US006870215B2

(12) United States Patent
Endoh et al.

(10) Patent No.: US 6,870,215 B2
(45) Date of Patent: Mar. 22, 2005

(54) SEMICONDUCTOR MEMORY AND ITS PRODUCTION PROCESS

(75) Inventors: Tetsuo Endoh, Natori (JP); Fujio Masuoka, 2-33-18, Higashikatsuyama, Auba-ku, Sendai-shi, Miyagi (JP); Takuji Tanigami, Fukuyama (JP); Takashi Yokoyama, Sendai (JP); Noboru Takeuchi, Fukuyama (JP); Yoshihisa Wada, Fukuyama (JP); Kota Sato, Fukuyama (JP); Kazushi Kinoshita, Fukuyama (JP)

(73) Assignees: Fujio Masuoka, Miyagi (JP); Sharp Kabushiki Kaisha, Osaka (JP)

( * ) Notice: Subject to any disclaimer, the term of this patent is extended or adjusted under 35 U.S.C. 154(b) by 21 days.

(21) Appl. No.: 10/175,259

(22) Filed: Jun. 20, 2002

(65) Prior Publication Data

US 2003/0157763 A1 Aug. 21, 2003

(30) Foreign Application Priority Data

Jun. 22, 2001 (JP) ...................................... 2001-190270

(51) Int. Cl.[7] ............................................. H10L 27/108
(52) U.S. Cl. ....................................................... 257/316
(58) Field of Search ......................... 257/316, E29.129, 257/E29.3; 438/259, 589, FOR 193, FOR 203

(56) References Cited

U.S. PATENT DOCUMENTS

| | | | | | |
|---|---|---|---|---|---|
| 5,414,287 | A | * | 5/1995 | Hong | 257/316 |
| 5,721,442 | A | * | 2/1998 | Hong | 257/316 |
| 5,923,063 | A | * | 7/1999 | Liu et al. | 257/316 |
| 5,929,477 | A | | 7/1999 | McAllister Burns, Jr. et al. | |
| 5,990,509 | A | * | 11/1999 | Burns et al. | 257/296 |
| 6,107,670 | A | | 8/2000 | Masuda | |
| 6,114,767 | A | | 9/2000 | Nagai et al. | |
| 6,188,115 | B1 | * | 2/2001 | Kamitani | 257/412 |
| 6,380,585 | B1 | * | 4/2002 | Odanaka et al. | 257/316 |
| 6,387,757 | B1 | | 5/2002 | Chu et al. | |
| 6,433,382 | B1 | | 8/2002 | Orlowski et al. | |
| 6,483,136 | B1 | | 11/2002 | Yoshida et al. | |
| 6,501,125 | B2 | | 12/2002 | Kobayashi | |
| 6,593,231 | B2 | | 7/2003 | Endoh et al. | |
| 2002/0036308 | A1 | | 3/2002 | Endoh et al. | |
| 2002/0154556 | A1 | | 10/2002 | Endoh et al. | |
| 2002/0195668 | A1 | | 12/2002 | Endoh et al. | |
| 2002/0197868 | A1 | | 12/2002 | Endoh et al. | |

* cited by examiner

*Primary Examiner*—George Fourson
*Assistant Examiner*—Joannie Adelle Garcia
(74) *Attorney, Agent, or Firm*—Nixon & Vanderhye, P.C.

(57) ABSTRACT

A semiconductor memory comprises: a first conductivity type semiconductor substrate and memory cells each constituted of an island-like semiconductor layer, a charge storage layer and a control gate, the charge storage layer and the control gate being formed to entirely or partially encircle a sidewall of the island-like semiconductor layer, wherein the memory cells are disposed in series, and the island-like semiconductor layer on which the memory cells are disposed has cross-sectional areas in a horizontal direction which vary stepwise.

22 Claims, 547 Drawing Sheets

SEMICONDUCTOR MEMORY AND ITS PRODUCTION PROCESS

CROSS-REFERENCE TO RELATED APPLICATION

This application is related to Japanese Patent Application No. 2001-190270 filed on Jun. 22, 2001, whose priority is claimed under 35 USC § 119, the disclosure of which is incorporated by reference in its entirety.

BACKGROUND OF THE INVENTION

1. Field of the Invention

The present invention relates to a semiconductor memory and its production process, and more particularly, the invention relates to a semiconductor memory provided with a memory transistor having a charge storage layer and a control gate, and its production process.

2. Description of Related Art

As a memory cell of an EEPROM, is known a device of a MOS transistor structure having a charge storage layer and a control gate in a gate portion, in which an electric charge is injected into and released from the charge storage layer by use of a tunnel current. In this memory cell, data "0" and "1" is stored as changes in a threshold voltage by the state of the charge in the charge storage layer.

For example, in the case of an n-channel memory cell using a floating gate as the charge storage layer, when a source/drain diffusion layer and a substrate are grounded and a high positive voltage is applied to the control gate, electrons are injected from the substrate into the floating gate by a tunnel current. This injection of electrons shifts the threshold voltage of the memory cell toward positive. When the control gate is grounded and a high positive voltage is applied to the source/drain diffusion layer or the substrate, electrons are released from the floating gate to the substrate by the tunnel current. This release of electrons shifts the threshold voltage of the memory cell toward negative.

In the above-described operation, a relationship of capacity coupling between the floating gate and the control gate with capacity coupling between the floating agate and the substrate plays an important role in effective injection and release of electrons, i.e., effective writing and erasure. That is, the larger the capacity between the floating gate and the control gate, the more effectively the potential of the control gate can be transmitted to the floating gate and the easier the writing and erasure become.

With recent development in semiconductor technology, especially, in micro-patterning techniques, the size reduction and the capacity increase of memory cells of EEPROM are rapidly progressing. Accordingly, it is an important how large capacity can be ensured between the floating gate and the control gate.

For increasing the capacity between the floating gate and the control gate, it is necessary to thin a gate insulating film therebetween, to increase the dielectric constant of the gate insulating film or to enlarge an area where the floating gate opposes the control gate.

However, the thinning of the gate insulating film is limited in view of reliability of memory cells. For increasing the dielectric constant of the gate insulating film, a silicon nitride film is used as the gate insulating film instead of a silicon oxide film. This is also questionable in view of reliability and is not practical. Therefore, in order to ensure a sufficient capacity between the floating gate and the control gate, it is necessary to set a sufficient overlap area therebetween. This is, however, contradictory to the size reduction of memory cells and the capacity increase of EEPROM.

In an EEPROM disclosed by Japanese Patent No. 2877462, memory transistors are formed by use of sidewalls of a plurality of pillar-form semiconductor layers arranged in matrix on a semiconductor substrate, the pillar-form semiconductor layers being separated by trenches in a lattice form. A memory transistor is composed of a drain diffusion layer formed on the top of a pillar-form semiconductor layer, a common source diffusion layer formed at the bottom of the trenches, and a charge storage layer and a control gate which are around all the periphery of the sidewall of the pillar-form semiconductor layer. The control gates are provided continuously for a plurality of pillar-form semiconductor layers lined in one direction so as to form a control gate line, and a bit line is connected to drain diffusion layers of a plurality of memory transistors lined in a direction crossing the control gate line. The charge storage layer and the control gate are formed in a lower part of the pillar-form semiconductor layer. This construction can prevent a problem in a one transistor/one cell structure, that is, if a memory cell is over-erased (a reading potential is 0 V and the threshold is negative), a cell current flows in the memory cell even if it is not selected.

With this construction, a sufficiently large capacity can be ensured between the charge storage layer and the control gate with a small area occupied. The drain regions of the memory cells connected to the bit lines are formed on the top of the pillar-form semiconductor layers and completely insulated from each other by the trenches. A device isolation region can further be decreased and the memory cells are reduced in size. Accordingly, it is possible to obtain a mass-storage EEPROM with memory cells which provide excellent writing and erasing efficiency.

The prior-art EEPROM is explained with reference to figures. FIG. 562 is a cross-sectional view of a prior-art EEPROM, and FIGS. 563(*a*) and 563(*b*) are sectional views taken on lines A–A' and B–B', respectively, in FIG. 562. In the cross-sectional view of FIG. 562, selection gate lines formed by continuing gate electrodes of selection gate transistors are not shown for avoiding complexity of the figure.

In the prior art, is used a P-type silicon substrate 1, on which a plurality of pillar-form P-type silicon layers 2 are arranged in matrix. The pillar-form P-type silicon layers 2 are separated by trenches 3 in a lattice form and functions as memory cell regions. Drain diffusion layers 10 are formed on the top of the silicon layers 2, common source diffusion layers 9 are formed at the bottom of the trenches 3, and oxide films 4 are buried at the bottom of the trenches 3. Floating gates 6 are formed in a lower part of the silicon layers 2 with intervention of tunnel oxide films 5 so as to surround the silicon layers 2. Outside the floating gates 6, control gates 8 are formed with intervention of interlayer insulating films 7. Thus memory transistors are formed.

Here, as shown in FIGS. 562 and 563(*b*), the control gates 8 are provided continuously for a plurality of memory cells in one direction so as to form control gate lines (CG1, CG2, . . . ). Gate electrodes 32 are provided around an upper part of the silicon layers 2 with intervention of gate oxides films 31 to form the selection gate transistors, like the memory transistors. The gate electrodes 32 of the selection gate transistors, like the control gates 8 of the memory cells, are provided continuously in the same direction as that of the control gates 8 of the memory cells so as to form selection gate lines, i.e., word lines WL (WL1, WL2, . . . ).

Thus, the memory transistors and the selection gate transistors are buried in the trenches in a stacked state. The control gate lines leave end portions as contact portions 14 on the surface of silicon layers, and the selection gate lines leaves contact portions 15 on silicon layers on an end opposite to the contact portions 14 of the control gates. Al wires 13 and 16 to be control gate lines CG and the word lines WL, respectively, are contacted to the contact portion 14 and 15, respectively. At the bottom of the trenches 3, common source diffusion layers 9 of the memory cells are formed, and on the top of the silicon layers 2, drain diffusion layers 10 are formed for every memory cell. The resulting substrate with the thus formed memory cells is covered with a CVD oxide film 11, where contact holes are opened. Al wires 12 are provided which are to be bit lines BL which connects the drain diffusion layers 10 of memory cells lined in a direction crossing the word lines WL.

When patterning is carried out for the control gate lines, a mask is formed of PEP on pillar-form silicon layers at an end of a cell array to leave, on the surface of the silicon layers, the contact portions 14 of a polysilicon film which connect with the control gate lines. To the contact portions 14, the Al wires 13 which are to be control gate lines are contacted by Al films formed simultaneously with the bit lines BL.

A production process for obtaining the structure shown in FIG. 563(*a*) is explained with reference to FIGS. 564(*a*) to 567(*g*).

A P-type silicon layer 2 with a low impurity concentration is epitaxially grown on a P-type silicon substrate 1 with a high impurity concentration to give a wafer. A mask layer 21 is deposited on the wafer and a photoresist pattern 22 is formed by a known PEP process. The mask layer 21 is etched using the photoresist pattern 22 (see FIG. 564(*a*)).

The silicon layer 2 is etched by a reactive ion etching method using the resulting mask layer 21 to form trenches 3 in a lattice form which reach the substrate. Thereby the silicon layer 21 is separated into a plurality of pillar-form islands. A silicon oxide film 23 is deposited by a CVD method and anisotropically etched to remain on the sidewalls of the pillar-form silicon layers 2. By implantation of N-type impurity ions, drain diffusion layers 10 are formed on the top of the pillar-form silicon layers 2 and common source diffusion layers 9 are formed at the bottom of the trenches (see FIG. 564(*b*)).

The oxide films 23 around the pillar-form silicon layers 2 are etched away by isotropic etching. Channel ion implantation is carried out on the sidewalls of the pillar-form silicon layers 2 by use of a slant ion implantation as required. Instead of the channel ion implantation, an oxide film containing boron may be deposited by a CVD method with a view to utilizing diffusion of boron from the oxide film. A silicon oxide film 4 is deposited by a CVD method and isotropically etched to be buried at the bottom of trenches 3. Tunnel oxide films 5 are formed to a thickness of about 10 nm around the silicon layers 2 by thermal oxidation. A first-layer polysilicon film 5 is deposited and anisotropically etched to remain on lower sidewalls of the pillar-form silicon layers 2 as floating gates 6 around the silicon layers 2 (see FIG. 565(*c*)).

Interlayer insulating films 7 are formed on the surface of the floating gates 5 formed around the pillar-form silicon layers 2. The interlayer insulating films 7 are formed of an ONO film, for example. The ONO film is formed by oxidizing the surface of the floating gate 6 by a predetermined thickness, depositing a silicon nitride film by a plasma-CVD method and then thermal-oxidizing the surface of the silicon nitride film. A second-layer polysilicon film is deposited and anisotropically etched to form control gates 8 on lower parts of the pillar-form silicon layers 2 (see FIG. 565(*d*)). At this time, the control gates 8 are formed as control gate lines continuous in a longitudinal direction in FIG. 562 without need to perform a masking process by previously setting intervals between the pillar-form silicon layers 2 in the longitudinal direction at a predetermined value or less. Unnecessary parts of the interlayer insulating films 7 and underlying tunnel oxide films 2 are etched away. A silicon oxide film 111 is deposited by a CVD method and etched halfway down the trenches 3, that is, to a depth such that the floating gates 6 and control gates 8 of the memory cells are buried and hidden (see FIG. 566(*e*)).

A gate oxide film 31 is formed to a thickness of about 20 nm on exposed upper parts of the pillar-form silicon layers 2 by thermal oxidation. A third-layer polysilicon film is deposited and anisotropically etched to form gate electrodes 32 of MOS transistors (see FIG. 566(*f*)). The gate electrodes 32 are patterned to be continuous in the same direction as the control gate lines run, and form selection gate lines. The selection gate lines can be formed continuously in self-alignment, but this is more difficult than the control gates 8 of the memory cells. For, the selection gate transistors are single-layer gates while the memory transistors are two-layered gates, and therefore, the intervals between adjacent selection gates are wider than the intervals between the control gates. Accordingly, in order to ensure that the gate electrodes 32 are continuous, the gate electrodes may be formed in a two-layer polysilicon structure, a first polysilicon film may be patterned to remain only in locations to connect the gate electrodes by use of a masking process, and a second polysilicon film may be left on the sidewalls.

Masks for etching the polysilicon films are so formed that contact portions 14 and 15 of the control gate lines and the selection gate lines are formed on the top of the pillar-form silicon layers at different ends.

A silicon oxide film 112 is deposited by a CVD method and, as required, is flattened. Contact holes are opened. An Al film is deposited and patterned to form Al wires 12 to be bit lines BL, Al wires 13 to be control gate lines CG and Al wires 16 to be word lines WL at the same time (see FIG. 567(*g*)).

FIG. 568(*a*) schematically shows a sectional structure of a major part of one memory cell of the prior-art EEPROM, and FIG. 568(*b*) shows an equivalent circuit of the memory cell. The operation of the prior-art EEPROM is briefly explained with reference to FIGS. 568(*a*) to 568(*b*).

For writing by use of injection of hot carriers, a sufficiently high positive potential is applied to a selected word line WL, and positive potentials are applied to a selected control gate line CG and a selected bit line BL. Thereby, a positive potential is transmitted to the drain of a memory transistor Qc to let a channel current flow in the memory transistor Qc and inject hot carriers. Thereby, the threshold of the memory cell is shifted toward positive.

For erasure, 0 V is applied to a selected control gate CG and high positive potentials are applied to the word line WL and the bit line BL to release electrons from the floating gate to the drain. For erasing all the memory cells, a high positive potential may be applied to the common sources to release electrons to the sources. Thereby, the thresholds of the memory cells are shifted toward negative.

For reading, the selection gate transistor is rendered ON by the word line WL and the reading potential is applied to the control gate line CG. The judgement of a “0” or a “1” is made from the presence or absence of a current.

In the case where an FN tunneling is utilized for injecting electrons, high potentials are applied to a selected control gate line CG and a selected word line WL and 0 V is applied to a selected bit line BL to inject electrons from the substrate to the floating gate.

This prior art provides an EEPROM which does not mis-operate even in an over-erased state thanks to the presence of the selection gate transistors.

The prior-art EEPROM does not have diffusion layers between the selection gate transistors Qs and the memory transistors Qc as shown in FIG. 568(*a*). For, it is hard to form the diffusion layers selectively on the sidewalls of the pillar-form silicon layers. Therefore, in the structure shown in FIGS. 563(*a*) and 563(*b*), desirably, separation oxide films between the gates of the memory transistors and the gates of the selection gate transistors are as thin as possible. In the case of utilizing the injection of hot electrons, in particular, the separation oxide films need to be about 30 to 40 nm thick for allowing a sufficient “H” level potential to be transmitted to the drain of a memory transistor.

Such fine intervals cannot be practically made only by burying the oxide films by the CVD method as described above in the production process. Accordingly, desirably, the oxide films are buried in such a manner that the floating gates 6 and the control gates 8 are exposed, and thin oxide films are formed on exposed parts of the floating gates 6 and the control gates 8 simultaneously with the formation of the gate oxide films for the selection gate transistors.

Further, according to the prior art, since the pillar-form silicon layers are arranged with the bottom of the lattice-form trenches forming an isolation region and the memory cells are constructed to have the floating gates formed to surround the pillar-form silicon layers, it is possible to obtain a highly integrated EEPROM in which the area occupied by the memory cells are small. Furthermore, although the memory cells occupy a small area, the capacity between the floating gates and the control gates can be ensured to be sufficiently large.

According to the prior art, the control gates of the memory cells are formed to be continuous in one direction without using a mask. This is possible, however, only when the pillar-form silicon layers are arranged at intervals different between a longitudinal direction and a lateral direction. That is, by setting the intervals, between adjacent pillar-form silicon layers in a word line direction to be smaller than the intervals between adjacent pillar-form silicon layers in a bit line direction, it is possible to obtain control gate lines that are separated in the bit line direction and are continuous in the word line direction automatically without using a mask. In contrast, when the pillar-form silicon layers are arranged at the same intervals both in the longitudinal direction and in the lateral direction, a PEP process is required.

More particularly, the second-layer polysilicon film is deposited thick, and through the PEP process to form a mask, the second-layer polysilicon film is selectively etched to remain in locations to be continuous as control gate lines. The third-layer polysilicon film is deposited and etched to remain on the sidewalls as described regarding the production process of the prior art. Even in the case where the pillar-form silicon layers are arranged at intervals different between the longitudinal direction and the lateral direction, the continuous control gate lines cannot be automatically formed depending upon the intervals of the pillar-form silicon layers. In this case, the mask process by the PEP process as described above can be used for forming the control gate lines continuous in one direction.

Although the memory cells of the prior art as described above are of a floating gate structure, the charge storage layers do not necessarily have the floating gate structure and may have a structure such that the storage of a charge is realized by a trap in a laminated insulating film, e.g., a MNOS structure.

FIG. 569 is a sectional view of a prior-art memory with memory cells of the MNOS structure, corresponding to FIG. 563(*a*). A laminated insulating film 24 functioning as the charge storage layer is of a laminated structure of a tunnel oxide film and a silicon nitride film, or of a tunnel oxide film, a silicon nitride film and further an oxide film formed on the silicon nitride film.

FIG. 570 is a sectional view of a prior-art memory in which the memory transistors and the selection gate transistors of the above-described prior art are exchanged, i.e., the selection gate transistors are formed in the lower parts of the pillar-form silicon layers 2 and the memory transistors are formed in the upper parts of the pillar-form silicon layers 2. FIG. 570 corresponds to FIG. 563(*a*). This structure in which the selection gate transistors are provided on a common source side can apply to the case where the injection of hot electrons is used for writing.

FIG. 571 shows a prior-art memory in which a plurality of memory cells are formed on one pillar-form silicon layer. Like numbers denote like components in the above-described prior-art memories and the explanation thereof is omitted.

In this memory, a selection gate transistor Qs1 is formed in the lowermost part of a pillar-form silicon layer 2, three memory transistors Qc1, Qc2 and Qc3 are laid above the selection gate transistor Qs1, and another selection gate transistor Qs2 is formed above. This structure can be obtained basically by repeating the aforesaid production process.

As described above, the prior-art techniques can provide highly integrated EEPROMs whose control gates and charge storage layers have a sufficient capacity therebetween and whose memory cells occupy a decreased area, by constructing the memory cells using memory transistors having the charge storage layers and the control gates by use of the sidewalls of the pillar-form semiconductor layers separated by the lattice-form trenches.

The prior-art EEPROM does not have diffusion layers between the selection gate transistors Qs and the memory transistors Qc as shown in FIG. 568(*a*). This is because, it is hard to form the diffusion layers selectively on the sidewalls of the pillar-form silicon layers.

Therefore, in the structure shown in FIGS. 563(*a*) and 563(*b*), desirably, separation oxide films between the, gates of the memory transistors and the gates of the selection gate transistors are as thin as possible. In the case of utilizing the injection of hot electrons, in particular, the separation oxide films need to be about 30 to 40 nm thick for allowing a sufficient “H” level potential to be transmitted to the drain of a memory transistor. Such fine intervals cannot be practically made only by burying the oxide films by the CVD method as described in the above production process.

Further, if transistors are formed in a direction vertical to the substrate stage by stage, there occur increase in the number of the production steps at increased costs in a increased time period and reduced, moreover, variations in characteristics of the memory cells owing to differences in the properties of the tunnel oxide films and differences in the profile of diffusion layers. Such differences are generated by thermal histories different stage by stage.

Furthermore, if a plurality of memory cells are connected in series on one pillar-form semiconductor layer and the thresholds of the memory cells are supposed to be the same, significant changes take place in the thresholds of memory cells at both ends of the memory cells connected in series owing to a back-bias effect of the substrate in a reading operation. In the reading operation, the reading potential is applied to the control gate lines CG and the "0" or "1" is judged from the presence of a current. For this reason, the number of memory cells connected in series is limited in view of the performance of memories. Therefore, the production of mass-storage memories is difficult to realize.

SUMMARY OF THE INVENTION

The present invention has been made in view of the above-described problems. An object of the present invention is to provide a semiconductor memory having a structure such that a plurality of memory cells are disposed in series in the direction vertical to the surface of the semiconductor substrate, and a production process therefor which enables easy formation of impurity diffusion layers between memory transistors and between a memory transistor and a selection gate transistor with good control. According to the production process, the number of production steps does not increase with increase in the number of the steps in the island-like semiconductor layer and the semiconductor memory can be produced by a smaller number of production steps at decreased costs in a decreased time period. Furthermore, the degree of integrity can be improved by reducing the influence of the back-bias effect of a semiconductor memory having a charge storage layer and a control gate.

The present invention provides a semiconductor memory comprising:

- a first conductivity type semiconductor substrate and
- memory cells each constituted of an island-like semiconductor layer, a charge storage layer and a control gate, the charge storage layer and the control gate being formed to entirely or partially encircle a sidewall of the island-like semiconductor layer,
- wherein the memory cells are disposed in series, and the island-like semiconductor layer on which the memory cells are disposed has cross-sectional areas in a horizontal direction which vary stepwise.

The present invention also provides a process for producing a semiconductor memory comprises the steps of:

- forming at least one island-like semiconductor layer on a semiconductor substrate;
- forming a sidewall of a first insulating film on a sidewall of the island-like semiconductor layer;
- further etching the semiconductor layer using the sidewall as a mask to form an island-like semiconductor layer having cross-sectional areas in a direction horizontal to the semiconductor substrate which areas vary stepwise;
- forming a single-layered or multi-layered insulating film and a first conductive film on the island-like semiconductor layer; and
- forming the first conductive film into a sidewall form on a sidewall of the island-like semiconductor layer with intervention of the insulating film, thereby separating the first conductive film,
- whereby a semiconductor memory is produced which has at least one memory cell constituted of the island-like semiconductor layer, a charge storage layer and a control gate, the charge storage layer and the control gate being formed to entirely or partially encircle the sidewall of the island-like semiconductor layer.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
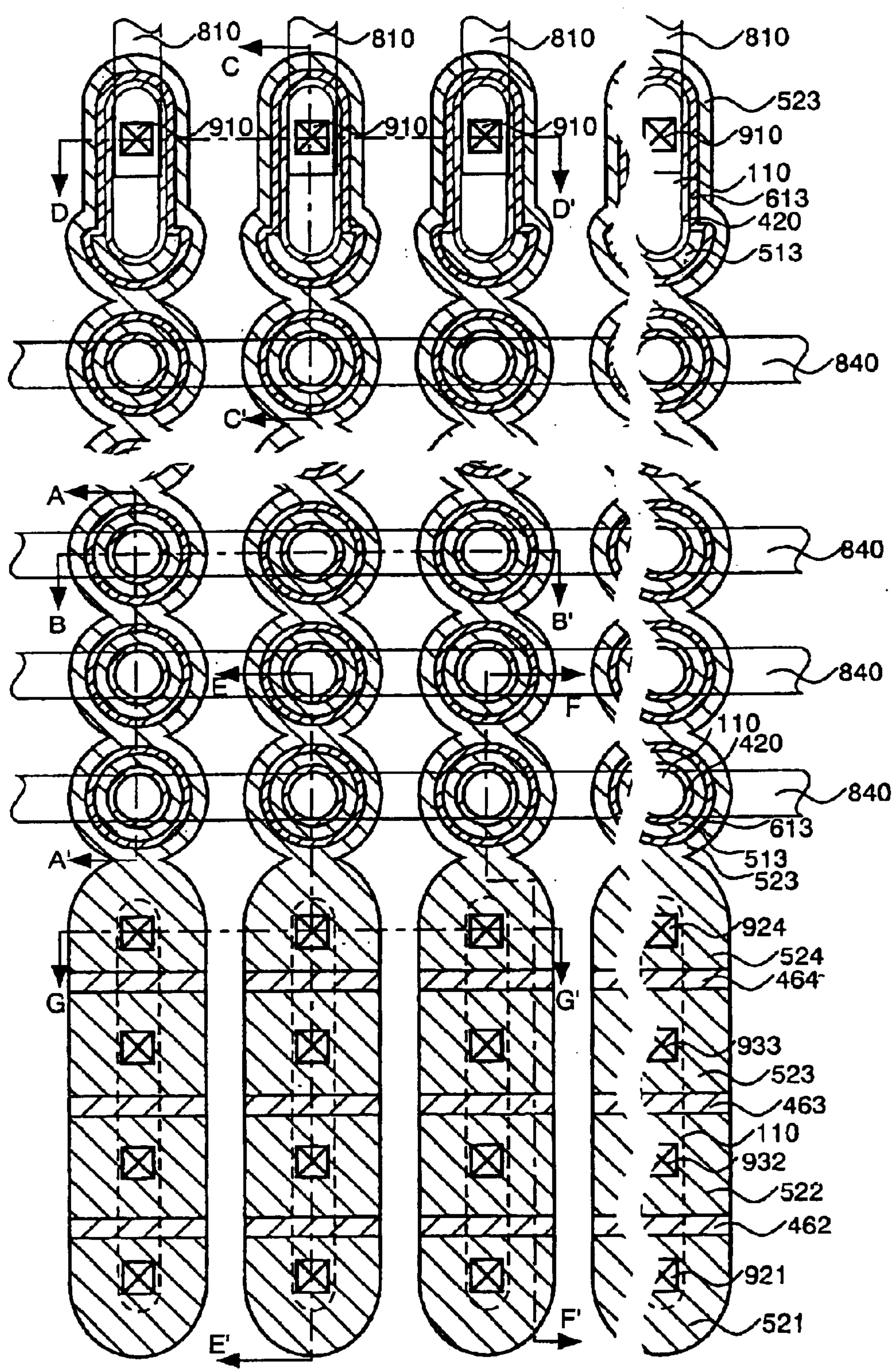
FIG. 1 to FIG. 7 are cross-sectional views illustrating memory cell arrays of EEPROMs having floating gates as charge storage layers in accordance with the present invention.

The semiconductor memory of the present invention has a plurality of island-like semiconductor layers arranged separately in matrix on the semiconductor substrate. The island-like semiconductor layer is formed at least one step, i.g., at least 2 tiers. A plurality of memory cells each having a charge storage layer and a third electrode to be a control gate are connected in series in the direction vertical to a semiconductor substrate. The memory cells are formed on sidewalls of the island-like semiconductor layers. The charge storage layer is provided a sidewall of the tier of the island-like semiconductor layer. Selection gate transistors having a thirteenth electrode to be a selection gate are connected to both ends of the memory cells connected in series. The selection gate is provided on the sidewall of the tier of the island-like semiconductor layer. The impurity diffusion layer (a second conductivity type, which is different conductivity from a first conductivity type semiconductor substrate) placed in the island-like semiconductor layer is a source or a drain of the memory cell. The control gate has a control gate line which is a third wiring provided continuously along island-like semiconductor layers in one direction and horizontally with respect to the surface of the semiconductor substrate. A bit line as a fourth wiring is provided to be electrically connected with the impurity diffusion layer in a direction crossing the control gate line and horizontal to the surface of the semiconductor substrate.

The island-like semiconductor layer may be formed to have smaller cross-sectional areas or larger cross-sectional areas at lower portions thereof, i.e., as it approaches to the semiconductor substrate provided that the island-like semiconductor layer has stepwise different cross-sectional areas. Or the island-like semiconductor layer may have increasing or deceasing cross-sectional areas and then have the same cross-sectional area as that on the semiconductor substrate side. The charge storage layer and the control gate may be formed to surround the entire periphery of the sidewall of the island-like semiconductor layer or may be formed partially around the sidewall of the island-like semiconductor layer. The charge storage layer and the control gate may be formed on the sidewall of a smaller tier of the island-like semiconductor layer, may be formed on the sidewall of a larger tier of the island-like semiconductor layer, or may be formed bridging the step. It is not particularly limited where on the island-like semiconductor layer the charge storage layer and the control gate are formed. However, from the viewpoint of easiness in the production process, they are preferably formed in a portion having a smaller tier.

Only one memory cell or two or more memory cells may be formed on one island-like semiconductor layer. If three or more memory cells are formed, a selection gate is preferably formed below and/or above the memory cells to form a selection transistor together with the island-like semiconductor layer.

That "at least one of said one or more memory cells is electrically insulated from the semiconductor substrate" means that the island-like semiconductor layer is electrically insulated (isolated) from the semiconductor substrate. If two or more memory cells are formed in one island-like semiconductor layer, memory cells are electrically insulated and thereby a memory cell/memory cells above an insulating site is/are electrically insulated from the semiconductor substrate. If a selection gate (memory gate) is formed below the memory cell(s), a selection transistor composed of the selection gate is electrically insulated from the semiconductor substrate or the selection transistor is electrically insulated from a memory cell and thereby a memory cell/memory cells above an insulating site is/are electrically insulated from the semiconductor substrate. It is preferably in particular that the selection transistor is formed between the semiconductor substrate and the island-like semiconductor layer or below the memory cell(s) and the selection transistor is electrically insulated from the semiconductor substrate.

Electric insulation may be made, for example, by forming a second conductivity type impurity diffusion layer over a region to be insulated, by forming the second conductivity type impurity diffusion layer in part of the region to be insulated and utilizing a depletion layer at a junction of the second conductivity type impurity diffusion layer, or by providing a distance not allowing electric conduction and achieving electric insulation as a result. The semiconductor substrate may be electrically insulated from the memory cell(s) or the selection transistor by an insulating film of $SiO_2$ or the like. In the case where a plurality of memory cells are formed in one island-like semiconductor layer and selection transistors are optionally formed above and/or below the memory cells, the electric insulation may be formed between optional memory cells and/or a selection transistor and a memory cell.

Embodiments of Memory Cell Arrays as Shown in Cross-Sectional Views

The memory cell array in the semiconductor memory of the present invention is described with reference to cross-sectional views shown in FIG. 1 to FIG. 8. These figures also illustrate layouts of selection gate lines as second or fifth wiring which are gate electrodes for selecting memory cells (referred to as "selection gates" hereinafter), control gates as third wiring, bit lines as fourth wiring and source lines as first wiring.

FIG. 1 to FIG. 7 are cross-sectional views illustrating embodiments of memory cell arrays of EEPROM having a floating gate as the charge storage layer. FIG. 8 is a cross-sectional view illustrating an embodiment of a memory cell array of MONOS structure having a laminated insulating film as the charge storage layer. The cross-sectional views of FIG. 1 to FIG. 8 show horizontal sections in lower memory cells in the above-mentioned memory cell arrays.

In FIG. 1, island-like semiconductor layers in a columnar form for constituting memory cells are arranged to be located at intersections where a group of parallel lines and another group of parallel lines cross at right angles. First, second, third and fourth wiring layers for selecting and controlling the memory cells are disposed in parallel to the surface of the substrate.

By changing intervals between island-like semiconductor layers between an A–A' direction which crosses fourth wiring layers 840 and a B–B' direction which is parallel to the fourth wiring layers 840, second conductive films which act as the control gates of the memory cells are formed continuously in one direction, in the A–A' direction in FIG. 1, to be the third wiring layers. Likewise, second conductive films which act as the gates of the selection gate transistors are formed continuously in one direction to be the second wiring layers.

A terminal for electrically connecting with the first wiring layer disposed on a substrate side of island-like semiconductor layers is provided, for example, at an A side end of a row of memory cells connected in the A–A' direction in FIG. 1, and terminals for electrically connecting with the second and third wiring layers are provided at an A' side end of the row of memory cells connected in the A–A' direction in FIG. 1. The fourth wiring layers 840 disposed on a side of the island-like semiconductor layers opposite to the substrate are electrically connected to the island-like semiconductor layers in the columnar form for constituting memory cells. In FIG. 1, the fourth wiring layers 840 are formed in the direction crossing the second and third wiring layers.

The terminals for electrically connecting with the first wiring layers are formed of island-like semiconductor layers, and the terminals for electrically connecting with the second and third wiring layers are formed of second conductive films covering the island-like semiconductor layers, respectively.

The terminals for electrically connecting with the first, second and third wiring layers are connected to first contacts 910, second contacts 921 and 924 and third contacts 932, 933 respectively. In FIG. 1, the first wiring layers 810 are lead out onto the top of the semiconductor memory via the first contacts.

The island-like semiconductor layers in the columnar form for constituting the memory cells may be not only in the form of a column but also in the form of a prism, a polygonalar prism or the like. In the case where they are patterned in columns, it is possible to avoid occurrence of local field concentration on the surface of active regions and have an easy electrical control.

The arrangement of the island-like semiconductor layers in the columnar form is not particularly limited to that shown in FIG. 1 but may be any arrangement so long as the above-mentioned positional relationship and electric connection between the wiring layers are realized.

The island-like semiconductor layers connected to the first contacts 910 are all located at the A' side ends of the memory cells connected in the A–A' direction in FIG. 1. However, they may be located entirely or partially located on the A side ends or may be located at any of the island-like semiconductor layers constituting the memory cells connected in the A–A' direction.

The island-like semiconductor layers covered with the second conductive films connected to the second contacts 921 and 924 and the third contacts 932, 933 may be located at the ends where the first contacts 910 are not disposed, may be located adjacently to the island-like semiconductor layers connected to the first contacts 910 at the ends where the first contacts 910 are disposed, and may be located at any of the island-like semiconductor layers constituting the memory cells connected in the A–A' direction. The second contacts 921 and 924 and the third contacts 932, 933 may be located at different places.

The width and shape of the first wiring layers 810 and the fourth wiring layers 840 are not particularly limited so long as a desired wiring can be obtained.

In the case where the first wiring layers, which are disposed on the substrate side of the island-like semiconductor layers, are formed in self-alignment with the second and third wiring layers formed of the second conductive films, the island-like semiconductor layers which act as the terminals for electrically connecting with the first wiring layers are electrically insulated from the second and third wiring layers but contact the second and third wiring layers with intervention of insulating films.

In FIG. 1, for example, first conductive films are formed partially on the sidewalls of the island-like semiconductor layers connected to the first contacts 910 with intervention of insulating films. The first conductive films are located to face the island-like semiconductor layers for constituting the memory cells. The second conductive films are formed on the first conductive films with intervention of insulating films. The second conductive films are connected to the second and third wiring layers formed continuously in the A–A' direction. At this time, the shape of the first and the second conductive films is not particularly limited.

The first conductive films on the sidewalls of the island-like semiconductor layers which act as the terminals for electrically connecting with the first wiring layers may be removed by setting the distance from said island-like semiconductor layers to the first conductive films on the island-like semiconductor layers for constituting the memory cells, for example, to be two or less times larger than the thickness of the second conductive films.

In FIG. 1, the second and third contacts are formed on the second wiring layers 821 and 824 and the third wiring layers 832 which are formed to cover the top of the island-like semiconductor layers. However, the shape of the second and third wiring layers is not particularly limited so long as their connection is realized. In FIG. 1, selection gate transistors are not shown for avoiding complexity of the figure. FIG. 1 also shows lines for sectional views to be used for explaining examples of production processes, i.e., A–A' line, B–B' line, C–C' line, D–D' line, E–E' line and F–F' line.

Figure 2:
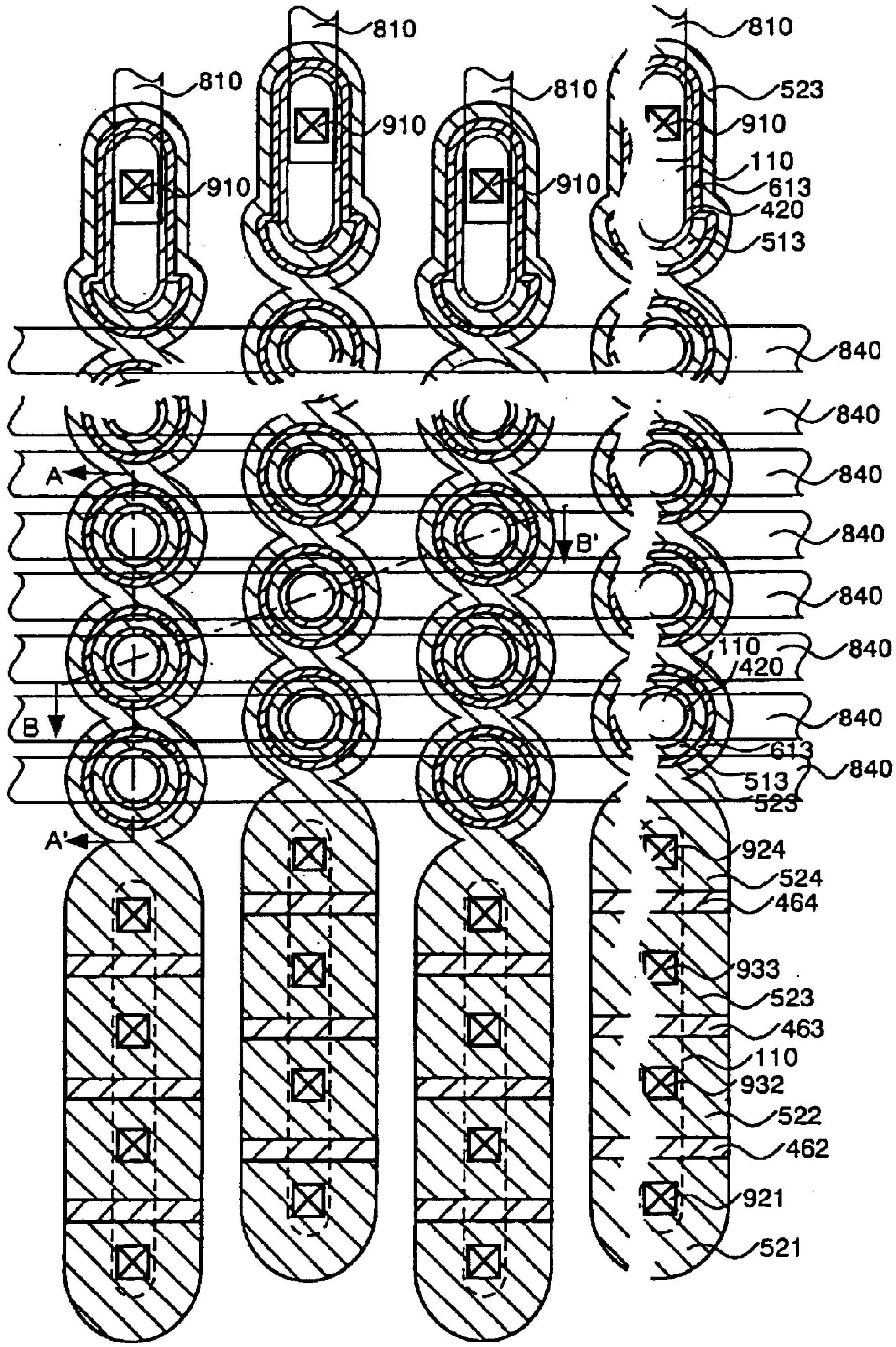

In FIG. 2, the island-like semiconductor layers in a columnar form for constituting memory cells are located at intersections where a group of parallel lines and another group of parallel lines cross at oblique angles. First, second, third and fourth wiring layers for selecting and controlling the memory cells are disposed in parallel to the surface of the substrate.

By changing intervals between the island-like semiconductor layers between the A–A' direction which crosses the fourth wiring layers 840 and the B–B' direction, second conductive films which act as the control gates of the memory cells are formed continuously in one direction, in the A–A' direction in FIG. 2, to form the third wiring layers. Likewise, second conductive films which act as the gates of the selection gate transistors are formed continuously in one direction to form the second wiring layers.

Further, terminals for electrically connecting with the first wiring layers disposed on a substrate side of the island-like semiconductor layers are provided at the A side end of rows of memory cells connected in the A–A' direction in FIG. 2, and terminals for electrically connecting with the second and third wiring layers are provided at the A' side end of the rows of memory cells connected in the A–A' direction in FIG. 2. The fourth wiring layers 840 disposed on a side of the island-like semiconductor layers opposite to the substrate are electrically connected to the island-like semiconductor layers in the columnar form for constituting the memory cells. FIG. 2, the fourth wiring layers 840 are formed in the direction crossing the second and third wiring layers.

The terminals for electrically connecting with the first wiring layers are formed of island-like semiconductor layers, and the terminals for electrically connecting with the second and third wiring layers are formed of the second conductive film covering the island-like semiconductor layers. The terminals for electrically connecting with the first, second and third wiring layers are connected to first contacts 910, second contacts 921 and 924 and third contacts 932, 933, respectively. In FIG. 2, the first wiring layers 810 are lead out to the top of the semiconductor memory via the first contacts 910.

The arrangement of the island-like semiconductor layers in the columnar form is not particularly limited to that shown in FIG. 2 but may be any arrangement so long as the above-mentioned positional relationship and electric connection between the wiring layers are realized. The island-like semiconductor layers connected to the first contacts 910 are all located at the A side end of the rows of memory cells connected in the A–A' direction in FIG. 2. However, they may be located entirely or partially located on the A' side end or may be located at any of the island-like semiconductor layers for constituting the memory cells connected in the A–A' direction.

The island-like semiconductor layers coated with the second conductive film and connected to the second contacts 921 and 924 and the third contacts 932 and 933 may be located at an end where the first contacts 910 are not disposed, may be continuously located at the end where the first contacts 910 are disposed and may be located at any of the island-like semiconductor layers for constituting the memory cells connected in the A–A' direction. The second contacts 921 and 924 and the third contacts 932 and 933 may be located at different places. The width and shape of the first wiring layers 810 and the fourth wiring layers 840 are not particularly limited so long as desired wiring can be obtained.

In the case where the first wiring layers are formed in self-alignment with the second and third wiring layers formed of the second conductive film, the island-like semiconductor layers which are the terminal for electrically connecting with the first wiring layers are electrically insulated from the second and third wiring layers but contact the second and third wiring layers with intervention of an insulating film.

In FIG. 2, for example, the first conductive films are formed on part of the sidewalls of the island-like semiconductor layers connected to the first contacts 910 with intervention of insulating films. The first conductive films are located to face the island-like semiconductor layers for constituting the memory cells. The second conductive films are formed on the side faces of the first conductive films with intervention of insulating films. The second conductive films are connected to the second and third wiring layers formed continuously in the A–A' direction. The shape of the first and the second conductive films is not particularly limited.

The first conductive films on the sidewalls of the island-like semiconductor layers which act as the terminals for electrically connecting with the first wiring layers may be removed by setting the distance between said island-like semiconductor layers and the first conductive films on the island-like semiconductor layers for constituting the memory cells, for example, to be two or less times larger than the thickness of the second conductive films.

In FIG. 2, the second and third contacts are formed on the second wiring layers 821 and 824 and the third wiring layers 832 which are formed to cover the top of the island-like semiconductor layers. However, the shape of the second and third wiring layers are not particularly limited so long as their connection is realized. FIG. 2 also shows lines for sectional views, i.e., line A–A' and line B–B' to be used for explaining examples of production processes.

Figure 3:
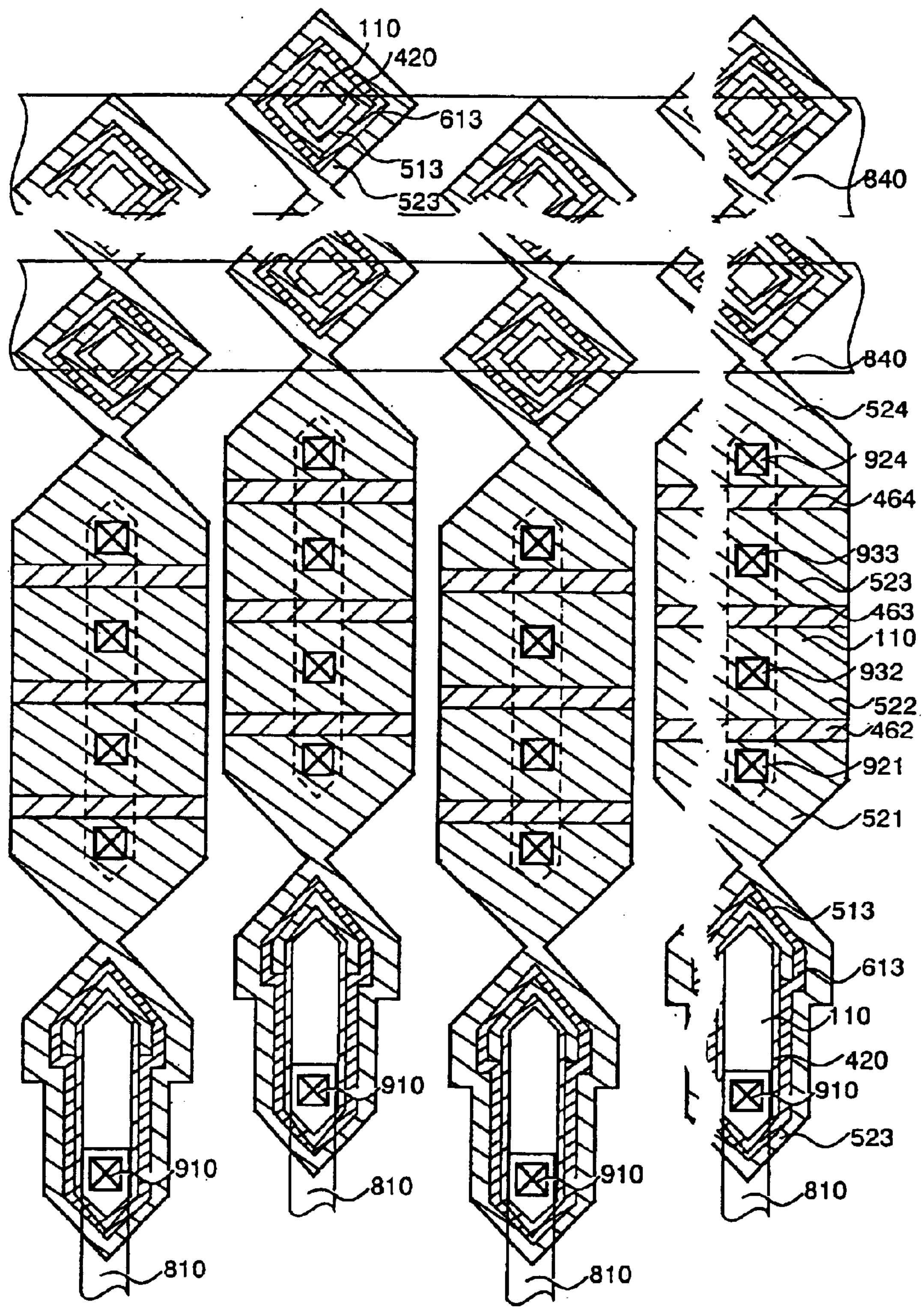
Figure 4:
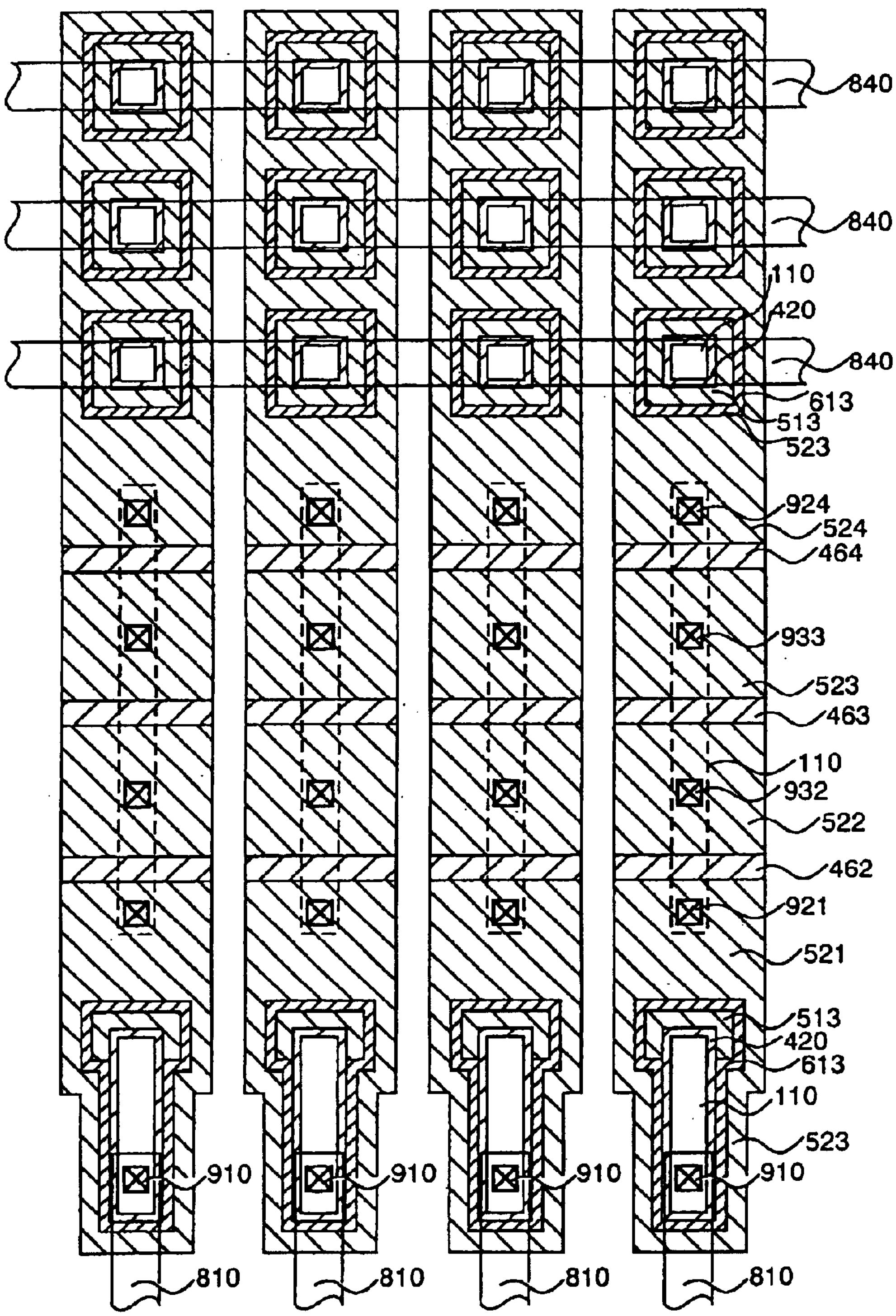

FIG. 3 and FIG. 4, in contrast to FIG. 1 and FIG. 2, the island-like semiconductor layers for constituting the memory cells have a square cross section. In FIG. 3 and FIG. 4, the island-like semiconductor layers are differently oriented. The cross section of the island-like semiconductor layers is not particularly limited to circular or square but may be elliptic, hexagonal or octagonal, for example. However, if the island-like semiconductor layers have a dimension close to the minimum photoetching dimension, the island-like semiconductor layers, even if they are designed to have corners like square, hexagon or octagon, may be rounded by photolithography and etching, so that the island-like semiconductor layers may have a cross section near to circle or ellipse. In FIGS. 3 and 4, selection gate transistors are not shown for avoiding complexity of the figure.

Figure 6:
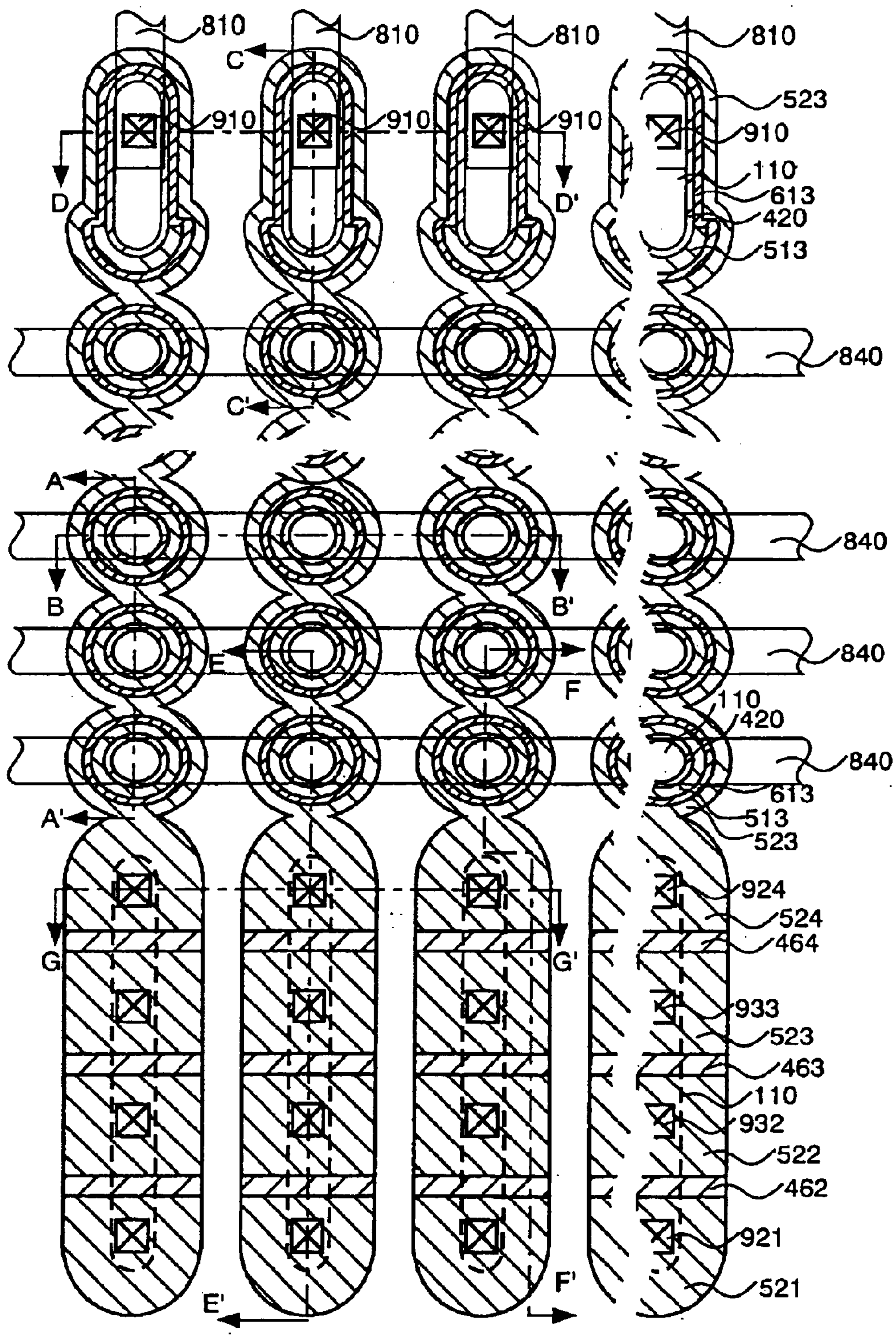
Figure 7:
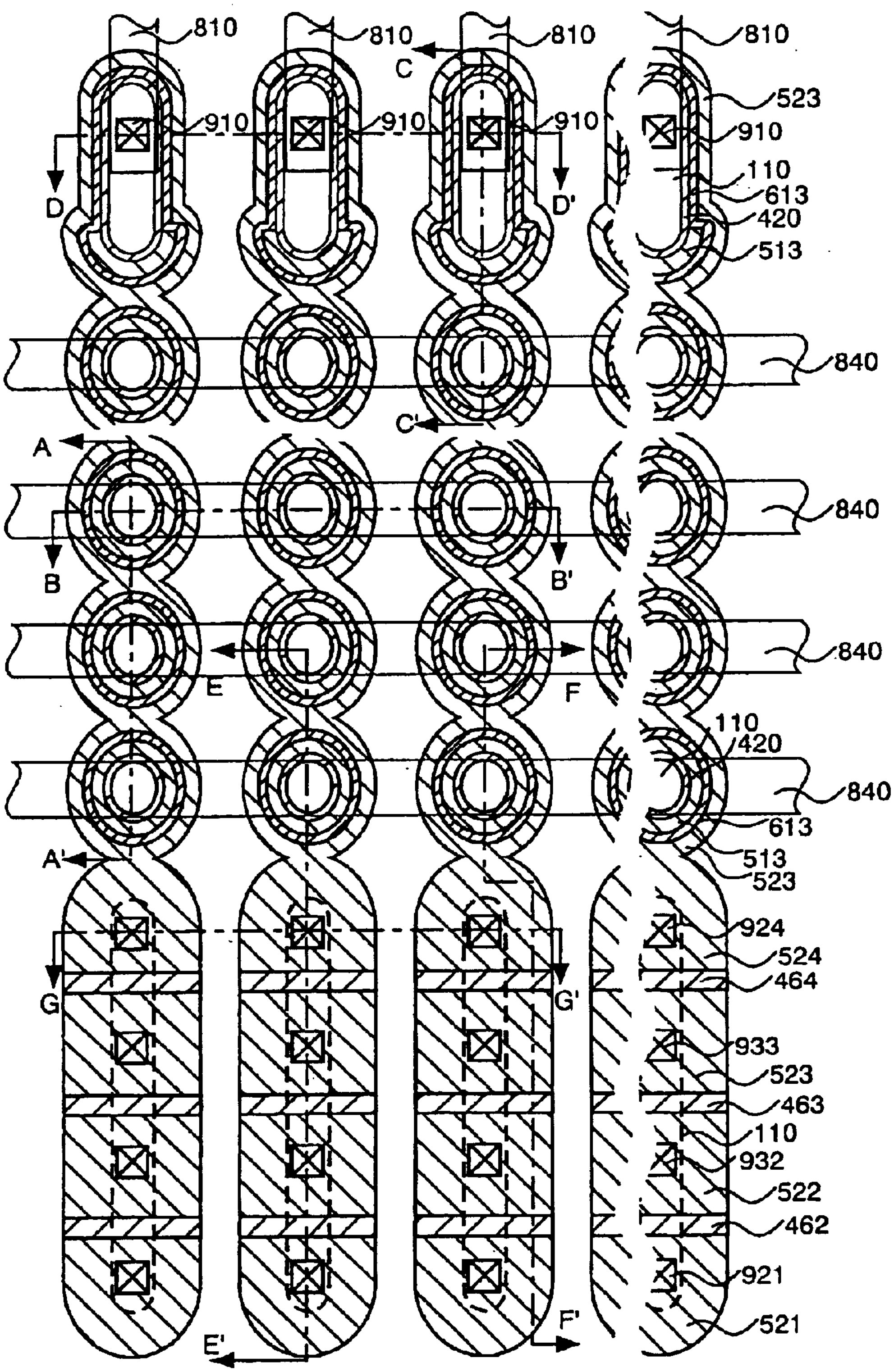
Figure 8:
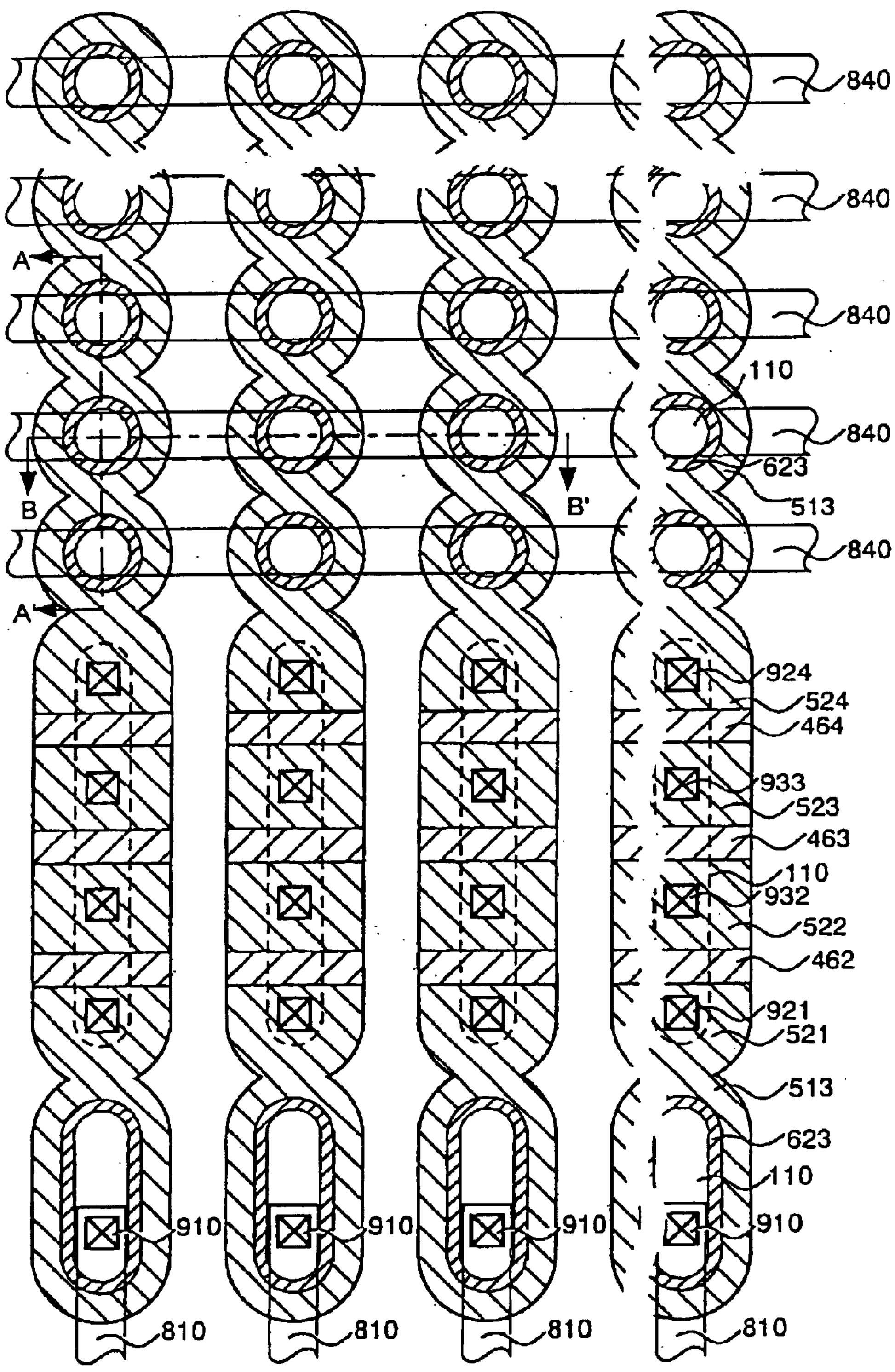
FIG. 8 is a cross-sectional view illustrating a memory cell array of a MONOS structure having laminated insulating films as charge storage layers in accordance with the present invention.

In FIGS. 6 and 7, in contrast to FIG. 1, the island-like semiconductor layers for constituting the memory cells have an elliptic cross section, and the major axis of ellipse is in the A–A' direction and B–B' direction, respectively. The major axis may be not only in the A–A' or B–B' direction but in any direction. In FIGS. 6 and 7, selection gate transistors are not shown for avoiding complexity of the figure.

In the above descriptions, the semiconductor memories having floating gates as charge storage layers with reference to their cross-sectional views, FIGS. 1 to 7. However, the arrangements and structures shown in these figures may be combined in various ways.

The memory cell array other than the memory cell array having floating gate as the charge storage layer is described below.

In FIG. 8, in contrast to FIG. 1, there is shown an example in which laminated insulating films are used as the charge storage layers as in the MONOS structure. The example of FIG. 8 is the same as the example of FIG. 1, except that the charge storage layers are changed from the floating gates to the laminated insulating films. FIG. 8 also shows lines for sectional views, i.e., line A–A' and line B–B', to be used for explaining examples of production processes. Also, in FIG. 8, selection gate transistors are not shown for avoiding complexity of the figure.

Embodiments of Memory Cell Arrays as Shown in Sectional Views

FIG. 9 to FIG. 56 are vertical sectional views of semiconductor memories according to the present invention.

FIG. 9 to FIG. 50 are sectional views of semiconductor memories having a floating gate as the charge storage layer. Of FIG. 9 to FIG. 50, the odd-numbered figures show cross sections taken on line A–A' as shown in FIG. 1, and the even-numbered figures show cross sections taken on line B–B' as shown in FIG. 1.

In these embodiments, a plurality of columnar island-like semiconductor layers 110, for example, having at least one step are arranged in matrix on a P-type silicon substrate 100. Selection gate transistors having a second electrode or a fifth electrode are arranged on the top and the bottom of each island-like semiconductor layer. Between the selection gate transistors, there are arranged a plurality of memory transistors, for example, two memory transistors in FIG. 9 to FIG. 50. The transistors are connected in series along the island-like semiconductor layer. More particularly, a silicon oxide film 460 of a specific thickness which is a seventh insulating film is formed at the bottom of the trench between island-like semiconductor layers 110. In the trench between island-like semiconductor layers formed to surround each island-like semiconductor layer 110, a second electrode 500 to be a selection gate is formed with intervention of a gate insulating film 480 so as to make a selection gate transistor. Above the selection gate transistor, a floating gate 510 is formed on the sidewall of the tier of the island-like semiconductor layer 110 with intervention of a tunnel oxide film 440. On at least a part of a sidewall of the floating gate 510, a control gate 520 is arranged with intervention of an interlayer insulating film 610 to form a memory transistor. The interlayer insulating film 610 is formed of a multi-layer film.

A plurality of memory transistors of this structure are arranged in the same manner. Above the memory transistors, a transistor to be a selection gate having a fifth electrode 500 is formed on the sidewall of tier of the island-like semiconductor layer 100 with intervention of a gate insulating film 480.

The selection gate 500 and the control gate 520 are continuously provided with regard to a plurality of transistors in one direction to form a selection gate line which is a second wiring or a fifth wiring and a control gate line which is a third wiring.

On the semiconductor substrate, a source diffusion layer 710 of a memory cell is formed, and further, diffusion layers 720 are arranged between the memory cells and between the selection gate transistors and the memory cells. A drain diffusion layer 725 is arranged for memory cell on each island-like semiconductor layer 110.

The source diffusion layer 710 of the memory cell may be arranged so that the active region of the memory cell is a floating state to the semiconductor substrate. As a semiconductor substrate, a structure in which an insulating film is inserted under the semiconductor substrate, for example, a SOI substrate may be used.

Between the thus arranged memory cells, an oxide film 460 which is an eighth insulating film is formed so that the top of the drain diffusion layer 725 is exposed. An aluminum wiring 840 is provided which is to be a bit line connecting the drain layers 725 in a direction crossing the control gate line. Preferably the impurity concentration in the diffusion layer 720, instead of being uniform, is gradually reduced from the surface of the island-like semiconductor layer 110 toward the inside thereof by introducing an impurity into the island-like semiconductor layer 110 and thermally diffusing the impurity. Thereby the junction withstand voltage between the diffusion layer 720 and the island-like semiconductor layer 110 is improved, and also the parasitic capacity decreases.

Similarly, it is also preferably that the impurity concentration in the source diffusion layer 710 is gradually reduced from the surface of the semiconductor substrate 100 toward the inside thereof. Thereby the junction withstand voltage between the source diffusion layer 710 and the semiconductor substrate 100 is improved, and also the parasitic capacity in the first wiring decreases.

Figure 9:
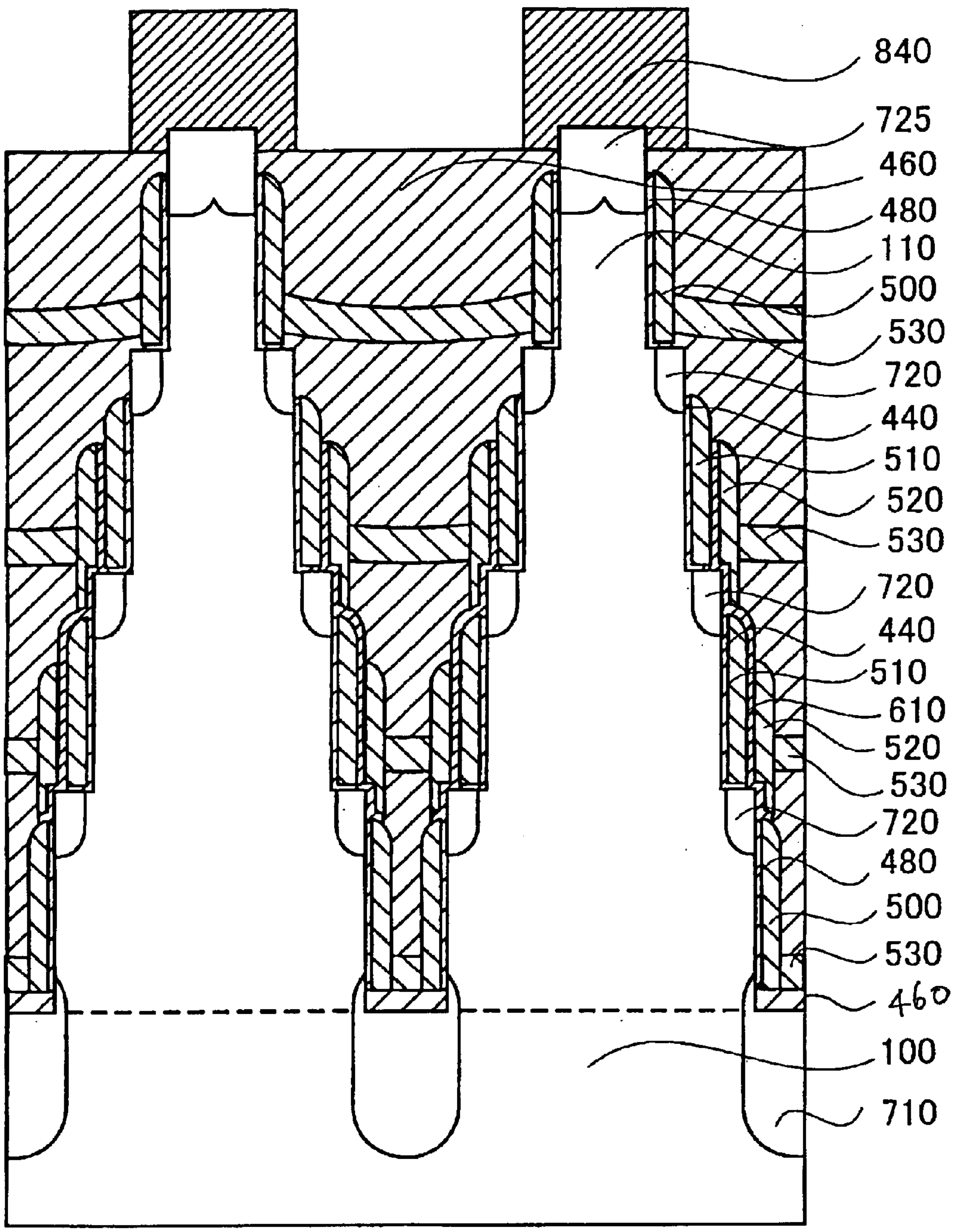
FIGS. 9 to 50 are sectional views of various semiconductor memory devices having floating gates as charge storage layers in accordance with the present invention, the sectional views corresponding to those taken on line A–A' and line B–B' in FIG. 1.
Figure 10:
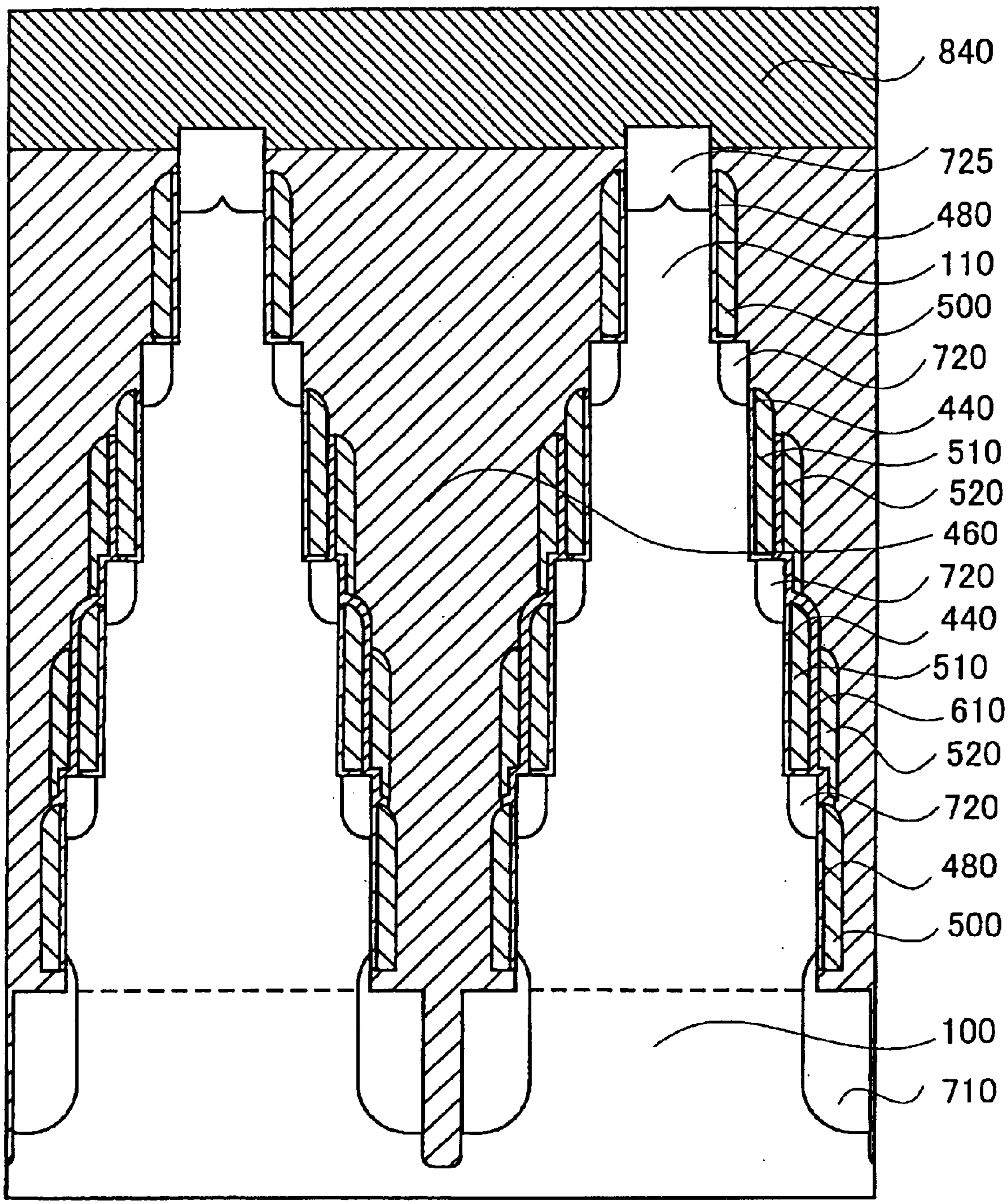

FIG. 9 and FIG. 10 show an example wherein the thickness of the floating gate 510 is equal to the thickness of the control gate 520.

Figure 11:
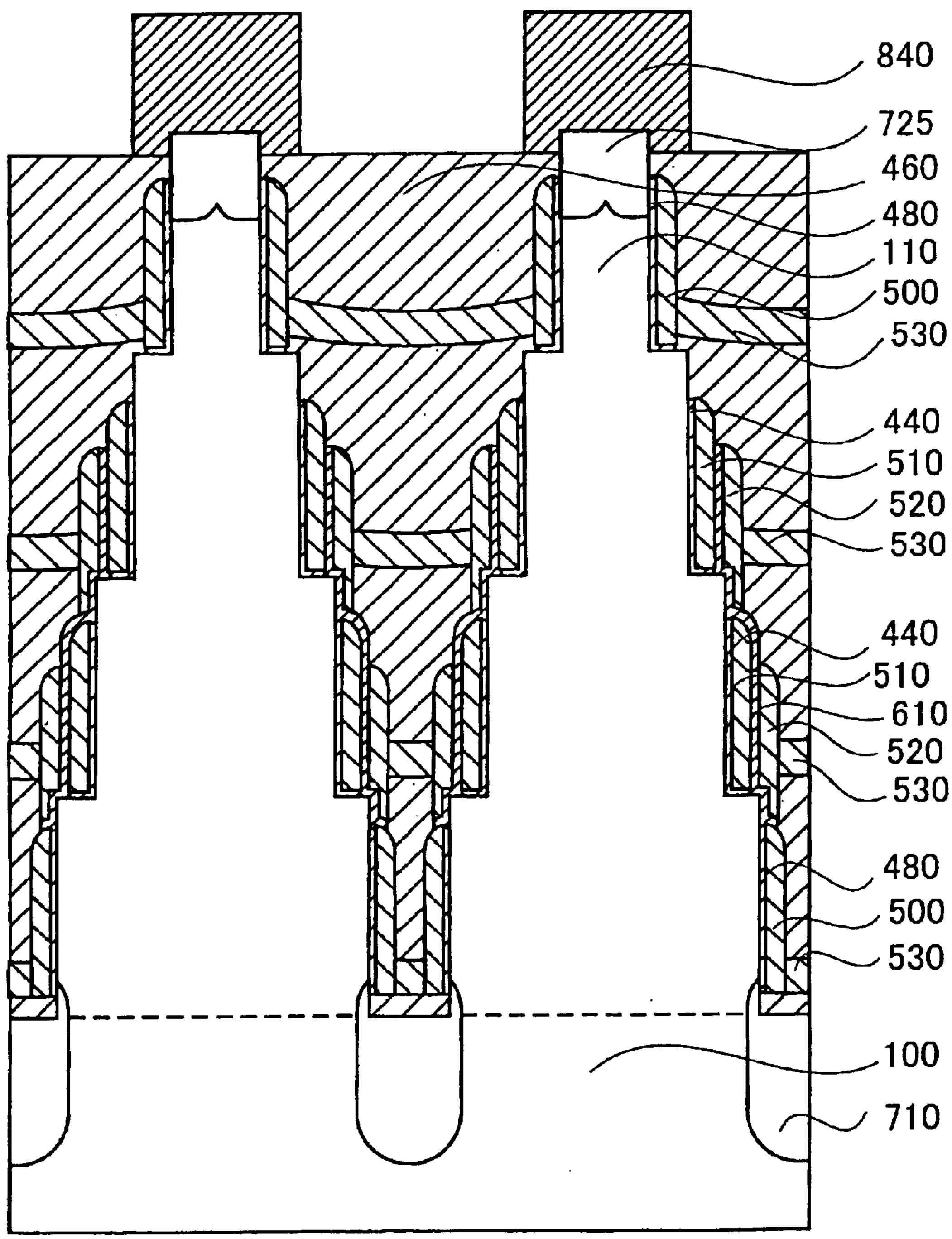
Figure 12:
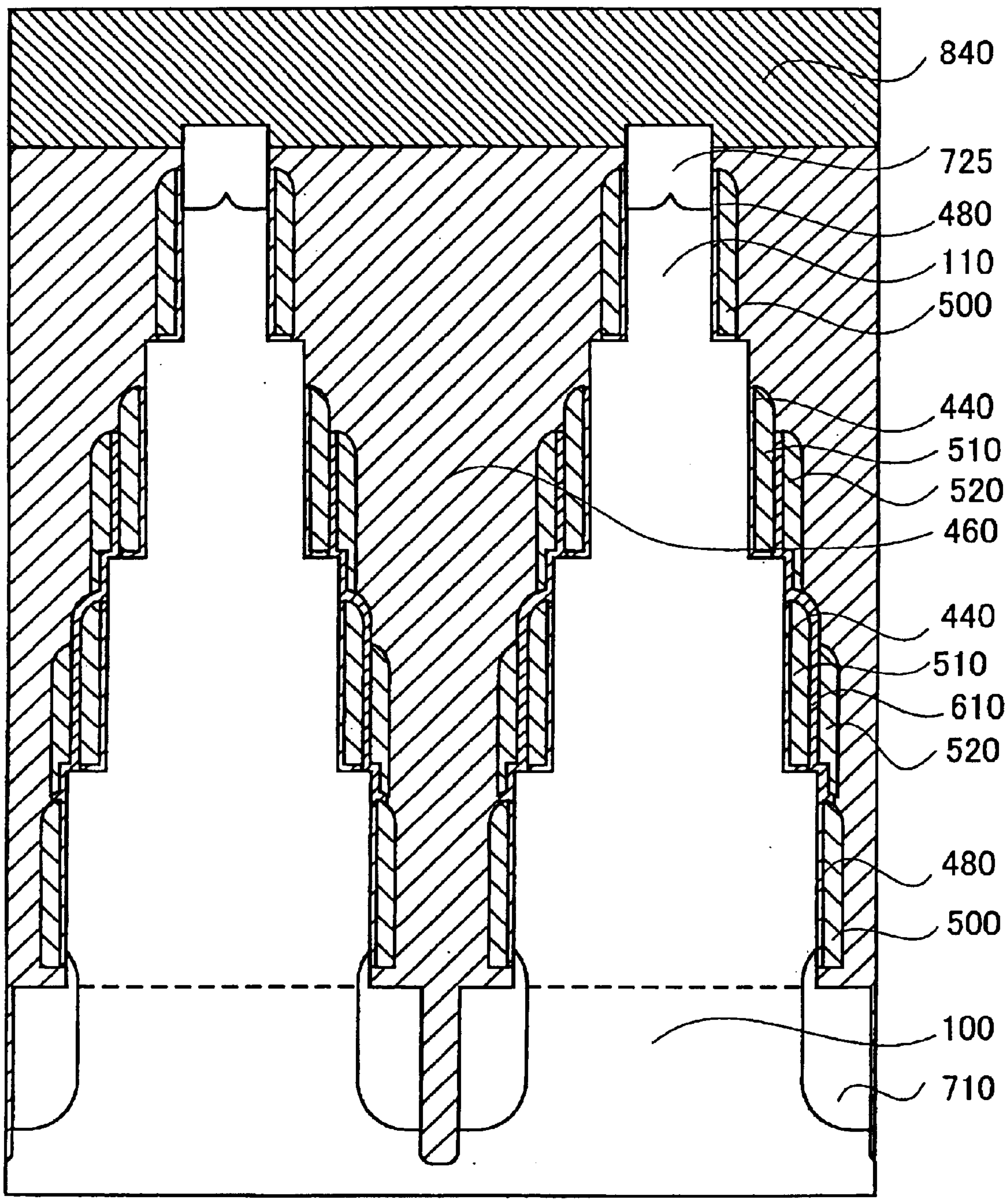

FIG. 11 and FIG. 12 show an example wherein the diffusion layers 720 are not provided between the transistors.

Figure 13:
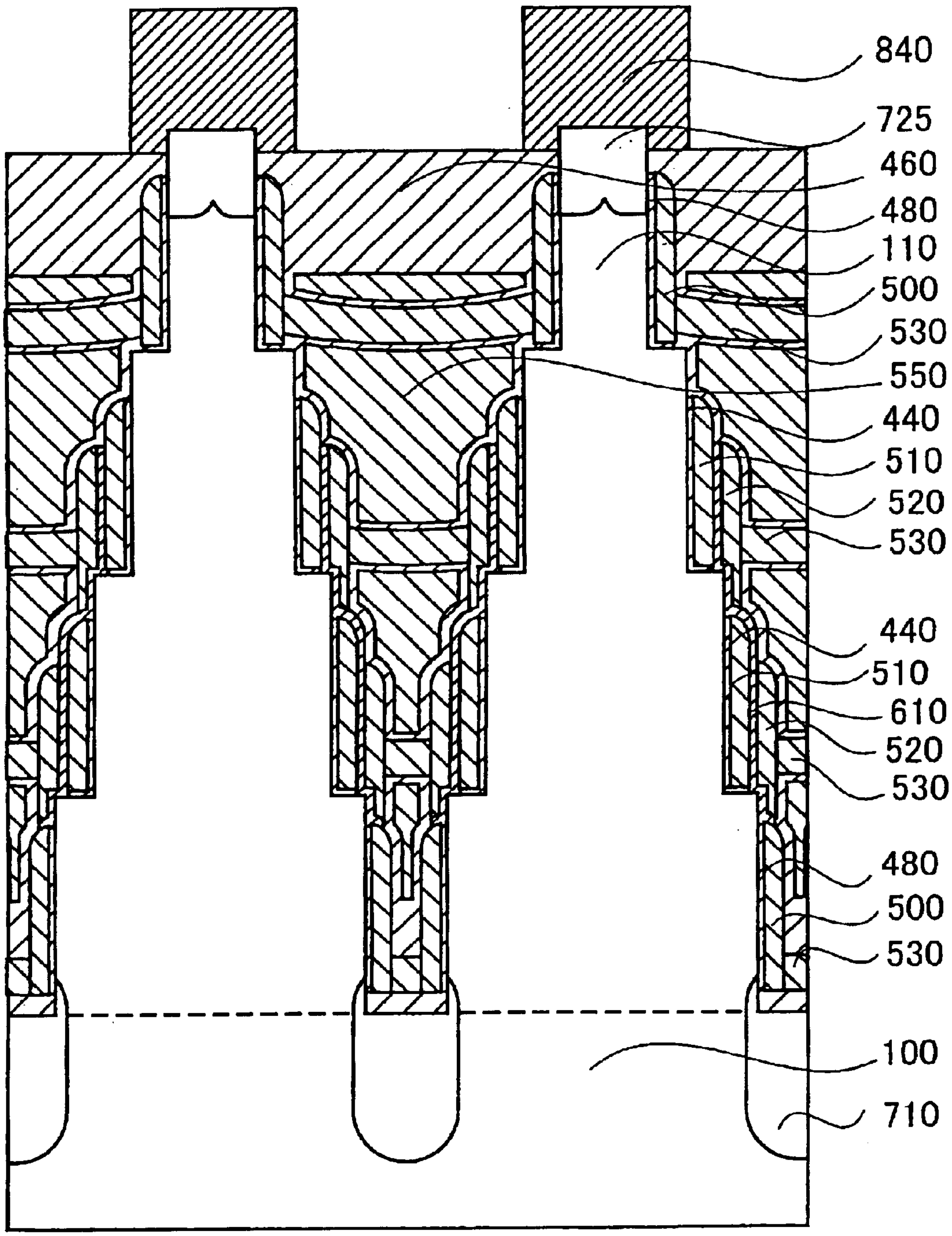
Figure 14:
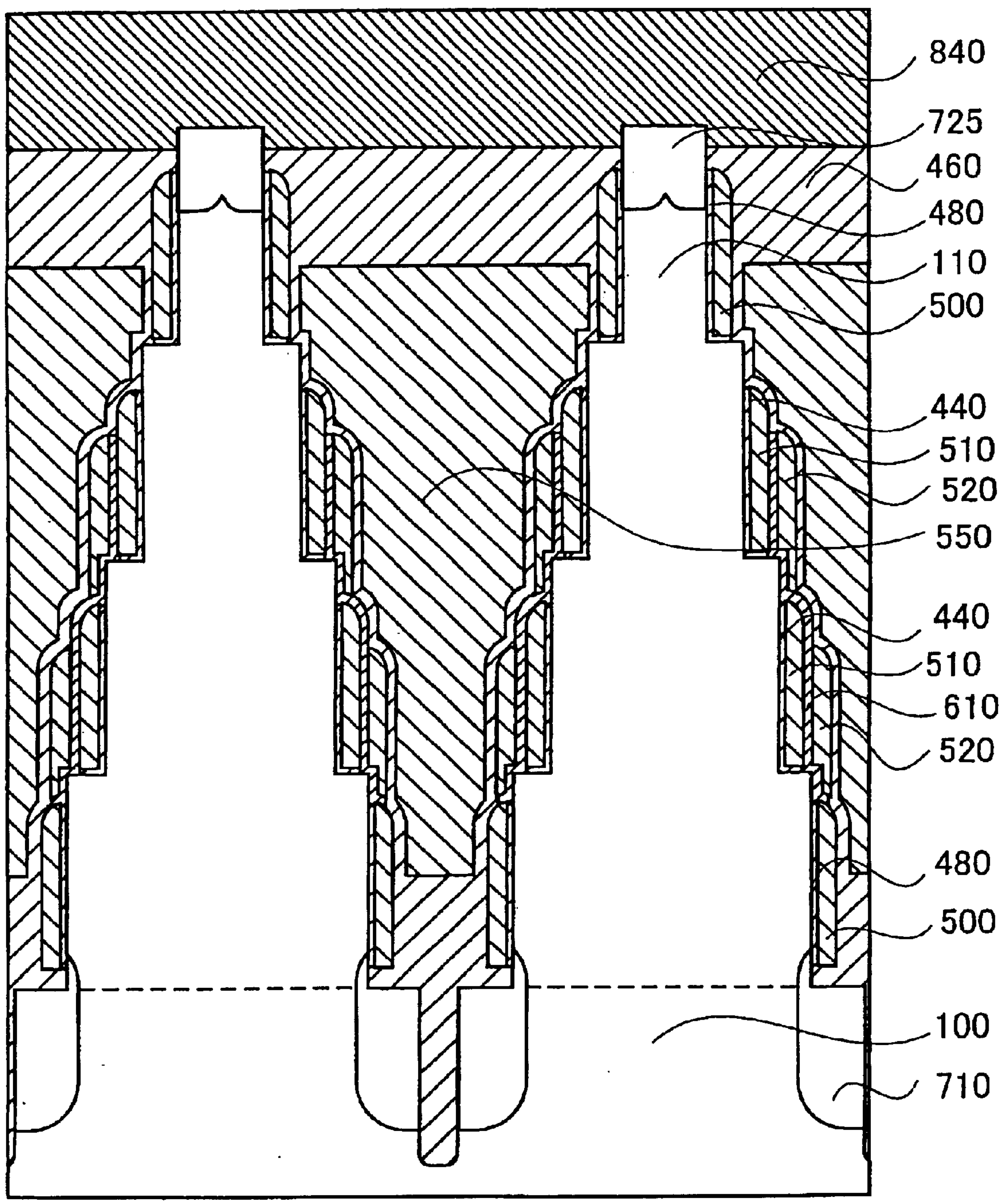

FIG. 13 and FIG. 14 show an example, wherein the diffusion layers 720 are not provided and polysilicon films 550 are formed as third electrode between the gate electrodes 500, 510 and 520 of the memory transistors and the selection gate electrodes.

In FIG. 1, the polysilicon film 550 which is the third electrode is omitted for simplicity.

Figure 15:
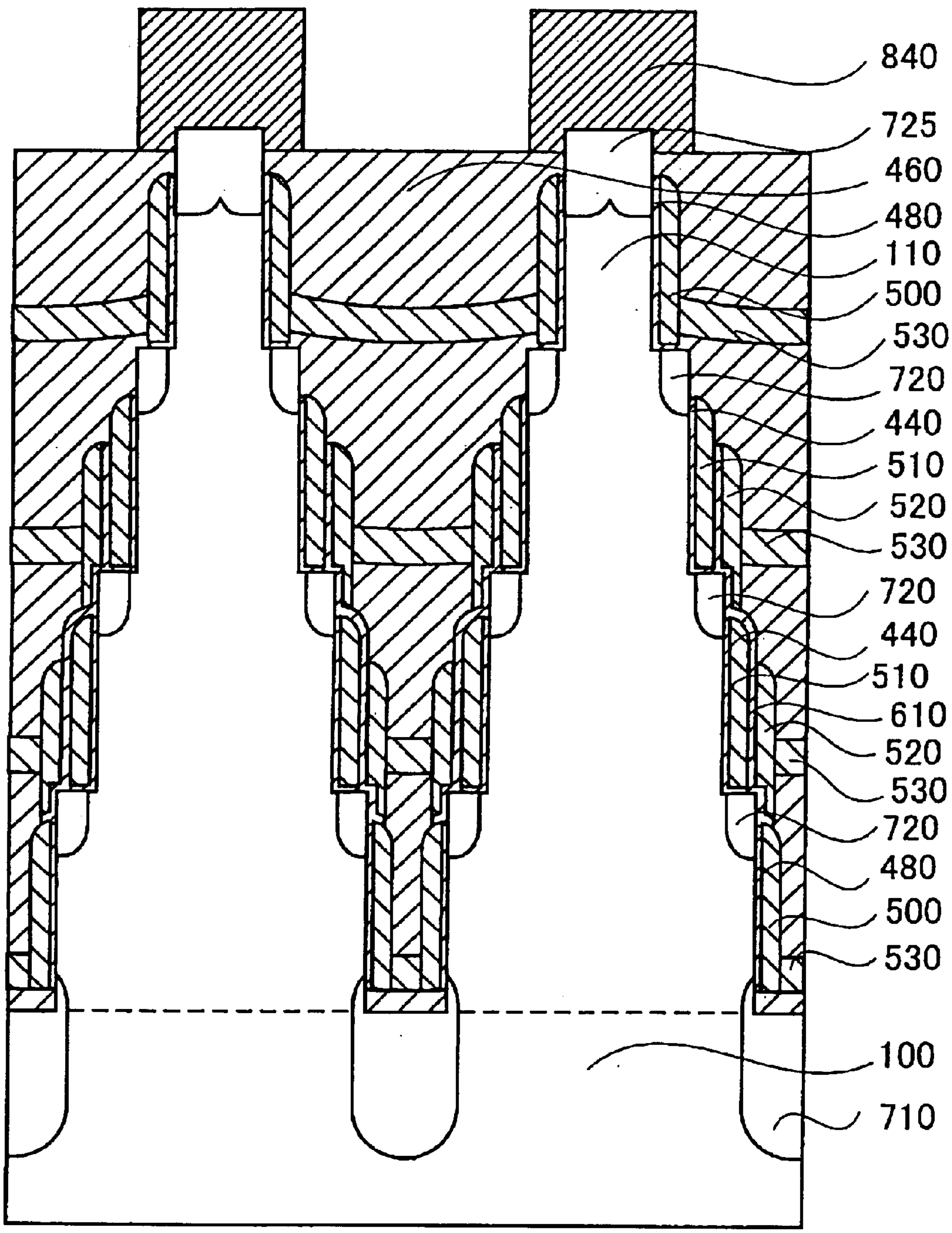
Figure 16:
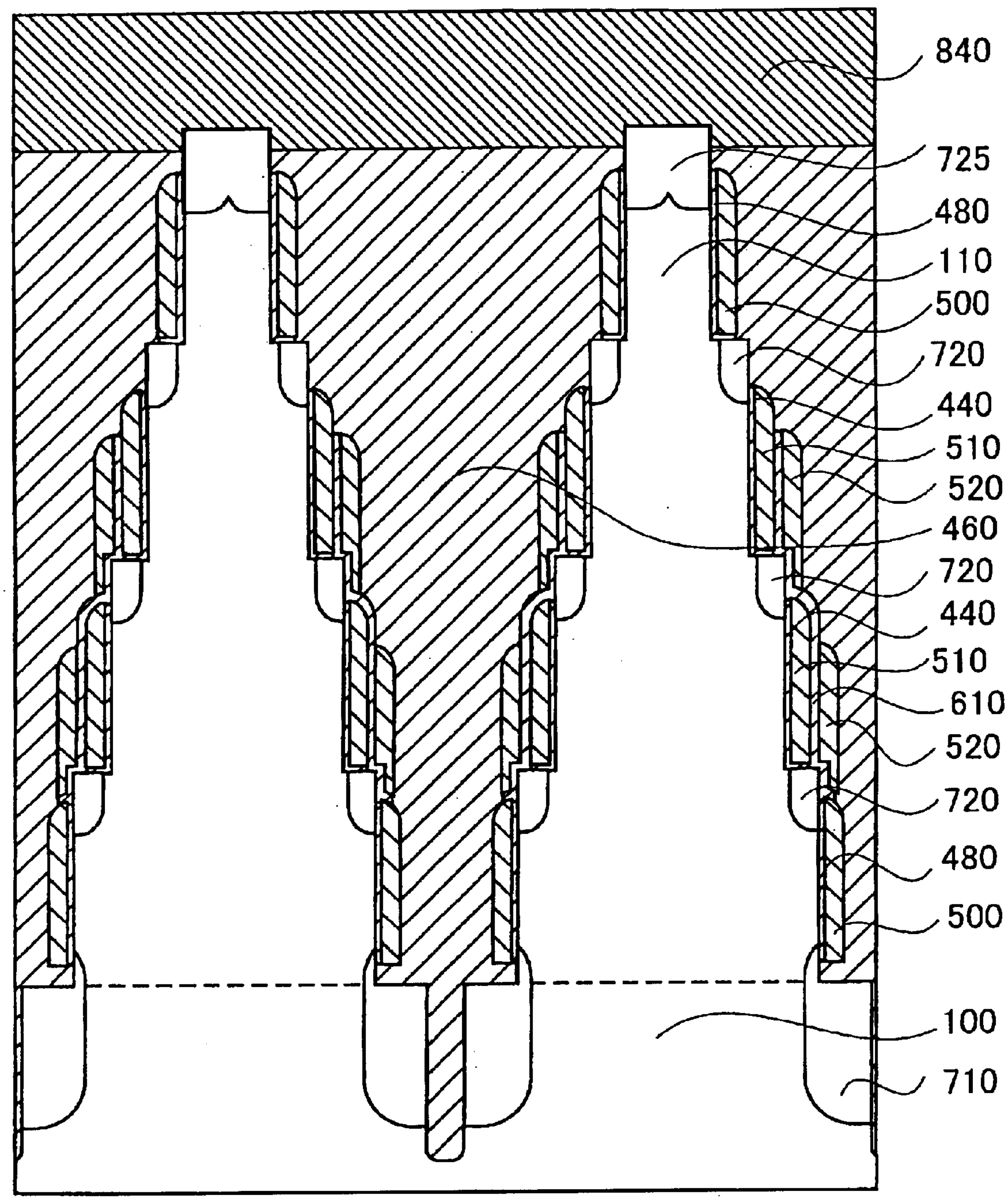

In FIG. 15 and FIG. 16 show an example wherein the interlayer insulating film 610 is formed of a single layer film.

Figure 17:
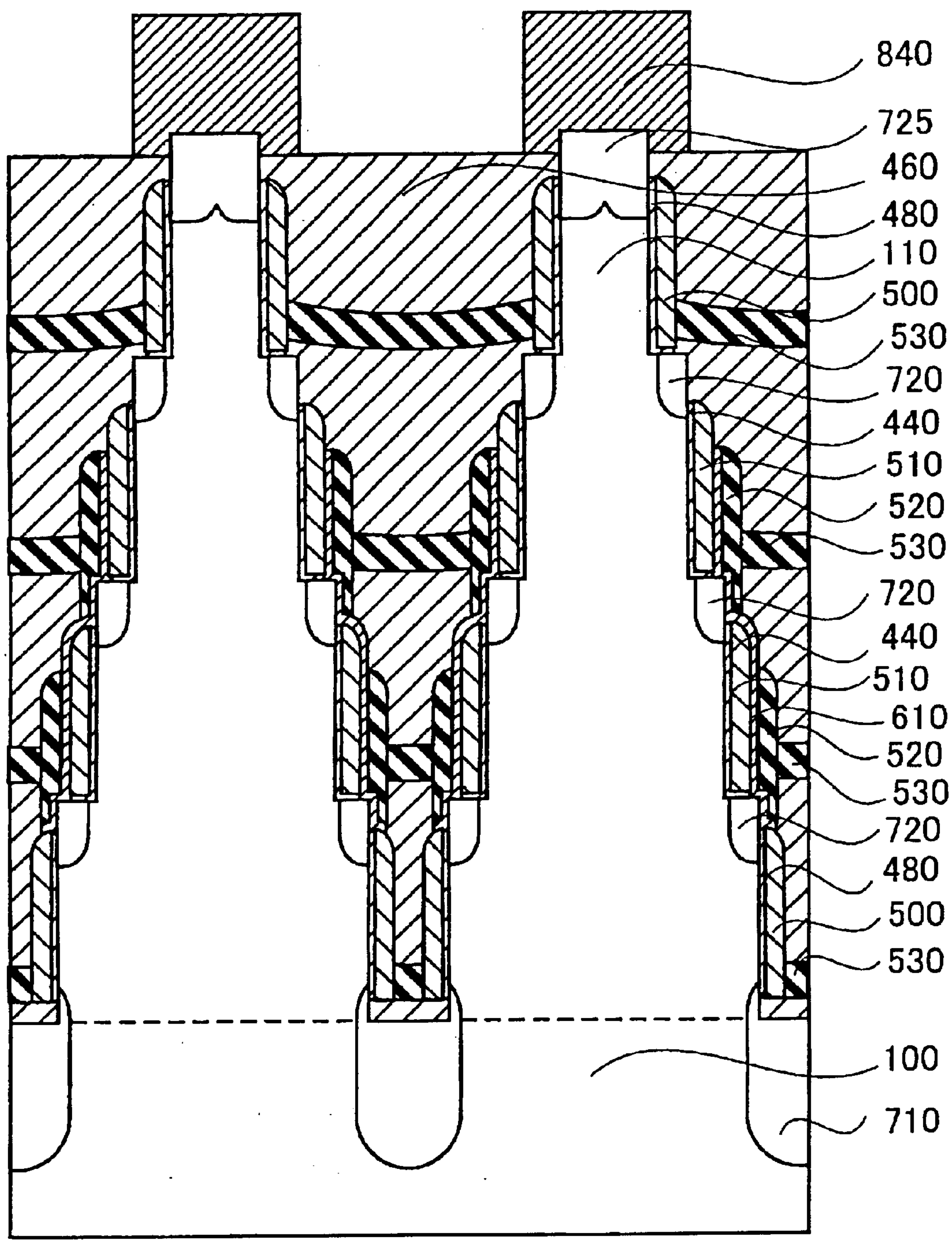
Figure 18:
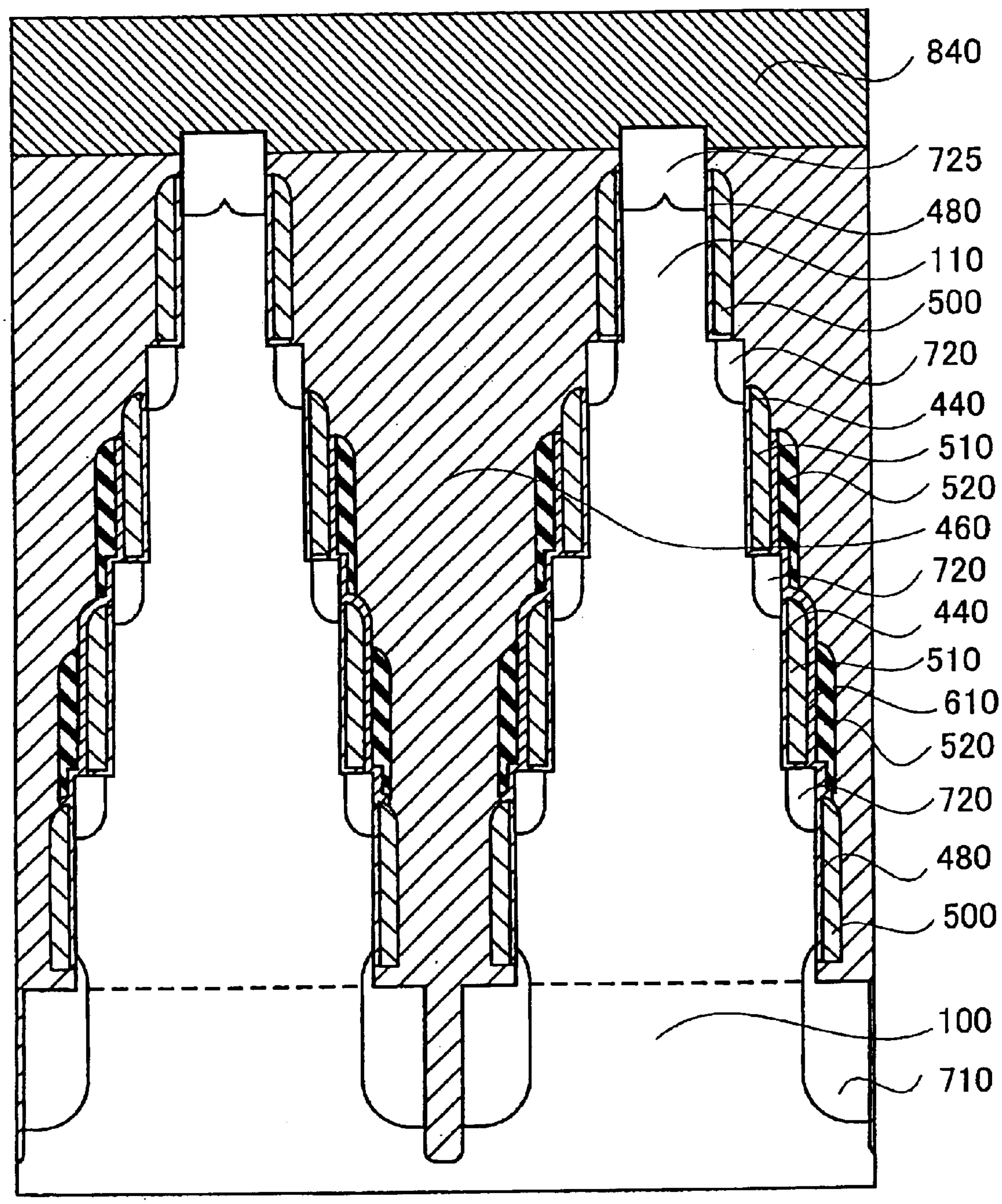

FIG. 17 and FIG. 18 show that the control gates 520 of the memory cells and the third conductive film 530 connecting the control gates are formed of a material different from that for the floating gate as an example wherein one gate and another gate are formed of different materials.

Figure 19:
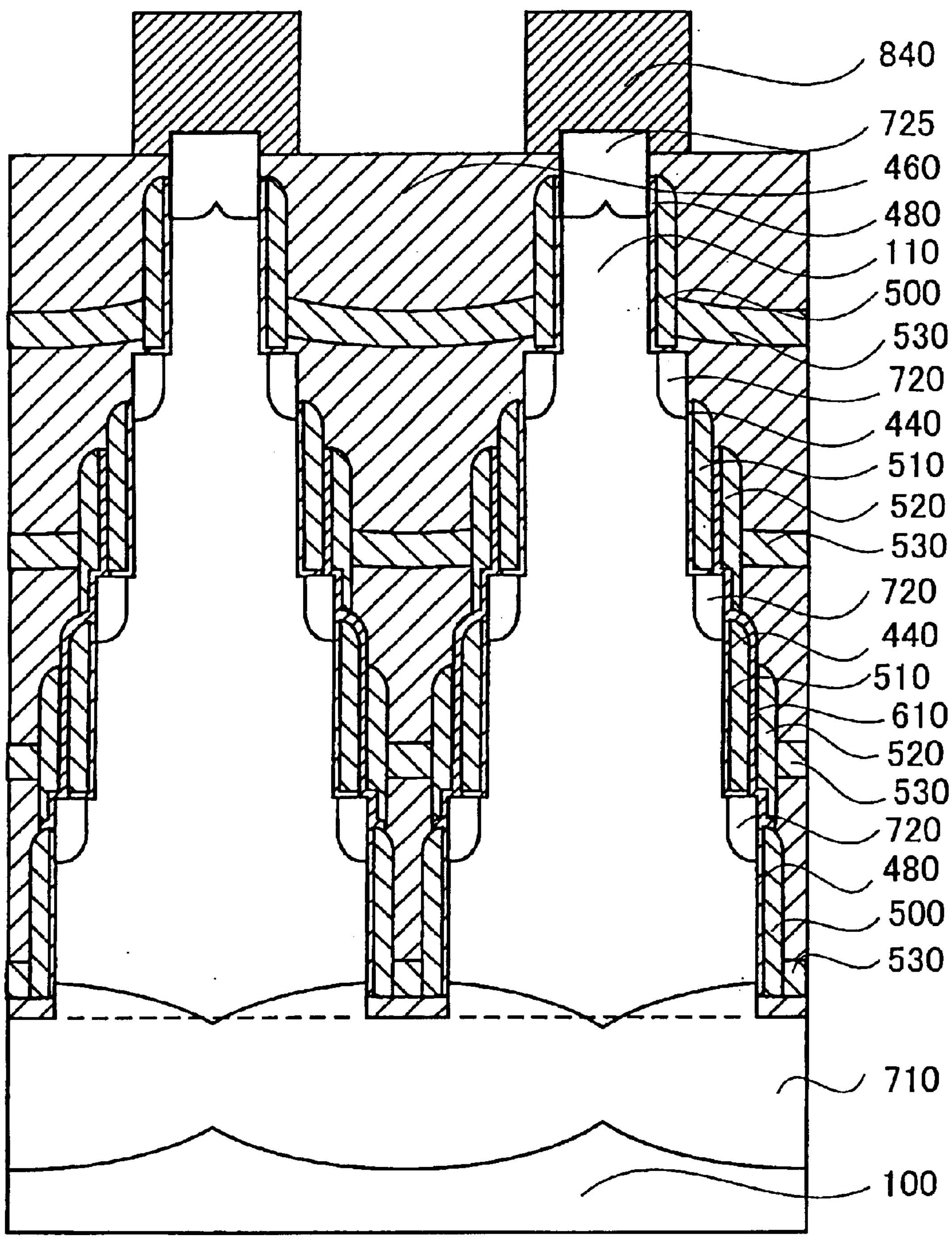
Figure 20:
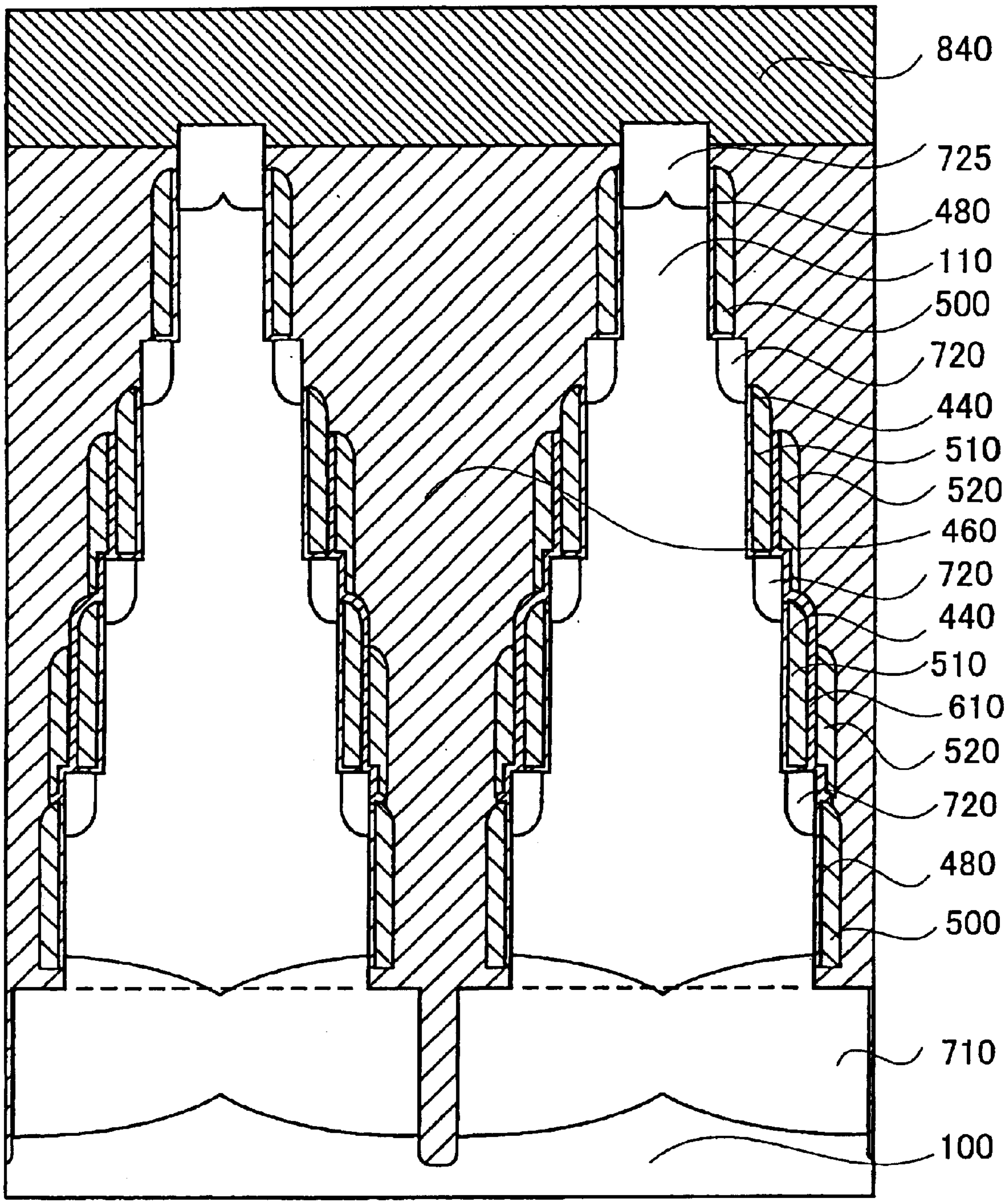

FIG. 19 and FIG. 20 show an example wherein the active regions of the memory cells is in the floating state to the semiconductor substrate by the source diffusion layer 710.

Figure 21:
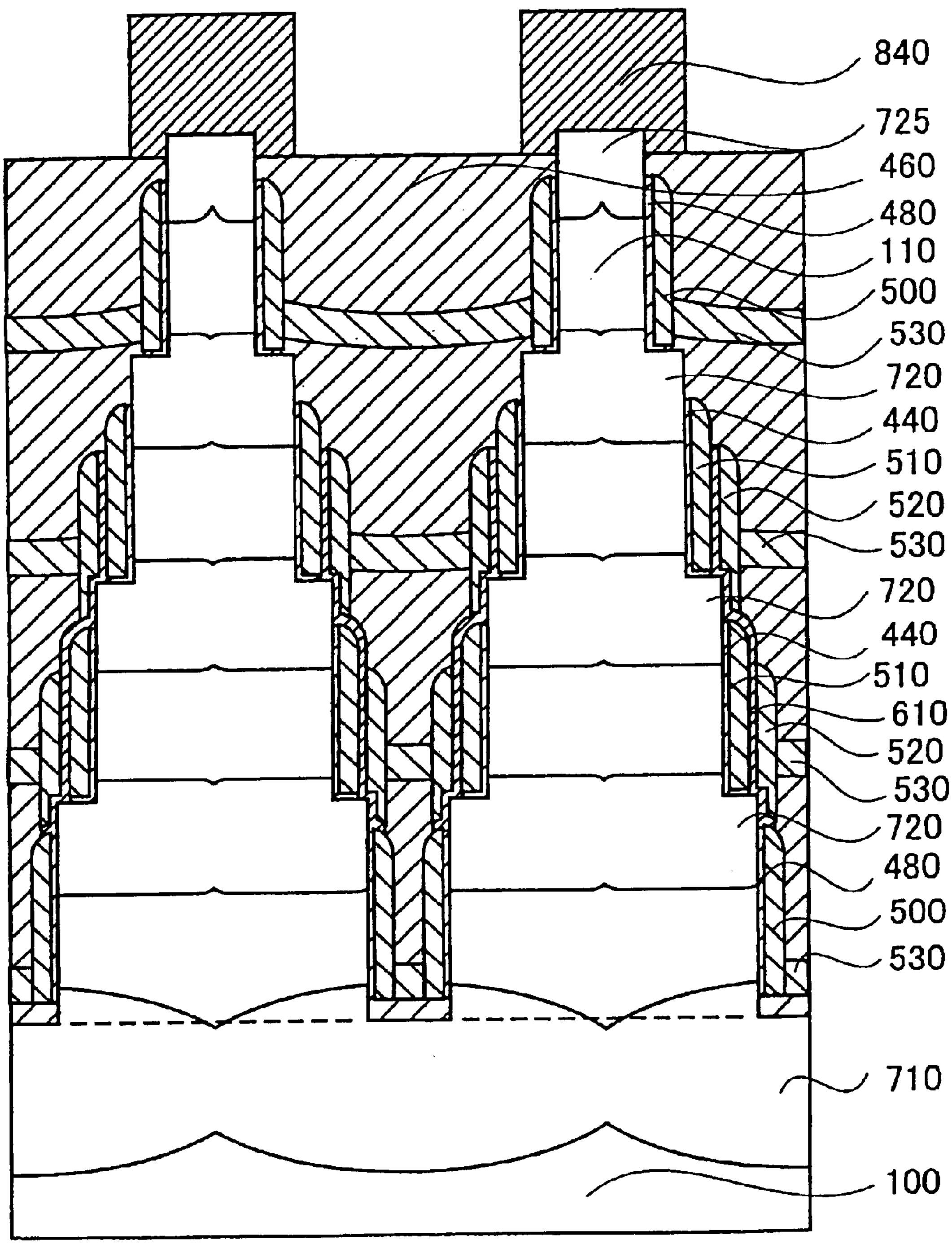
Figure 22:
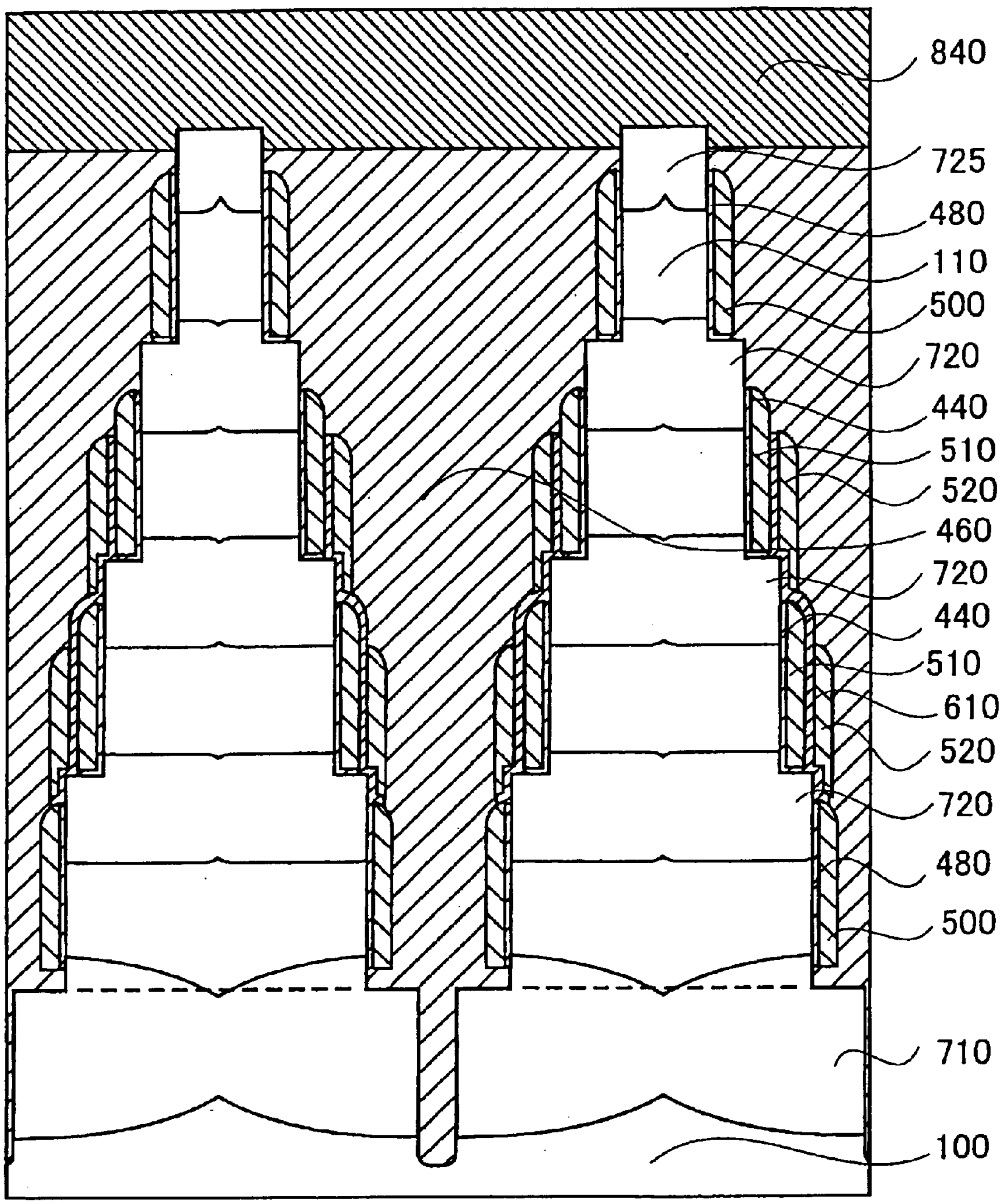

FIG. 21 and FIG. 22 show an example wherein the active regions of the memory cells is in the floating state to the semiconductor substrate by the source diffusion layer 710 and the diffusion layers 720 between the memory cells.

Figure 23:
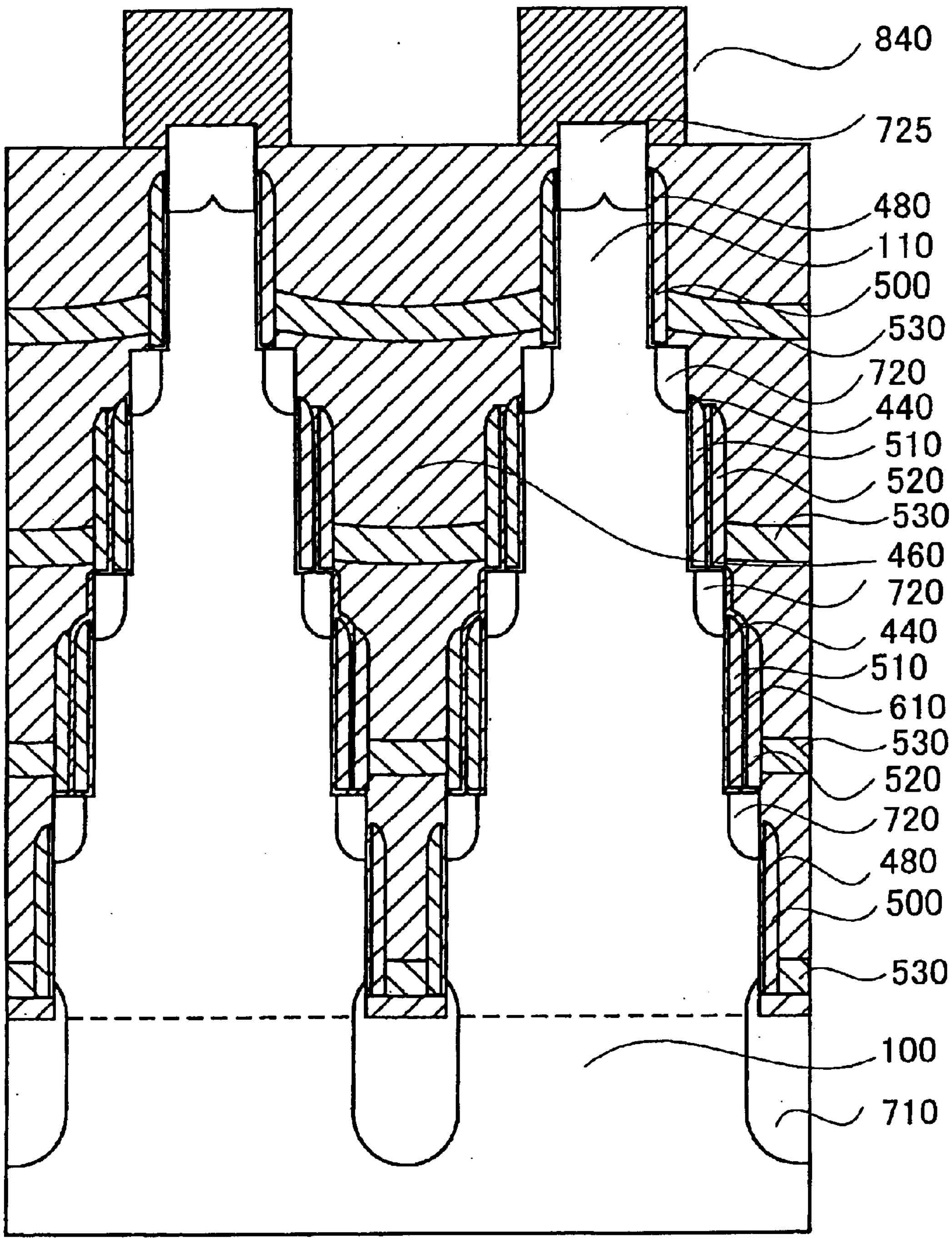
Figure 24:
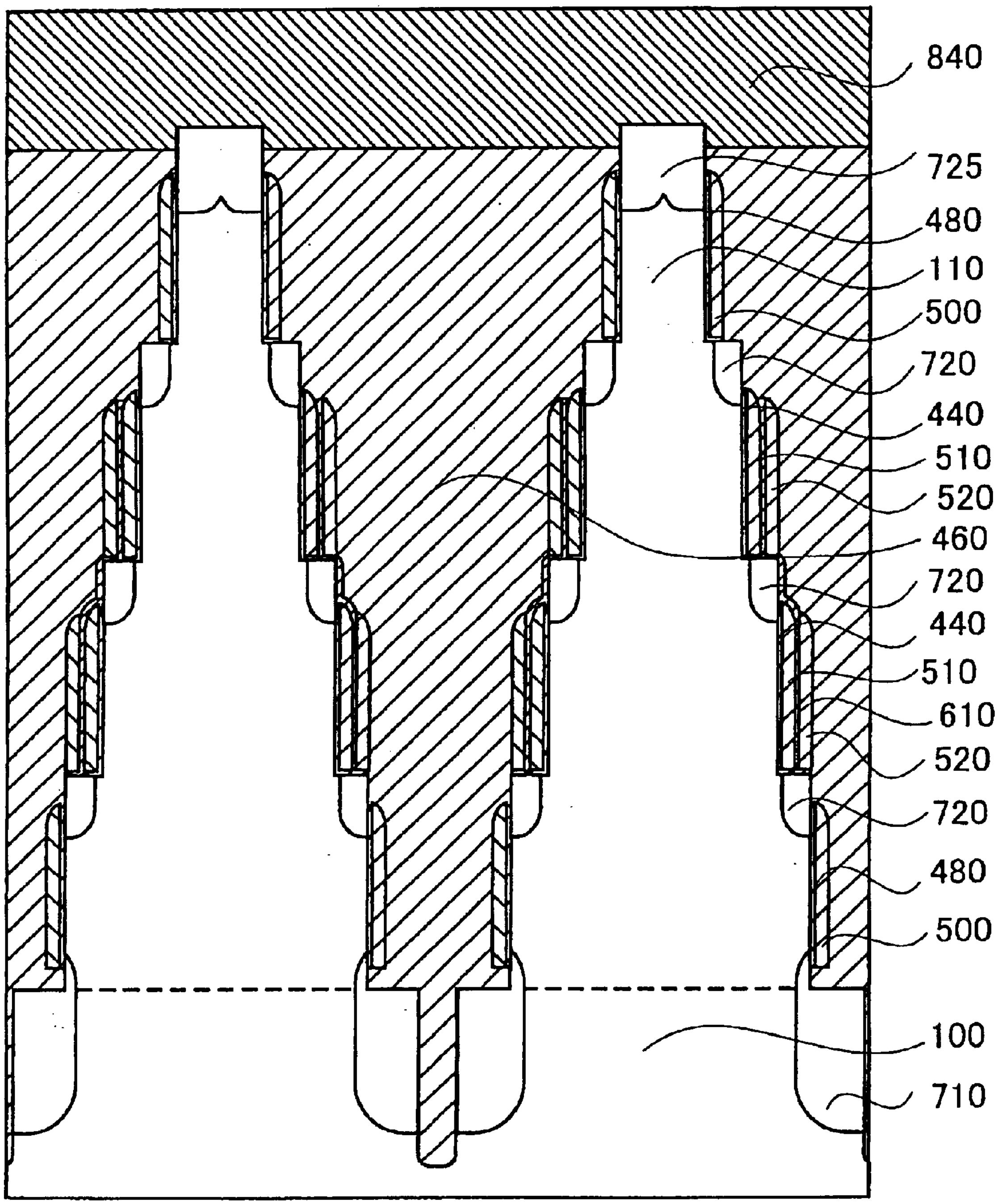

FIG. 23 and FIG. 24 show an example wherein the floating gate 510 and the control gate 520 are provided on the sidewall of the tier without sticking out as compared with FIG. 9 and FIG. 10.

Figure 25:
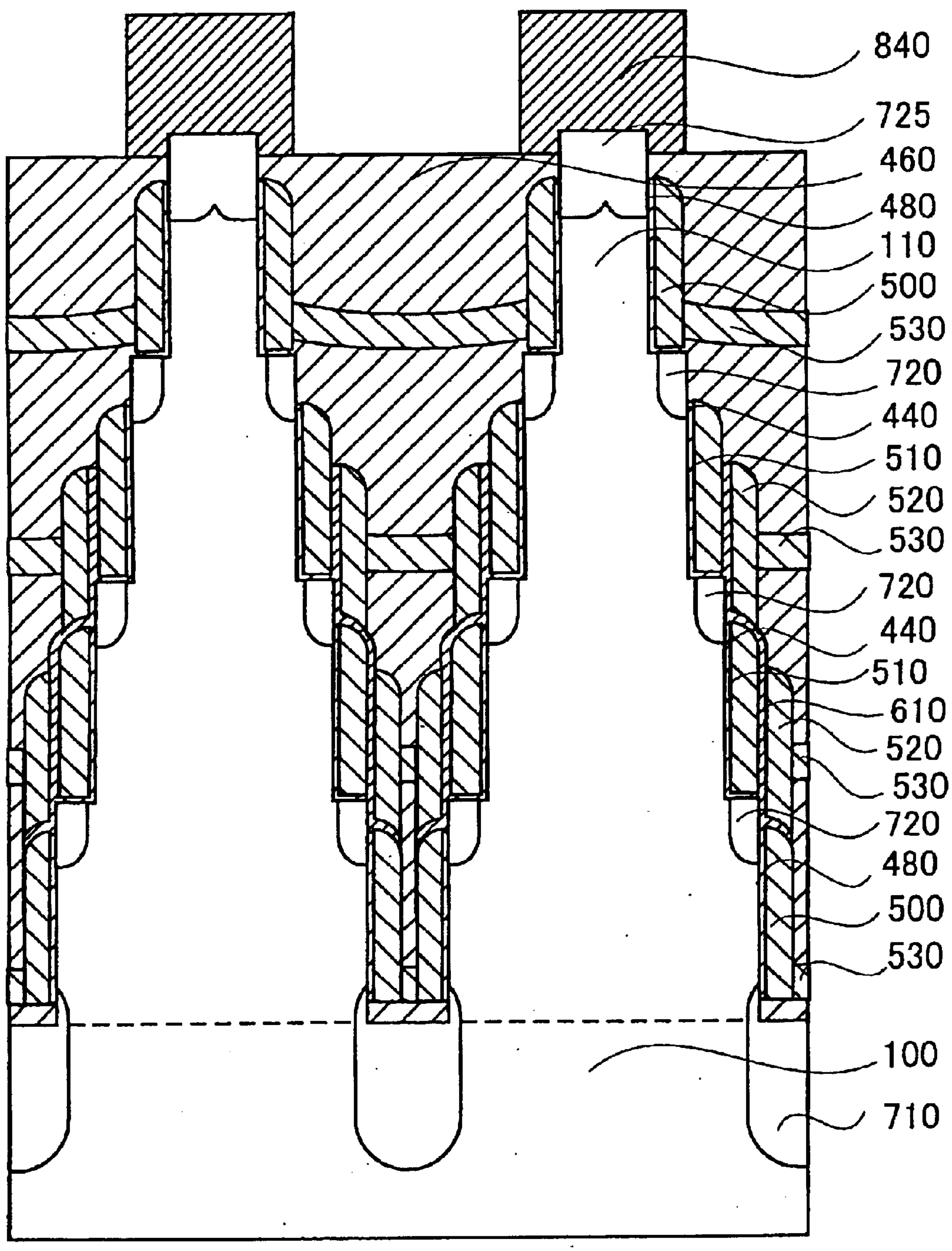
Figure 26:
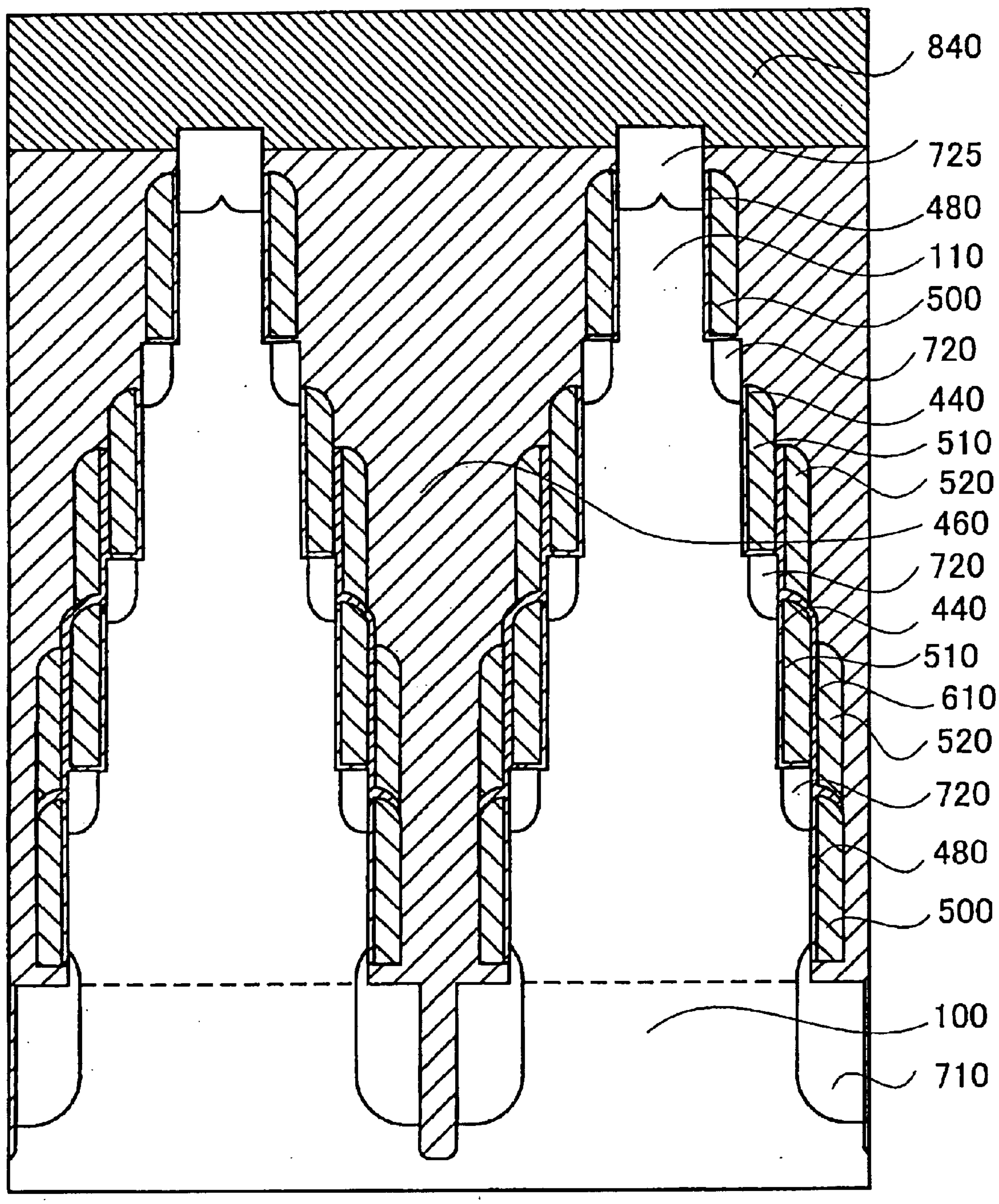

FIG. 25 and FIG. 26 show an example wherein the control gate 520 are formed to stick out completely from the sidewall of the tier as compared with FIG. 9 and FIG. 10.

Figure 27:
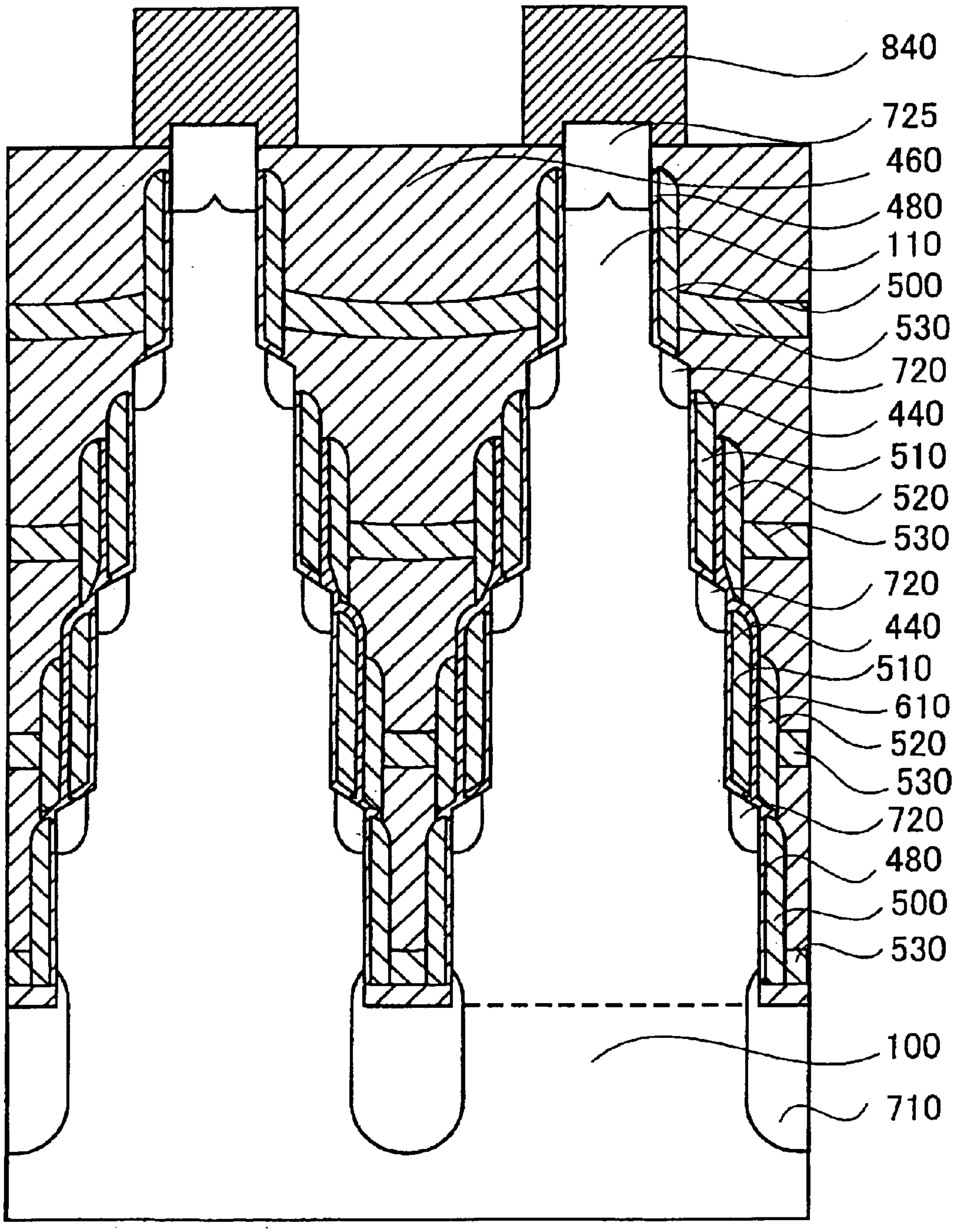
Figure 28:
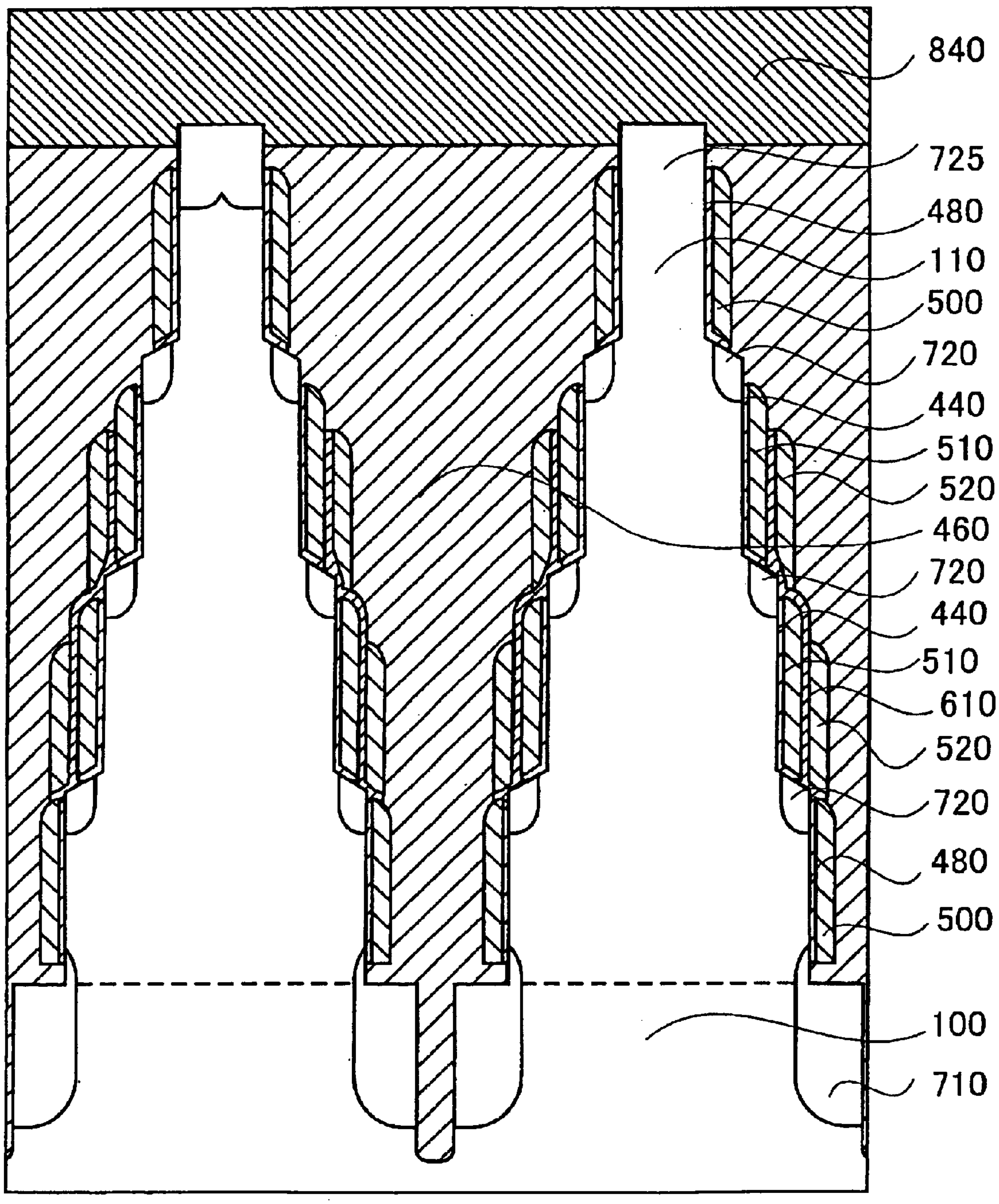

FIG. 27 and FIG. 28 show an example wherein the shoulders of the tier of the island-like semiconductor layer are formed to have an obtuse angle as compared with FIG. 9 and FIG. 10.

Figure 29:
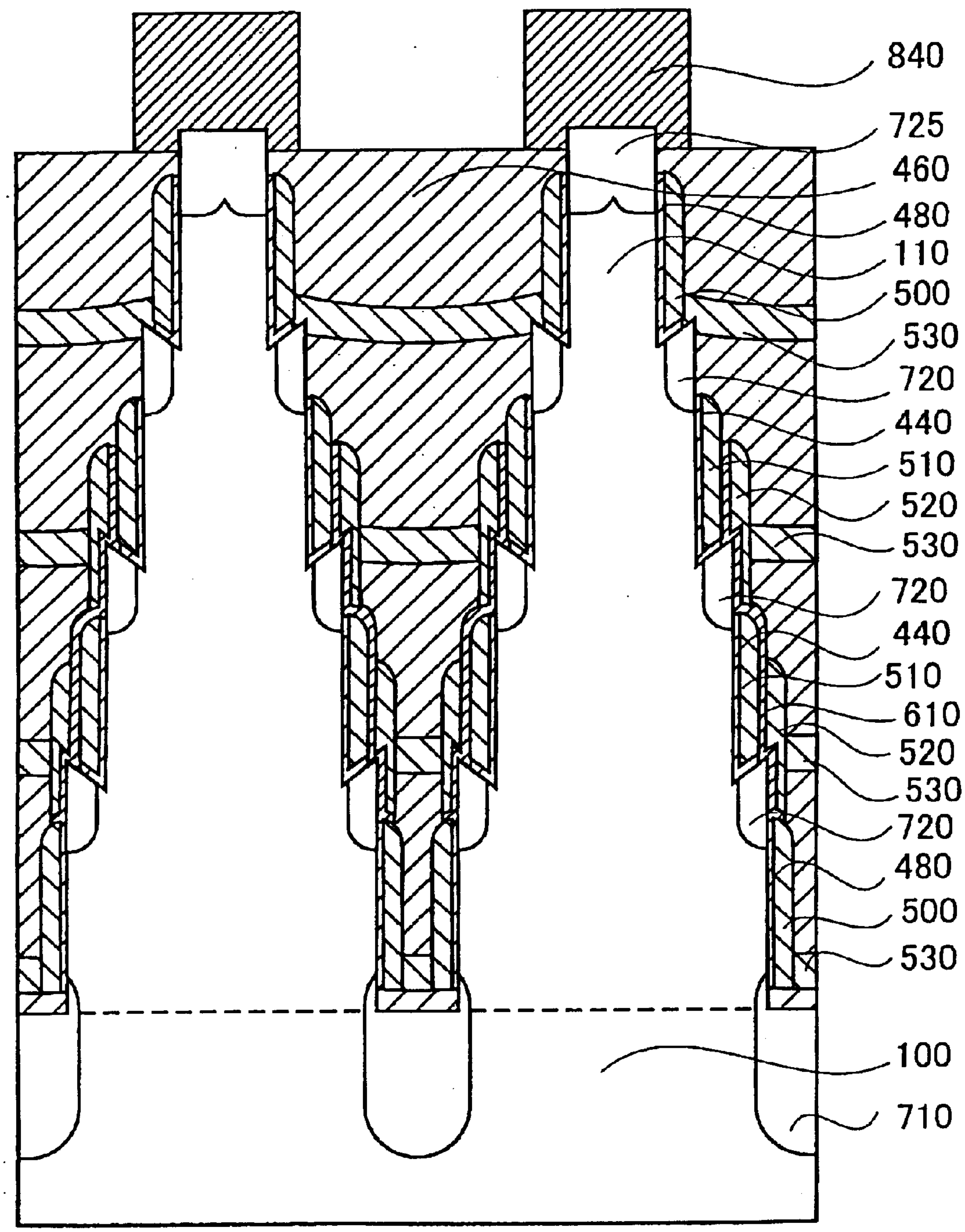
Figure 30:
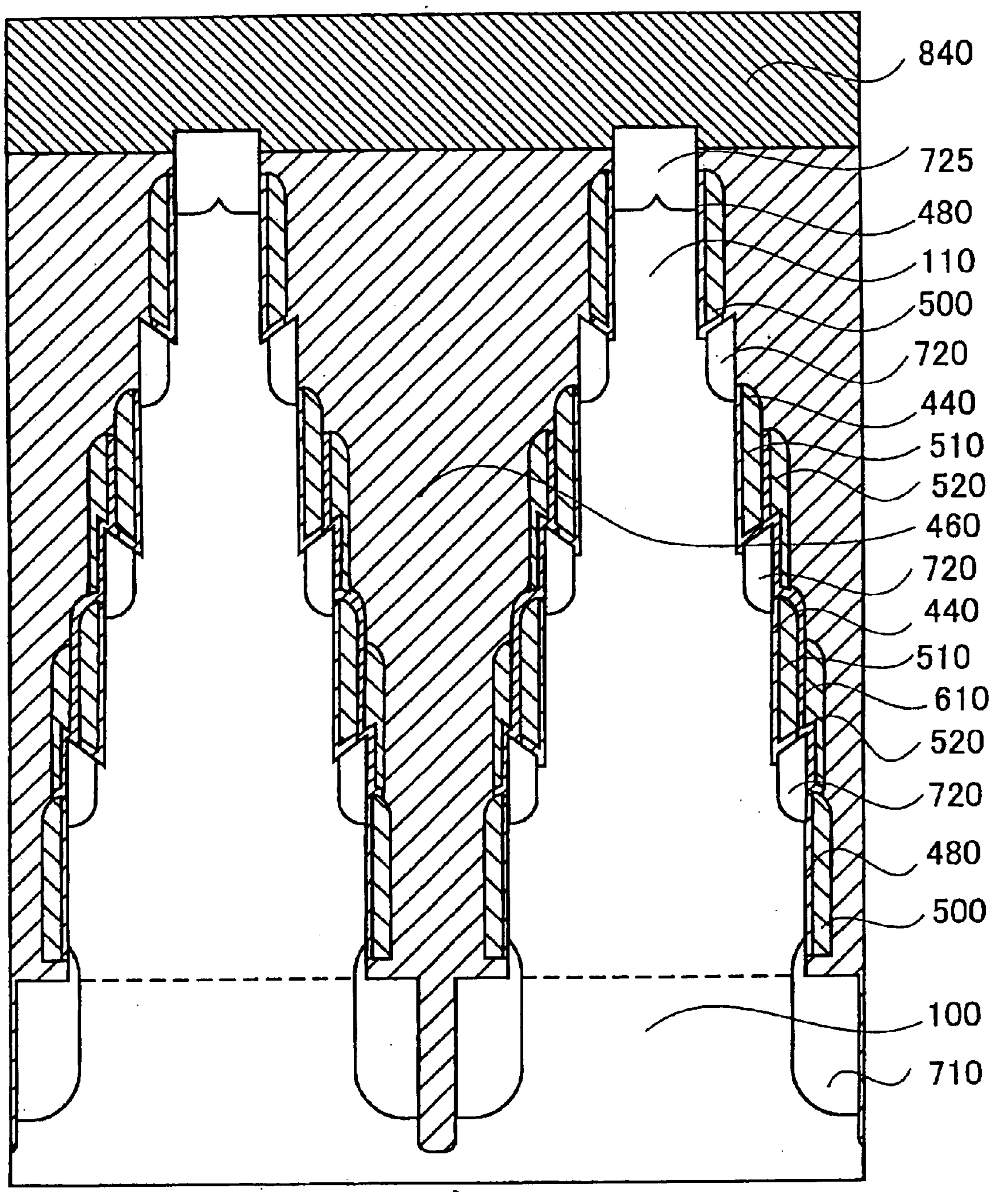

FIG. 29 and FIG. 30 show an example wherein the shoulders of the tier of the island-like semiconductor layer are formed to have an acute angle as compared with FIG. 9 and FIG. 10.

Figure 31:
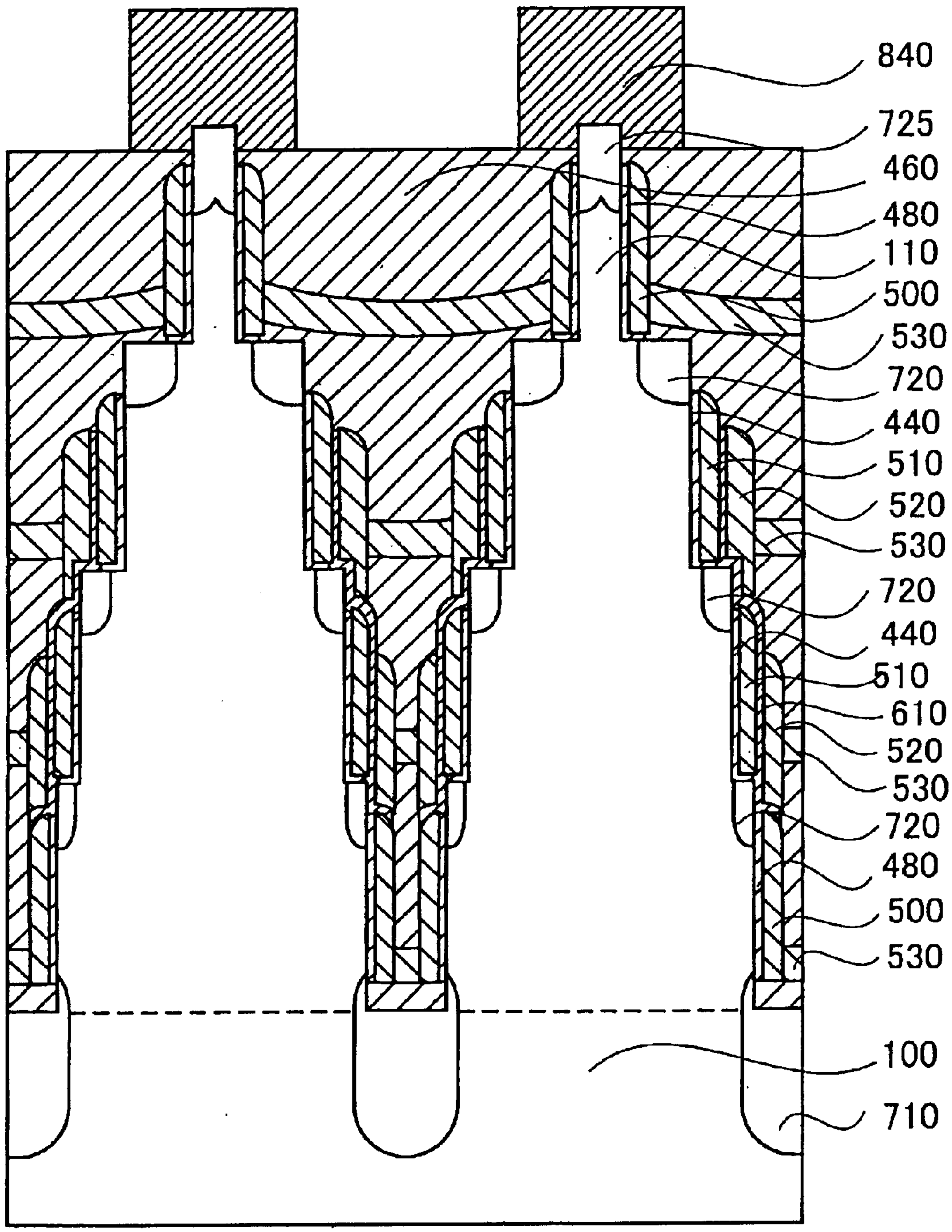
Figure 32:
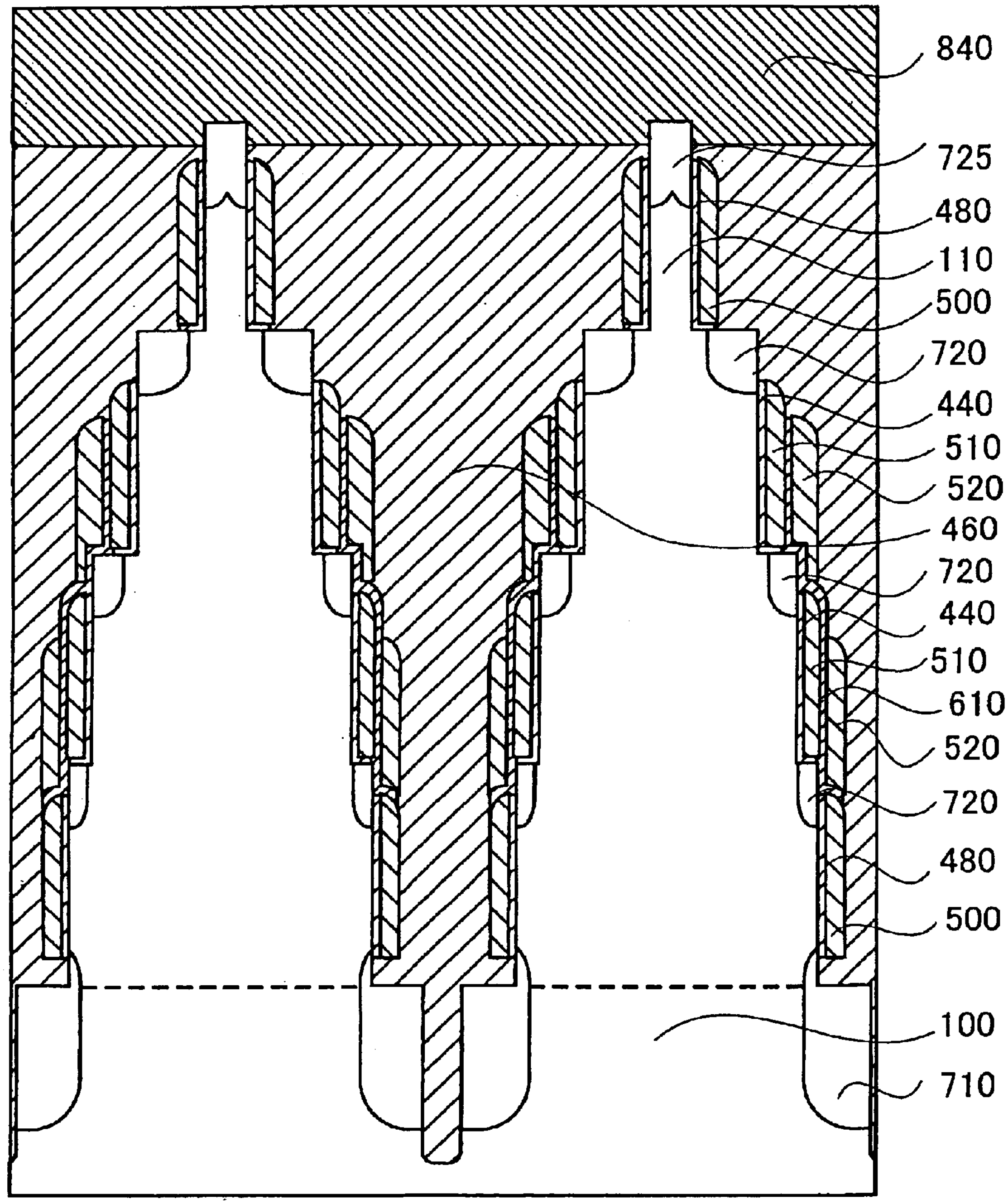

FIG. 31 and FIG. 32 show an example wherein the width of the tiers of the island-like semiconductor layer gradually decrease from the top surface of the semiconductor substrate as compared with FIG. 9 and FIG. 10.

Figure 33:
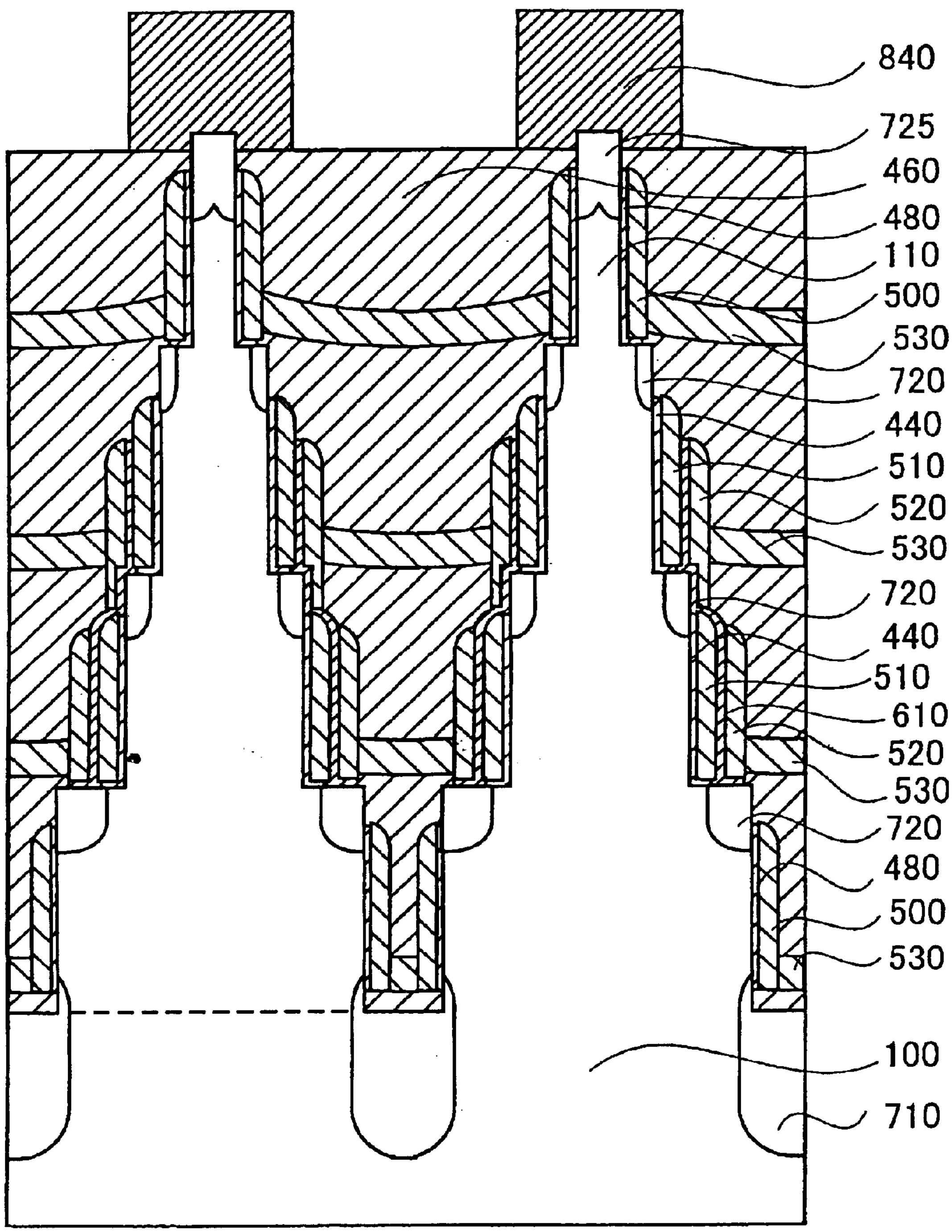
Figure 34:
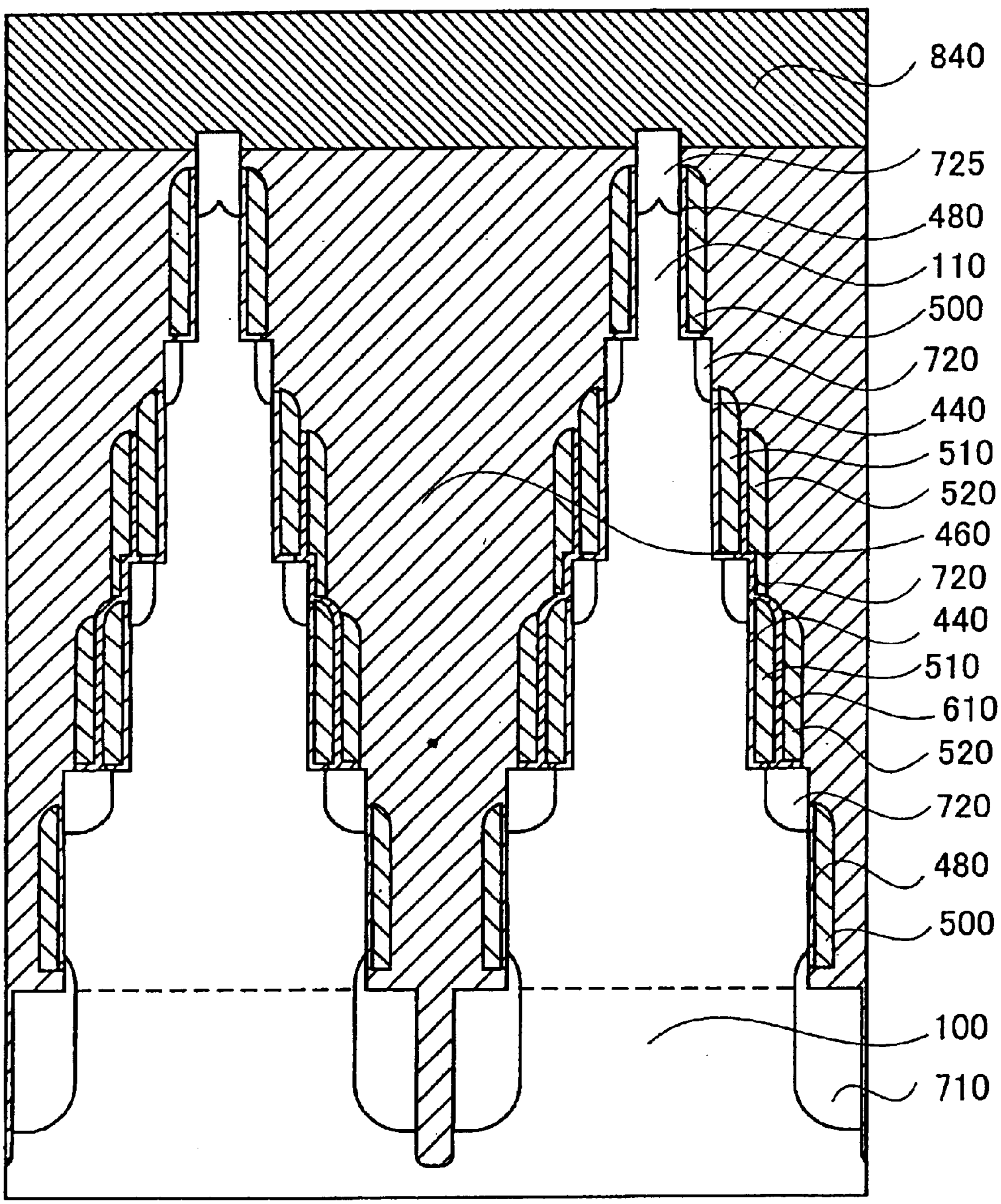

FIG. 33 and FIG. 34 show an example wherein the width of the tiers of the island-like semiconductor layer gradually increase from the top surface of the semiconductor substrate as compared with FIG. 9 and FIG. 10.

Figure 35:
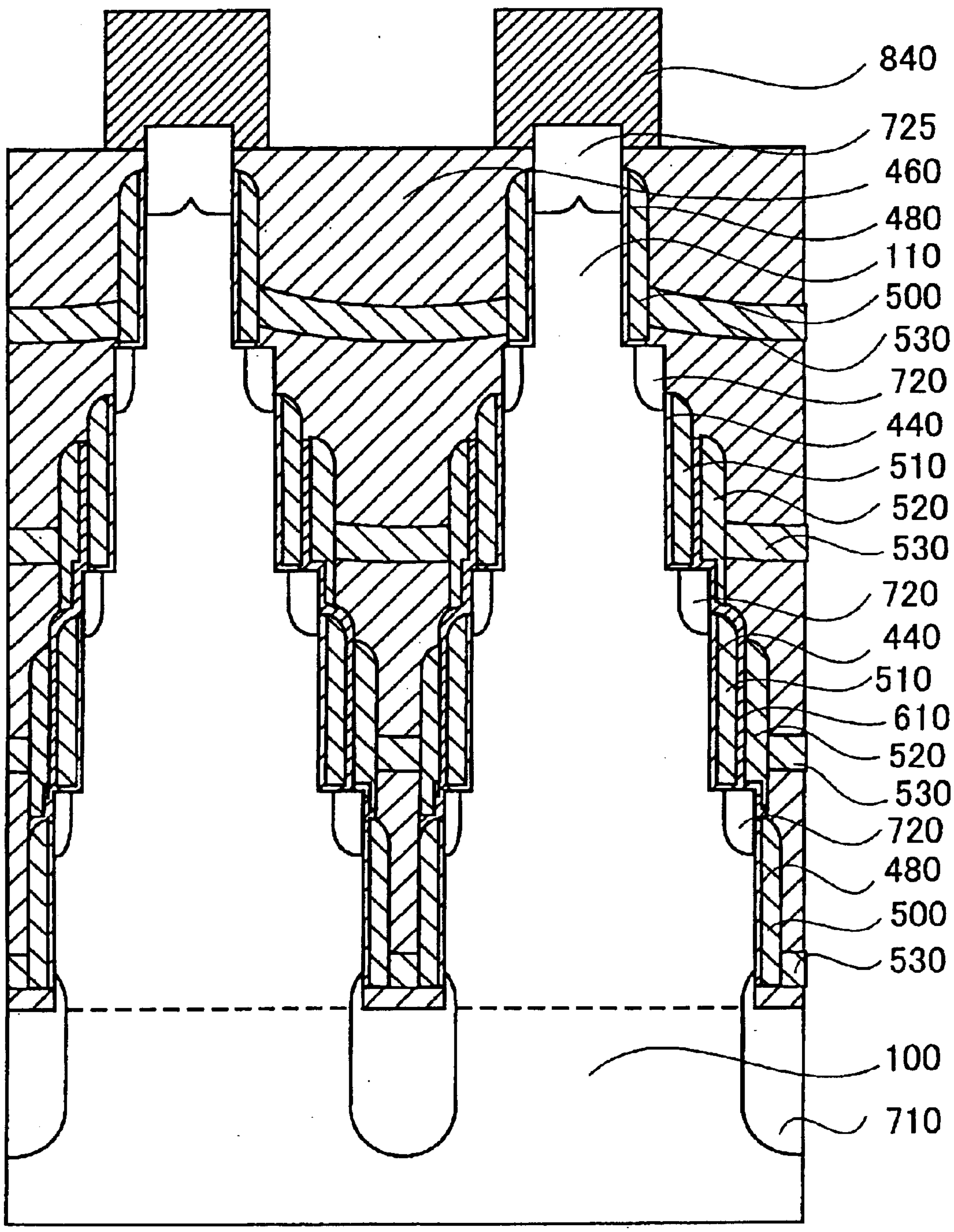
Figure 36:
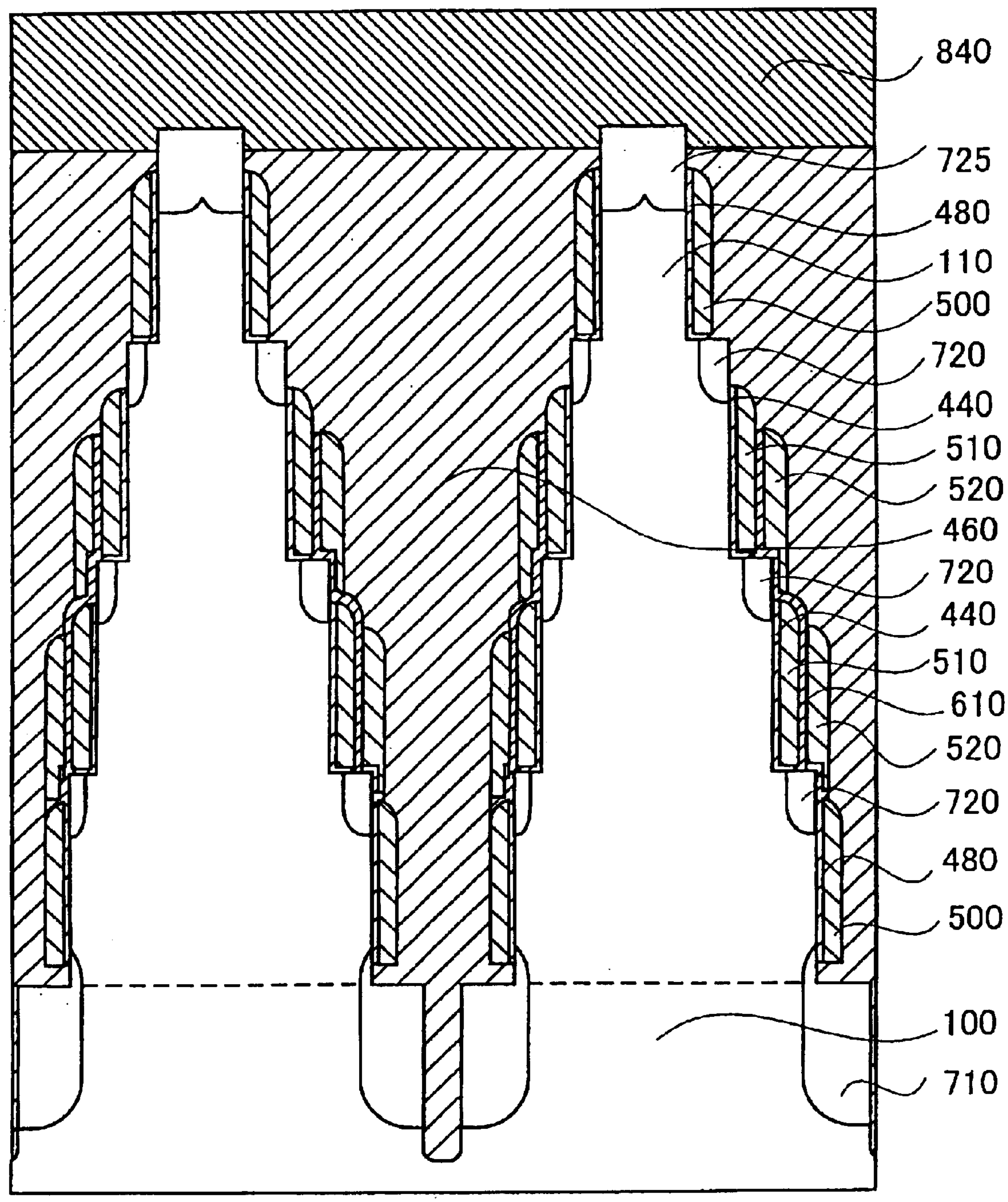

FIG. 35 and FIG. 36 show an example wherein the central axes of the tiers of the island-like semiconductor layer are one-sided as compared with FIG. 9 and FIG. 10.

Figure 37:
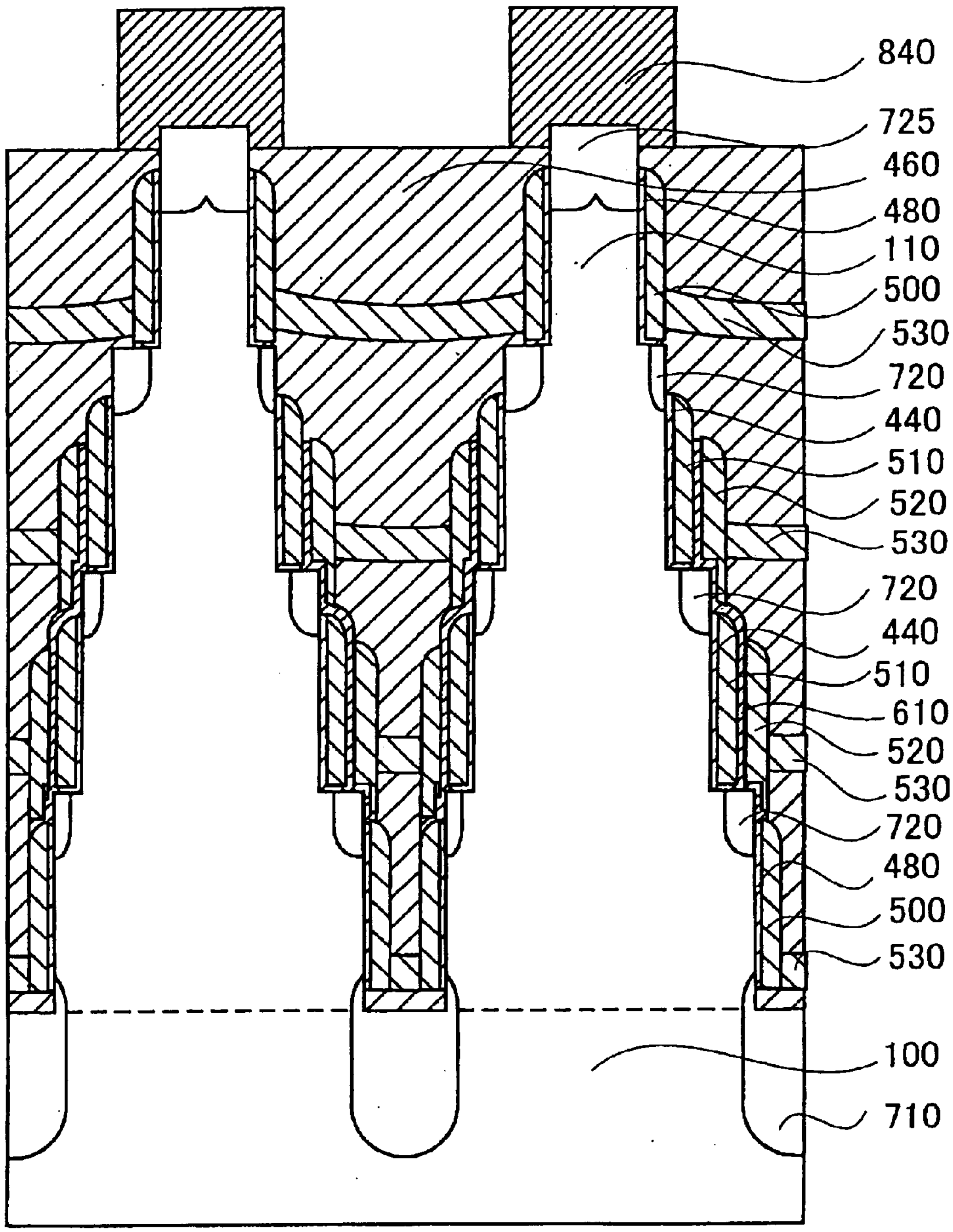
Figure 38:
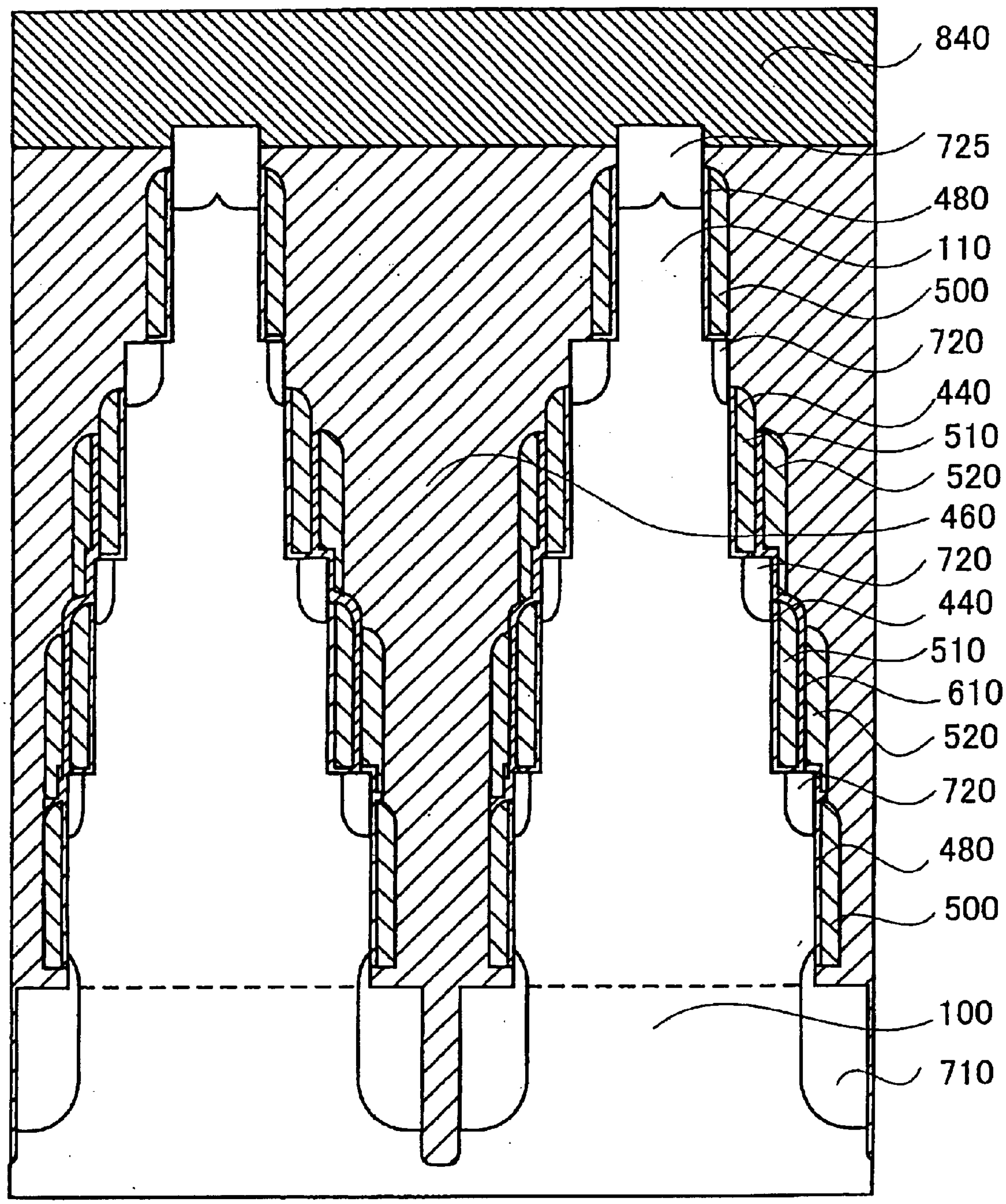

FIG. 37 and FIG. 38 show an example wherein the central axes of the tiers of the island-like semiconductor layer are shifted on a random basis as compared with FIG. 9 and FIG. 10.

Figure 39:
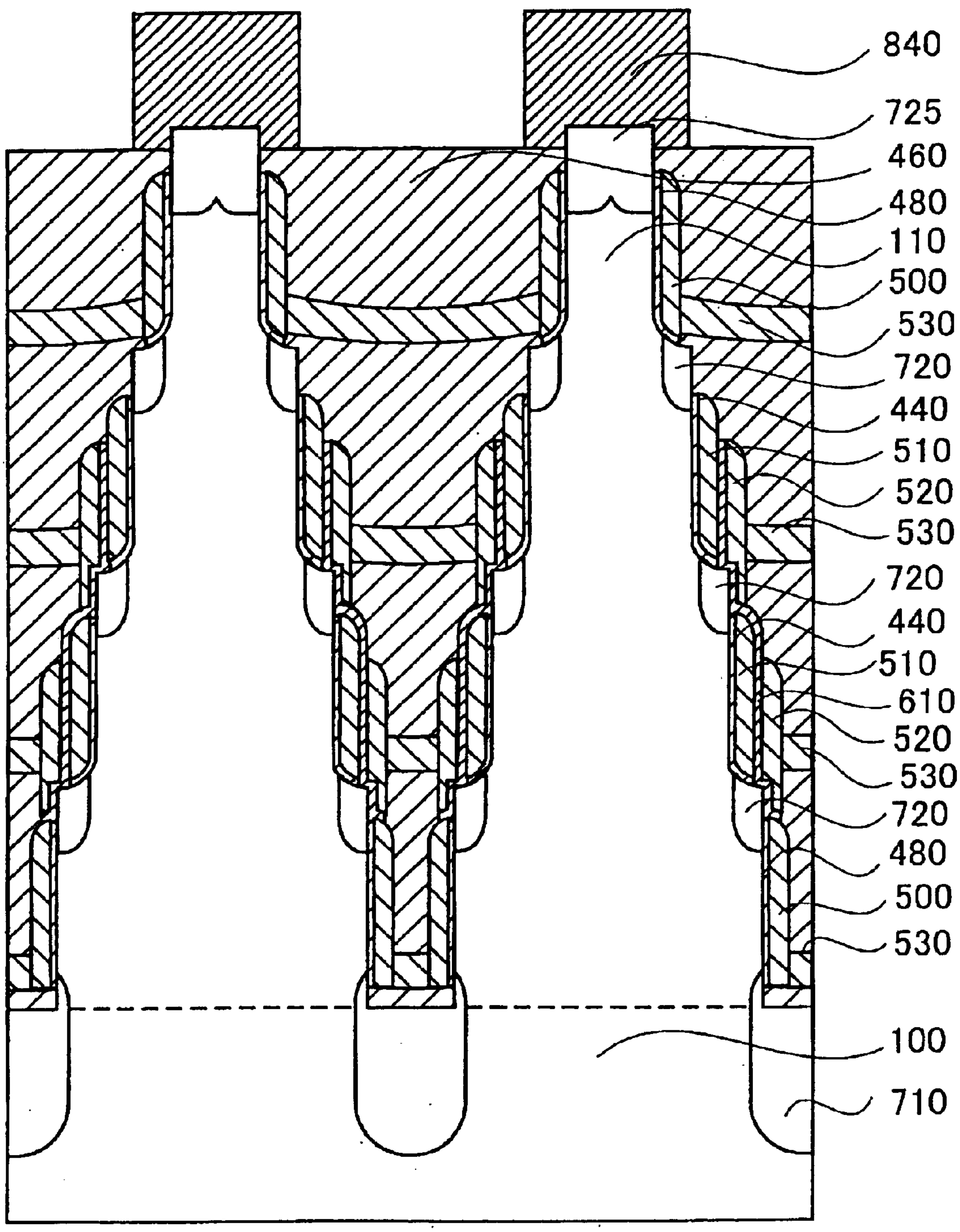
Figure 40:
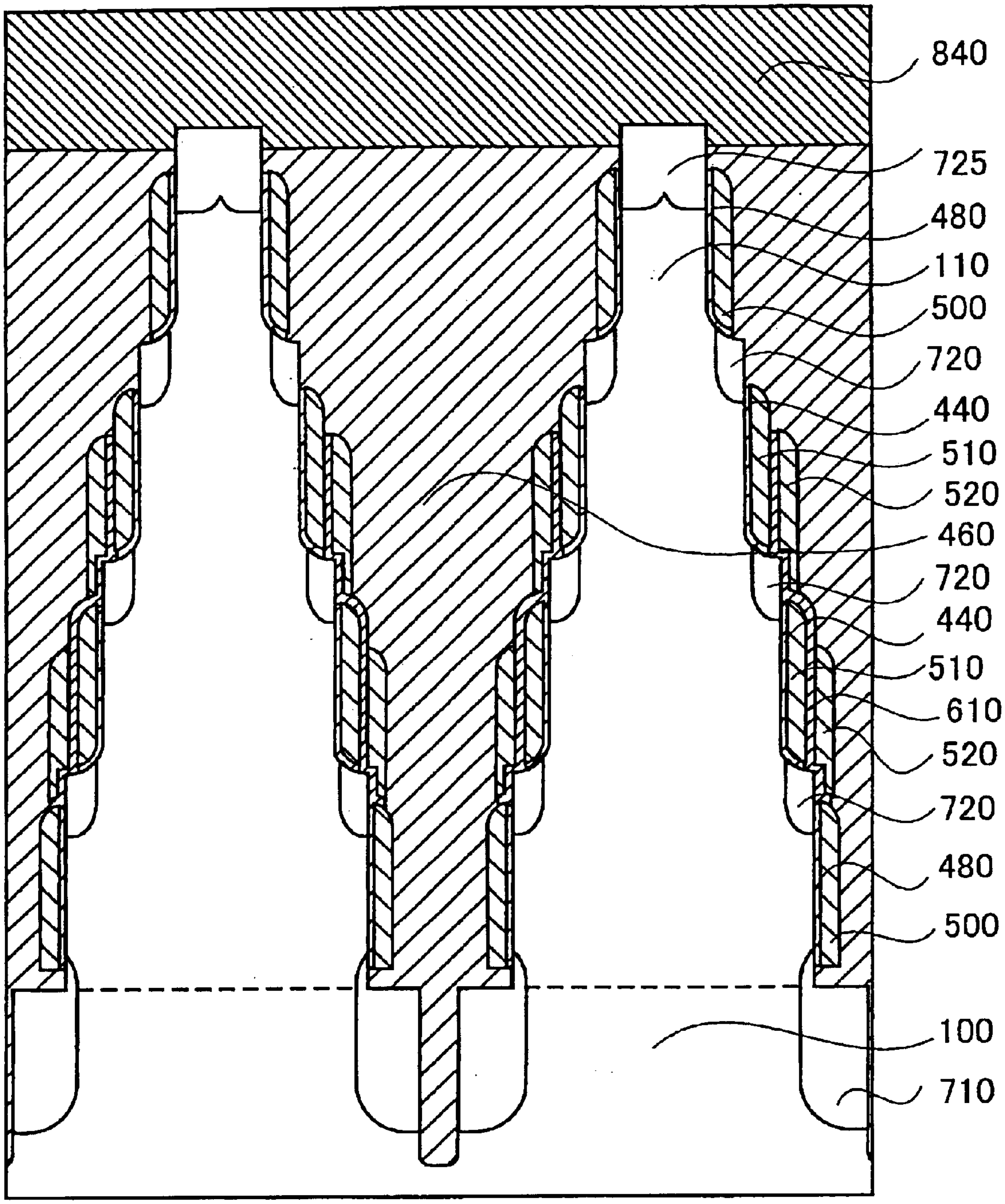

FIG. 39 and FIG. 40 show an example wherein the shoulders of the tiers of the island-like semiconductor layer have rounded corners as compared with FIG. 9 and FIG. 10.

Figure 41:
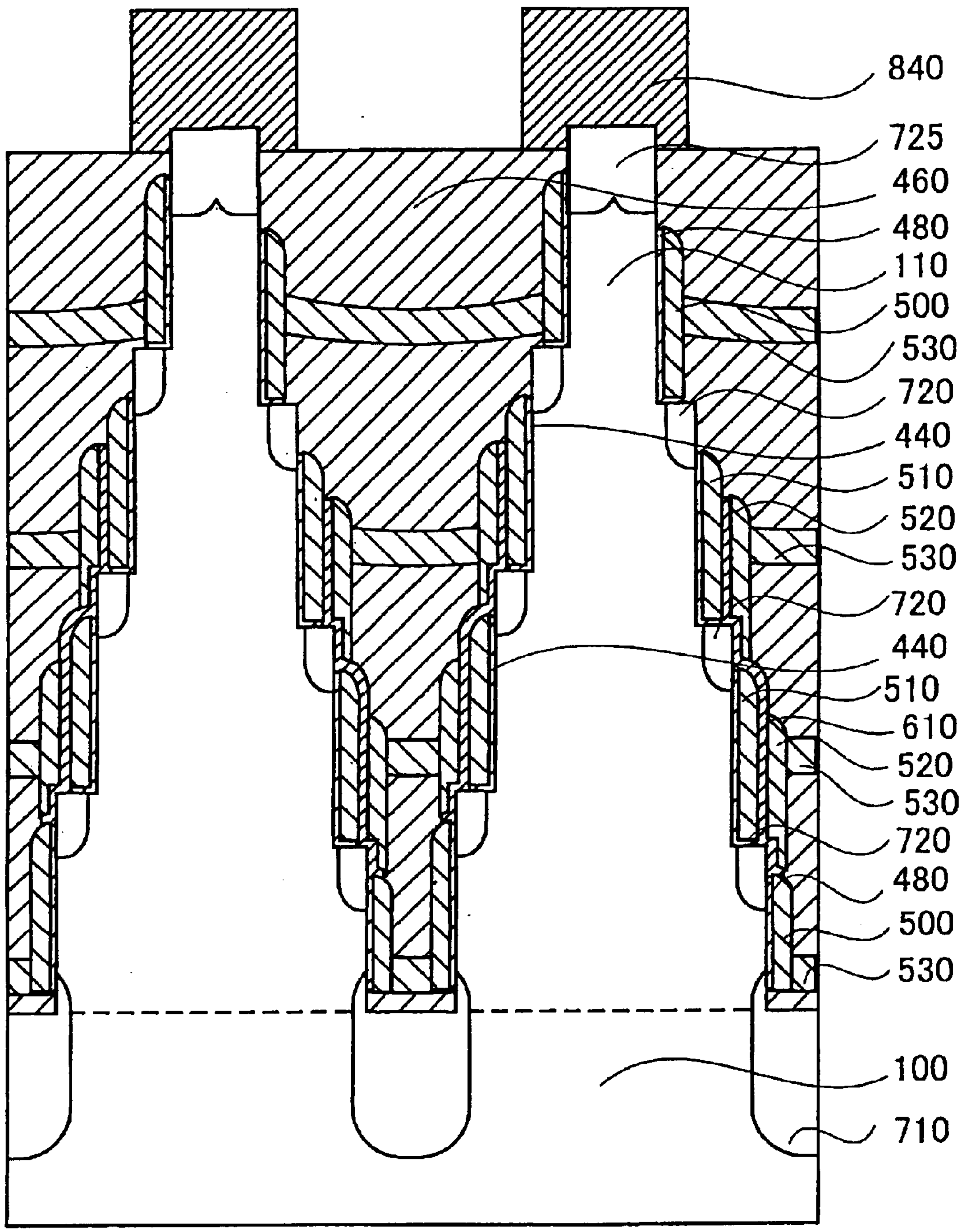
Figure 42:
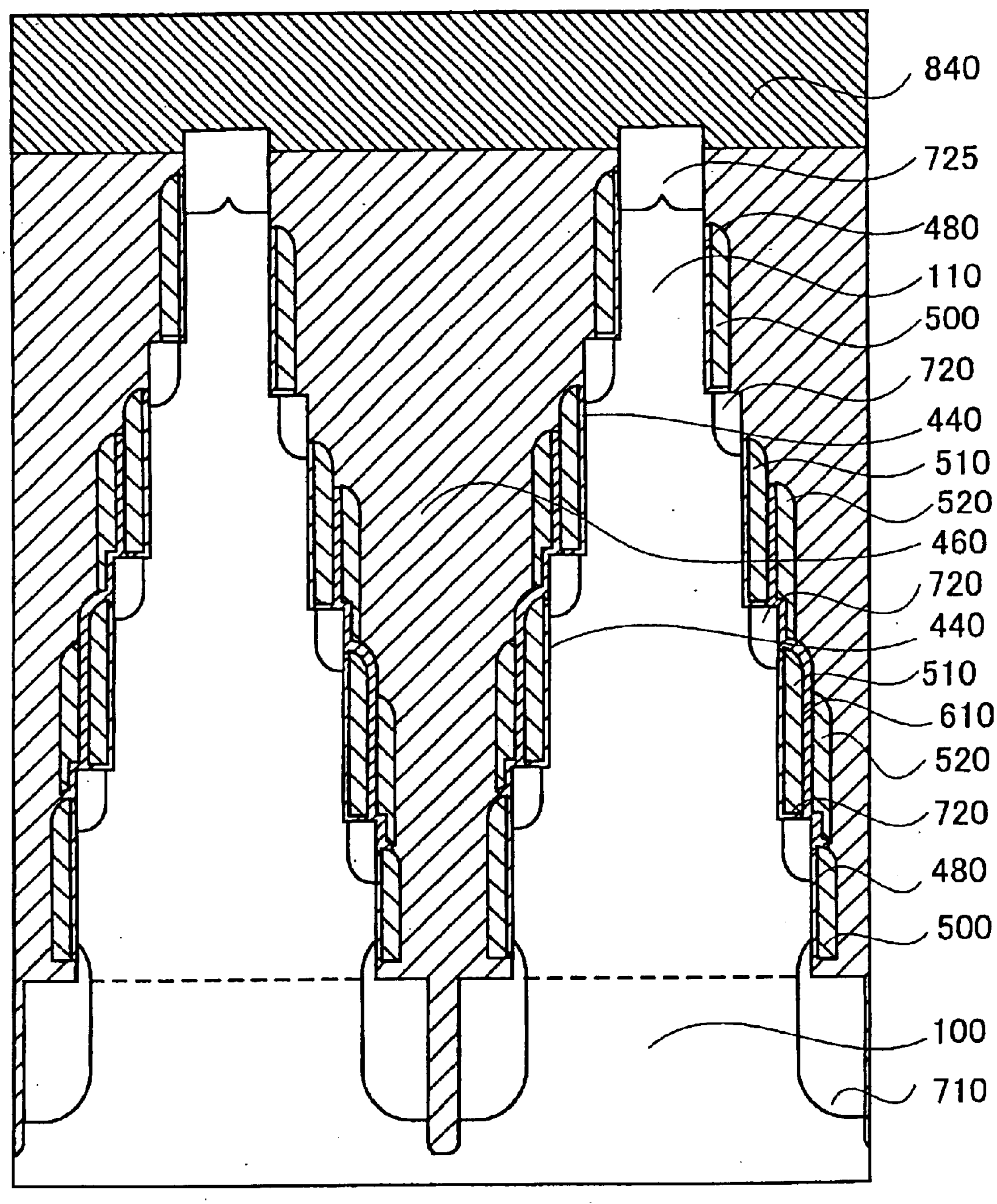

FIG. 41 and FIG. 42 show an example wherein the heights of the tiers of the island-like semiconductor layer deviate at both side as compared with FIG. 9 and FIG. 10.

Figure 43:
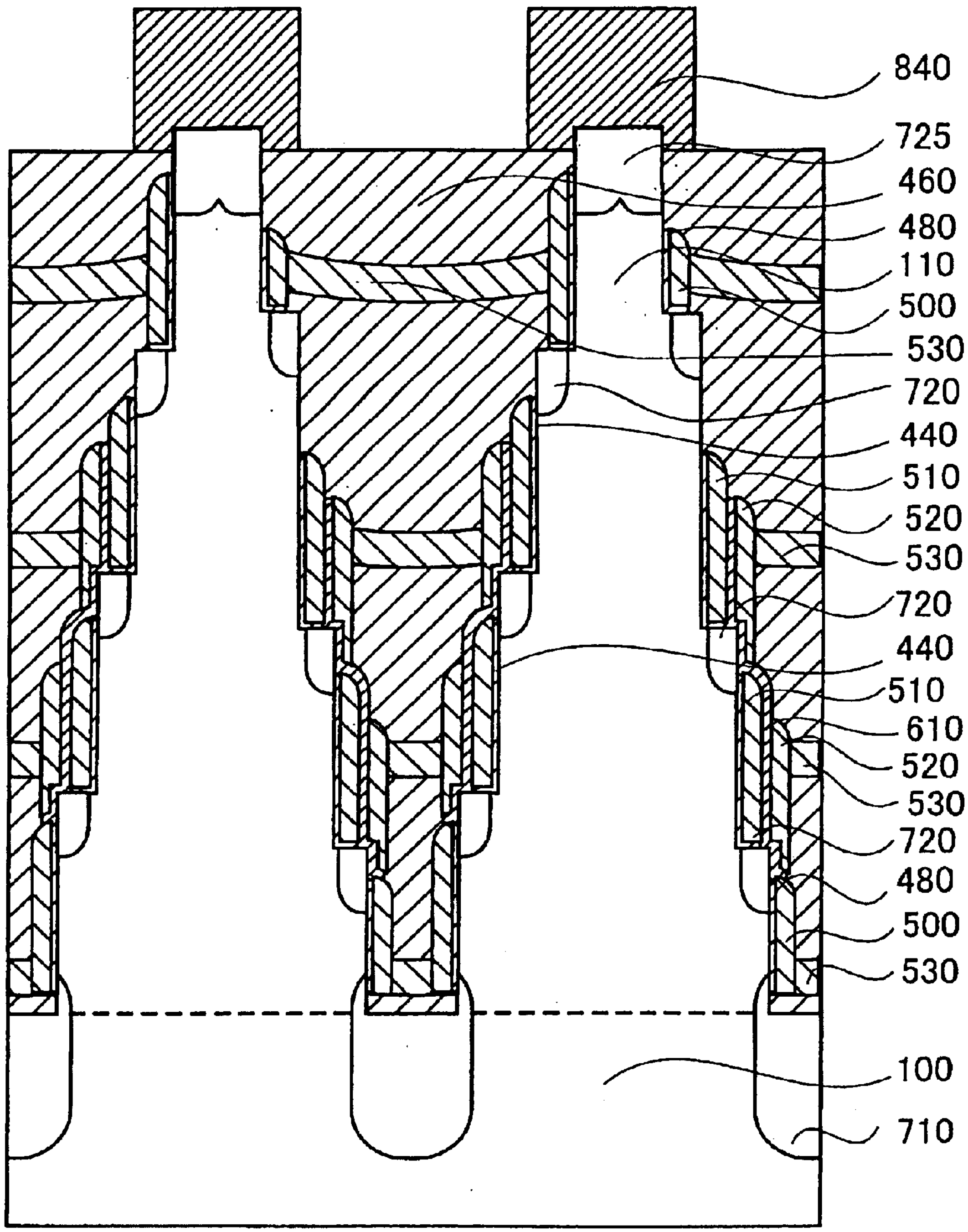
Figure 44:
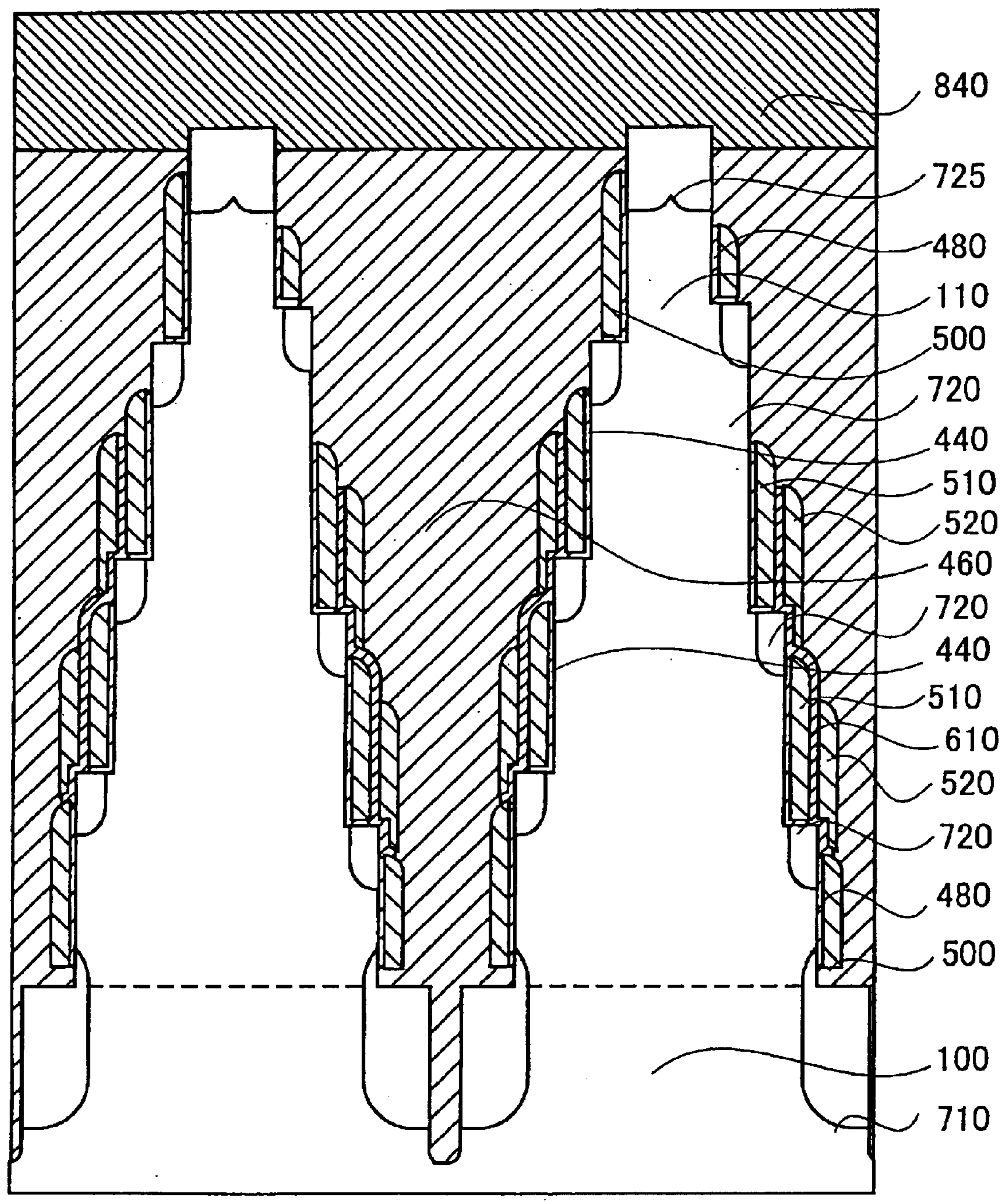

FIG. 43 and FIG. 44 show an example wherein the heights of the tiers of the island-like semiconductor layer deviate on a random basis as compared with FIG. 9 and FIG. 10.

Figure 45:
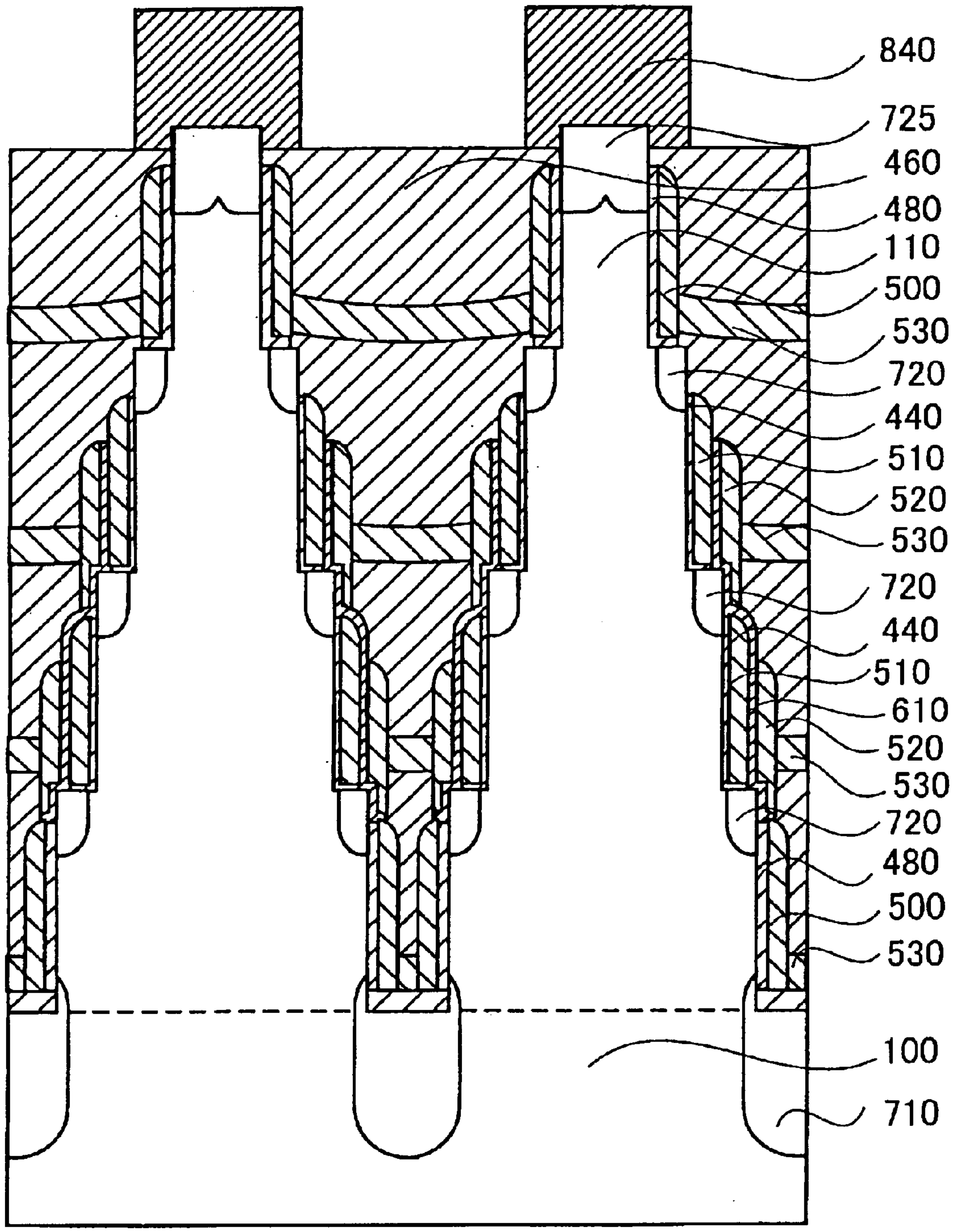
Figure 46:
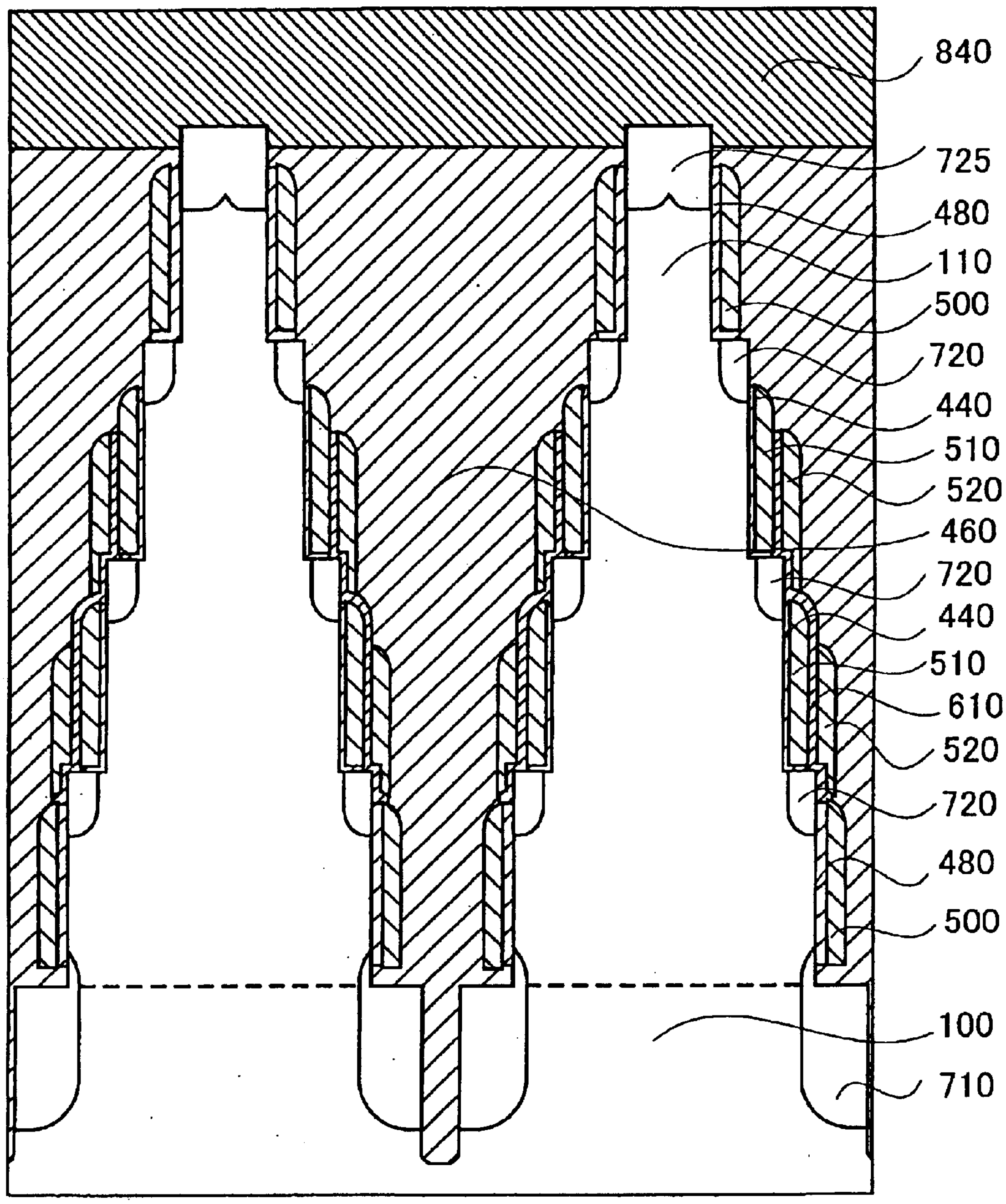

FIG. 45 and FIG. 46 show an example wherein the gate insulating film 480 has a thickness larger than that of the tunnel oxide film 440 as compared with FIG. 9 and FIG. 10.

Figure 47:
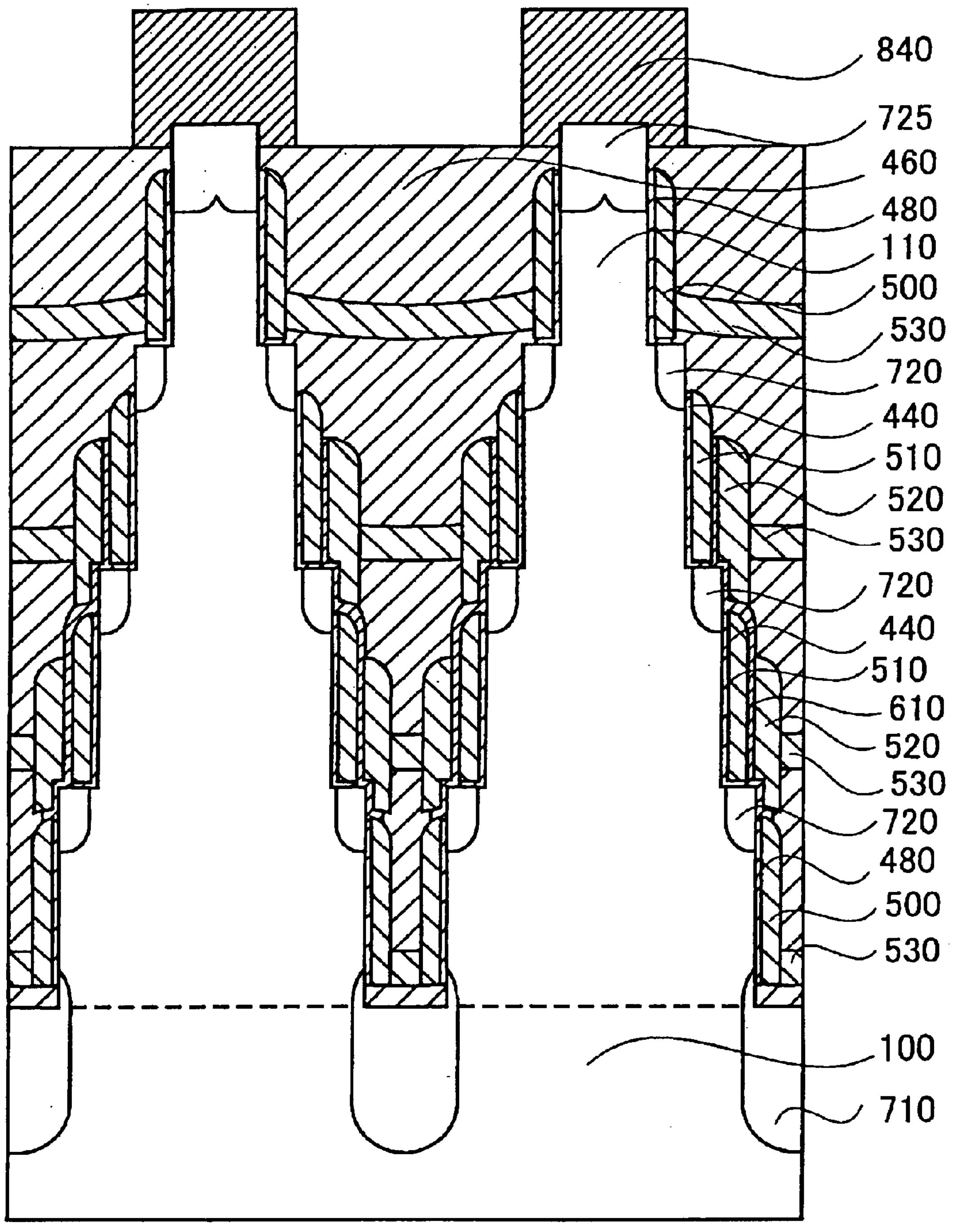
Figure 48:
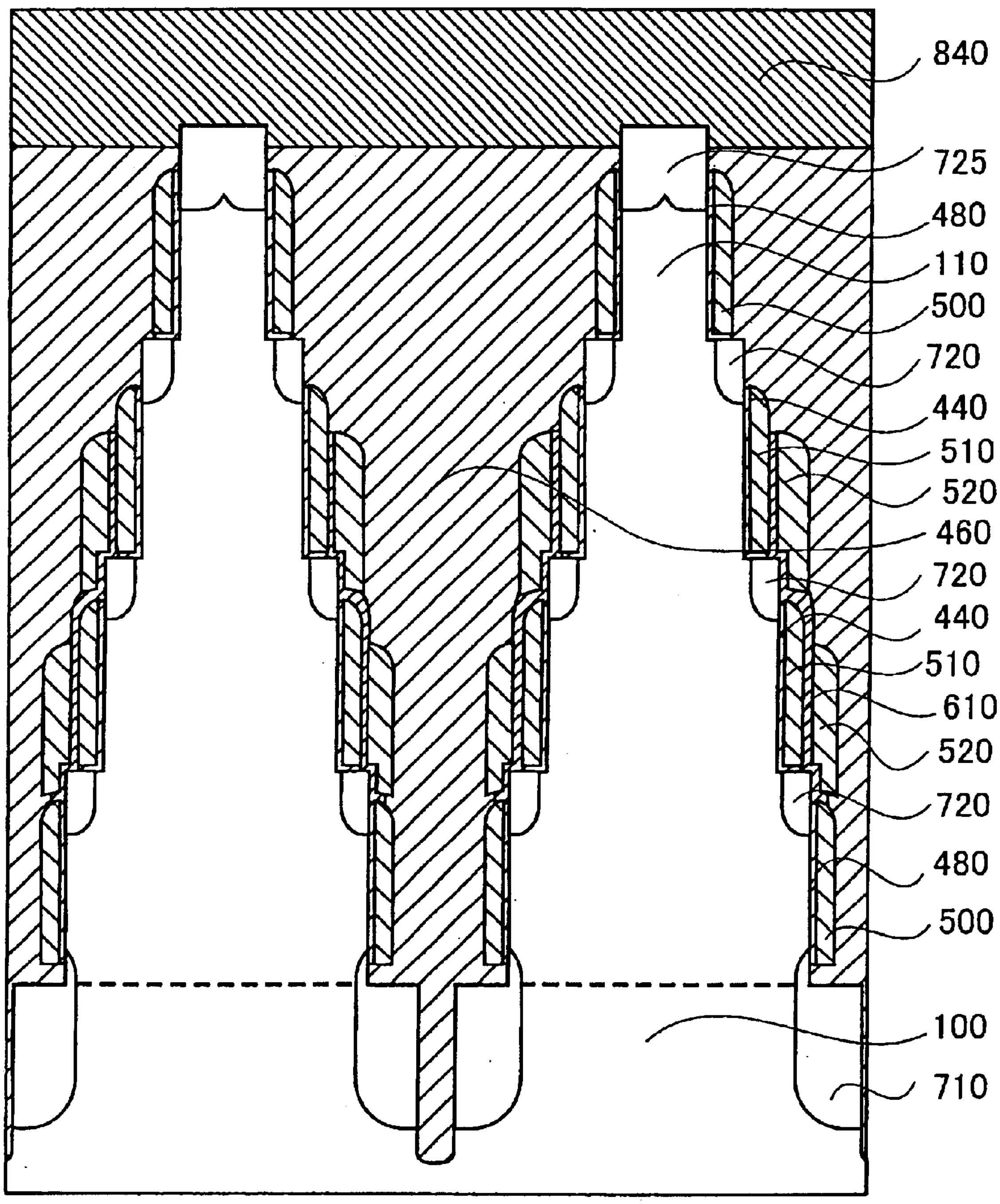

FIG. 47 and FIG. 48 show an example wherein the control gate 520 has a thickness larger than that of the floating gate 510 as compared with FIG. 9 and FIG. 10.

Figure 49:
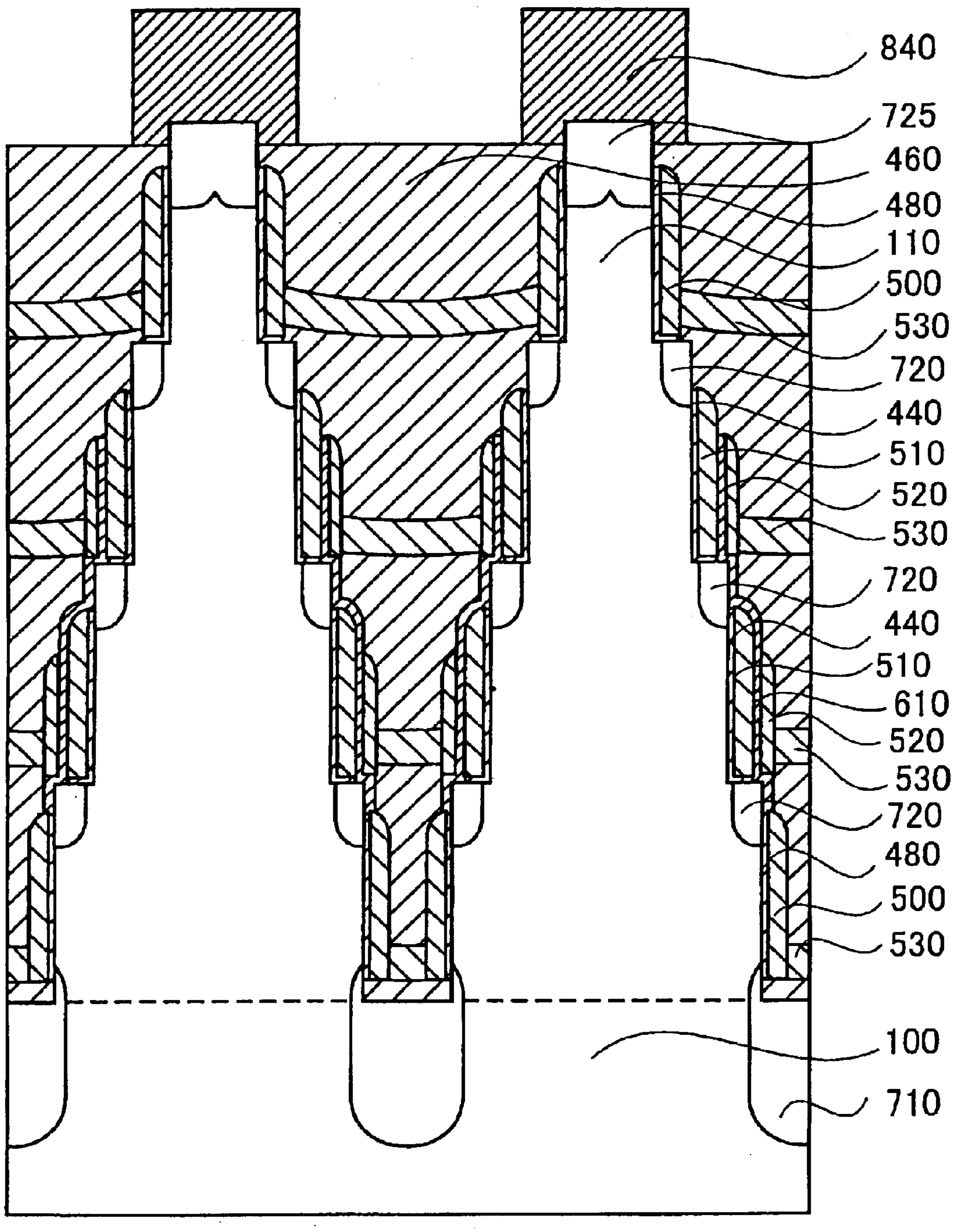
Figure 50:
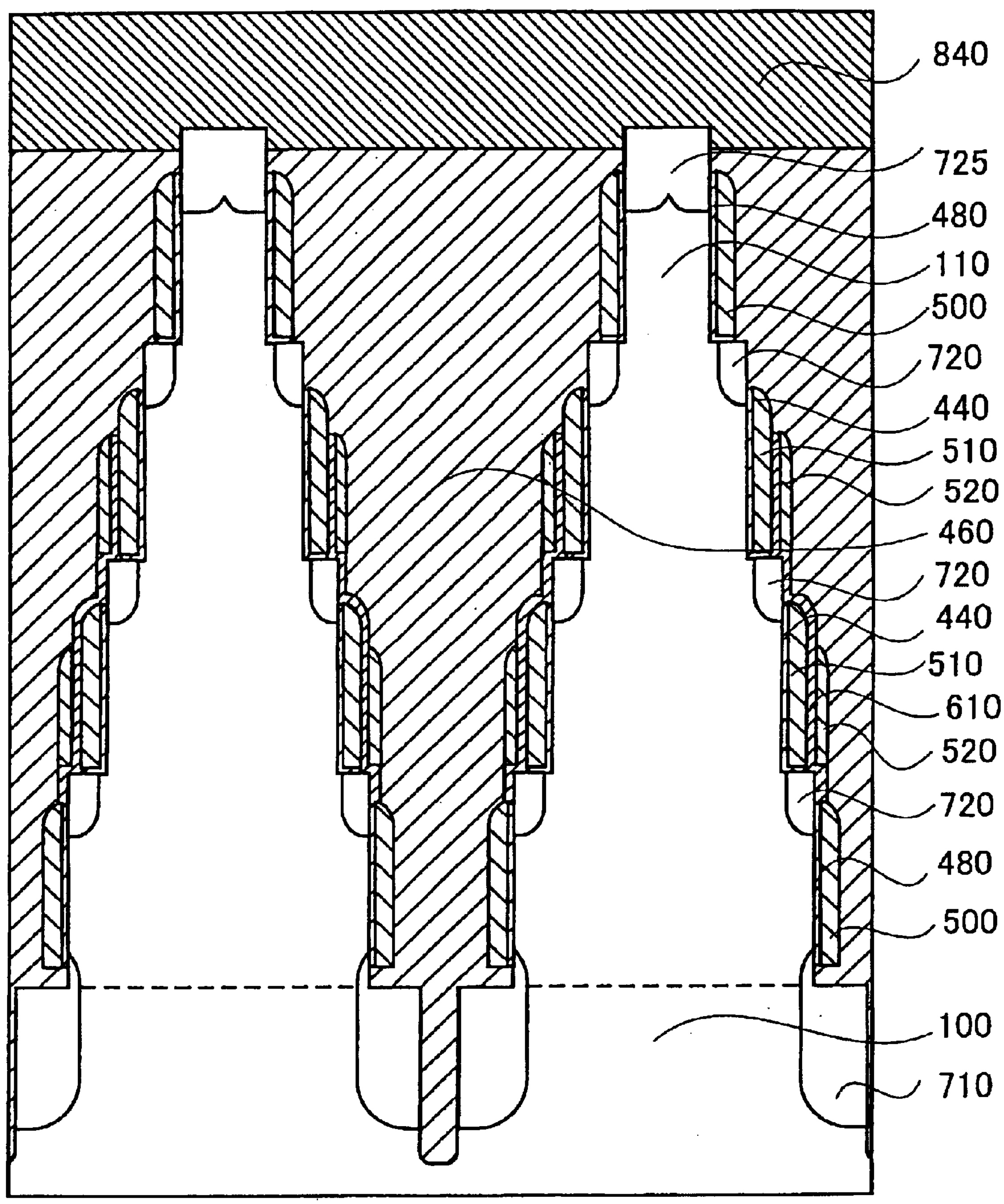
Figure 51:
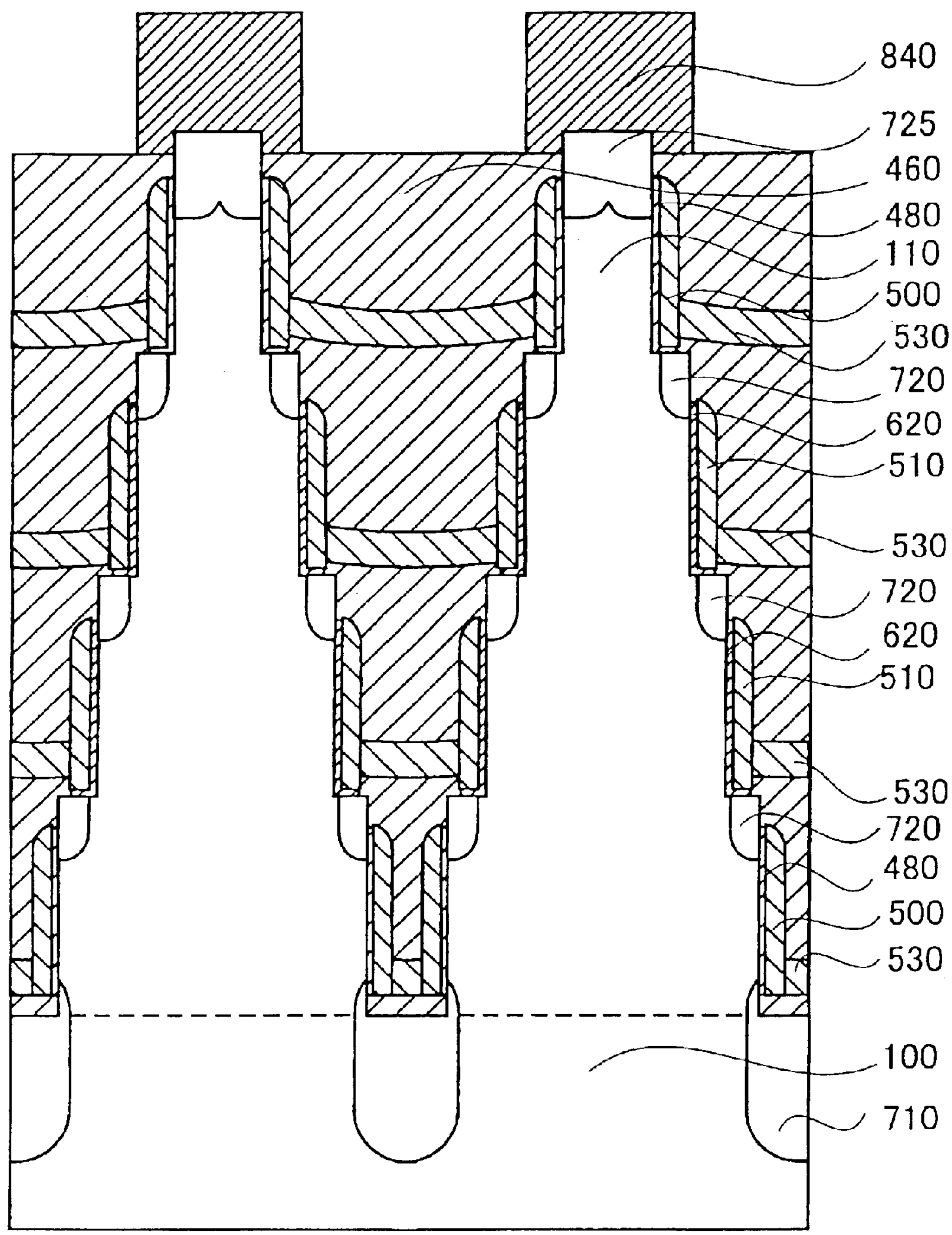
FIGS. 51 to 56 are sectional views of various semiconductor memory devices having layered insulating films as charge storage layers in accordance with the present invention, the sectional views corresponding to those taken on line A–A' and line B–B' in FIG. 8.
Figure 52:
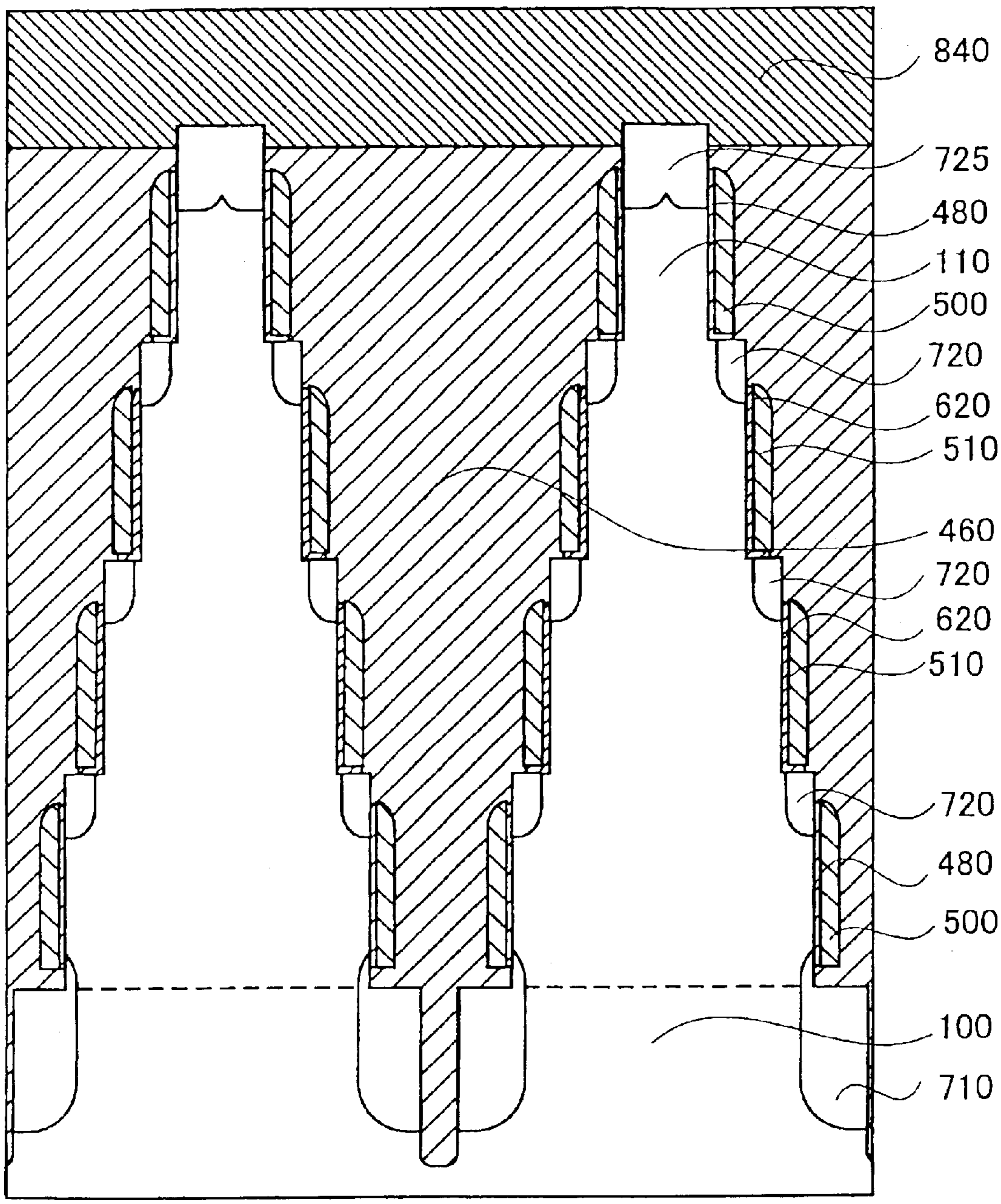
Figure 53:
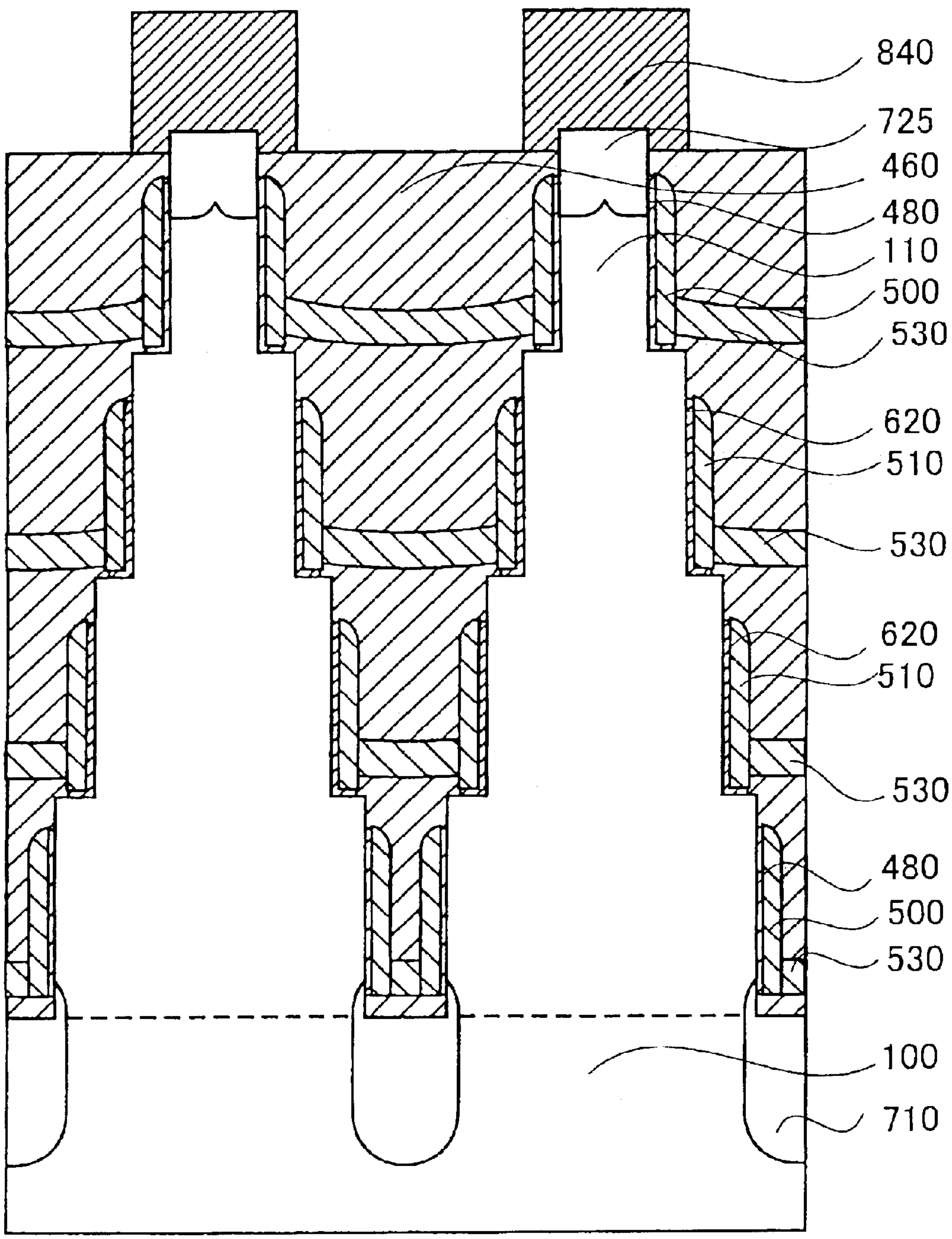
Figure 54:
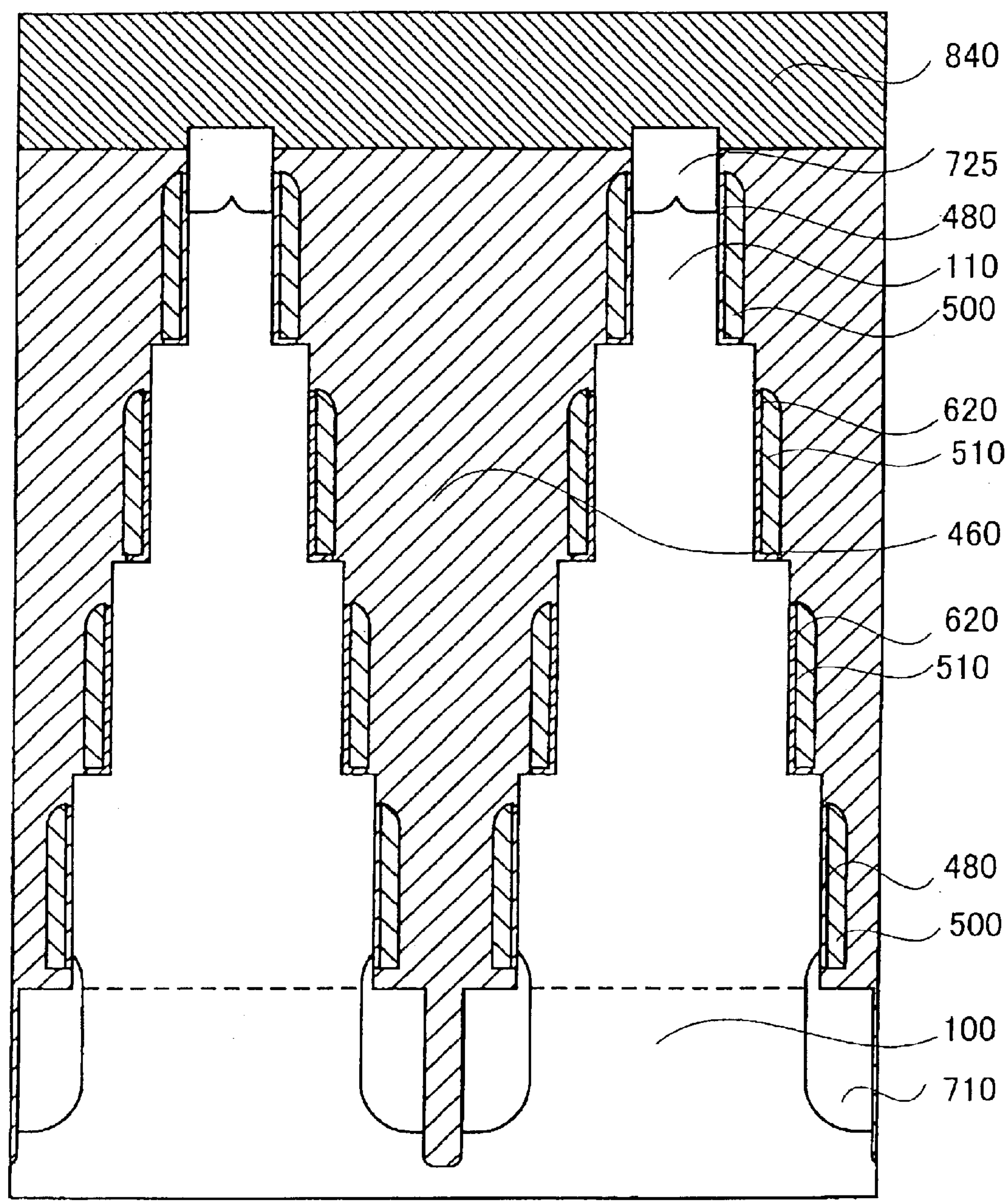
Figure 55:
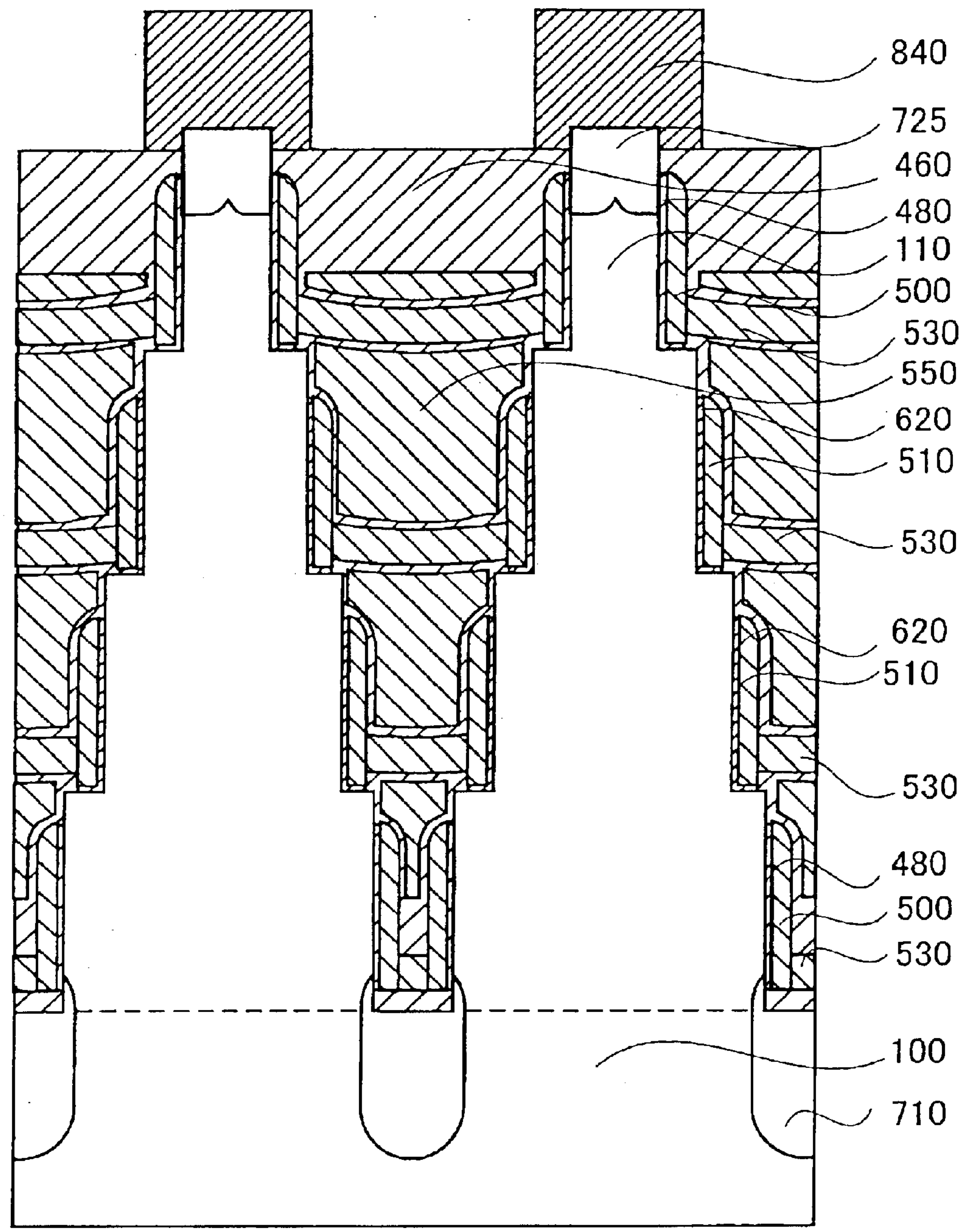
Figure 56:
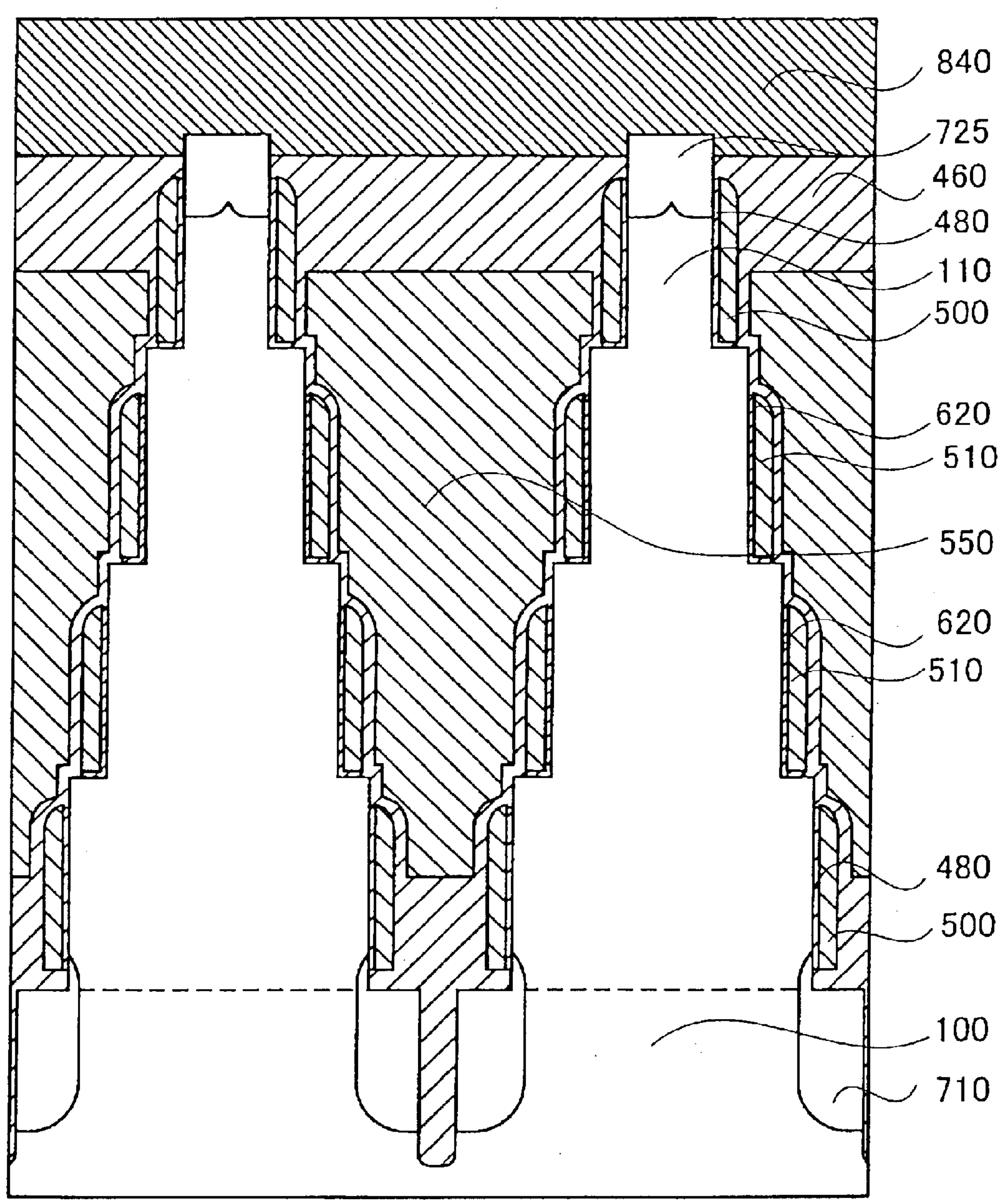

FIG. 49 and FIG. 50 show an example wherein the control gate 520 has a thickness smaller than that of the floating gate 510 as compared with FIG. 9 and FIG. 10.

FIG. 51 to FIG. 56 show sectional views of semiconductor memories having a laminated insulating film as the charge storage layer. Of FIG. 51 to FIG. 56, the odd-numbered figures show cross sections taken on line A–A' as shown in FIG. 8, and the even-numbered figures show cross sections taken on line B–B' as shown in FIG. 8.

These embodiments shown in FIG. 51 to FIG. 56 are similar to those shown in FIG. 9 to FIG. 14 sequentially except that the charge storage layer is changed from the floating gate to the laminated insulating film.

Embodiments of Operating Principles of Memory Cell Arrays

The semiconductor memory of the present invention has a memory function according to the state of a charge stored in the charge storage layer.

The operating principles for reading, writing and erasing data will be explained with a memory cell having a floating gate as the charge storage layer, for example.

The below-described reading, writing and erasing can be applicable to all semiconductor memories according to the present invention. In the following description, examples of the principle of operating memory cells formed of a P-type semiconductor is described. The polarity of all the electrodes may be reversed as in the case of memory cells formed of an N-type semiconductor. At this time, the potentials have a relationship in magnitude reverse to that in the case of the P-type semiconductor.

A reading process is now explained with a semiconductor memory according to the present invention which is so constructed that, in island-like semiconductor layers having memory cells provided with a charge storage layer and a third electrode as a control gate electrode, a fourth electrode is connected to one end of each island-like semiconductor layer and a first electrode is connected to another end of the island-like semiconductor layer.

Figure 57:
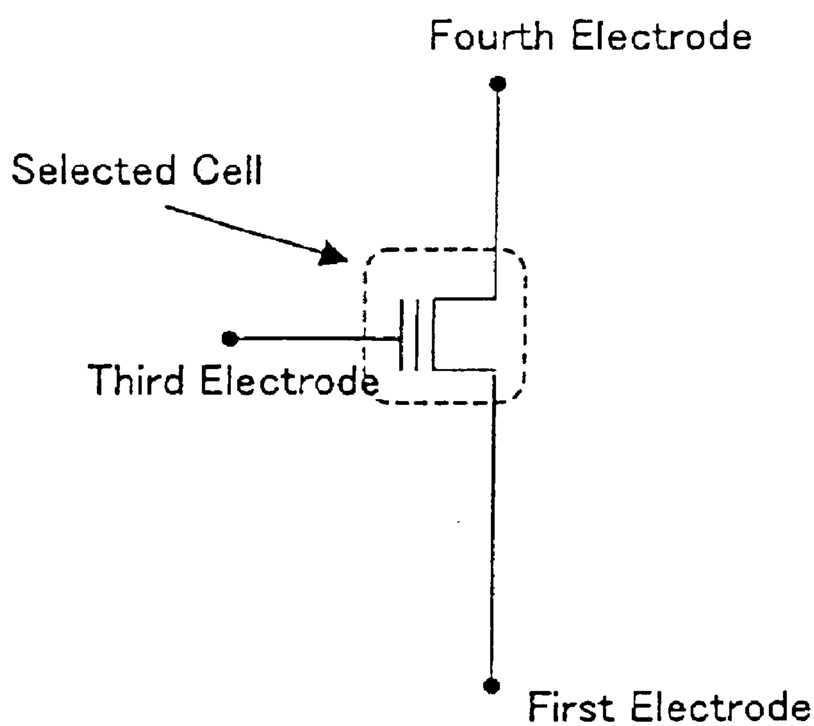
FIGS. 57 to 89 are equivalent circuit diagrams of semiconductor memory devices in accordance with the present invention.

FIG. 57 shows the equivalent circuit diagram of the memory cell of the semiconductor memory of this structure.

For example, in the case where the island-like semiconductor layers are formed of a P-type semiconductor, a selected cell as shown in FIG. 57 is read by applying a first potential to the first electrode, a third potential to the third electrode connected to the selected cell and a fourth potential to the fourth electrode connected to the selected cell. The fourth potential is larger than the first potential. A "0" or "1" is judged from a current flowing through the fourth or first electrode. At this time, the third potential is a potential allowing the distinction of the amount of a charge stored in the charge storage layer, i.e., a potential allowing the judgment of "0" or "1".

Figure 90:
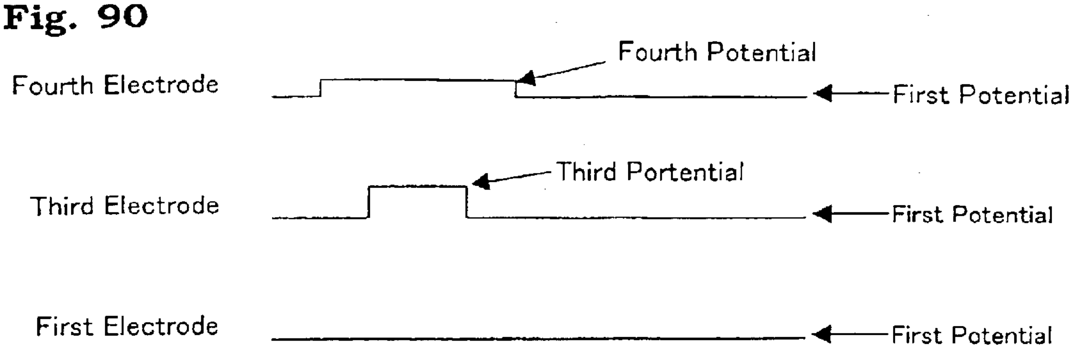
FIGS. 90 to 187 are examples of timing charts at reading, writing or erasing of a semiconductor memory device in accordance with the present invention.

FIG. 90 shows a timing chart showing an example of timing of applying each potential for reading data. In FIG. 90, a ground potential is applied as the first potential, and the memory cell has a threshold of 5.0 V to 7.5 V when it is in a written state and has a threshold of 0.5 V to 3 V when it is in an erased state.

First, the ground potential as the first potential is applied to the first, third and fourth electrodes. In this state, the fourth potential, e.g., 1 V, is applied to the fourth electrode. The third potential, e.g., 4 V, is applied to the third electrode connected to the selected cell, and the current flowing through the fourth or first electrode is sensed.

Thereafter, the third electrode is returned to the ground potential, i.e., the first potential, and the fourth electrode is returned to the ground potential, i.e., the first potential. The potentials may be applied to the respective electrodes in another order or simultaneously. Further, the respective electrodes may be returned to the ground potential, i.e., the first potential, in another order or simultaneously. Here, the same potential is preferably applied initially as the first potential to the first, third and fourth electrodes, but different potentials may be applied. The third potential may be kept applied to the third electrode.

Figure 91:
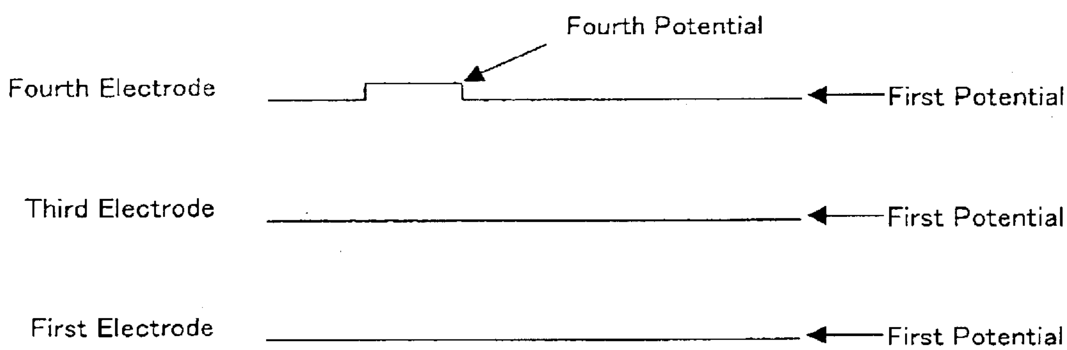

FIG. 91 shows another timing chart showing an example of timing of applying each potential for reading data. In FIG. 91, a ground potential is applied as the first potential, and the memory cell has a threshold of 1.0 V to 3.5 V when it is in the written state and has a threshold of −1.0 V or lower when it is in the erased state.

First, the ground potential as the first potential is applied to the first, third and fourth electrodes. In this state, the fourth potential, e.g., 1 V, is applied to the fourth electrode. The third potential, e.g., 0 V, is applied to the third electrode connected to the selected cell, and the current flowing through the fourth or first electrode is sensed.

The third electrode is returned to the ground potential, i.e., the first potential, and the fourth electrode is returned to the ground potential, i.e., the first potential. The potentials may be applied to the respective electrodes in another order or simultaneously. Further, the respective electrodes may be returned to the ground potential, i.e., the first potential, in another order or simultaneously. Here, the same potential is preferably applied initially as the first potential to the first, third and fourth electrodes, but different potentials may be applied. The third potential may be kept applied to the third electrode.

A reading process is now explained with a semiconductor memory according to the present invention which is constructed to have island-like semiconductor layers which include, as selection gate transistors, a transistor provided with a second electrode as a gate electrode and a transistor provided with a fifth electrode as a gate electrode, a plurality of (e.g., L (L is a positive integer)) memory cells having a charge storage layer between the selection gate transistors and provided with a third electrode as a control gate electrode, the memory cells being connected in series.

Figure 58:
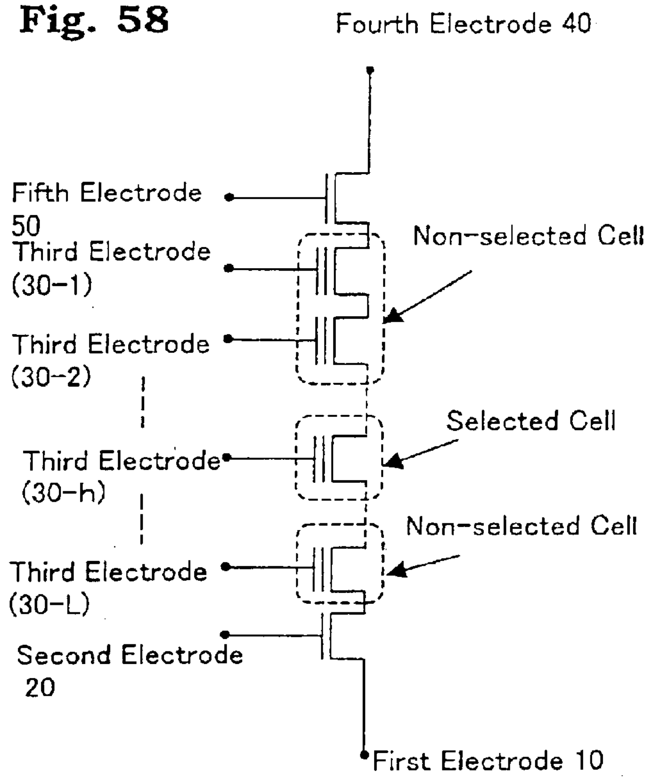

FIG. 58 shows the equivalent circuit diagram of the above-described memory cell. For example, in the case the island-like semiconductor layers are formed of a P-type semiconductor, a selected cell as shown in FIG. 58 is read out by applying a first potential to a first electrode 10 connected to the island-like semiconductor layer including the selected cell, a second potential to a second electrode 20 arranged in series with the selected cell, a third potential to a third electrode (30-*h*) (1≦h≦L, wherein h is a positive integer) connected to the selected cell, a seventh potential to third electrodes (30-1 to 30-(h−1)) connected to non-selected cells arranged in series with the selected cell, an eleventh potential to third electrodes (30-(h+1) to 30-L) connected to non-selected cells arranged in series with the selected cell, a fourth potential to a fourth electrode 40 and a fifth potential to the fifth electrode 50 arranged in series with the selected cell. The fourth potential is larger than the first potential. The "0" or "1" is judged from the current flowing through the fourth electrode 40 or the first electrode 10. At this time, the third potential is a potential allowing the distinction of the amount of a charge stored in the charge storage layer, i.e., a potential allowing the judgment of "0" or "1." The seventh and eleventh potentials are potentials always allowing a cell current to flow through the memory cell regardless of the amount of the charge stored in the charge storage layer, i.e., potentials allowing the formation of a reverse layer in the channel region of the memory cell. For example, they are not lower than the threshold voltage that the memory transistor having the third electrode as the gate electrode can take. If h=1, third electrodes (30-2 to 30-L) are given the same potential as the third electrodes (30-(h+1) to 30-L) when 2≦h≦L−1. If h=L, the third electrodes (30-1 to 30-(L−1)) are given the same potential as the third electrodes (30-1 to 30-(h−1)) when 2≦h≦L−1.

The second and fifth potentials are potentials allowing the cell current to flow, e.g., potentials not lower than the threshold voltages that the memory transistors having the second and fifth electrodes as the gate electrodes can take. In the case where the first electrode 10 is formed as an impurity diffusion layer in the semiconductor substrate and the channel region of the selected memory cell is electrically connected to the semiconductor substrate, the first potential applied to the first electrode 10 connected to the island-like semiconductor layer including the selected cell is such that, by applying the first potential, the island-like semiconductor layer becomes in the electrically floating state from the semiconductor substrate by a depletion layer extended toward the semiconductor substrate. Thereby, the potential of the island-like semiconductor layer equals the first potential, and the selected cell on the island-like semiconductor layer can be read without being affected by the potential of the substrate.

The selected memory cell is apparently back-biased to the substrate since the potential of the first electrode rises with respect to the potential of the substrate because of a resistant component in the impurity diffusion layer from the first electrode of the island-like semiconductor layer including the selected memory cell to a power source when a reading current flows through the first electrode.

However, in the present invention, it is possible to prevent a back-bias effect which may occur when the semiconductor substrate is electrically connected with the channel region of a memory cell on the island-like semiconductor layer and has the same potential with the channel region, and a rise in the threshold and a decrease in the current owing to the back bias can be prevented.

In the case where the first electrode 10 is formed as an impurity diffusion layer in the semiconductor substrate and the tenth potential applied to the semiconductor substrate is the ground potential, the first potential is generally a ground potential. In the case where the first electrode 10 is formed to be electrically insulated from the semiconductor substrate, for example, where the first electrode 10 is formed of an impurity diffusion layer in an SOI substrate and is insulated from the semiconductor substrate by an insulating film, the first potential is not necessarily the same as the tenth potential.

The memory cells may be sequentially read out from a memory cell connected to a third electrode (30-L) to a memory cell connected to a third electrode (30-1), or may be read in an opposite order or at random.

Figure 92:
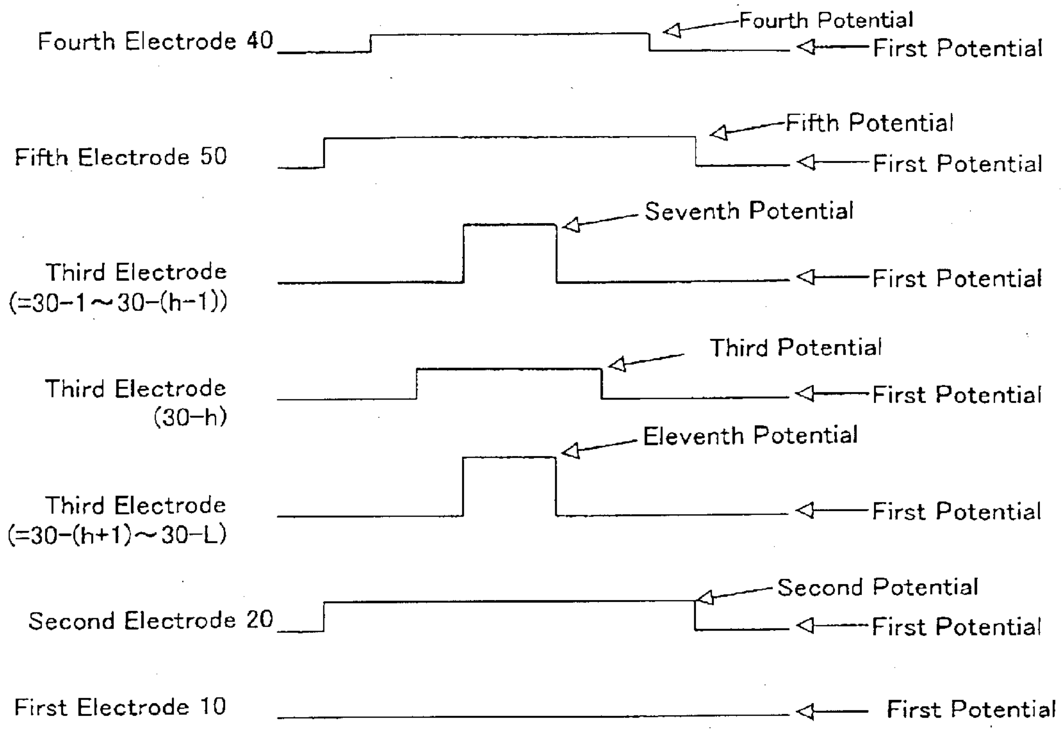

FIG. 92 shows a timing chart showing an example of timing of applying each potential for reading data. In FIG. 92, a ground potential is applied as the first potential, and the thresholds of the transistors having the second electrode and the fifth electrode are, for example, 0.5 V. The memory cell has a threshold of 5.0 V to 7.5 V when it is in the written state and has a threshold of 0.5 V to 3 V when it is in the erased state.

First, the ground potential as the first potential is applied to the first electrode 10, the second electrode 20, the third electrodes 30, the fourth electrode 40 and the fifth electrode 50. In this state, the second potential, e.g., 3 V, is applied to the second electrode. The fifth potential, e.g., 3 V which is equal to the second potential, is applied to the fifth electrode. The fourth potential, e.g., 1 V, is applied to the fourth electrode. The third potential, e.g., 4 V, is applied to the third electrode (30-*h*) connected to the selected cell. The seventh potential, e.g., 8 V is applied to the third electrodes (30-1 to 30-(h−1)) and the eleventh potential, e.g., 8 V which is equal to the seventh potential, is applied to the third electrodes (30-(h+1) to 30-L). The current flowing through the fourth or first electrode is sensed.

Third electrodes (not 30-*h*) other than the third electrode (30-*h*) are returned to the ground potential, i.e., the first potential, and the third electrode (30-*h*) is returned to the ground potential, i.e., the first potential. The fourth electrode 40 is returned to the ground potential, i.e., the first potential. The second electrode 20 and the fifth electrode 50 are returned to the ground potential, i.e., the first potential. The potentials may be applied to the respective electrodes in another order or simultaneously. Further, the respective electrodes may be returned to the ground potential, i.e., the first potential, in another order or simultaneously.

The second and fifth potentials may be different, and the eleventh and seventh potentials may be different. Here, the same potential is preferably applied initially as the first potential to the first electrode 10, the second electrode 20, the third electrodes (30-1 to 30-L), the fourth electrode 40 and the fifth electrode 50, but different potentials may be applied. The third potential may be kept applied to the third electrode (30-*h*).

In the above example, the reading process has been described with the case where the selected cell is a memory cell having the third electrode (30-*h*) as the gate electrode. However, the reading process is the same with the case where the selected cell is a memory cell having a third electrode other than the third electrode (30-*h*) as the gate electrode. The first and fourth potentials may be changed with each other.

Figure 93:
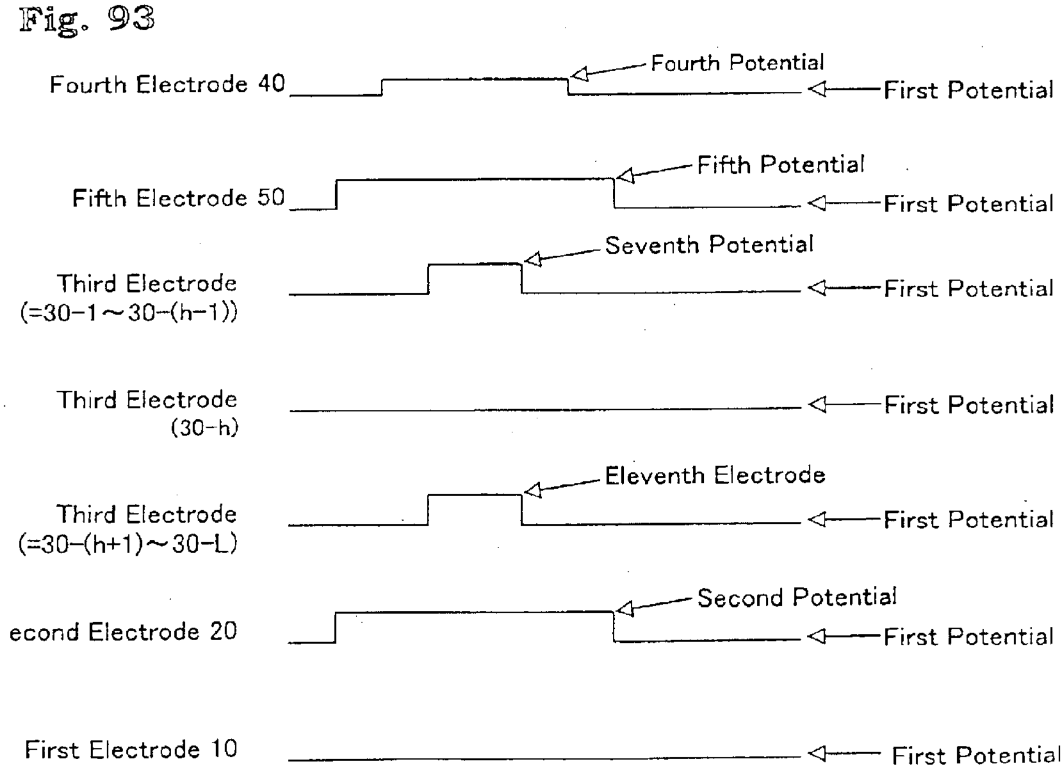

FIG. 93 shows a timing chart showing an example of timing of applying each potential for reading data. In FIG. 93, a ground potential is applied as the first potential, and the thresholds of the transistors having the second electrode and the fifth electrode are, for example, 0.5 V. The memory cell has a threshold of 1.0 V to 3.5 V when it is in the written state and has a threshold of −1.0 V or lower when it is in the erased state.

First, the ground potential as the first potential is applied to the first electrode 10, the second electrode 20, the third electrodes 30, the fourth electrode 40 and the fifth electrode 50. In this state, the second potential, e.g., 3 V, is applied to the second electrode 20, and the fifth potential, e.g., 3 V which is equal to the second potential, is applied to the fifth electrode 50. The fourth potential, e.g., 1 V, is applied to the fourth electrode 40, and the third potential, e.g., the ground potential which is the first potential, is kept applied to the third electrode (30-*h*) connected to the selected cell. The seventh potential, e.g., 5 V, is applied to the third electrodes (30-1 to 30-(h−1)) connected to the non-selected cells arranged in series with the selected cell, and the eleventh potential, e.g., 5 V which is equal to the seventh potential, is applied to the third electrodes (30-(h+1) to 30-L) connected to the non-selected cells arranged in series with the selected cell. The current flowing through the fourth electrode 40 or the first electrode 10 is sensed.

The third electrodes (not 30-*h*) other than the third electrode (30-*h*) are returned to the ground potential, i.e., the first potential, and the fourth electrode 40 is returned to the ground potential, i.e., the first potential. The second electrode 20 and the fifth electrode 50 are returned to the ground potential, i.e., the first potential. The potentials may be applied to the respective electrodes in another order or simultaneously. Further, the respective electrodes may be returned to the ground potential, i.e., the first potential, in another order or simultaneously.

The second and fifth potentials may be different, and the eleventh and seventh potentials may be different. Here, the same potential is preferably applied initially as the first potential to the first electrode 10, the second electrode 20, the third electrodes (30-1 to 30-L), the fourth electrode and the fifth electrode 50, but different potentials may be applied. The third potential may be kept applied to the third electrode (30-*h*). The third electrode (30-*h*) may at the ground potential.

In the above example, the reading process has been described with the case where the selected cell is a memory cell having the third electrode (30-*h*) as the gate electrode. However, the reading process is the same with the case where the selected cell is a memory cell having a third electrode other than the third electrode (30-*h*) as the gate electrode. The first and fourth potentials may be changed with each other.

A reading process is now explained with a semiconductor memory according to the present invention which is so constructed to have island-like semiconductor layers provided with, for example, two memory cells connected in series, the memory cells having the charge storage layer between the selection gate transistors and a third electrode as a control gate electrode.

Figure 60:
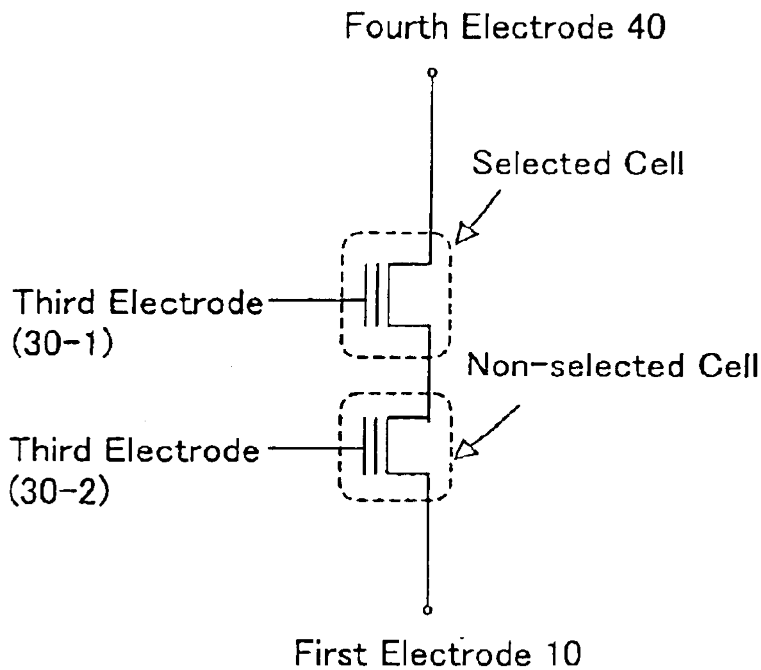

FIG. 60 shows the equivalent circuit diagram of the above-described memory cell.

For example, in the case where the island-like semiconductor layer is formed of a P-type semiconductor, a selected cell shown in FIG. 60 is read by applying a first potential to the first electrode 10 connected to an island-like semiconductor layer including the selected cell, a third potential to the third electrode (30-1) connected to the selected cell and an eleventh potential to a third electrode (30-2) connected to a non-selected cell arranged in series with the selected cell, a fourth potential to the fourth electrode 40 connected to the island-like semiconductor layer including the selected cell. The fourth potential is larger than the first potential. A "0" or "1" is judged from a current flowing through the fourth electrode 40 or the first electrode 10. At this time, the third potential is a potential allowing the distinction of the amount of a charge stored in the charge storage layer, i.e., a potential allowing the judgement of "0" or "1." The eleventh potential is a potential always allowing a cell current to flow through the memory cell regardless of the amount of the charge stored in the charge storage layer, i.e., a potential allowing the formation of a reverse layer in the channel region of the memory cell. For example, the eleventh potential is not lower than the threshold voltage that the memory transistor having the third electrode as the gate electrode can take.

In the case where the first electrode 10 is formed as an impurity diffusion layer in the semiconductor substrate and the channel region of a selected memory cell is electrically connected to the semiconductor substrate, the first potential applied to the first electrode 10 connected to the island-like semiconductor layer including the selected cell is such that, by applying the first potential, the island-like semiconductor layer becomes in the electrically floating state from the semiconductor substrate by a depletion layer extended toward the semiconductor substrate. Thereby, the potential of the island-like semiconductor layer equals the first potential, and the selected cell on the island-like semiconductor layer can be read without being affected by the potential of the substrate.

The selected memory cell is apparently back-biased to the substrate since the potential of the first electrode rises with respect to the potential of the substrate because of a resistant component in the impurity diffusion layer from the first electrode of the island-like semiconductor layer including the selected memory cell to a power source when a reading current flows through the first electrode.

However, in the present invention, it is possible to prevent a back-bias effect which may occur when the semiconductor substrate is electrically connected with the channel region of a memory cell on the island-like semiconductor layer and has the same potential with the channel region, and a rise in the threshold and a decrease in the current owing to the back bias can be prevented.

In the case where the first electrode 10 is formed as the impurity diffusion layer in the semiconductor substrate and the tenth potential applied to the semiconductor substrate is the ground potential, the first potential is generally the ground potential.

In the case where the first electrode 10 is electrically insulated from the semiconductor substrate, for example, where the first electrode 10 is formed of an impurity diffusion layer on an SOI substrate and is insulated from the semiconductor substrate by an insulating film, the first potential is not necessarily the same as the tenth potential.

Figure 94:
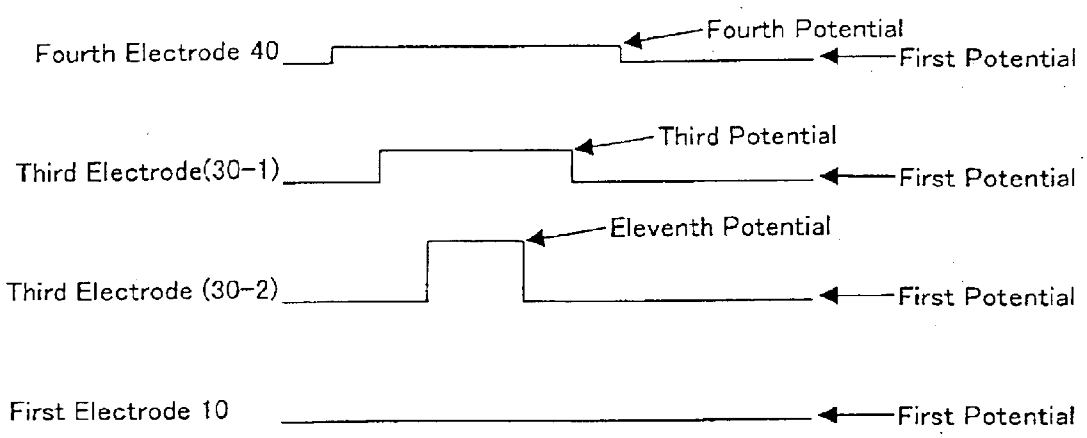

FIG. 94 shows a timing chart showing an example of timing of applying each potential for reading data. In FIG. 94, a ground potential is applied as the first potential, and the thresholds of the transistors having the second electrode and the fifth electrode are, for example, 0.5 V. The memory cell has a threshold of 5.0 V to 7.5 V when it is in the written state and has a threshold of 0.5 V to 3 V when it is in the erased state.

First, the ground potential as the first potential is applied to the first electrode 10, the third electrodes (30-1 to 30-2) and the fourth electrode 40. In this state, the fourth potential, e.g., 1 V, is applied to the fourth electrode 40, and the third potential, e.g., 4 V, is applied to the third electrode (30-1) connected to the selected cell, and the eleventh potential, e.g., 8 V which is equal to the seventh potential, is applied to the third electrode (30-2) connected to a non-selected cell arranged in series with the selected cell. The current flowing through the fourth electrode 40 or the first electrode 10 is sensed.

The third electrode (30-2) is returned to the ground potential, i.e., the first potential, the third electrode (30-1) is returned to the ground potential, i.e., the first potential, and the fourth electrode 40 is returned to the ground potential, i.e., the first potential. The potentials may be applied to the respective electrodes in another order or simultaneously. Further, the respective electrodes may be returned to the ground potential, i.e., the first potential, in another order or simultaneously. Here, the same potential is preferably applied initially as the first potential to the first electrode 10, the third electrodes (30-1 to 30-2) and the fourth electrode 40, but different potentials may be applied. The third potential may be kept applied to the third electrode (30-1). The third potential may be a ground potential.

In the above example, the reading process has been described with the case where the selected cell is a memory cell having the third electrode (30-1) as the gate electrode. However, the reading process is the same with the case where the selected cell is a memory cell having a third electrode other than the third electrode (30-1) as the gate electrode. The first and fourth potentials may be changed with each other.

Figure 95:
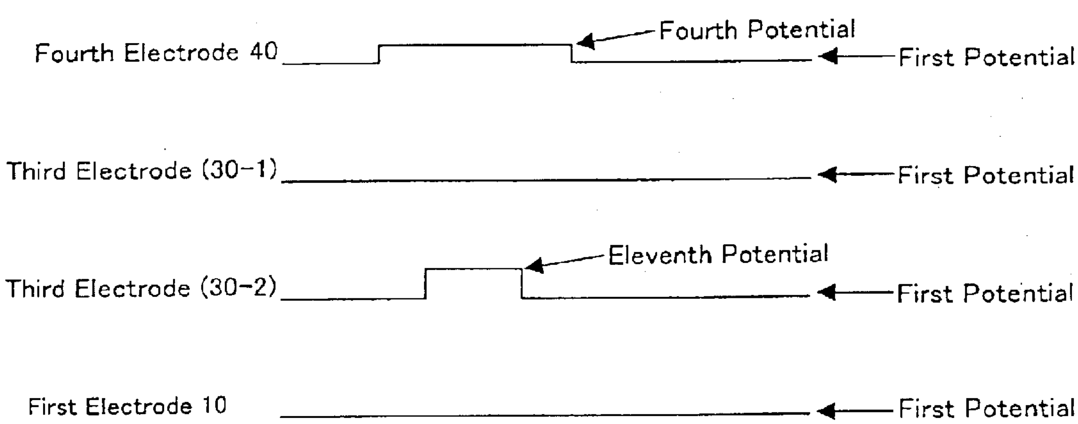

FIG. 95 shows a timing chart showing an example of timing of applying each potential for reading data. In FIG. 95, a ground potential is applied as the first potential, and the thresholds of the transistors having the second electrode and the fifth electrode are, for example, 0.5 V. The memory cell has a threshold of 1.0 V to 3.5 V when it is in the written state and has a threshold of −1.0 V or lower when it is in the erased state.

First, the ground potential as the first potential is applied to the first electrode 10, the third electrodes (30-1 to 30-2) and the fourth electrode 40. In this state, the fourth potential, e.g., 1 V, is applied to the fourth electrode 40, and the third potential, e.g., the ground potential which is the first potential, is applied to the third electrode (30-1) connected to the selected cell. The eleventh potential, e.g., 5 V which is equal to the seventh potential, is applied to the third electrode (30-2) connected to a non-selected cell arranged in series with the selected cell. The current flowing through the fourth electrode 40 or the first electrode 10 is sensed.

The third electrode (30-2) is returned to the ground potential, i.e., the first potential, the third electrode (30-1) is returned to the ground potential, i.e., the first potential, and the fourth electrode 40 is returned to the ground potential, i.e., the first potential. The potentials may be applied to the respective electrodes in another order or simultaneously. Further, the respective electrodes may be returned to the ground potential, i.e., the first potential, in another order or simultaneously. Here, the same potential is preferably applied initially as the first potential to the first electrode 10, the third electrodes (30-1 to 30-2) and fourth electrode 40, but different potentials may be applied. The third potential may be kept applied to the third electrode (30-1). The third potential may be a ground potential.

In the above example, the reading process has been described with the case where the selected cell is a memory cell having the third electrode (30-1) as the gate electrode. However, the reading process is the same with the case where the selected cell is a memory cell having a third electrode other than the third electrode (30-1) as the gate electrode. The first and fourth potentials may be changed with each other.

A reading process is now explained with a semiconductor memory according to the present invention which is constructed to include a plurality of (e.g., M×N, wherein M and N are positive integers) island-like semiconductor layers each having, as selection gate transistors, a transistor provided with the second electrode as a gate electrode and a transistor provide with the fifth electrode as a gate electrode and a plurality of (e.g., L, wherein L is a positive integer) memory cells connected in series, the memory cells each provided with the charge storage layer between the selection gate transistors and the third electrode as a control gate electrode. In this memory cell array, a plurality of (e.g., M) fourth wires arranged in parallel with the semiconductor substrate are connected to end portions of the island-like semiconductor layers, and first wires are connected to opposite end portions of the island-like semiconductor layers. A plurality of (e.g., N×L) third wires are arranged in a direction crossing the fourth wires and are connected to the third electrodes of the memory cells.

Figure 62:
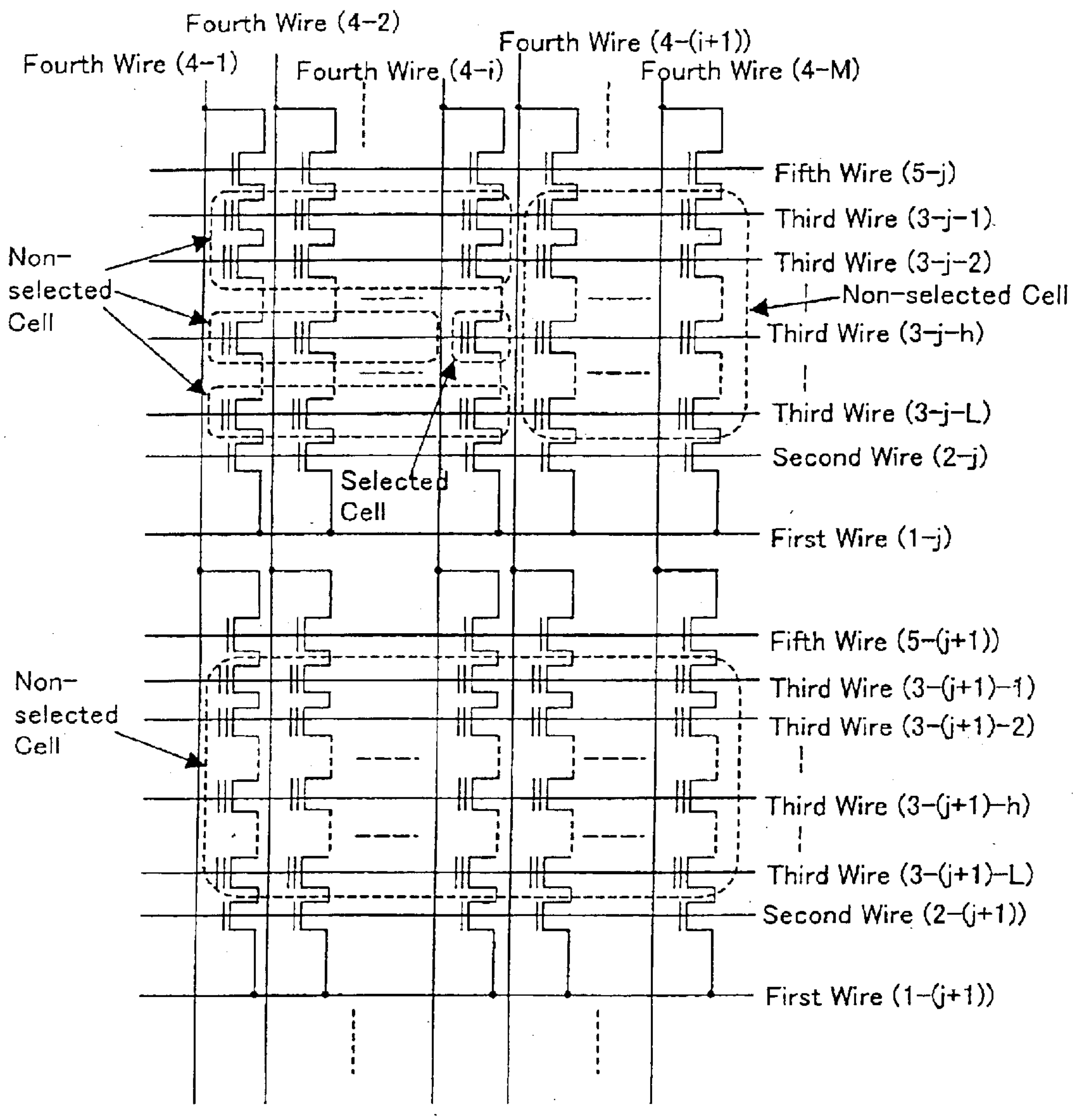

FIG. 62 shows the equivalent circuit diagram of the above-described memory cell array in which the first wires are in parallel to the third wires.

For example, in the case where the island-like semiconductor layers are formed of a P-type semiconductor, a selected cell shown in FIG. 62 is read by applying a first potential to the first wire (1-*j*, wherein j is a positive integer, $1 \leqq j \leqq N$) connected to an island-like semiconductor layer including the selected cell, a second potential to a second wire (2-*j*) connected to a second electrode arranged in series with the selected cell, a third potential to a third wire (3-*j*-h, wherein h is a positive integer, $1 \leqq h \leqq N$) connected to the selected cell, a seventh potential to third wires (3-*j*-1 to 3-*j*-(h−1)) connected to non-selected cells arranged in series with the selected cell, an eleventh potential to third wires (3-*j*-(h+1) to 3-*j*-L) connected to non-selected cells arranged in series with the selected cell, a twelfth potential to third wires (not 3-*j*-1 to 3-*j*-L) not arranged in series with the selected cell and connected to non-selected cells, a fourth potential to a fourth wire (4-*i*, wherein i is a positive integer, $1 \leqq i \leqq M$) connected to the island-like semiconductor layer including the selected cell, an eighth potential to fourth wires (not 4-*i*) other than the fourth wire (4-*i*), a fifth potential to a fifth wire (5-*j*) connected to a fifth electrode arranged in series with the selected cell, and a sixth potential to at least either second wires (not 2-*j*) other than the second wire (2-*j*) or fifth wires (not 5-*j*) other than the fifth wire (5-*j*). If h=1, third electrodes (3-*j*-2 to 3-*j*-L) are provided with the same potential as applied to third electrodes (3-*j*-(h+1) to 3-*j*-L) when $2 \leqq h \leqq L-1$. If h=L, third electrodes (3-*j*-1 to 3-*j*-(L−1)) are provided with the same potential as applied to third electrodes (3-*j*-1 to 3-*j*-(h−1)) when $2 \leqq h \leqq L-1$.

The fourth potential is larger than the first potential. A "0" or "1" is judged from a current flowing through the fourth wire (4-*i*) or the first wire (1-*i*). At this time, the third potential is a potential allowing the distinction of the amount of a charge stored in the charge storage layer, i.e., a potential allowing the judgment of the "0" or "1." The seventh and eleventh potentials are potentials always allowing a cell current to flow through the memory cell regardless of the amount of the charge stored in the charge storage layer, i.e., potentials allowing the formation of a reverse layer in the channel region of the memory cell. For example, the seventh and eleventh potentials are not lower than the threshold voltage that a memory transistor having the third electrode connected to the third wire as the gate electrode can take. The second and fifth potentials are potentials allowing a cell current to flow, for example, potentials not lower than the threshold voltages that memory transistors having the second electrode connected to the second wire and the fifth electrode connected to the fifth wire as the gate electrodes can take.

The sixth potential is a potential not allowing a cell current to flow, for example, potentials not higher than the threshold voltages that the memory transistors having the second electrode connected to the second wire and the fifth electrode connected to the fifth wire as the gate electrodes can take. The eighth potential is preferably equal to the first potential.

In the case where the first wires (1-1 to 1-N) are formed as impurity diffusion layers in the semiconductor substrate and the channel regions of a selected memory cells are electrically connected to the semiconductor substrate, the first potential applied to the first wire (1-*j*) connected to the island-like semiconductor layer including the selected cell is such that, by applying the first potential, the island-like semiconductor layer becomes in the electrically floating state from the semiconductor substrate by a depletion layer extended toward the semiconductor substrate. Thereby, the potential of the island-like semiconductor layer equals the first potential, and the selected cell on the island-like semiconductor layer can be read without being affected by the potential of the substrate.

The selected memory cell is apparently back-biased to the substrate since the potential of the first electrode rises with respect to the potential of the substrate because of a resistant component in the impurity diffusion layer from the first electrode of the island-like semiconductor layer including the selected memory cell to a power source when a reading current flows through the first wire (1-*j*).

However, in the present invention, it is possible to prevent a back-bias effect which may occur when the semiconductor substrate is electrically connected with the channel region of a memory cell on the island-like semiconductor layer and has the same potential with the channel region, and a rise in the threshold and a decrease in the current owing to the back bias can be prevented.

In the case where the first wires (1-1 to 1-N) are formed as impurity diffusion layers in the semiconductor substrate and the tenth potential applied to the semiconductor substrate is the ground potential, the first potential is generally the ground potential. In the case where the first wires (1-1 to 1-N) are electrically insulated from the semiconductor substrate, for example, where the first electrodes (1-1 to 1-N) are formed of impurity diffusion layers on an SOI substrate and are insulated from the semiconductor substrate by an insulating film, the first potential is not necessarily the same as the tenth potential.

The memory cells may be sequentially read from a memory cell connected to a third electrode (3-*j*-L) to a memory cell connected to a third electrode (3-*j*-1), or may be read in reverse order or at random.

Further, some or all memory cells connected to the third wire (3-*j*-h) may be read at the same time. For a particular example, the memory cells connected to the third wire (3-*j*-h) may be read simultaneously by given intervals, for example, every eight fourth wires (e.g., a fourth wire (4-(i−16)), a fourth wire (4-(i−8)), a fourth wire (4-*i*), a fourth wire (4-(i+8)), a fourth wire (4-(i+16)), . . . ). A plurality of third wires having uncommon fourth wires may be read at the same time. The above-mentioned ways of reading may be combined.

Figure 67:
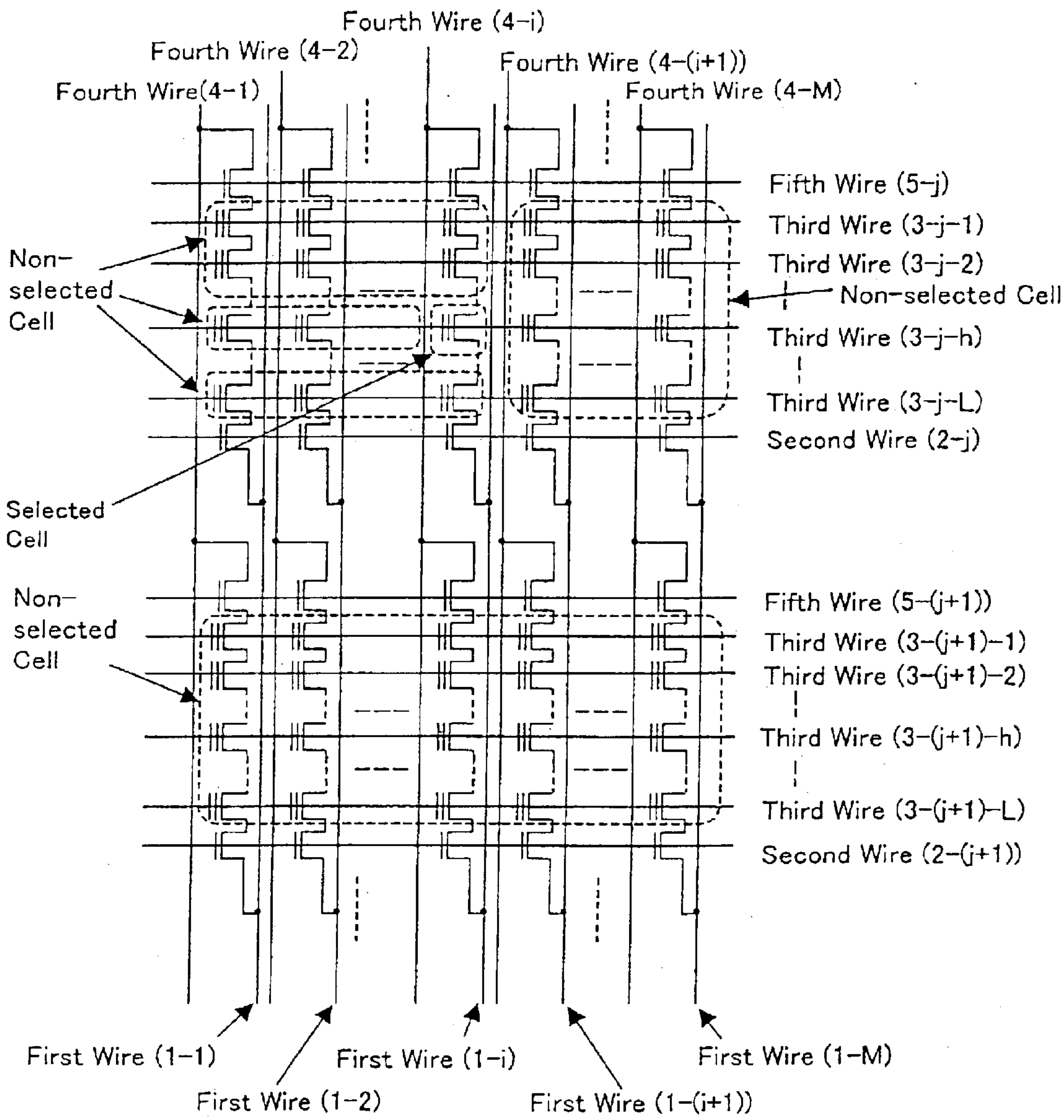

FIG. 67 shows the equivalent circuit diagram of a memory cell array in which the first wires are in parallel to the fourth wires. The application of potentials for reading data is the same as in FIG. 62 except that the first potential is applied to the first wire (1-*i*).

Figure 69:
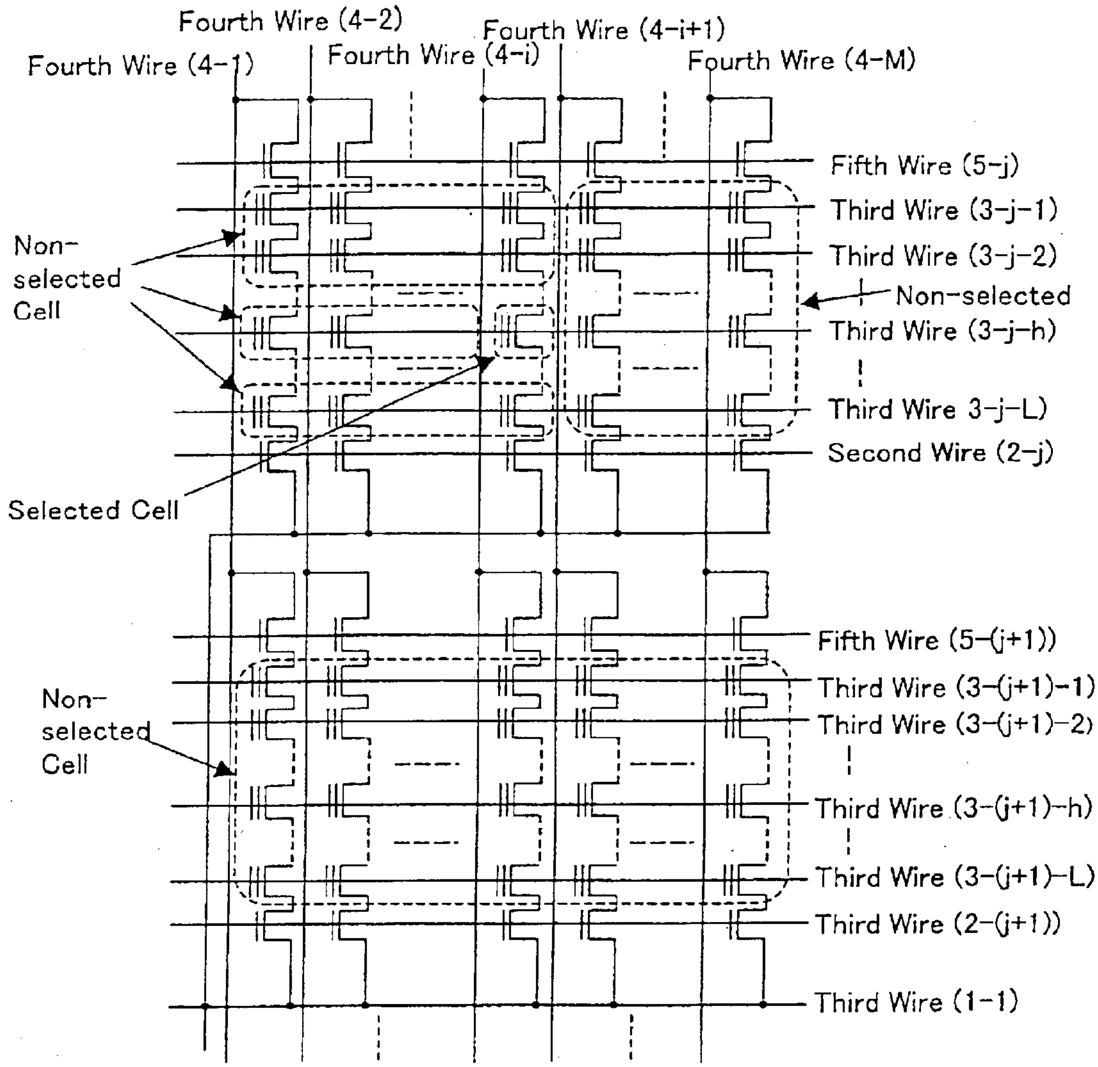

FIG. 69 shows the equivalent circuit diagram of a memory cell array in which a plurality of first wires are electrically connected in common. The application of potentials for reading data is the same as in FIG. 62 except that the first potential is applied to the first wire (1-1).

Figure 96:
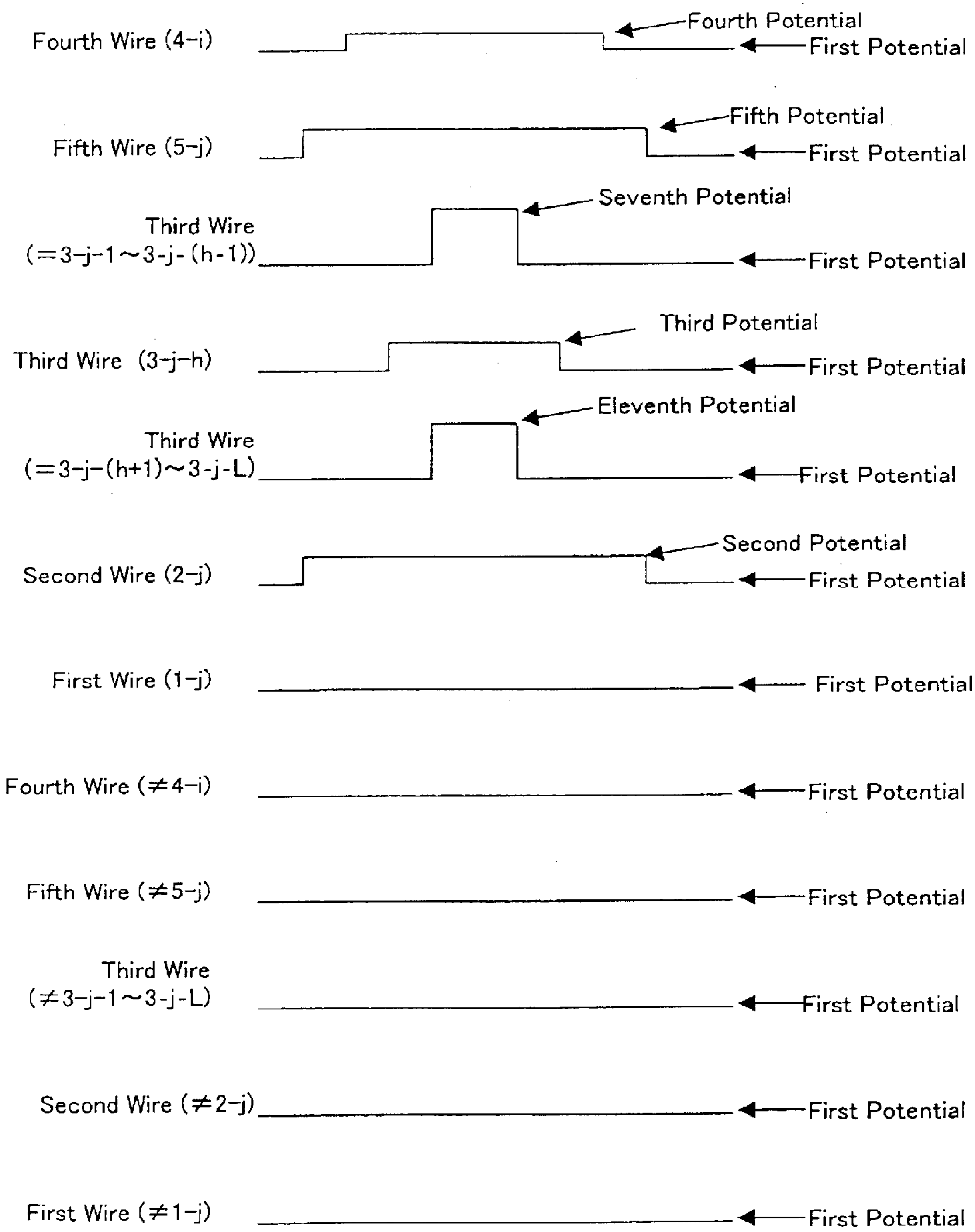

FIG. 96 shows a timing chart showing an example of timing of applying each potential for reading data in the case where the first wires are arranged in parallel to the third wires. In FIG. 96, a ground potential is applied as the first potential, and the thresholds of transistors having gate electrodes connected to the second wire and the fifth wire are, for example, 0.5 V. The memory cell has a threshold of 5.0 V to 7.5 V when it is in the written state and has a threshold of 0.5 V to 3 V when it is in the erased state.

First, the ground potential as the first potential is applied to the first wires (1-1 to 1-N), the second wires (2-1 to 2-N), the third wires (3-1-1 to 3-N-L), the fourth wires (4-1 to 4-M) and the fifth wires (5-1 to 5-N). In this state, the second potential, e.g., 3V, is applied to the second wire (2-*j*), and the fifth potential, e.g., 3 V which is equal to the second potential, is applied to the fifth wire (5-*j*). The fourth potential, e.g., 1 V, is applied to the fourth wire (4-*i*), and the third potential, e.g., 4 V, is applied to the third wire (3-*j*-h) connected to the selected cell. The seventh potential, e.g., 8 V, is applied to third wires (3-*j*-1 to 3-*j*-(h−1)) connected to non-selected cells arranged in series with the selected cell, and the eleventh potential, e.g., 8 V which is equal to the seventh potential, is applied to third wires (3-*j*-(h−1) to 3-*j*-L) connected to non-selected cells arranged in series with the selected cell. The current flowing through the fourth wire (4-*i*) or the first wire (1-*j*) is sensed.

The third wires (not 3-*j*-h) other than the third wire (3-*j*-h) are returned to the ground potential, i.e., the first potential, and then the third wire (3-*j*-h) is returned to the ground potential, i.e., the first potential. The fourth wiring (4-*i*) is returned to the ground potential, i.e., the first potential, and the second wire (2-*j*) and the fifth wire (5-*j*) are returned to the ground potential, i.e., the first potential. The potentials may be applied to the respective wires in another order or simultaneously. Further, the respective wires may be returned to the ground potential, i.e., the first potential, in another order or simultaneously.

The second and fifth potentials may be different, and the eleventh and seventh potential may be different. Here, the same potential is preferably applied initially as the first potential to the first wires (1-1 to 1-N), the second wires (2-1 to 2-N), the third wires (3-1-1 to 3-N-L), the fourth wires (4-1 to 4-M) and the fifth wires (5-1 to 5-N), but different potentials may be applied. The third potential may be kept applied to the third wire (3-*j*-h).

In the above example, the reading process has been described with the case where the selected cell is a memory cell having the third wire (3-*j*-h) as the gate electrode. However, the reading process is the same with the case where the selected cell is a memory cell having a third wire other than the third wire (3-*j*-h) as the gate electrode.

Figure 97:
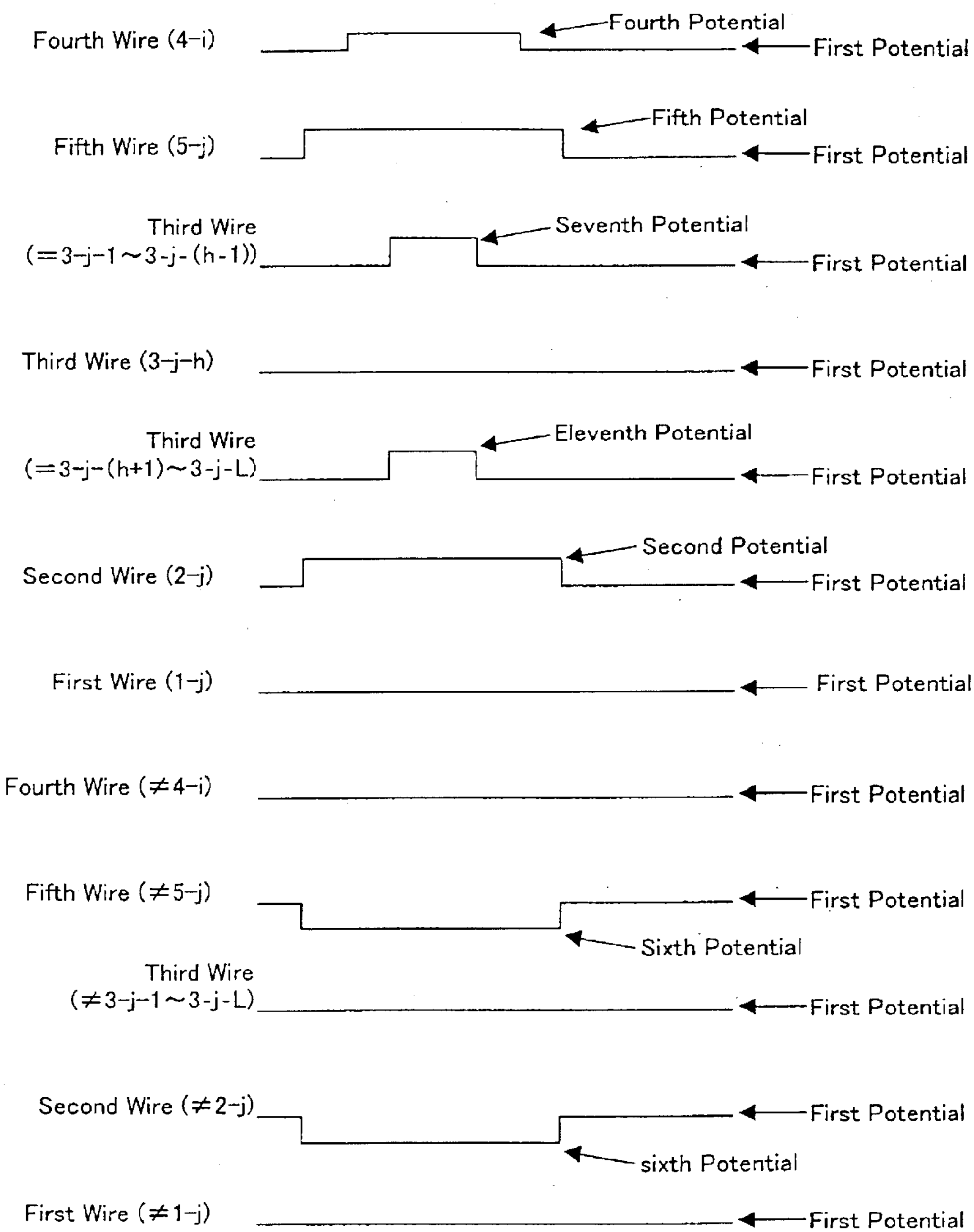

FIG. 97 shows a timing chart showing an example of timing of applying each potential for reading data in the case where the first wires are arranged in parallel to the third wires. In FIG. 97, a ground potential is applied as the first potential, and the thresholds of transistors having gate electrodes connected to the second wire and the fifth wire are, for example, 0.5 V. The memory cell has a threshold of 1.0 V to 3.5 V when it is in the written state and has a threshold of −1.0 V or lower when it is in the erased state.

First, the ground potential as the first potential is applied to the first wires (1-1 to 1-N), the second wires (2-1 to 2-N), the third wires (3-1-1 to 3-N-L), the fourth wires (4-1 to 4-M) and the fifth wires (5-1 to 5-N). In this state, the sixth potential, e.g., −1 V, is applied to second wires (not 2-*j*) and fifth wires (not 5-*j*), the second potential, e.g., 3 V, is applied to the second wire (2-*j*), and the fifth potential, e.g., 3 V which is equal to the second potential, is applied to the fifth wire (5-*j*). The fourth potential, e.g., 1 V, is applied to the fourth wire (4-*i*). The third potential, e.g., the ground potential which is the first potential, is kept applied to the third wiring (3-*j*-h) connected to the selected cell. The seventh potential, e.g., 5 V, is applied to third wires (3-*j*-1 to 3-*j*-(h−1)) connected to non-selected cells arranged in series with the selected cell, the eleventh potential, e.g., 5 V which is equal to the seventh potential, is applied to third wires (3-*j*-(h−1) to 3-*j*-L) connected to non-selected cells arranged in series with the selected cell, and the twelfth potential is applied to third wires (not 3-*j*-1 to 3-*j*-L) connected to non-selected cells not arranged in series with the selected cell. The current flowing through the fourth wire (4-*i*) or the first wire (1-*j*) is sensed.

The third wires (not 3-*j*-h) other than the third wire (3-*j*-h) are returned to the ground potential, i.e., the first potential, and the fourth wire (4-*i*) is returned to the ground potential, i.e., the first potential. The second wire (2-*j*), the fifth wire (5-*j*), the second wires (not 2-*j*) and the fifth wires (not 5-*j*) are returned to the ground potential, i.e., the first potential. The potentials may be applied to the respective wires in another order or simultaneously. Further, the respective wires may be returned to the ground potential, i.e., the first potential, in another order or simultaneously. The second and fifth potentials may be different, and the eleventh and seventh potential may be different. Here, the same potential is preferably applied initially as the first potential to the first wires (1-1 to 1-N), the second wires (2-1 to 2-N), the third wires (3-1-1 to 3-N-L), the fourth wires (4-1 to 4-M) and the fifth wires (5-1 to 5-N), but different potentials may be applied. The third potential may be kept applied to the third wire (3-*j*-h). The sixth potential may be the ground potential.

In the above example, the reading process has been described with the case where the selected cell is a memory cell having the third wire (3-*j*-h) as the gate electrode. However, the reading process is the same with the case where the selected cell is a memory cell having a third wire other than the third wire (3-*j*-h) as the gate electrode.

Figure 98:
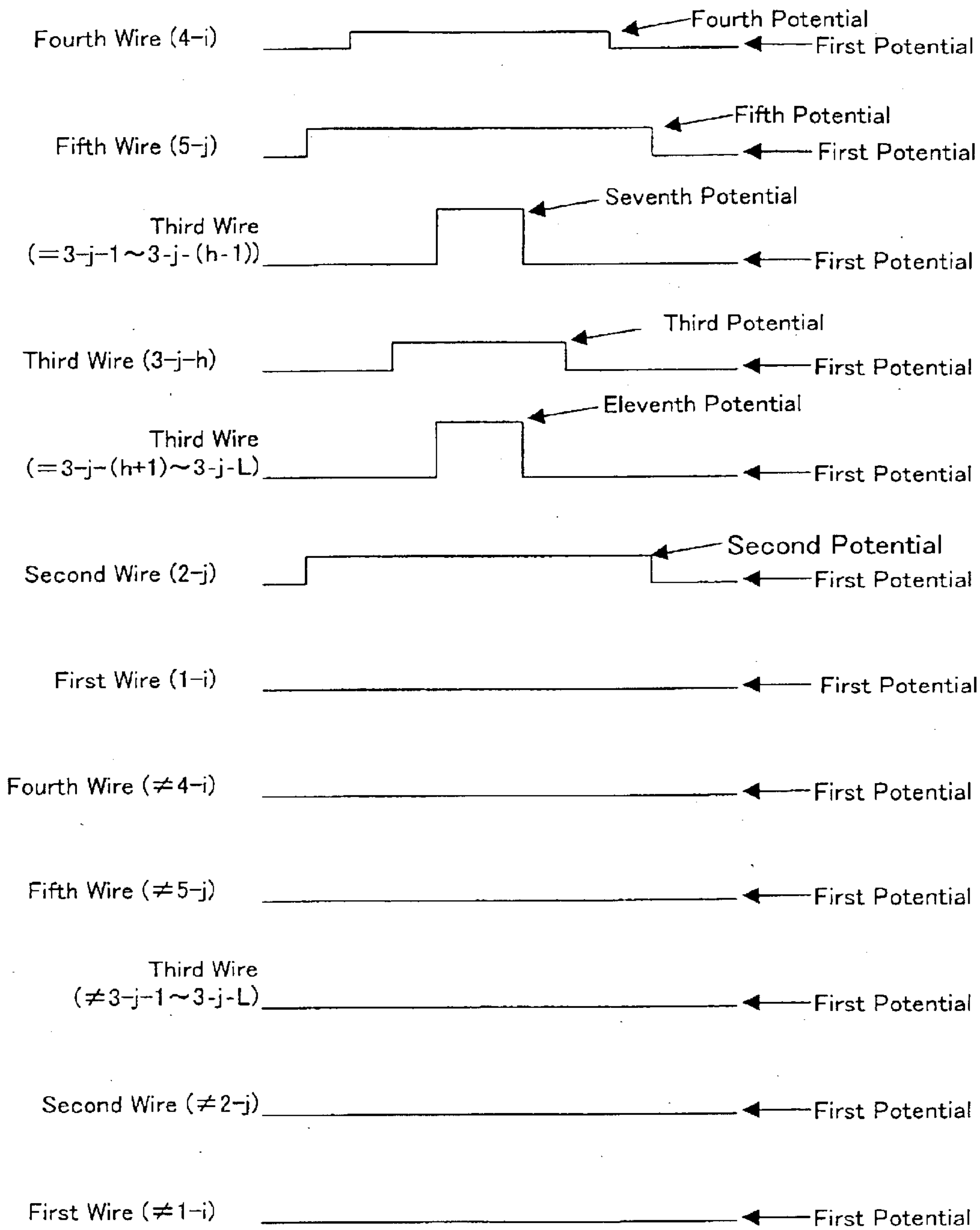

FIG. 98 shows a timing chart showing an example of timing of applying each potential for reading data in the case where the first wires are arranged in parallel to the fourth wires. In FIG. 98, a ground potential is applied as the first potential, and the thresholds of transistors having gate electrodes connected to the second wire and the fifth wire are, for example, 0.5 V. The memory cell has a threshold of 5.0 V to 7.5 V when it is in the written state and has a threshold of 0.5 V to 3 V when it is in the erased state.

FIG. 98 conforms to FIG. 96 except that a first wire (1-*i*) in place of the first wire (1-*j*) is connected to the end portion of the island-like semiconductor layer including the selected cell.

Figure 99:
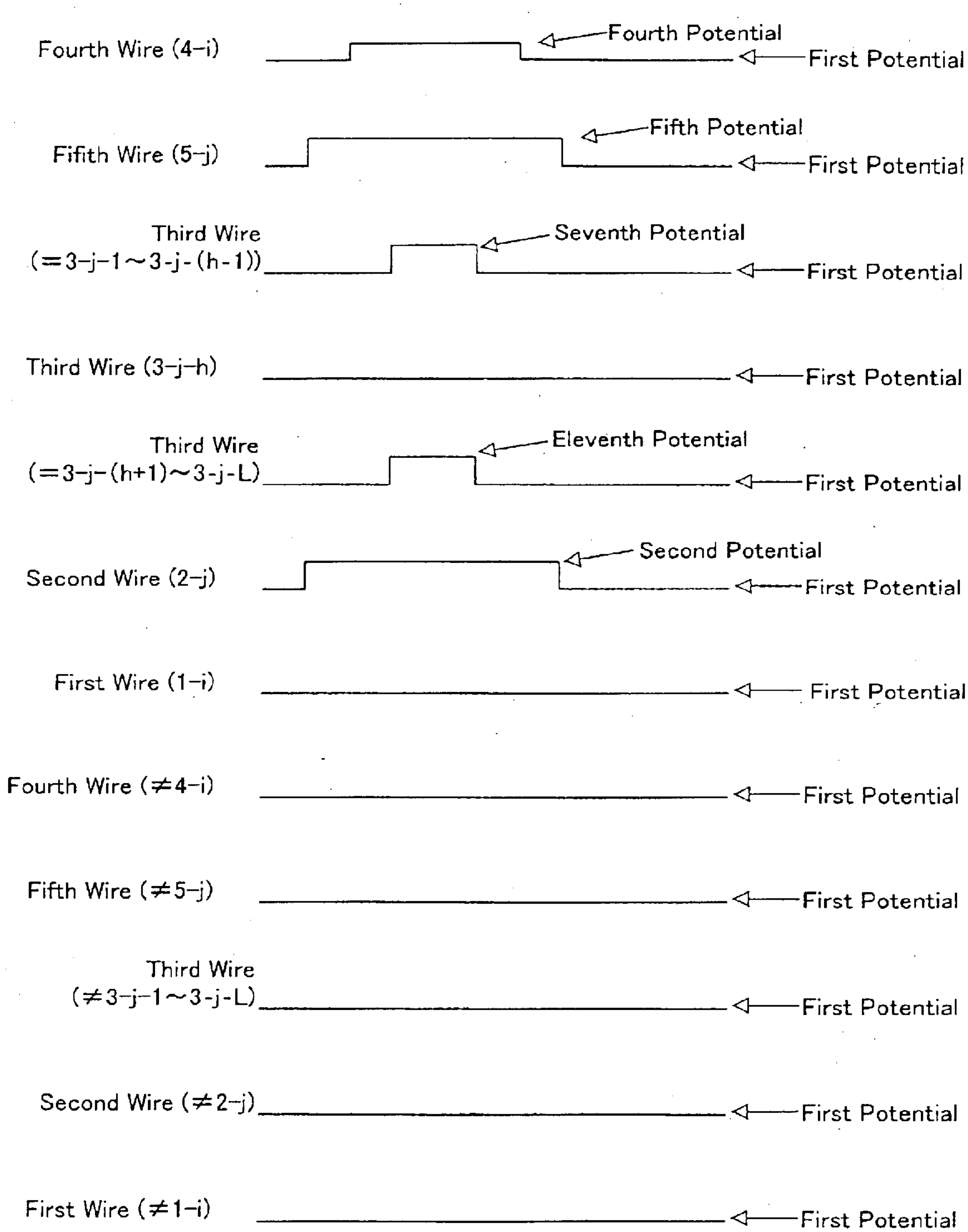

FIG. 99 shows a timing chart showing an example of timing of applying each potential for reading data when the first wirings are connected in common to the entire array. In FIG. 99, a ground potential is applied as the first potential, and the thresholds of transistors having gate electrodes connected to the second wire and the fifth wire are, for example, 0.5 V. The memory cell has a threshold of 1.0 V to 3.5 V when it is in the written state and has a threshold of −1.0 V or lower when it is in the erased state.

FIG. 99 conforms to FIG. 97 except that a first wiring (1-*i*) in place of the first wiring (1-*j*) is connected to the end portion of the island-like semiconductor layer including the selected cell and the sixth potential equals the first potential. The sixth potential is not necessarily the same as the first potential.

Figure 100:
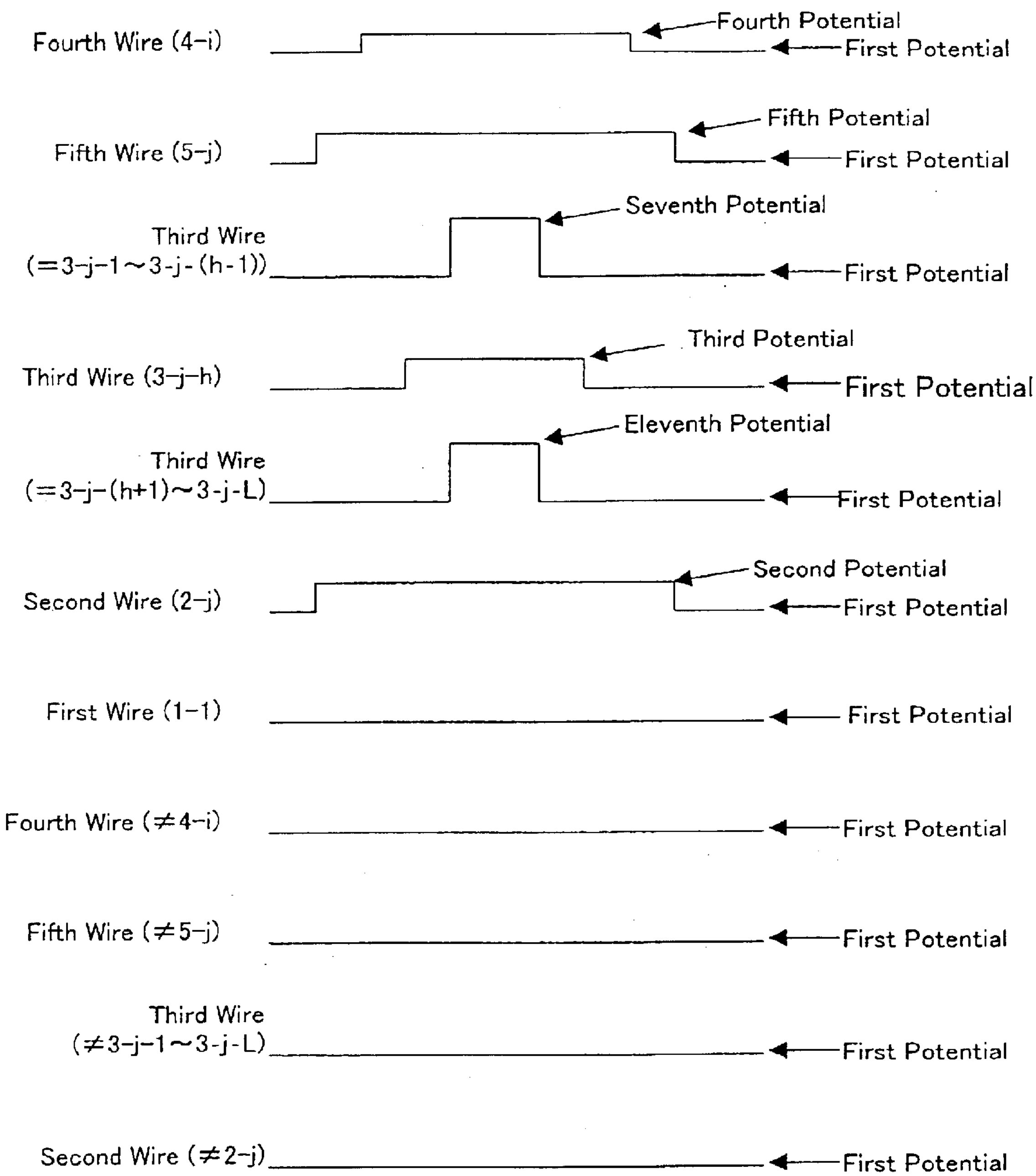

FIG. 100 shows a timing chart showing an example of timing of applying each potential for reading data when the first wires are connected in common to the entire array. In FIG. 100, a ground potential is applied as the first potential, and the thresholds of transistors having gate electrodes connected to the second wire and the fifth wire are, for example, 0.5 V. The memory cell has a threshold of 5.0 V to 7.5 V when it is in the written state and has a threshold of 0.5 to 3.0 V when it is in the erased state.

FIG. 98 conforms to FIG. 96 except that a first wire (1-1) in place of the first wiring (1-*j*) is connected to the end portion of the island-like semiconductor layer including the selected cell.

Figure 101:
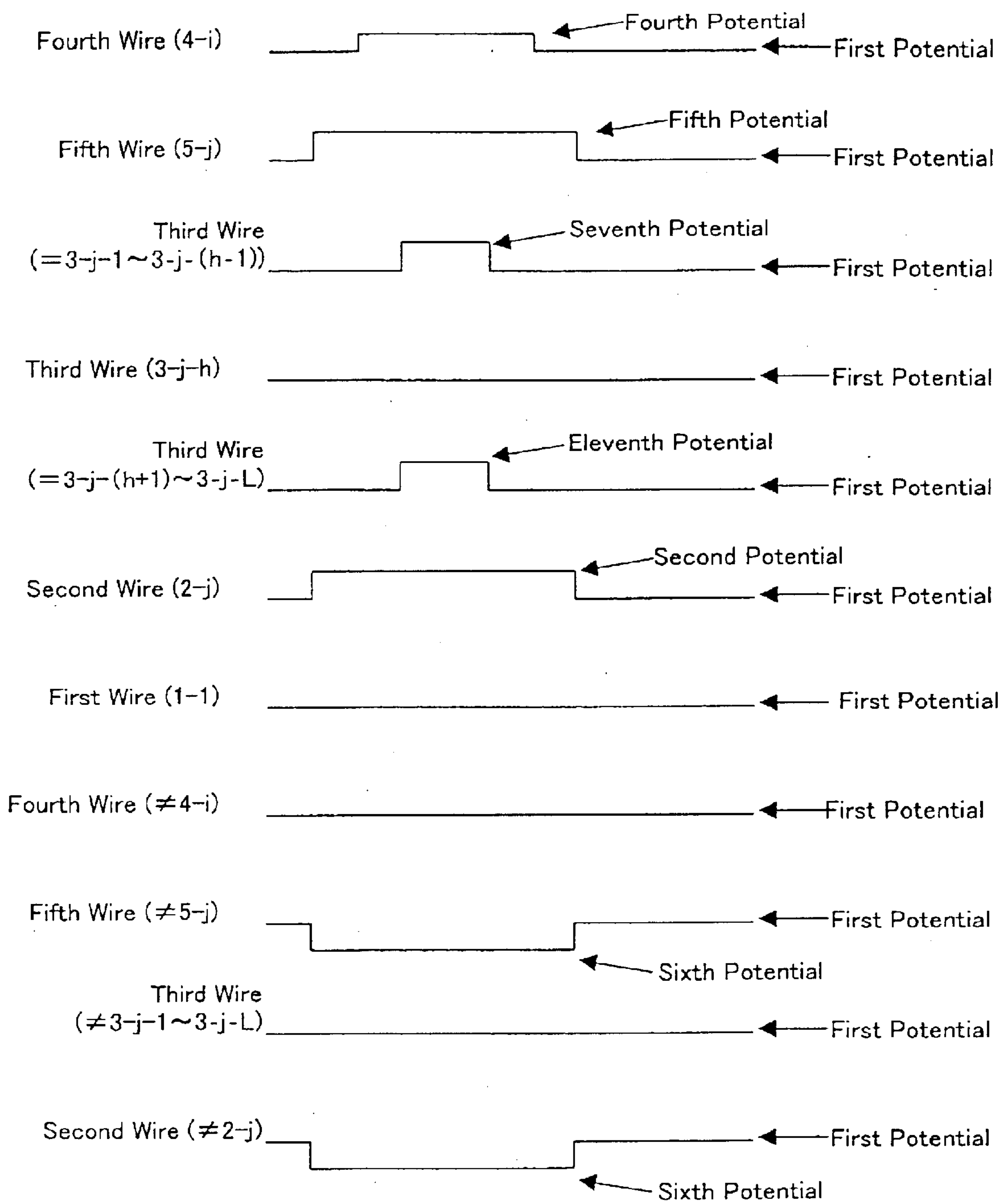

FIG. 101 shows a timing chart showing an example of timing of applying each potential for reading data when the first wirings are connected in common to the entire array. In FIG. 101, a ground potential is applied as the first potential, and the thresholds of transistors having gate electrodes connected to the second wire and the fifth wire are, for example, 0.5 V. The memory cell has a threshold of 1.0 V to 3.5 V when it is in the written state and has a threshold of −1.0 V or lower when it is in the erased state.

FIG. 101 conforms to FIG. 97 except that a first wiring (1-*i*) in place of the first wiring (1-*j*) is connected to the end portion of the island-like semiconductor layer including the selected cell.

A reading process is explained with a semiconductor memory according to the present invention which is constructed to include a plurality of (e.g., M×N, wherein M and N are positive integers) island-like semiconductor layers each having a charge storage layer and a plurality (e.g., 2) of memory cells connected in series. In this memory cell array, a plurality of (e.g., M) fourth wires arranged in parallel with the semiconductor substrate are connected to end portions of the island-like semiconductor layers, and first wires are connected to opposite end portions of the island-like semiconductor layers. A plurality of (e.g., N×2) third wires are arranged in a direction crossing the fourth wires and are connected to the third electrodes of the memory cells.

Figure 72:
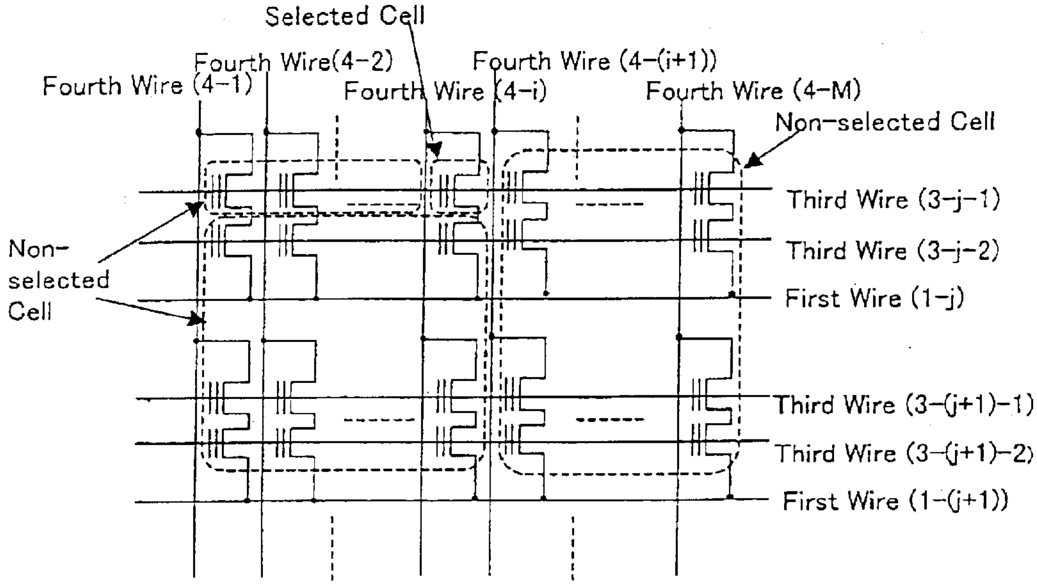

FIG. 72 shows the equivalent circuit diagram of the above-described memory cell array in which the first wires are in parallel to the third wires.

For example, in the case where the island-like semiconductor layers are formed of a P-type semiconductor, a selected cell shown in FIG. 72 is read by applying a first potential to a first wire (1-*j*, wherein j is a positive integer, 1≦j≦N) connected to an island-like semiconductor layer including the selected cell, a third potential to a third wire (3-*j*-1) connected to the selected cell, an eleventh potential to a third wire (3-*j*-2) connected to a non-selected cell arranged in series with the selected cell, a twelfth potential to third wires (3-*j*-1 to 3-*j*-2) connected to non-selected cells not arranged in series with the selected cell and, a fourth potential to a fourth wire (4-*i*, wherein i is a positive integer, 1≦i≦M) connected to the island-like semiconductor layer including the selected cell and an eighth potential to fourth wires (not 4-i) other than the fourth wire (4-*i*). The fourth potential is larger than the first potential. A "0" or "1" is judged from a current flowing through the fourth wire (4-*i*) or the first wire (1-*j*). At this time, the third potential is a potential allowing the distinction of the amount of a charge stored in the charge storage layer, i.e., a potential allowing the judgement of "0" or "1." The eleventh potential is a potential always allowing a cell current to flow through the memory cell regardless of the amount of the charge stored in the charge storage layer, i.e., a potential allowing the formation of a reverse layer in the channel region of the memory cell. For example, the eleventh potential is not lower than the threshold voltage that a memory transistor having the third electrode connected to the third wire as the gate electrode can take.

The eighth potential is preferably equal to the first potential.

In the case where the first wires (1-1 to 1-N) are formed as impurity diffusion layers in the semiconductor substrate and the channel regions of a memory cells are electrically connected to the semiconductor substrate, the first potential applied to the first wire (1-*j*) connected to the island-like semiconductor layer including the selected cell is such that, by applying the first potential, the island-like semiconductor layer becomes in the electrically floating state from the semiconductor substrate by a depletion layer extended toward the semiconductor substrate. Thereby, the potential of the island-like semiconductor layer equals the first potential, and the selected cell on the island-like semiconductor layer can be read without being affected by the potential of the substrate.

The selected memory cell is apparently back-biased to the substrate since the potential of the first electrode rises with respect to the potential of the substrate because of a resistant component in the impurity diffusion layer from the first electrode of the island-like semiconductor layer including the selected memory cell to a power source when a reading current flows through the first wire (1-*j*).

However, in the present invention, it is possible to prevent a back-bias effect which may occur when the semiconductor substrate is electrically connected with the channel region of the memory cell on the island-like semiconductor layer and has the same potential with the channel region, and a rise in the threshold and a decrease in the current owing to the back bias can be prevented.

In the case where the first wires (1-1 to 1-N) are formed as impurity diffusion layers in the semiconductor substrate and the tenth potential applied to the semiconductor substrate is the ground potential, the first potential is generally the ground potential.

In the case where the first wires (1-1 to 1-N) are electrically insulated from the semiconductor substrate, for example, where the first electrodes (1-1 to 1-N) are formed of impurity diffusion layers on an SOI substrate and are insulated from the semiconductor substrate by an insulating film, the first potential is not necessarily the same as the tenth potential. The memory cells may be sequentially read from a memory cell connected to a third electrode (3-*j*-2) to a memory cell connected to a third electrode (3-*j*-1), or may be read in reverse order or at random. Further, some or all memory cells connected to the third wire (3-*j*-1) may be read at the same time. For a particular example, the memory cells connected to the third wire (3-*j*-1) may be read simultaneously by given intervals, for example, every eight fourth wires (e.g., a fourth wire (4-(i−16)), a fourth wire (4-(i−8)), a fourth wire (4-*i*), a fourth wire (4-(i+8)), a fourth wire (4-(i+16)), . . . ). A plurality of third wires having uncommon fourth wires may be read at the same time. The above-mentioned ways of reading may be combined.

Figure 76:
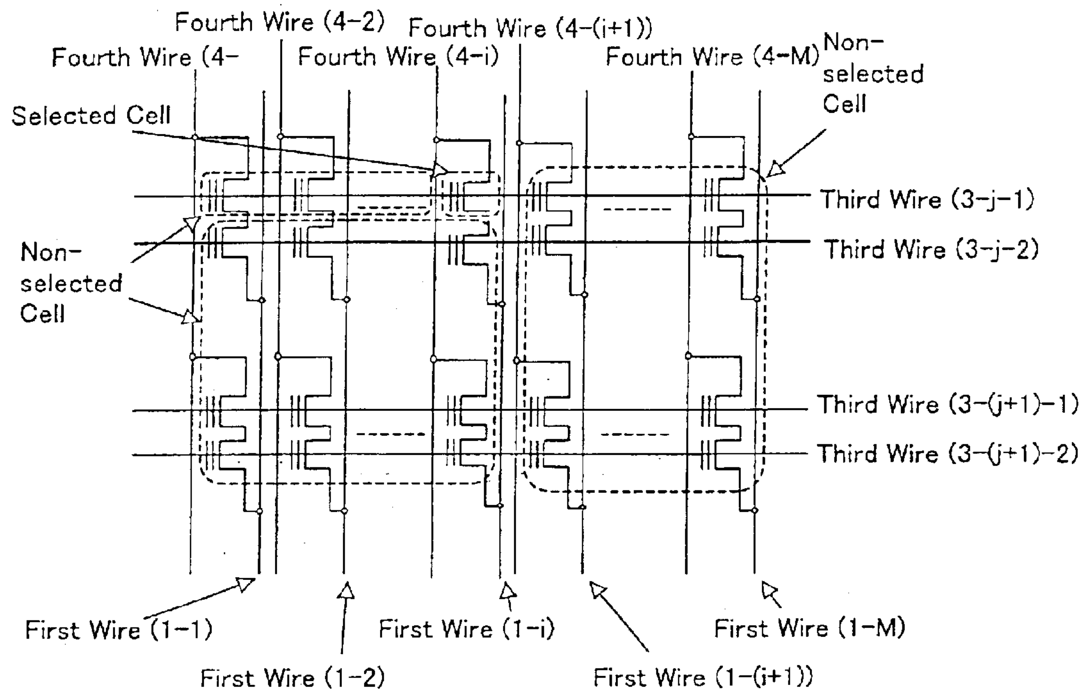

FIG. 76 shows the equivalent circuit diagram of a memory cell array in which the first wires are in parallel to the fourth wires. The application of the potentials for reading data is the same as in FIG. 72 except that the first potential is applied to the first wire (1-*i*).

Figure 80:
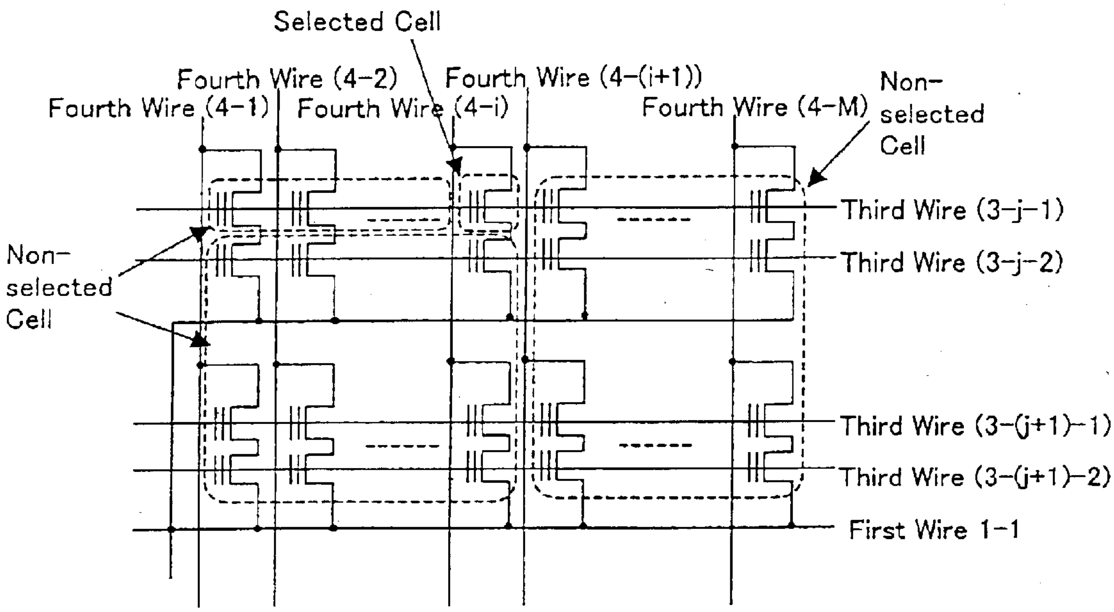

FIG. 80 shows the equivalent circuit diagram of a memory cell array in which a plurality of first wires are electrically connected in common. The application of the potentials for reading data is the same as in FIG. 72 except that the first potential is applied to the first wire (1-1).

Figure 102:
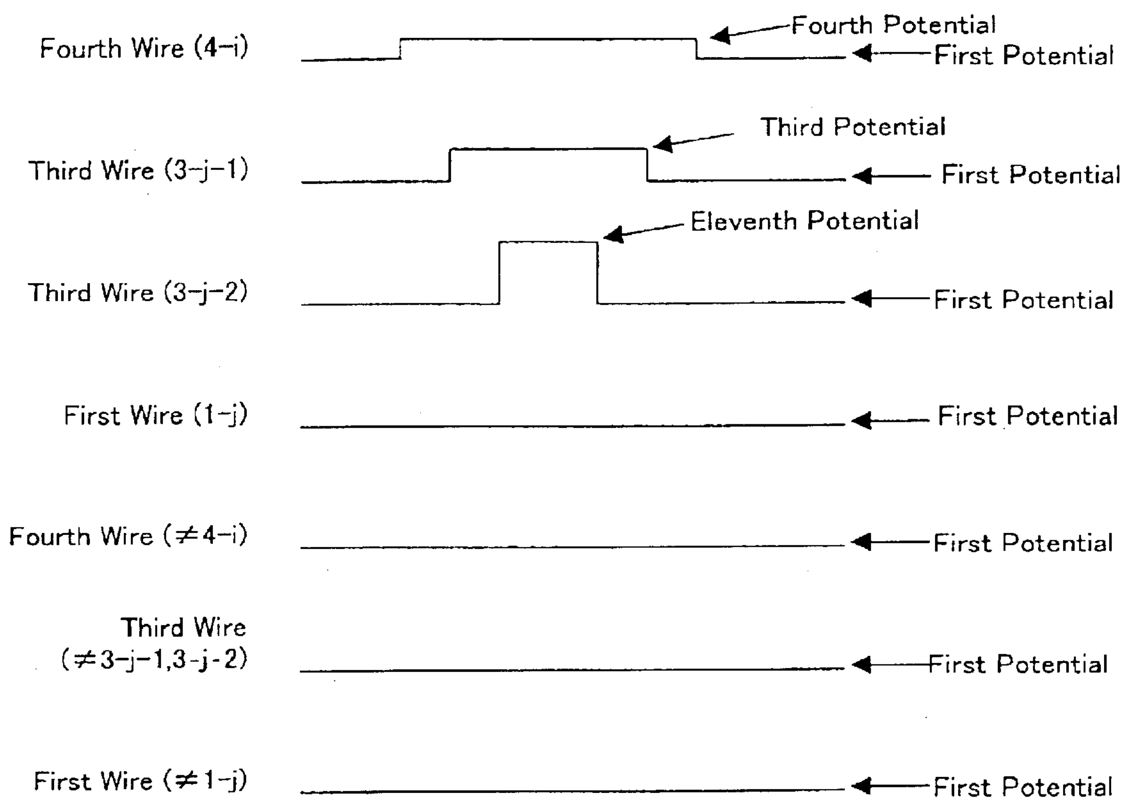

FIG. 102 shows a timing chart showing an example of timing of applying each potential for reading data when the first wires are arranged in parallel to the third wires. In FIG. 102, a ground potential is applied as the first potential, and the memory cell has a threshold of 5.0 V to 7.5 V when it is in the written state and has a threshold of 0.5 V to 3 V when it is in the erased state.

First, the ground potential as the first potential is applied to the first wires (1-1 to 1-N), the third wires (3-1-1 to 3-N-2), and the fourth wirings (4-1 to 4-M). In this state, the fourth potential, e.g., 1 V, is applied to a fourth wire (4-*i*). The third potential, e.g., 4 V, is applied to a third wire (3-*j*-1) connected to the selected cell. The eleventh potential, e.g., 8 V, is applied to a third wire (3-*j*-2) connected to a non-selected cell arranged in series with the selected cell. The current flowing through the fourth wire (4-*i*) or the first wire (1-*j*) is sensed.

Thereafter, the third wire (3-*j*-2) is returned to the ground potential, i.e., the first potential, and the third wire (3-*j*-1) is returned to the ground potential, i.e., the first potential. The fourth wiring (4-*i*) is returned to the ground potential, i.e., the first potential. The potentials may be applied to the respective wires in another order or simultaneously. Further, the respective wires may be returned to the ground potential, i.e., the first potential, in another order or simultaneously. Here, the same potential is preferably applied initially as the first potential to the first wires (1-1 to 1-N), the second wires (2-1 to 2-N), the third wires (3-1-1 to 3-N-2) and the fourth wires (4-1 to 4-M), but different potentials may be applied. The third potential may be kept applied to the third wire (3-*j*-1).

In the above example, the reading process has been described with the case where the selected cell is a memory cell having the third wire (3-*j*-1) as the gate electrode. However, the reading process is the same with the case where the selected cell is a memory cell having the third wire (3-*j*-2) as the gate electrode.

Figure 103:
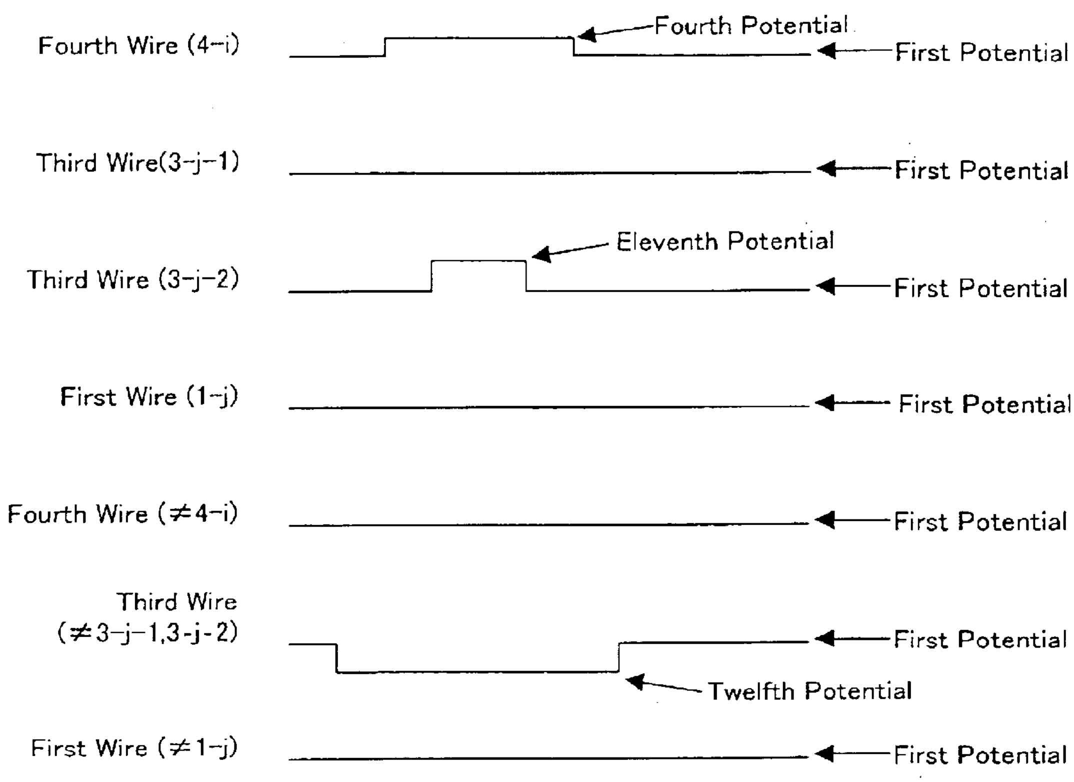

FIG. 103 shows a timing chart showing an example of timing of applying each potential for reading data when the first wires are arranged in parallel to the third wires. In FIG. 103, a ground potential is applied as the first potential, and the memory cell has a threshold of 1.0 V to 3.5 V when it is in the written state and has a threshold of −3.0 V to −1.0 V when it is in the erased state.

First, the ground potential as the first potential is applied to the first wires (1-1 to 1-N), the third wires (3-1-1 to 3-N-2) and the fourth wires (4-1 to 4-M). In this state, the twelfth potential, e.g., 4 V, is applied to third wires (not 3-*j*-1 to 3-*j*-2) connected to non-selected cells not arranged in series with the selected cell. The fourth potential, e.g., 1 V, is applied to a fourth wire (4-*i*). The third potential, e.g., the ground potential which is the first potential, is applied to a third wire (3-*j*-1) connected to the selected cell. The eleventh potential, e.g., 5 V, is applied to a third wire (3-*j*-2) connected to a non-selected cell arranged in series with the selected cell. The current flowing through the fourth wire (4-*i*) or the first wire (1-*j*) is sensed.

Thereafter, the third wire (3-*j*-2) is returned to the ground potential, i.e., the first potential, and the third wire (3-*j*-1) is returned to the ground potential, i.e., the first potential. The fourth wiring (4-*i*) is returned to the ground potential, i.e., the first potential. The third wires (not 3-*j*-1 to 3-*j*-2) are returned to the ground potential, i.e., the first potential. The potentials may be applied to the respective wires in another order or simultaneously. Further, the respective wires may be returned to the ground potential, i.e., the first potential, in another order or simultaneously. Here, the same potential is preferably applied initially as the first potential to the first wires (1-1 to 1-N), the third wires (3-1-1 to 3-N-2) and the fourth wires (4-1 to 4-M), but different potentials may be applied. The third potential may be kept applied to the third wire (3-*j*-1).

In the above example, the reading process has been described with the case where the selected cell is a memory cell having the third wire (3-*j*-1) as the gate electrode. However, the reading process is the same with the case where the selected cell is a memory cell having the third wire (3-*j*-2) as the gate electrode.

Figure 104:
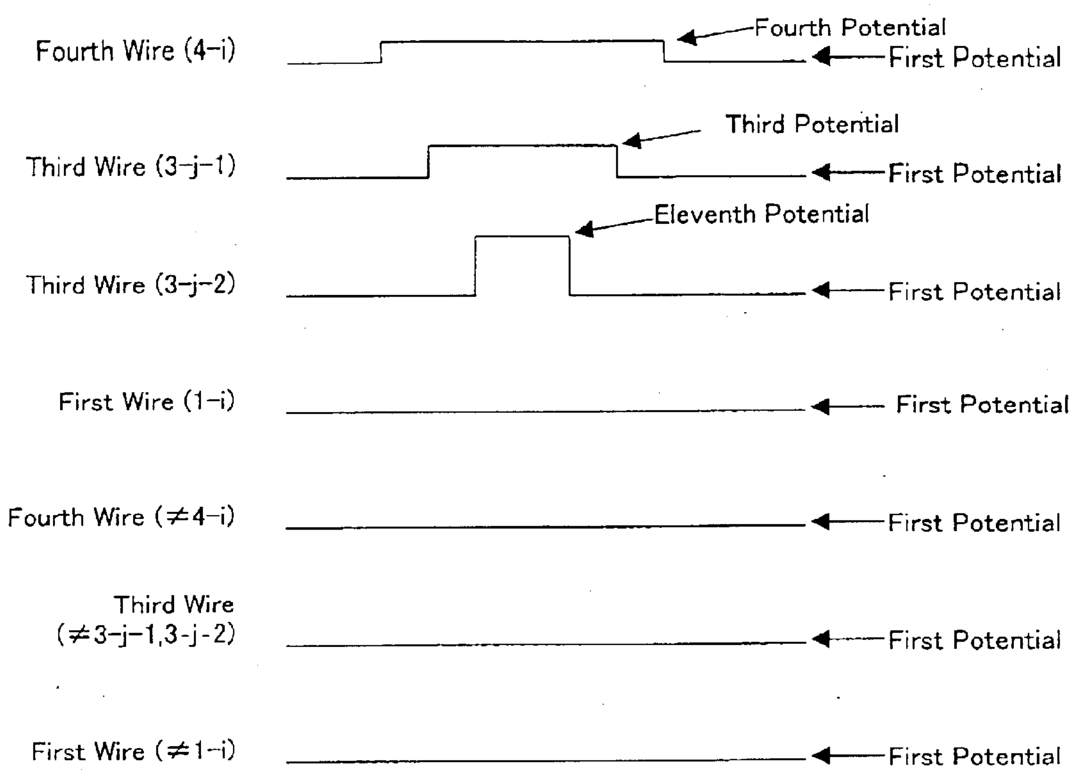

FIG. 104 shows a timing chart showing an example of timing of applying each potential for reading data in the case where the first wires are arranged in parallel to the fourth wires. In FIG. 104, a ground potential is applied as the first potential, and the memory cell has a threshold of 5.0 V to 7.5 V when it is in the written state and has a threshold of 0.5 V to 3.0 V when it is in the erased state.

FIG. 104 conforms to FIG. 102 except that a first wire (1-*i*) in place of the first wire (1-*j*) is connected to the end portion of the island-like semiconductor layer including the selected cell.

Figure 105:
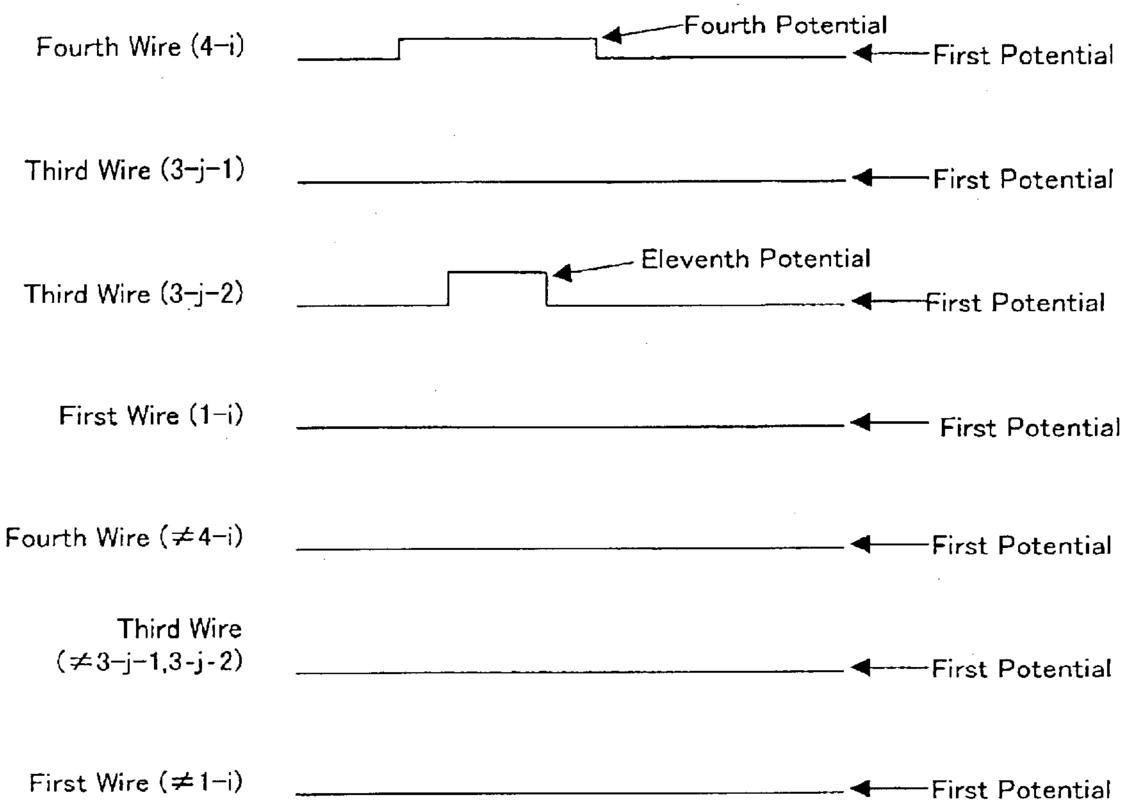

FIG. 105 shows a timing chart showing an example of timing of applying each potential for reading data when the first wires are arranged in parallel to the fourth wires. In FIG. 105, a ground potential is applied as the first potential, and the memory cell has a threshold of 1.0 V to 3.5 V when it is in the written state and has a threshold of −1.0 V or lower when it is in the erased state. FIG. 105 conforms to FIG. 103 except that a first wire (1-*i*) in place of the first wire (1-*j*) is connected to the end portion of the island-like semiconductor layer including the selected cell and the twelfth potential equals the first potential. However, the twelfth potential does not necessarily equal the first potential.

Figure 88:
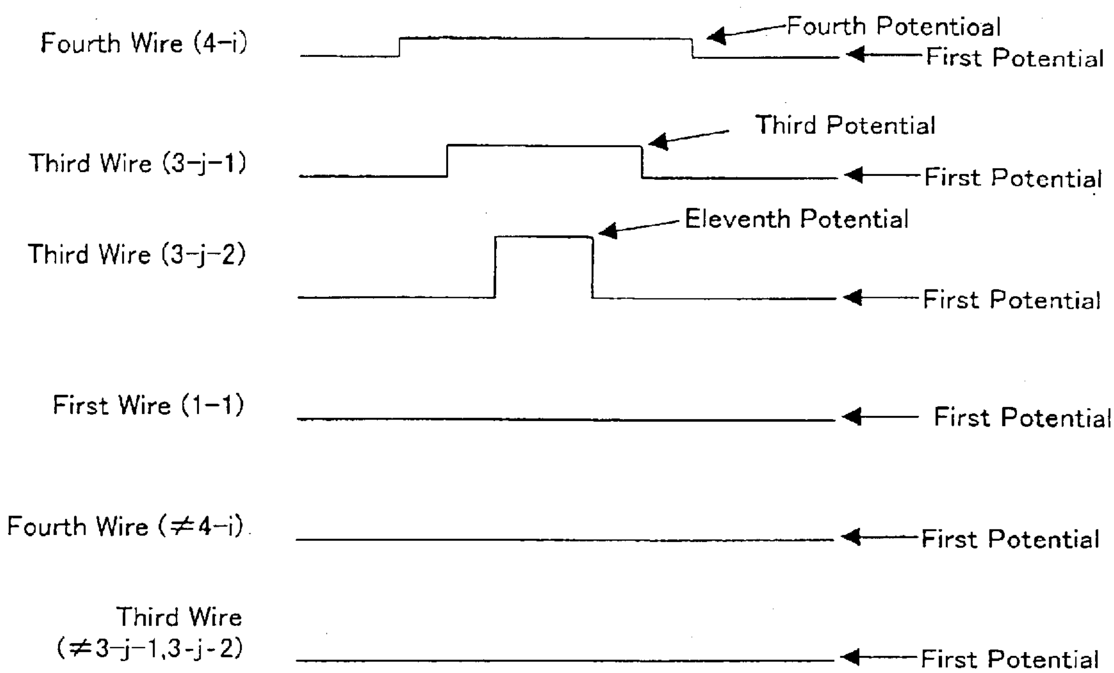

FIG. 88 shows a timing chart showing an example of timing of applying each potential for reading data in the case where the first wires are connected in common to the entire array. In FIG. 88, a ground potential is applied as the first potential, and the memory cell has a threshold of 5.0 V to 7.5 V when it is in the written state and has a threshold of 0.5 V to 3.0 V when it is in the erased state. FIG. 88 conforms to FIG. 102 except that a first wire (1-1) in place of the first wire (1-*j*) is connected to the end portion of the island-like semiconductor layer including the selected cell.

Figure 89:
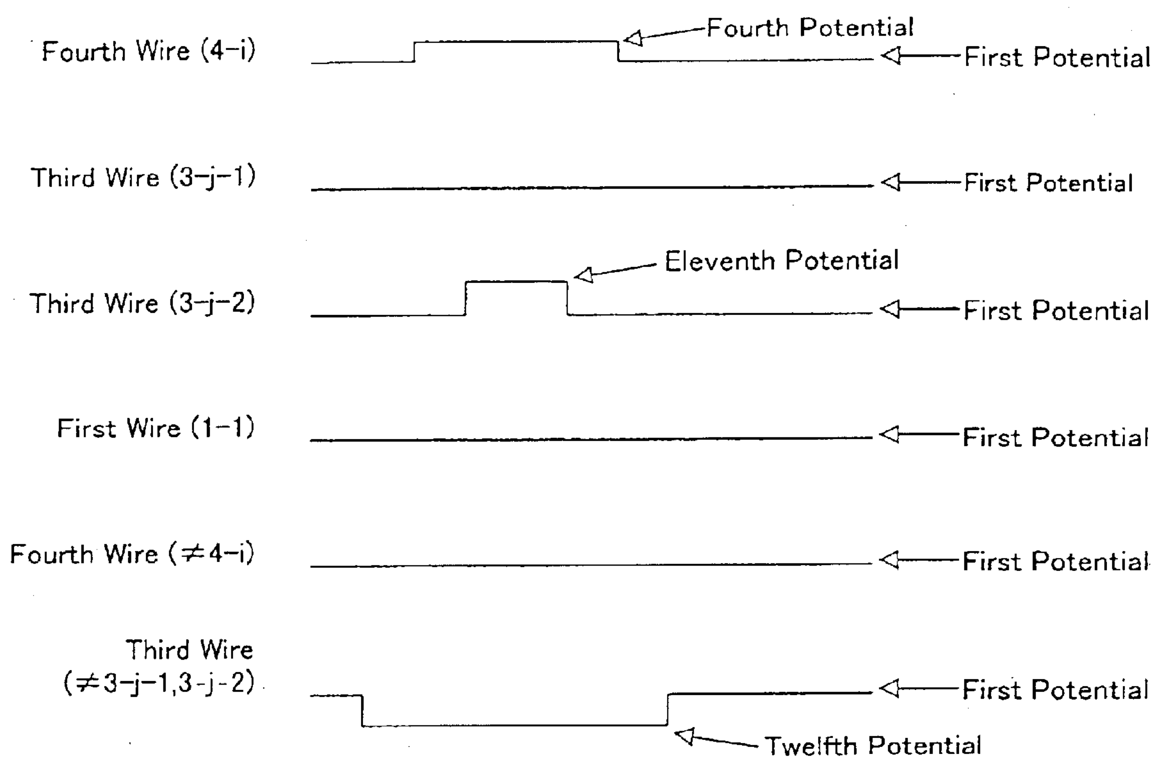

FIG. 89 shows a timing chart showing an example of timing of applying each potential for reading data in the case where the first wires are connected in common to the entire array. In FIG. 89, a ground potential is applied as the first potential, and the memory cell has a threshold of 1.0 V to 3.5 V when it is in the written state and has a threshold of −1.0 V or lower when it is in the erased state. FIG. 89 conforms to FIG. 103 except that a first wire (1-1) in place of the first wire (1-*j*) is connected to the end portion of the island-like semiconductor layer including the selected cell.

A writing process is now explained with a semiconductor memory according to the present invention which is so constructed that a memory cell has a charge storage layer in an island-like semiconductor layer and a third electrode as a control gate electrode. The writing process utilizes a Fowler-Nordheim tunneling current (referred to as F-N current hereinafter).

For example, in the case where the island-like semiconductor layers are formed of a P-type semiconductor, a selected cell shown in FIG. 57 is written by applying a first potential to the first electrode of an island-like semiconductor layer including the selected cell, a third potential to the third electrode connected to the selected cell and a fourth potential to the fourth electrode of the island-like semiconductor layer. The application of these potentials generates the F-N current only in the tunnel oxide film of the selected cell and changes the state of a charge in the charge storage layer.

If a "1" is written by storing a negative charge in the charge storage layer, the third potential is larger than the fourth potential. If a "1" is written by drawing a negative charge from the charge storage layer, i.e., by storing a positive charge, the third potential is smaller than the fourth potential. Thus, the "0" or "1" can be set by utilizing a change in the state of the charge in the charge storage layer. At this time, the third potential is a potential such that the "1" can be written by a difference between the third and fourth potentials. For example, the third potential is a potential allowing the generation of a sufficient F-N current flow by a difference between the third and fourth potentials. The F-N current flows in the tunnel oxide film of the memory transistor having, as the gate electrode, the third electrode to which the third potential is applied and thereby changes the state of the charge in the charge storage layer. The first electrode may be opened.

In the case where the channel region of a memory cell is electrically connected to the semiconductor substrate, for example, in the case where the island-like semiconductor layer is not floated from the semiconductor substrate by an impurity diffusion layer, the memory cell is written if the tenth potential applied to the semiconductor substrate is a potential such that the "1" is written by a difference between the third potential and the tenth potential, for example, a potential such that a sufficiently large F-N current flows by a difference between the third potential and the tenth potential. The F-N current flows in the tunnel oxide film of the memory transistor having, as the gate electrode, the third electrode to which the third potential is applied.

In the case where the first electrode is formed as an impurity diffusion layer in the semiconductor substrate and the tenth potential applied to the semiconductor substrate is a ground potential, the first potential is generally the ground potential. In the case where the first electrode is electrically insulated from the semiconductor substrate, for example, in the case where the first electrode is formed of an impurity diffusion layer on an SOI substrate and is insulated from the semiconductor substrate by an insulating film, the first potential is not necessarily the same as the tenth potential.

The charge storage layer may be, for example, a dielectric or a laminated insulating film as well as the floating gate. Also, it is needless to say that the "0" may be written by changing the state of the charge in the charge storage layer and the "1" may be written by not changing the state of the charge. Further, the "0" may be written by slightly changing the state of the charge in the charge storage layer and the "1" may be written by-greatly changing the state of the charge, and vice versa. Furthermore, the "0" is written by changing the state of the charge in the charge storage layer to negative and the "1" is written by changing the state of the charge to positive, and vice versa. The above-mentioned definitions of "0" and "1" may be combined. The F-N current is not the only means for changing the state of the charge in the charge storage layer.

Now examples of timing of applying the above-described potentials for writing data are explained with the case where one memory cell is disposed in an island-like semiconductor layer formed of a P-type semiconductor.

Figure 106:
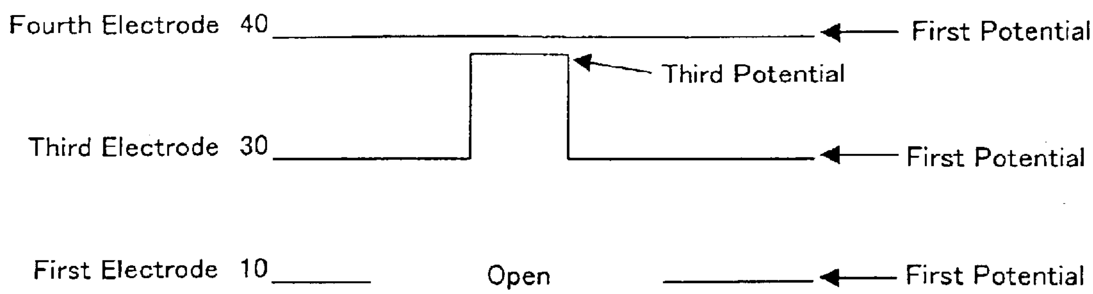

FIG. 106 is a timing chart showing an example of applying each potential for writing data in the case where the first electrode is open. For example, if the "1" is written by storing a negative charge in the charge storage layer, the ground potential as the first potential is first applied to the first, third and fourth electrodes. In this state, the first electrode is opened. The fourth potential, e.g., a ground potential which is the first potential, is kept applied to the fourth electrode. The third potential, e.g., 20 V, is applied to the third electrode. This state is maintained for a desired period of time to write the "1." The timing of applying the potentials to the respective electrodes may be in another order or simultaneous.

The third electrode is returned to the ground potential, i.e., the first potential, and the first electrode is returned to the ground potential, i.e., the first potential. The timing of returning the respective electrodes to the ground potential, i.e., the first potential, may be in another order or simultaneous. The potentials applied may be any combination of potentials so long as they satisfy conditions for writing the "1" in a desired cell. Here, the same potential is preferably applied initially as the first potential to the first, third and fourth electrodes, but different potentials may be applied. The first and fourth electrodes may be changed with each other.

Figure 107:
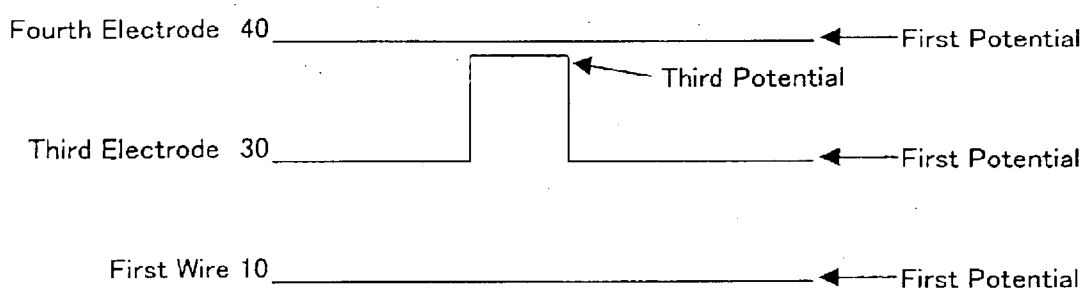

FIG. 107 is a timing chart showing an example of applying each potential for writing data in the case where the ground potential is applied as the first potential to all the first electrodes. For example, if the "1" is written by storing a negative charge in the charge storage layer, the ground potential as the first potential is first applied to the first, third and fourth electrodes. In this state, the fourth potential, e.g., a ground potential which is the first potential, is kept applied to the fourth electrode. The third potential, e.g., 20 V, is applied to the third electrode. This state is maintained for a desired period of time to write the "1".

The third electrode is returned to the ground potential, i.e., the first potential. The potentials applied may be any combination of potentials so long as they satisfy conditions for writing the "1" in a desired cell. Here, the same potential is preferably applied initially as the first potential to the first, third and fourth electrodes, but different potentials may be applied.

A writing process is now explained with a semiconductor memory according to the present invention which is constructed to have island-like semiconductor layers each including two memory cells provided with a charge storage layer between gate transistors and a third electrode as a control gate electrode and connected in series. The writing process utilizes a channel hot electron current (referred to as CHE current hereinafter).

In the case the island-like semiconductor layers are formed of a P-type semiconductor, a selected cell shown in FIG. 57 is written by applying a first potential to a first electrode of an island-like semiconductor layer including the selected cell, a third potential to a third electrode connected to the selected cell, and a fourth potential to a fourth electrode of the island-like semiconductor layer including the selected cell. This application of the potentials generates the CHE current in the channel region of the selected cell and changes the state of the charge in the charge storage layer.

For example, if the "1" is written by storing a negative charge in the charge storage layer, the fourth potential is larger than the first potential, the third potential is larger than the first potential, the first potential is preferably the ground potential, and the third or fourth potential is a potential such that the "1" can be written by a potential difference between the third and first potentials and a potential difference between the fourth and first potential, for example, a potential allowing the generation of a sufficient CHE current. The CHE current flows in the tunnel oxide film of the memory transistor having, as the gate electrode, the third electrode to which the third potential is applied and thereby changes the state of the charge in the charge storage layer.

In the case where the first electrode is formed as an impurity diffusion layer in the semiconductor substrate and the tenth potential applied to the semiconductor substrate is a ground potential, the first potential is generally the ground potential. In the case where the first electrode is electrically insulated from the semiconductor substrate, for example, in the case where the first electrode is formed of an impurity diffusion layer on an SOI substrate and is insulated from the semiconductor substrate by an insulating film, the first potential is not necessarily the same as the tenth potential.

The charge storage layer may be, for example, a dielectric or a laminated insulating film as well as the floating gate. Also, it is needless to say that the "0" may be written by changing the state of the charge in the charge storage layer and the "1" may be written by not changing the state of the charge. Further, the "0" may be written by slightly changing the state of the charge in the charge storage layer and the "1" may be written by greatly changing the state of the charge, and vice versa. Furthermore, the "0" is written by changing the state of the charge in the charge storage layer to negative and the "1" is written by changing the state of the charge to positive, and vice versa. The above-mentioned definitions of "0" and "1" may be combined. The CHE current is not the only means for changing the state of the charge in the charge storage layer.

Now examples of timing of applying the above-described potentials for writing data are explained with the case where one memory cell is disposed in an island-like semiconductor layer formed of a P-type semiconductor.

Figure 108:
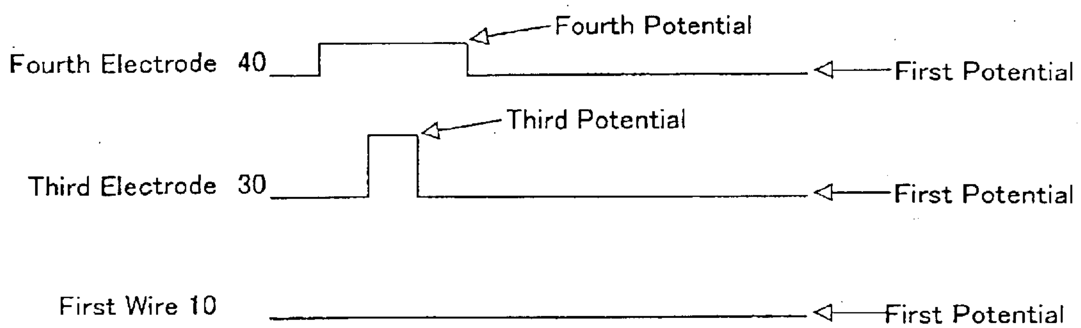

FIG. 108 shows a timing chart showing an example of applying each potential for writing data in the case where the ground potential is applied as the first potential to the first electrode. For example, if the "1" is written by storing a negative charge in the charge storage layer, the ground potential as the first potential is first applied to the first, third and fourth electrodes. In this state, the fourth potential, e.g., 6V, is applied to the fourth electrode. The third potential, e.g., 12 V, is applied to the third electrode connected to the selected cell. This state is maintained for a desired period of time to write the "1." The timing of applying the potentials to the respective electrodes may be in another order or simultaneous.

The third electrode is returned to the ground potential and the fourth electrode is returned to the ground potential. The timing of returning the respective electrodes to the ground potential may be in another order or simultaneous. The potentials applied may be any combination of potentials so long as they satisfy conditions for writing the "1" in a desired cell. Here, the same potential is preferably applied initially as the first potential to the first, third and fourth electrodes, but different potentials may be applied.

Figure 109:
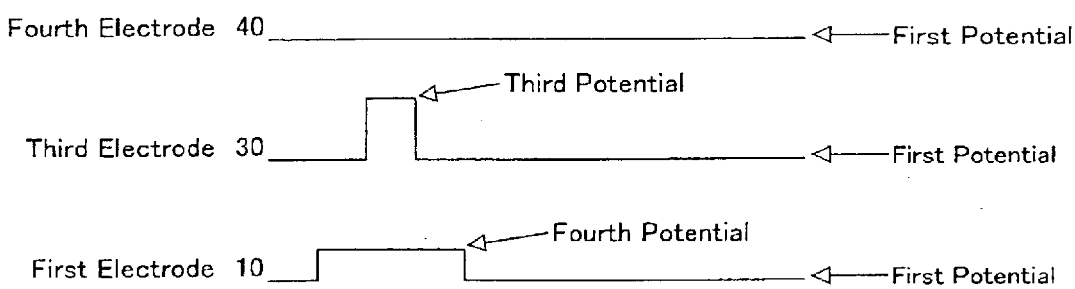

In contrast to FIG. 108, FIG. 109 shows a timing chart for writing data in the case where the first electrode is exchanged with the fourth electrode. FIG. 109 conforms to FIG. 108 except that the first potential and the fourth potential are changed with each other.

A writing process is now explained with a semiconductor memory according to the present invention which is constructed to have island-like semiconductor layers each of which includes, as selection gate transistors, a transistor having the second electrode as a gate electrode and a transistor having the fifth electrode as a gate electrode and a plurality of (e.g., L, L is a positive integer) memory cells provided with a charge storage layer between gate transistors and the third electrode as a control gate electrode and connected in series. The writing process utilizes the F-N current.

FIG. 58 shows an equivalent circuit diagram of the above-described memory cell.

For example, in the case the island-like semiconductor layers are formed of a P-type semiconductor, a selected cell shown in FIG. 58 is written by applying a first potential to a first electrode 10 of an island-like semiconductor layer including the selected cell, a second potential to a second electrode 20 arranged in series with the selected cell, a third potential to a third electrode (30-*h*) (h is an positive integer, $1 \leqq h \leqq L$), a seventh potential to a third electrode (3-*j*-1 to 3-*j*-(h−1)) connected to non-selected cells arranged in series with the selected cell, an eleventh potential to third electrodes (3-*j*-(h+1) to 3-*j*-L) connected to non-selected cells arranged in series with the selected cell, a fourth potential to the fourth electrode 40 of the island-like semiconductor layer including the selected cell and a fifth potential to the fifth electrode 50 arranged in series with the selected cell. The application of these potentials generates the F-N current only in the tunnel oxide film of the selected cell and changes the state of the charge in the charge storage layer.

For example, if the "1" is written by storing a negative charge in the charge storage layer, the third potential is larger than the fourth potential. If the "1" is written by drawing a negative charge from the charge storage layer, i.e., by storing a positive charge, the third potential is smaller than the fourth potential. Thereby, the "0" or "1" can be set by utilizing a change in the state of the charge in the charge storage layer. At this time, the third potential is a potential such that the "1" can be written by a difference between the third and fourth potentials. For example, the third potential is a potential allowing the generation of a sufficient F-N current flow by a difference between the third and fourth potentials. The F-N current flows in the tunnel oxide film of the memory transistor having, as the gate electrode, the third electrode to which the third potential is applied and thereby changes the state of the charge in the charge storage layer.

The seventh potential is a potential always allowing a cell current to flow through the memory cell regardless of the state of the charge stored in the charge storage layer, i.e., a potential allowing the formation of a reverse layer in the channel region of the memory cell, and not generating a change in the charge by the F-N current flowing the tunnel oxide film. For example, if the "1" is written by storing a negative charge in the charge storage layer, the seventh potential is a potential which is not less than the threshold that memory transistors having as gate electrodes the third electrodes connected to the third electrodes (3-*j*-1 to 3-*j*-(h−1)) can take and sufficiently reduces the F-N current flowing the tunnel oxide film of the memory transistors having as gate electrodes the third electrodes to which the seventh potential is applied.

The eleventh potential may be a potential sufficiently reduces the F-N current flowing the tunnel oxide film of the memory transistors having as gate electrodes the third electrodes to which the eleventh potential is applied. The second potential is a potential not allowing the cell current to flow, for example, a potential not higher than the threshold of a transistor having the second electrode 20 as a gate electrode. The fifth potential may be a potential allowing the cell current to flow, for example, a potential not lower than the threshold of a transistor having the fifth electrode 50 as a gate electrode. The first electrode 10 may be opened.

In the case where the channel region of a selected memory cell is electrically connected to the semiconductor substrate, for example, in the case where the island-like semiconductor layer is not floated from the semiconductor substrate by an impurity diffusion layer, all memory cells having the third electrodes to which the third potential is applied can also be written at the same time if the tenth potential applied to the semiconductor substrate is a potential such that the "1" is written by a difference between the third potential and the tenth potential, for example, a potential such that a sufficiently large F-N current flows by a difference between the third potential and the tenth potential. The F-N current flows in the tunnel oxide film of the memory transistor having, as the gate electrode, the third electrode to which the third potential is applied.

In the case where the first electrode is formed as an impurity diffusion layer in the semiconductor substrate and the tenth potential applied to the semiconductor substrate is the ground potential, the first potential is generally the ground potential. In the case where the first electrode is electrically insulated from the semiconductor substrate, for example, in the case where the first electrode is formed of an impurity diffusion layer on an SOI substrate and is insulated from the semiconductor substrate by an insulating film, the first potential is not necessarily the same as the tenth potential.

Memory cells may be sequentially written from a memory cell connected to a third electrode (30-L) to a memory cell connected to a third electrode (30-1), or may be written in reverse order or at random. Further, some or all memory cells connected to the third electrode (30-*h*) may be written at the same time, some or all memory cells connected to the third electrodes (30-1 to 30-L) may be written at the same time, and some or all memory cells connected to the third electrodes (30-1 to 30-L) may be written at the same time.

The charge storage layer may be, for example, a dielectric or a laminated insulating film as well as the floating gate. Also, it is needless to say that the "0" may be written by changing the state of the charge in the charge storage layer and the "1" may be written by not changing the state of the charge. Further, the "0" may be written by slightly changing the state of the charge in the charge storage layer and the "1" may be written by greatly changing the state of the charge, and vice versa. Furthermore, the "0" is written by changing the state of the charge in the charge storage layer to negative and the "1" is written by changing the state of the charge to positive, and vice versa. The above-mentioned definitions of "0" and "1" may be combined. The F-N current is not the only means for changing the state of the charge in the charge storage layer.

Now examples of timing of applying the above-described potentials for writing data are explained with the case of a plurality of (e.g., L, L is a positive integer) memory cells which are formed of a P-type semiconductor and connected in series.

Figure 110:
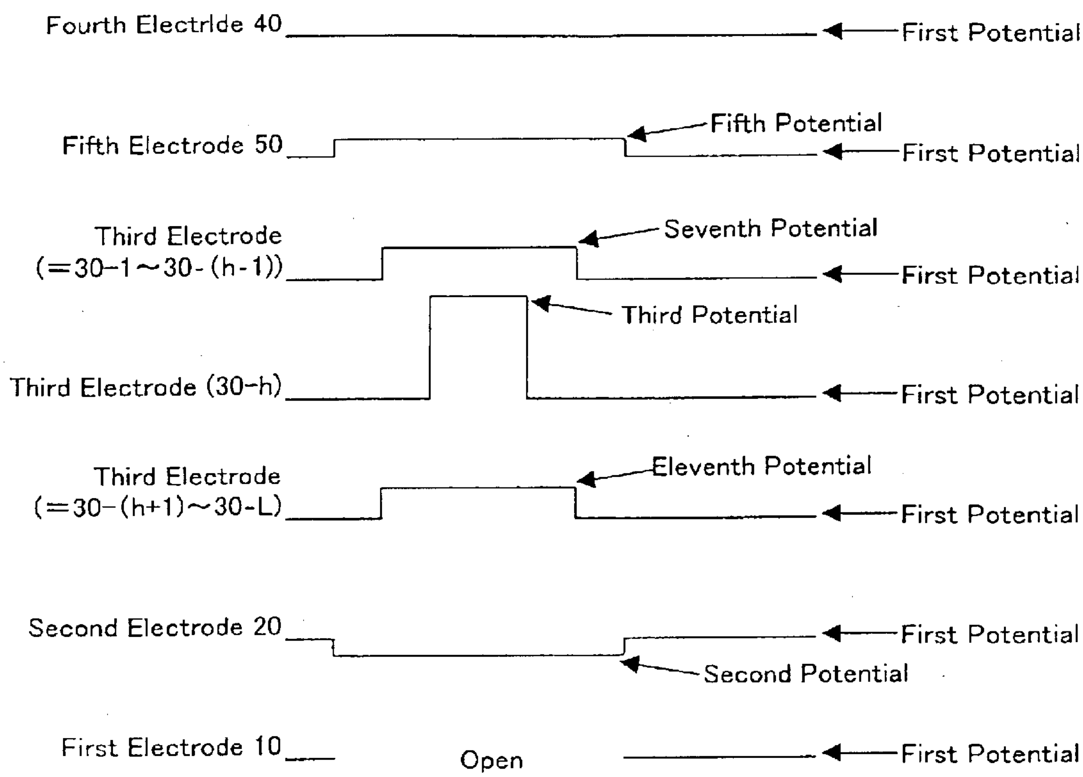

FIG. 110 is a timing chart showing an example of timing of applying each potential for writing data. In FIG. 110, the first electrode is open, the thresholds of transistors having gate electrodes connected to the second electrode and the fifth electrode are, for example, 0.5 V, and the memory cell has a threshold of 1.0 V to 3.5 V when it is in the written state and has a threshold of −1.0 V or lower when it is in the erased state.

For example, if the "1" is written by storing a negative charge in the charge storage layer, the ground potential as the first potential is first applied to the first electrode 10, the second electrode 20, the third electrodes (30-1 to 30-L), the fourth electrode 40 and the fifth electrode 50. In this state, the first electrode 10 is opened. The second potential, e.g., −1 V, is applied to the second electrode 20, and the fifth potential, e.g., 1 V, is applied to the fifth electrode 50. The ground potential which is the first potential is kept applied as the fourth potential to the fourth electrode 40. The seventh potential, e.g., 10 V, is applied to third electrodes (30-1 to 30-(h−1)) (h is a positive integer, $1 \leqq h \leqq L$), the eleventh potential, e.g., 10 V, is applied to third electrodes (30-(h+1) to 30-L), and the third potential, e.g., 20 V, is applied to the third electrode (30-*h*). This state is maintained for a desired period of time to write the "1." The timing of applying the potentials to the respective electrodes may be in another order or simultaneous.

The third electrode (30-*h*) is returned to the ground potential, i.e., the first potential, the third electrodes (not 30-*h*) are returned to the ground potential, i.e., the first potential, the second electrode 20 and the fifth electrode 50 are returned to the ground potential, i.e., the first potential, and the first electrode 10 is returned to the ground potential, i.e., the first potential. The timing of returning the respective electrodes to the ground potential may be in another order or simultaneous. The potentials applied may be any combination of potentials so long as they satisfy conditions for writing the "1" in a desired cell.

Here, the same potential is preferably applied initially as the first potential to the first electrode 10, the second electrode 20, the third electrode 30-*h*, the fourth electrode 40 and the fifth electrode 50, but different potentials may be applied.

In the above example, the writing process has been described with the case where the selected cell is a memory cell having the third electrode (30-*h*) as the gate electrode. However, the writing process is the same with the case where the selected cell is a memory cell having a third electrode other than the third electrode (30-*h*) as the gate electrode.

Figure 111:
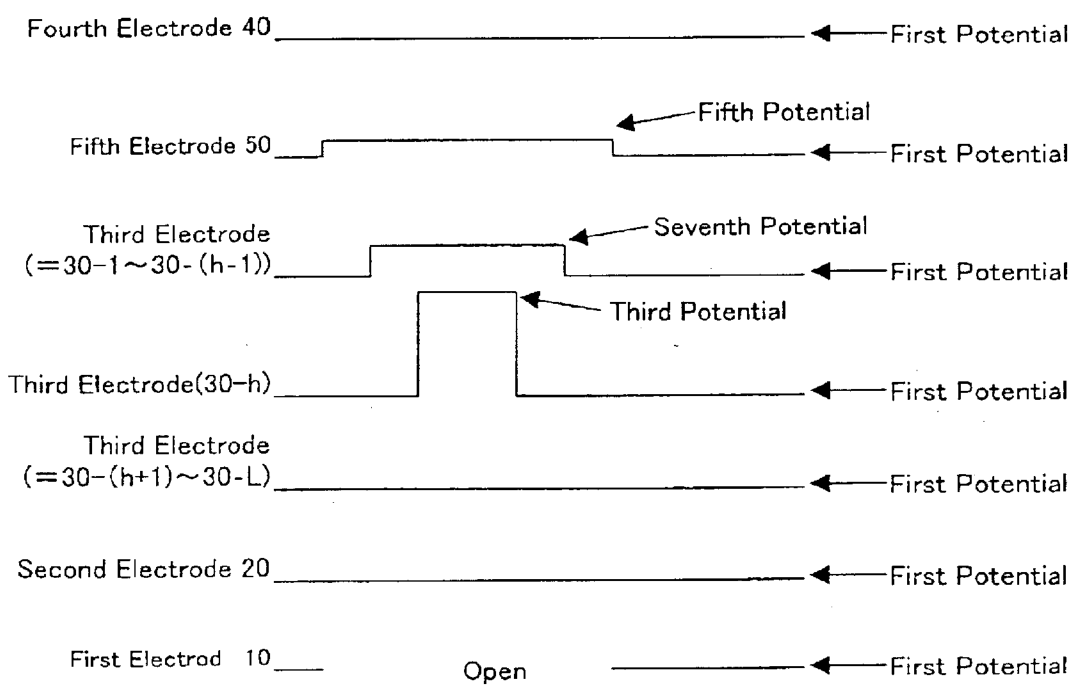

In contrast to FIG. 110, FIG. 111 shows a timing chart for writing data in the case where the eleventh potential is the ground potential.

The writing of the selected cell of FIG. 111 conforms to that of FIG. 110 without being affected by application of the ground potential, i.e., the first potential, as the eleventh potential to the third electrodes (30-(h+1) to 30-L, h is a positive integer, $1 \leqq h \leqq L$).

Figure 112:
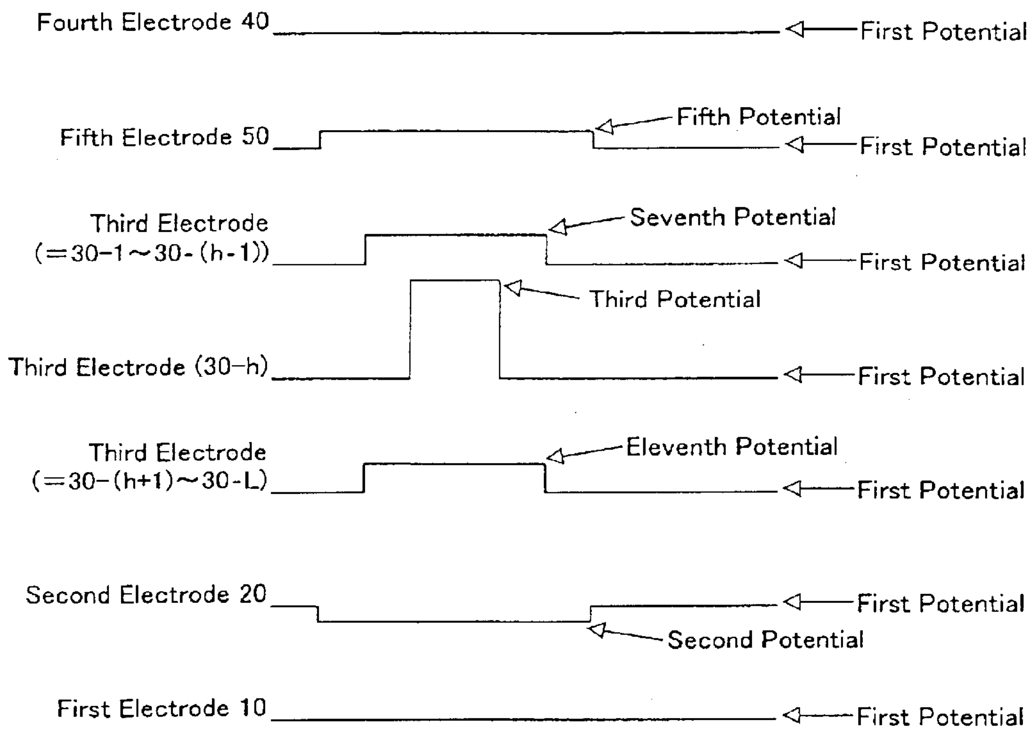

In contrast to FIG. 110, FIG. 112 shows a timing chart for writing data in the case where the first potential is the ground potential.

The writing of the selected cell of FIG. 112 conforms to that of FIG. 110 without being affected by the application of the ground potential as the first potential to the first electrode 10 if the second potential is not higher than the threshold of the transistor having the second electrode 20 as the gate electrode.

Figure 113:
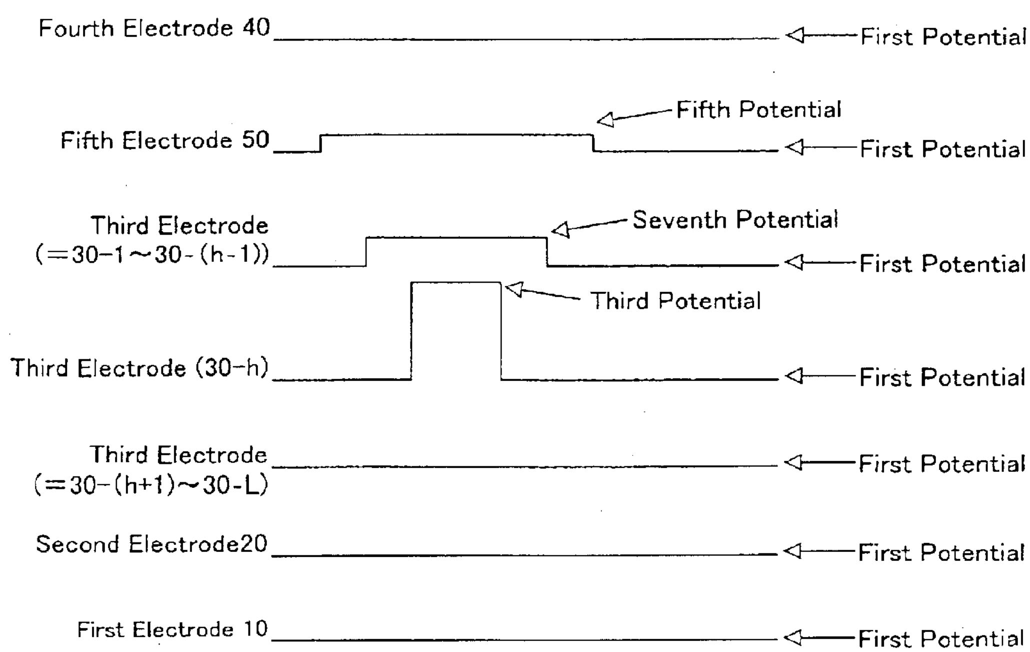

In contrast to FIG. 111, FIG. 113 shows a timing chart for writing data in the case where the first potential is the ground potential.

The writing of the selected cell of FIG. 113 conforms to that of FIG. 111 without being affected by the application of the ground potential as the first potential to the first electrode 10 if the second potential is not higher than the threshold of the transistor having the second electrode 20 as the gate electrode.

A writing process is now explained with a semiconductor memory according to the present invention which is constructed to have island-like semiconductor layers each including two memory cells which are provided with a charge storage layer between the gate transistors and a third electrode as a control gate electrode and are connected in series. The writing process utilizes the F-N current.

FIG. 60 shows an equivalent circuit diagram of the above-described memory cell. For example, in the case where the island-like semiconductor layers are formed of a P-type semiconductor, a selected cell shown in FIG. 60 is written by applying a first potential to a first electrode 10 of an island-like semiconductor layer including the selected cell, a third potential to a third electrode (30-1) connected to the selected cell, the eleventh potential to a third electrode (30-2) connected a non-selected cell arranged in series with the selected cell, and a fourth potential to a fourth electrode 40 of the island-like semiconductor layer including the selected cell. The application of these potentials generates the F-N current only in the channel region of the selected cell and changes the state of the charge in the charge storage layer.

For example, if the "1" is written by storing a negative charge in the charge storage layer, the third potential is larger than the fourth potential. If the "1" is written by drawing a negative charge from the charge storage layer, i.e., by storing a positive charge, the third potential is smaller than the fourth potential. Thus, the "0" or "1" can be set by utilizing a change in the state of the charge in the charge storage layer. At this time, the third potential is a potential such that the "1" can be written by a difference between the third and fourth potentials. For example, the third potential is a potential allowing the generation of a sufficient F-N current flow by a difference between the third and fourth potentials. The F-N current flows in the tunnel oxide film of the memory transistor having, as the gate electrode, the third electrode to which the third potential is applied and thereby changes the state of the charge in the charge storage layer.

The eleventh potential is a potential such that a change in the charge is not generated by the F-N current flowing in the tunnel oxide film. For example, if the "1" is written by storing a negative charge in the charge storage layer, the eleventh potential may be a potential which is not lower than the threshold of a memory transistor having the third electrode (30-2) as the gate electrode and sufficiently reduces the F-N current flowing in the tunnel oxide film of the memory transistor having as the gate electrode the third electrode to which the eleventh potential is applied. The first electrode 10 may be opened.

In the case where the channel region of a selected memory cell is electrically connected to the semiconductor substrate, for example, in the case where the island-like semiconductor layer is not floated from the semiconductor substrate by an impurity diffusion layer, all memory cells having the third electrodes to which the third potential is applied can also be written at the same time if the tenth potential applied to the semiconductor substrate is a potential such that the "1" is written by a difference between the third potential and the tenth potential, for example, a potential such that a sufficiently large F-N current flows by a difference between the third potential and the tenth potential. The F-N current flows in the tunnel oxide film of the memory transistor having, as the gate electrode, the third electrode to which the third potential is applied.

In the case where the first electrode is formed as an impurity diffusion layer in the semiconductor substrate and the tenth potential applied to the semiconductor substrate is a ground potential, the first potential is generally the ground potential. In the case where the first electrode is electrically insulated from the semiconductor substrate, for example, in the case where the first electrode is formed of an impurity diffusion layer on an SOI substrate and is insulated from the semiconductor substrate by an insulating film, the first potential is not necessarily the same as the tenth potential.

The charge storage layer may be, for example, a dielectric or a laminated insulating film as well as the floating gate. Also, it is needless to say that the "0" may be written by changing the state of the charge in the charge storage layer and the "1" may be written by not changing the state of the charge. Further, the "0" may be written by slightly changing the state of the charge in the charge storage layer and the "1" may be written by greatly changing the state of the charge, and vice versa. Furthermore, the "0" is written by changing the state of the charge in the charge storage layer to negative and the "1" is written by changing the state of the charge to positive, and vice versa. The above-mentioned definitions of "0" and "1" may be combined. The F-N current is not the only means for changing the state of the charge in the charge storage layer.

Now examples of timing of applying the above-described potentials for writing data are explained with the case of two memory cells formed of a P-type semiconductor and arranged in series.

Figure 114:
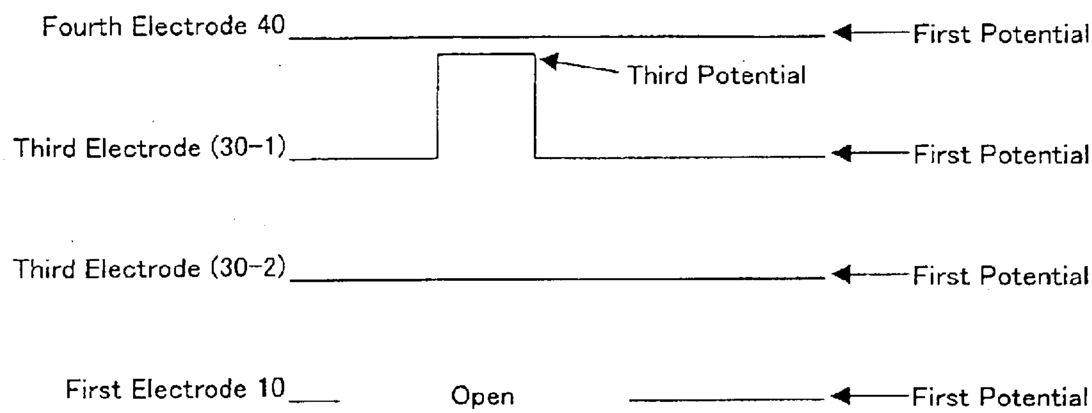

In FIG. 114, the first electrode is open, and the memory cell has a threshold of 1.0 V to 3.5 V when it is in the written state and has a threshold of −1.0 V or lower when it is in the erased state.

For example, if the "1" is written by storing a negative charge in the charge storage layer, the ground potential as the first potential is first applied to the first electrode 10, the third electrodes (30-1 to 30-2) and the fourth electrode 40. In this state, the first electrode is opened. The ground potential which is the first potential is kept applied as the fourth potential to the fourth electrode 40. The eleventh potential, e.g., the ground potential which is the first potential, is applied to the third electrode (30-2), and the third potential, e.g., 20 V, is applied to the third electrode (30-1). This state is maintained for a desired period of time to write the "1." The timing of applying the potentials to the respective electrodes may be in another order or simultaneous.

The third electrode (30-1) is returned to the ground potential, i.e., the first potential, and the first electrode 10 is returned to the ground potential, i.e., the first potential. The timing of returning the respective electrodes to the ground potential, i.e., the first potential, may be in another order or simultaneous. The potentials applied may be any combination of potentials so long as they satisfy conditions for writing the "1" in a desired cell.

Here, the same potential is preferably applied initially as the first potential to the first electrode 10, the third electrodes 30-1 to 30-2 and the fourth electrode 40, but different potentials may be applied.

In the above example, the writing process has been described with the case where the selected cell is a memory cell having the third electrode (30-1) as the gate electrode. However, the writing process is the same with the case where the selected cell is a memory cell having the third electrode (30-2) as the gate electrode.

In contrast to FIG. 110, explanation is given of the case where the selected cell is a memory cell having the third electrode (30-2) as the gate electrode.

Figure 115:
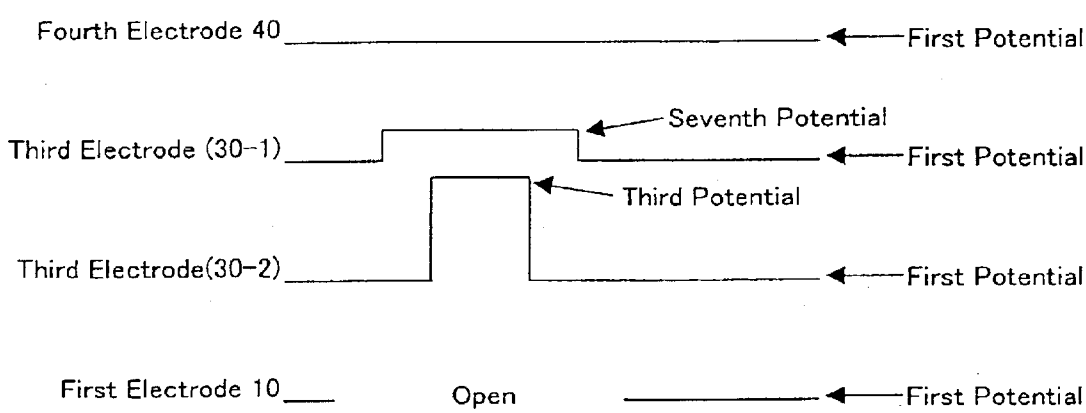

In FIG. 115, the first electrode is open, and the memory cell has a threshold of 1.0 V to 3.5 V when it is in the written state and has a threshold of −1.0 V or lower when it is in the erased state.

For example, if the "1" is written by storing a negative charge in the charge storage layer, the ground potential as the first potential is first applied to the first electrode 10, the third electrodes (30-1 to 30-2) and the fourth electrode 40. In this state, the first electrode is opened. The ground potential which is the first potential is kept applied as the fourth potential to the fourth electrode 40. The seventh potential, e.g., 10V, is applied to the third electrode (30-1), and the third potential, e.g., 20 V, is applied to the third electrode (30-2). This state is maintained for a desired period of time to write the "1." The timing of applying the potentials to the respective electrodes may be in another order or simultaneous.

The third electrode (30-2) is returned to the ground potential, i.e., the first potential, the third electrode (30-1) is returned to the ground potential, i.e., the first potential, and the first electrode 10 is returned to the ground potential, i.e., the first potential. The timing of returning the respective electrodes to the ground potential may be in another order or simultaneous. The potentials applied may be any combination of potentials so long as they satisfy conditions for writing the "1" in a desired cell. Here, the same potential is preferably applied initially as the first potential to the first electrode 10, the third electrodes 30-1 to 30-2 and the fourth electrode 40, but different potentials may be applied.

Figure 116:
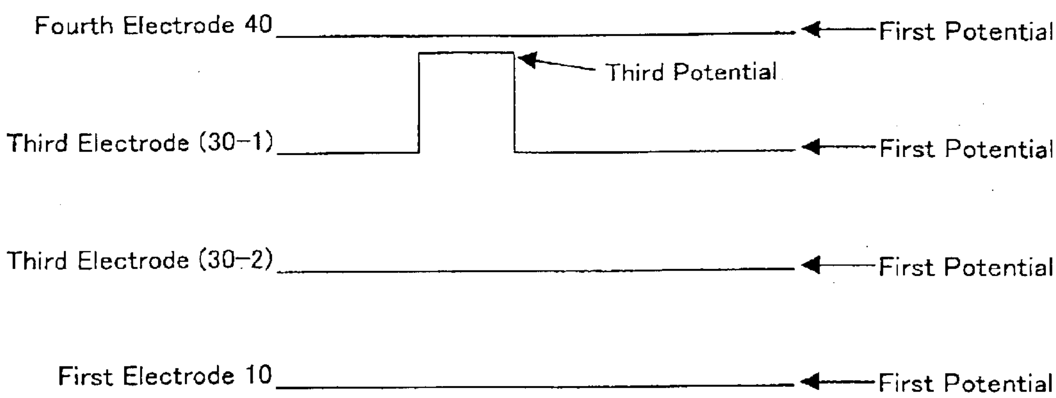

In contrast to FIG. 114, FIG. 116 is a timing chart showing an example of applying each potential for writing data in the case where the first potential is the ground potential.

The writing of the selected cell of FIG. 116 conforms to that of FIG. 114 without being affected by application of the ground potential as the first potential to the first electrode 10.

Figure 117:
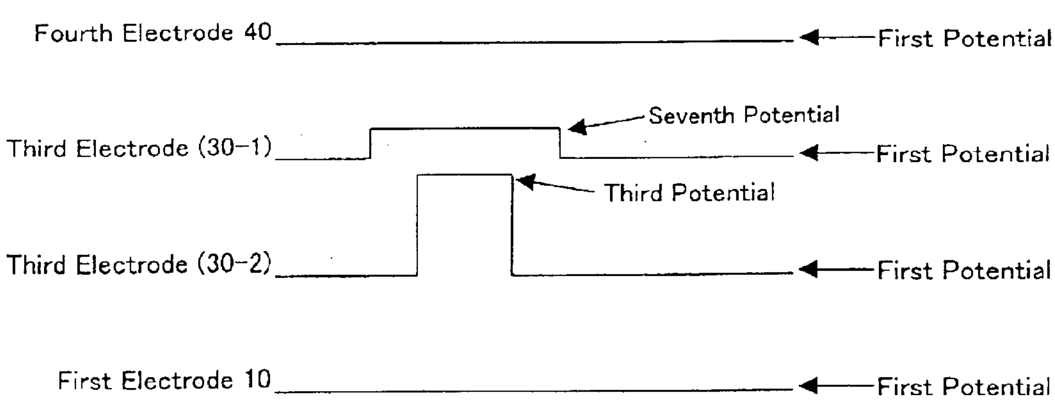

In contrast to FIG. 115, FIG. 117 is a timing chart showing an example of applying each potential for writing data in the case where the first potential is the ground potential. The writing of the selected cell of FIG. 117 conforms to that of FIG. 115 without being affected by application of the ground potential as the first potential to the first electrode 10.

A writing process is now explained with a semiconductor memory according to the present invention which is constructed to have island-like semiconductor layers each including two memory cells which are provided with a charge storage layer between the gate transistors and a third electrode as the control gate electrode and are connected in series. The writing process utilizes the CHE current.

FIG. 60 shows an equivalent circuit diagram of the above-described memory cell. For example, in the case the island-like semiconductor layers are formed of a P-type semiconductor, a selected cell shown in FIG. 60 is written by applying a first potential to a first electrode 10 of an island-like semiconductor layer including the selected cell, a third potential to a third electrode (30-1) connected to the selected cell, an eleventh potential to a third electrode (30-2) connected to a non-selected cell arranged in series with the selected cell, and a fourth potential to a fourth electrode 40 of the island-like semiconductor layer including the selected cell. The application of these potentials generates the CHE current only in the channel region of the selected cell and changes the state of the charge in the charge storage layer.

For example, if the "1" is written by storing a negative charge in the charge storage layer, the fourth potential is larger than the first potential, the third potential is larger than the first potential, the first potential is preferably the ground potential, the third or fourth potential is such that the "1" can be written by a potential difference between the third and first potentials and a potential difference between the fourth and first potential. For example, the third or fourth potential is such that a sufficient CHE current is generated by a potential difference between the third and first potentials and a potential difference between the fourth and first potential. The CHE current flows in the tunnel oxide film of a memory transistor having, as the gate electrode, the third electrode to which the third potential is applied.

The eleventh potential is a potential always allowing the cell current to flow in the memory cell regardless of the state of the charge in the charge storage layer, that is, a potential allowing the formation of a reverse layer in the channel region of the memory cell, but the state of the charge in the charge storage layer is not changed by the eleventh potential.

For example, if the "1" is written by storing a negative charge in the charge storage layer, the eleventh potential may be a potential which is not lower than the threshold of a memory transistor having as the gate electrode the third electrode (30-2) and sufficiently reduces the F-N current or the CHE current flowing in the tunnel oxide film of the memory transistor having, as the gate electrode, the third electrode to which the eleventh potential is applied.

In the case where the first electrode 10 is formed as an impurity diffusion layer in the semiconductor substrate and the tenth potential applied to the semiconductor substrate is a ground potential, the first potential is generally the ground potential.

In the case where the first electrode 10 is electrically insulated from the semiconductor substrate, for example, in the case where the first electrode 10 is formed of an impurity diffusion layer on an SOI substrate and is insulated from the semiconductor substrate by an insulating film, the first potential is not necessarily the same as the tenth potential.

The charge storage layer may be, for example, a dielectric or a laminated insulating film as well as the floating gate. Also, it is needless to say that the "0" may be written by changing the state of the charge in the charge storage layer and the "1" may be written by not changing the state of the charge. Further, the "0" may be written by slightly changing the state of the charge in the charge storage layer and the "1" may be written by greatly changing the state of the charge, and vice versa. Furthermore, the "0" is written by changing the state of the charge in the charge storage layer to negative and the "1" is written by changing the state of the charge to positive, and vice versa. The above-mentioned definitions of "0" and "1" may be combined. The CHE current is not the only means for changing the state of the charge in the charge storage layer.

Now examples of timing of applying the above-described potentials for writing data are explained with the case of two memory cells formed of a P-type semiconductor and arranged in series.

Figure 118:
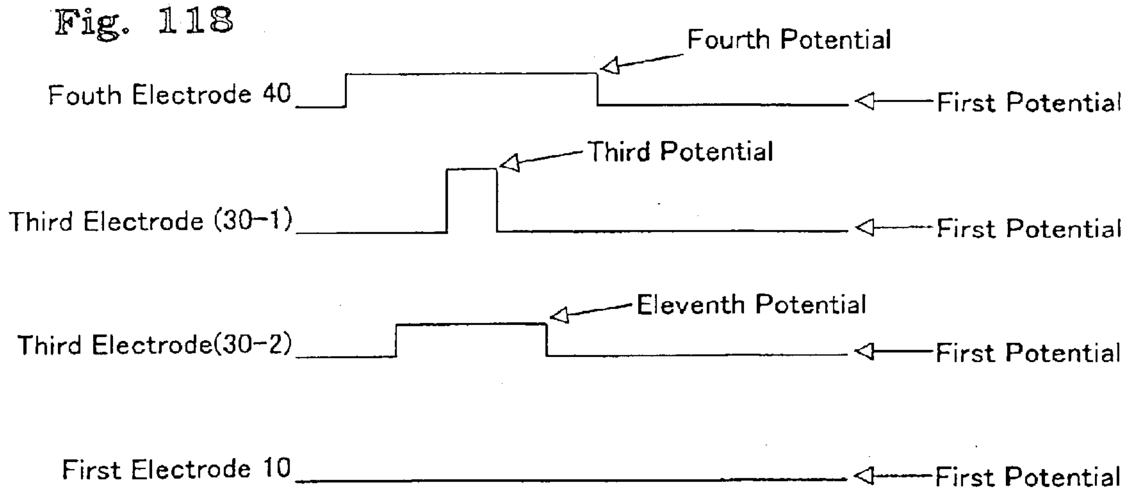

In FIG. 118, the first potential, e.g., the ground potential, is given to the first electrode, and the memory cell has a threshold of 5.0 V to 7.5 V when it is in the written state and has a threshold of 0.5 V to 3.0 V when it is in the erased state.

For example, if the "1" is written by storing a negative charge in the charge storage layer, the ground potential as the first potential is first applied to the first electrode 10, the third electrodes (30-1 to 30-2) and the fourth electrode 40. In this state, the fourth potential, e.g., 6 V, is applied as the fourth potential to the fourth electrode 40. The eleventh potential, e.g., 8 V, is applied to the third electrode (30-2) connected to a non-selected cell arranged in series with the selected cell, and the third potential, e.g., 12V, is applied to the third electrode (30-1) connected to the selected cell. This state is maintained for a desired period of time to write the "1." The timing of applying the potentials to the respective electrodes may be in another order or simultaneous.

The third electrode (30-1) is returned to the ground potential, the third electrode (30-2) is returned to the ground potential, and the fourth electrode 40 is returned to the ground potential. The timing of returning the respective electrodes to the ground potential may be in another order or simultaneous. The potentials applied may be any combination of potentials so long as they satisfy conditions for writing the "1" in a desired cell.

Here, the same potential is preferably applied initially as the first potential to the first electrode 10, the third electrodes (30-1 to 30-2) and the fourth electrode 40, but different potentials may be applied.

In the above example, the writing process has been described with the case where the selected cell is a memory cell having the third electrode (30-1) as the gate electrode. However, the writing process is the same with the case where the selected cell is a memory cell having the third electrode (30-2) as the gate electrode.

Figure 119:
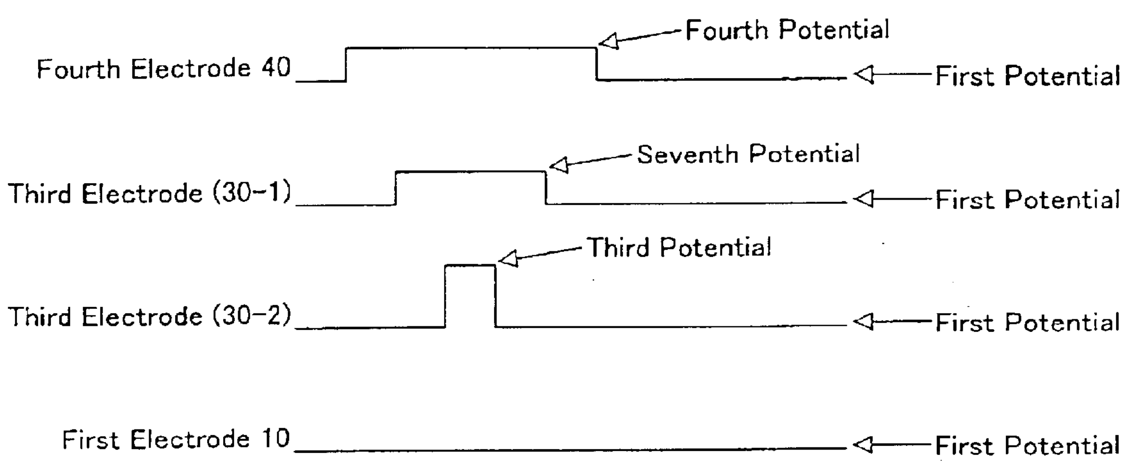

In contrast to FIG. 118, FIG. 119 is a timing chart showing an example of applying each potential for writing data in the case where the selected cell is a memory cell connected to the third electrode (30-2).

FIG. 119 conforms to FIG. 118 except that the seventh potential instead of the eleventh potential is applied to the third electrode connected to the non-selected cell arranged in series with the selected cell. At this time, the seventh potential is equal to the eleventh potential.

A writing process is now explained with a semiconductor memory according to the present invention which is constructed to include a plurality of (e.g., M×N, M and N are positive integers) island-like semiconductor layers each having, as selection gate transistors, a transistor provided with the second electrode as a gate electrode and a transistor provide with the fifth electrode as a gate electrode and a plurality of (e.g., L, L is a positive integer) memory cells provided with the charge storage layer between the selection gate transistors and the third electrode as a control gate electrode and connected in series. In this memory cell array, a plurality of (e.g., M) fourth wires arranged in parallel with the semiconductor substrate are connected to ends of the island-like semiconductor layers, and first wires are connected to opposite ends of the island-like semiconductor layers. A plurality of (e.g., N×L) third wires in parallel with the semiconductor substrate are arranged in a direction crossing the fourth wires and connected to the third electrodes of the memory cells. The writing process utilizes the F-N current.

FIG. 62 shows an equivalent circuit diagram of the above-described memory cell array in which the first wires are arranged in parallel to the third wires.

For example, in the case where the island-like semiconductor layers are formed of a P-type semiconductor, a selected cell shown in FIG. 62 is written by applying a first potential to a first wire (1-*j*, j is a positive integer, 1≦j≦N) connected to an island-like semiconductor layer including the selected cell, a ninth potential to first wires (not 1-*j*) other than the first wire (1-*j*), a second potential to a second wire (2-*j*) connected to a second electrode arranged in series with the selected cell, a third potential to a third wire (3-*j*-h, h is a positive integer, 1≦h≦N) connected to the selected cell, a seventh potential to third wires (3-*j*-1 to 3-*j*-(h−1)) connected to non-selected cells arranged in series with the selected cell, an eleventh potential to third wires (3-*j*-(h+1) to 3-*j*-L) connected to non-selected cells arranged in series with the selected cell, a twelfth potential to other third wires (not 3-*j*-1 to 3-*j*-L), a fourth potential to a fourth wire (4-*i*, i is a positive integer, 1≦i≦M) connected to the fourth electrode of the island-like semiconductor layer including the selected cell, an eighth potential to fourth wires (not 4-*i*) other than the fourth wire (4-*i*), a fifth potential to a fifth wire (5-*j*) connected to a fifth electrode arranged in series with the selected cell, and a sixth potential to second wires (not 2-*j*) other than the second wire (2-*j*) or fifth wires (not 5-*j*) other than the fifth wire (5-*j*). The application of these potentials generates the F-N current only in the channel region of the selected cell and changes the state of the charge in the charge storage layer.

For example, if the "1" is written by storing a negative charge in the charge storage layer, the third potential is larger than the fourth potential. If the "1" is written by drawing a negative charge from the charge storage layer, i.e., by storing a positive charge, the third potential is smaller than the fourth potential. Thus, the "0" or "1" can be set by utilizing a change in the state of the charge in the charge storage layer. At this time, the third potential is a potential such that the "1" can be written by a difference between the third and fourth potentials. For example, the third potential is a potential allowing the generation of a sufficient F-N current flow by a difference between the third and fourth potentials. The F-N current flows in the tunnel oxide film of the memory transistor having, as the gate electrode, the third electrode to which the third potential is applied and thereby changes the state of the charge in the charge storage layer. The seventh potential is a potential always allowing a cell current to flow through the memory cell regardless of the state of the charge stored in the charge storage layer, i.e., a potential allowing the formation of a reverse layer in the channel region of the memory cell, and not generating a change in the charge by the F-N current flowing the tunnel oxide film.

For example, if the "1" is written by storing a negative charge in the charge storage layer, the seventh potential is a potential which is not less than the threshold that memory transistors having as gate electrodes the third electrodes connected to the third electrodes (3-*j*-1 to 3-*j*-(h−1)) can take and sufficiently reduces the F-N current flowing the tunnel oxide film of the memory transistors having as gate electrodes the third electrodes to which the seventh potential is applied. The eleventh potential may be a potential sufficiently reduces the F-N current flowing the tunnel oxide film of the memory transistors having as gate electrodes the third electrodes to which the eleventh potential is applied.

The second potential is a potential not allowing the cell current to flow, for example, a potential not higher than the threshold of a transistor having, as a gate electrode, the second electrode connected to the second wire (2-*j*).

The fifth potential may be a potential allowing the cell current to flow, for example, a potential not lower than the threshold of a transistor having, as a gate electrode, the fifth electrode connected to the fifth wire (5-*j*).

The sixth potential is a potential not allowing the cell current to flow, for example, a potential not higher than the threshold of the transistors having, as the gate electrodes, the second electrodes connected to the second wires (not 2-*j*) and the fifth electrodes connected to the fifth wires (not 5-*j*). The eighth potential is such that, in a transistor having, as the gate electrode, the fifth electrode connected to the fifth wire (5-*j*) and, as the source or drain electrode, the fourth electrode connected to a fourth wire (not 4-*i*), a cut-off state is generated by a potential difference between the eighth potential and the fifth potential which exceeds the threshold and a reverse layer is not generated in the channel region of a memory cell arranged in series with the above-mentioned transistor.

The first wires (1-1 to 1-N) may be opened. Further, the fourth wires (not 4-*i*) may be opened, or has a potential such that the first and second potentials may become in the above-mentioned cut-off state. The eighth potential may be a potential such that, even if it is smaller than the fifth potential, the "1" is not written by a potential difference between the third and eighth potentials, for example, a potential such that sufficiently small is the F-N current caused by the potential difference to flow in the tunnel oxide film of the memory transistor having, as the gate electrode, the third electrode to which the third potential is applied.

In the case where the channel region of a selected memory cell is electrically connected to the semiconductor substrate, for example, in the case where the island-like semiconductor layer is not floated from the semiconductor substrate by an impurity diffusion layer, all memory cells having the third electrodes connecting the third wire to which the third potential is applied can also be written at the same time if the tenth potential applied to the semiconductor substrate is a potential such that the "1" is written by a difference between the third potential and the tenth potential, for example, a potential such that a sufficiently large F-N current flows in the tunnel oxide film of the memory transistor having, as the gate electrode, the third electrode connected to the third wire to which the third potential is applied.

At this time, in the case where the first wires (1-1 to 1-N) are formed as impurity diffusion layers in the semiconductor substrate, the ninth potential applied to the first wires (not 1-*j*) connected to the island-like semiconductor layers not including the selected cell is preferably a potential such that the island-like semiconductor layers are electrically floated from the semiconductor substrate by depletion layers extended by the application of the ninth potential. Thereby, the potential of the island-like semiconductor layers becomes equal to the ninth potential, and memory cells on the island-like semiconductor layers not including the selected cell are not written if the ninth potential is a potential such-that the F-N current flowing in the tunnel oxide film of the memory transistors is sufficiently small.

That is, the potential differences between the ninth and third potentials, between the ninth and seventh potentials and between the ninth and eleventh potentials are such that the F-N current flowing in the tunnel oxide films of the memory transistors is sufficiently small. If the channel regions of the memory cells are not connected electrically to the semiconductor substrate, the depletion layers owing to the ninth potential may be expended in either complete depletion or partial depletion.

In the case where the first wires (1-1 to 1-N) are formed as impurity diffusion layers in the semiconductor substrate and the tenth potential applied to the semiconductor substrate is the ground potential, the first potential is generally the ground potential.

In the case where the first wires (1-1 to 1-N) are electrically insulated from the semiconductor substrate, for example, where the first electrodes (1-1 to 1-N) are formed of impurity diffusion layers on an SOI substrate and are insulated from the semiconductor substrate by an insulating film, the first potential is not necessarily the same as the tenth potential. Memory cells may be sequentially written from a memory cell connected to a third electrode (3-*j*-L) to a memory cell connected to a third electrode (3-*j*-1), or may be written in reverse order or at random.

Further, some or all memory cells connected to the third wire (3-*j*-h) may be written at the same time, some or all memory cells connected to the third wires (3-*j*-1 to 3-*j*-L) may be written at the same time, and some or all memory cells connected to the third wires (3-1-1 to 3-N-L) may be written at the same time. Also, some or all memory cells connected to third wires selected regularly, e.g., a third wire (3-(j–8)-h), a third wire (3-*j*-h), a third wire (3-(j+8)-h), a third wire (3-(j+16)-h), . . . , may be written at the same time.

Further some or all memory cells of one island-like semiconductor layer connected to the fourth wire (4-*i*) may be written at the same time, or some or all memory cells of some or all island-like semiconductor layers connected to the fourth wire (4-*i*) may be written at the same time.

One, some or all memory cells of one island-like semiconductor layer connected to each of a plurality of fourth wires may be written at the same time, or some or all memory cells of some or all island-like semiconductor layers connected to each of a plurality of fourth wires may be written at the same time.

The memory cells connected to the third wire (3-*j*-h) may be written at the same time at given intervals, for example, every eight fourth wires (e.g., a fourth wire (4-(i–16)), a fourth wire (4-(i–8)), a fourth wire (4-*i*), a fourth wire (4-(i+8)), a fourth wire (4-(i+16)), . . . ). All the memory cells having, as gate electrodes, the third electrodes connected to the third wire (3-*j*-h) can be written at the same time by applying the first potential to all the fourth wires, applying the fourth potential to the first wire (1-*j*) and the eighth potential to the first wires (not 1-*j*), exchanging the potentials of the second and fifth wires and applying the third potential to the third wire (3-*j*-h).

Further, by applying the fourth potential to a plurality of first wires and applying the third potential to the third wires connected to the third electrodes of the memory cells included in the island-like semiconductor layers having the first electrodes connected to said plurality of first wires, all the memory cells having, as gate electrodes, the third electrodes connected to the third wires to which the third potential is applied can be written at the same time. The above-described writing processes may be combined.

The charge storage layer may be, for example, a dielectric or a laminated insulating film as well as the floating gate. The "0" may be written by changing the state of the charge in the charge storage layer and the "1" may be written by not changing the state of the charge. Further, the "0" may be written by slightly changing the state of the charge in the charge storage layer and the "1" may be written by greatly changing the state of the charge, and vice versa. Furthermore, the "0" is written by changing the state of the charge in the charge storage layer to negative and the "1" is written by changing the state of the charge to positive, and vice versa. The above-mentioned definitions of "0" and "1" may be combined. The F-N current is not the only means for changing the state of the charge in the charge storage layer.

FIG. 67 shows an equivalent circuit diagram of a memory cell array in which the first wires are arranged in parallel to the fourth wires. The application of the potentials for writing data is the same as that of FIG. 62 except that the first potential is applied to the first wire (1-*i*) and the ninth potential is applied to the first wires (not 1-*i*).

FIG. 69 shows an equivalent circuit diagram of a memory cell array in which a plurality of first wires are electrically connected in common. The application of the potentials for writing data is the same as that of FIG. 62 except that the first potential is applied to the first wire (1-1).

Now, timing charts for the above-described examples of application of potentials for writing data are explained with the case where a plurality of (e.g., M×N, M and N are positive integers) island-like semiconductor layers are arranged, each island-like semiconductor layer having a plurality of (e.g., L, L is a positive integer) memory cells connected in series and formed of a P-type semiconductor and selection gate transistors formed to sandwich the memory cells, and the first wires are arranged in parallel with the third wires.

Figure 120:
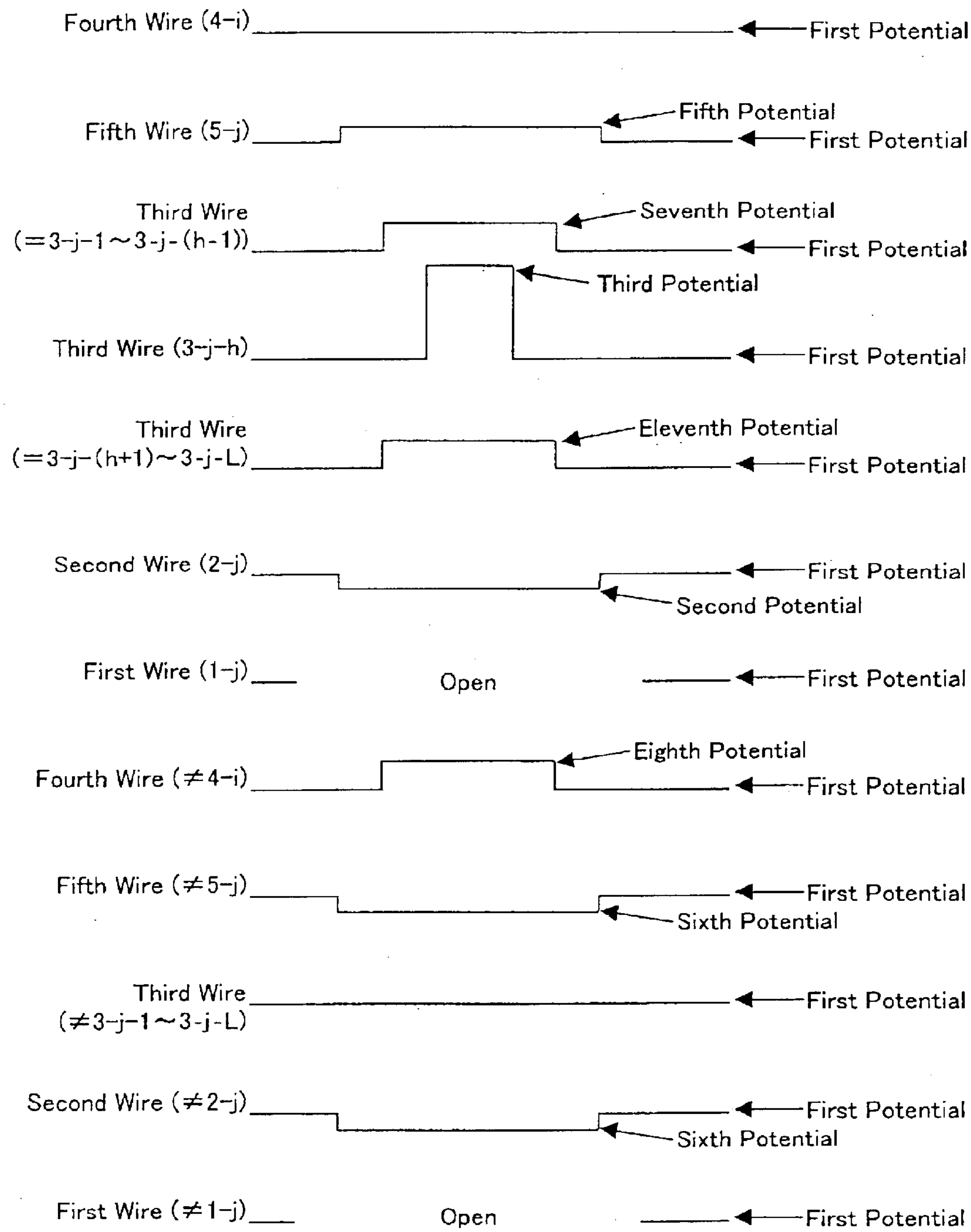

In FIG. 120, the first electrode is open, the thresholds of transistors having gate electrodes connected to the second wire and the fifth wire are, for example, 0.5 V, and the memory cell has a threshold of 1.0 V to 3.5 V when it is in the written state and has a threshold of −1.0 V or lower when it is in the erased state.

For example, if the "1" is written by storing a negative charge in the charge storage layer, the ground potential as the first potential is first applied to the first wires (1-1 to 1-N), the second wires (2-1 to 2-N), the third wires (3-1-1 to 3-N-L), the fourth wires (4-1 to 4-M) and the fifth wires (5-1 to 5-N). In this state, the first wires (1-1 to 1-N) are opened. The sixth potential, e.g., −1 V, is applied to second wires (not 2-*j*) and fifth wires (not 5-*j*). The second potential, e.g., −1 V, is applied to the second electrode (2-*j*), and the fifth potential, e.g., 1 V, is applied to the fifth wire (5-*j*). The ground potential which is the first potential is kept applied as the fourth potential to the fourth wire (4-*i*). The eighth potential, e.g., 3 V, is applied to fourth wires (not 4-*i*) other than the fourth wire (4-*i*). The seventh potential, e.g., 10 V, is applied to third wires (3-*j*-1 to 3-*j*-(h) (h is a positive integer, 1≦h≦L) other than the third wire (3-*j*-h). The eleventh potential, e.g., 10 V, is applied to third wires (3-*j*-(h+1) to 3-*j*-L). The ground potential which is the first potential is applied as the twelfth potential to third wires (not 3-*j*-1 to 3-*j*-L) other than mentioned above. Thereafter, the third potential, e.g., 20 V, is applied to the third electrode (3-*j*-h). This state is maintained for a desired period of time to write the "1."

The timing of applying the potentials to the respective electrodes may be in another order or simultaneous provided that, while the third potential, e.g., 20 V, is applied to the third electrode (3-*j*-h), at least the eighth potential, e.g., 3 V, is applied to the fourth wires (not 4-*i*) or the fifth wires (not 5-*j*) are grounded.

The third wire (3-*j*-h) is returned to the ground potential, i.e., the first potential. The third wires (not 3-*j*-h) other than the third wire (3-*j*-h) are returned to the ground potential, i.e., the first potential. The fourth wires (not 4-*i*) are returned to the ground potential, i.e., the first potential. The second wire (2-*j*) and the fifth wire (5-*j*) are returned to the ground potential, i.e., the first potential. The second wires (not 2-*j*) and the fifth wires (not 5-*j*) are returned to the ground potential, i.e., the first potential. The first wires (1-1 to 1-N) are returned to the ground potential, i.e., the first potential.

At this time, the timing of returning the respective electrodes to the ground potential may be in another order or simultaneous provided that, while the third potential, e.g., 20 V, is applied to the third electrode (3-*j*-h), at least the eighth potential, e.g., 3 V, is applied to the fourth wires (not 4-*i*) or the fifth wires (not 5-*j*) are grounded, i.e., the first potential. The potentials applied may be any combination of potentials so long as they satisfy conditions for writing the "1" in a desired cell.

Here, the same potential is preferably applied initially as the first potential to the first wires (1-1 to 1-N), the second wires (2-1 to 2-N), the third wires (3-1-1 to 3-N-L), the fourth wires (4-1 to 4-M) and the fifth wires (5-1 to 5-N), but different potentials may be applied.

In the above example, the writing process has been described with the case where the selected cell is a memory cell having the third wire (3-*j*-h) as the gate electrode. However, the writing process is the same with the case where the selected cell is a memory cell having a third wire other than the third wire (3-*j*-h) as the gate electrode.

Figure 121:
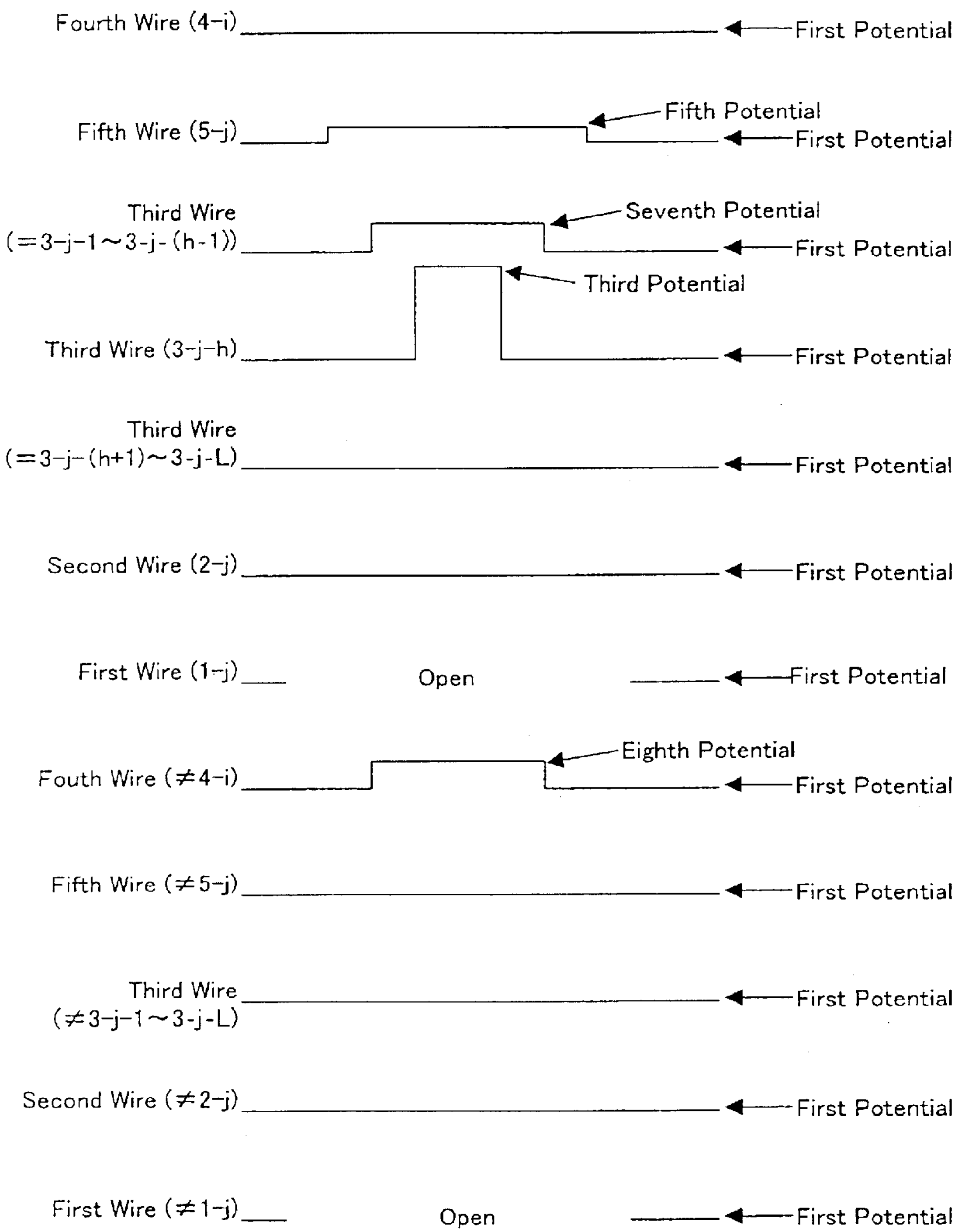

In contrast to FIG. 120, FIG. 121 shows a timing chart for writing data in the case where the eleventh potential is the ground potential.

The writing of the selected cell of FIG. 121 conforms to that of FIG. 120 without being affected by application of the ground potential, which is the first potential, as the eleventh potential to the third wires (30-(h+1) to 30-L, h is a positive integer, 1≦h≦L).

Figure 122:
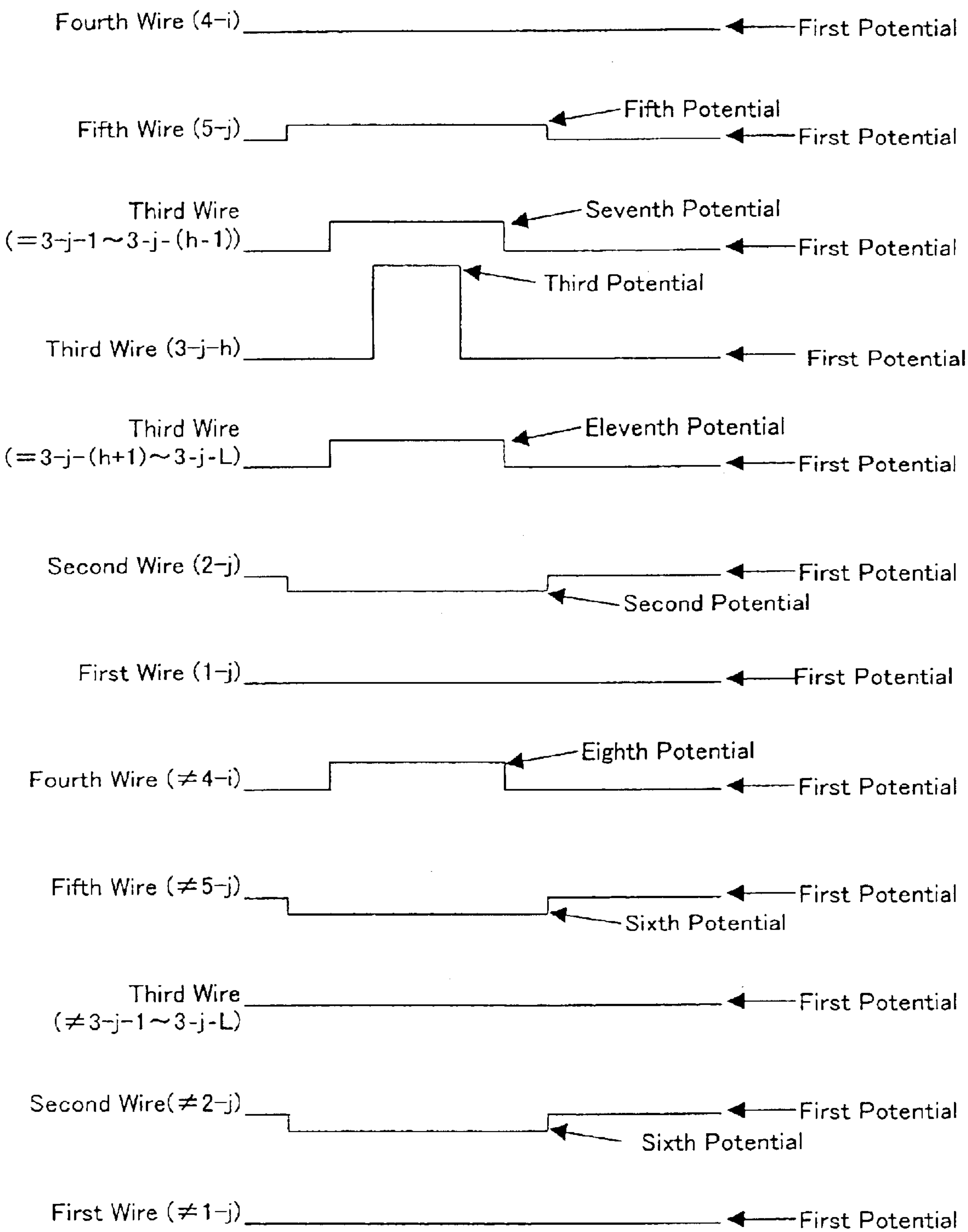

In contrast to FIG. 120, FIG. 122 shows a timing chart for writing data in the case where the first wire is grounded.

The writing of the selected cell of FIG. 122 conforms to that of FIG. 120 without being affected by application of the ground potential as the first potential to the first wire (1-*j*) if the second potential is not higher than the threshold of the transistor having the second wire (2-*j*) as the gate electrode.

Figure 123:
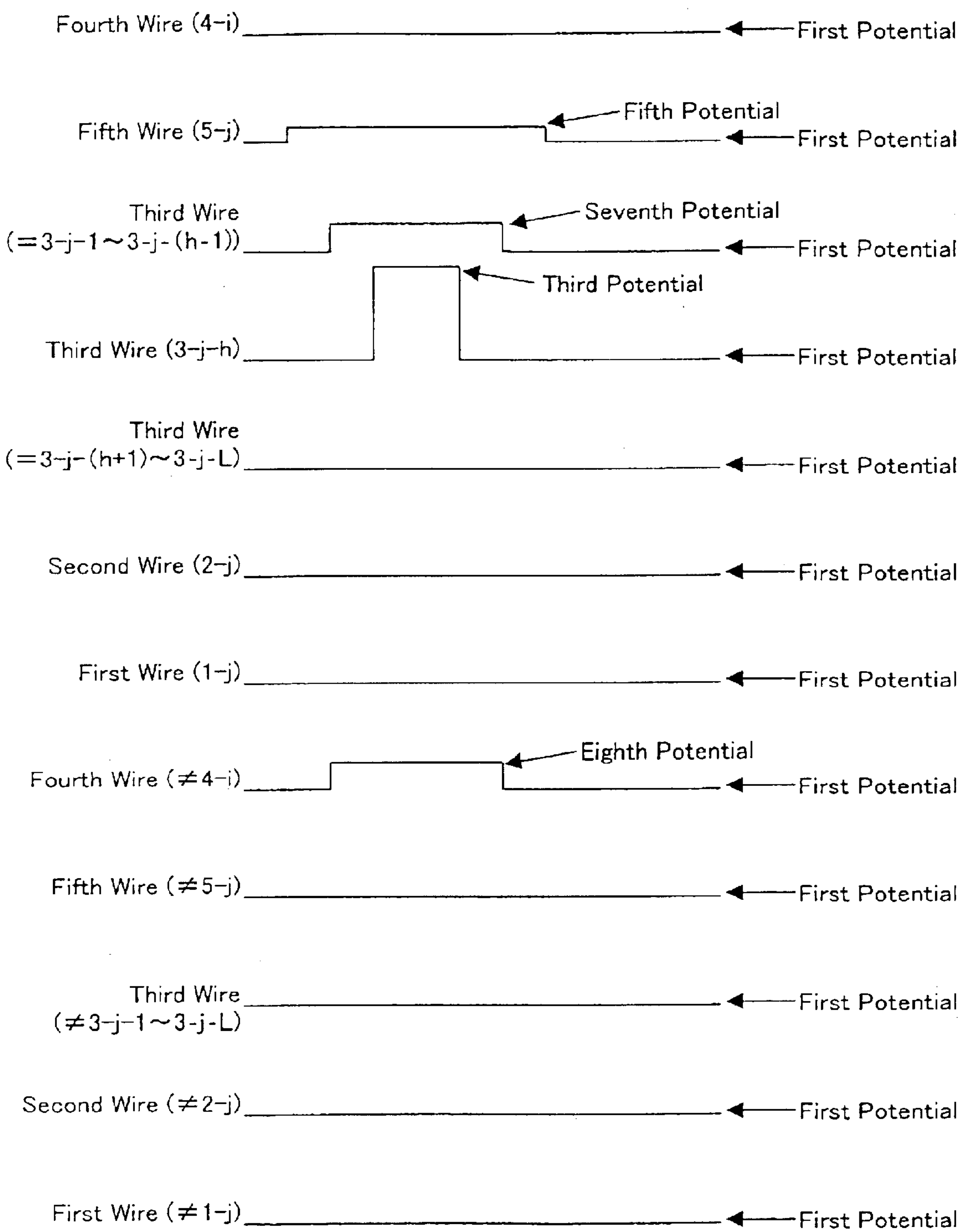
Figure 124:
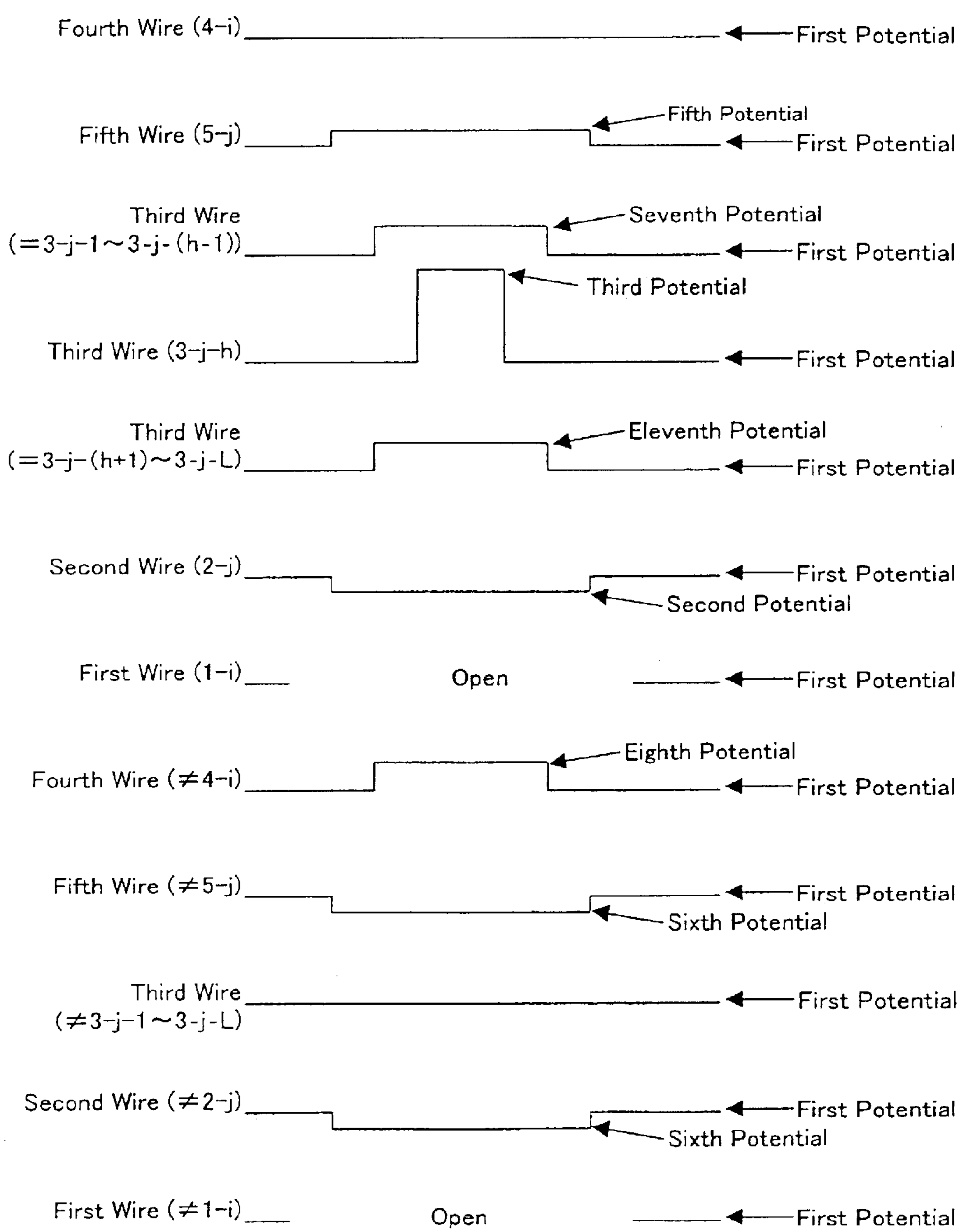
Figure 125:
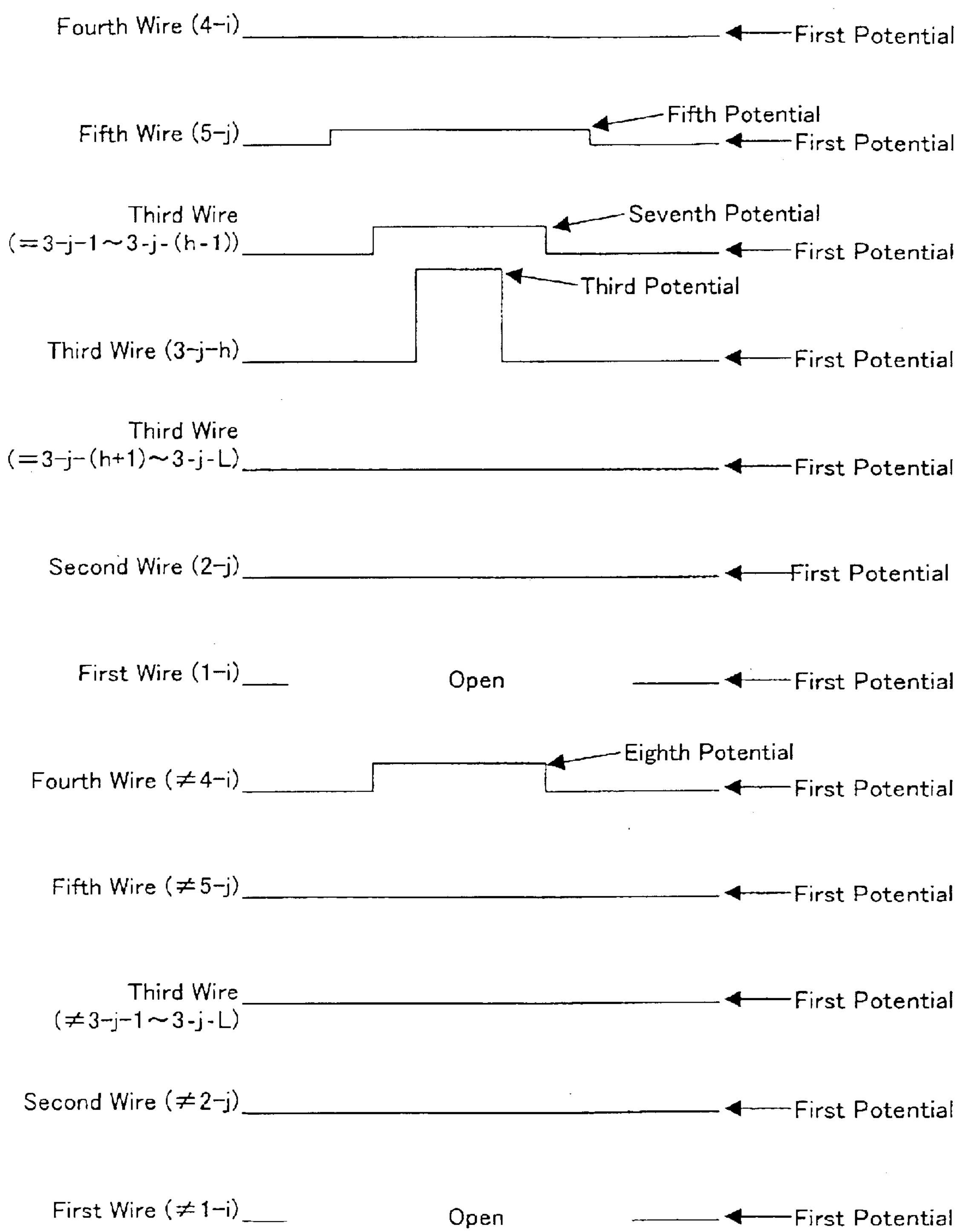
Figure 126:
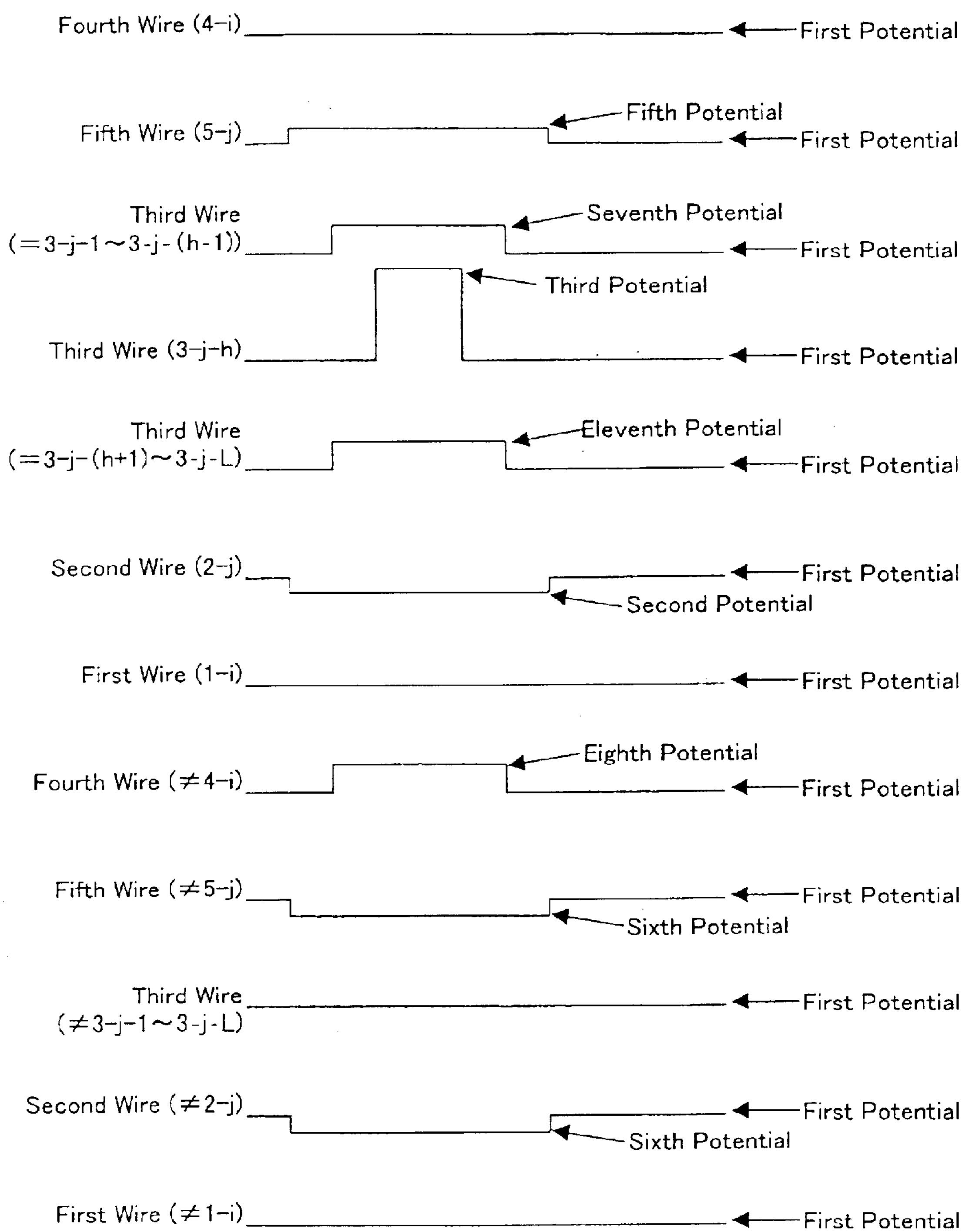
Figure 127:
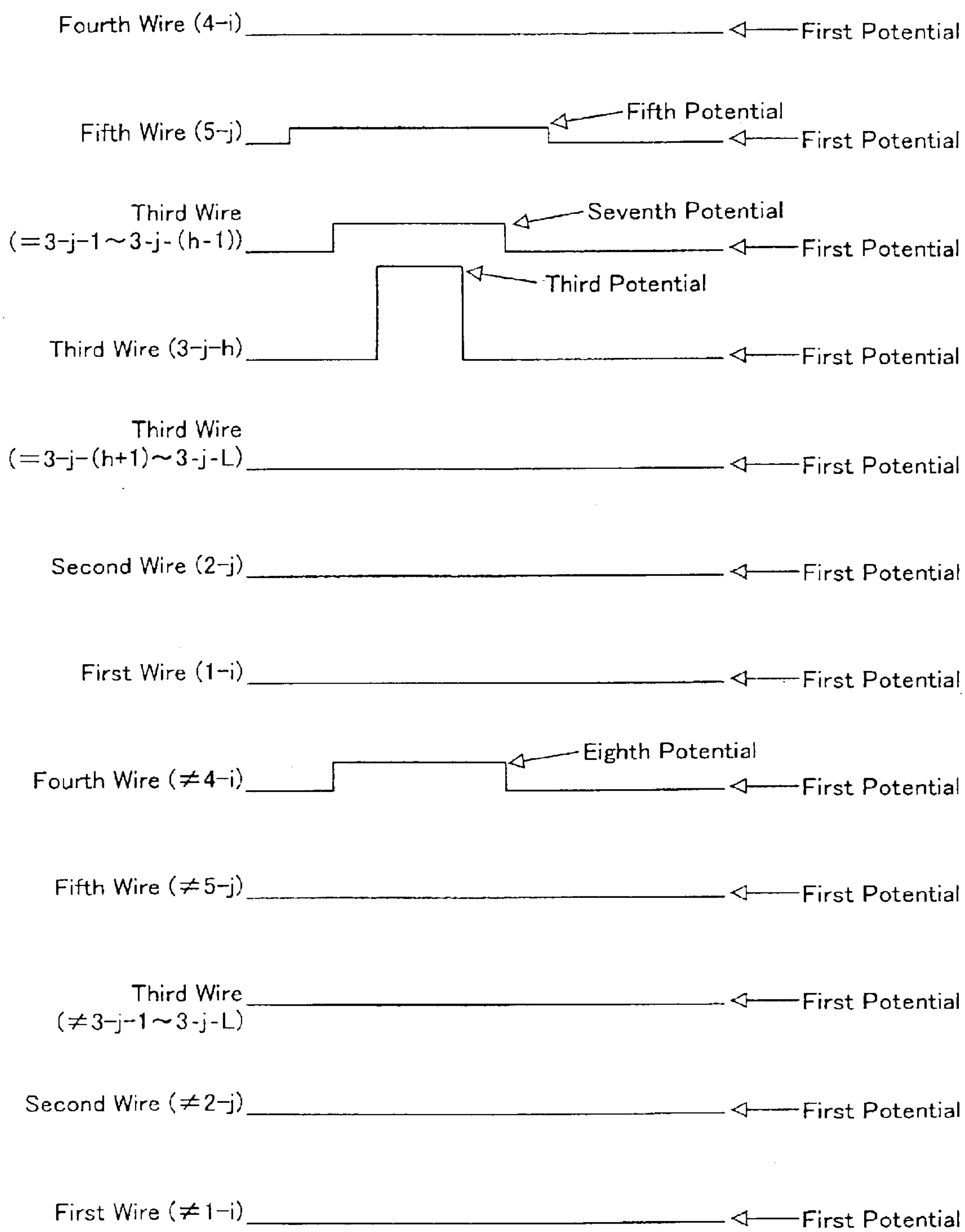
Figure 128:
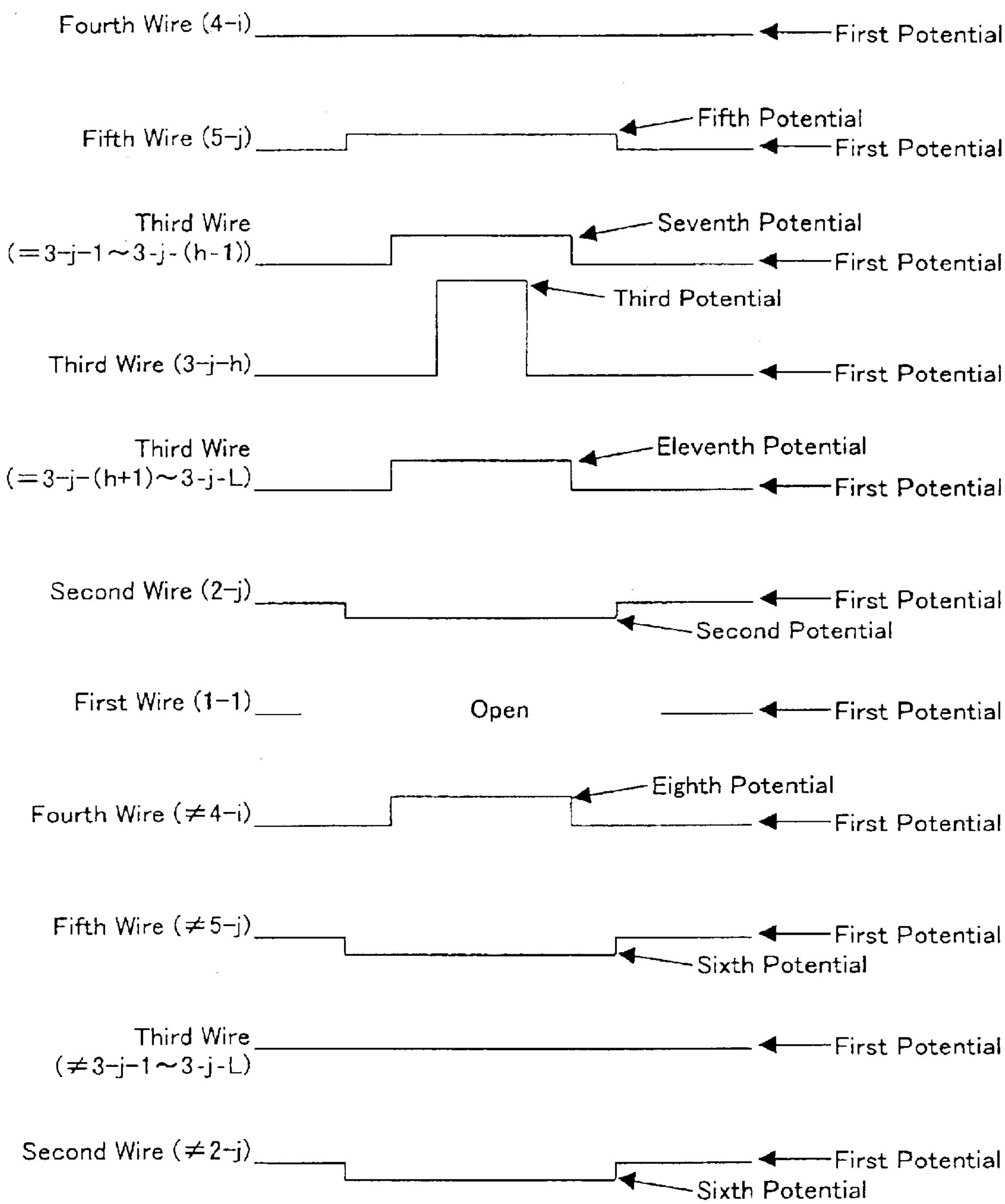
Figure 129:
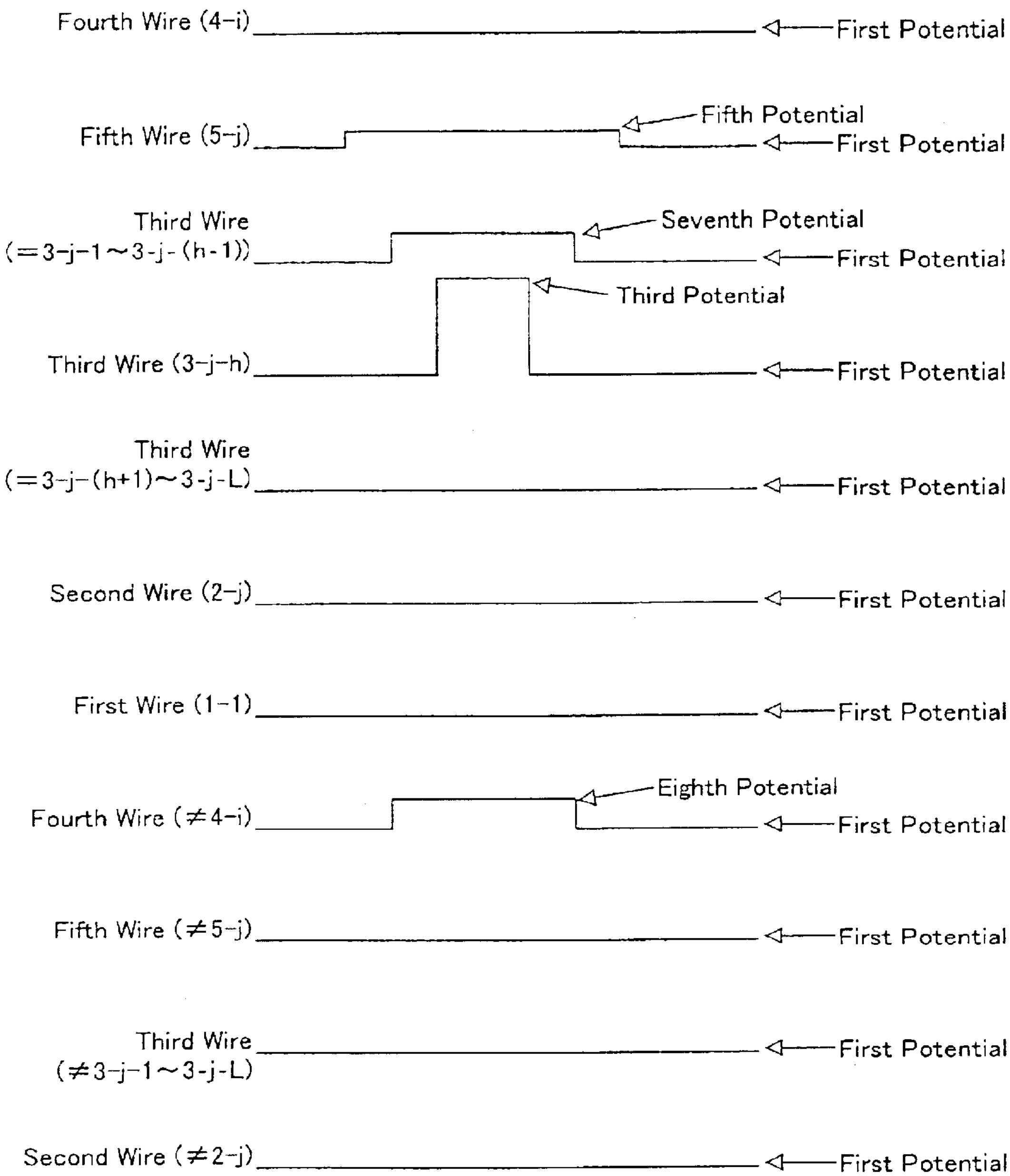
Figure 130:
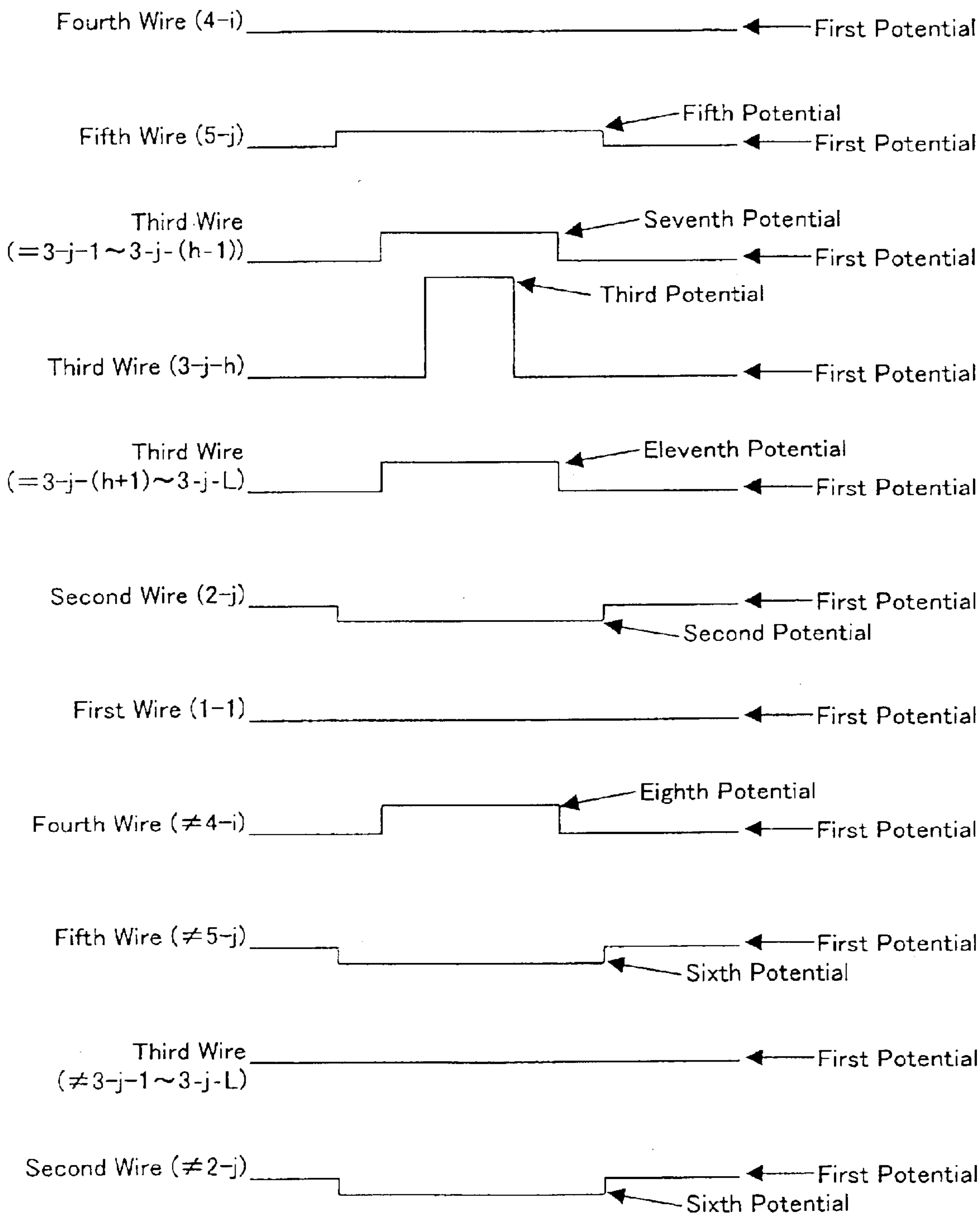
Figure 131:
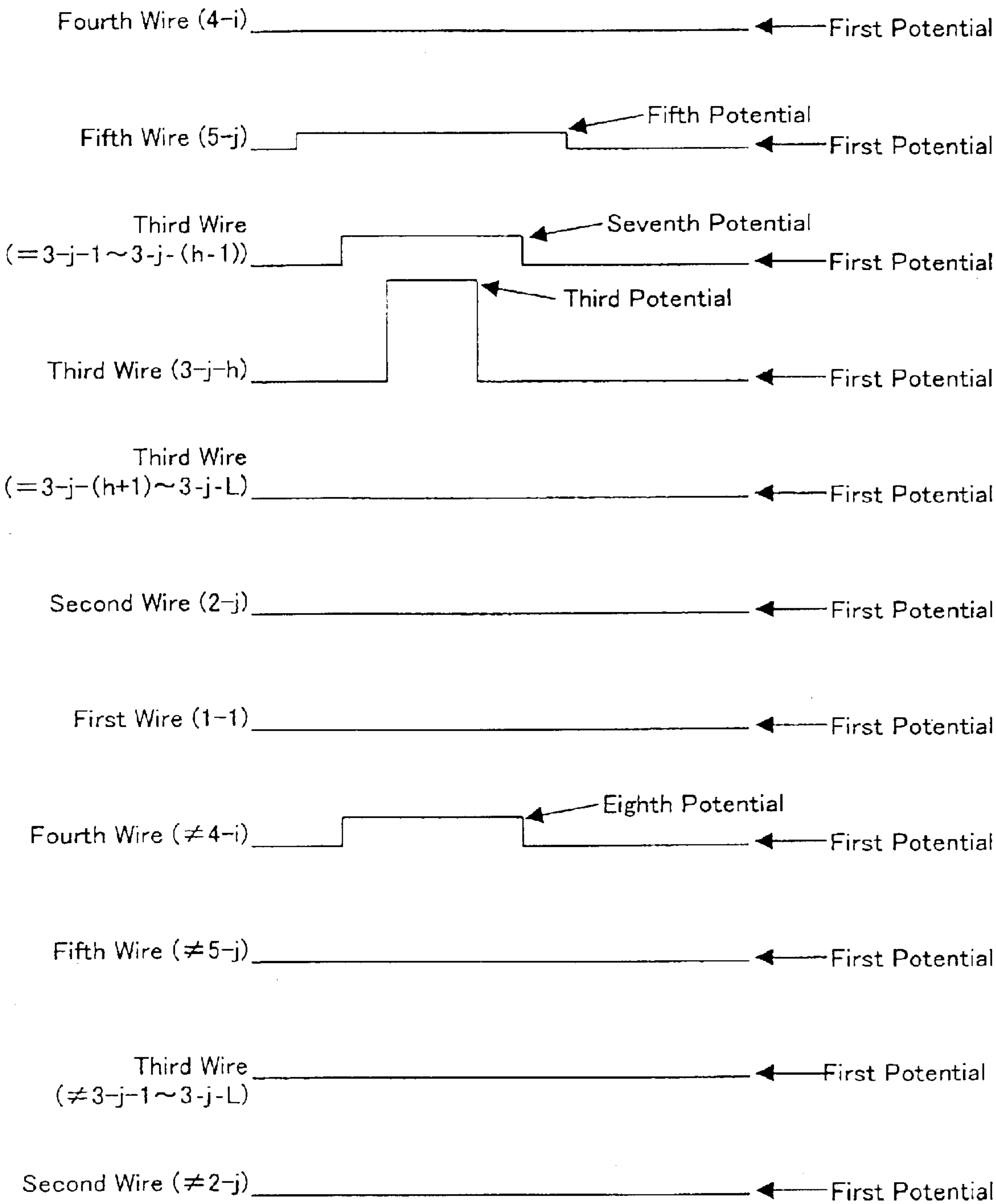

In contrast to FIG. 121, FIG. 123 shows a timing chart for writing data in the case where the first wire is grounded. The writing of the selected cell of FIG. 123 conforms to that of FIG. 121 without being affected by application of the ground potential as the first potential to the first wire (1-*j*) if the second potential is not higher than the threshold of the transistor having the second electrode 20 as the gate electrode.

FIG. 124 to FIG. 127 are timing charts showing examples of timing for writing data when the first wires are arranged in parallel to the fourth wires.

FIG. 124 to FIG. 127 conform to FIG. 120 to FIG. 123 except that the first wire (1-*i*) instead of the first wire (1-*j*) is connected to the end portion of the island-like semiconductor layer including the selected cell.

FIG. 128 to FIG. 131 are timing charts showing examples of timing for writing data when the first wires are connected in common to the entire array.

FIG. 128 to FIG. 131 conform to FIG. 120 to FIG. 123 except that the first wire (1-1) instead of the first wire (1-*j*) is connected to the end of the island-like semiconductor layer including the selected cell.

A writing process is now explained with a semiconductor memory according to the present invention which is constructed to include a plurality of (e.g., M×N, M and N are positive integers) island-like semiconductor layers each having two memory cells provided with the charge storage layer between the selection gate transistors and the third electrode as the control gate electrode and connected in series. In this memory cell array, a plurality of (e.g., M) fourth wires arranged in parallel with the semiconductor substrate are connected to ends of the island-like semiconductor layers, and first wires are connected to opposite ends of the island-like semiconductor layers. A plurality of (e.g., N×2) third wires in parallel with the semiconductor substrate are arranged in a direction crossing the fourth wires and connected to the third electrodes of the memory cells. The writing process utilizes the F-N current.

FIG. 72 shows an equivalent circuit diagram of the above-described memory cell array in which the first wires are arranged in parallel to the third wires.

For example, in the case where the island-like semiconductor layers are formed of a P-type semiconductor, a selected cell shown in FIG. 72 is written by applying a first potential to a first wire (1-*j*, j is a positive integer, 1≦j≦N) connected to an island-like semiconductor layer including the selected cell, a ninth potential to first wires (not 1-*j*) other than the first wire (1-*j*), a third potential to a third wire (3-*j*-1) connected to the selected cell, an eleventh potential to a third wire (3-*j*-2) connected to a non-selected cell arranged in series with the selected cell, a twelfth potential to third wires (not 3-*j*-1 to 3-*j*-2) other than mentioned above, a fourth potential to a fourth wire (4-*i*, i is a positive integer, 1≦i≦M) connected to the fourth electrode of the island-like semiconductor layer including the selected cell, and an eighth potential to fourth wires (not 4-*i*) other than the fourth wire (4-*i*).

The application of these potentials generates the F-N current only in the channel region of the selected cell and changes the state of the charge in the charge storage layer. For example, if the "1" is written by storing a negative charge in the charge storage layer, the third potential is larger than the fourth potential. If the "1" is written by drawing a negative charge from the charge storage layer, i.e., by storing a positive charge, the third potential is smaller than the fourth potential. Thus, the "0" or "1" can be set by utilizing a change in the state of the charge in the charge storage layer.

At this time, the third potential is a potential such that the "1" can be written by a difference between the third and fourth potentials. For example, the third potential is a potential allowing the generation of a sufficient F-N current flow by a difference between the third and fourth potentials. The F-N current flows in the tunnel oxide film of the memory transistor having, as the gate electrode, the third electrode to which the third potential is applied and thereby changes the state of the charge in the charge storage layer.

The eleventh potential may be a potential sufficiently reduces the F-N current flowing the tunnel oxide film of the memory transistors having as gate electrodes the third electrodes to which the eleventh potential is applied.

The first wires (1-1 to 1-N) may be opened. The eighth potential is a potential such that the "1" is not written by a potential difference between the third and eight potentials, for example, such that small enough is the F-N current caused by the potential difference to flow in the tunnel oxide film of the memory transistor having, as the gate electrode, the third electrode to which the third potential is applied.

In the case where the channel region of a selected memory cell is electrically connected to the semiconductor substrate, for example, in the case where the island-like semiconductor layer is not floated from the semiconductor substrate by an impurity diffusion layer, all memory cells having the third electrodes connecting to the their wire to which the third potential is applied can also be written at the same time if the tenth potential applied to the semiconductor substrate is a potential such that the "1" is written by a difference between the third potential and the tenth potential, for example, a potential such that a sufficiently large F-N current flows by a difference between the third potential and the tenth potential. The F-N current flows in the tunnel oxide film of the memory transistor.

At this time, in the case where the first wires (1-1 to 1-N) are formed as impurity diffusion layers in the semiconductor substrate, the ninth potential applied to the first wires (not 1-*j*) connected to the island-like semiconductor layers not including the selected cell is preferably a potential such that the island-like semiconductor layers are electrically floated from the semiconductor substrate by depletion layers extended by the application of the ninth potential. Thereby, the potential of the island-like semiconductor layers becomes equal to the ninth potential, and memory cells on the island-like semiconductor layers not including the selected cell are not written if the ninth potential is a potential such that the F-N current flowing in the tunnel oxide film of the memory transistors is sufficiently small.

That is, the potential differences between the ninth and third potentials, between the ninth and seventh potentials and between the ninth and eleventh potentials are such that the F-N current flowing in the tunnel oxide films of the memory transistors is sufficiently small. If the channel regions of the memory cells are not connected electrically to the semiconductor substrate, the depletion layers owing to the ninth potential may be expended in any way.

In the case where the first wires (1-1 to 1-N) are formed as impurity diffusion layers in the semiconductor substrate and the tenth potential applied to the semiconductor substrate is the ground potential, the first potential is generally the ground potential.

In the case where the first wires (1-1 to 1-N) are electrically insulated from the semiconductor substrate, for example, where the first electrodes (1-1 to 1-N) are formed of impurity diffusion layers on an SOI substrate and are insulated from the semiconductor substrate by an insulating film, the first potential is not necessarily the same as the tenth potential.

Memory cells may be sequentially written from a memory cell connected to a third electrode (3-*j*-2) to a memory cell connected to a third electrode (3-*j*-1), or may be written in reverse order or at random. Further, some or all memory cells connected to the third wire (3-*j*-1) may be written at the same time, some or all memory cells connected to the third wires (3-*j*-1 to 3-*j*-2) may be written at the same time, and some or all memory cells connected to the third wires (3-1-1 to 3-N-2) may be written at the same time.

Also, some or all memory cells connected to third wires selected regularly, e.g., a third wire (3-(j−8)-h), a third wire (3-*j*-h), a third wire (3-(j+8)-h), a third wire (3-(j+16)-h), (h=1 or 2) may be written at the same time.

Further some or all memory cells of one island-like semiconductor layer connected to the fourth wire (4-*i*) may be written at the same time, or some or all memory cells of some or all island-like semiconductor layers connected to the fourth wire (4-*i*) may be written at the same time. One, some or all memory cells of one island-like semiconductor layer connected to each of a plurality of fourth wires may be written at the same time, or some or all memory cells of some or all island-like semiconductor layers connected to each of a plurality of fourth wires may be written at the same time.

The memory cells connected to the third wire (3-*j*-h) may be written at the same time at given intervals, for example, every eight fourth wires (e.g., a fourth wire (4-(i−16)), a fourth wire (4-(i−8)), a fourth wire (4-*i*), a fourth wire (4-(i+8)), a fourth wire (4-(i+16)), . . . ). All the memory cells having, as gate electrodes, the third electrodes connected to the third wire (3-*j*-h) can be written at the same time by applying the first potential to all the fourth wires, applying the fourth potential to the first wire (1-*j*) and the eighth potential to the first wires (not 1-*j*), exchanging the potentials of the second and fifth wires and applying the third potential to the third wire (3-*j*-h).

Further, by applying the fourth potential to a plurality of first wires and applying the third potential to the third wires connected to the third electrodes of the memory cells included in the island-like semiconductor layers having the first electrodes connected to said plurality of first wires, all the memory cells having, as gate electrodes, the third electrodes connected to the third wires to which the third potential is applied can be written at the same time.

The above-described writing processes may be combined.

The charge storage layer may be, for example, a dielectric or a laminated insulating film as well as the floating gate. Also, it is needless to say that the "0" may be written by changing the state of the charge in the charge storage layer and the "1" may be written by not changing the state of the charge. Further, the "0" may be written by slightly changing the state of the charge in the charge storage layer and the "1" may be written by greatly changing the state of the charge, and vice versa. Furthermore, the "0" is written by changing the state of the charge in the charge storage layer to negative and the "1" is written by changing the state of the charge to positive, and vice versa. The above-mentioned definitions of "0" and "1" may be combined. The F-N current is not the only means for changing the state of the charge in the charge storage layer.

FIG. 76 shows an equivalent circuit diagram of a memory cell array in which the first wires are arranged in parallel to the fourth wires.

The application of the potentials for writing data of FIG. 76 is the same as that of FIG. 72 except that the first potential is applied to the first wire (1-*i*) and the ninth potential is applied to the first wires (not 1i).

FIG. 80 shows an equivalent circuit diagram of a memory cell array in which a plurality of first wires are electrically connected in common. The application of the potentials for writing data of FIG. 80 is the same as that of FIG. 72 except that the first potential is applied to the first wire (1-1).

Now, timing charts for the above-described examples of application of potentials for writing data are explained with the case where a plurality of (e.g., M×N, wherein M and N are positive integers) island-like semiconductor layers are arranged, each island-like semiconductor layer having two memory cells connected in series and formed of a P-type semiconductor, and the first wires are arranged in parallel with the third wires.

Figure 132:
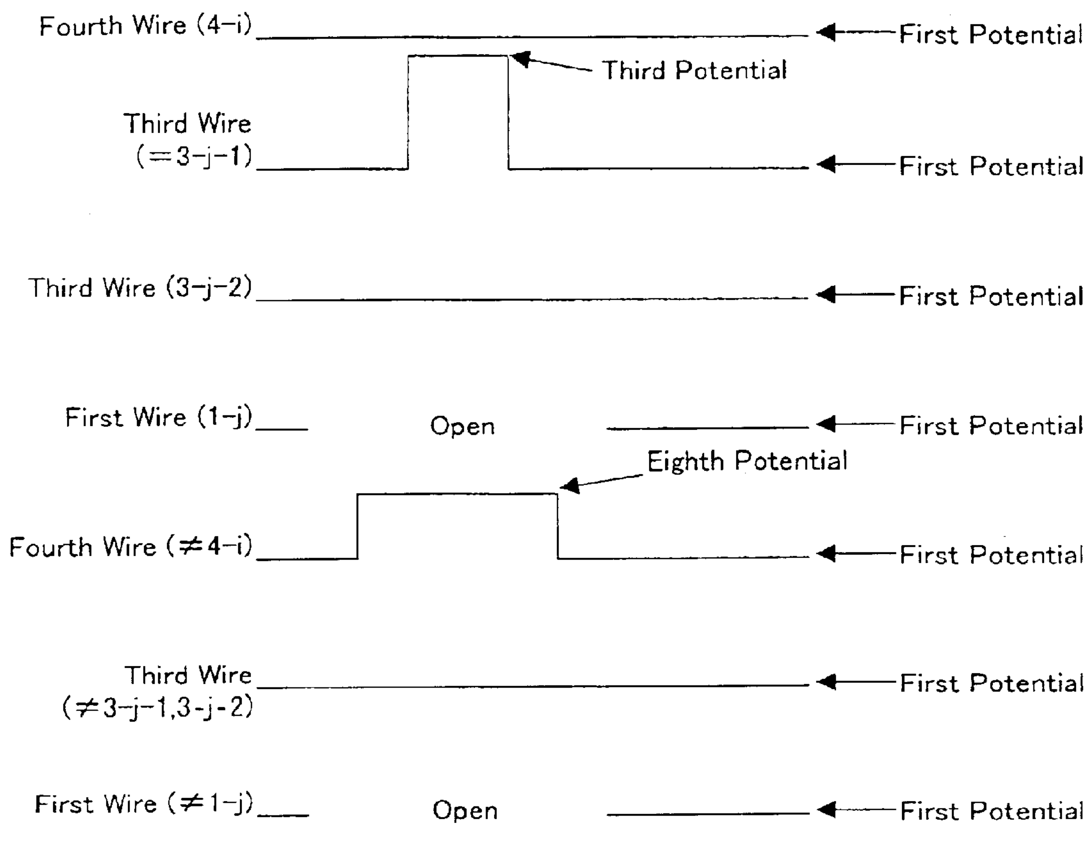

In FIG. 132, the first wire is open, and the memory cell has a threshold of 1.0 V to 3.5 V when it is in the written state and has a threshold of −1.0 V or lower when it is in the erased state.

For example, if the "1" is written by storing a negative charge in the charge storage layer, the ground potential as the first potential is first applied to the first wires (1-1 to 1-N), the third wires (3-1-1 to 3-N-L) and the fourth wires (4-1 to 4-M). In this state, the first wires (1-1 to 1-N) are opened. Thereafter, the ground potential which is the first potential is kept applied as the fourth potential to the fourth wire (4-*i*). The eighth potential, e.g., 10 V, is applied to fourth wires (not 4-*i*) other than the fourth wire (4-*i*). The eleventh potential, e.g., the ground potential which is the first potential, is applied to the third wire (3-*j*-1). The ground potential which is the first potential is applied as the twelfth potential to third wires (not 3-*j*-1 to 3-*j*-2) other than mentioned above. The third potential, e.g., 20 V, is applied to the third wire (3-*j*-1). This state is maintained for a desired period of time to write the "1."

At this time, the timing of applying the potentials to the respective wires may be in another order or simultaneous provided that, while the third potential, e.g., 20 V, is applied to the third wire (3-*j*-1), at least the eighth potential, e.g., 10 V, is applied to the fourth wires (not 4-*i*).

The third wire (3-*j*-1) is returned to the ground potential, i.e., the first potential. The third wires (not 3-*j*-1) other than the third wire (3-*j*-1) are returned to the ground potential, i.e., the first potential. The fourth wires (not 4-*i*) are returned to the ground potential, i.e., the first potential. At this time, the timing of returning the respective wires to the ground potential may be in another order or simultaneous provided that, while the third potential, e.g., 20 V, is applied to the third wire (3-*j*-1), at least the eighth potential, e.g., 10 V, is applied to the fourth wires (not 4-*i*).

The potentials applied may be any combination of potentials so long as they satisfy conditions for writing the "1" in a desired cell.

Here, the same potential is preferably applied initially as the first potential to the first wires (1-1 to 1-N), the third wires (3-1-1 to 3-N-2), and the fourth wires (4-1 to 4-M), but different potentials may be applied.

In the above example, the writing process has been described with the case where the selected cell is a memory cell having the third wire (3-*j*-1) as the gate electrode. However, the writing process is the same with the case where the selected cell is a memory cell having a third wire (3-*j*-2) as the gate electrode.

Figure 73:
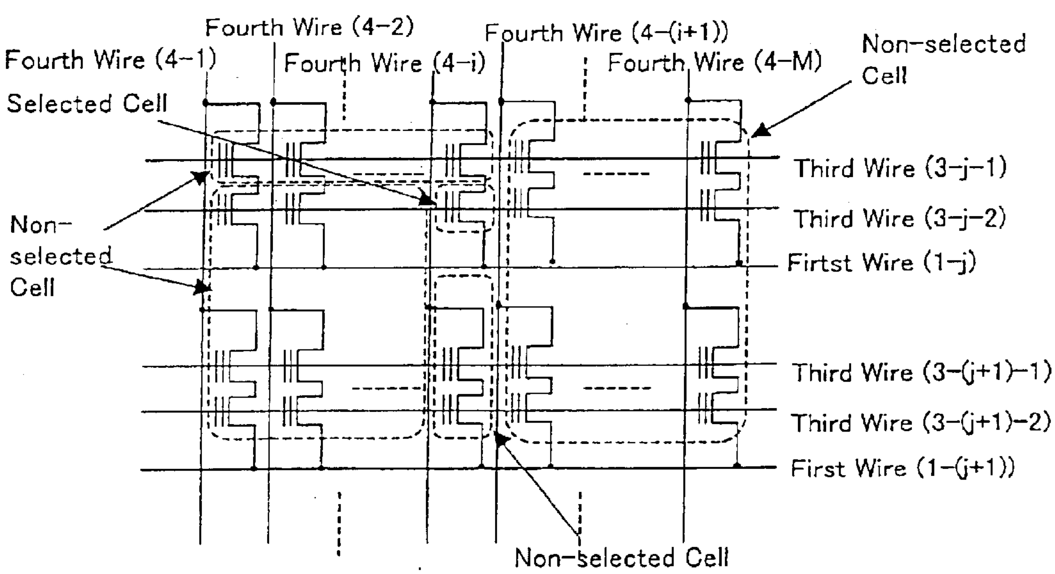
Figure 133:
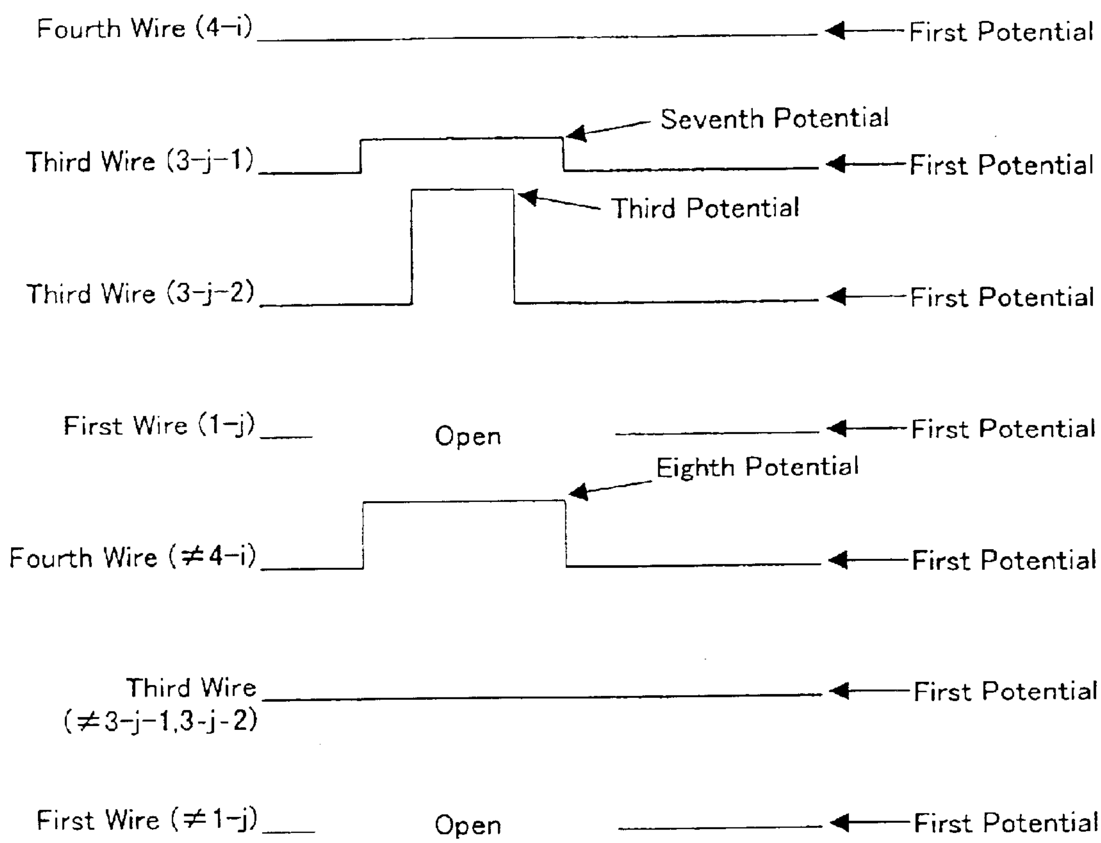

In contrast to FIG. 132, FIG. 133 is a timing chart showing an example of applying each potential for writing data in the case where the selected cell is a memory cell connected to the third electrode (3-*j*-2). FIG. 73 is an equivalent circuit diagram in the case where the selected cell is the memory cell connected to the third electrode (3-*j*-2).

FIG. 133 conforms to Fgi. 132 except that the seventh potential instead of the eleventh potential is applied to the third electrode connected to a non-selected cell arranged in series with the selected cell.

At this time, the seventh potential is a potential always allowing a cell current to flow through the memory cell regardless of the state of the charge stored in the charge storage layer, i.e., a potential allowing the formation of a reverse layer in the channel region of the memory cell, and not generating a change in the charge by the F-N current flowing the tunnel oxide film. For example, if the "1" is written by storing a negative charge in the charge storage layer, the seventh potential is a potential which is not less than the threshold that memory transistors having as gate electrodes the third electrodes connected to the third electrodes (3-*j*-1) can take and sufficiently reduces the F-N current flowing the tunnel oxide film of the memory transistors having as gate electrodes the third electrodes to which the seventh potential is applied.

Figure 134:
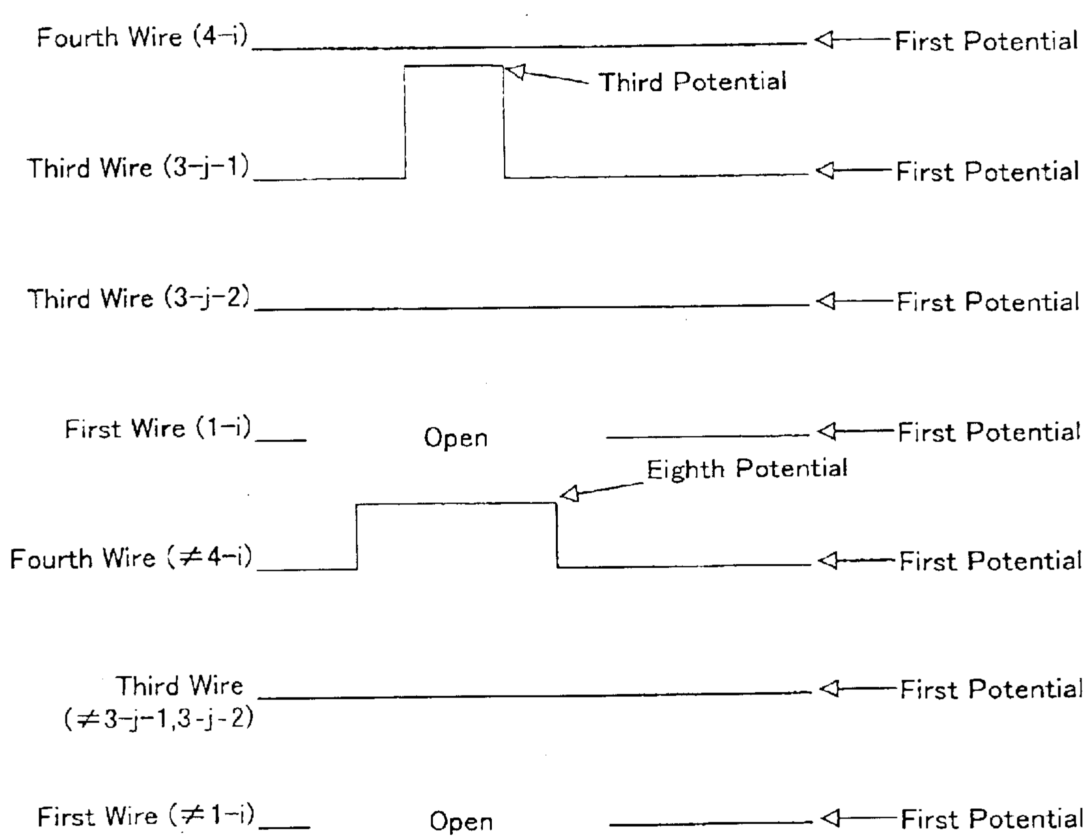
Figure 135:
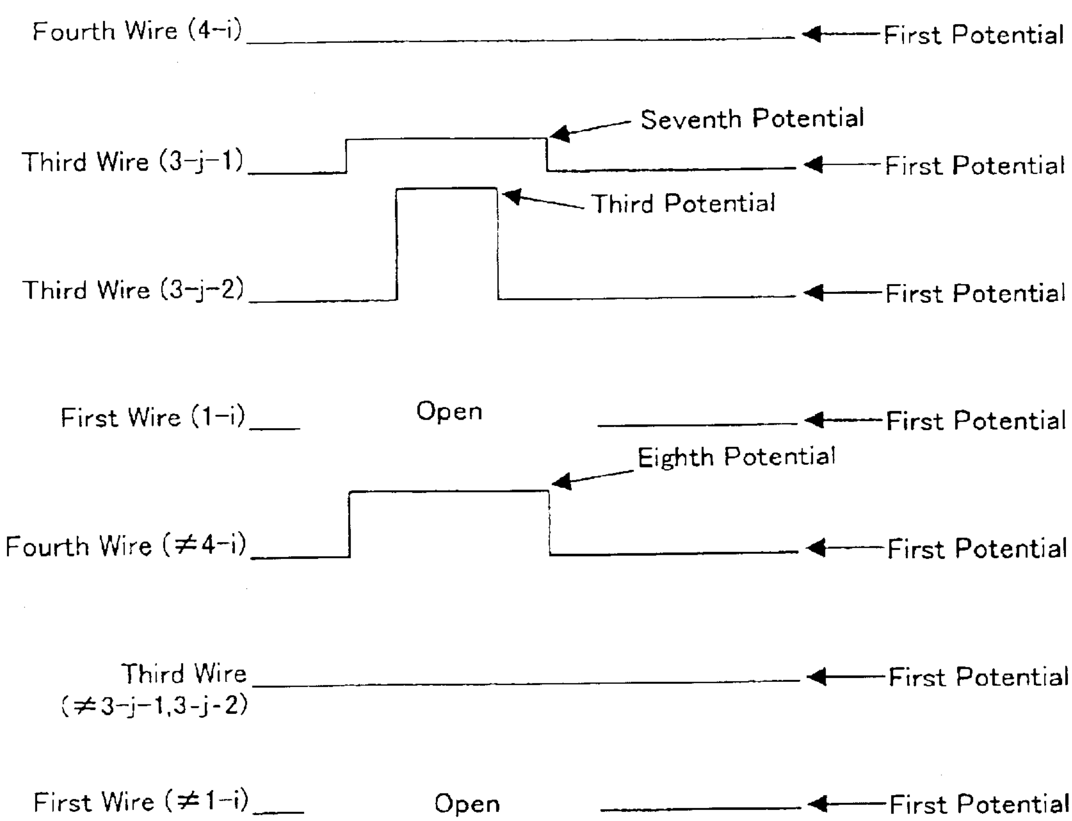
Figure 136:
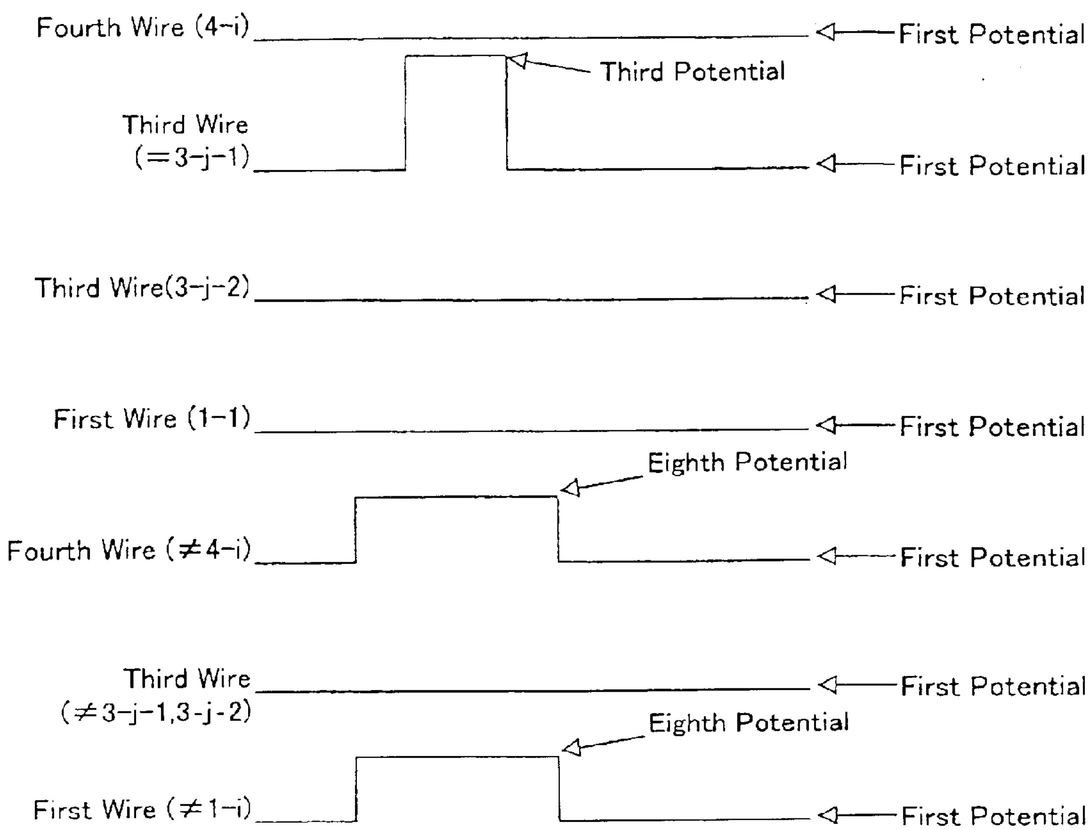
Figure 137:
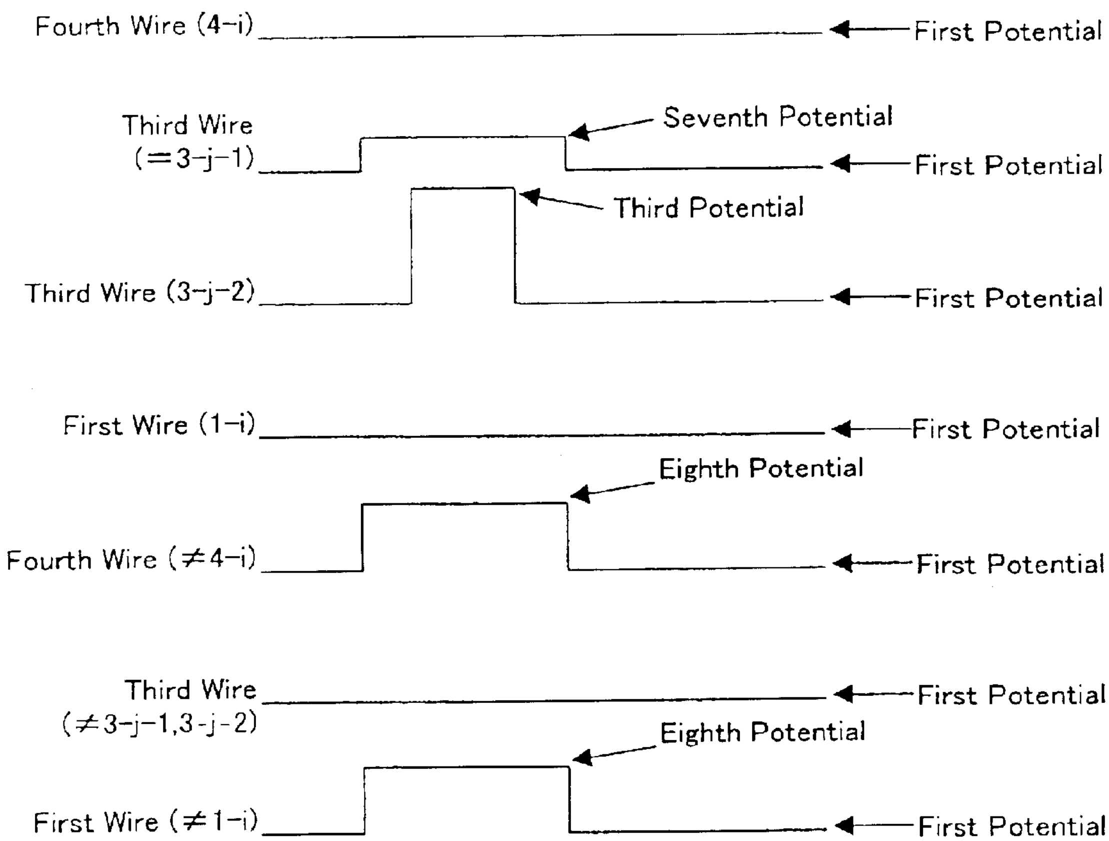

FIG. 134 to FIG. 137 are timing charts showing examples of applying each potential for writing data in the case where the first wires are arranged in parallel to the fourth wires. FIG. 134 and FIG. 137 conform to FIG. 132 and FIG. 133, respectively, except that the first wire (1-*i*) instead of the first wire (1-*j*) is connected to the end of the island-like semiconductor layer including the selected cell.

Figure 77:
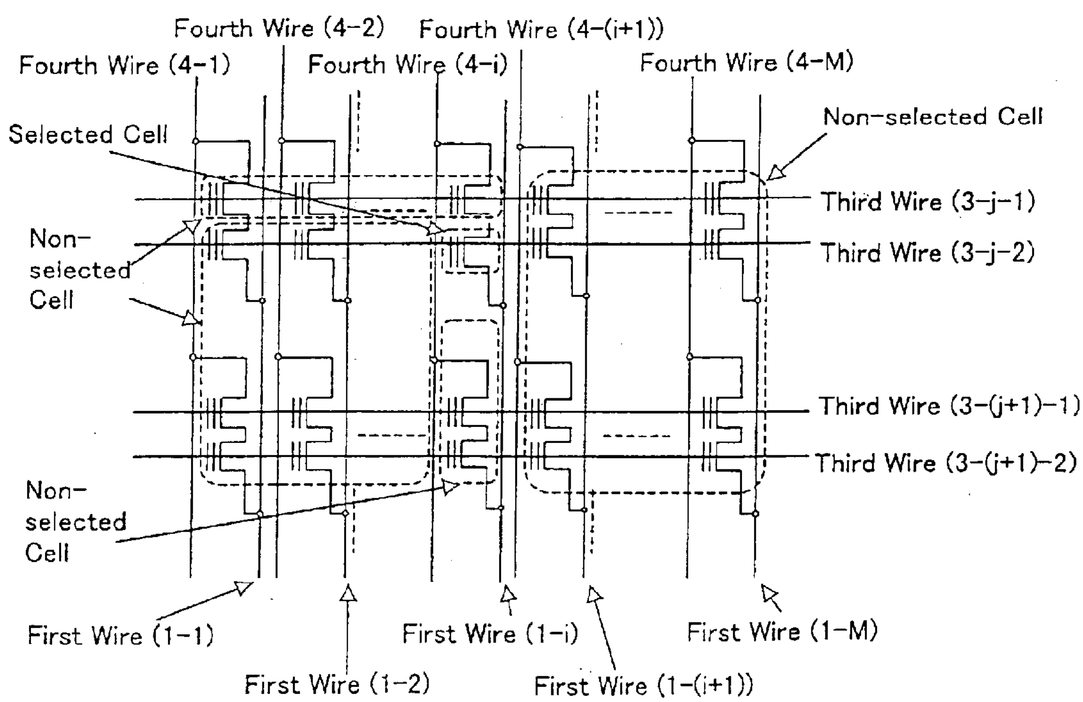

In the FIG. 134 and FIG. 137, even if a ground potential, i.e., the first potential, is kept applied to the first wire (1-*i*) connected to the end of the island-like semiconductor layer including the selected cell, the writing of the selected cell is not affected, and the writing operation conform to that of FIG. 132 and FIG. 133. FIG. 77 shows an equivalent circuit in the case where the selected cell is a memory cell connected to the third electrode (3-*j*-2). In this case, the eighth potential is preferably applied to the non-selected first wires (not 1i).

Figure 138:
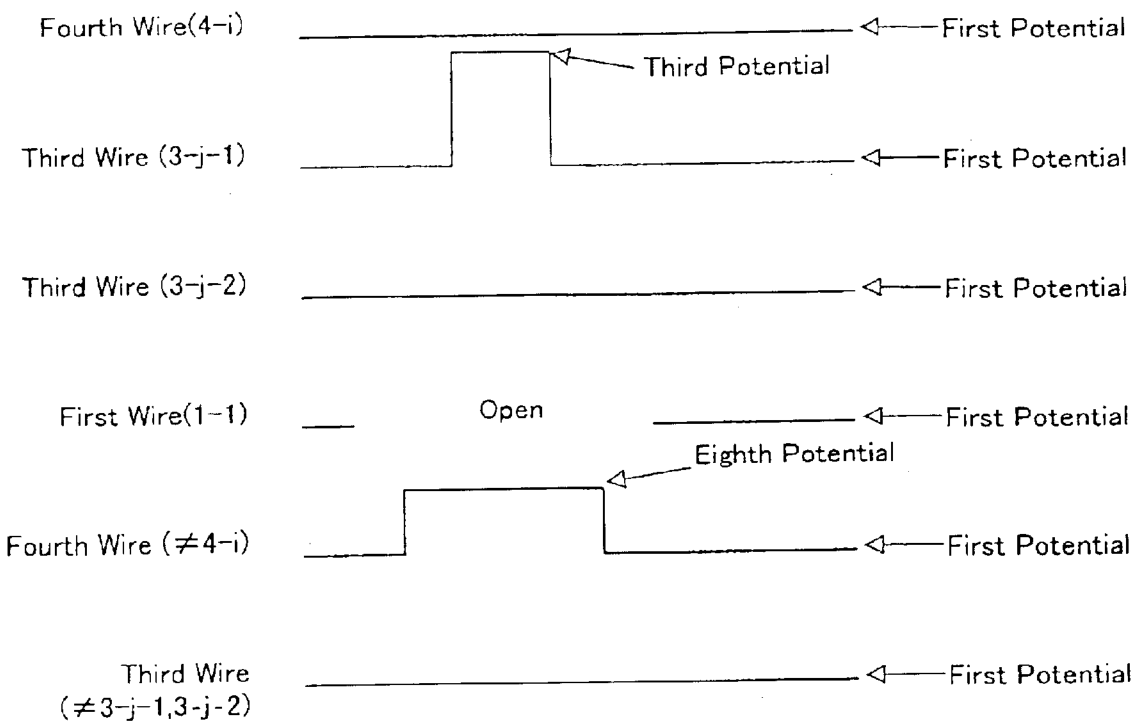
Figure 139:
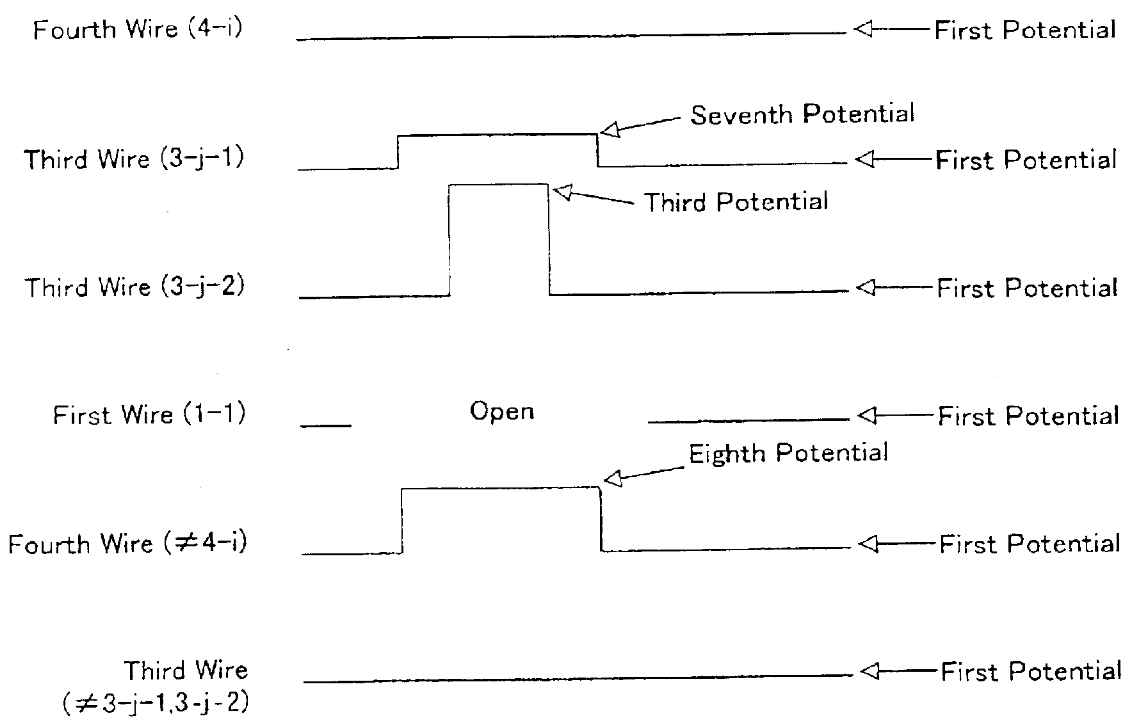

FIG. 138 and FIG. 139 are timing charts showing examples of applying each potential for writing data in the case where the first wires are connected in common to the entire array. FIG. 138 and FIG. 139 conform to FIG. 132 and FIG. 133, respectively, except that the first wire (1-1) instead of the first wire (1-*j*) is connected to the end of the island-like semiconductor layer including the selected cell.

Figure 81:
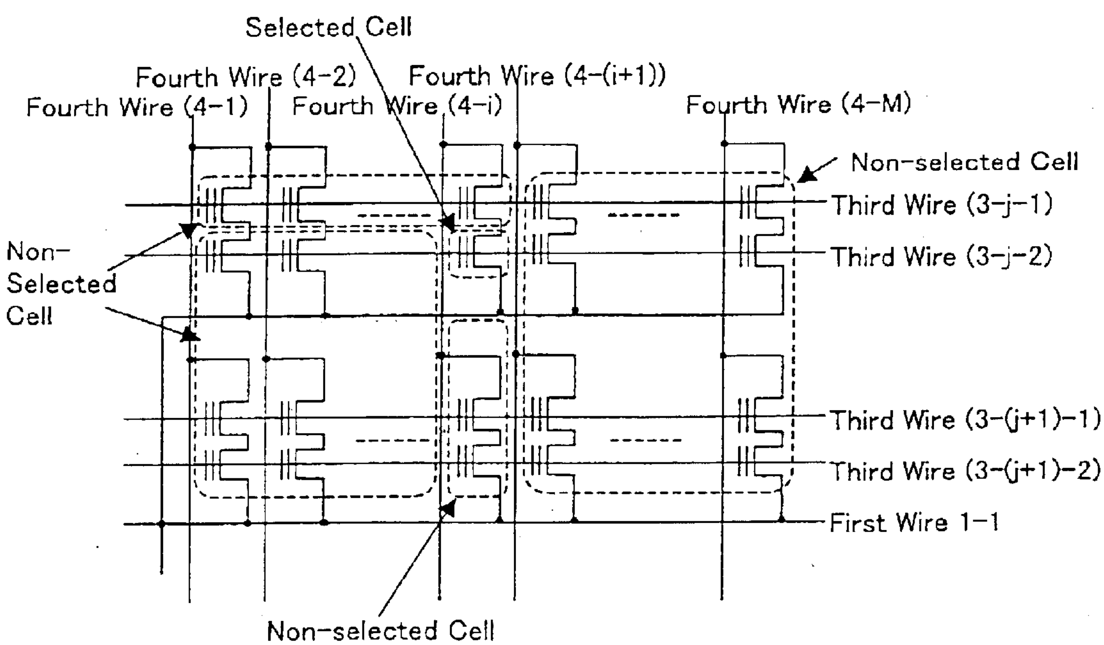

FIG. 81 shows an equivalent circuit in the case where the selected cell is a memory cell connected to the third electrode (3-*j*-2).

A writing process is now explained with a semiconductor memory according to the present invention which is constructed to include a plurality of (e.g., M×N, M and N are positive integers) island-like semiconductor layers each having two memory cells provided with the charge storage layer and the third electrode as the control gate electrode and connected in series. In this memory cell array, a plurality of (e.g., M) fourth wires arranged in parallel with the semiconductor substrate are connected to ends of the island-like semiconductor layers, and first wires are connected to opposite ends of the island-like semiconductor layers. A plurality of (e.g., N×2) third wires in parallel with the semiconductor substrate are arranged in a direction crossing the fourth wires and connected to the third electrodes of the memory cells. The writing process utilizes the CHE current.

FIG. 72 is an equivalent circuit diagram of the above-described memory cell array in which the first wires are arranged in parallel with the third wires.

For example, in the case where the island-like semiconductor layers are formed of a P-type semiconductor, a selected cell shown in FIG. 72 is written by applying a first potential to a first wire (1-*j*, j is a positive integer, 1≦j≦N) connected to an island-like semiconductor layer including the selected cell, a ninth potential to first wires (not 1-*j*) other than the above-mentioned first wire (1-*j*), a third potential to a third wire (3-*j*-1) connected to the selected cell, an eleventh potential to a third wire (3-*j*-2) connected to a non-selected cell arranged in series with the selected cell, a twelfth potential to other third wires (not 3-*j*-1 to 3-*j*-2), a fourth potential to a fourth wire (4-*i*, i is an integer, 1≦i≦M) connected to the fourth electrode of the island-like semiconductor layer including the selected cell, and an eighth potential to fourth wires (not 4-*i*) other than the fourth wire (4-*i*). The application of these potentials generates the CHE current in the channel region of the selected cell and changes the state of the charge in the charge storage layer. For example, if the "1" is written by storing a negative charge in the charge storage layer, the fourth potential is larger than the first potential and the third potential is larger than the first potential. At this time, the first potential is preferably a ground potential. The third or fourth potential is a potential such that the "1" can be written by a potential difference between the third and first potentials and a potential difference between the fourth and first potential, for example, a potential such that the CHE current is sufficiently generated as means for changing the state of the charge by these potential differences. The CHE current flows in the tunnel oxide film of the memory transistor having, as the gate electrode, the third electrode to which the third potential is applied.

The eleventh potential is a potential always allowing the cell current to flow in a selected memory cell regardless of the state of the charge in the charge storage layer, that is, a potential allowing a reverse layer to form in the channel region of the memory cell but not causing a change in the state of the charge in the charge storage layer. For example, if the "1" is written by storing electrons in the charge storage layer, the eleventh potential is a potential which is not smaller than the threshold that a memory transistor having, as the gate electrode, the third electrode connected to the third wire (3-*j*-2) can take and which can sufficiently reduce the F-N or CHE current flowing in the tunnel oxide film of the memory transistor having, as the gate electrode, the third electrode to which the eleventh potential is applied.

The eighth potential is a potential such that the "1" is not written by potential-differences between the eighth potential and the first potential, between the eighth potential and the third potential and between the eighth potential and the eleventh potential, for example, a potential such that owing to the potential differences, only a sufficiently small CHE and F-N currents flow in the tunnel oxide film of the memory transistor having the third electrode as the gate electrode. At this time, the eighth potential is desirably a ground potential and may be open. The ninth potential may be an optional potential such that the "1" is not written by potential differences between the ninth potential and the eighth potential, between the ninth potential and the fourth potential and between the ninth potential and the twelfth potential, but is desirably equal to the eighth potential. The ninth potential may be open. The twelfth potential is desirably a ground potential.

In the case where the first wires (1-1 to 1-N) are formed as impurity diffusion layers in the semiconductor substrate and the tenth potential applied to the semiconductor substrate is the ground potential, the first potential is generally the ground potential. In the case where the first wires (1-1 to 1-N) are electrically insulated from the semiconductor substrate, for example, in the case where the first electrodes (1-1 to 1-N) are formed of impurity diffusion layers on an SOI substrate and are insulated from the semiconductor substrate by an insulating film, the first potential is not necessarily the same as the tenth potential.

Memory cells may be sequentially written from a memory cell connected to a third electrode (3-*j*-2) to a memory cell connected to a third electrode (3-*j*-1), or may be written in reverse order. Further, some or all memory cells connected to the third wire (3-*j*-1) may be written at the same time, some or all memory cells connected to the third wires (3-1-1 to 3-N-2) may be written at the same time.

Also, some or all memory cells connected to third wires selected regularly, e.g., a third wire (3-(j−8)-1), a third wire (3-*j*-1), a third wire (3-(j+8)-1), a third wire (3-(j+16)-1), may be written at the same time.

Further the memory cells of some or all island-like semiconductor layers connected to the fourth wire (4-*i*) may be written at the same time. The memory cells of one island-like semiconductor layer connected to each of a plurality of fourth wires may be written at the same time, or the memory cells of some or all island-like semiconductor layers connected to each of a plurality of fourth wires may be written at the same time.

The memory cells connected to the third wire (3-*j*-1) may be written at the same time at given intervals, for example, every eight fourth wires (e.g., a fourth wire (4-(i−16)), a fourth wire (4-(i−8)), a fourth wire (4-*i*), a fourth wire (4-(i+8)), a fourth wire (4-(i+16)), . . . ). All the memory cells having, as gate electrodes, the third electrodes connected to the third wire (3-*j*-1) can also be written at the same time by applying the first potential to all the fourth wires, applying the fourth potential to the first wire (1-*j*), the eighth potential to the first wires (not 1-*j*), and applying the third potential to the third wire (3-*j*-1).

The selected cell can also be written by applying the ninth potential (the first potential<the ninth potential<the fourth potential) to fourth wires (not 4-*i*) not including the selected cell, applying the first potential to the fourth wire (4-*i*), applying the fourth potential to the first wire (1-*j*), applying the eighth potential to first wires (not 1-*j*) and applying the third potential to the third wire (3-*j*-1). Further, by applying the fourth potential to a plurality of first wires, applying the third potential to the third wire (3-*j*-1) connected to the third electrodes of the memory cells included in the island-like semiconductor layers having the first electrodes connected to said plurality of first wires, and by applying eleventh potential to the third wire (not 3-*j*-1), all the memory cells having, as gate electrodes, the third electrodes connected to the third wires to which the third potential is applied can be written at the same time. The above-described writing processes may be combined.

The charge storage layer may be, for example, a dielectric or a laminated insulating film as well as the floating gate. Also, it is needless to say that the "0" may be written by changing the state of the charge in the charge storage layer and the "1" may be written by not changing the state of the charge. Further, the "0" may be written by slightly changing the state of the charge in the charge storage layer and the "1" may be written by greatly changing the state of the charge, and vice versa. Furthermore, the "0" is written by changing the state of the charge in the charge storage layer to negative and the "1" is written by changing the state of the charge to positive, and vice versa. The above-mentioned definitions of "0" and "1" may be combined. The CHE current is not the only means for changing the state of the charge in the charge storage layer.

FIG. 76 shows an equivalent circuit diagram of a memory cell array in which the first wires are arranged in parallel to the fourth wires.

The application of the potentials of FIG. 76 is the same as that of FIG. 72 except that the first potential is applied to the first wire (1-*i*) and the ninth potential is applied to the first wires (not 1i).

FIG. 80 shows an equivalent circuit diagram of a memory cell array in which a plurality of first wires are electrically connected in common.

The application of the potentials of FIG. 80 is the same as that of FIG. 72 except that the first potential is applied to the first wire (1-1).

Now, examples of timing charts for the above-described application of the potentials for writing data are explained with the case where M×N (M and N are positive integers) island-like semiconductor layers are arranged, each having two memory cells connected in series and formed of a P-type semiconductor, and the first wires are arranged in parallel with the third wires.

Figure 140:
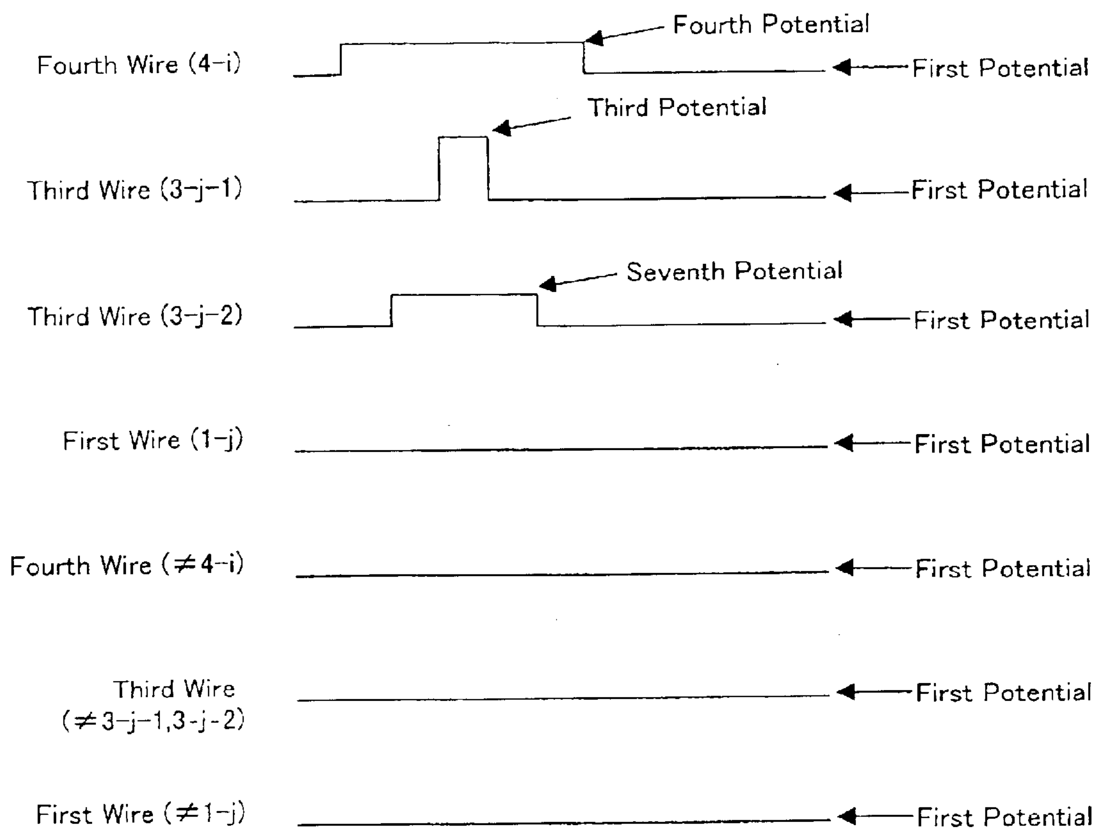

In FIG. 140, a ground potential is applied as the first potential and the ninth potential to the first wire, and the memory cell has a threshold of 5.0 V to 7.5 V when it is in the written state and has a threshold of 0.5 V to 3.0 V when it is in the erased state.

For example, if the "1" is written by storing a negative charge in the charge storage layer, the ground potential as the first potential is first applied to the first wires (1-1 to 1-N), the third wires (3-1-1 to 3-N-2) and the fourth wires (4-1 to 4-M). In this state, the fourth potential, e.g., 6 V, is applied to the fourth wire (4-*i*). The eighth potential, e.g., the ground potential which is the first potential, is applied to fourth wires (not 4-*i*) other than the fourth wire (4-*i*). The twelfth potential is applied to third wires (not 3-*j*-1 to 3-*j*-2) connected to non-selected cells not arranged in series with the selected cell. The eleventh potential, e.g., 8 V, is applied to the third wire (3-*j*-2) connected to a non-selected cell arranged in series with the selected cell. The third potential, e.g., 12 V, is applied the third wire (3-*j*-1) connected to the selected cell. The "1" is written by maintaining this state for a desired time period. At this time, the timing of applying the potentials to the respective wires may be in another order or simultaneous.

The third wire (3-*j*-1) is returned to the ground potential, the third wire (3-*j*-2) is returned to the ground potential, and the fourth wire (4-*i*) is returned to the ground potential. At this time, the respective electrodes may be returned to the ground potential in another order or simultaneously. The potentials given may be any combination of potentials so long as they meet conditions for writing the "1" in a desired cell.

Here, the same potential is preferably applied initially as the first potential to the first wires (1-1 to 1-N), the third wires (3-1-1 to 3-N-2) and the fourth wires (4-1 to 4-M), but different potentials may be applied.

In the above example, the writing process has been described with the case where the selected cell is a memory cell having the third wire (3-*j*-1) as the gate electrode. However, the writing process is the same with the case where the selected cell is a memory cell having a third wire other than the third wire (3-*j*-1) as the gate electrode.

Figure 141:
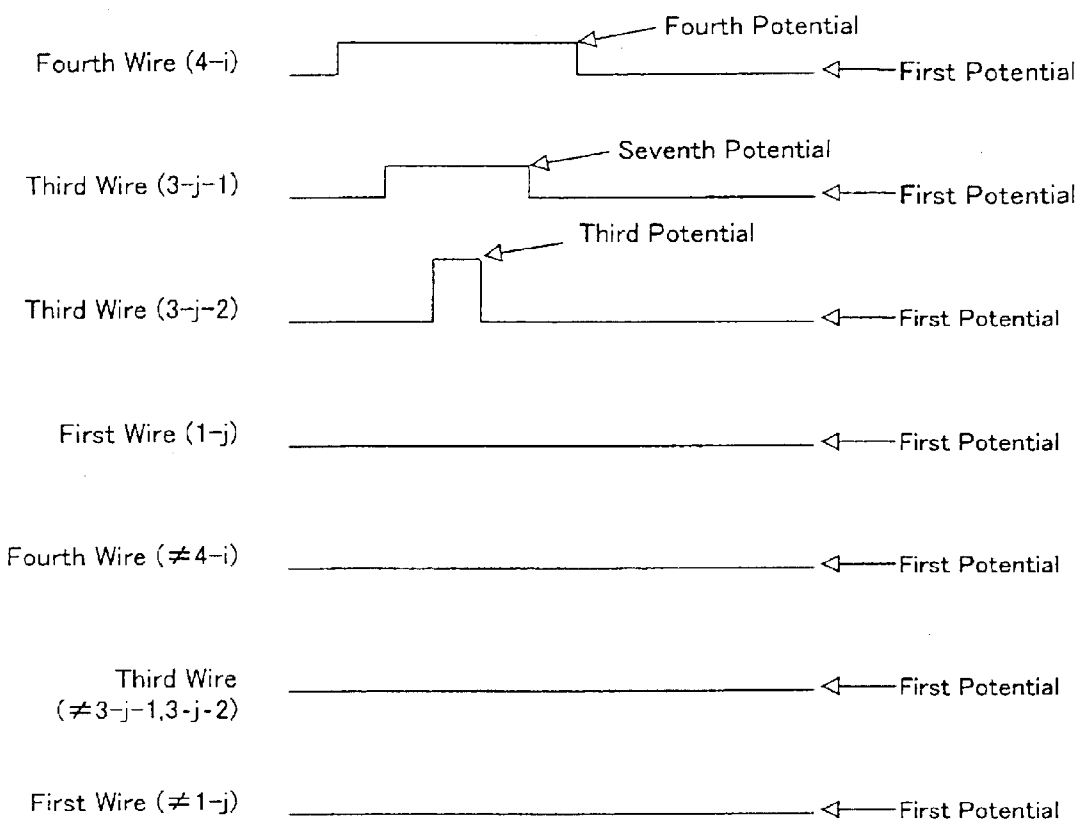

In contrast to FIG. 140, FIG. 141 shows a timing chart for writing data in the case where the selected cell is a memory cell connected to the third wire (3-*j*-2).

FIG. 141 conforms to FIG. 140 except that the seventh potential instead of the eleventh potential is applied to the third wire connected to the non-selected cell arranged in series with the selected cell. At this time, the seventh potential is equal to the eleventh potential.

FIG. 72 is an equivalent circuit diagram in the case where the selected cell is a memory cell connected to the third wire (3-*j*-2).

Figure 142:
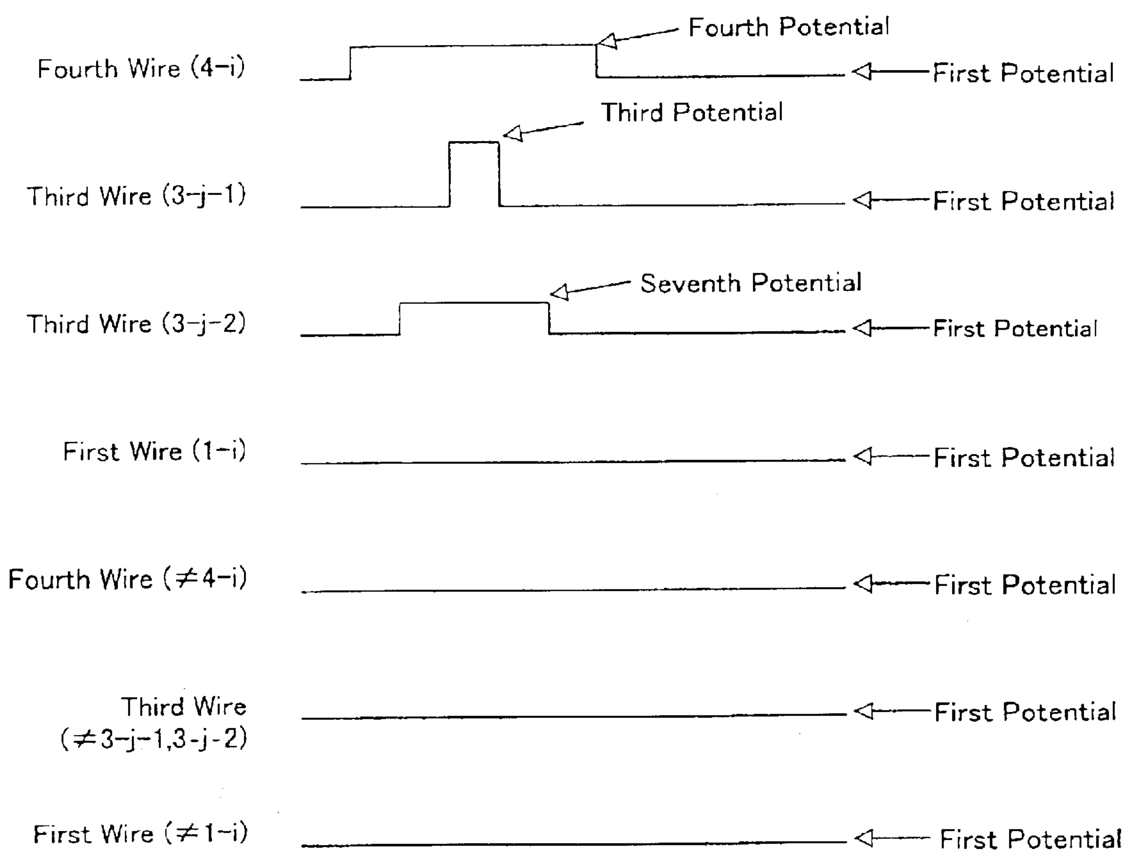

Now, FIG. 142 shows a timing chart for writing data in the case where the first wires are arranged in parallel to the fourth wires.

In FIG. 142, a ground potential is applied as the first potential, and the memory cell has a threshold of 5.0 V to 7.5 V when it is in the written state and has a threshold of 0.5 V to 3.0 V when it is in the erased state. FIG. 142 conforms to FIG. 140 except that the first wire (1-*i*) instead of the first wire (1-*j*) is connected to the end of the island-like semiconductor layer including the selected cell.

Figure 143:
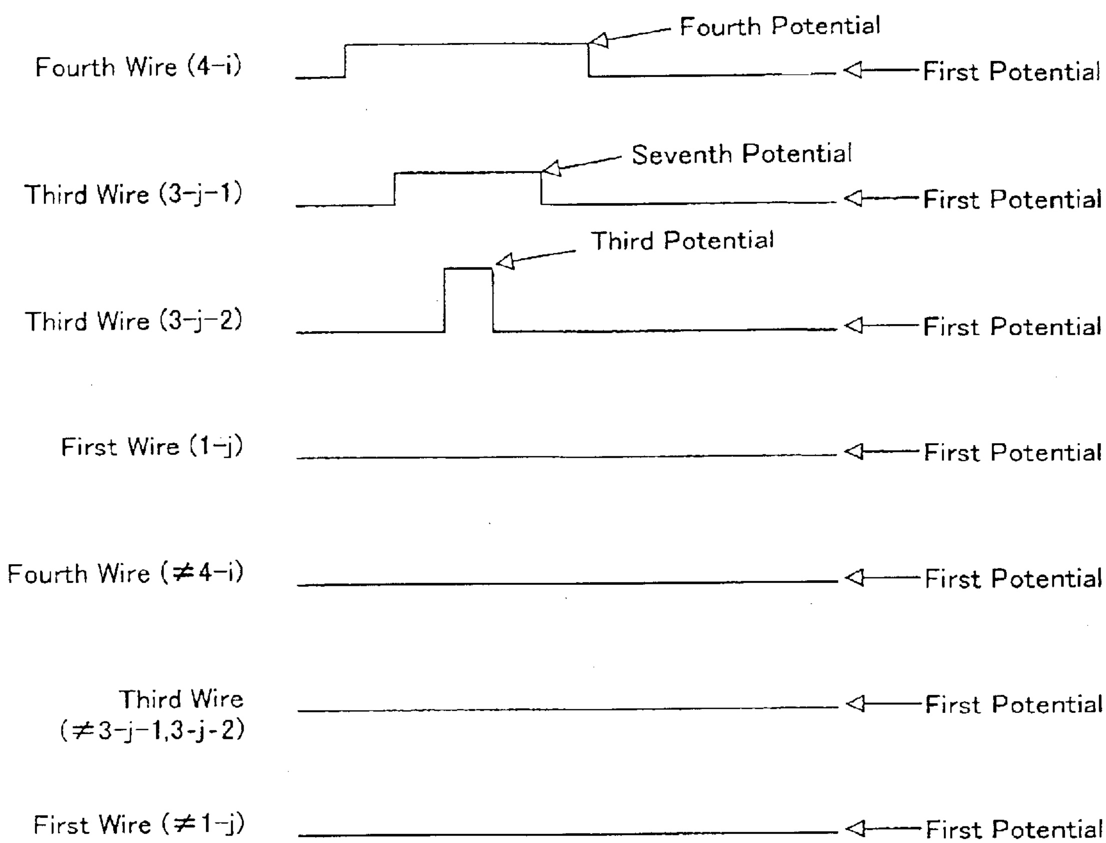

In contrast to FIG. 142, FIG. 143 shows a timing chart for writing data in the case where the selected cell is a memory cell connected to the third wire (3-*j*-2).

FIG. 143 conforms to FIG. 142 except that the seventh potential instead of the eleventh potential is applied to the third wire connected to the non-selected cell arranged in series with the selected cell. At this time, the seventh potential is equal to the eleventh potential.

FIG. 77 is an equivalent circuit diagram in the case where the selected cell is a memory cell connected to the third wire (3-*j*-2).

Figure 144:
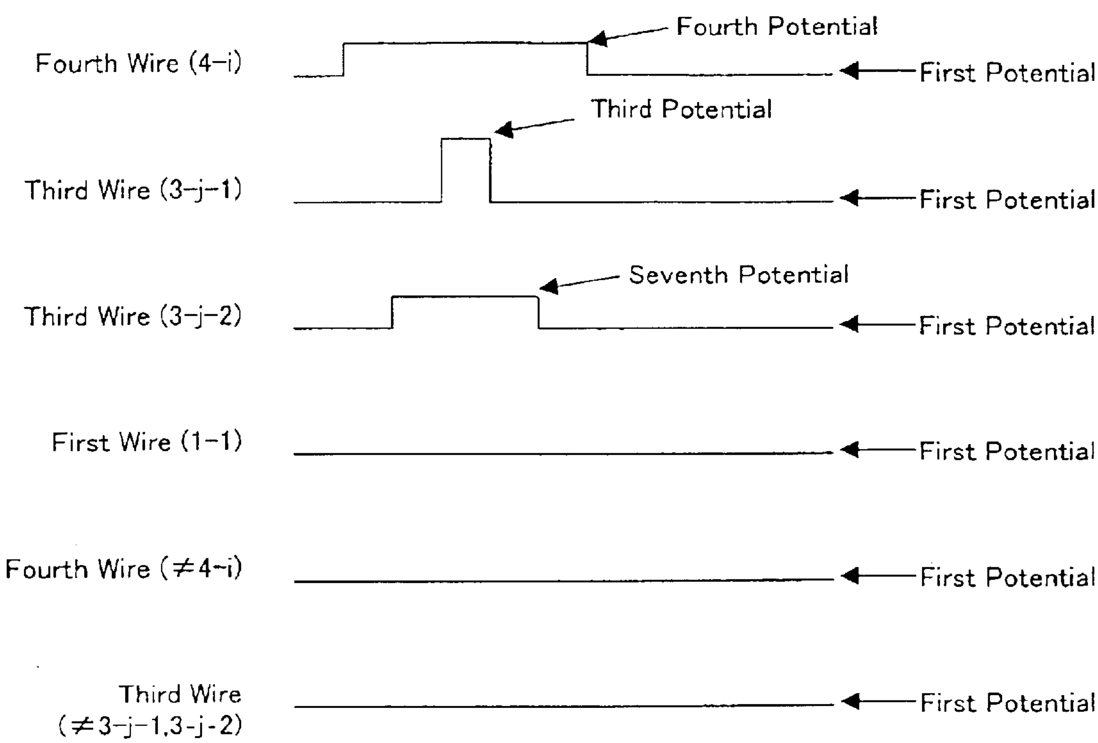

Now, FIG. 144 shows a timing chart for writing data in the case where the first wires are connected in common to the entire array. In FIG. 144, a ground potential is applied as the first potential, and the memory cell has a threshold of 5.0 V to 7.5 V when it is in the written state and has a threshold of 0.5 V to 3.0 V when it is in the erased state.

FIG. 144 conforms to FIG. 140 except that the first wire (1-1) instead of the first wire (1-*j*) is connected to the end of the island-like semiconductor layer including the selected cell.

Figure 145:
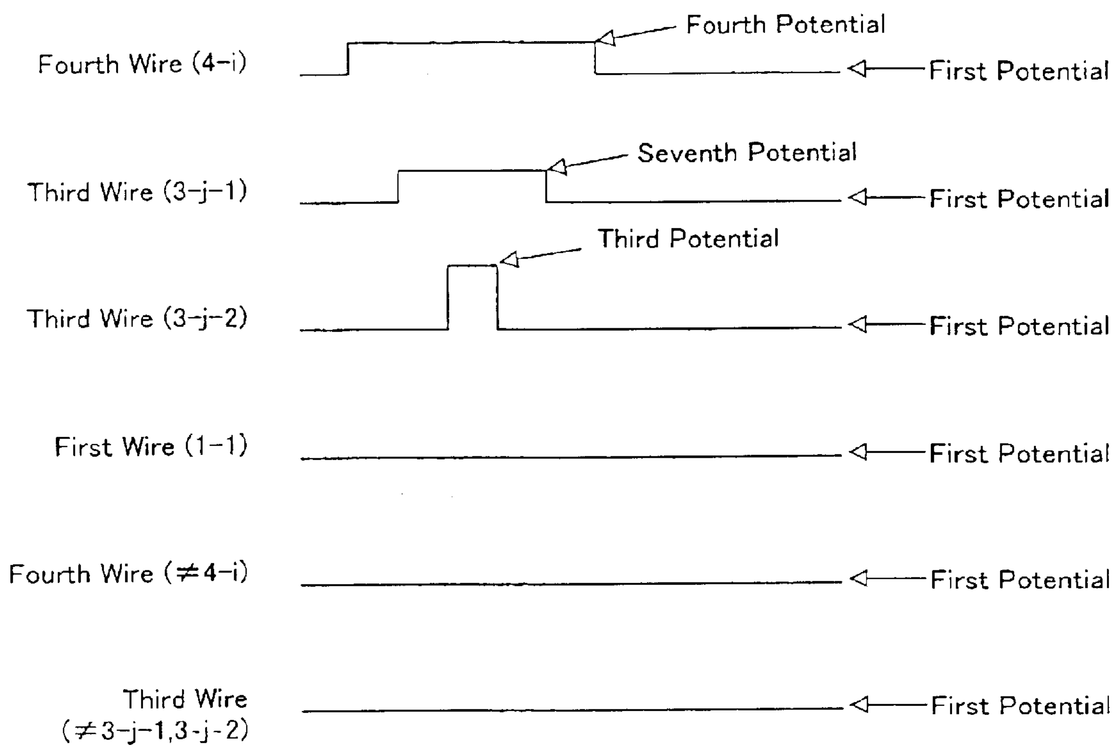

In contrast to FIG. 144, FIG. 145 shows a timing chart for writing data in the case where the selected cell is a memory cell connected to the third wire (3-*j*-2).

FIG. 145 conforms to FIG. 144 except that the seventh potential instead of the eleventh potential is applied to the third wire connected to the non-selected cell arranged in series with the selected cell. At this time, the seventh potential is equal to the eleventh potential.

FIG. 81 is an equivalent circuit diagram in the case where the selected cell is a memory cell connected to the third wire (3-*j*-2).

An erasing process is now explained with a semiconductor memory according to the present invention which is so constructed to have island-like semiconductor layers to which is connected a memory cell provided with a charge storage layer and a third electrode as a control gate electrode. The erasing process utilizes an F-N current.

FIG. 57 shows an equivalent circuit diagram of the memory cell of this structure.

For example, in the case where the island-like semiconductor layers are formed of a P-type semiconductor, a selected cell as shown in FIG. 57 is erased by applying a first potential to the first electrode connected to the island-like semiconductor layer, a third potential to the third electrode connected to the selected cell and a fourth potential to the fourth electrode connected to the island-like semiconductor layer including the selected cell. The application of these potentials causes the F-N current to occur only in a tunnel oxide film of the selected cell to change the state of a charge in the charge storage layer.

In the case where a negative charge is drawn from the charge storage layer for erasing data, for example, the fourth potential is larger than the third potential. Supposing that a "1" means that a negative charge is stored in the charge storage layer, the state of the charge in the charge storage layer is changed to a "0." At this time, the third potential is a potential allowing the change to "0" by a difference between the third potential and the fourth potential, that is, a potential allowing the occurrence of a sufficient F-N current as means for changing the state of the charge. The F-N current flows in the tunnel oxide film of a memory transistor having, as the gate electrode, the third electrode to which the third potential is applied.

In the case where the first wires (1-1 to 1-N) are formed as impurity diffusion layers in the semiconductor substrate and the channel region of a selected memory cell is electrically connected to the semiconductor substrate when the first electrode is floating, the fourth potential applied to the first electrode connected to the island-like semiconductor layer including the selected cell is a potential such that the island-like semiconductor layer are electrically floated from the semiconductor substrate by a depletion layer extended toward the semiconductor substrate owing to the application of the fourth potential. Thereby the potential of the island-like semiconductor layer equals the fourth potential and a sufficiently large F-N current flows in the tunnel oxide film of the memory transistor of the selected cell on the island-like semiconductor layer, so that data is erased.

That is, the difference between the fourth potential and the third potential becomes a potential difference allowing a sufficient F-N current to flow in the tunnel oxide film of the memory transistor. In the case where the channel region of the memory cell is not electrically connected to the semiconductor substrate, the depletion layer owing to the fourth potential may have any extension.

In the case where the first electrode is formed to be electrically insulated from the semiconductor substrate, for example, where the first electrode is formed of an impurity diffusion layer in an SOI substrate and is insulated from the semiconductor substrate by an insulating film, the first potential is not necessarily the same as the tenth potential. Erasure may be defined as changing the state of the charge in the charge storage layer and raising the threshold of the selected memory transistor. In this case, the third potential is large than the fourth potential, and the third potential is a potential allowing the state of the charge in the charge storage layer to be changed sufficiently by the difference between the third potential and the fourth potential, for example, a potential allowing the occurrence of a sufficient F-N current. Means for changing the state of the charge in the charge storage layer is not limited to the F-N current.

Now are described examples of timing charts for applying potentials for erasing data in the case where the selected cell is a memory cell having the selected third electrode as the gate electrode in island-like semiconductor layers having memory cells formed of a P-type semiconductor.

Figure 146:
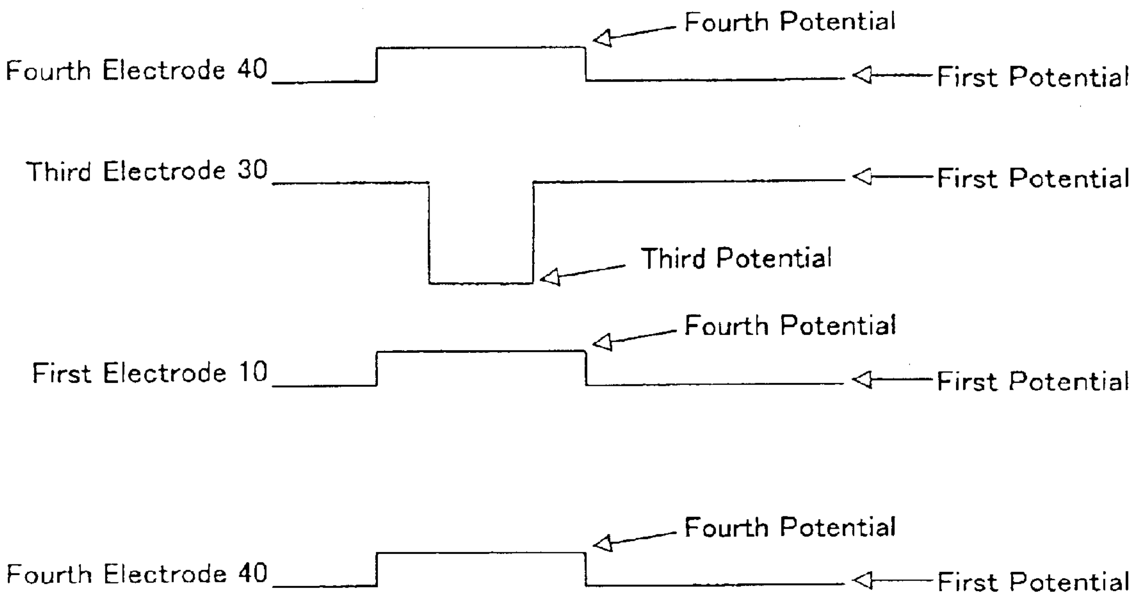

In FIG. 146, a selected third electrode as shown in FIG. 57 is negative-biased, and the memory cell has a threshold of 1.0 V to 3.5 V when it is in the written state and has a threshold of −1.0 V or lower when it is in the erased state.

For drawing a negative charge from the charge storage layer, for example, a ground potential is applied as the first potential to the first, third and fourth electrodes. The fourth potential, e.g., 6 V, is applied to the first electrode, and the fourth potential, e.g., 6 V, is applied to the fourth electrode. The third potential, e.g., −12 V, is applied to the third electrode. The selected cell is erased to "0" by sustaining this state for a desired period of time. The potentials may be applied to the respective electrodes in another order or simultaneously.

The third electrode is returned to the ground potential, i.e., the first potential, the first electrode is returned to the ground potential, i.e., the first potential, and the fourth electrode is returned to the ground potential, i.e., the first potential. The respective electrodes may be returned to the ground potential, i.e., the first potential, in another order or simultaneously. The potentials given may be any combination of potentials so long as they meet conditions for erasing a desired cell.

Here, the same potential is preferably applied initially as the first potential to the first, third and fourth electrodes, but different potentials may be applied.

Thereby the selected cell as shown in FIG. 57 is erased.

Figure 147:
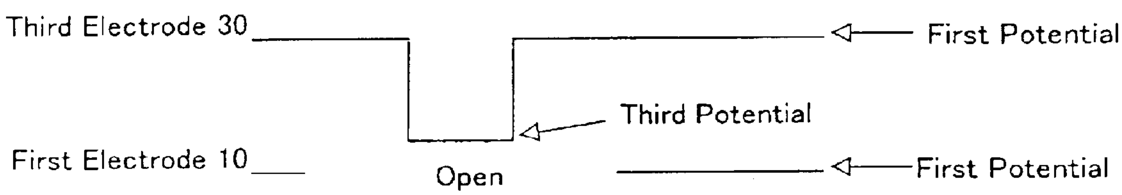

FIG. 147 shows a timing chart showing an example of timing of applying each potential for erasing data in the case where the first electrode is open in contrast to FIG. 146.

The erasing process of FIG. 147 conforms to that of FIG. 146 except that the first electrode is open, and the selected cell is erased by a potential difference between the first electrode and the fourth electrode. Also in FIG. 147, the selected cell as shown in FIG. 57 is erased.

Figure 148:
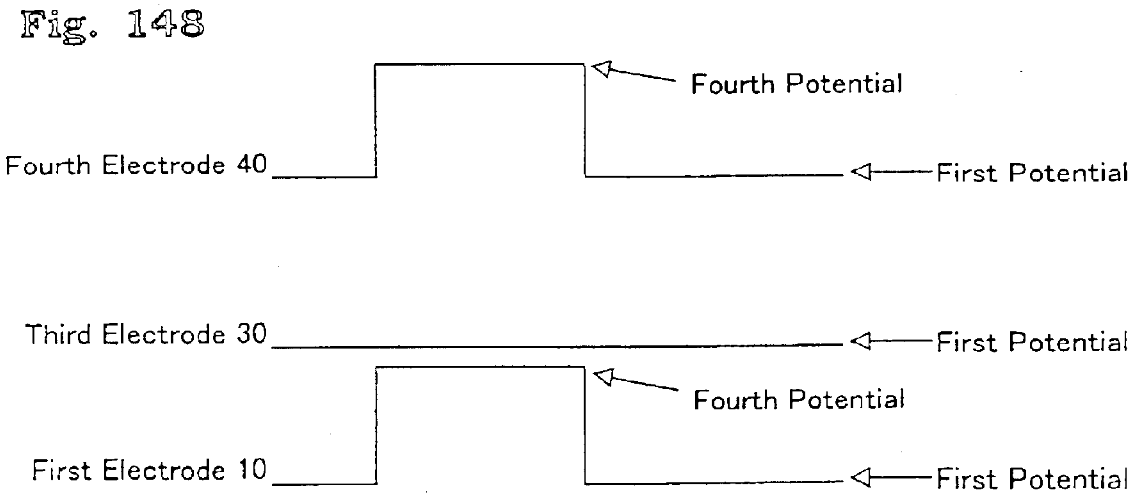

In FIG. 148, 18 V is applied to the first electrode as the fourth potential, and the memory cell has a threshold of 1.0 V to 3.5 V when it is in the written state and has a threshold of −1.0 V or lower when it is in the erased state.

For drawing a negative charge from the charge storage layer, for example, the ground potential as the first potential is applied to the first, third and fourth electrodes. In this state, the fourth potential, e.g., 18 V, is applied to the first electrode, and the fourth potential, e.g., 18 V, is applied to the fourth electrode. The third potential, e.g., the ground potential which is the first potential, is kept applied to the third electrode. The selected cell is erased to "0" by sustaining this state for a desired period of time. The potentials may be applied to the respective electrodes in another order or simultaneously.

The fourth electrode is returned to the ground potential, i.e., the first potential. The respective electrodes may be returned to the ground potential, i.e., the first potential, in another order or simultaneously. The potentials given may be any combination of potentials so long as they meet conditions for erasing a desired cell.

Here, the same potential is preferably applied initially as the first potential to the first, third and fourth electrodes, but different potentials may be applied. Thereby the selected cell as shown in FIG. 57 is erased.

An erasing process is now explained with a semiconductor memory according to the present invention which is constructed to include island-like semiconductor layers each having, as selection gate transistors, the transistor provided with the second electrode as a gate electrode and a transistor provide with the fifth electrode as a gate electrode and a plurality of (e.g., L, wherein L is a positive integer) memory cells connected in series, the memory cells each being provided with the charge storage layer between the selection gate transistors and the third electrode as a control gate electrode. The erasing process utilizes an F-N current.

FIG. 58 shows an equivalent circuit diagram of the memory cell of this structure.

For example, in the case where the island-like semiconductor layers are formed of a P-type semiconductor, a selected cell as shown in FIG. 58 is erased by applying a first potential to a first electrode 10 connected to an island-like semiconductor layer including the selected cell, a second potential to a second electrode 20 arranged in series with the selected cell, a third potential to a third electrode (30-*h*, wherein h is a positive integer, 1≦h≦L) connected to the selected cell, a seventh potential to third electrodes (30-1 to 30-(h−1)) connected to non-selected cells arranged in series with the selected cell, an eleventh potential to third electrodes (30-(h+1) to 30-L) connected to non-selected cells arranged in series with the selected cell, a fourth potential to the fourth electrode 40 connected to the island-like semiconductor layer including the selected cell, and a fifth potential to the fifth electrode 50 arranged in series with the selected cell. The application of these potentials causes the F-N current to occur only in the tunnel oxide film of the selected cell to change the state of the charge in the charge storage layer.

In the case where a negative charge is drawn from the charge storage layer for erasing data, for example, the fourth potential is larger than the third potential. Supposing that the "1" means that a negative charge is stored in the charge storage layer, the state of the charge in the charge storage layer is changed to the "0." At this time, the third potential is a potential allowing the change to "0" by the difference between the third potential and the fourth potential, that is, a potential allowing the occurrence of a sufficient F-N current as means for changing the state of the charge. The F-N current flows in the tunnel oxide film of a memory transistor having, as the gate electrode, the third electrode to which the third potential is applied. The first electrode 10 may be open.

In the case where the first electrode 10 is formed as an impurity diffusion layer in the semiconductor substrate and the channel region of a selected memory cell is electrically connected to the semiconductor substrate when the potential of the first electrode is floating, the fourth potential applied to the first electrode 10 connected to the island-like semiconductor layer including the selected cell is a potential such that the island-like semiconductor layer and the semiconductor substrate are electrically floated by the depletion layer extended toward the semiconductor substrate owing to the application of the fourth potential. Thereby the potential of the island-like semiconductor layer equals the fourth potential and a sufficiently large F-N current flows in the tunnel oxide film of the memory transistor of the selected cell on the island-like semiconductor layer, so that data is erased.

That is, the difference between the fourth potential and the third potential becomes a potential difference allowing a sufficient F-N current to flow in the tunnel oxide film of the memory transistor.

In the case where the channel region of the memory cell is not electrically connected to the semiconductor substrate, the depletion layer owing to the fourth potential may have any extension. The seventh potential is a potential causing a sufficiently smaller change in the state of the charge in the charge storage layers in non-selected cells than in the selected cell, for example, a potential such that a difference between the seventh potential and the fourth potential causes only a sufficiently small F-N current in the tunnel oxide films of the memory transistors having, as the gate electrodes, the third electrodes (30-1 to 30-(h−1)) to which the seventh potential is applied.

The eleventh potential is a potential causing a sufficiently smaller change in the state of the charge in the charge storage layers in non-selected cells than in the selected cell, for example, a potential such that a difference between the eleventh potential and the fourth potential causes only a sufficiently small F-N current in the tunnel oxide films of the memory transistors having, as the gate electrodes, the third electrodes (30-(h+1) to 30-L) to which the eleventh potential is applied.

The second potential is a potential not allowing the F-N current to flow in the gate oxide film of the transistor having the second electrode 20 as the gate electrode.

The fifth potential is a potential not allowing the F-N current to flow in the gate oxide film of the transistor having the fifth electrode 50 as the gate electrode.

In the case where the first electrode is formed to be electrically insulated from the semiconductor substrate, for example, where the first electrode is formed of an impurity diffusion layer in an SOI substrate and is insulated from the semiconductor substrate by an insulating film, the first potential is not necessarily the same as the tenth potential.

In the case where the channel region of a selected memory cell is electrically connected to the semiconductor substrate, for example, in the case where impurity diffusion layers do not render the island-like semiconductor layers in the floating state from the substrate, the tenth potential applied to the semiconductor substrate can erase simultaneously all memory cells having as the gate electrodes the third electrodes to which the third potential is applied, provided that a difference between the tenth potential and the third potential causes a sufficient change in the state of the charge in the charge storage layer.

The memory cells may be sequentially erased from a memory cell connected to a third electrode (3-L) to a memory cell connected to a third electrode (3-1), or may be erased in reverse order or at random.

Erasure may be defined as changing the state of the charge in the charge storage layer and raising the threshold of the selected memory transistor. In this case, the third potential is large than the fourth potential, and the third potential is a potential allowing the state of the charge in the charge storage layer to be changed sufficiently by the difference between the third potential and the fourth potential, for example, a potential allowing the occurrence of a sufficient F-N current. Means for changing the state of the charge in the charge storage layer is not limited to the F-N current.

Now are described examples of timing charts for applying potentials for erasing data in the case where there are arranged M×N (M and N are positive integers) island-like semiconductor layers having a plurality of (e.g., L wherein L is a positive integer) memory cells formed of the P-type semiconductor and arranged in series and the selected cell is a memory cell having the selected third electrode as the gate electrode. In the case where the selected cell is a memory cell having the selected third electrode as the gate electrode in island-like semiconductor layers having memory cells formed of a P-type semiconductor.

Figure 149:
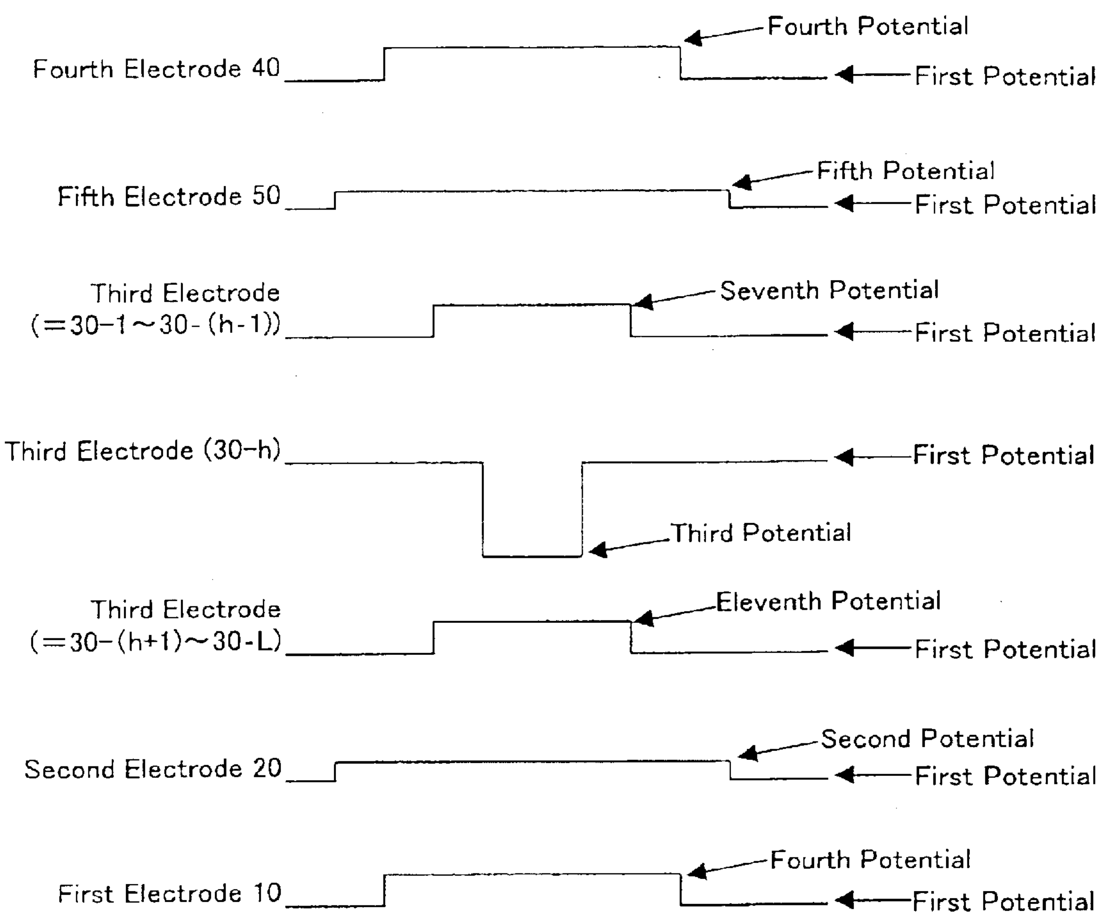

In FIG. 149, a selected third electrode as shown in FIG. 58 is negative-biased, the threshold of the transistors having the second and fifth electrodes as the gate electrodes is 0.5 V, for example, and the memory cell has a threshold of 1.0 V to 3.5 V when it is in the written state and has a threshold of −1.0 V or lower when it is in the erased state.

For drawing a negative charge from the charge storage layer, for example, a ground potential is applied as the first potential to the first electrode 10, the second electrode 20, the third electrodes (30-1 to 30-L), the fourth electrode 40 and the fifth electrode 50. In this state, the second potential, e.g., 6 V, is applied to the second electrode 20, the fifth potential, e.g., 6 V, is applied to the fifth electrode 50, the fourth potential, e.g., 6 V, is applied to the first electrode 10, the fourth potential, e.g., 6 V, is applied to the fourth electrode 40, the seventh potential, e.g., 6 V, is applied to third electrodes (30-1 to 30-(h−1)) (h is a positive integer, 1≦h≦L) other than the third electrode (30-*h*), the eleventh potential, e.g., 6 V, is applied to third electrodes (30-(h+1) to 30-L) (h is a positive integer, 1≦h≦L), and the third potential, e.g., −12 V, is applied to the third electrode (30-*h*). The selected cell is erased to "0" by sustaining this state for a desired period of time. The potentials may be applied to the respective electrodes in another order or simultaneously. The third electrode (30-*h*) is returned to the ground potential, i.e., the first potential; the third electrodes (not 30-*h*) other than the third electrode (30-*h*) are returned to the ground potential, i.e., the first potential; the fourth electrode 40 is returned to the ground potential, i.e., the first potential; the first electrode 10 is returned to the ground potential, i.e., the first potential; the second electrode 20 is returned to the ground potential, i.e., the first potential; and the fifth electrode 50 is returned to the ground potential, i.e., the first potential. The respective electrodes may be returned to the ground potential in another order or simultaneously. The potentials given may be any combination of potentials so long as they meet conditions for erasing a desired cell.

The ground potential may be applied as the second potential, and the ground potential may be applied as the fifth potential to the fifth electrode 50.

Here, the same potential is preferably applied initially as the first potential to the first electrode 10, the second electrode 20, the third electrodes (30-1 to 30-L), the fourth electrode 40 and the fifth electrode 50, but different potentials may be applied.

Thereby the selected cell as shown in FIG. 58 is erased.

In the above example, the erasing process has been described with the case where the selected cell is a memory cell having the third electrode (30-*h*) as the gate electrode. However, the erasing process is the same with the case where the selected cell is a memory cell having a third electrode other than the third electrode (30-*h*) as the gate electrode.

Figure 150:
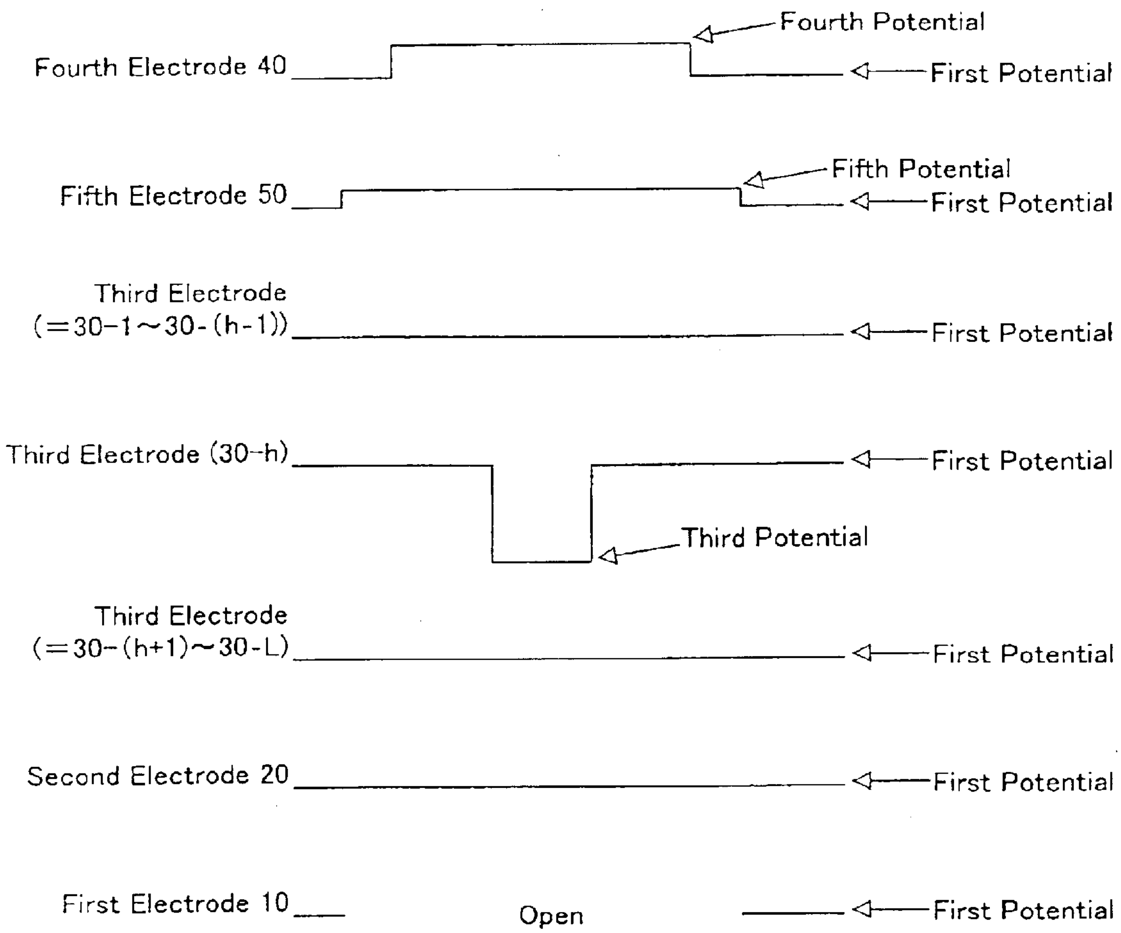

FIG. 150 shows a timing chart showing an example of timing of applying each potential for erasing data in the case where the first electrode is open in contrast to FIG. 149.

The erasing process of FIG. 150 conforms to that of FIG. 149 except that the first electrode is open and the ground potential is applied as the first potential to the non-selected electrodes (not 30-*h*, h is a positive integer, 1≦h≦L) and the fourth electrode 40. Also in FIG. 150, the selected cell as shown in FIG. 58 is erased.

Figure 59:
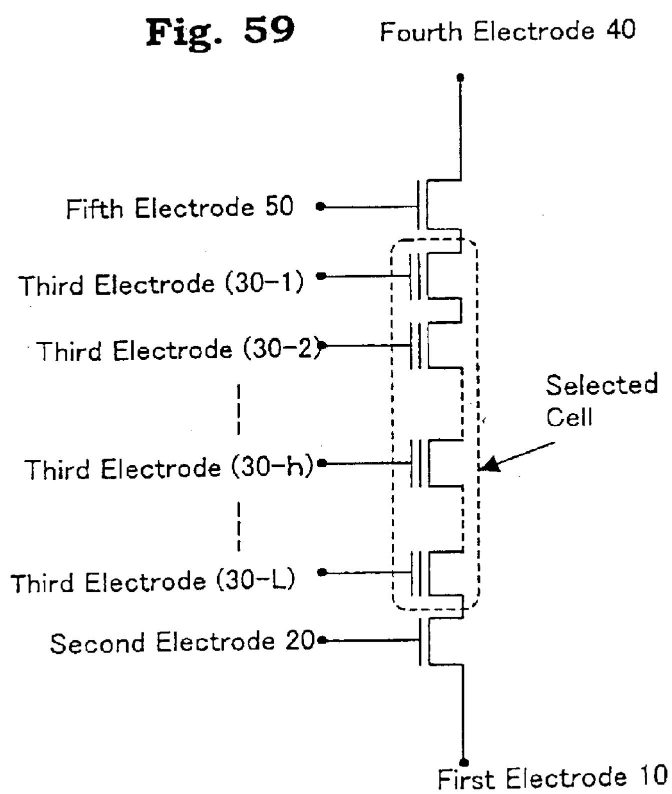

If −12 V is applied as the third potential to the third electrodes (30-1 to-30-(h−1)) and the third electrodes (30-(h−1) to 30-L), a plurality of cells connected to the third electrodes (30-1 to 30-L) as shown in FIG. 59 are erased.

Figure 151:
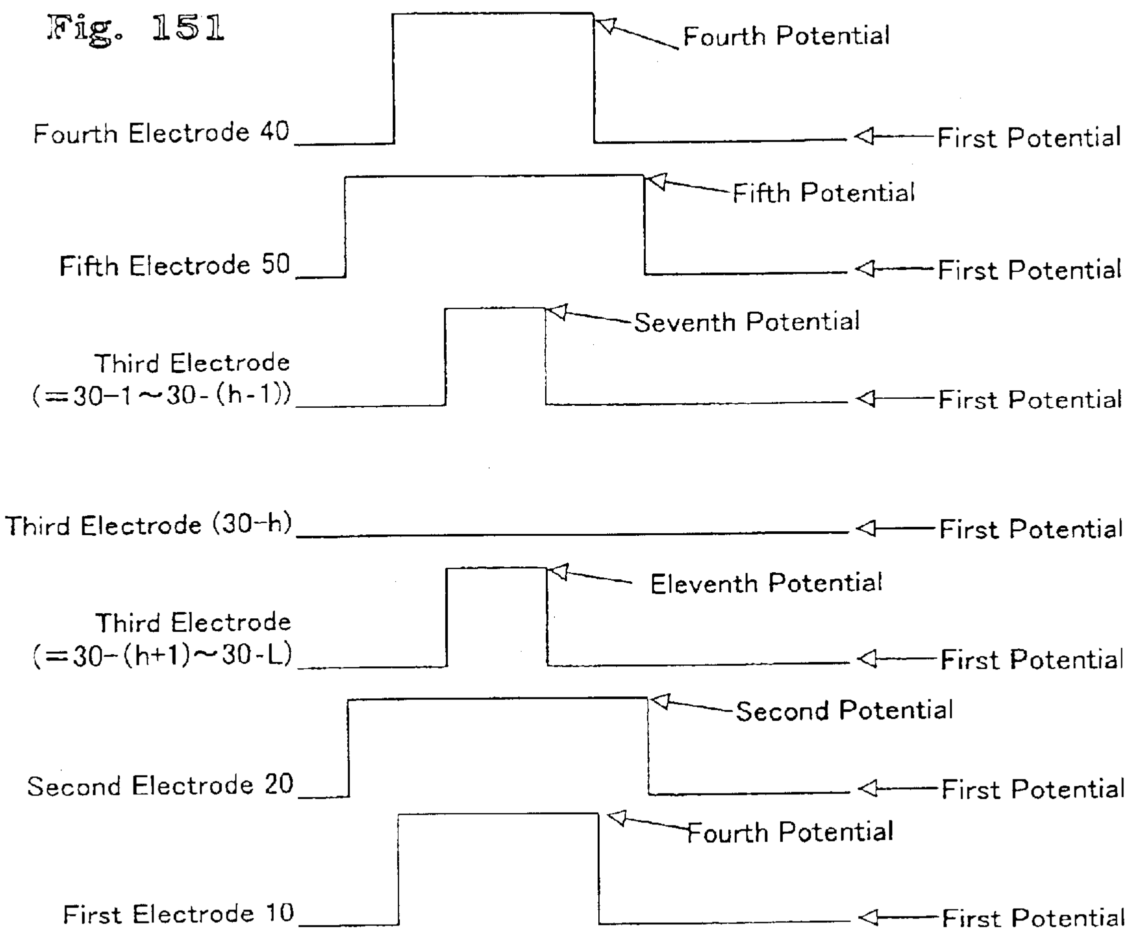

In FIG. 151, the fourth potential, e.g., 18 V, is applied to the first electrode, the threshold of the transistors having the second and fifth electrodes as the gate electrodes is 0.5 V, for example, and the memory cell has a threshold of 1.0 V to 3.5 V when it is in the written state and has a threshold of −1.0 V or lower when it is in the erased state.

For drawing a negative charge from the charge storage layer, for example, a ground potential is applied as the first potential to the first electrode 10, the second electrode 20, the third electrodes (30-1 to 30-L), the fourth electrode 40 and the fifth electrode 50. In this state, the second potential, e.g., 18 V, is applied to the second electrode 20, the fifth potential, e.g., 18 V, is applied to the fifth electrode 50, the fourth potential, e.g., 18 V, is applied to the fourth electrode 40, the fourth potential, e.g., 18 V, is applied to the first electrode 10, the seventh potential, e.g., 10 V, is applied to third electrodes (30-1 to 30-(h−1)) (h is a positive integer, 1≦h≦L) other than the third electrode (30-*h*), the eleventh potential, e.g., 10 V, is applied to third electrodes (30-(h+1) to 30-L) (h is a positive integer, 1≦h≦L), and the third potential, e.g., the ground potential which is the first potential, is kept applied to the third electrode (30-*h*). The selected cell is erased to "0" by sustaining this state for a desired period of time. The potentials may be applied to the respective electrodes in another order or simultaneously.

The third electrodes (not 30-*h*) other than the third electrode (30-*h*) are returned to the ground potential, i.e., the first potential, the fourth electrode 40 is returned to the ground potential, i.e., the first potential, the first electrode 10 is returned to the ground potential, i.e., the first potential, and the second electrode 20 and the fifth electrode 50 are returned to the ground potential, i.e., the first potential. The respective electrodes may be returned to the ground potential in another order or simultaneously. The potentials given may be any combination of potentials so long as they meet conditions for erasing a desired cell.

Here, the same potential is preferably applied initially as the first potential to the first electrode 10, the second electrode 20, the third electrodes (30-1 to 30-L), the fourth electrode 40 and the fifth electrode 50, but different potentials may be applied. Thereby the selected cell as shown in FIG. 58 is erased.

In the above example, the erasing process has been described with the case where the selected cell is a memory cell having the third electrode (30-*h*) as the gate electrode. However, the erasing process is the same with the case where the selected cell is a memory cell having a third electrode other than the third electrode (30-*h*) as the gate.

Figure 152:
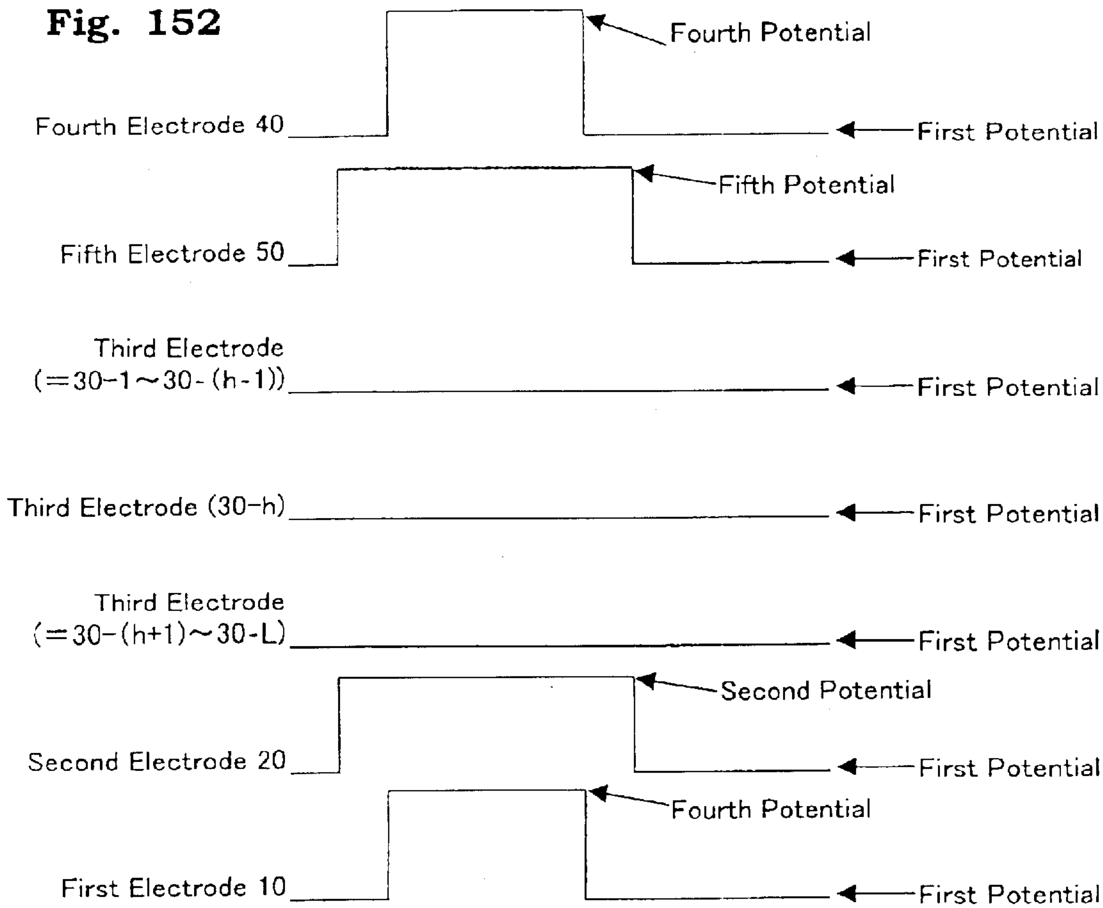

As shown in FIG. 152 illustrating a timing of applying each potential, if 18 V is applied as the third potential to the third electrodes (30-1 to 30-(h−1)) and the third electrodes (30-(h−1) to 30-L), a plurality of cells connected to the third electrodes (30-1 to 30-L) as shown in FIG. 59 are erased.

An erasing process is now explained with a semiconductor memory according to the present invention which is constructed to include island-like semiconductor layers each having, for example, two memory cells connected in series, the memory cells each being provided with the charge storage layer and the third electrode as a control gate electrode. The erasing process utilizes the F-N current.

FIG. 60 shows an equivalent circuit diagram of the memory cell of this structure.

For example, in the case where the island-like semiconductor layers are formed of a P-type semiconductor, a selected cell as shown in FIG. 60 is erased by applying a first potential to a first electrode 10 connected to an island-like semiconductor layer including the selected cell, a second potential to a second electrode 20 arranged in series with the selected cell, a third potential to a third electrode (30-1) connected to the selected cell, an eleventh potential to third electrode (30-2) connected to a non-selected cell arranged in series with the selected cell, a fourth potential to the fourth electrode 40 connected to the island-like semiconductor layer including the selected cell, and a fifth potential to the fifth electrode 50 arranged in series with the selected cell. The application of these potentials causes the F-N current to occur only in the tunnel oxide film of the selected cell to change the state of the charge in the charge storage layer.

In the case where a negative charge is drawn from the charge storage layer for erasing data, for example, the fourth potential is larger than the third potential. Supposing that the "1" means that a negative charge is stored in the charge storage layer, the state of the charge in the charge storage layer is changed to the "0." At this time, the third potential is a potential allowing the change to "0" by the difference between the third potential and the fourth potential, that is, a potential allowing the occurrence of a sufficient F-N current as means for changing the state of the charge. The F-N current flows in the tunnel oxide film of a memory transistor having, as the gate electrode, the third electrode to which the third potential is applied. The first electrode 10 may be open.

In the case where the first electrode 10 is formed as an impurity diffusion layer in the semiconductor substrate and the channel region of a selected memory cell is electrically connected to the semiconductor substrate when the potential of the first electrode 10 is floating, the fourth potential applied to the first electrode 10 connected to the island-like semiconductor layer including the selected cell is a potential such that the island-like semiconductor layer and the semiconductor substrate are electrically floated by the depletion layer extended toward the semiconductor substrate owing to the application of the fourth potential. Thereby the potential of the island-like semiconductor layer equals the fourth potential and a sufficiently large F-N current flows in the tunnel oxide film of the memory transistor of the selected cell on the island-like semiconductor layer, so that data is erased.

That is, the difference between the fourth potential and the third potential becomes a potential difference allowing a sufficient F-N current to flow in the tunnel oxide film of the memory transistor.

In the case where the channel region of the memory cell is not electrically connected to the semiconductor substrate, the depletion layer owing to the fourth potential may have any extension.

The eleventh potential is a potential causing a sufficiently smaller change in the state of the charge in the charge storage layers in non-selected cells than in the selected cell, for example, a potential such that a difference between the eleventh potential and the fourth potential causes only a sufficiently small F-N current in the tunnel oxide film of the memory transistor having, as the gate electrode, the third electrode (30-2) to which the eleventh potential is applied.

In the case where the first electrode is formed to be electrically insulated from the semiconductor substrate, for example, where the first electrode is formed of an impurity diffusion layer in an SOI substrate and is insulated from the semiconductor substrate by an insulating film, the first potential is not necessarily the same as the tenth potential.

In the case where the channel region of a selected memory cell is electrically connected to the semiconductor substrate, for example, in the case where impurity diffusion layers do not render the island-like semiconductor layers in the floating state from the substrate, the tenth potential applied to the semiconductor substrate can erase simultaneously all memory cells having as the gate electrodes the third electrodes to which the third potential is applied, provided that a difference between the tenth potential and the third potential causes a sufficient change in the state of the charge in the charge storage layer.

The memory cells may be sequentially erased from a memory cell connected to a third electrode (30-2) to a memory cell connected to a third electrode (30-1), or may be erased in reverse order or at random.

Erasure may be defined as changing the state of the charge in the charge storage layer and raising the threshold of the selected memory transistor. In this case, the third potential is large than the fourth potential, and the third potential is a potential allowing the state of the charge in the charge storage layer to be changed sufficiently by the difference between the third potential and the fourth potential, for example, a potential allowing the occurrence of a sufficient F-N current. Means for changing the state of the charge in the charge storage layer is not limited to the F-N current.

Now are described examples of timing charts for applying potentials for erasing data in the case where island-like semiconductor layers having two memory cells formed of the P-type semiconductor and arranged in series and the selected cell is a memory cell having the selected third electrode as the gate electrode.

Figure 153:
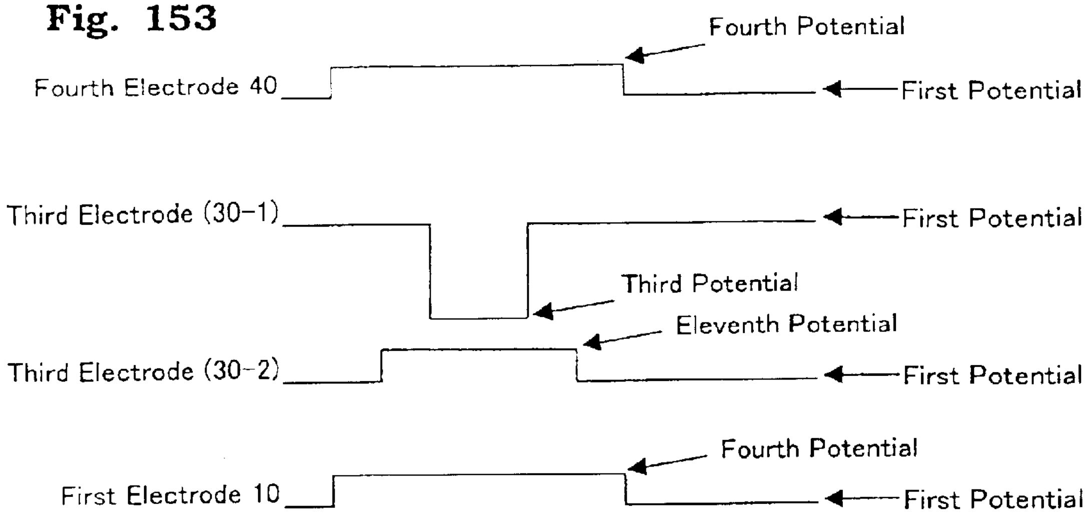

In FIG. 153, a selected third electrode as shown in FIG. 60 is negative-biased, and the memory cell has a threshold of 1.0 V to 3.5 V when it is in the written state and has a threshold of −1.0 V or lower when it is in the erased state.

For drawing a negative charge from the charge storage layer, for example, a ground potential is applied as the first potential to the first electrode 10, the third electrodes (30-1 to 30-2) and the fourth electrode 40. In this state, the fourth potential, e.g., 6 V, is applied to the first electrode 10, the fourth potential, e.g., 6 V, is applied to the fourth electrode 40, the eleventh potential, e.g., 6 V, is applied to the third electrode (30-2), and the third potential, e.g., −12 V, is applied to the third electrode (30-1). The selected cell is erased to "0" by sustaining this state for a desired period of time. The potentials may be applied to the respective electrodes in another order or simultaneously.

The third electrode (30-1) is returned to the ground potential, i.e., the first potential, the third electrode (30-2) is returned to the ground potential, i.e., the first potential, the fourth electrode 40 is returned to the ground potential, i.e., the first potential, and the first electrode 10 is returned to the ground potential, i.e., the first potential. The respective electrodes may be returned to the ground potential in another order or simultaneously. The potentials given may be any combination of potentials so long as they meet conditions for erasing a desired cell.

The eleventh potential is a potential causing a sufficiently smaller change in the state of the charge in the charge storage layers in the non-selected cell than in the selected cell, for example, a potential such that a difference between the eleventh potential and the fourth potential causes only a sufficiently small F-N current in the tunnel oxide film of the memory transistor having, as the gate electrode, the third electrode (30-2) to which the eleventh potential is applied.

Here, the same potential is preferably applied initially as the first potential to the first electrode 10, the third electrodes (30-1 to 30-2), and the fourth electrode 40, but different potentials may be applied.

Thereby the selected cell as shown in FIG. 60 is erased.

In the above example, the erasing process has been described with the case where the selected cell is a memory cell having the third electrode (30-1) as the gate electrode. However, the erasing process is the same with the case where the selected cell is a memory cell having the third electrode (30-2) as the gate electrode.

Figure 154:
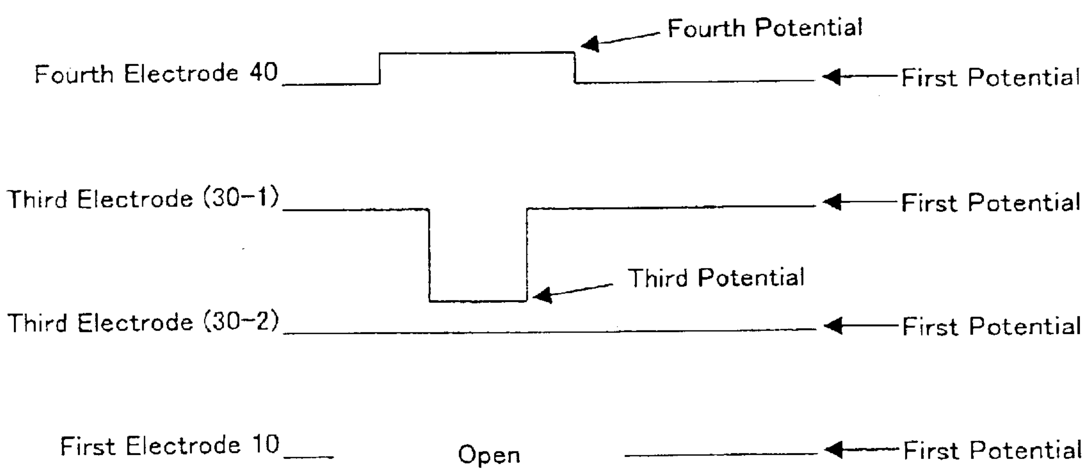

FIG. 154 shows a timing chart showing an example of timing of applying each potential for erasing data in the case where the first electrode is open in contrast to FIG. 153.

The erasing process of FIG. 154 conforms to that of FIG. 153 except that the first electrode 10 is open and the ground potential is applied as the first potential to the non-selected electrode (30-2) and the fourth electrode 40. Also in FIG. 153, the selected cell as shown in FIG. 60 is erased.

Figure 61:
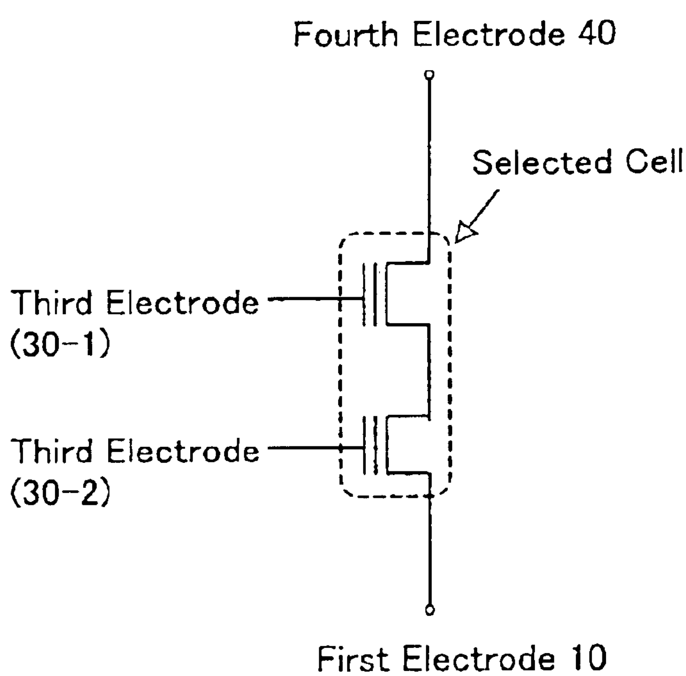

If −12 V is applied as the third potential to the third electrodes (30-1 to 30-2), a plurality of cells connected to the third electrodes (30-1 to 30-2) as shown in FIG. 61 are erased.

Figure 155:
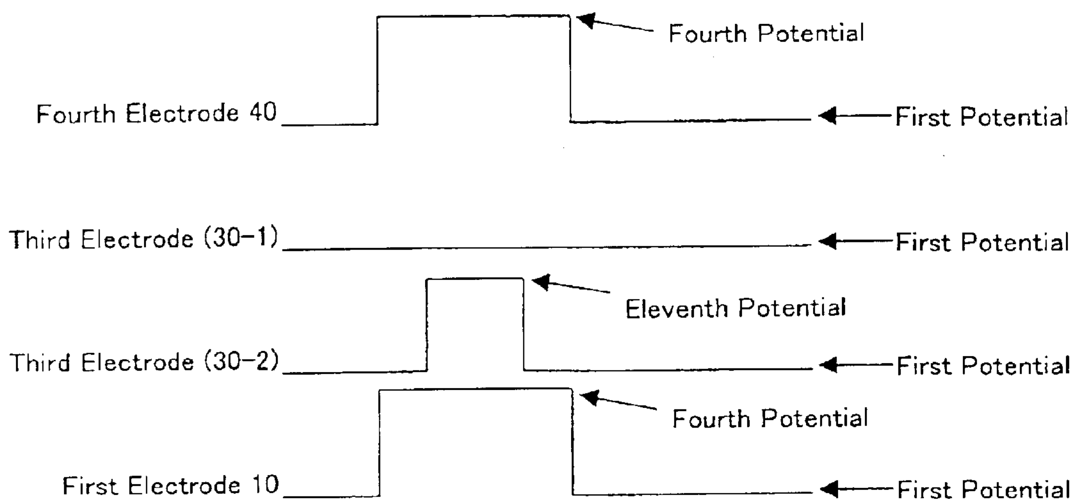

In FIG. 155, the fourth potential, e.g., 18 V, is applied to the first electrode, and the memory cell has a threshold of 1.0 V to 3.5 V when it is in the written state and has a threshold of −1.0 V or lower when it is in the erased state.

For drawing a negative charge from the charge storage layer, for example, a ground potential is applied as the first potential to the first electrode 10, the third electrodes (30-1 to 30-2) and the fourth electrode 40. In this state, the fourth potential, e.g., 18 V, is applied to the fourth electrode 40, the fourth potential, e.g., 18 V, is applied to the first electrode 10, the eleventh potential, e.g., 10 V, is applied to the third electrode (30-2), and the third potential, e.g., the ground potential which is the first potential, is kept applied to the third electrode (30-1). The selected cell is erased to "0" by sustaining this state for a desired period of time. The potentials may be applied to the respective electrodes in another order or simultaneously.

The third electrode (30-2) is returned to the ground potential, i.e., the first potential, the fourth electrode 40 is returned to the ground potential, i.e., the first potential, and the first electrode 10 is returned to the ground potential, i.e., the first potential. The respective electrodes may be returned to the ground potential in another order or simultaneously. The potentials given may be any combination of potentials so long as they meet conditions for erasing a desired cell.

Here, the same potential is preferably applied initially as the first potential to the first electrode 10, the third electrodes (30-1 to 30-2), and the fourth electrode 40, but different potentials may be applied. Thereby the selected cell as shown in FIG. 60 is erased.

In the above example, the erasing process has been described with the case where the selected cell is a memory cell having the third electrode (30-1) as the gate electrode. However, the erasing process is the same with the case where the selected cell is a memory cell having the third electrode (30-2) as the gate electrode.

Figure 156:
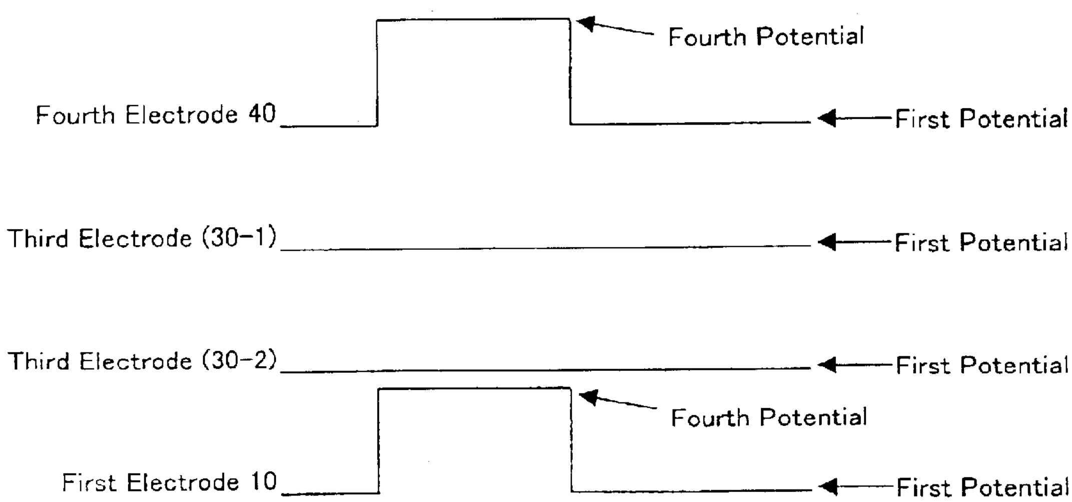

As shown in FIG. 156 illustrating a timing of applying each potential, if 18 V is applied as the third potential to the third electrodes (30-1 to 30-2), a plurality of cells connected to the third electrodes (30-1 to 30-2) as shown in FIG. 61 are erased.

An erasing process is now explained with a semiconductor memory according to the present invention which is constructed to include a plurality of (e.g., M×N, wherein M and N are positive integers) island-like semiconductor layers each having, as selection gate transistors, a transistor provided with the second electrode as a gate electrode and a transistor provide with the fifth electrode as a gate electrode and a plurality of (e.g., L, wherein L is a positive integer) memory cells connected in series, the memory cells each provided with the charge storage layer between the selection gate transistors and the third electrode as a control gate electrode. In this memory cell array, a plurality of (e.g., M) fourth wires arranged in parallel with the semiconductor substrate are connected to end portions of the island-like semiconductor layers, and first wires are connected to opposite end portions of the island-like semiconductor layers. A plurality of (e.g., N×L) third wires are arranged in a direction crossing the fourth wires and are connected to the third electrodes of the memory cells. The erasing process utilizes the F-N current.

FIG. 62 shows an equivalent circuit diagram of the above-described memory cell array in which the first wires are arranged in parallel to the third wires.

For example, in the case where the island-like semiconductor layers are formed of a P-type semiconductor, a selected cell shown in FIG. 62 is erased by applying a first potential to the first wire (1-*j*, wherein j is a positive integer, 1≦j≦N) connected to the first electrode connected to an island-like semiconductor layer including the selected cell, a ninth potential to first wires (not 1-*j*) other than the above-mentioned first wire (1-*j*), a second potential to a second wire (2-*j*) connected to the second electrode arranged in series with the selected cell, a third potential to a third wire (3-*j*-h, wherein h is a positive integer, 1≦h≦N) connected to the selected cell, a seventh potential to third wires (3-*j*-1 to 3-*j*-(h−1)) connected to non-selected cells arranged in series with the selected cell, an eleventh potential to third wires (3-*j*-(h+1) to 3-*j*-L) connected to non-selected cells arranged in series with the selected cell, a twelfth potential to third wires (not 3-*j*-1 to 3-*j*-L) not arranged in series with the selected cell, a fourth potential to a fourth wire (4-*i*, wherein i is a positive integer, 1≦i≦M) connected to the fourth electrode connected to the island-like semiconductor layer including the selected cell, an eighth potential to fourth wires (not 4-*i*) other than the above-mentioned fourth wire (4-*i*), a fifth potential to a fifth wire (5-*j*) connected to the fifth electrode arranged in series with the selected cell, and a sixth potential to at least either second wires (not 2-*j*) other than the second wire (2-*j*) or fifth wires (not 5-*j*) other than the fifth wire (5-*j*). The application of these potentials causes the F-N current to occur only in the tunnel oxide film of the selected cell to change the state of the charge in the charge storage layer.

In the case where a negative charge is drawn from the charge storage layer for erasing data, for example, the fourth potential is larger than the third potential. Supposing that the "1" means that a negative charge is stored in the charge storage layer, the state of the charge in the charge storage layer is changed to the "0." At this time, the third potential is a potential allowing the change to "0" by the difference between the third potential and the fourth potential, that is, a potential allowing the occurrence of a sufficient F-N current as means for changing the state of the charge. The F-N current flows in the tunnel oxide film of a memory transistor having, as the gate electrode, the third electrode to which the third potential is applied.

The seventh potential is a potential causing a sufficiently smaller change in the state of the charge in the charge storage layers in non-selected cells than in the selected cell, for example, a potential such that a difference between the seventh potential and the fourth potential causes only a sufficiently small F-N current in the tunnel oxide films of the memory transistors having, as the gate electrodes, the third electrodes connected to the third wires (30-*j*-1 to 30-*j*-(h−1)) to which the seventh potential is applied.

The eleventh potential is a potential causing a sufficiently smaller change in the state of the charge in the charge storage layers in non-selected cells than in the selected cell, for example, a potential such that a difference between the eleventh potential and the fourth potential causes only a sufficiently small F-N current in the tunnel oxide films of the memory transistors having, as the gate electrodes, the third electrodes connected to the third wires (30-*j*-(h+1) to 30-*j*-L) to which the eleventh potential is applied.

The second potential is a potential not allowing the F-N current to flow in the gate oxide film of the transistor having, as the gate electrode, the second electrode connected to the second wire.

The fifth potential is a potential not allowing the F-N current to flow in the gate oxide film of the transistor having, as the gate electrode, the fifth electrode connected to the fifth wire.

The sixth potential, as the second potential and the fifth potential, is a potential not allowing the F-N current to flow in the gate oxide film of the transistor having the second or fifth electrode as the gate electrode.

The eighth potential is preferably a potential equal to the fourth or ninth potential applied to the terminal connected via an island-like semiconductor layer.

The twelfth potential is a potential causing a sufficiently smaller change in the state of the charge in the charge storage layers in non-selected cells than in the selected cell, for example, a potential such that a difference between the twelfth potential and the eighth potential and a difference between the twelfth potential and the fourth potential cause only a sufficiently small F-N current in the tunnel oxide films of the memory transistors having, as the gate electrodes, the third electrodes connected to the third wires (not 3-*j*-1 to 30-*j*-L) to which the twelfth potential is applied.

The first wires (1-1 to 1-M) may be open-and the ninth potential may be open. In the case where the first wires (1-1 to 1-N) are formed as impurity diffusion layers in the semiconductor substrate and the channel region of a selected memory cell is electrically connected to the semiconductor substrate when the potential of the first wires (1-1 to 1-N) is floating, the fourth potential applied to the first wire (1-*j*) connected to the island-like semiconductor layer including the selected cell is a potential such that the island-like semiconductor layer and the semiconductor substrate are electrically floated by a depletion layer extended toward the semiconductor substrate owing to the application of the fourth potential. Thereby the potential of the island-like semiconductor layer equals the fourth potential and a sufficiently large F-N current flows in the tunnel oxide film of the memory transistor of the selected cell on the island-like semiconductor layer, so that data is erased.

That is, the difference between the fourth potential and the third potential becomes a potential difference allowing a sufficient F-N current to flow in the tunnel oxide film of the memory transistor. In the case where the channel region of the memory cell is not electrically connected to the semiconductor substrate, the depletion layer owing to the fourth potential may have any extension.

In the case where the first wires (1-1 to 1-N) are formed to be electrically insulated from the semiconductor substrate, for example, where the first wires (1-1 to 1-N) are formed of an impurity diffusion layer in an SOI substrate and is insulated from the semiconductor substrate by an insulating film, the first potential is not necessarily the same as the tenth potential.

In the case where the channel region of a selected memory cell is electrically connected to the semiconductor substrate, for example, in the case where impurity diffusion layers do not render the island-like semiconductor layers in the floating state from the substrate, the tenth potential applied to the semiconductor substrate can erase simultaneously all memory cells having as the gate electrodes the third electrodes to which the third potential is applied, provided that a difference between the tenth potential and the third potential causes a sufficient change in the state of the charge in the charge storage layer.

The memory cells may be sequentially erased from a memory cell connected to a third wire (3-*j*-L) to a memory cell connected to a third electrode (3-*j*-1), or may be erased in reverse order or at random. Further, some or all memory cells connected to the third wire (3-*j*-h) may be erased at the same time, some or all memory cells connected to the third wires (3-*j*-1 to 3-*j*-L) may be erased at the same time, and some or all memory cells connected to the third wires (3-1-1 to 3-N-L) may be erased at the same time. Also, some or all memory cells connected to third wires selected regularly, e.g., the third wires (3-(j−8)-h), (3-*j*-h), (3-(j+8)-h), (3-(j+16)-h), . . . , may be erased at the same time.

Further some or all memory cells of one island-like semiconductor layer connected to the fourth wire (4-*i*) may be erased at the same time, or some or all memory cells of some or all island-like semiconductor layers connected to the fourth wire (4-*i*) may be erased at the same time. One, some or all memory cells of one island-like semiconductor layer connected to each of a plurality of fourth wires may be erased at the same time, or some or all memory cells of some or all island-like semiconductor layers connected to each of a plurality of fourth wires may be erased at the same time.

The memory cells connected to the third wire (3-*j*-h) may be erased at the same time by given intervals, for example, every eight fourth wires (e.g., a fourth wire (4-(i−16)), a fourth wire (4-(i−8)), a fourth wire (4-*i*), a fourth wire (4-(i+8)), a fourth wire (4-(i+16)), . . . ). All the memory cells having, as the gate electrodes, the third electrodes connected to the third wire (3-*j*-h,) can be erased at the same time by applying the first potential to all the fourth wires, applying the fourth potential to the first wire (1-*j*) and the eighth potential to the first wires (not 1-*j*), exchanging the potentials of the second and fifth wires and applying the third potential to the third wire (3-*j*-h). At this time, the fourth potential may optionally be applied to the fourth wire. Further, by applying the fourth potential to a plurality of first wires and applying the third potential to the third wires connected to the third electrodes of the memory cells included in the island-like semiconductor layers having the first electrodes connected to said plurality of first wires, all the memory cells having, as gate electrodes, the third electrodes connected to the third wires to which the third potential is applied can be erased at the same time. The above-described erasing processes may be combined.

Erasure may be defined as changing the state of the charge in the charge storage layer and raising the threshold of the selected memory transistor. In this case, the third potential is large than the fourth potential, and the third potential is a potential allowing the state of the charge in the charge storage layer to be changed sufficiently by the difference between the third potential and the fourth potential, for example, a potential allowing the occurrence of a sufficient F-N current. Means for changing the state of the charge in the charge storage layer is not limited to the F-N current.

Figure 63:
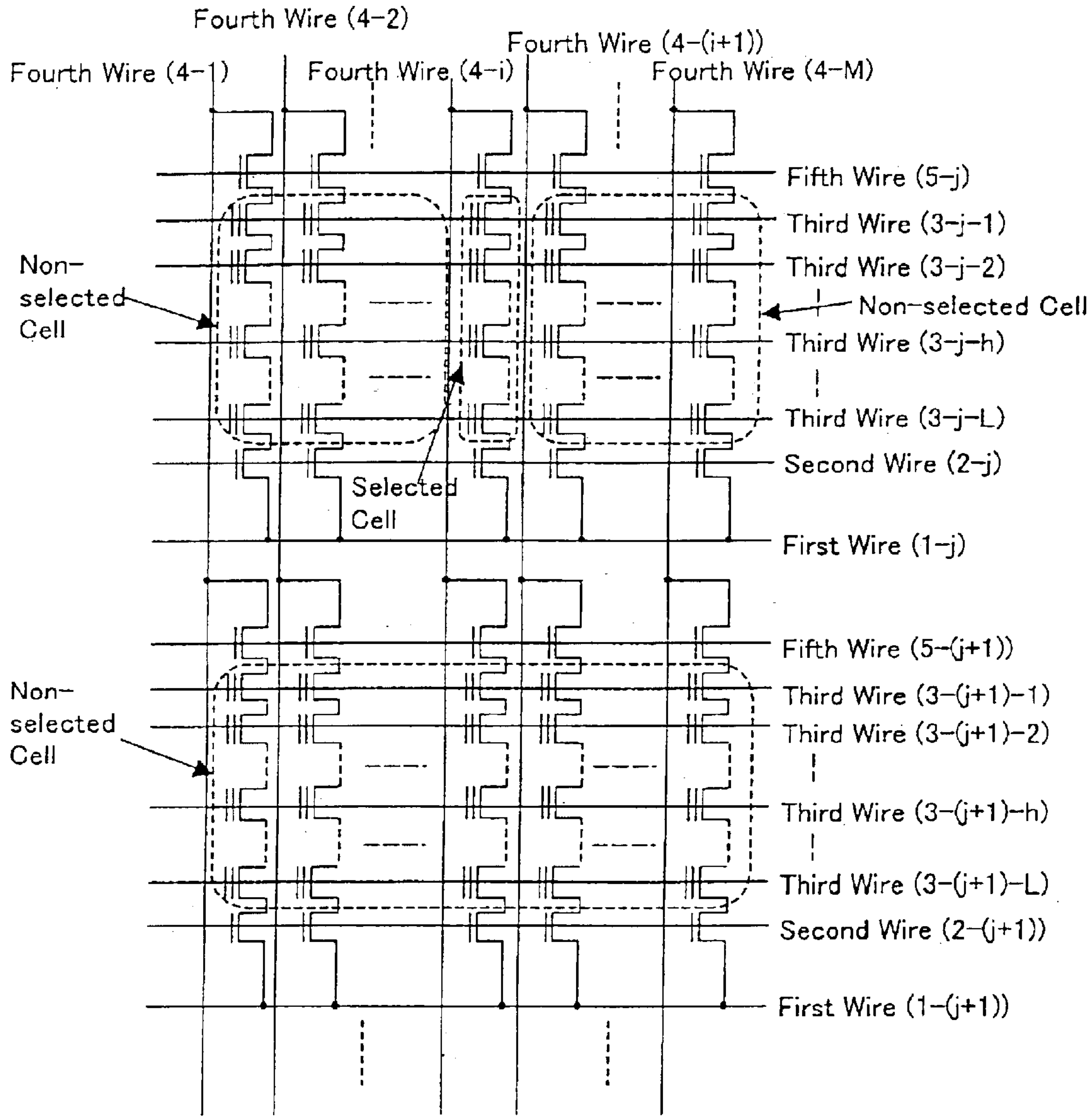

FIG. 63 shows an equivalent circuit diagram of a memory cell array in which the first wires are arranged in parallel to the third wires. All memory cells on an island-like semiconductor layer defined by the first wire (1-*j*) and the fourth wire (4-*i*) can be selected and erased. The application of the potentials of FIG. 63 is the same as that of FIG. 62 except that the third potential is applied to the third wires (3-*j*-1 to 3-*j*-L).

Figure 64:
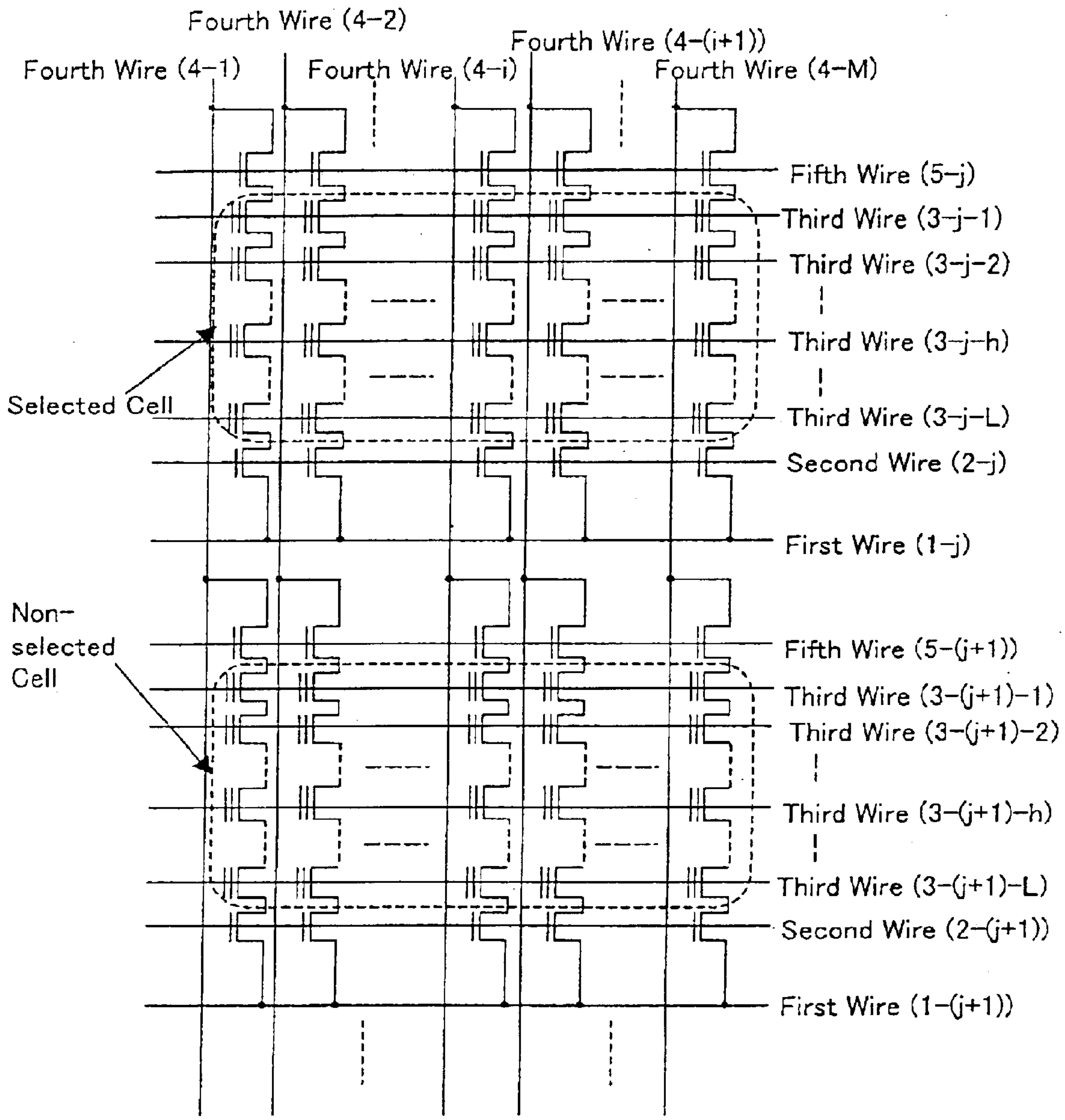

FIG. 64 shows an equivalent circuit diagram of a memory cell array in which the first wires are arranged in parallel to the third wires.

All memory cells on all island-like semiconductor layers connected to the first wire (1-*j*) can be selected and erased. The application of the potentials of FIG. 64 is the same as that of FIG. 62 except that the third potential is applied to the third wires (3-*j*-1 to 3-*j*-L) and the fourth potential is applied to the fourth wires (4-1 to 4-M).

Figure 65:
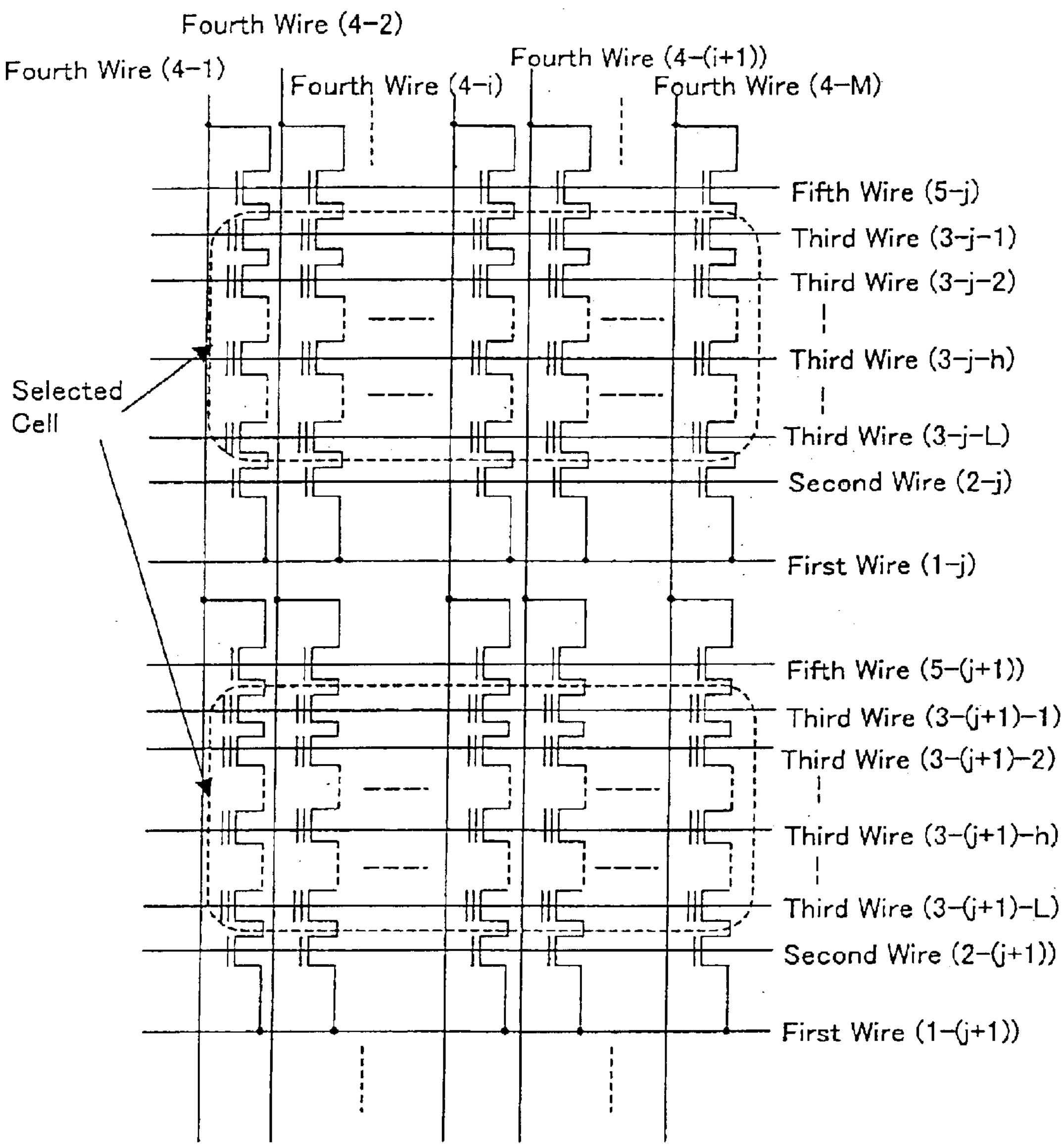

FIG. 65 shows an equivalent circuit diagram of a memory cell array in which the first wires are arranged in parallel to the third wires. All memory cells on all island-like semiconductor layers connected to the first wires (1-1 to 1-N) can be selected and erased. The application of the potentials of FIG. 65 is the same as that of FIG. 62 except that the fourth potential is applied to the first wires (1-1 to 1-N), the third potential is applied to the third wires (3-*j*-1 to3-N-L) and the fourth potential is applied to the fourth wires (4-1 to 4-M).

FIG. 67 shows an equivalent circuit diagram of a memory cell array in which the first wires are arranged in parallel to the fourth wires. The application of the potentials of FIG. 133 is the same as that of FIG. 62 except that the fourth potential is applied to the first wire (1-*i*) and the ninth potential is applied to first wires (not 1i).

Figure 68:
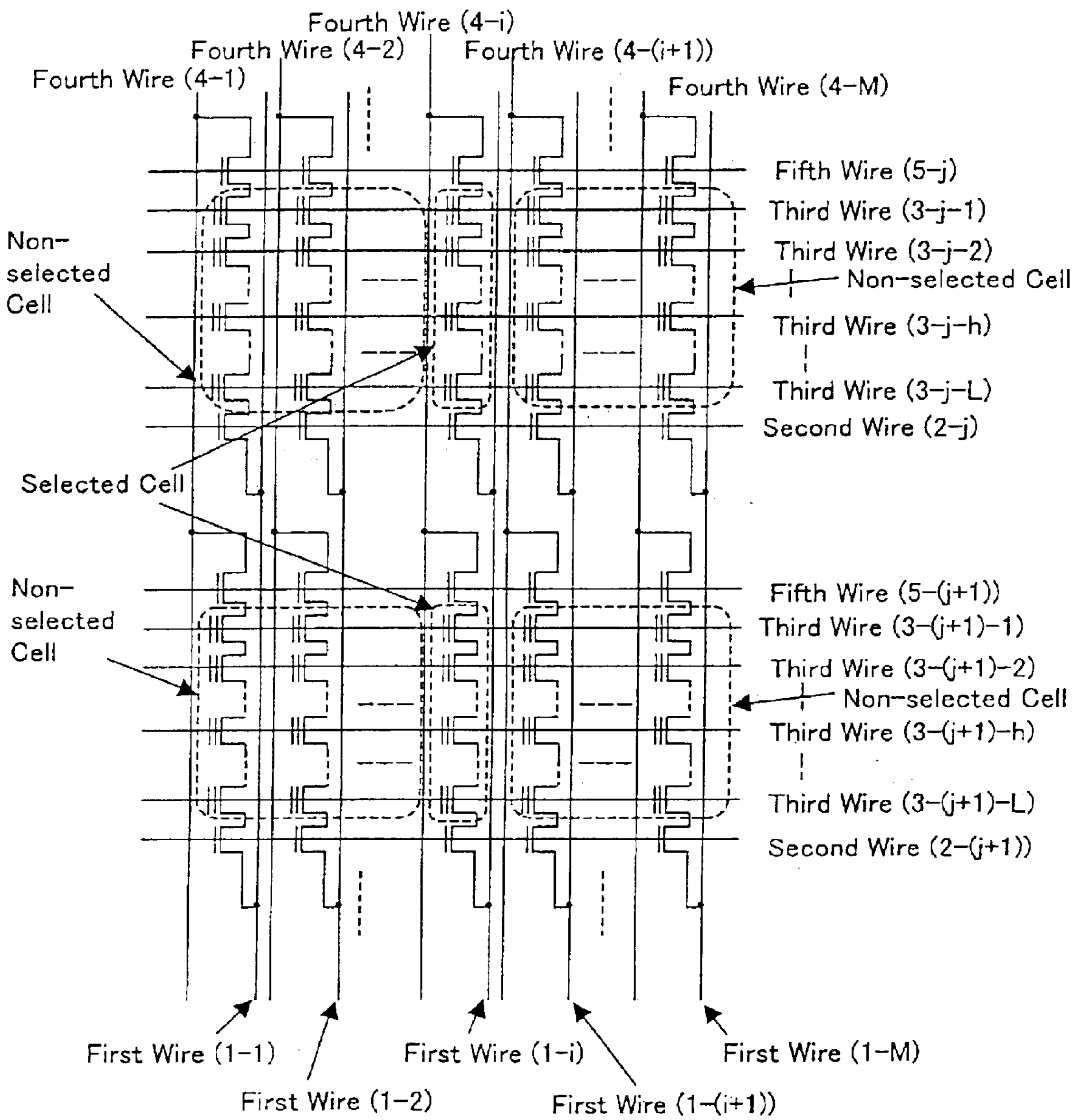

FIG. 68 shows an equivalent circuit diagram of a memory cell array in which the first wires are arranged in parallel to the fourth wires. All memory cells on an island-like semiconductor layer defined by the first wire (1-*i*) and the fourth wire (4-*i*) can be selected and erased. The application of the potentials of FIG. 68 is the same as that of FIG. 62 except that the third potential is applied to the third wires (3-*j*-1 to 3-N-L).

FIG. 69 shows an equivalent circuit diagram of a memory cell array in which a plurality of first wires are electrically connected in common. The application of the potentials of FIG. 69 is the same as that of FIG. 62 except that the fourth potential is applied to the first wire (1-*i*).

Figure 70:
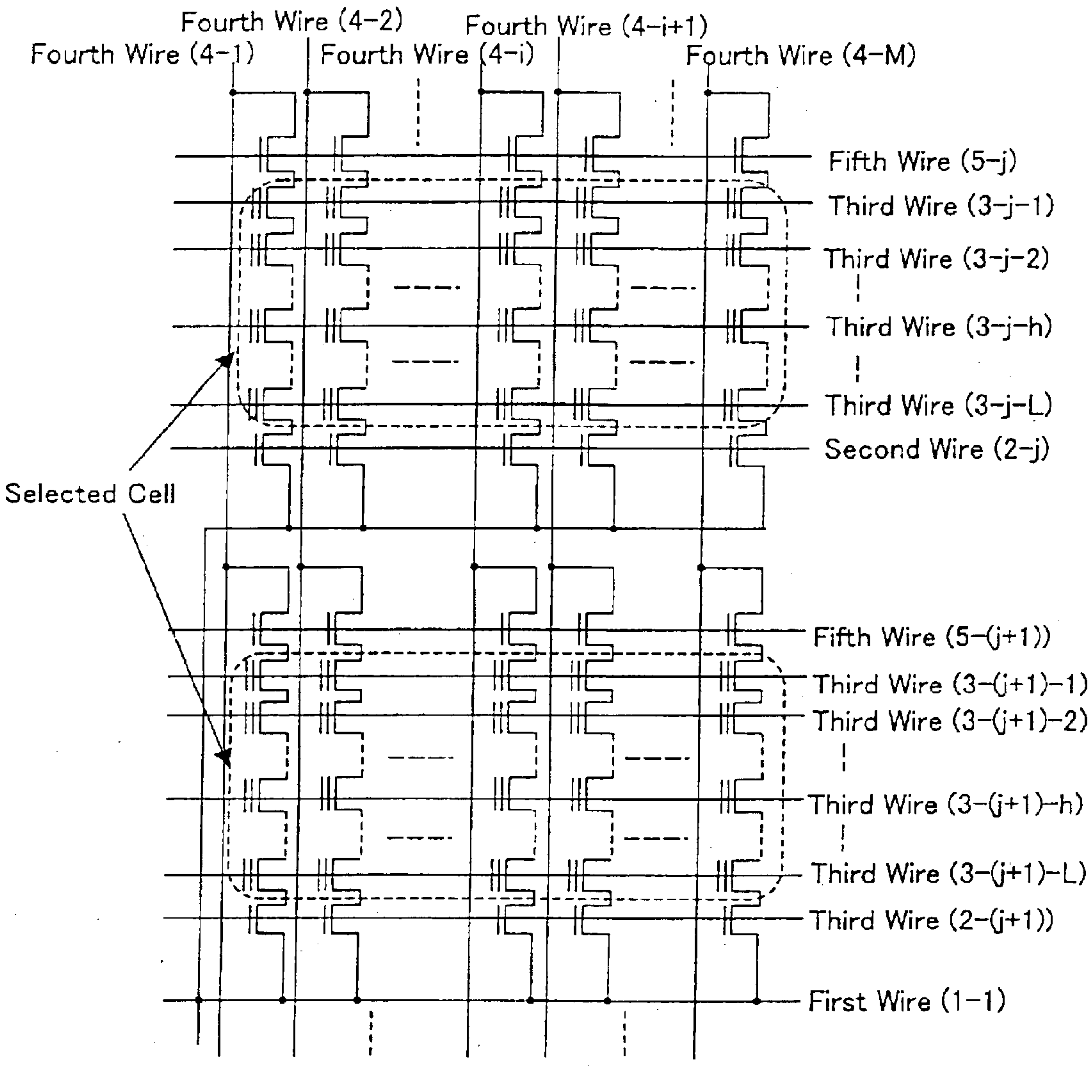

FIG. 70 shows an equivalent circuit diagram of a memory cell array in which a plurality of first wires are electrically connected in common. All memory cells on all island-like semiconductor layers connected to the first wire (1-1) can be selected and erased. The application of the potentials of FIG. 70 is the same as that of FIG. 62 except that the fourth potential is applied to the first wire (1-1), the third potential is applied to the third wires (3-*j*-1 to 3-(j+1)-L) and the fourth potential is applied to the fourth wires (4-1 to 4-M).

Figure 71:
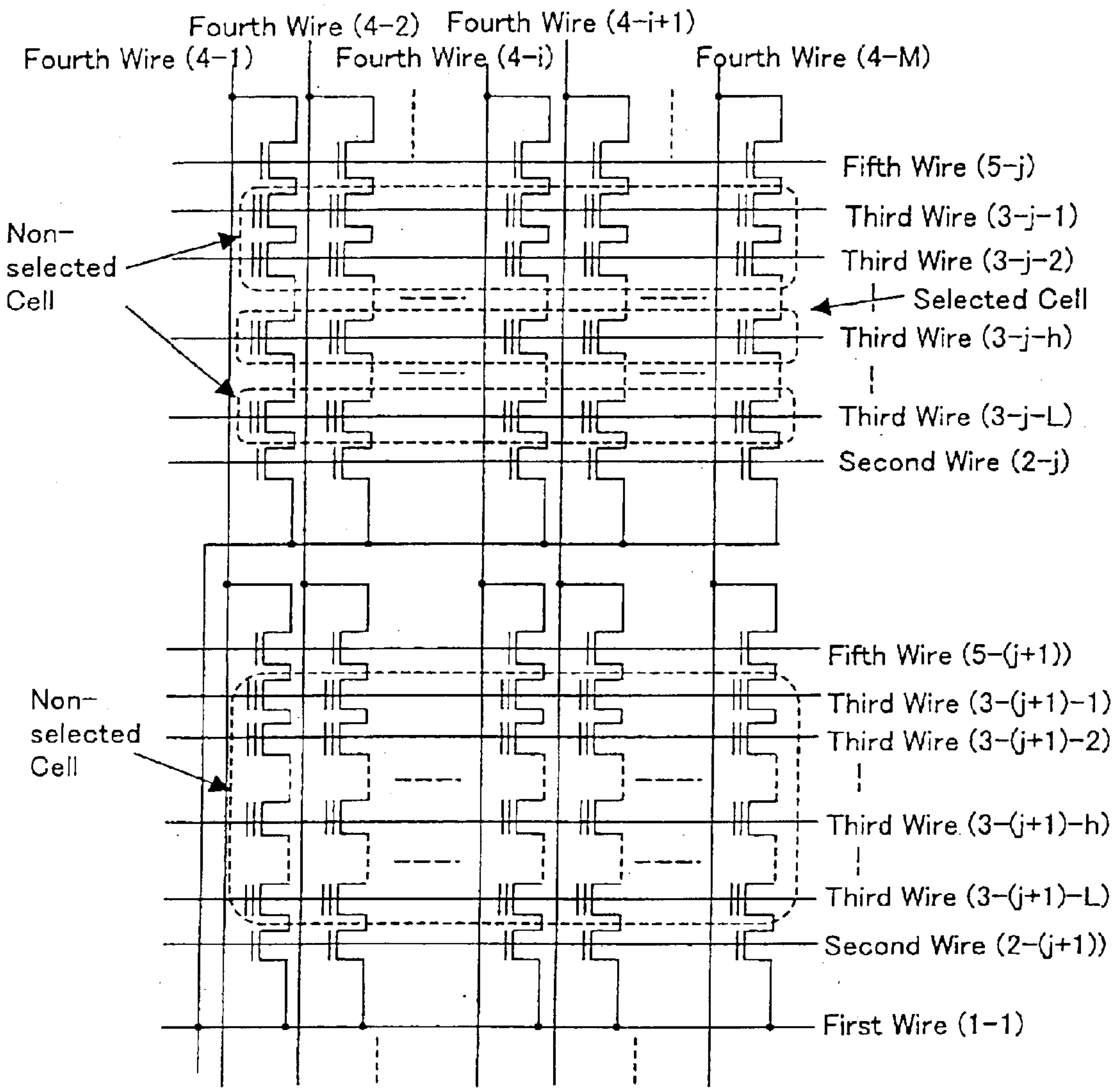

FIG. 71 shows an equivalent circuit diagram of a memory cell array in which a plurality of first wires are electrically connected in common. All memory cells connected to the third wire (3-*j*-h) can be selected and erased. The application of the potentials of FIG. 71 is the same as that of FIG. 62 except that the fourth potential is applied to the first wire (1-1), the third potential is applied to the third wire (3-*j*-h) and the fourth potential is applied to the fourth wires (4-1 to 4-M).

Now are described examples of timing charts for applying potentials for erasing data in the case where there are arranged M×N (M and N are positive integers) island-like semiconductor layers having a plurality of (e.g., L, L is a positive integer) memory cells formed of the P-type semiconductor and arranged in series and selection transistors formed to sandwich the memory cells therebetween, the first wires and the third wires are arranged in parallel and the selected cell is a memory cell having the selected third electrode as the gate electrode.

Figure 66:
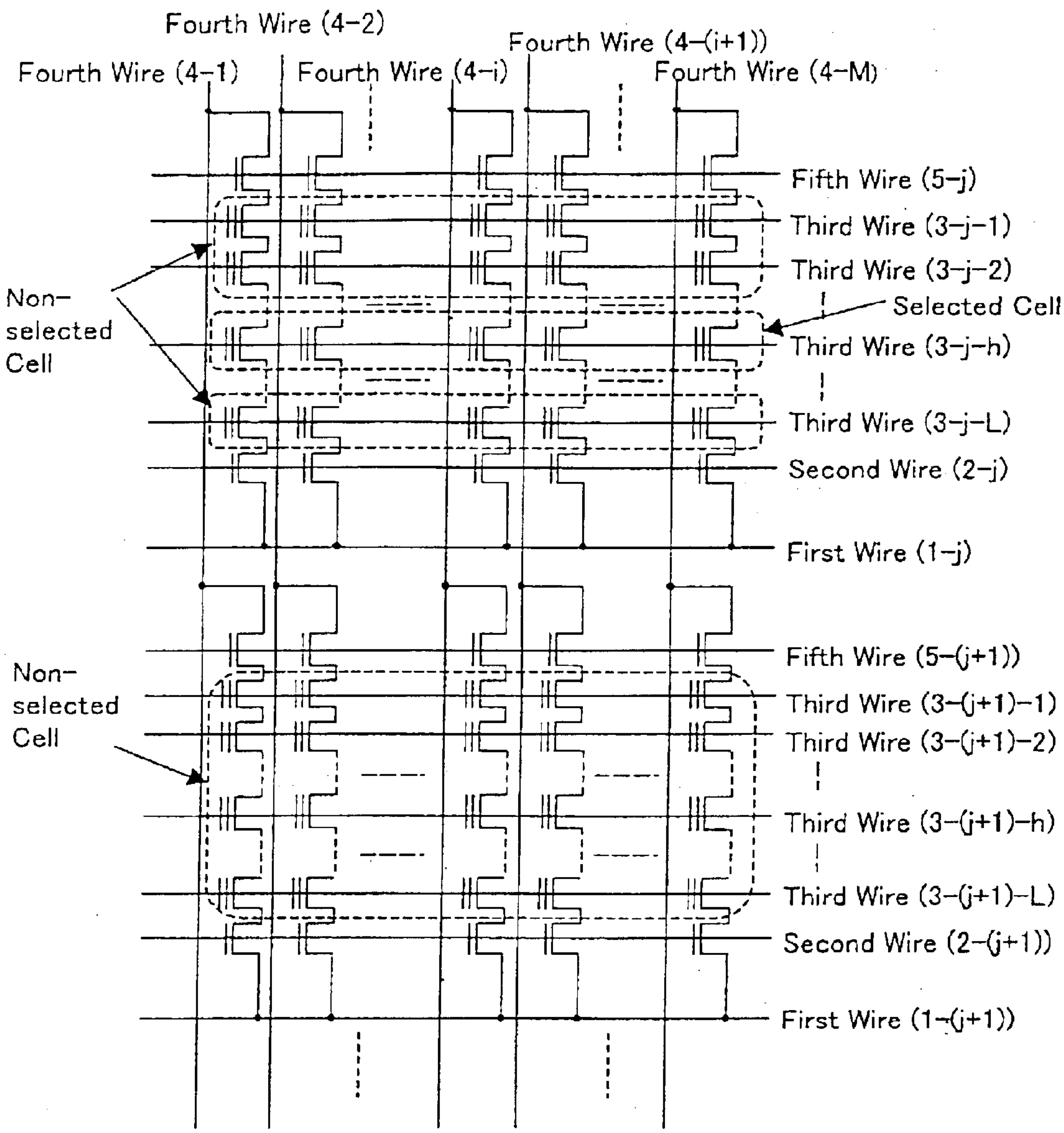
Figure 157:
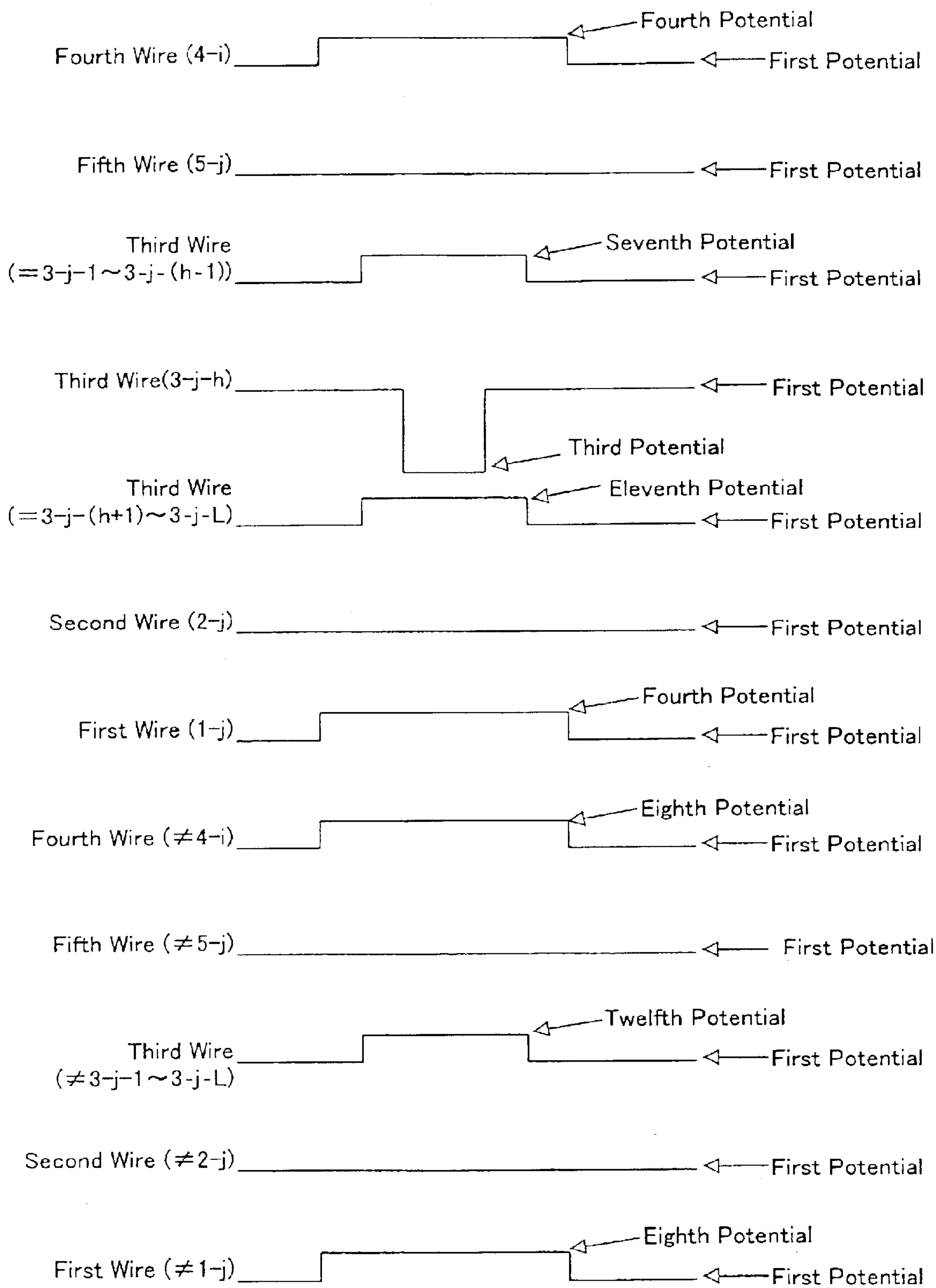

In FIG. 157, a selected third electrode as shown in FIG. 66 is negative-biased, the threshold of transistors having gate electrodes connected to the second wire and the fifth wire is 0.5 V, for example, and the memory cell has a threshold of 1.0 V to 3.5 V when it is in the written state and has a threshold of −1.0 V or lower when it is in the erased state.

For drawing a negative charge from the charge storage layer, for example, a ground potential is applied as the first potential to the first wires (1-1 to 1-N), the second wires (2-1 to 2-N), the third wires (3-1-1 to 3-N-L), the fourth wires (4-1 to 4-M) and the fifth wires (5-1 to 5-N). In this state, the eighth potential, e.g., 6 V which is equal to the fourth potential, is applied to first wires (not 1-*j*) other than the first wire (1-*j*), the eighth potential, e.g., 6 V which is equal to the fourth potential, is applied to fourth wires (not 4-*i*) other than the fourth wire (4-*i*), the fourth potential, e.g., 6 V, is applied to the first wire (1-*j*), the fourth potential, e.g., 6 V, is applied to the fourth wire (4-*i*), the seventh potential, e.g., 6 V, is applied to third wires (3-*j*-1 to 3-*j*-(h−1)) (h is a positive integer, 1≦h≦L) other than the third wire (3-*j*-h), the eleventh potential, e.g., 6 V, is applied to third wires (3-*j*-(h+1) to 3-*j*-L) (h is a positive integer, 1≦h≦L), the twelfth potential, e.g., 6 V, is applied to third wires (not 3-*j*-1 to 3-*j*-L) other than mentioned above, and the third potential, e.g., −12 V, is applied to the third wire (3-*j*-h). The selected cell is erased to "0" by sustaining this state for a desired period of time. The potentials may be applied to the respective wires in another order or simultaneously.

The third wire (3-*j*-h) is returned to the ground potential, i.e., the first potential, the third wires (not 3-*j*-h) other than the third wire (3-*j*-h) are returned to the ground potential, i.e., the first potential, the fourth wires (4-1 to 4-M) are returned to the ground potential, i.e., the first potential, and the first wires (1-1 to 1-N) are returned to the ground potential, i.e., the first potential. The respective electrodes may be returned to the ground potential in another order or simultaneously. The potentials given may be any combination of potentials so long as they meet conditions for erasing a desired cell.

Here, the same potential is preferably applied initially as the first potential to the first wires (1-1 to 1-N), the second wires (2-1 to 2-N), the third wires (3-1-1 to 3-N-L), the fourth wires (4-1 to 4-M) and the fifth wires (5-1 to 5-N), but different potentials may be applied.

Thereby a plurality of cells connected to the selected third wire as shown in FIG. 66 are erased.

In the above example, the erasing process has been described with the case where the selected cell is a memory cell having the third wire (3-*j*-h) as the gate electrode. However, the erasing process is the same with the case where the selected cell is a memory cell having a third wire other than the third wire (3-*j*-h) as the gate electrode.

Figure 158:
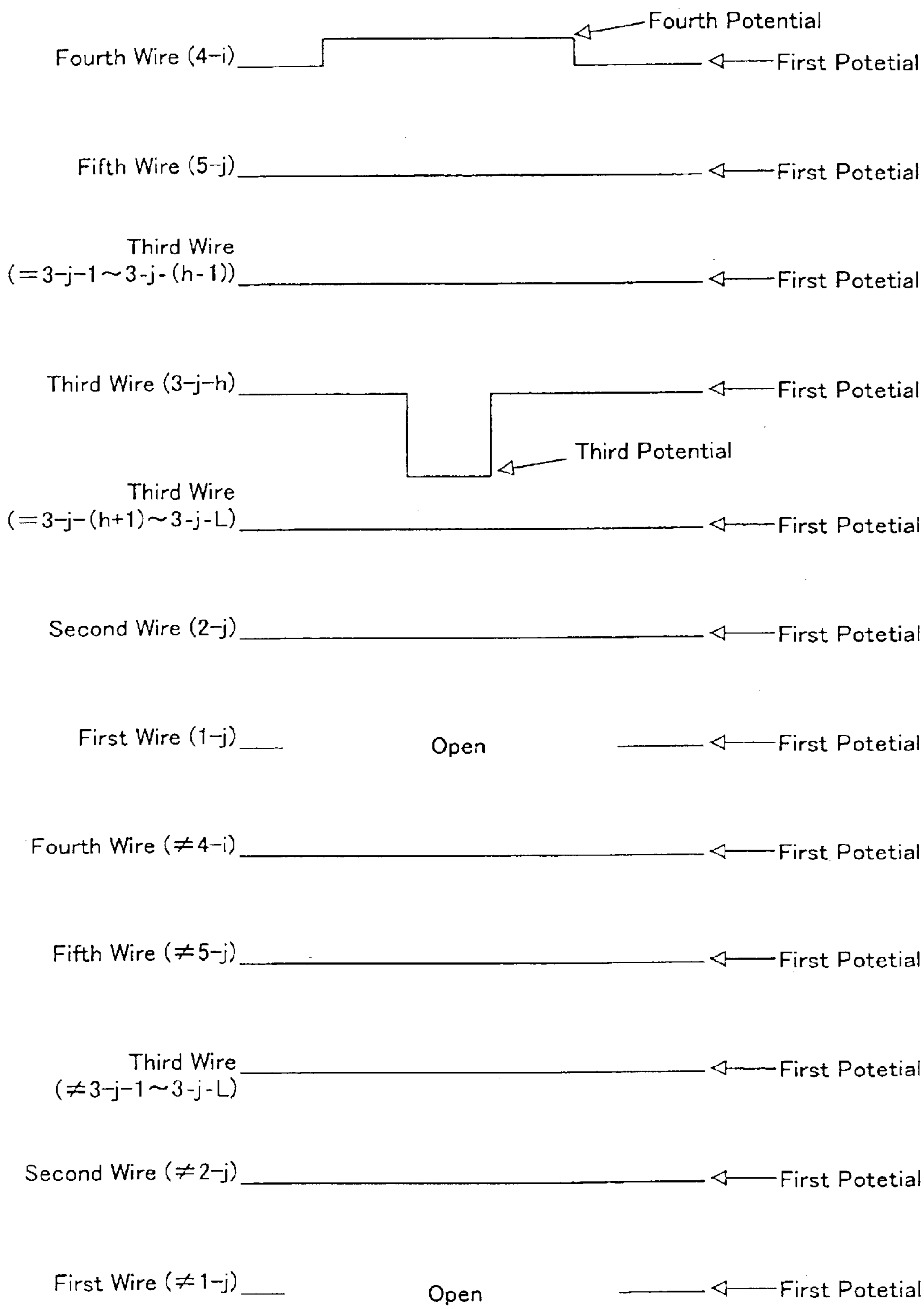

FIG. 158 shows a timing chart showing an example of timing of applying each potential for erasing data in the case where the first wire is open in contrast to FIG. 157.

The erasing process of FIG. 158 conforms to that of FIG. 157 except that the first electrode 10 is open and the ground potential is applied as the first potential to the non-selected third wires (not 3-*i*-h) (h is a positive integer, 1≦h≦L) and the fourth wires (not 4-*i*). Also in FIG. 158, the selected cell as shown in FIG. 62 is erased.

If 6 V is applied as the eighth potential to the fourth wires (not 4-*i*), a plurality of cells connected to the elected third wire as shown in FIG. 66 are erased.

If 6 V is applied as the eighth potential to the fourth wires (not 4-*i*) and −12 V is applied as the third potential to the third wires (3-*i*-1 to 3-*i*-(h−1)) and the third wires (3-*i*-(h+1) to 3-*i*-L), a plurality of cells connected to the first wire (1-*j*) as shown in FIG. 64 are erased.

If 6 V is applied as the fourth potential to all the fourth wires (4-1 to 4-M) and −12 V is applied as the third potential to all the third wires (3-1-1 to 3-N-L), all cells as shown in FIG. 65 are erased.

Figure 159:
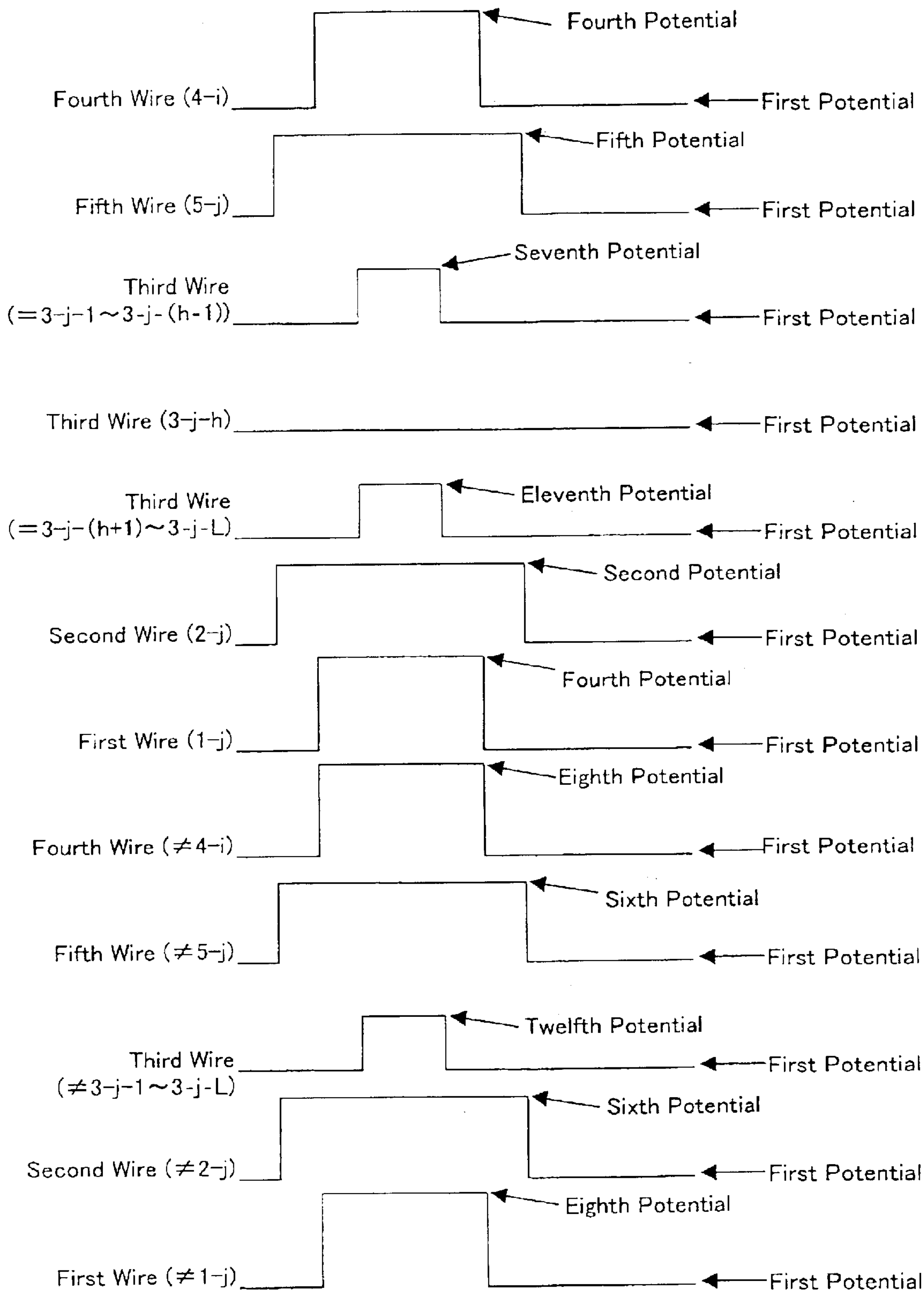

In FIG. 159, 18 V for example is applied as the fourth potential and the ninth potential to the first wire, the threshold of transistors having gate electrodes connected to the second wire and the fifth wire is 0.5 V, for example, and the memory cell has a threshold of 1.0 V to 3.5 V when it is in the written state and has a threshold of −1.0 V or lower when it is in the erased state.

For drawing a negative charge from the charge storage layer, for example, a ground potential is applied as the first potential to the first wires (1-1 to 1-N), the second wires (2-1 to 2-N), the third wires (3-1-1 to 3-N-L), the fourth wires (4-1 to 4-M) and the fifth wires (5-1 to 5-N). In this state, the sixth potential, e.g., 18 V, is applied to second wires (not 2-*j*) and fifth wires (not 5-*j*), the second potential, e.g., 18 V, is applied to the second wire (2-*j*), the fifth potential, e.g., 18 V, is applied to the fifth wire (5-*j*), the eighth potential, e.g., 18 V which is equal to the fourth potential, is applied to fourth wires (not 4-*i*) other than the fourth wire (4-*i*), the eighth potential, e.g., 18 V which is equal to the fourth potential, is applied to first wires (not 1-*j*) other than the first wire (1-*j*), the fourth potential, e.g., 18 V, is applied to the fourth wire (4-*i*), the fourth potential, e.g., 18 V, is applied to the first wire (1-*j*), the seventh potential, e.g., 10 V, is applied to third wires (3-*j*-1 to 3-*j*-(h−1)) (h is a positive integer, 1≦h≦L) other than the third wire (3-*j*-h), the eleventh potential, e.g., 10 V, is applied to third wires (3-*j*-(h+1) to 3-*j*-L) (h is a positive integer, 1≦h≦L), the twelfth potential, e.g., 10 V, is applied to third wires (not 3-*j*-1 to 3-*j*-L) other than mentioned above, and the third potential, e.g., the ground potential which is the first potential, is kept applied to the third wire (3-*j*-h). The selected cell is erased to "0" by sustaining this state for a desired period of time. The potentials may be applied to the respective wires in another order or simultaneously.

The third wires (not 3-*j*-h) other than the third wire (3-*j*-h) are returned to the ground potential, i.e., the first potential, the fourth wires (4-1 to 4-M) are returned to the ground potential, i.e., the first potential, the first wires (1-1 to 1-N) are returned to the ground potential, i.e., the first potential, and the second wires (2-1 to 2-N) and the fifth wires (5-1 to 5-N) are returned to the ground potential, i.e., the first potential. The respective electrodes may be returned to the ground potential in another order or simultaneously. The potentials given may be any combination of potentials so long as they meet conditions for erasing a desired cell.

Here, the same potential is preferably applied initially as the first potential to the first wires (1-1 to 1-N), the second wires (2-1 to 2-N), the third wires (3-1-1 to 3-N-L), the fourth wires (4-1 to 4-M) and the fifth wires (5-1 to 5-N), but different potentials may be applied.

Thereby a plurality of cells connected to the selected third wire as shown in FIG. 66 are erased.

In the above example, the erasing process has been described with the case where the selected cell is a memory cell having the third wire (3-*j*-h) as the gate electrode. However, the erasing process is the same with the case where the selected cell is a memory cell having a third wire other than the third wire (3-*j*-h) as the gate electrode.

Figure 160:
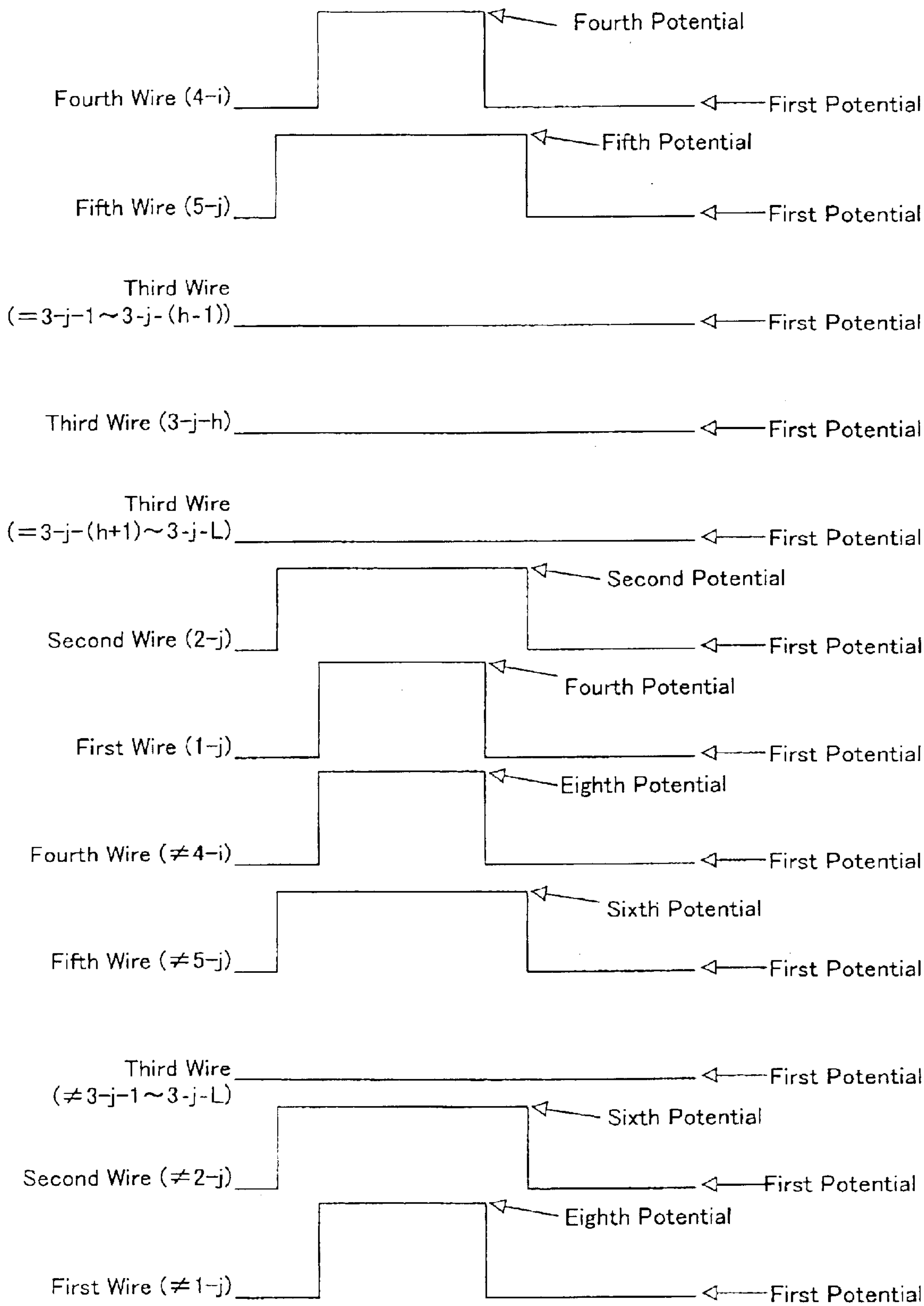
Figure 161:
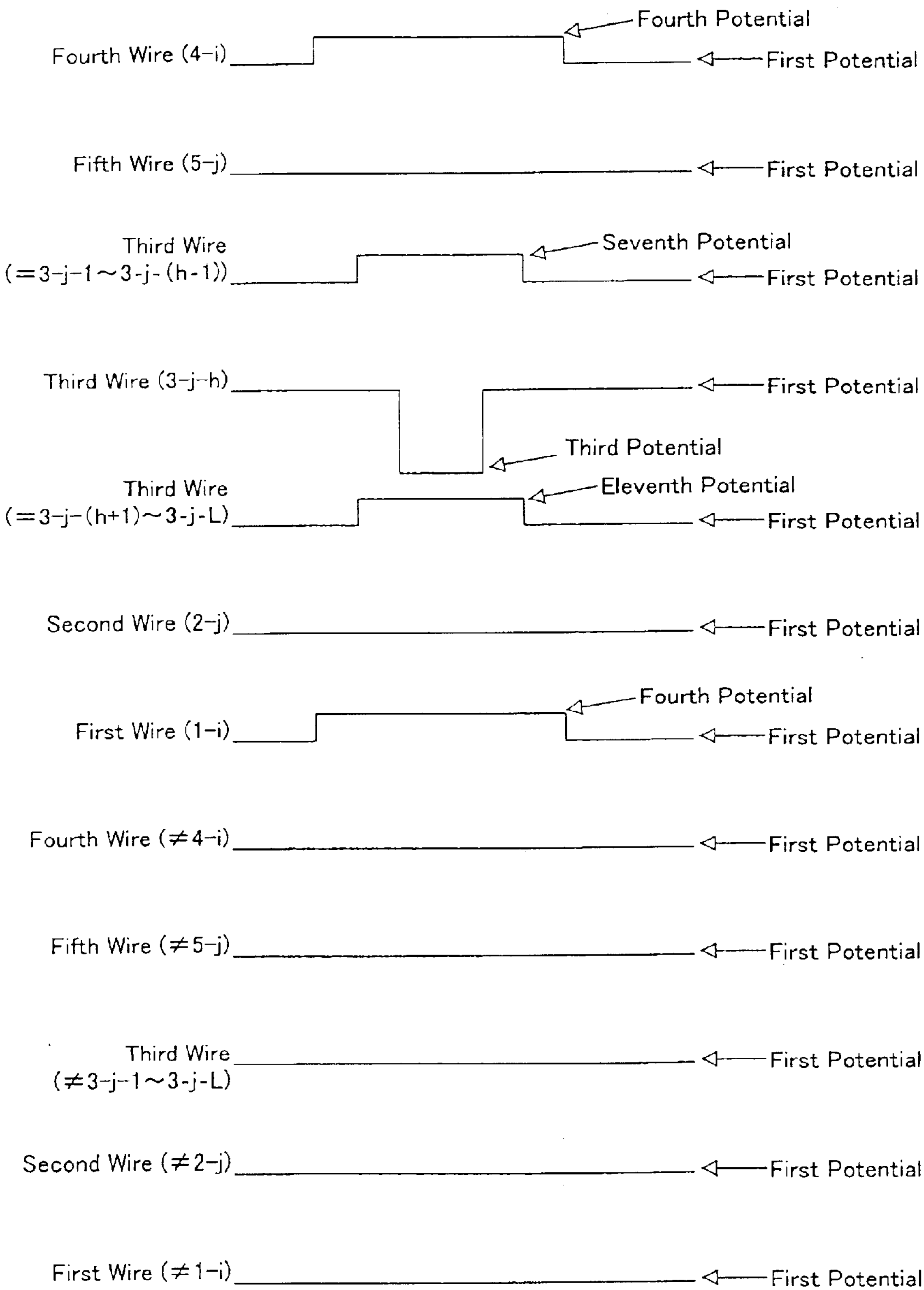
Figure 162:
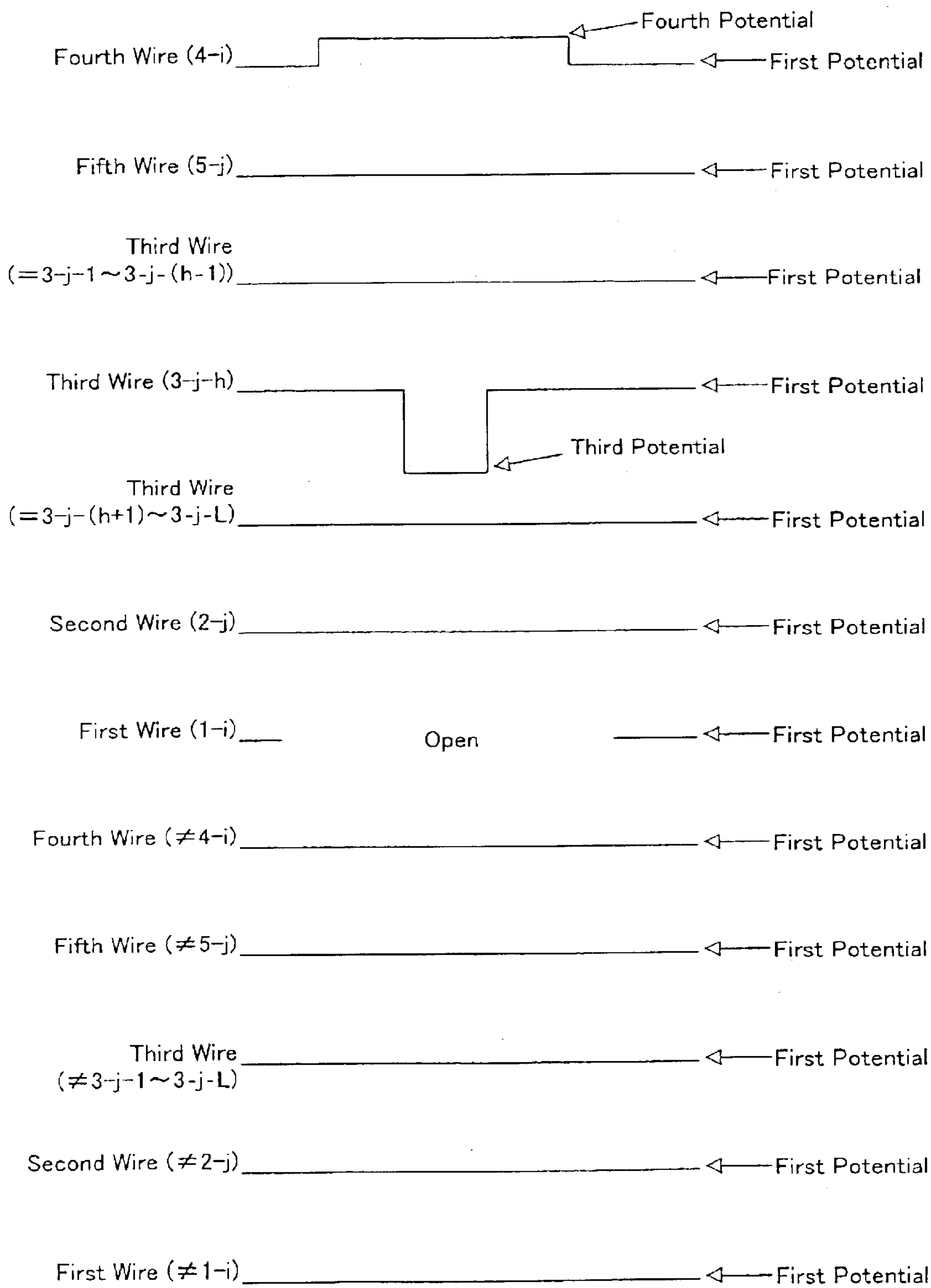
Figure 163:
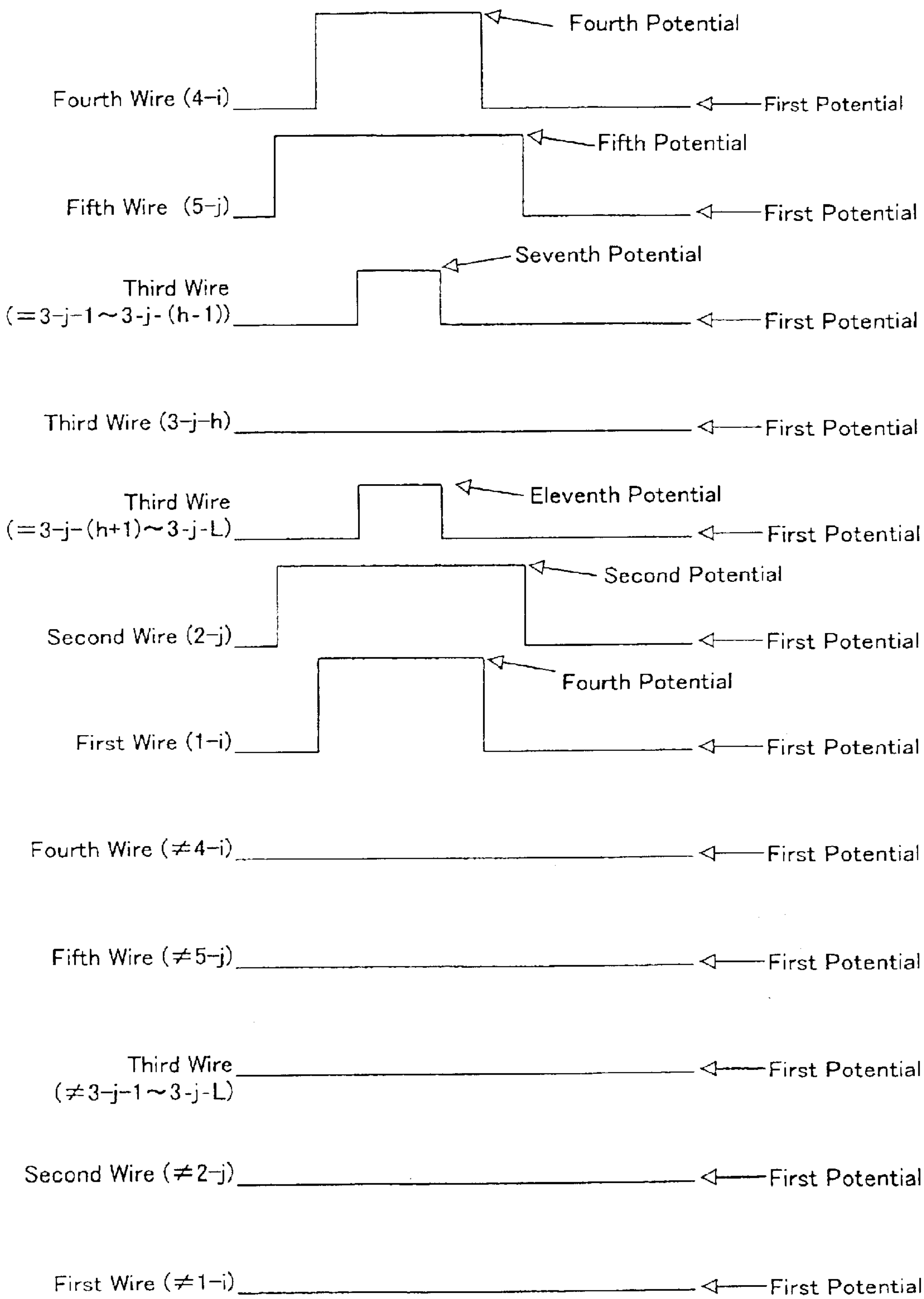
Figure 164:
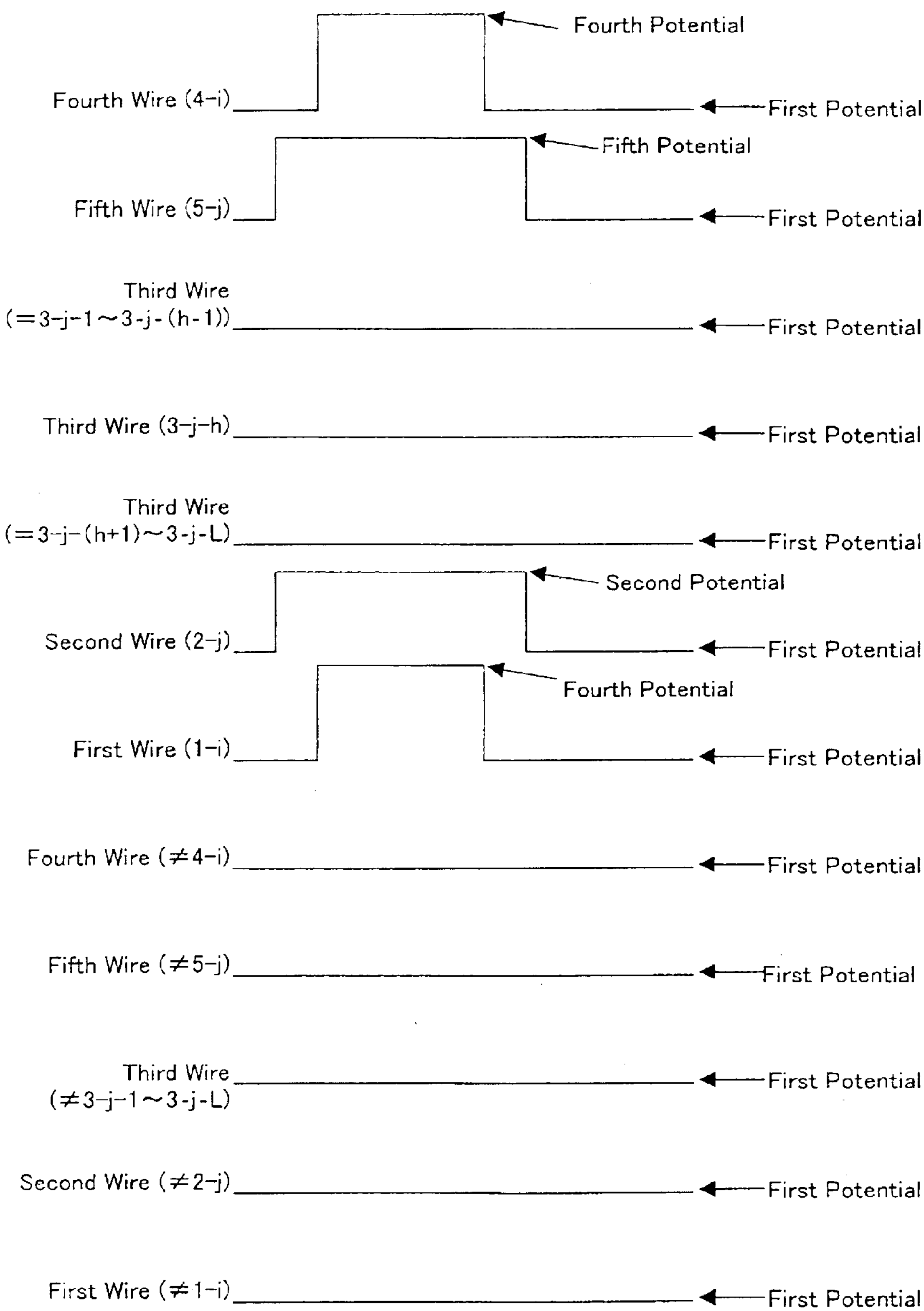

If the ground potential is applied as the third potential to the third wires (3-*i*-1 to 3-*i*-(h−1)) and the third wires (3-*i*-(h−1) to 3-*i*-L), a plurality of cells connected to the first wire (1-*j*) as-shown in FIG. 64 are erased. If the ground potential is applied as the third potential to all the third wires (3-1-1 to 3-N-L), all cells as shown in FIG. 65 are erased when the potentials are applied at the timing shown in FIG. 160.

FIG. 161 to FIG. 164 show examples of timing charts for erasing data in the case where the first wires are arranged in parallel to the fourth wires.

FIG. 161 to FIG. 164 conform to FIG. 157 to FIG. 160, respectively, except that the first wire (1-*i*) instead of the first wire (1-*j*) is connected to the end of the island-like semiconductor layer including the selected cell. At this time, as shown in FIG. 161 to FIG. 164, the ground potential may be applied as the first potential to the fifth wires (not 5-*j*), the fourth wires (not 4-*i*), the third wires (not 3-*j*-1 to 3-*j*-L), the second wires (not 2-*j*) and the first wires (not 1i). If the ground potential is applied as the third potential to the third wires (3-*j*-1 to 3-*j*-L), cells connected to the first wire (1-*i*) as shown in FIG. 64 are erased when the potentials are applied at the timing shown in FIG. 164.

Figure 165:
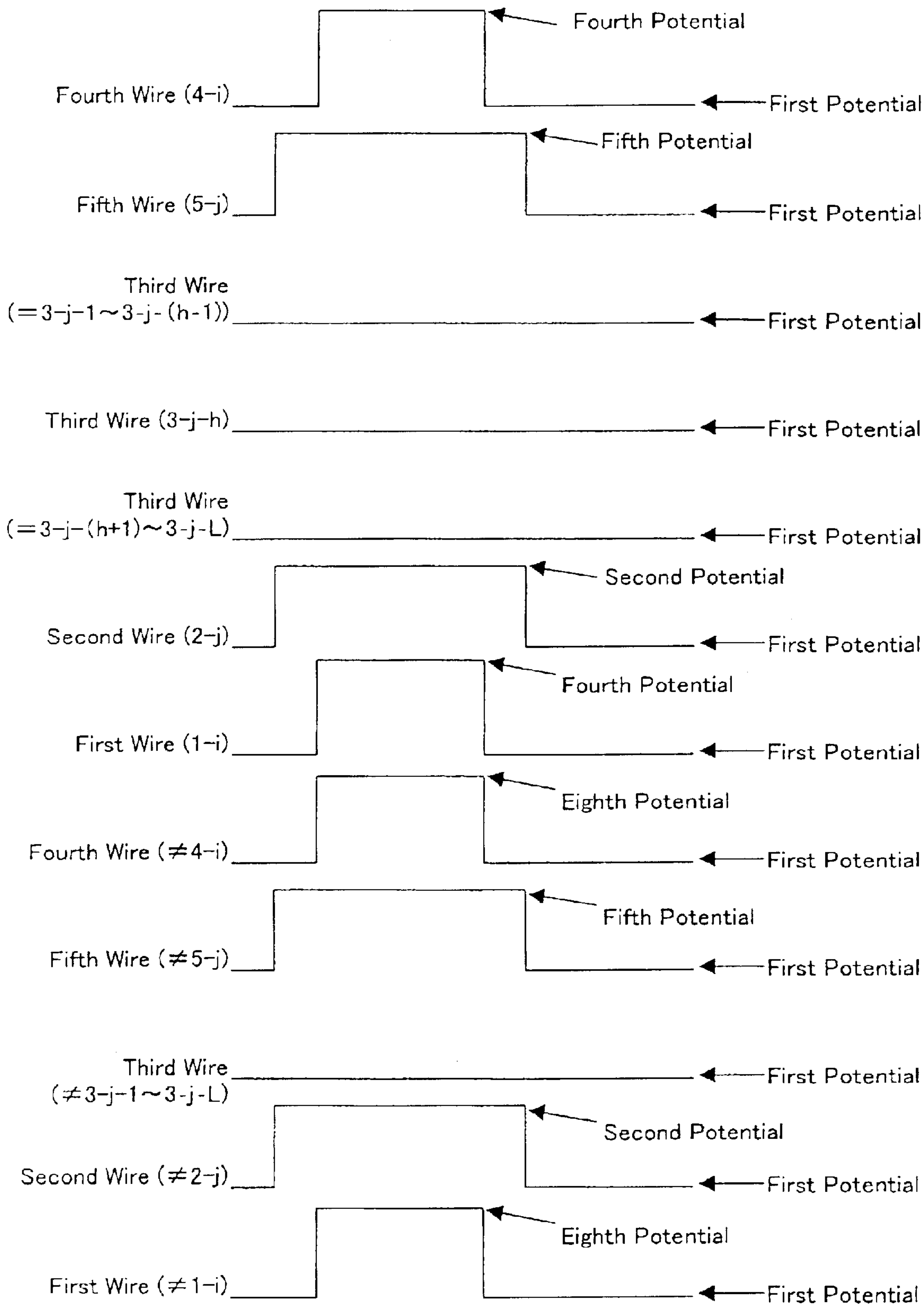
Figure 166:
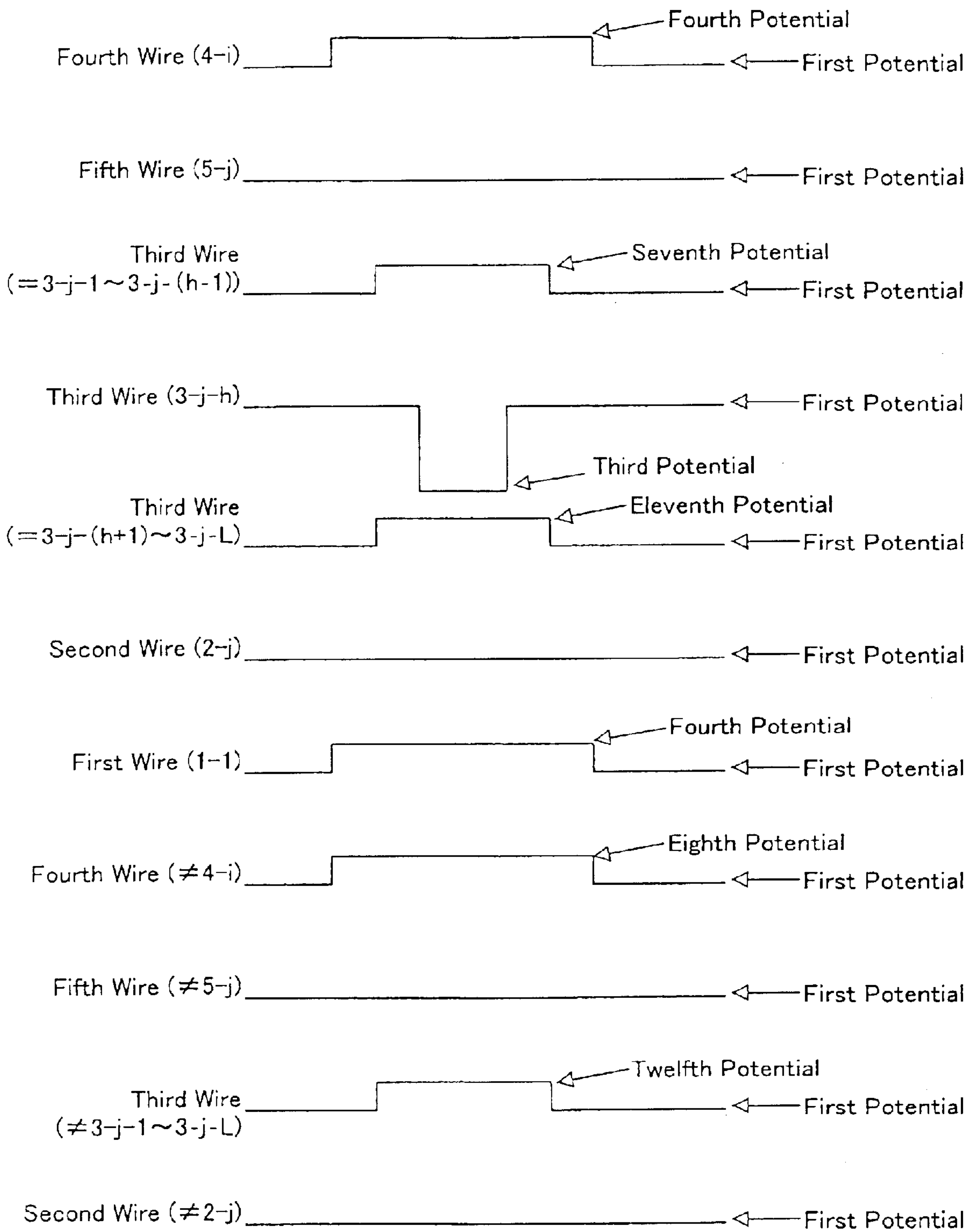
Figure 167:
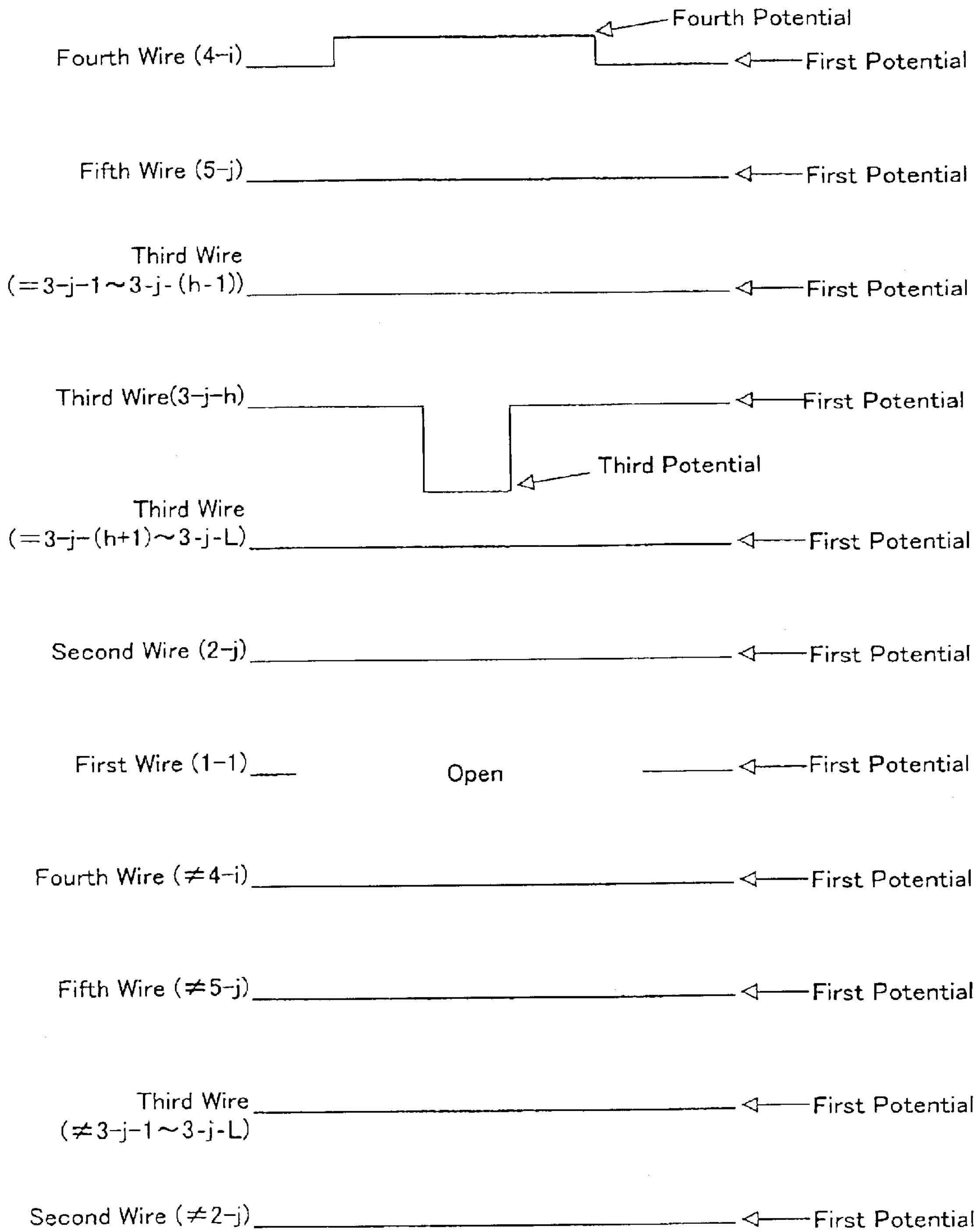
Figure 168:
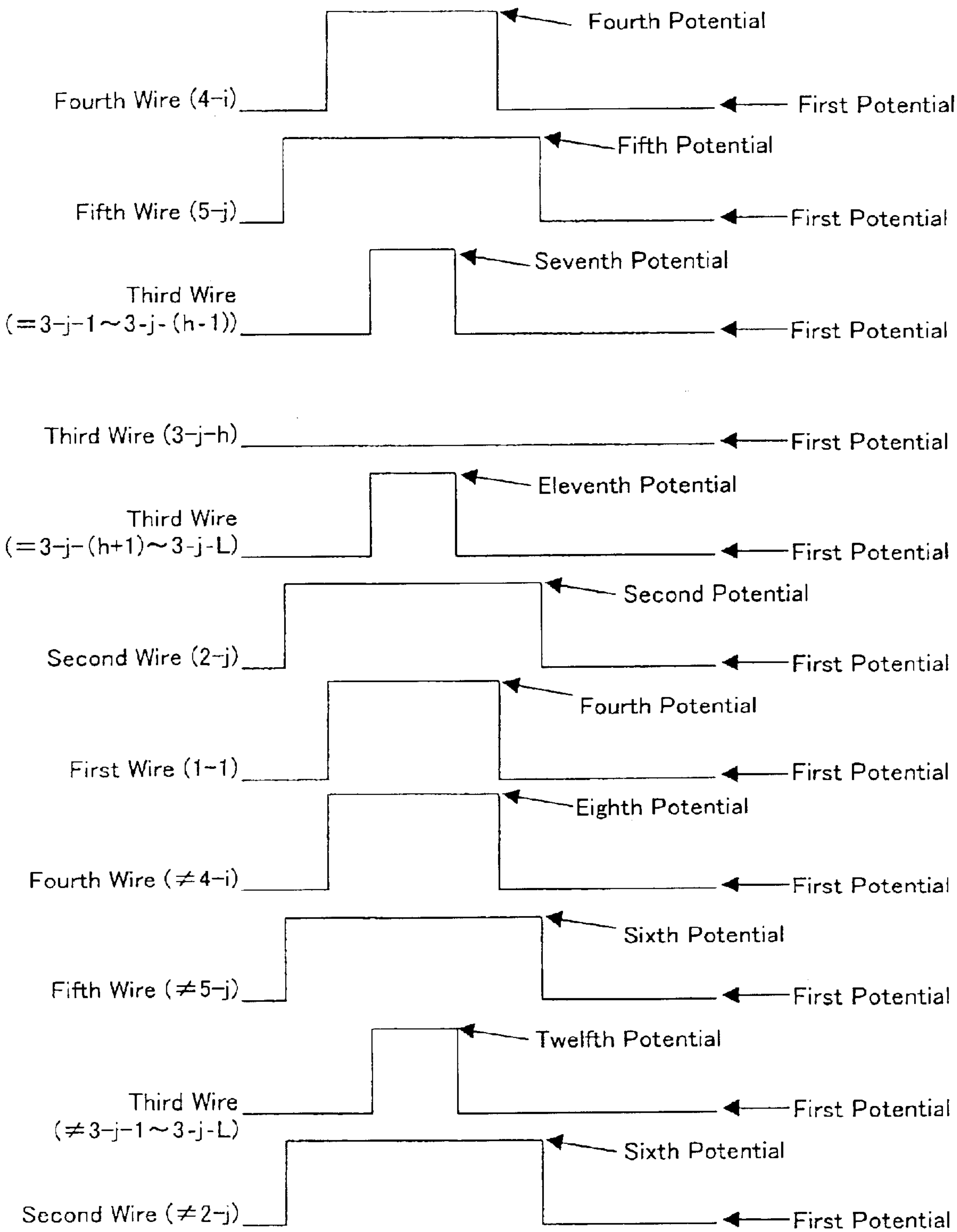
Figure 169:
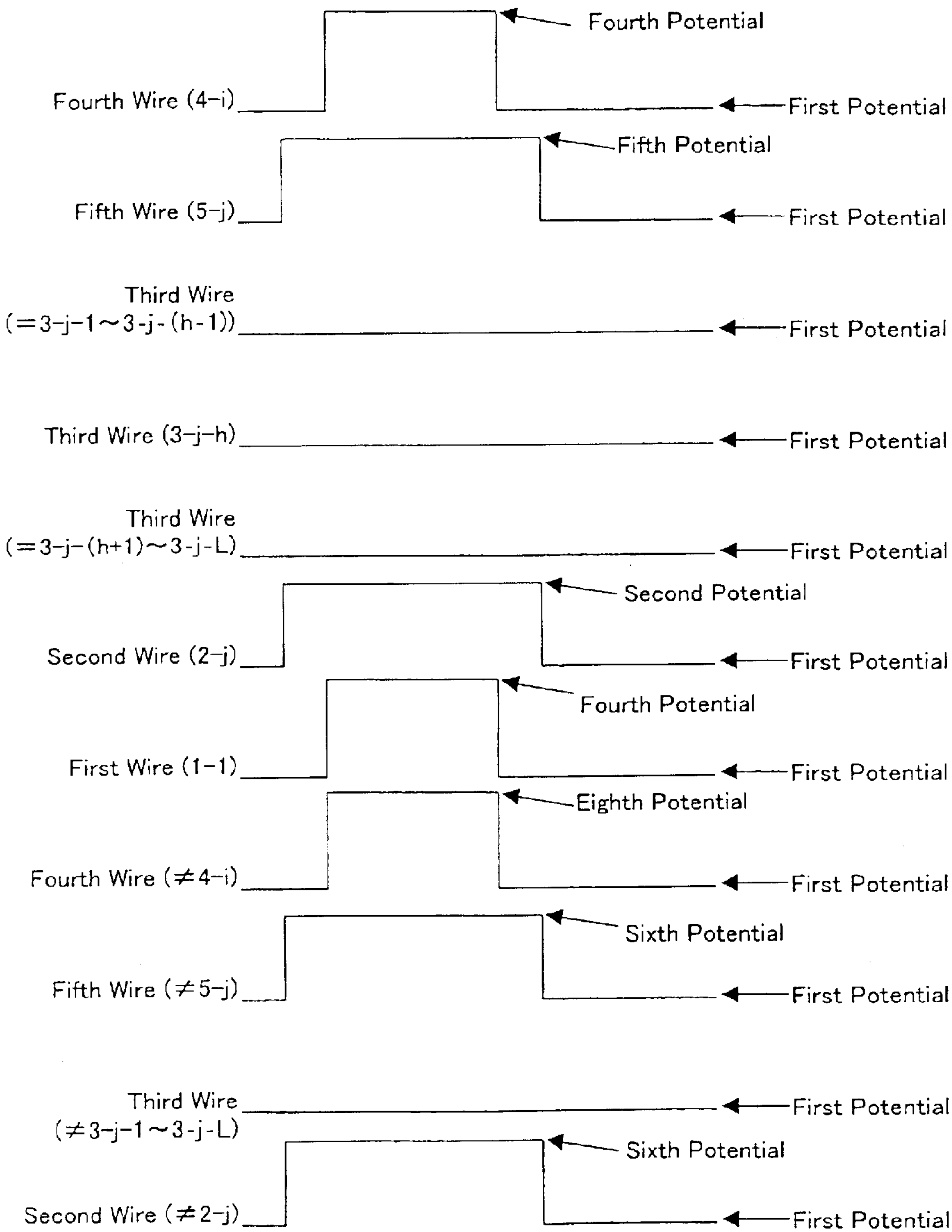

As shown in FIG. 165, if 18 V for example is applied as the fifth potential to the fifth wires (not 5-*j*), 18 V for example is applied as the second potential to the second wires (not 2-*j*) and 18 V for example is applied as the fourth potential to the fourth wires (not 4-*i*) and the first wires (not 1i), all cells as shown in FIG. 65 are erased.

FIG. 166 to FIG. 169 show examples of timing charts for erasing data in the case where the first wires are connected in common in the entire array.

FIG. 166 to FIG. 169 conform to FIG. 157 to FIG. 160, respectively, except that the first wire (1-*i*) instead of the first wire (1-*j*) is connected to the end of the island-like semiconductor layer including the selected cell. If the ground potential is applied as the third potential to all the third wires (3-1-1 to 3-N-L), all cells as shown in FIG. 65 are erased when the potentials are applied at the timing shown in FIG. 169.

An erasing process is now explained with a semiconductor memory according to the present invention which is constructed to include a plurality of (e.g., M×N, wherein M and N are positive integers) island-like semiconductor layers each having, for example, two memory cells connected in series, the memory cells each being provided with the charge storage layer and the third electrode as a control gate electrode. In this memory cell array, a plurality of (e.g., M) fourth wires arranged in parallel with the semiconductor substrate are connected to end portions of the island-like semiconductor layers, and first wires are connected to opposite end portions of the island-like semiconductor layers. A plurality of (e.g., N×L) third wires are arranged in a direction crossing the fourth wires and are connected to the third electrodes of the memory cells. The erasing process utilizes the F-N current.

FIG. 72 shows an equivalent circuit diagram of the above-described memory cell array in which the first wires are arranged in parallel to the third wires.

For example, in the case where the island-like semiconductor layers are formed of a P-type semiconductor, a selected cell shown in FIG. 72 is erased by applying a first potential to the first wire (1-*j*, wherein j is a positive integer, 1≦j≦N) connected to the first electrode connected to an island-like semiconductor layer including the selected cell, a ninth potential to first wires (not 1-*j*) other than the above-mentioned first wire (1-*j*), an eleventh potential to a third wire (3-*j*-2) connected to a non-selected cell arranged in series with the selected cell, a twelfth potential to third wires (not 3-*j*-1 to 3-*j*-2) connected to non-selected cells other than mentioned above, a fourth potential to a fourth wire (4-*i*, wherein i is a positive integer, 1≦i≦M) connected to the fourth electrode connected to the island-like semiconductor layer including the selected cell and an eighth potential to fourth wires (not 4-*i*) other than the above-mentioned fourth wire (4-*i*). The application of these potentials causes the F-N current to occur only in the tunnel oxide film of the selected cell to change the state of the charge in the charge storage layer.

In the case where a negative charge is drawn from the charge storage layer for erasing data, for example, the fourth potential is larger than the third potential. Supposing that the "1" means that a negative charge is stored in the charge storage layer, the state of the charge in the charge storage layer is changed to the "0." At this time, the third potential is a potential allowing the change to "0" by the difference between the third potential and the fourth potential, that is, a potential allowing the occurrence of a sufficient F-N current as means for changing the state of the charge. The F-N current flows in the tunnel oxide film of a memory transistor having, as the gate electrode, the third electrode to which the third potential is applied.

The eighth potential is preferably a potential equal to the fourth or ninth potential applied to the terminal connected via an island-like semiconductor layer.

The twelfth potential is a potential causing a sufficiently smaller change in the state of the charge in the charge storage layers in non-selected cells than in the selected cell, for example, a potential such that a difference between the twelfth potential and the eighth potential and a difference between the twelfth potential and the fourth potential cause only a sufficiently small F-N current in the tunnel oxide films of the memory transistors having, as the gate electrodes, the third electrodes connected to the third wires (not 3-*j*-1 to 3-*j*-2) to which the twelfth potential is applied.

The first wires (1-1 to 1-N) may be open and the ninth potential may be open.

In the case where the first wires (1-1 to 1-N) are formed as impurity diffusion layers in the semiconductor substrate and the channel region of a selected memory cell is electrically connected to the semiconductor substrate when the potential of the first wires (1-1 to 1-N) is floating, the fourth potential applied to the first wire (1-*j*) connected to the island-like semiconductor layer including the selected cell is a potential such that the island-like semiconductor layer and the semiconductor substrate are electrically floated by a depletion layer extended toward the semiconductor substrate owing to the application of the fourth potential. Thereby the potential of the island-like semiconductor layer equals the fourth potential and a sufficiently large F-N current flows in the tunnel oxide film of the memory transistor of the selected cell on the island-like semiconductor layer, so that data is erased.

That is, the difference between the fourth potential and the third potential becomes a potential difference allowing a sufficient F-N current to flow in the tunnel oxide film of the memory transistor.

In the case where the channel region of the memory cell is not electrically connected to the semiconductor substrate, the depletion layer owing to the fourth potential may have any extension.

In the case where the first wires (1-1 to 1-N) are formed to be electrically insulated from the semiconductor substrate, for example, where the first wires (1-1 to 1-N) are formed of an impurity diffusion layer in an SOI substrate and is insulated from the semiconductor substrate by an insulating film, the first potential is not necessarily the same as the tenth potential.

In the case where the channel region of a selected memory cell is electrically connected to the semiconductor substrate, for example, in the case where impurity diffusion layers do not render the island-like semiconductor layers in the floating state from the substrate, the tenth potential applied to the semiconductor substrate can erase simultaneously all memory cells having as the gate electrodes the third electrodes to which the third potential is applied, provided that a difference between the tenth potential and the third potential causes a sufficient change in the state of the charge in the charge storage layer.

The memory cells may be sequentially erased from a memory cell connected to a third wire (3-*j*-2) to a memory cell connected to a third electrode (3-*j*-1), or may be erased in reverse order or at random. Further, some or all memory cells connected to the third wire (3-*j*-1) may be erased at the same time, some or all memory cells connected to the third wires (3-*j*-1 to 3-*j*-2) may be erased at the same time, and some or all memory cells connected to the third wires (3-1-1 to 3-N-2) may be erased at the same time. Also, some or all memory cells connected to third wires selected regularly, e.g., the third wires (3-(j–8)-h), (3-*j*-h), (3-(j+8)-h), (3-(j+16)-h), . . . (h=1 or 2), may be erased at the same time.

Further some or all memory cells of one island-like semiconductor layer connected to the fourth wire (4-*i*) may be erased at the same time, or some or all memory cells of some or all island-like semiconductor layers connected to the fourth wire (4-*i*) may be erased at the same time. One, some or all memory cells of one island-like semiconductor layer connected to each of a plurality of fourth wires may be erased at the same time, or some or all memory cells of some or all island-like semiconductor layers connected to each of a plurality of fourth wires may be erased at the same time.

The memory cells connected to the third wire (3-*j*-h) may be erased at the same time by given intervals, for example, every eight fourth wires (e.g., a fourth wire (4-(i–16)), a fourth wire (4-(i–8)), a fourth wire (4-*i*), a fourth wire (4-(i+8)), a fourth wire (4-(i+16)), . . . ).

Further, by applying the fourth potential to a plurality of first wires and applying the third potential to the third wires connected to the third electrodes of the memory cells included in the island-like semiconductor layers having the first electrodes connected to said plurality of first wires, all the memory cells having, as gate electrodes, the third electrodes connected to the third wires to which the third potential is applied can be erased at the same time. The above-described erasing processes may be combined.

Erasure may be defined as changing the state of the charge in the charge storage layer and raising the threshold of the selected memory transistor. In this case, the third potential is large than the fourth potential, and the third potential is a potential allowing the state of the charge in the charge storage layer to be changed sufficiently by the difference between the third potential and the fourth potential, for example, a potential allowing the occurrence of a sufficient F-N current. Means for changing the state of the charge in the charge storage layer is not limited to the F-N current.

FIG. 73 shows an equivalent circuit diagram of a memory cell array in which the first wires are arranged in parallel to the third wires. The application of the potentials of FIG. 73 is the same as that of FIG. 62 for erasing data except that the third potential is applied to the third wire (3-*j*-2) and the seventh potential is applied to the third wires (3-*j*-1) connected to a non-selected cell. Here, the seventh potential is a potential causing a sufficiently smaller change in the state of the charge in the charge storage layers in non-selected cell than in the selected cell, for example, a potential such that a difference between the seventh potential and the fourth potential causes only a sufficiently small F-N current in the tunnel oxide film of the memory transistors having, as the gate electrodes, the third electrodes connected to the third wire (3-*j*-1) to which the seventh potential is applied.

Figure 74:
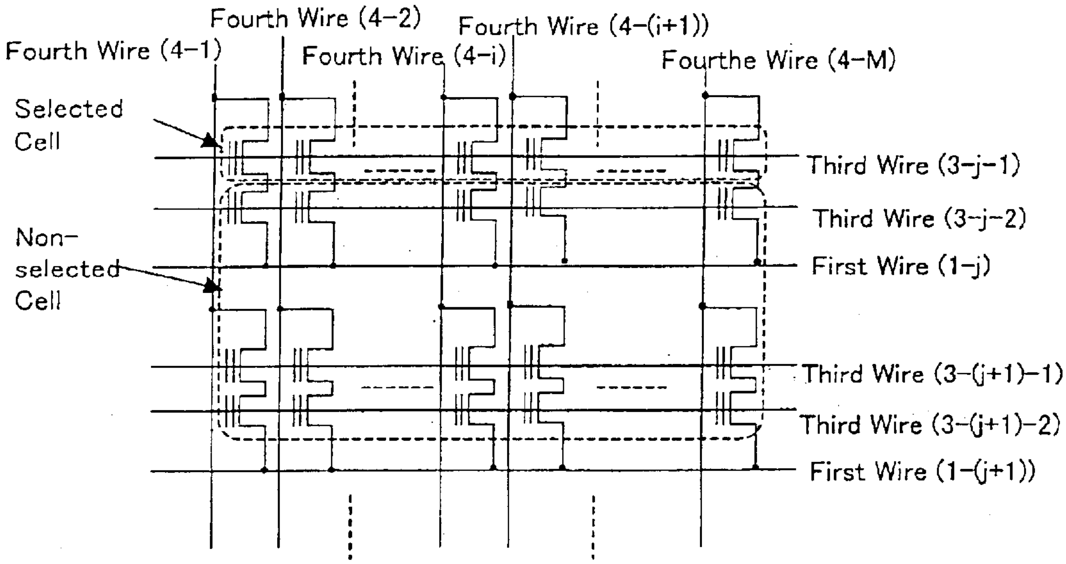

FIG. 74 shows an equivalent circuit diagram of a memory cell array in which the first wires are arranged in parallel to the third wires. The application of the potentials of FIG. 74 is the same as that of FIG. 62 for erasing data except that the fourth potential is applied to the fourth wires (4-1 to 4-M). A memory cell connected to the first wire (1-*j*) and the third wire (3-*j*-1) can be selected and erased.

Figure 75:
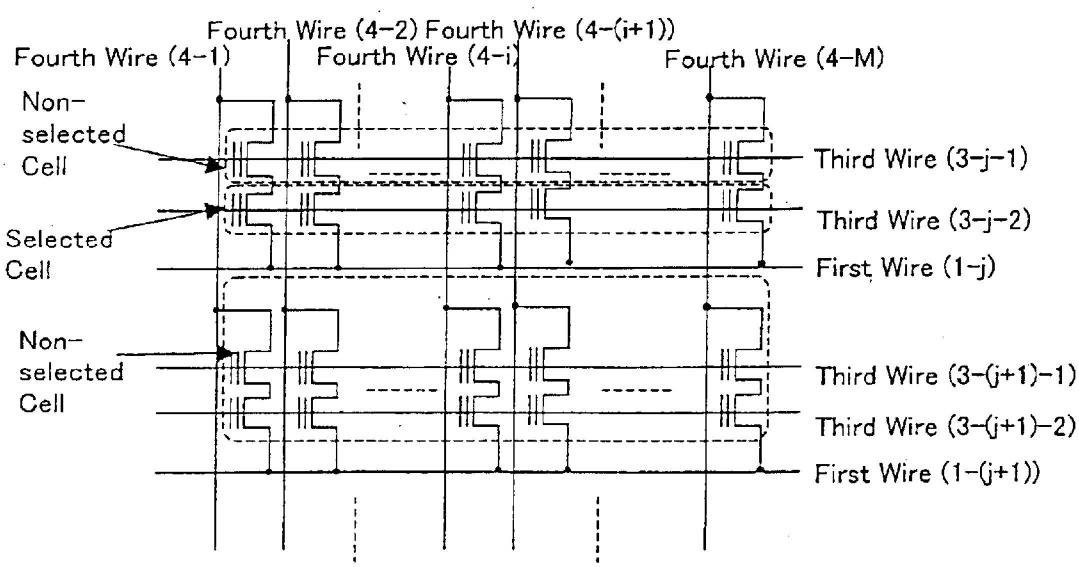

FIG. 75 shows an equivalent circuit diagram of a memory cell array in which the first wires are arranged in parallel to the third wires. The application of the potentials of FIG. 75 is the same as that of FIG. 73 for erasing data except that the third potential is applied to the third wire (3-*j*-2) and the seventh potential is applied to the third wires (3-*j*-1) connected to a non-selected cell. Here, the seventh potential is a potential causing a sufficiently smaller change in the state of the charge in the charge storage layers in non-selected cell than in the selected cell, for example, a potential such that a difference between the seventh potential and the fourth potential causes only a sufficiently small F-N current in the tunnel oxide film of the memory transistors having, as the gate electrodes, the third electrodes connected to the third wire (3-*j*-1) to which the seventh potential is applied.

FIG. 76 shows an equivalent circuit diagram of a memory cell array in which the first wires are arranged in parallel to the fourth wires. The application of the potentials of FIG. 76 is the same as that of FIG. 72 for erasing data except that the fourth potential is applied to the first wire (1-*i*) and the ninth potential is applied to the first wires (not 1-*i*).

FIG. 77 shows an equivalent circuit diagram of a memory cell array in which the first wires are arranged in parallel to the fourth wires. The application of the potentials of FIG. 77 is the same as that of FIG. 76 for erasing data except that the third potential is applied to the third wire (3-*j*-2) connected to the selected cell and the seventh potential is applied to the third wires (3-*i*-1) connected to the non-selected cell. Here, the seventh potential is a potential causing a sufficiently smaller change in the state of the charge in the charge storage layers in non-selected cell than in the selected cell, for example, a potential such that a difference between the seventh potential and the fourth potential causes only a sufficiently small F-N current in the tunnel oxide film of the memory transistors having, as the gate electrodes, the third electrodes connected to the third wire (3-*j*-1) to which the seventh potential is applied.

Figure 78:
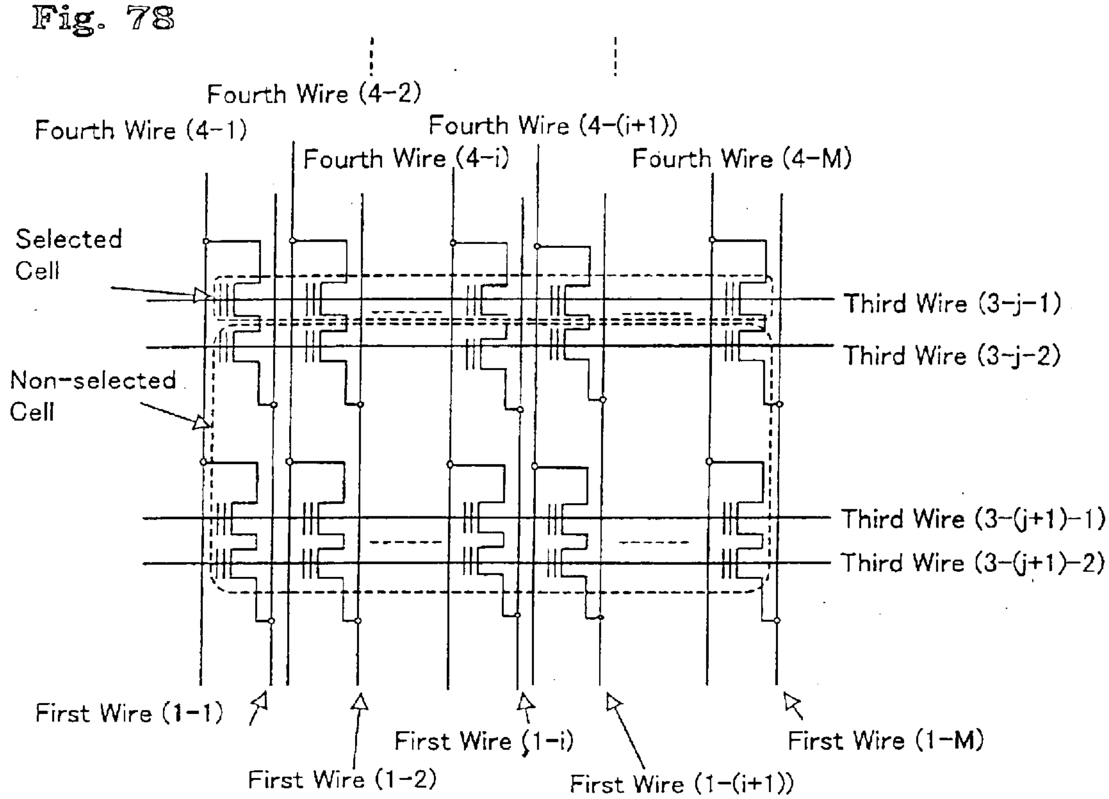

FIG. 78 shows an equivalent circuit diagram of a memory cell array in which the first wires are arranged in parallel to the fourth wires. A memory cell connected to the first wire (1-*i*) and the third wire (3-*j*-1) can be selected and erased. The application of the potentials of FIG. 78 is the same as that of FIG. 76 for erasing data except that the fourth potential is applied to the fourth wires (4-1 to 4-M).

Figure 79:
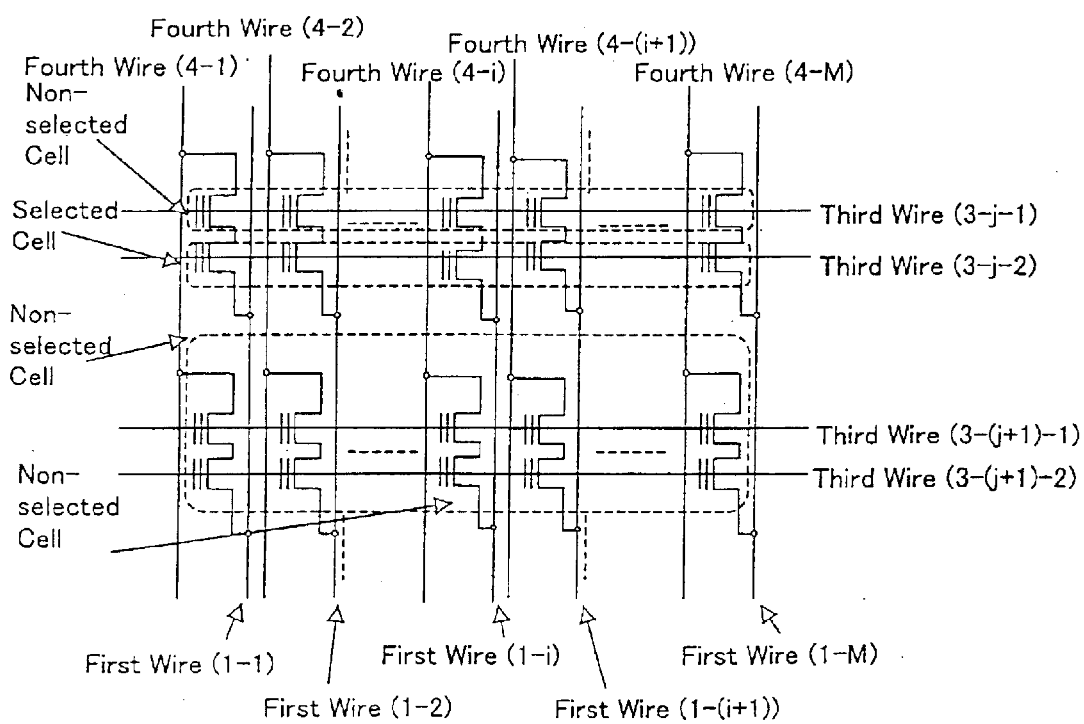

FIG. 79 shows an equivalent circuit diagram of a memory cell array in which the first wires are arranged in parallel to the third wires. The application of the potentials of FIG. 79 is the same as that of FIG. 78 for erasing data except that the third potential is applied to the third wire (3*j*-2) connected to the selected cell and the seventh potential is applied to the third wires (3-*j*-1) connected to a non-selected cell. Here, the seventh potential is a potential causing a sufficiently smaller change in the state of the charge in the charge storage layers in non-selected cell than in the selected cell, for example, a potential such that a difference between the seventh potential and the fourth potential causes only a sufficiently small F-N current in the tunnel oxide film of the memory transistors having, as the gate electrodes, the third electrodes connected to the third wire (3-*j*-1) to which the seventh potential is applied.

FIG. 80 shows an equivalent circuit diagram of a memory cell array in which a plurality of first wires are electrically connected in common. The application of the potentials of FIG. 80 is the same as that of FIG. 72 for erasing data except that the fourth potential is applied to the first wire (1-1).

FIG. 81 shows an equivalent circuit diagram of a memory cell array in which a plurality of first wires are electrically connected in common. The application of the potentials of FIG. 81 is the same as that of FIG. 80 for erasing data except that the third potential is applied to the third wire (3-*j*-2) connected to the selected cell and the seventh potential is applied to the third wire (3-*i*-1) connected to a non-selected cell. Here, the seventh potential is a potential causing a sufficiently smaller change in the state of the charge in the charge storage layers in non-selected cell than in the selected cell, for example, a potential such that a difference between the seventh potential and the fourth potential causes only a sufficiently small F-N current in the tunnel oxide-film of the memory transistors having, as the gate electrodes, the third electrodes connected to the third wire (3-*j*-1) to which the seventh potential is applied.

Figure 82:
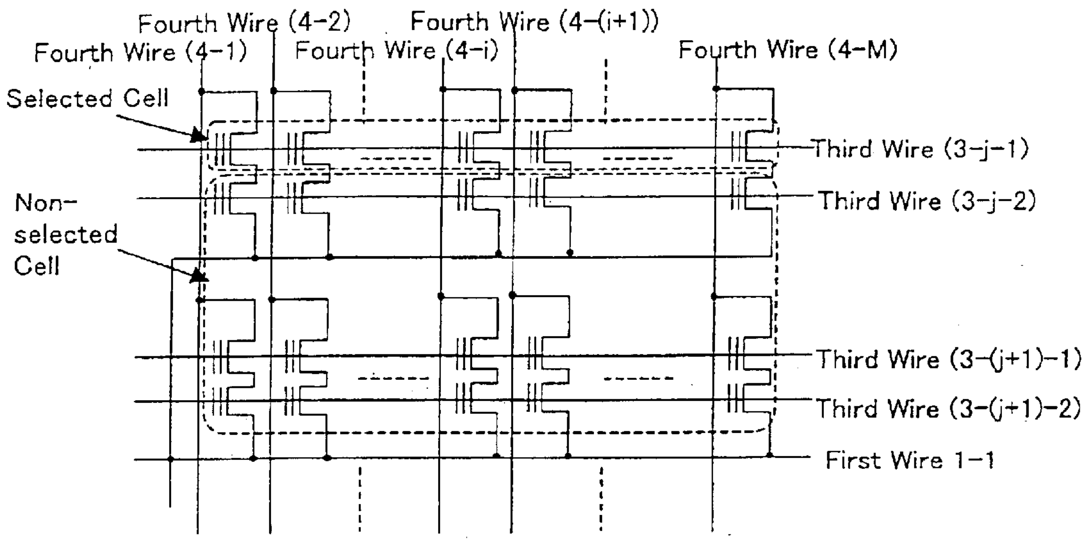

FIG. 82 shows an equivalent circuit diagram of a memory cell array in which a plurality of first wires are electrically connected in common. The application of the potentials of FIG. 82 is the same as that of FIG. 81 for erasing data except that the fourth potential is applied to the fourth wires (4-1 to 4-M). A memory cell connected to the first wire (1-*i*) and the third wire (3-*j*-1) can be selected and erased.

Figure 83:
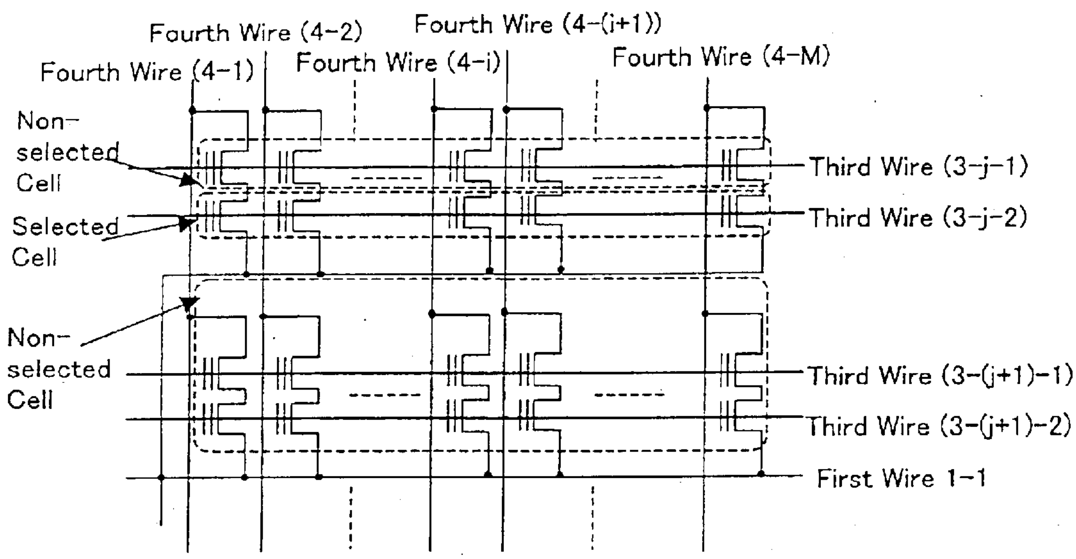

FIG. 83 shows an equivalent circuit diagram of a memory cell array in which a plurality of first wires are electrically connected in common. The application of the potentials of FIG. 83 is the same as that of FIG. 82 for erasing data except that the third potential is applied to the third wire (3-*j*-2) connected to the selected cell and the seventh potential is applied to the third wire (3-*i*-1) connected to a non-selected cell. Here, the seventh potential is a potential causing a sufficiently smaller change in the state of the charge in the charge storage layers in non-selected cell than in the selected cell, for example, a potential such that a difference between the seventh potential and the fourth potential causes only a sufficiently small F-N current in the tunnel oxide film of the memory transistors having, as the gate electrodes, the third electrodes connected to the third wire (3-*j*-1) to which the seventh potential is applied.

Now are described examples of timing charts for applying potentials for erasing data in the case where there are arranged M×N (M and N are positive integers) island-like semiconductor layers having two memory cells formed of the P-type semiconductor and arranged in series and selection transistors formed to sandwich the memory cells therebetween, the first wires and the third wires are arranged in parallel and the selected cell is a memory cell having the selected third electrode as the gate electrode.

Figure 170:
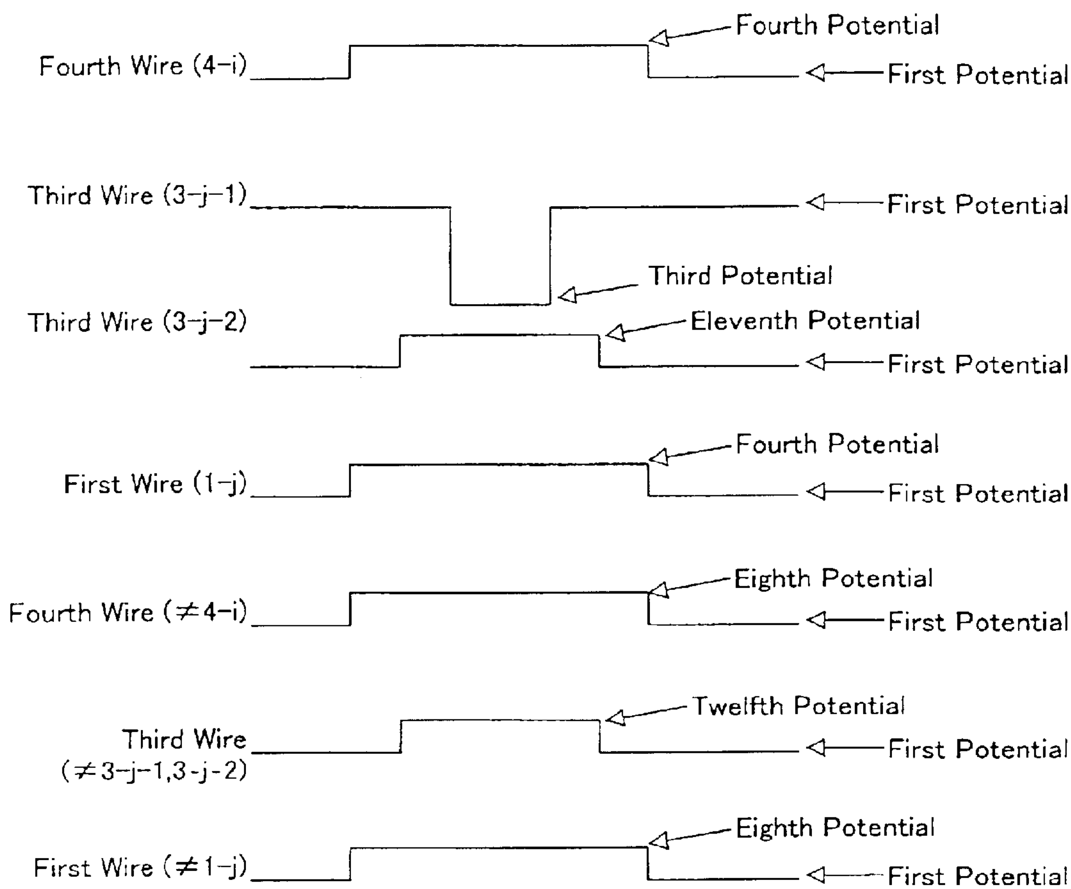

In FIG. 170, a selected third wire as shown in FIG. 74 is negative-biased, and the memory cell has a threshold of 1.0 V to 3.5 V when it is in the written state and has a threshold of −1.0 V or lower when it is in the erased state.

For drawing a negative charge from the charge storage layer, for example, a ground potential is applied as the first potential to the first wires (1-1 to 1-N), the third wires (3-1-1 to 3-N-L) and the fourth wires (4-1 to 4-M). In this state, the eighth potential, e.g., 6 V which is equal to the fourth potential, is applied to first wires (not 1-*j*) other than the first wire (1-*j*), the eighth potential, e.g., 6 V which is equal to the fourth potential, is applied to fourth wires (not 4-*i*) other than the fourth wire (4-*i*), the fourth potential, e.g., 6 V, is applied to the first wire (1-*j*), the fourth potential, e.g., 6 V, is applied to the fourth wire (4-*i*), the eleventh potential, e.g., 6 V, is applied to the third wire (3-*j*-2) other than the third wire (3-*j*-1), the twelfth potential, e.g., 6 V, is applied to third wires (not 3-*j*-1 to 3-*j*-2) other than mentioned above, and the third potential, e.g., −12 V, is applied to the third wire (3-*j*-1). The selected cell is erased to "0" by sustaining this state for a desired period of time. The potentials may be applied to the respective wires in another order or simultaneously.

The third wire (3-*j*-1) is returned to the ground potential, i.e., the first potential, the third wires (not 3-*j*-1) other than the third wire (3-*j*-1) are returned to the ground potential, i.e., the first potential, the fourth wires (4-1 to 4-M) are returned to the ground potential, i.e., the first potential, and the first wires (1-1 to 1-N) are returned to the ground potential, i.e., the first potential. The respective wires may be returned to the ground potential in another order or simultaneously. The potentials given may be any combination of potentials so long as they meet conditions for erasing a desired cell.

Here, the same potential is preferably applied initially as the first potential to the first wires (1-1 to 1-N), the third wires (3-1-1 to 3-N-L) and the fourth wires (4-1 to 4-M), but different potentials may be applied.

Thereby a plurality of cells connected to the selected third wire as shown in FIG. 74 are erased.

In the above example, the erasing process has been described with the case where the selected cell is a memory cell having the third wire (3-*j*-1) as the gate electrode. However, the erasing process is the same with the case where the selected cell is a memory cell having the third wire (3-*j*-2) as the gate electrode.

Figure 171:
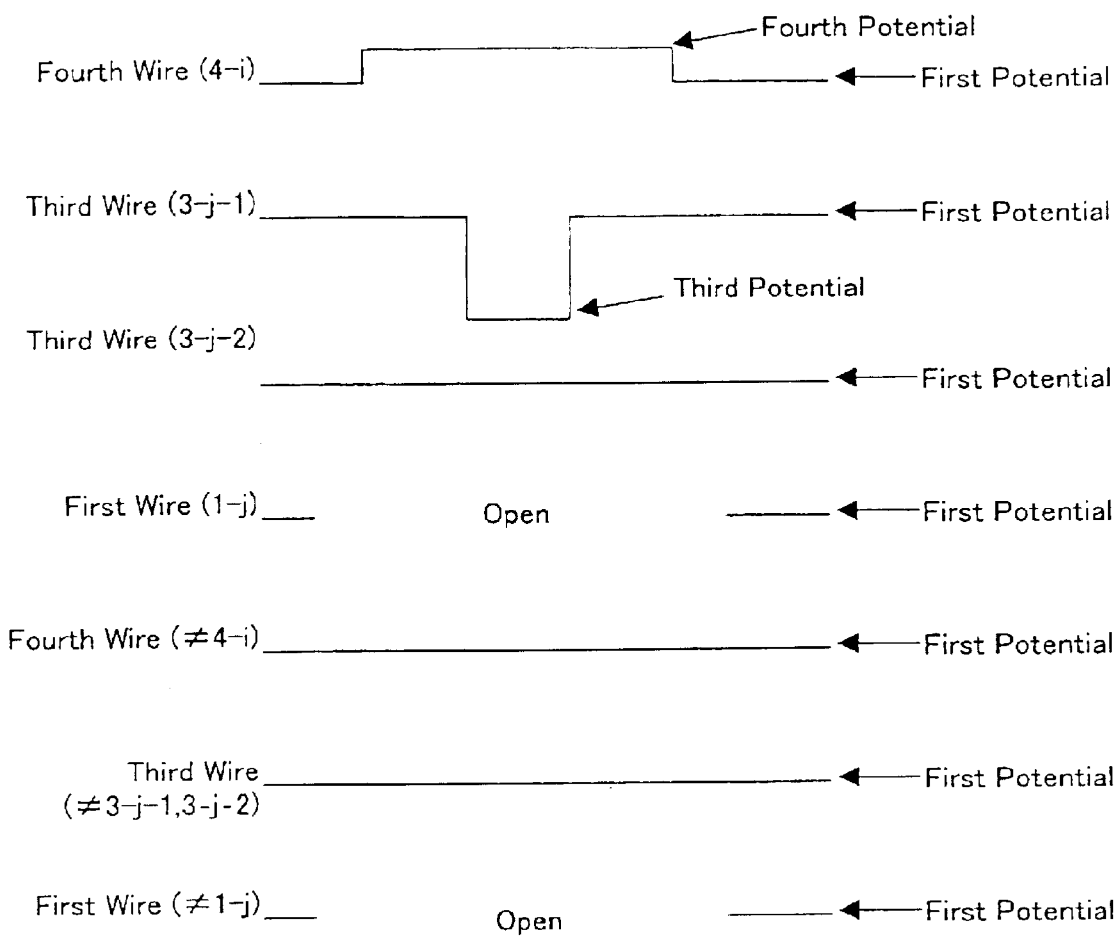

FIG. 171 shows a timing chart showing an example of timing of applying each potential for erasing data in the case where the first wire is open in contrast to FIG. 170.

The erasing process of FIG. 171 conforms to that of FIG. 170 except that the first electrode 10 is open and the ground potential is applied as the first potential to the non-selected third wires (3-*i*-2) and the fourth wires (not 4-*i*). Also in FIG. 171, the selected cell as shown in FIG. 72 is erased.

If 6 V is applied as the eighth potential to the fourth wires (not 4-*i*), a plurality of cells connected to the elected third wire as shown in FIG. 74 are erased. If 6 V is applied as the eighth potential to the fourth wires (not 4-*i*) and −12 V is applied as the third potential to the third wires (3-*i*-1 to 3-*i*-L), a plurality of cells connected to the first wire (1-*j*) are erased. If 6 V is applied as the fourth potential to all the fourth wires (4-1 to 4-M) and −12 V is applied as the third potential to all the third wires (3-1-1 to 3-N-2), all cells are erased.

Figure 172:
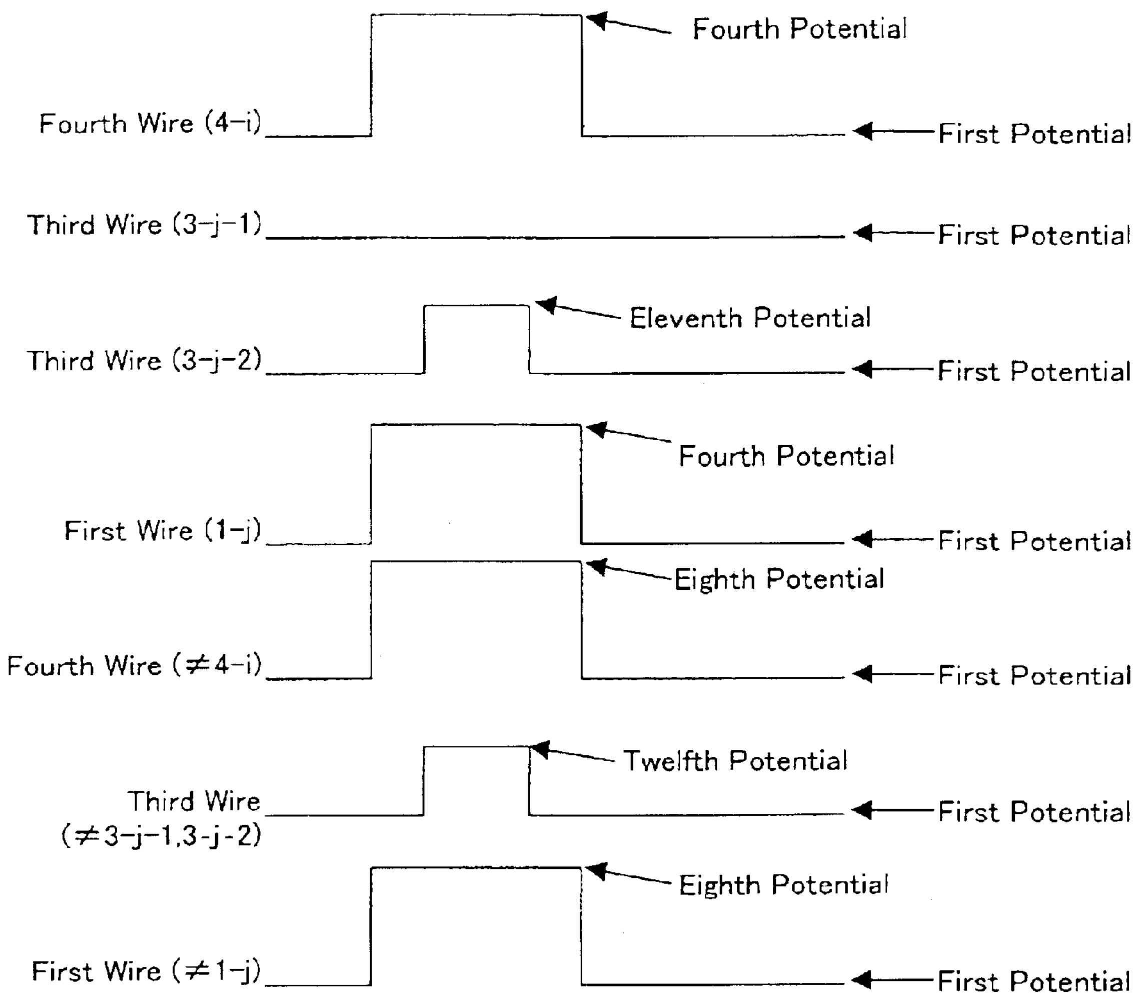

In FIG. 172, 18 V for example is applied as the fourth potential and the ninth potential to the first wire, and the memory cell has a threshold of 1.0 V to 3.5 V when it is in the written state and has a threshold of −1.0 V or lower when it is in the erased state.

For drawing a negative charge from the charge storage layer, for example, a ground potential is applied as the first potential to the first wires (1-1 to 1-N), the third wires (3-1-1 to 3-N-L) and the fourth wires (4-1 to 4-M). In this state, the eighth potential, e.g., 18 V which is equal to the fourth potential, is applied to fourth wires (not 4-*i*) other than the fourth wire (4-*i*), the eighth potential, e.g., 18 V which is equal to the fourth potential, is applied to first wires (not 1-*j*) other than the first wire (1-*j*), the fourth potential, e.g., 18 V, is applied to the fourth wire (4-*i*), the fourth potential, e.g., 18 V, is applied to the first wire (1-*j*), the eleventh potential, e.g., 10 V, is applied to the third wire (3-*j*-2), the twelfth potential, e.g., 10 V, is applied to third wires (not 3-*j*-1 to 3-*j*-2) other than mentioned above, and the third potential, e.g., the ground potential which is the first potential, is kept applied to the third wire (3-*j*-1). The selected cell is erased to "0" by sustaining this state for a desired period of time. The potentials may be applied to the respective wires in another order or simultaneously.

The third wires (not 3-*j*-1) other than the third wire (3-*j*-1) are returned to the ground potential, i.e., the first potential, the fourth wires (4-1 to 4-M) are returned to the ground potential, i.e., the first potential, and the first wires (1-1 to 1-N) are returned to the ground potential, i.e., the first potential. The respective electrodes may be returned to the ground potential in another order or simultaneously. The potentials given may be any combination of potentials so long as they meet conditions for erasing a desired cell.

Here, the same potential is preferably applied initially as the first potential to the first wires (1-1 to 1-N), the third wires (3-1-1 to 3-N-L), and the fourth wires (4-1 to 4-M), but different potentials may be applied. Thereby a plurality of cells connected to the selected third wire as shown in FIG. 82 are erased. In the above example, the erasing process has been described with the case where the selected cell is a memory cell having the third wire (3-*j*-1) as the gate electrode. However, the erasing process is the same with the case where the selected cell is a memory cell having the third wire (3-*j*-2) as the gate electrode.

Figure 173:
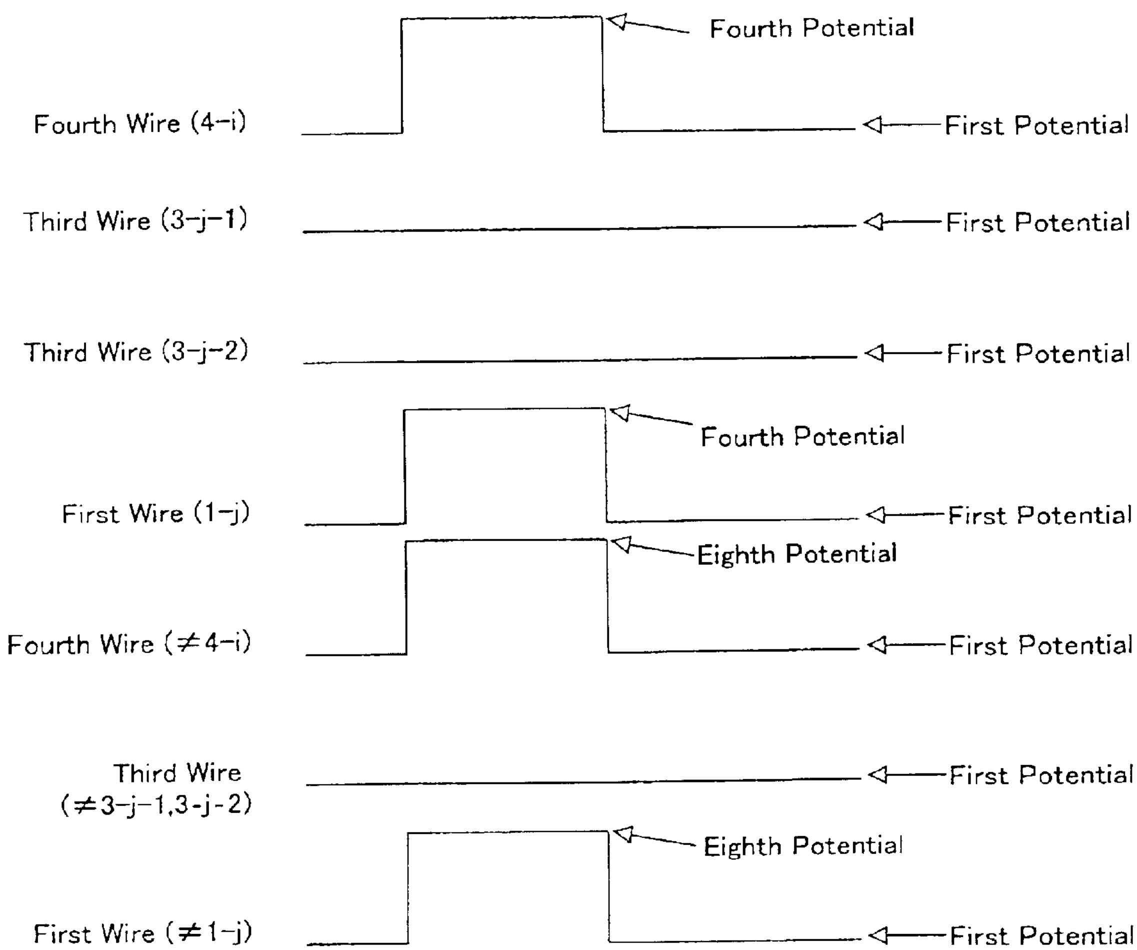
Figure 174:
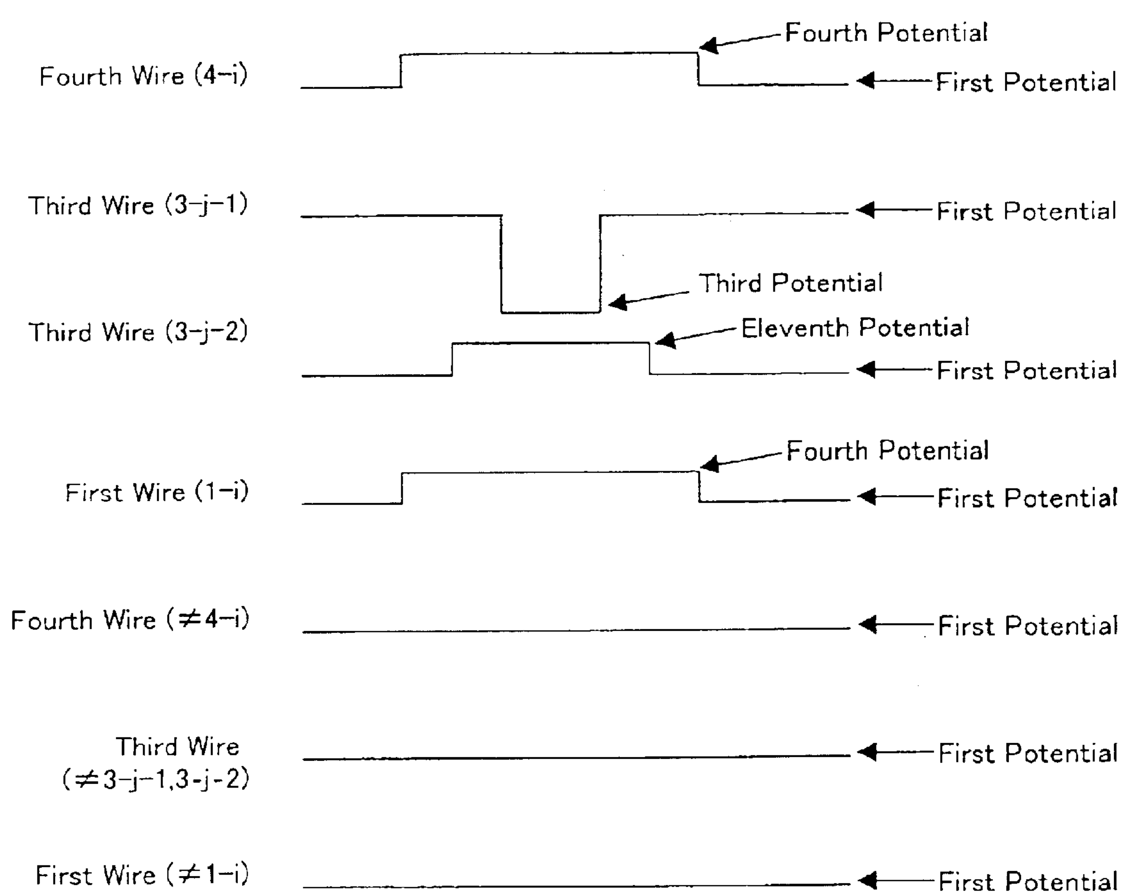
Figure 175:
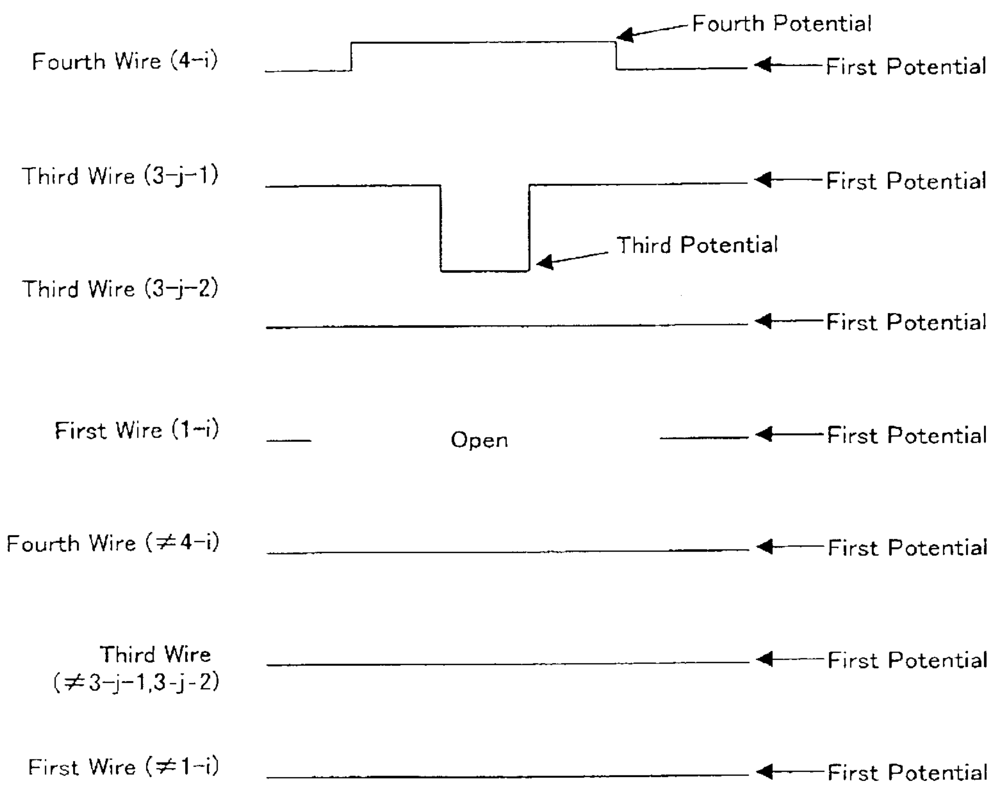
Figure 176:
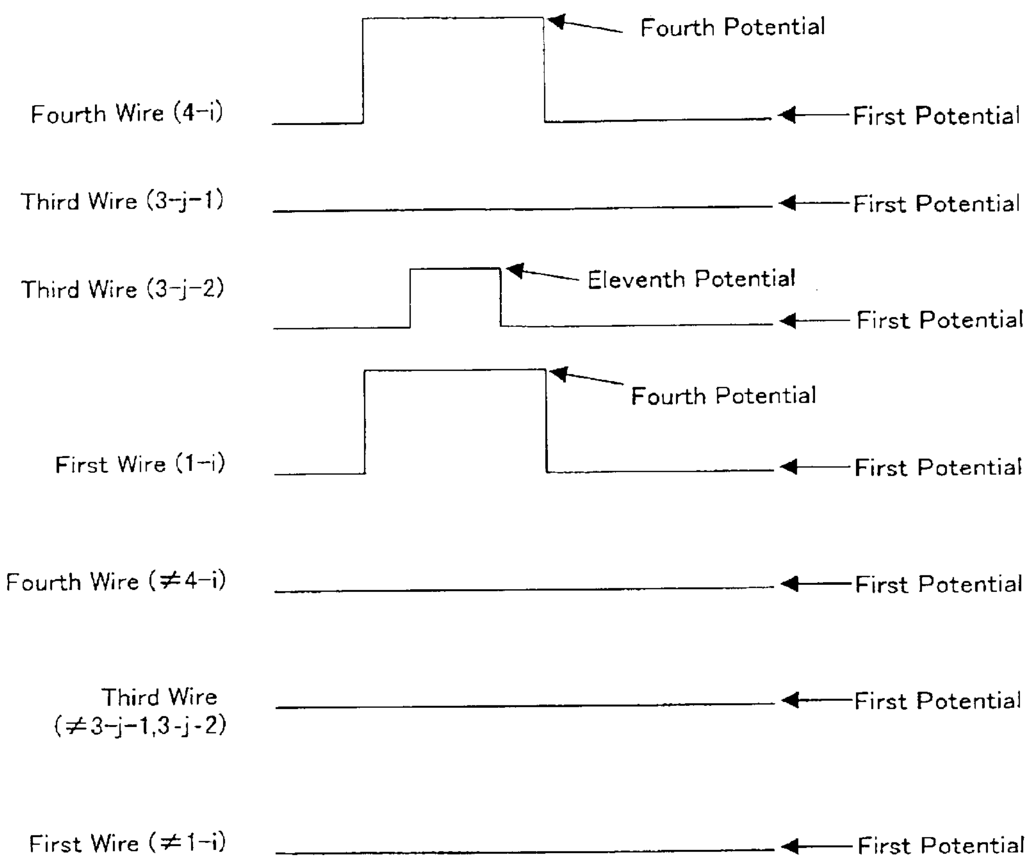
Figure 177:
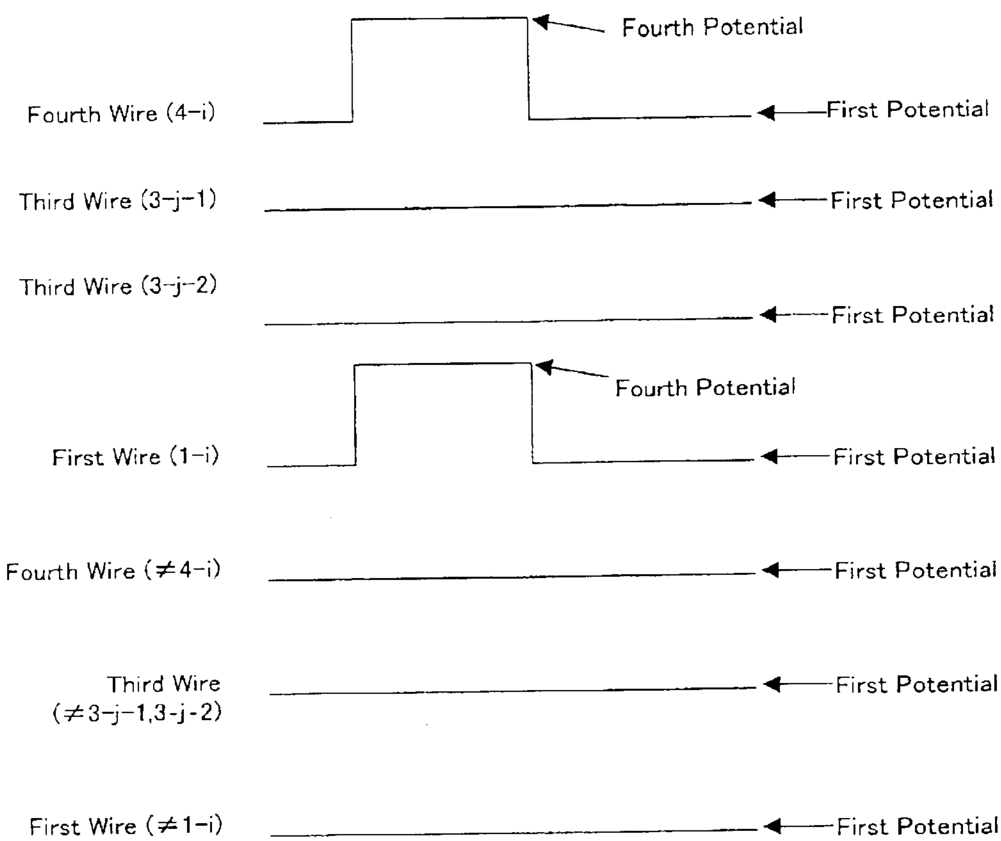
Figure 178:
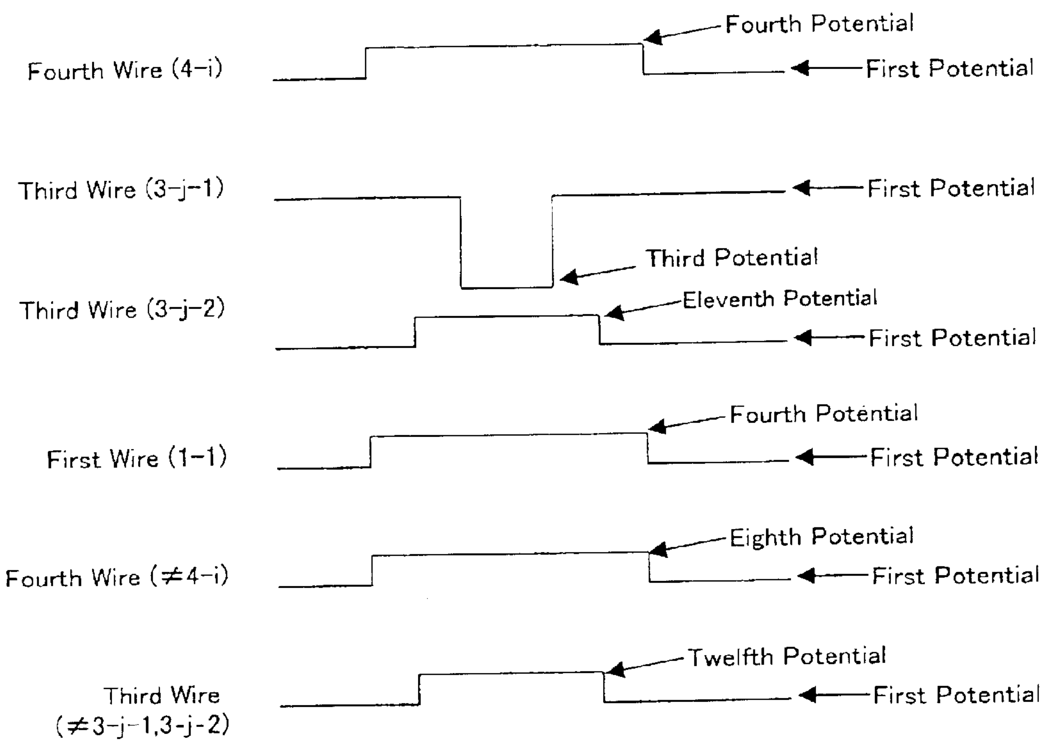
Figure 179:
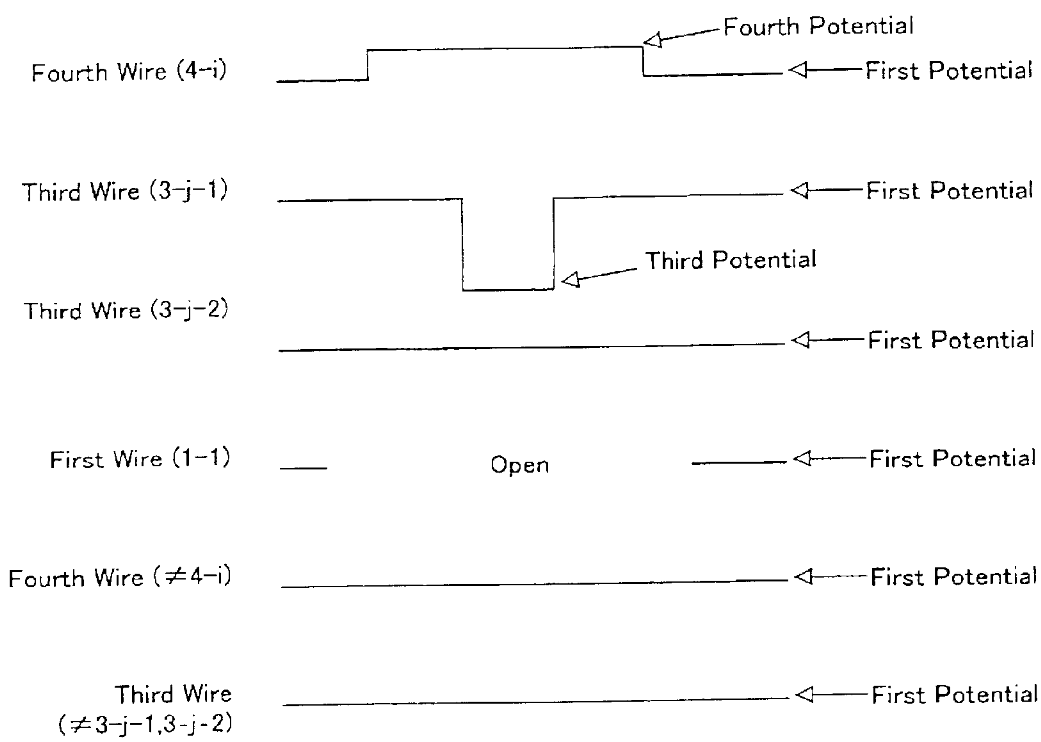
Figure 180:
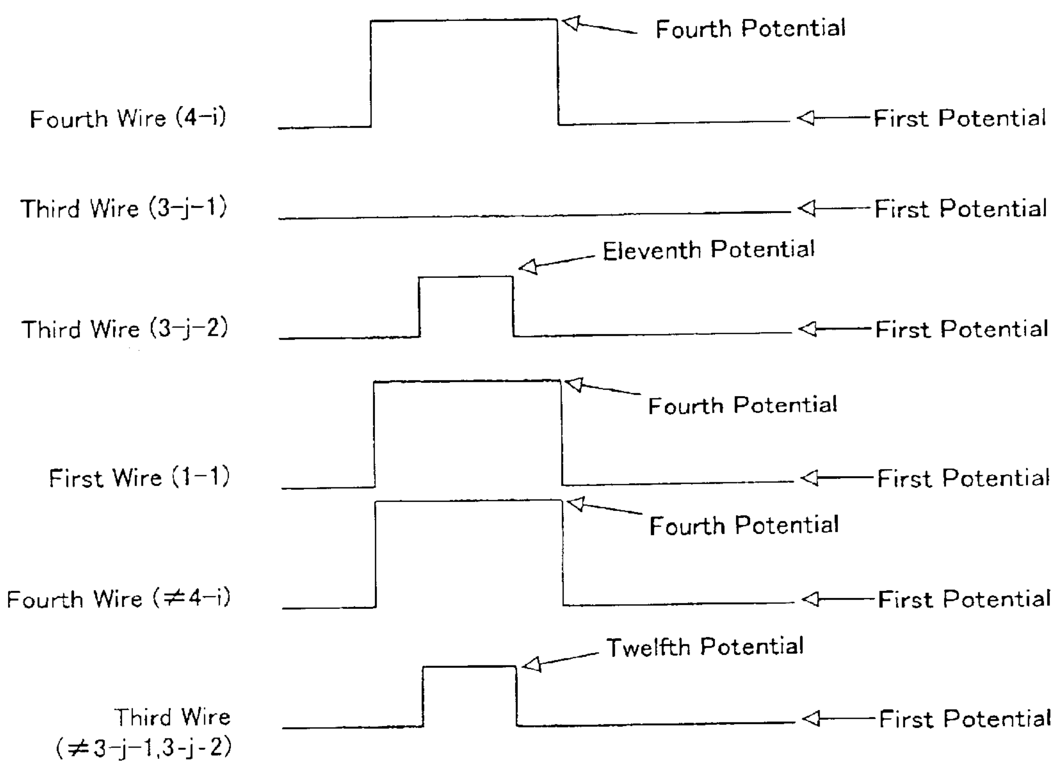
Figure 181:
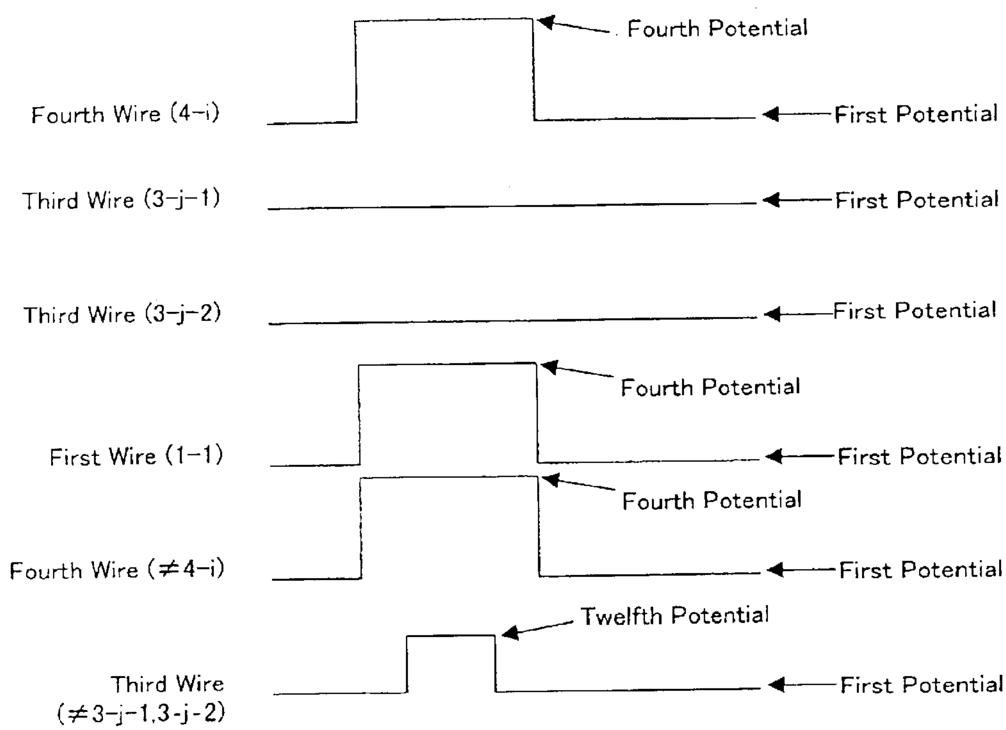

If the ground potential, i.e., the first potential, is applied as the third potential to the third wires (3-*i*-1 to 3-*i*-2) as shown in a timing chart of FIG. 173 for the potentials for erasing data, a plurality of cells connected to the first wire (1-*j*) are erased. If the ground potential is applied as the third potential to all the third wires (3-1-1 to 3-N-2), all cells are erased.

FIG. 174 to FIG. 177 show examples of timing charts for erasing data in the case where the first wires are arranged in parallel to the fourth wires.

FIG. 174 to FIG. 177 conform to FIG. 170 to FIG. 173, respectively, except that the first wire (1-*i*) instead of the first wire (1-*j*) is connected to the end of the island-like semiconductor layer including the selected cell. At this time, as shown in FIG. 174 to FIG. 177, the ground potential may be applied as the first potential to the fourth wires (not 4-*i*), the third wires (not 3-*j*-1 to 3-*j*-L) and the first wires (not 1i).

FIG. 178 to FIG. 181 show examples of timing charts for erasing data in the case where the first wires are connected in common in the entire array. FIG. 178 to FIG. 181 conform to FIG. 170 to FIG. 173, respectively, except that the first wire (1-*i*) instead of the first wire (1-*j*) is connected to the end of the island-like semiconductor layer including the selected cell.

An erasing process is now explained with a semiconductor memory according to the present invention which is constructed to include a plurality of (e.g., M×N, wherein M and N are positive integers) island-like semiconductor layers each having, for example, two memory cells connected in series, the memory cells being each provided with the charge storage layer and the third electrode as a control gate electrode. In this memory cell array, a plurality of (e.g., M) fourth wires arranged in parallel with the semiconductor substrate are connected to end portions of the island-like semiconductor layers, and first wires are connected to opposite end portions of the island-like semiconductor layers. A plurality of (e.g., N×2) third wires are arranged in parallel to the semiconductor substrate and in a direction crossing the fourth wires and are connected to the third electrodes of the memory cells. The erasing process utilizes the channel hot electron (CHE) current.

FIG. 74 shows an equivalent circuit diagram of the above-described memory cell array in which the first wires are arranged in parallel to the third wires.

For example, in the case where the island-like semiconductor layers are formed of a P-type semiconductor, a selected cell shown in FIG. 74 is erased by applying a first potential to the first wire (1-*j*, wherein j is a positive integer, 1≦j≦N) connected to the first electrode of an island-like semiconductor layer including the selected cell, a ninth potential to first wires (not 1-*j*) other than the above-mentioned first wire (1-*j*), a third potential to the third wire (3-*j*-1) connected to the selected cell, an eleventh potential to a third wire (3-*j*-2) connected to a non-selected cell arranged in series with the selected cell, a twelfth potential to third wires (not 3-*j*-1 to 3-*j*-2) connected other than mentioned above, a fourth potential to a fourth wire (4-*i*, wherein i is a positive integer, 1≦i≦M) connected to the fourth electrode of the island-like semiconductor layer including the selected cell and an eighth potential to fourth wires (not 4-*i*) other than the above-mentioned fourth wire (4-*i*). The application of these potentials causes the CHE current to occur in the tunnel region of the selected cell to change the state of the charge in the charge storage layer.

In the case where the "1" is erased by storing a negative charge in the charge storage layer, for example, the fourth potential is larger than the first potential and the third potential is larger than the first potential. In this case, the first potential is preferably a ground potential. The third or fourth potential is a potential such that the "1" can be erased by a difference between the third potential and the first potential or by a difference between the fourth potential and the first potential, for example, a potential such that the above-mentioned potential difference can produce a sufficient CHE current as means for changing the state of the charge in the charge storage layer. The CHE current flows in the tunnel oxide film of the memory transistor having as the gate electrode the third electrode to which the third potential is applied.

The eleventh potential is a potential always allowing the cell current to flow in the memory cell regardless of the state of the charge in the charge storage layer, that is, a potential such that a reverse layer can be formed in the channel region of the memory cell and the state of the charge in the charge storage layer is not changed by the eleventh potential. For example, supposing that the erasure of the "1" means storing electrons in the charge storage layer, for example, the eleventh potential is a potential not less than the threshold that the memory transistor having, as the gate electrode, the third electrode connected to the third wire (3-*j*-2) can take and allows only a sufficiently small F-N or CHE current to flow in the funnel oxide film of the memory transistor having, as the gate electrode, the third electrode to which the eleventh potential is applied. The ninth potential may be an optional potential which does not erase the "1" by the potential difference from the eight potential, the fourth potential and the twelfth potential, but is preferably equal to the eighth potential. The ninth potential may be open. The twelfth potential is preferably a grand potential.

In the case where the first wires (1-1 to 1-N) are formed as impurity diffusion layers in the semiconductor substrate and the tenth potential applied to the semiconductor substrate, the first potential is generally a ground potential. In the case where the first wires (1-1 to 1-N) are formed to be electrically insulated from the semiconductor substrate, for example, in the case where the first wires (1-1 to 1-N) are formed as impurity diffusion layers in an SOI substrate and is insulated from the semiconductor substrate by an insulating film, the first potential is not necessarily the same as the tenth potential.

The memory cells may be sequentially erased from a memory cell connected to a third wire (3-*j*-2) to a memory cell connected to a third electrode (3-*j*-1), or may be erased in reverse order or at random. Further, some or all memory cells connected to the third wire (3-*j*-1) may be erased at the same time, and some or all memory cells connected to the third wires (3-1-1 to 3-N-2) may be erased at the same time. Also, some or all memory cells connected to third wires selected regularly, e.g., the third wires (3-(j−8)-1), (3-*j*-1), (3-(j+8)-1), (3-(j+16)-1), . . . , may be erased at the same time.

Further some or all memory cells of one island-like semiconductor layer connected to the fourth wire (4-*i*) may be erased at the same time, or some or all memory cells of some or all island-like semiconductor layers connected to the fourth wire (4-*i*) may be erased at the same time. Memory cells of one island-like semiconductor layer connected to each of a plurality of fourth wires may be erased at the same time, or memory cells of some or all island-like semiconductor layers connected to each of a plurality of fourth wires may be erased at the same time.

The memory cells connected to the third wire (3-*j*-1) may be erased at the same time by given intervals, for example, every eight fourth wires (e.g., a fourth wire (4-(i−16)), a fourth wire (4-(i−8)), a fourth wire (4-*i*), a fourth wire (4-(i+8)), a fourth wire (4-(i+16)), . . . ). All the memory cells having, as the gate electrodes, the third electrodes connected to the third wire (3-*j*-1) can be erased at the same time by applying the first potential to all the fourth wires, applying the fourth potential to the first wire (1-*j*) and the eighth potential to the first wires (not 1-*j*) and applying the third potential to the third wire (3-*j*-1). Further, the selected cell can be erased by applying the ninth potential (the first potential<the ninth potential<the fourth potential) to fourth wires (not 4-*i*) not including the selected cell, the first potential to the fourth wire (4-*i*), the fourth potential to the first wire (1-*j*), the eight potential to first wires (not 1-*j*) and the third potential to the third wire (3-*j*-1).

Further, all memory cells having, as the gate electrodes, the third electrodes connected to the third wire to which the third potential is applied by applying the fourth potential to a plurality of first wires, the third potential to the third wire (3-*j*-1) connected to the third electrode of the memory cell included in the island-like semiconductor layer having the first electrode connected to the first wire and the eleventh potential to the third wires (not 3-*j*-1). The above-described erasing processes may be combined.

The charge storage layer may be a dielectric, a laminated insulating film and the like in addition to the floating gate. Also it is needless to say that the erasure to the "0" means changing the state of the charge in the charge storage layer and the erasure to the "1" means not changing the state of the charge. Further, the erasure to the "0" may mean slightly changing the state of the charge in the charge storage layer and the erasure to the "1" may mean greatly changing the state of the charge, vice versa. Further, the erasure to the "0" may mean changing the state of the charge in the charge storage layer to negative and the erasure to the "1" may mean changing the state of the charge, to positive, vice versa. The above definitions of the "0" and "1" may be combined. The means for changing the state of the charge in the charge storage layer is not limited to the CHE current.

FIG. 76 shows an equivalent circuit diagram of a memory cell array in which the first wires are arranged in parallel to the fourth wires. The application of the potentials of FIG. 76 is the same as that of FIG. 72 for erasing data except that the first potential is applied to the first wire (1-*i*) and the ninth potential is applied to the first wires (not 1i).

FIG. 80 shows an equivalent circuit diagram of a memory cell array in which a plurality of first wires are electrically connected in common. The application of the potentials of FIG. 80 is the same as that of FIG. 72 for erasing data except that the first potential is applied to the first wire (1-1).

Now are described examples of timing charts for applying potentials for erasing data in the case where there are arranged M×N (M and N are positive integers) island-like semiconductor layers having two memory cells formed of the P-type semiconductor and arranged in series and the first wires and the third wires are arranged in parallel.

Figure 182:
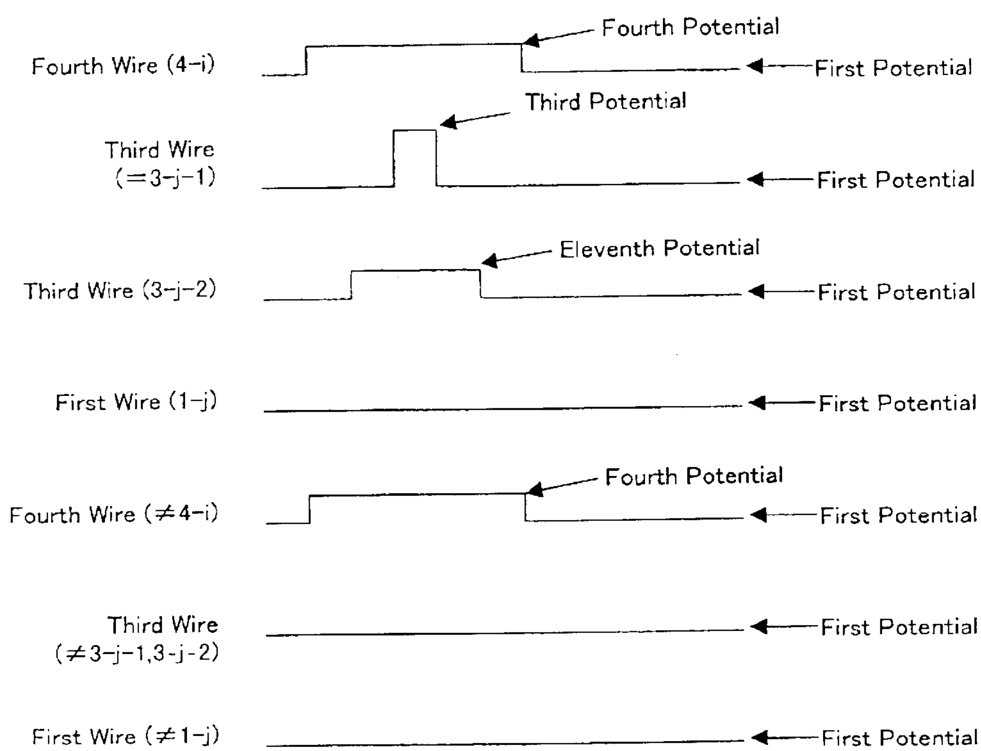

In FIG. 182, a ground potential, for example, is applied as the first potential and ninth potential to the first wire, and the memory cell has a threshold of 5.0 V to 7.5 V when it is in the written state and has a threshold of 0.5 V to 3.0 V when it is in the erased state.

In the case where the "1" is erased by storing a negative charge in the charge storage layer, for example, a ground potential is applied as the first potential to the first wires (1-1 to 1-N), the third wires (3-1-1 to 3-N-2) and the fourth wires (4-1 to 4-M). In this state, the fourth potential, e.g., 6 V, is applied to the fourth wire (4-*i*), the eighth potential, e.g., 6 V which is equal to the fourth potential, is applied to fourth wires (not 4-*i*) other than the fourth wire (4-*i*), the twelfth potential, e.g., a ground potential, is applied to third wires (not 3-*j*-1 to 3-*j*-2) connected to non-selected cells not arranged in series with the selected cell, the eleventh potential, e.g., 8 V, is applied to the third wire (3-*j*-2) connected to a non-selected cell arranged in series with the selected cell, and the third potential, e.g., 12 V, is applied to the third wire (3-*j*-1) connected to the selected cell. The selected cell is erased to "1" by sustaining this state for a desired period of time. The potentials may be applied to the respective wires in another order or simultaneously.

The third wire (3-*j*-1) is returned to the ground potential, the third wires (3-*j*-2) is returned to the ground potential, and the fourth wires (4-1 to 4-M) are returned to the ground potential. The respective wires may be returned to the ground potential in another order or simultaneously. The potentials given may be any combination of potentials so long as they meet conditions for erasing a desired cell.

Here, the same potential is preferably applied initially as the first potential to the first wires (1-1 to 1-N), the third wires (3-1-1 to 3-N-2) and the fourth wires (4-1 to 4-M), but different potentials may be applied.

In the above example, the erasing process has been described with the case where the selected cell is a memory cell having the third wire (3-*j*-1) as the gate electrode. However, the erasing process is the same with the case where the selected cell is a memory cell having, as the gate electrode, one of the third wires other than the third wire (3-*j*-1).

Figure 183:
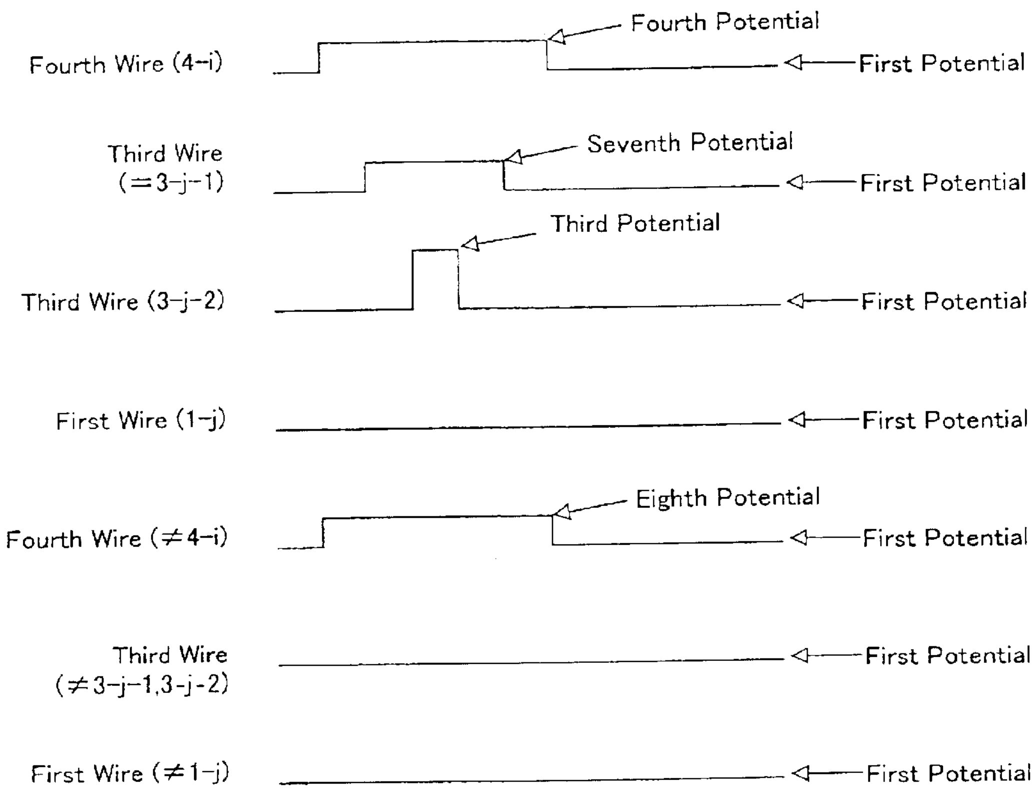

FIG. 183 shows a timing chart showing an example of timing of applying each potential for erasing data in the case where all memory cells connected to the third wire (3-*j*-2) are selected cells in contrast to FIG. 182.

The erasing process of FIG. 183 conforms to that of FIG. 182 except that the seventh potential instead of the eleventh potential is applied to third wired connected to non-selected cells arranged in series with the selected cells. At this time, the seventh potential is the same as the eleventh potential.

FIG. 75 shows an equivalent circuit diagram in the case where all memory cells connected to the third wire (3-*j*-2) are selected cells.

Figure 184:
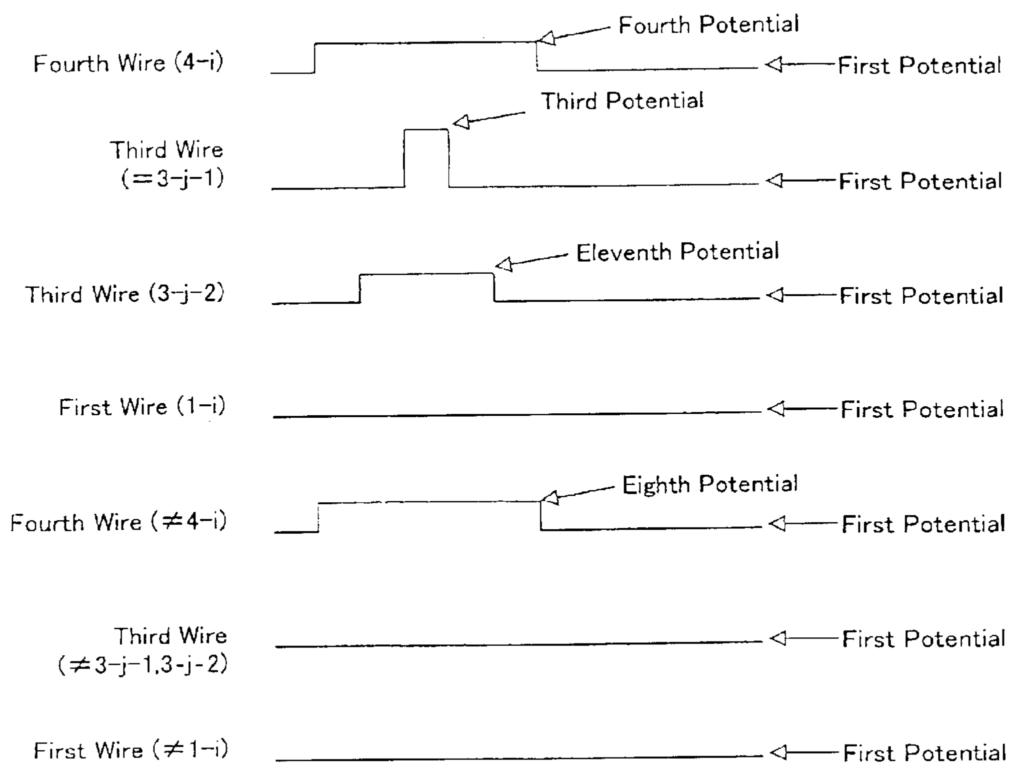

Now FIG. 184 shows an example of timing charts for applying potentials for erasing data in the case where the first wires and the fourth wires are arranged in parallel. In FIG. 184, a ground potential is applied as the first potential, and the memory cell has a threshold of 5.0 V to 7.5 V when it is in the erased state and has a threshold of 0.5 V to 3.0 V when it is in the written state.

The application of the potentials of FIG. 184 conforms to that of FIG. 182 except that the first wire (1-*i*) instead of the first wire (1-*j*) is connected to the end of the island-like semiconductor layer including the selected cell.

Figure 185:
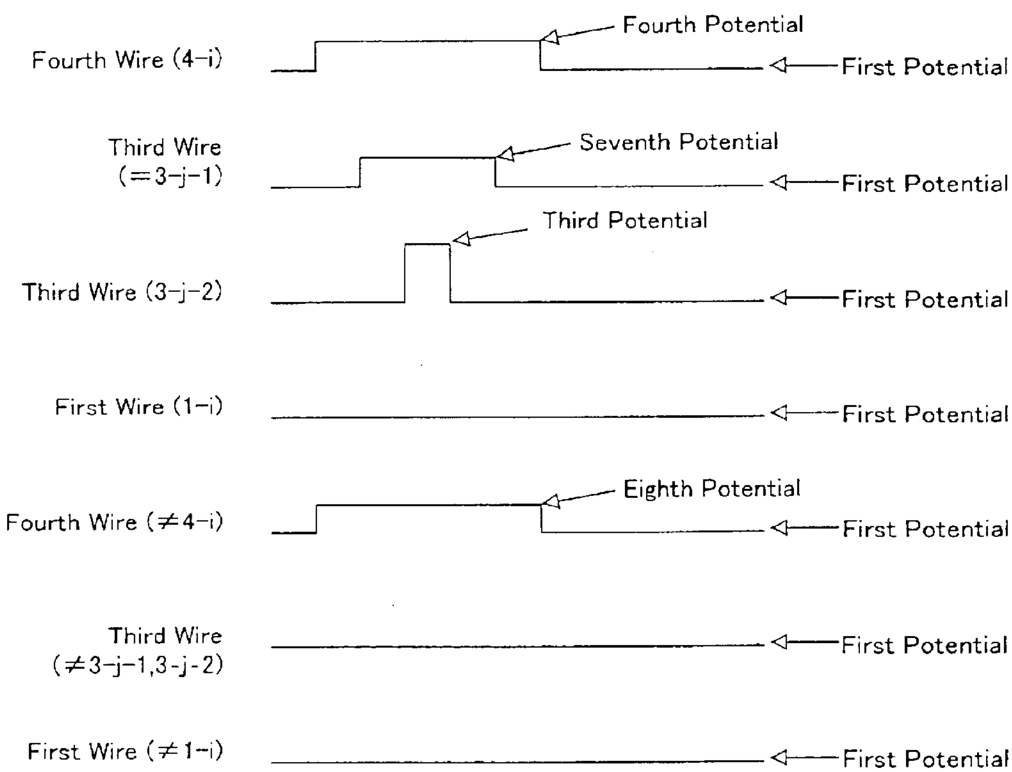

FIG. 185 shows a timing chart showing an example of timing of applying each potential for erasing data in the case where all memory cells connected to the third wire (3-*j*-2) are selected cells in contrast to FIG. 184.

The erasing process of FIG. 185 conforms to that of FIG. 184 except that the seventh potential instead of the eleventh potential is applied to third wired connected to non-selected cells arranged in series with the selected cells. At this time, the seventh potential is the same as the eleventh potential.

FIG. 79 shows an equivalent circuit diagram in the case where all memory cells connected to the third wire (3-*j*-2) are selected cells.

Figure 186:
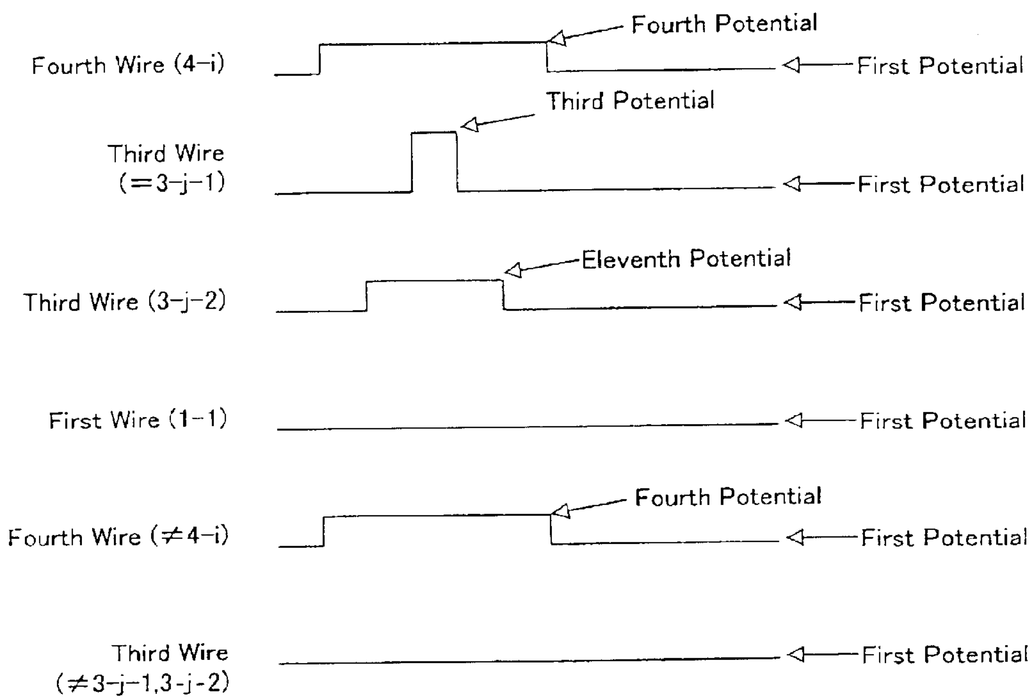

FIG. 186 shows a timing chart showing an example of timing of applying each potential for erasing data in the case where the first wires are connected in common in the entire array.

In FIG. 186, a ground potential is applied as the first potential, and the memory cell has a threshold of 5.0 V to 7.5 V when it is in the erased state and has a threshold of 0.5 V to 3.0 V when it is in the written state. The application of the potential of FIG. 186 conforms to that of FIG. 182 except that the first wire (1-1) instead of the first wire (1-*j*) is connected to the end of the island-like semiconductor layer including the selected cell.

Figure 187:
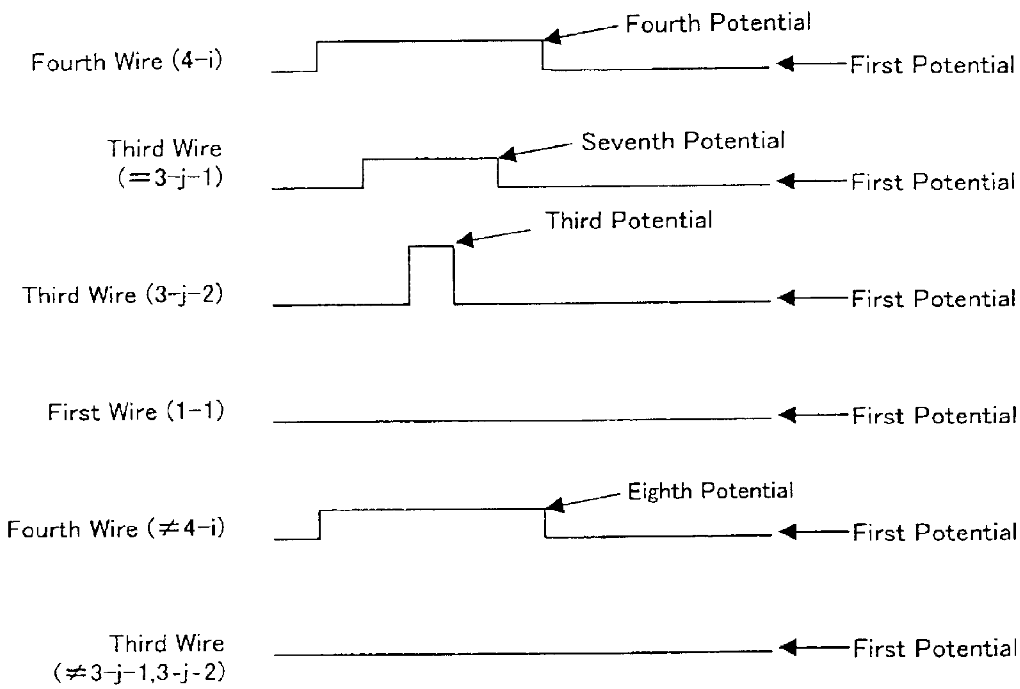

FIG. 187 shows a timing chart showing an example of timing of applying each potential for erasing data in the case where all memory cells connected to the third wire (3-*j*-2) are selected cells in contrast to FIG. 186.

The erasing process of FIG. 187 conforms to that of FIG. 186 except that the seventh potential instead of the eleventh potential is applied to third wired connected to non-selected cells arranged in series with the selected cells. At this time, the seventh potential is the same as the eleventh potential.

FIG. 83 shows an equivalent circuit diagram in the case where all memory cells connected to the third wire (3-*j*-2) are selected cells.

The charge storage layer may be a dielectric, a nitride film of the MONOS structure and the like in addition to the floating gate. Also the erasure may mean changing the state of the charge in the charge storage layer to increase the threshold of the selected memory transistor. The means for changing the state of the charge in the charge storage layer is not limited to the CHE current, but a hot hole may be utilized.

Now explanation is given of memory cells other than those having floating gates as the charge storage layers.

Figure 84:
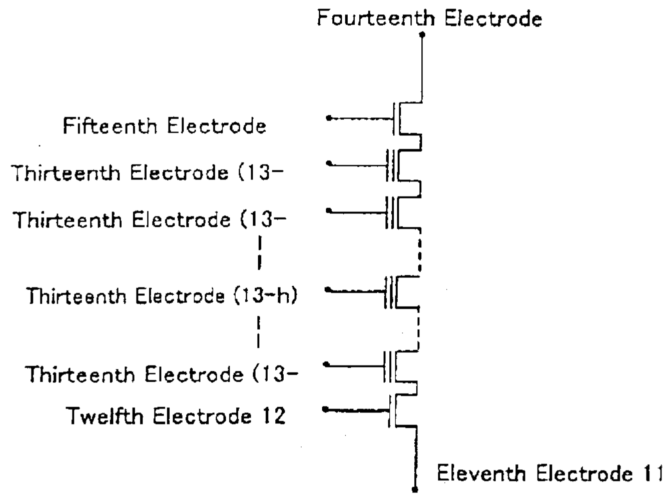
Figure 85:
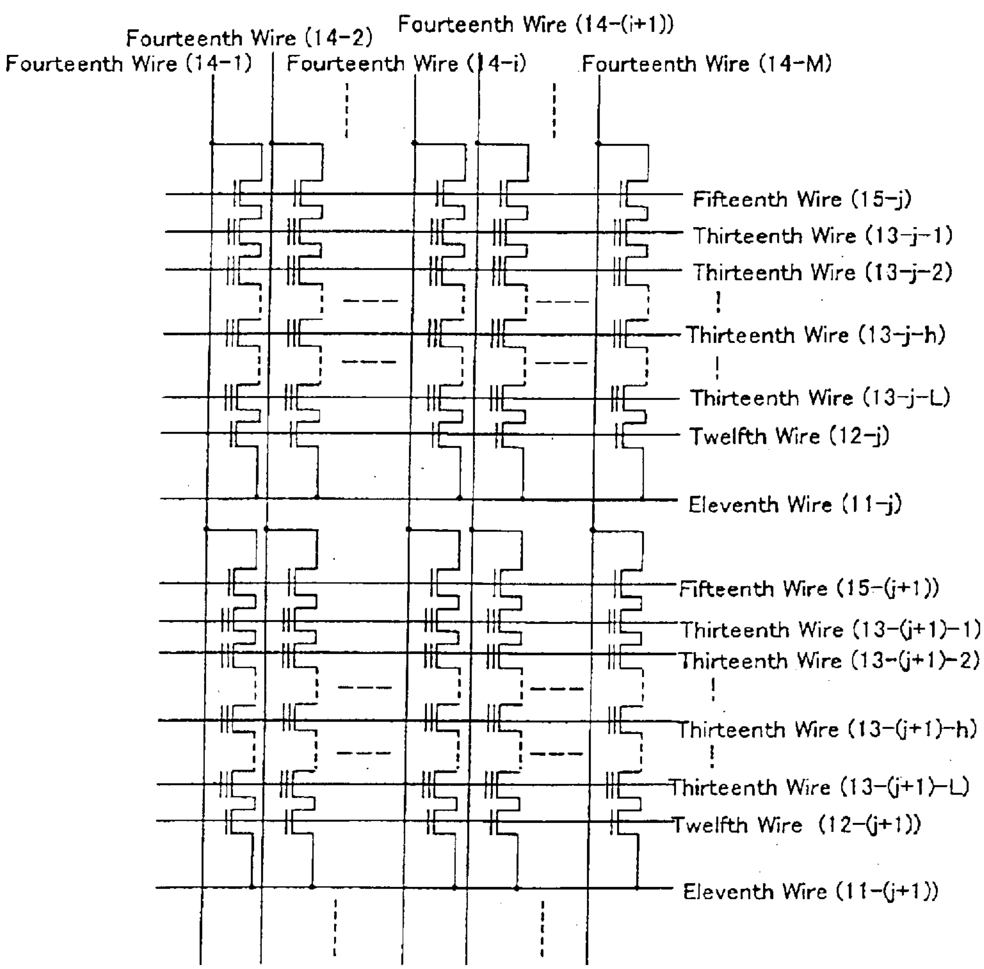

FIG. 84 and FIG. 85 are equivalent circuit diagrams of part of a memory cell array of the MONOS structure shown as an example in FIG. 8 and FIG. 51 to FIG. 56.

FIG. 84 is an equivalent circuit diagram of memory cells of the MONOS structure arranged in one island-like semiconductor layer 110, and FIG. 85 is an equivalent circuit diagram in the case where a plurality of island-like semiconductor layers 110 are arranged.

Now explanation is given of the equivalent circuit diagram of FIG. 84.

The island-like semiconductor layer 110 has, as the selection gate transistors, a transistor provided with a twelfth electrode 12 as the gate electrode and a transistor provided with a fifth electrode 15 as the gate electrode and a plurality of (e.g., L, L is a positive integer) memory cells arranged in series. The memory cell has a laminated insulating film as the charge storage layer between the selection electrodes and has a thirteenth electrode (13-*h*, h is a positive integer, 1≦h≦L). A fourteenth electrode 14 is connected to an end of the island-like semiconductor layer 110 and an eleventh electrode 11 is connected to another end thereof.

Next explanation is given of the equivalent circuit diagram of FIG. 85.

Now there is shown a connection relationship between each circuit element arranged in each island-like semiconductor layer 110 shown in FIG. 84 and each wire in a memory cell array where a plurality of island-like semiconductor layers 110 are arranged.

Are provided a-plurality of (e.g., M×N, M and N are positive integers; i is a positive integer, 1≦i≦M; j is a positive integer, 1≦j≦N) island-like semiconductor layers 110. In the memory cell array, a plurality of (e.g., M) fourteenth wires in parallel with the semiconductor substrate are connected with the above-mentioned fourteenth electrodes 14 provided in the island-like semiconductor layers 110. A plurality of (e.g., N×L) thirteenth wires in parallel with the semiconductor substrate and in a direction crossing the fourteenth wires 14 are connected with the above-mentioned thirteenth electrodes (13-*h*, h is a positive integer, 1≦h≦L) of the memory cells. The eleventh wires are arranged in parallel with the thirteenth wires. A plurality of (e.g., N) twelfth wires in parallel with the semiconductor substrate and in a direction crossing the fourteenth wires 14 are connected with the above-mentioned twelfth electrodes 12 of the memory cells, and a plurality of (e.g., N) fifteenth wires in parallel with the semiconductor substrate and in a direction crossing the fourteenth wires 14 are connected with the above-mentioned fifteenth electrodes 15 of the memory cells.

Figure 86:
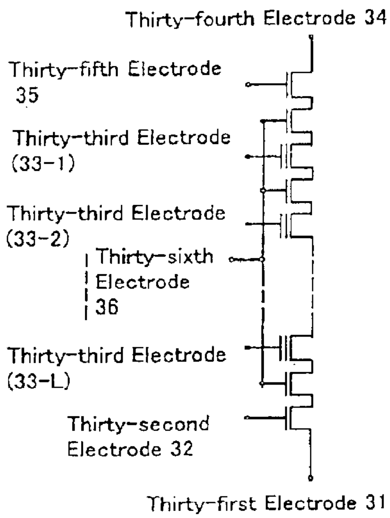
Figure 87:
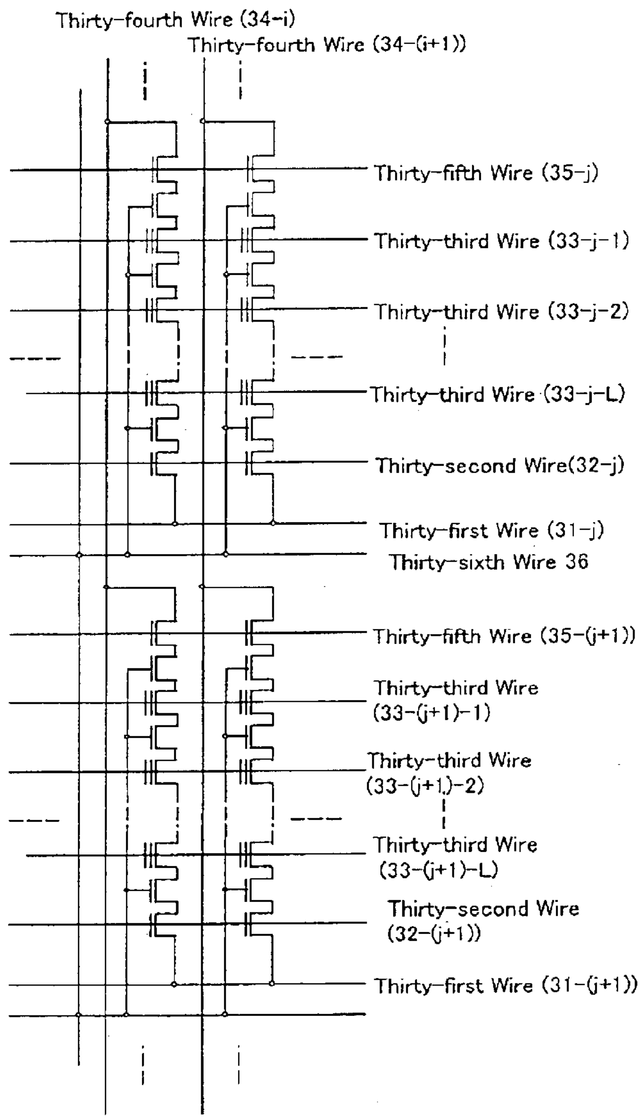

FIG. 86 and FIG. 87 are equivalent circuit diagrams of part of a memory cell array shown as an example in FIG. 13 to FIG. 14, FIG. 55 and FIG. 56 in which diffusion layers 720 are not disposed between the transistors and polysilicon films 550 are formed as fifth conductive films between the gate electrodes 500, 510 and 520 of the memory transistors and the selection gate transistors.

FIG. 86 shows an equivalent circuit diagram of memory cells arranged in one island-like semiconductor layer 110 in which the polysilicon films 550 are formed as fifth conductive films between the gate electrodes of the memory transistors and the selection gate transistors, and FIG. 87 shows an equivalent circuit diagram in the case where a plurality of island-like semiconductor layers 110 are arranged.

Now explanation is given of the equivalent circuit diagram of FIG. 86.

The island-like semiconductor layer 110 has, as the selection gate transistors, a transistor provided with a thirty-second electrode 32 as the gate electrode and a transistor provided with a thirty-fifth electrode 35 as the gate electrode and a plurality of (e.g., L, L is a positive integer) memory cells arranged in series. The memory cell has a charge storage layer between the selection electrodes and has a thirty-third electrode (33-*h*, h is a positive integer, 1≦h≦L) as the control gate electrode. The island-like semiconductor layer 110 also has thirty-sixth electrodes as the gate electrodes between the transistors. A thirty-fourth electrode 34 is connected to an end of the island-like semiconductor layer 110 and a thirty-first electrode 31 is connected to another end thereof. A plurality of thirsty-sixth electrodes are connected as a whole and provided in the island-like semiconductor layers 110.

Explanation is given of the equivalent circuit diagram of FIG. 87.

Now there is shown a connection relationship between each circuit element arranged in each island-like semiconductor layer 110 shown in FIG. 86 and each wire in a memory cell array where a plurality of island-like semiconductor layers 110 are arranged.

Are provided a plurality of (e.g., M×N, M and N are positive integers; i is a positive integer, 1≦i≦M; j is a positive integer, 1≦j≦N) island-like semiconductor layers 110. In the memory cell array, a plurality of (e.g.,<M) thirty-fourth wires in parallel with the semiconductor substrate are connected to the above-mentioned thirty-fourth electrodes 34 provided in the island-like semiconductor layers 110. A plurality of (e.g., N'L) thirty-third wires in parallel with the semiconductor substrate and in a direction crossing the thirty-fourth wires 34 are connected with the above-mentioned thirty-third electrodes (33-*h*). A plurality of (e.g., N) thirty-first wires in a direction crossing the thirty-fourth wires 34 are connected to the above-mentioned thirty-first electrodes 31 of the island-like semiconductor layers 110. The thirty-first wires are arranged in parallel with the thirty-third wires. A plurality of (e.g., N) thirty-second wires 32 in parallel with the semiconductor substrate and in a direction crossing the thirty-fourth wires 34 are connected to the above-mentioned thirty-second electrodes 32. A plurality of (e.g., N) thirty-fifth wires 35 in parallel with the semiconductor substrate and in a direction crossing the thirty-fourth wires 34 are connected to the above-mentioned thirty-fifth electrodes 35. All the above-mentioned thirty-sixth electrodes 36 provided n the island-like semiconductor layers 110 are connected in unity by thirty-sixth wires.

All the above-mentioned thirty-sixth electrodes 36 provided n the island-like semiconductor layers 110 need not be connected in unity by thirty-sixth wires, but may be connected in two or more groups by dividing the memory cell array with the thirty-sixth wires 36. That is, the memory cell array may be so constructed that the thirty-sixth electrodes 36 are connected block by block.

Now is described the operation principle of the case where the selection gate transistor is not connected to a memory cell adjacent to the selection gate transistor via an impurity diffusion layer, and the memory cells are not connected to each other via an impurity diffusion layer, and instead of that, the interval between the selection gate transistor and the memory cell and that between the memory cells are as close as about 30 nm or less as compared with the case where the selection gate transistor and the memory cell as well as the memory cells are connected via an impurity diffusion layer.

Where adjacent elements are sufficiently close to each other, a channel formed by a potential higher than the threshold applied to the gate of a selection gate transistor and the control gate of a memory cell connects to a channel of an adjacent element, and if a potential higher than the threshold is applied to the gates of all elements, the channels of all elements are connected. This state is equivalent to a state in which the selection transistor and the memory cell as well as the memory cells are connected via the impurity diffusion layer. Therefore, the operation principle is the same as that in the case where the selection transistor and the memory cell as well as the memory cells are connected via the impurity diffusion layer.

Now is described the operation principle of the case where the selection gate transistor is not connected to a memory cell adjacent to the selection gate transistor via an impurity diffusion layer, the memory cells are not connected to each other via an impurity diffusion layer, and instead of that, fifth conductive films between the selection transistor and the memory cell and between the gate electrodes of the memory cells.

The fifth conductive films are located between elements and are connected to the island-like semiconductor layers with intervention of insulating films, e.g., silicon oxide films. That is, the fifth conductive film, the insulating film and the island-like semiconductor layer form an MIS capacitor. A channel is formed by applying to the fifth conductive film a potential such that a reverse layer is formed at an interface between the island-like semiconductor layer and the insulating film. The thus formed channel acts to adjacent elements in the same manner as an impurity diffusion layer connecting the elements. Therefore, if a potential allowing a channel to be formed is applied to the fifth conductive film, is produced the same action as in the case where the selection gate transistor and the memory cell are connected via the impurity diffusion layer.

Even if the potential allowing a channel to be formed is not applied to the fifth conductive film, is produced the same action as in the case where the selection gate transistor and the memory cell are connected via the impurity diffusion layer, when electrons are drawn from the charge storage layer if the island-like semiconductor layer is formed of a P-type semiconductor.

Embodiments of Processes of Producing Semiconductor Memories

Processes of producing semiconductor memories in accordance with the present invention and the semiconductor memories produced by these processes are now described with reference to the attached figures.

In the following embodiments, in contrast to the prior-art memories, a semiconductor substrate or a semiconductor layer patterned in the form of columns having at least one step is formed, tunnel oxide films and floating gates as charge storage layers are formed at the same time on at least part of a sidewall of each tier, and impurities diffusion layers are formed in self-alignment with gates at corners of steps.

Each step and manner in the following examples can be used in combination with steps and manners in other production examples. The conductivity type of the semiconductor in the following examples is merely an example, and the conductivity type of impurity diffusion layers may be opposite.

PRODUCTION EXAMPLE 1

In the semiconductor memory produced in this example, a semiconductor substrate is patterned, for example, into an island-like semiconductor layer having at least one step. A side of the island-like semiconductor layer serves as an active region. A plurality of tunnel oxide films and floating gates as charge storage layers are formed on a sidewall of each tier. Control gates are formed on at least a part of sides of the floating gates with intervention of interlayer insulating films. At a corner (shoulder) of each tier, an impurity diffusion layer is formed in self-alignment with the floating gate. Tiers are further provided in a top portion and in a bottom portion of the island-like semiconductor layer. Selection gate transistors each formed of a gate oxide film and a selection gate are disposed on sidewalls of the tiers. A plurality of, for example, two memory transistors are disposed between the selection gate transistors. The transistors are connected in series along the island-like semiconductor layer. Impurity diffusion layers are formed in self-alignment with the floating gate and the selection gate so that a channel layer of the selection gate transistor and a channel layer of the memory transistor are electrically connected. The gate insulating film of the selection gate transistor have the same thickness as that of the gate insulating film of the memory transistor; and the selection gates and the floating gates of the respective transistors are formed at the same time.

FIGS. 188 to 217 and FIG. 218 to 247 are sectional views taken on line A–A' and line B–B', respectively, of FIG. 1 showing the memory cell array of EEPROM.

Figure 188:
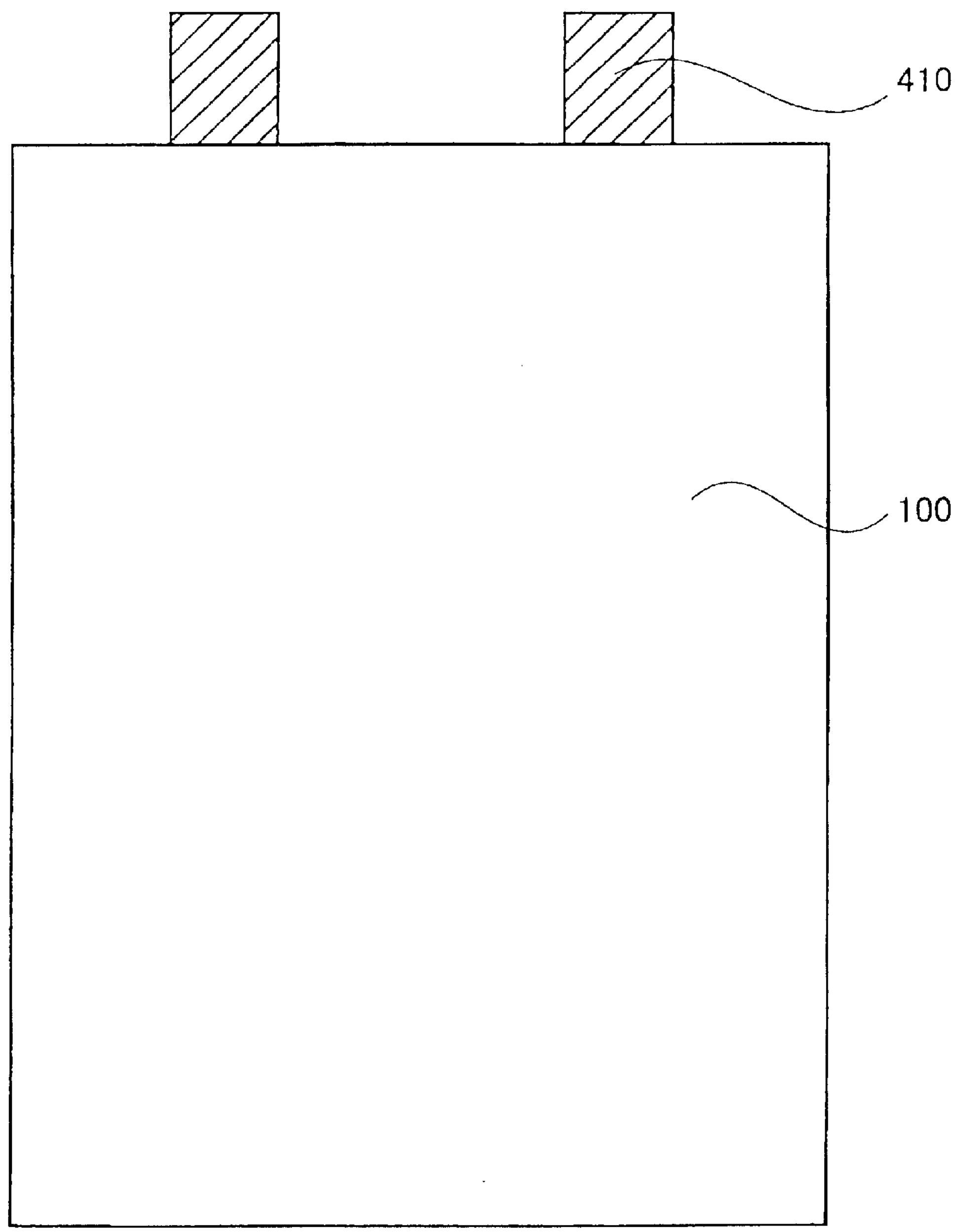
FIGS. 188 to 561 are sectional views (taken on line A–A' and line B–B' in FIG. 1, FIG. 5 or FIG. 8) illustrating production steps of Production Example for producing a semiconductor memory device in accordance with the present invention.
Figure 218:
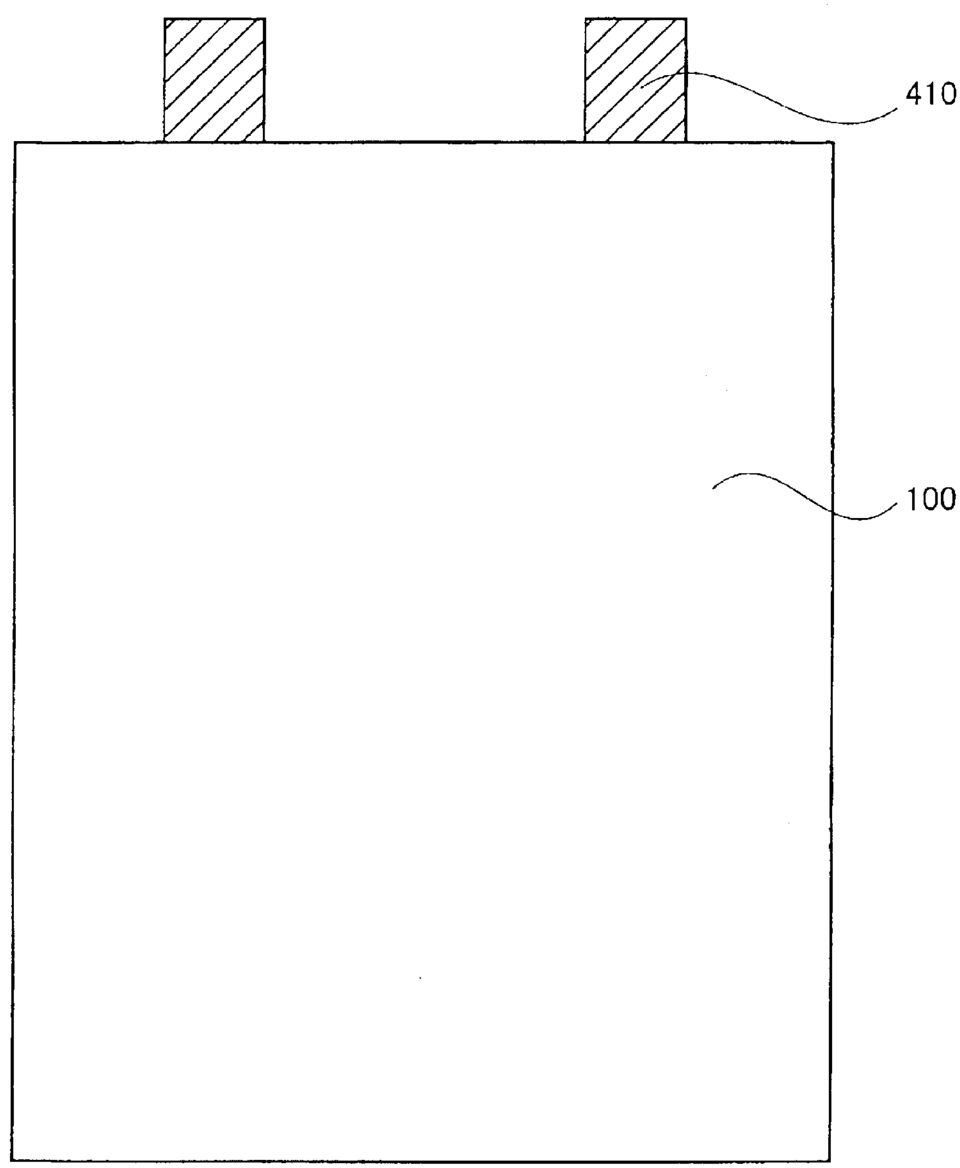

First, a silicon oxide film 410 is deposited to 200 to 2000 nm as a first insulating film to be a mask layer on the surface of a p-type silicon substrate 100 as a semiconductor substrate. Using as a mask a resist film R1 patterned by a known photolithography technique, the silicon oxide film 410 is etched by reactive ion etching (FIG. 188 and FIG. 218).

The silicon oxide film 410 may be, for example, a silicon nitride film, a conductive film, a laminate film of two or more kinds of materials, or any material that cannot be etched or exhibits a lower etch rate when the p-type silicon substrate 100 is etched by RIE.

Figure 189:
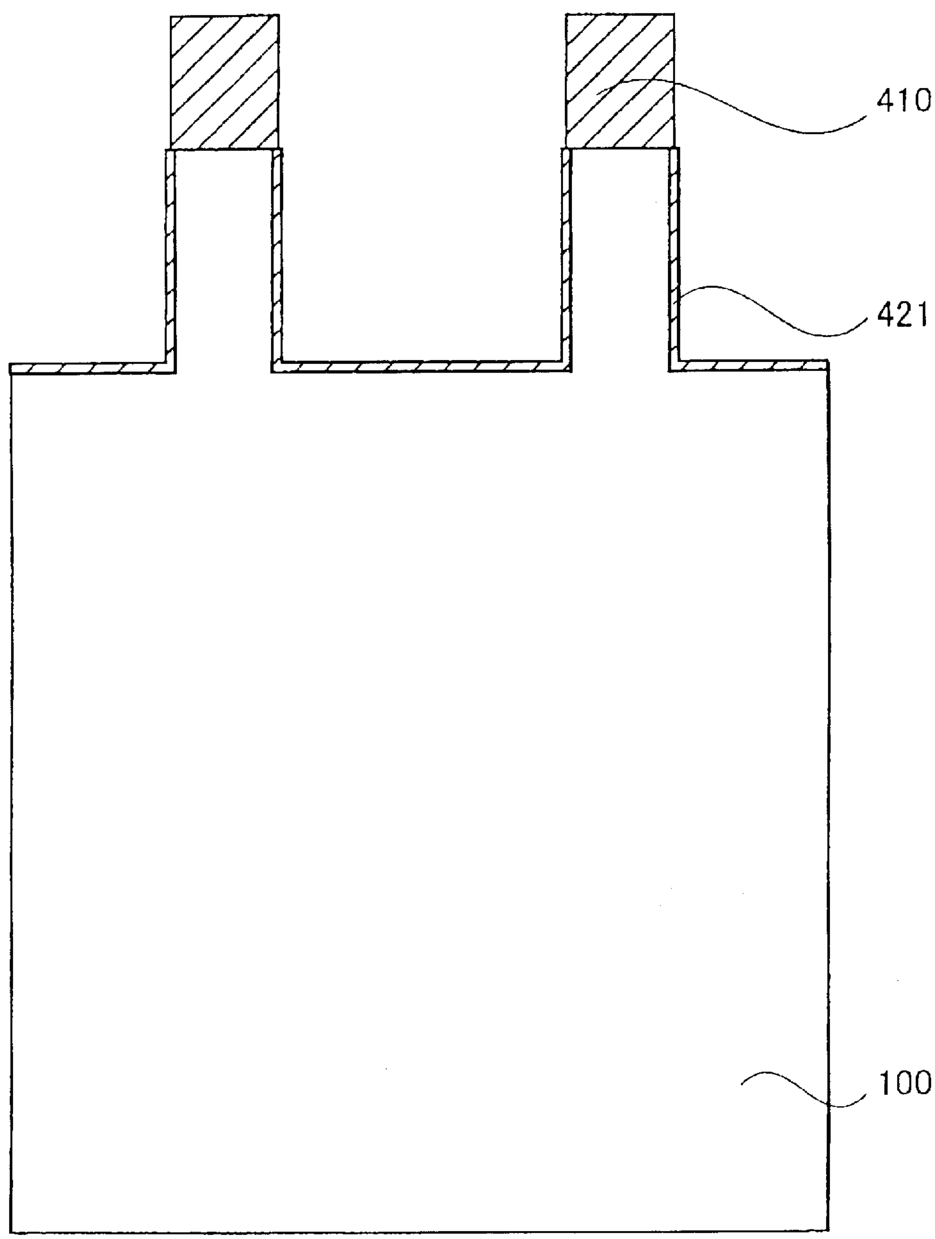
Figure 219:
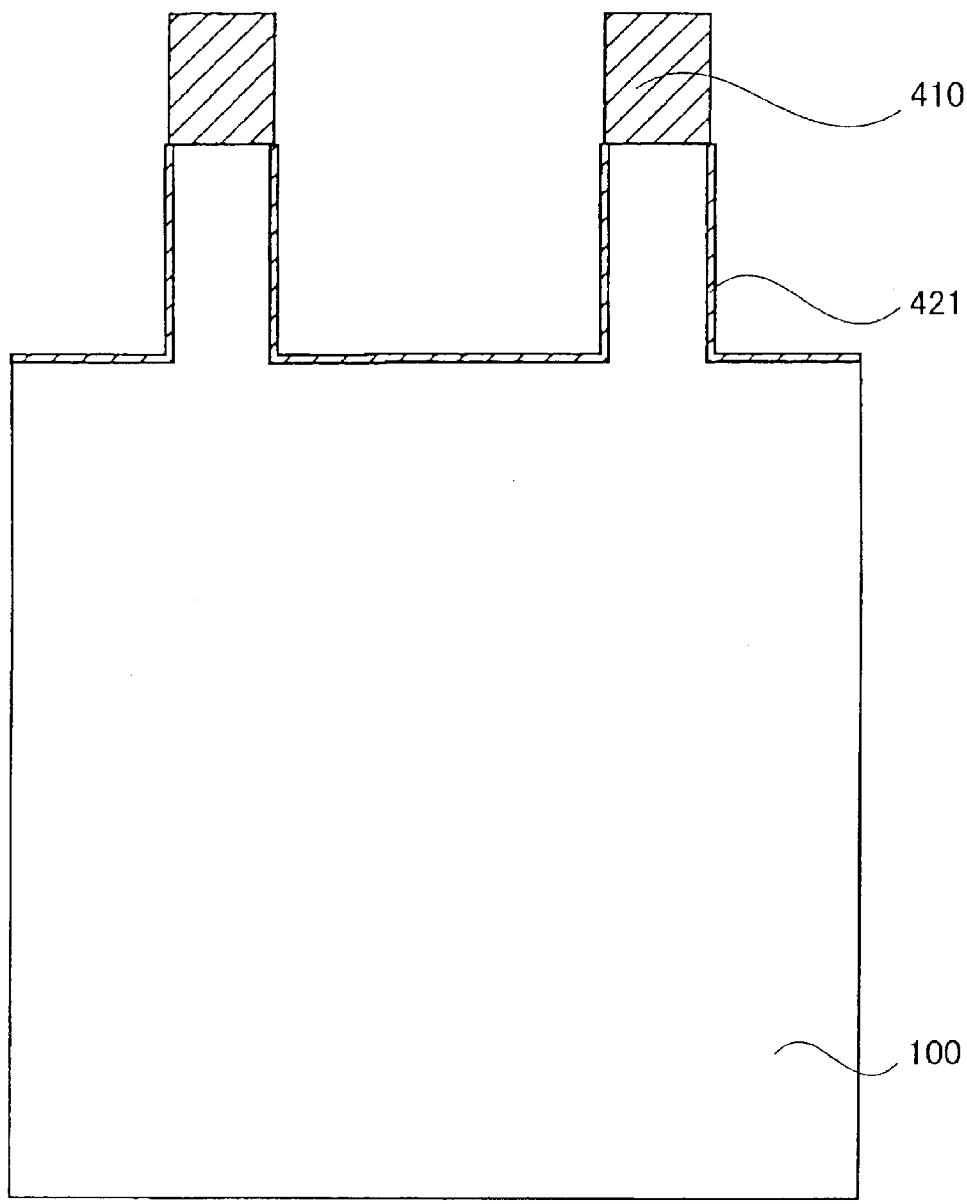

Using the silicon oxide film 410 as a mask, the p-type silicon substrate 100 is etched 50 to 5000 nm by RIE. Thereafter an exposed part of the p-type silicon substrate 100 is thermally oxidized to form a second insulating film, for example, a silicon oxide film 421 of 5 to 100 nm thickness (FIG. 189 and FIG. 219).

Figure 190:
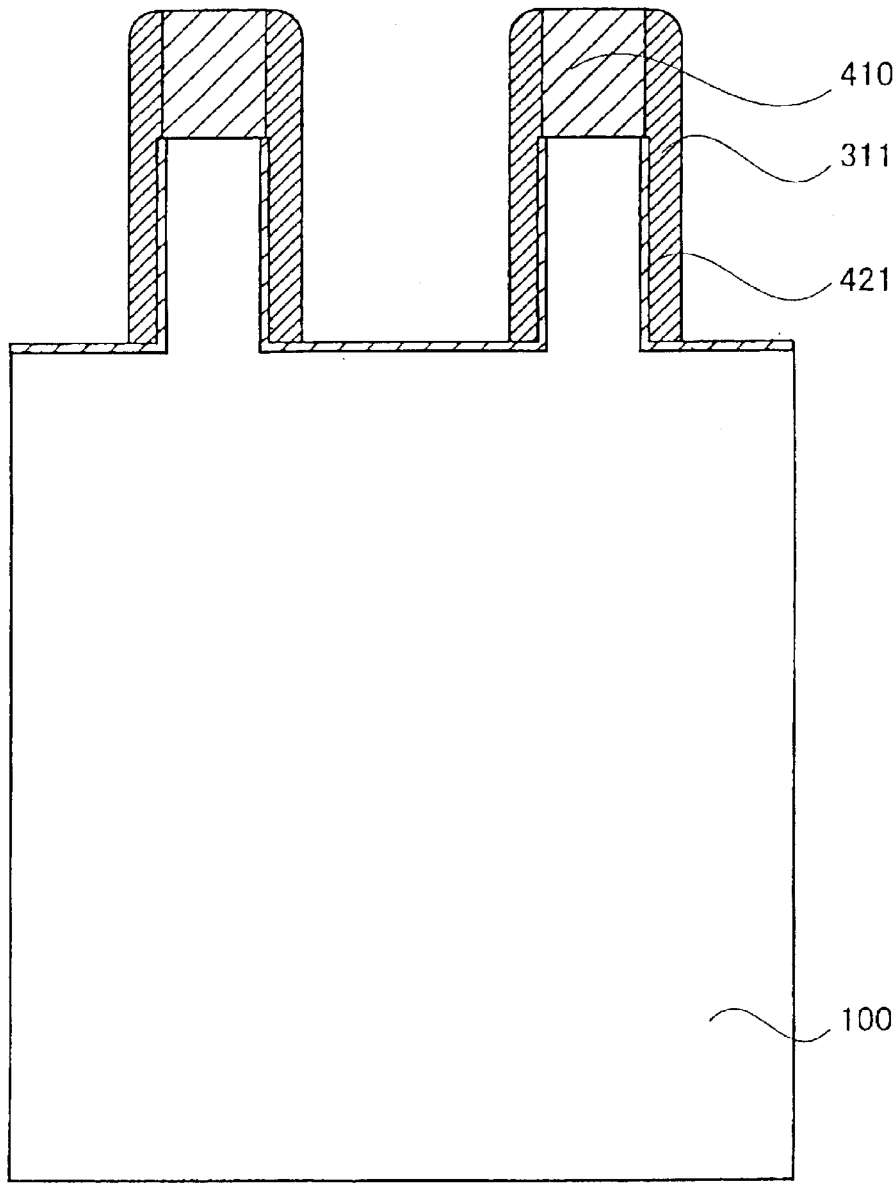
Figure 220:
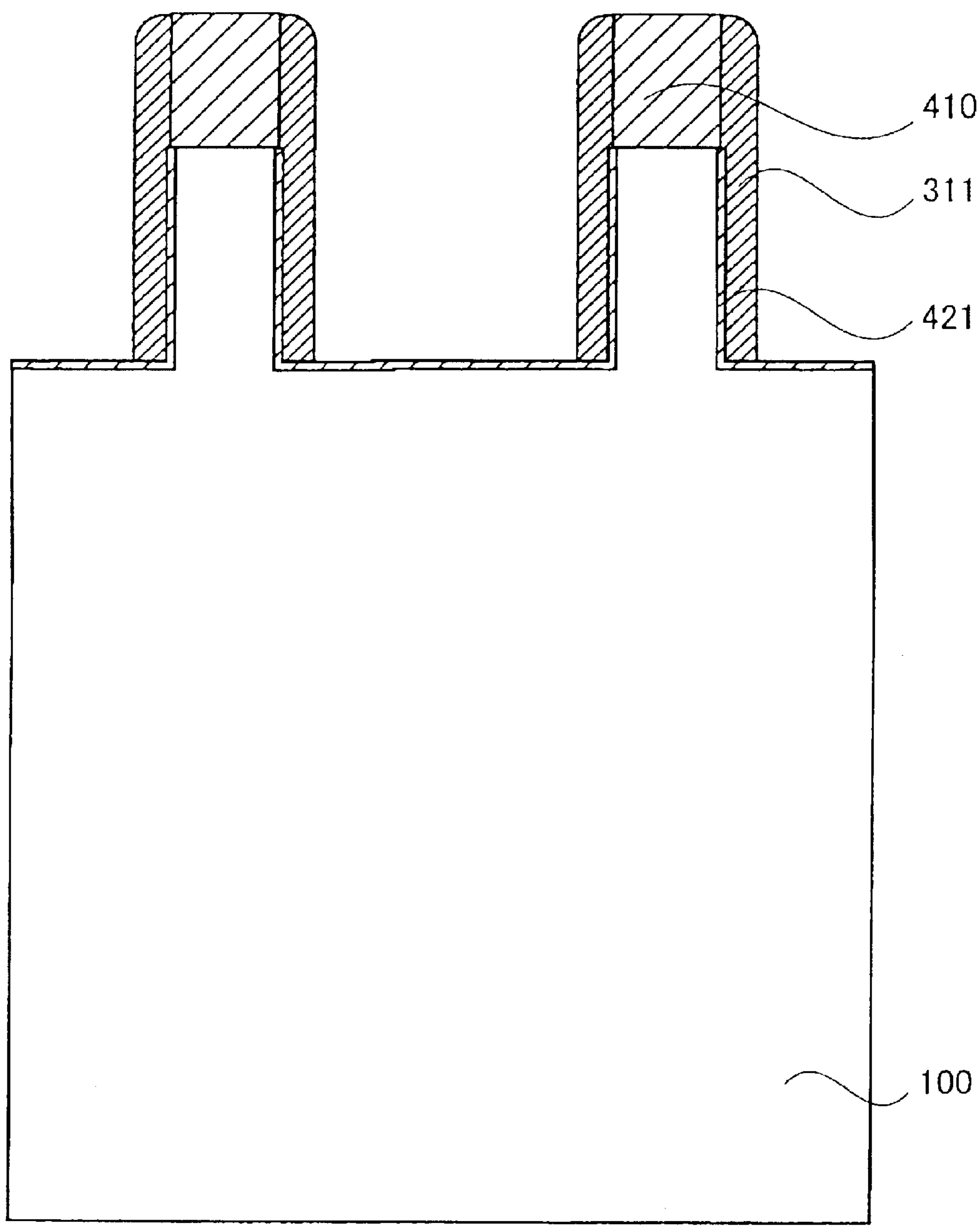

Next, a silicon nitride film 311, for example, is deposited to 10 to 1000 nm as a third insulating film, and then is anisotropically etched in the form of sidewalls on sidewalls of the silicon oxide film 410 and the p-type silicon substrate 100 patterned in the columnar form with intervention of the silicon oxide film 421 (FIG. 190 and FIG. 220).

Subsequently, using the silicon nitride film 311 formed in the sidewalls as a mask, the silicon oxide film 421 is etched away by RIE, and then, the exposed p-type silicon substrate 100 is etched 50 to 5000 nm. Thereby, the p-type silicon substrate 100 is patterned into the form of columns each having a step.

Figure 191:
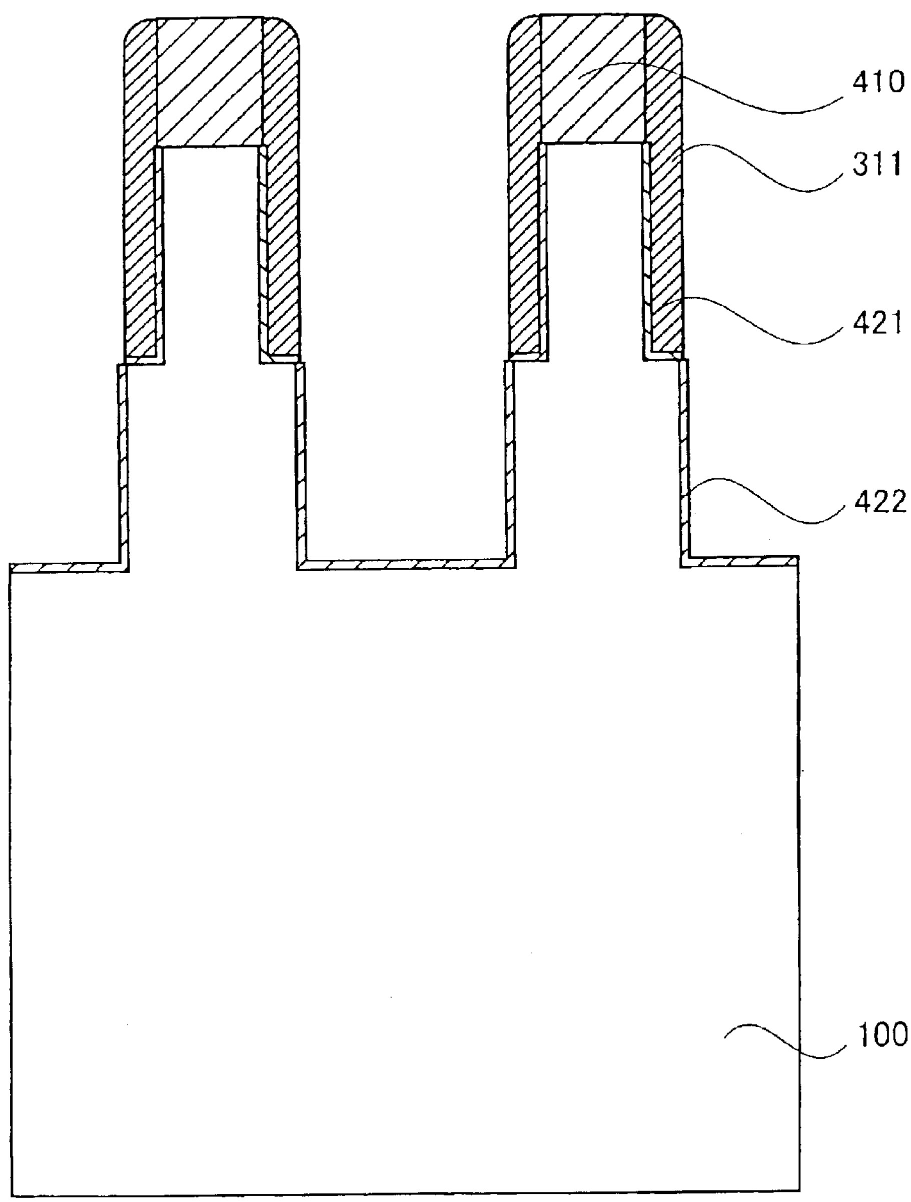
Figure 221:
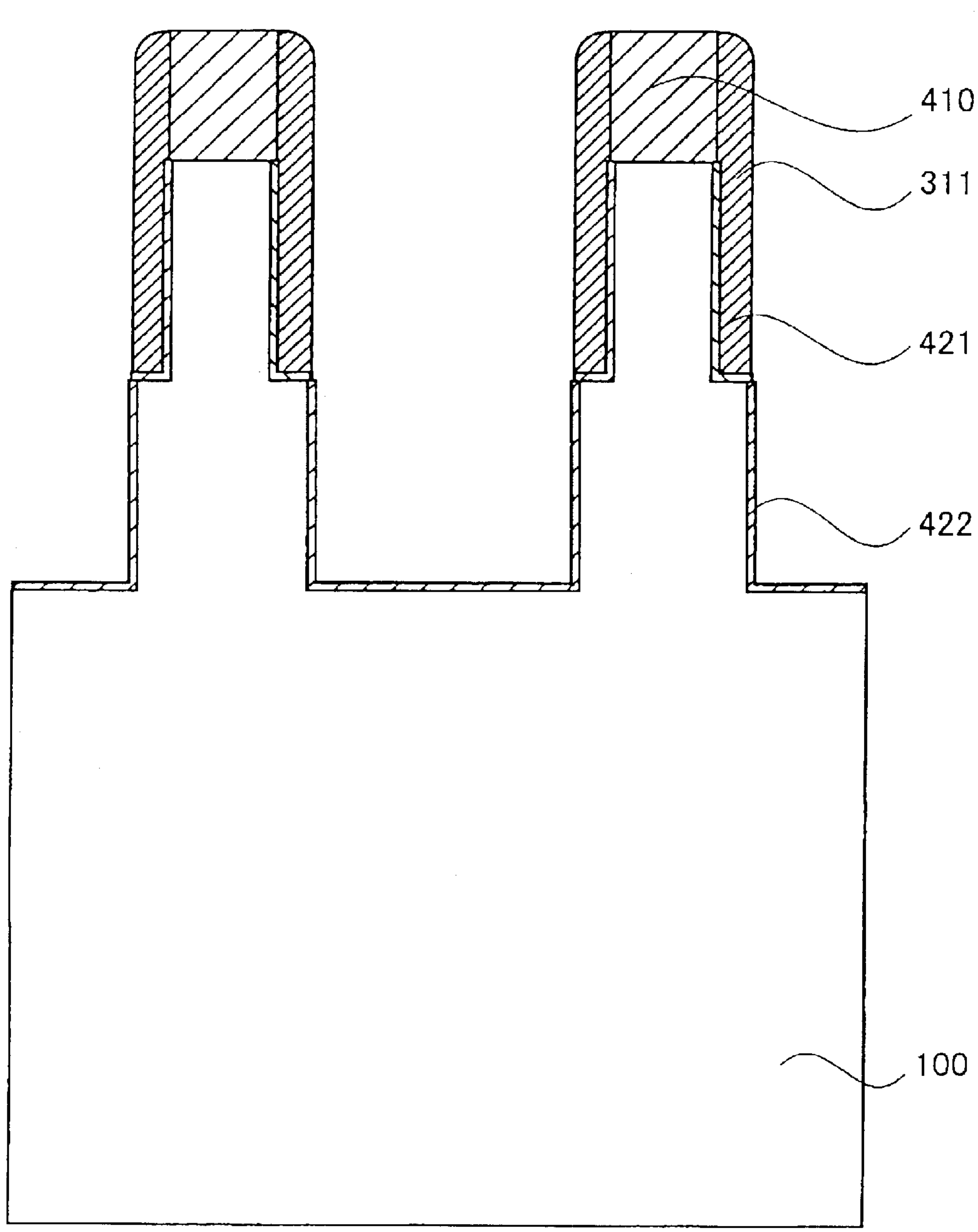

Thereafter, an exposed part of the p-type silicon substrate 100 is thermally oxidized to form a second insulating film, for example, a silicon oxide film 422 of 5 to 100 nm thickness (FIG. 191 and FIG. 221).

A silicon nitride film 312, for example, is deposited to 10 to 1000 nm as a third insulating film, and then is anisotropically etched in the form of sidewalls on sidewalls of the silicon oxide film 410, the silicon nitride film 311 and the p-type silicon substrate 100 patterned in the columnar form having the step with intervention of the silicon oxide film 422.

Subsequently, using the silicon nitride film 312 formed in the sidewalls as a mask, the silicon oxide film 422 is etched away by RIE, and then, the exposed p-type silicon substrate 100 is etched 50 to 5000 nm. Thereby, the p-type silicon substrate 100 is patterned into the form of columns each having two steps.

Figure 192:
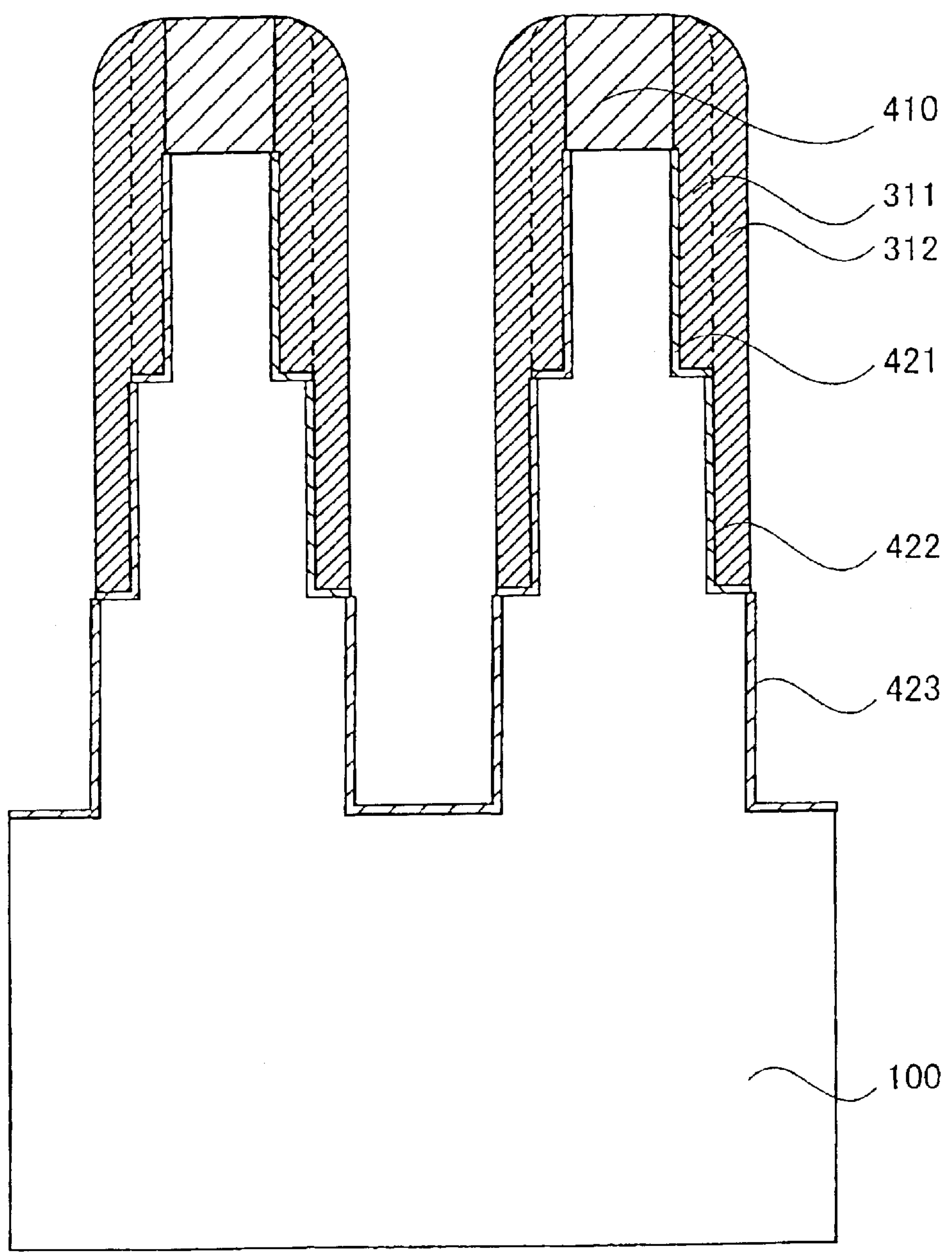
Figure 222:
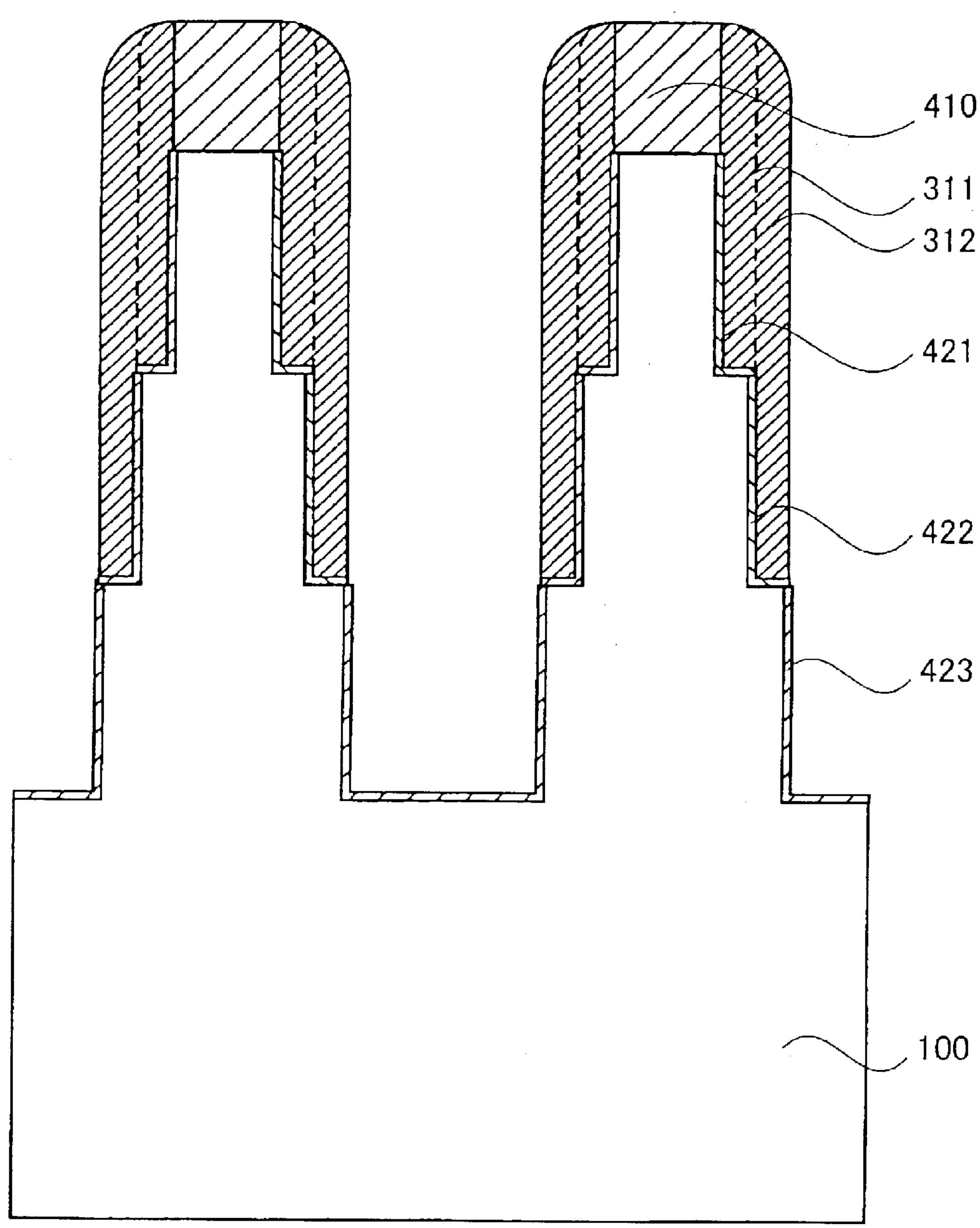

Thereafter, an exposed part of the p-type silicon substrate 100 is thermally oxidized to form a second insulating film, for example, a silicon oxide film 423 of 5 to 100 nm thickness (FIG. 192 and FIG. 222).

Next, a silicon nitride film 313, for example, is deposited to 10 to 1000 nm as a third insulating film, and then is anisotropically etched in the form of sidewalls on sidewalls of the silicon oxide film 410, the silicon nitride film 312 and the p-type silicon substrate 100 patterned in the columnar form having the two steps with intervention of the silicon oxide film 423.

Subsequently, using the silicon nitride film 313 formed in the sidewalls as a mask, the silicon oxide film 423 is etched away by RIE, and then, the exposed p-type silicon substrate 100 is etched 50 to 5000 nm. Thereby, the p-type silicon substrate 100 is patterned into the form of columns each having three steps. By the above-described process, the p-type silicon substrate 100 is separated into a plurality of columnar island-like semiconductor layers 110 having the steps.

Figure 193:
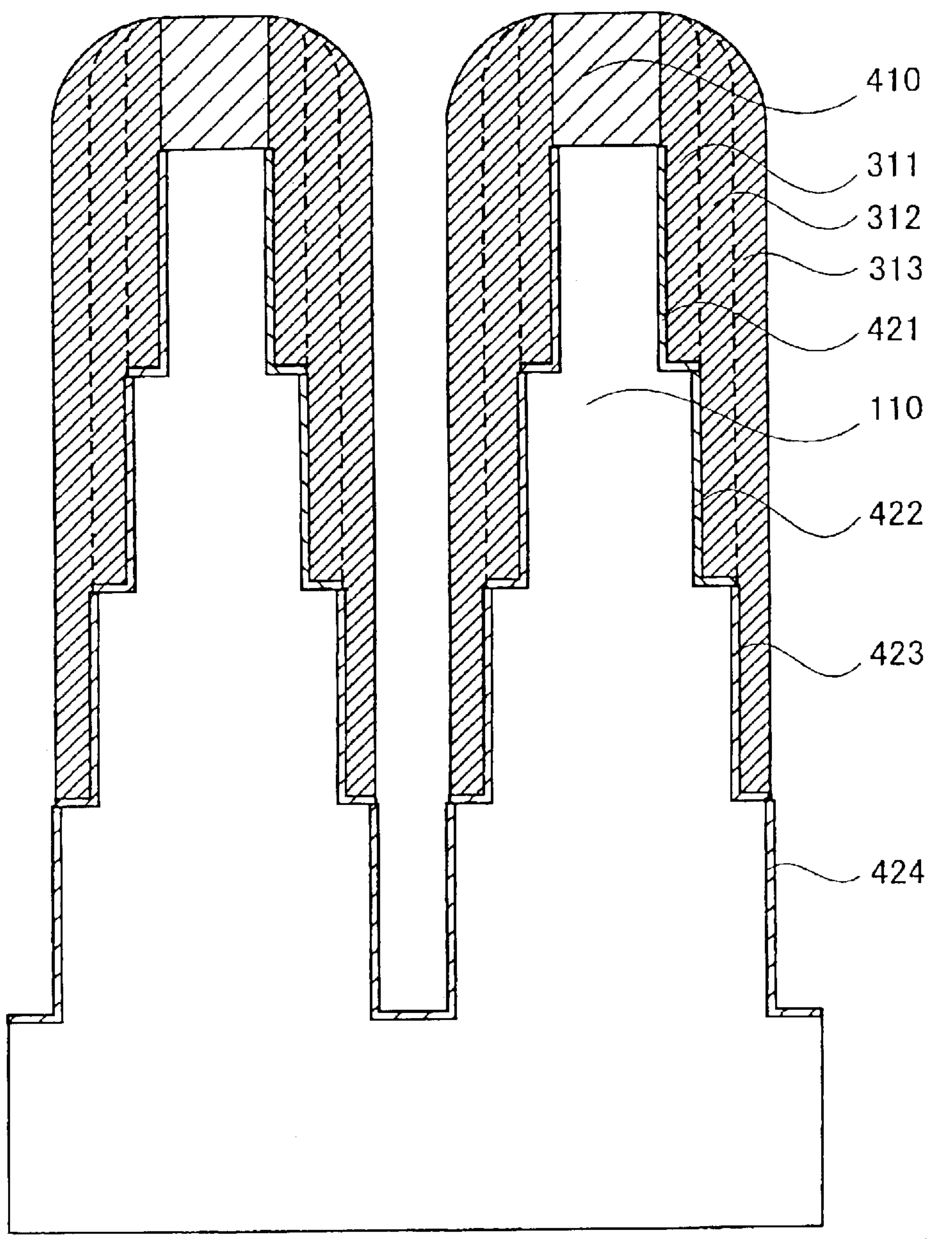
Figure 223:
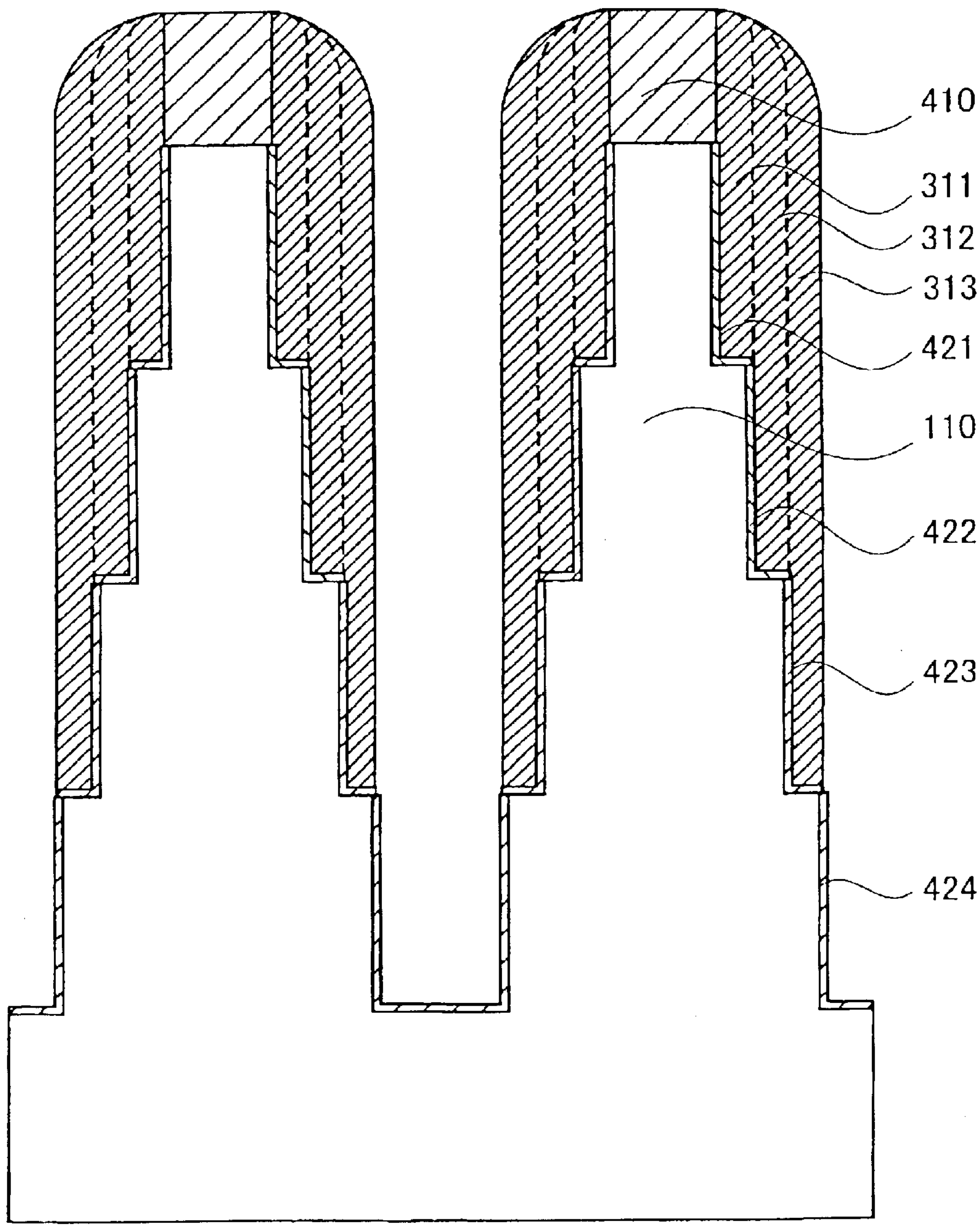

Thereafter, on an exposed part of the p-type silicon substrate 100, a silicon oxide film 424 is formed as a second insulating film of a thickness of 5 to 100 nm, for example, by thermal oxidization (FIG. 193 and FIG. 223). The silicon oxide film 424 may be formed by deposition. Instead of the silicon oxide film, the second insulating film may be a silicon nitride film and a film of any material particularly limited.

An impurity is introduced at the bottom of each island-like semiconductor layer 110 having the steps to form an n-type impurity region 710, for example, by ion implantation at an implantation energy of 5 to 100 keV at an arsenic or phosphorus dose of about $1\times10^{13}$ to $1\times10^{17}/cm^2$ in a direction inclined about 0 to 7°.

Figure 194:
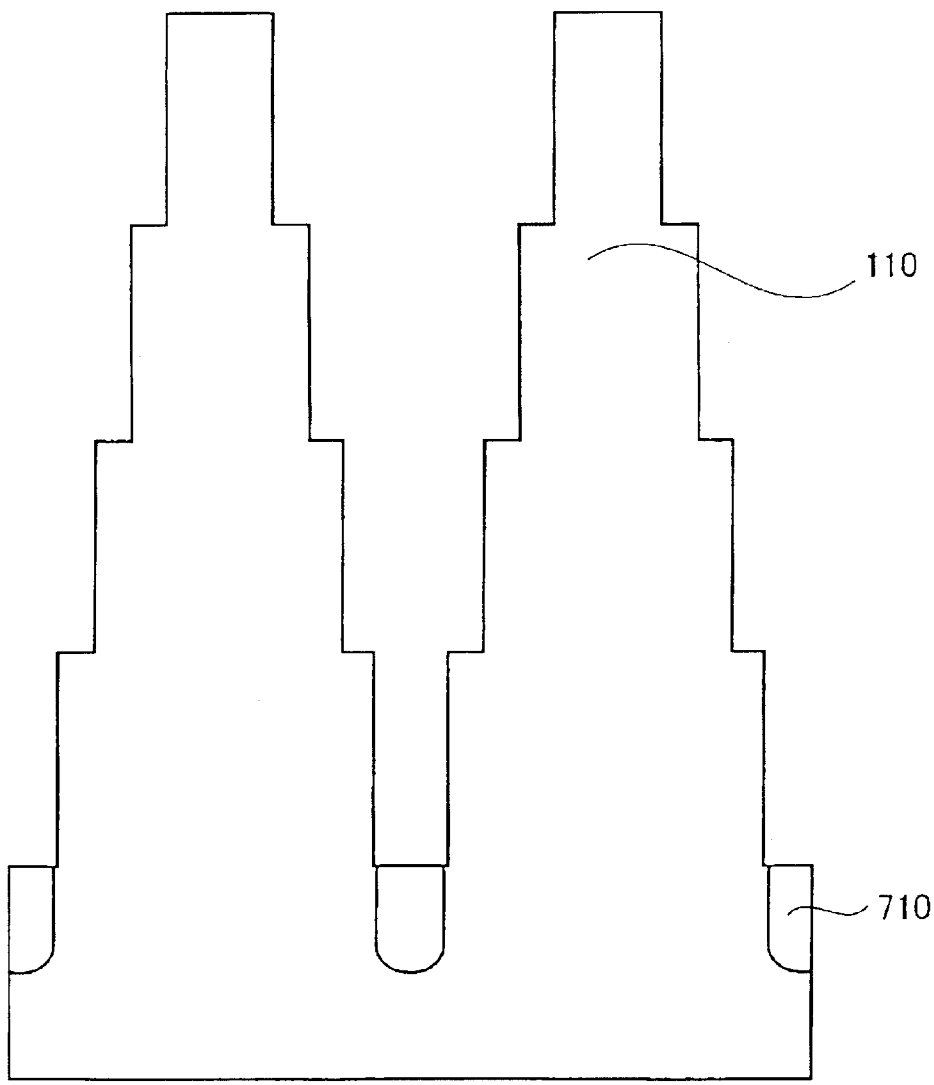
Figure 224:
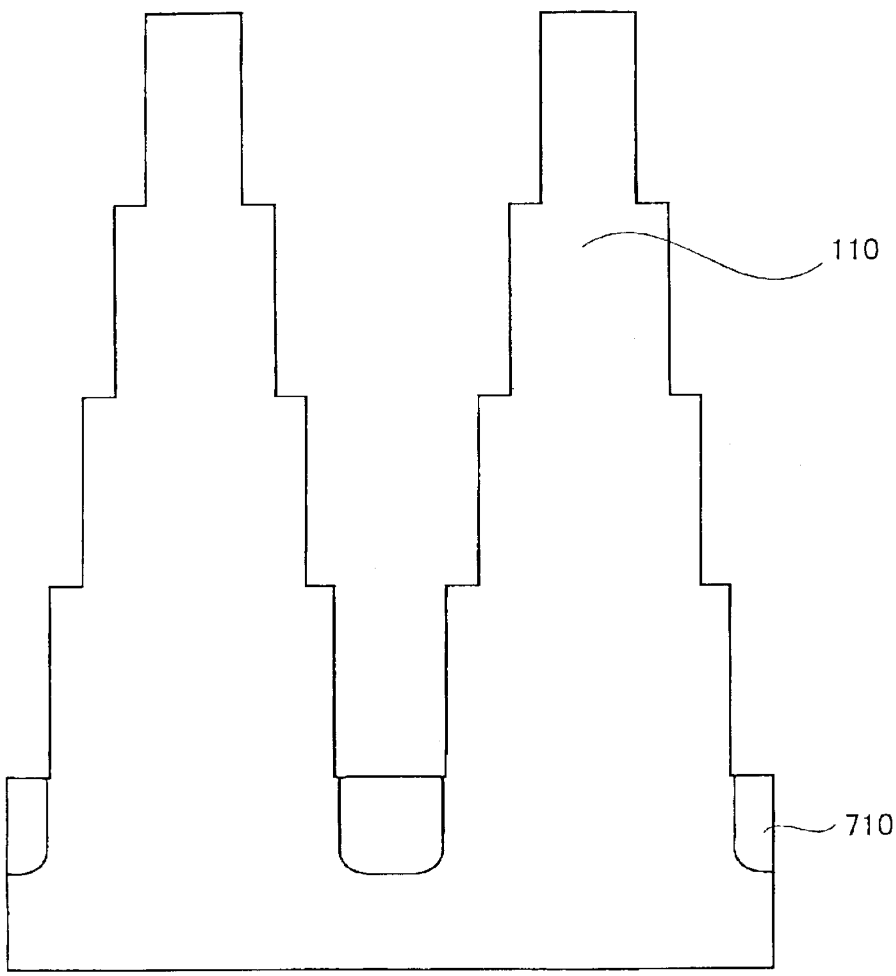

Subsequently, the silicon nitride film and the silicon oxide film are selectively removed, for example, by isotropic etching (FIG. 194 and FIG. 224).

Figure 195:
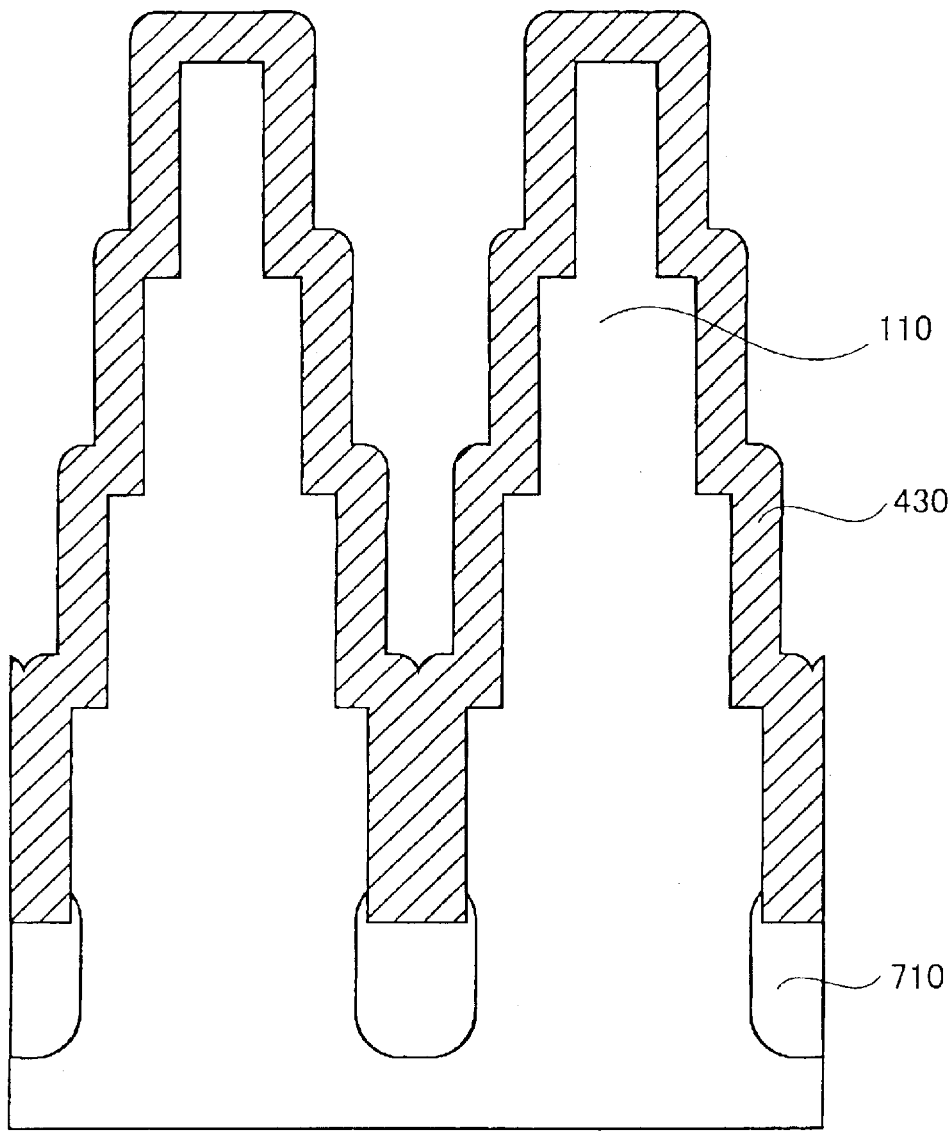
Figure 225:
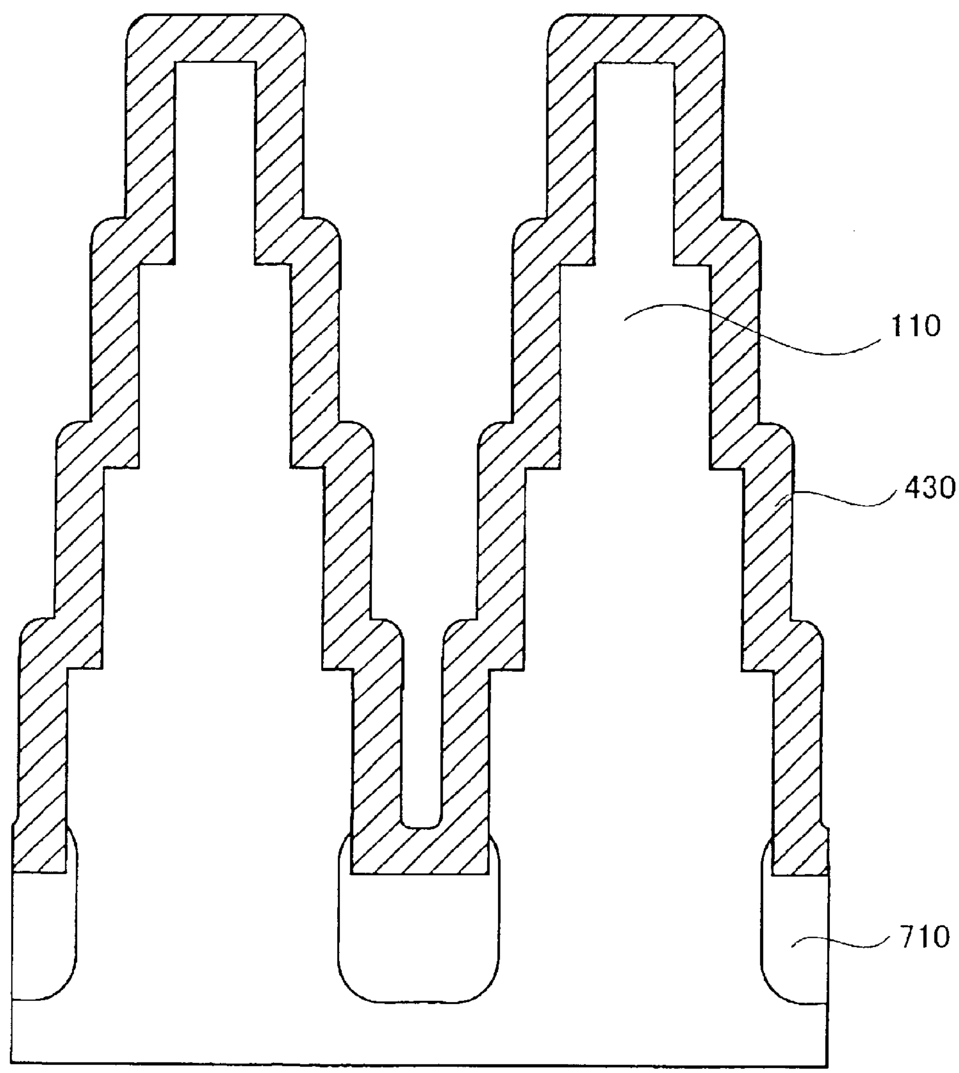

The surface of the island-like semiconductor layer 110 is oxidized to form a fourth insulating film, for example, a silicon oxide film 430 with a thickness of 10 to 100 nm (FIG. 195 and FIG. 225). At this time, if the uppermost tier of the island-like semiconductor layer 110 is formed to have a diameter of the minimum patterning dimensions (the minimum photoetching dimensions), the diameter of the uppermost tier of the island-like semiconductor layer 110 is reduced to the minimum patterning dimensions or less by the formation of the silicon oxide film 430.

Figure 196:
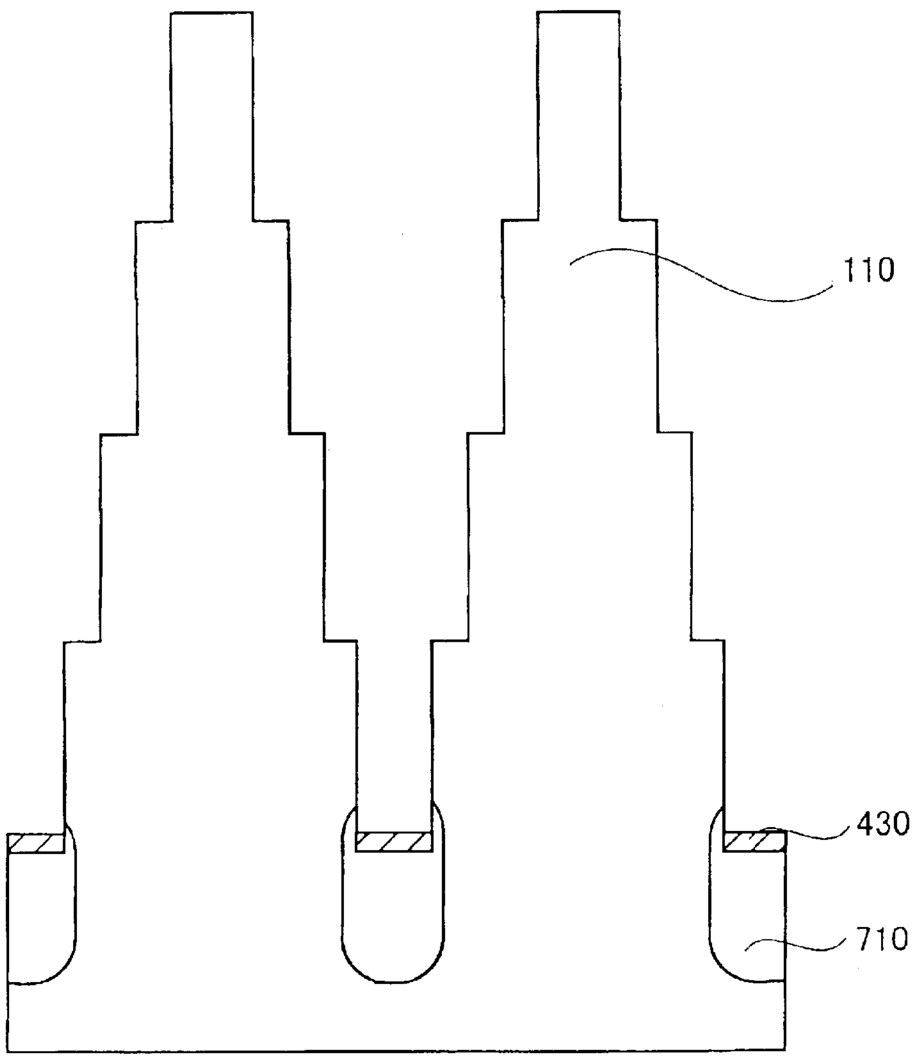
Figure 226:
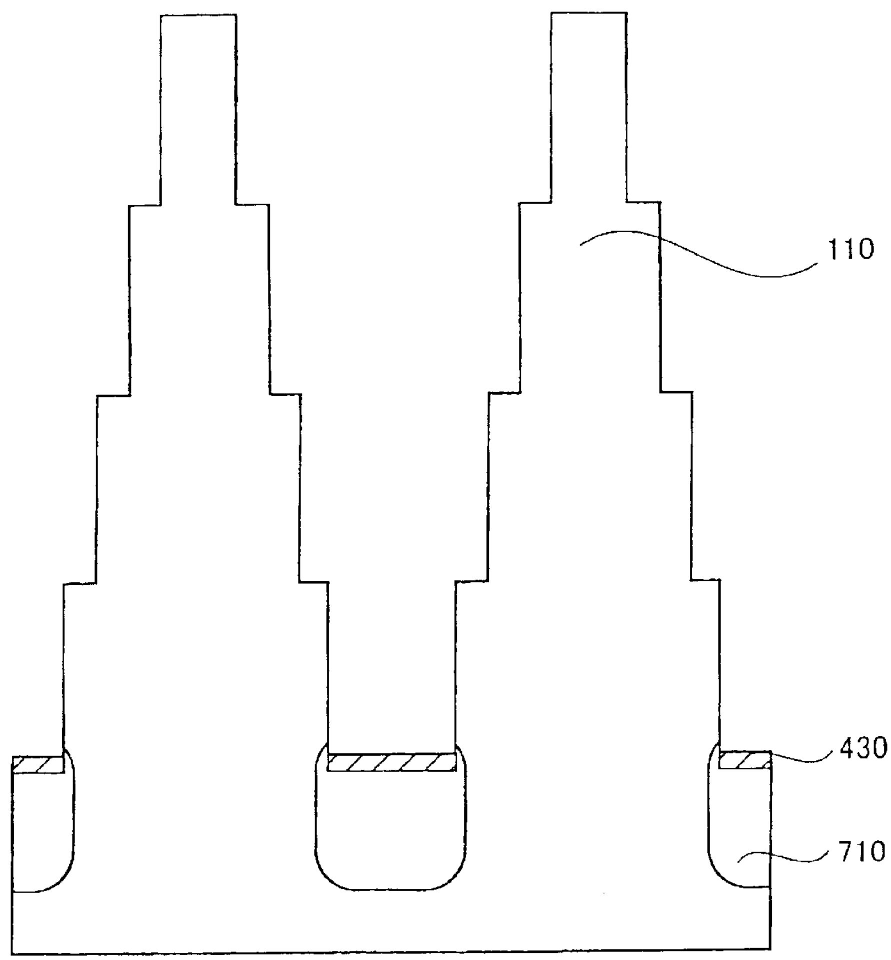

Thereafter, an insulating film such as a silicon oxide film as require is deposited and etched back by isotropic etching to a desired height to bury a silicon oxide film 441 as a fifth insulating film at the bottom of the island-like semiconductor layer 110 (FIG. 196 and FIG. 226).

Next, channel ion implantation is carried out on the sidewall of the island-like semiconductor layer 110 as required using a slant ion implantation, for example, at an implantation energy of 5 to 100 keV at a phosphorus dose of about $1\times10^{11}$ to $1\times10^{13}/cm^2$ in a direction inclined about 5 to 45°. The channel ion implantation may preferably be performed in various directions toward the island-like semiconductor layer 110 because the surface impurity concentration becomes uniform. Alternatively, instead of the channel ion implantation, a oxide film containing phosphorus is deposited by CVD and diffusion of phosphorus from the oxide film may be utilized. The implantation of the impurity ions from the surface of the island-like semiconductor layer 110 may be done before the surface of the island-like semiconductor layer 110 is covered with the silicon oxide film 430 or may be finished before the island-like semiconductor layer 110 is formed. The means for the implantation is not particularly limited so long as the impurity concentration distribution in the island-like semiconductor layer 110 is equal.

Figure 197:
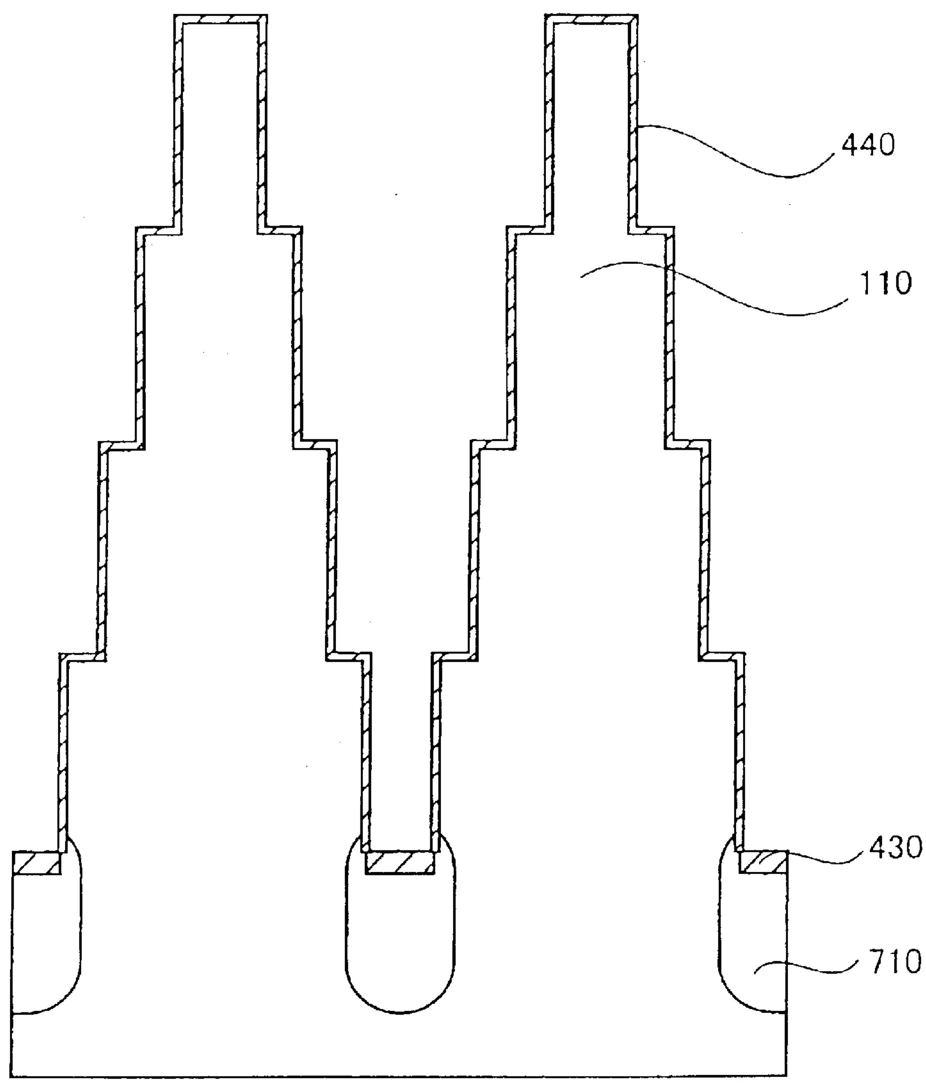
Figure 198:
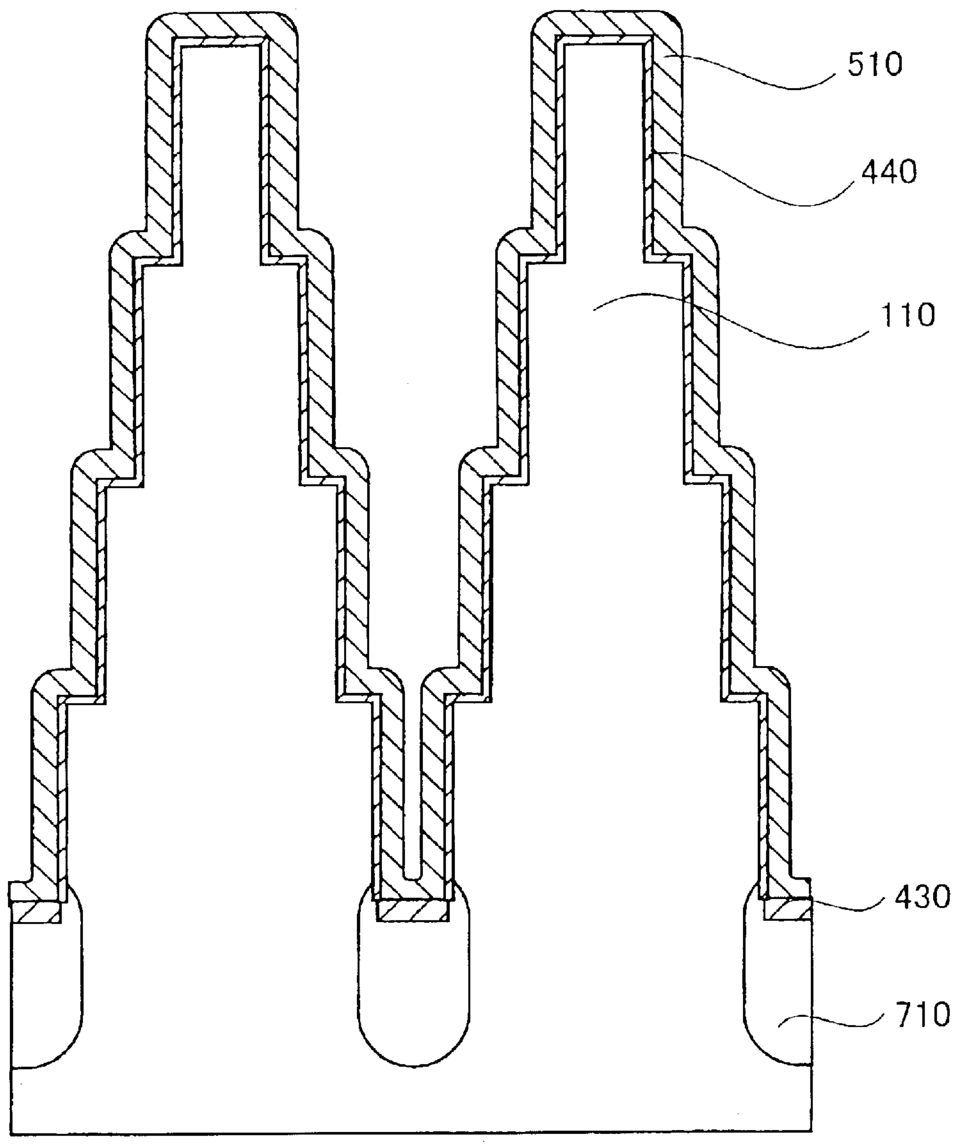
Figure 227:
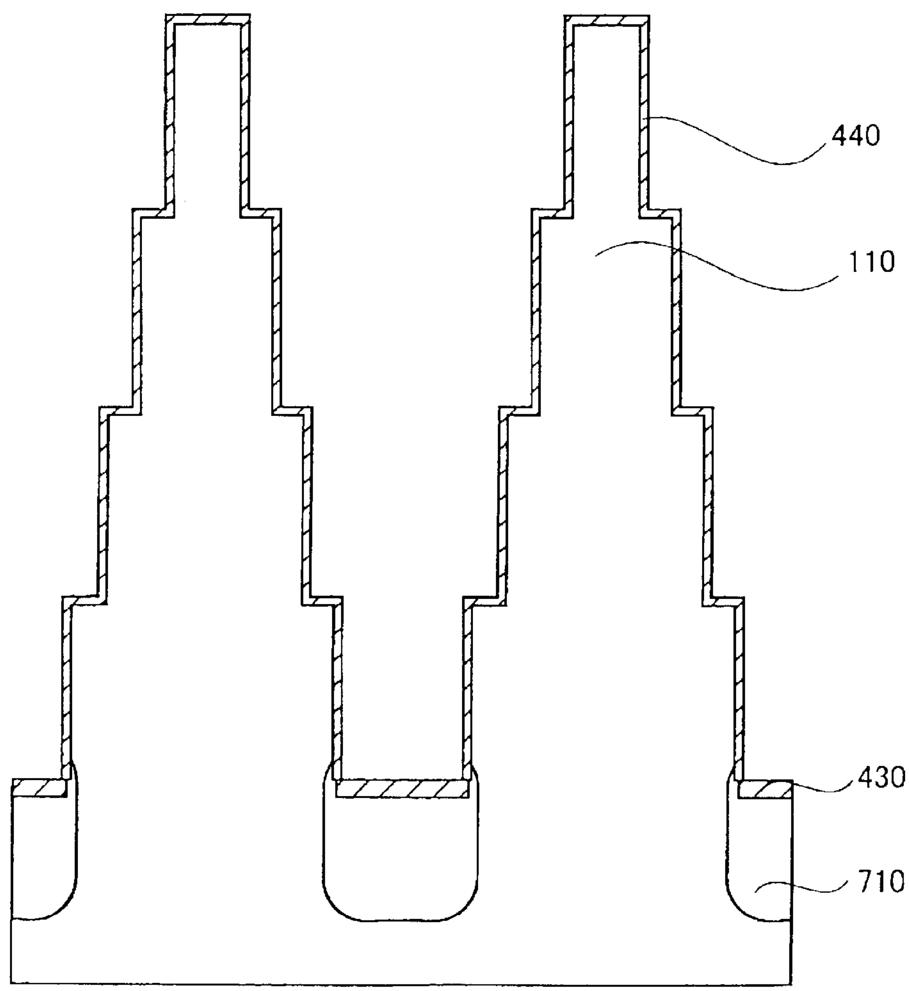
Figure 228:
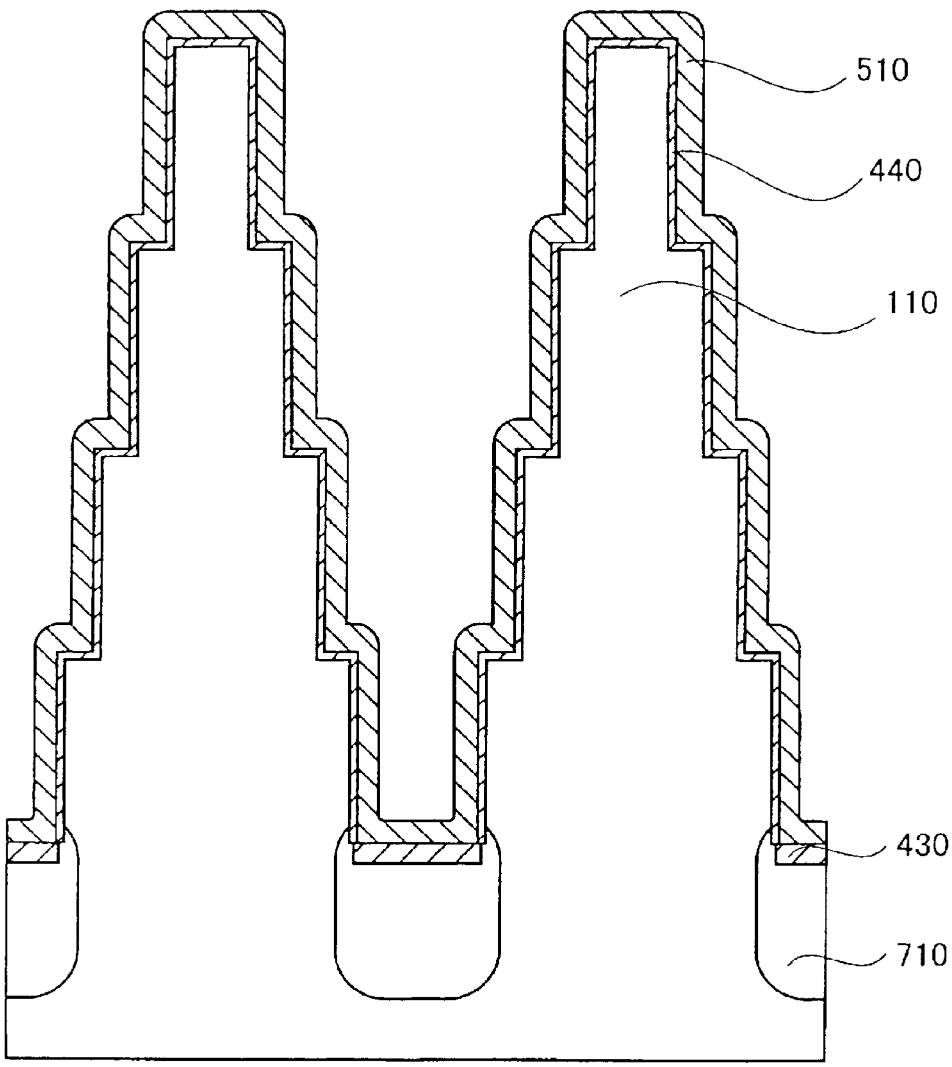

Subsequently, a silicon oxide film 440, for example, is formed as a fifth oxide film to be a tunnel oxide film of about 10 nm around the island-like semiconductor layer 110, for example, using thermal oxidation (FIG. 197 ad FIG. 227). At this time, the tunnel oxide film is not limited to the thermally oxidized film but may be a CVD oxide film or an oxynitride film.

Figure 199:
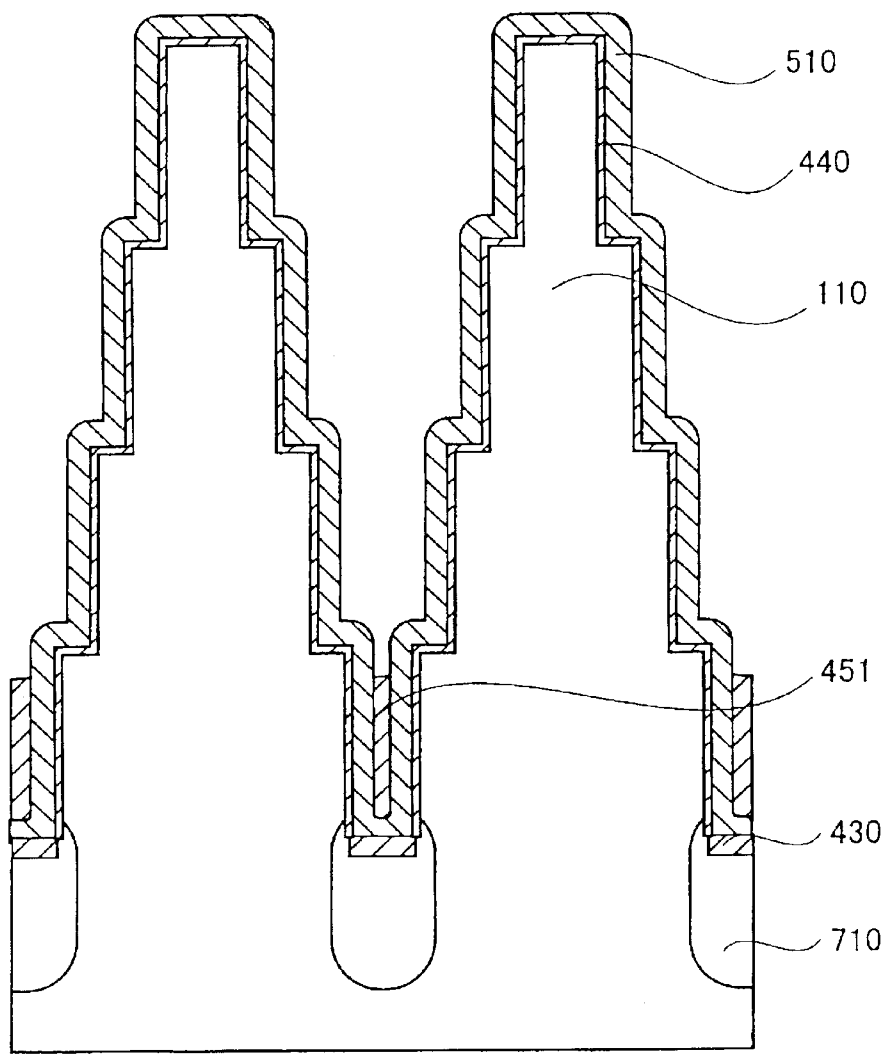
Figure 200:
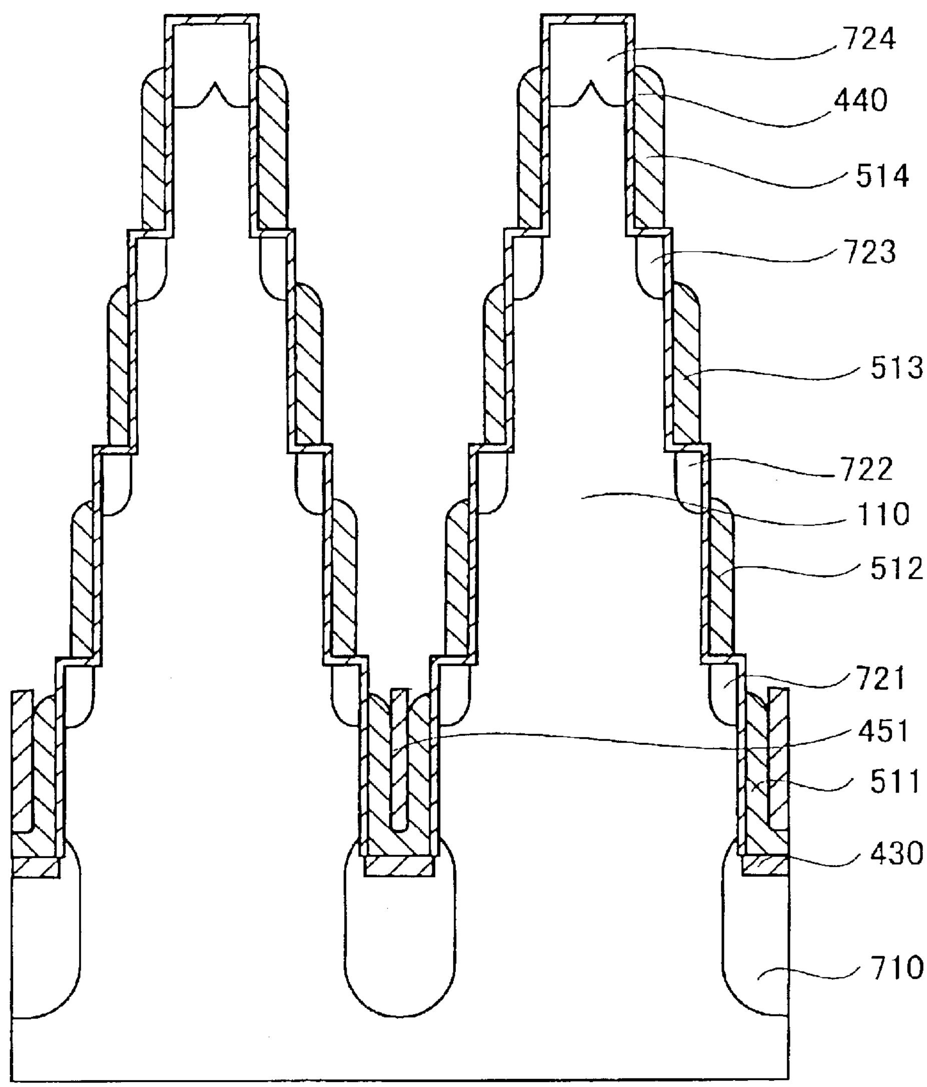
Figure 229:
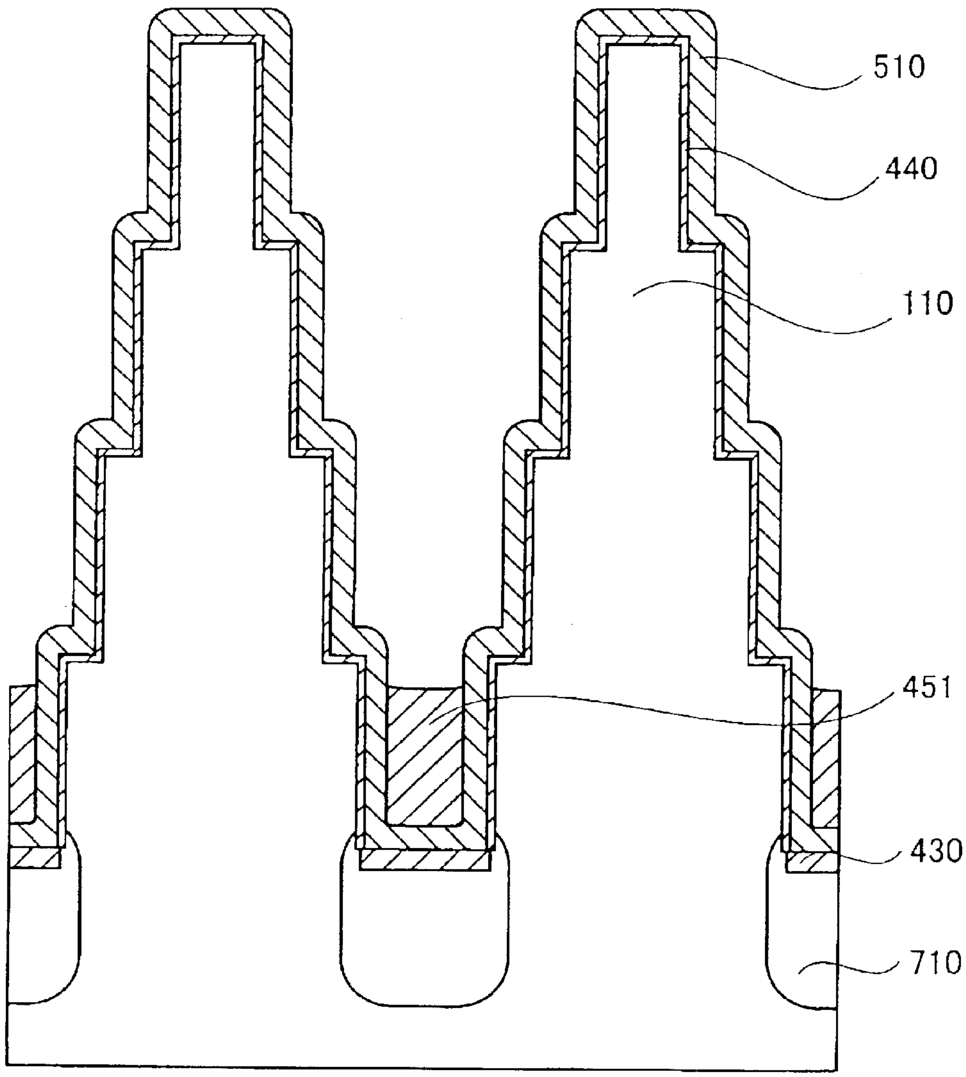
Figure 230:
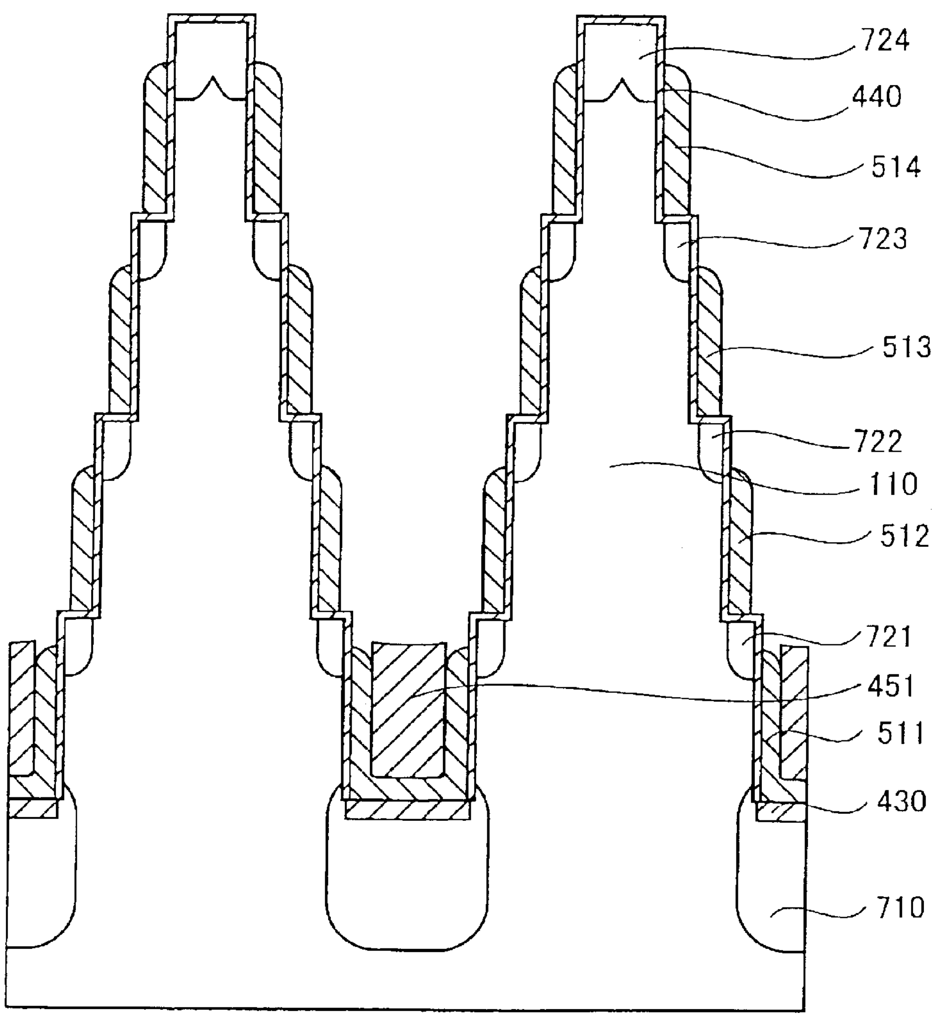

A first conductive film, for example, polysilicon film 510 is deposited to about 20 to 200 nm (FIG. 198 and FIG. 228), and a sixth insulating film, for example, a silicon oxide film 451 is deposited to about 20 to 200 nm. Then etch-back is conducted to a desired depth (FIG. 199 and FIG. 229). For example, by anisotropic etching, the polysilicon film 510 is formed in the form of sidewalls on the sidewalls of the tiers of the island-like semiconductor layer 110, whereby separate polysilicon films 511, 512, 513 and 514 which are first conductive films are formed at the same time. The selection gates, i.e., polysilicon film 511, at the bottom are all kept continuous by protection by the silicon oxide film 451.

Next, impurity ions are introduced into corners of the island-like semiconductor layer 110 having the steps to form n-type impurity diffusion layers 721, 722, 723 and 724 (FIG. 200 and FIG. 230), for example, at an implantation energy of 5 to 100 keV at an arsenic or phosphorus dose of about $1\times10^{12}$ to $1\times10^{15}/cm^2$ in a direction inclined about 0 to 45°. Here, the ion implantation for forming the n-type impurity diffusion layers 721, 722, 723 and 724 may be carried out on the entire periphery of the island-like semiconductor layer 110 and may be carried out from one direction or from several directions. That is, the n-type impurity diffusion layers 721, 722, 723 and 724 may not be formed to surround the periphery of the island-like semiconductor layer 110.

Figure 201:
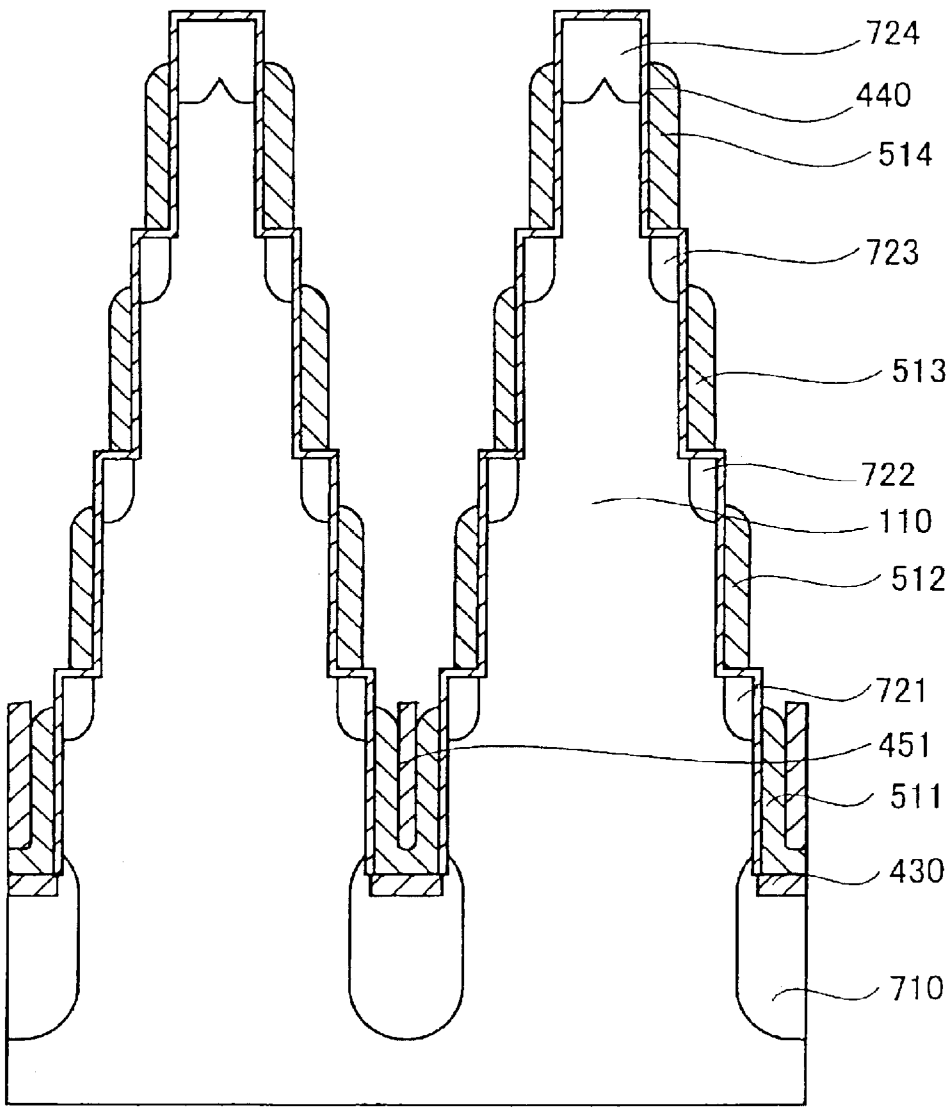
Figure 231:
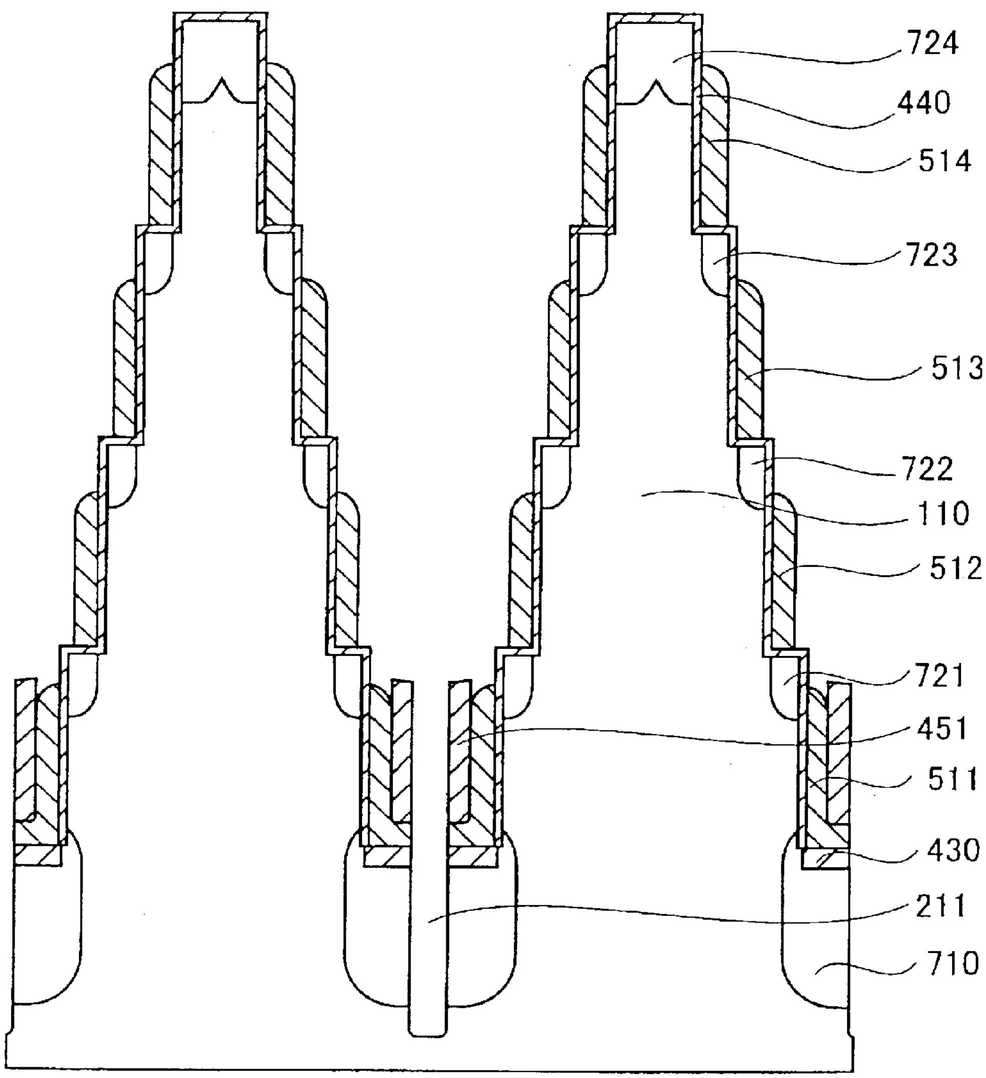

Thereafter, using as a mask a resist film R2 patterned by a known photolithography technique, the silicon oxide film 451 is etched by RIE, and the polysilicon film 51 1, the silicon oxide 430 and the impurity diffusion layer 710 are etched to form a first trench 211 (FIG. 201 and FIG. 231). Thereby a first wiring layer continuous in the A–A' direction in FIG. 1 and a second wiring layer to be a selection gate line are formed by separation.

Figure 202:
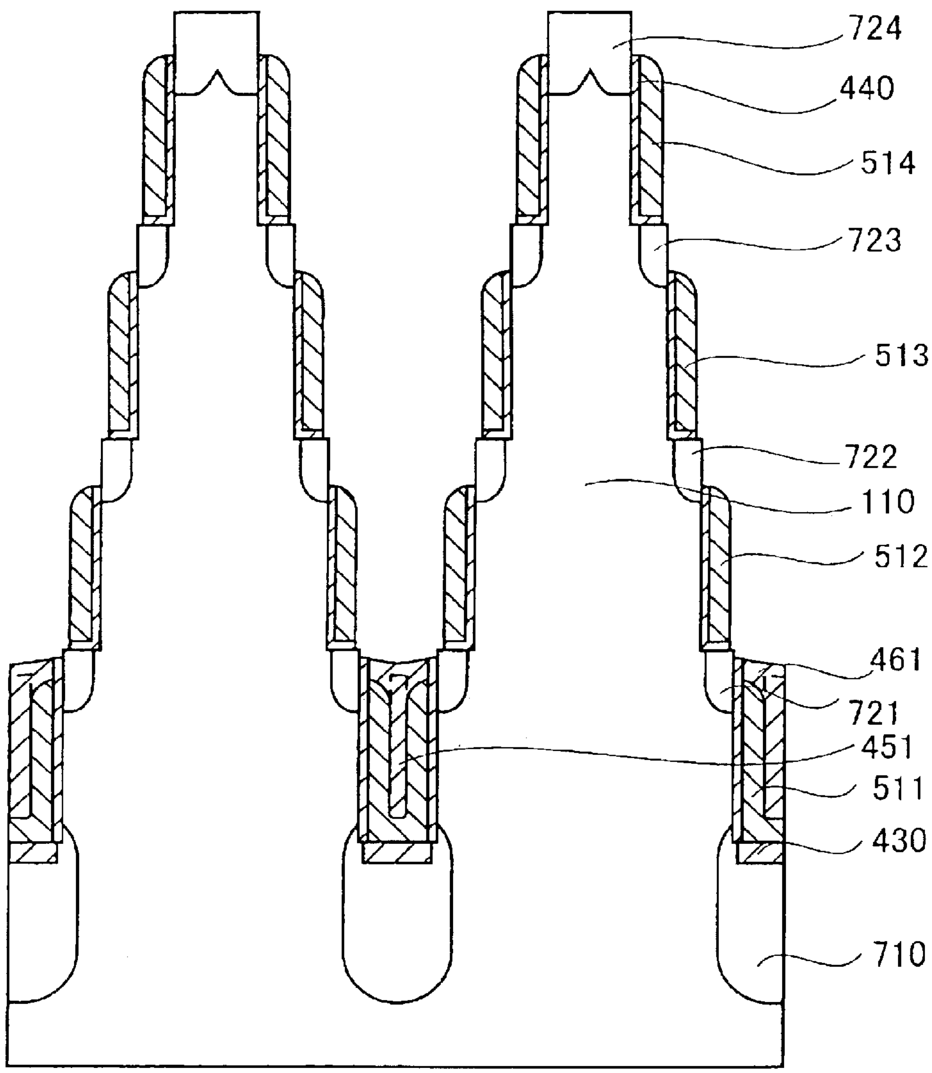
Figure 232:
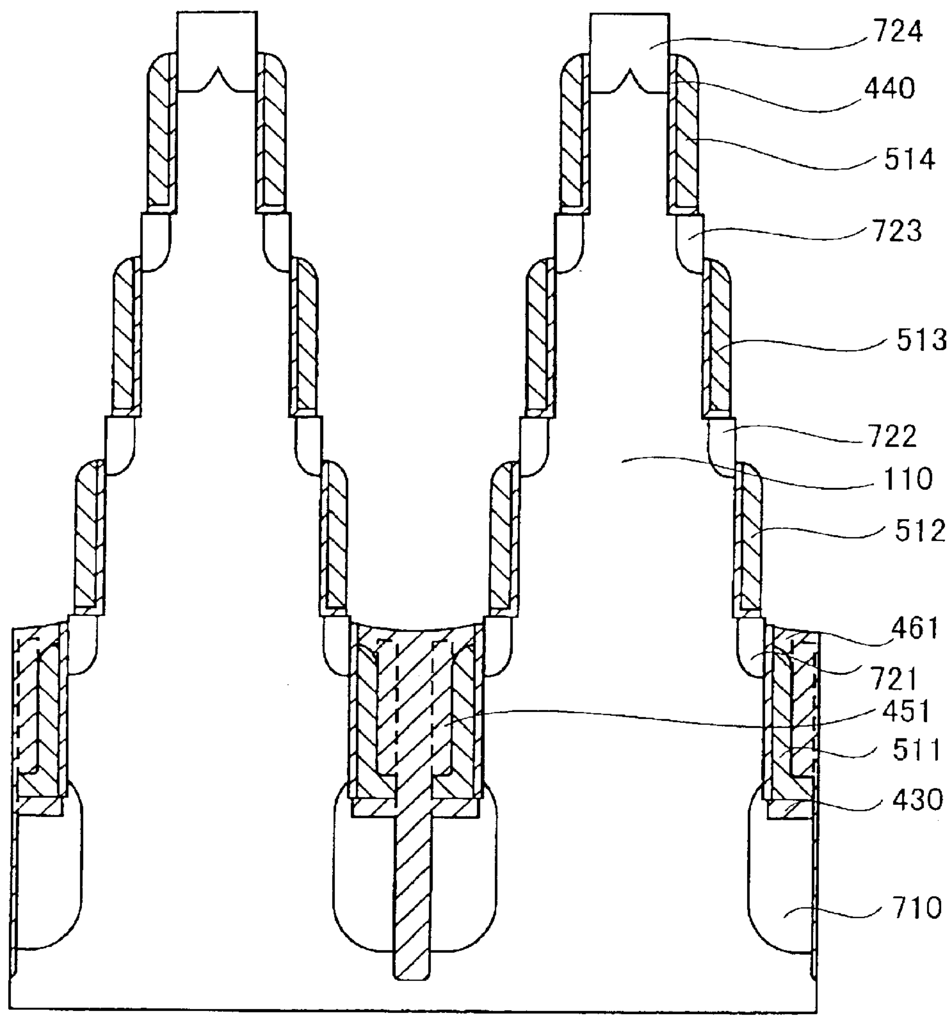

Next, a silicon oxide film 461, for example, is deposited to about 20 to 200 nm as a seventh insulating film and is isotropically etched to be buried and cover the first trench 211 and the top of the polysilicon film 511 (FIG. 202 and FIG. 232).

Subsequently, an interlayer insulating film 610 is formed on the exposes surfaces of the polysilicon films 512, 513 and 514. The interlayer insulating film 610 may be a ONO film, for example. More particularly, on the surfaces of the polysilicon films, a silicon oxide film of 5 to 10 nm thickness is formed by thermal oxidization, and a silicon nitride film of 5 to 10 nm thickness and further a silicon oxide film of 5 to 10 nm thickness are sequentially deposited.

Figure 203:
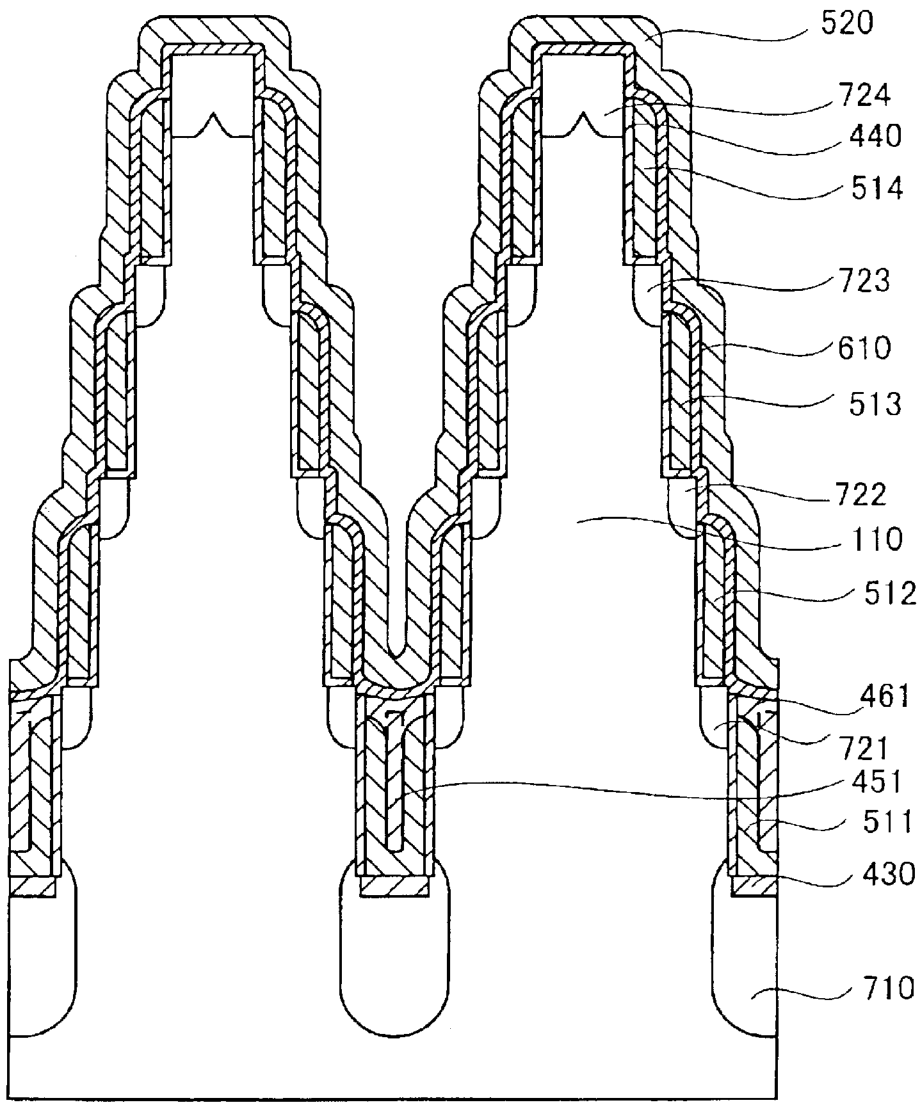
Figure 233:
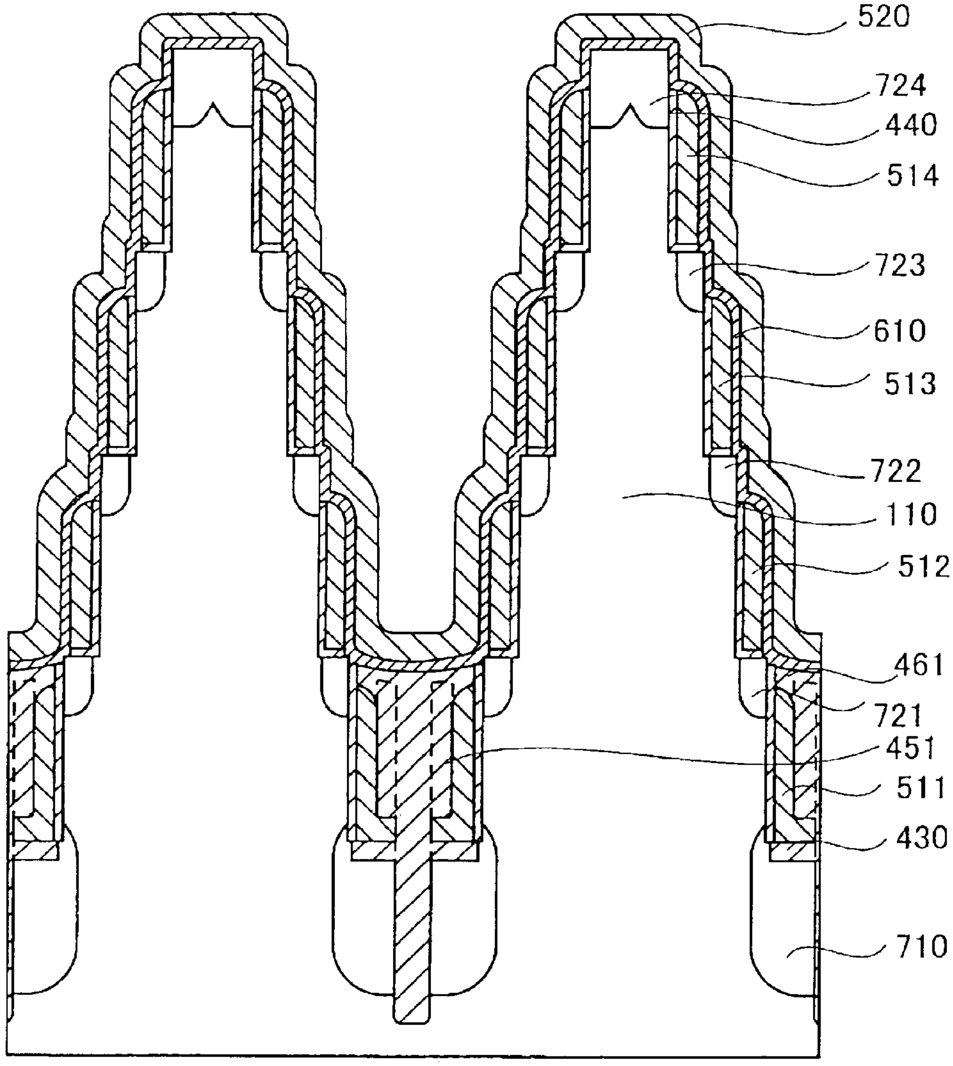

Next, a polysilicon film 520, for example, is deposited to 15 to 150 nm as a second conductive film (FIG. 203 and FIG. 233).

Figure 204:
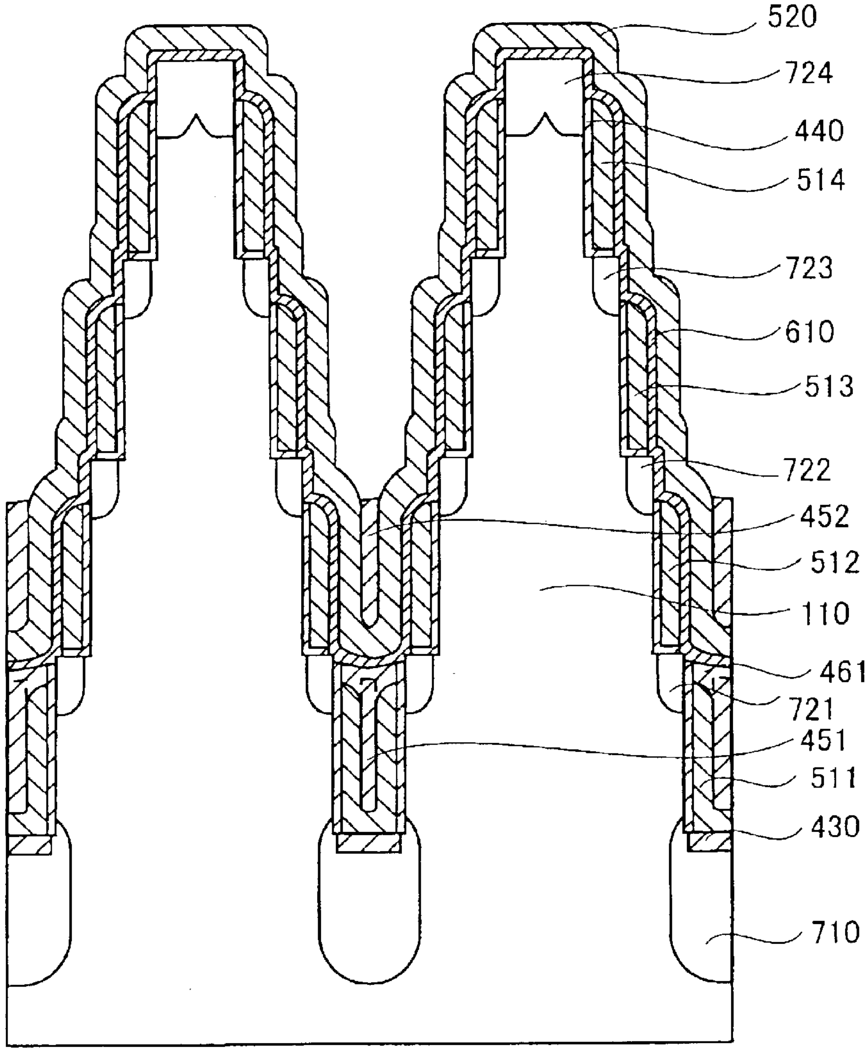
Figure 205:
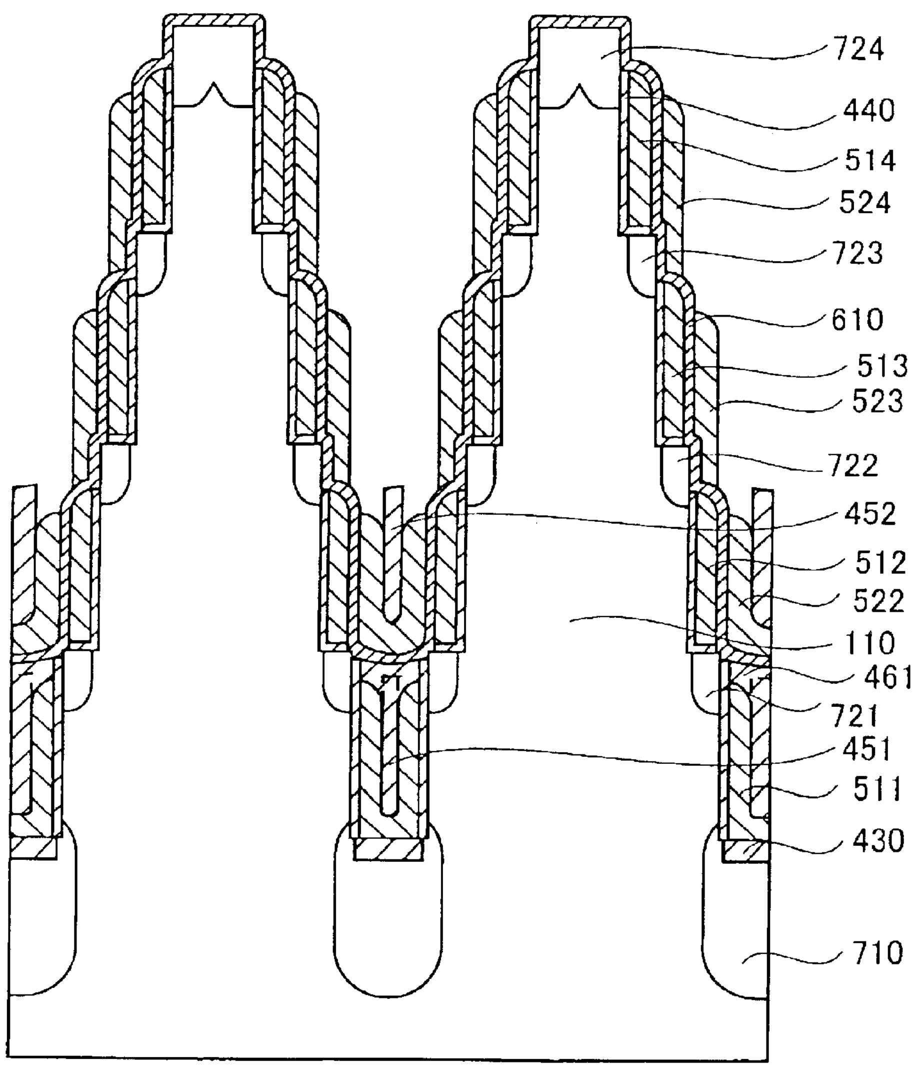
Figure 234:
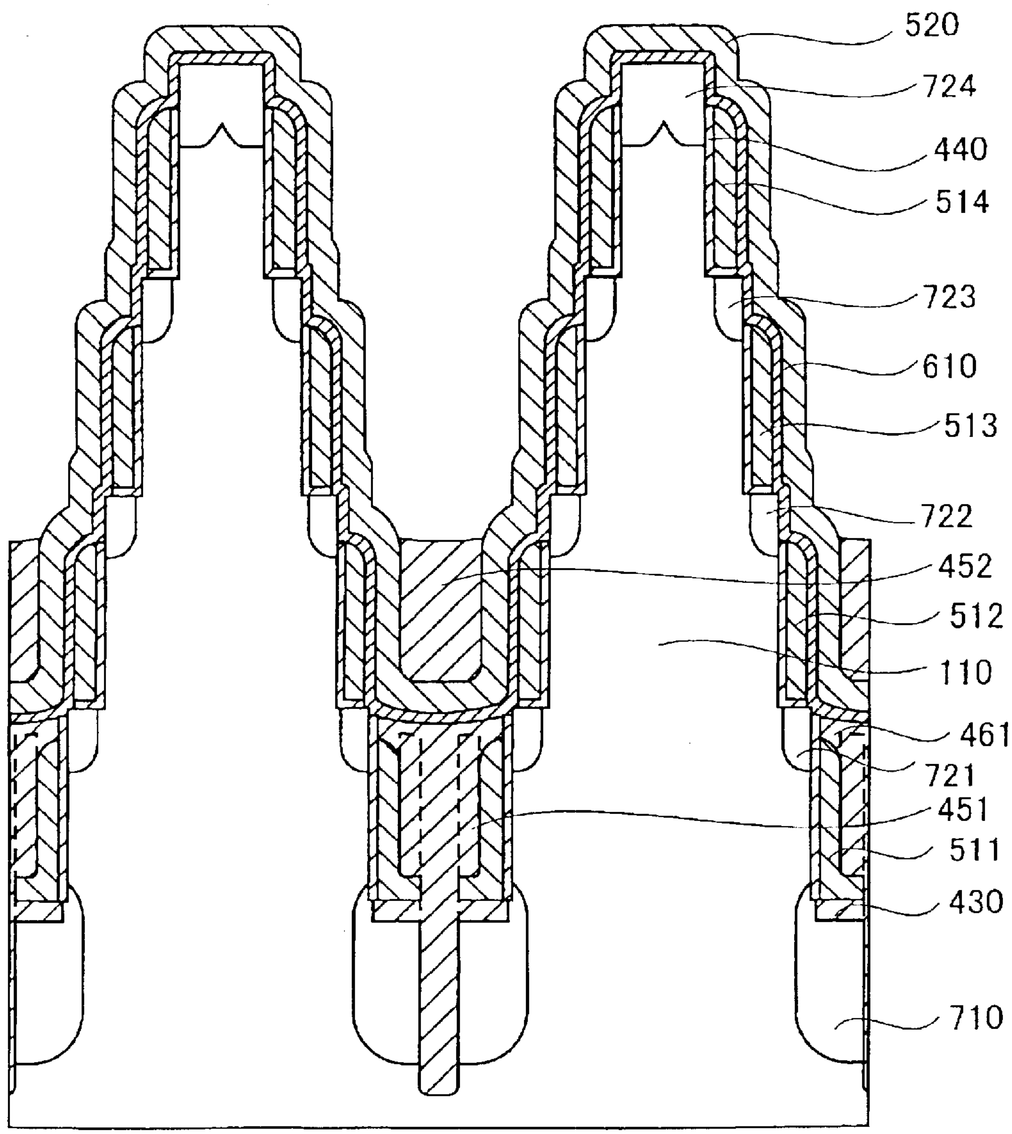
Figure 235:
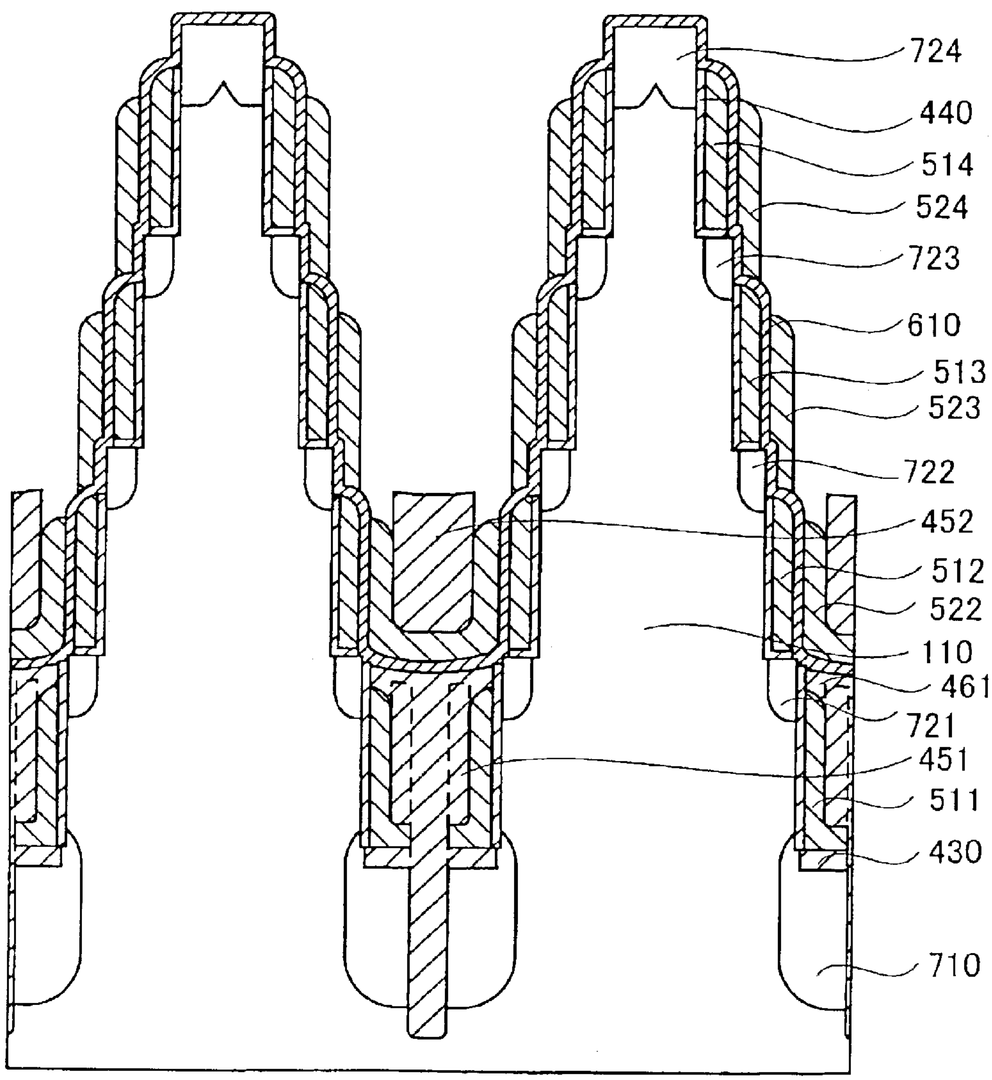

Thereafter, a silicon oxide film 452 is deposited to about 20 to 200 nm as a sixth insulating film and etched back to a desired depth (FIG. 204 and FIG. 234). For example, by anisotropic etching, the polysilicon film 520 is formed in the form of sidewalls on the sidewalls of the polysilicon films 512, 513 and 514 in the tiers of the island-like semiconductor layer 110 with intervention of the interlayer insulating film 610, whereby separate polysilicon films 522, 523, and 524 which are second conductive films are formed at the same time (FIG. 205 and FIG. 235). The control gates, i.e., polysilicon film 522, at the lower tier all kept continuous by protection by the silicon oxide film 452.

Figure 206:
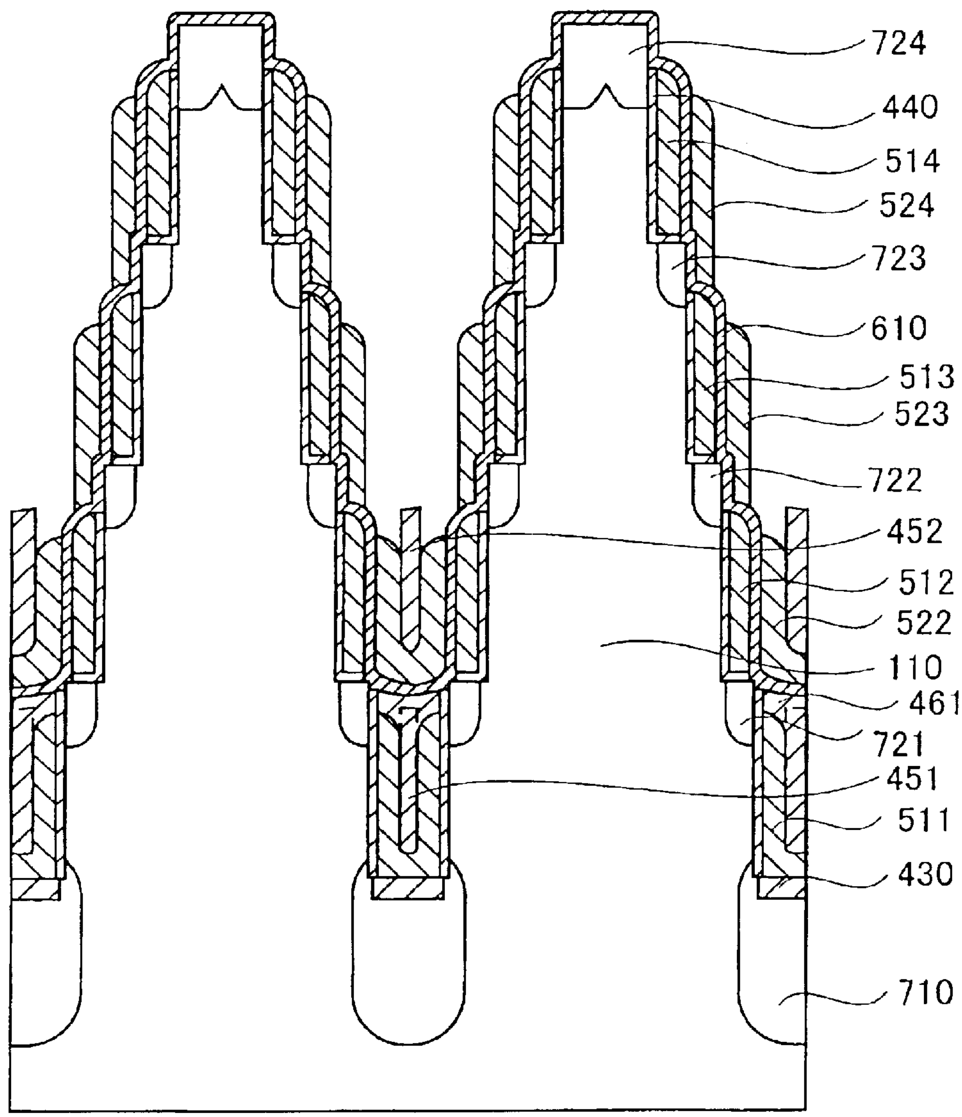
Figure 236:
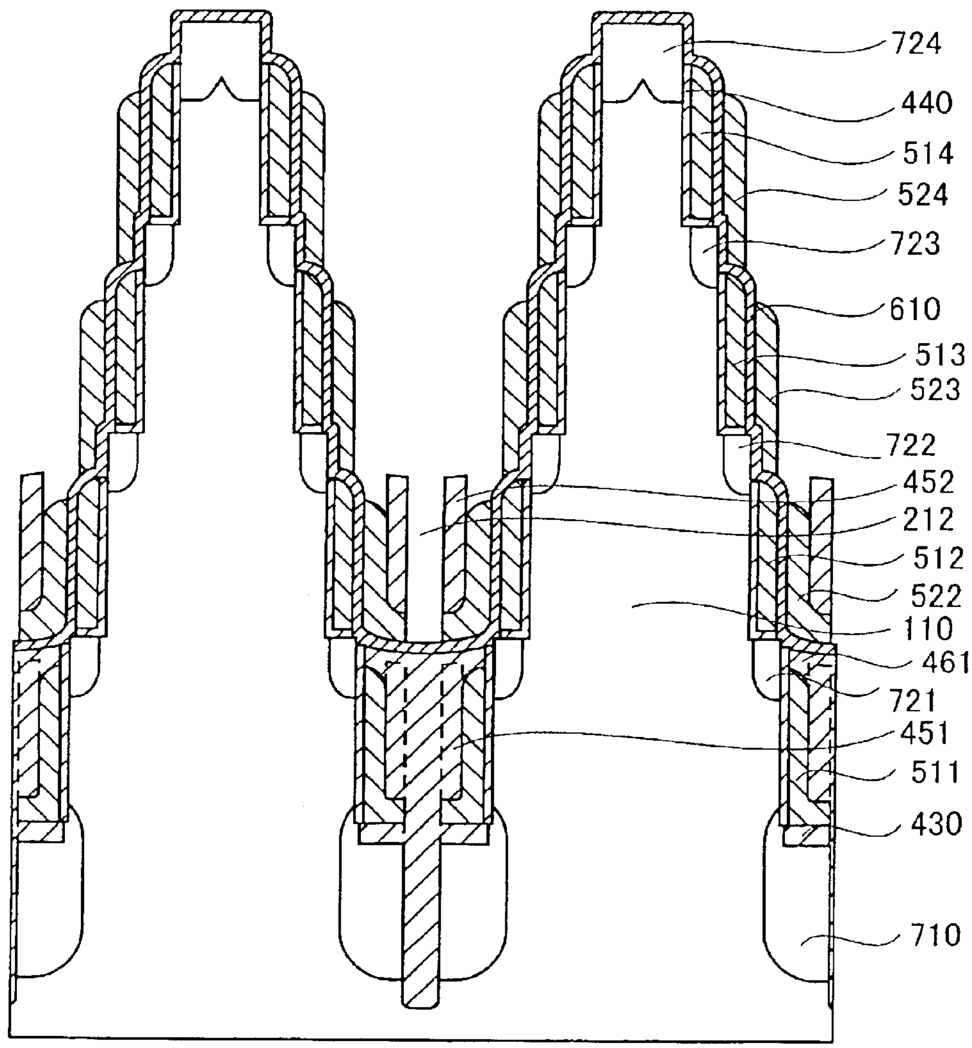

Subsequently, using as a mask a resist film R3 patterned by a known photolithography technique, the silicon oxide film 452 is etched by RIE, and then the polysilicon film 522 is etched to form a first trench 212 (FIG. 206 and FIG. 236). Thereby a third wiring layer to be a control gate line continuous in the A–A' direction in FIG. 1 is formed by separation.

Figure 207:
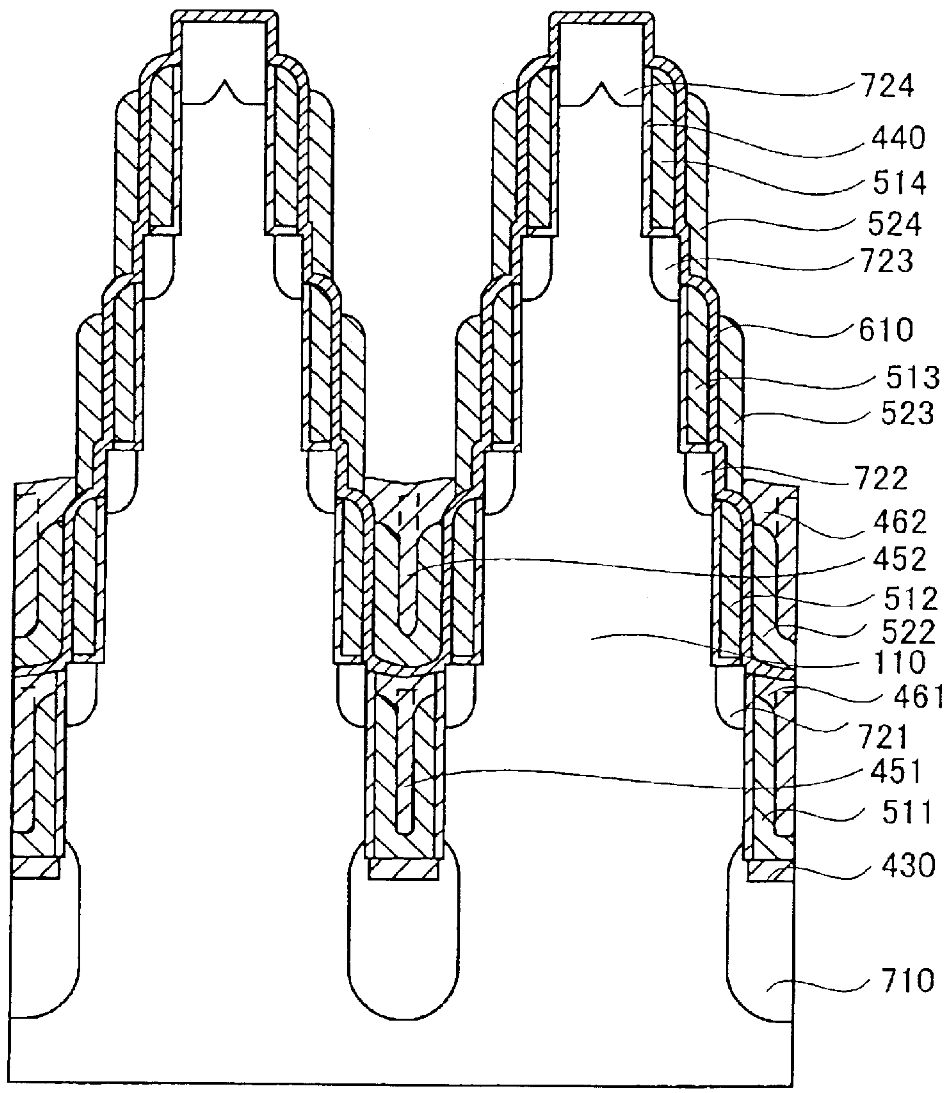
Figure 237:
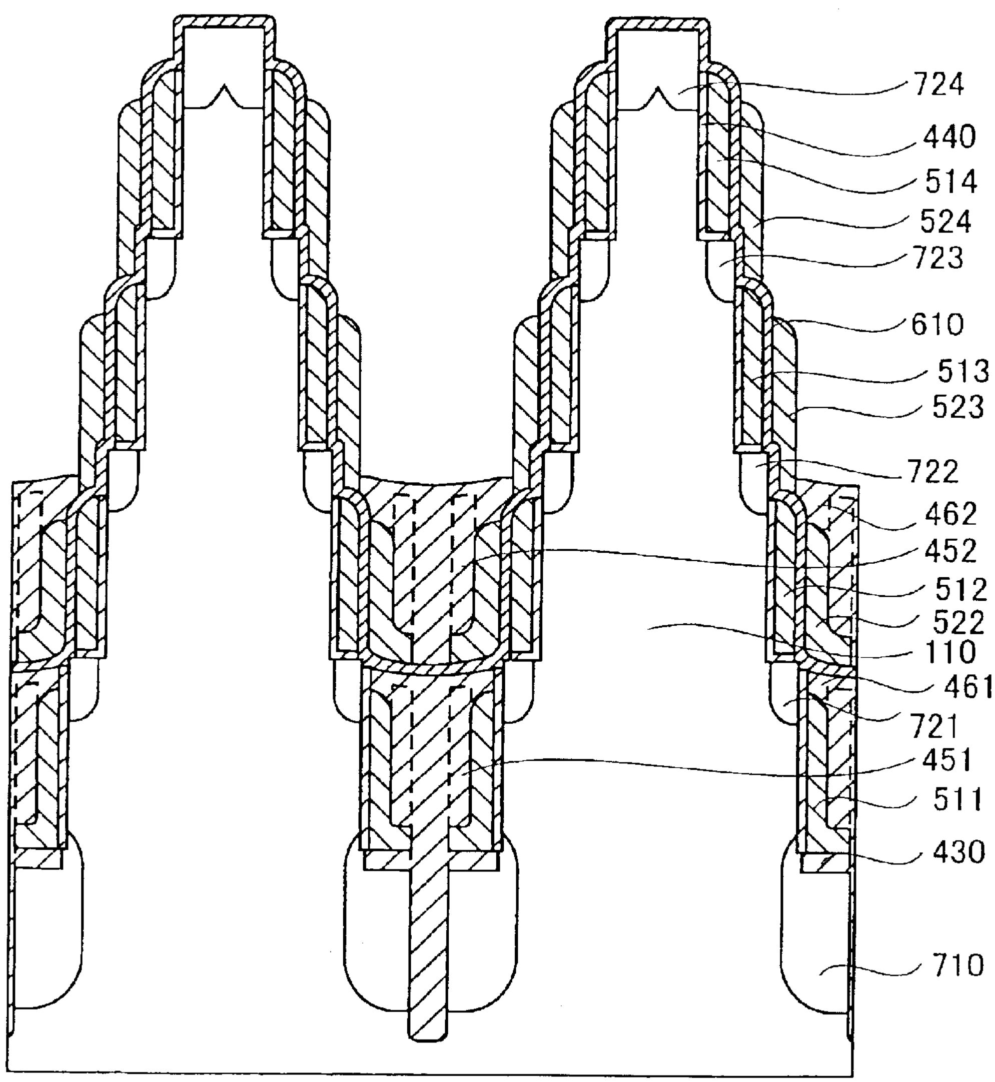

Next, a silicon oxide film 462, for example, is deposited to about 20 to 200 nm as a seventh insulating film and is isotropically etched to be buried and cover the first trench 212 and the top of the polysilicon film 522 (FIG. 207 and FIG. 237).

Figure 208:
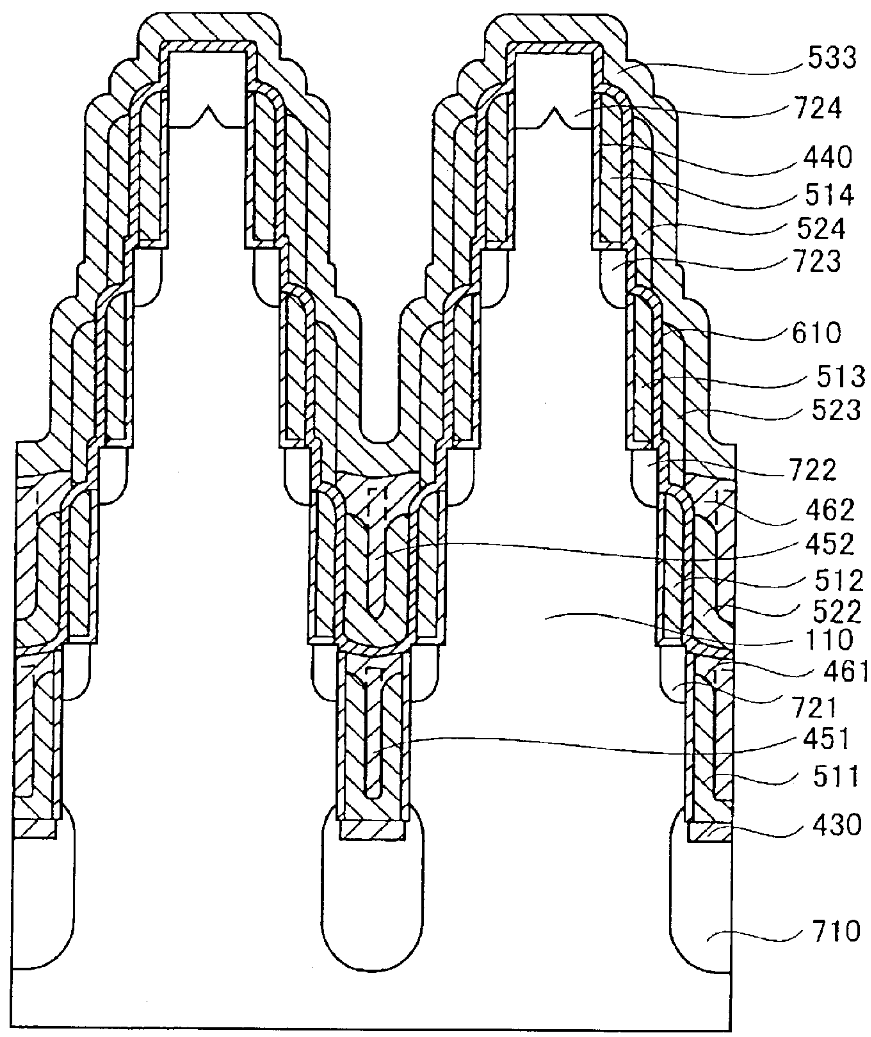
Figure 209:
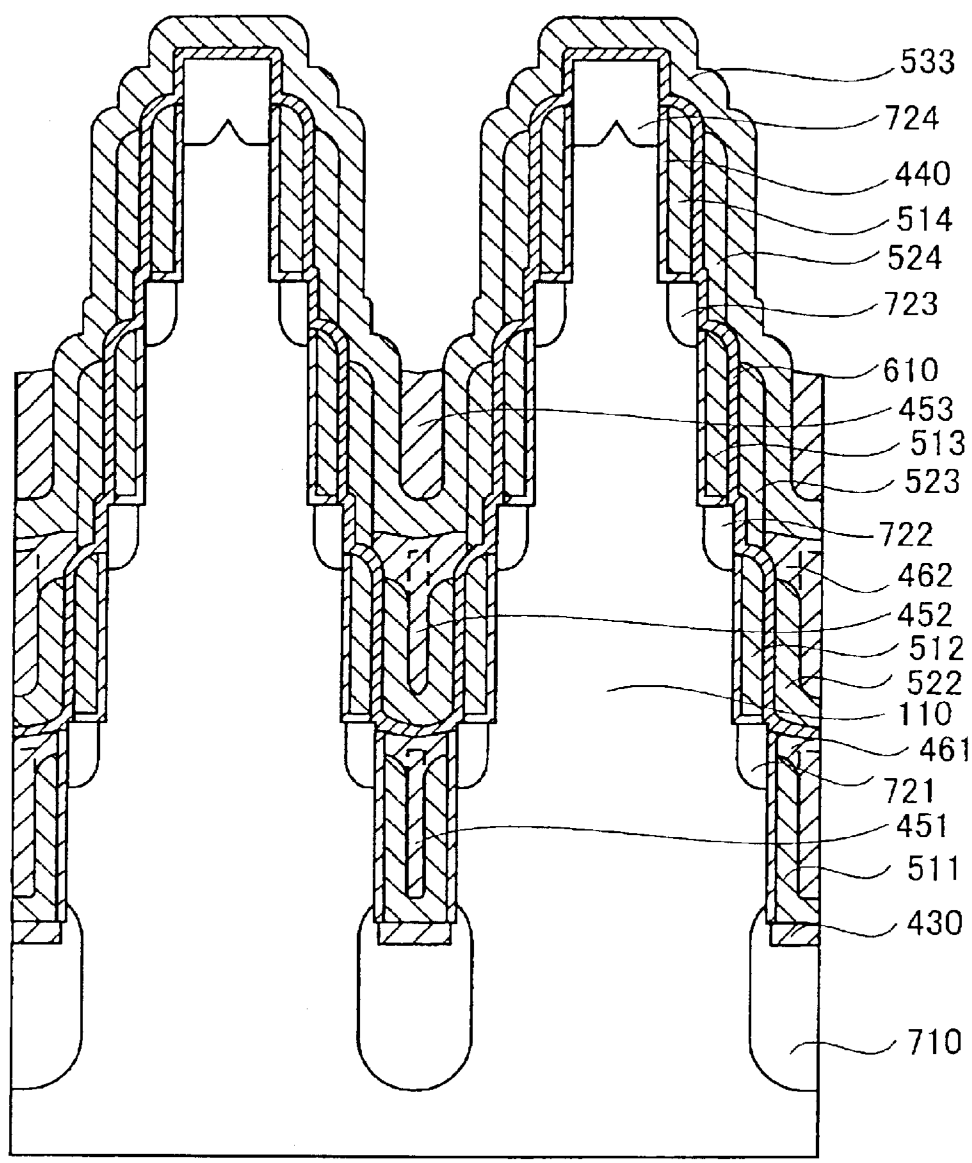
Figure 238:
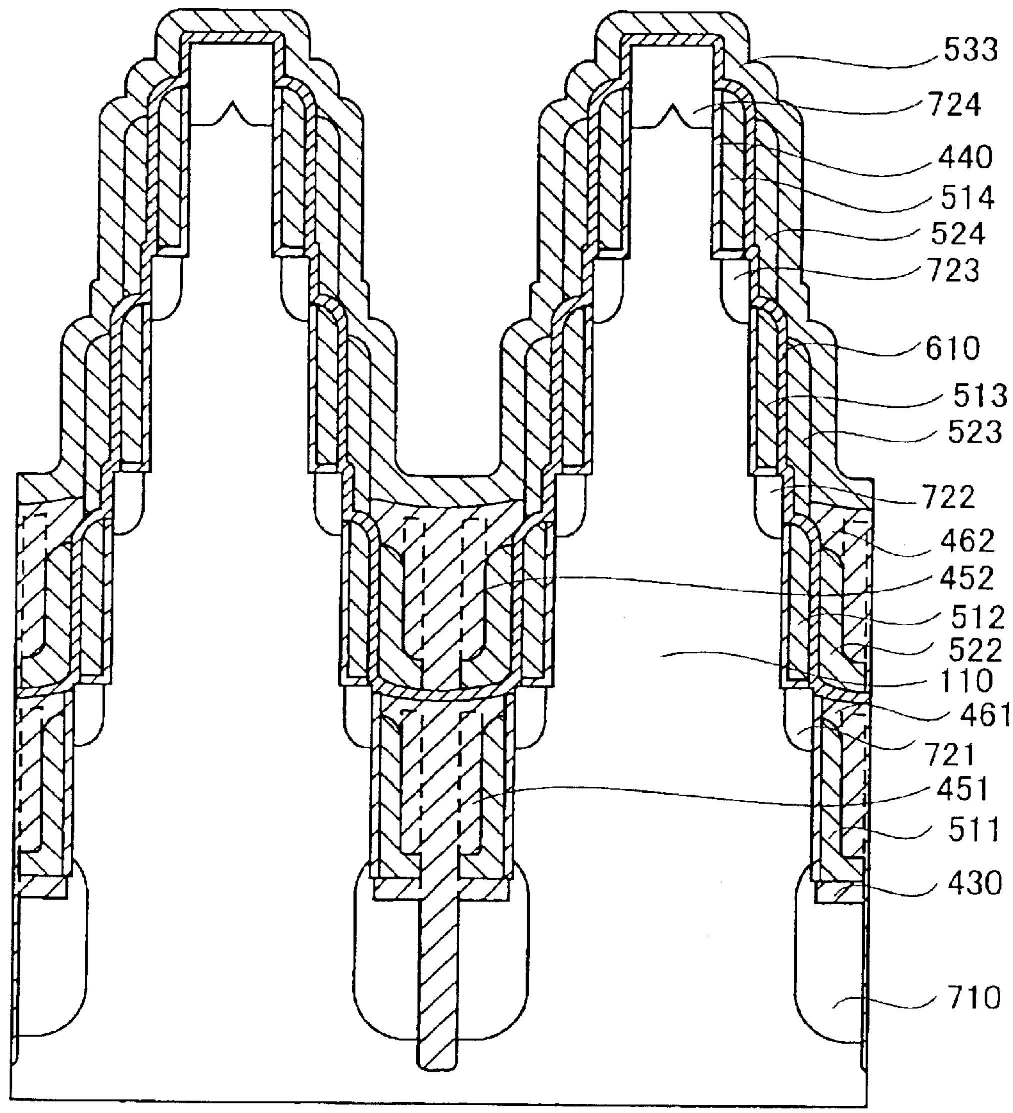
Figure 239:
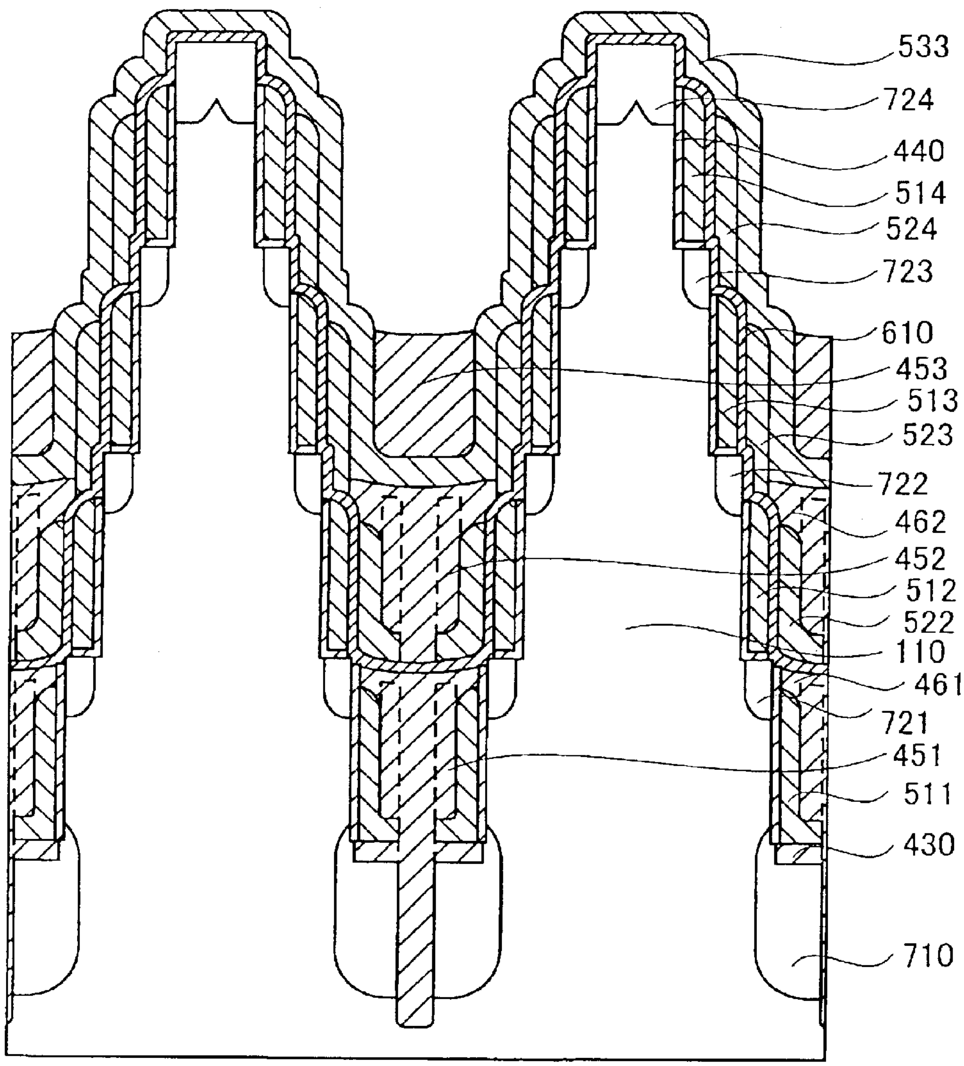

Subsequently, a polysilicon film 533, for example, is deposited to 15 to 150 nm as a third conductive film (FIG. 208 and FIG. 238). Thereafter, a silicon oxide film 453, for example, is deposited to about 20 to 200 nm as a sixth insulating film and is etched back to a desired depth (FIG. 209 and FIG. 239).

Figure 210:
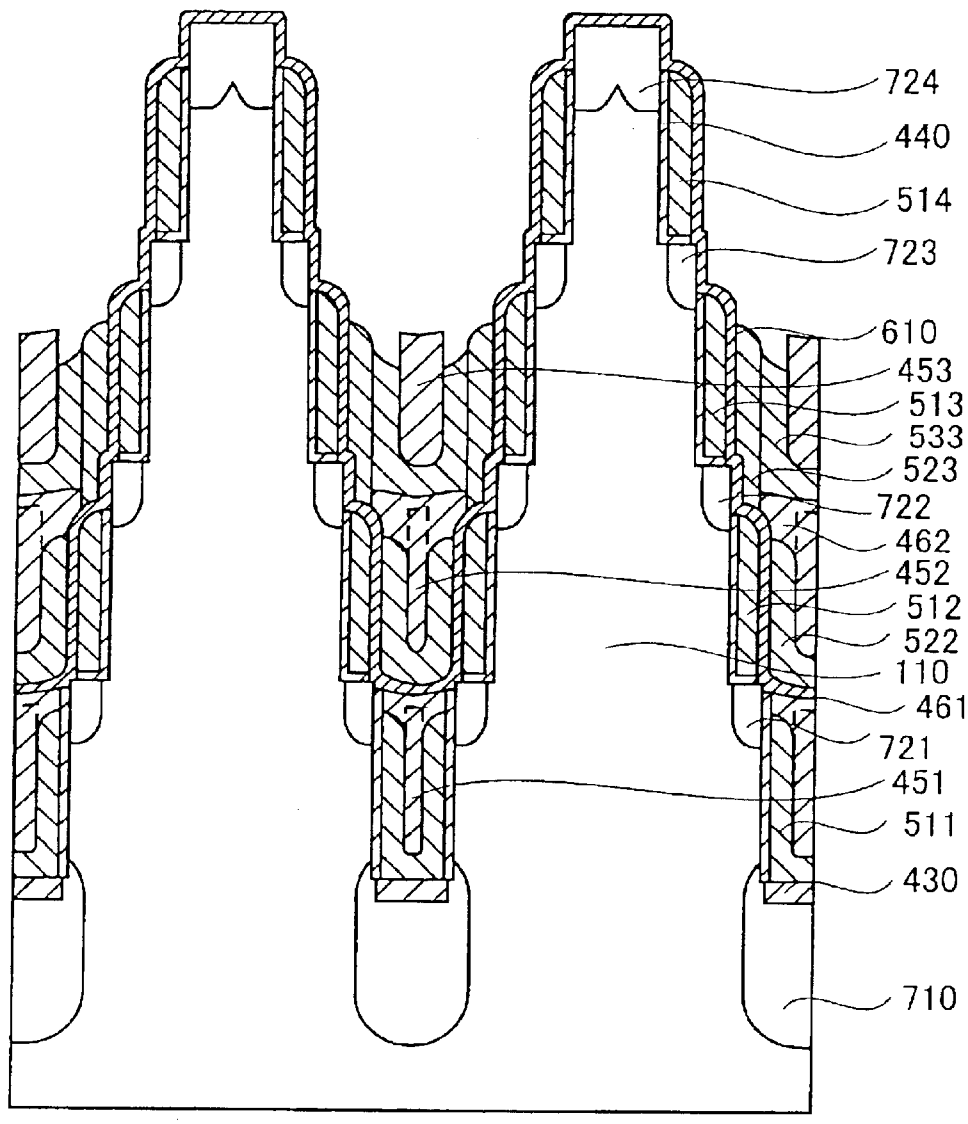
Figure 240:
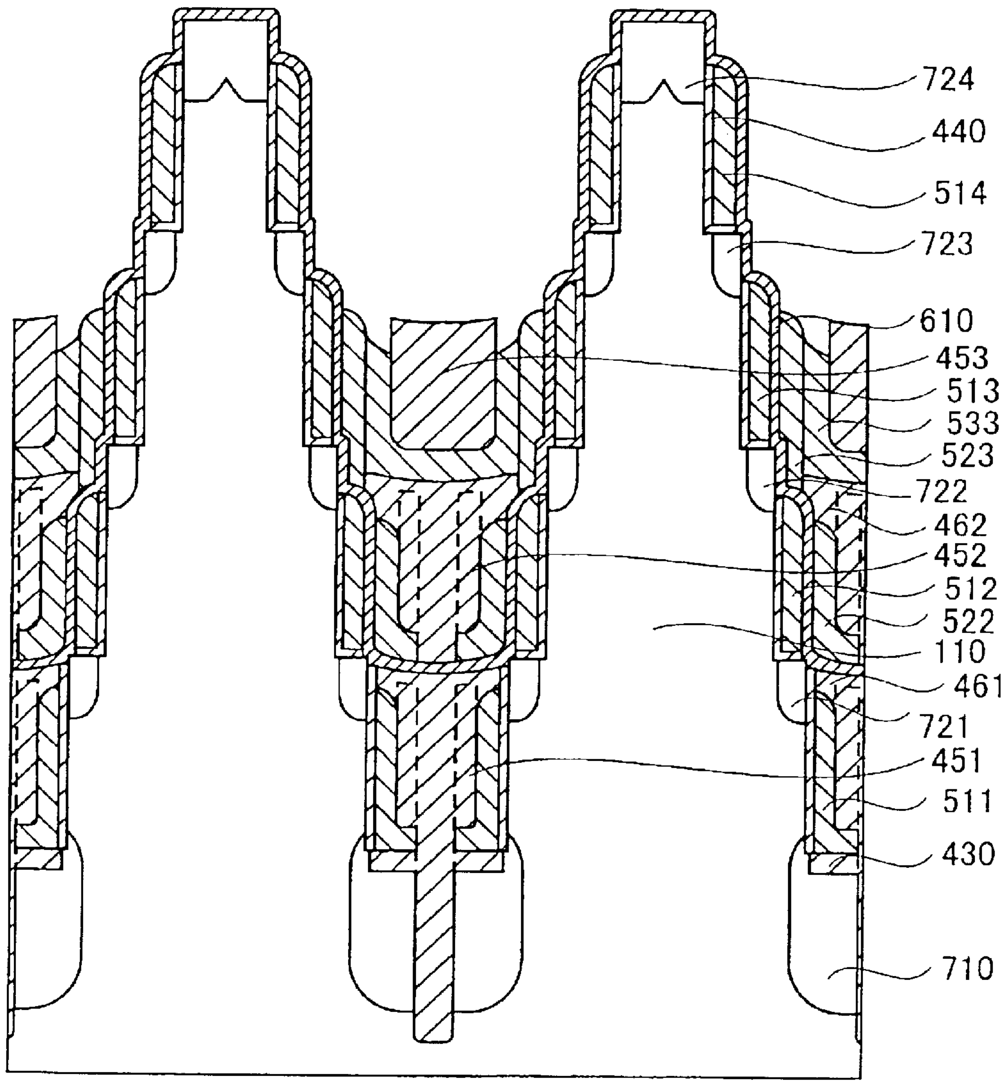

An exposed part of the polysilicon film 533 and the polysilicon film 524 are selectively removed by isotropic etching using the silicon oxide film 453 as a mask (FIG. 210 and FIG. 240). The control gates in the upper tier, i.e., the polysilicon film 523, are connected by the polysilicon film 533 and are all kept connected by protection by the silicon oxide film 453 after isotopic etching.

Figure 211:
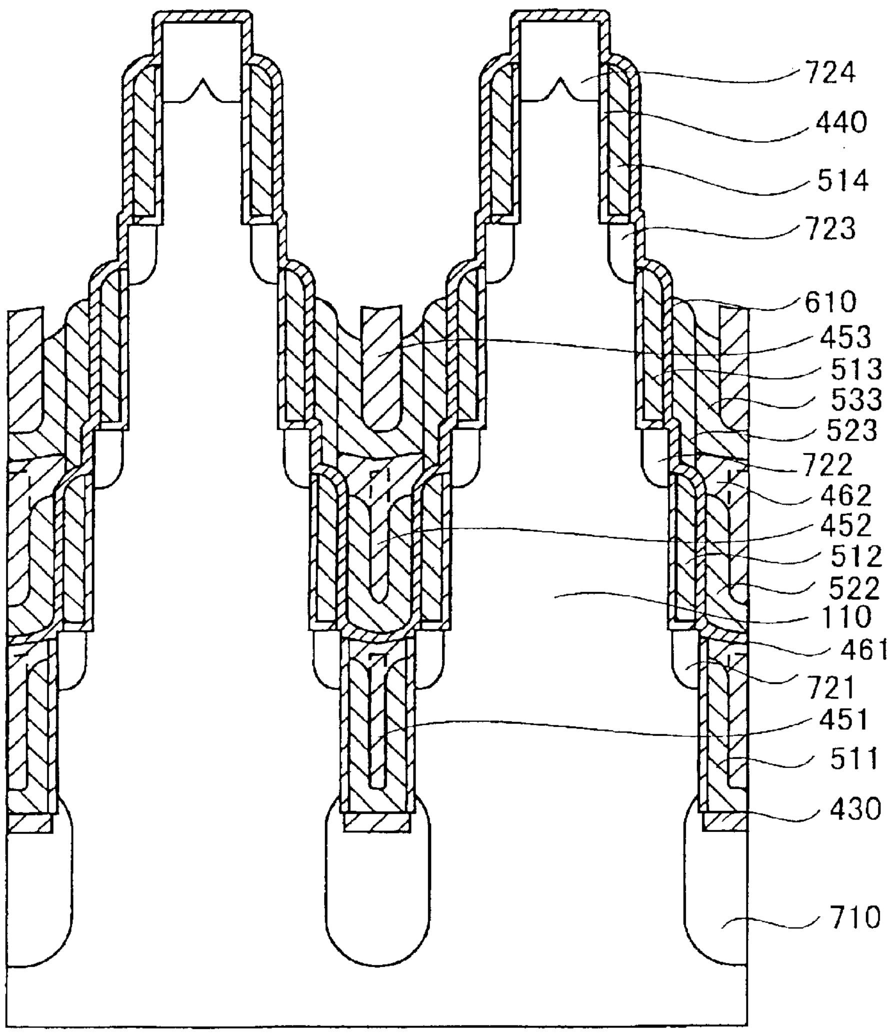
Figure 241:
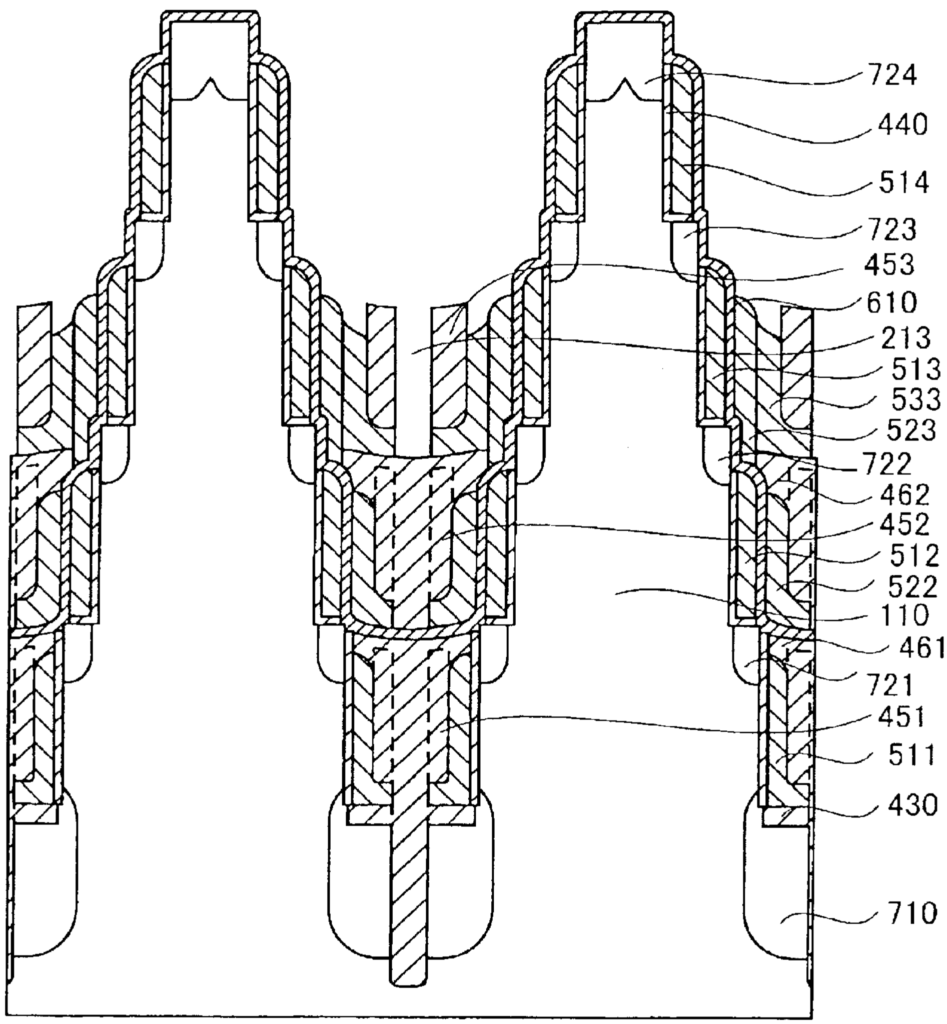

Thereafter, using as a mask a resist film R4 patterned by a known photolithography technique, the silicon oxide film 453 is etched by RIE, and then the polysilicon film 533 is etched to form a first trench 213 (FIG. 211 and FIG. 241). Thereby a third wiring layer to be a control gate line continuous in the A–A' direction in FIG. 1 is formed by separation.

Figure 212:
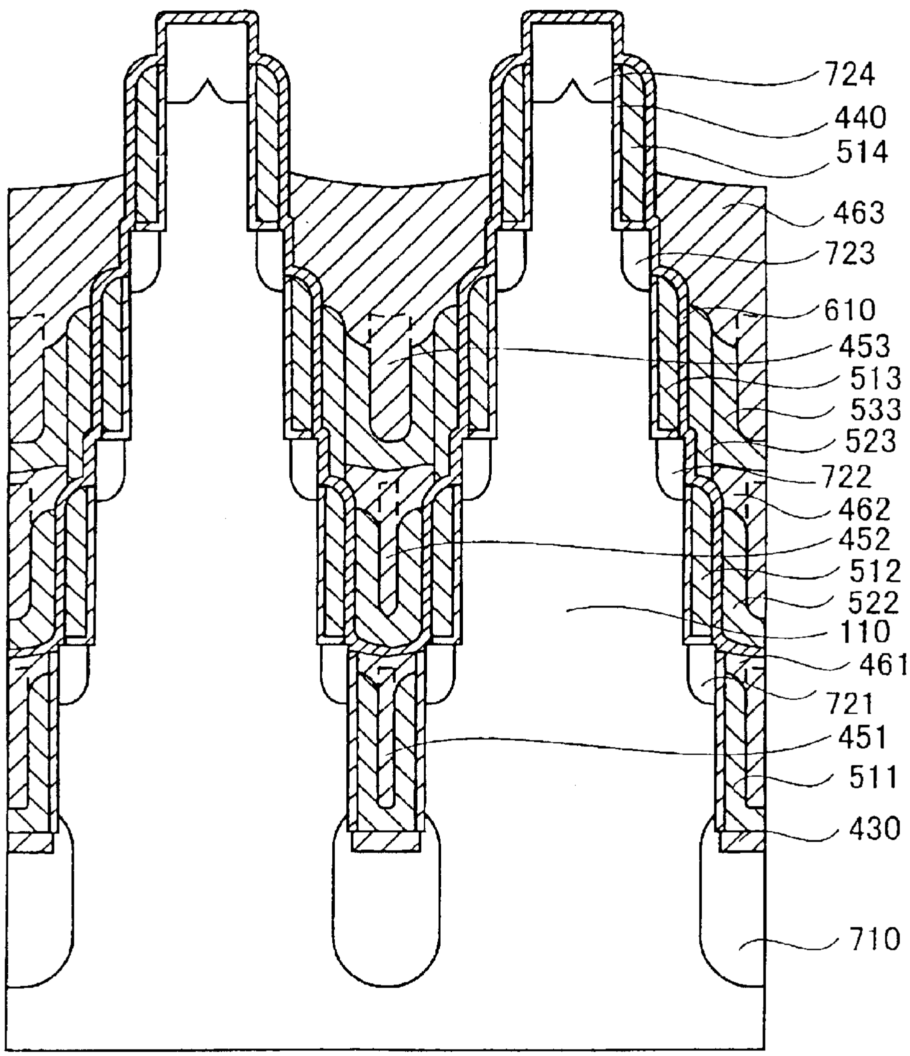
Figure 242:
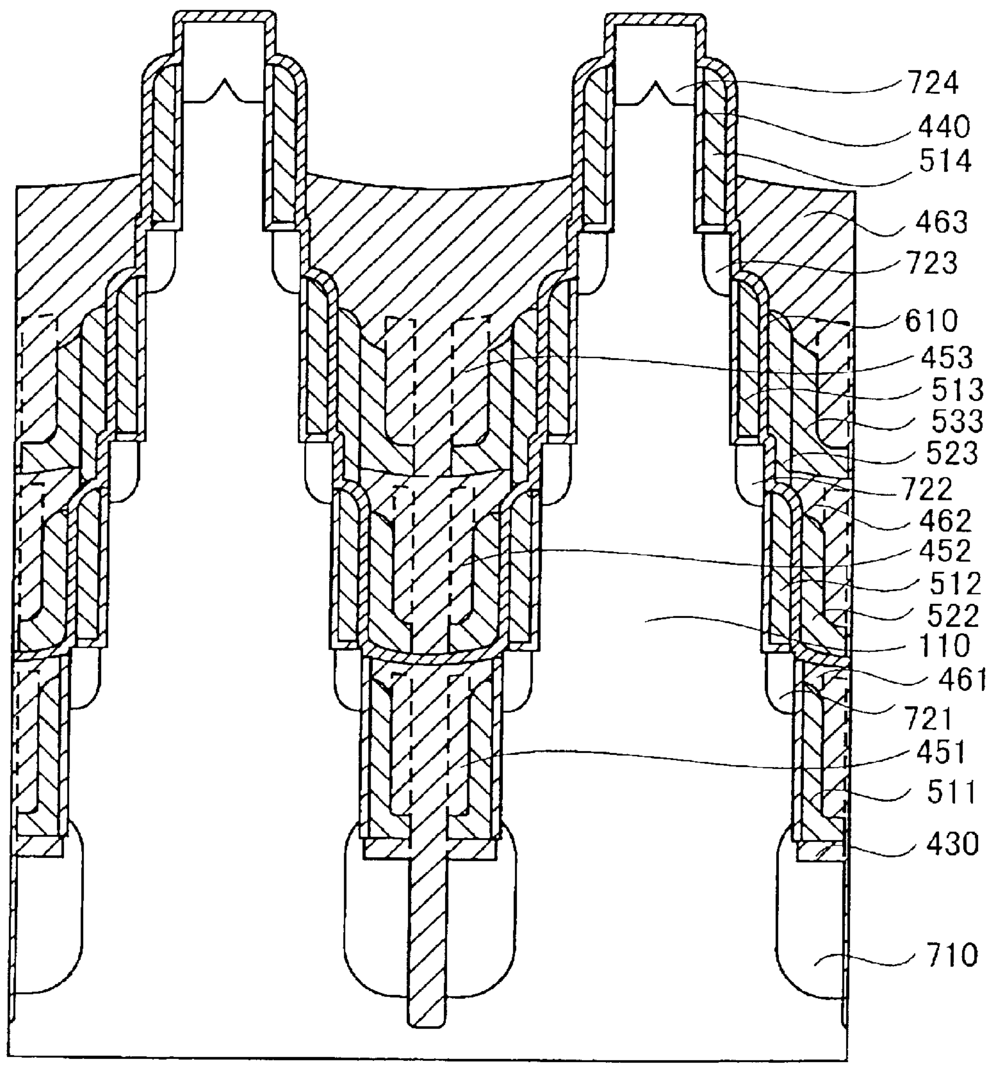

Next, a silicon oxide film 463, for example, is deposited to about 20 to 400 nm as a seventh insulating film and is isotropically etched to be buried and cover the first trench 213, the polysilicon film 523 and the top of the polysilicon film 533 (FIG. 212 and FIG. 242).

Figure 213:
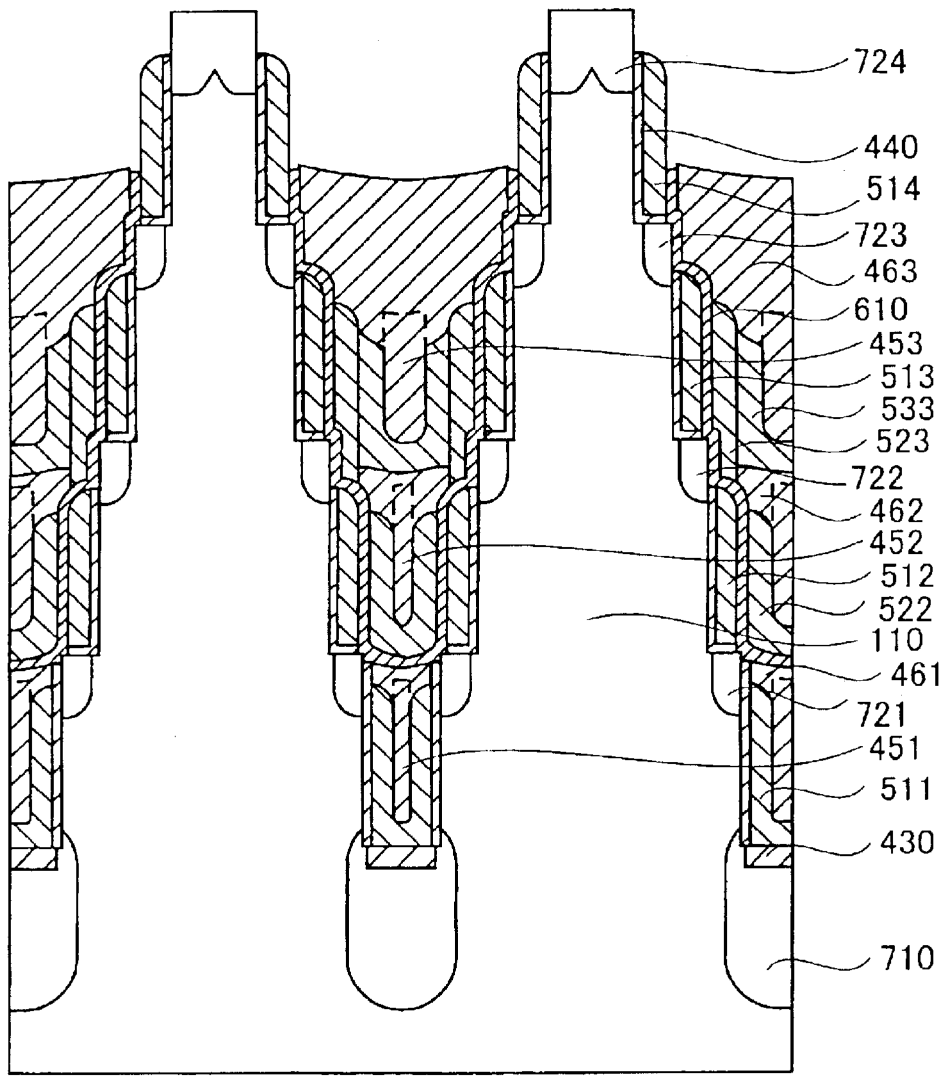
Figure 243:
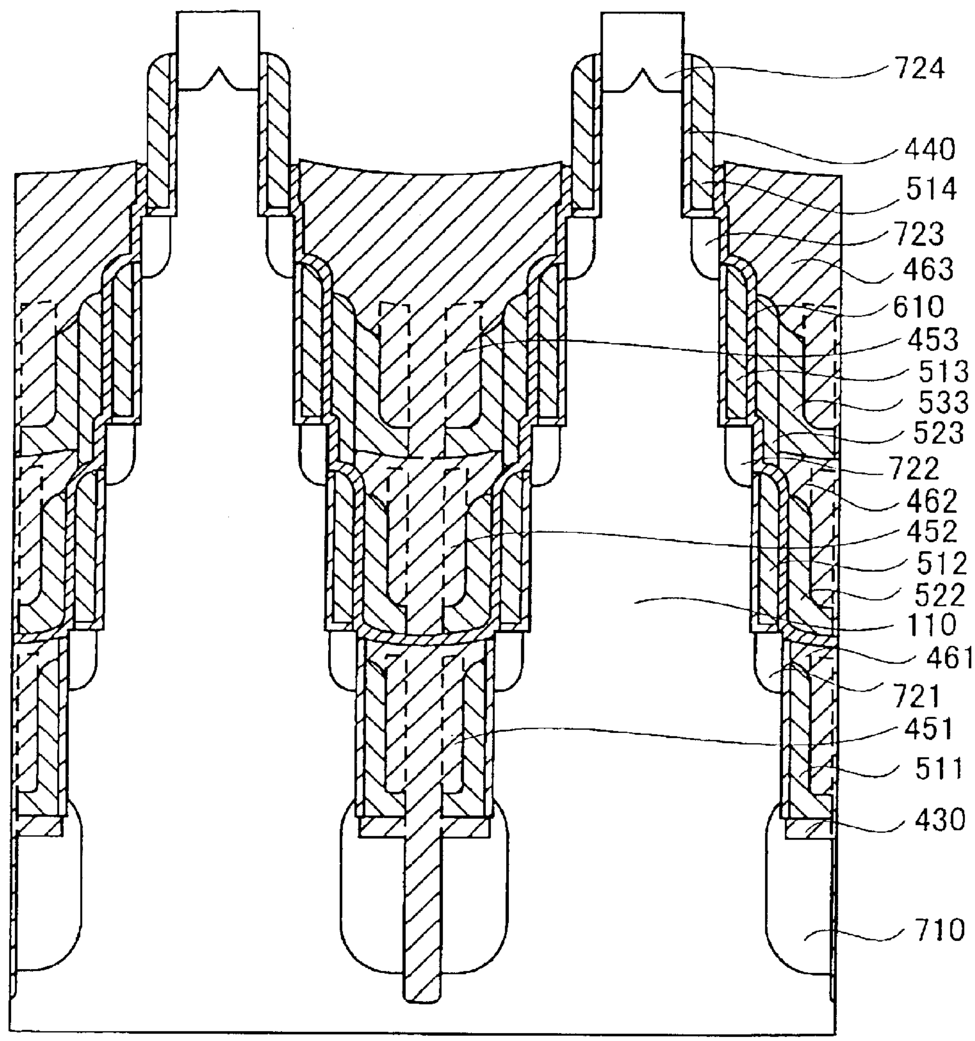

Thereafter, the interlayer insulating film 610 exposed with respect to the silicon oxide film 463 is removed to expose at least a part of the selection gate, i.e., the polysilicon layer 514, which is formed on the top of the island-like semiconductor layer 110 and the uppermost tier of the island-like semiconductor layer 110 (FIG. 213 and FIG. 243).

Figure 214:
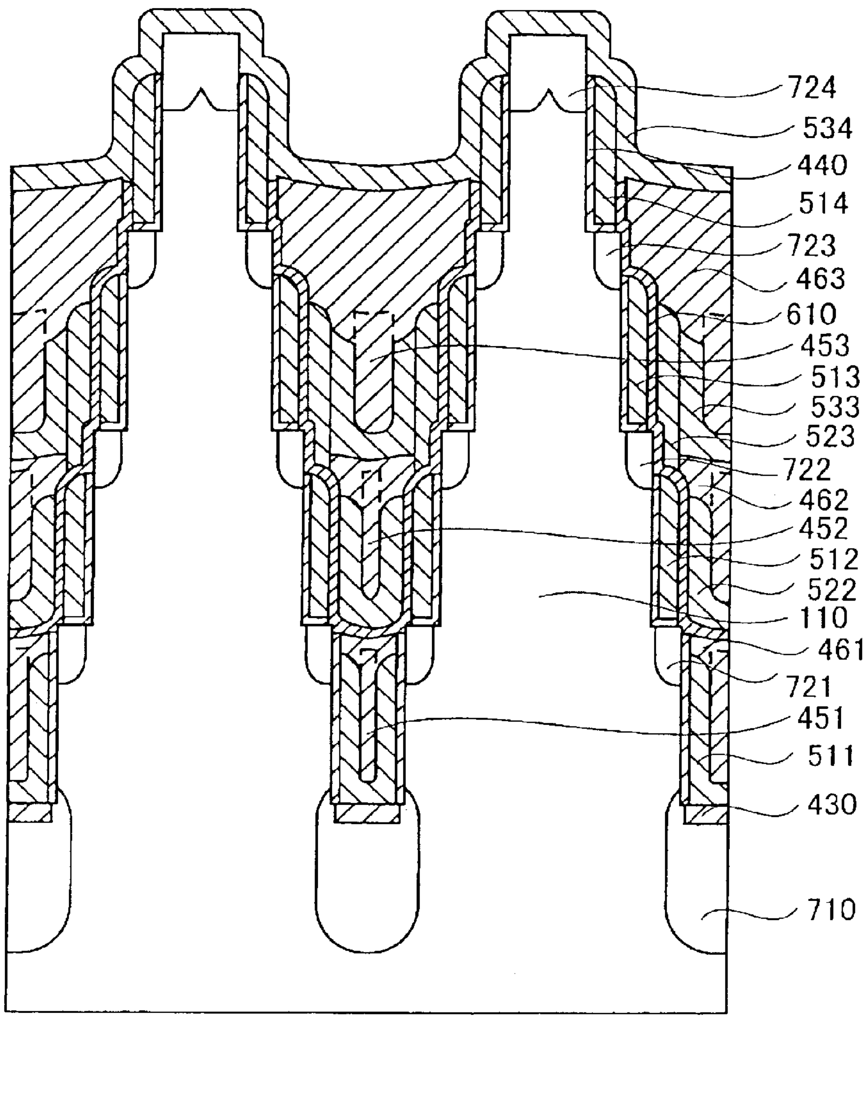
Figure 244:
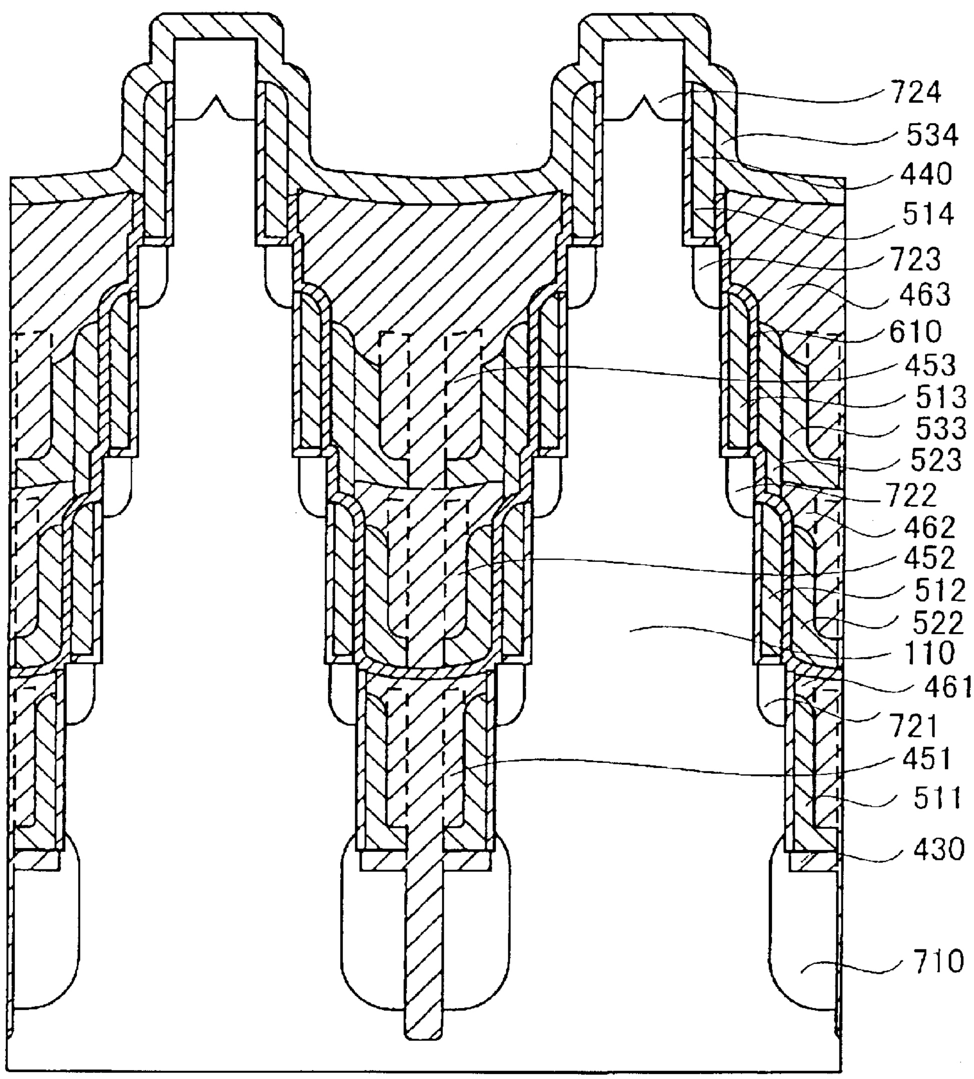

Subsequently, a polysilicon film 534, for example, is deposited to 15 to 150 nm as a third conductive film (FIG. 214 and FIG. 244).

Figure 215:
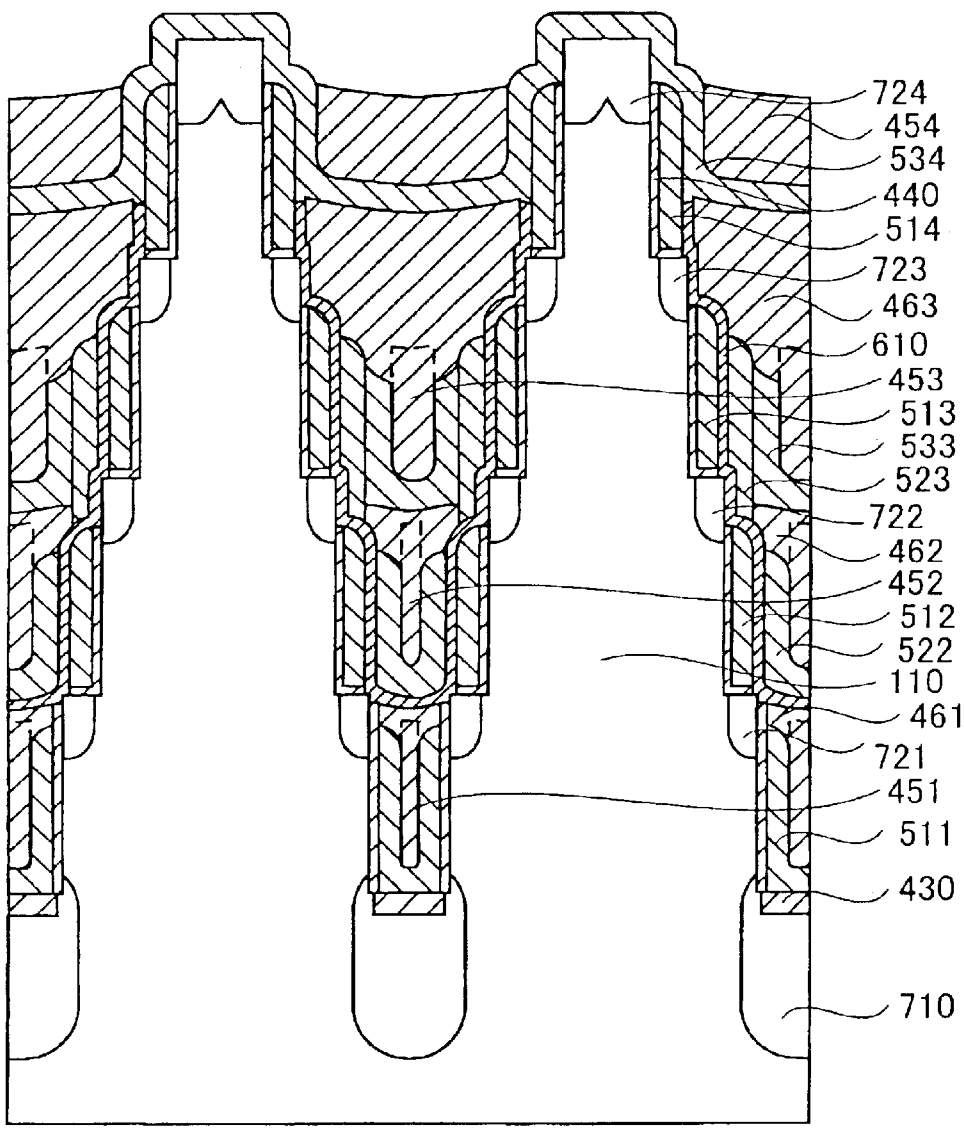
Figure 245:
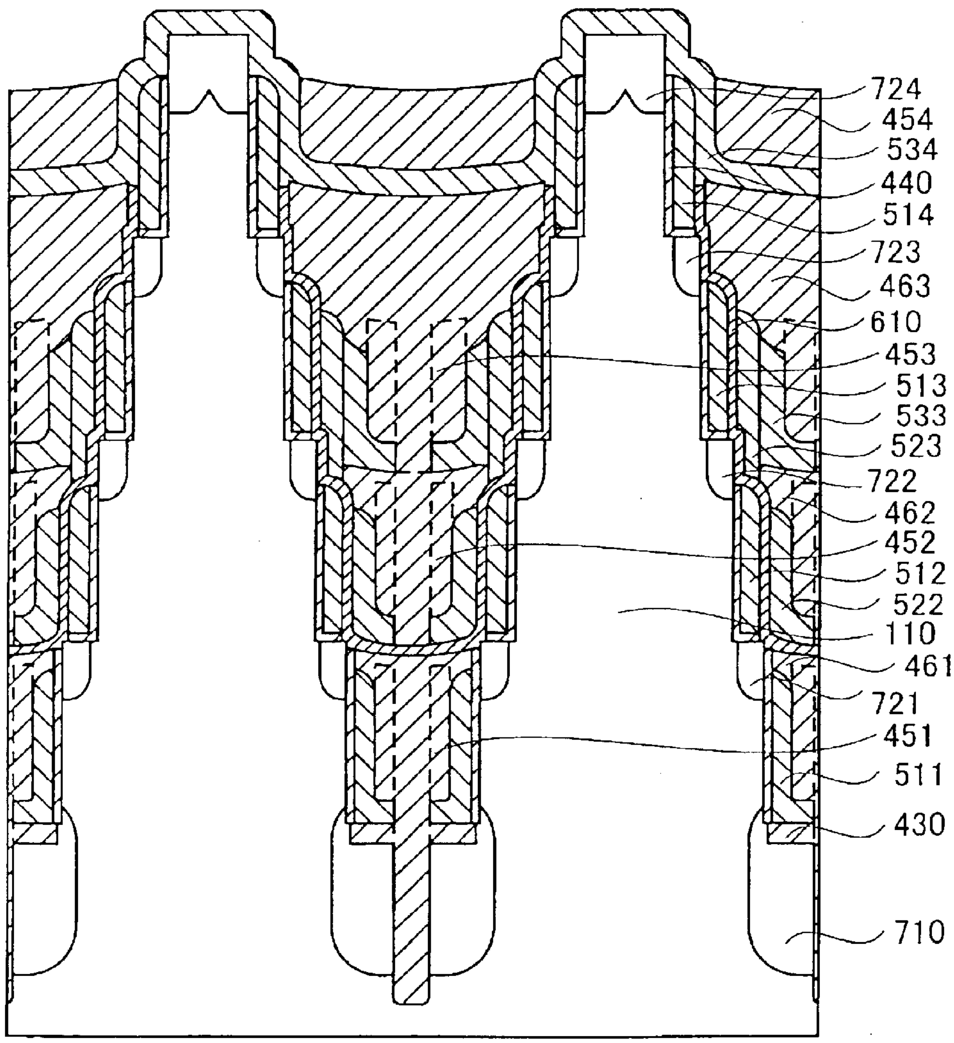

Thereafter, a silicon oxide film 454 is deposited to about 20 to 200 nm as a sixth insulating film and etched back to a desired depth (FIG. 215 and FIG. 245). The selection gates, i.e., the polysilicon film 514, at the uppermost tier are all kept connected by the polysilicon film 534.

Figure 216:
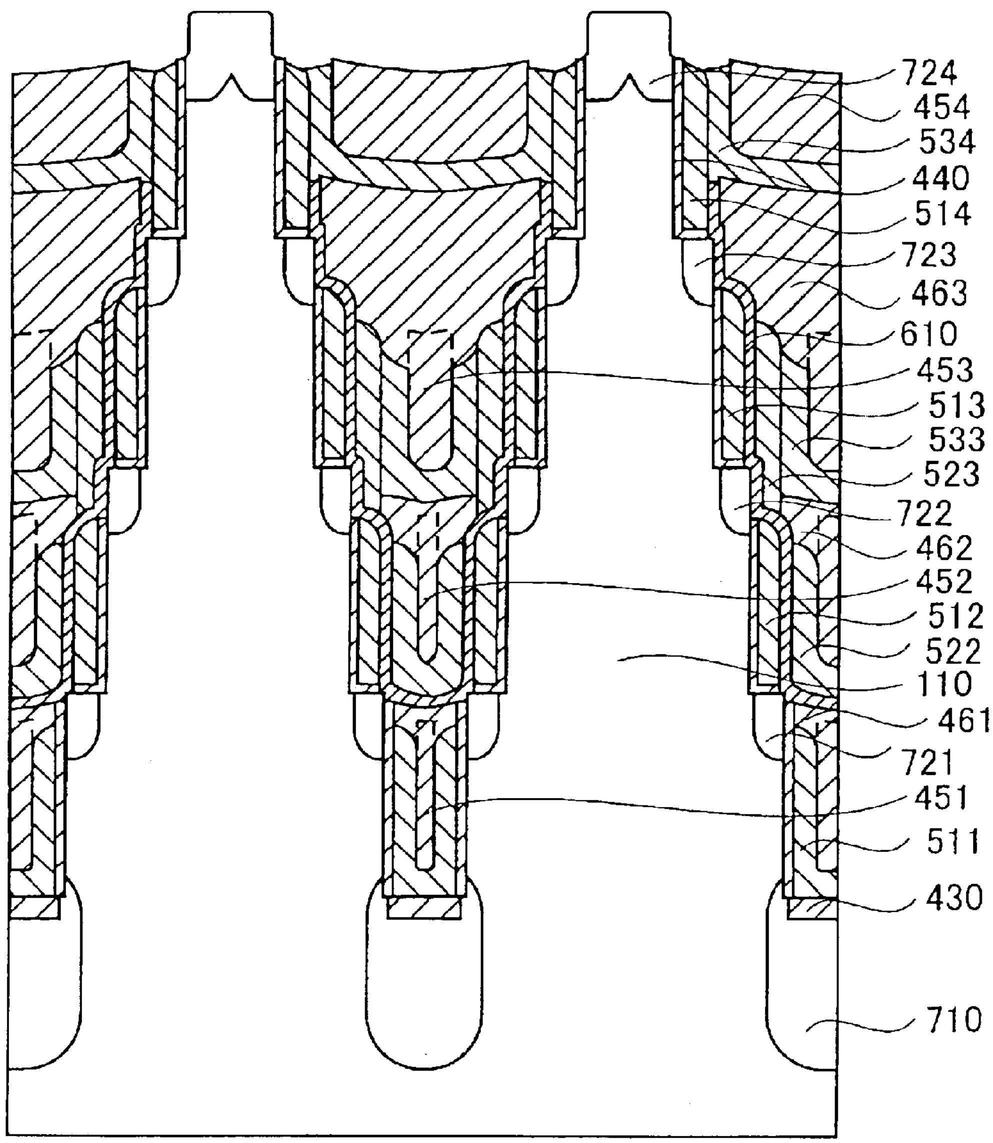
Figure 246:
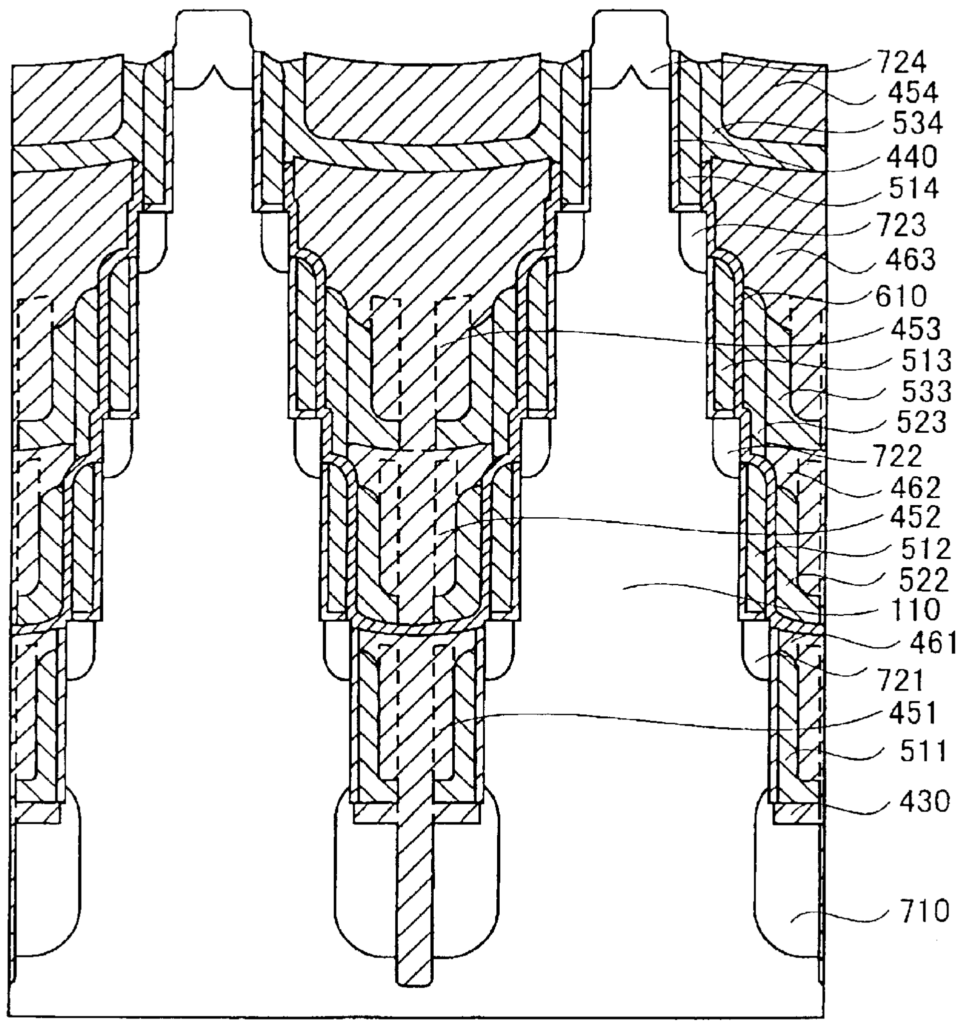

Subsequently, the polysilicon film 534 exposed with respect to the silicon oxide film 454 are selectively removed by isotropic etching (FIG. 216 and FIG. 246). At this time, the selection gate, i.e., the polysilicon film 514, formed on the top of the island-like semiconductor layer 110 and on the uppermost tier of the island-like semiconductor layer 110 are partially etched. However, it is sufficient that the height of the etched top of the island-like semiconductor layer 110 is higher than the top end of the polysilicon film 534 after etching.

Using as a mask a resist R5 patterned by a known photolithography technique, the silicon oxide film 454 is etched by RIE, and then the polysilicon film 534 is etched to form a first trench 214. Thereby a second wiring layer to be a selection gate line continuous in the A–A' direction in FIG. 1 is formed by separation.

Next, a silicon oxide film 464, for example, is deposited to about 20 to 400 nm as a seventh insulating film. The top of the island-like semiconductor layer 110 provided with the impurity diffusion layer 724 is exposed by etch-back or by a known chemical mechanical polishing (CMP) technique. The impurity concentration in the top of the island-like semiconductor layer 110 is adjusted as required, for example, by ion implantation, and a fourth wiring layer 840 is connected to the top of the island-like semiconductor layer 110 in a direction crossing the second or third wiring layer.

Figure 217:
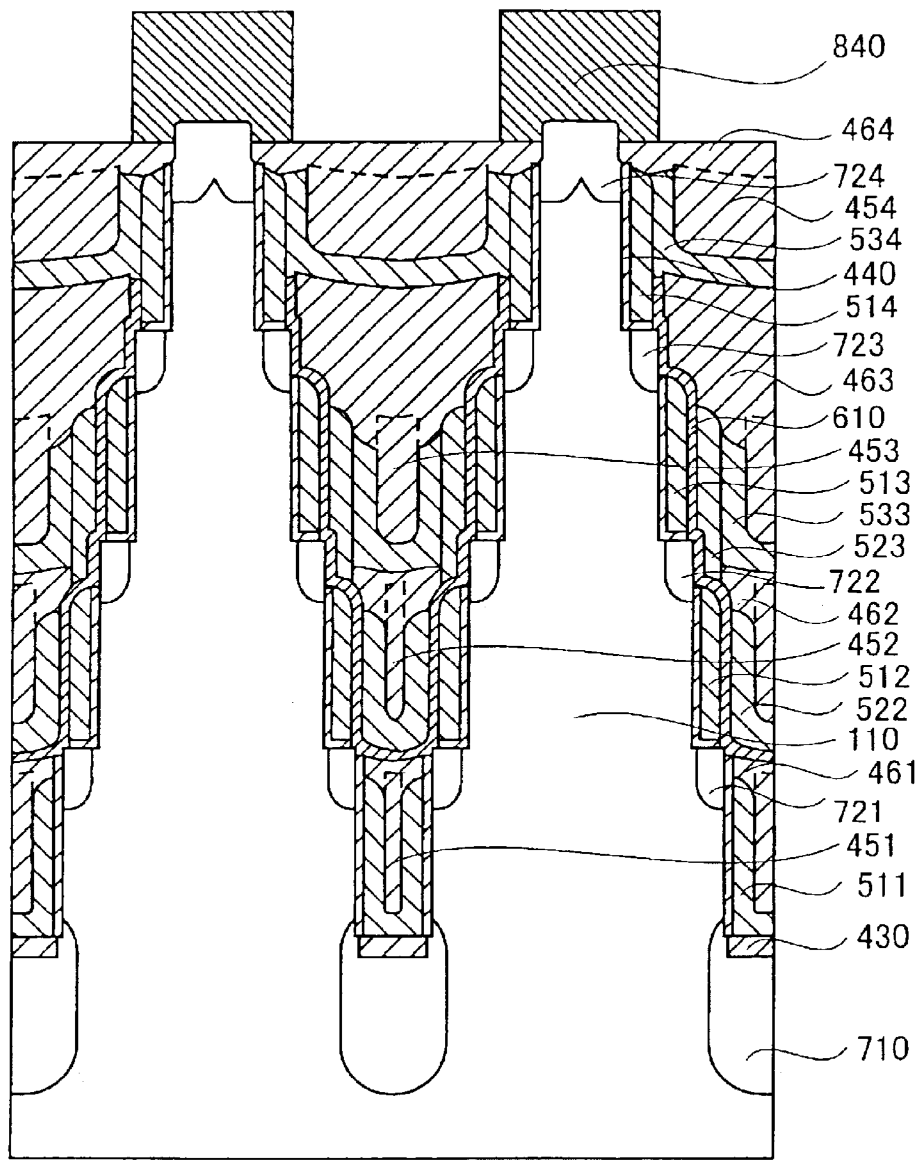
Figure 247:
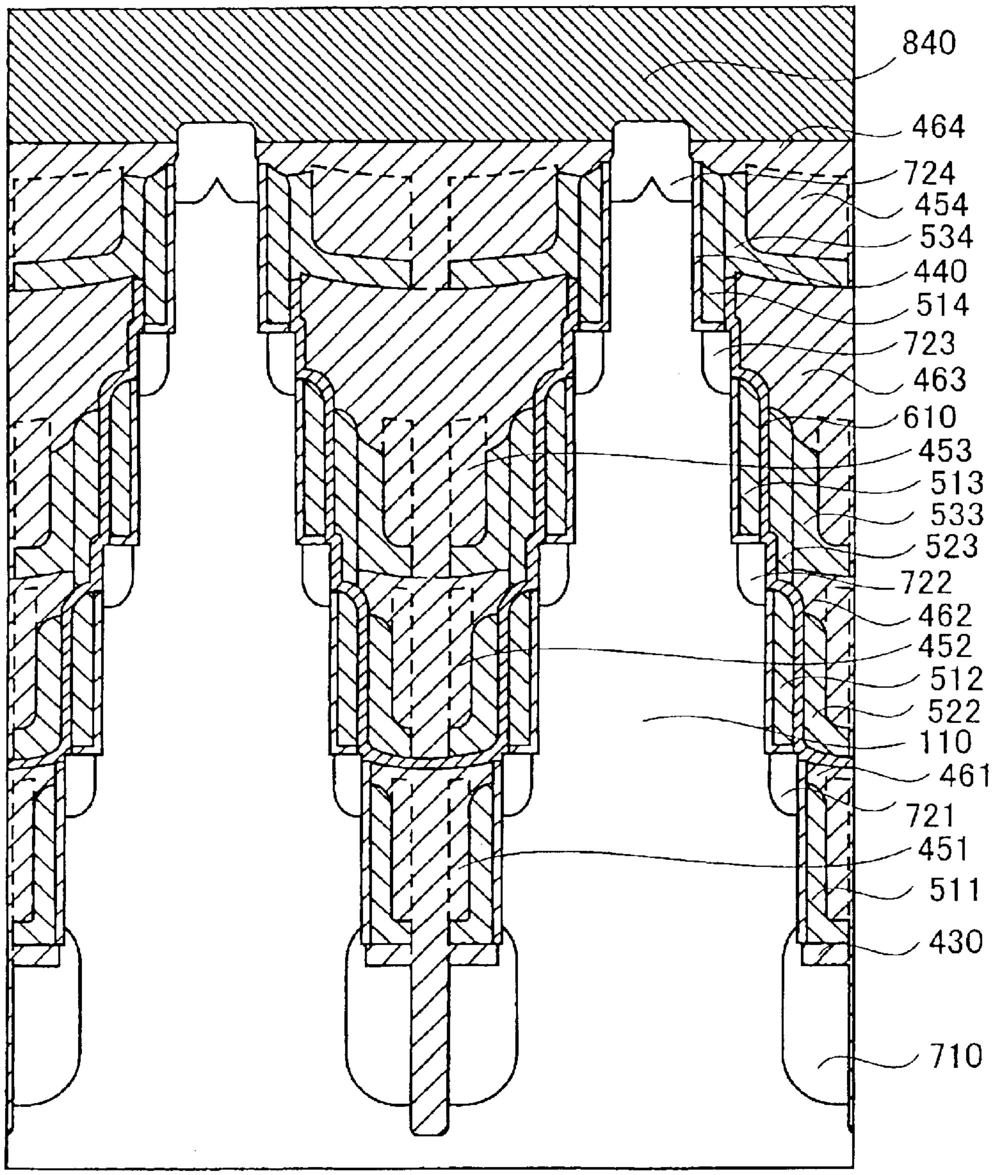

Thereafter, an interlayer insulating film is formed by a known technique, and a contact hole and a metal wiring are formed. Thereby, a semiconductor memory is realized which has a memory function according to the state of a charge in the charge storage layer which is the floating gate made of the polysilicon film (FIG. 217 and FIG. 247).

In this production example, the island-like semiconductor layer 110 is formed on the p-type semiconductor substrate, but the island-like semiconductor layer 110 may be formed in a p-type impurity diffusion layer formed in the n-type semiconductor substrate or in a p-type impurity diffusion layer formed in an n-type impurity diffusion layer formed in the p-type semiconductor substrate. The conductivity type of the impurity diffusion layers may be opposite.

In this production example, for forming the island-like semiconductor layer 110 in a stepwise form, the silicon nitride films 311, 312 and 313 which are the third insulating films are formed in the form of sidewalls, and the sidewalls are used as a mask in RIE of the p-type silicon substrate 100, whereby the steps are formed in the island-like semiconductor layer. However, for example, only the tip of the island-like semiconductor layer 110 may be exposed by burying an insulating film or a conductive film and the exposed part may be thermally oxidized or isotropically etched to render thin the tip of the island-like semiconductor layer 110. This process may be repeated to form the island-like semiconductor layer 110 into a shape having at least one step.

Further, in the process of burying a trench, a silicon oxide film, a polysilicon film or a laminate film of a silicon oxide film and a silicon nitride film may be deposited on the semiconductor substrate including the trench to be buried and then isotropically etched to bury the trench directly. Alternatively the trench may be indirectly buried by a resist etch-back method.

In the resist etch-back method, the height of the buried film may be controlled by adjusting exposure time, exposure amount or both the exposure time and the exposure amount. The height may be controlled by any means that is not particularly limited and may be controlled in a development process after exposure. Instead of exposure, the resist etch-back may be performed by ashing, or without being etched back, the resist may be buried to have a desired height when applied. In the latter technique, the resist preferably has a low viscosity. These techniques may be combined. The surface to which the resist is applied is preferably hydrophilic. For example, the resist is desirably applied to a silicon oxide film.

The silicon oxide film used for burying may be formed not only by CVD but also by rotary application.

By providing the selection gates in the top and the bottom of a set of memory cells, it is possible to prevent the phenomenon that a memory cell transistor is over-erased, i.e., a reading voltage is 0V and a threshold is negative, thereby the cell current flows even through a non-selected cell.

PRODUCTION EXAMPLE 2

The following shows an example for producing a semiconductor memory in which the first, second and third wiring layers are separated at the same time.

Figure 248:
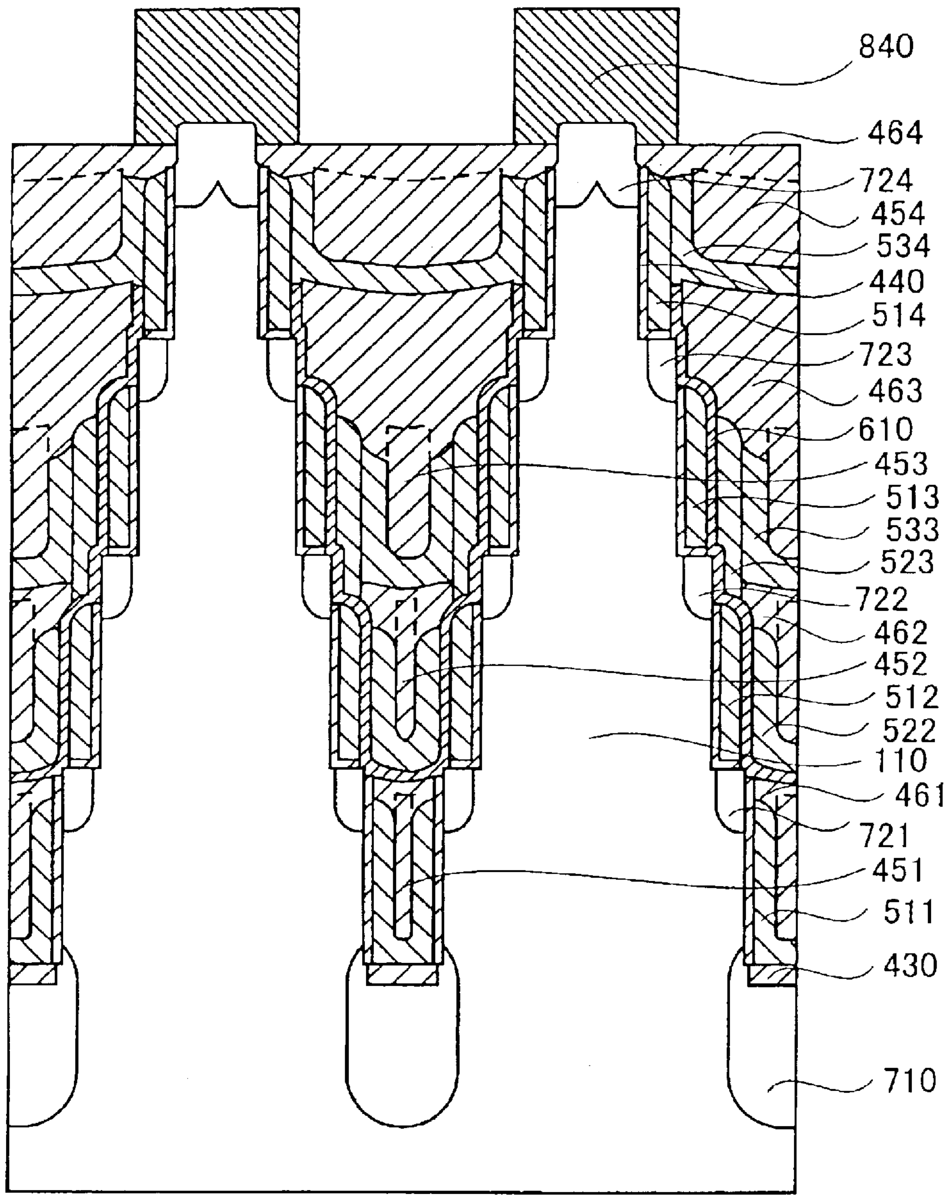
Figure 249:
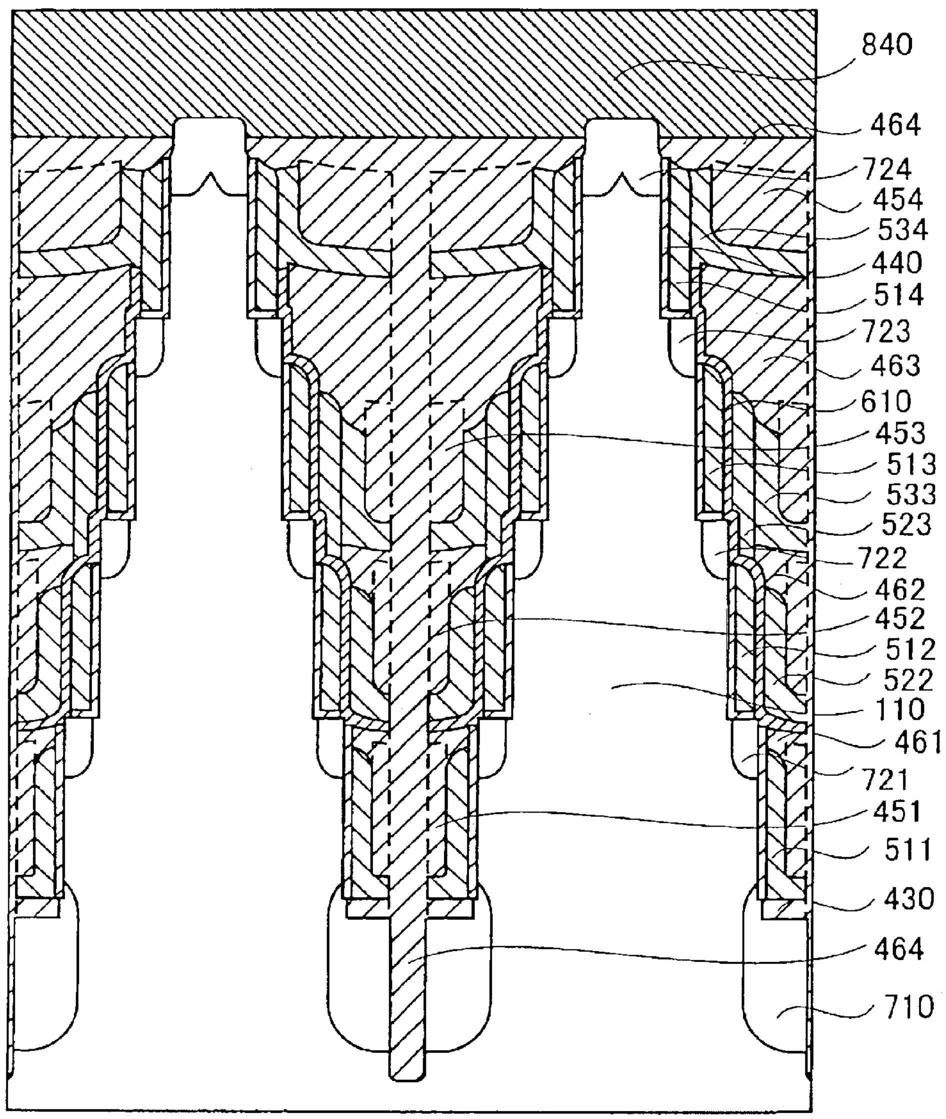

FIG. 248 and FIG. 249 are sectional views taken on line A–A' and line B–B', respectively, of FIG. 1 showing a memory cell array of EEPROM.

This production example omits the process for separating the first, second third wiring layers using as masks the resists R2, R3 and R4 patterned by the known photolithography technique, but separates not only the third wiring layer on the top but also the first and second wiring layers at the same time using as a mask a resist film R5 patterned by a known photolithography technique.

The simultaneous separation of the wiring layers may be performed not only just after the resist film R5 is formed but also after the silicon oxide film 464 as the seventh insulating film is deposited, and is not particularly limited to any time provided that it is after the polysilicon film 534 is deposited as the third conductive film.

Thus a semiconductor memory is realized which has a memory function according to the state of a charge in the charge storage layer which is the floating gate made of the polysilicon film as the first conductive film and in which the first, second and third wiring layers continuous in the A–A' direction are formed by separation at the same time.

PRODUCTION EXAMPLE 3

The following shows an example for producing a semiconductor memory in which, when the third wiring layer is formed to connected to the selection gate on the top, only the third wiring layer is etched, but the top portion of the island-like semiconductor layer is not etched.

FIGS. 250 to 256 and FIGS. 257 to 263 are sectional views taken on line A–A' and line B–B', respectively, of FIG. 1 showing a memory cell array of EEPROM.

In this production example, the interlayer insulating film 610 exposed with respect to the silicon oxide film 463 as the seventh insulating film is removed to expose at least a part of the selection gate formed on the top of the island-like semiconductor layer 110 and on the uppermost tier of the island-like semiconductor layer 110 (FIG. 213 and FIG. 243).

Thereafter, a silicon nitride film 320 is deposited to about 10 to 200 nm as an eighth insulating film, and the silicon oxide film, the resist film or both is/are buried. The exposed part of the silicon nitride film 320 is isotropically etched to expose the top of the island-like semiconductor layer 110 and at least a part of the polysilicon film 514.

Figure 250:
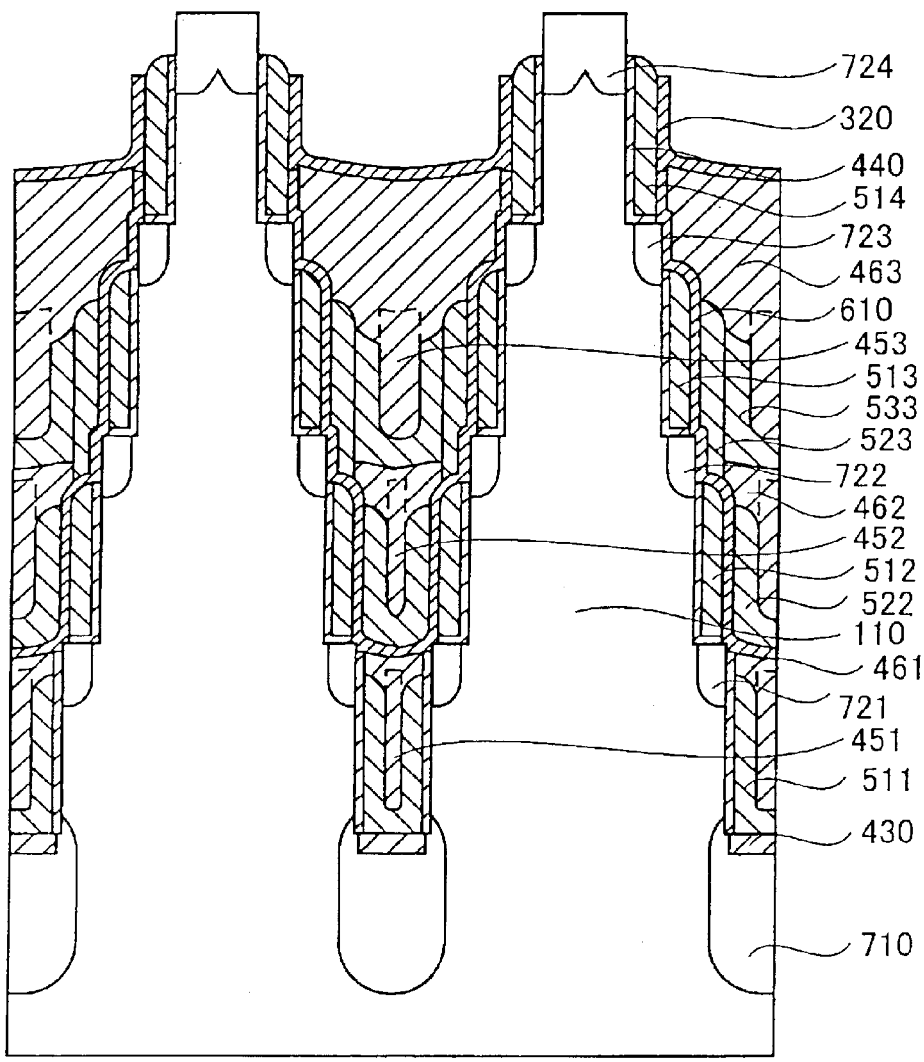
Figure 257:
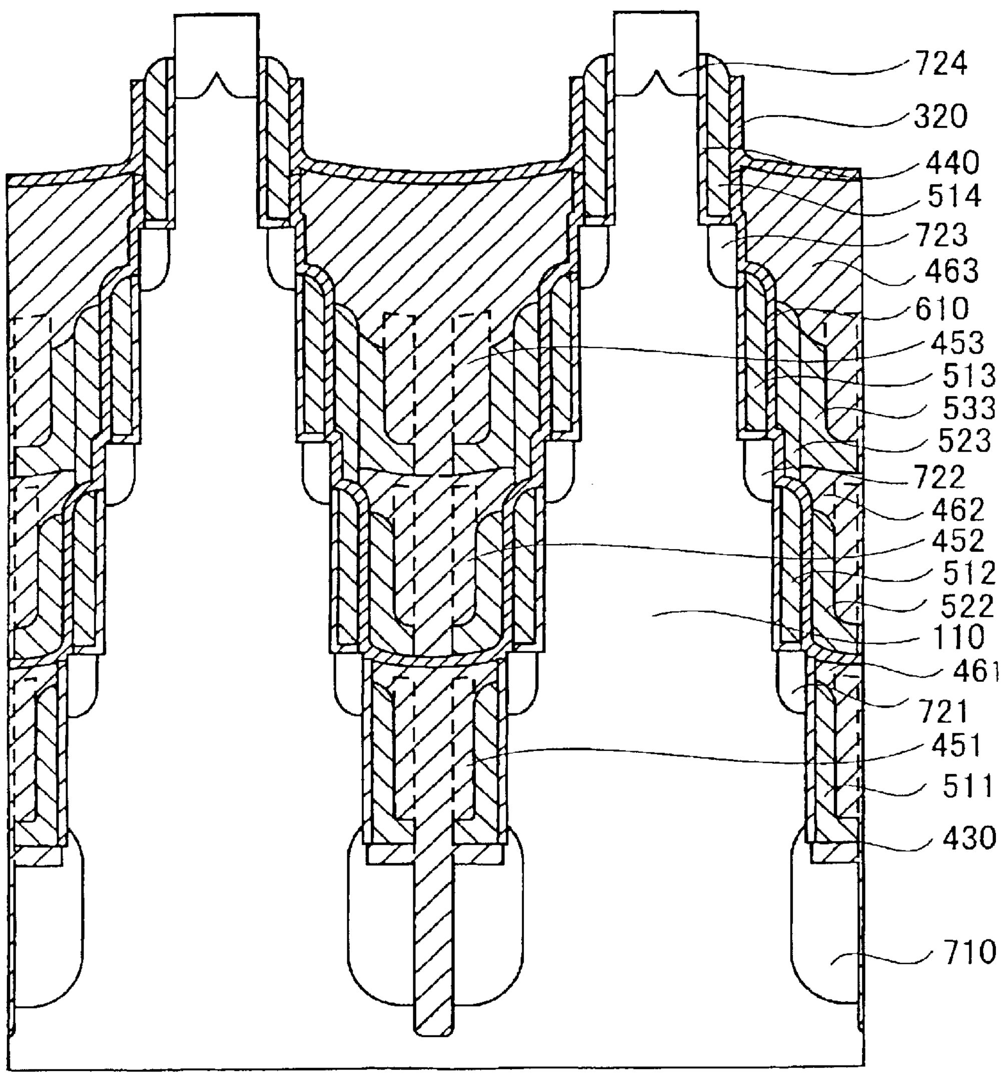

Subsequently the silicon oxide film, the resist film or both used for burying is/are selectively removed (FIG. 250 and FIG. 257).

Figure 251:
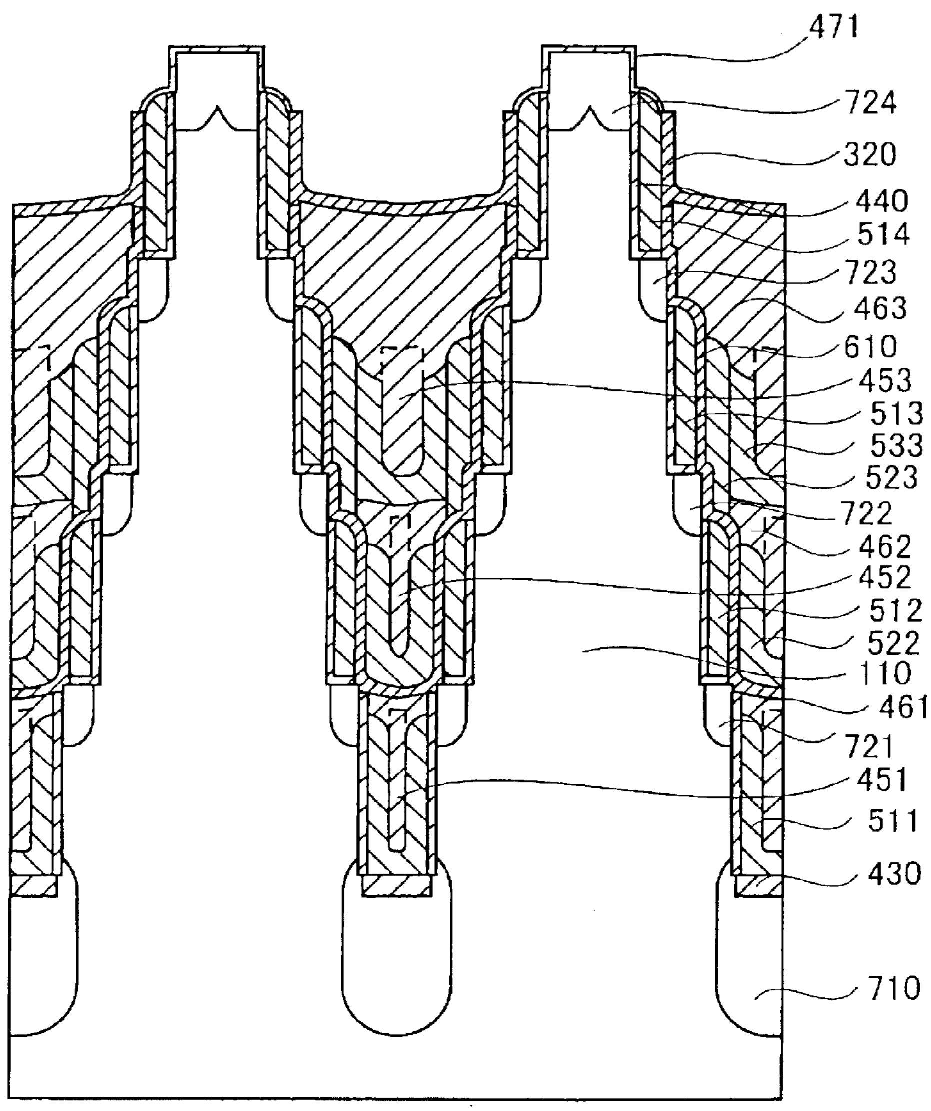
Figure 258:
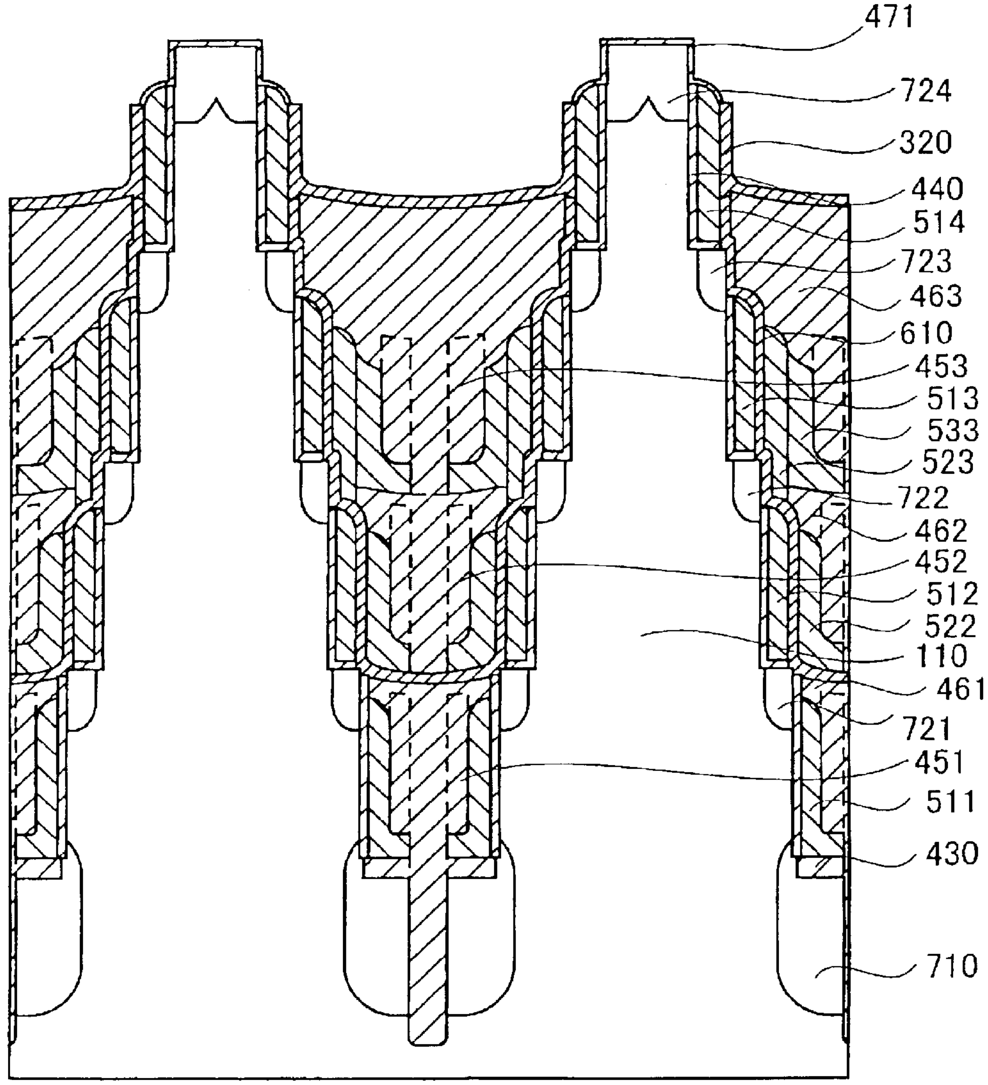

Further the top of the island-like semiconductor layer 110 and the exposed part of the polysilicon film 514 are thermally oxidized to form a silicon oxide film 471 of about 15 to 200 nm thickness as a ninth insulating film (FIG. 251 and FIG. 258).

Figure 252:
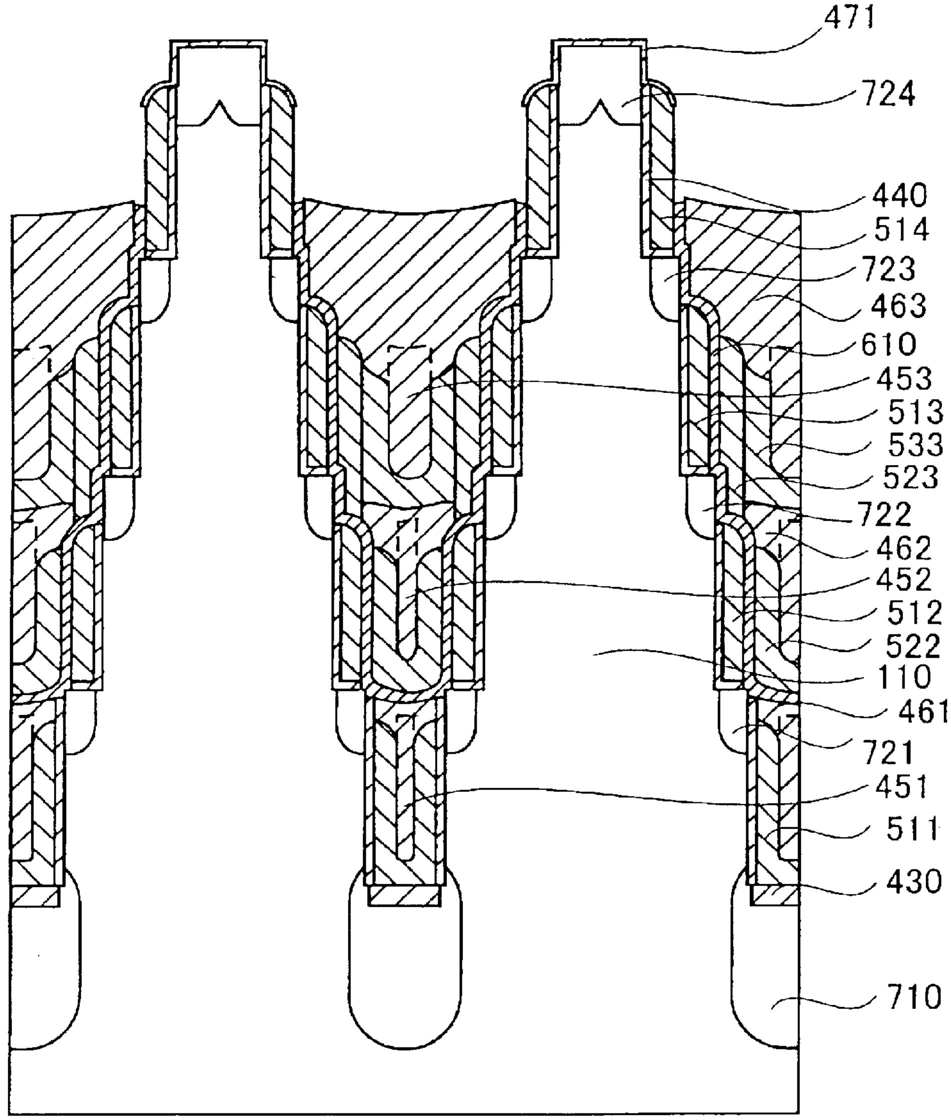
Figure 259:
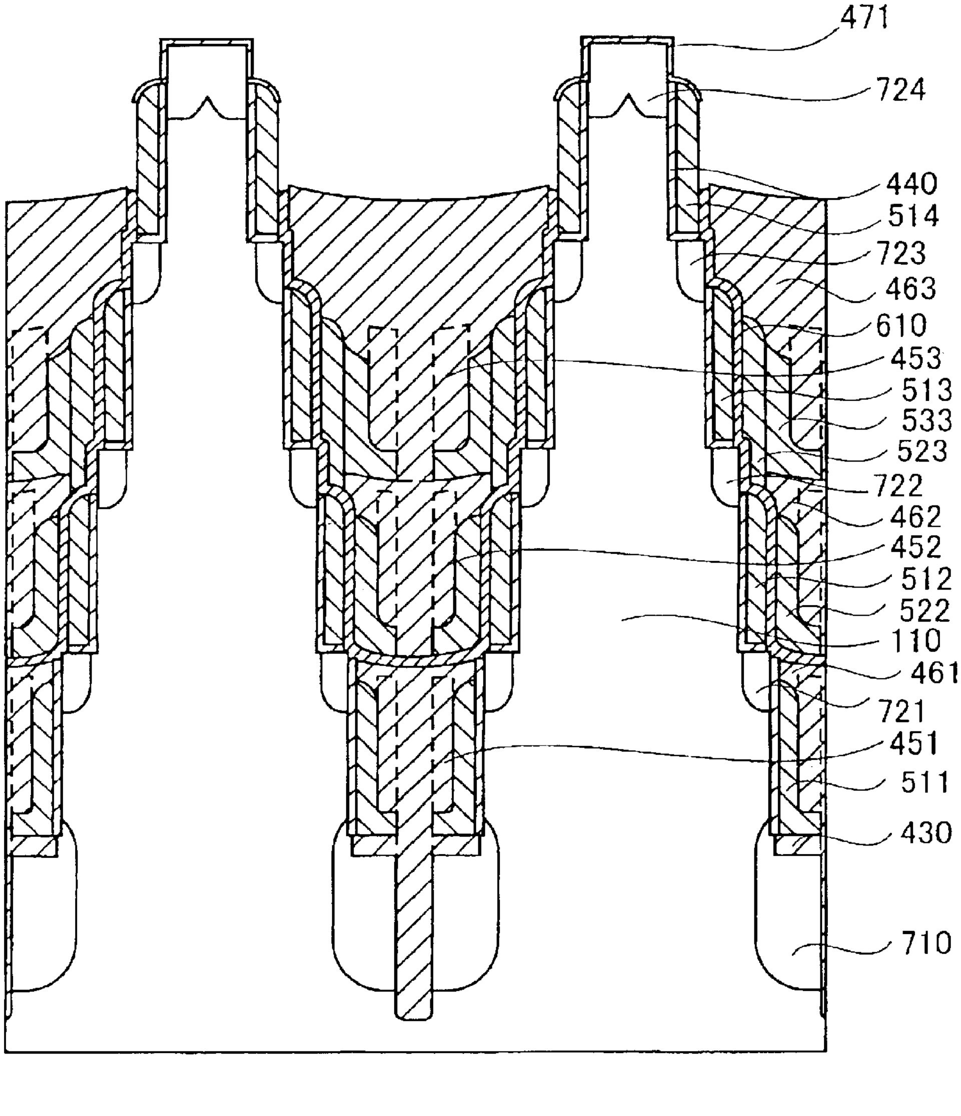

Thereafter the silicon nitride film 320 is selectively removed by isotropic etching to expose a part of the polysilicon film 514 (FIG. 252 and FIG. 259).

Figure 253:
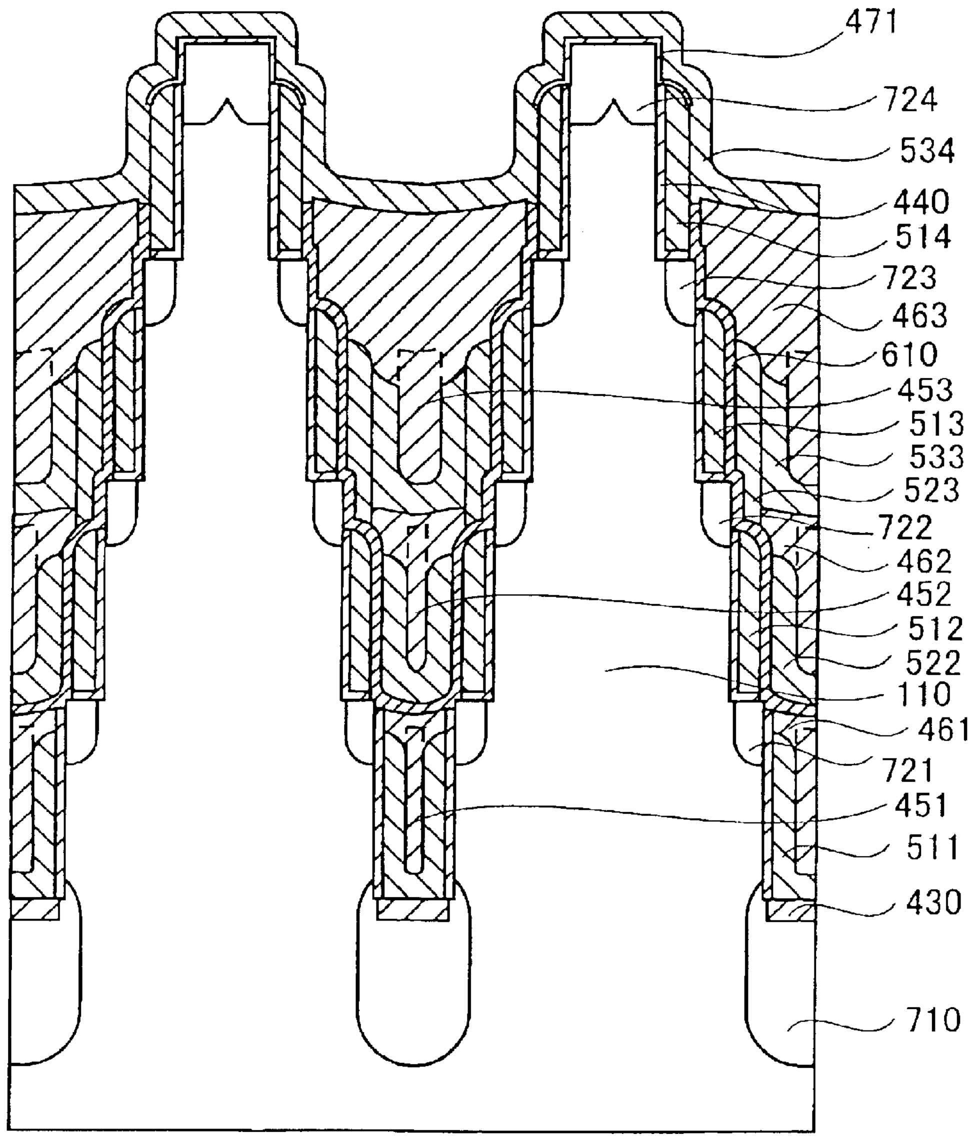
Figure 260:
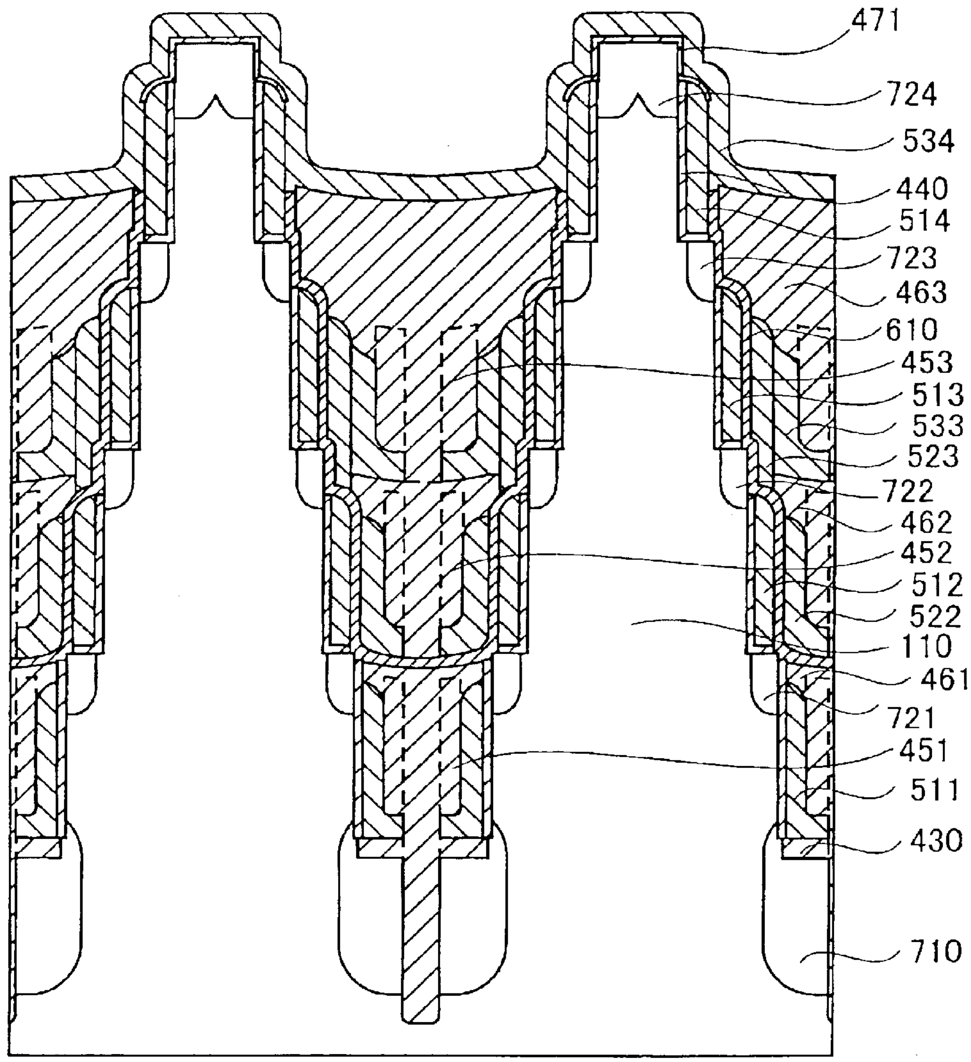

Subsequently, a polysilicon film 534 is deposited to 15 to 150 nm as a third conductive film (FIG. 253 and FIG. 260).

Figure 254:
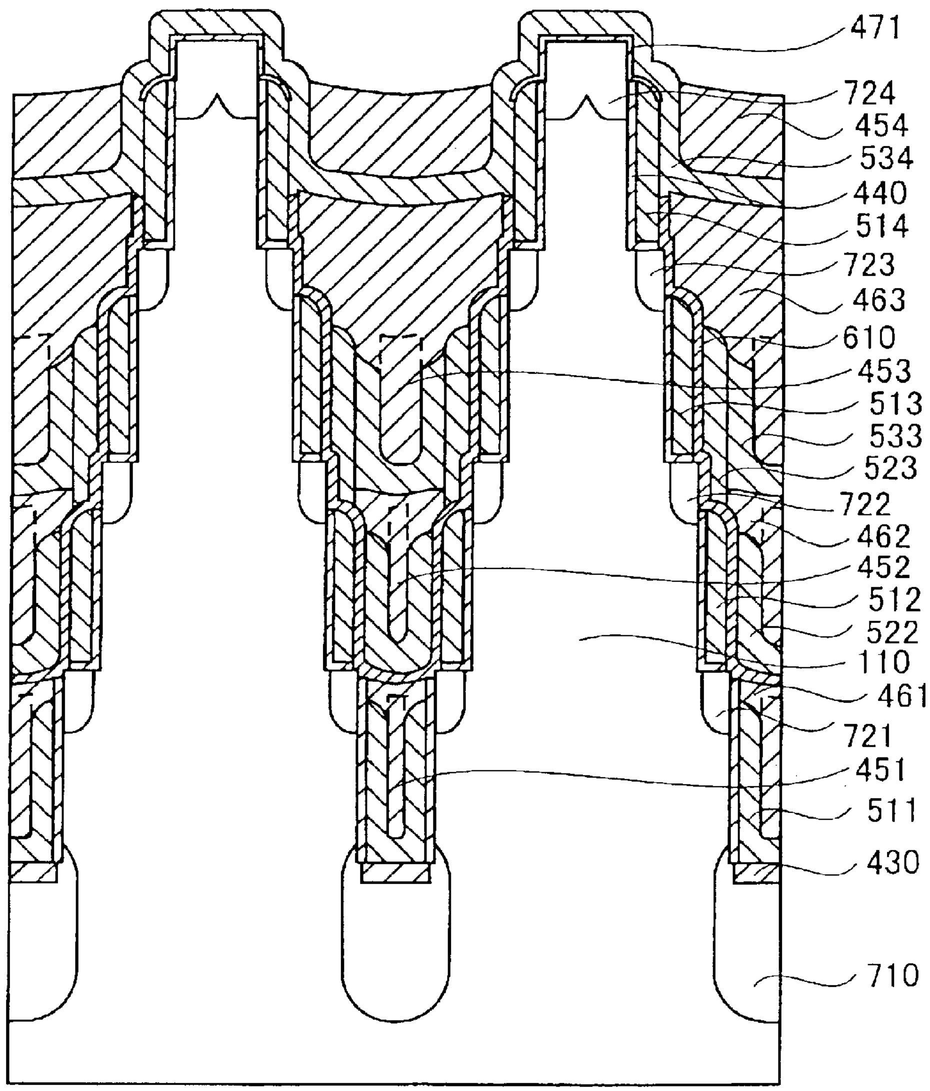
Figure 261:
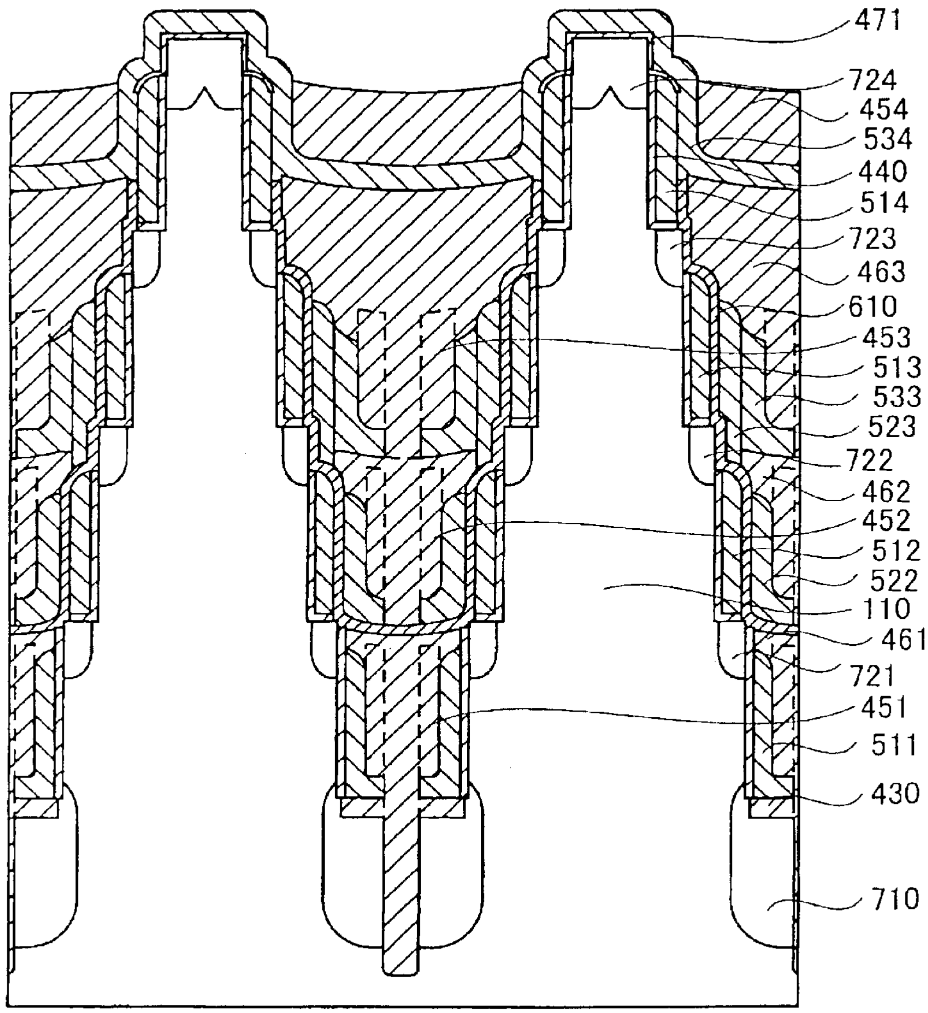

Thereafter, a silicon oxide film 454, for example, is deposited to about 20 to 200 nm as a sixth insulating film and etched back to a desired depth (FIG. 254 and FIG. 261). The selection gates, i.e., the polysilicon film 514, at the uppermost tier are all kept connected by the polysilicon film 534.

Figure 255:
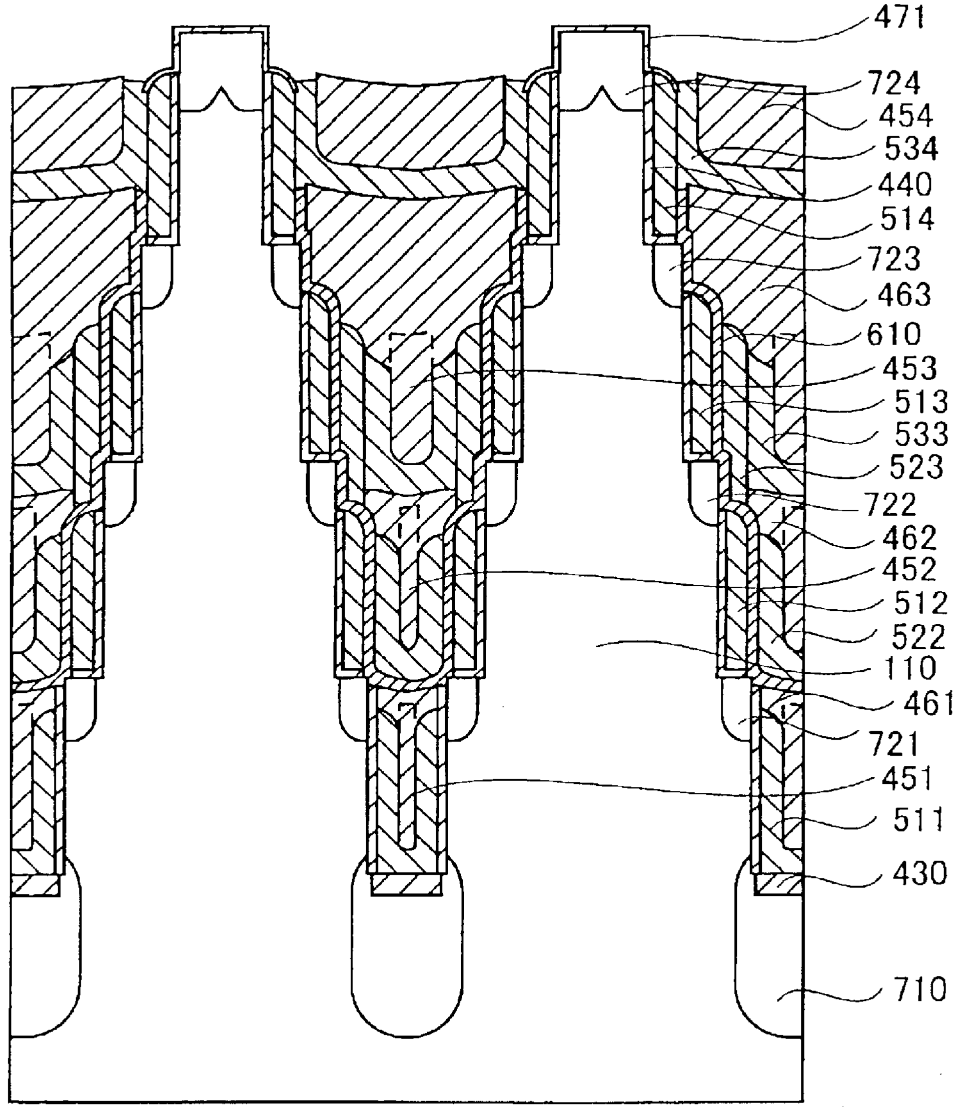
Figure 262:
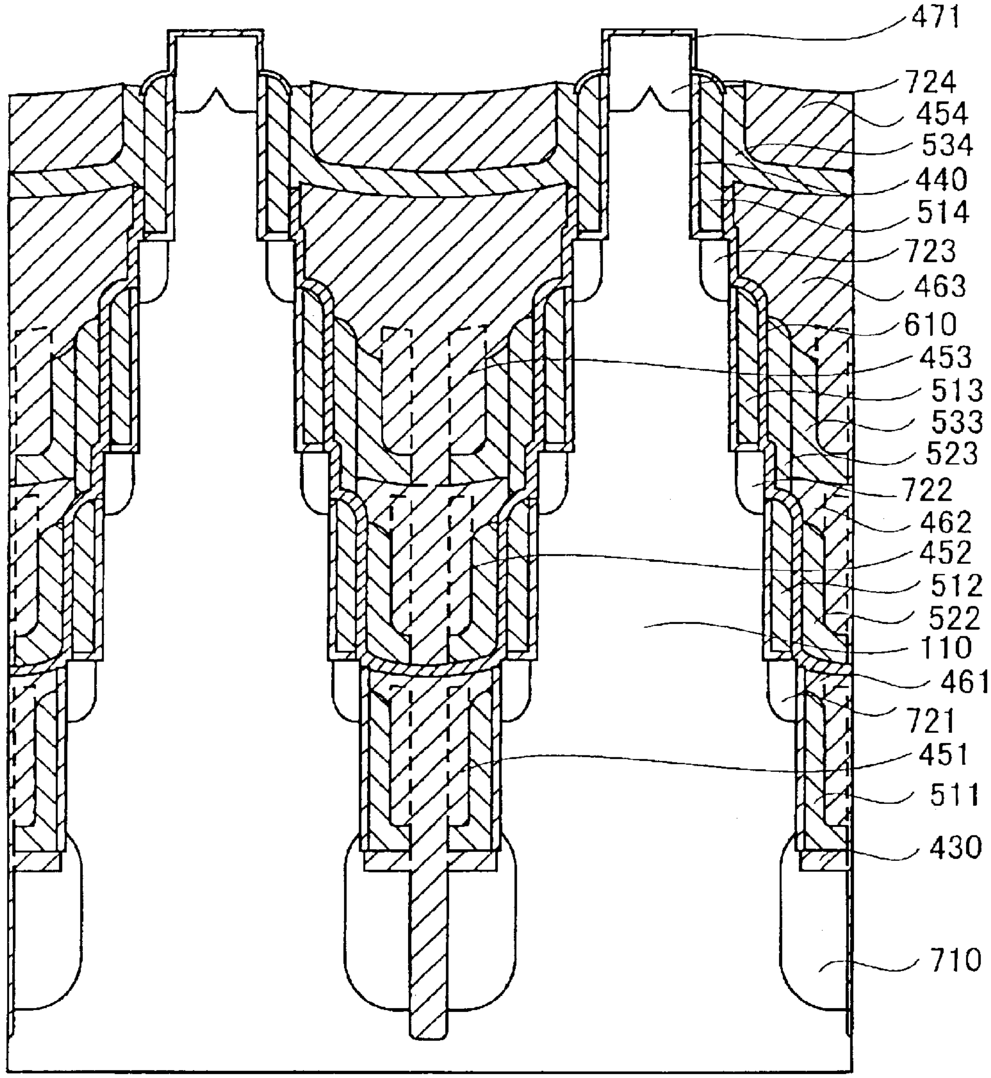

Subsequently, the polysilicon film 534 exposed with respect to the silicon oxide film 464 is selectively removed by isotropic etching (FIG. 255 and FIG. 262).

The selection gate formed on the top of the island-like semiconductor layer 110 and on the uppermost tier of the island-like semiconductor layer 110, i.e., polysilicon film 514, is not etched by protection of the silicon oxide film 471.

Thereafter, using as a mask the resist film R5 patterned by a known photolithography technique, the silicon oxide film 454 and the polysilicon film 534 are etched by RIE.

Figure 256:
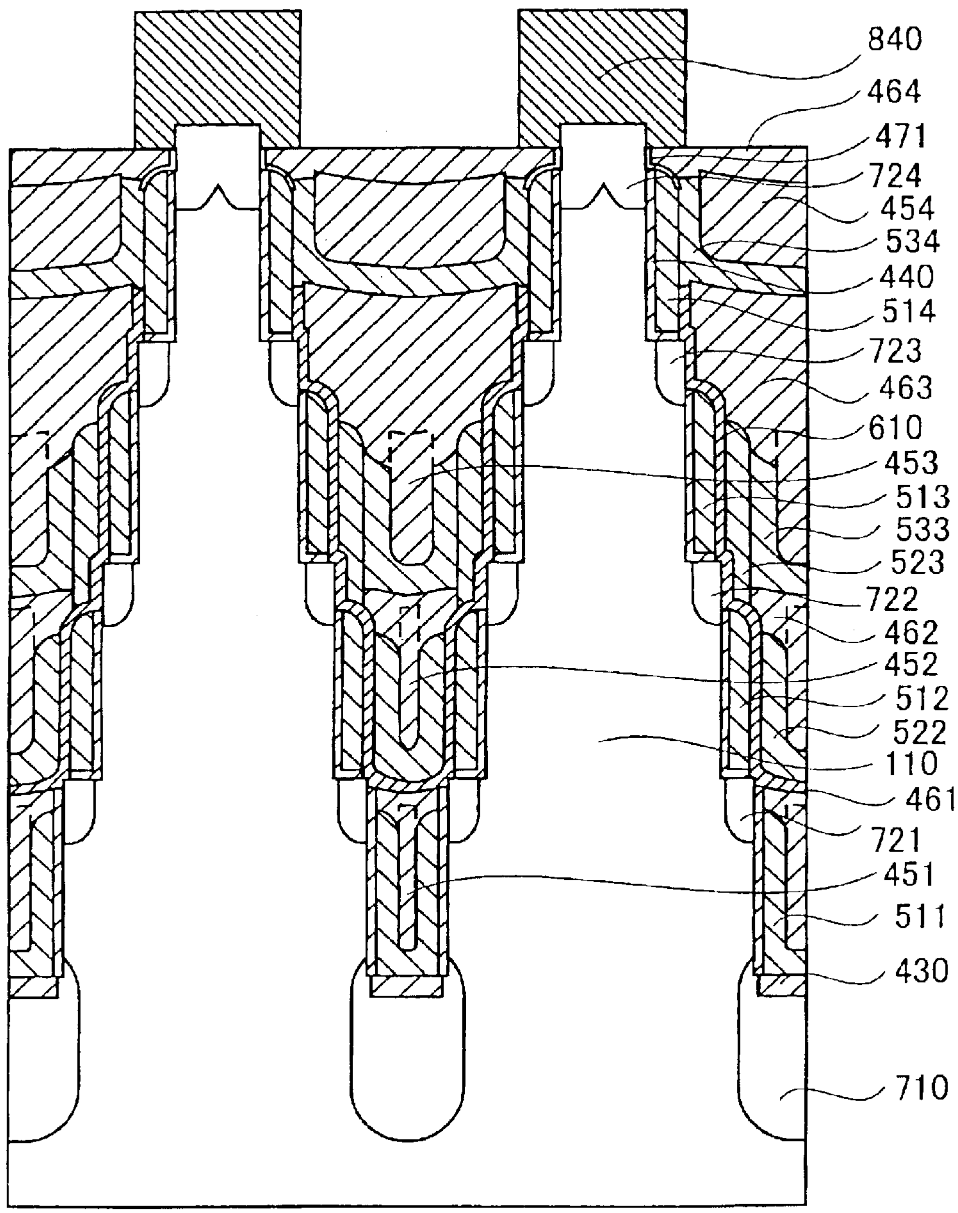
Figure 263:
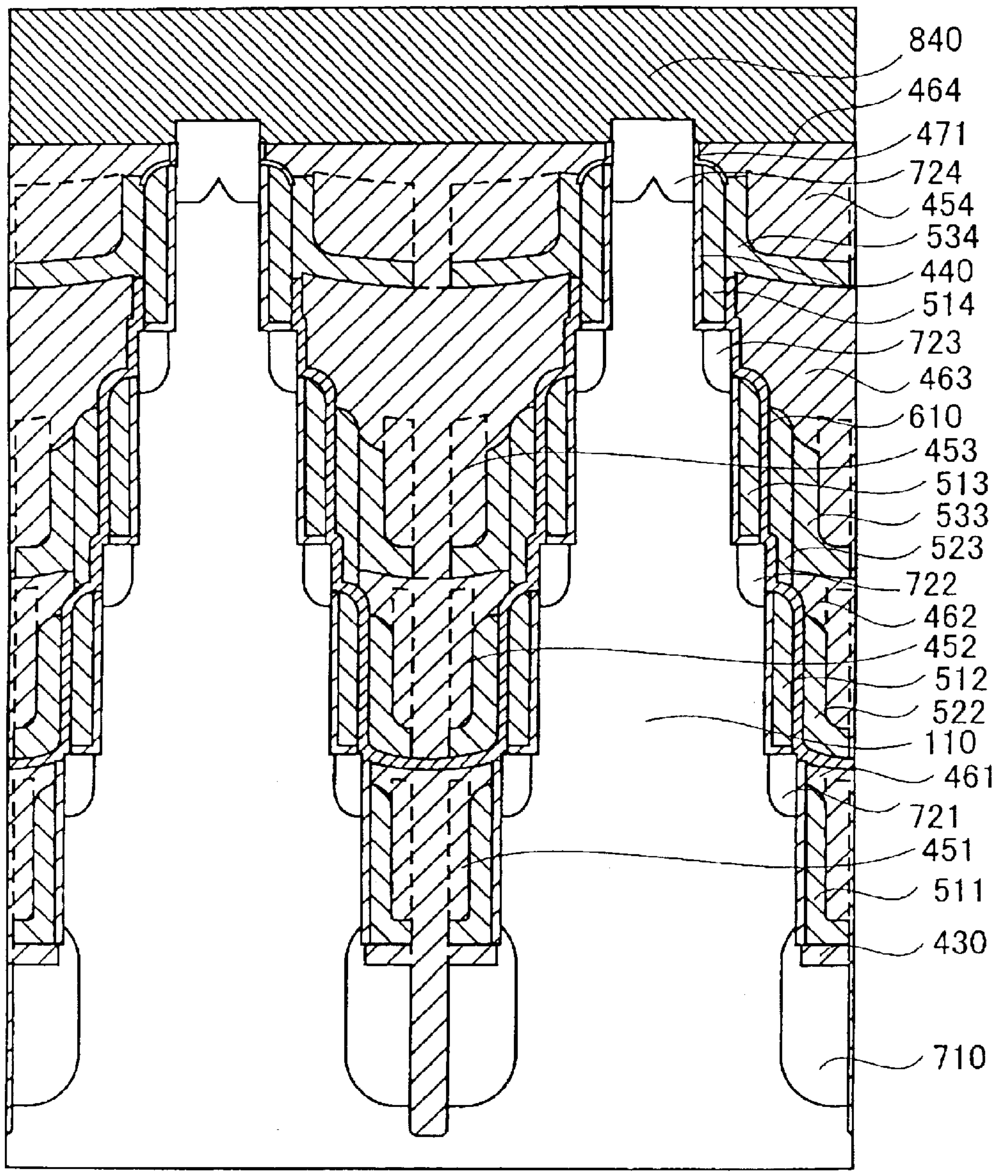

The production steps thereafter are in conformance with Production Example 1. Thereby, a semiconductor memory is realized which has a memory function according to the state of a charge in the charge storage layer which is the floating gate made of the polysilicon film (FIG. 256 and FIG. 263).

Thus, the same effect as realized in Production Example 1 can be obtained. Furthermore, this production example has another advantage of reducing difficultly in etch control because the top of the island-like semiconductor layer 110 and the polysilicon film 514 are not etched at the isotropic etching of the polysilicon film 534.

PRODUCTION EXAMPLE 4

The following shows an example for producing a semiconductor memory in which the first, second and third wiring layers are separated without using a mask.

FIGS. 264 to 291 and FIGS. 292 to 319 are sectional views taken on line A–A' and line B–B', respectively, of FIG. 1 showing a memory cell array of EEPROM.

Figure 264:
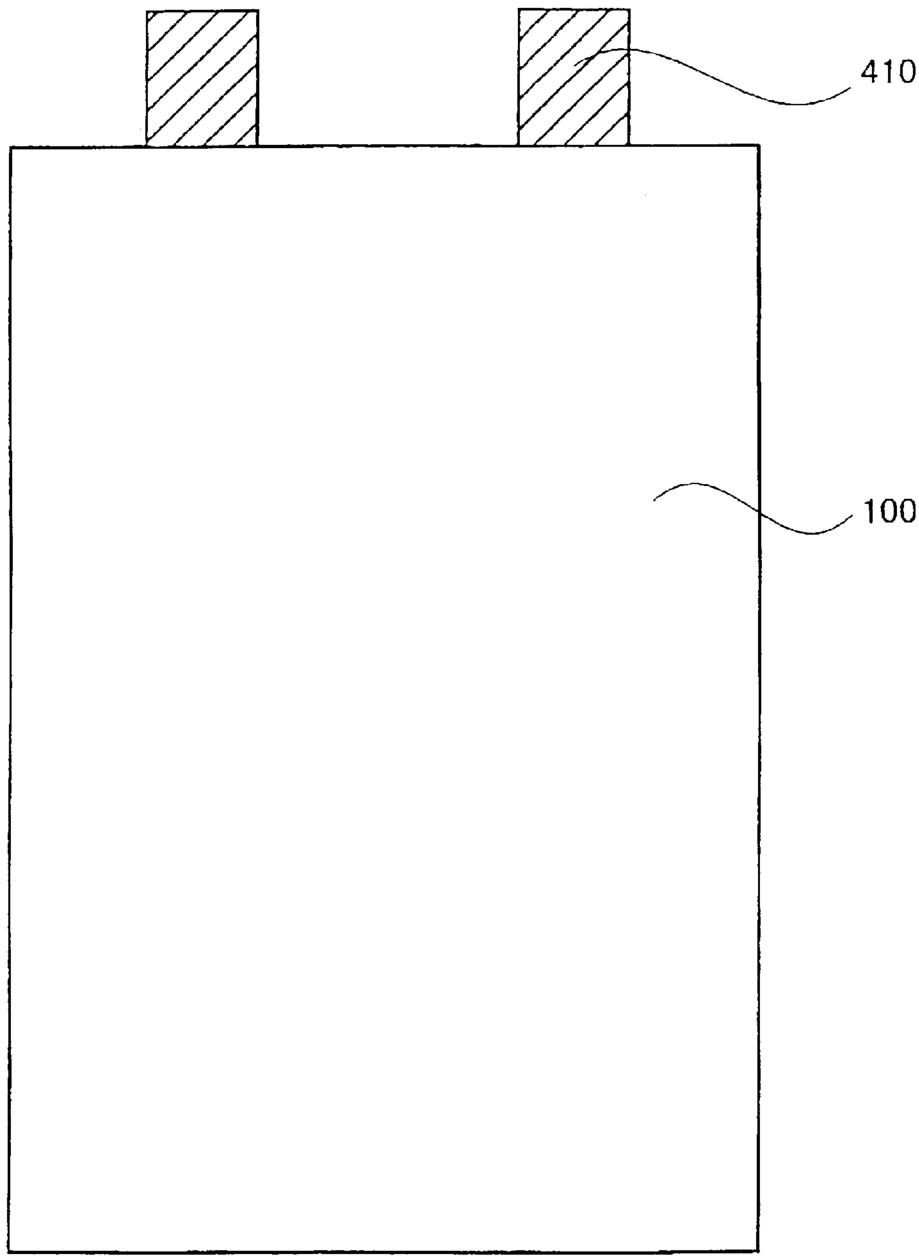
Figure 292:
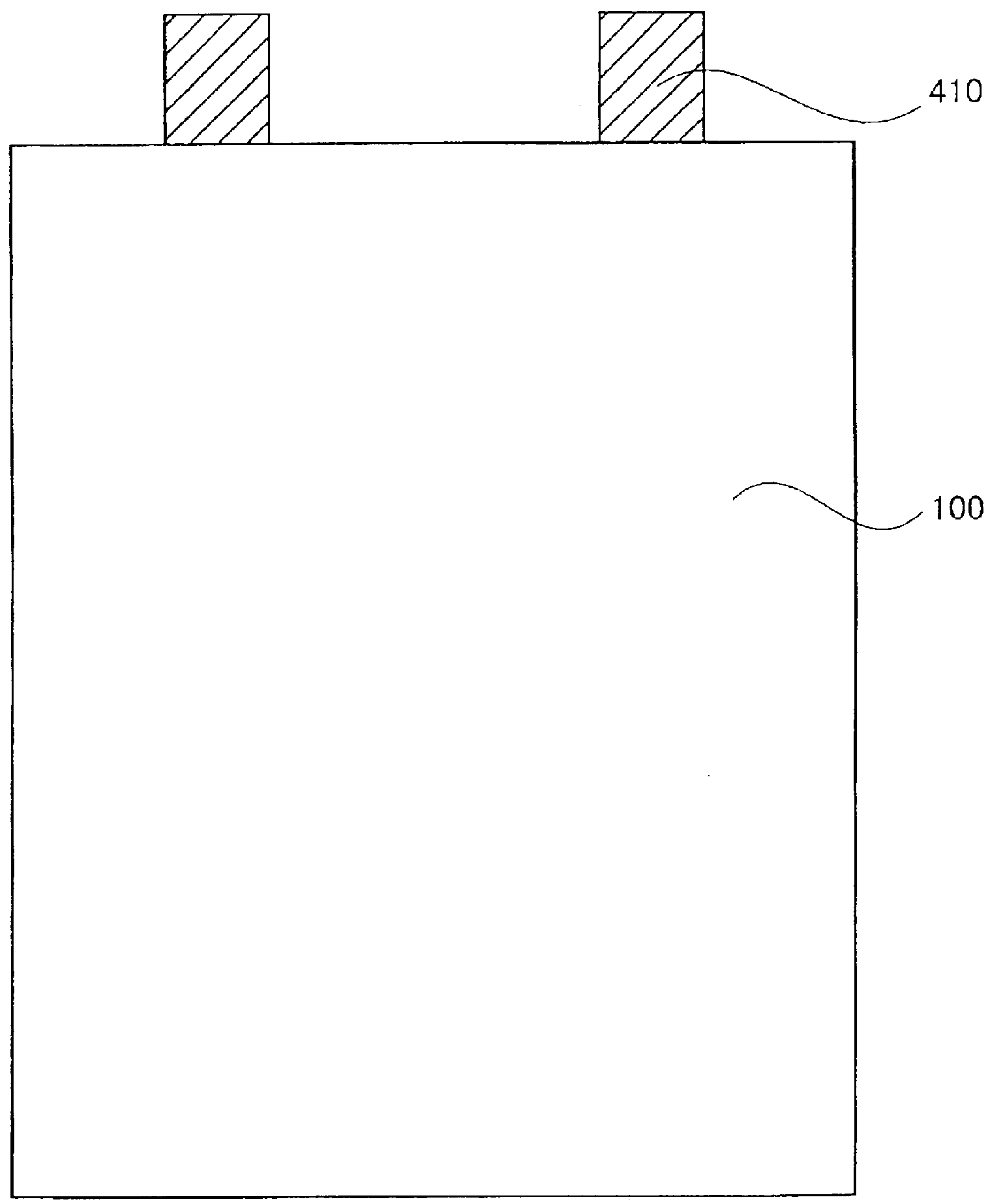

First, a silicon oxide film 410 is deposited to 200 to 2000 nm as a first insulating film to be a mask layer on the surface of a p-type silicon substrate 100 as a semiconductor substrate. Using as a mask a resist film R1 patterned by a known photolithography technique, the silicon oxide film 410 is etched by reactive ion etching (FIG. 264 and FIG. 292).

The silicon oxide film 410 may be, for example, a silicon nitride film, a conductive film, a laminate film of two or more kinds of materials, or any material that cannot be etched or exhibits a lower etch rate when the p-type silicon substrate 100 is etched by RIE.

Figure 265:
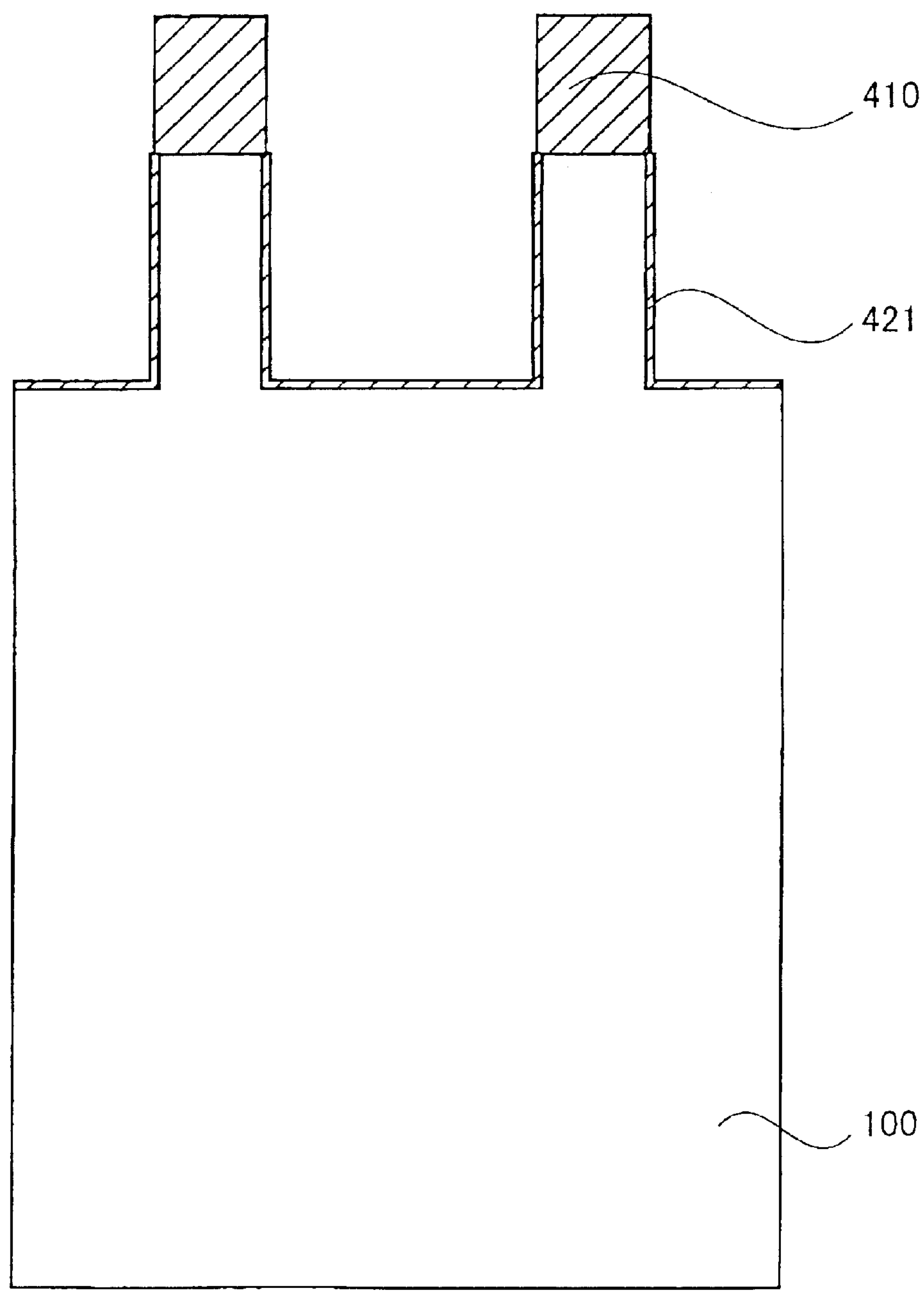
Figure 293:
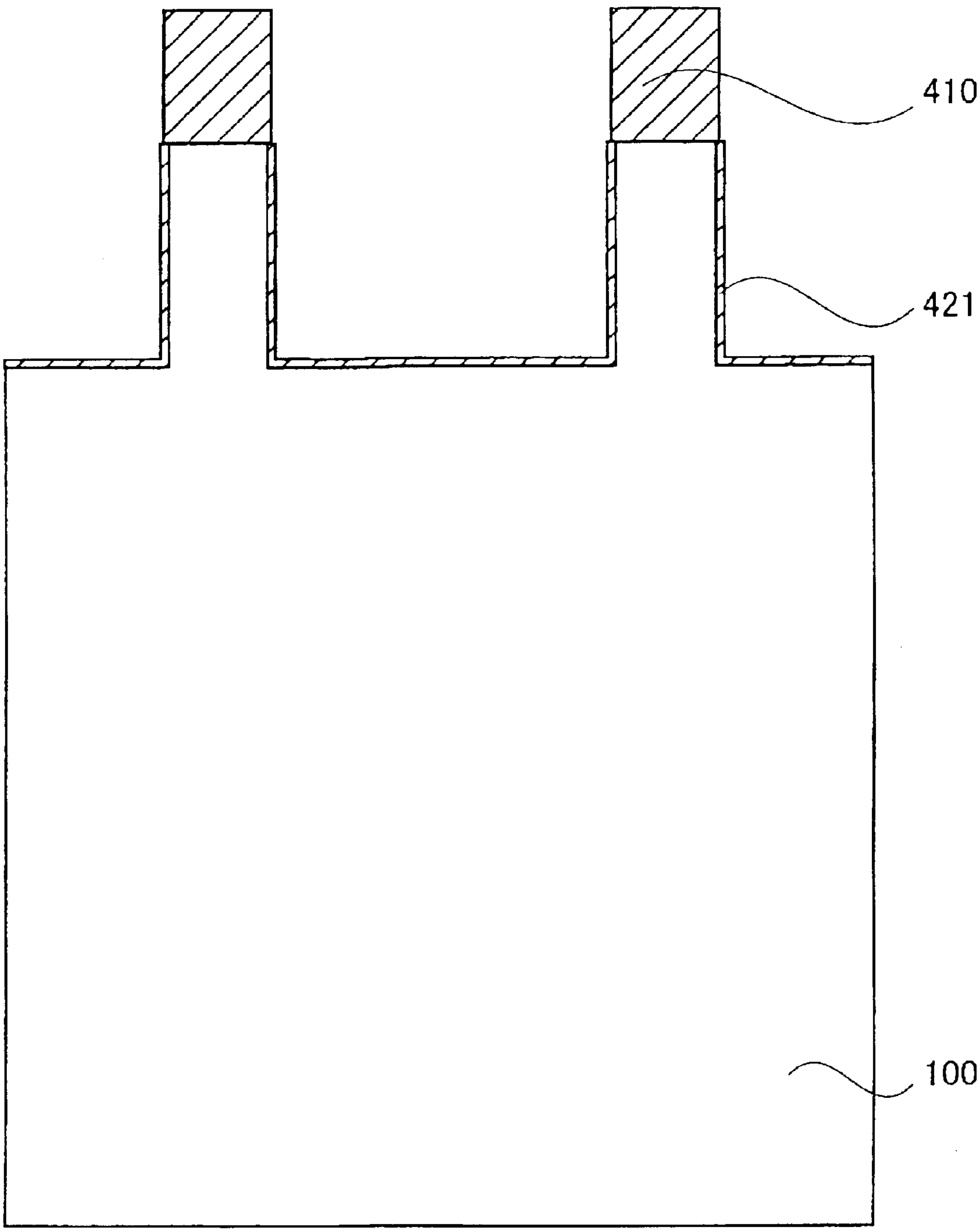

Using the silicon oxide film 410 as a mask, the p-type silicon substrate 100 is etched 50 to 5000 nm by RIE. Thereafter an exposed part of the p-type silicon substrate 100 is thermally oxidized to form a second insulating film, for example, a silicon oxide film 421 of 5 to 100 nm thickness (FIG. 265 and FIG. 293).

Figure 266:
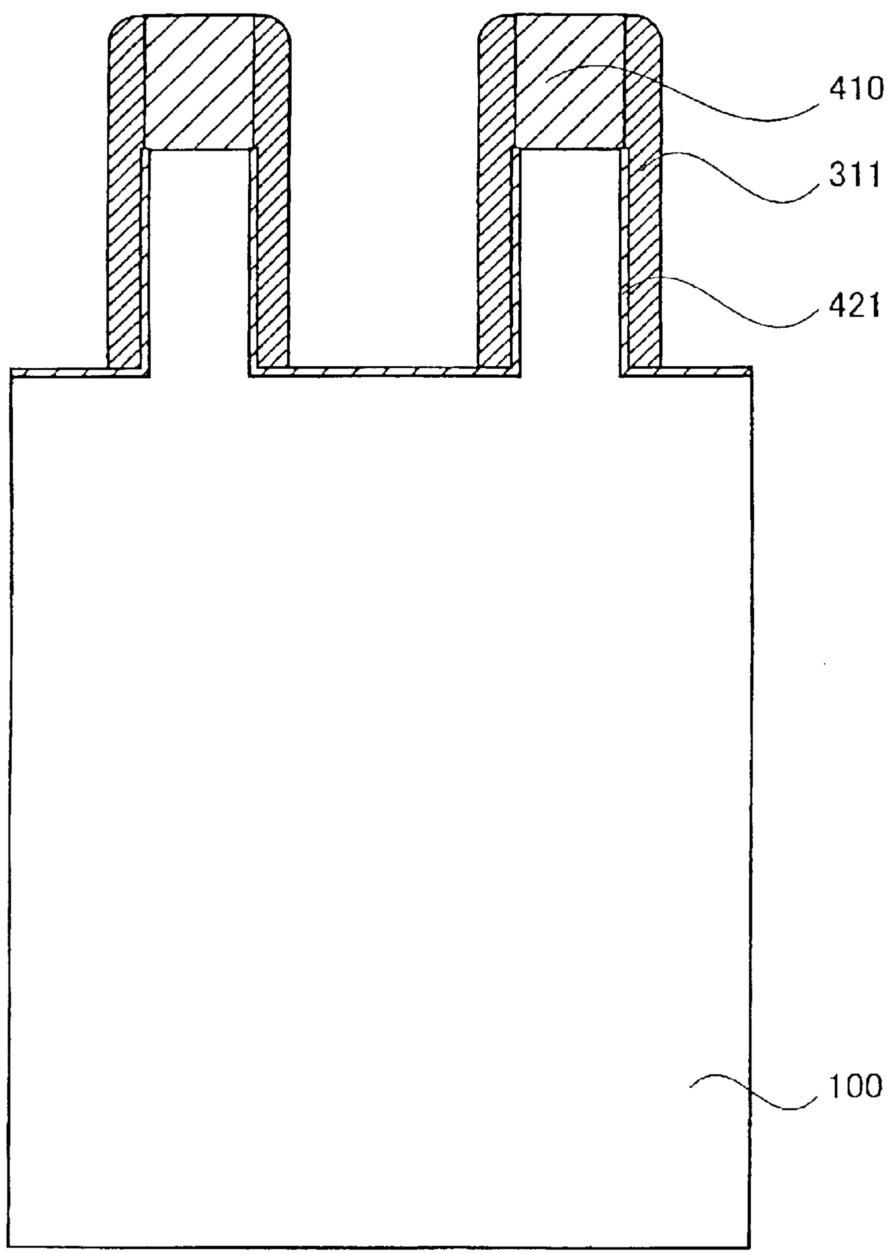
Figure 294:
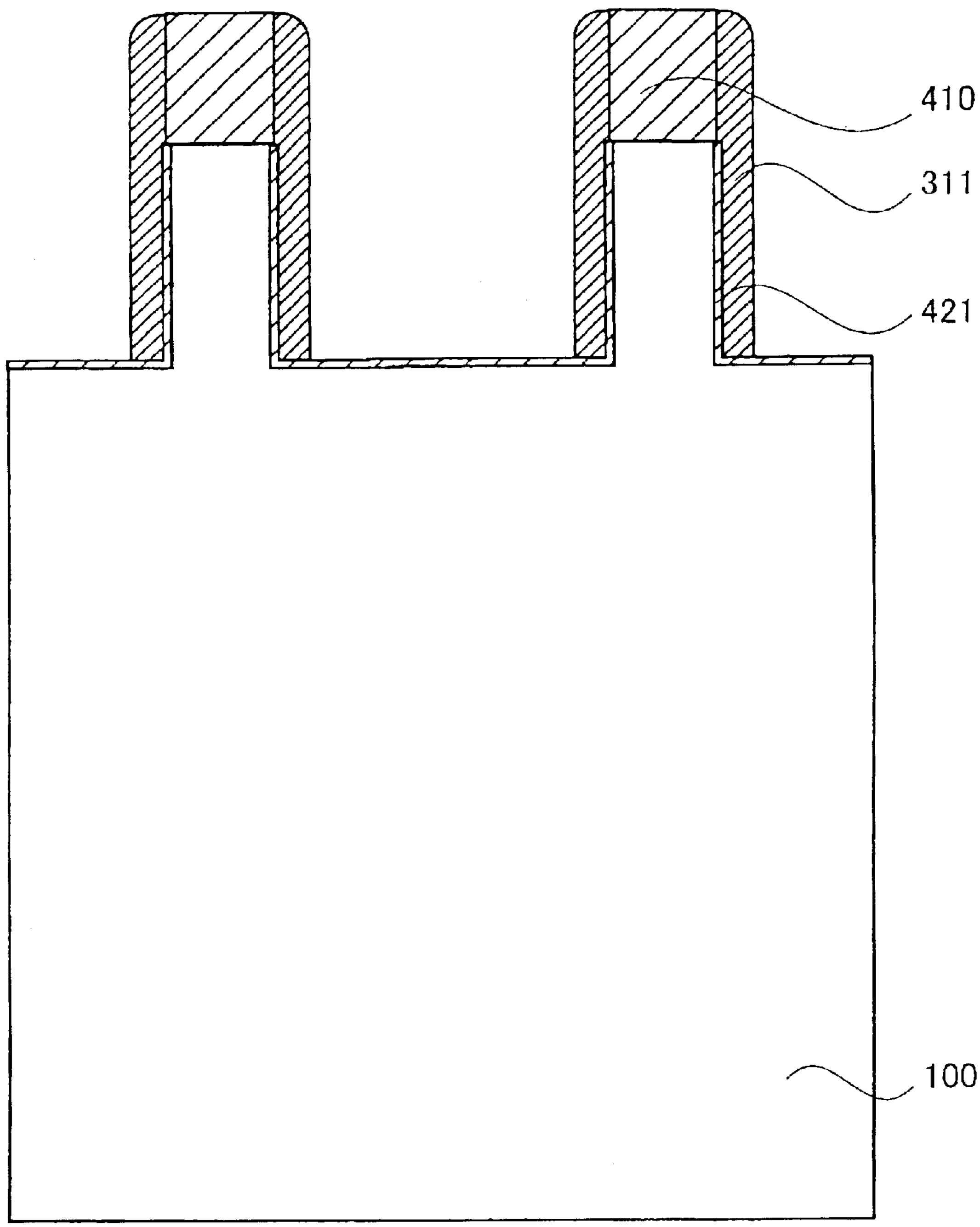

Next, a silicon nitride film 311, for example, is deposited to 10 to 1000 nm as a third insulating film, and then is anisotropically etched in the form of sidewalls on sidewalls of the silicon oxide film 410 and the p-type silicon substrate 100 patterned in the columnar form with intervention of the silicon oxide film 421 (FIG. 266 and FIG. 294).

Figure 267:
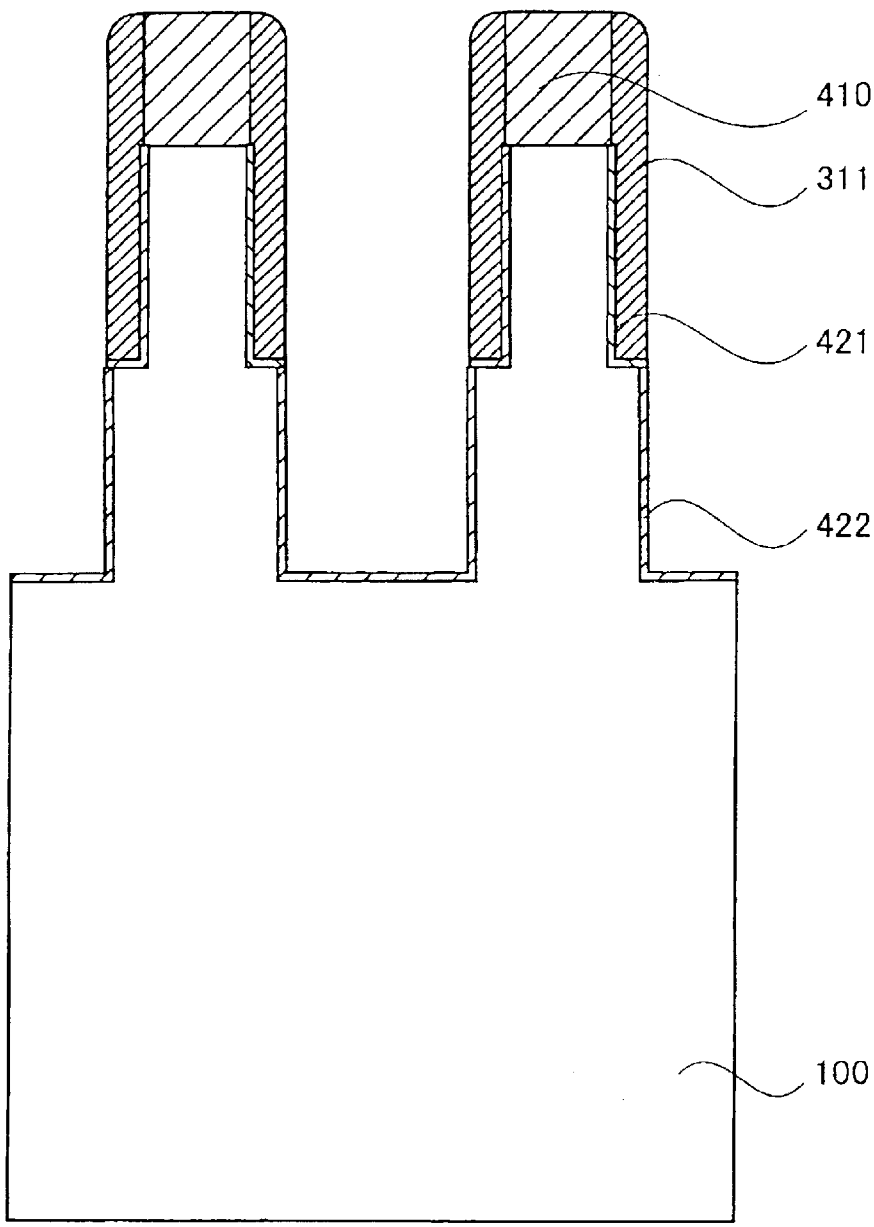
Figure 295:
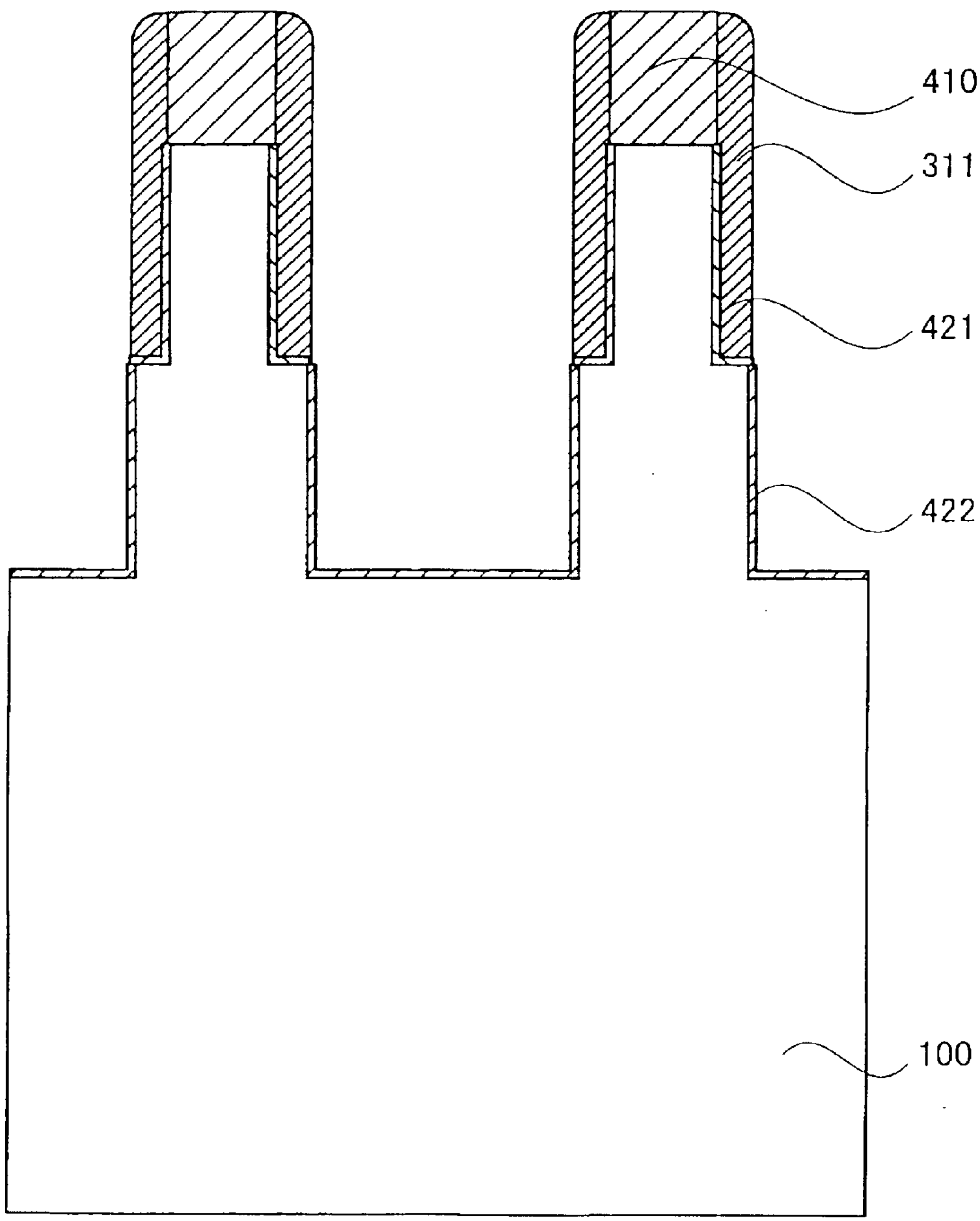

Subsequently, using the silicon nitride film 311 formed in the sidewalls as a mask, the silicon oxide film 421 is etched away by RIE, and then, the exposed p-type silicon substrate 100 is etched 50 to 5000 nm. Thereby, the p-type silicon substrate 100 is patterned into the form of columns each having a step. Thereafter, an exposed part of the p-type silicon substrate 100 is thermally oxidized to form a second insulating film, for example, a silicon oxide film 422 of 5 to 100 nm thickness (FIG. 267 and FIG. 295).

A silicon nitride film 312, for example, is deposited to 10 to 1000 nm as a third insulating film, and then is anisotropically etched in the form of sidewalls on sidewalls of the silicon oxide film 410, the silicon nitride film 311 and the p-type silicon substrate 100 patterned in the columnar form having the step with intervention of the silicon oxide-film 422.

Figure 268:
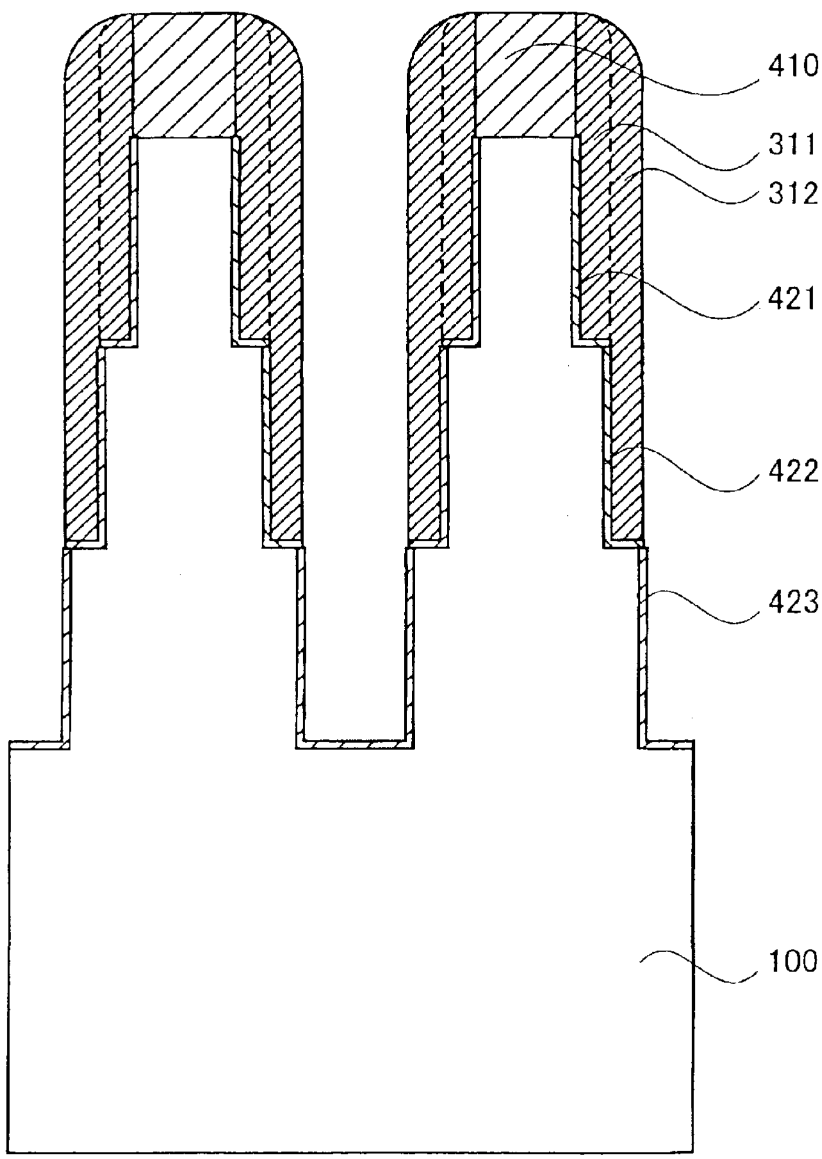
Figure 296:
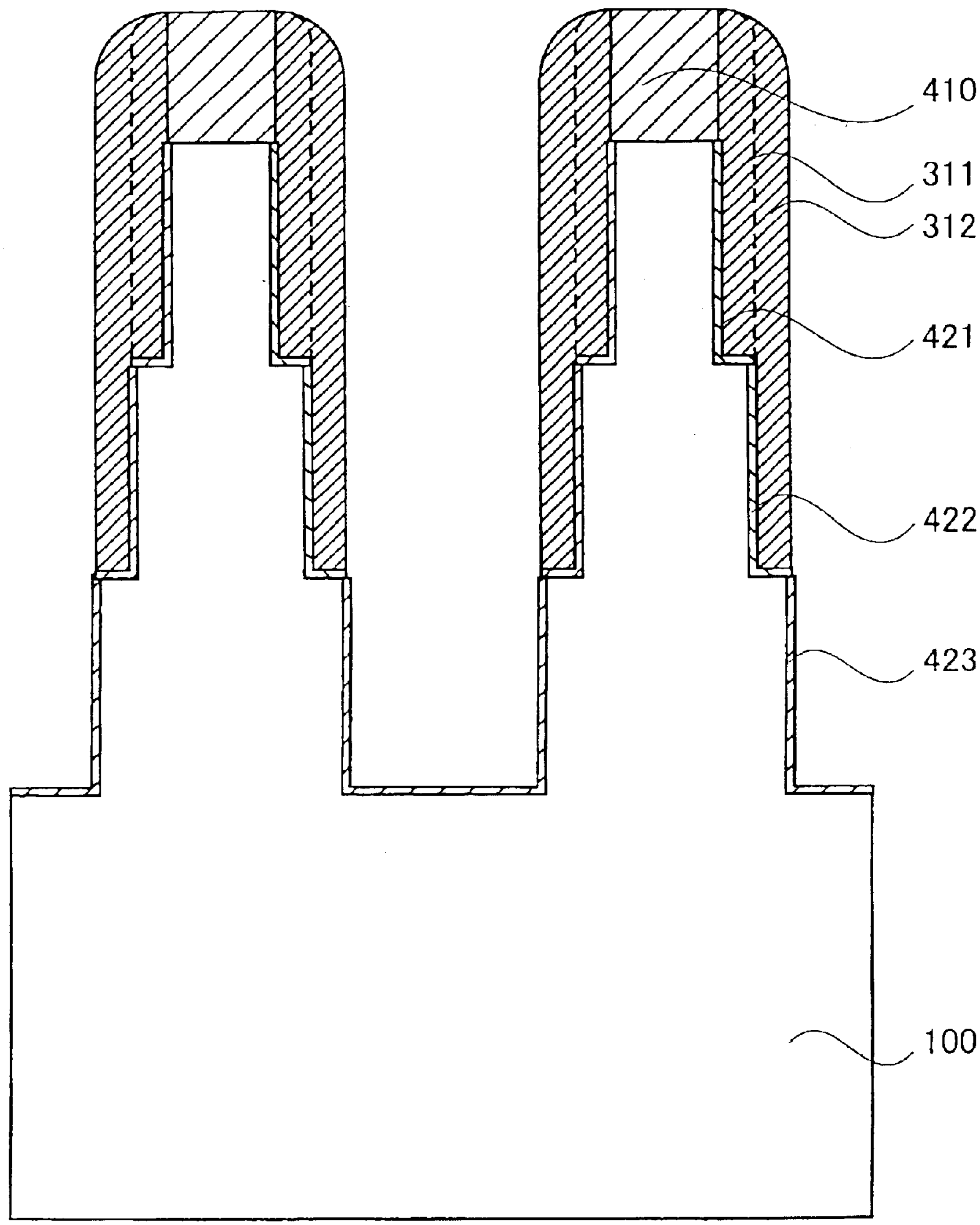

Subsequently, using the silicon nitride film 312 formed in the sidewalls as a mask, the silicon oxide film 422 is etched away by RIE, and then, the exposed p-type silicon substrate 100 is etched 50 to 5000 nm. Thereby, the p-type silicon substrate 100 is patterned into the form of columns each having two steps. Thereafter, an exposed part of the p-type silicon substrate 100 is thermally oxidized to form a second insulating film, for example, a silicon oxide film 423 of 5 to 100 nm thickness (FIG. 268 and FIG. 296).

Next, a silicon nitride film 313, for example, is deposited to 10 to 1000 nm as a third insulating film, and then is anisotropically etched in the form of sidewalls on sidewalls of the silicon oxide film 410, the silicon nitride film 312 and the p-type silicon substrate 100 patterned in the columnar form having the two steps with intervention of the silicon oxide film 423.

Subsequently, using the silicon nitride film 313 formed in the sidewalls as a mask, the silicon oxide film 423 is etched away by RIE, and then, the exposed p-type silicon substrate 100 is etched 50 to 5000 nm. Thereby, the p-type silicon substrate 100 is patterned into the form of columns each having three steps. By the above-described process, the p-type silicon substrate 100 is separated into a plurality of columnar island-like semiconductor layers 110 having the steps.

Figure 269:
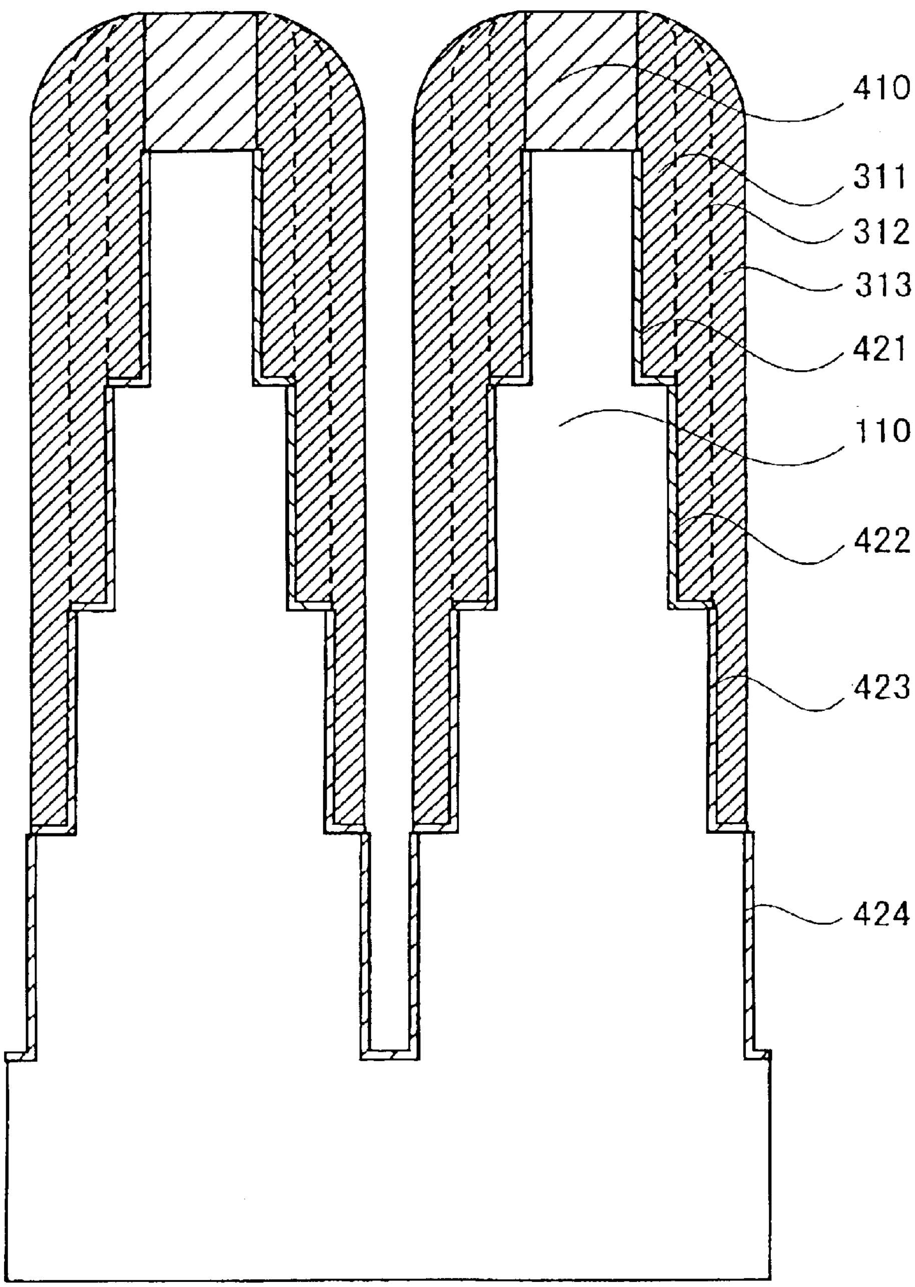
Figure 297:
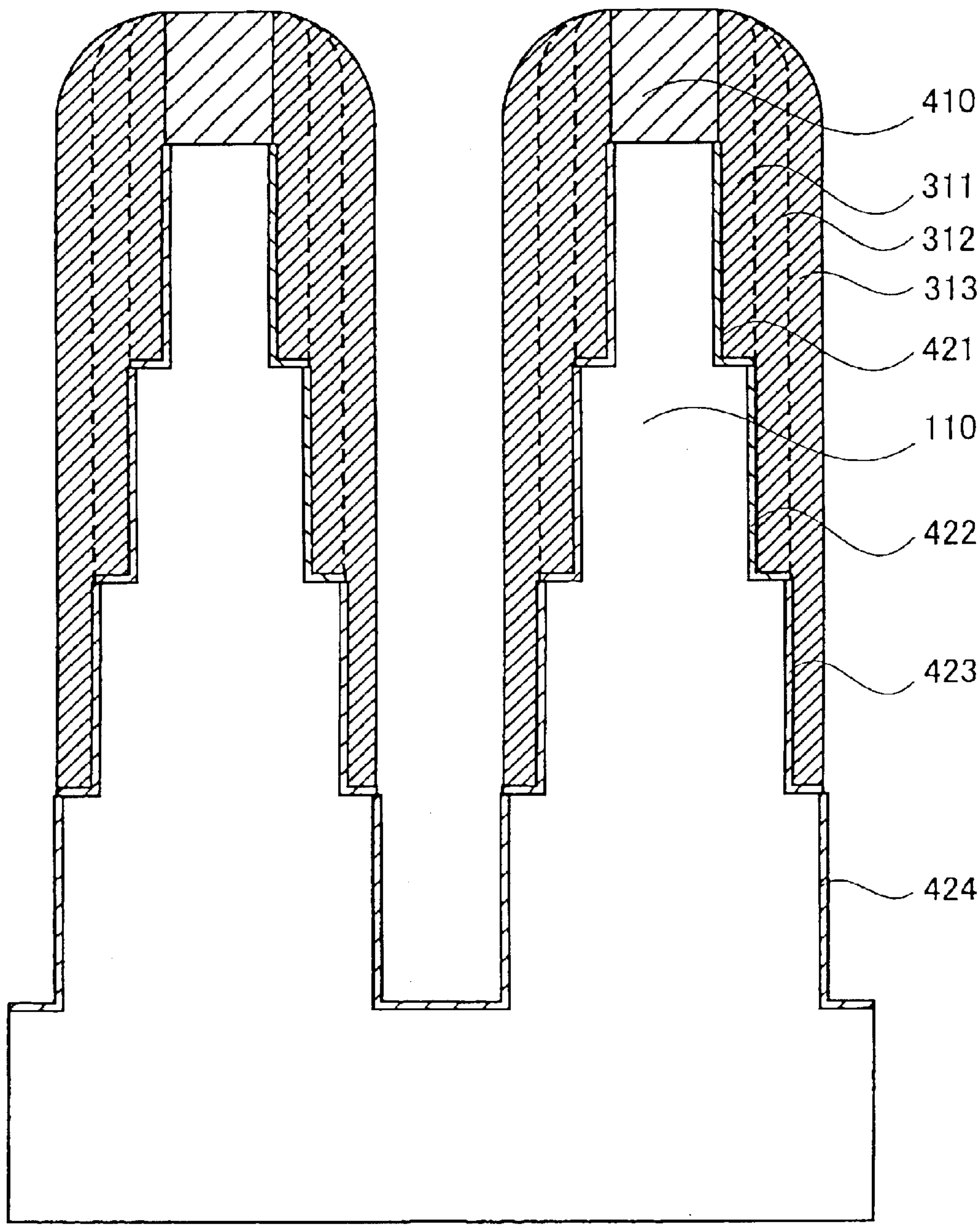

Thereafter, on an exposed part of the p-type silicon substrate 100, a silicon oxide film 424 is formed as a second insulating film of 5 to 100 nm thickness, for example, by thermal oxidization (FIG. 269 and FIG. 297). The silicon oxide film 424 may be formed by deposition. Instead of the silicon oxide film, the second insulating film may be a silicon nitride film and a film of any material particularly limited.

An impurity is introduced at the bottom of each island-like semiconductor layer 110 having the steps to form an n-type impurity region 710, for example, at an implantation energy of 5 to 100 keV at an arsenic or phosphorus dose of about $1\times10^{13}$ to $1\times10^{17}/cm^2$ in a direction inclined about 0 to 7°.

Figure 270:
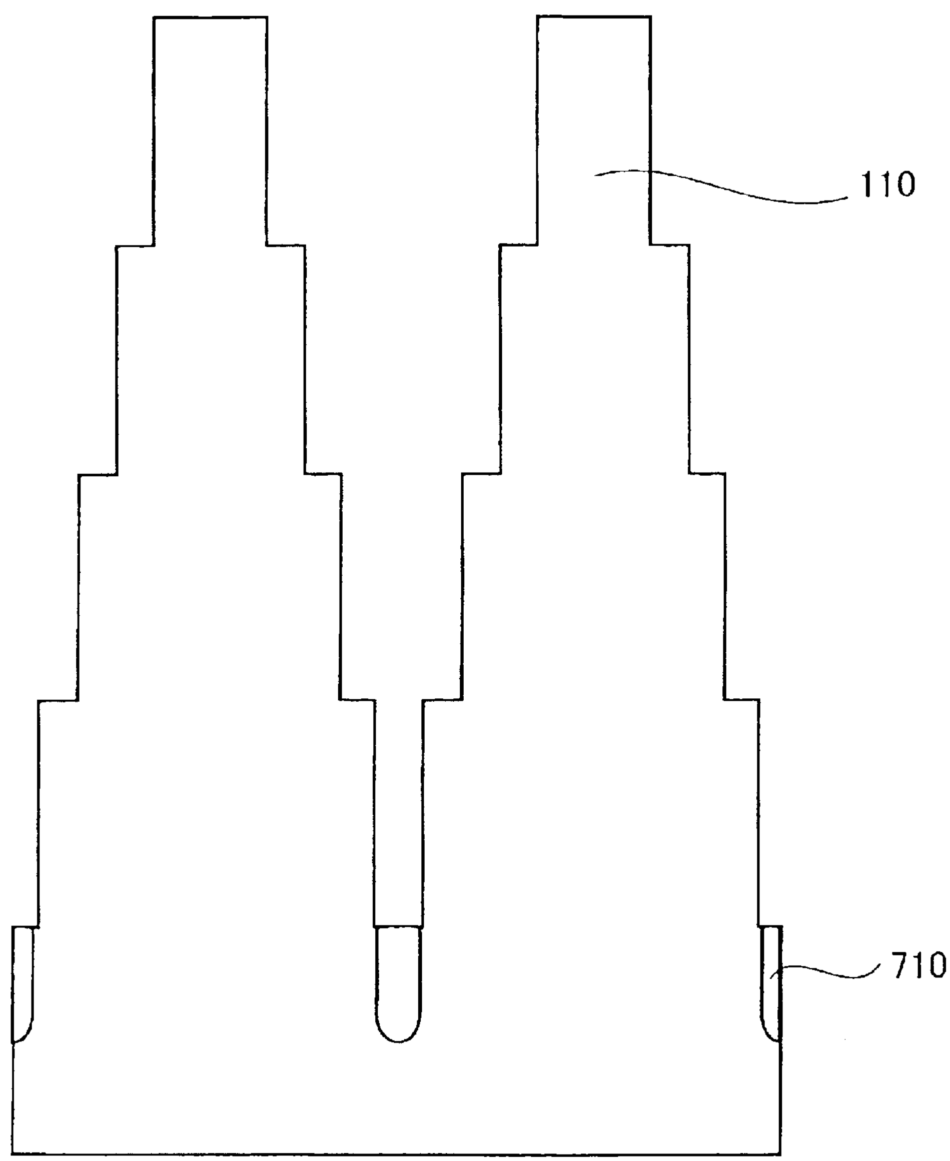
Figure 271:
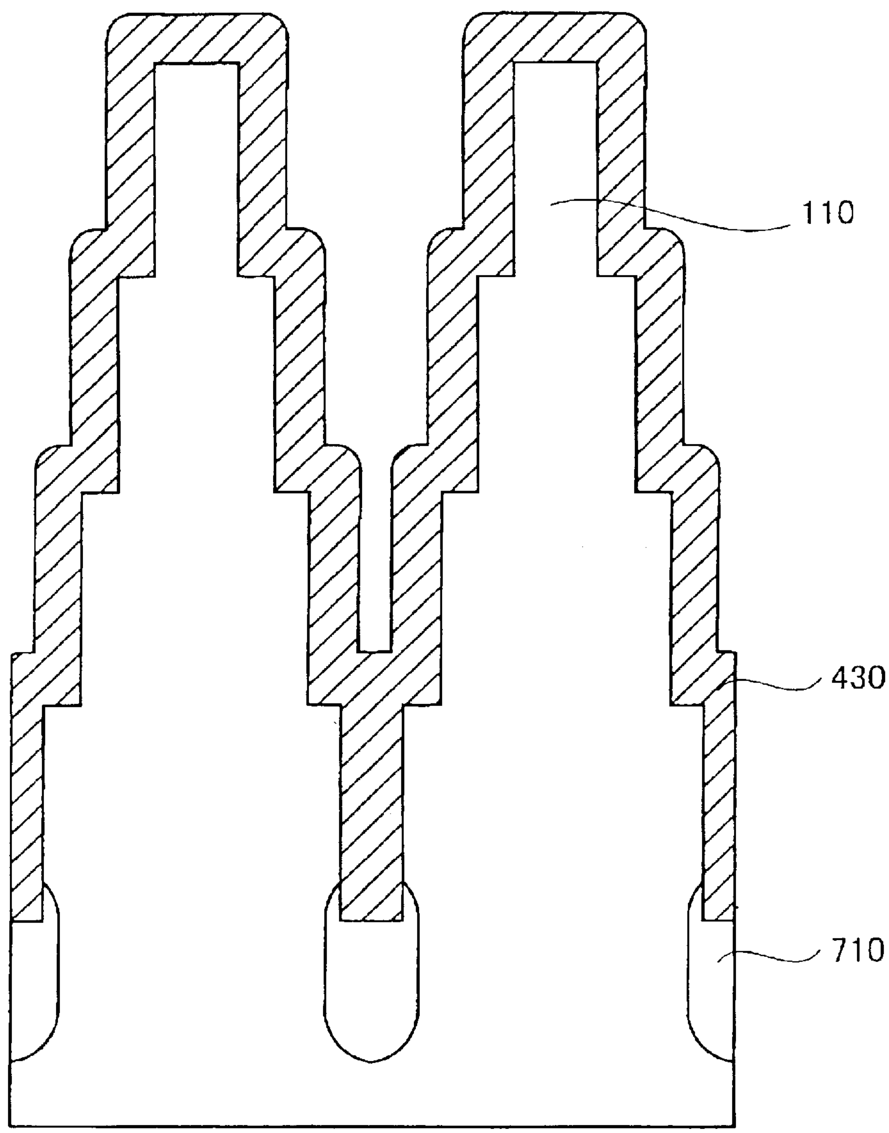
Figure 298:
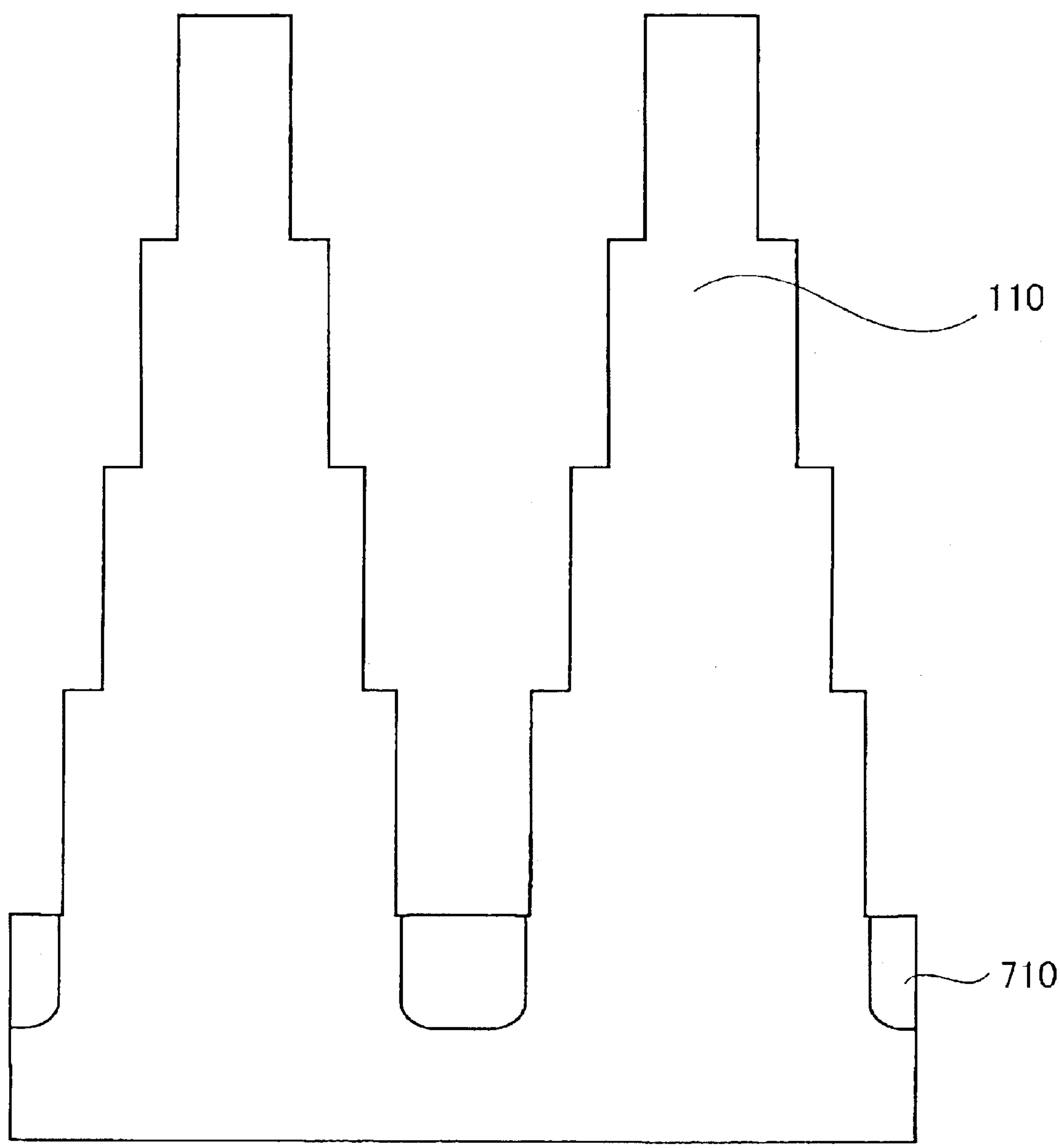
Figure 299:
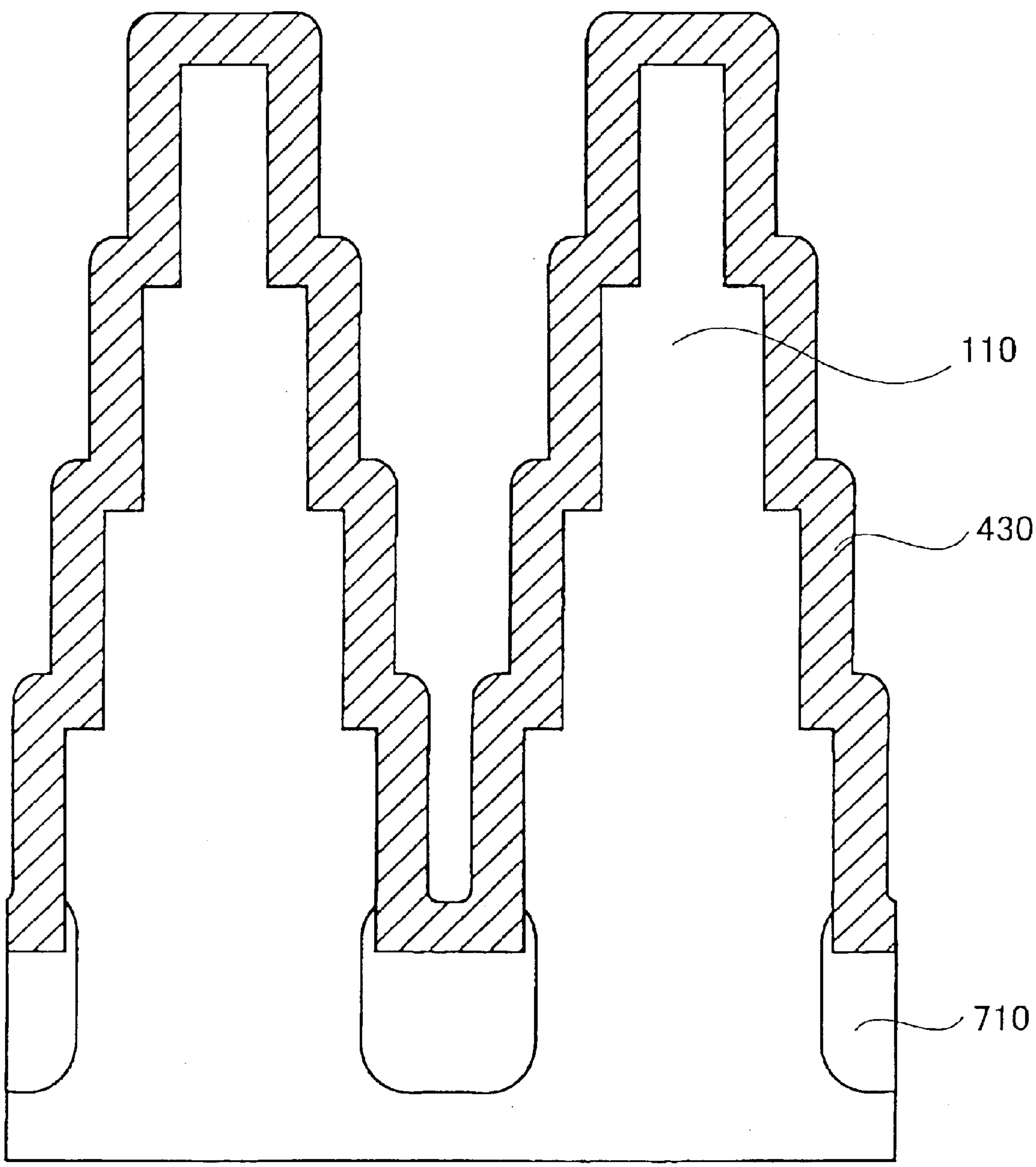

Subsequently, the silicon nitride film and the silicon oxide film are selectively removed, for example, by isotropic etching (FIG. 270 and FIG. 298). The surface of the island-like semiconductor layer 110 is oxidized to form a fourth insulating film, for example, a silicon oxide film 430 with a thickness of 10 to 100 nm (FIG. 271 and FIG. 299). At this time, if the uppermost tier of the island-like semiconductor layer 110 is formed to have a diameter of the minimum patterning dimensions, the diameter of the uppermost tier of the island-like semiconductor layer 110 is reduced to the minimum patterning dimensions or less by the formation of the silicon oxide film 430.

Figure 272:
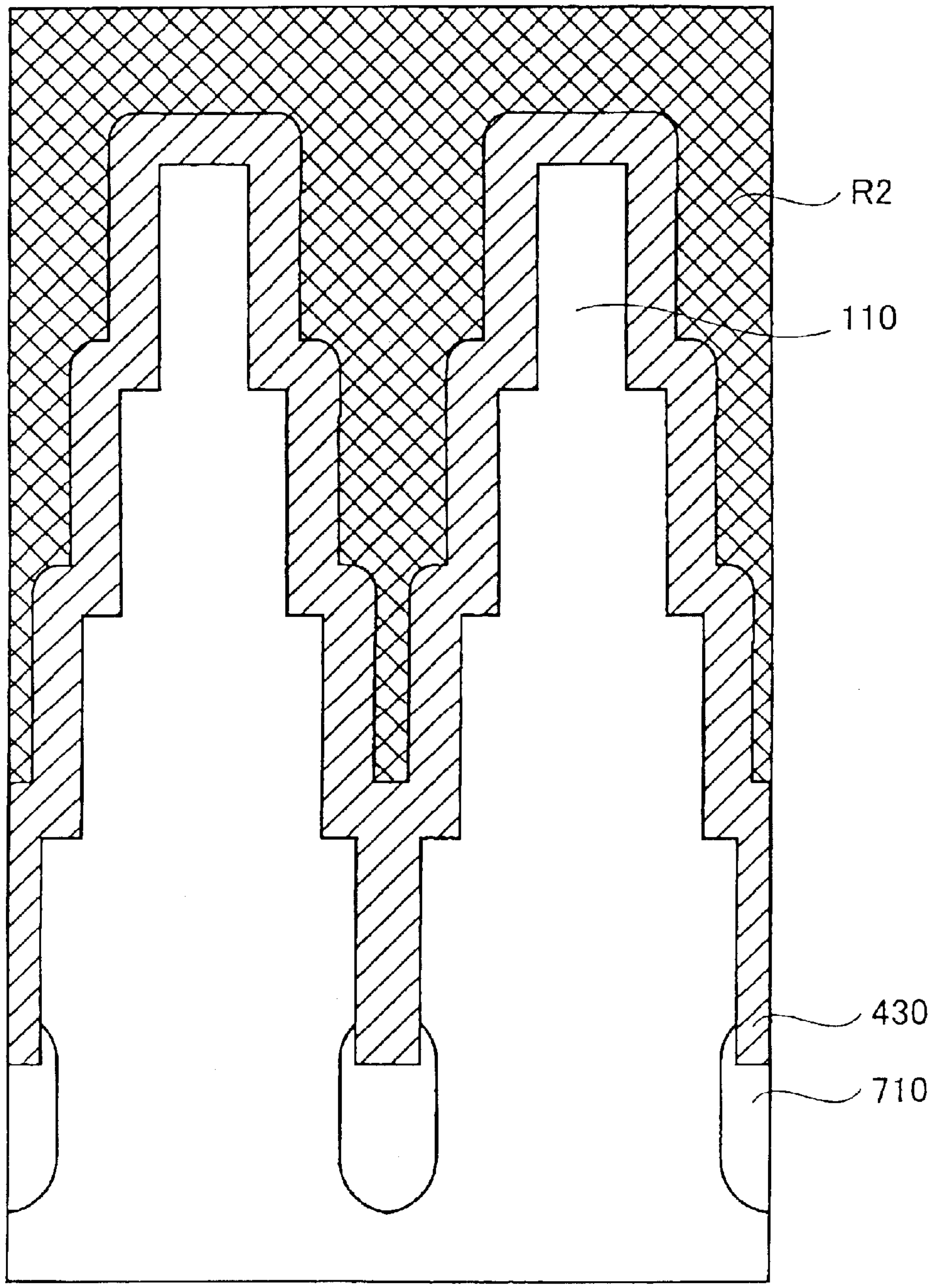
Figure 300:
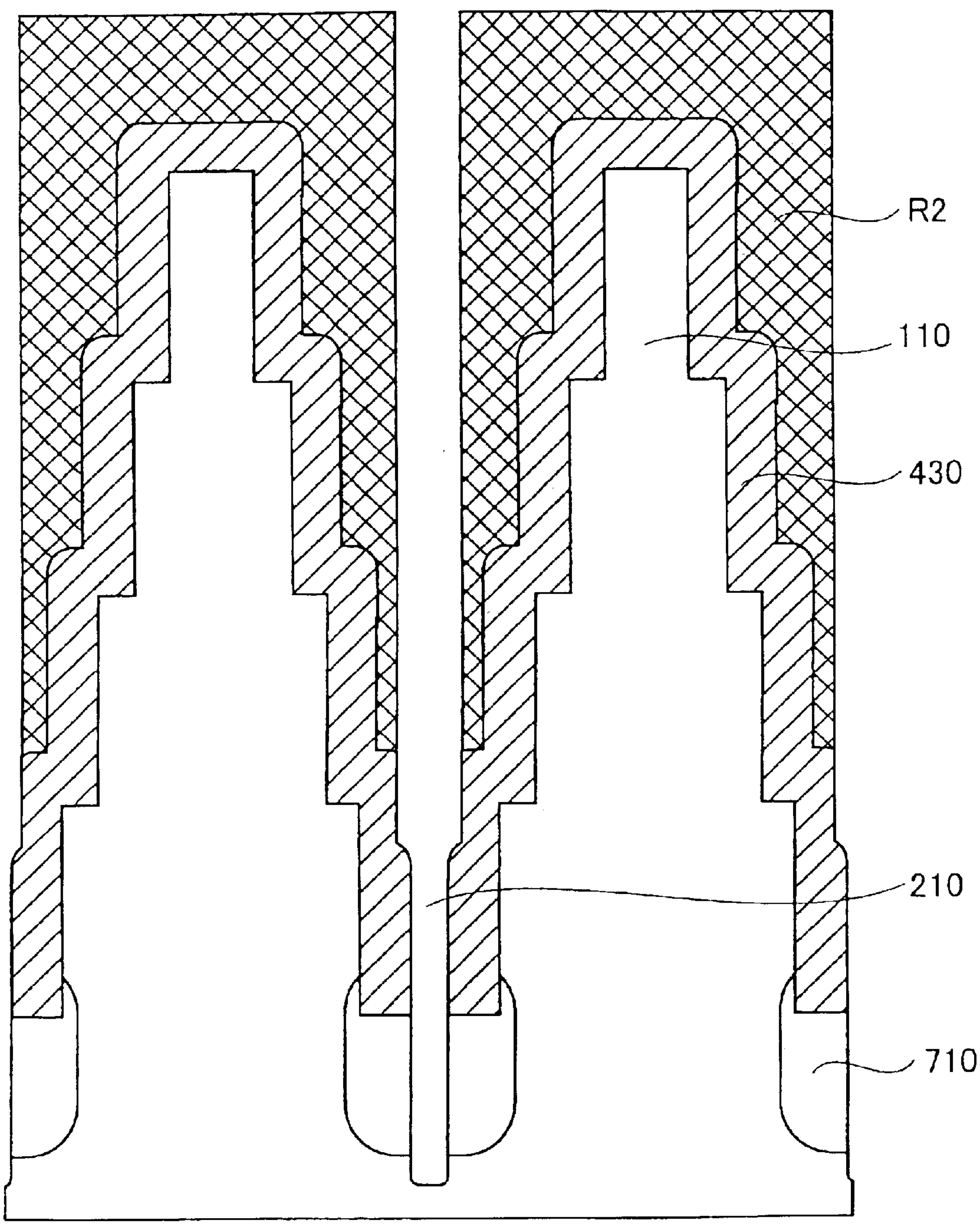

Using as a mask a resist film R2 patterned by a known photolithography technique, the silicon oxide film 430 is etched by RIE, and the exposed silicon substrate is further etched by RIE to separate the impurity diffusion layer 710 in the B–B' direction and form a first trench 210 (FIG. 272 and FIG. 300). Thereby, a first wiring layer continuous in the A–A' direction of FIG. 1 is formed by separation. Since the anisotropic etching of the silicon substrate is performed in self-alignment along the sidewall of the silicon oxide film 430, the resist film R2 can have a sufficient alignment margin, which provides an advantage of easy patterning.

Figure 273:
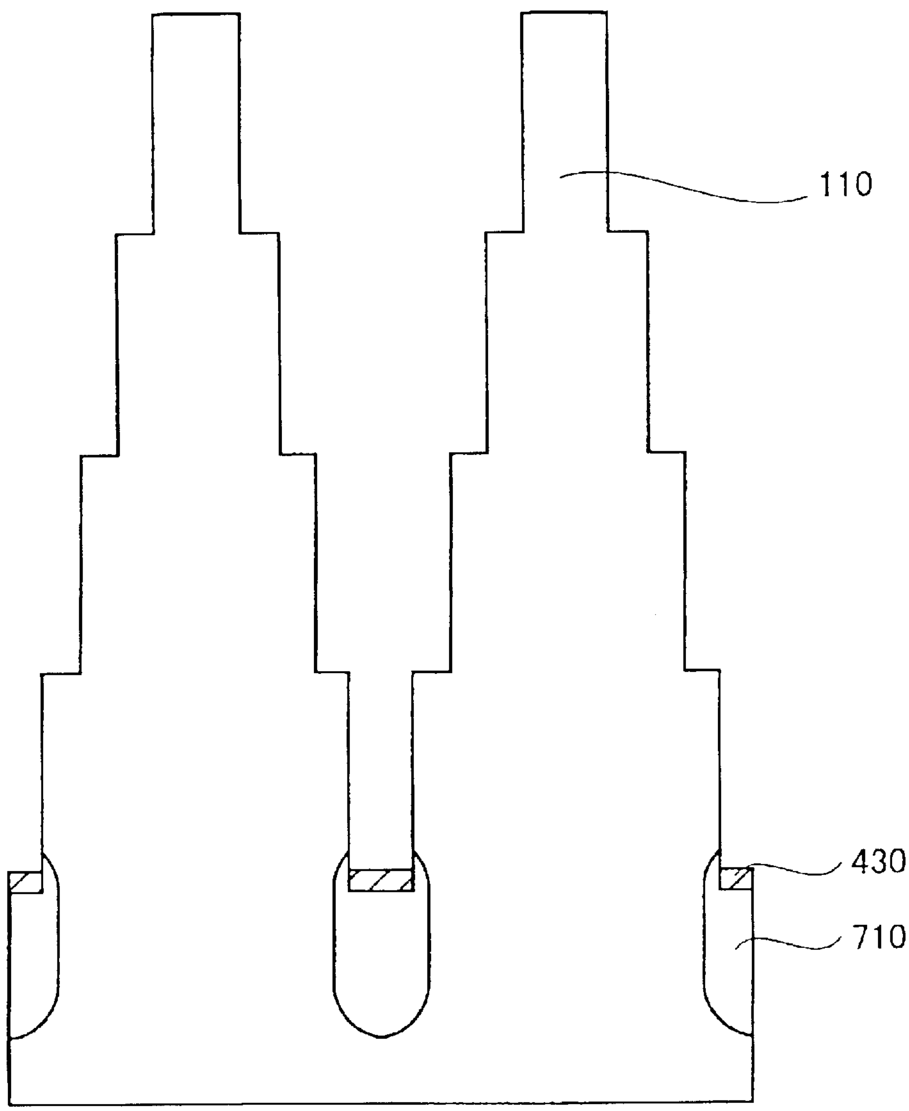
Figure 301:
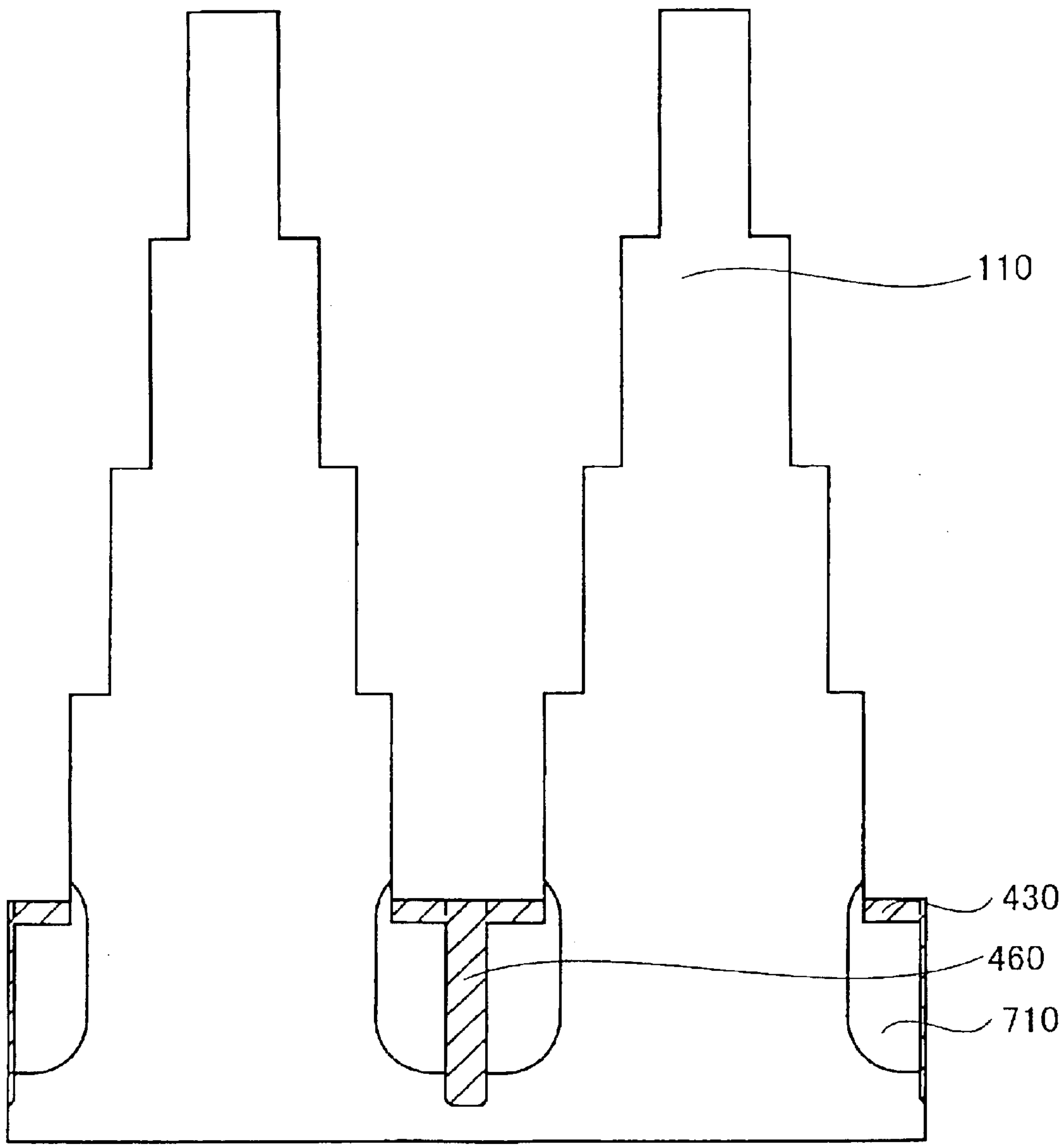

Thereafter, a silicon oxide film 460, for example, is deposited to about 20 to 200 nm as a seventh insulating film and is isotropically etched back to a desired height to be buried in the first trench 210 or in the first trench 210 and the bottom of the island-like semiconductor layer 110 (FIG. 273 and FIG. 301).

Next, channel ion implantation is carried out on the sidewall of each island-like semiconductor layer 110 as required using a slant ion implantationin the same manner as described above, for example, at an implantation energy of 5 to 100 keV at a boron dose of about $1\times10^{11}$ to $1\times10^{13}/cm^2$ in a direction inclined about 5 to 45°. The channel ion implantation may preferably be performed in various directions toward the island-like semiconductor layer 110 because the surface impurity concentration becomes uniform. Alternatively, instead of the channel ion implantation, an oxide film containing boron is deposited by CVD and diffusion of boron from the oxide film may be utilized. The implantation of the impurity ions from the surface of the island-like semiconductor layer 110 may be done before the surface of the island-like semiconductor layer 110 is covered with the silicon oxide film 430 or may be finished before the island-like semiconductor layer 110 is formed. The means for the implantation is not particularly limited so long as the impurity concentration distribution in the island-like semiconductor layer 110 is equal.

Figure 274:
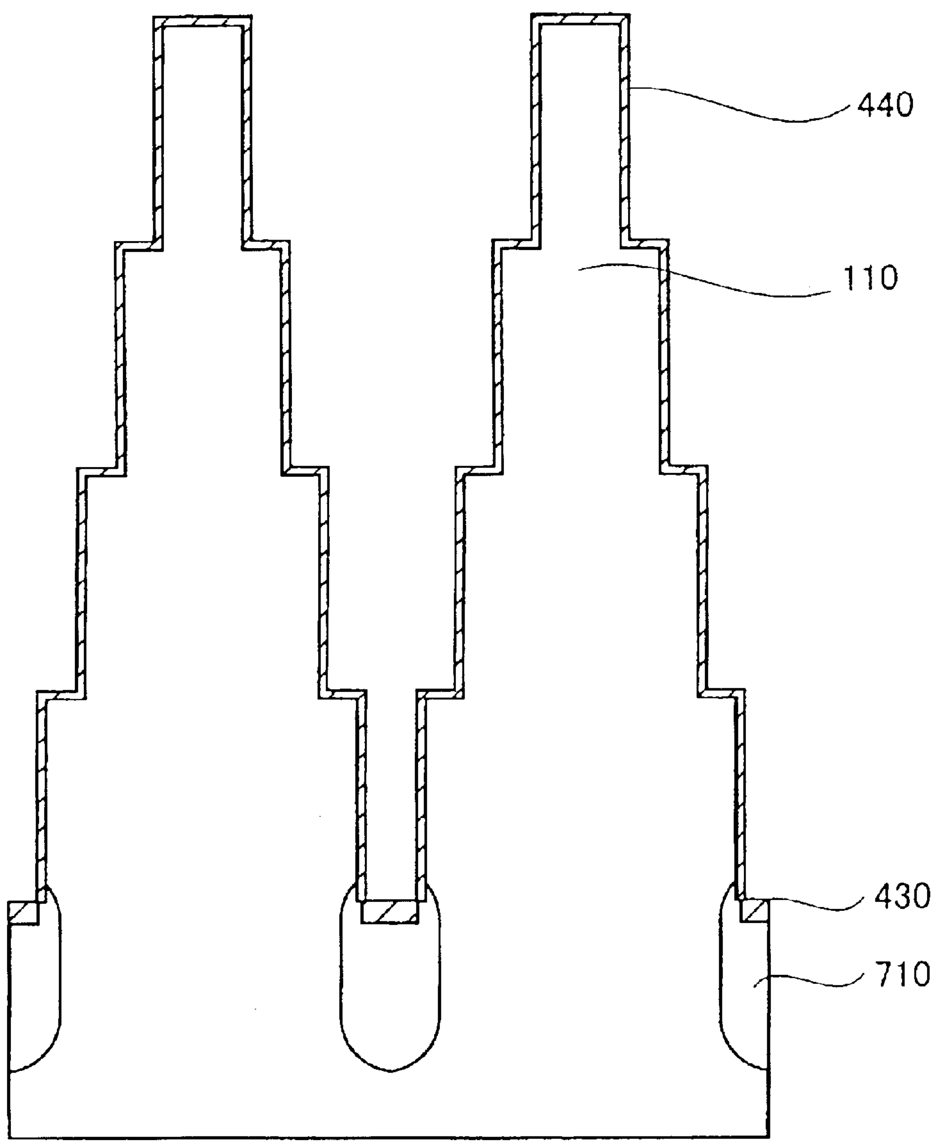
Figure 302:
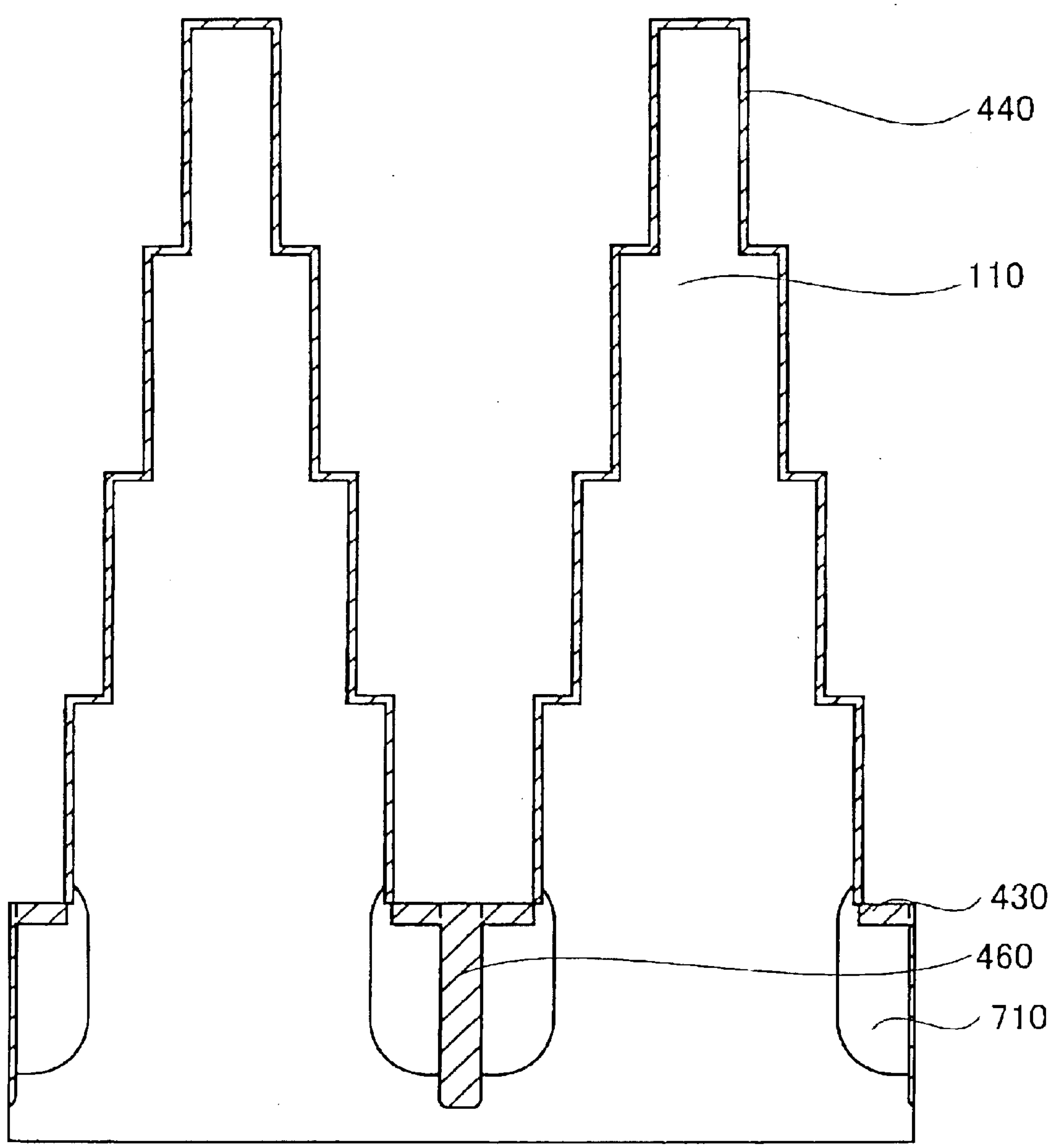

Subsequently, a silicon oxide film 440, for example, is formed as a fifth oxide film to be a tunnel oxide film of about 10 nm around each island-like semiconductor layer 110, for example, using thermal oxidation (FIG. 274 ad FIG. 302). At this time, the tunnel oxide film is not limited to the thermally oxidized film but may be a CVD oxide film or an oxynitride film.

Figure 275:
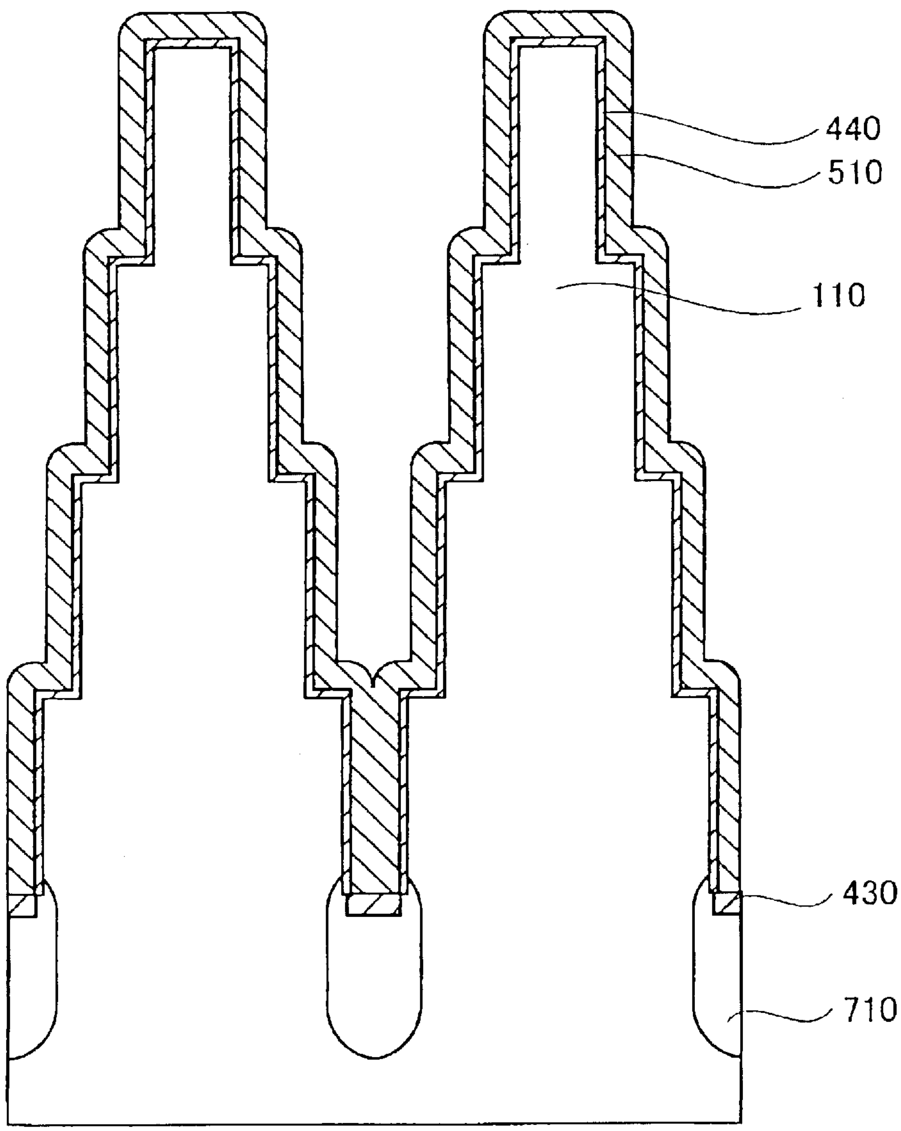
Figure 303:
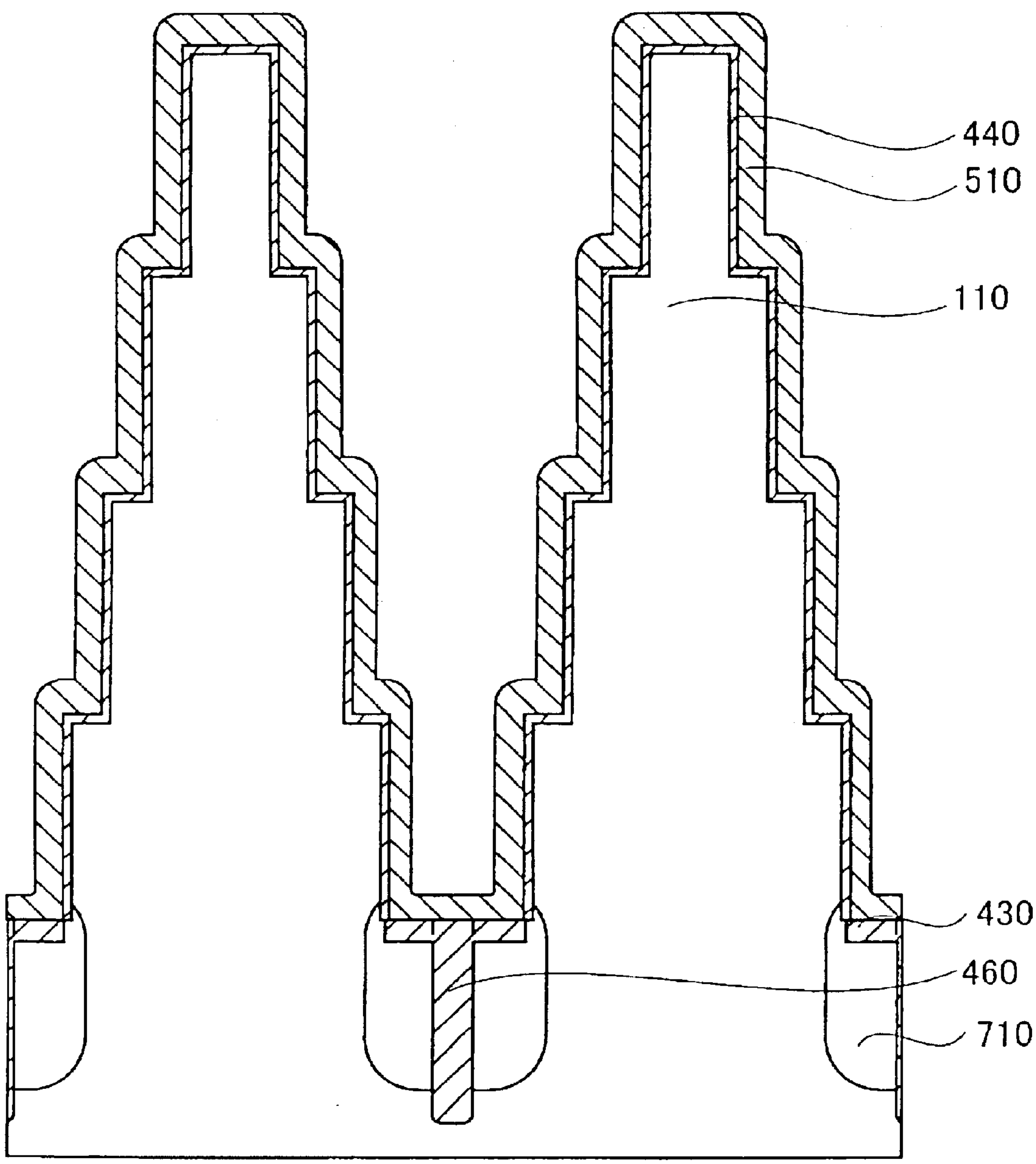

A first conductive film, for example, polysilicon film 510 is deposited to about 20 to 200 nm (FIG. 275 and FIG. 303).

Figure 276:
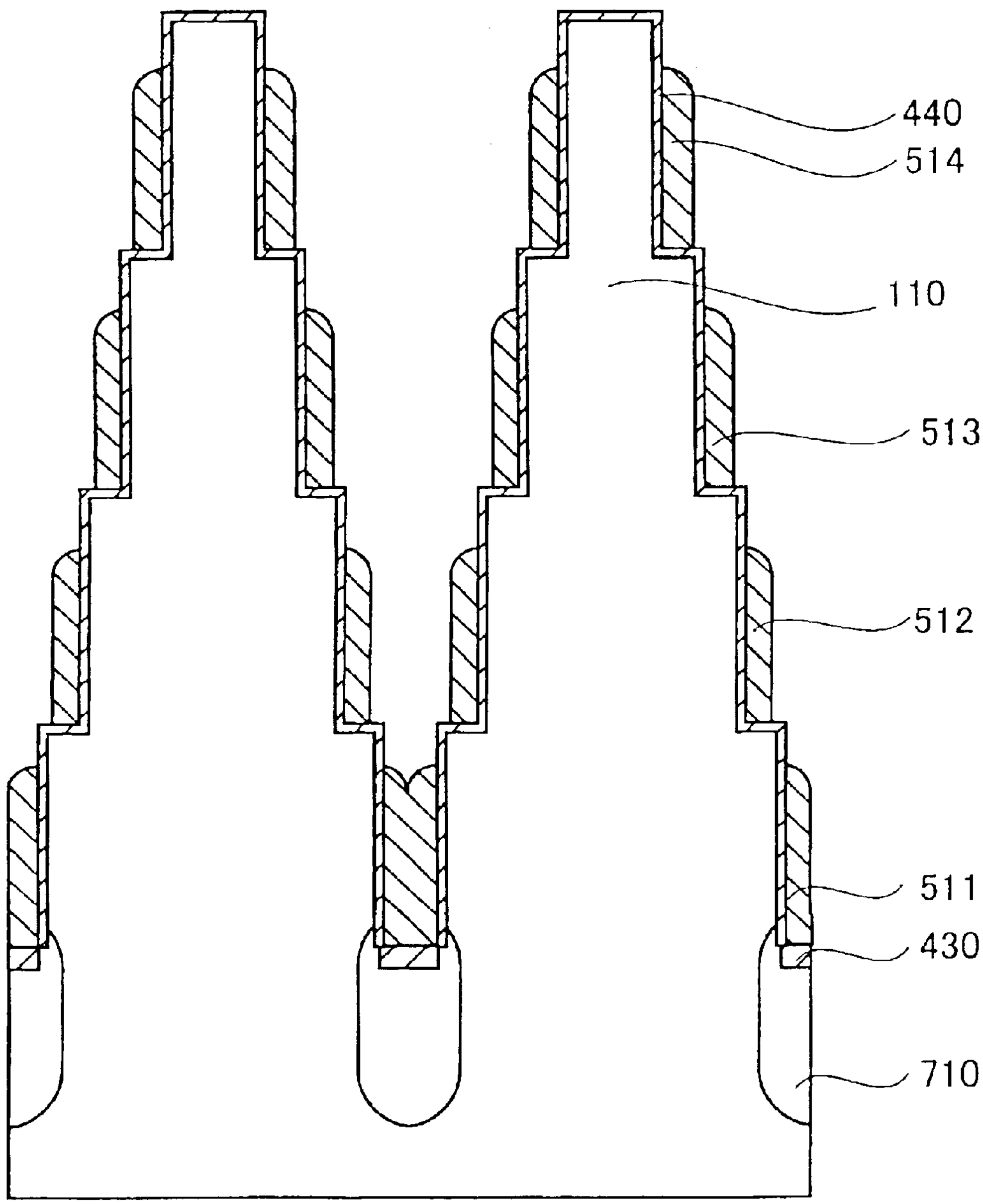
Figure 277:
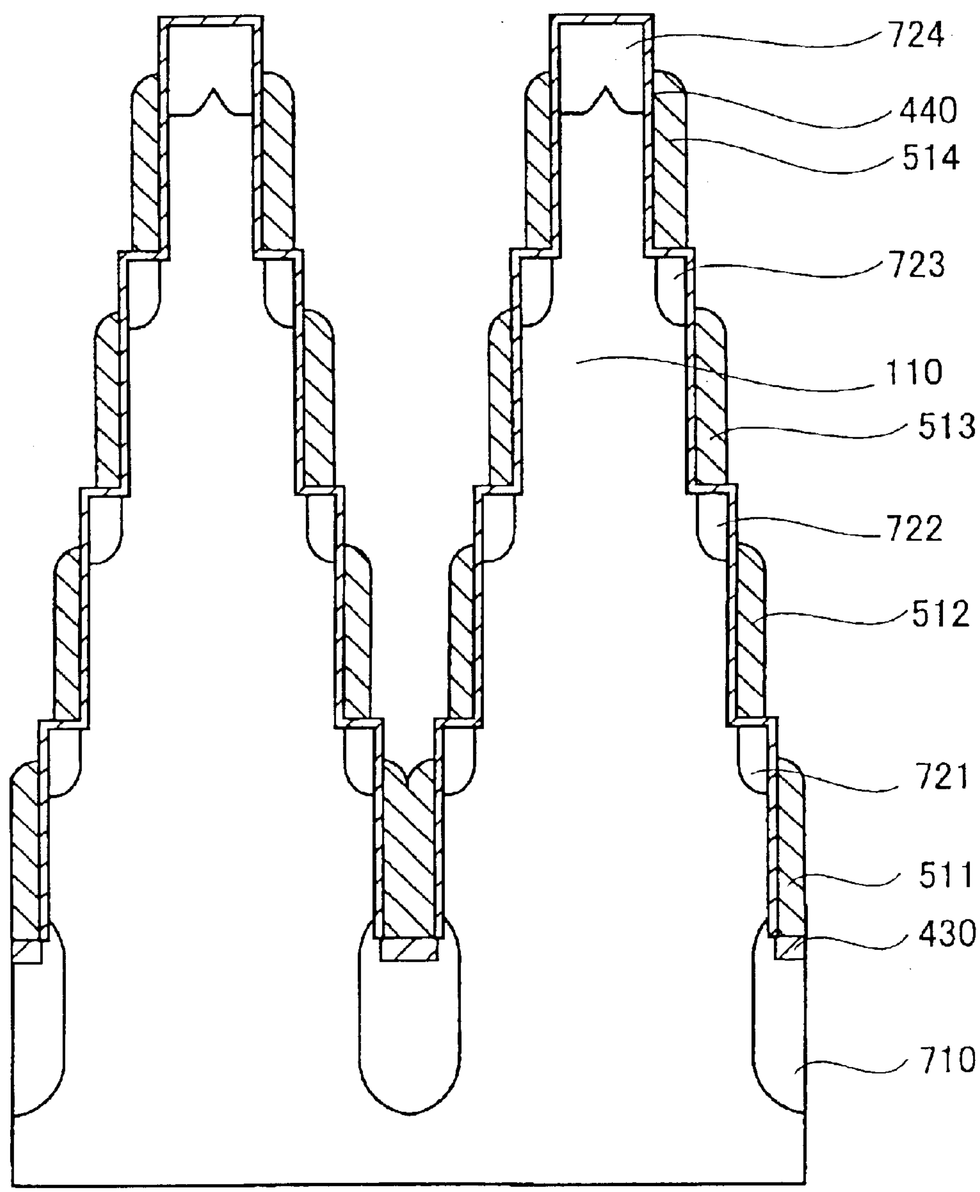
Figure 304:
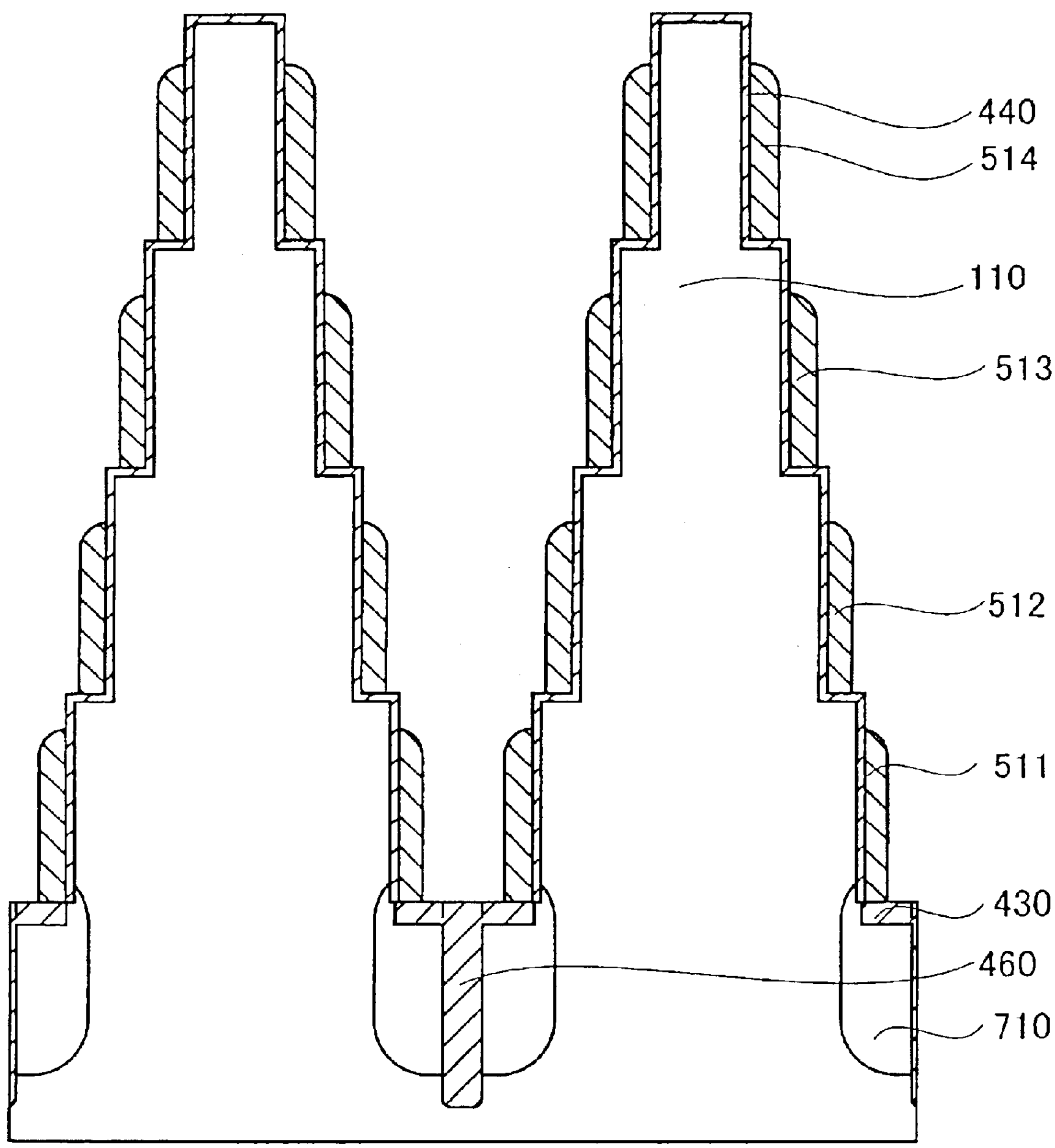
Figure 305:
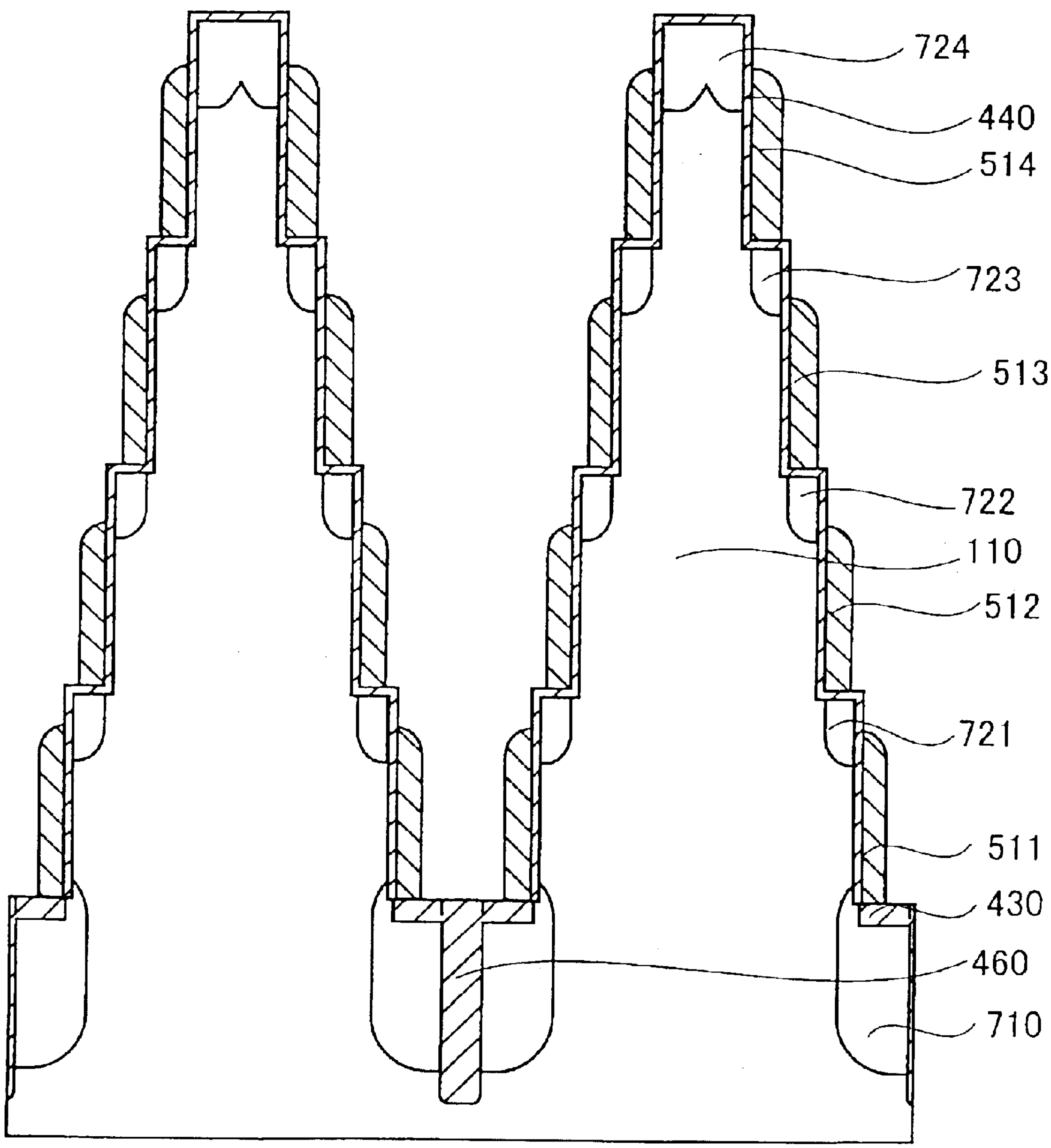

Thereafter, for example, by anisotropic etching, the polysilicon film 510 is formed in the form of sidewalls on the sidewalls of the tiers of the island-like semiconductor layer 110, whereby separate polysilicon films 511, 512, 513 and 514 are formed at the same time (FIG. 276 and FIG. 304). At this time, by setting the intervals between the island-like semiconductor layers in the A–A' direction to a predetermined value or less, a second wiring layer to be a selection gate line is formed continuously in the direction without using a masking process.

The first wiring layer may be formed by separation using as a mask a resist film R2 patterned by the known photolithography technique as described above. Alternatively, a conductive film may be formed by forming a first trench 211 in the silicon substrate in self-alignment along the sidewall of the polysilicon film 511 formed in the sidewall form to separate the impurity diffusion layer 710.

Next, impurity ions are introduced into corners of the island-like semiconductor layer 110 having the steps to form n-type impurity diffusion layers 721, 722, 723 and 724 (FIG. 277 and FIG. 305), for example, at an implantation energy of 5 to 100 keV at an arsenic or phosphorus dose of about $1\times10^{12}$ to $1\times10^{15}/cm^2$ in a direction inclined about 0 to 45°. Here, the ion implantation for forming the n-type impurity diffusion layers 721, 722, 723 and 724 may be carried out on the entire periphery of the island-like semiconductor layer 110 and may be carried out from one direction or from several directions. That is, the n-type impurity diffusion layers 721, 722, 723 and 724 may not be formed to surround the periphery of the island-like semiconductor layer 110.

Figure 278:
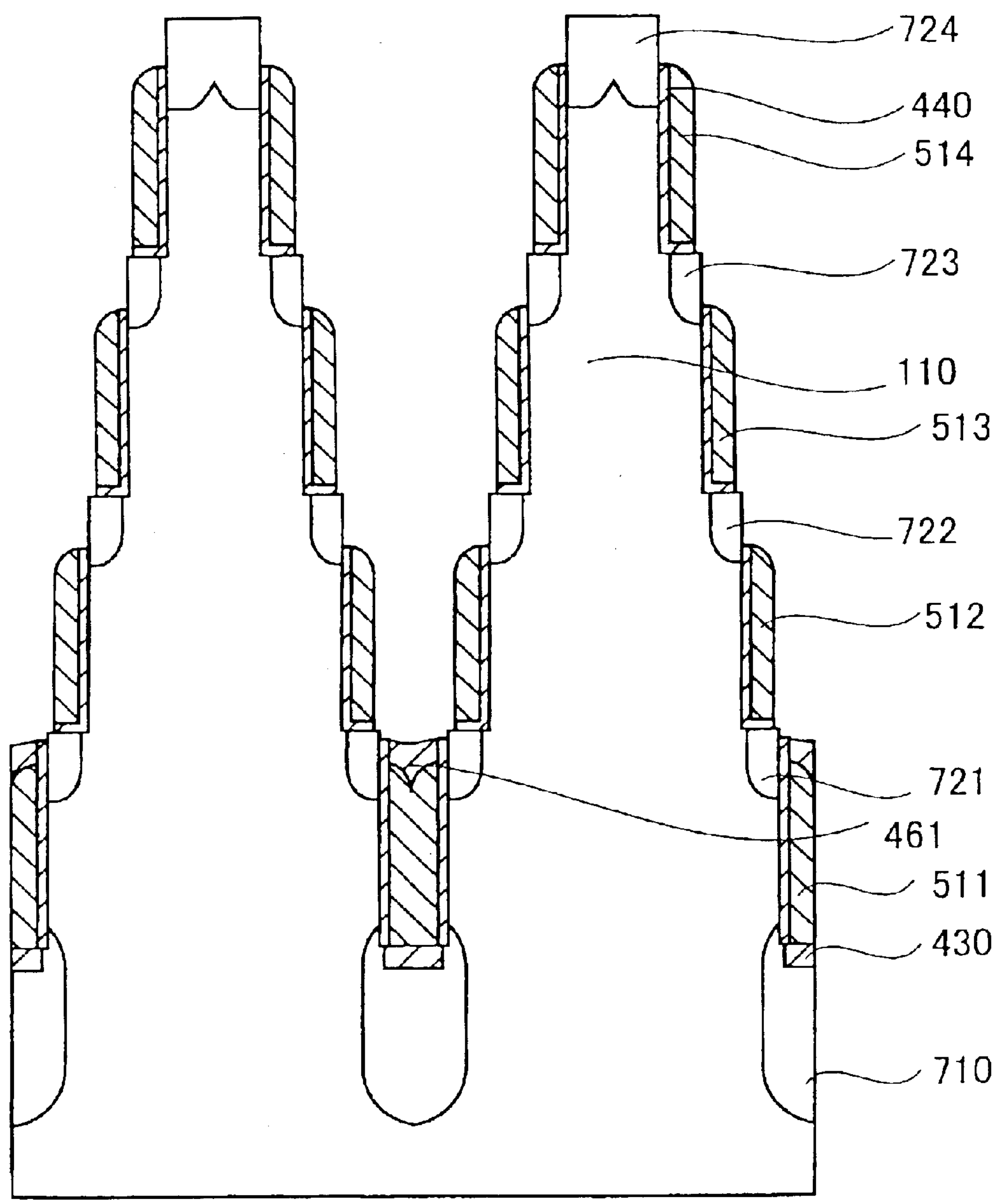
Figure 306:
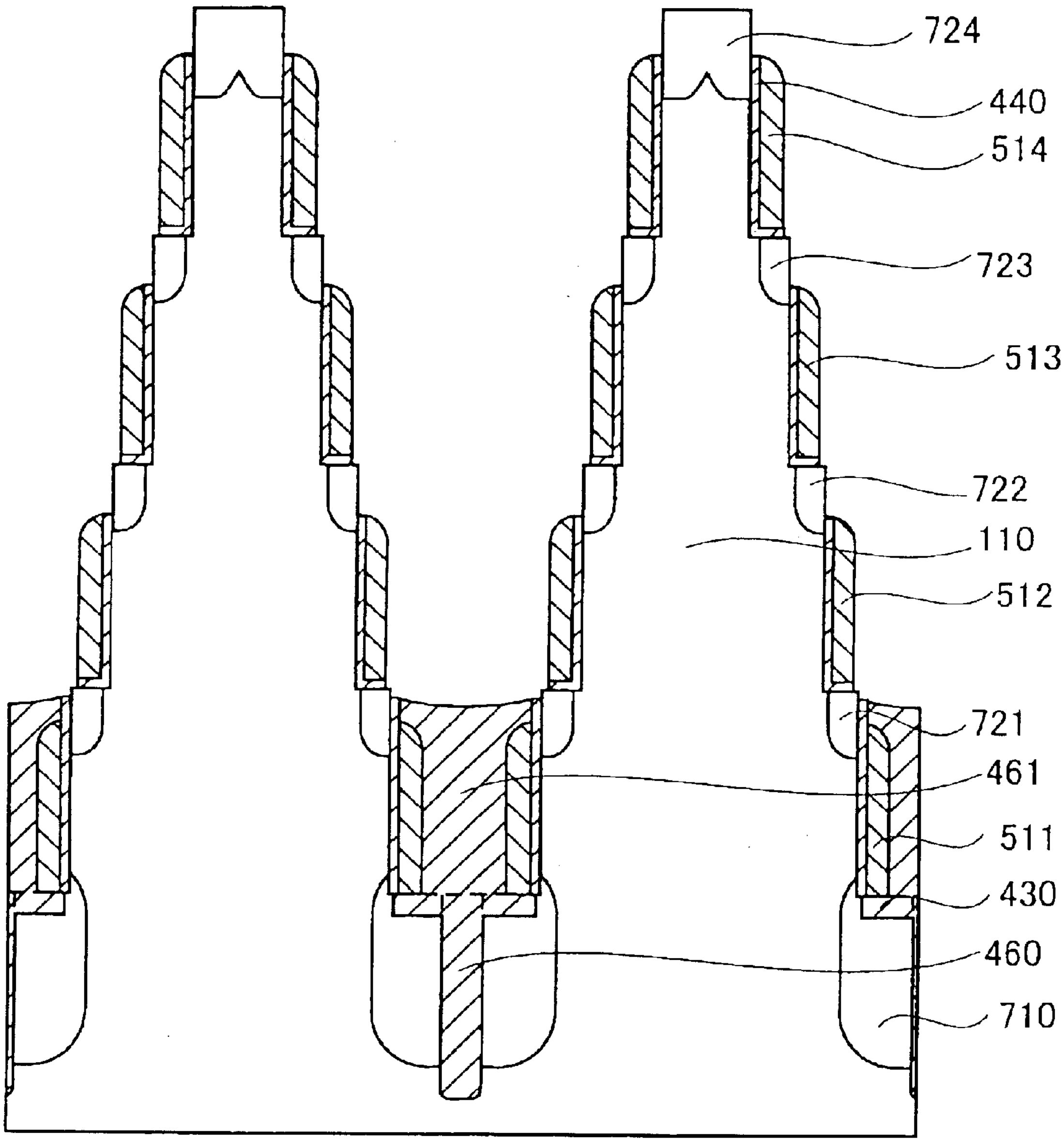

Next, a silicon oxide film 461, for example, is deposited to about 20 to 200 nm as a seventh insulating film and is isotropically etched to be buried and cover the top and side of the polysilicon film 511 (FIG. 278 and FIG. 306).

Subsequently, an interlayer insulating film 610 is formed on the exposes surfaces of the polysilicon films 512, 513 and 514. The interlayer insulating film 610 may be a ONO film, for example.

Figure 279:
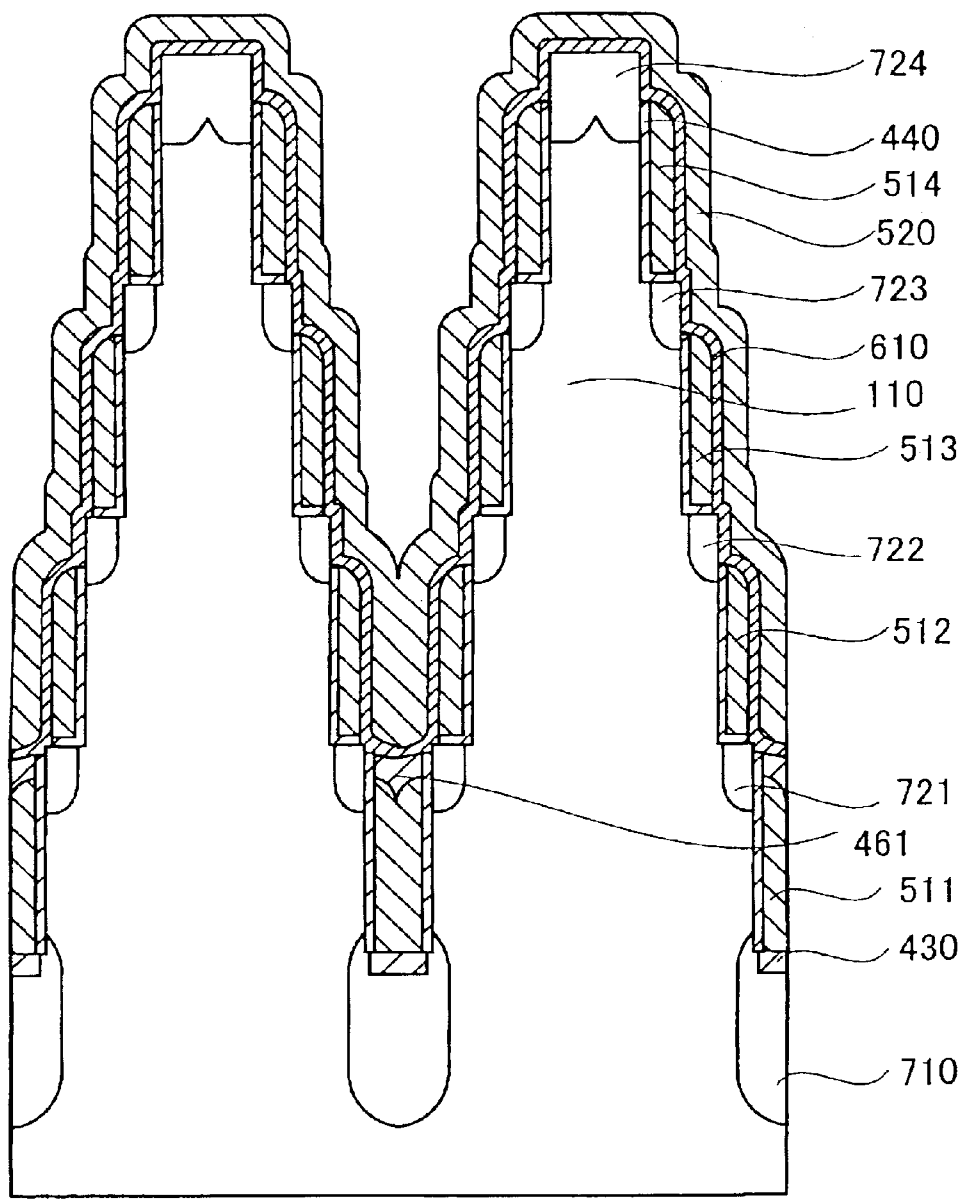
Figure 307:
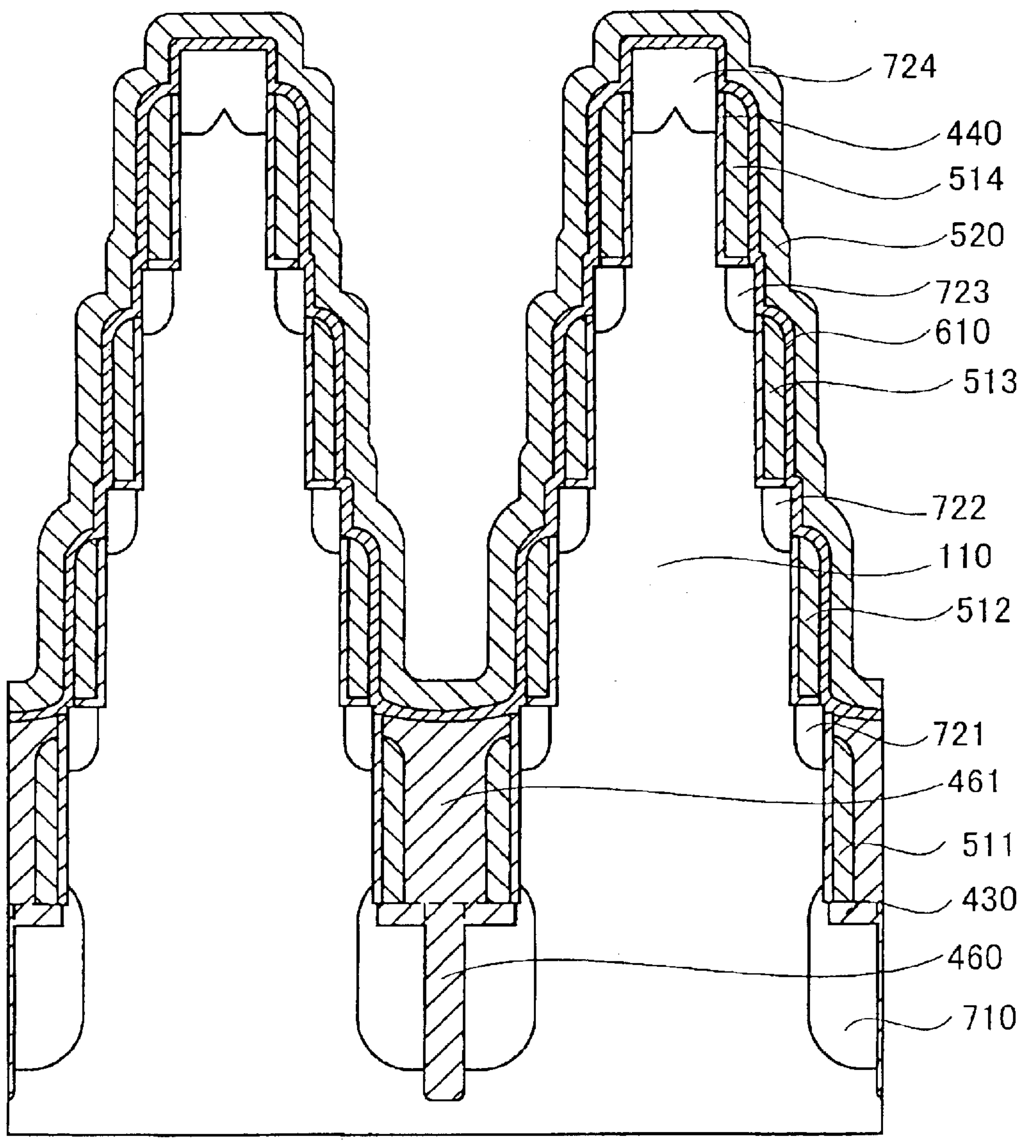

Subsequently, a polysilicon film 520, for example, is deposited to 15 to 150 nm as a second conductive film (FIG. 279 and FIG. 307).

Figure 280:
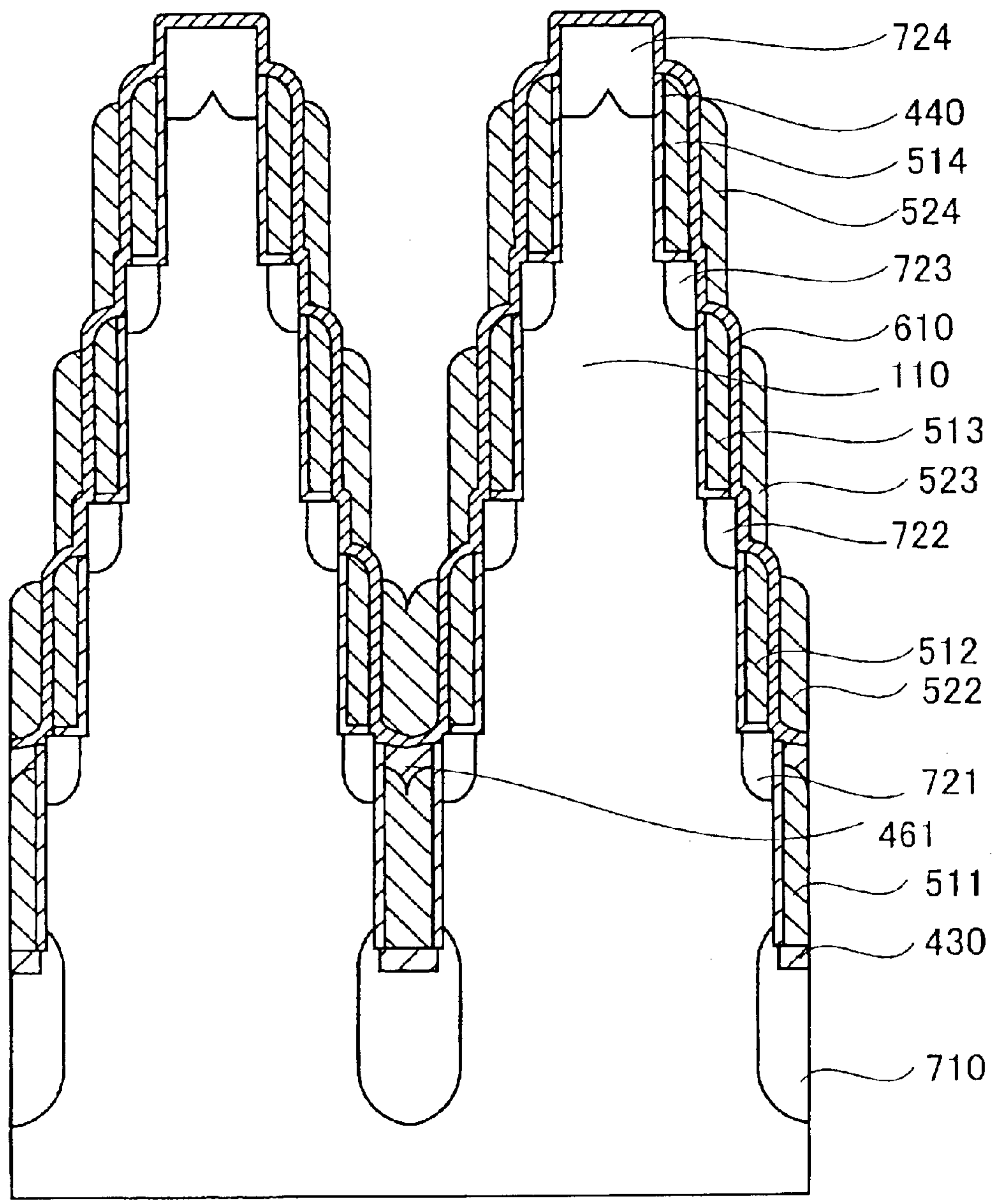
Figure 308:
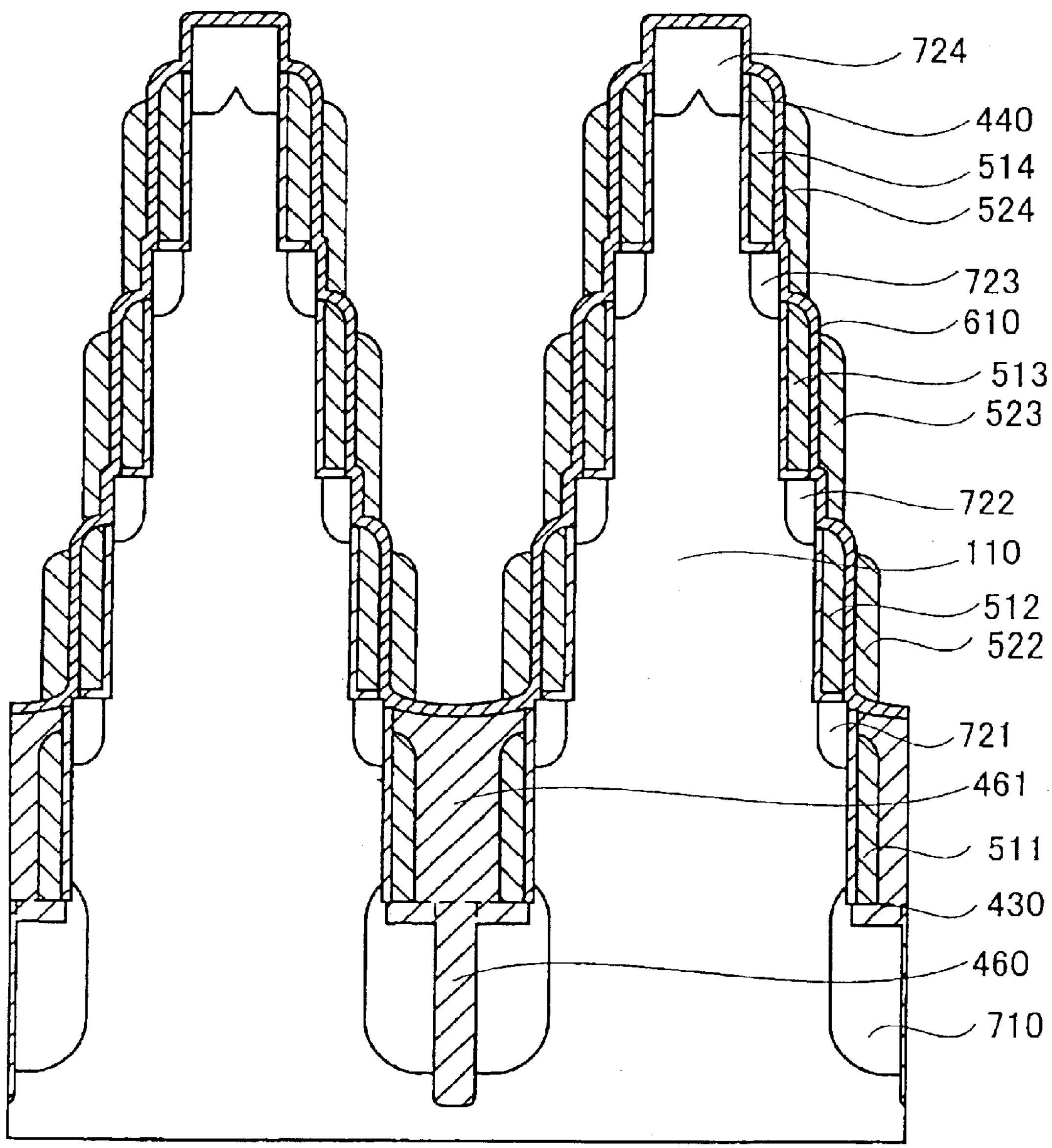

Thereafter, for example, by anisotropic etching, the polysilicon film 520 is formed in the form of sidewalls on the sidewalls of the polysilicon films 512, 513 and 514 in the tiers of the island-like semiconductor layer 110 with intervention of the interlayer insulating film 610, whereby separate polysilicon films 522, 523 and 524 are formed at the same time (FIG. 280 and FIG. 308). At this time, by setting the intervals between the island-like semiconductor layers in the A–A' direction to a predetermined value or less, each of the polysilicon films 522, 523 and 524 as a third wiring layer to be a control gate line is formed continuously in the direction without using a masking process.

Figure 281:
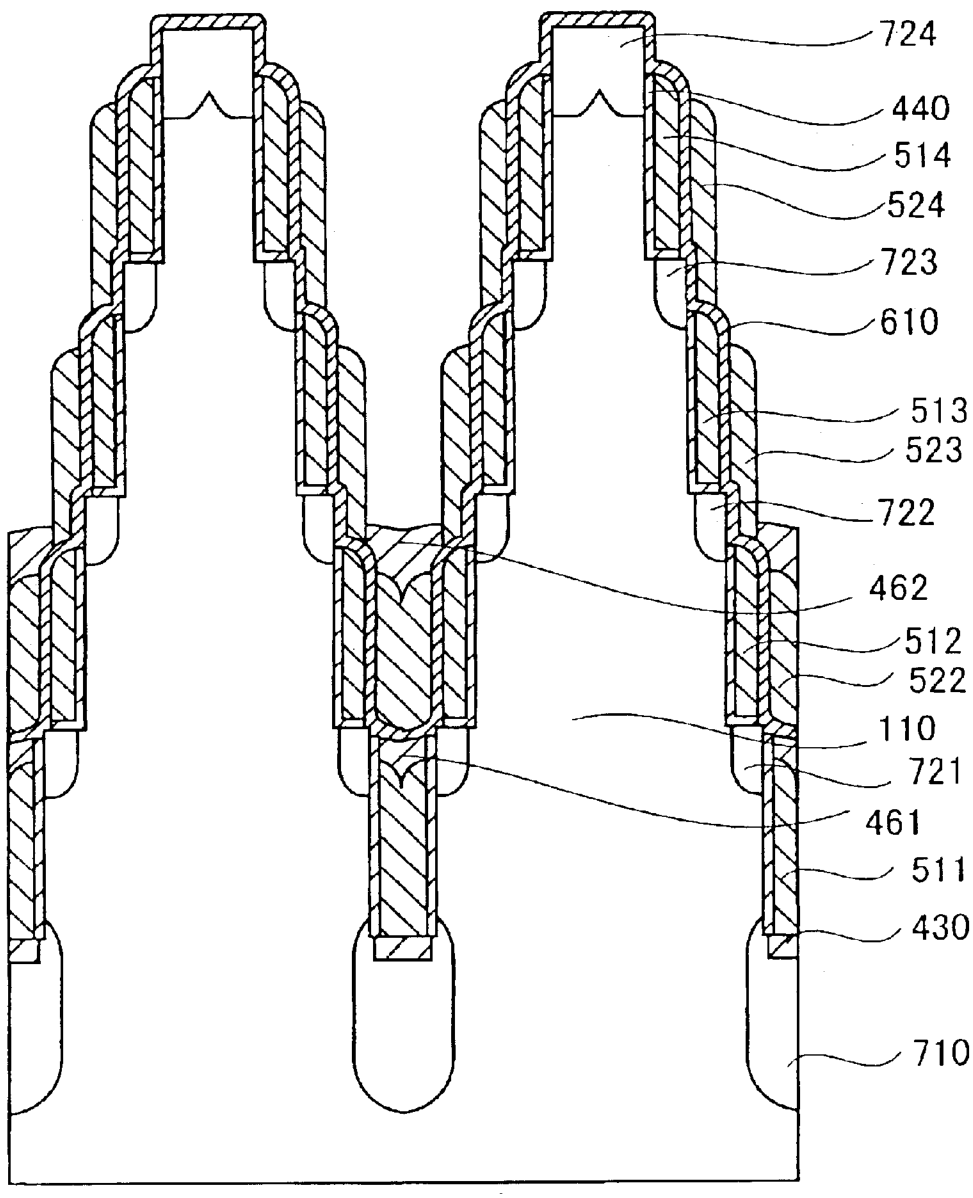
Figure 309:
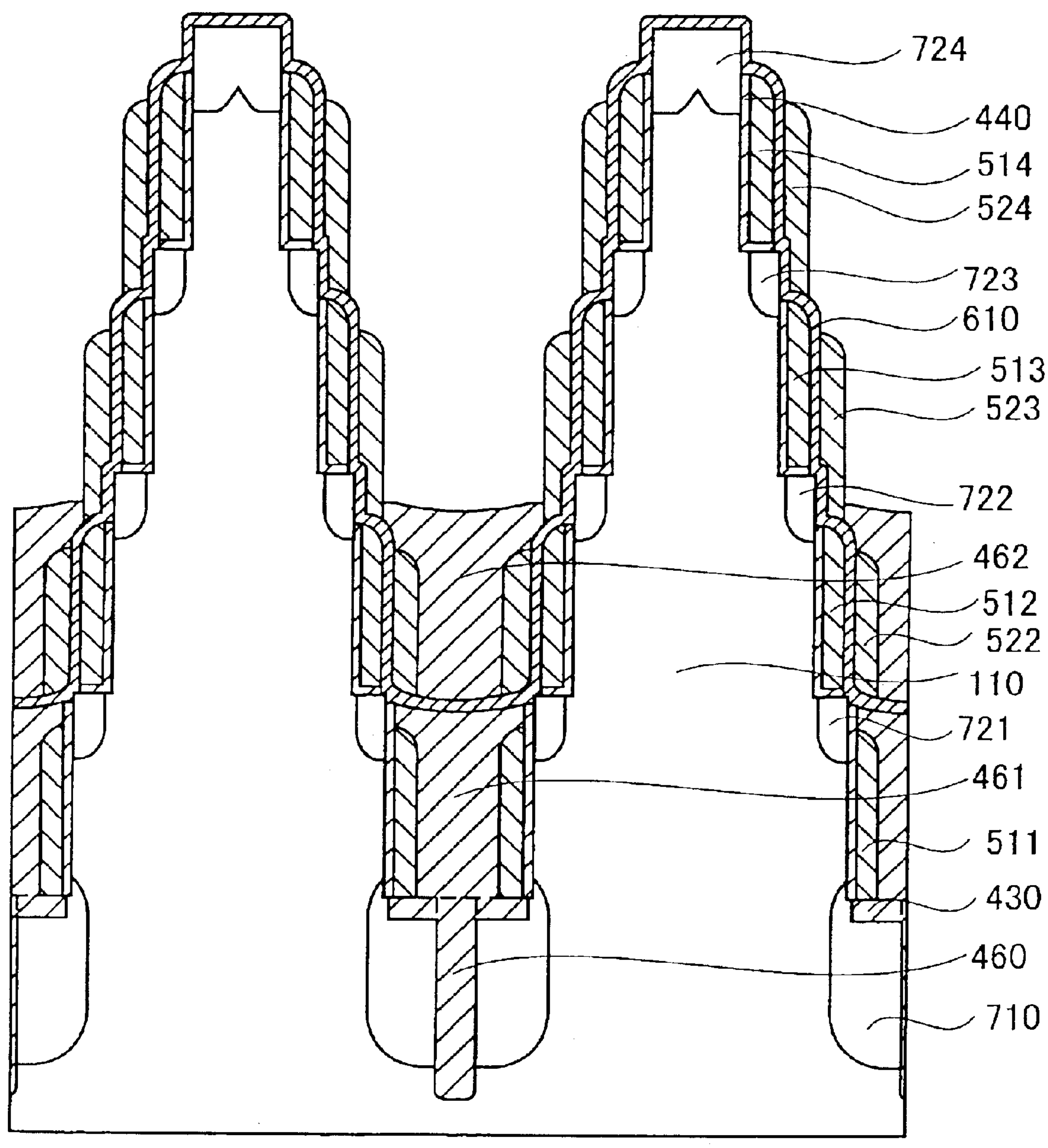

Next, a silicon oxide film 462, for example, is deposited to about 20 to 200 nm as a seventh insulating film and is isotropically etched to be buried and cover the top and side of the polysilicon film 522 (FIG. 281 and FIG. 309).

Figure 282:
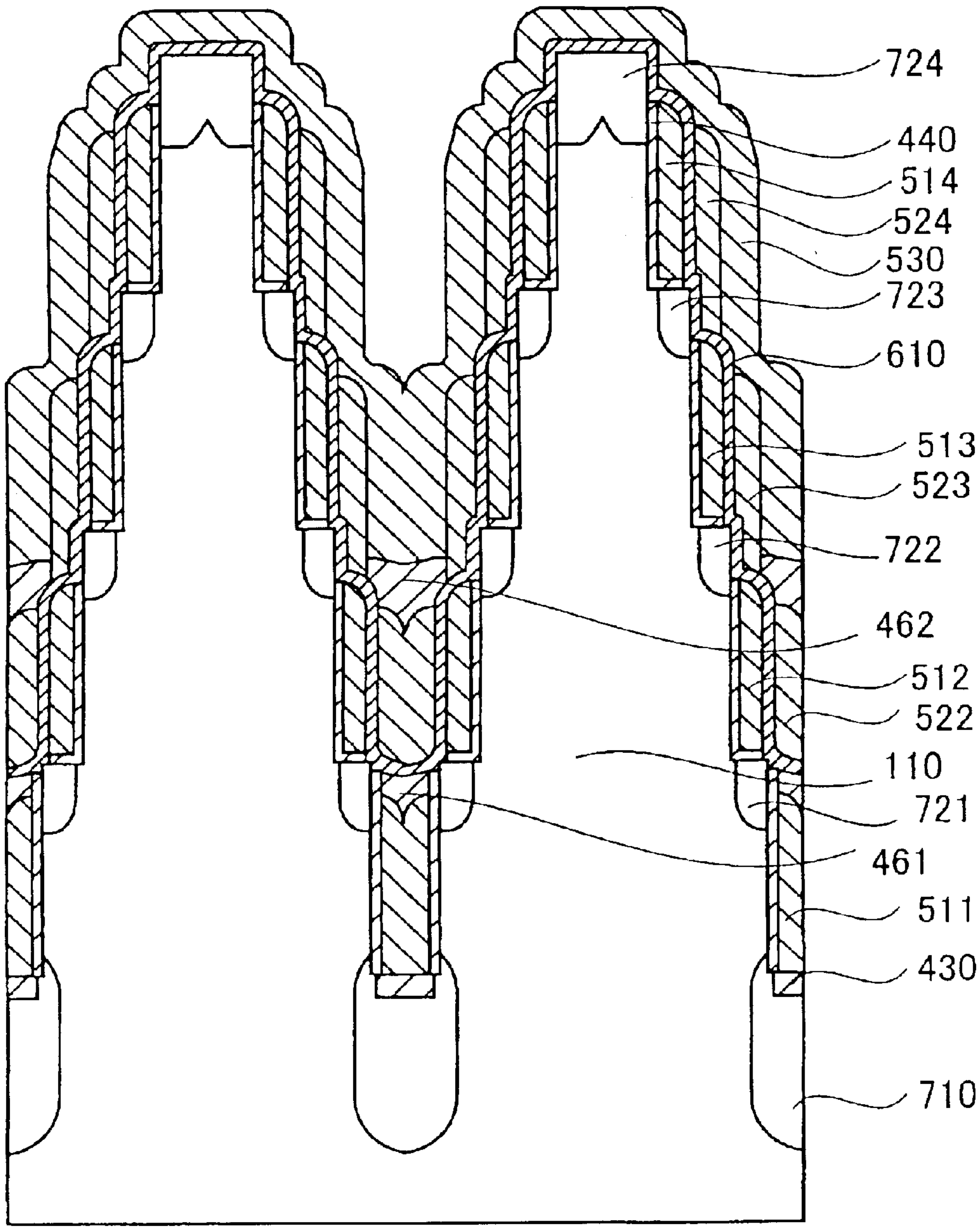
Figure 310:
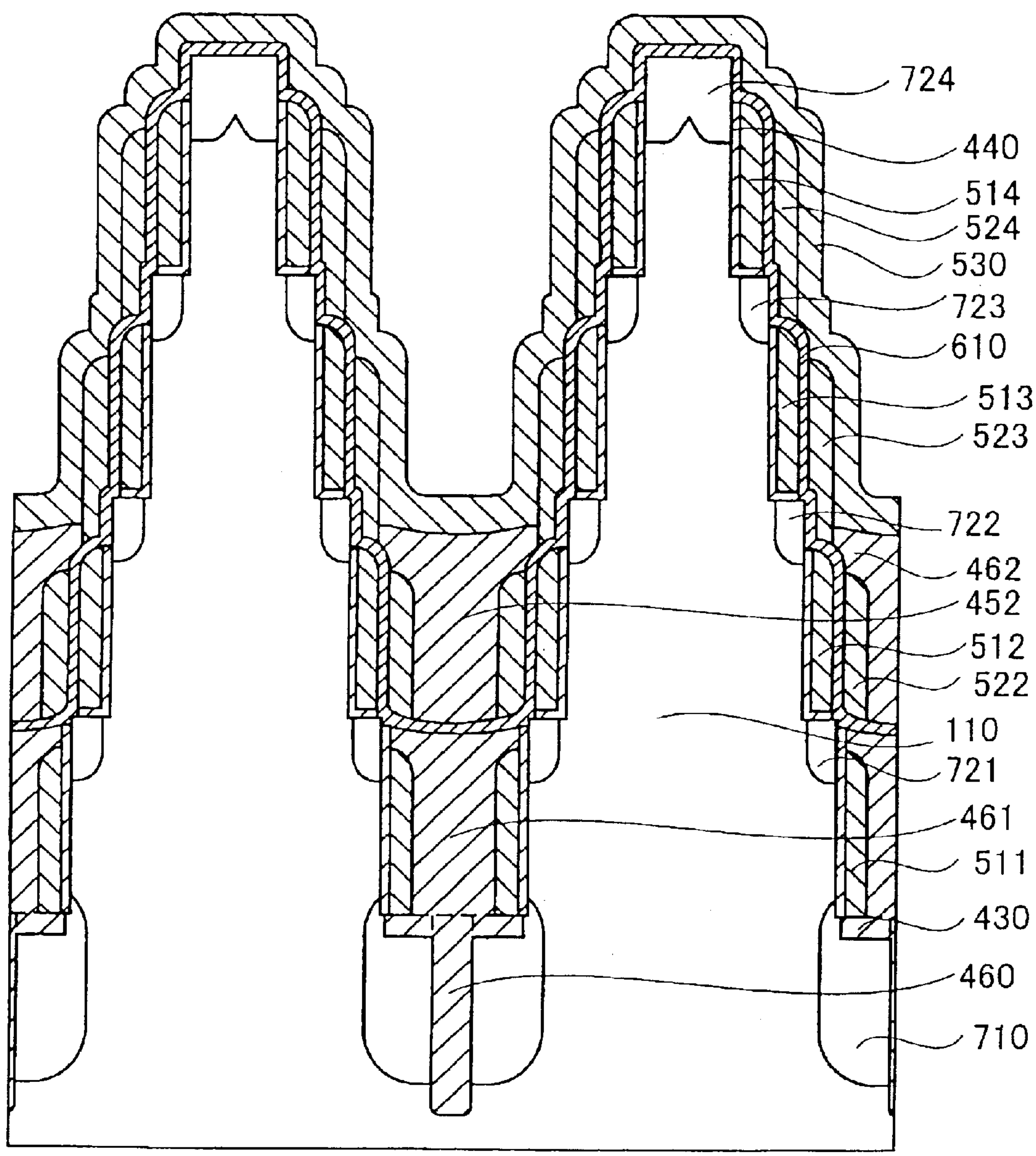

Subsequently, a polysilicon film 533, for example, is deposited to 15 to 150 nm as a third conductive film (FIG. 282 and FIG. 310).

Figure 283:
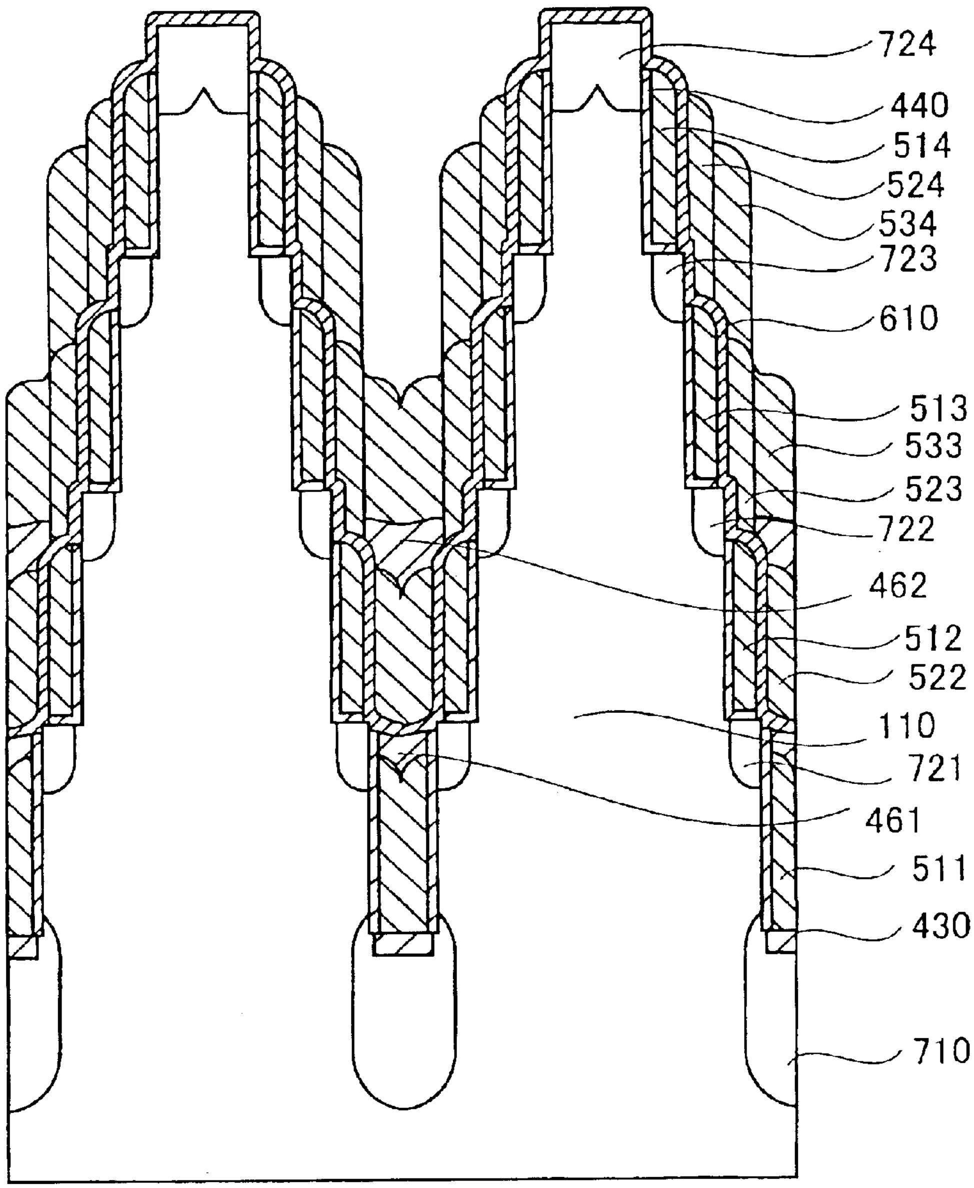
Figure 311:
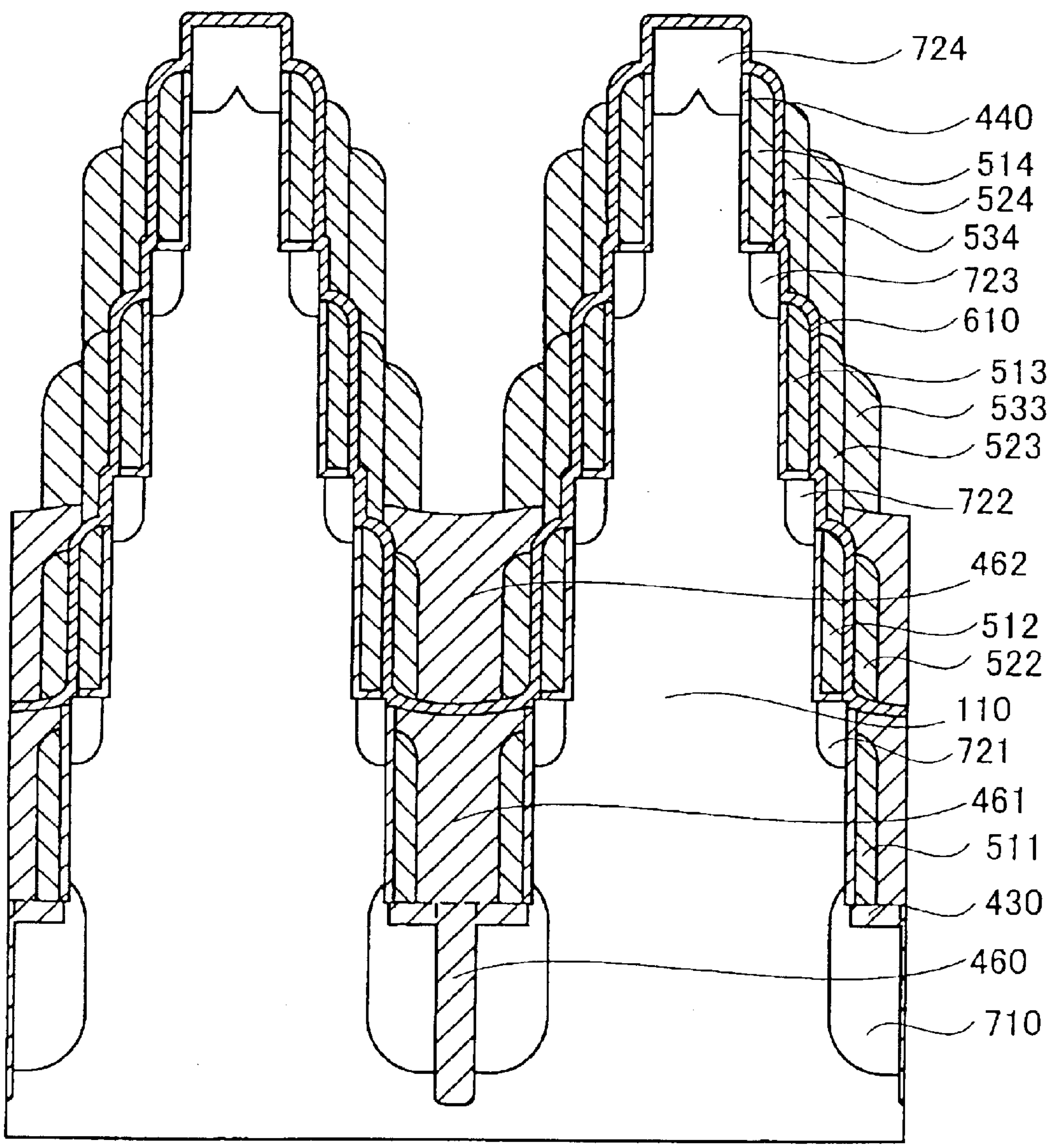

Thereafter, for example, by anisotropic etching, the polysilicon film 530 is formed in the form of sidewalls on the sidewalls of the polysilicon films 523 and 524 in the tiers of the island-like semiconductor layer 110, whereby separate polysilicon films 533 and 534 are formed at the same time (FIG. 283 and FIG. 311). At this time, by setting the intervals between the island-like semiconductor layers in the A–A' direction to a predetermined value or less, the polysilicon film 530 as a third wiring layer to be a control gate line is formed continuously in the direction without using a masking process.

Figure 284:
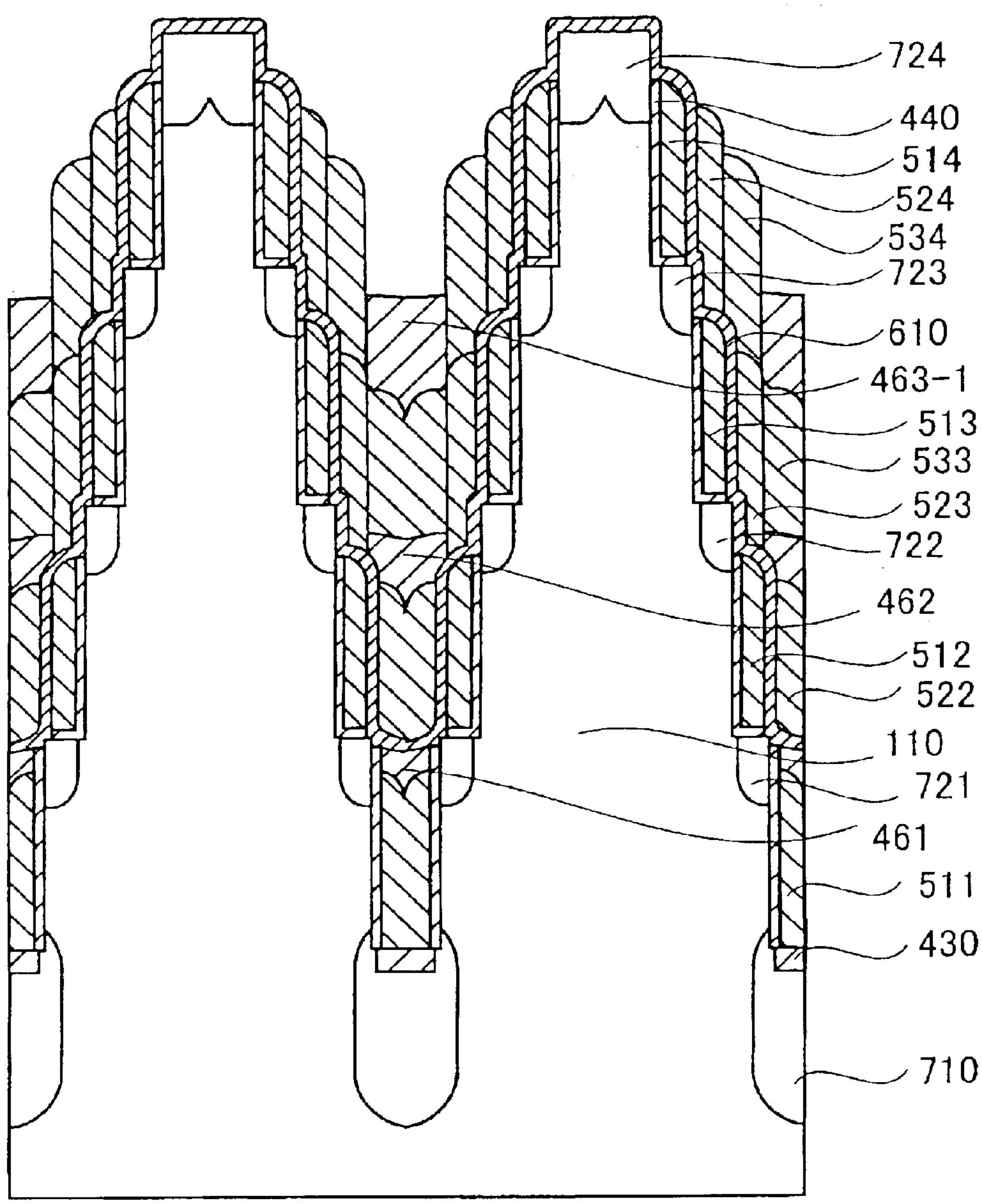
Figure 312:
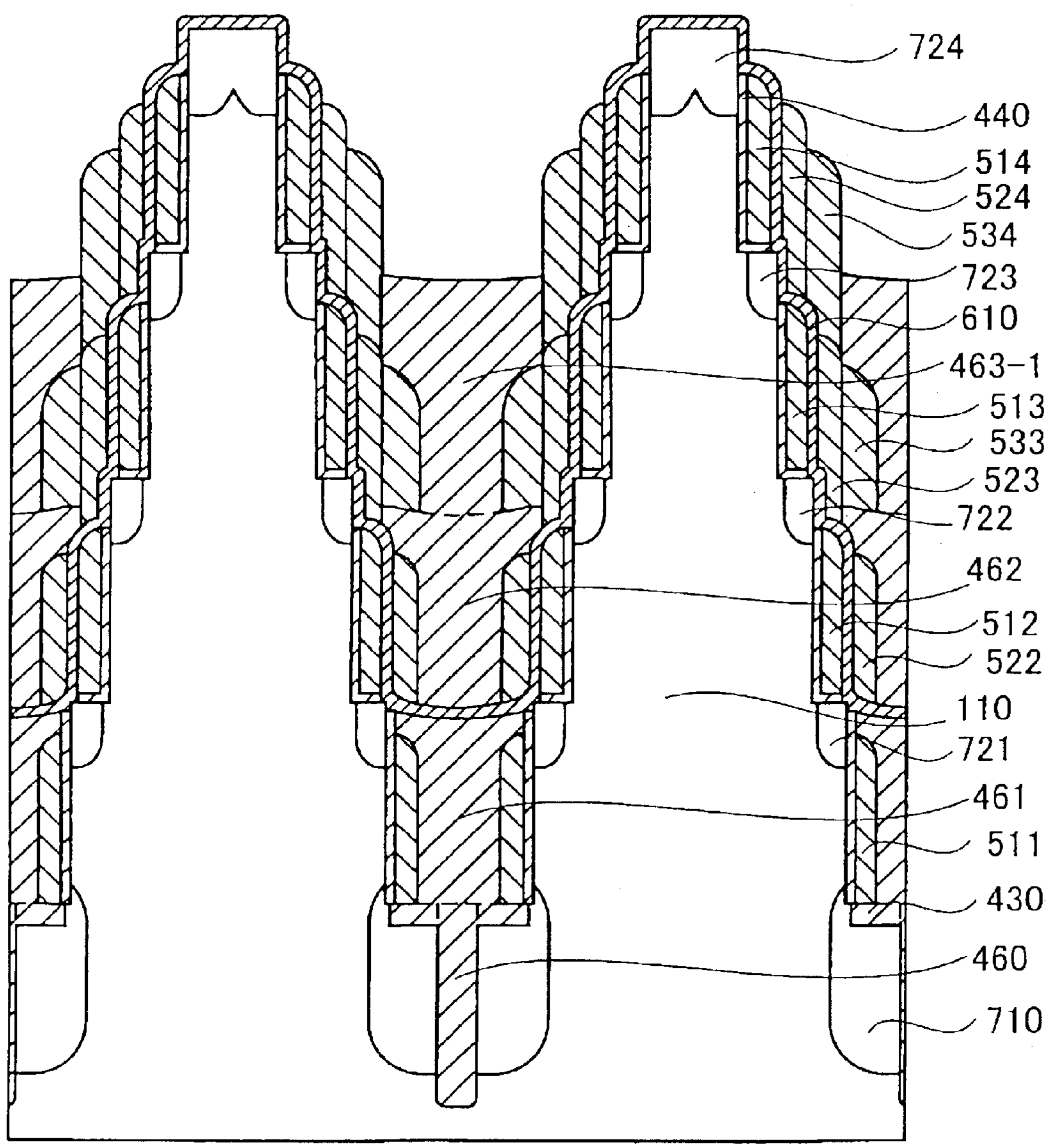

Next, a silicon oxide film 463-1, for example, is deposited to about 20 to 400 nm as a seventh insulating film and is isotropically etched to be buried and cover the polysilicon film 523 and the top and side of the polysilicon film 533 (FIG. 284 and FIG. 312).

Figure 285:
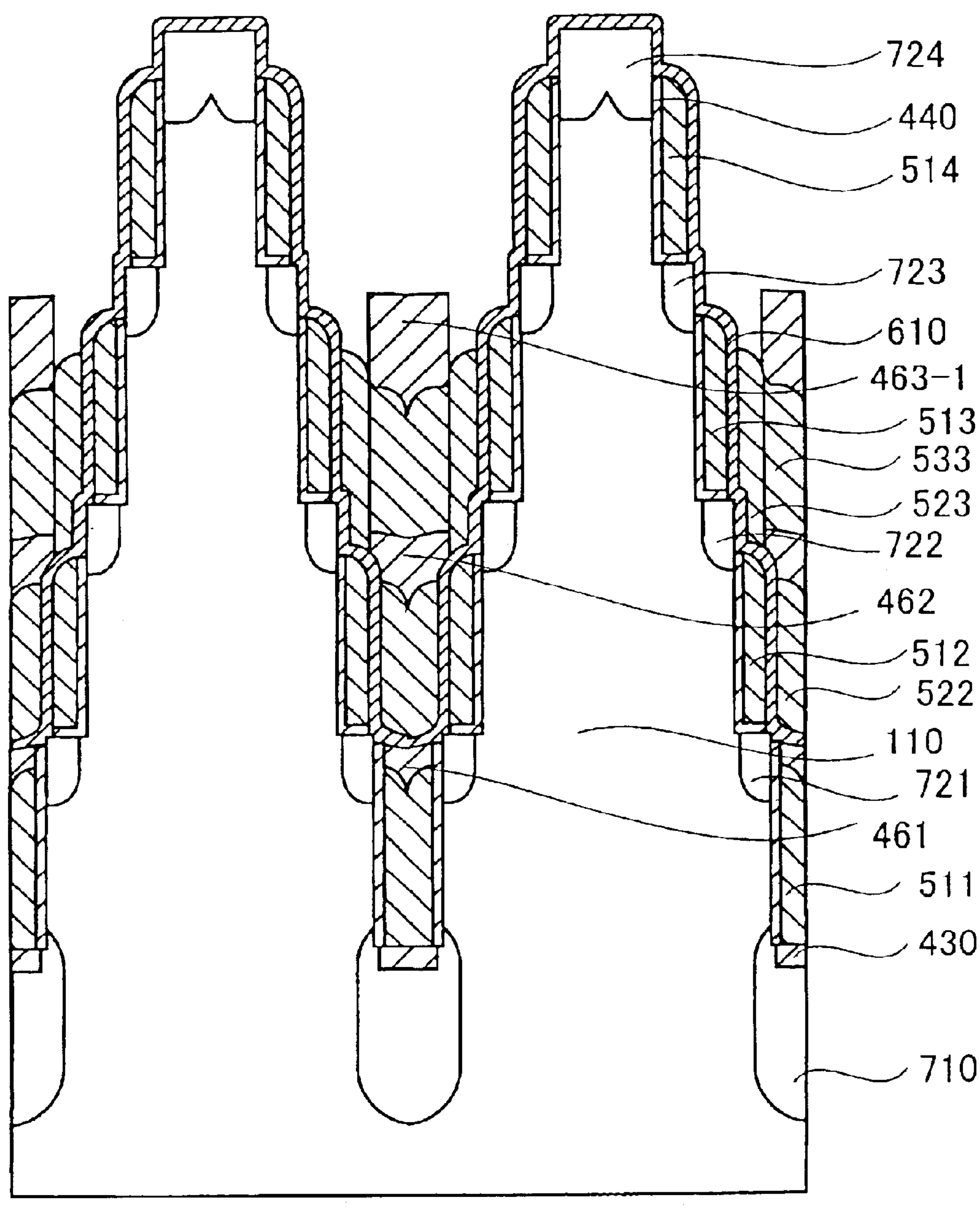
Figure 313:
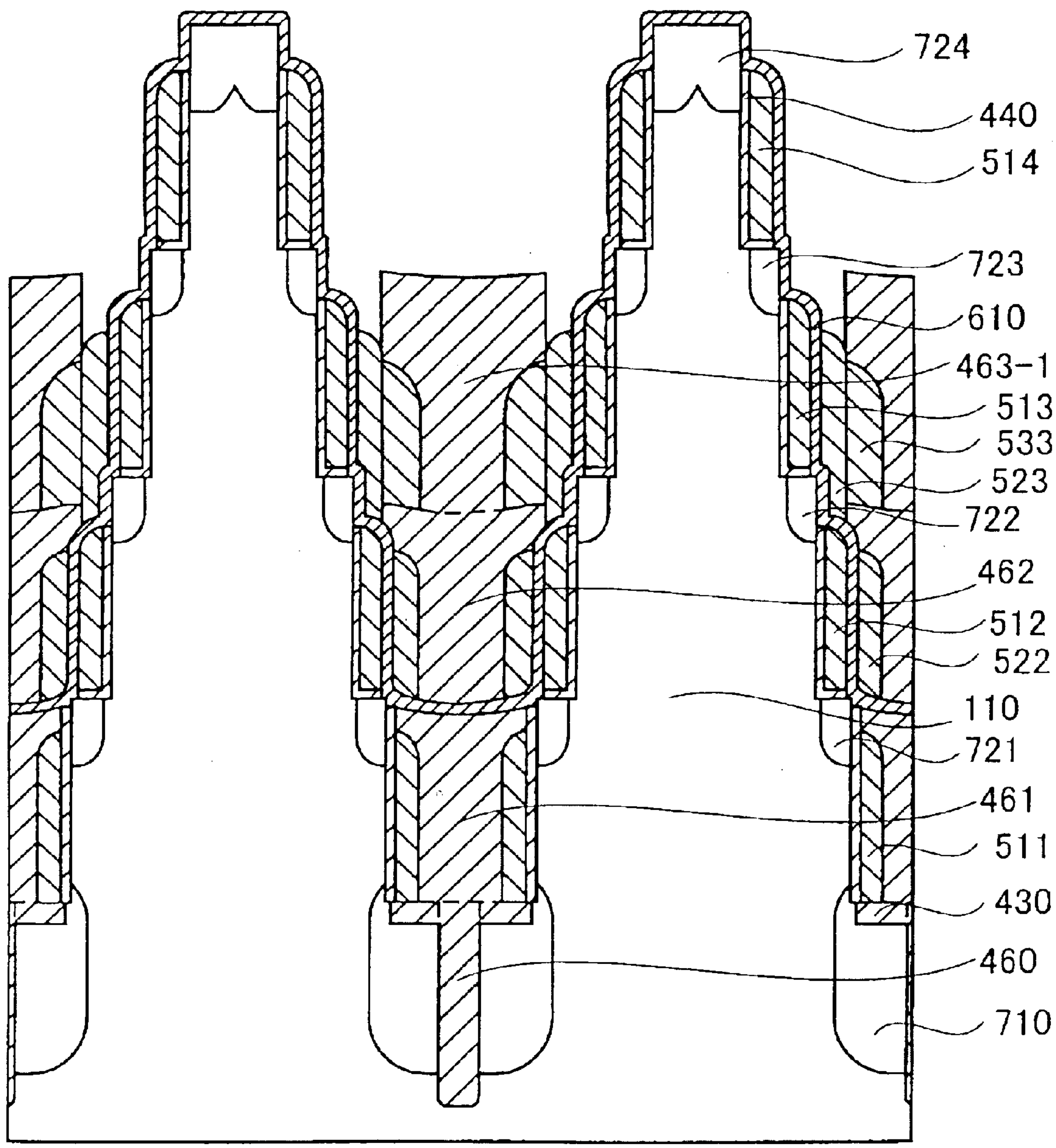

Subsequently, the polysilicon film 524 and the polysilicon film 534 exposed with respect to the silicon oxide film 463-1 are selectively removed, for example, by isotropic etching (FIG. 285 and FIG. 313). At this isotropic etching, a part of the polysilicon film 523, a part of the polysilicon film 533 or both may be etched, or alternatively, only a part of the polysilicon film 524 and a part of the polysilicon film 534 may be etched so long as the second and third wiring layers adjacent vertically are electrically insulated.

Figure 286:
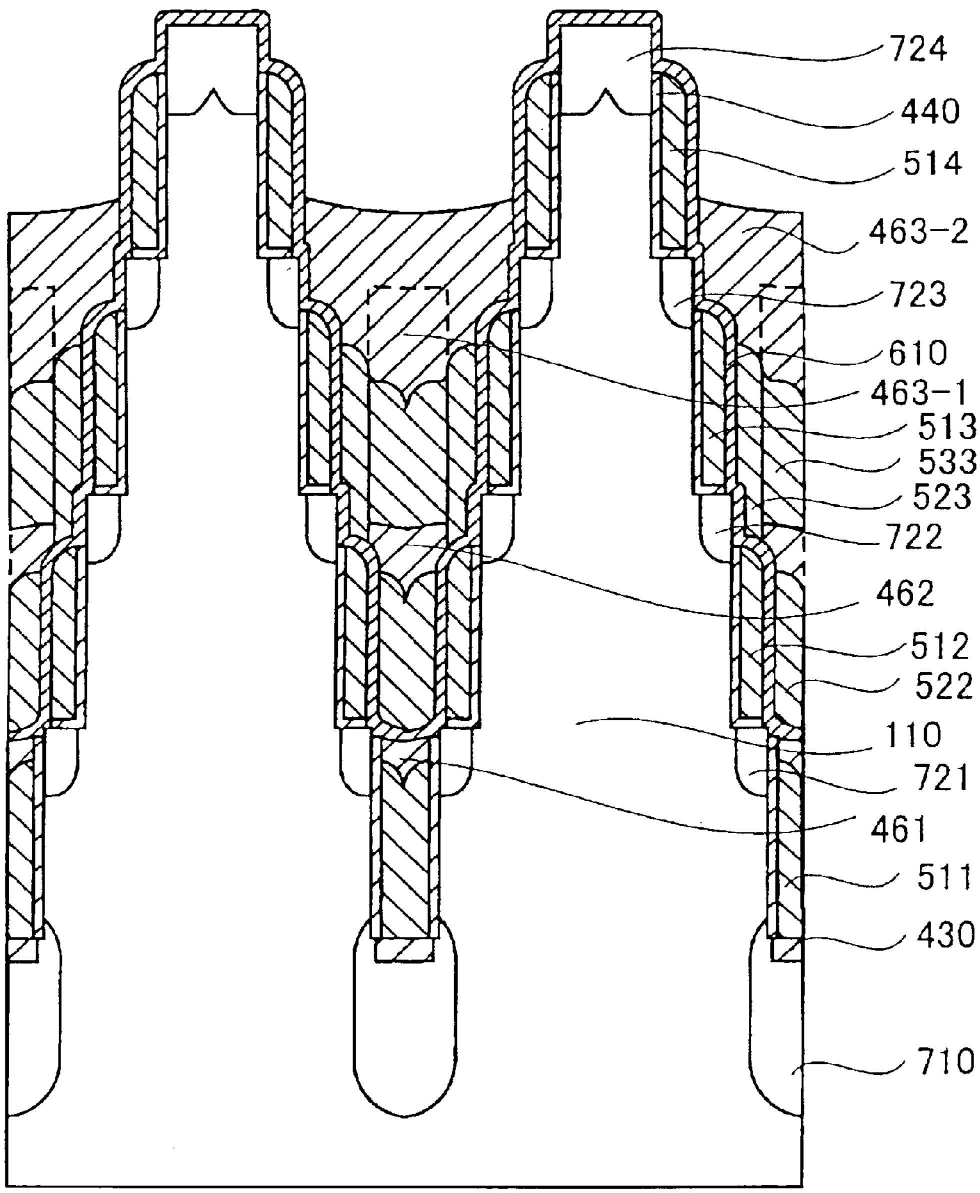
Figure 314:
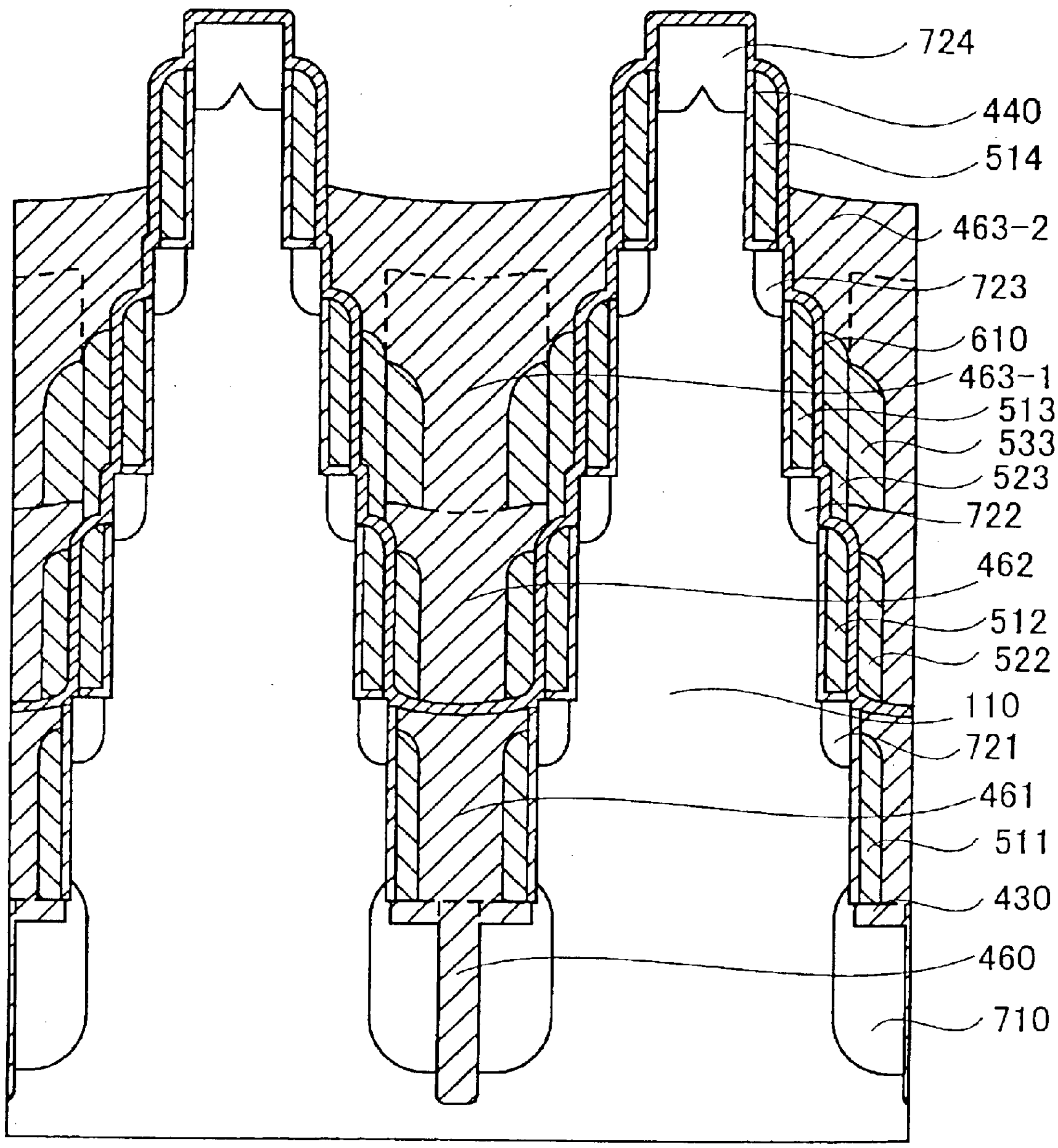

Next, a silicon oxide film 463-2, for example, is deposited to about 20 to 400 nm as a seventh insulating film and is isotropically etched to be buried and cover the top of the polysilicon film 523 (FIG. 286 and FIG. 314).

Figure 287:
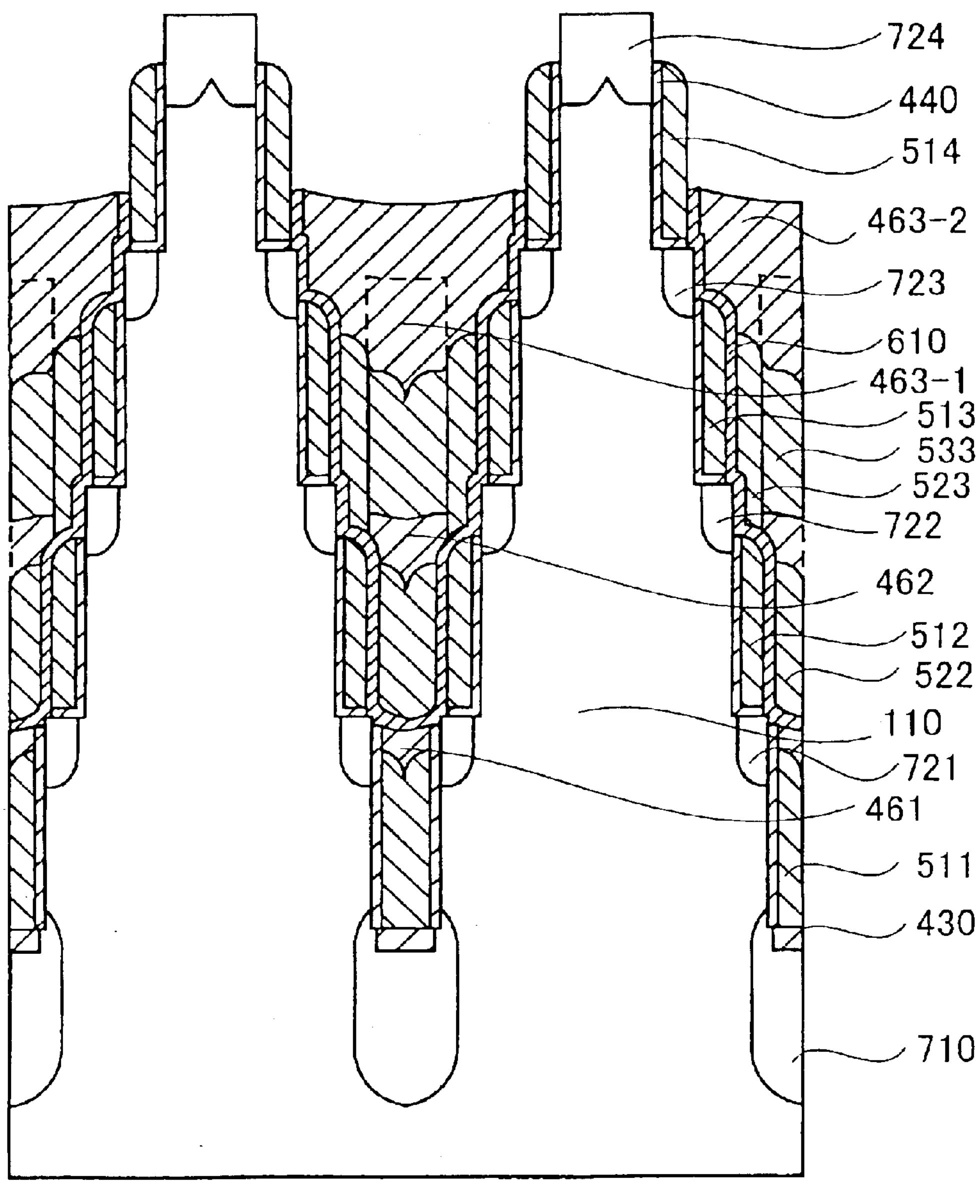
Figure 315:
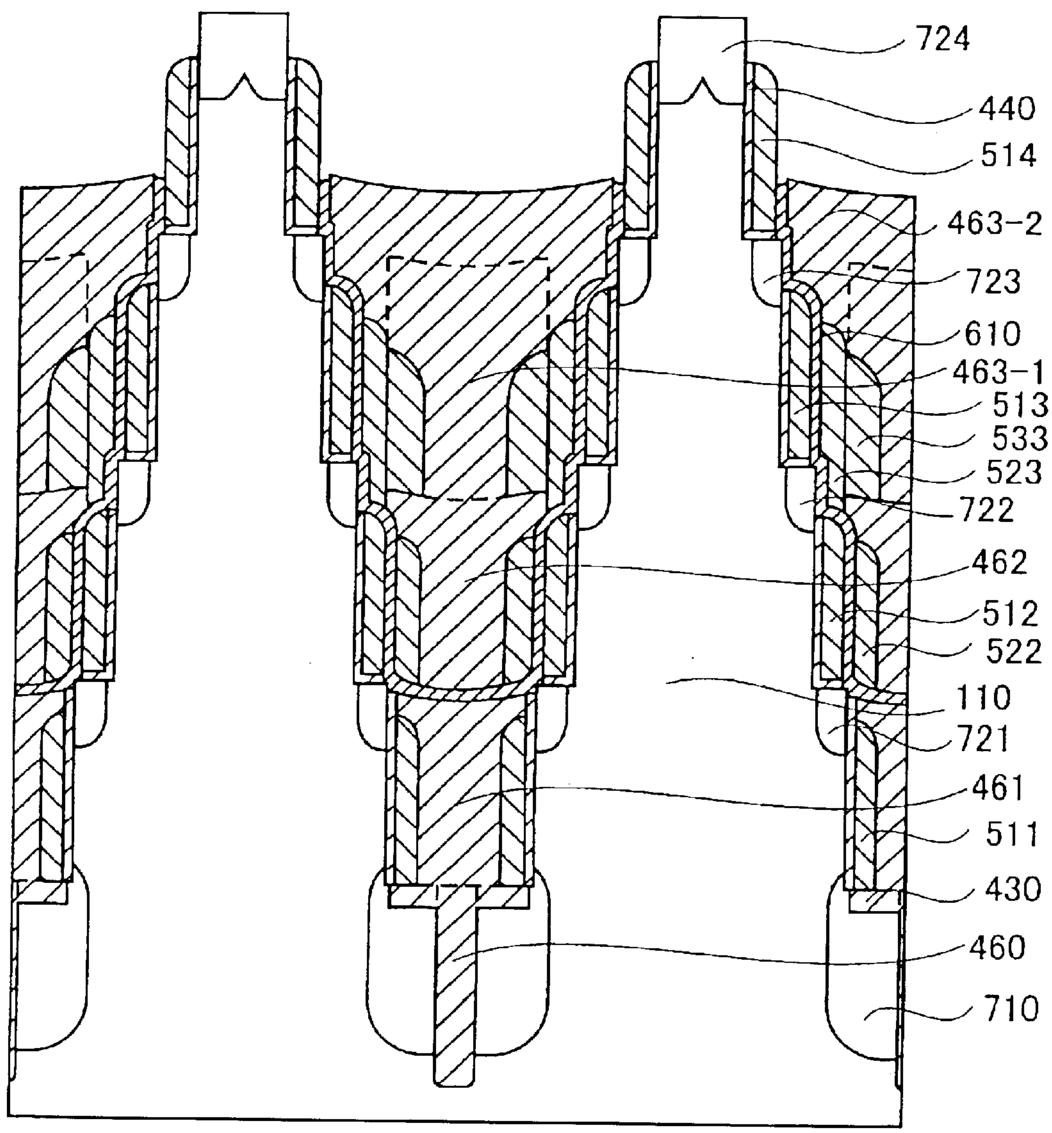

Thereafter, the interlayer insulating film 610 exposed with respect to the silicon oxide film 463-2 are removed to expose at least a part of the selection gate, i.e., the polysilicon film 514 formed on the top of the island-like semiconductor layer 110 and the uppermost tier of the island-like semiconductor layer (FIG. 287 and FIG. 315).

Figure 288:
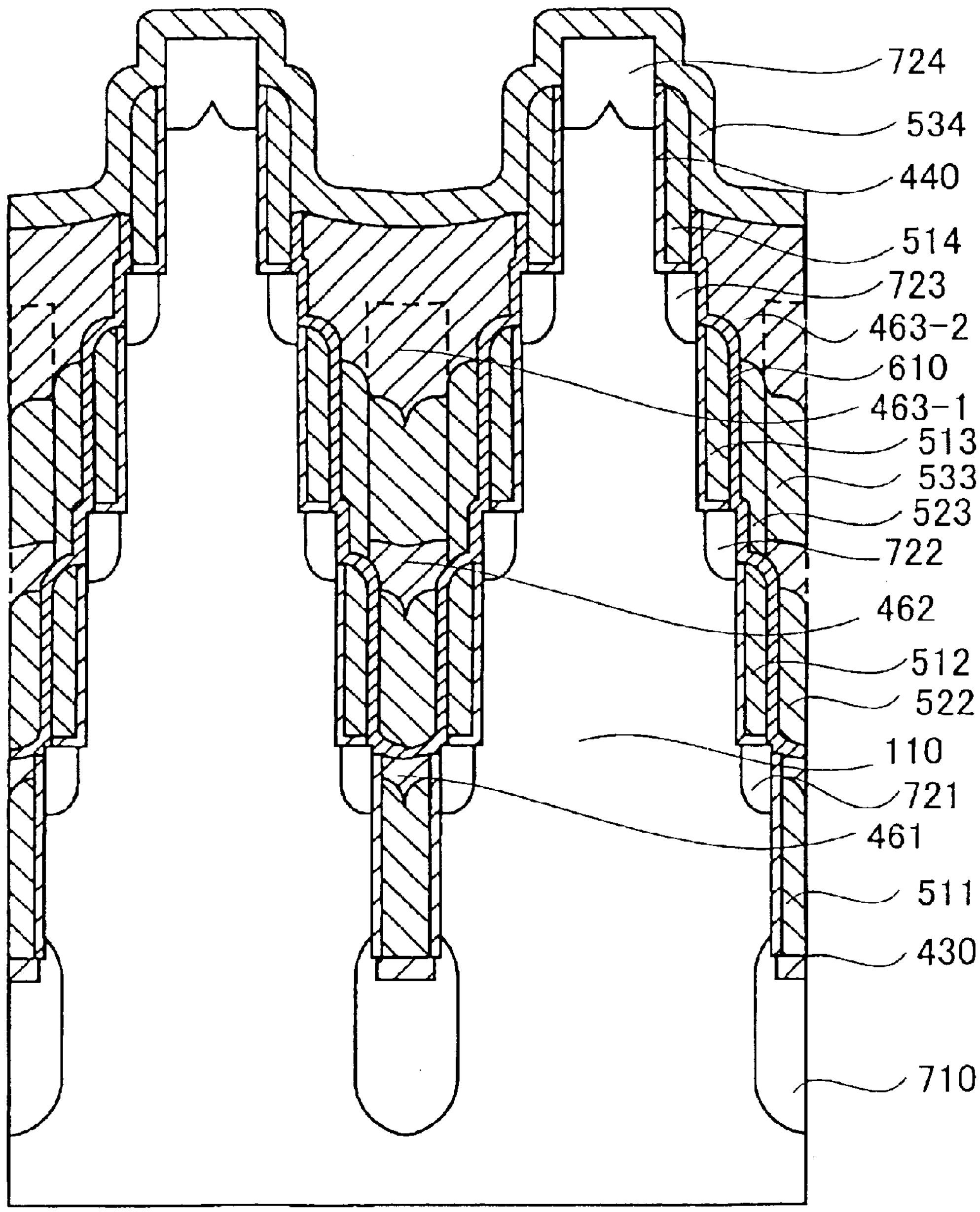
Figure 316:
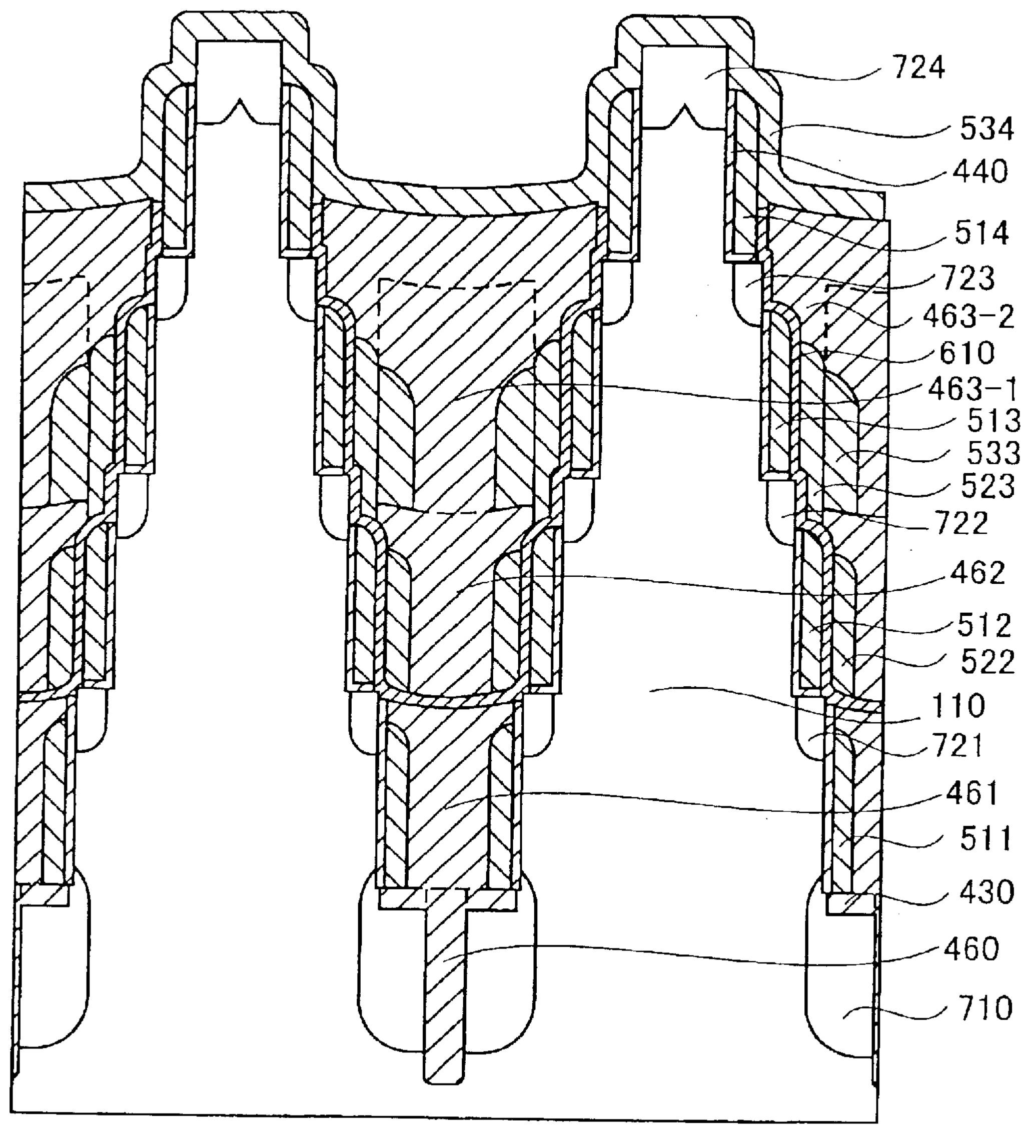

Subsequently, a polysilicon film 534, for example, is deposited to 15 to 150 nm as a third conductive film (FIG. 288 and FIG. 316).

Figure 289:
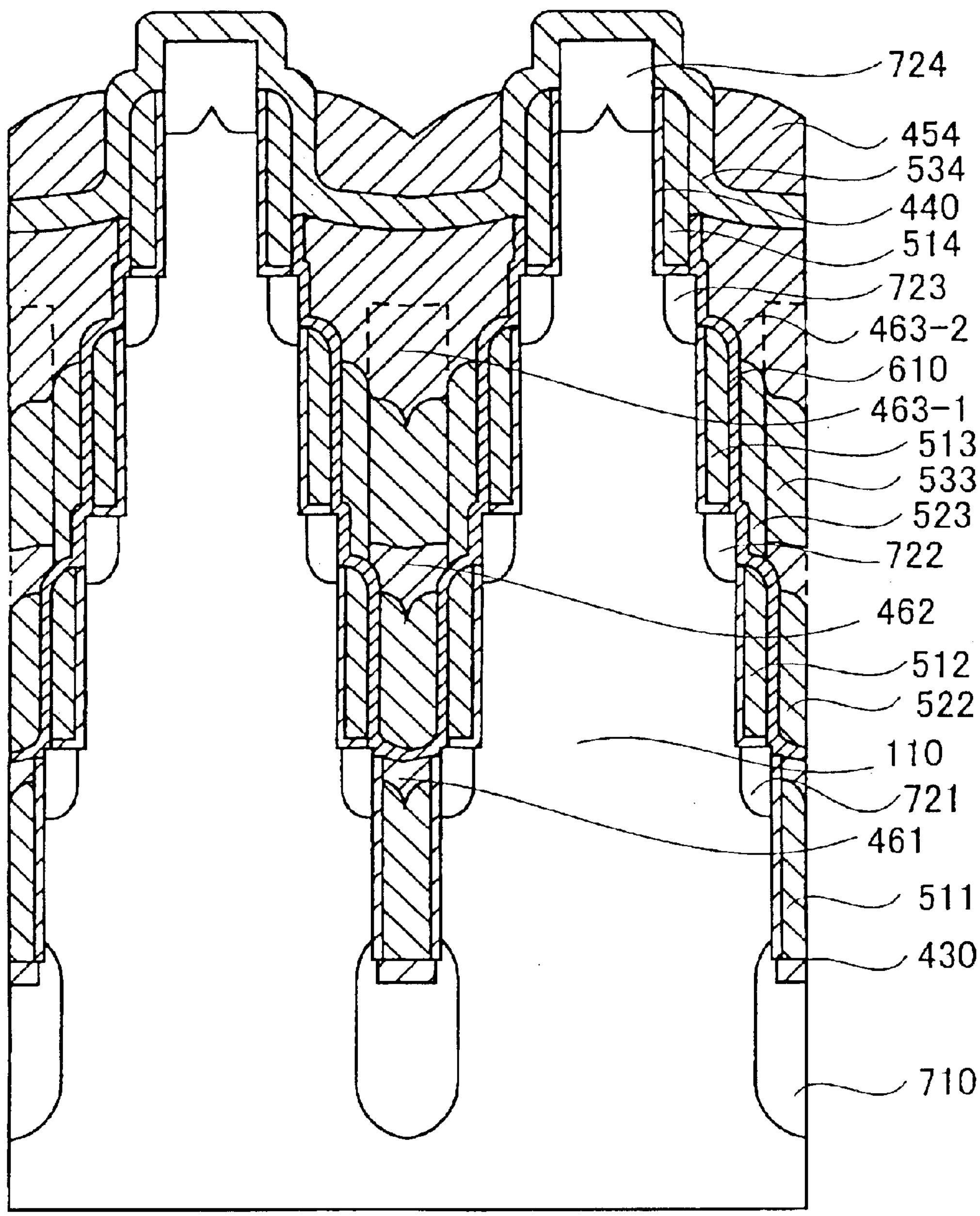
Figure 317:
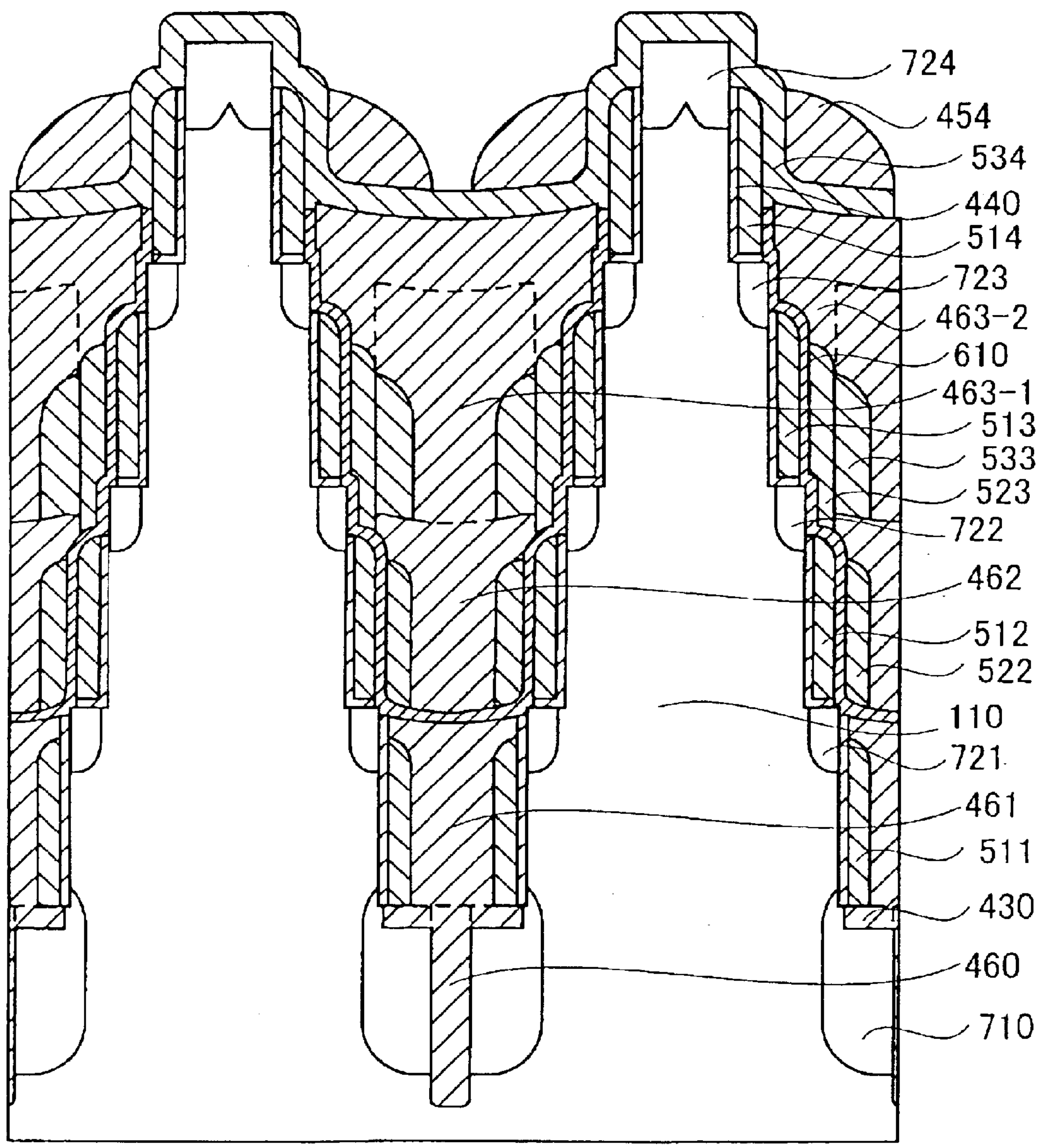

Thereafter, a silicon oxide film 454, for example, is deposited to 20 to 200 nm as a sixth insulating film and is formed in the sidewall form on the sidewall of the polysilicon film 534 formed in a projection form by RIE (FIG. 289 and FIG. 317). By setting the intervals between the island-like semiconductor layers in the A–A' direction of FIG. 1 to a predetermined value or less or by adjusting the thickness of the deposited silicon oxide film 454, the silicon oxide film 454 is connected continuously in the A–A' direction of FIG. 1 and separated in the B–B' direction of FIG. 1.

Figure 290:
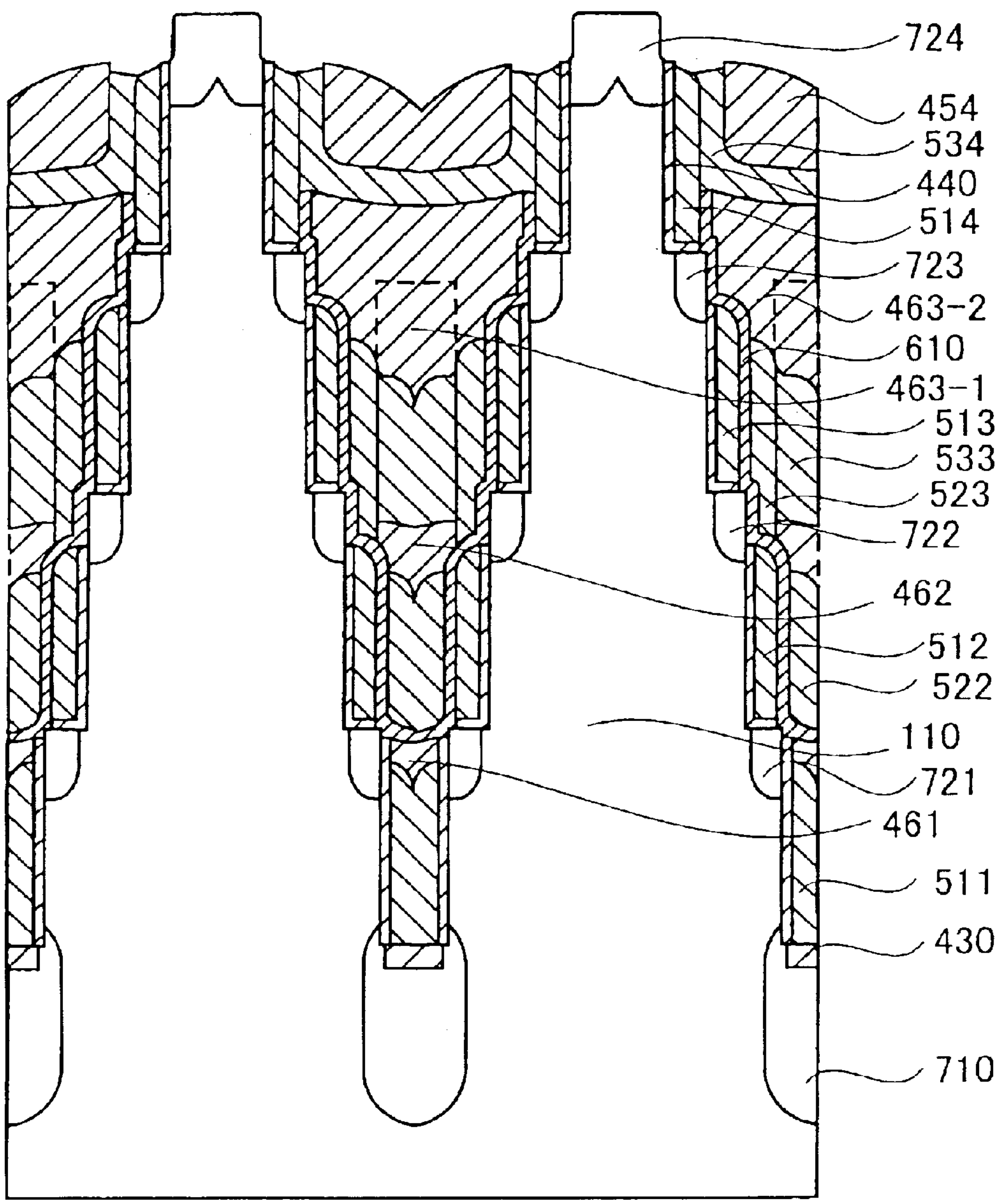
Figure 318:
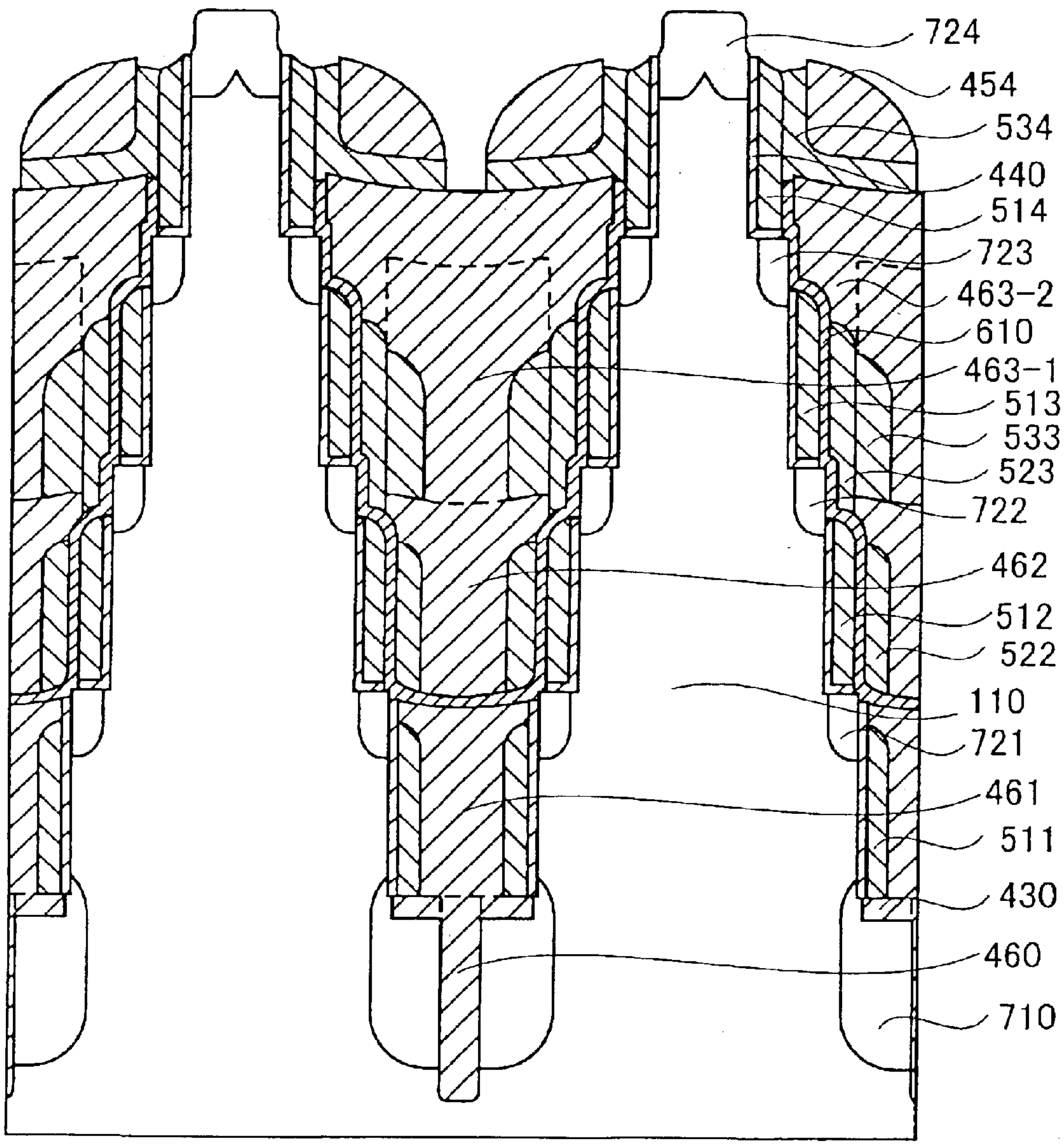

Subsequently, the polysilicon layer 534 exposed with respect to the silicon oxide film 454 is selectively removed by isotropic etching (FIG. 290 and FIG. 318). At this time, the selection gate, i.e., the polysilicon film 514, formed on the top of the island-like semiconductor layer 110 and on the uppermost tier of the island-like semiconductor layer 110 are partially etched. However, it is sufficient that the height of the etched top of the island-like semiconductor layer 110 is higher than the top end of the polysilicon film 534 as the third conductive film after etching. By this isotropic etching, a second wiring layer to be a selection gate line continuous in the direction is formed without using the masking process.

Next, a silicon oxide film 464, for example, is deposited to about 20 to 400 nm as a seventh insulating film. The top of the island-like semiconductor layer 110 provided with the impurity diffusion layer 724 is exposed by etch-back or by CMP. The impurity concentration in the top of the island-like semiconductor layer 110 is adjusted as required, for example, by ion implantation, and a fourth wiring layer 840 is connected to the top of the island-like semiconductor layer 110 in a direction crossing the second or third wiring layer.

Figure 291:
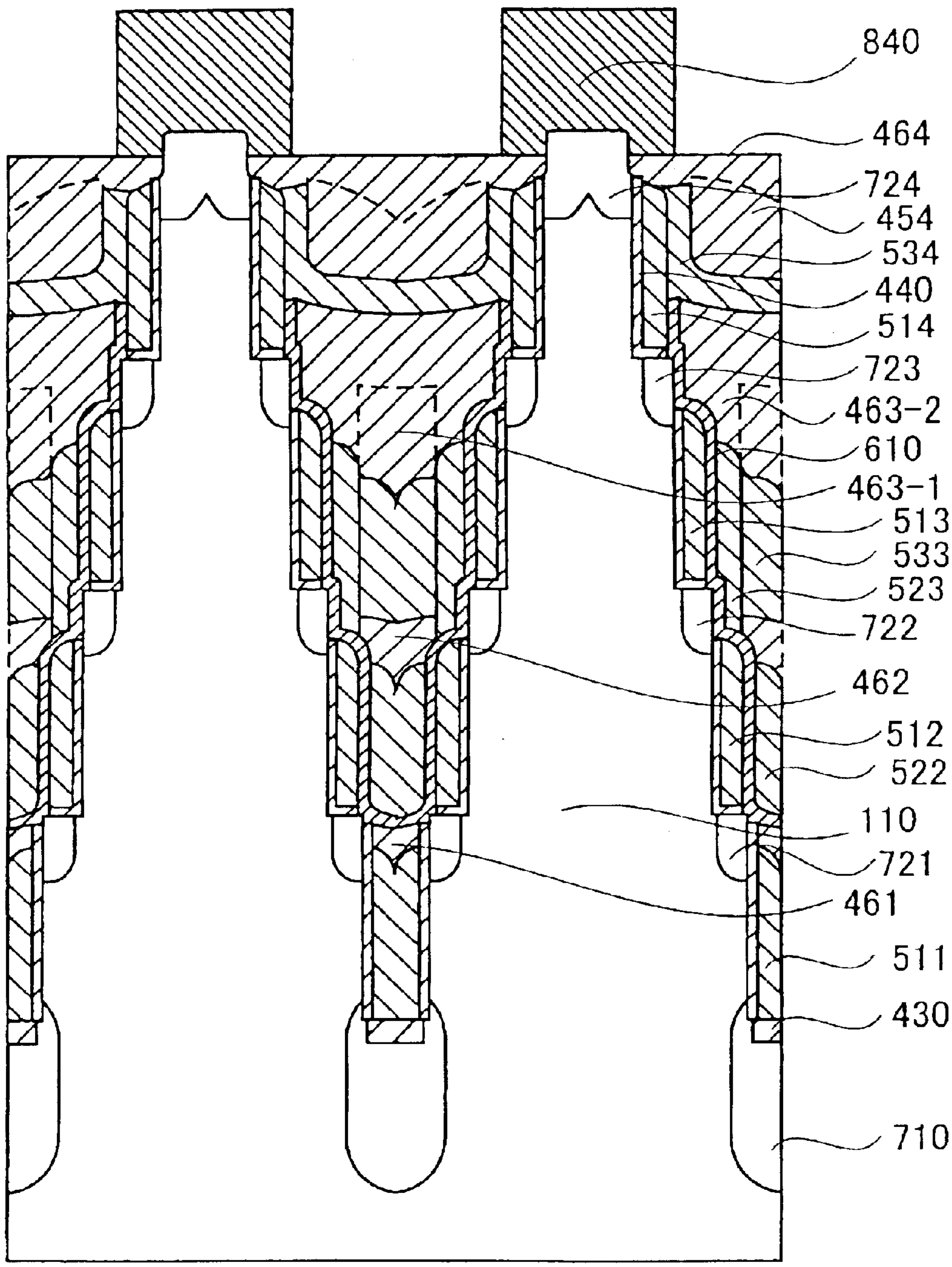
Figure 319:
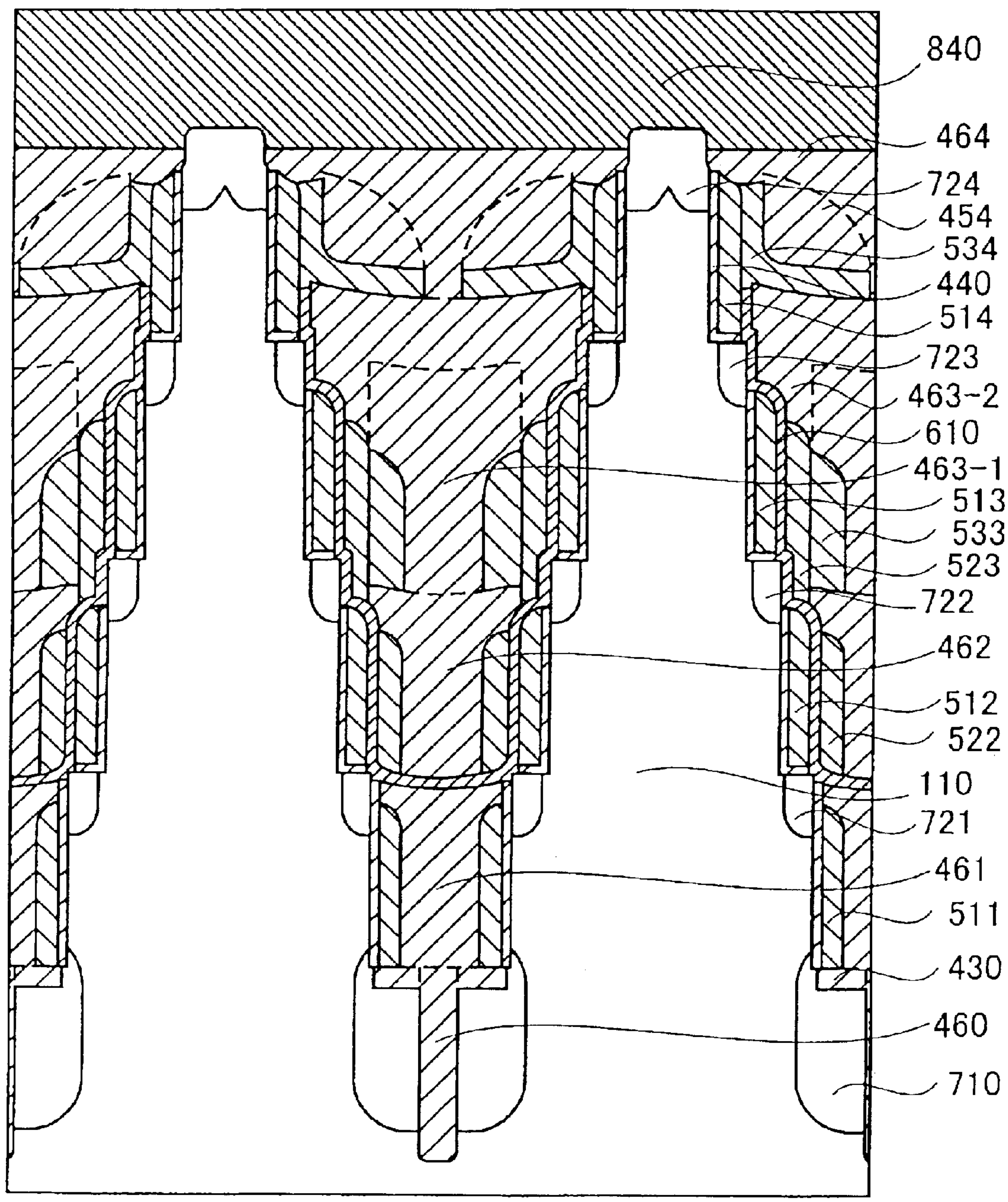

Thereafter, an interlayer insulating film is formed by a known technique, and a contact hole and a metal wiring are formed. Thereby, a semiconductor memory is realized which has a memory function according to the state of a charge in the charge storage layer which is the floating gate made of the polysilicon film (FIG. 291 and FIG. 319).

Thus, the same effect as realized in Production Example 1 can be obtained. Furthermore, this production example has another advantage of reducing the number of production steps since the first, second and third wiring layers can be formed by separation in self-alignment without using a mask.

This production example is possible only where the island-like semiconductor layers are not disposed symmetrically to a diagonal. More particularly, by setting smaller the intervals between adjacent island-like semiconductor layers in the direction of the second and third wiring layers than those in the direction of the fourth wiring layer, it is possible to automatically obtain the wiring layers which are discontinuous in the direction of the fourth wiring layer and are continuous in the direction of the second and third wiring layers without using a mask. In contrast, if the island-like semiconductor layers are disposed symmetrically to a diagonal, for example, the wiring layers may be separated through patterning with use of resist films by photolithography.

PRODUCTION EXAMPLE 5

The following shows an example for producing a semiconductor memory in which the third wiring layer is formed without forming an extra gate and the like at the selection gate at the uppermost tier.

FIGS. 320 to 344 and FIGS. 345 to 369 are sectional views taken on line A–A' and line B–B', respectively, of FIG. 1 showing a memory cell array of EEPROM.

Figure 320:
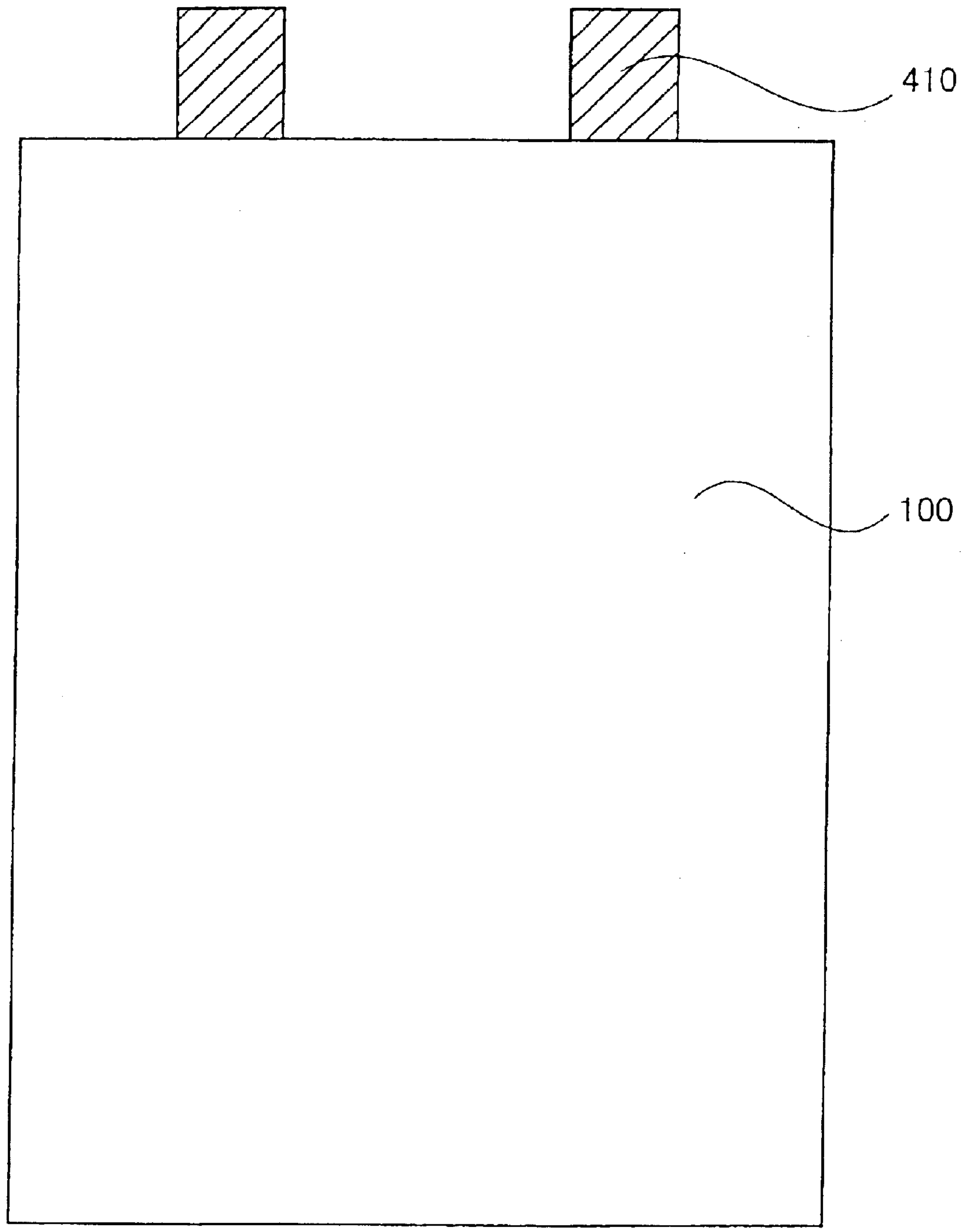
Figure 345:
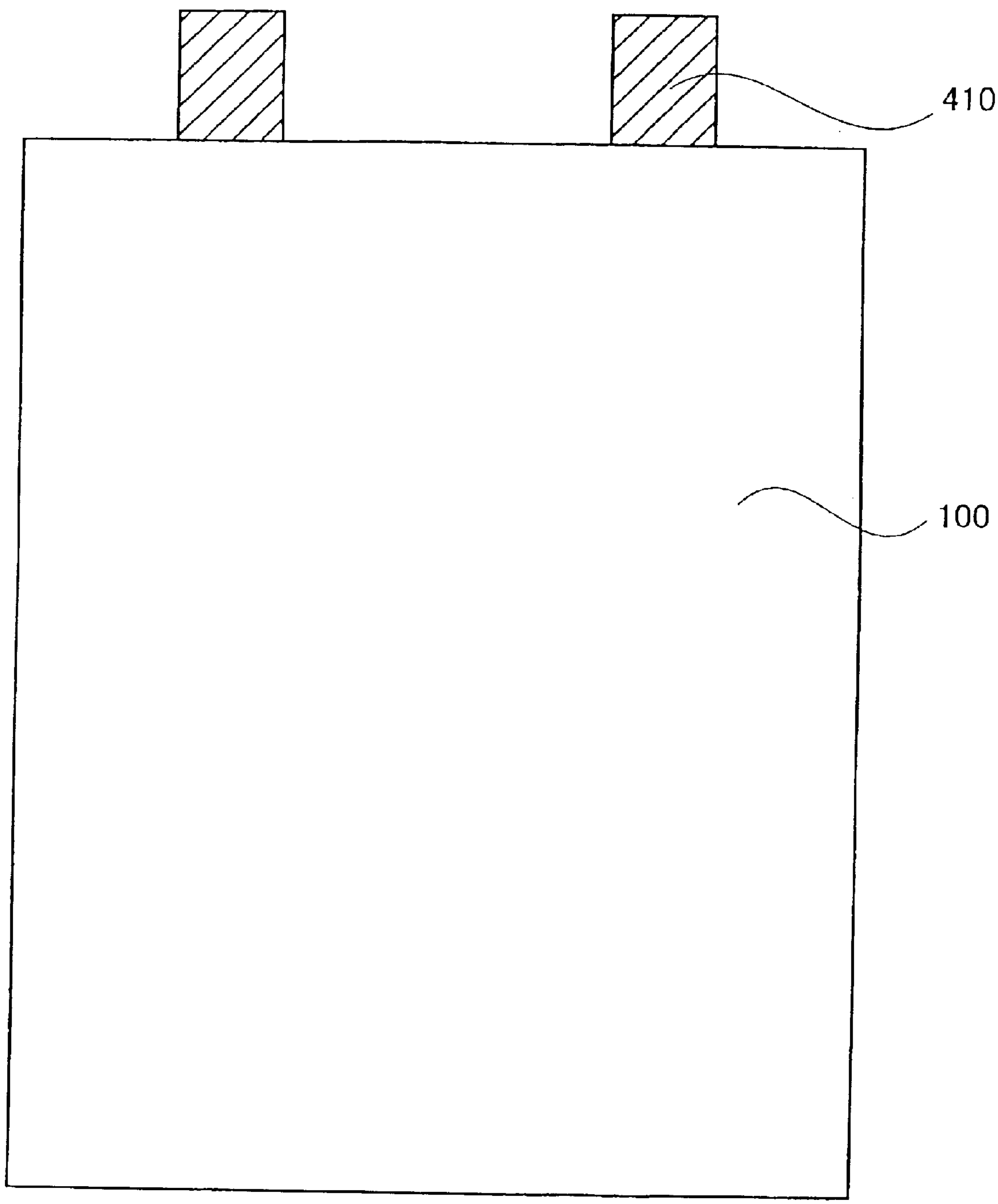

First, a silicon oxide film 410 is deposited to 200 to 2000 nm as a first insulating film to be a mask layer on the surface of a p-type silicon substrate 100 as a semiconductor substrate. Using as a mask a resist film R1 patterned by a known photolithography technique, the silicon oxide film 410 is etched by reactive ion etching (FIG. 320 and FIG. 345).

The silicon oxide film 410 may be, for example, a silicon nitride film, a conductive film, a laminate film of two or more kinds of materials, or any material that cannot be etched or exhibits a lower etch rate when the p-type silicon substrate 100 is etched by RIE.

Figure 321:
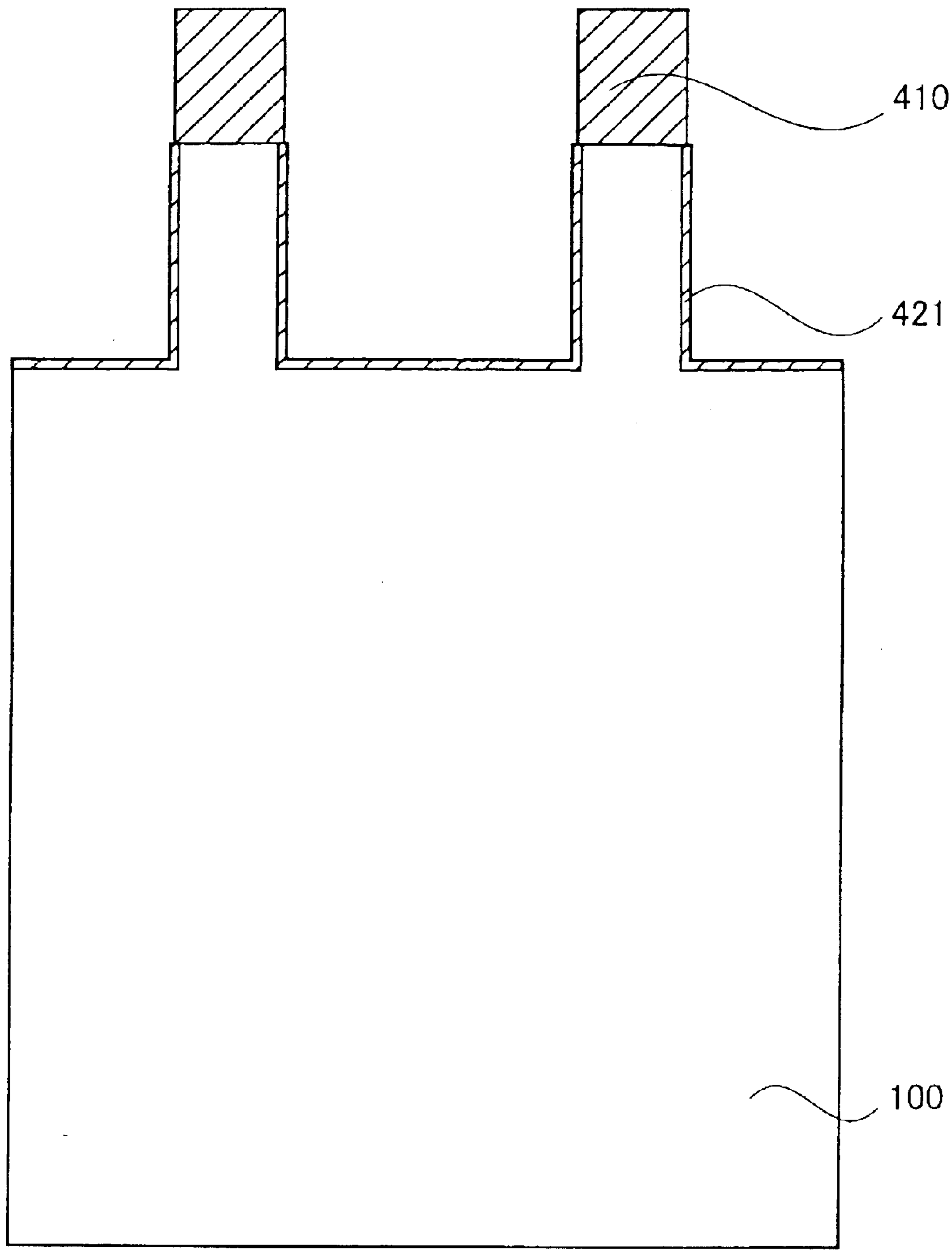
Figure 346:
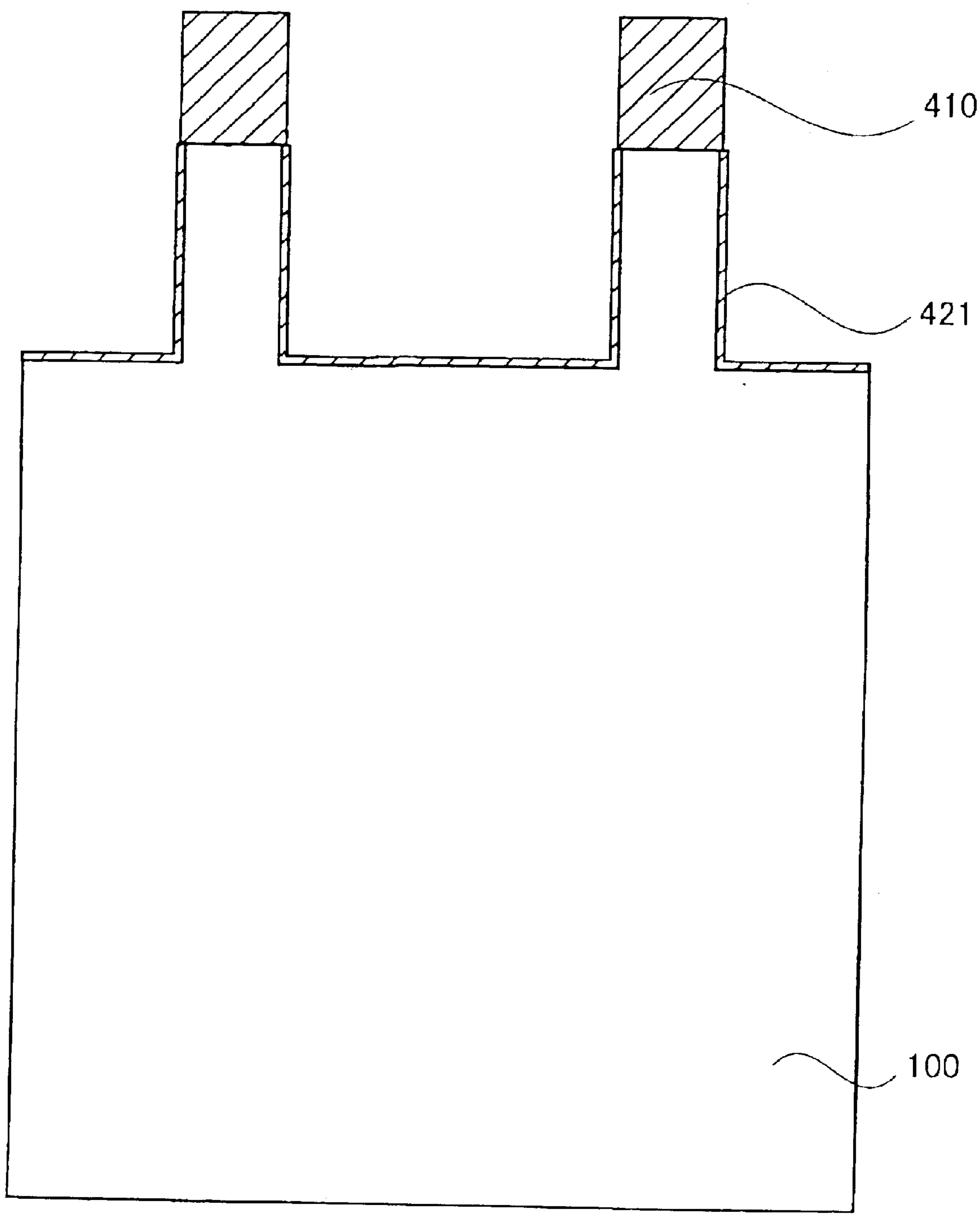

Using the silicon oxide film 410 as a mask, the p-type silicon substrate 100 is etched 50 to 5000 nm by RIE. Thereafter an exposed part of the p-type silicon substrate 100 is thermally oxidized to form a second insulating film, for example, a silicon oxide film 421 of 5 to 100 nm thickness (FIG. 321 and FIG. 346).

Figure 322:
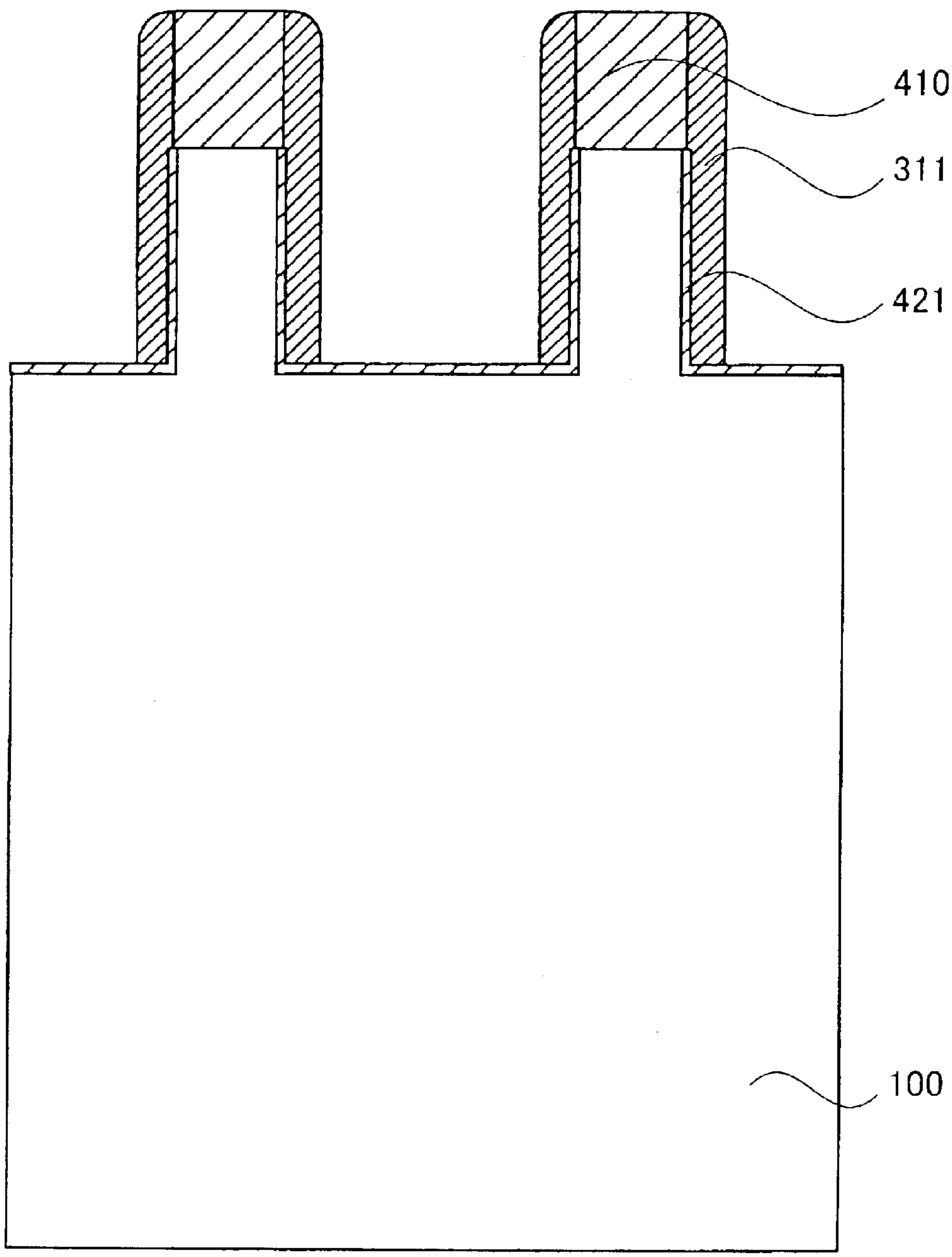
Figure 347:
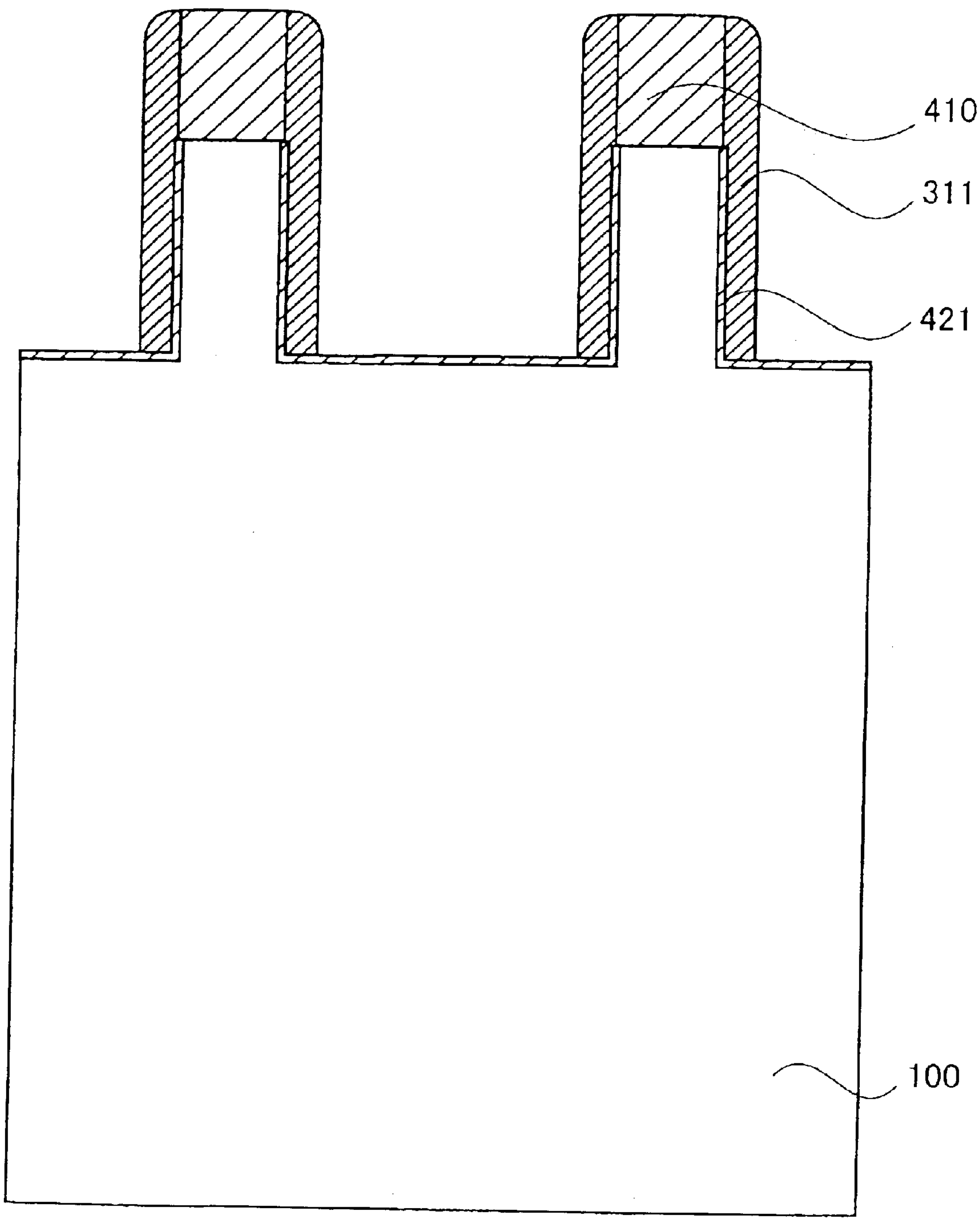

Next, a silicon nitride film 311, for example, is deposited to 10 to 1000 nm as a third insulating film, and then is anisotropically etched in the form of sidewalls on sidewalls of the silicon oxide film 410 and the p-type silicon substrate 100 patterned in the columnar form with intervention of the silicon oxide film 421 (FIG. 322 and FIG. 347).

Subsequently, using the silicon nitride film 311 formed in the sidewalls as a mask, the silicon oxide film 421 is etched away by RIE, and then, the exposed p-type silicon substrate 100 is etched 50 to 5000 nm. Thereby, the p-type silicon substrate 100 is patterned into the form of columns each having a step.

Figure 323:
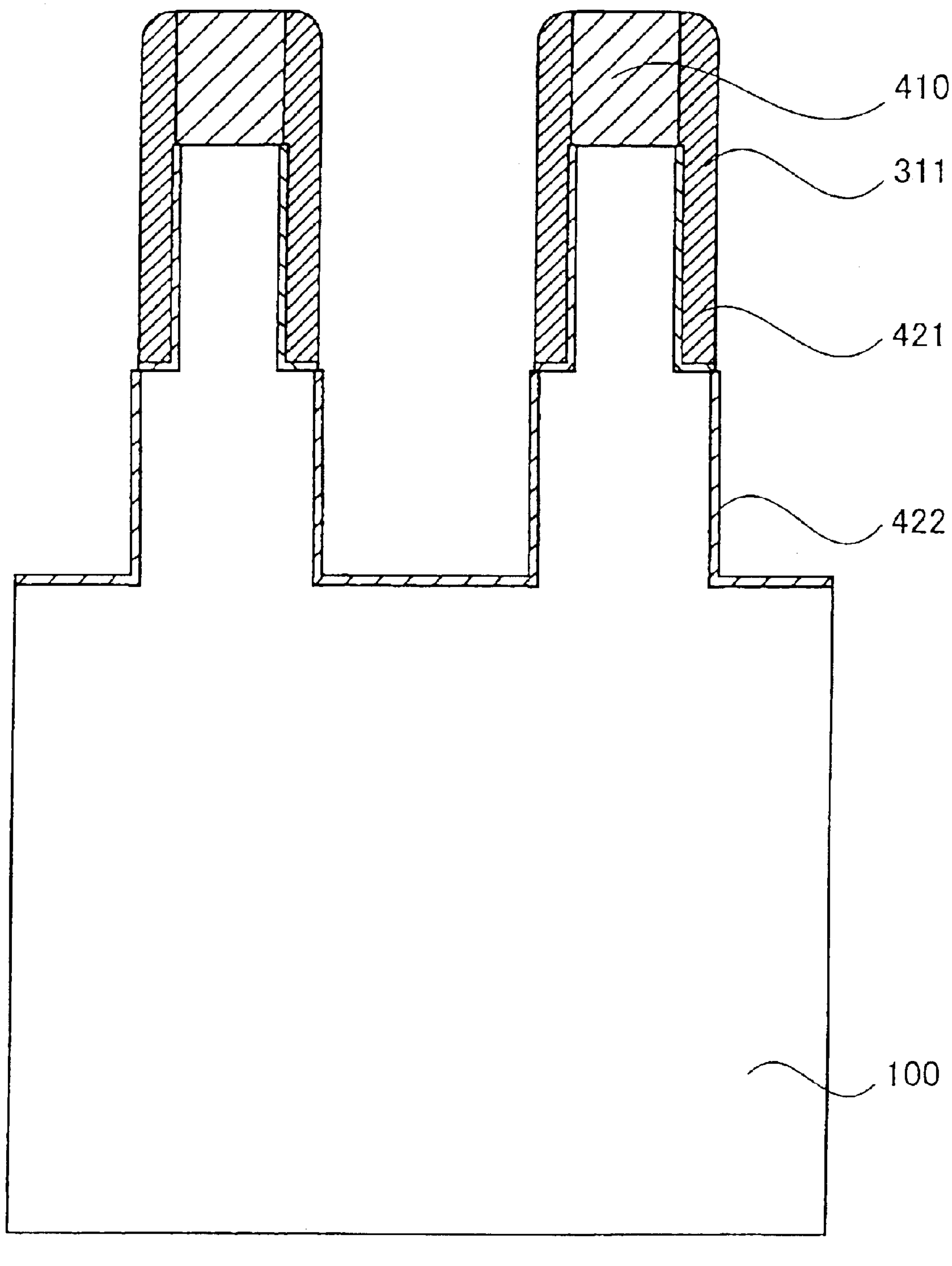
Figure 348:
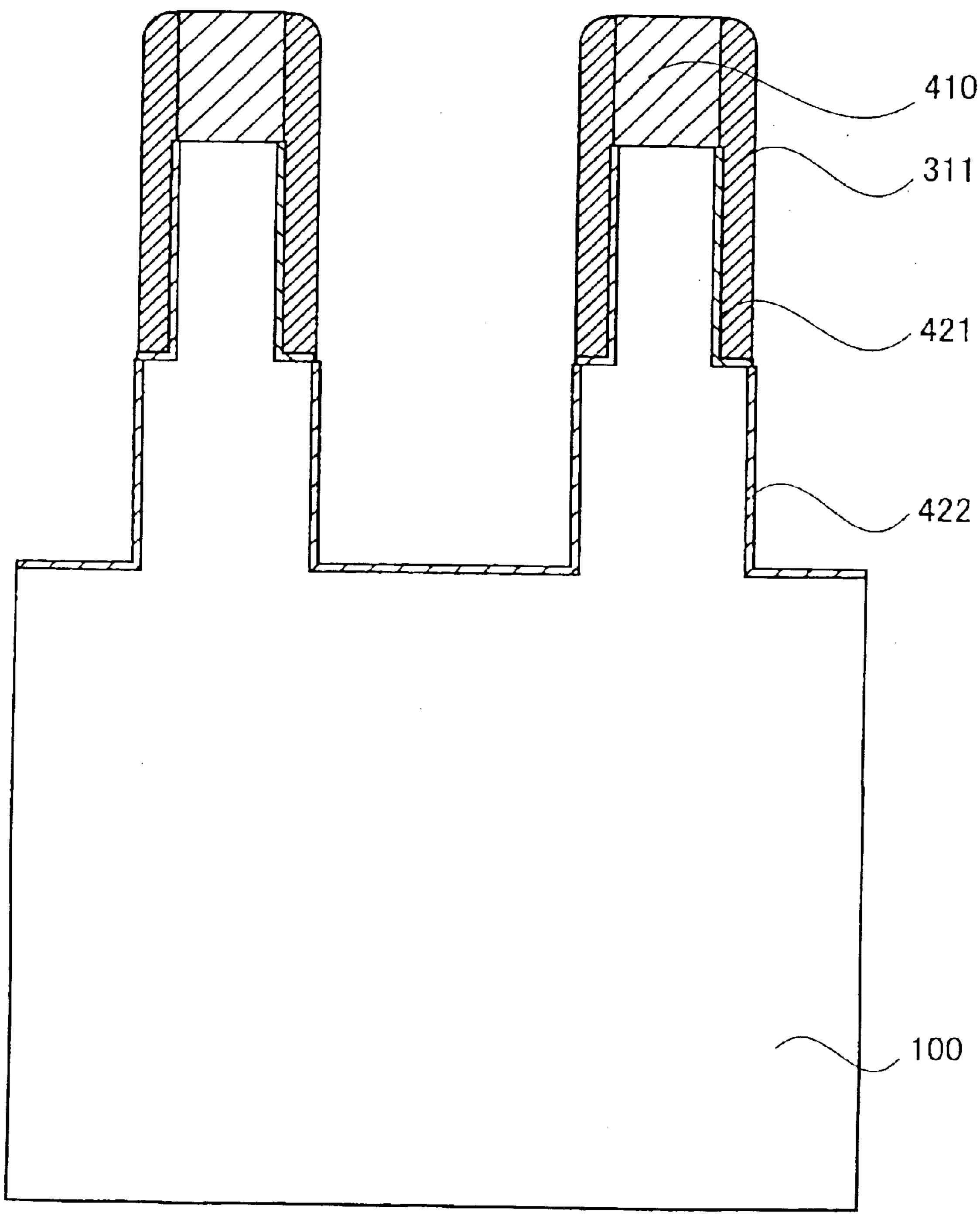

Thereafter, an exposed part of the p-type silicon substrate 100 is thermally oxidized to form a second insulating film, for example, a silicon oxide film 422 of 5 to 100 nm thickness (FIG. 323 and FIG. 348).

A silicon nitride film 312, for example, is deposited to 10 to 1000 nm as a third insulating film, and then is anisotropically etched in the form of sidewalls on sidewalls of the silicon oxide film 410, the silicon nitride film 311 and the p-type silicon substrate 100 patterned in the columnar form having the step with intervention of the silicon oxide film 422.

Subsequently, using the silicon nitride film 312 formed on the sidewalls as a mask, the silicon oxide film 422 is etched away by RIE, and then, the exposed p-type silicon substrate 100 is etched 50 to 5000 nm. Thereby, the p-type silicon substrate 100 is patterned into the form of columns each having two steps.

Figure 324:
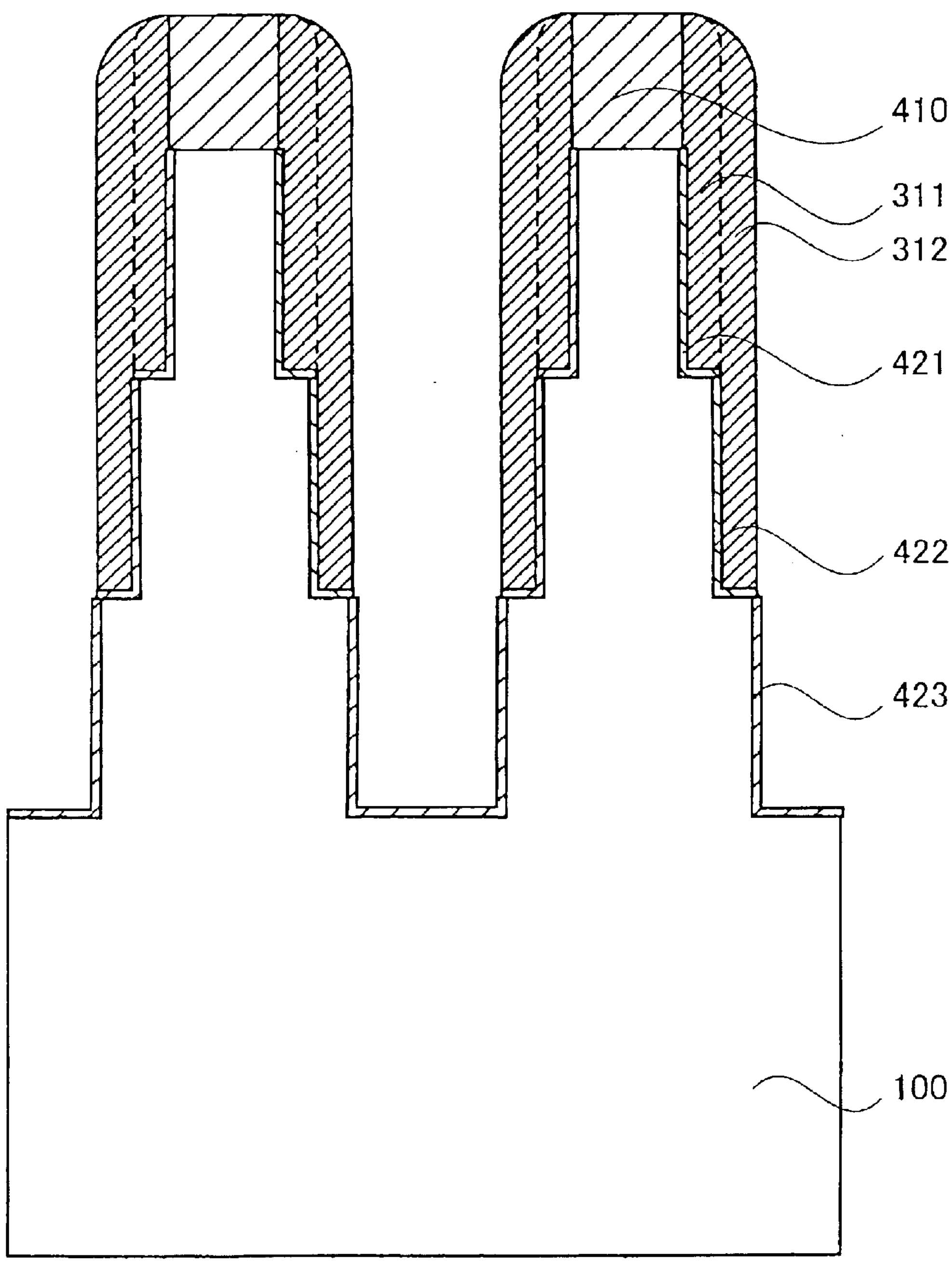
Figure 349:
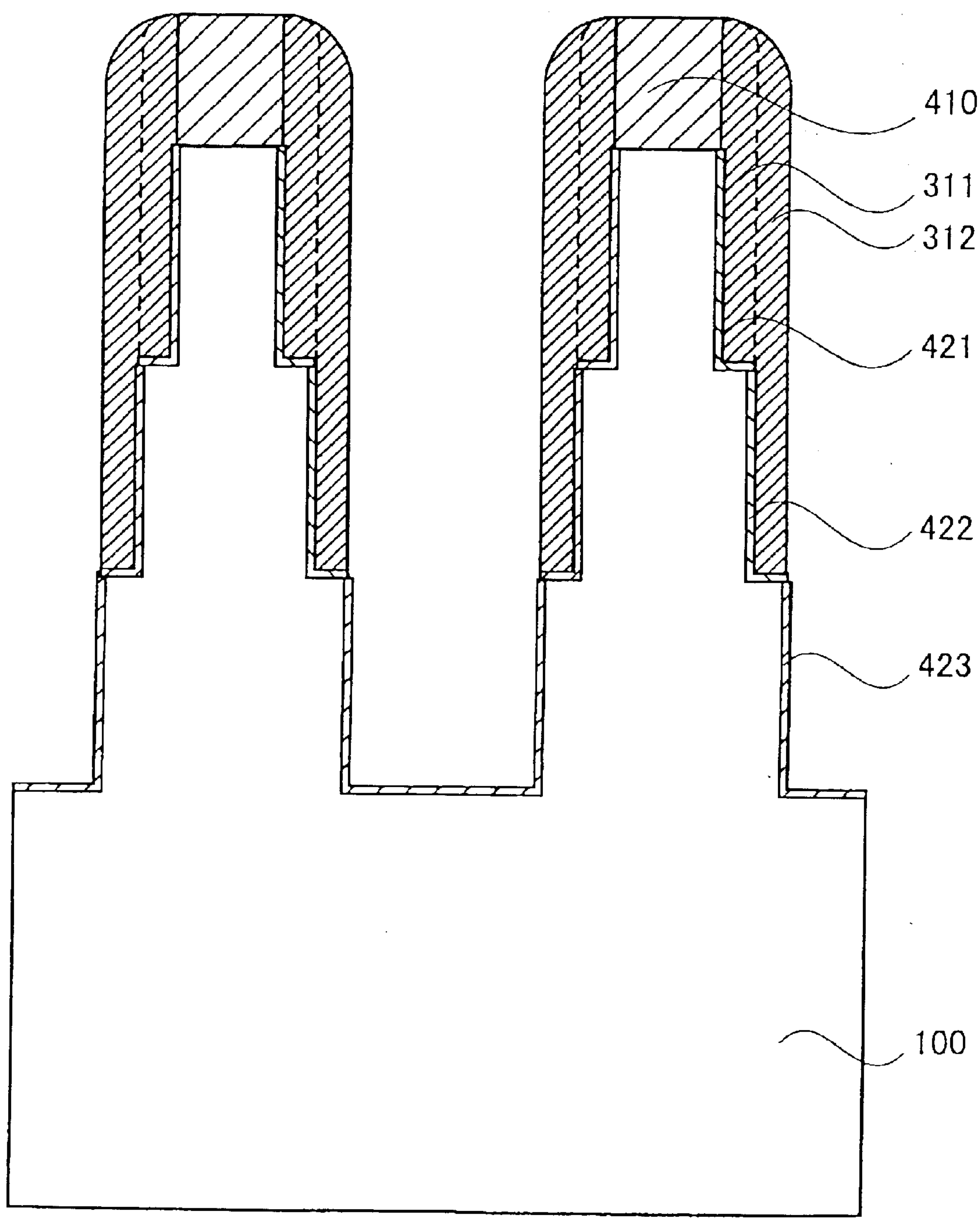

Thereafter, an exposed part of the p-type silicon substrate 100 is thermally oxidized to form a second insulating film, for example, a silicon oxide film 423 of 5 to 100 nm thickness (FIG. 324 and FIG. 349).

Next, a silicon nitride film 313, for example, is deposited to 10 to 1000 nm as a third insulating film, and then is anisotropically etched in the form of sidewalls on sidewalls of the silicon oxide film 410, the silicon nitride film 312 and the p-type silicon substrate 100 patterned in the columnar form having the two steps with intervention of the silicon oxide film 423.

Subsequently, using the silicon nitride film 313 formed in the sidewalls as a mask, the silicon oxide film 423 is etched away by RIE, and then, the exposed p-type silicon substrate 100 is etched 50 to 5000 nm. Thereby, the p-type silicon substrate 100 is patterned into the form of columns each having three steps. By the above-described process, the p-type silicon substrate 100 is separated into a plurality of columnar island-like semiconductor layers 110 having the steps.

Figure 325:
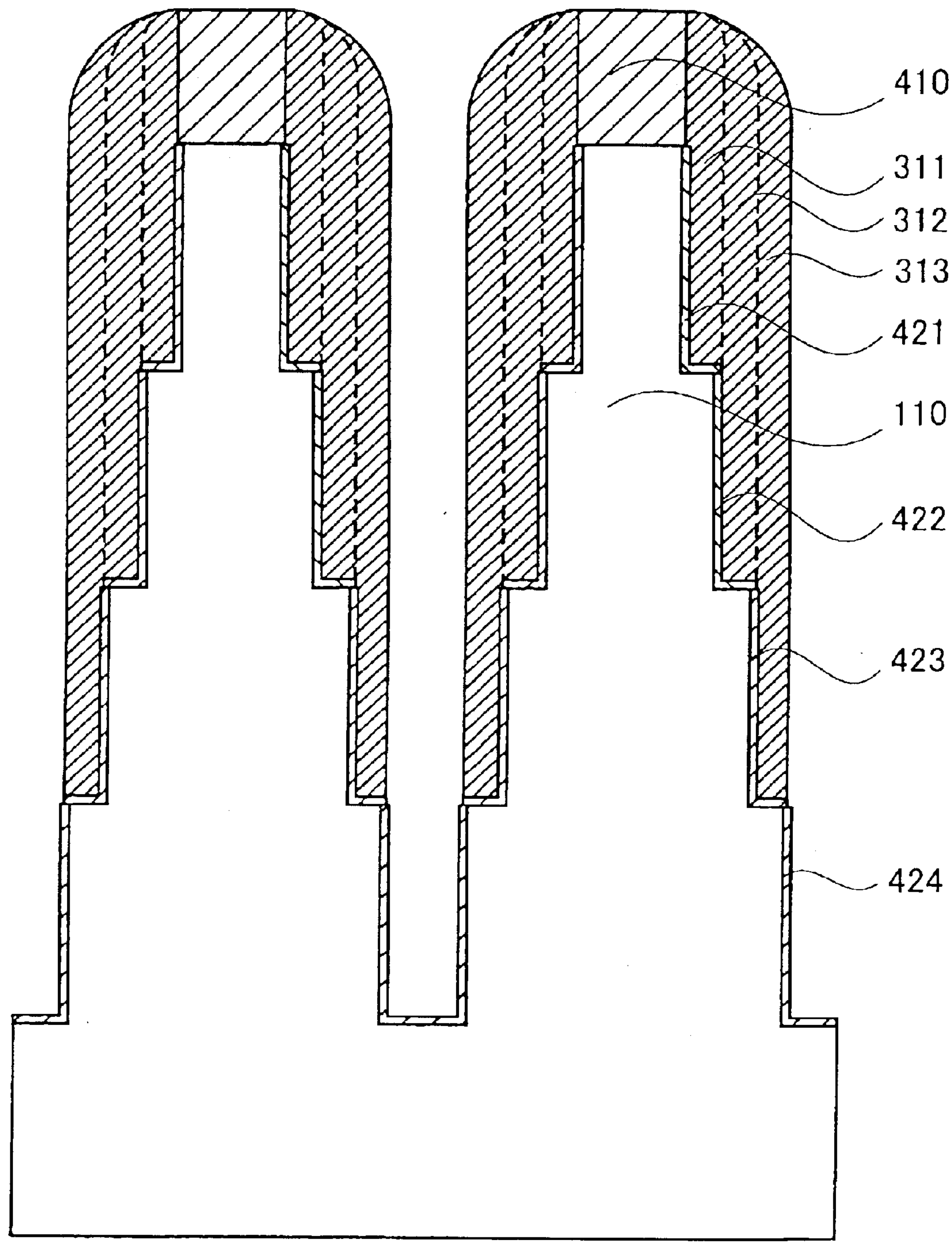
Figure 350:
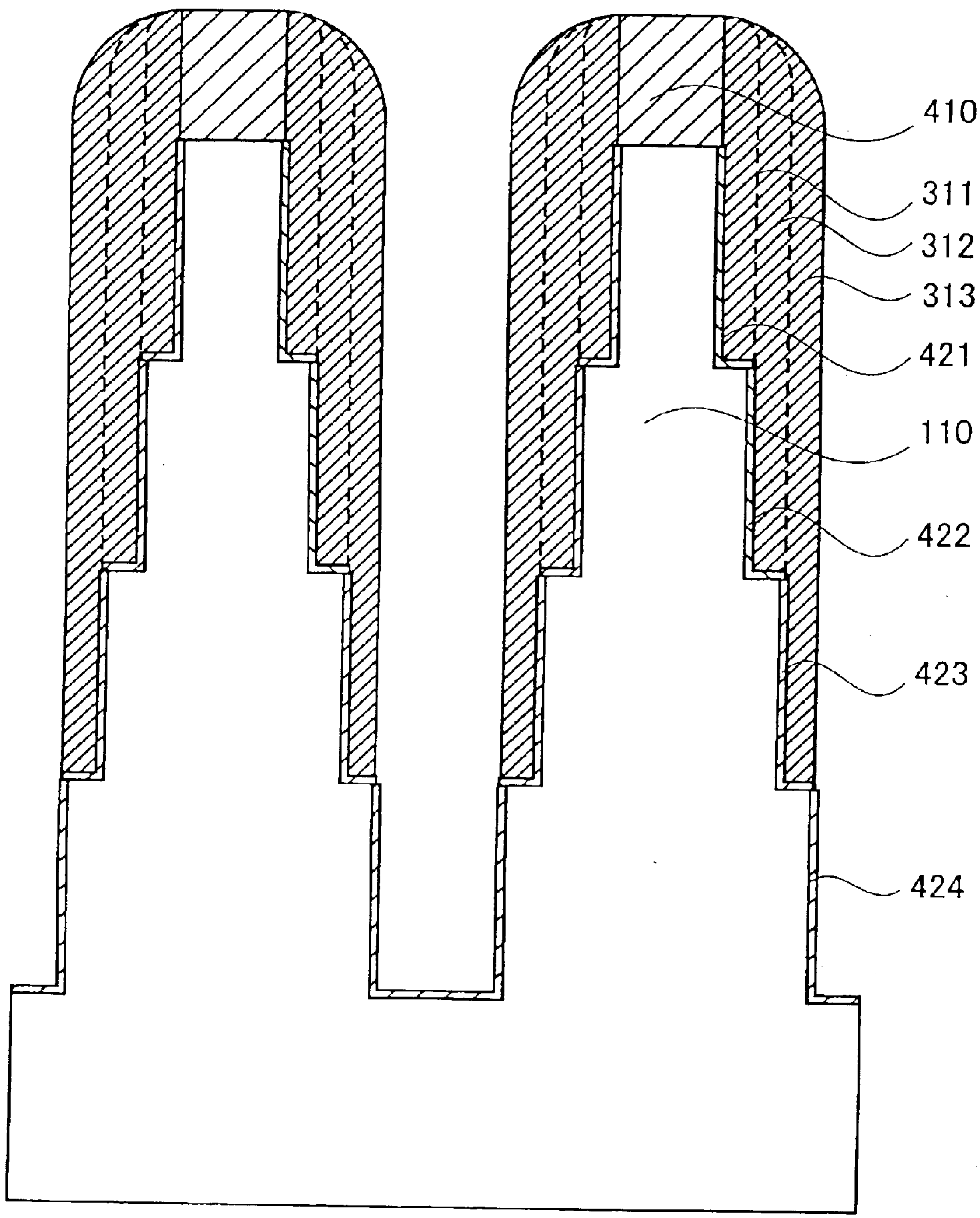

Thereafter, on an exposed part of the p-type silicon substrate 100, a silicon oxide film 424 is formed as a second insulating film of 5 to 100 nm thickness, for example, by thermal oxidization (FIG. 325 and FIG. 350). The silicon oxide film 424 is not limited to the thermally oxidized film but may be a CVD oxide film or an oxynitride film.

An impurity is introduced at the bottom of each island-like semiconductor layer 110 having the steps to form an n-type impurity region 710, for example, by ion implantation at an implantation energy of 5 to 100 keV and an arsenic or phosphorus dose of $1\times10^{13}$ to $1\times10^{17}/m^2$ in a direction inclined 0 to 7°.

Figure 326:
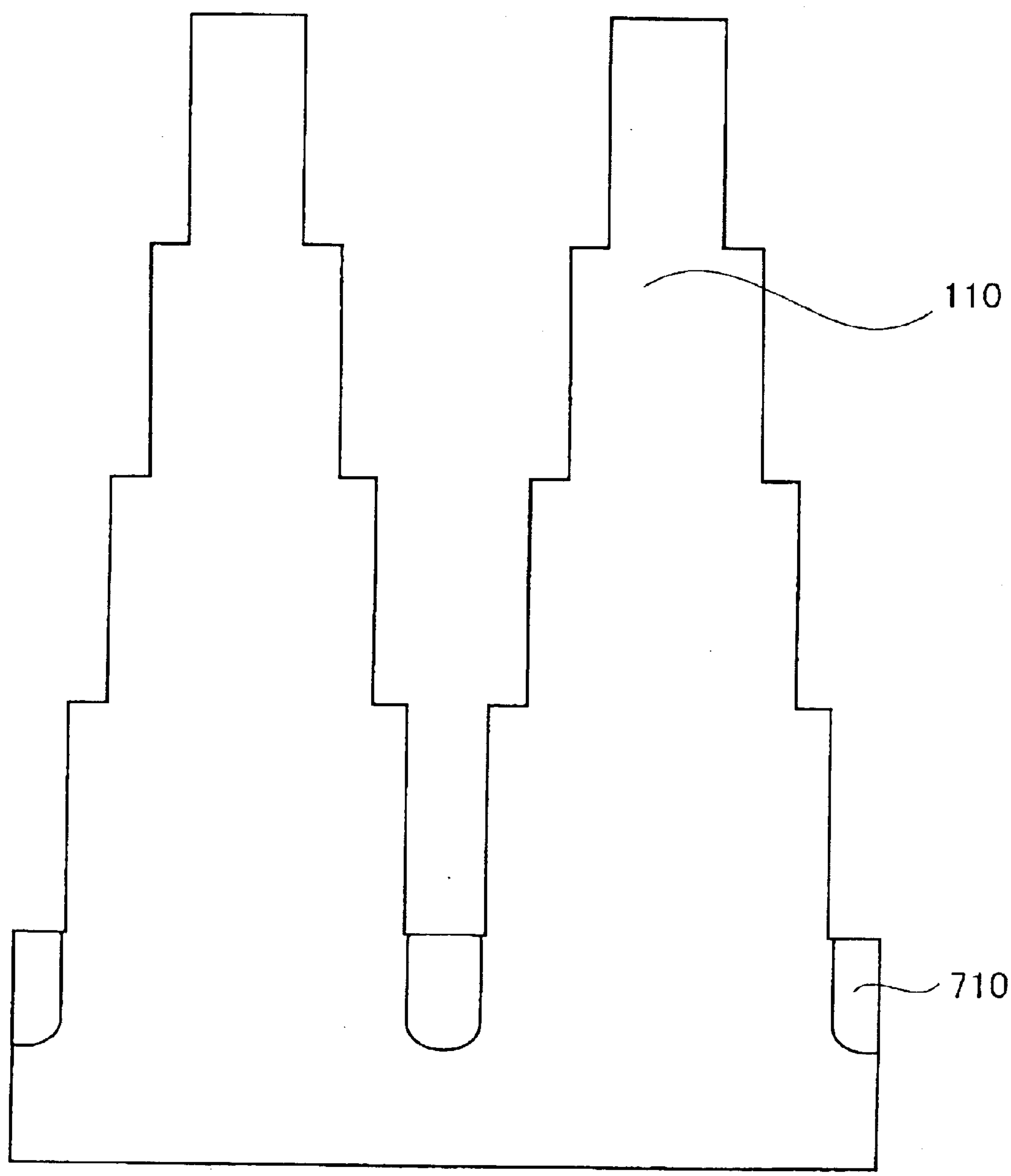
Figure 351:
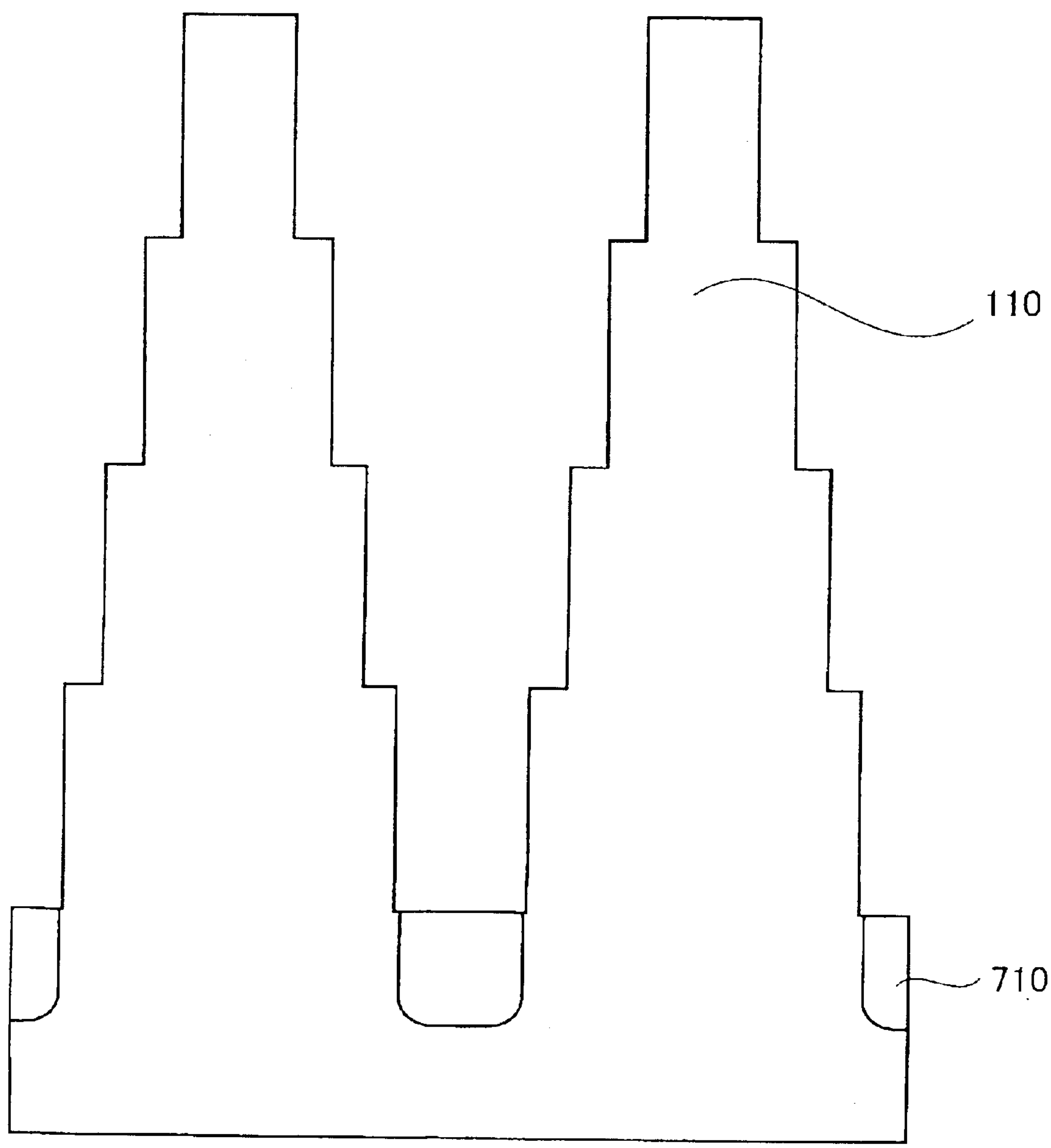

Subsequently, the silicon nitride film and the silicon oxide film are selectively removed, for example, by isotropic etching (FIG. 326 and FIG. 351).

Figure 327:
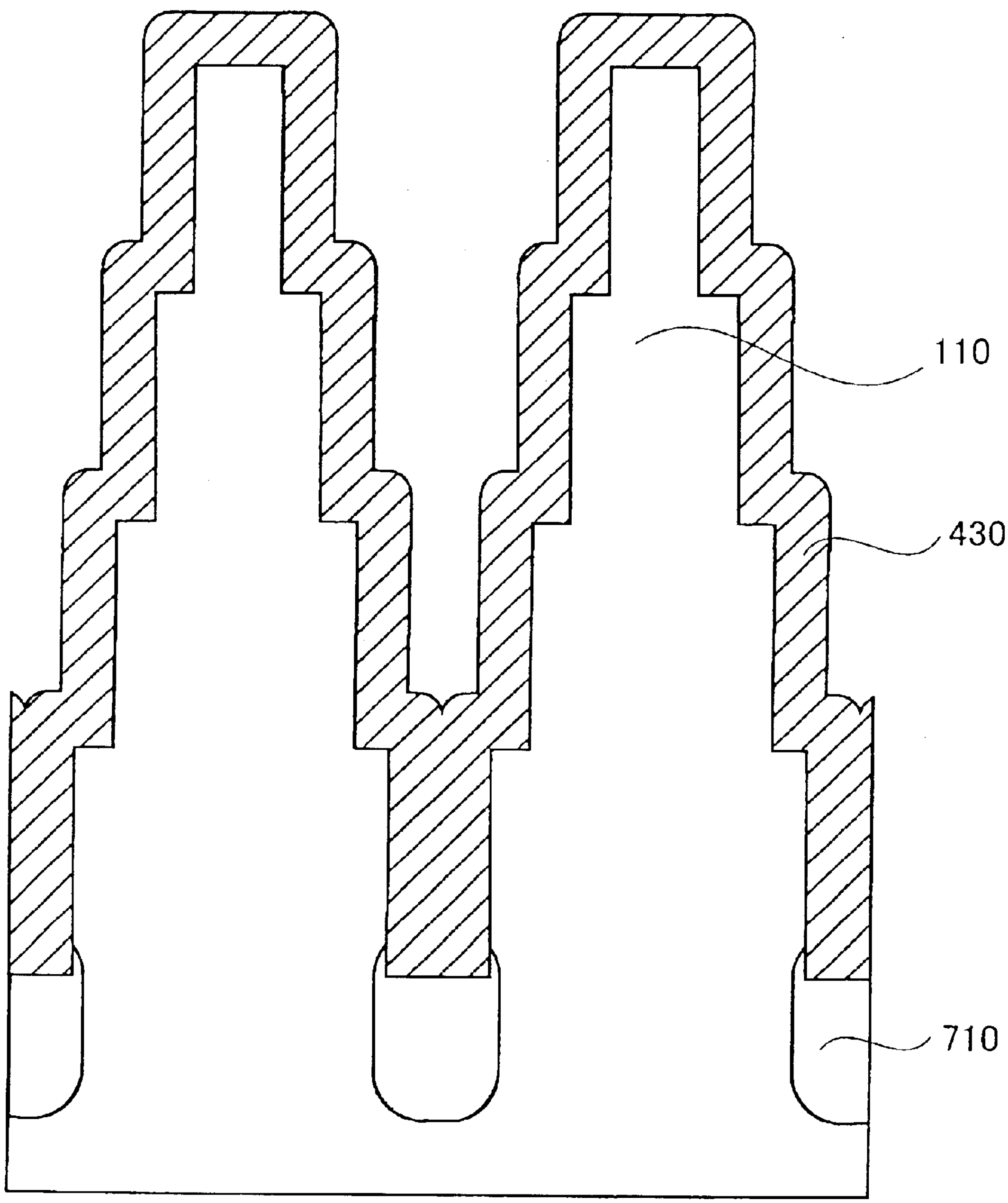
Figure 352:
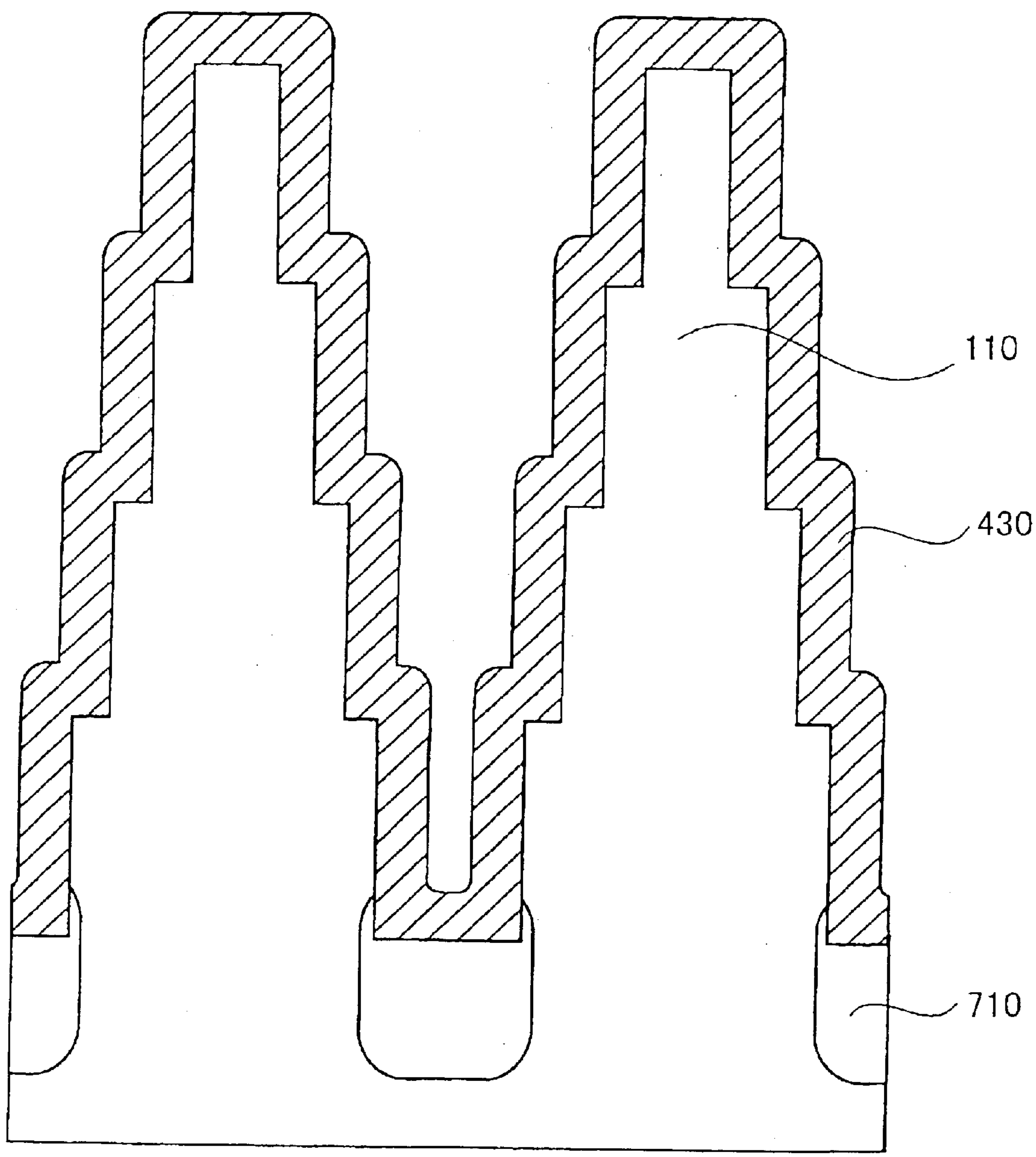

The surface of the island-like semiconductor layer 110 is oxidized to form a fourth insulating film, for example, a silicon oxide film 430 with a thickness of 10 to 100 nm (FIG. 327 and FIG. 352). At this time, if the uppermost tier of the island-like semiconductor layer 110 is formed to have a diameter of the minimum patterning dimensions, the diameter of the uppermost tier of the island-like semiconductor layer 110 is reduced to the minimum patterning dimensions or less by the formation of the silicon oxide film 430.

Figure 328:
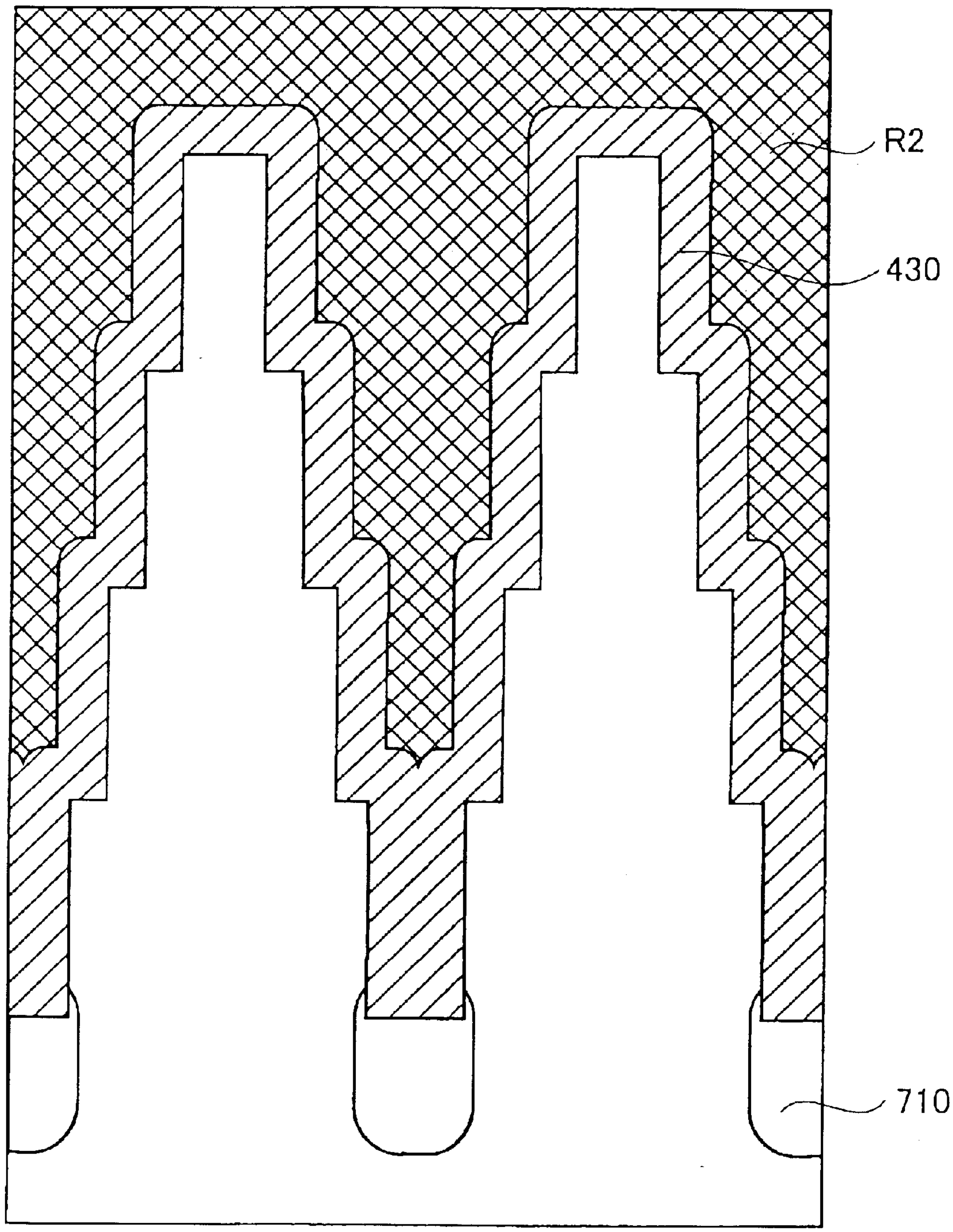
Figure 329:
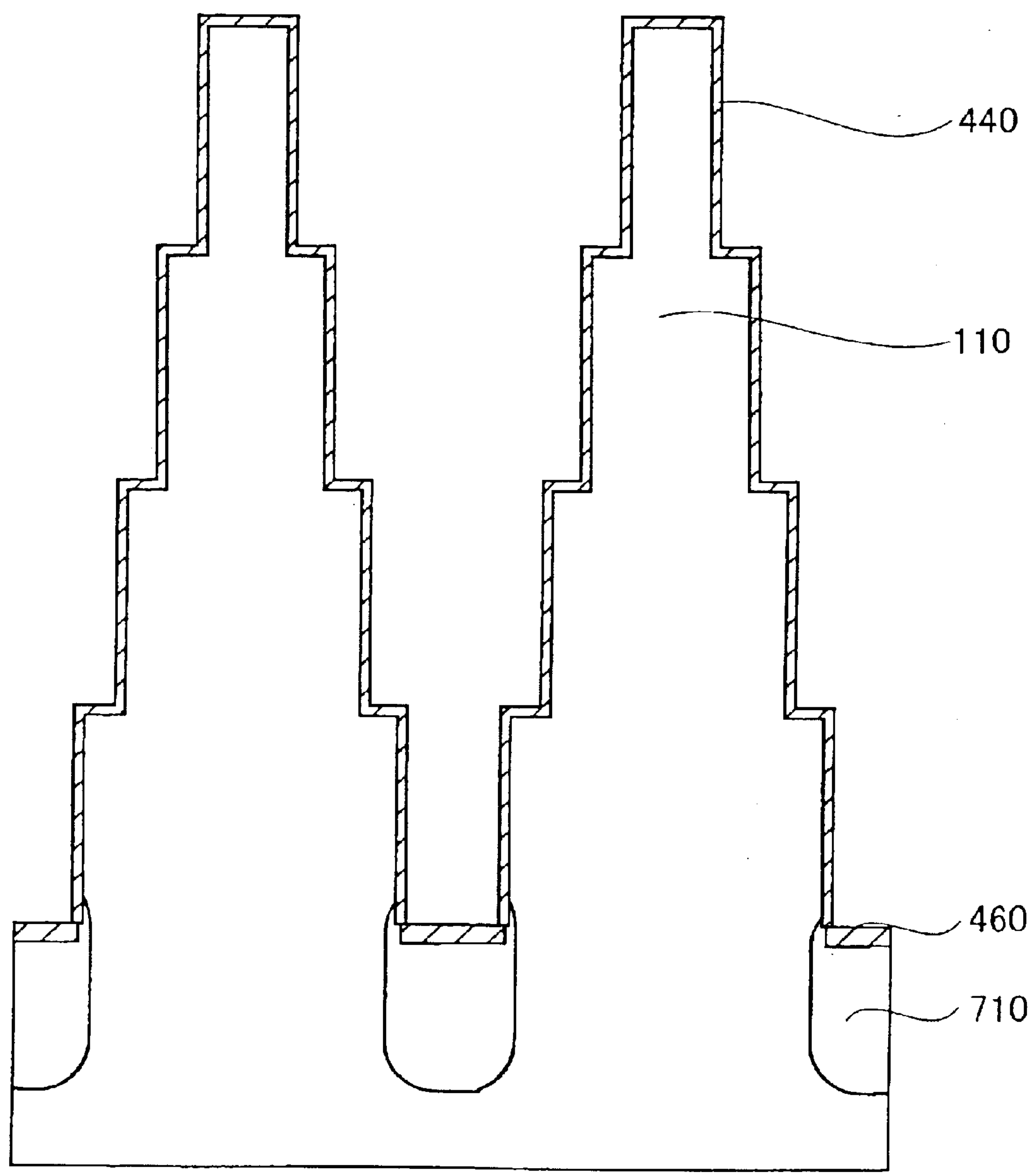
Figure 353:
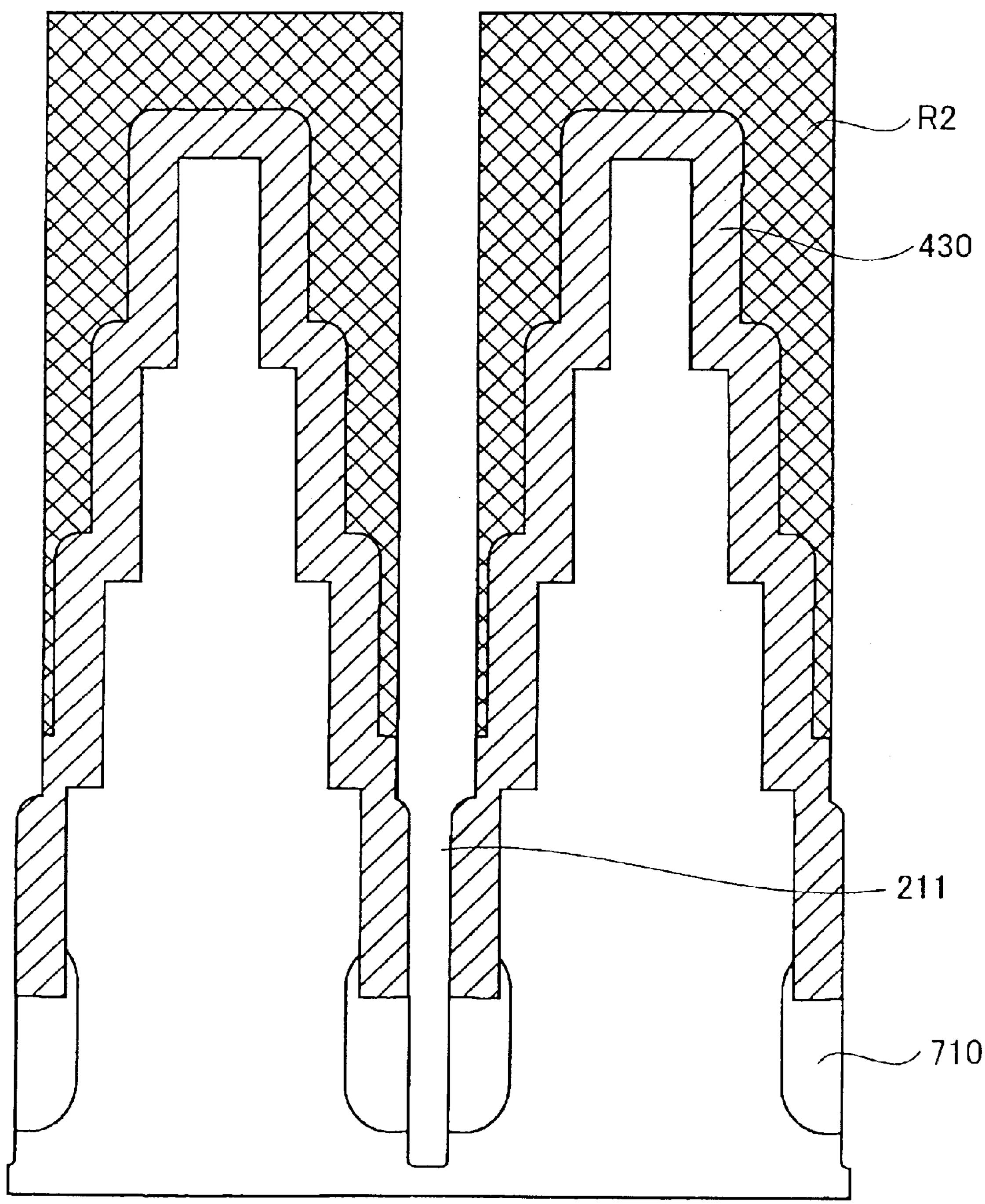
Figure 354:
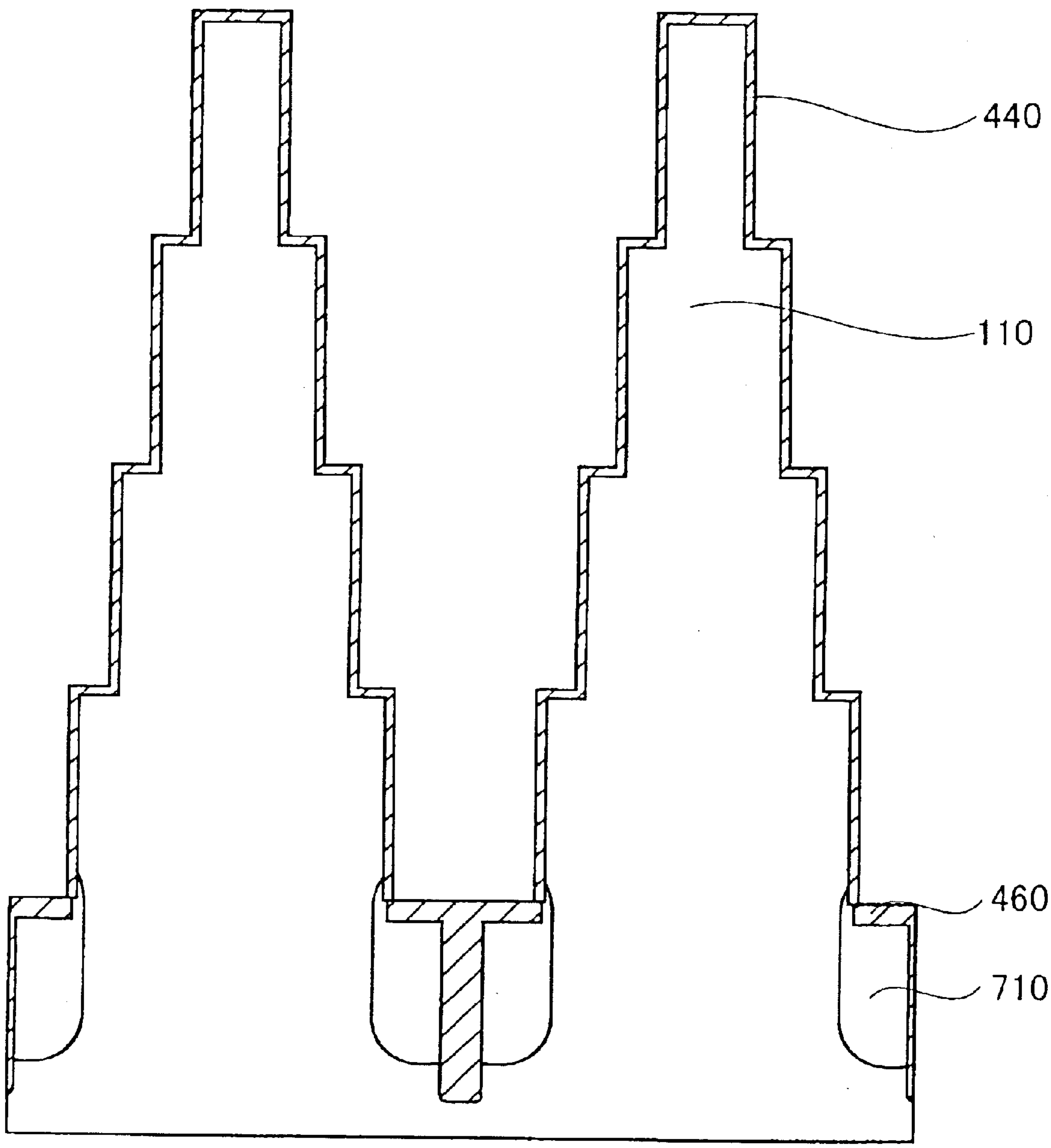

Using as a mask a resist film R2 patterned by a known photolithography technique, the silicon oxide film 430 is etched by RIE, and the exposed silicon substrate is further etched by RIE to separate the impurity diffusion layer 710 in direction B–B' and form a first trench 210 (FIG. 328 and FIG. 353). Thereby, a first wiring layer continuous in direction A–A' of FIG. 1 is formed by separation. Since the anisotropic etching of the silicon substrate is performed in self-alignment along the sidewall of the silicon oxide film 430, the resist film R2 can have a sufficient alignment margin, which provides an advantage of easy patterning.

Thereafter, a silicon oxide film 460, for example, is deposited to about 20 to 200 nm as a seventh insulating film and is isotropically etched back to a desired height to be buried in the first trench 210 or in the first trench 211 and the bottom of the island-like semiconductor layer 110.

Next, channel ion implantation is carried out on the sidewall of each island-like semiconductor layer 110 as required using a slant ion implantation, for example, at an implantation energy of 5 to 100 keV at an arsenic or phosphorus dose of about $1\times10^{11}$ to $1\times10^{13}/cm^2$ in a direction inclined about 5 to 45°. The channel ion implantation may preferably be performed in various directions toward the island-like semiconductor layer 110 because the surface impurity concentration becomes uniform. Alternatively, instead of the channel ion implantation, a oxide film containing phosphorus is deposited by CVD and diffusion of phosphorus from the oxide film may be utilized. The implantation of the impurity ions from the surface of the island-like semiconductor layer 110 may be done before the surface of the island-like semiconductor layer 110 is covered with the silicon oxide film 430 or may be finished before the island-like semiconductor layer 110 is formed. The means for the implantation is not particularly limited so long as the impurity concentration distribution in the island-like semiconductor layer 110 is equal.

Subsequently, a silicon oxide film 440, for example, is formed as a fifth oxide film to be a tunnel oxide film of about 10 nm thickness around each island-like semiconductor layer 110, for example, using thermal oxidation (FIG. 329 ad FIG. 354). the tunnel oxide film is not limited to the thermally oxidized film but may be a CVD oxide film or an oxynitride film.

Figure 330:
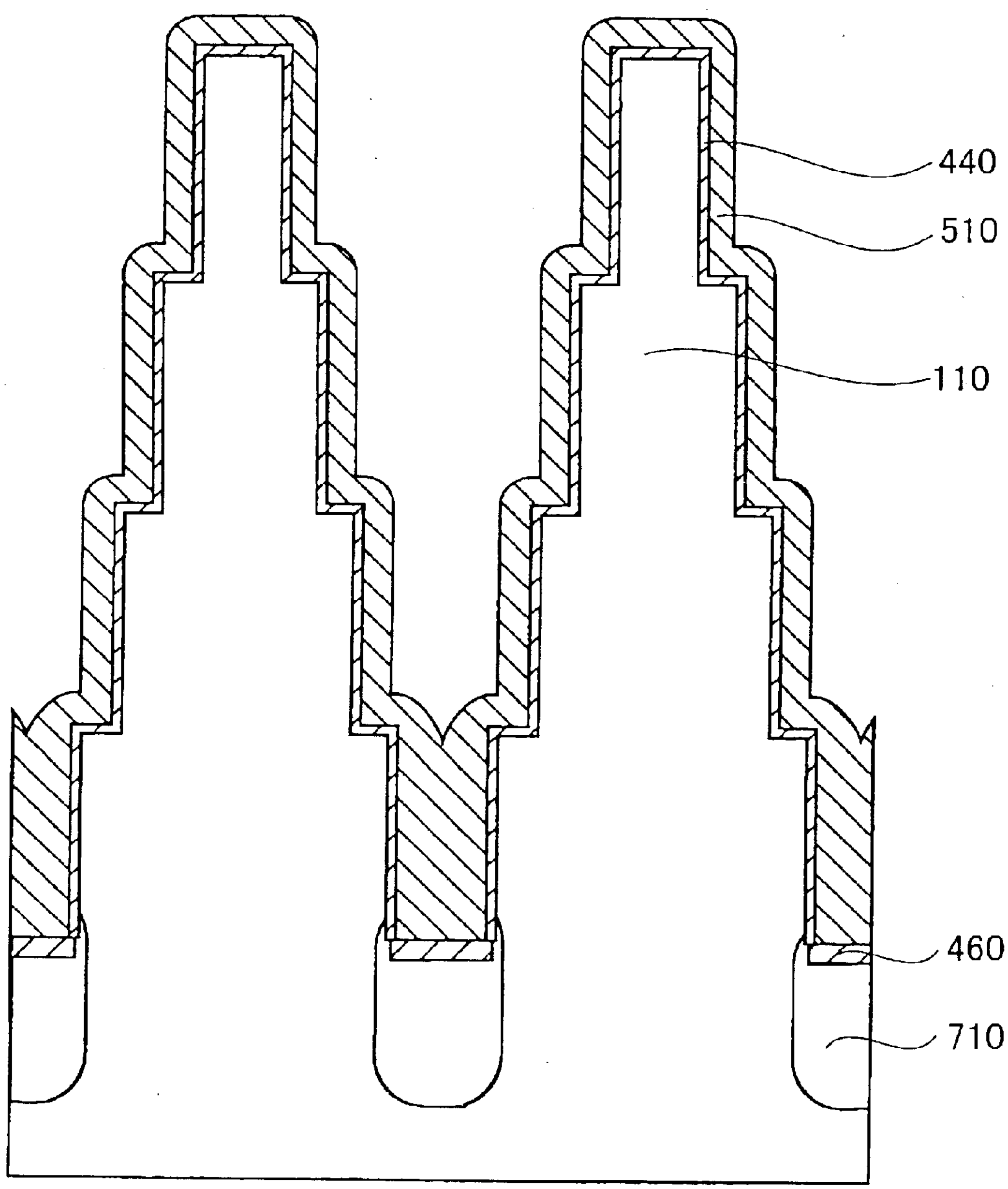
Figure 355:
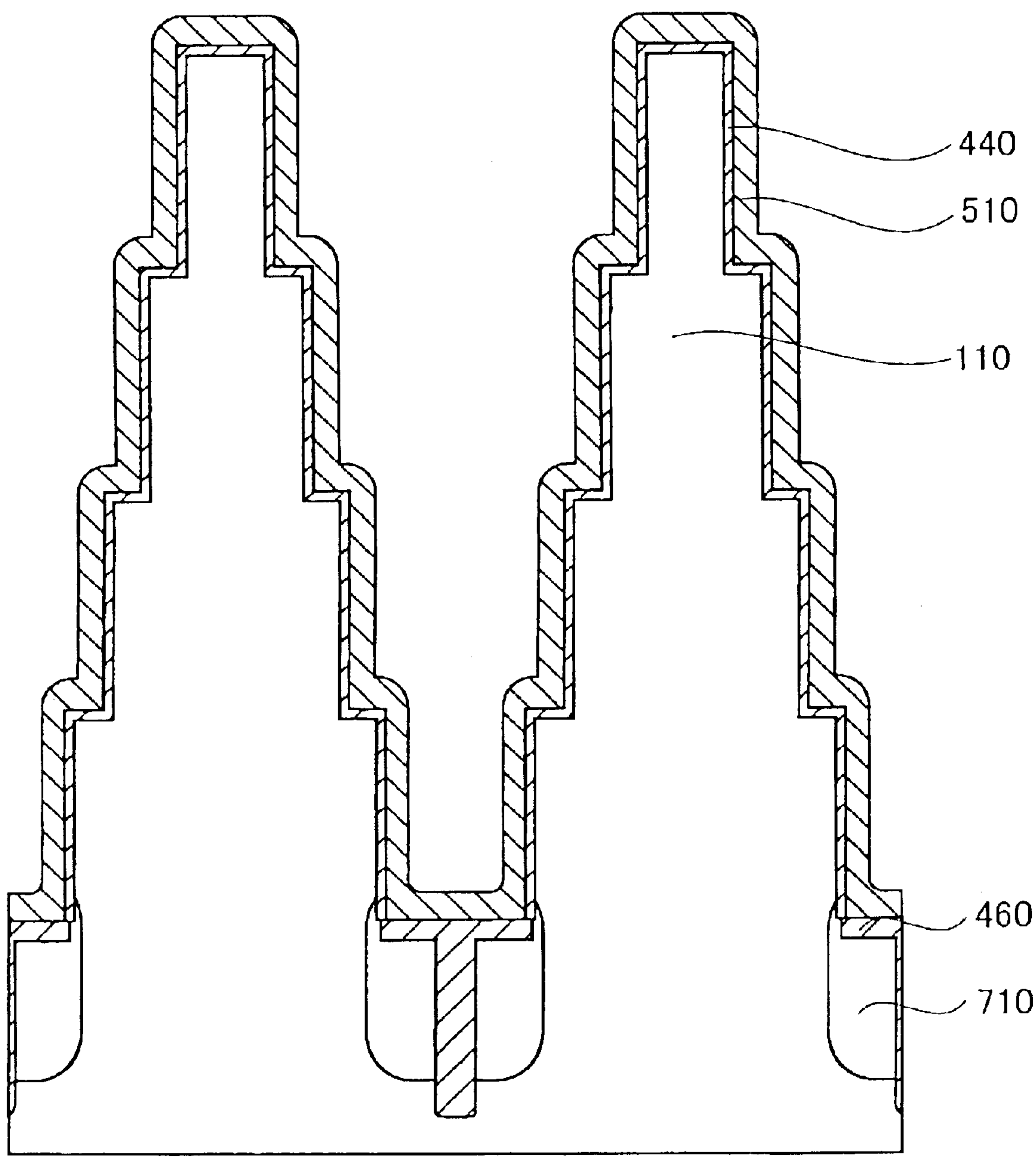

A first conductive film, for example, polysilicon film 510 is deposited to about 20 to 200 nm (FIG. 330 and FIG. 355).

Figure 331:
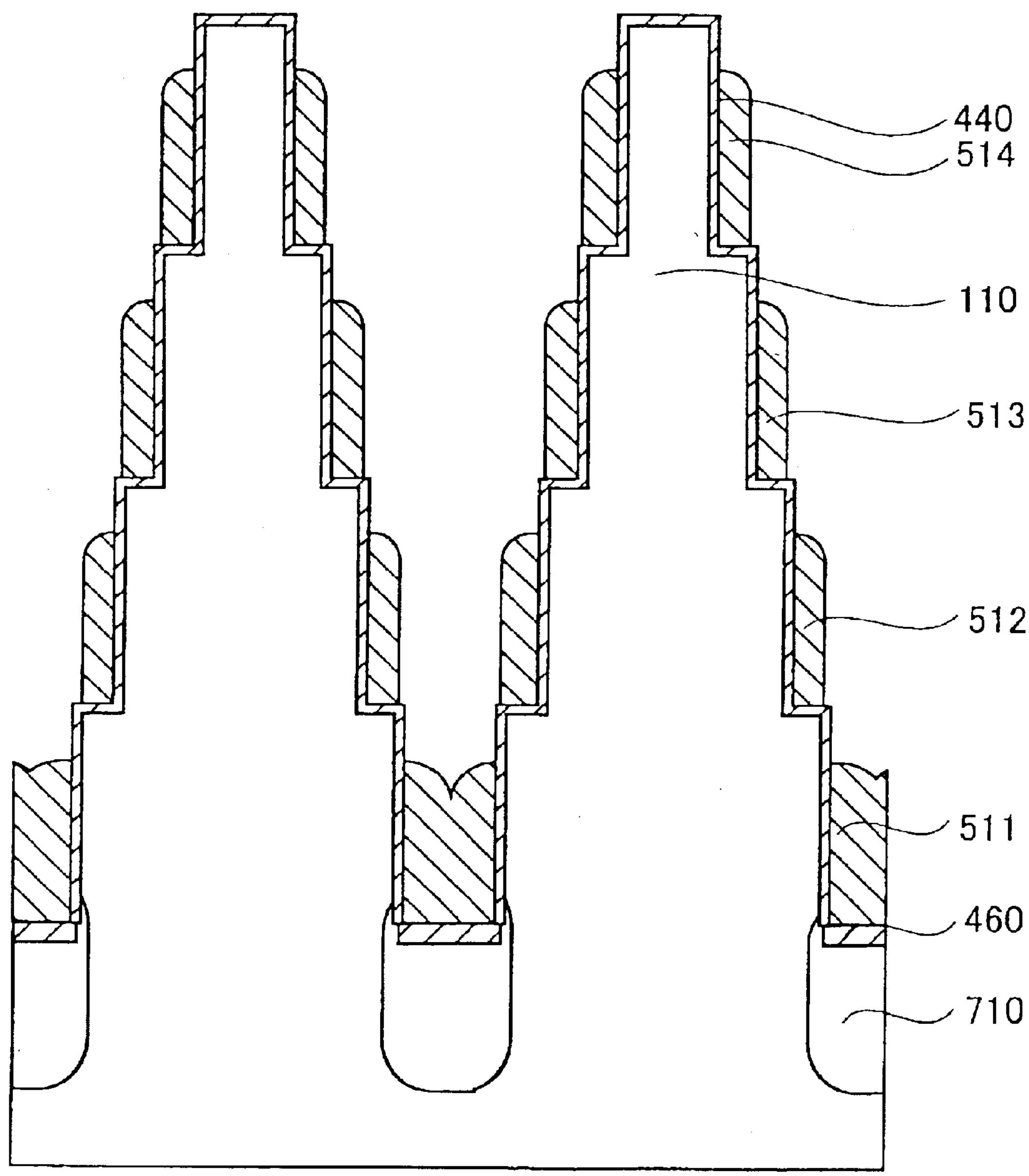
Figure 332:
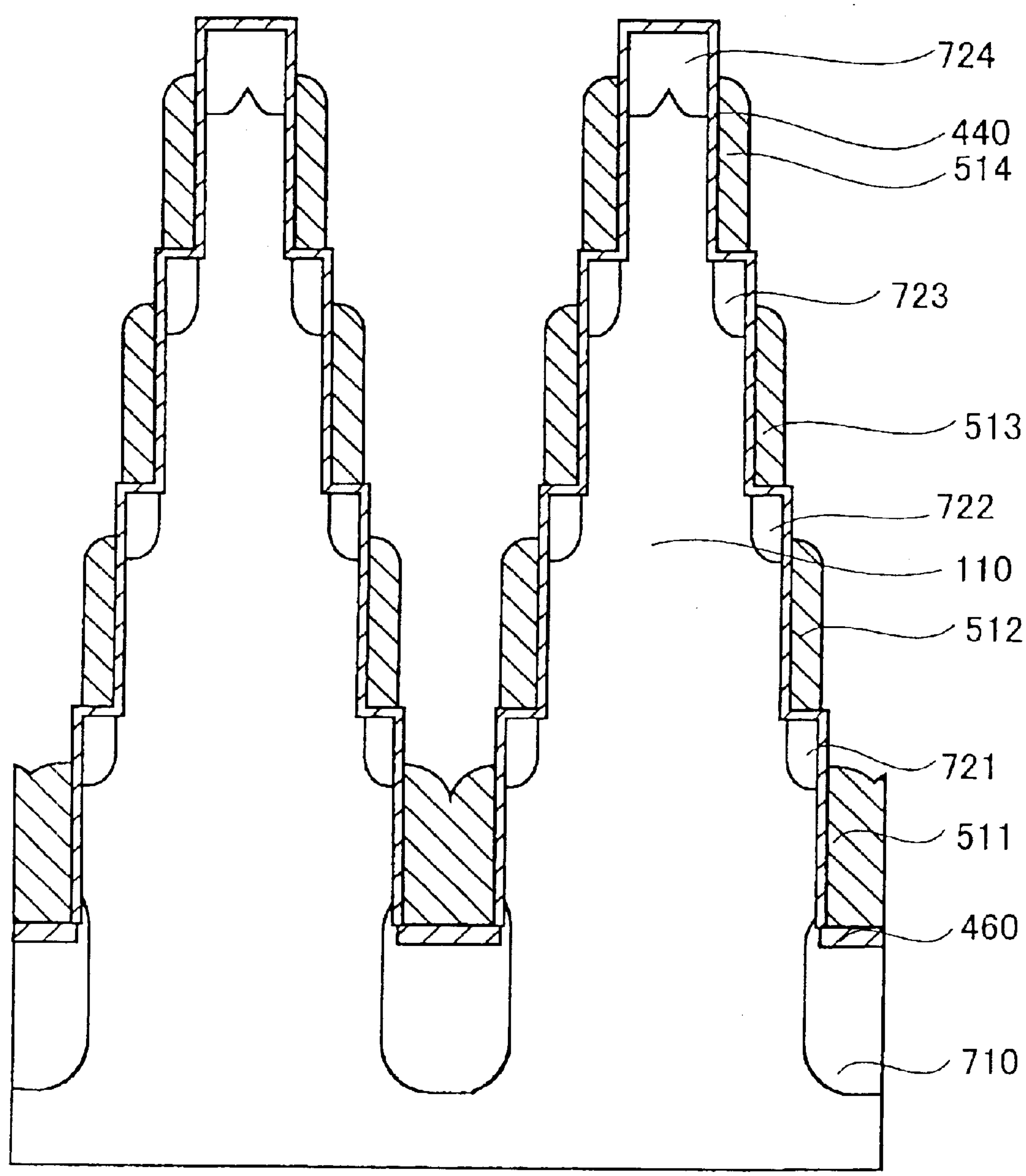
Figure 356:
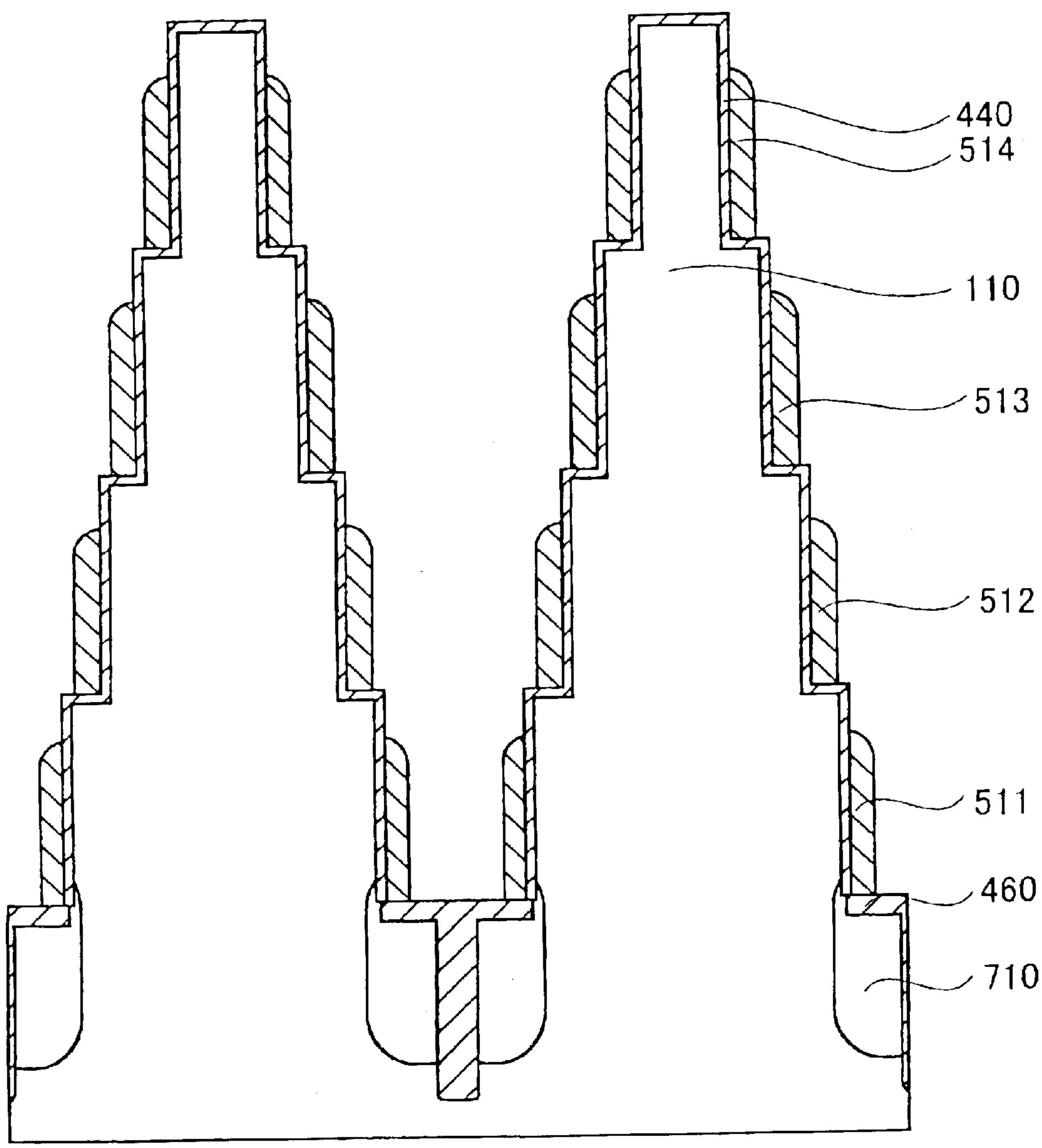
Figure 357:
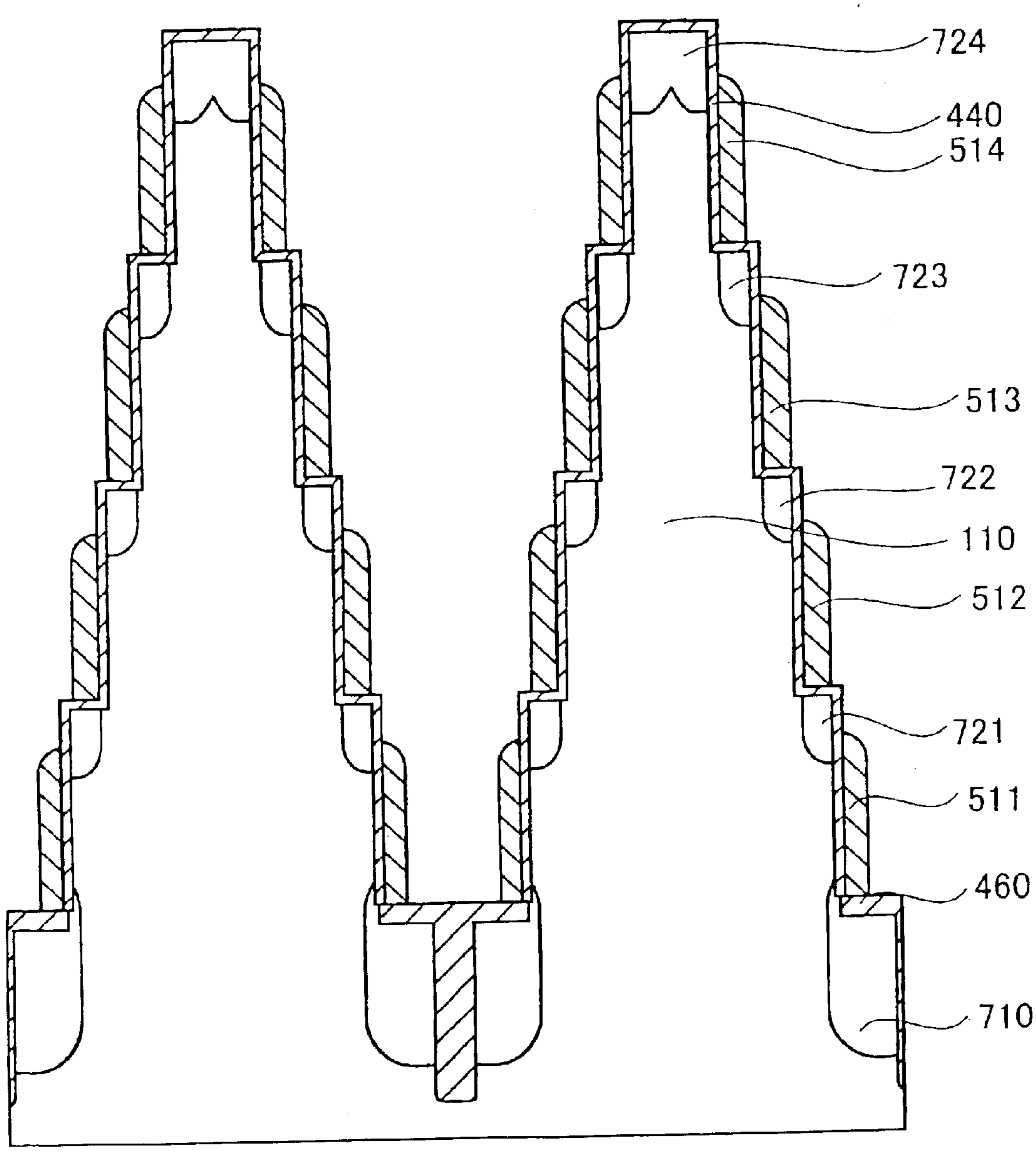

Thereafter, for example, by anisotropic etching, the polysilicon film 510 is formed in the form of sidewalls on the sidewalls of the tiers of the island-like semiconductor layer 110, whereby separate polysilicon films 511, 512, 513 and 514 are formed at the same time (FIG. 331 and FIG. 356). At this time, by setting the intervals between the island-like semiconductor layers in the A–A' direction to a predetermined value or less, the polysilicon film 510 as a second wiring layer to be a selection gate line is formed continuously in the direction without using a masking process.

For example, at an implantation energy of 5 to 100 keV at an arsenic or phosphorus dose of about $1\times10^{12}$ to $1\times10^{15}$/cm$^2$ in a direction inclined about 0 to 45°. Here, the ion implantation for forming the n-type impurity diffusion layers 721, 722, 723 and 724 may be carried out on the entire periphery of the island-like semiconductor layer 110 and may be carried out from one direction or from several directions. That is, the n-type impurity diffusion layers 721, 722, 723 and 724 may not be formed to surround the periphery of the island-like semiconductor layer 110.

Next, impurity ions are introduced into corners of the island-like semiconductor layer 110 having the steps to form n-type impurity diffusion layers 721, 722, 723 and 724 (FIG. 332 and FIG. 357), for example, at an implantation energy of 5 to 100 keV at an arsenic or phosphorus dose of about $1\times10^{12}$ to $1\times10^{15}$/cm$^2$ in a direction inclined about 0 to 45°. Here, the ion implantation for forming the n-type impurity diffusion layers 721, 722, 723 and 724 may be carried out on the entire periphery of the island-like semiconductor layer 110 and may be carried out from one direction or from several directions. That is, the n-type impurity diffusion layers 721, 722, 723 and 724 may not be formed to surround the periphery of the island-like semiconductor layer 110.

Figure 333:
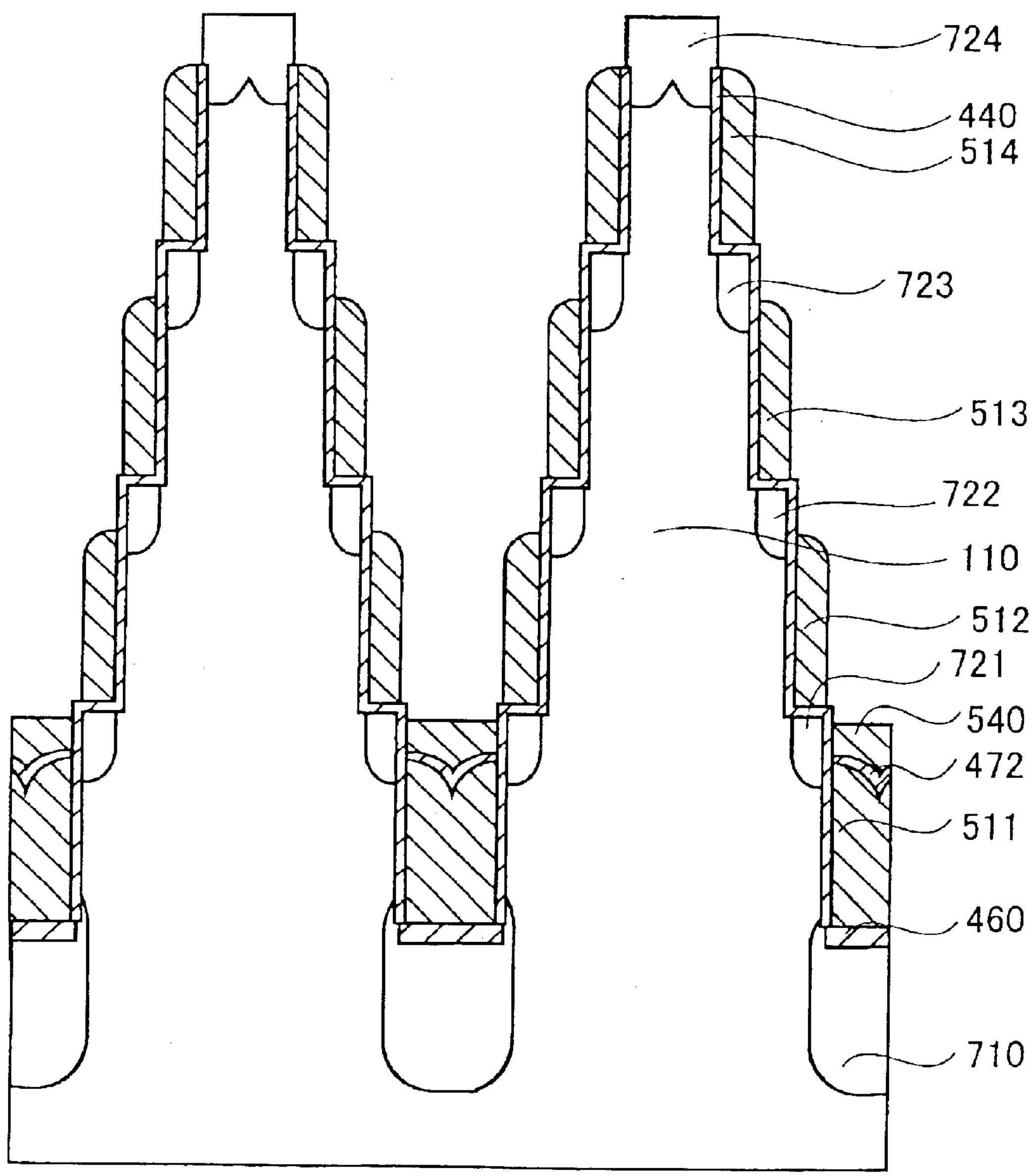
Figure 358:
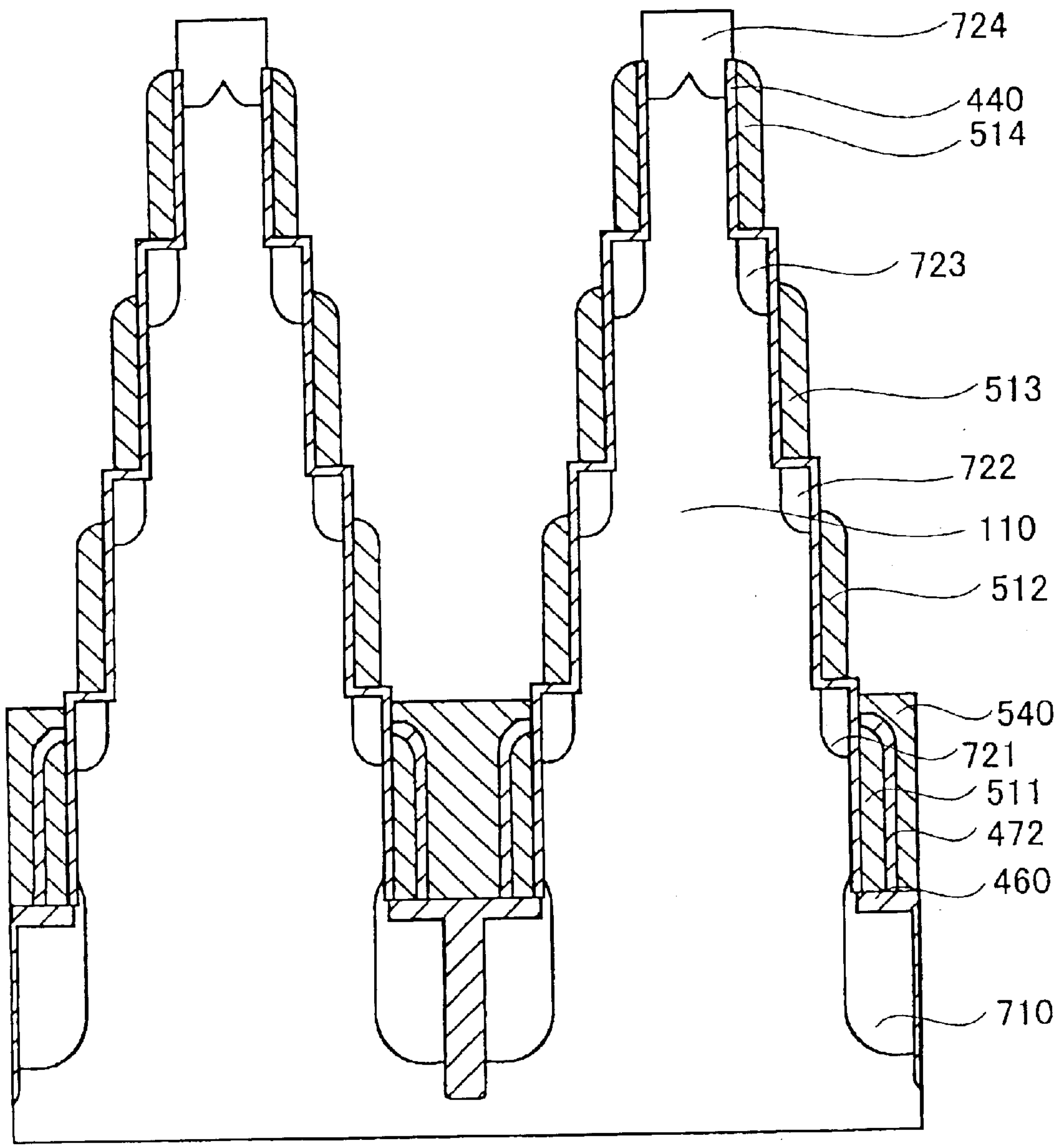

Subsequently, a silicon oxide film 472 is formed as a ninth insulating film of about 10 to 180 nm on the polysilicon film 511, for example, by thermal oxidation. Thereafter, a polysilicon film 540, for example, is deposited to about 20 to 200 nm as a fourth conductive film and is buried by isotropic etching to cover the top and sides of the polysilicon film 511 with intervention of the silicon oxide film 472 (FIG. 333 and FIG. 358).

Here, the polysilcon film 540 is used as a material to be buried, but a silicon oxide film, a silicon nitride film or other material which has a good burying property may be used. When an insulating film such as a silicon oxide film or a silicon nitride film is used, the silicon oxide film 472 may not be used.

Figure 334:
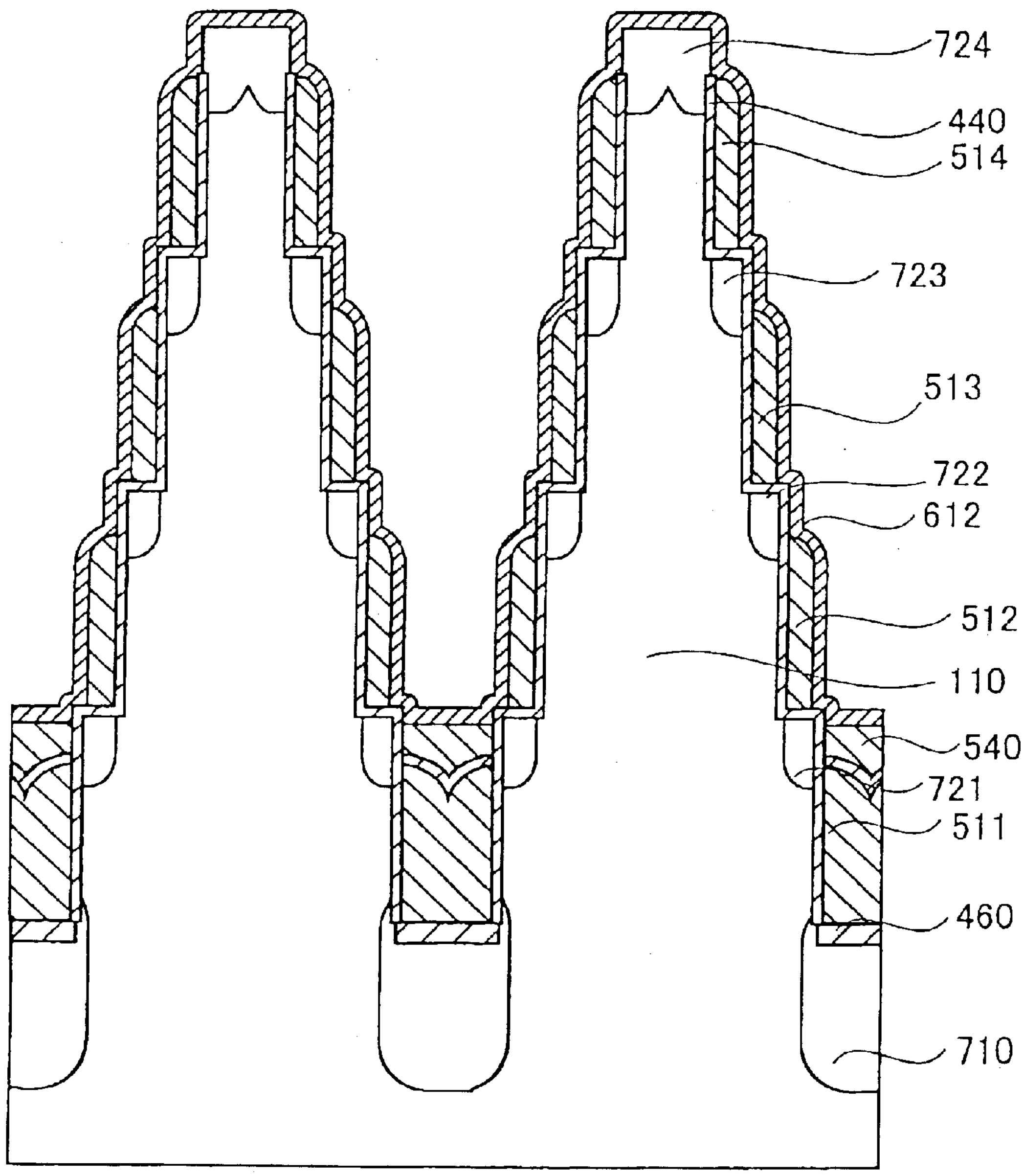
Figure 335:
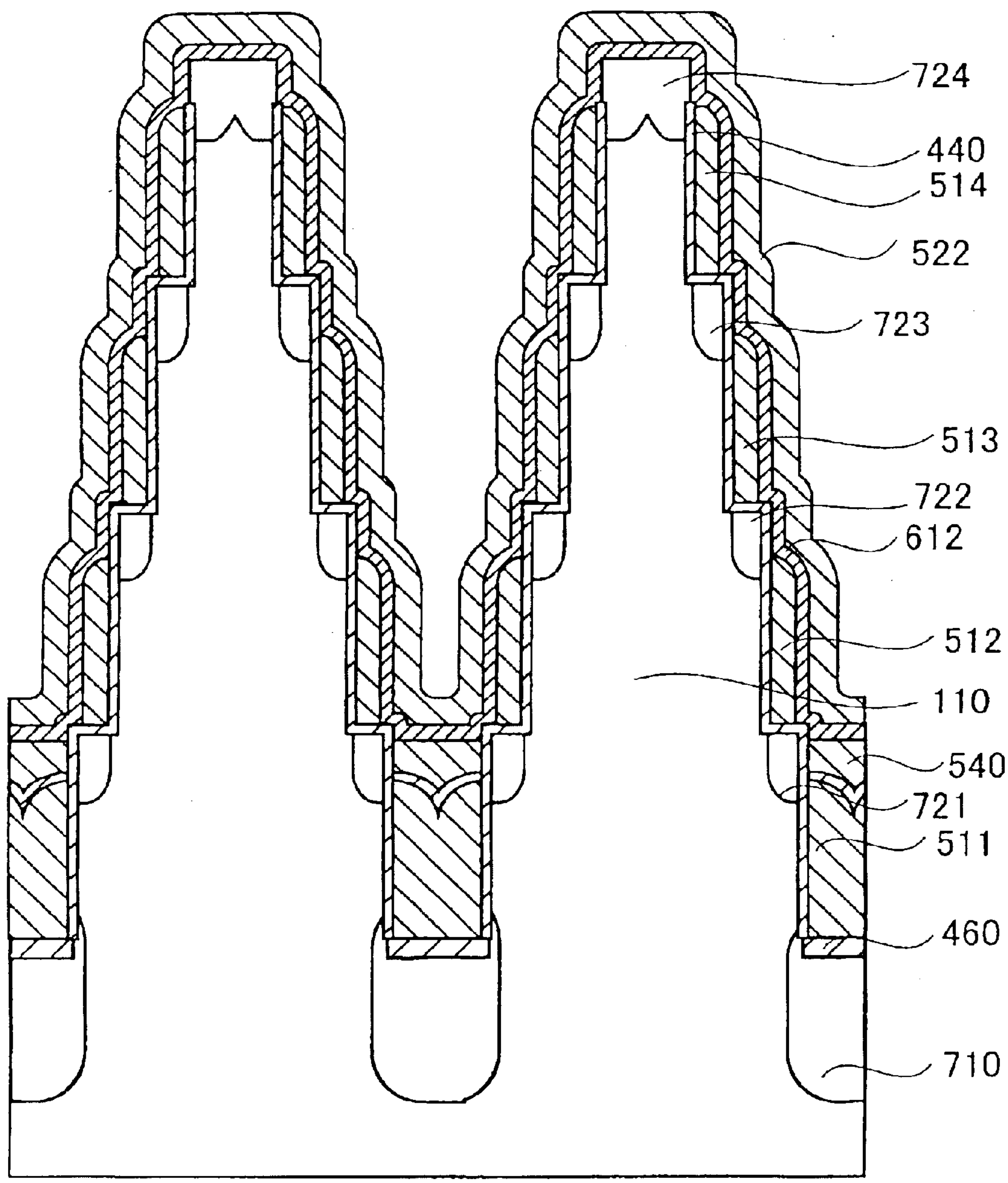
Figure 359:
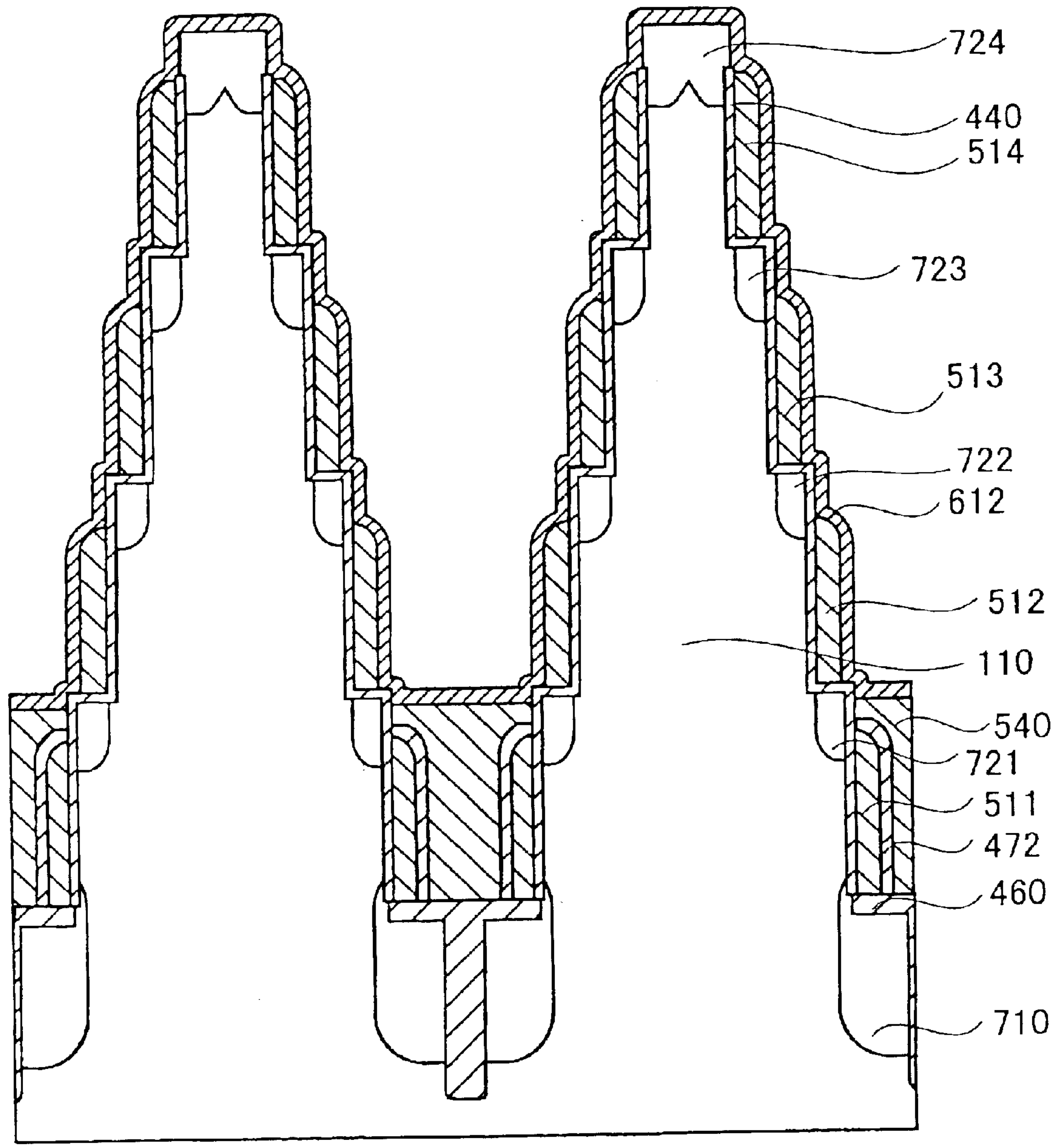
Figure 360:
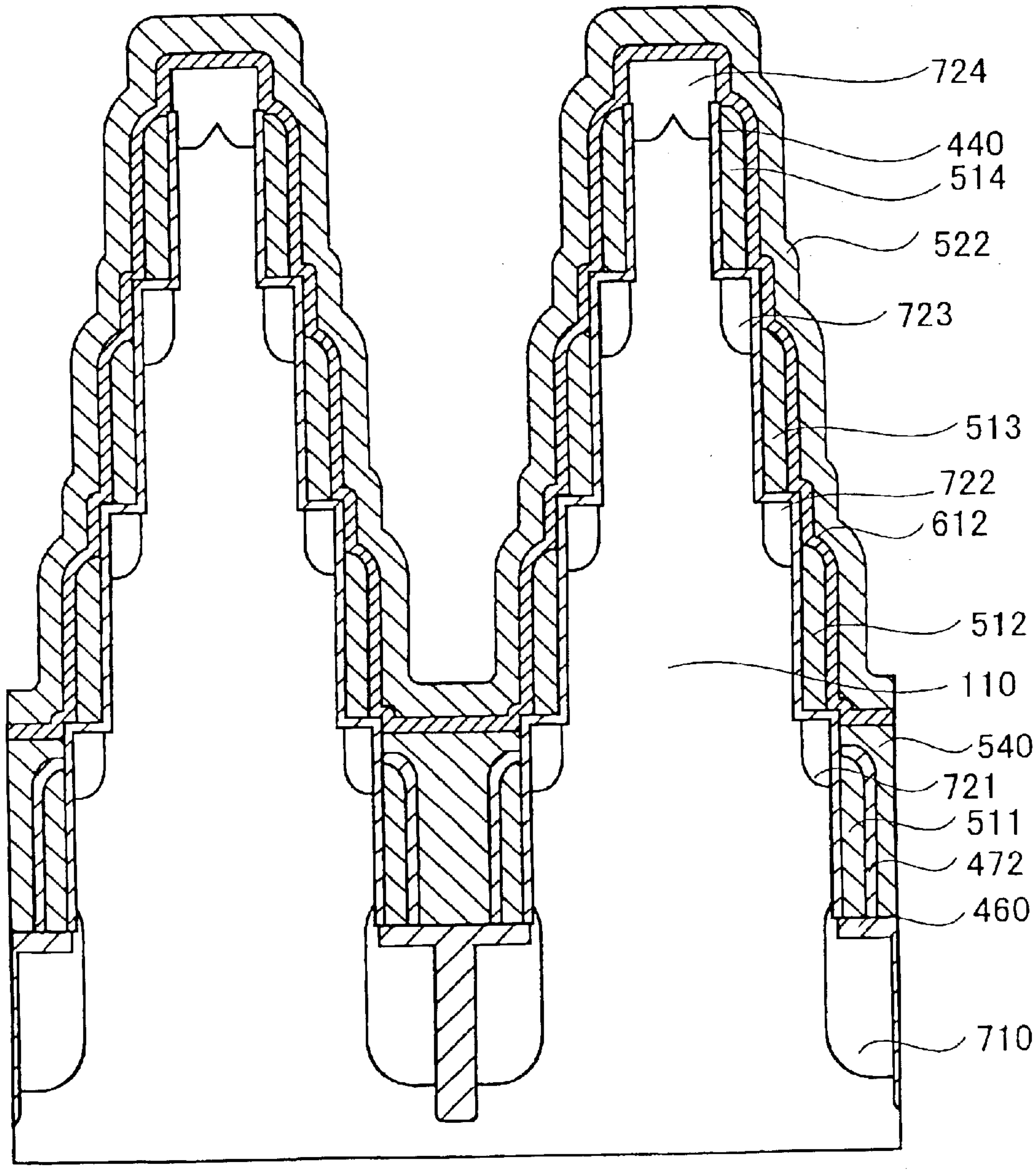

Next an interlayer insulating film 612 is formed on the surface of the exposed first conductive films, i.e., the polysilicon films 512, 513 and 514 (FIG. 334 and FIG. 359). The interlayer insulating film 612 may be formed of an ONO film. Subsequently, a polysilicon film 522, for example, is deposited to 15 to 150 nm as a second conductive film (FIG. 335 and FIG. 360).

Figure 336:
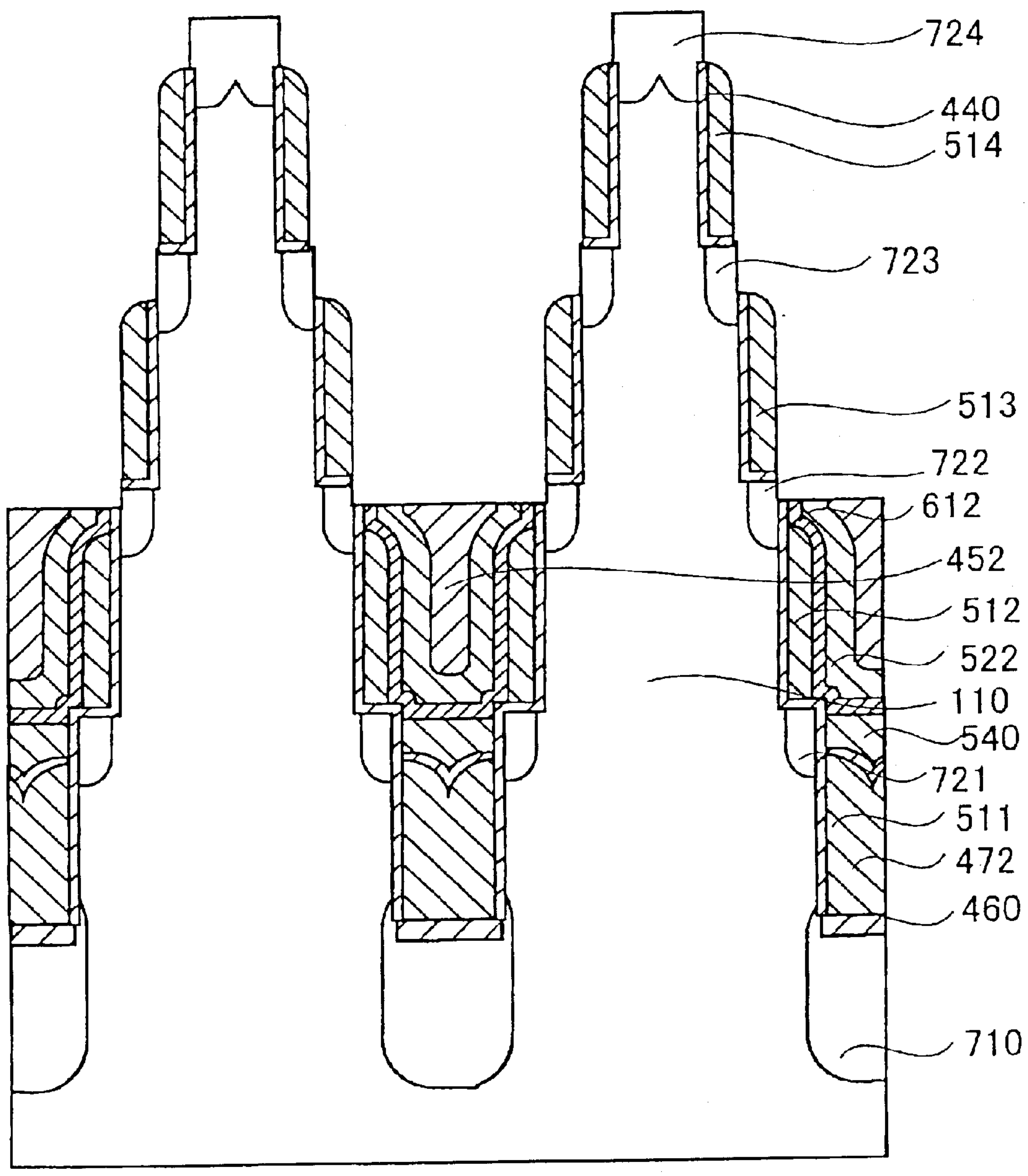
Figure 361:
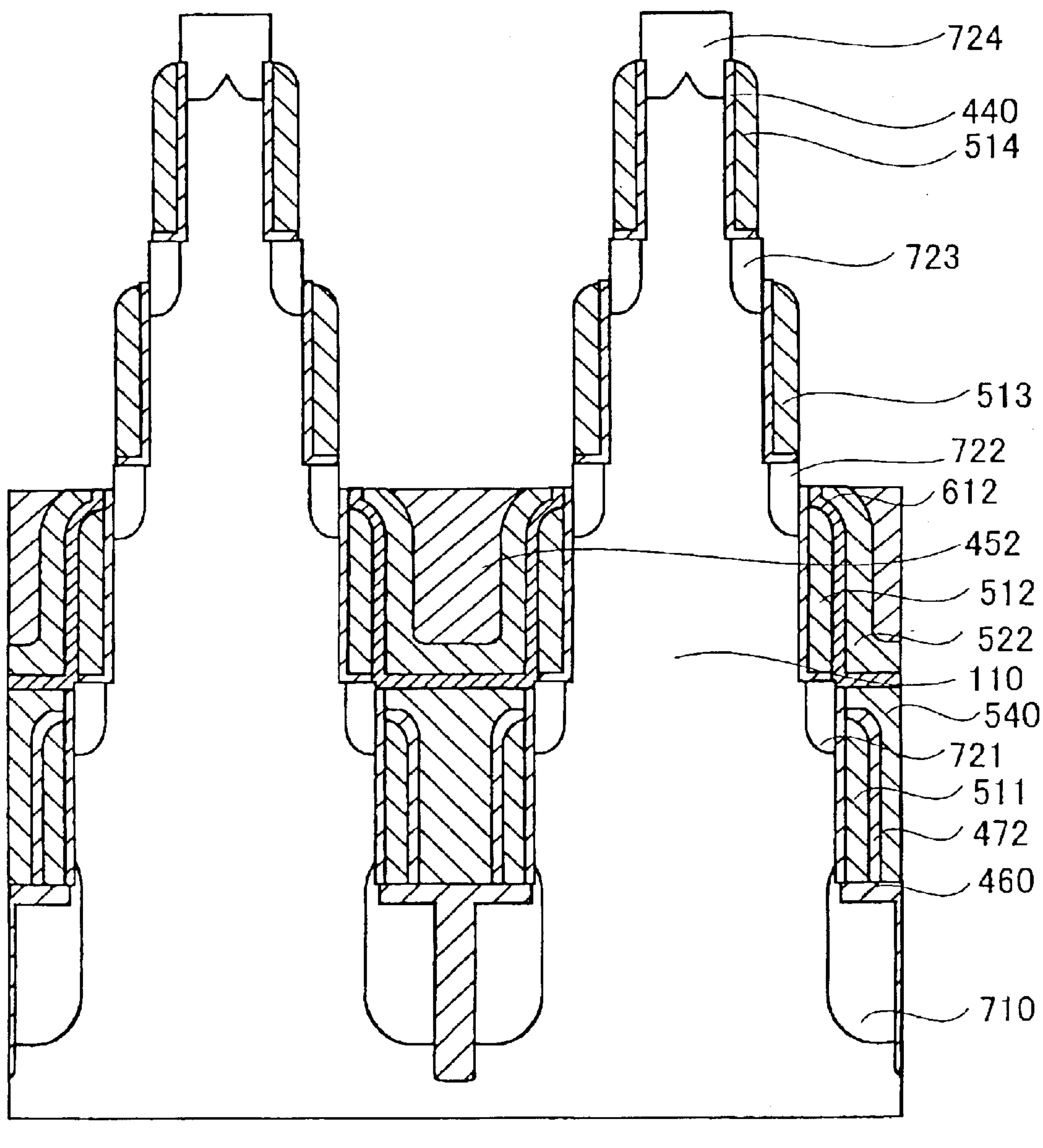

Thereafter, a silicon oxide film 452, for example, is deposited to about 20 to 200 nm as a sixth insulating film and etched back to a desired depth. Then, for example, by isotropic etching, the exposed part of the polysilicon film 522 is selectively removed to arrange the polysilicon film 522 on the sidewall of the polysilicon film 512 with intervention of the interlayer insulating film 612 (FIG. 336 and FIG. 361). The control gate in the lower tier, i.e., the polysilicon film 522 is all kept connected by protection of the silicon film 452.

Figure 337:
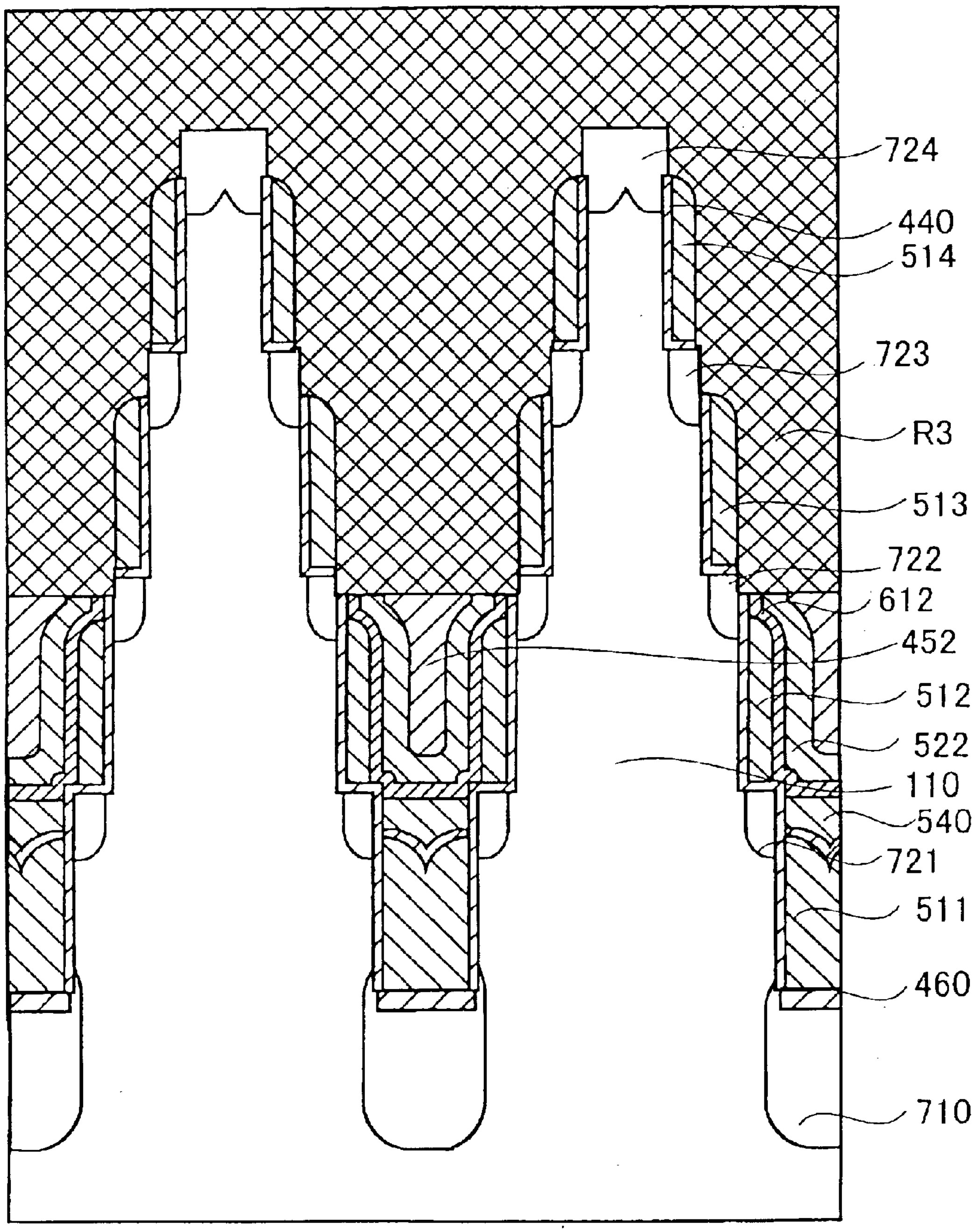
Figure 362:
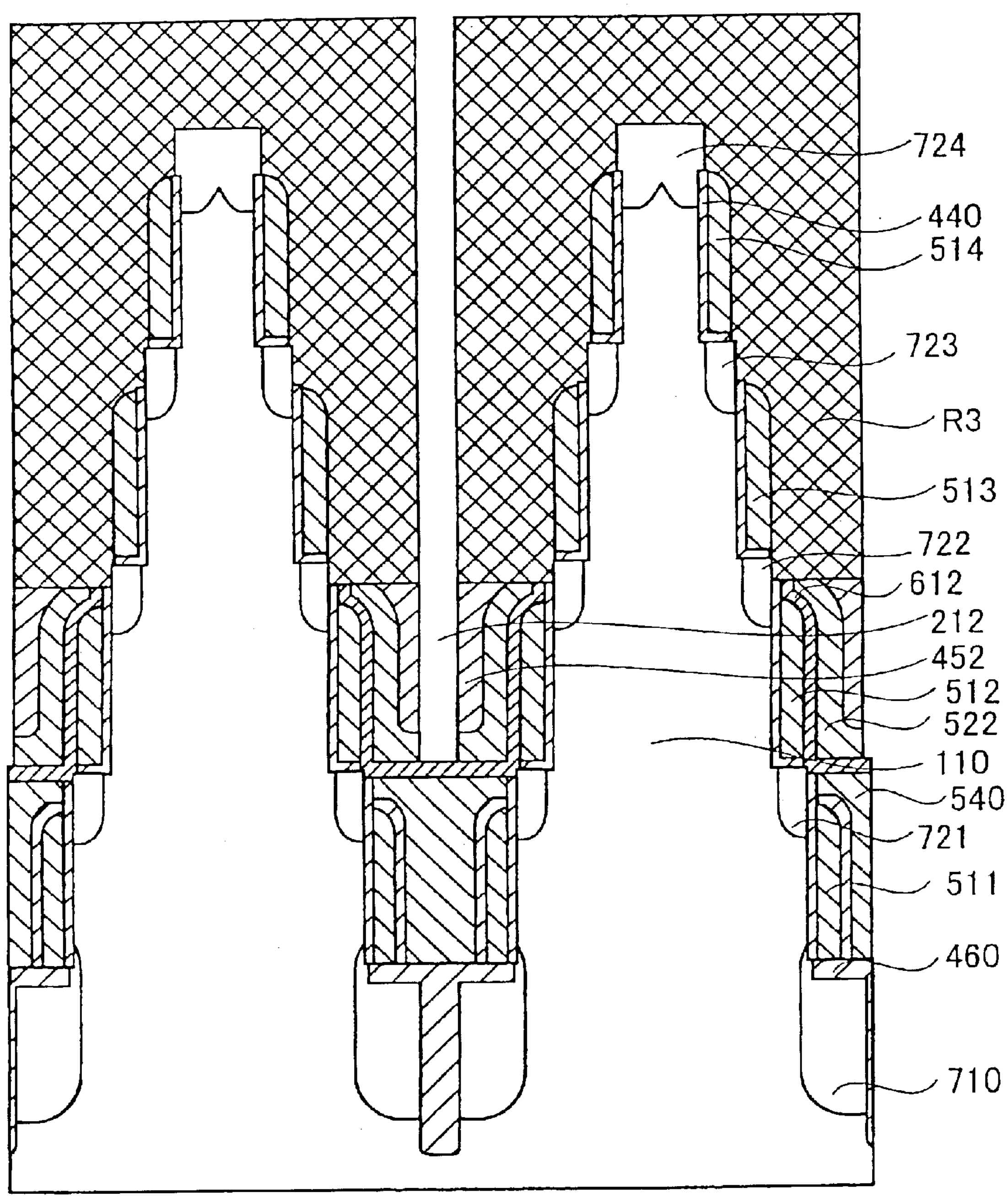

Thereafter, the exposed part of the interlayer insulating film 612 is removed, and then, the silicon oxide film 452 is etched by RIE using as a mask a resist film R3 patterned by a known photolithography technique. Sequentially the polysilicon film 522 is etched to form a first trench 212 (FIG. 337 and FIG. 362). Thereby a third wiring layer to be a control gate line is formed by separation which is continuous in direction A–A' of FIG. 1.

Figure 338:
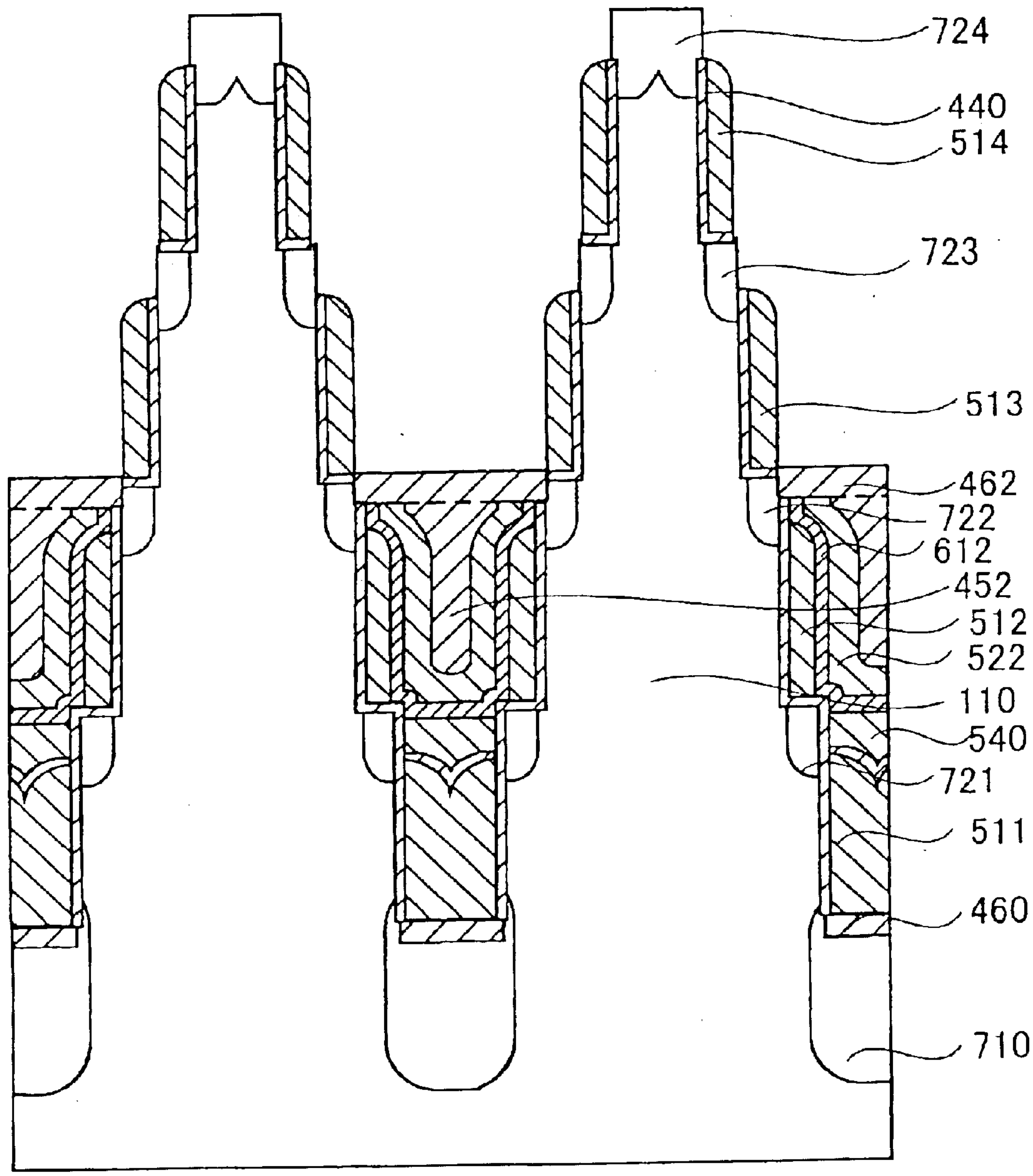
Figure 363:
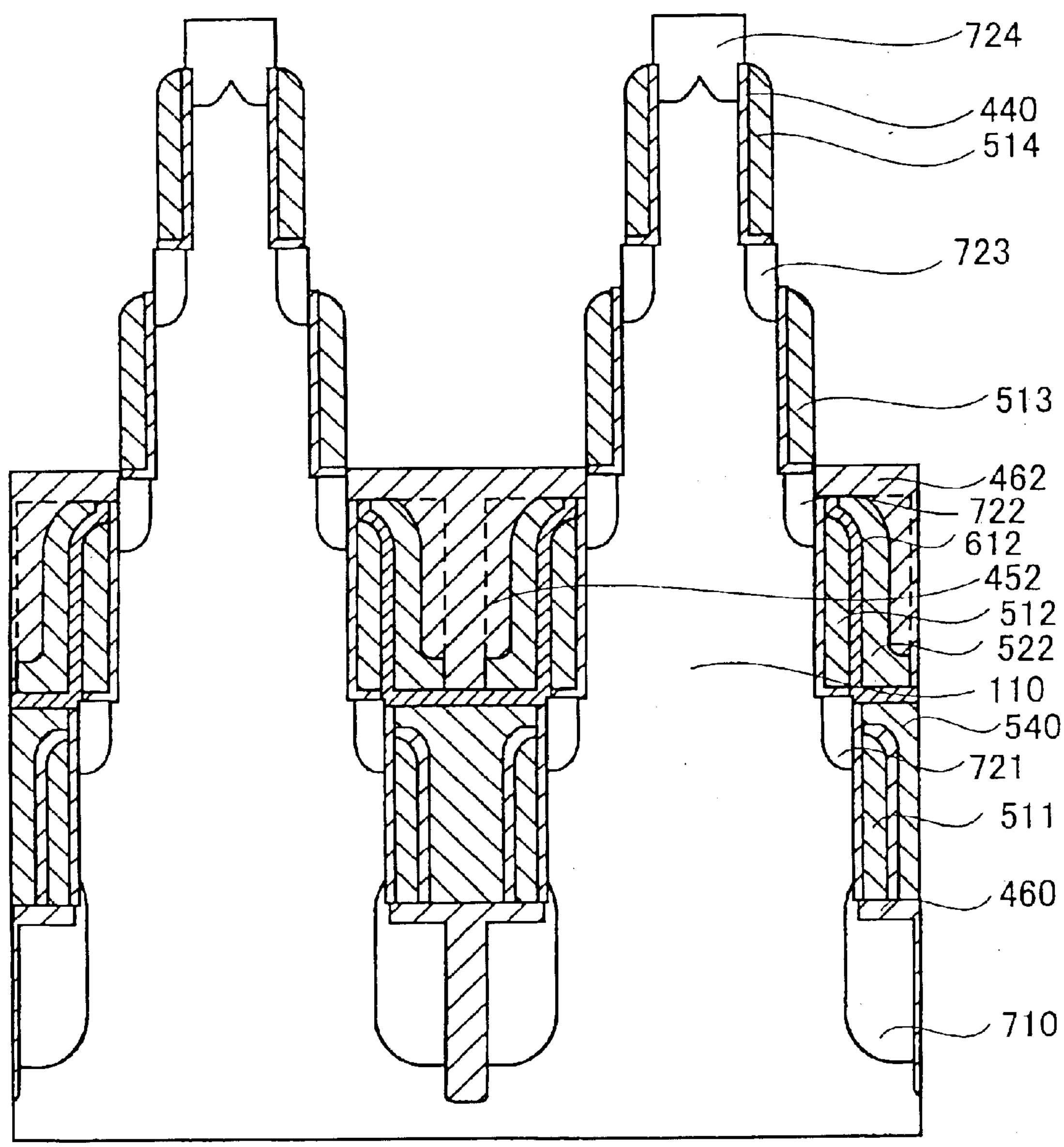

Next, a silicon oxide film 462, for example, is deposited to about 20 to 200 nm as a seventh insulating film and is isotropically etched to be buried and cover the first trench 212 and the top of the polysilicon film 522 (FIG. 338 and FIG. 363). The interlayer insulating film 612 formed on the polysilicon films 513 and 514 may be removed after the formation of the first trench 212 or after the burying of the silicon oxide film 462 without limitation. Alternatively, the interlayer insulating film 612 may not be removed.

Subsequently, an interlayer insulating film 613 is formed on the exposed surface of the polysilicon films 513 and 514. In the case where the interlayer insulating film 612 formed on the polysilicon films 513 and 514 is not removed in the previous step, a silicon oxide film is deposited to 5 to 10 nm by CVD.

Next, a polysilicon film 523 is deposited 15 to 150 nm as a second conductive film.

Thereafter, a silicon oxide film 453, for example, is deposited to about 20 to 200 nm as a sixth insulating film and etched back to a desired depth. Then, for example, by isotropic etching, the exposed part of the polysilicon film 523 is selectively removed to arrange the polysilicon film 523 on the sidewall of the polysilicon film 513 with intervention of the interlayer insulating film 613. The control gate in the upper tier, i.e., the polysilicon film 523 is all kept connected by protection of the silicon film 453.

The exposed part of the interlayer insulating film 613 is removed, and then, the silicon oxide film 453 is etched by RIE using as a mask a resist film R4 patterned by a known photolithography technique. Sequentially the polysilicon film 523 is etched to form a first trench 213. Thereby a third wiring layer to be a control gate line is formed by separation which is continuous in direction A–A' of FIG. 1.

Figure 339:
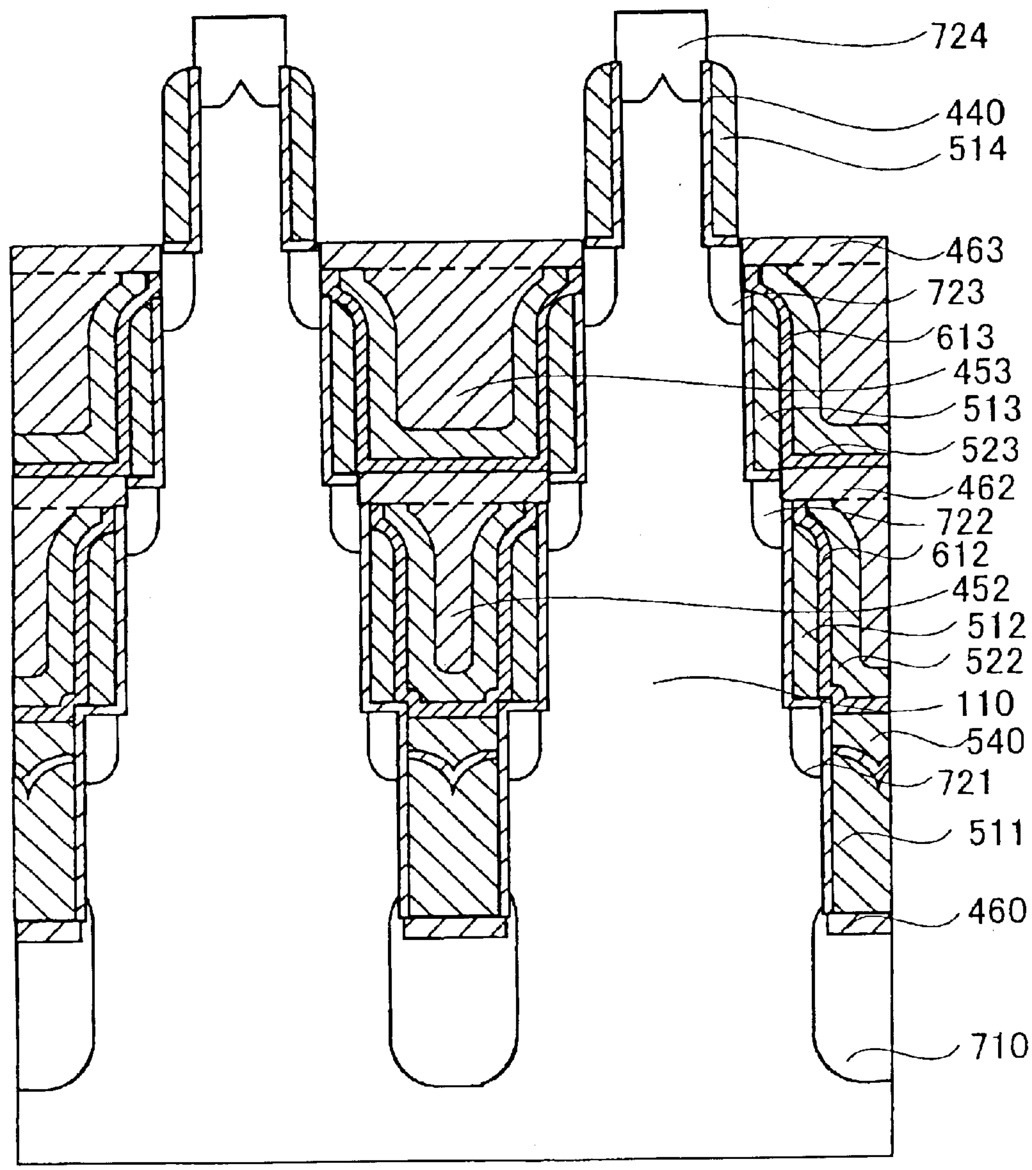
Figure 364:
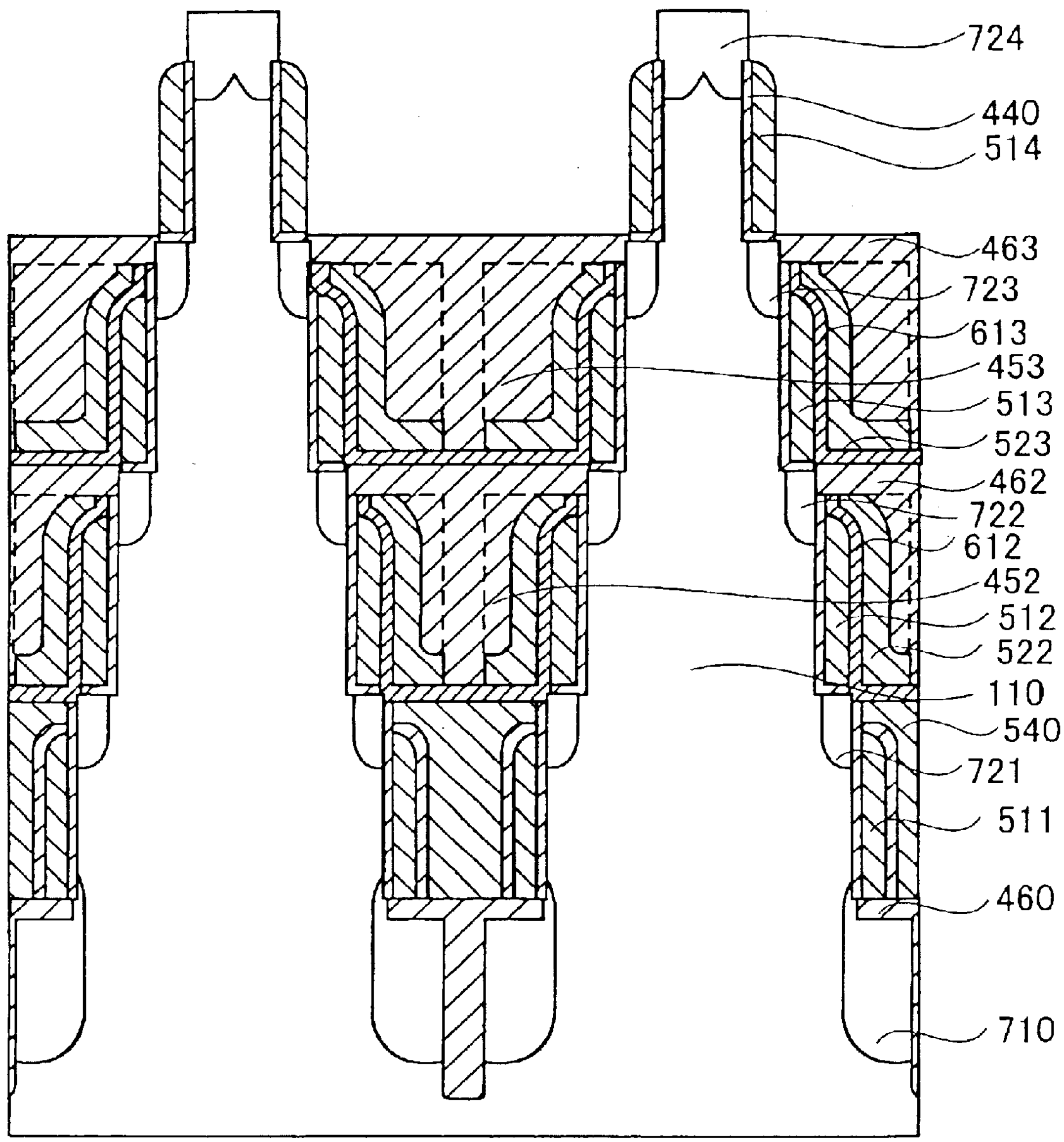

Next, a silicon oxide film 463, for example, is deposited to about 20 to 200 nm as a seventh insulating film and is isotropically etched to be buried and cover the first trench 213 and the top of the polysilicon film 523 (FIG. 339 and FIG. 364). The interlayer insulating film 613 formed on the polysilicon film 514 may be removed after the formation of the first trench 213 or after the burying of the silicon oxide film 463 without limitation.

Figure 340:
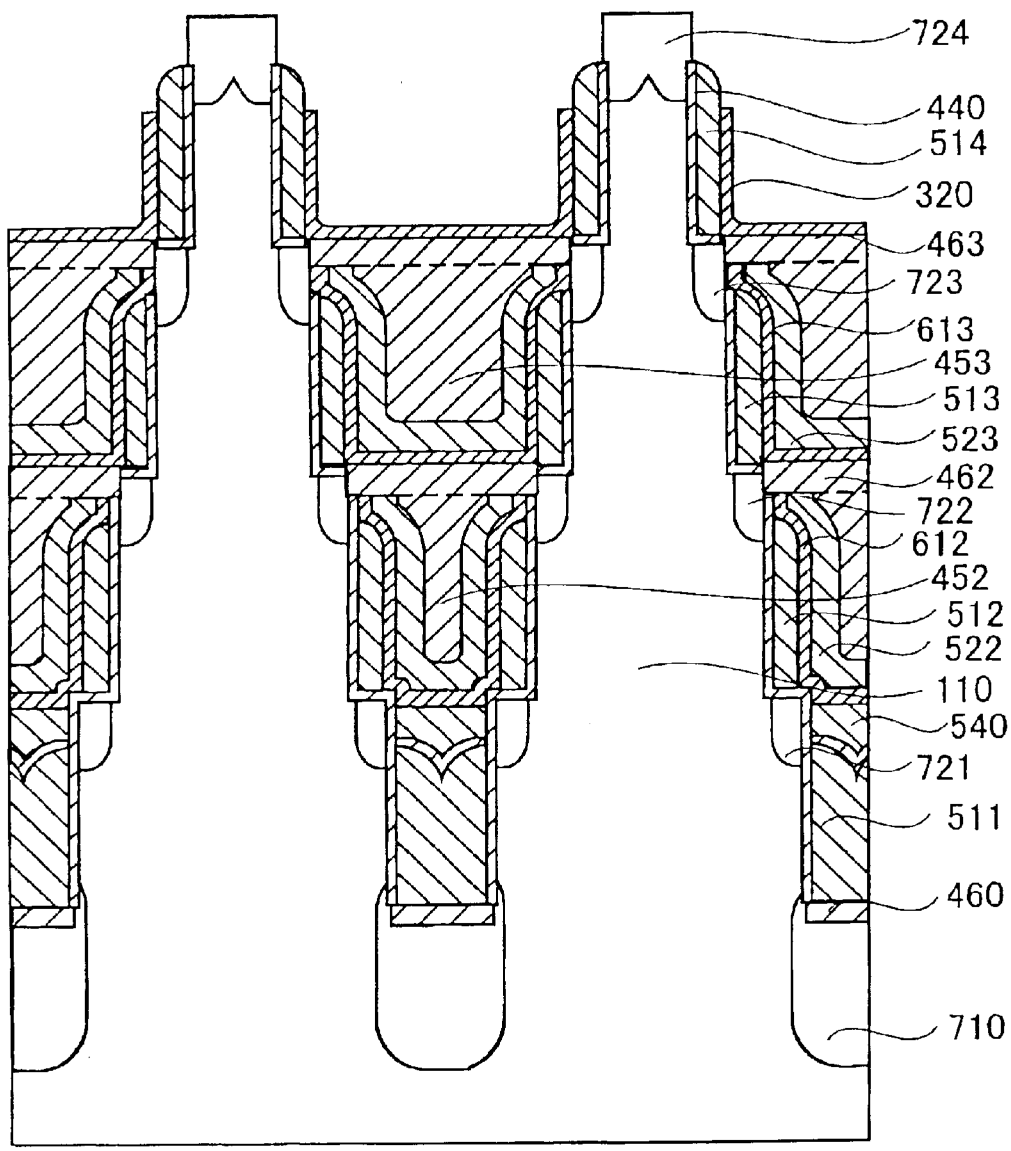
Figure 341:
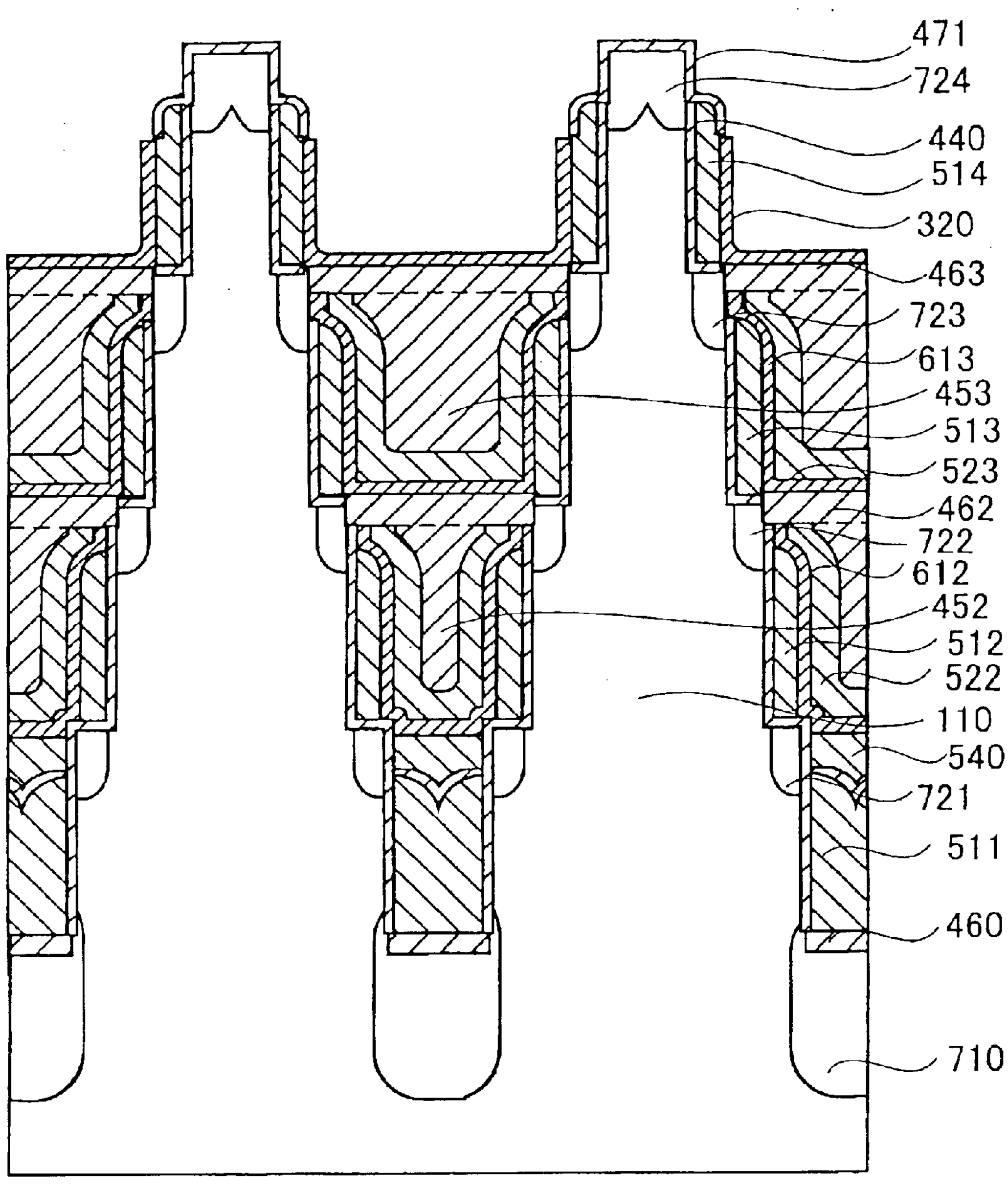
Figure 365:
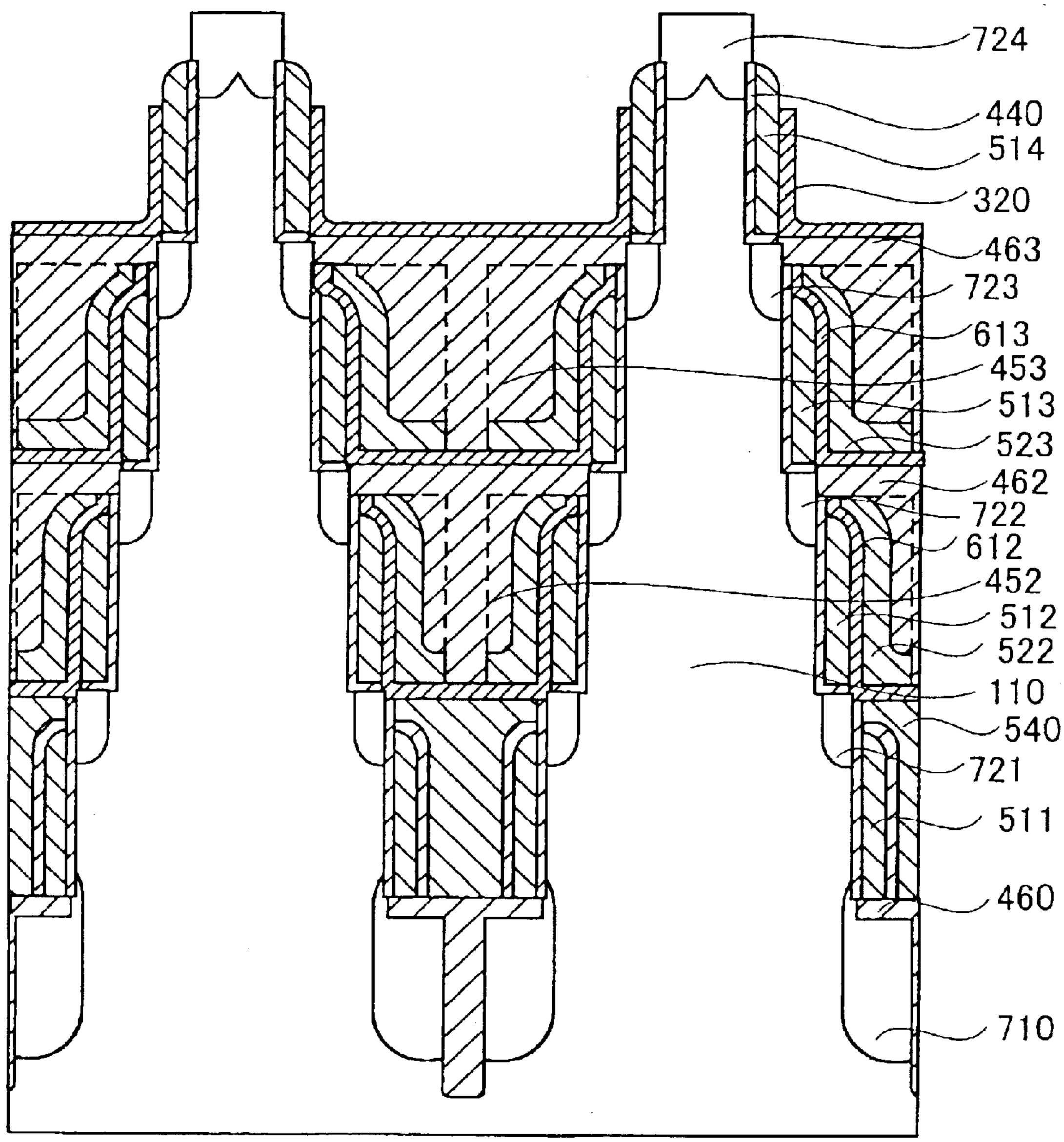

Subsequently, a silicon nitride film 320, for example, is deposited to about 10 to 200 nm as an eighth insulating film to bury the silicon oxide film and/or the resist. The exposed part of the silicon nitride film 320 is isotropically etched to expose the top of the island-like semiconductor layer 110 and at least a part of the polysilicon film 514. Thereafter, the silicon oxide film and/or the resist used for burying is/are selectively removed (FIG. 340 and FIG. 365).

Figure 366:
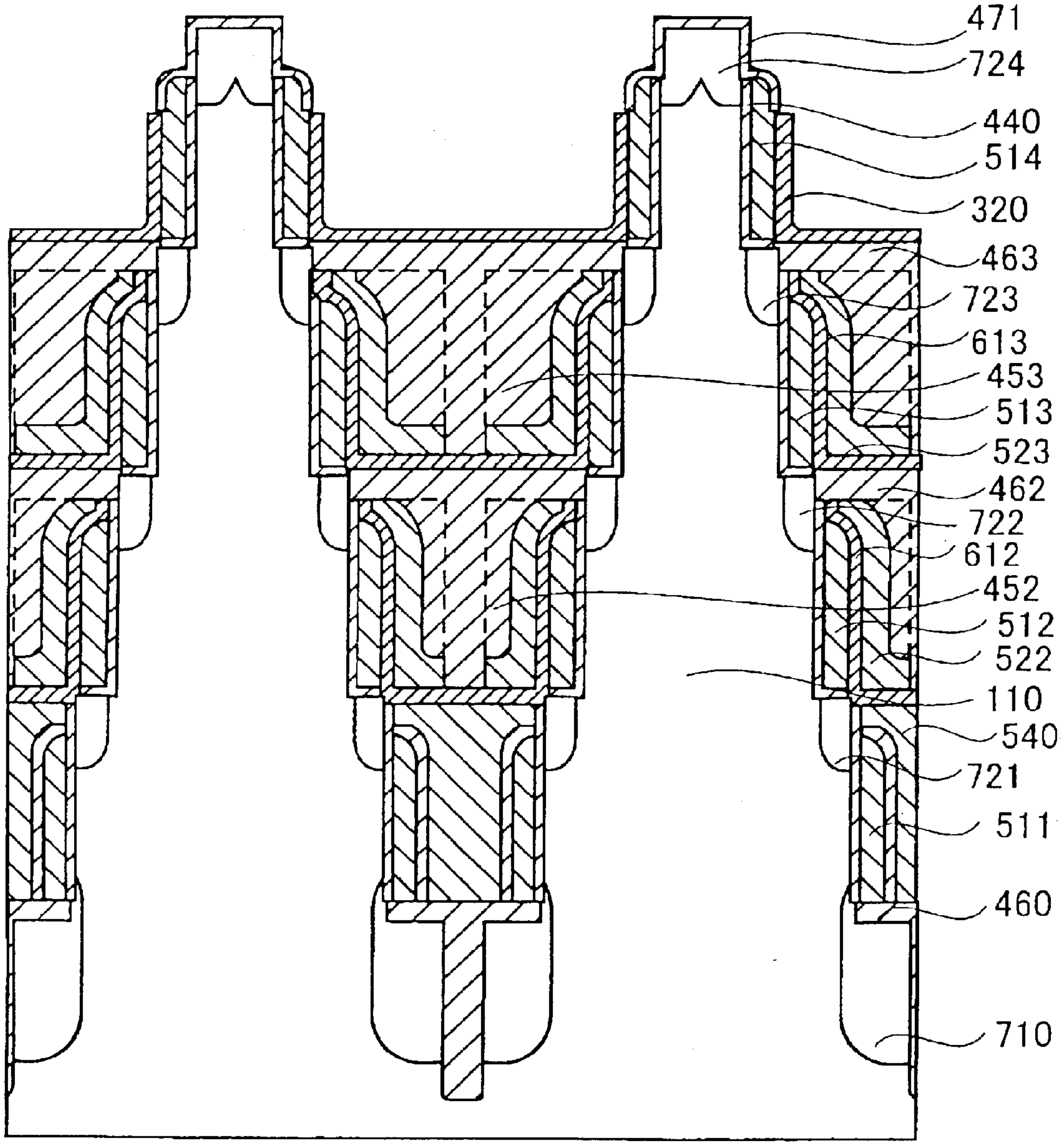

Subsequently, the top of the island-like semiconductor layer 110 and at least a part of the polysilicon film 514 are thermally oxidized to form, for example, a silicon oxide film 471 of about 15 to 200 thickness as a ninth insulating film (FIG. 314 and FIG. 366).

Figure 342:
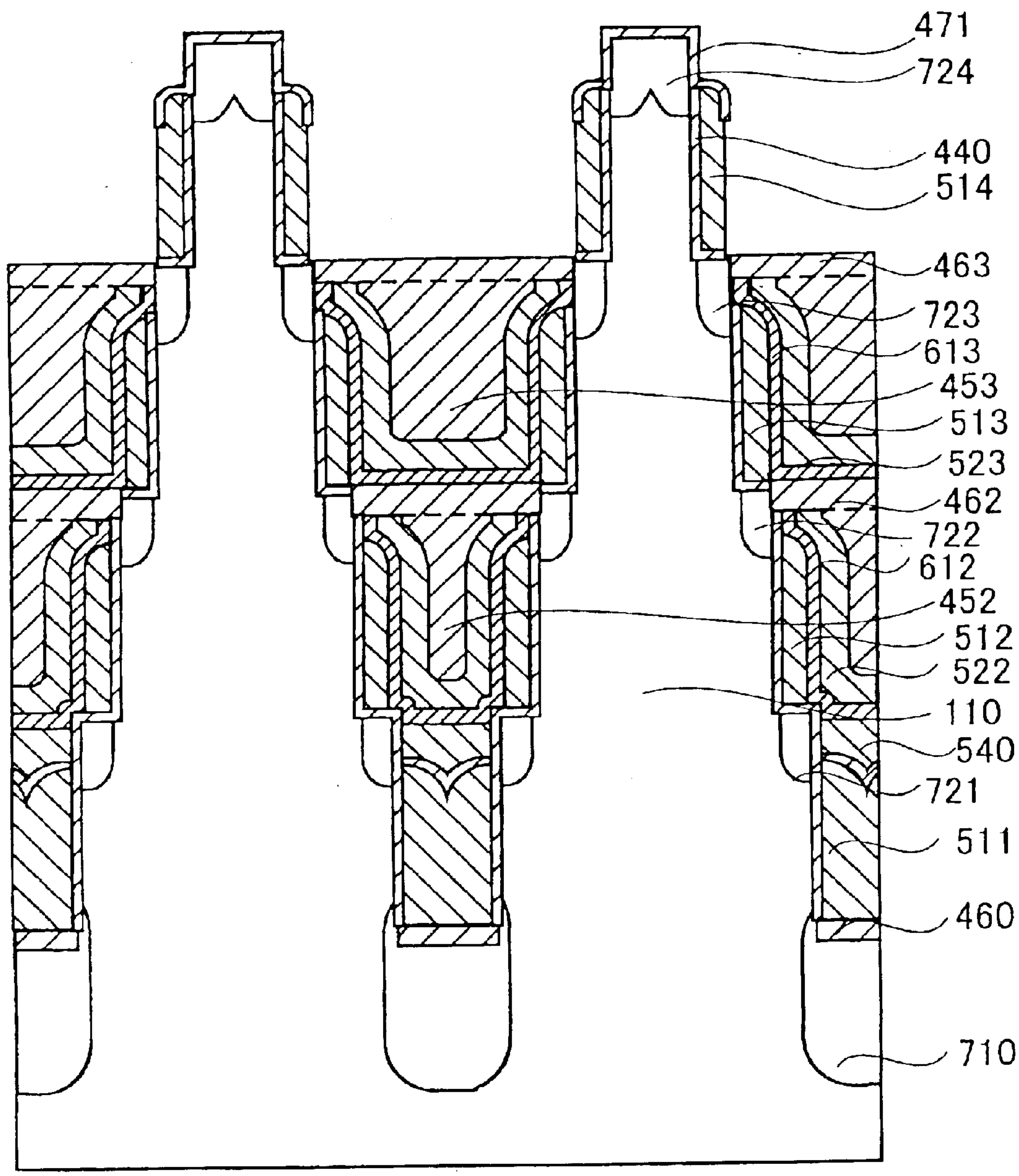
Figure 367:
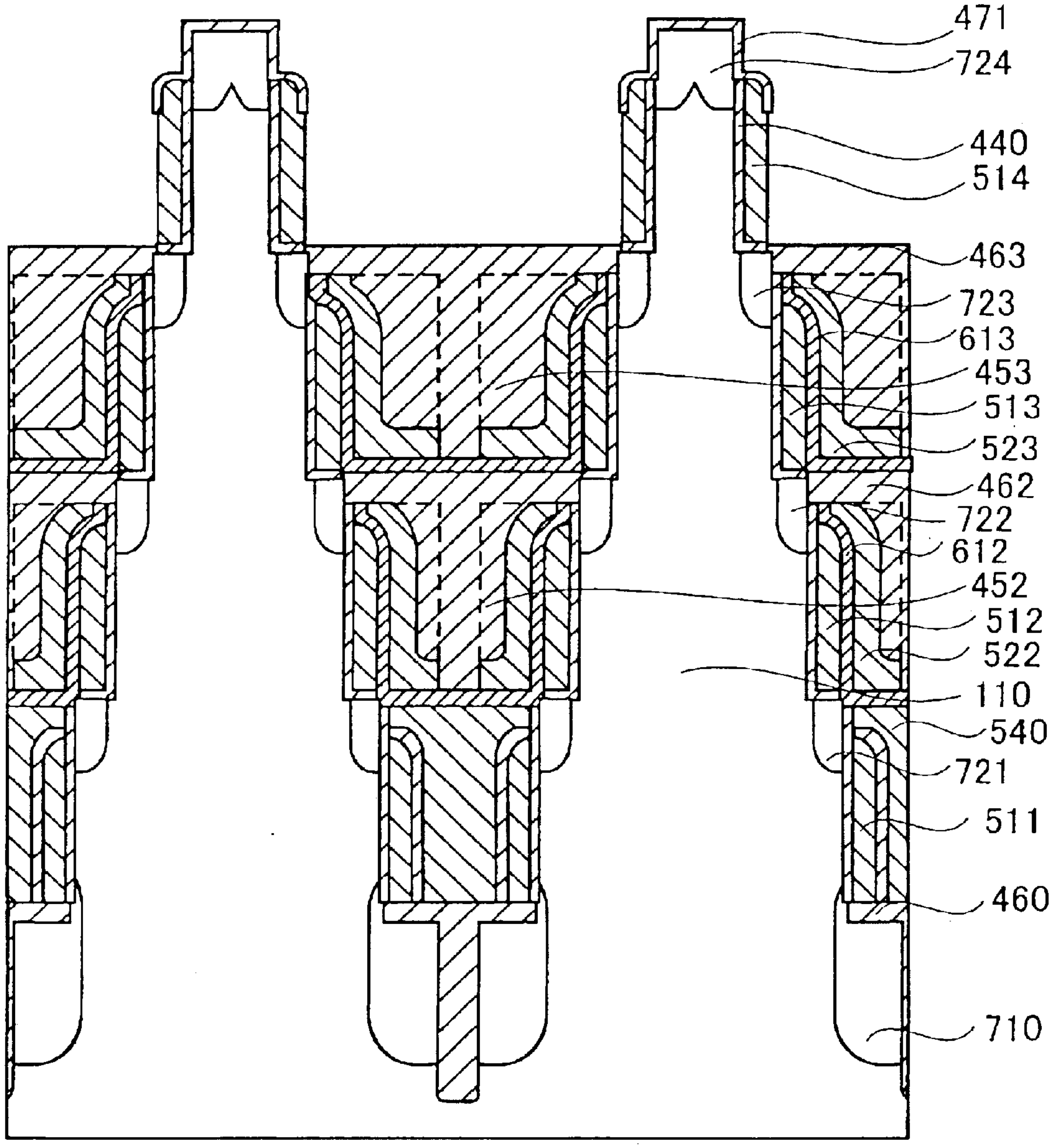

Thereafter, the silicon nitride film 320 is selectively removed by isotropic etching to expose a part of the polysilicon film 514 (FIG. 342 and FIG. 367).

Subsequently, a polysilicon film 534, for example, is deposited to 15 to 150 nm as a third insulating film. Thereafter, a silicon oxide 454, for example, is deposited to 20 to 200 nm as a sixth insulating film and etched back to a desired depth. The selection gate in the upper tier, i.e., the polysilicon film 514 is all kept connected by the polysilicon film 534.

Thereafter, the silicon oxide film 454 is etched by RIE using as a mask a resist film R5 patterned by a known photolithography technique to form a first trench 214 and expose the polysilicon film 534 at the bottom of the first trench 214.

Figure 343:
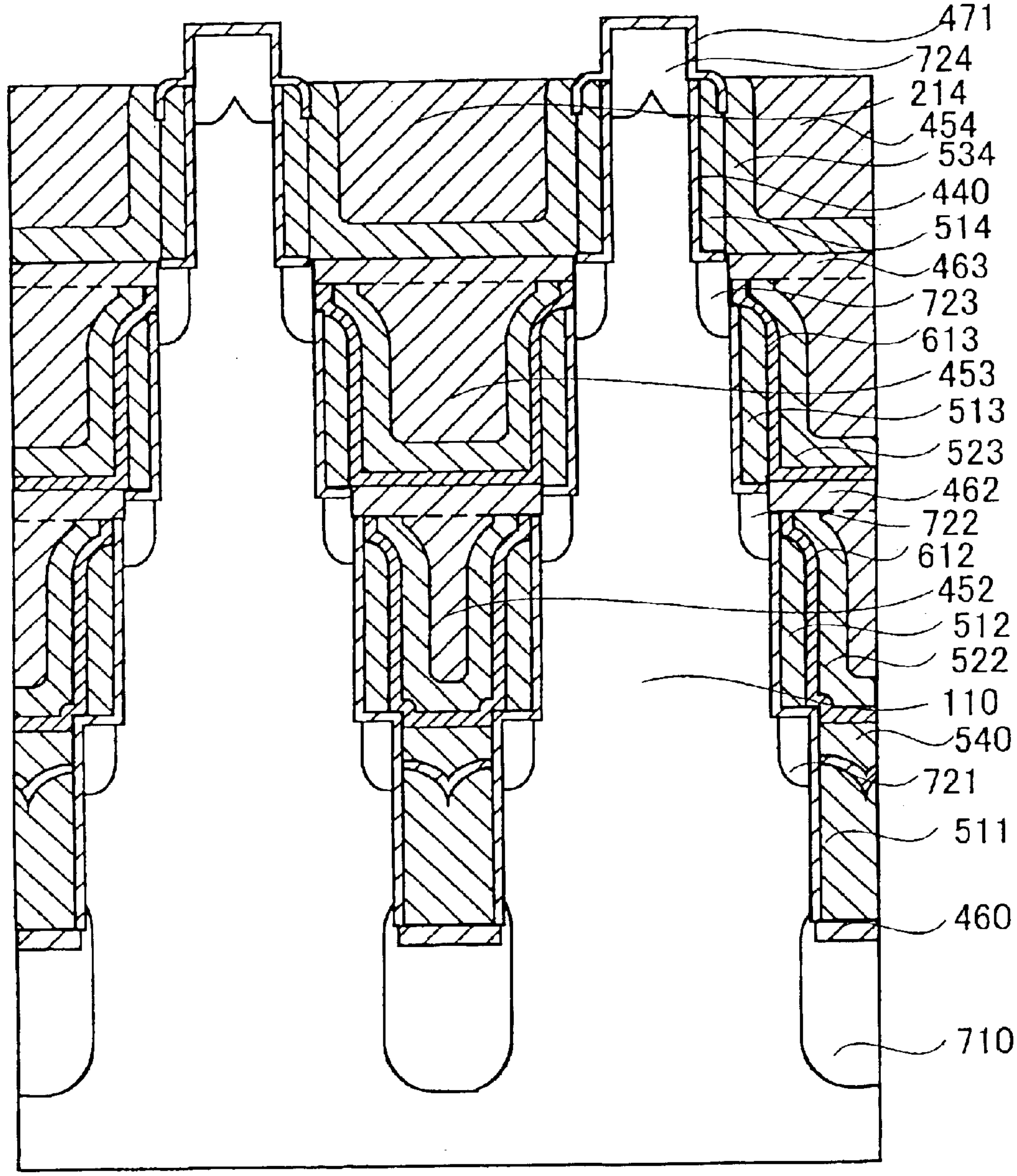
Figure 368:
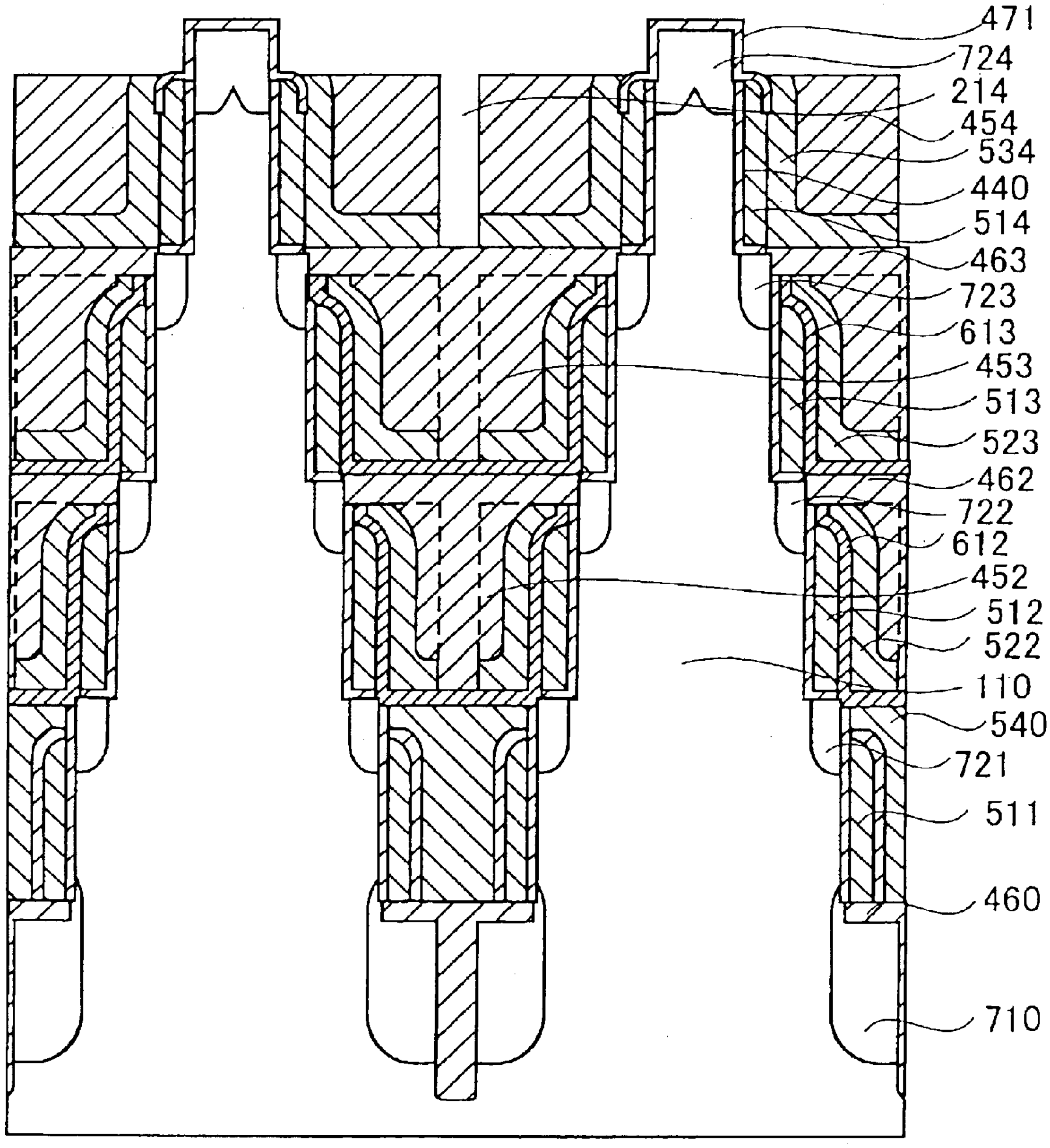

Subsequently, the polysilicon film 534 exposed with respect to the silicon oxide film 464 is electively removed by isotropic etching (FIG. 343 and FIG. 368). The selection gate, i.e., the polysilicon film 514, formed on the top of the island-like semiconductor layer 110 and the uppermost tier of the island-like semiconductor layer 110 is not etched by protection f the silicon oxide film 471.

Next, a silicon oxide film 464, for example, is deposited to about 20 to 400 nm as a seventh insulating film and etched back or CM-polished to expose the upper portion of the island-like semiconductor layer 110 provided with the impurity diffusion layer 724. The impurity concentration is adjusted as required at the top of the island-like semiconductor layer 110, for example, by ion implantation to connect the fourth wiring layer 840 to the top of the island-like semiconductor layer 110 in a direction crossing the direction of the second or third wiring layer.

Figure 344:
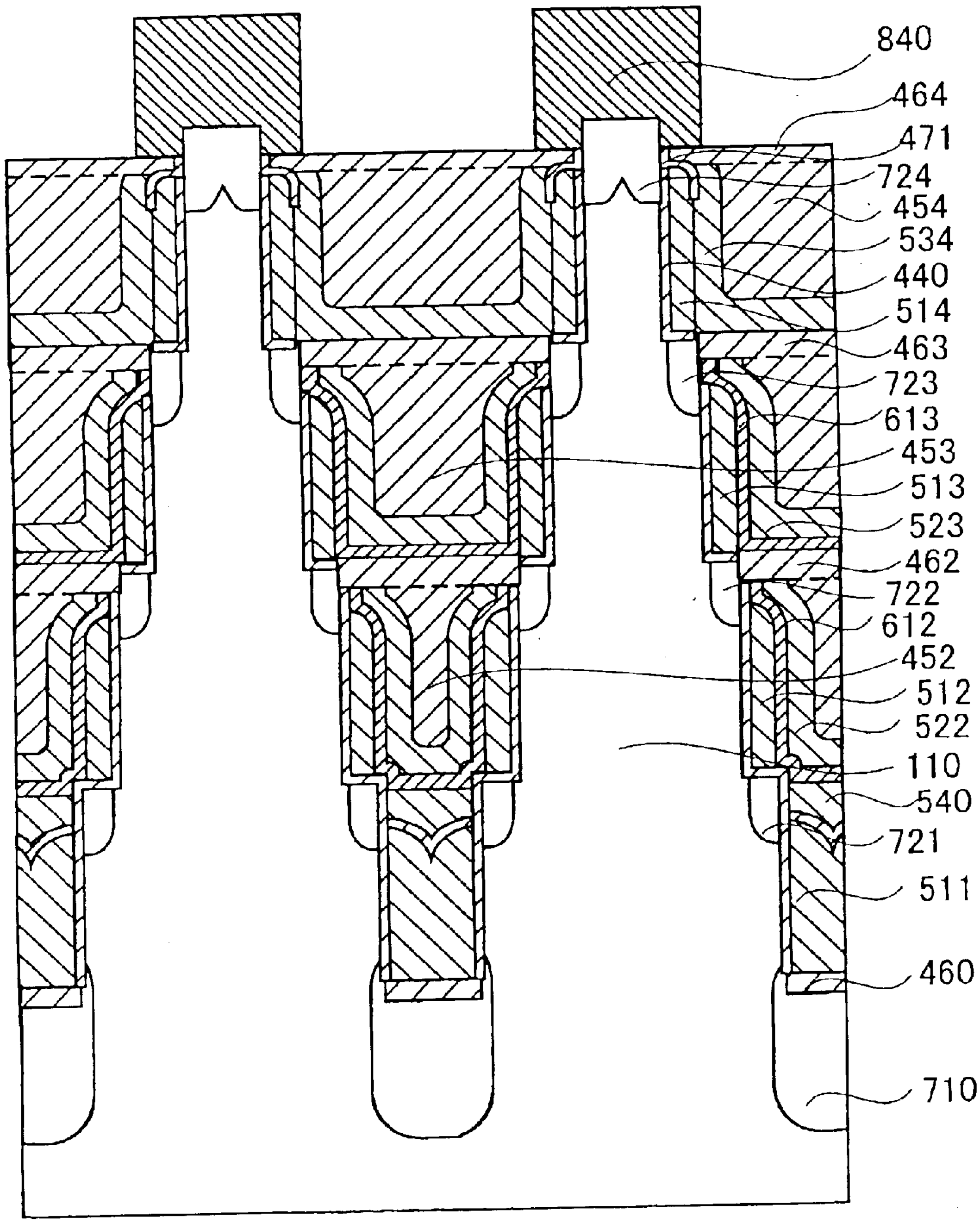
Figure 369:
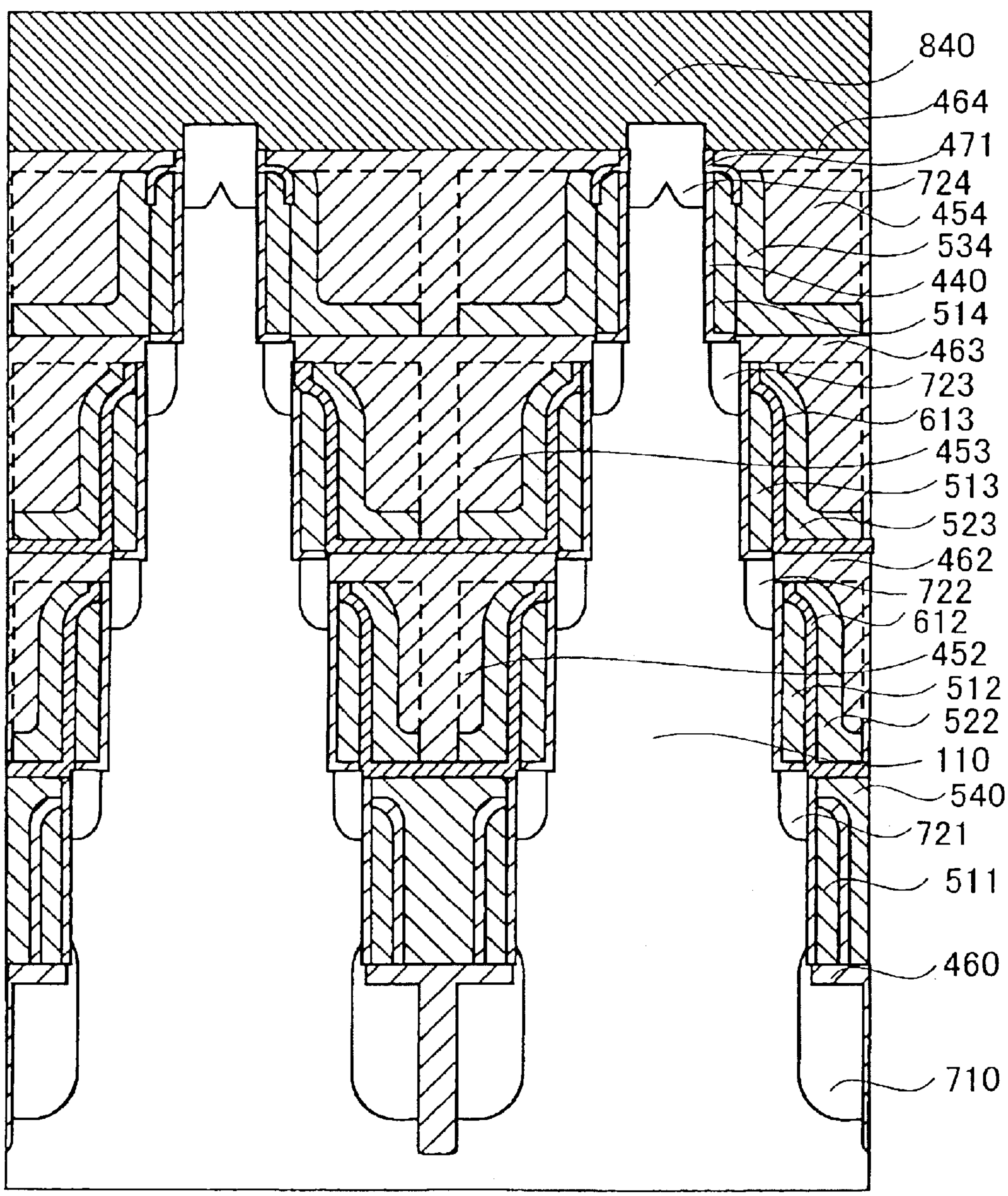

Thereafter, an interlayer insulating film is formed by a known technique, and a contact hole and a metal wiring are formed. Thereby a semiconductor memory is realized which has a memory function according to the state of a charge in the charge storage layer which is the floating gate made of the polysilicon film (FIG. 344 and FIG. 369).

Thus effect similar to that of Production Example 1 can be obtained.

PRODUCTION EXAMPLE 6

The following shows an example in which, before the third wiring layer is formed, an excess gate and the like formed in the selection gate in the uppermost tier are removed for simplifying the process for forming the third wiring layer as much as possible.

FIGS. 370 to 403 and FIGS. 404 to 437 are sectional views taken on line A–A' and line B–B', respectively, of FIG. 1 showing a memory cell array of EEPROM.

Figure 370:
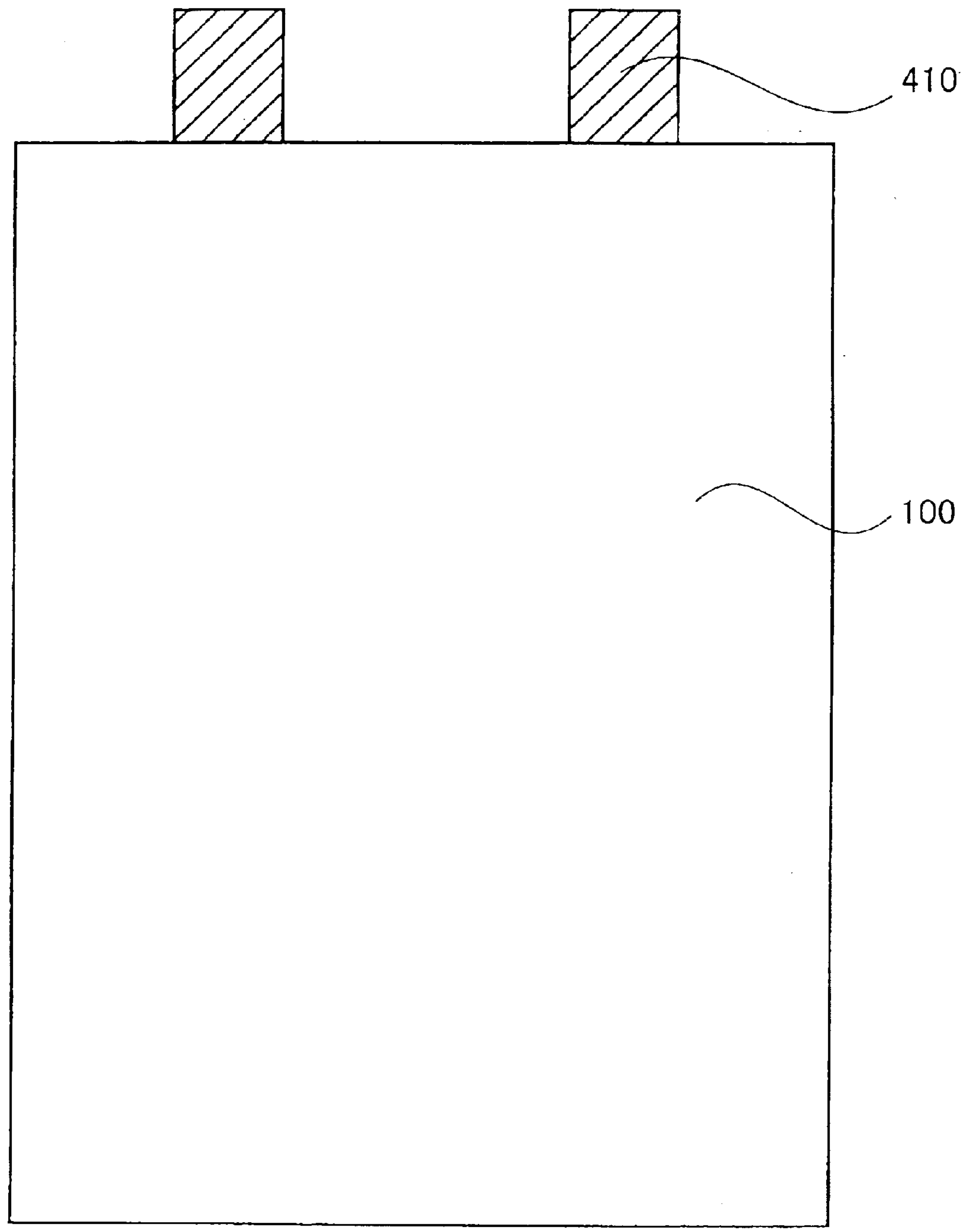
Figure 404:
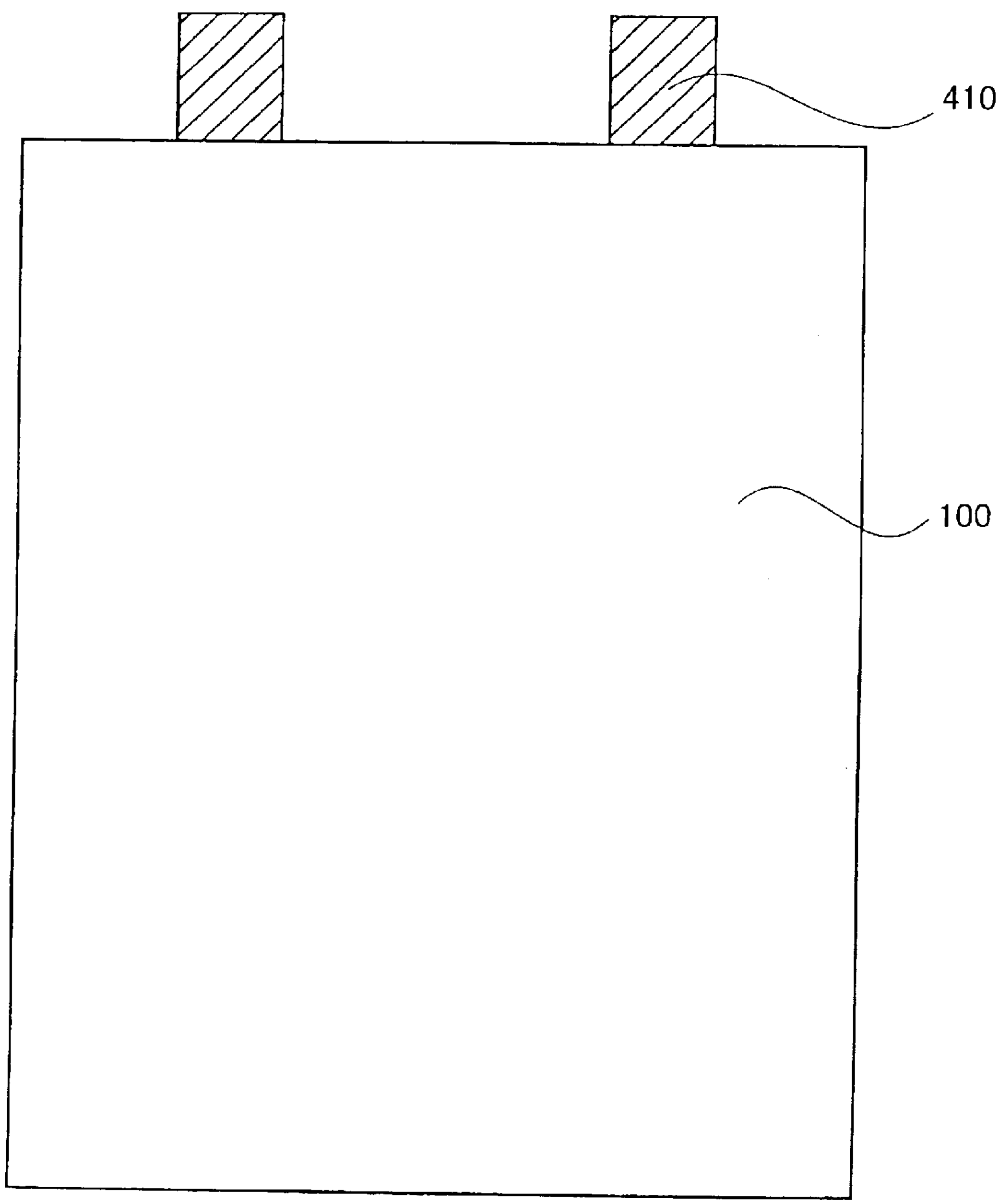

First, a silicon oxide film 410 is deposited to 200 to 2000 nm as a first insulating film to be a mask layer on the surface of a p-type silicon substrate 100 as a semiconductor substrate. Using as a mask a resist film R1 patterned by a known photolithography technique, the silicon oxide film 410 is etched by RIE (FIG. 370 and FIG. 404). The silicon oxide film 410 may be, for example, a silicon nitride film, a conductive film, a laminate film of two or more kinds of materials, or any material that cannot be etched or exhibits a lower etch rate when the p-type silicon substrate 100 is etched by RIE.

Figure 371:
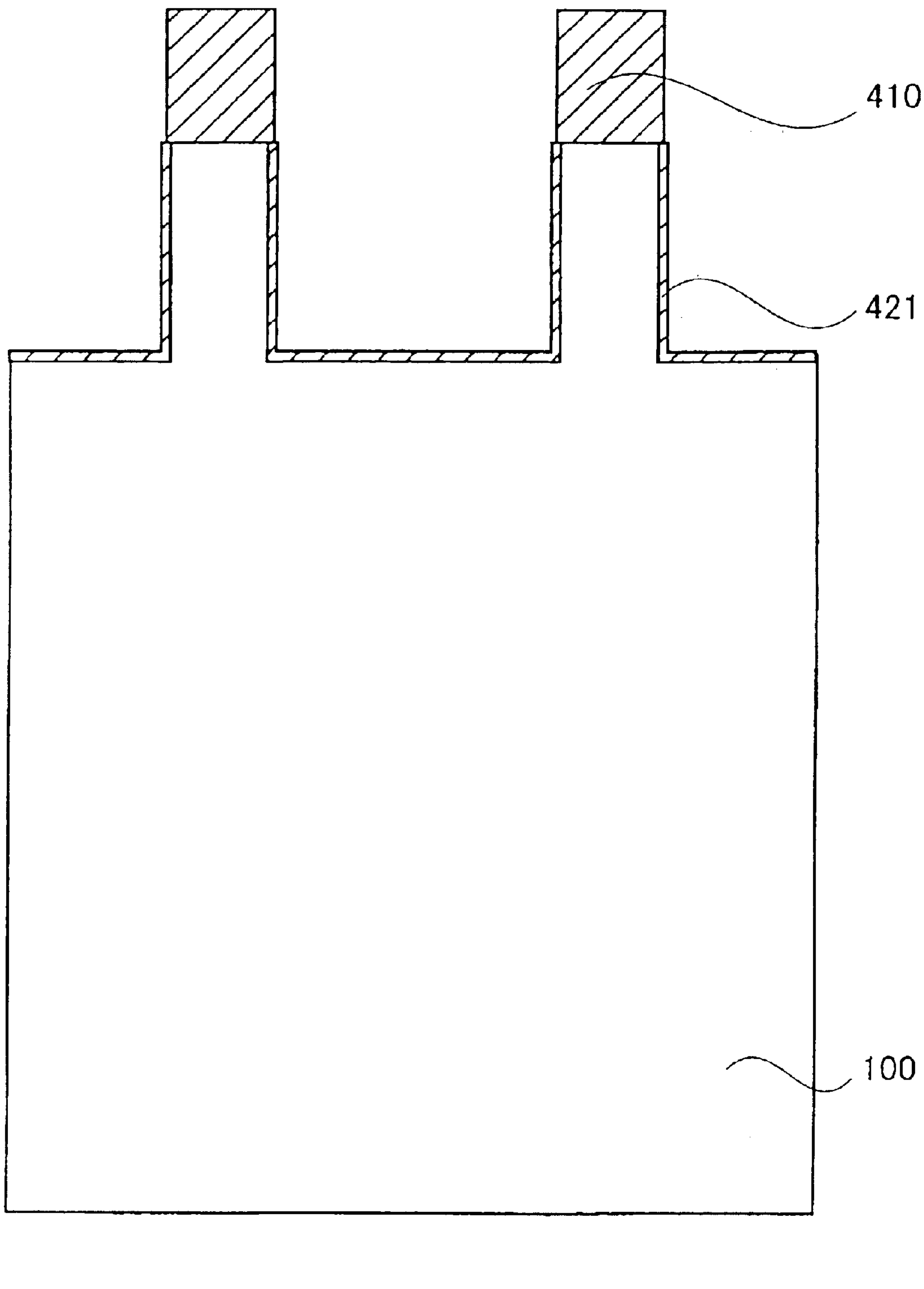
Figure 405:
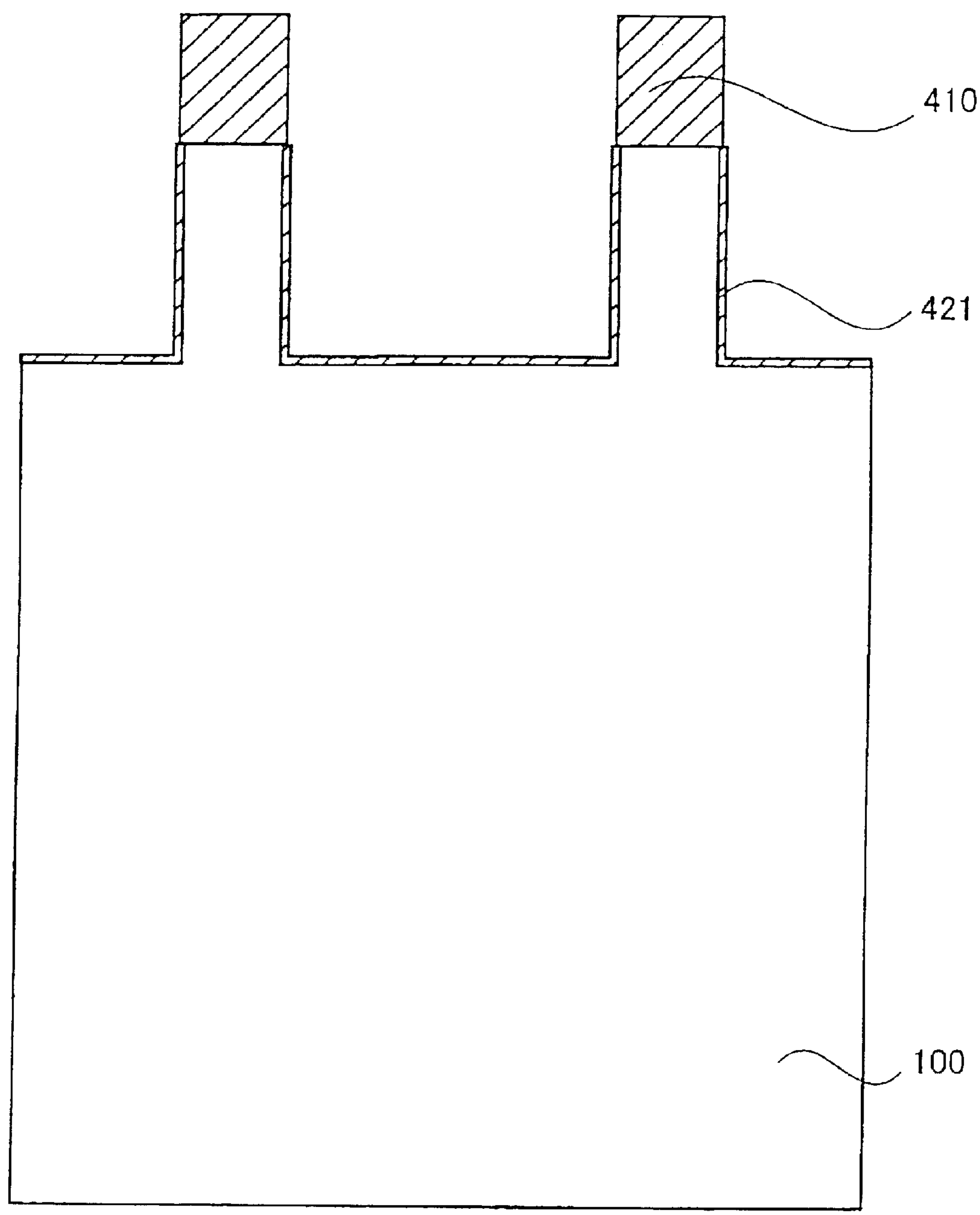

Using the silicon oxide film 410 as a mask, the p-type silicon substrate 100 is etched 50 to 5000 nm by RIE. Thereafter an exposed part of the p-type silicon substrate 100 is thermally oxidized to form a second insulating film, for example, a silicon oxide film 421 of 5 to 100 nm thickness (FIG. 371 and FIG. 405).

Figure 372:
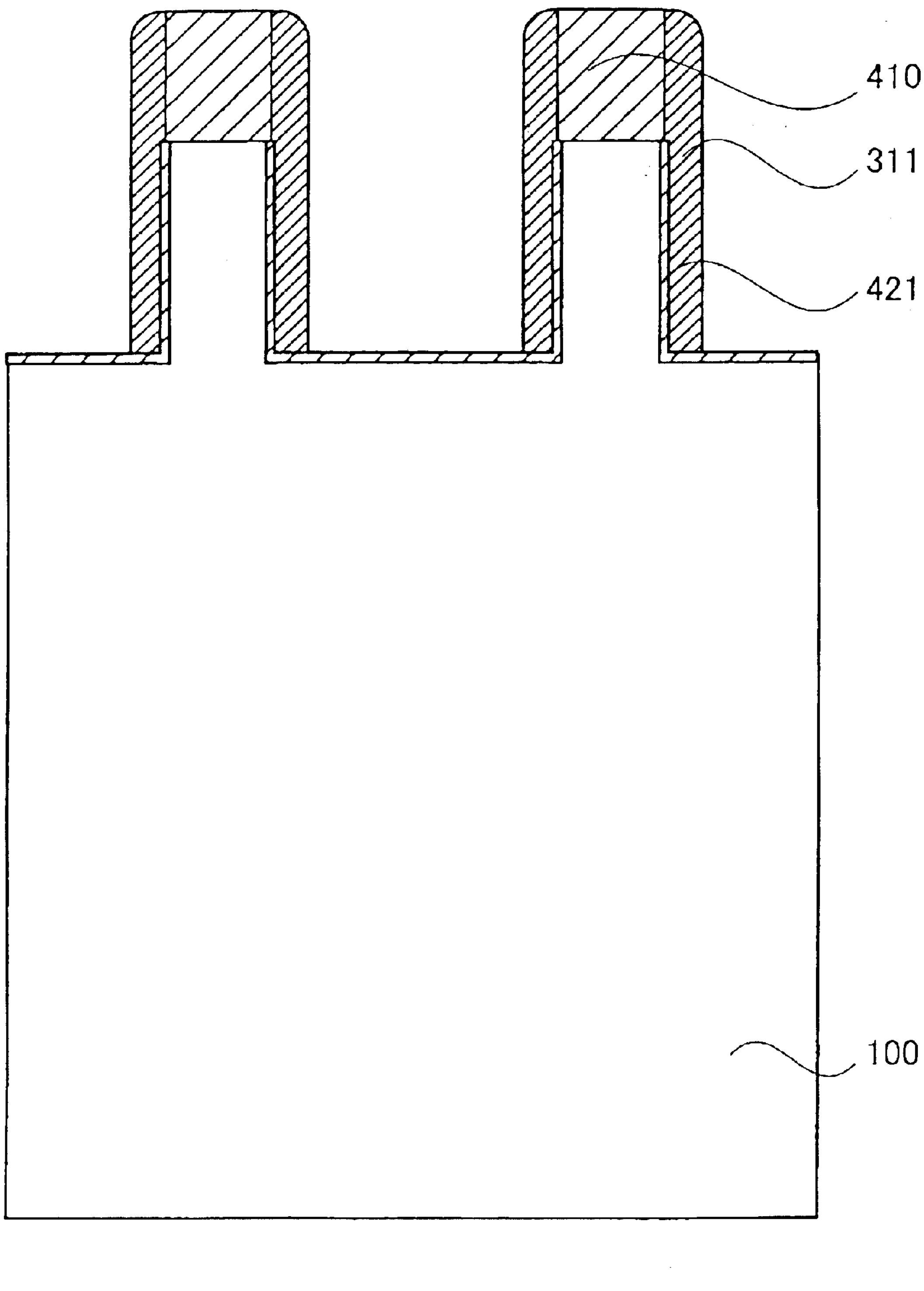
Figure 406:
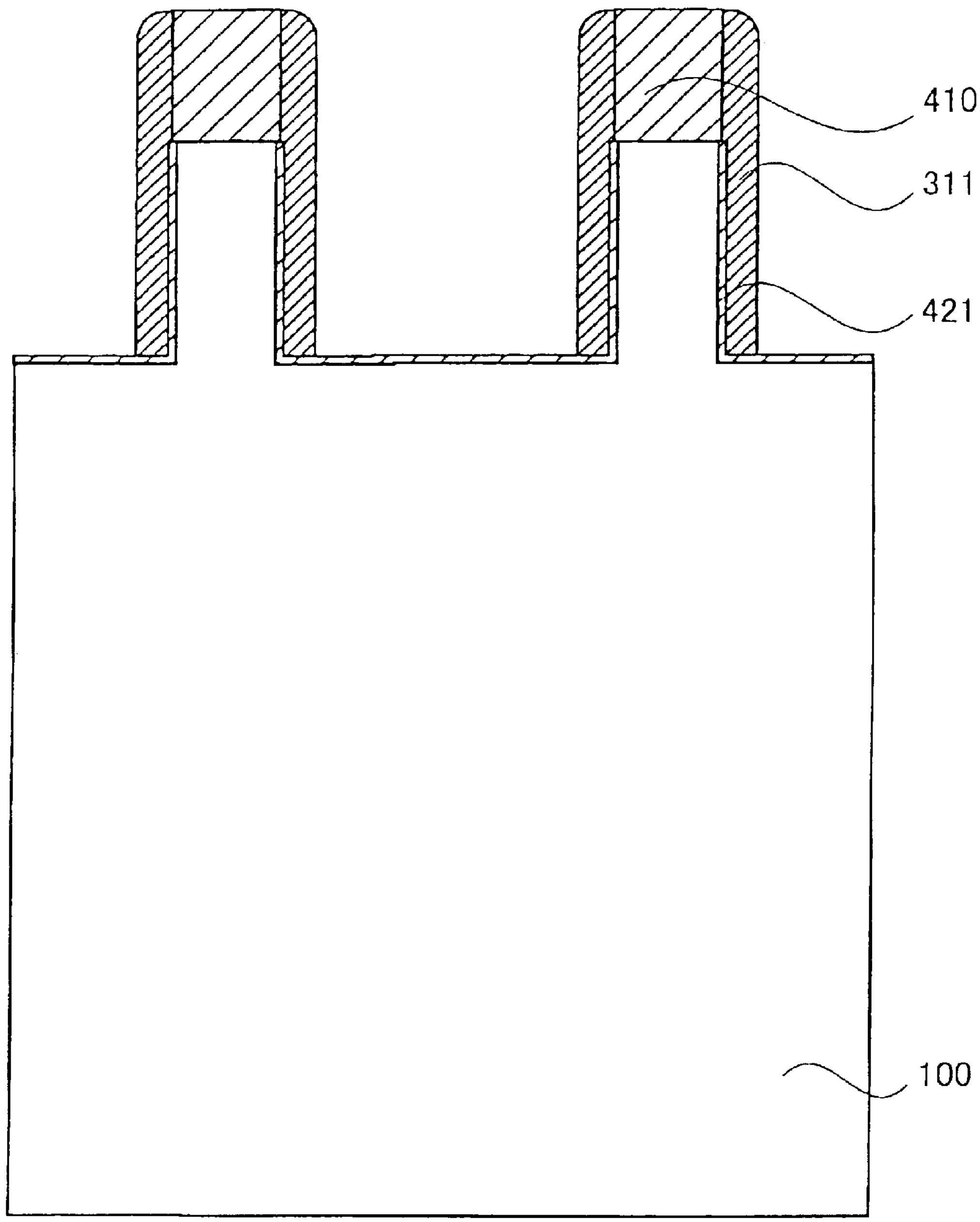

Next, a silicon nitride film 311, for example, is deposited to 10 to 1000 nm as a third insulating film, and then is anisotropically etched into the form of sidewalls on sidewalls of the silicon oxide film 410 and the p-type silicon substrate 100 patterned in the columnar form with intervention of the silicon oxide film 421 (FIG. 372 and FIG. 406).

Subsequently, using the silicon nitride film 311 formed in the sidewalls as a mask, the silicon oxide film 421 is etched away by RIE, and then, the exposed p-type silicon substrate 100 is etched 50 to 5000 nm. Thereby, the p-type silicon substrate 100 is patterned into the form of columns each having a step.

Figure 373:
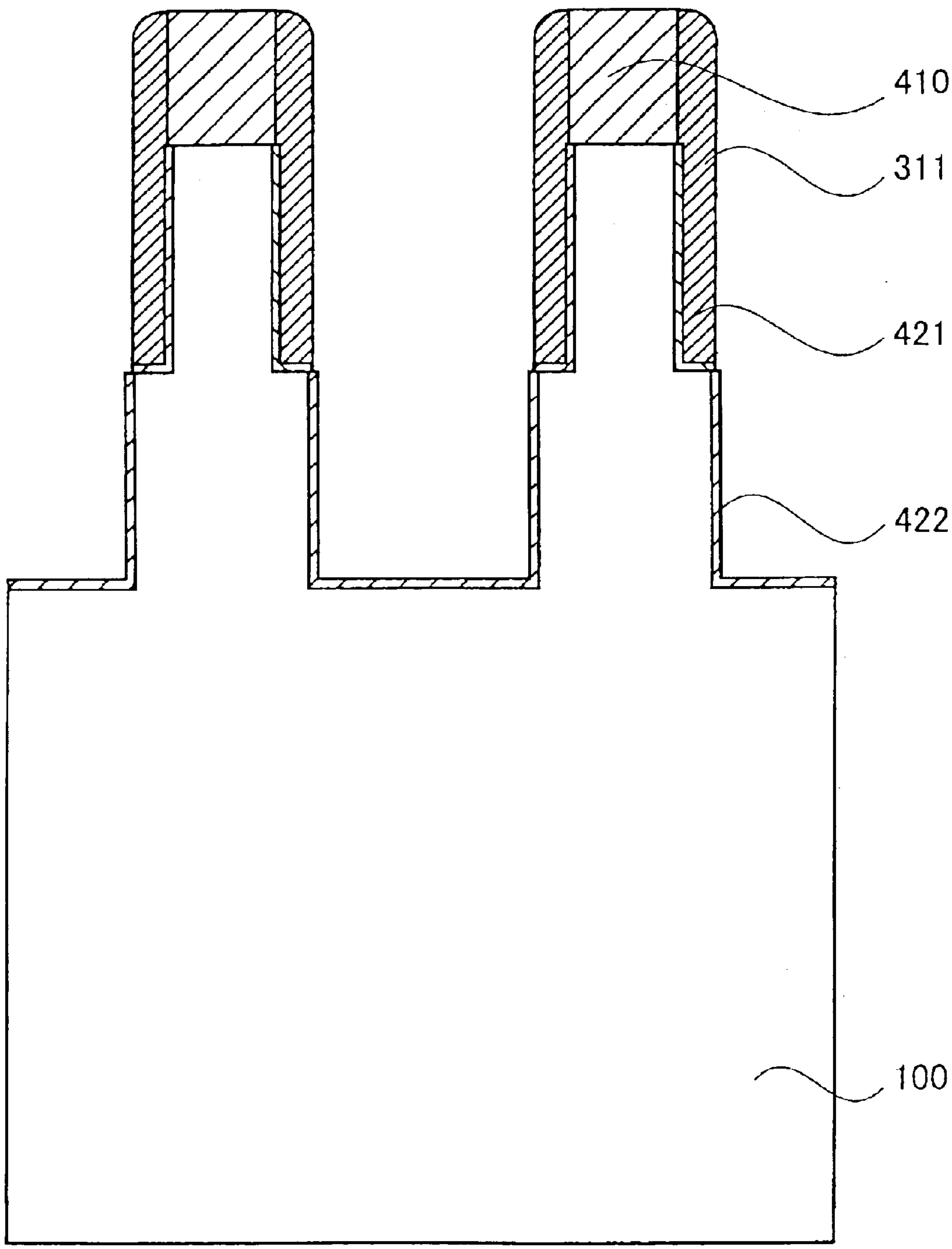
Figure 407:
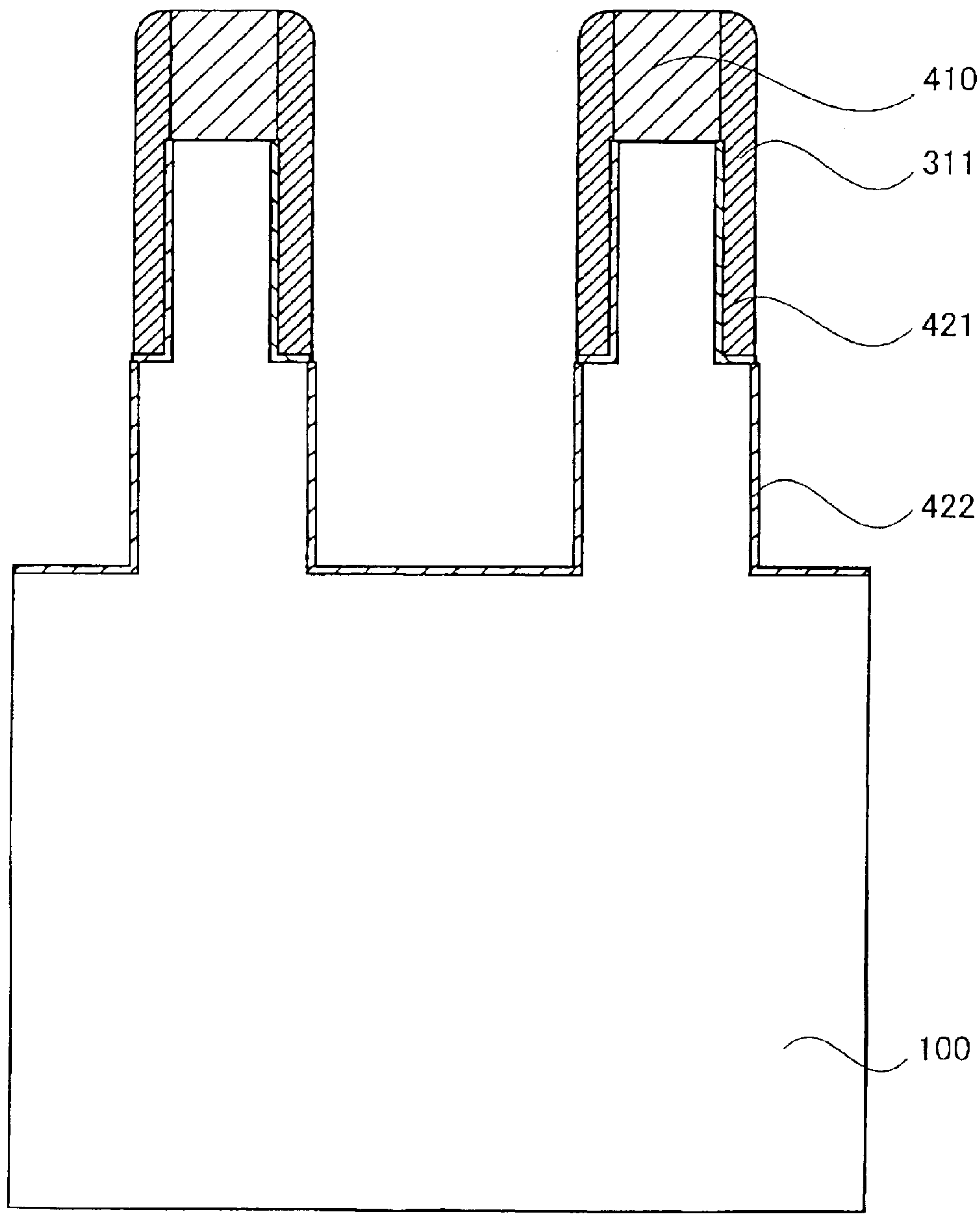

Thereafter, an exposed part of the p-type silicon substrate 100 is thermally oxidized to form a second insulating film, for example, a silicon oxide film 422 of 5 to 100 nm thickness (FIG. 373 and FIG. 407).

Next, a silicon nitride film 312, for example, is deposited to 10 to 1000 nm as a third insulating film, and then is anisotropically etched in the form of sidewalls on sidewalls of the silicon oxide film 410, the silicon nitride film 311 and the p-type silicon substrate 100 patterned in the columnar form having the step with intervention of the silicon oxide film 422.

Subsequently, using as a mask the silicon nitride film 312 formed in the sidewalls, the silicon oxide film 422 is etched away by RIE, and then, the exposed p-type silicon substrate 100 is etched 50 to 5000 nm. Thereby, the p-type silicon substrate 100 is patterned into the form of columns each having two steps.

Figure 374:
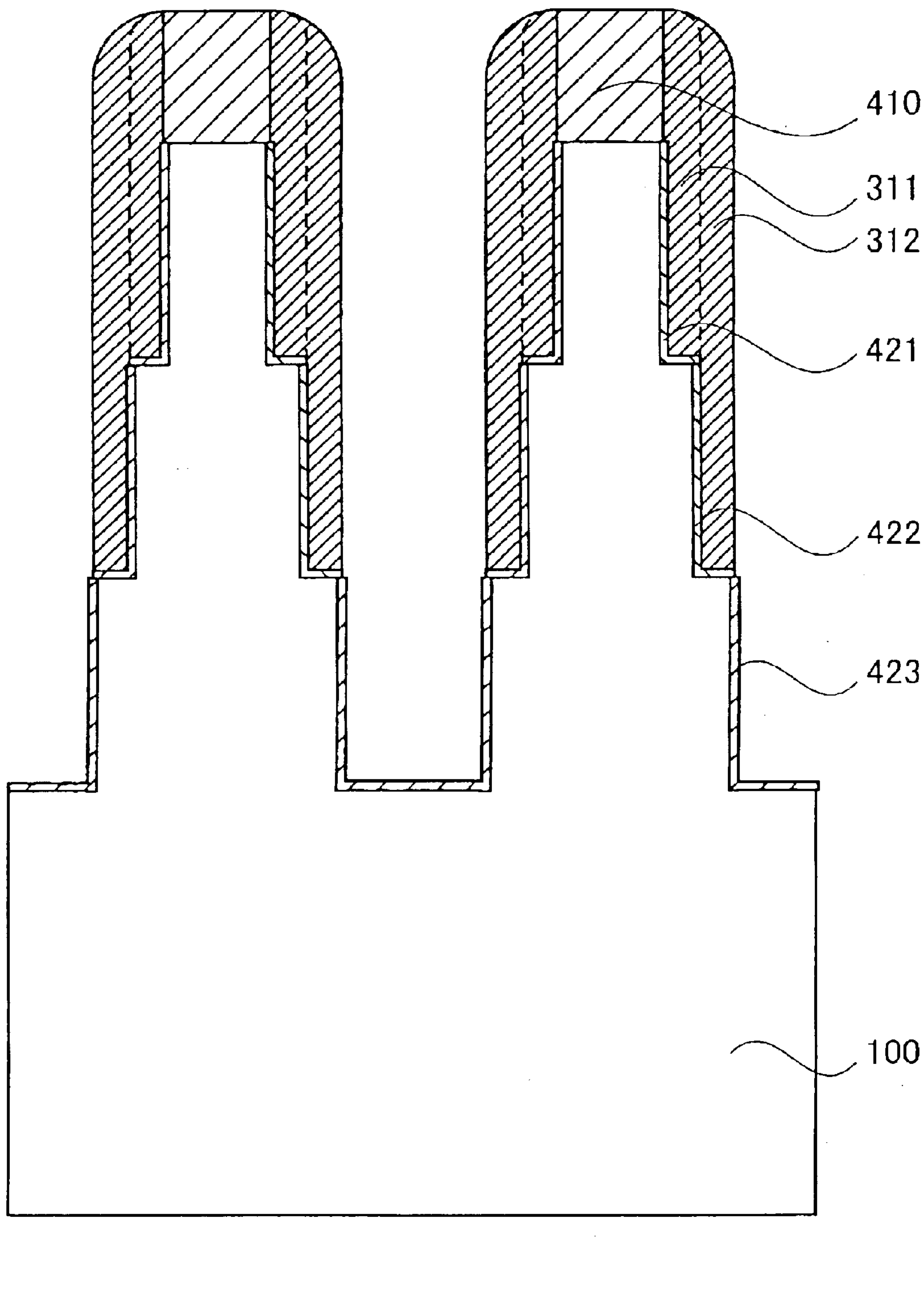
Figure 408:
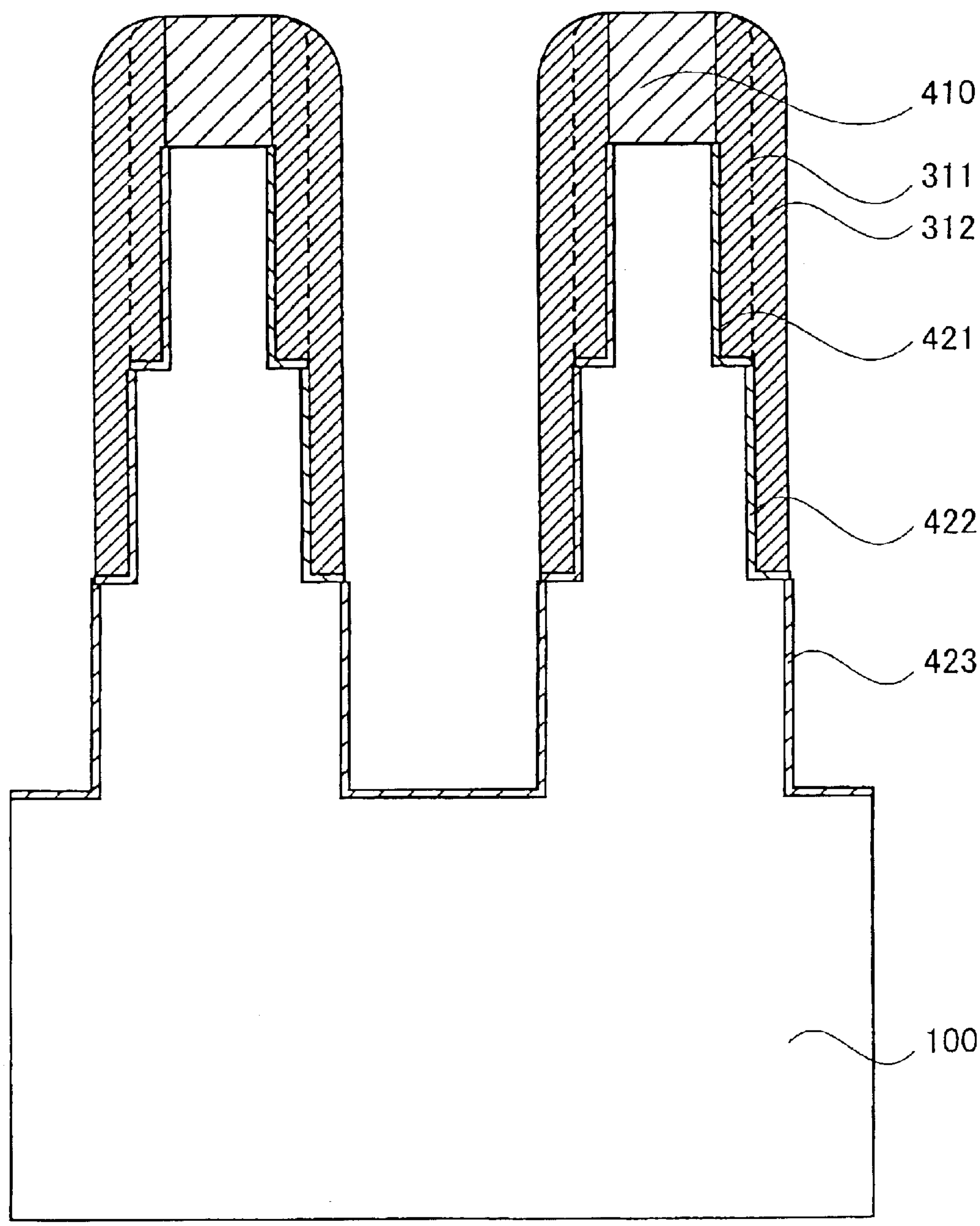

Thereafter, an exposed part of the p-type silicon substrate 100 is thermally oxidized to form a second insulating film, for example, a silicon oxide film 423 of 5 to 100 nm thickness (FIG. 374 and FIG. 408).

Next, a silicon nitride film 313, for example, is deposited to 10 to 1000 nm as a third insulating film, and then is anisotropically etched in the form of sidewalls on sidewalls of the silicon oxide film 410, the silicon nitride film 312 and the p-type silicon substrate 100 patterned in the columnar form having the two steps with intervention of the silicon oxide film 423.

Subsequently, using as a mask the silicon nitride film 313 formed in the sidewalls, the silicon oxide film 423 is etched away by RIE, and then, the exposed p-type silicon substrate 100 is etched 50 to 5000 nm. Thereby, the p-type silicon substrate 100 is patterned into the form of columns each having three steps. By the above-described process, the p-type silicon substrate 100 is separated into a plurality of columnar island-like semiconductor layers 110 having the steps.

Figure 375:
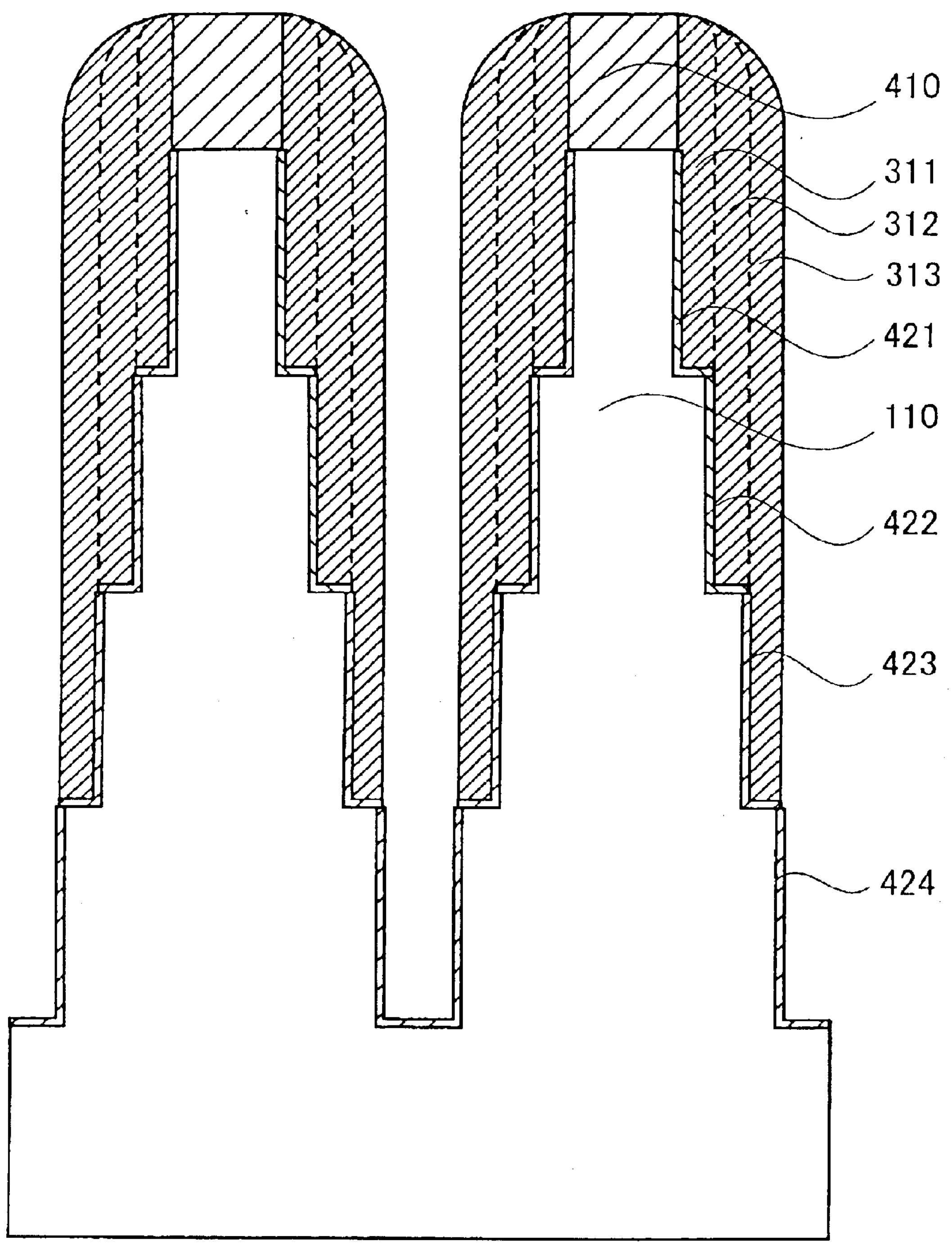
Figure 409:
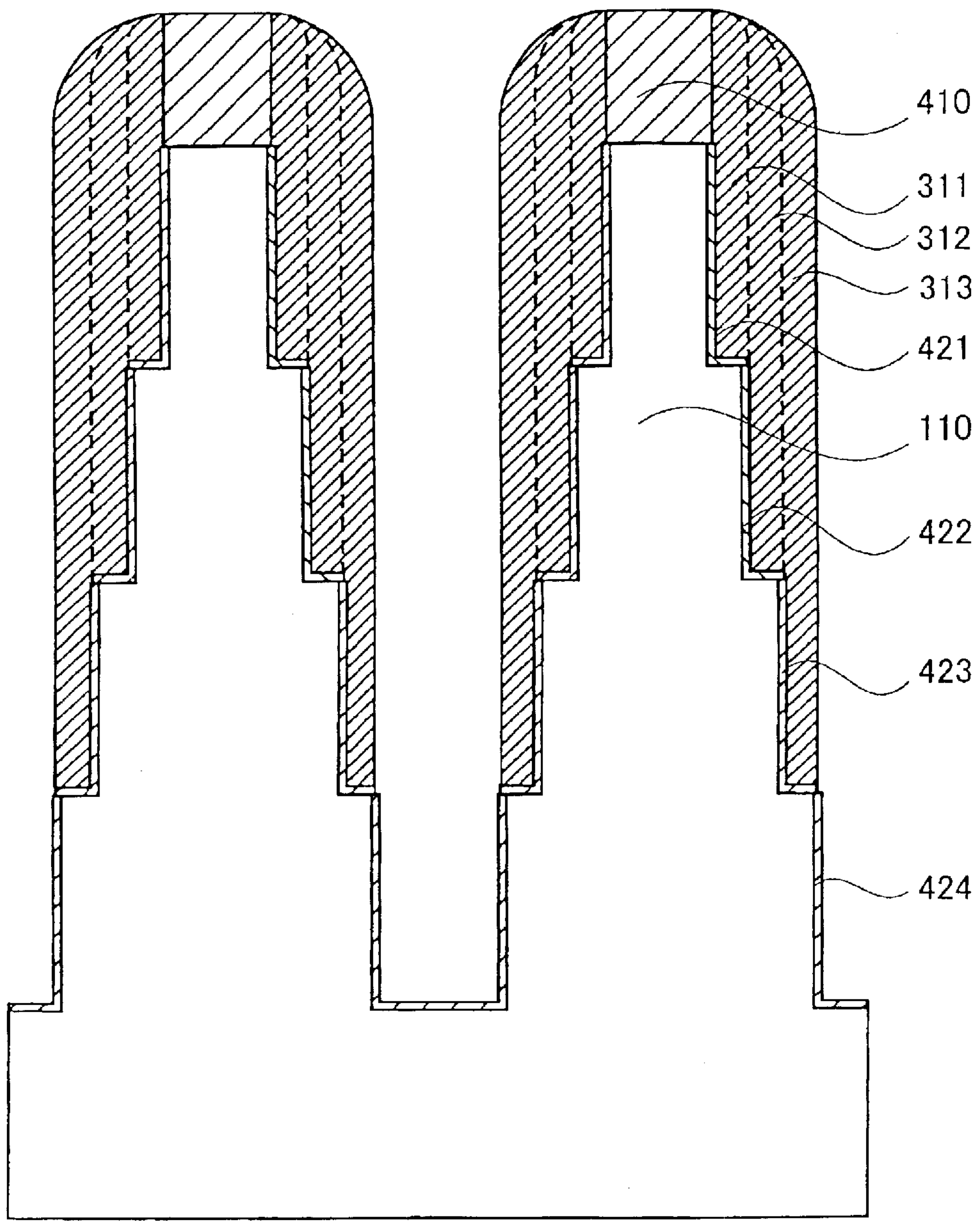

Thereafter, on an exposed part of the p-type silicon substrate 100, a silicon oxide film 424 is formed as a second insulating film of 5 to 100 nm thickness, for example, by thermal oxidization (FIG. 375 and FIG. 409). The silicon oxide film 424 is not limited to the thermally oxidized film but may be a CVD oxide film or an oxynitride film.

An impurity is introduced at the bottom of each island-like semiconductor layer 110 having the steps to form an n-type impurity region 710, for example, at an implantation energy of 5 to 100 keV at an arsenic or phosphorus dose of about $1\times10^{13}$ to $1\times10^{17}/cm^2$ in a direction inclined about 0 to 7°.

Figure 376:
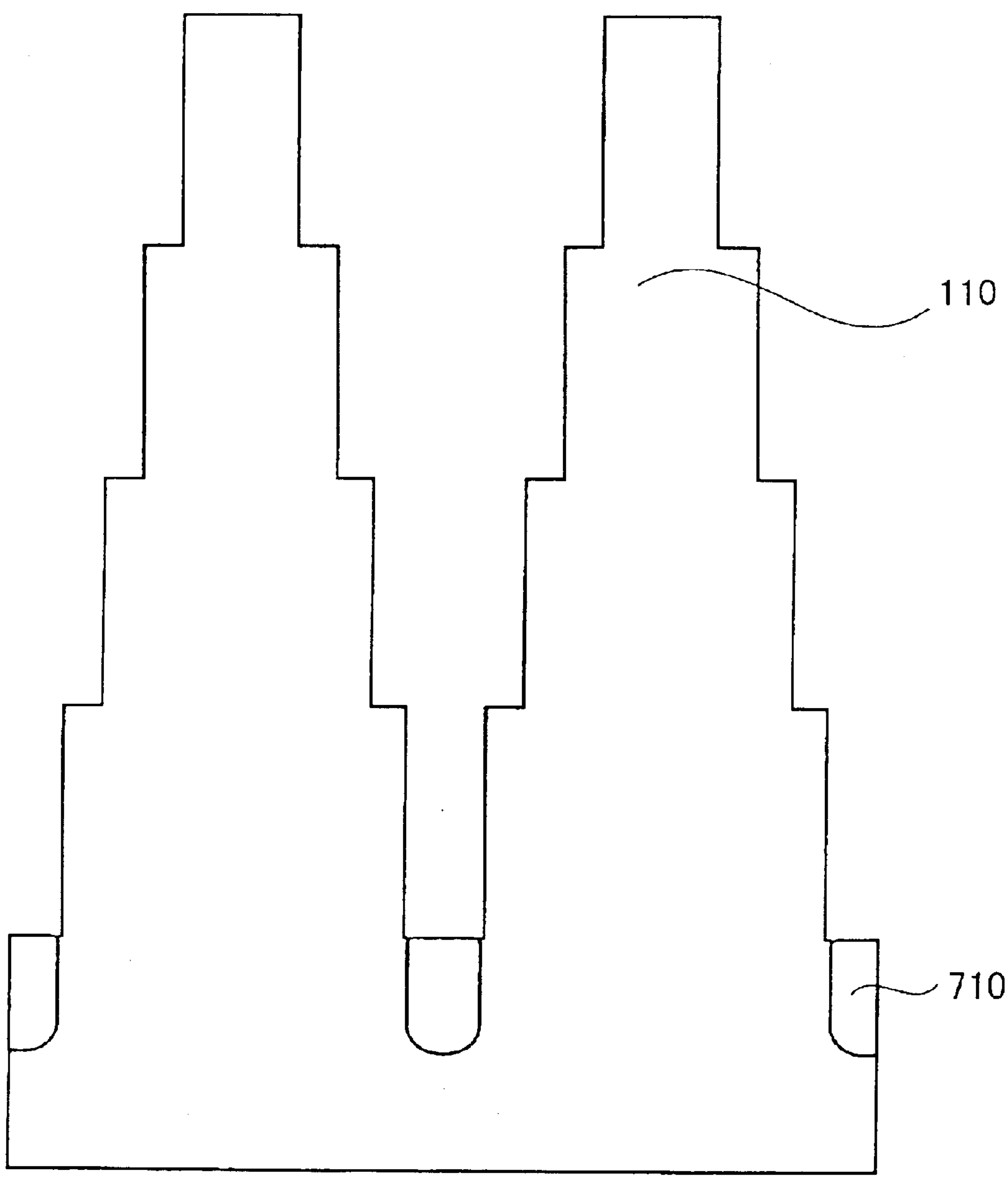
Figure 410:
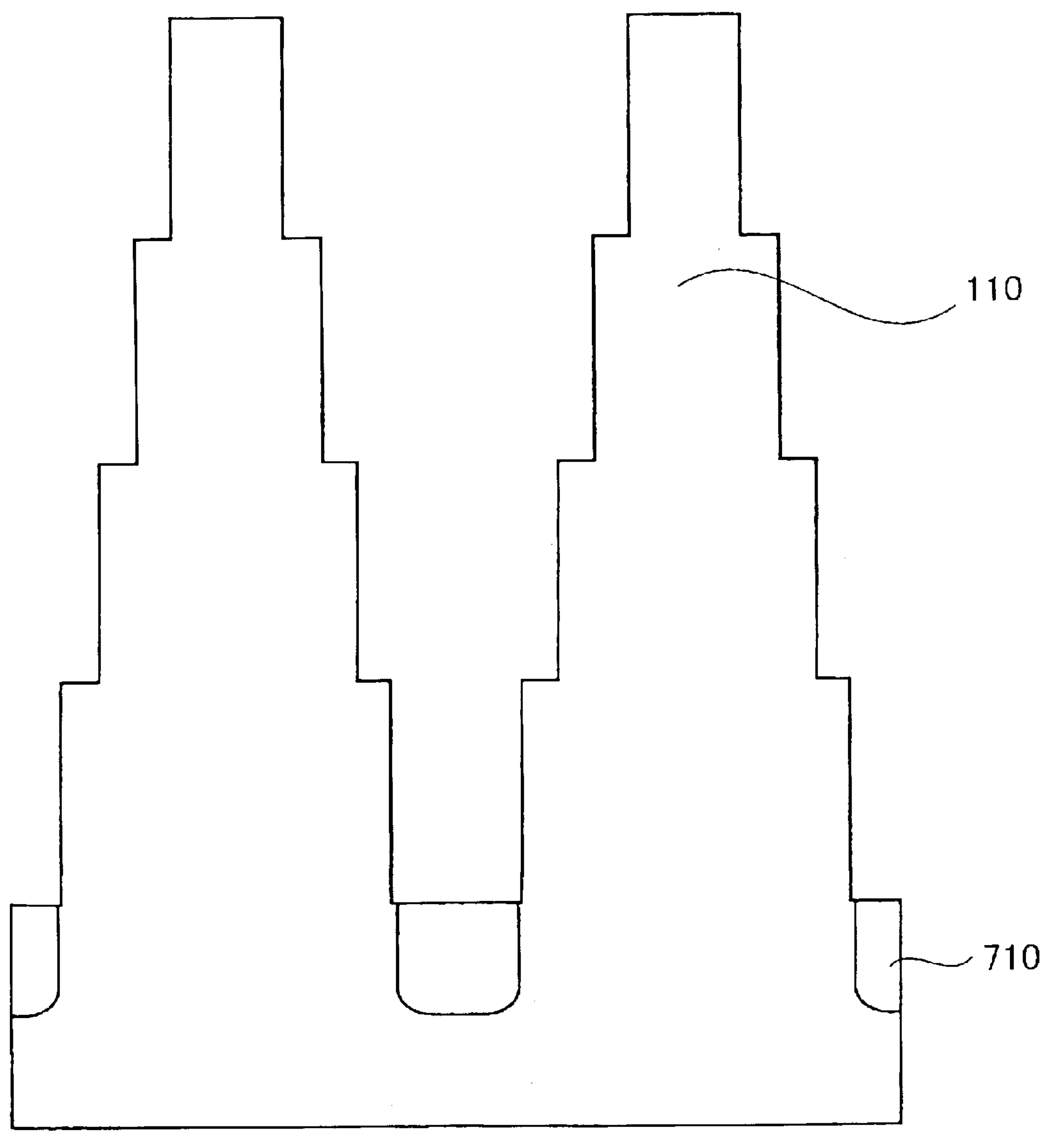

Subsequently, the silicon nitride film and the silicon oxide film are selectively removed, for example, by isotropic etching (FIG. 376 and FIG. 410).

Figure 377:
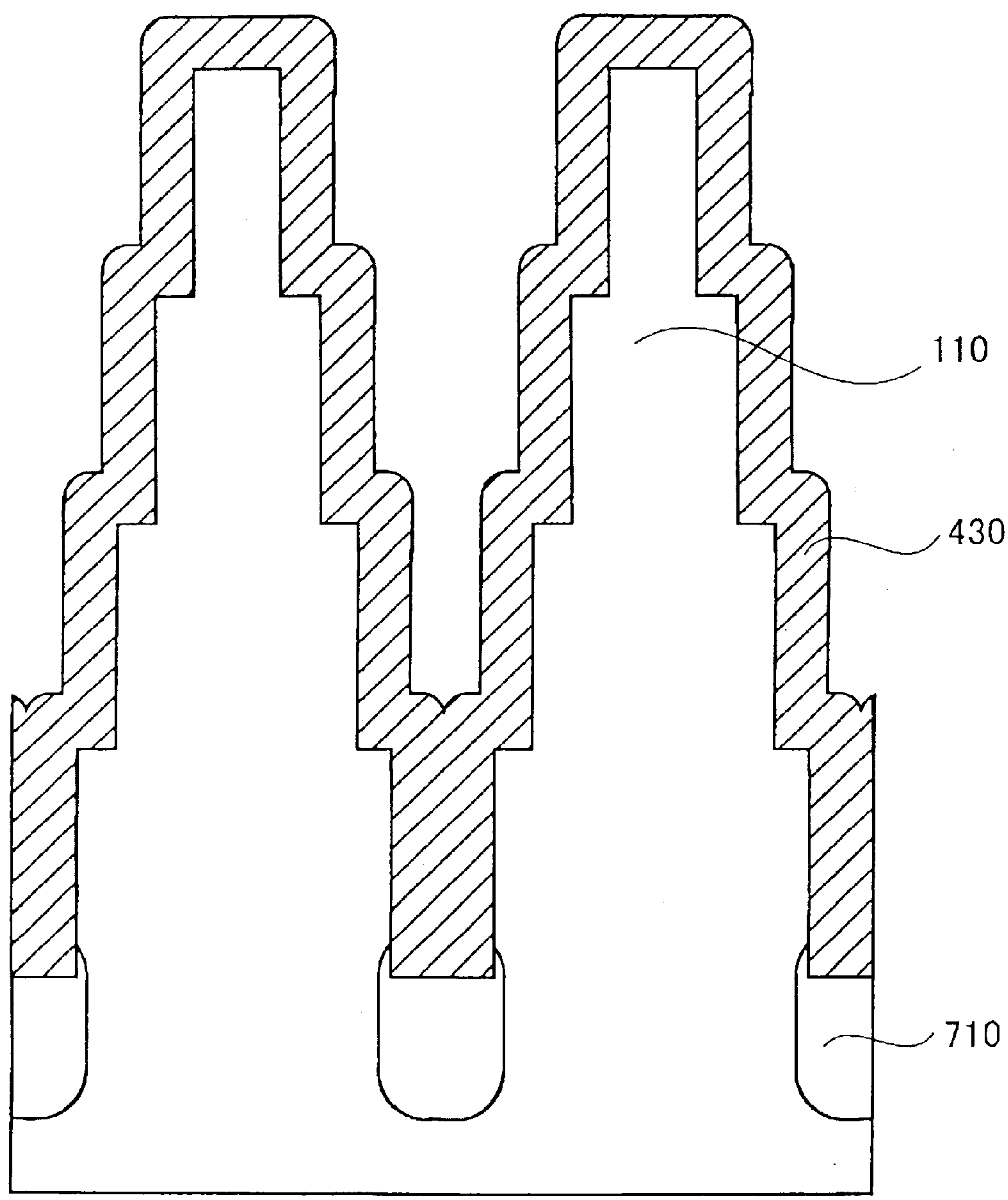
Figure 411:
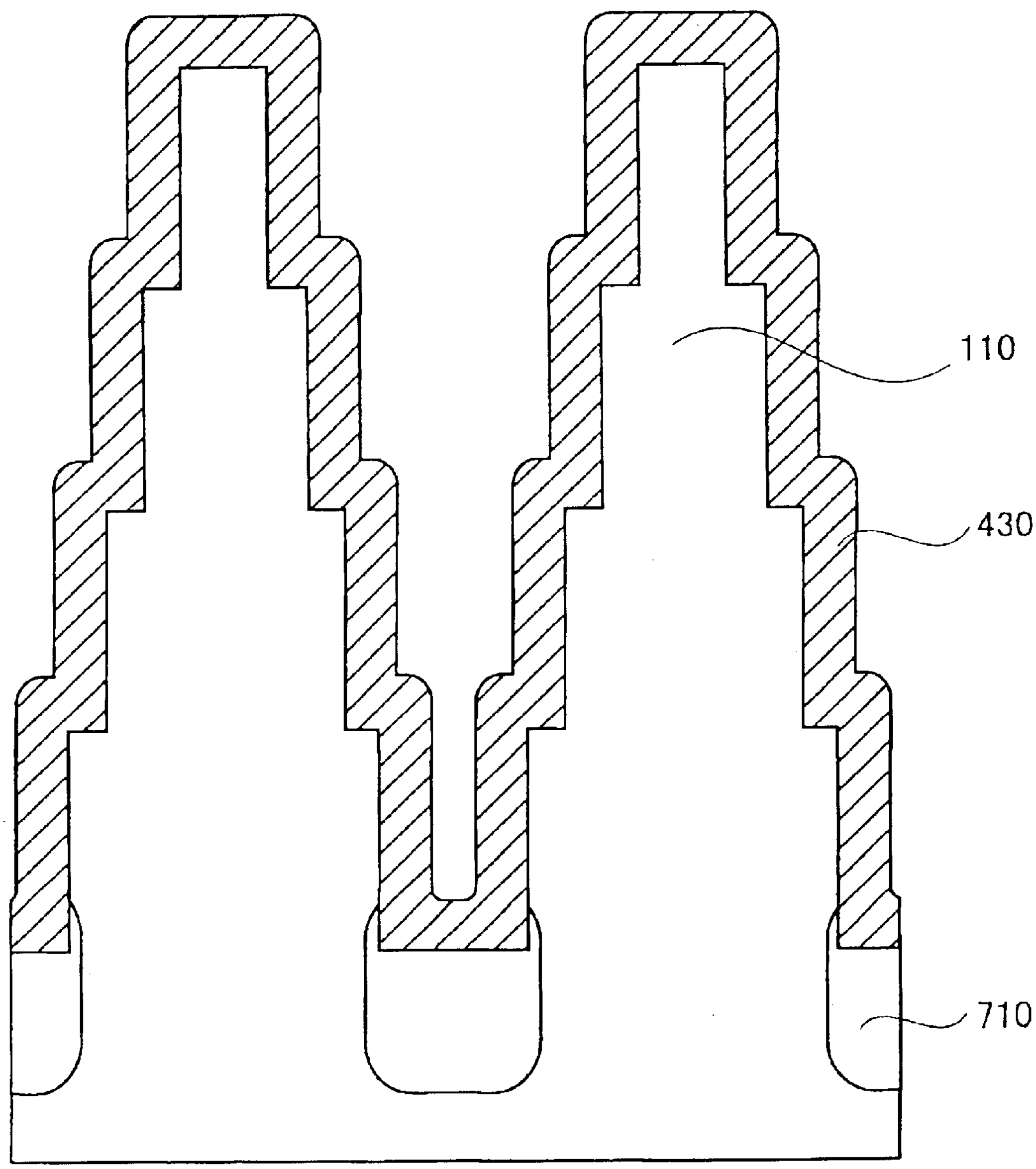

The surface of the island-like semiconductor layer 110 is oxidized to form a fourth insulating film, for example, a silicon oxide film 430 with a thickness of 10 to 100 nm (FIG. 377 and FIG. 411). At this time, if the uppermost tier of the island-like semiconductor layer 110 is formed to have a diameter of the minimum patterning dimensions, the diameter of the uppermost tier of the island-like semiconductor layer 110 is reduced to the minimum patterning dimensions or less by the formation of the silicon oxide film 430.

Figure 378:
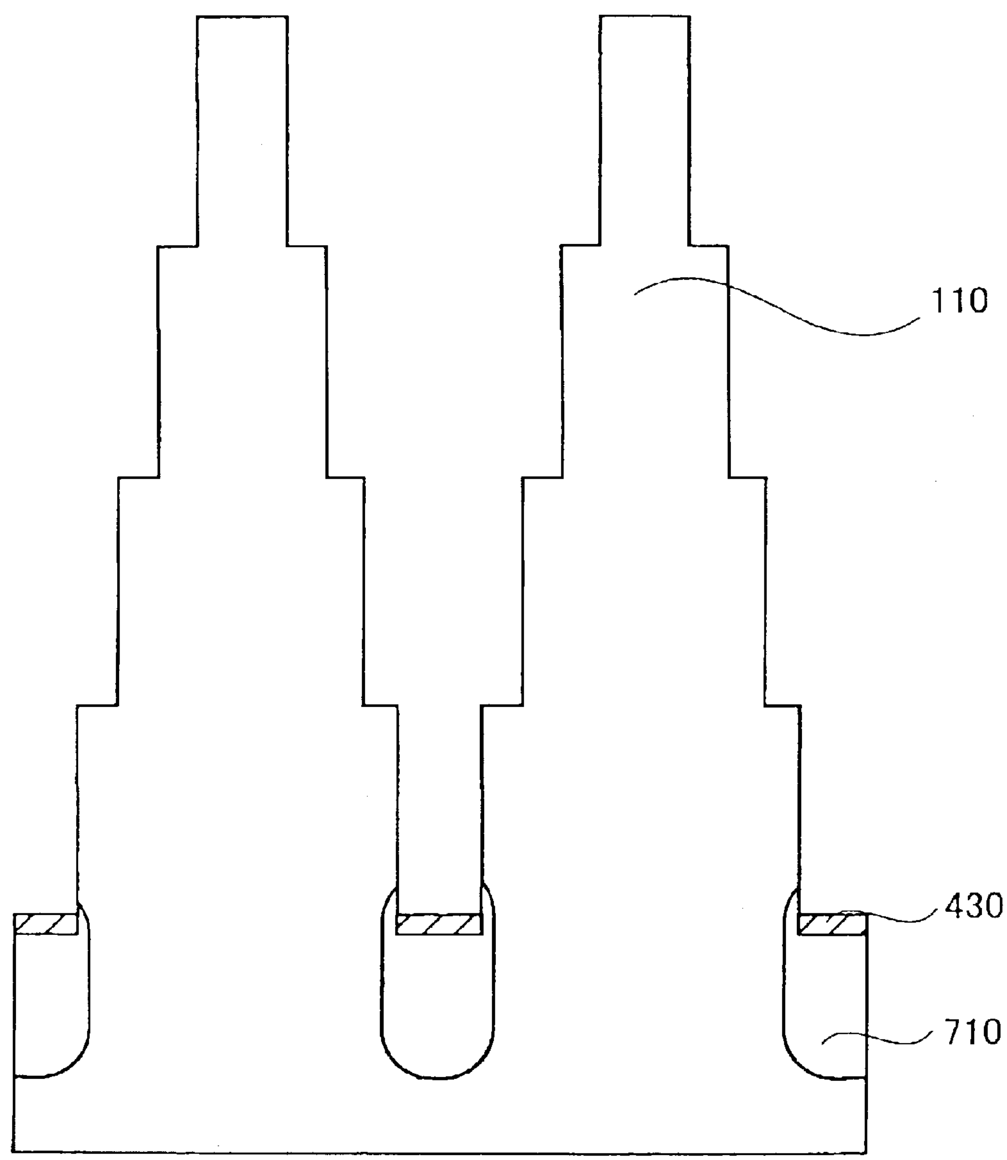
Figure 412:
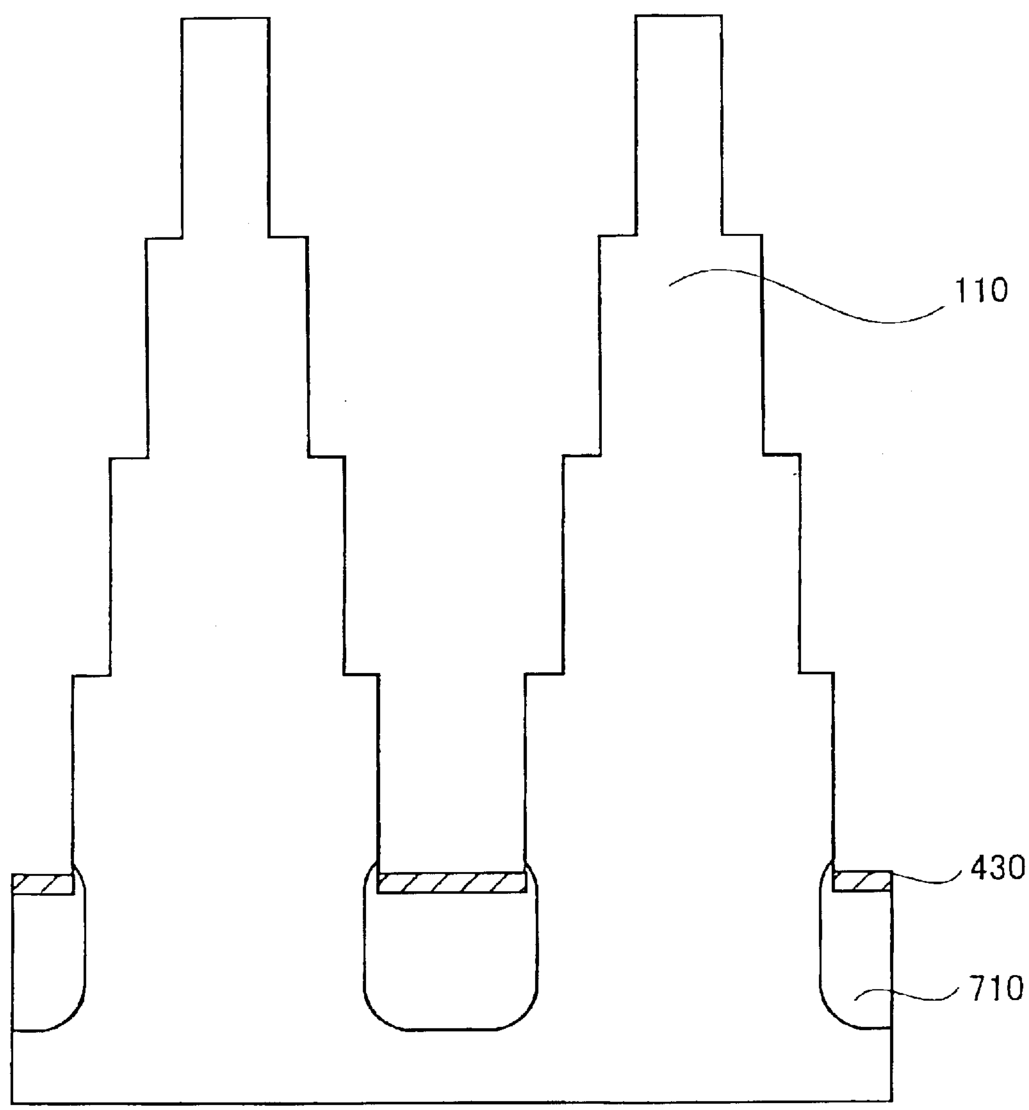

Thereafter, an insulating film such as a silicon oxide film is deposited as required and is etched back to a desired height, for example, by isotropic etching to bury the silicon oxide film 430 at the bottom of the island-like semiconductor layer 110 (FIG. 378 and FIG. 412).

Next, channel ion implantation is carried out on the sidewall of the island-like semiconductor layer 110 as required using a slant ion implantation, for example, at an implantation energy of 5 to 100 keV at a phosphorus dose of about $1\times10^{11}$ to $1\times10^{13}/cm^2$ in a direction inclined about 5 to 45°. The channel ion implantation may preferably be performed in various directions toward the island-like semiconductor layer 110 because the surface impurity concentration becomes uniform. Alternatively, instead of the channel ion implantation, a oxide film containing phosphorus is deposited by CVD and diffusion of phosphorus from the oxide film may be utilized. The implantation of the impurity ions from the surface of the island-like semiconductor layer 110 may be done before the surface of the island-like semiconductor layer 110 is covered with the silicon oxide film 430 or may be finished before the island-like semiconductor layer 110 is formed. The means for the implantation is not particularly limited so long as the impurity concentration distribution in the island-like semiconductor layer 110 is equal.

Figure 379:
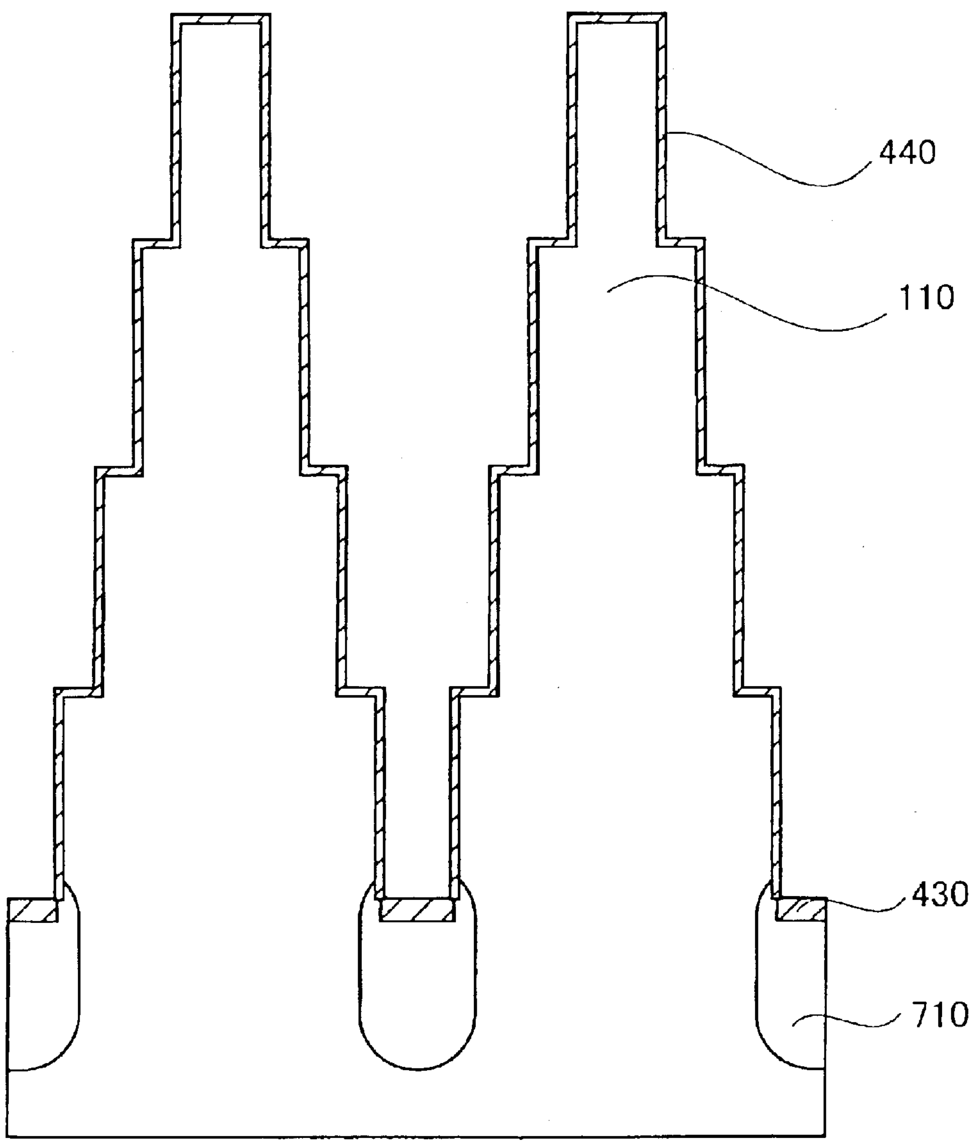
Figure 413:
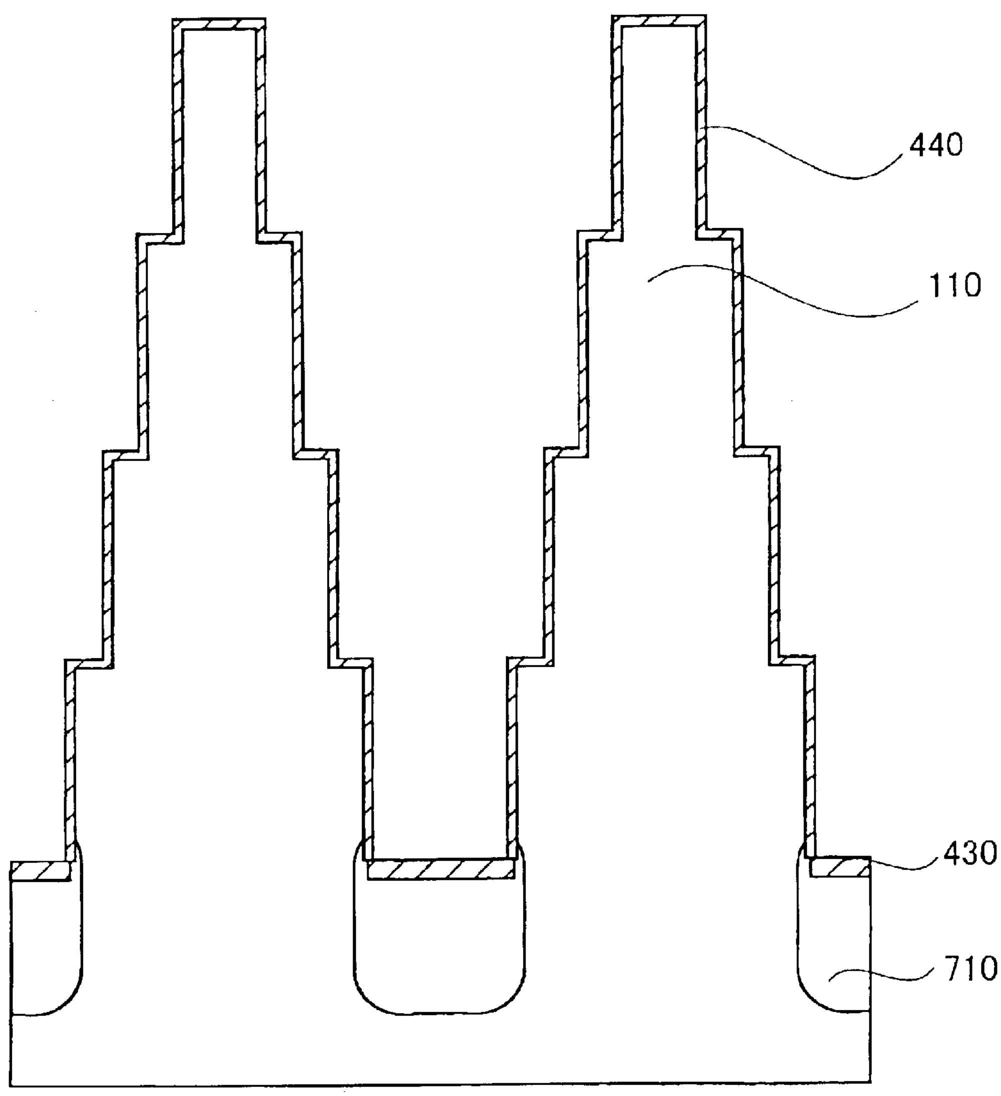

Subsequently, a silicon oxide film 440, for example, is formed as a fifth oxide film to be a tunnel oxide film of about 10 nm thickness around each island-like semiconductor layer 110, for example, using thermal oxidation (FIG. 379 ad FIG. 413). The tunnel oxide film is not limited to the thermally oxidized film but may be a CVD oxide film or an oxynitride film.

Figure 380:
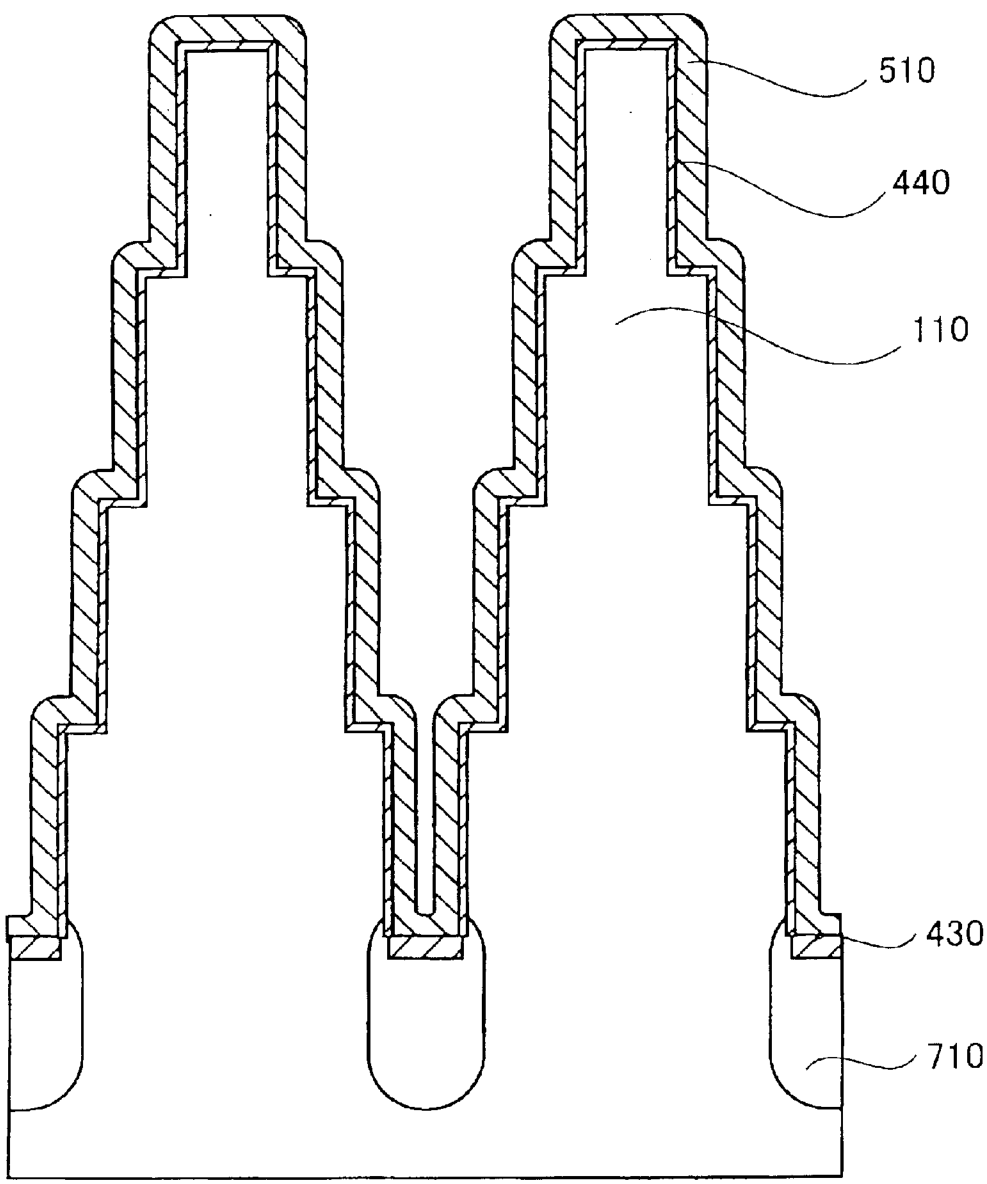
Figure 381:
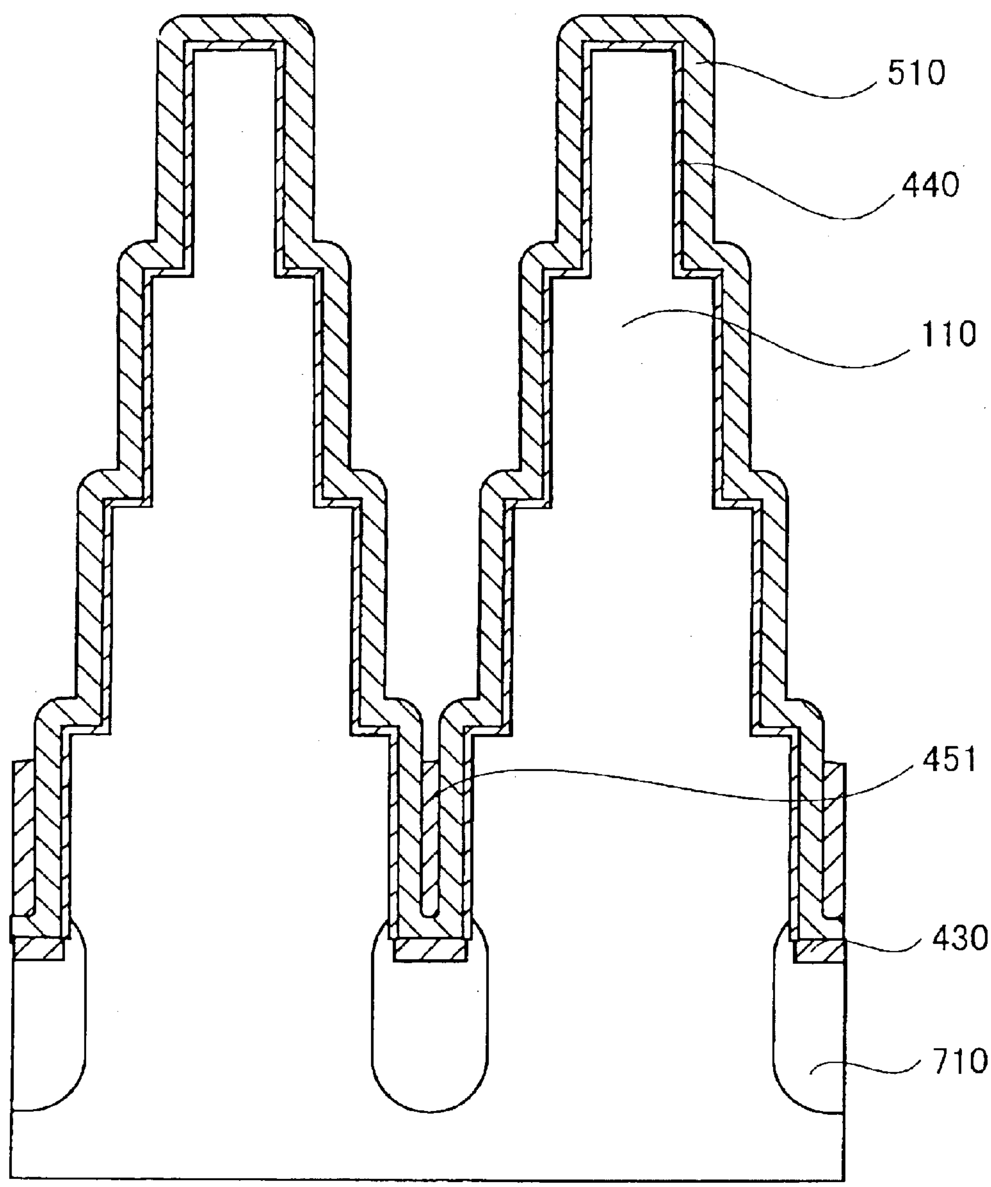
Figure 382:
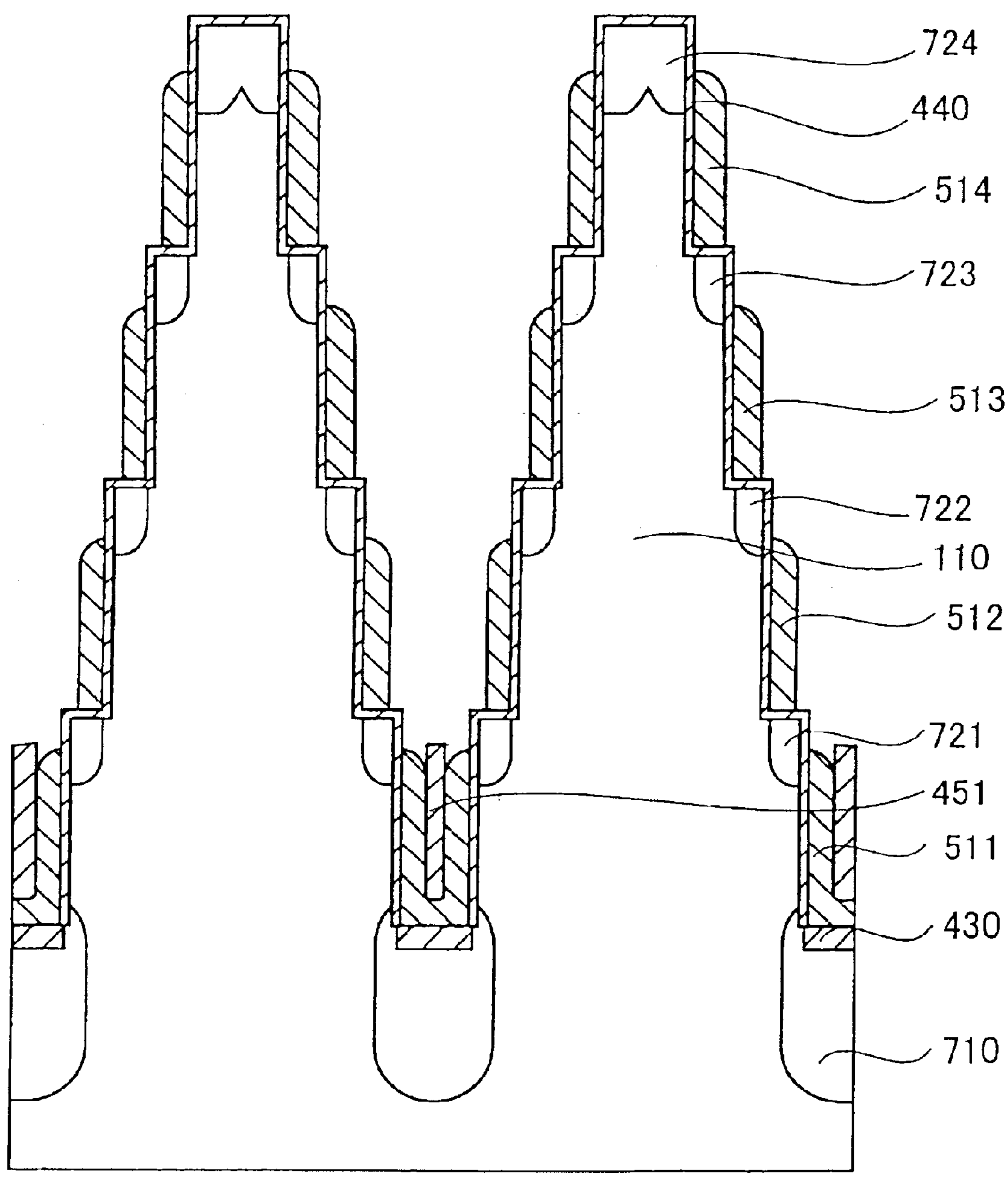
Figure 414:
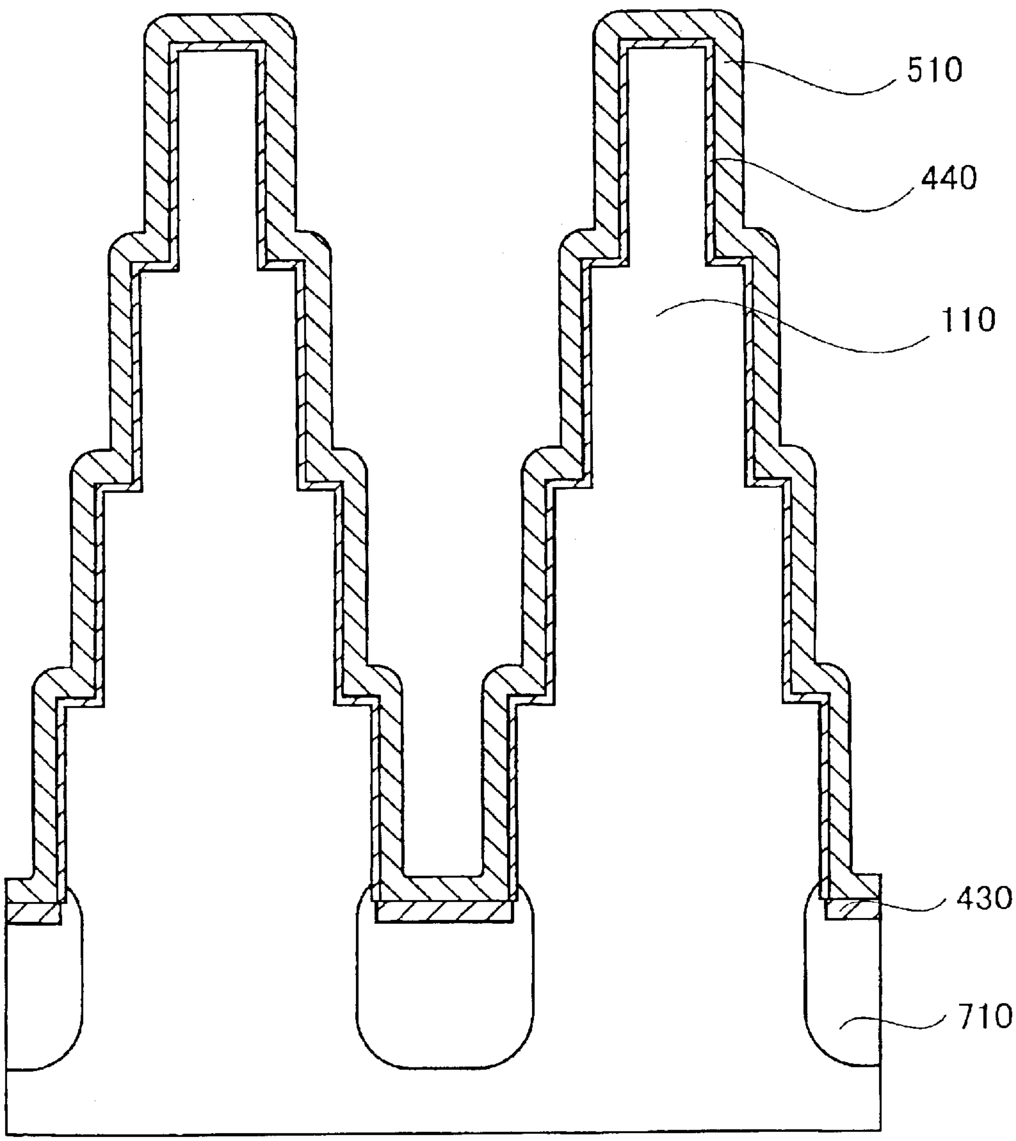
Figure 415:
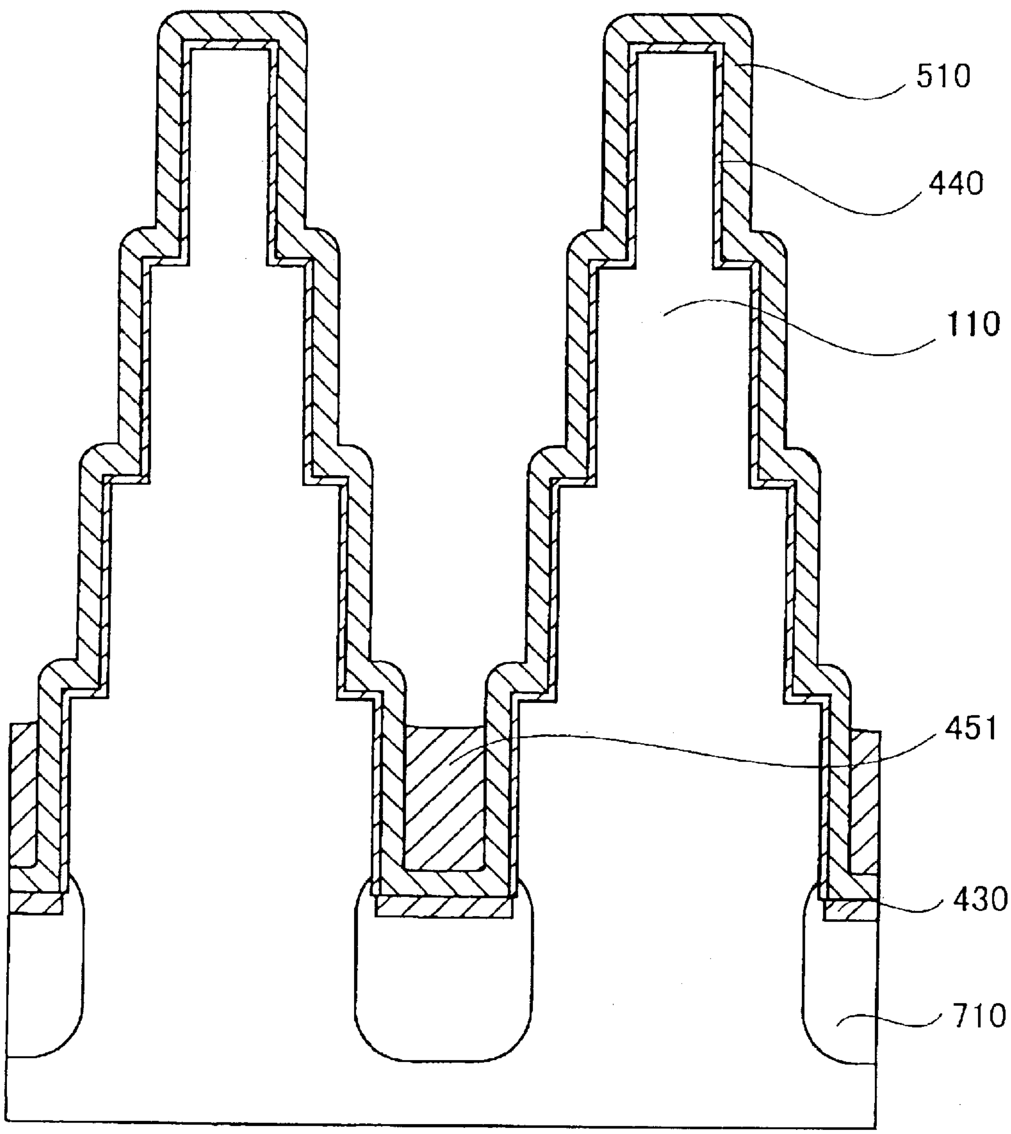
Figure 416:
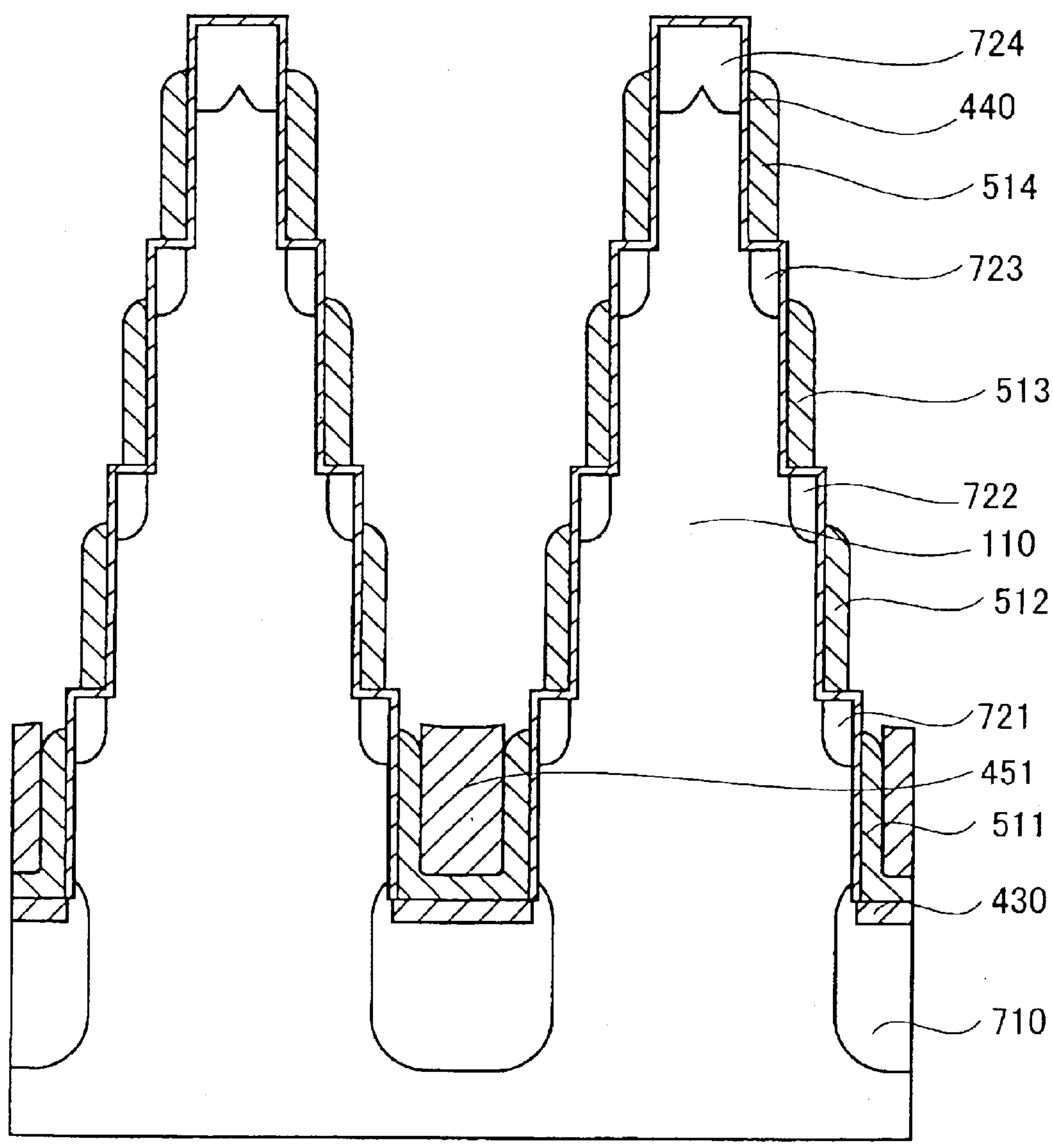

Subsequently, a first conductive film, for example, a polysilicon film 510 is deposited to about 20 to 200 nm (FIG. 380 and FIG. 414). Then, a silicon oxide film 451, for example, is deposited to about 20 to 200 nm as a sixth insulating film and is etched back to a desired depth (FIG. 381 and FIG. 415). Thereafter, for example, by anisotropic etching, the polysilicon film 510 is formed in the form of sidewalls on sidewalls of each tier of the island-like semiconductor layer 110, whereby separate polysilicon films 511, 512, 513 and 514 are formed at the same time. The selection gate in the lowermost tier, i.e., the polysilicon film 511, is all kept connected by protection of the silicon oxide film 451.

Next, impurity ions are introduced into corners of the island-like semiconductor layer 110 having the steps to form n-type impurity diffusion layers 721, 722, 723 and 724 (FIG. 382 and FIG. 416), for example, at an implantation energy of 5 to 100 keV at an arsenic or phosphorus dose of about $1\times10^{12}$ to $1\times10^{15}/cm^2$ in a direction inclined about 0 to 45°. Here, the ion implantation for forming the n-type impurity diffusion layers 721, 722, 723 and 724 may be carried out on the entire periphery of the island-like semiconductor layer 110 and may be carried out from one direction or from several directions. That is, the n-type impurity diffusion layers 721, 722, 723 and 724 may not be formed to surround the periphery of the island-like semiconductor layer 110.

Figure 383:
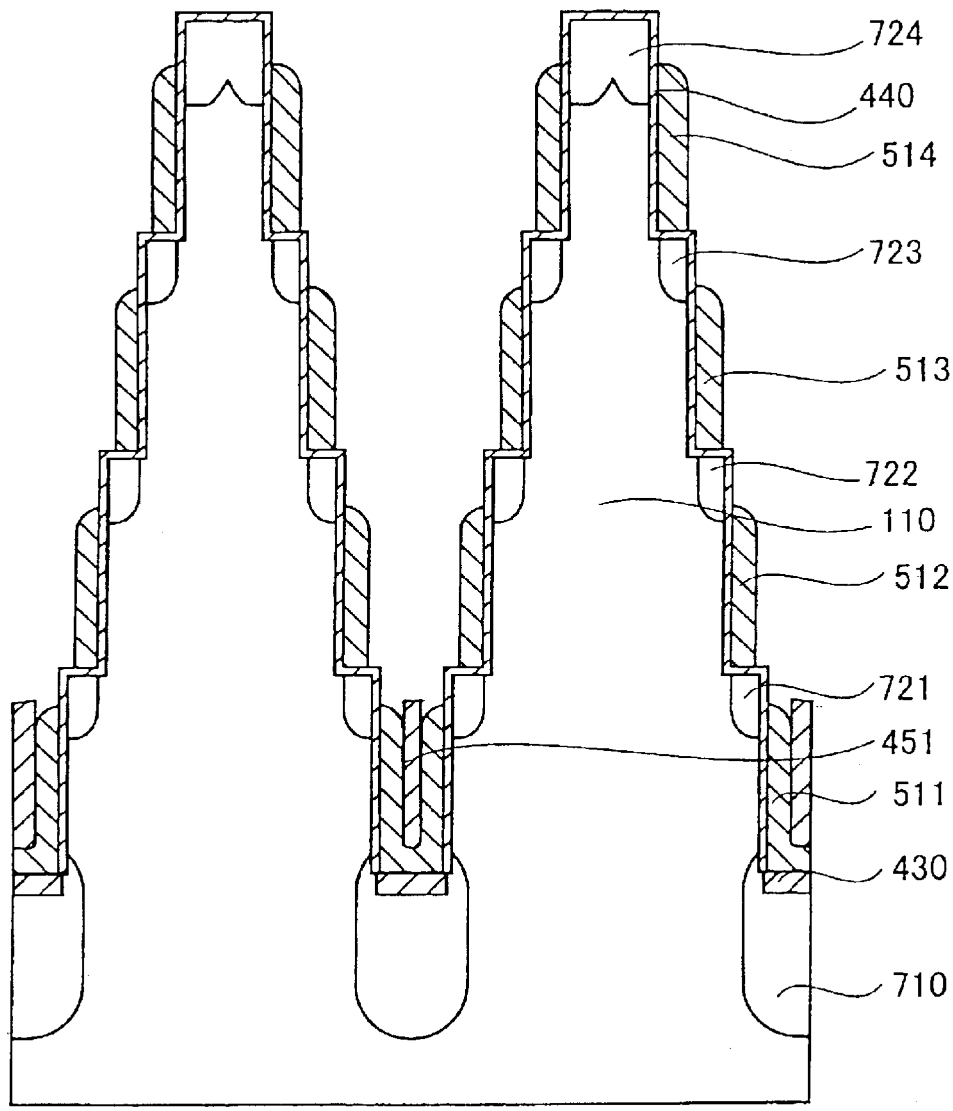
Figure 417:
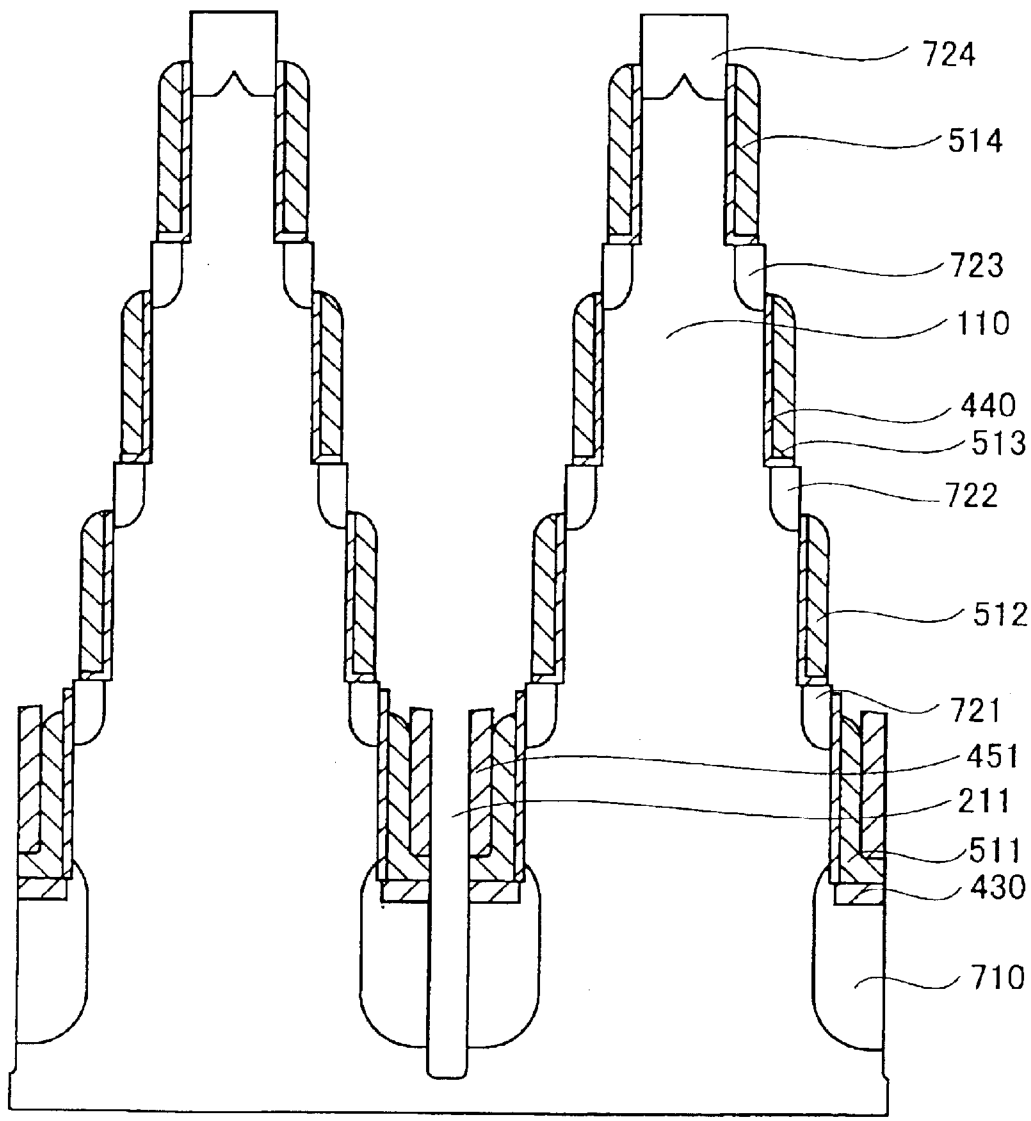

Using as a mask a resist film R2 patterned by a known photolithography technique, the silicon oxide film 451 is etched by RIE, and sequentially, the polysilicon film 511, the silicon oxide film 430 and the impurity diffusion layer 710 are etched to form a first trench 211 (FIG. 383 and FIG. 417). Thereby, a first wiring layer and a second wiring layer to be a selection gate layer which are continuous in direction A–A' of FIG. 1 are formed by separation.

Figure 384:
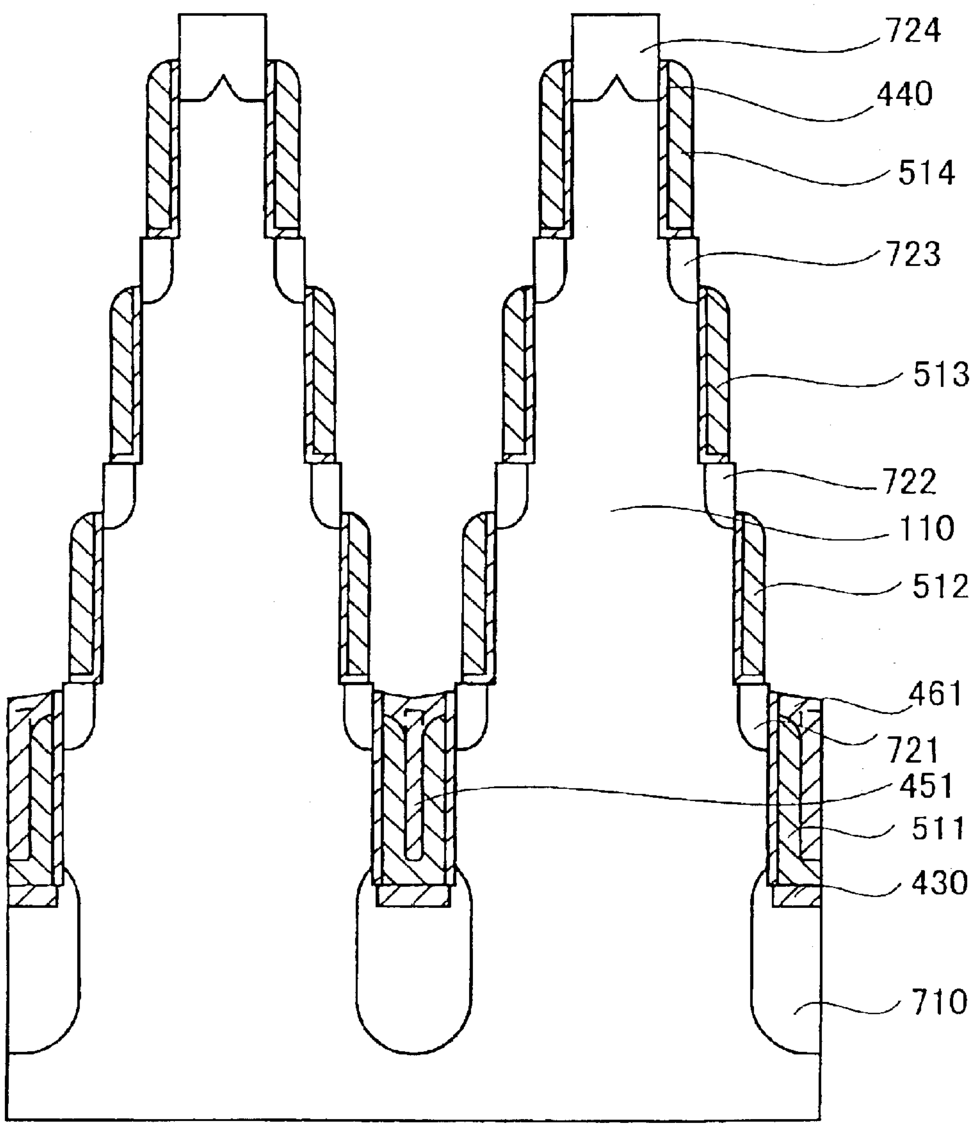
Figure 418:
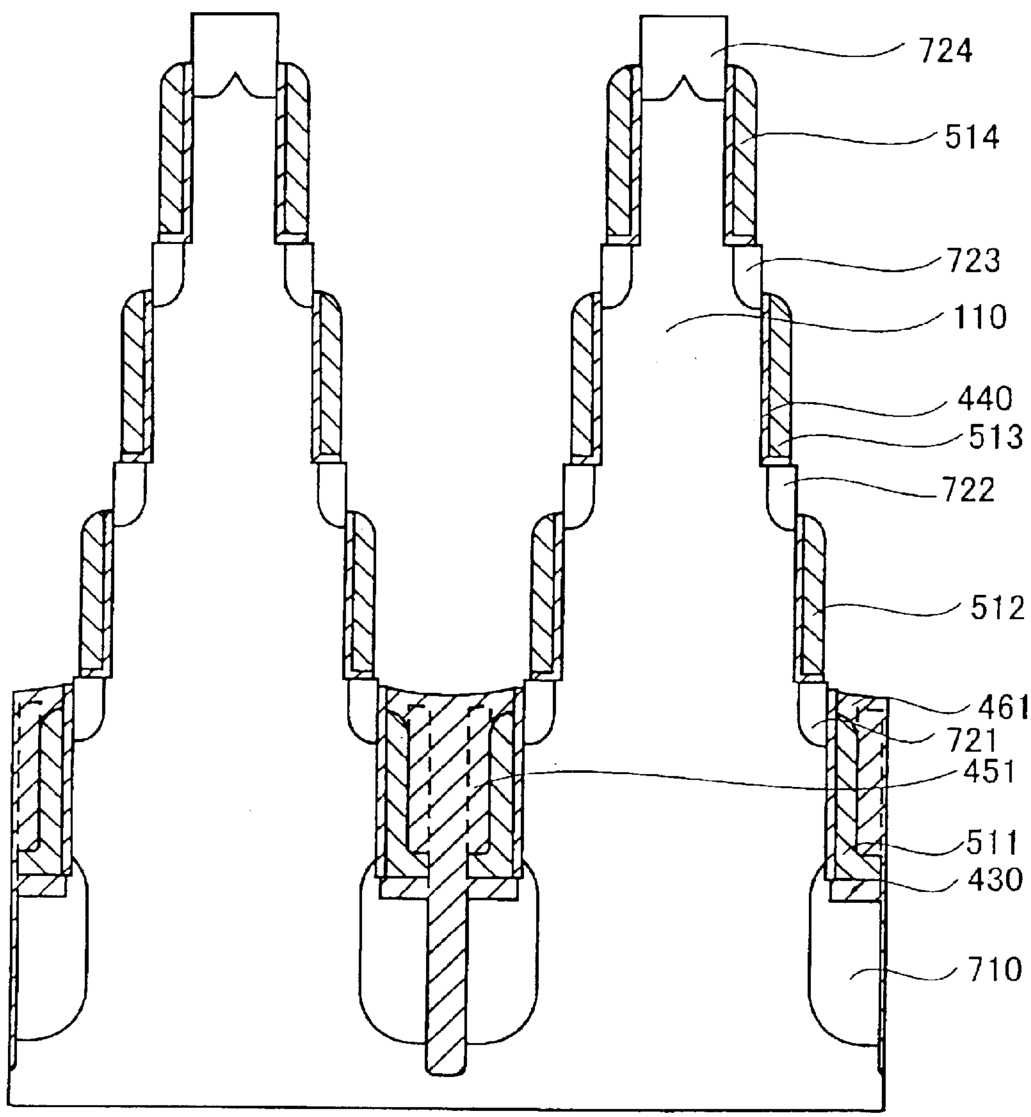

Thereafter, a silicon oxide film 461, for example, is deposited to about 20 to 200 nm as a seventh insulating film and is isotropically etched to be buried in the first trench 211 and the top of the island-like semiconductor layer 110 (FIG. 384 and FIG. 418).

Figure 385:
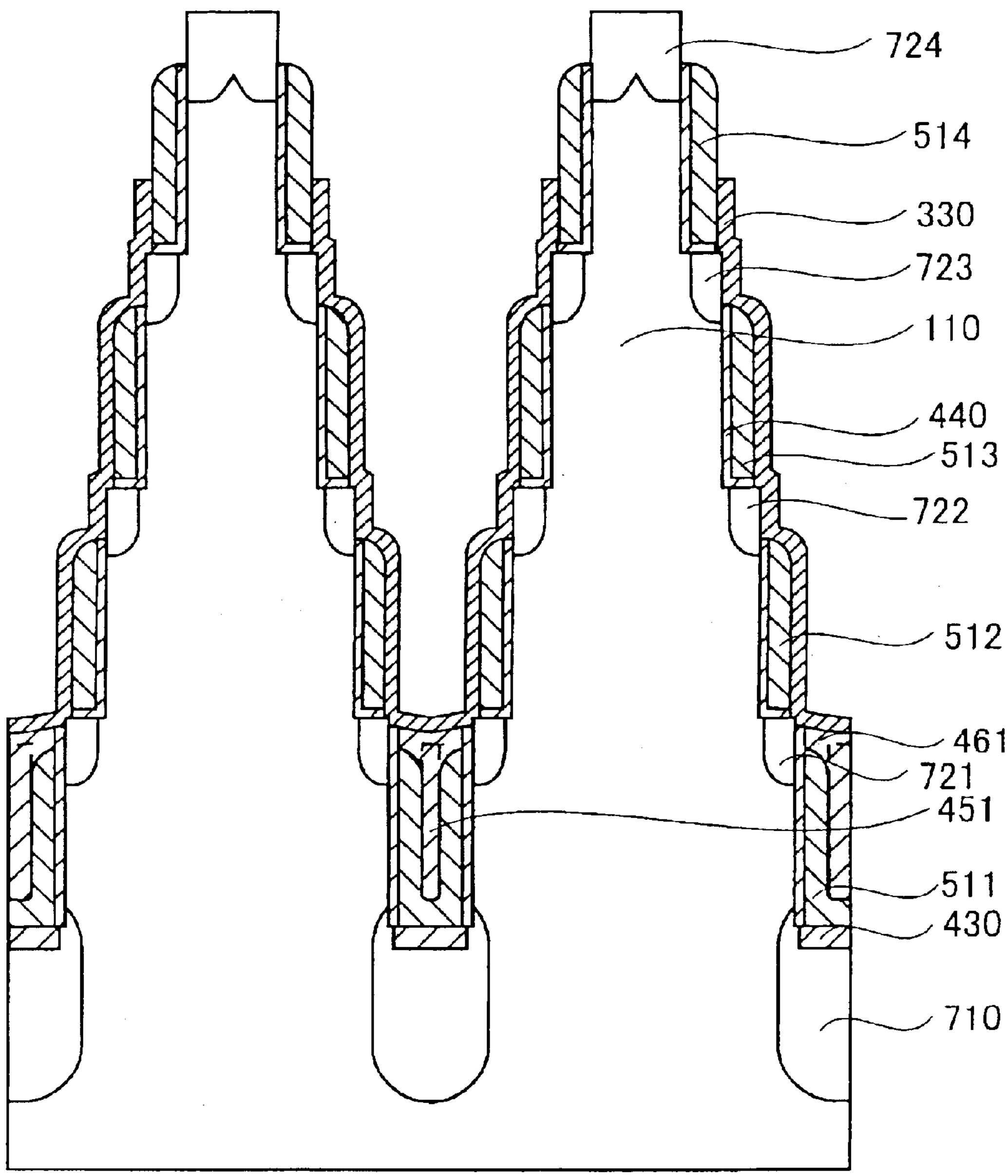
Figure 419:
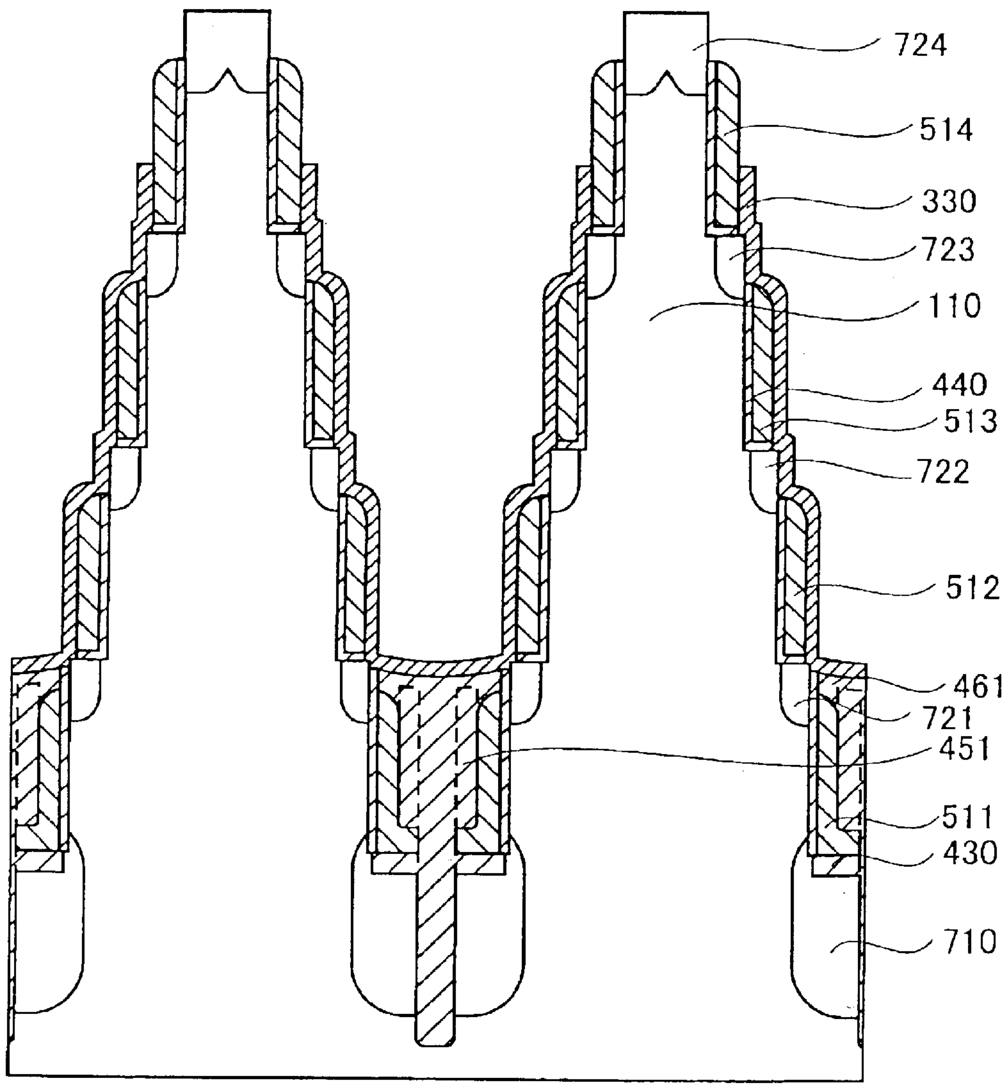

Subsequently, a silicon nitride film 330, for example, is deposited to about 10 to 200 nm as a tenth insulating film. The silicon nidtride film 330 and/or the resist film are buried and an exposed part of the silicon nitride film 330 is isotropically etched to expose the top of the island-like semiconductor layer 110 and at least a part of the polysilicon film 514. Thereafter the silicon oxide film and/or the resist film are selectively removed (FIG. 385 and FIG. 419).

Figure 386:
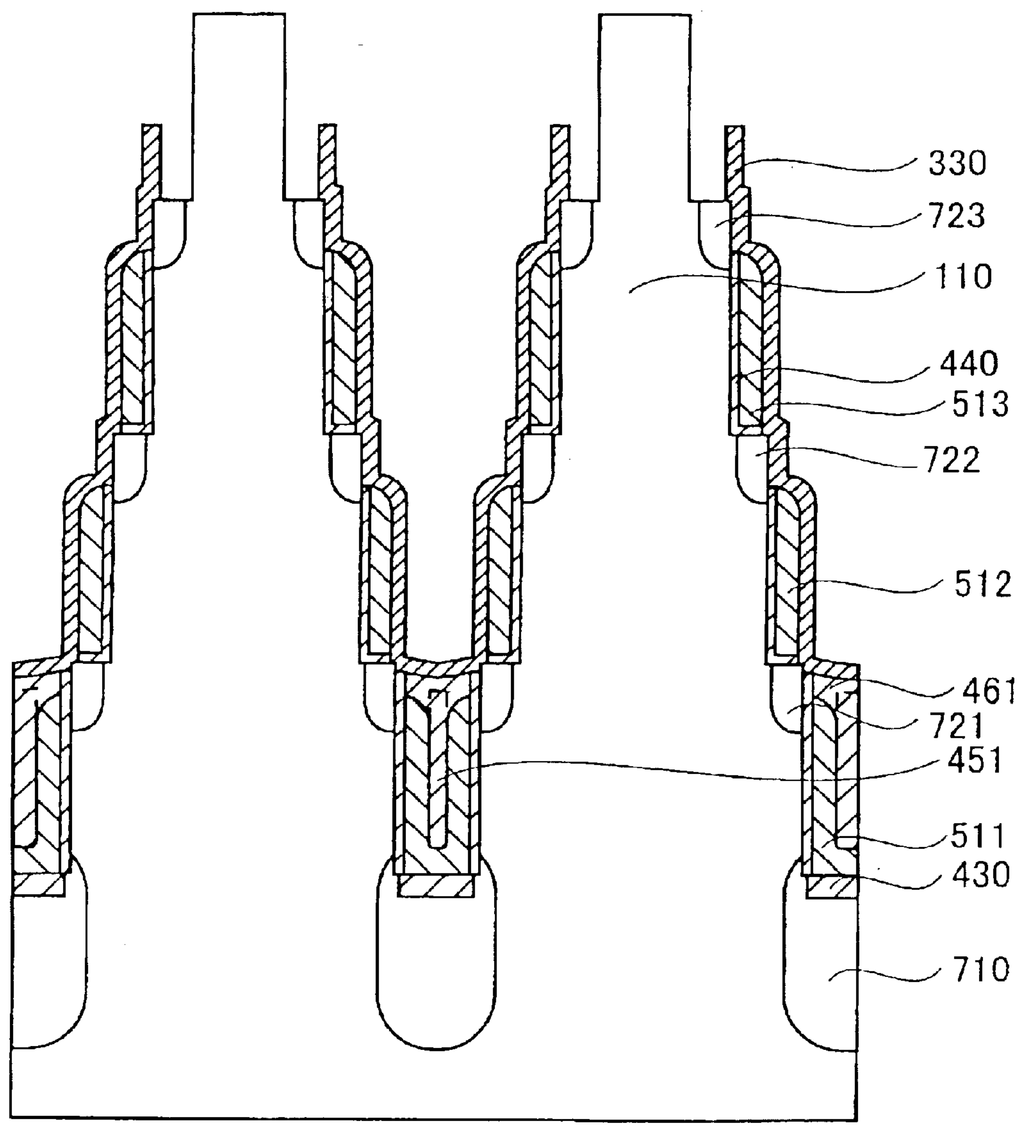
Figure 420:
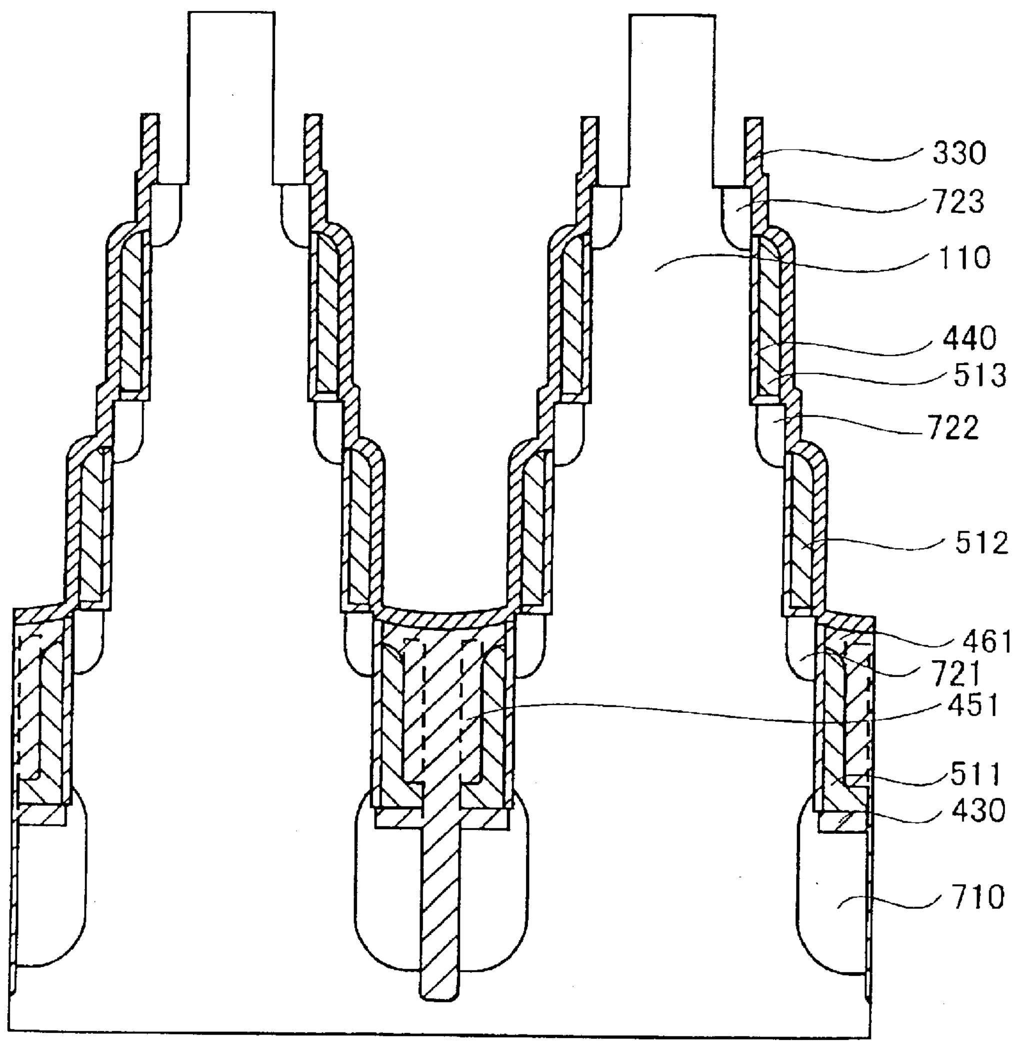

Thereafter, the polysilicon film 514 exposed with respect to the silicon nitride film 330 is selectively removed by isotropic etching (FIG. 386 and FIG. 410). At this time, since the top of the island-like semiconductor layer 110 is also etched, it is desirable to set a large height for the uppermost tier of the island-like semiconductor layer 110. FIG. 386 and FIG. 420 show the case where all the impurity diffusion layer 724 is etched away, but the impurity diffusion layer 724 may partially remain.

Figure 387:
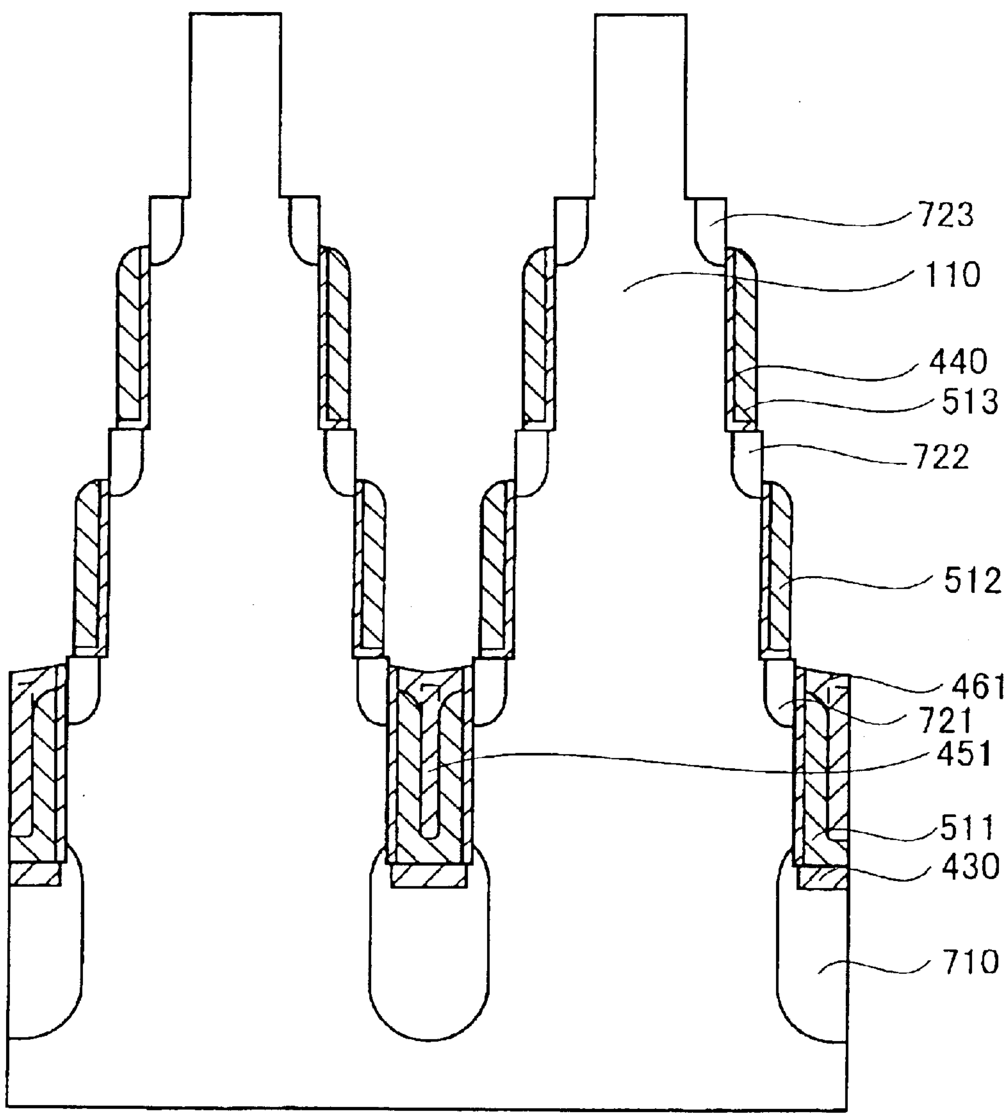
Figure 421:
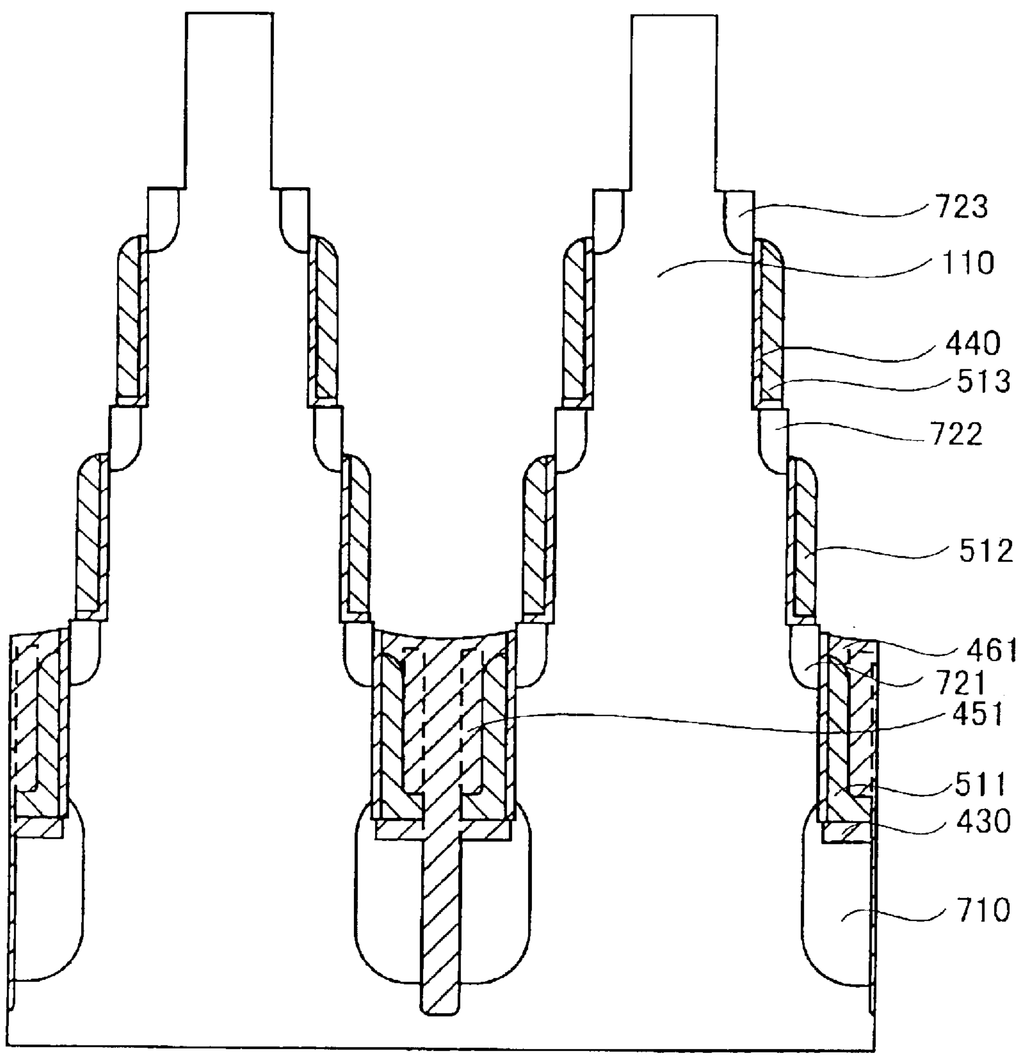

Subsequently, the silicon nitride film 330 is selectively removed by isotropic etching (FIG. 387 and FIG. 421).

Figure 388:
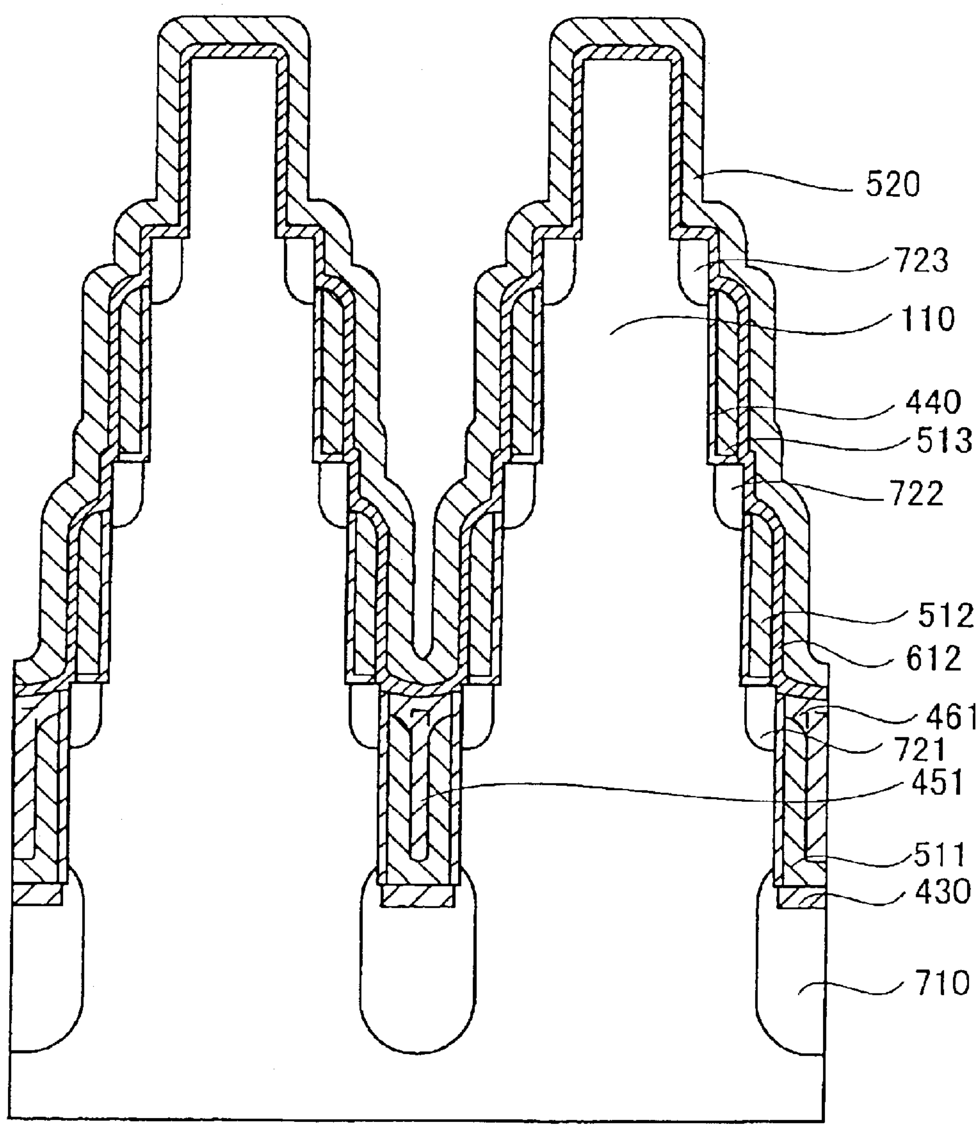
Figure 422:
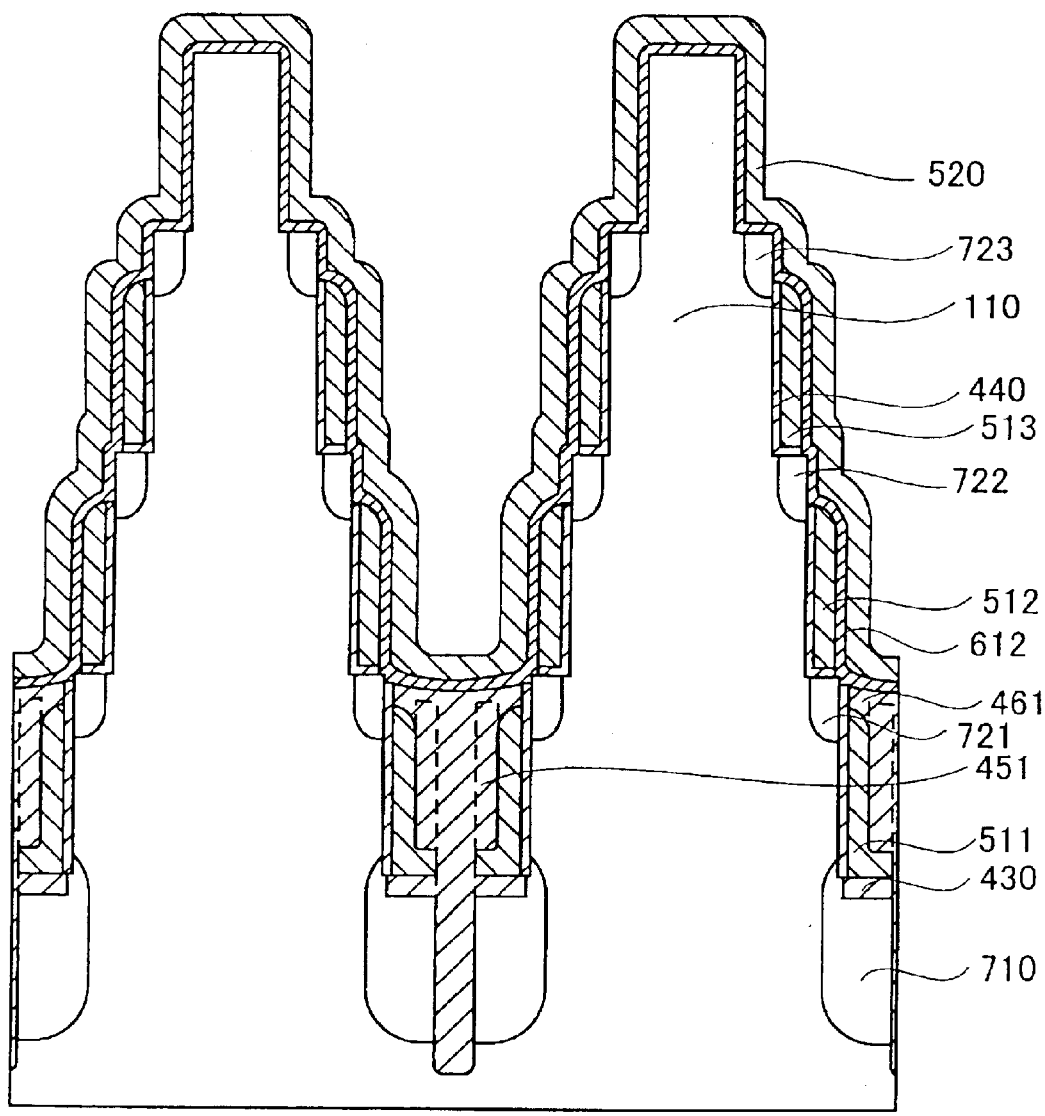

Next an interlayer insulating film 612 is formed on the surface of the exposed polysilicon films 512 and 513. The interlayer insulating film 612 is, for example, ONO film. A polysilicon film 520, for example, is deposited to 15 to 150 nm as a second conductive film (FIG. 388 and FIG. 422).

Figure 389:
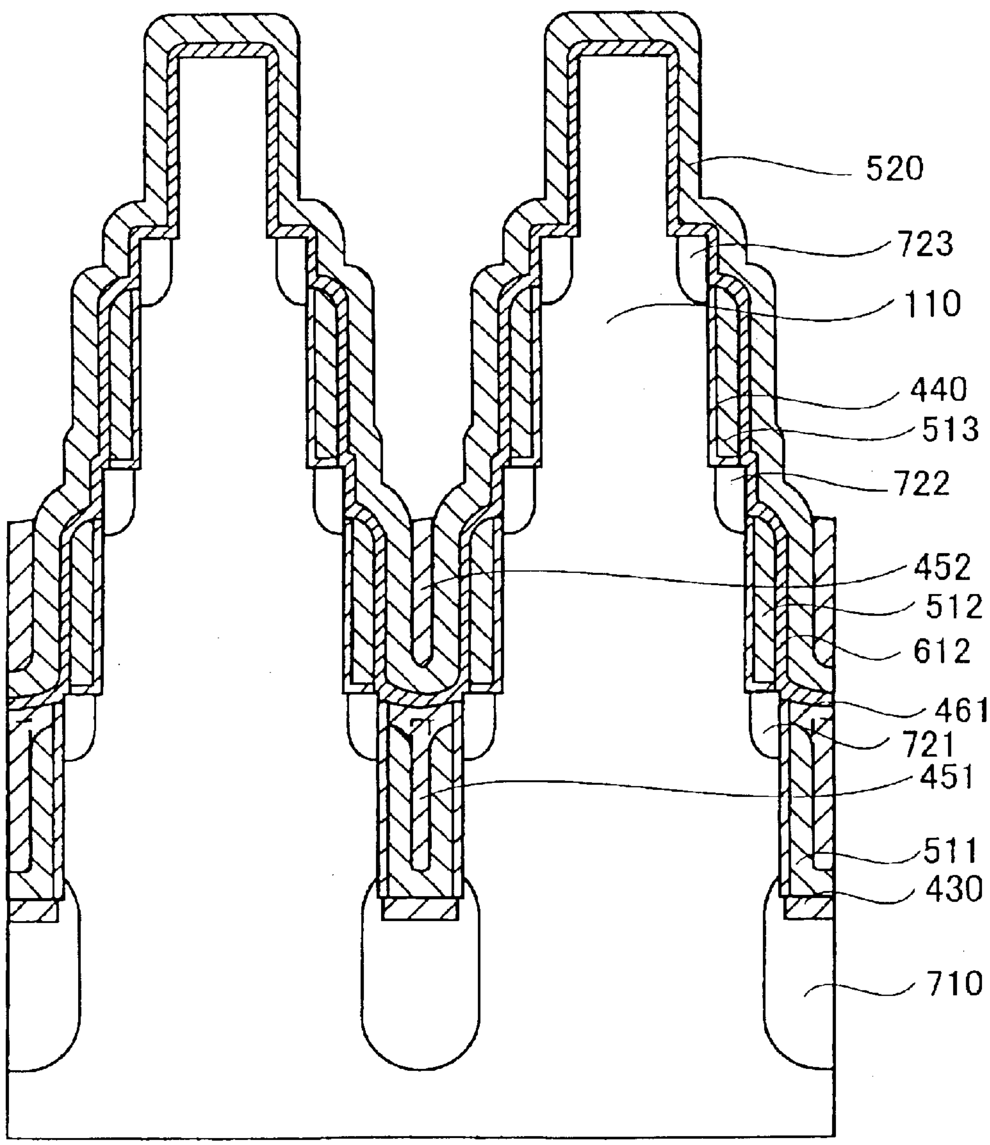
Figure 390:
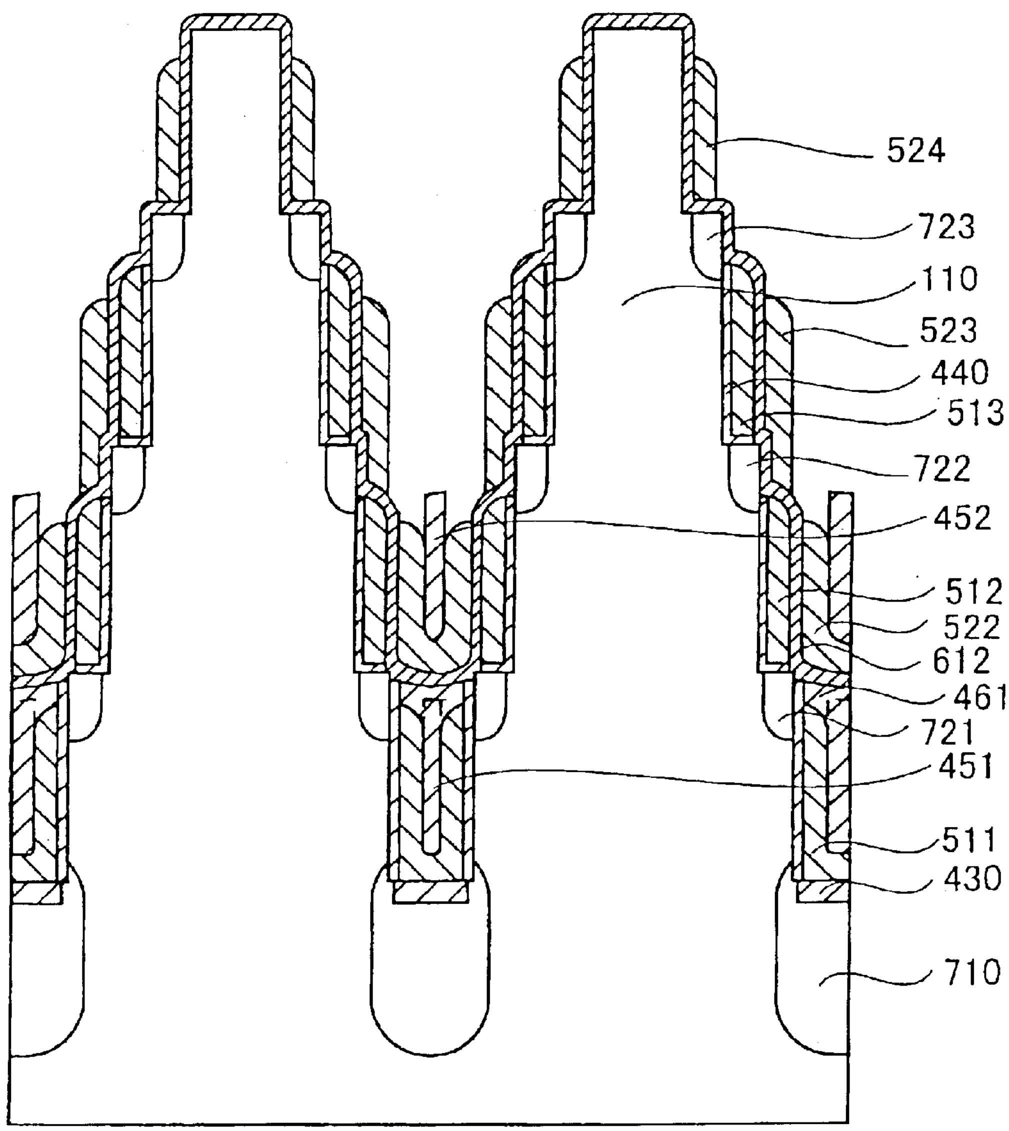
Figure 423:
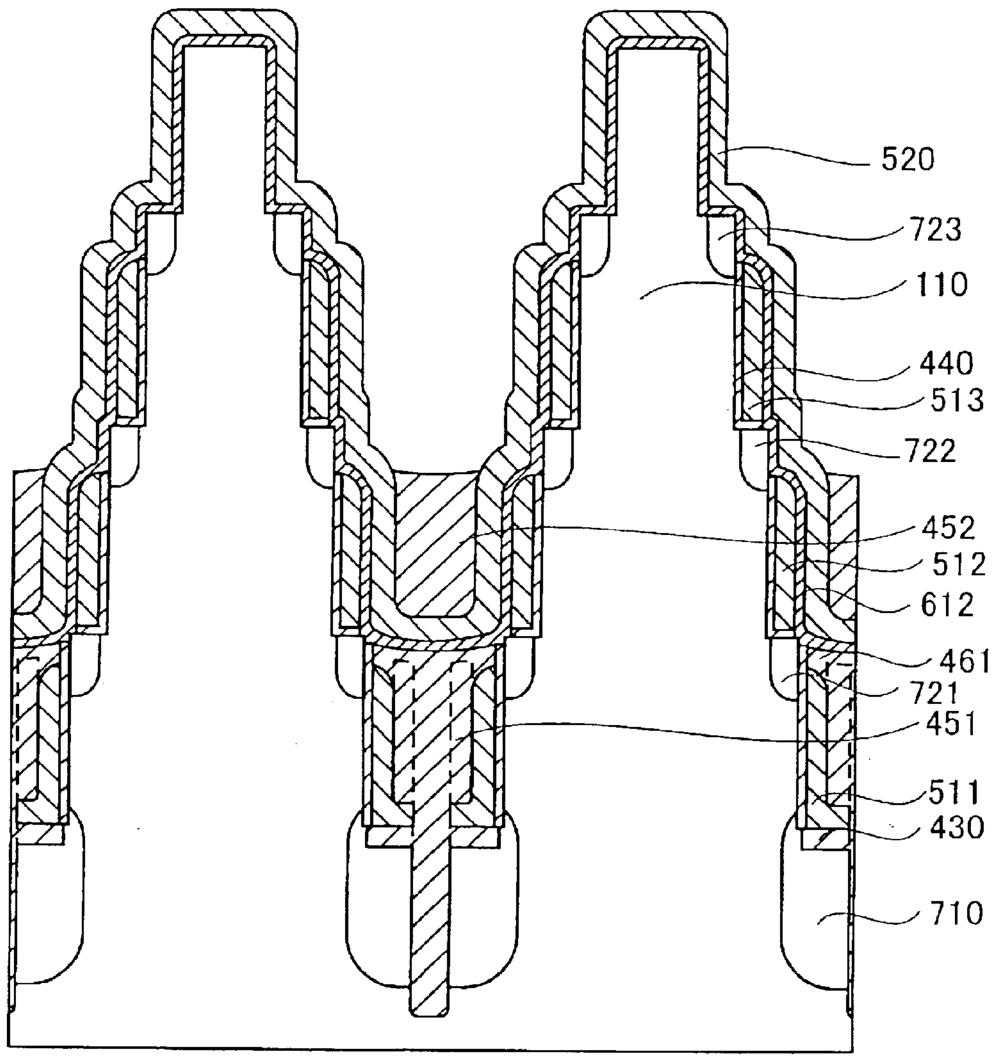
Figure 424:
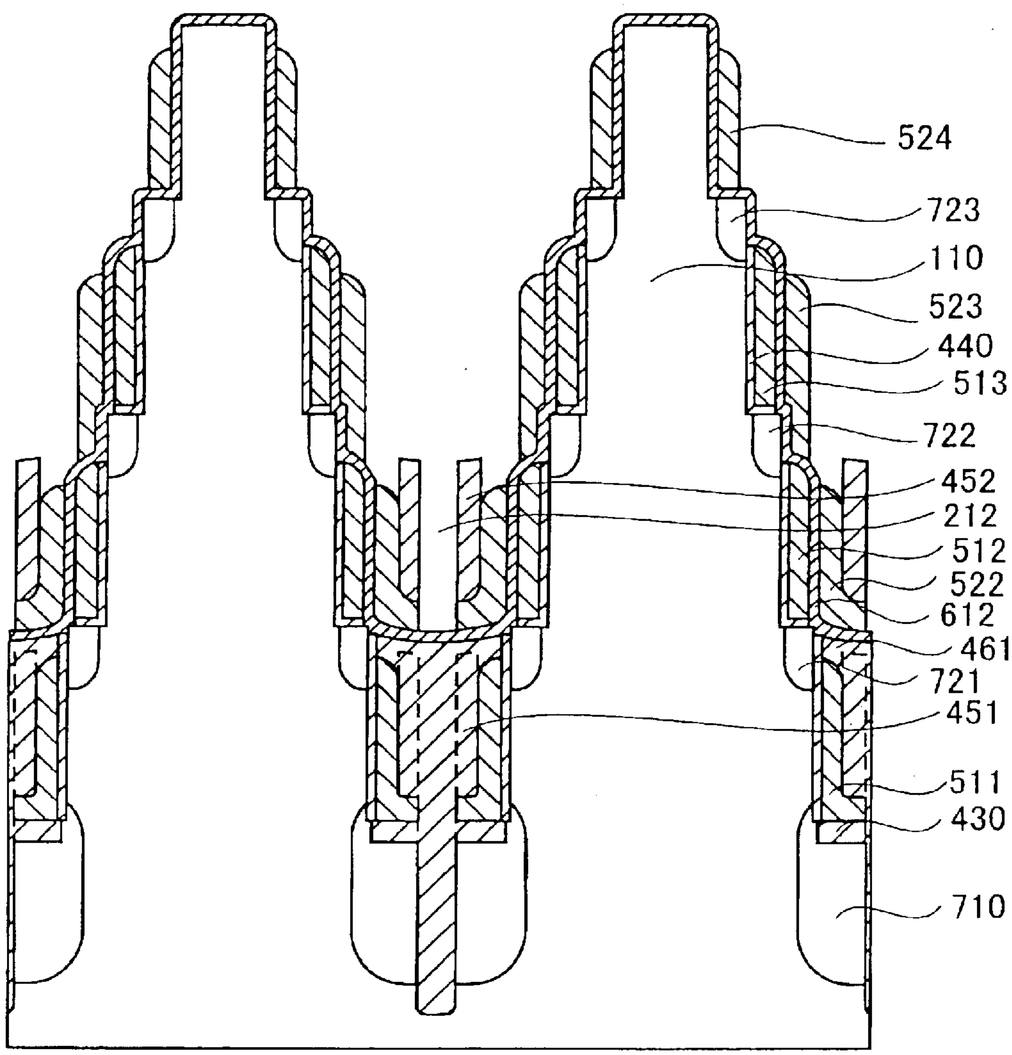

Thereafter, a silicon oxide film 452, for example, is deposited to about 20 to 200 nm as a sixth insulating film and etched back to a desired depth (FIG. 389 and FIG. 423). Using as a mask a resist film R3 patterned by a known photolithography technique, the silicon oxide film 452 is etched by RIE to form a first trench 212. Subsequently, for example, by anisotropic etching, a polysilicon film 520 is formed in the form of sidewalls on sidewalls of the polysilicon films 512, 513 and 514 with intervention of the interlayer insulating film 612 in each tier of each island-like semiconductor layer 110. Thereby separate polysilicon films 522, 523 and 524 are formed at the same time, and simultaneously a third wiring layer to be a control gate line is formed separately which is continuous in direction A–A' of FIG. 1 (FIG. 390 and FIG. 424).

Figure 391:
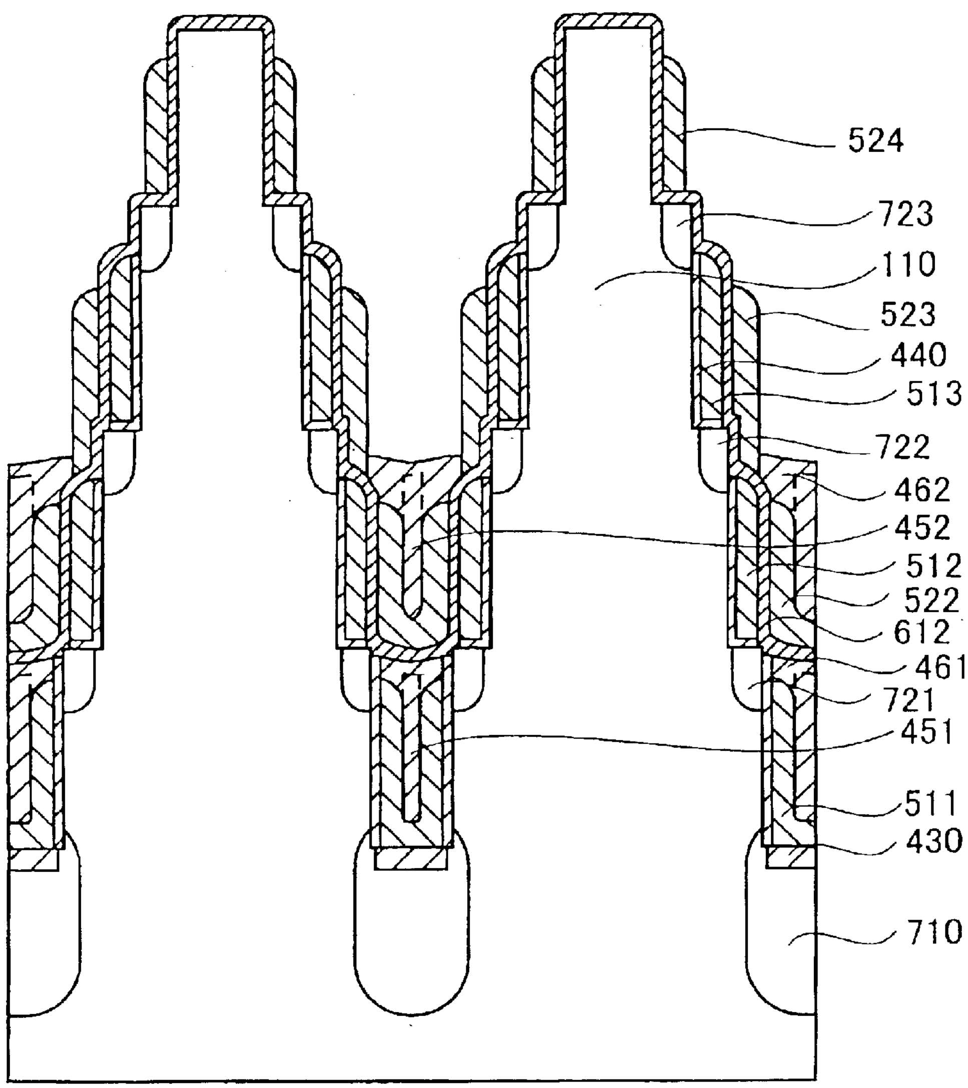
Figure 425:
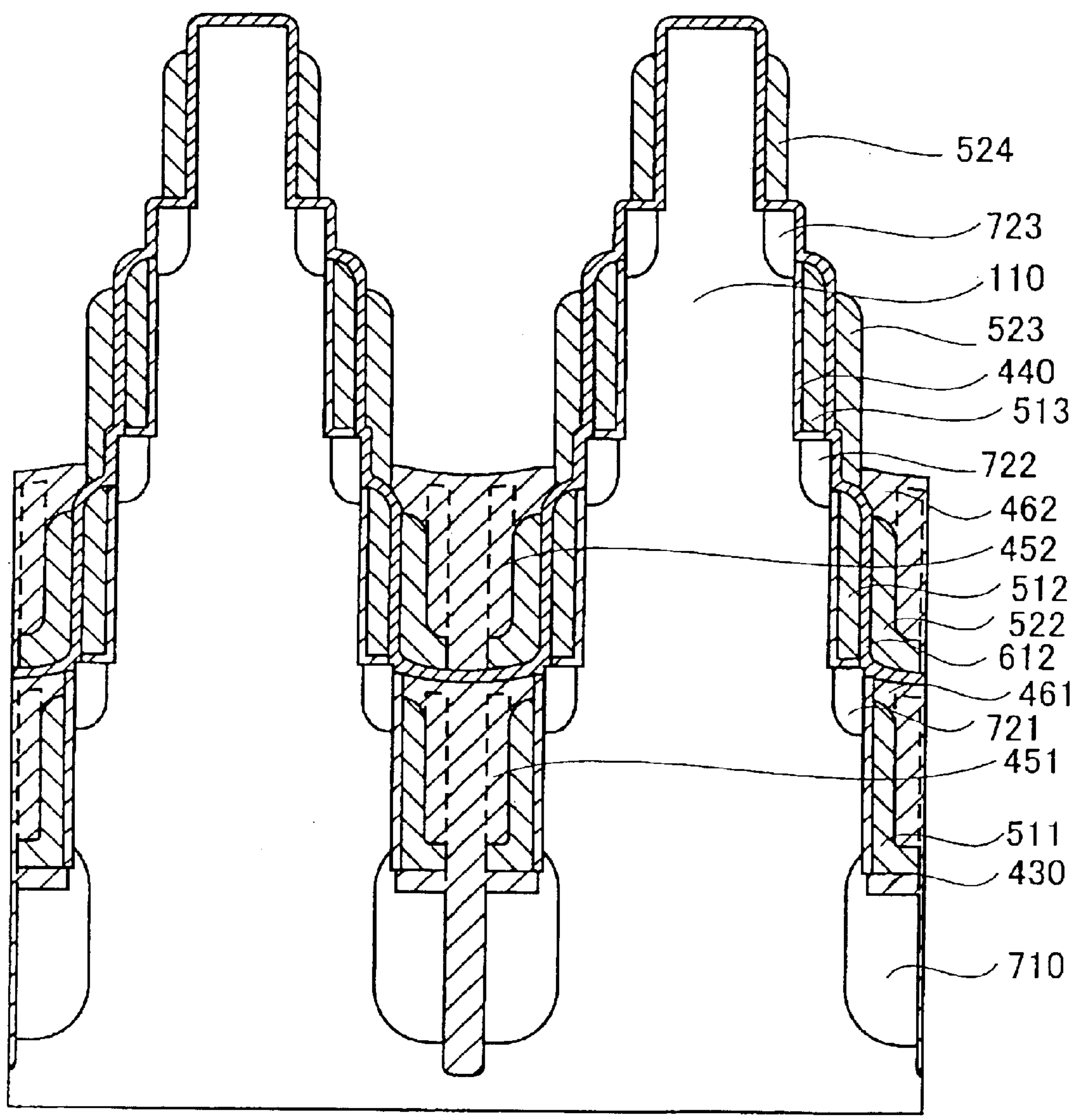

Next, a silicon oxide film 462, for example, is deposited to about 20 to 400 nm as a seventh insulating film and is isotropically etched to be buried and cover the first trench 212 and the top of the polysilicon film 522 (FIG. 391 and FIG. 425).

Figure 392:
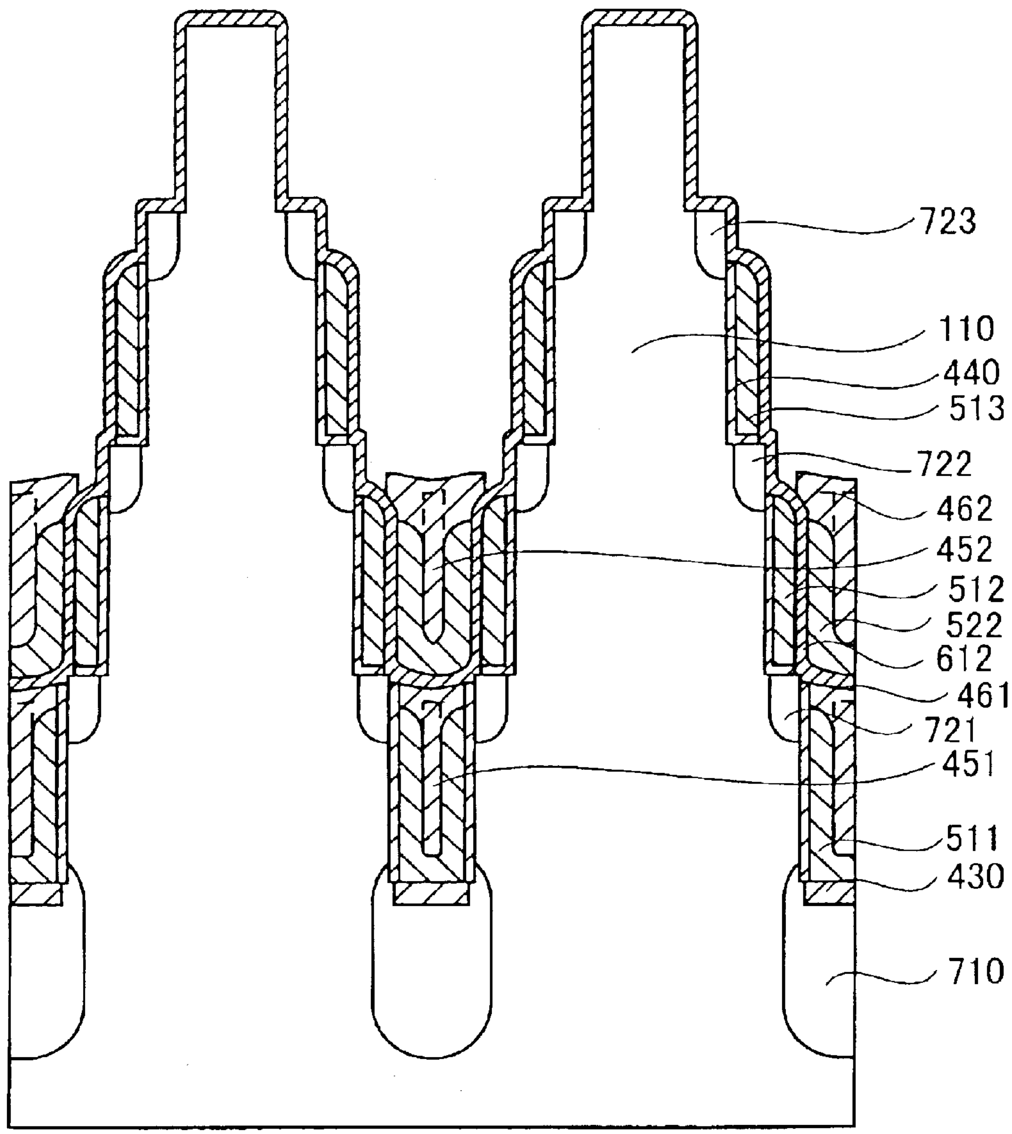
Figure 393:
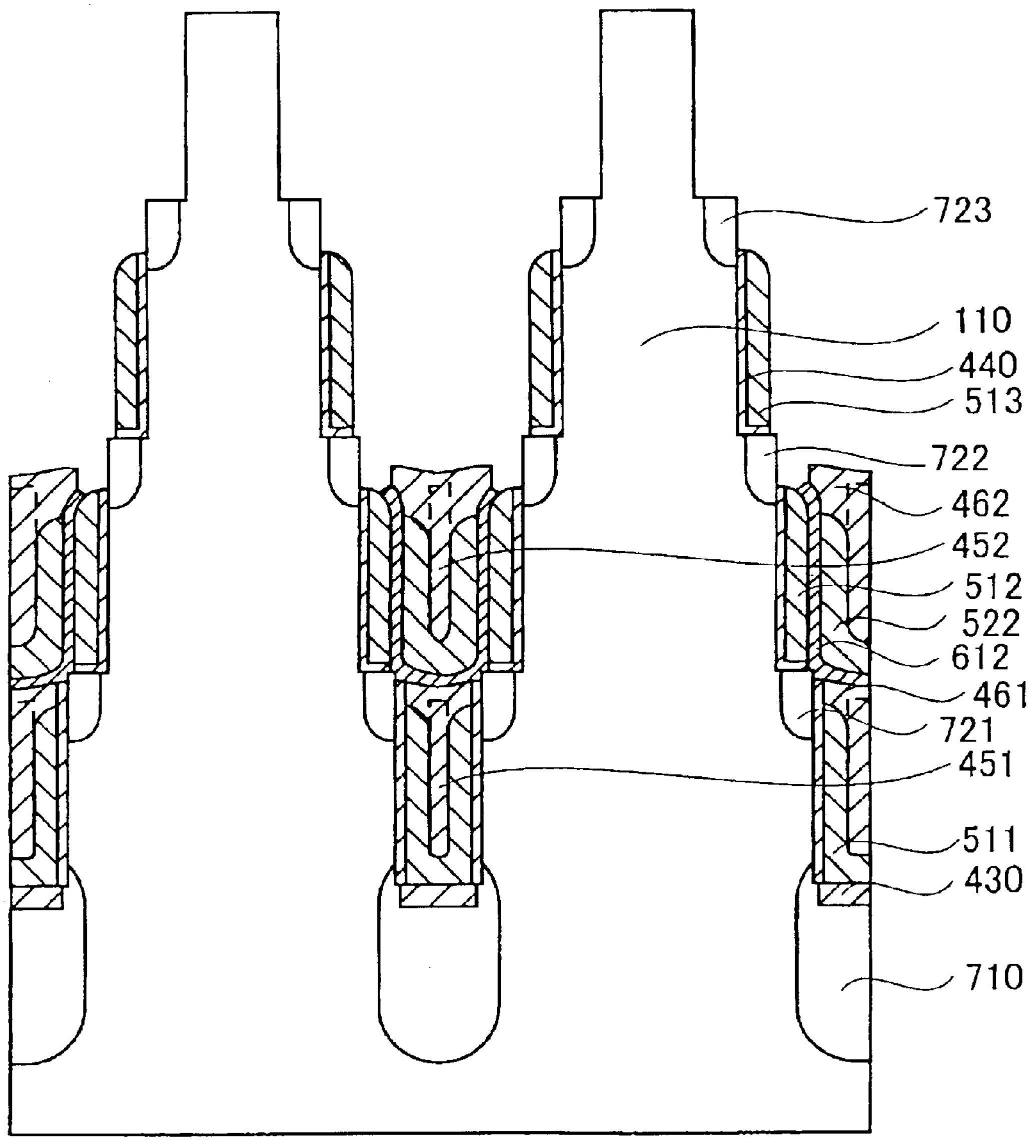
Figure 426:
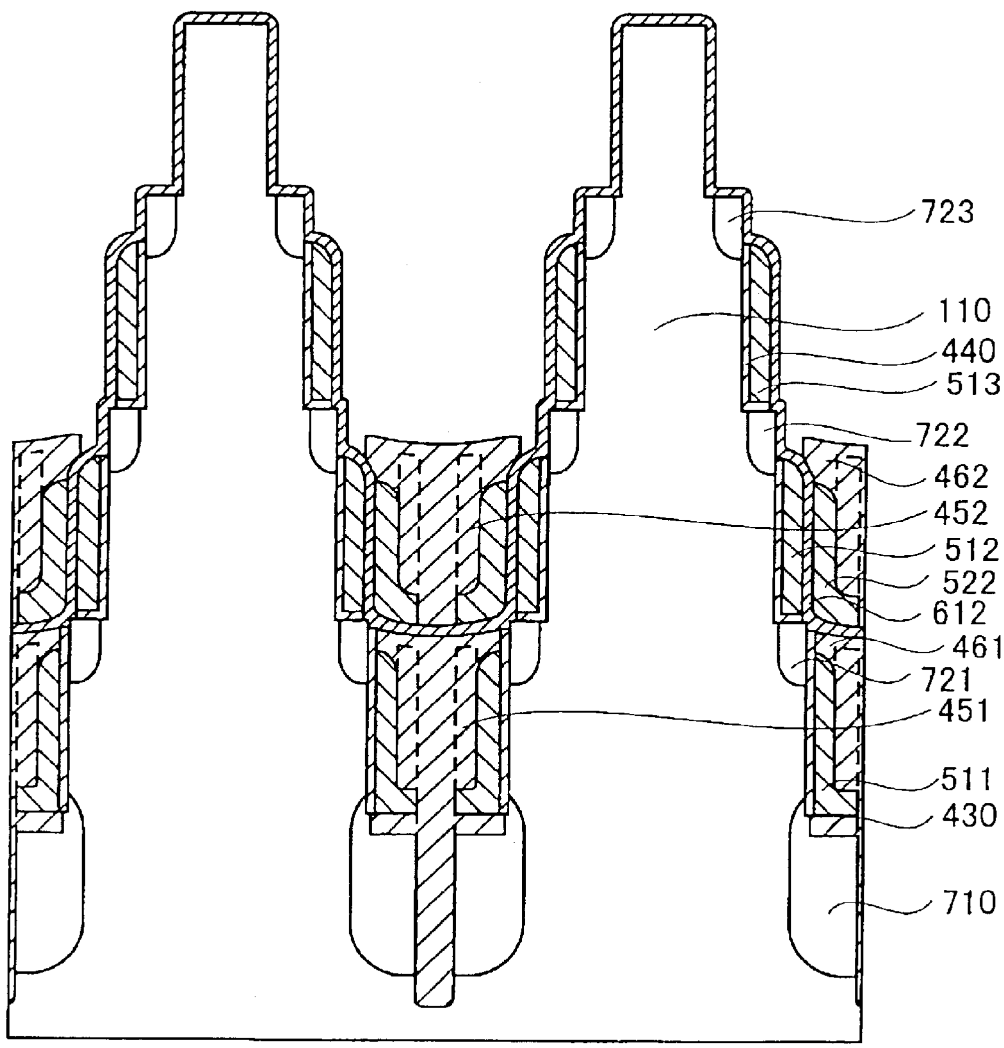
Figure 427:
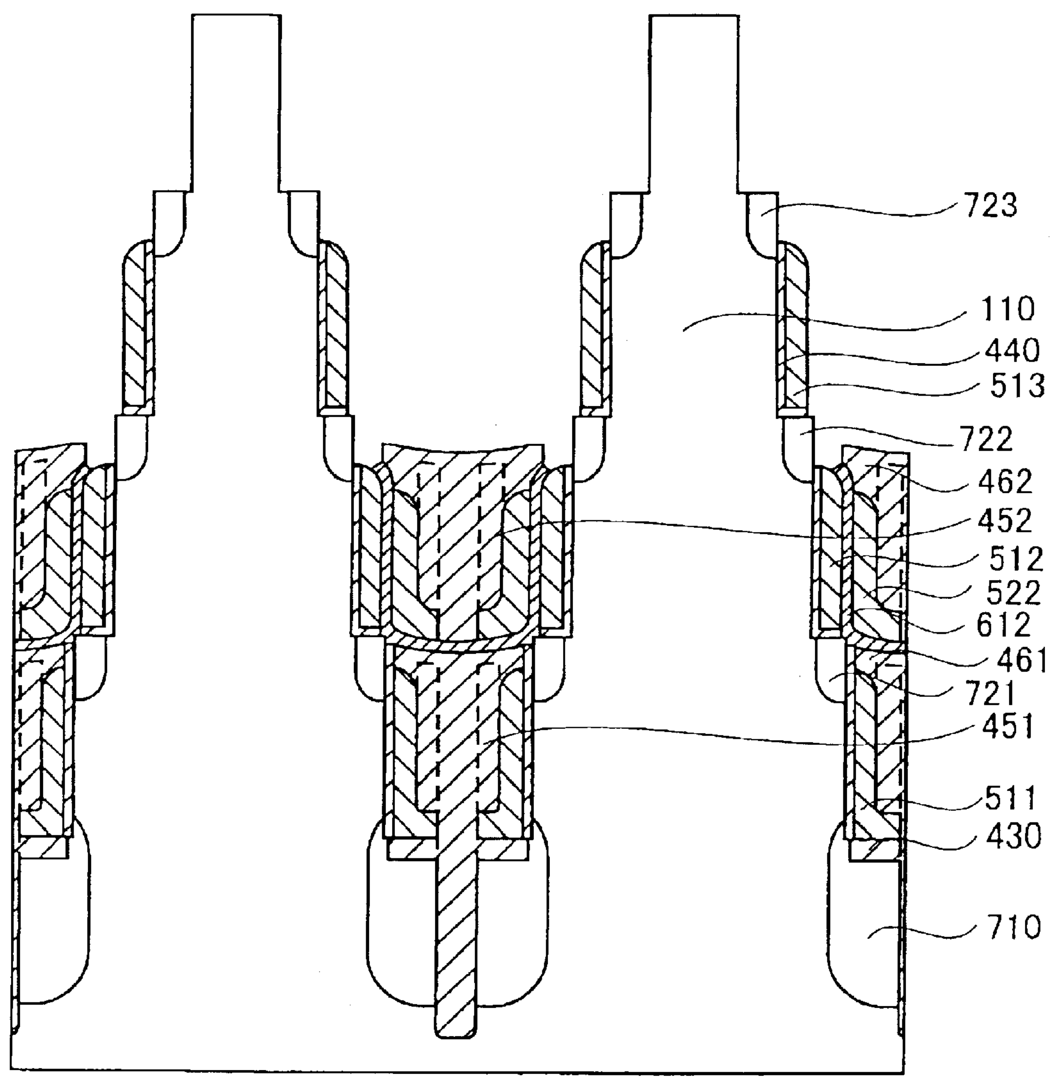

Subsequently, the polysilicon films 523 and 524 exposed with respect to the silicon oxide film 462 are selectively etched by isotropic etching (FIG. 392 and FIG. 426). Thereafter, an exposed part of the interlayer insulating film 612 are removed (FIG. 393 and FIG. 427).

Figure 394:
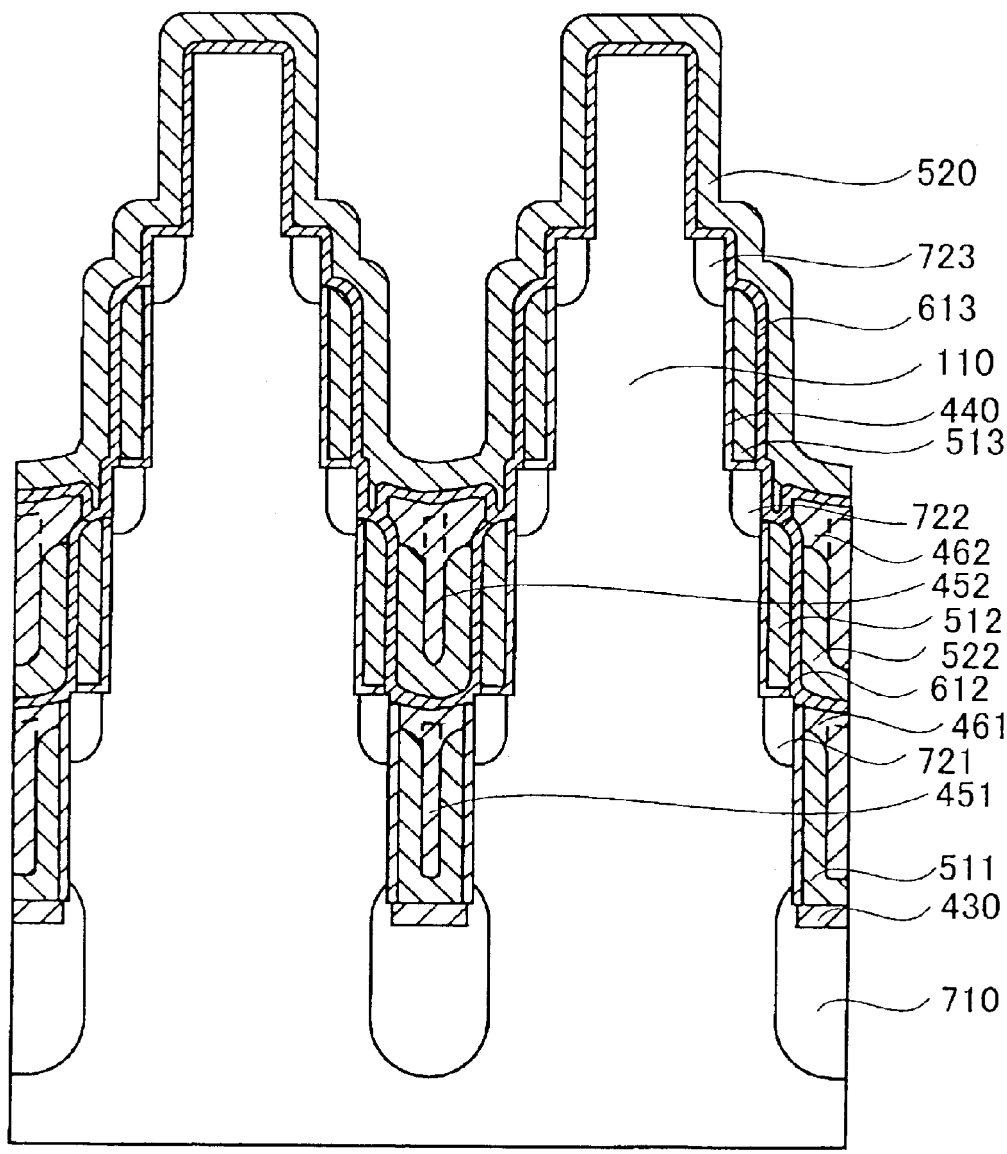
Figure 428:
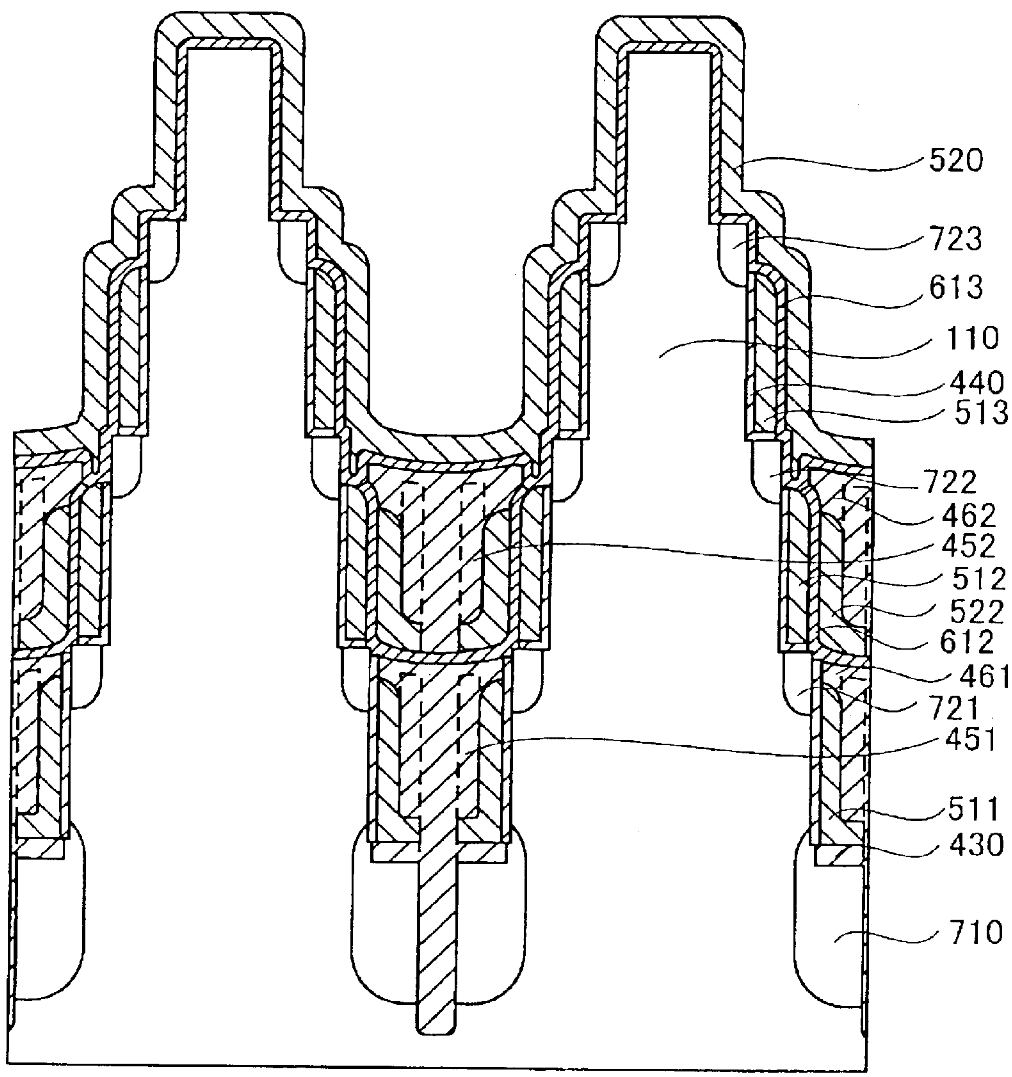

Next, an interlayer insulating film 613 is formed on the exposed surface of the polysilicon film 513, and sequentially, a polysilicon film 520, for example, is deposited to 15 to 150 nm as a second conductive film (FIG. 394 and FIG. 428).

Figure 395:
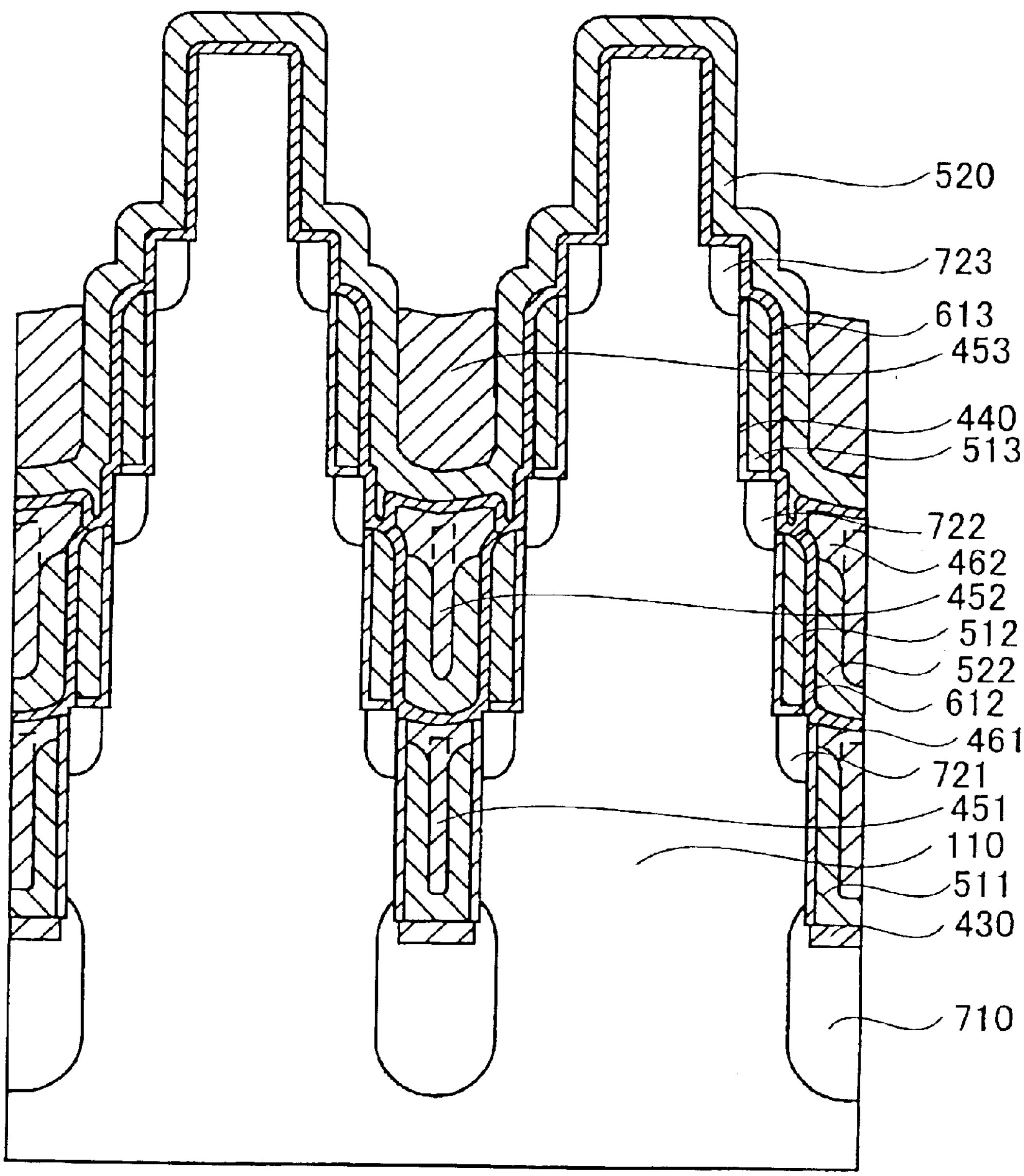
Figure 396:
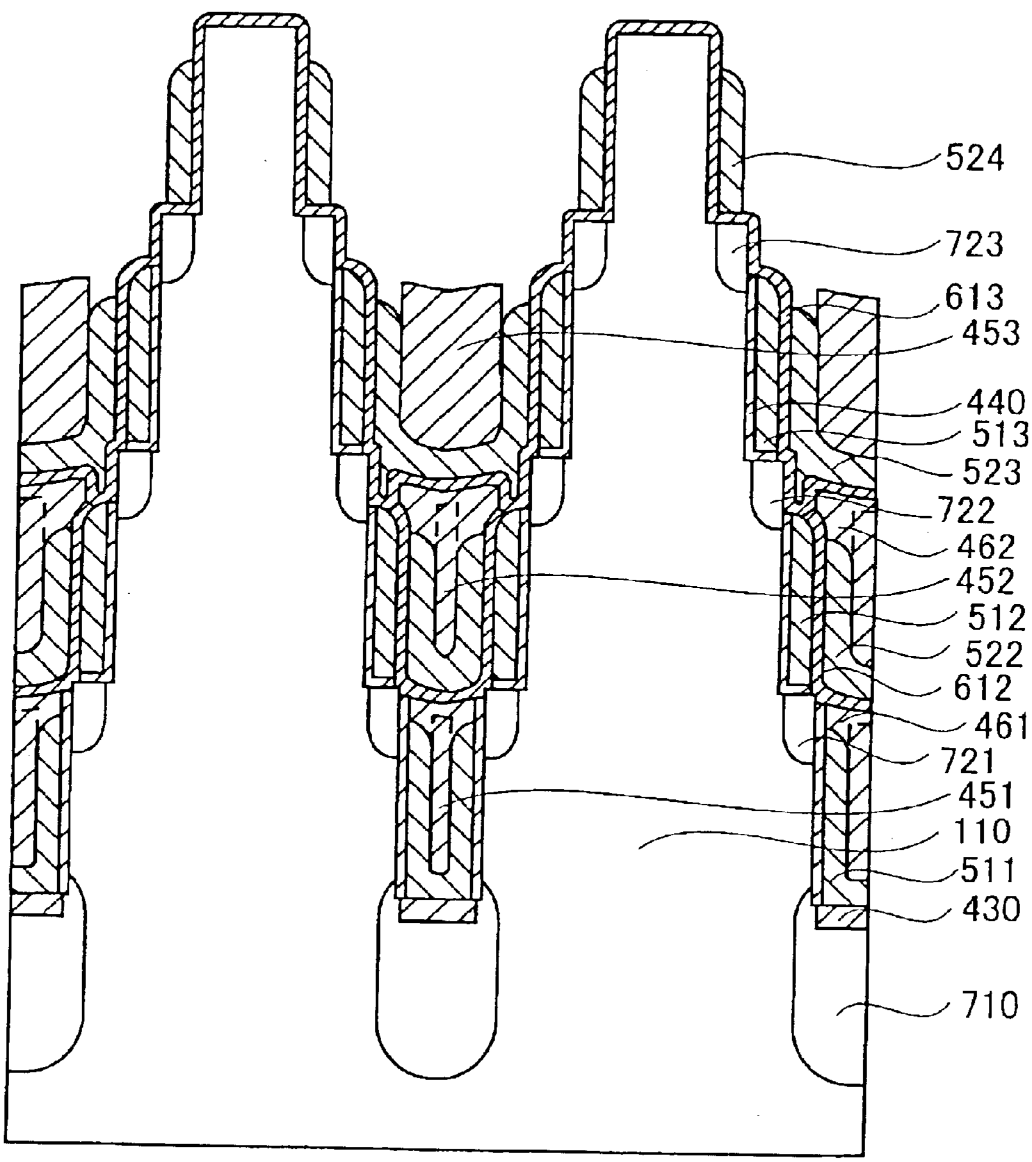
Figure 429:
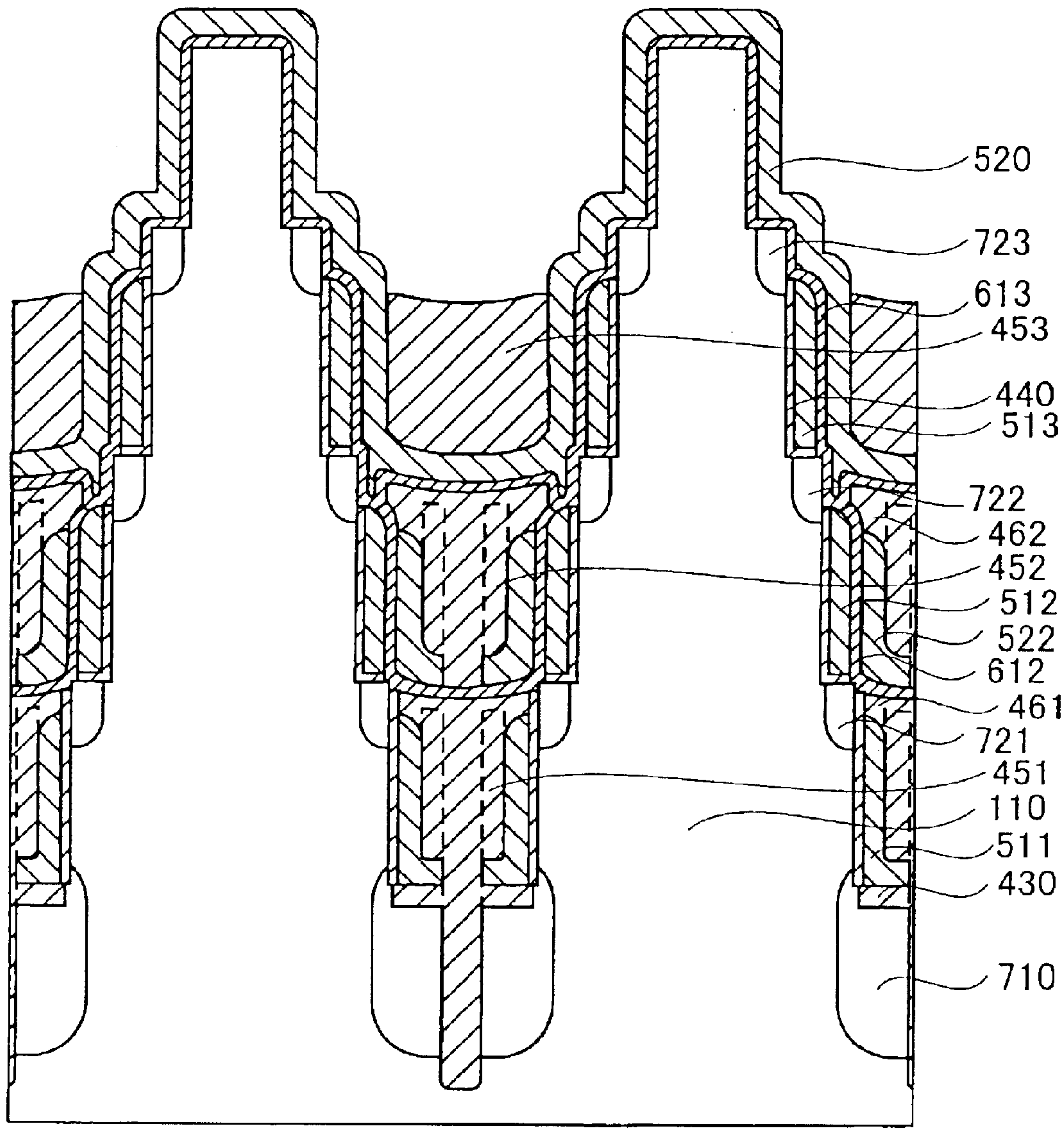
Figure 430:
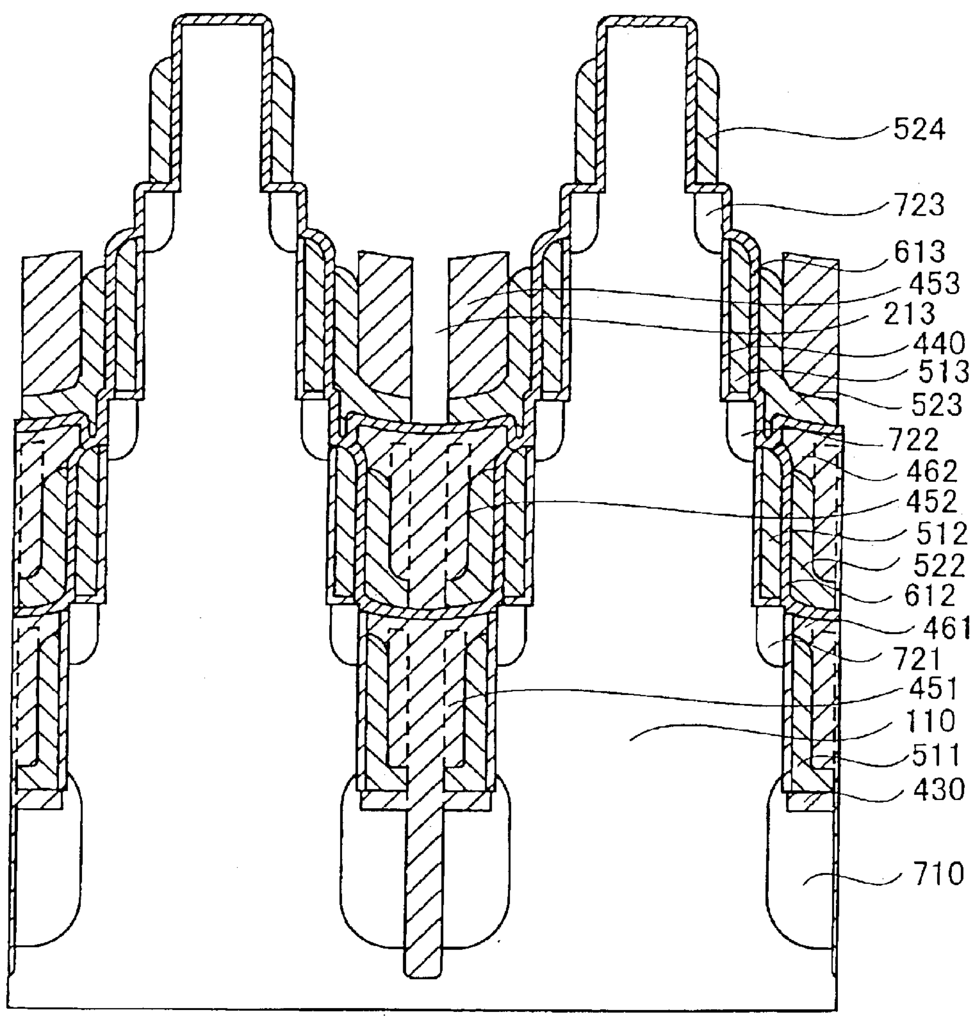

Thereafter, a silicon oxide film 453, for example, is deposited to about 20 to 200 nm as a sixth insulating film and etched back to a desired depth (FIG. 395 and FIG. 429). The silicon oxide film 453 is etched by RIE using as a mask a resist film R4 patterned by a known photolithography technique to form a first trench 213. Subsequently, for example, by anisotropic etching, a polysilicon film 520 is formed in the form of sidewalls on sidewalls of each tier of each island-like semiconductor layer 110 with intervention of the interlayer insulating film 613. Thereby separate polysilicon films 523 and 524 are formed at the same time, and simultaneously a third wiring layer to be a control gate line is formed separately which is continuous in direction A–A' of FIG. 1 (FIG. 396 and FIG. 430).

Figure 397:
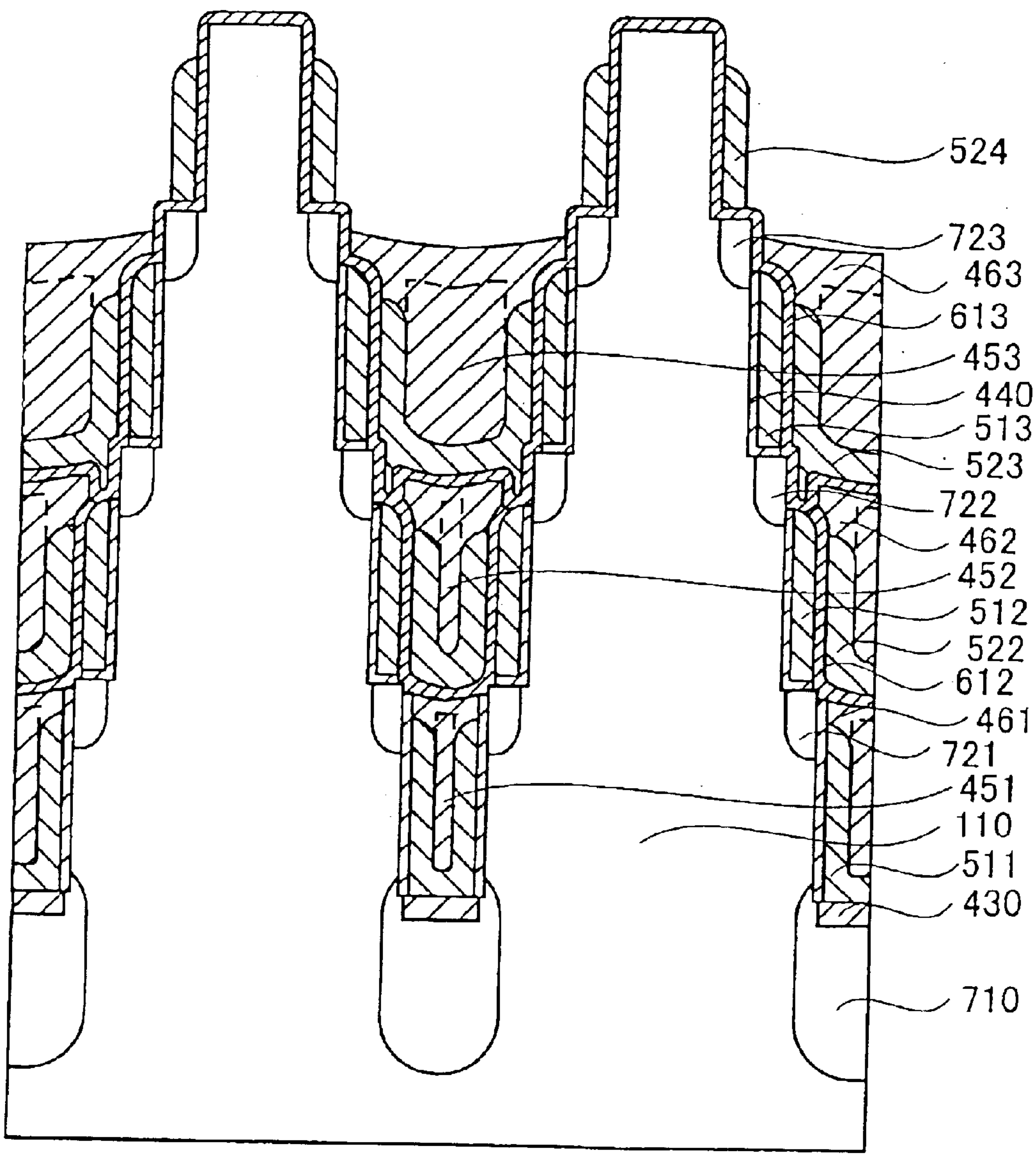
Figure 431:
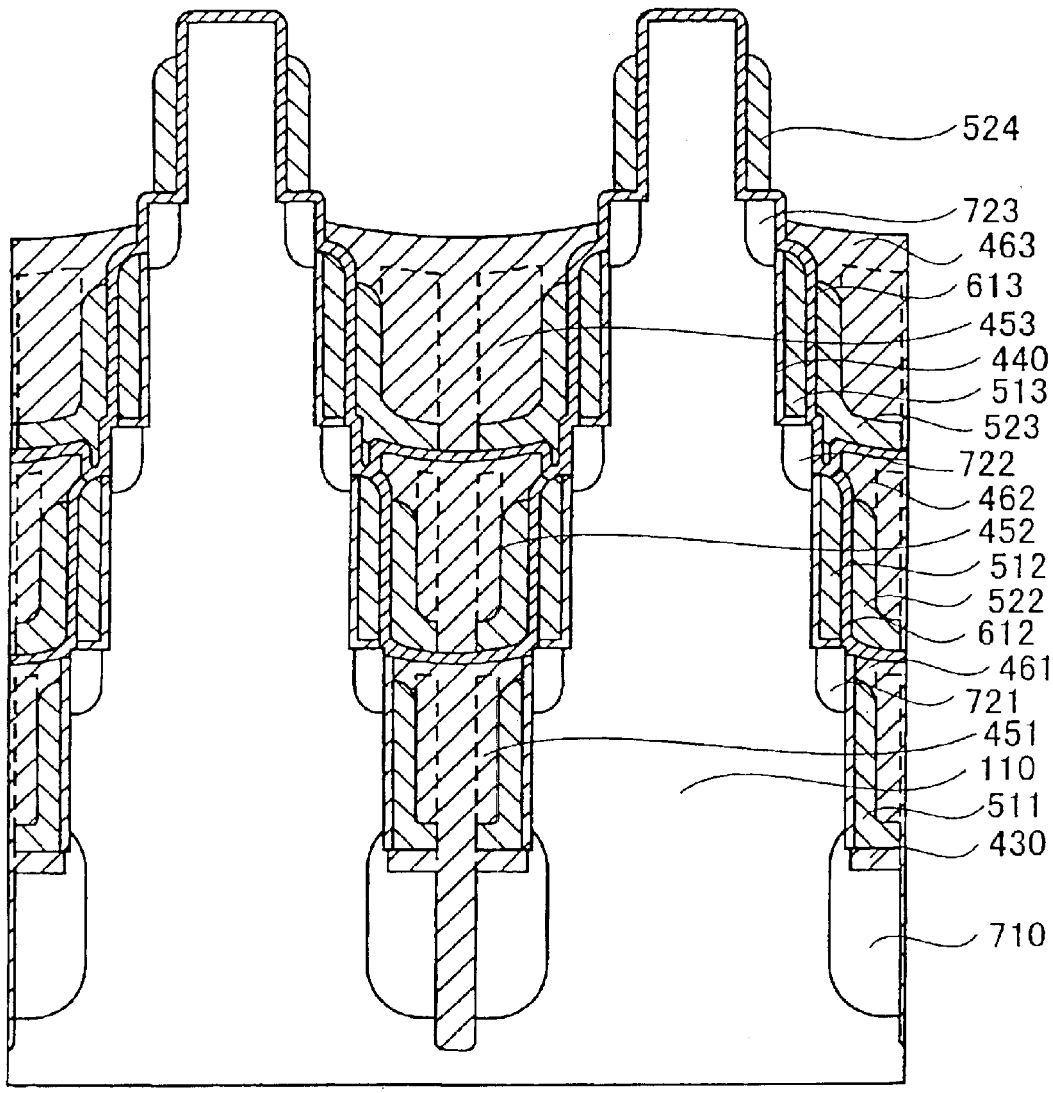

Next, a silicon oxide film 463, for example, is deposited to about 20 to 400 nm as a seventh insulating film and is isotropically etched to be buried and cover the first trench 213 and the top of the polysilicon film 523 (FIG. 397 and FIG. 431).

Figure 398:
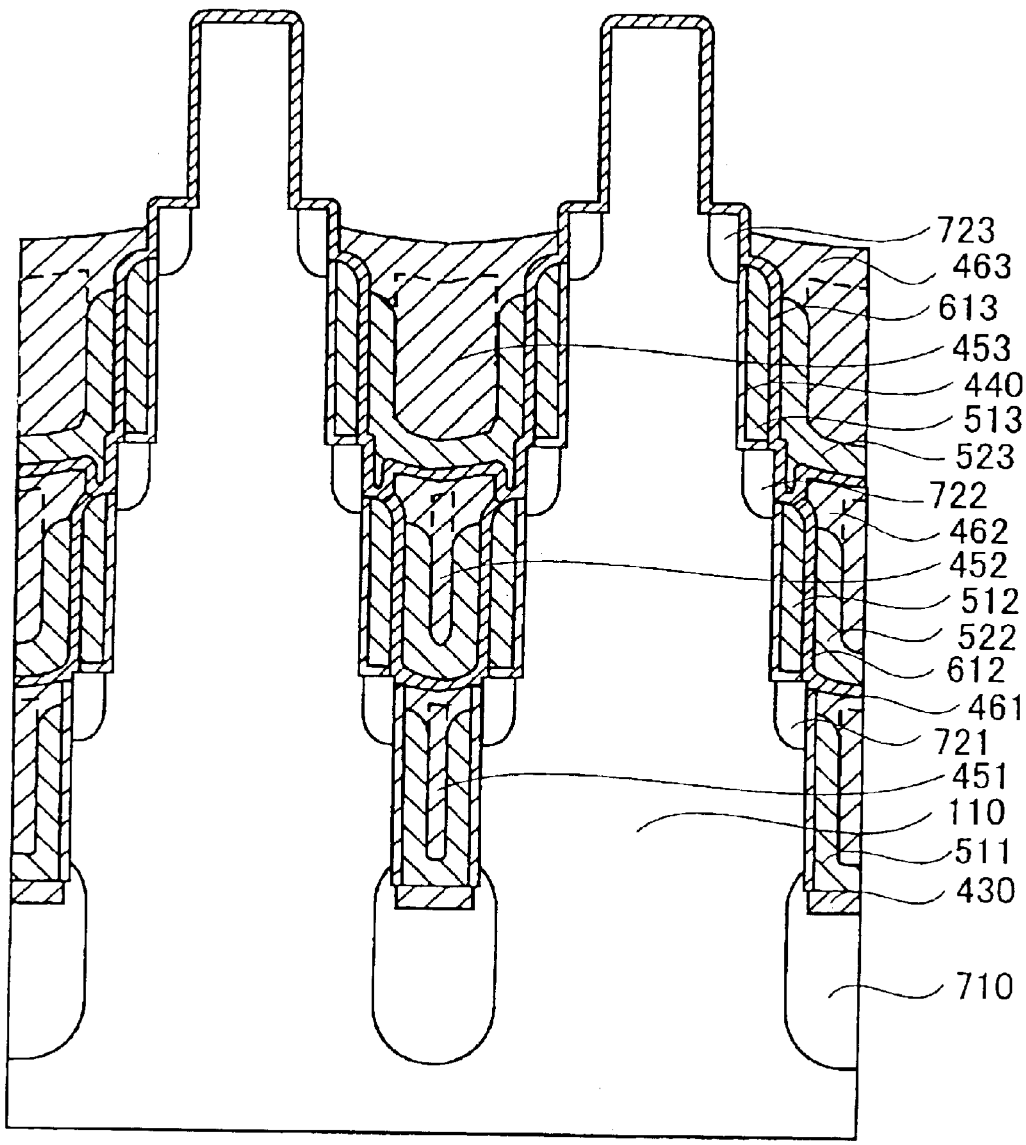
Figure 399:
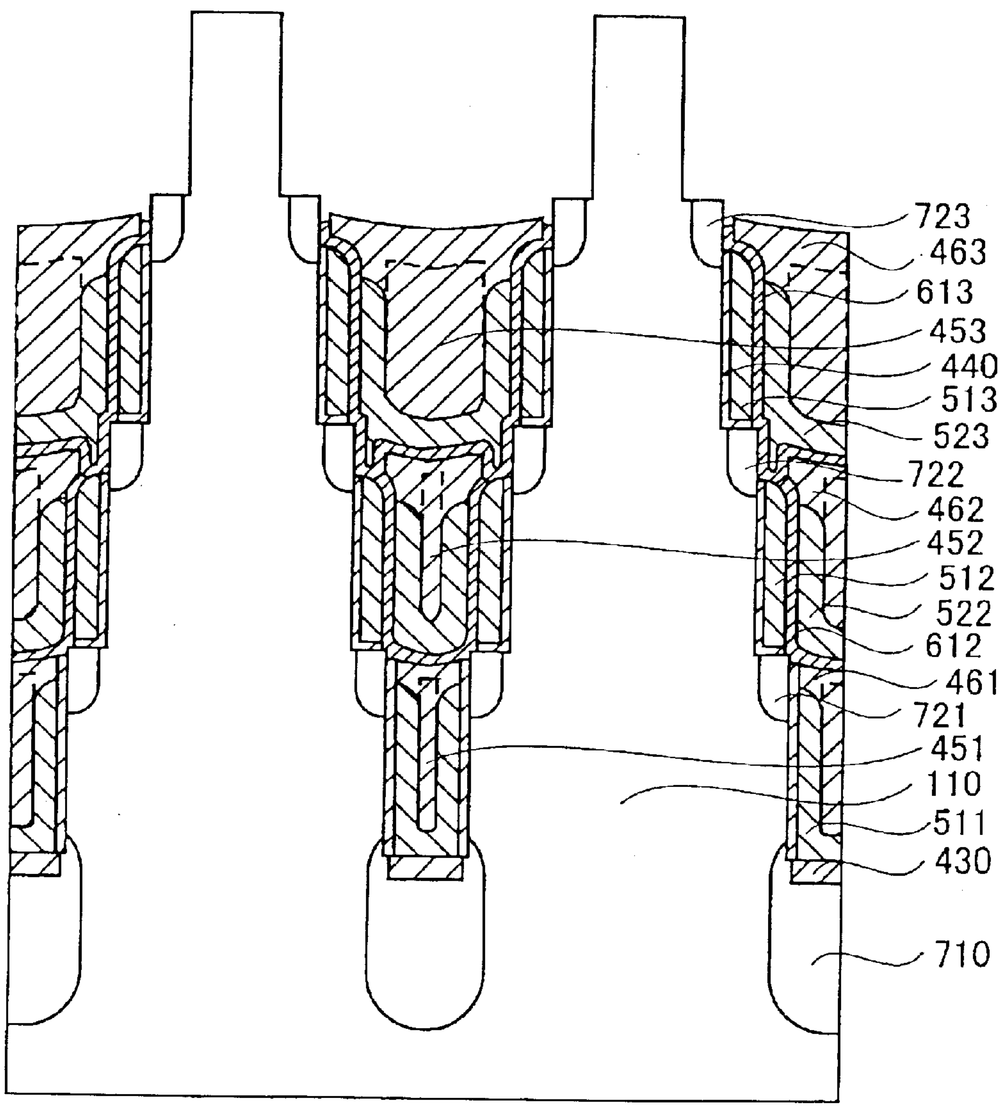
Figure 432:
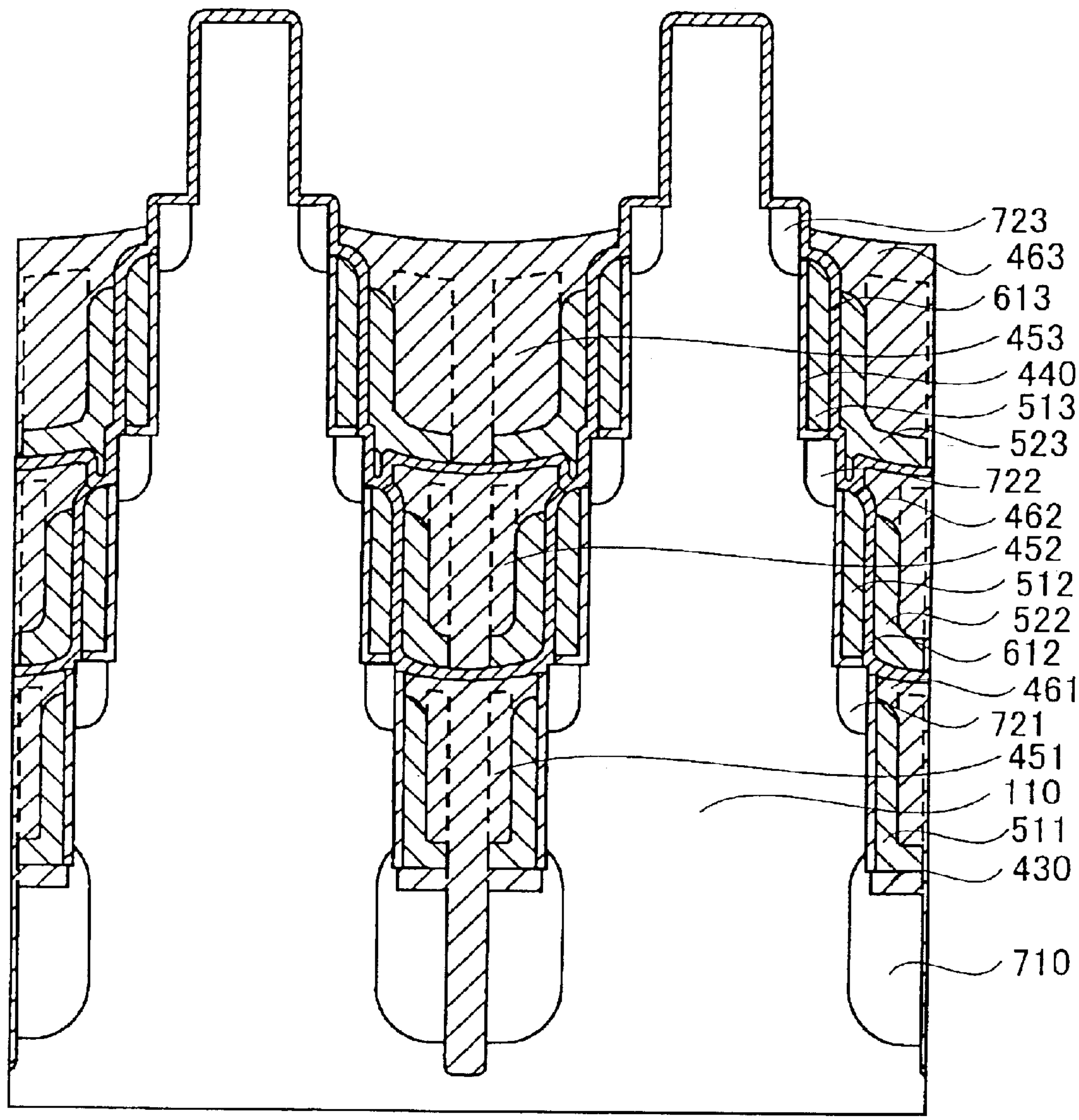
Figure 433:
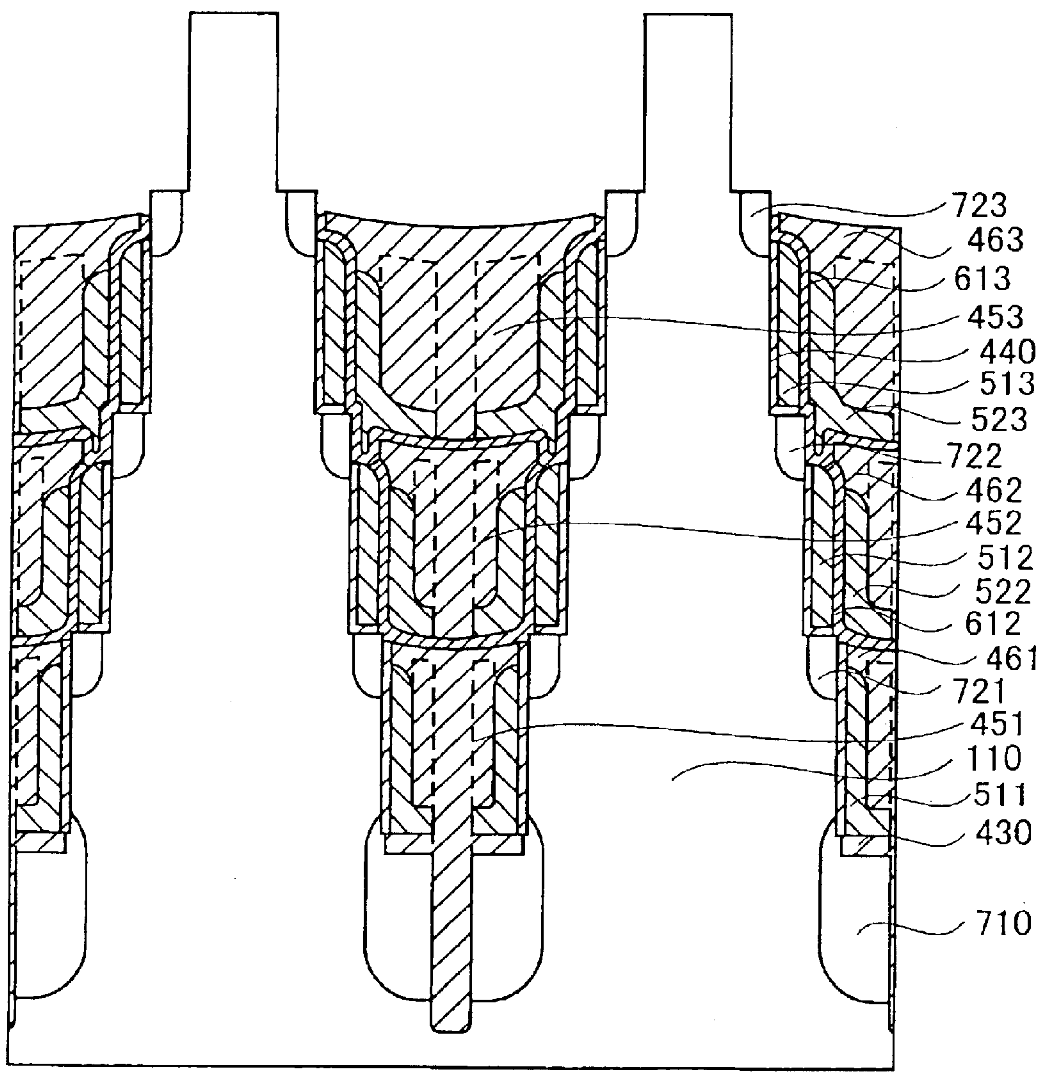

Subsequently, the polysilicon film 524 exposed with respect to the silicon oxide film 463 is selectively etched by isotropic etching (FIG. 398 and FIG. 432). Thereafter, an exposed part of the interlayer insulating film 613 are removed (FIG. 399 and FIG. 433).

Figure 400:
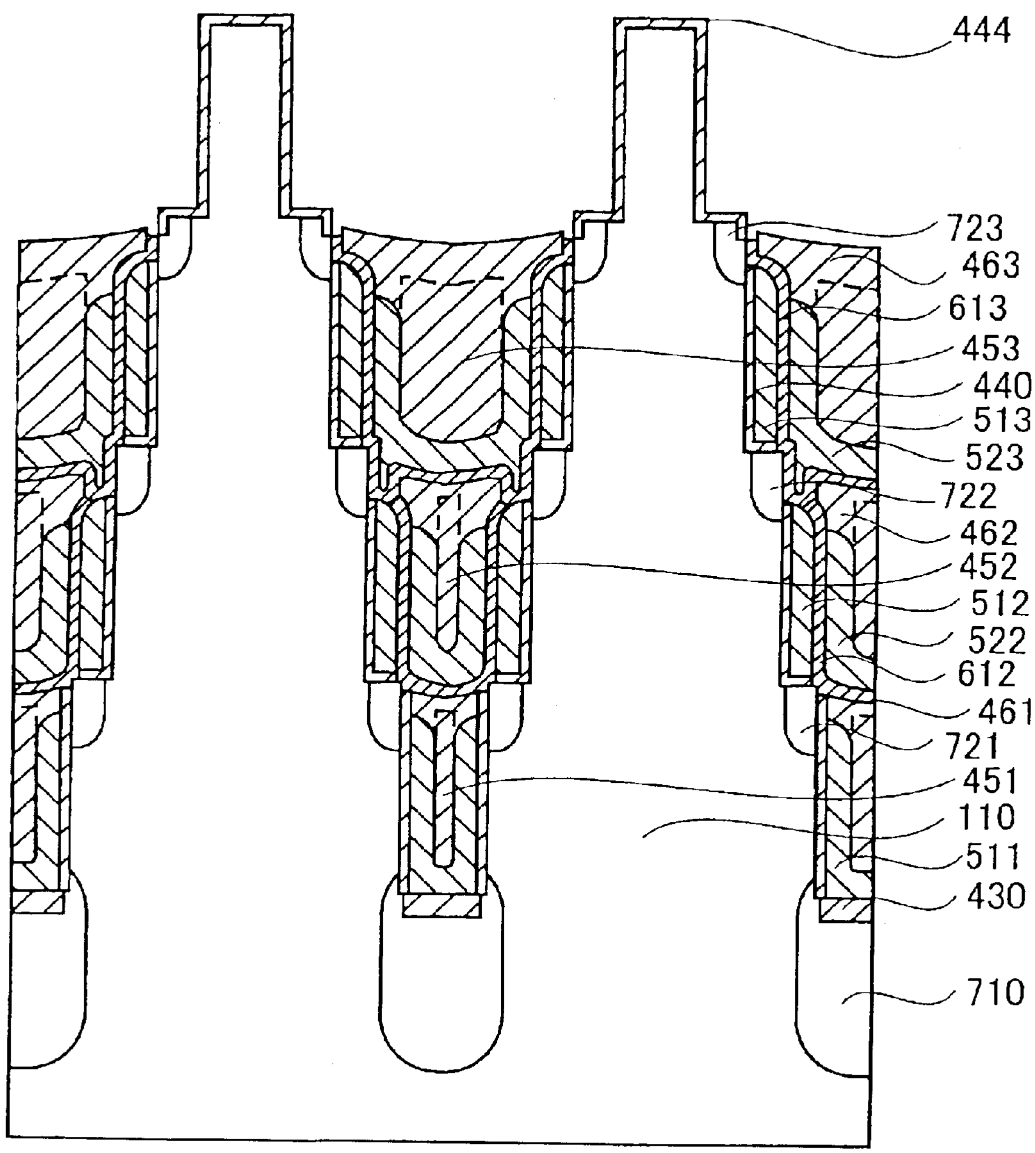
Figure 434:
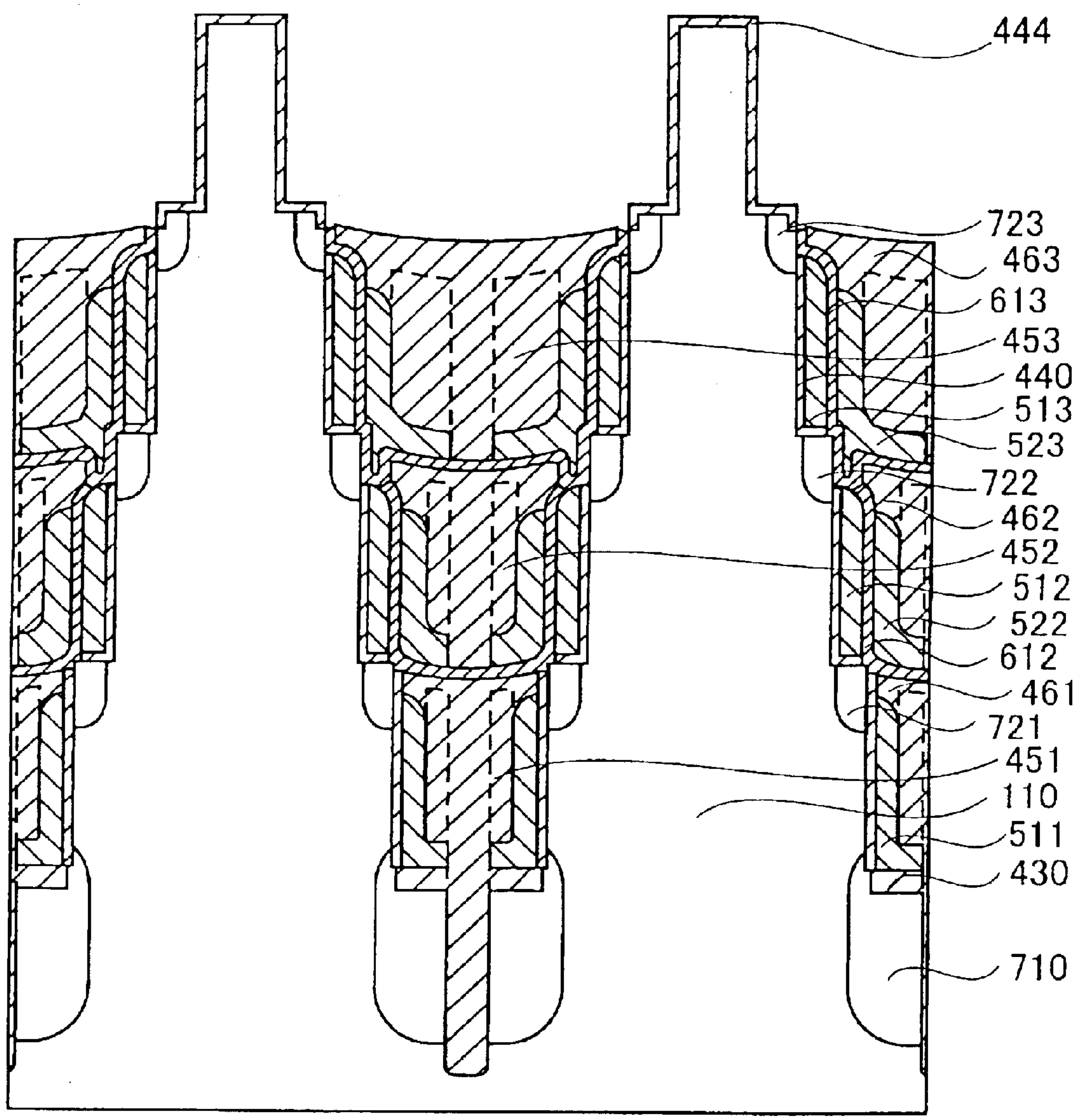

Then, channel ion implantation is carried out on the exposed surface of the island-like semiconductor layer 110 as required, and the concentration in the cannel is re-adjusted. A silicon oxide film 444 is formed as a fifth insulating film to be a tunnel oxide film of about 10 nm thickness around the island-like semiconductor layer 110, for example, by use of thermal oxidation (FIG. 400 and FIG. 434). The tunnel oxide film is not limited to the thermally oxidized film but may be a CVD oxide film or an oxynitride film.

Figure 401:
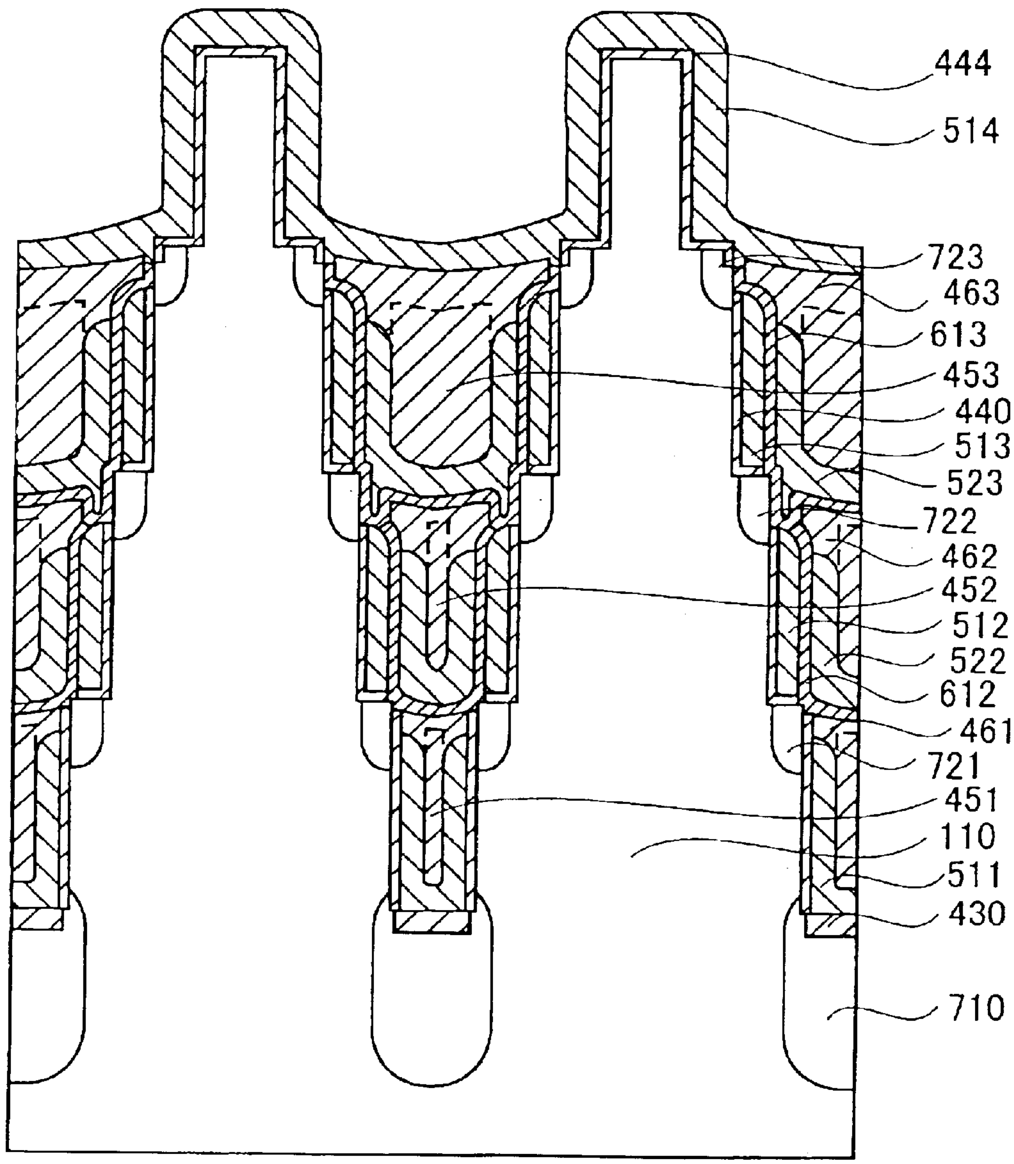
Figure 435:
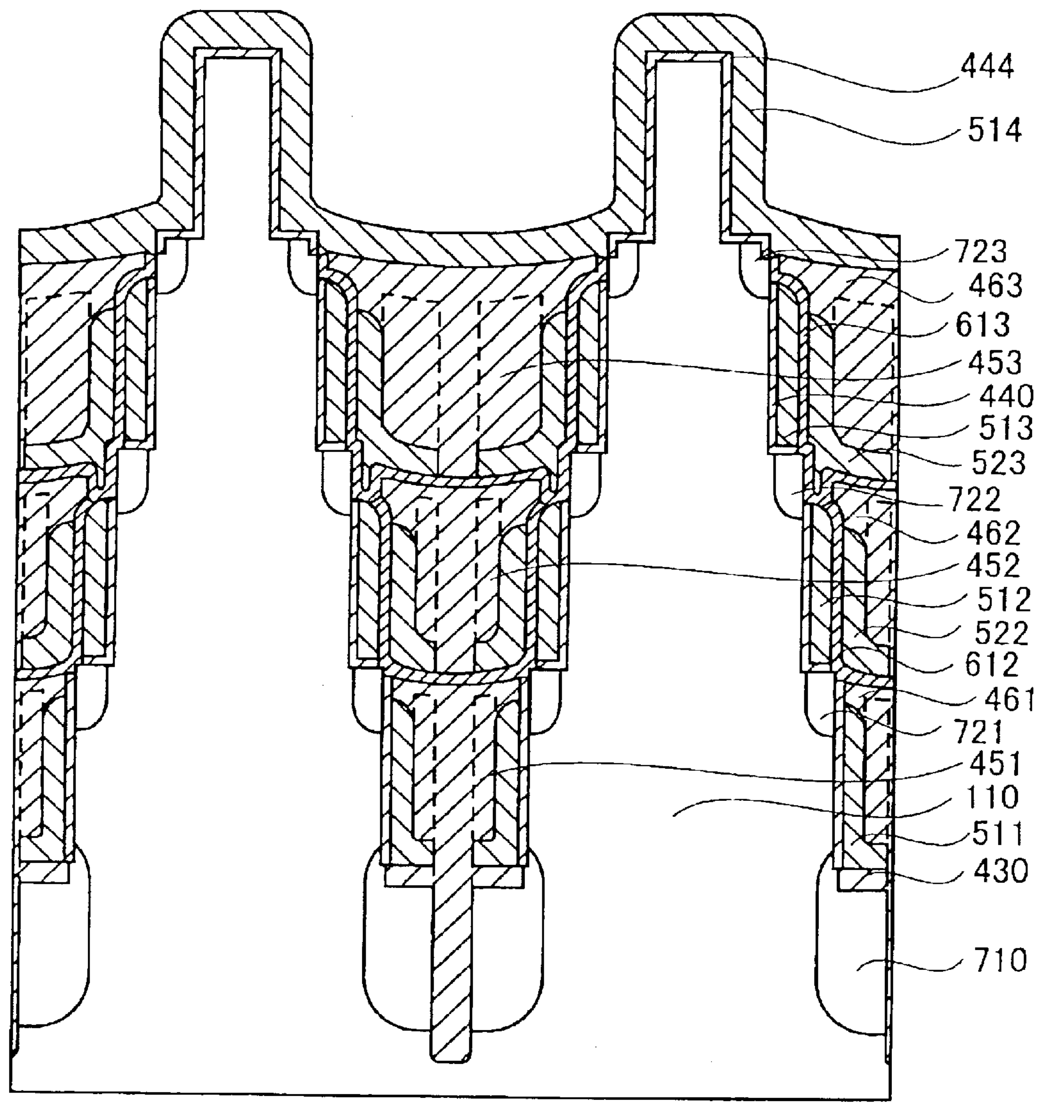

Subsequently, a polysilicon film 514, for example, is deposited to about 15 to 150 nm as a first conductive film (FIG. 401 and FIG. 435). Then, a silicon oxide film 454, for example, is deposited to about 20 to 200 nm as a sixth insulating film and etched back to a desired depth. Thereafter, the silicon oxide film 454 is etched by RIE using as a mask a resist film R5 patterned by a known photolithography technique to form a first trench 214.

Figure 402:
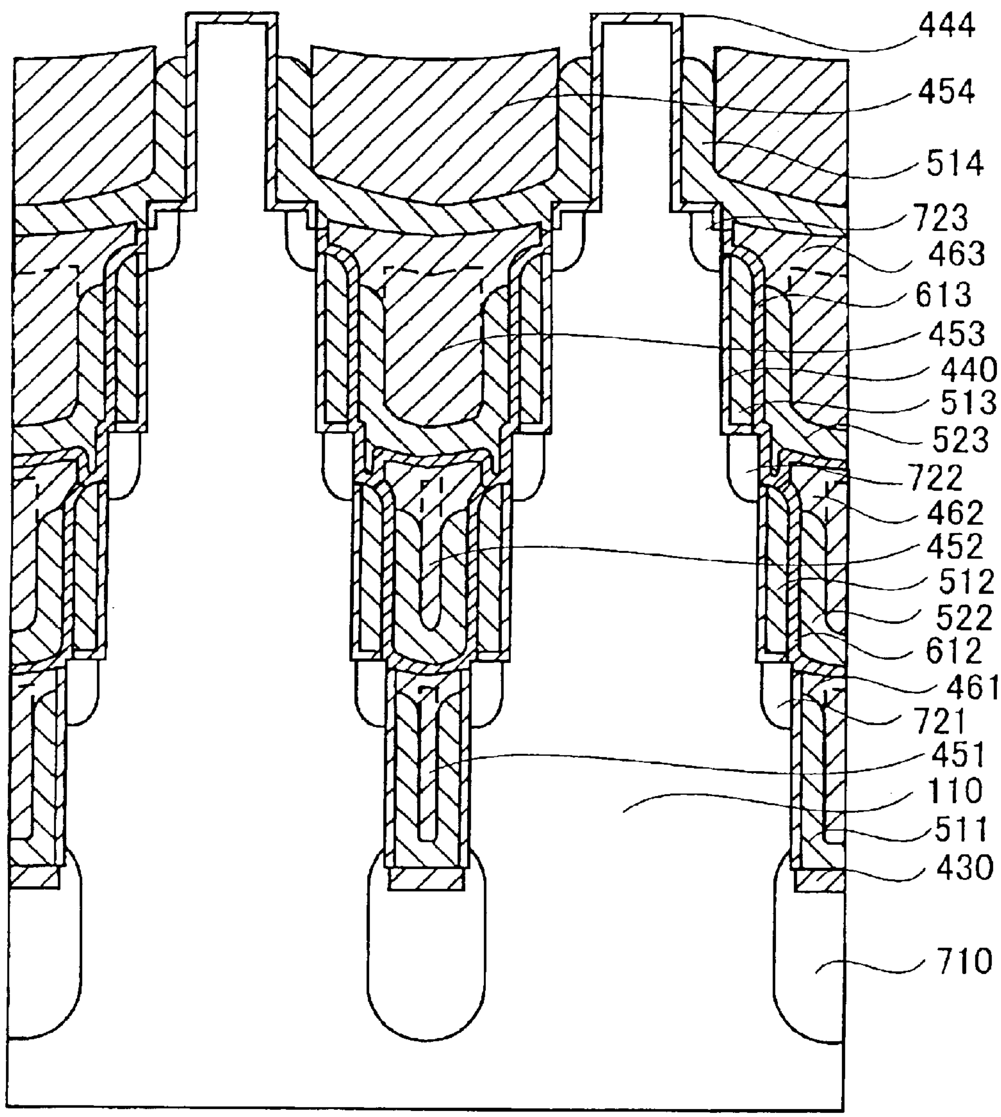
Figure 436:
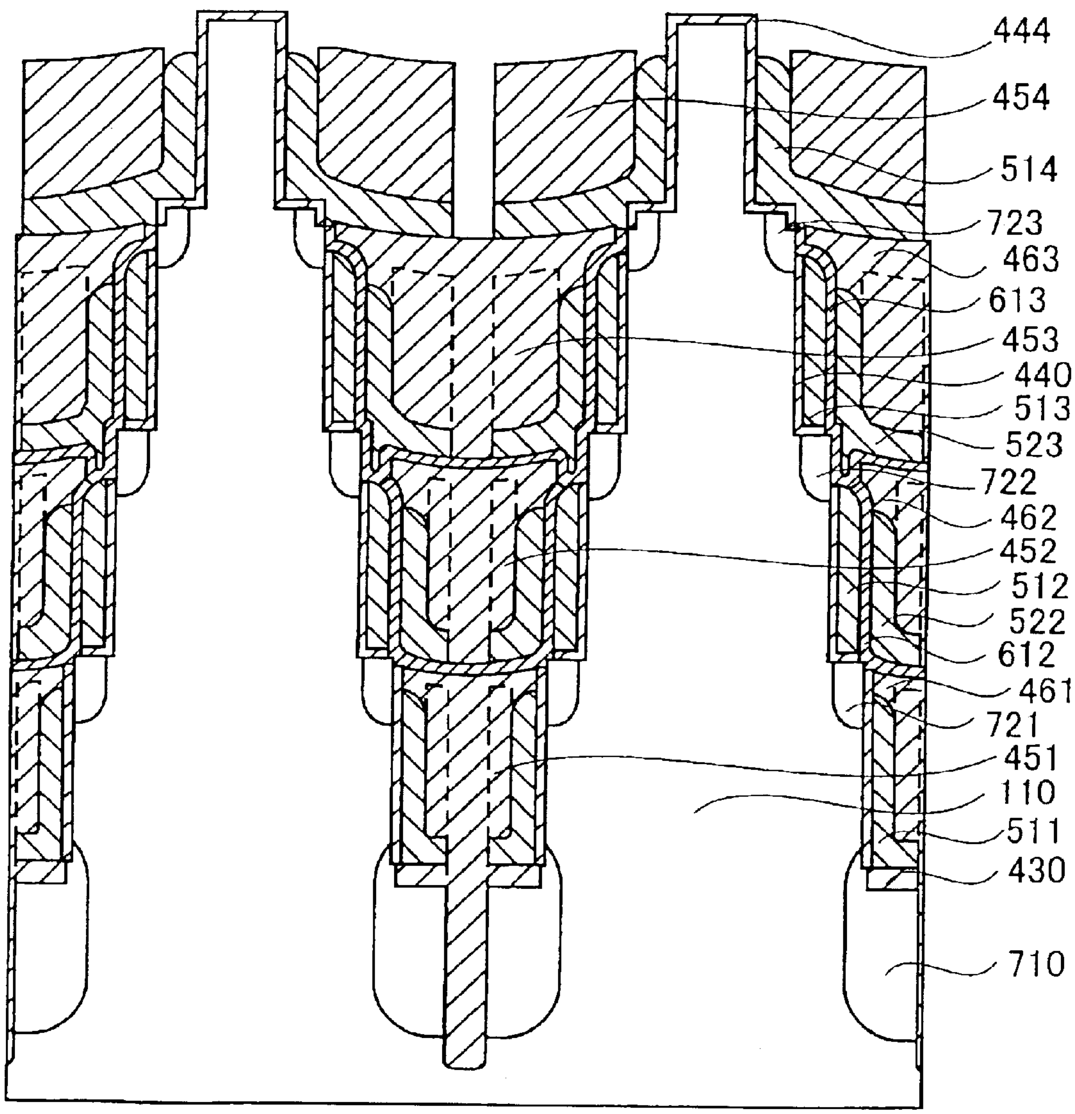

Next, the polysilicon film 514 is etched by RIE (FIG. 402 and FIG. 436). Thereby, a second wiring layer to be a control gate line is separately formed which is continuous in direction A–A' of FIG. 1.

The polysilicon may be etched not only by anisotropic etching but by isotropic etching, for example. The second wiring layer may be formed separately using as a mask the resist film R5 patterned by a known photolithography technique. Alternatively, the intervals between the island-like semiconductor layers 110 in direction A–A' may be set to a predetermined value or smaller beforehand, and the thickness of the polysilicon film may be adjusted, whereby the second wiring layer may be formed which is to be a selection gate line continuous in the direction without using the masking process.

Next, a silicon oxide film 464, for example, is deposited to about 20 to 400 nm as a seventh insulating film and etched back or CM-polished to expose the upper portion of the island-like semiconductor layer 110 provided with the impurity diffusion layer 724. The impurity concentration is adjusted as required at the top of the island-like semiconductor layer 110, for example, by ion implantation, so as to connect the fourth wiring layer 840 to the top of the island-like semiconductor layer 110 in a direction crossing the direction of the second or third wiring layer.

Figure 403:
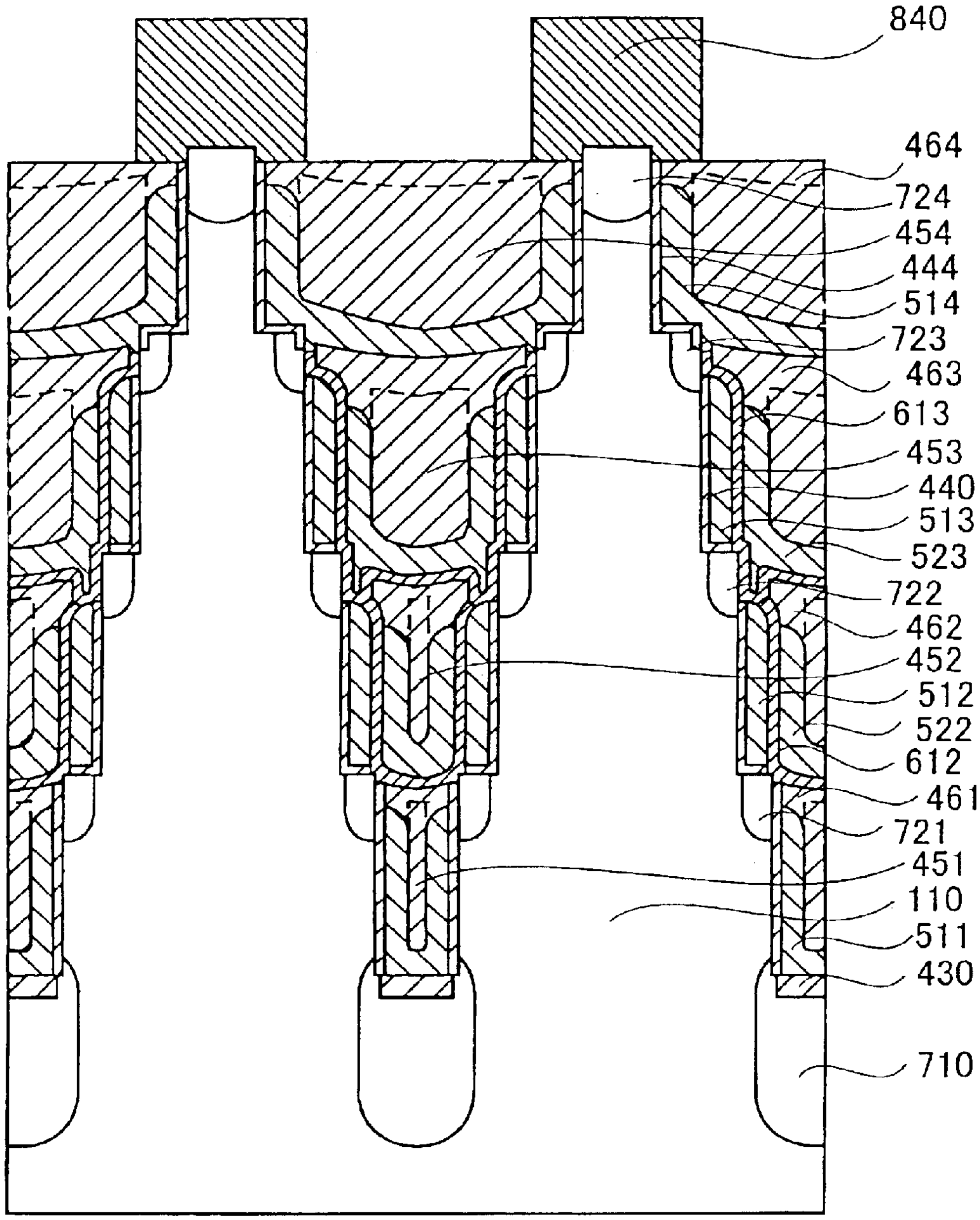
Figure 437:
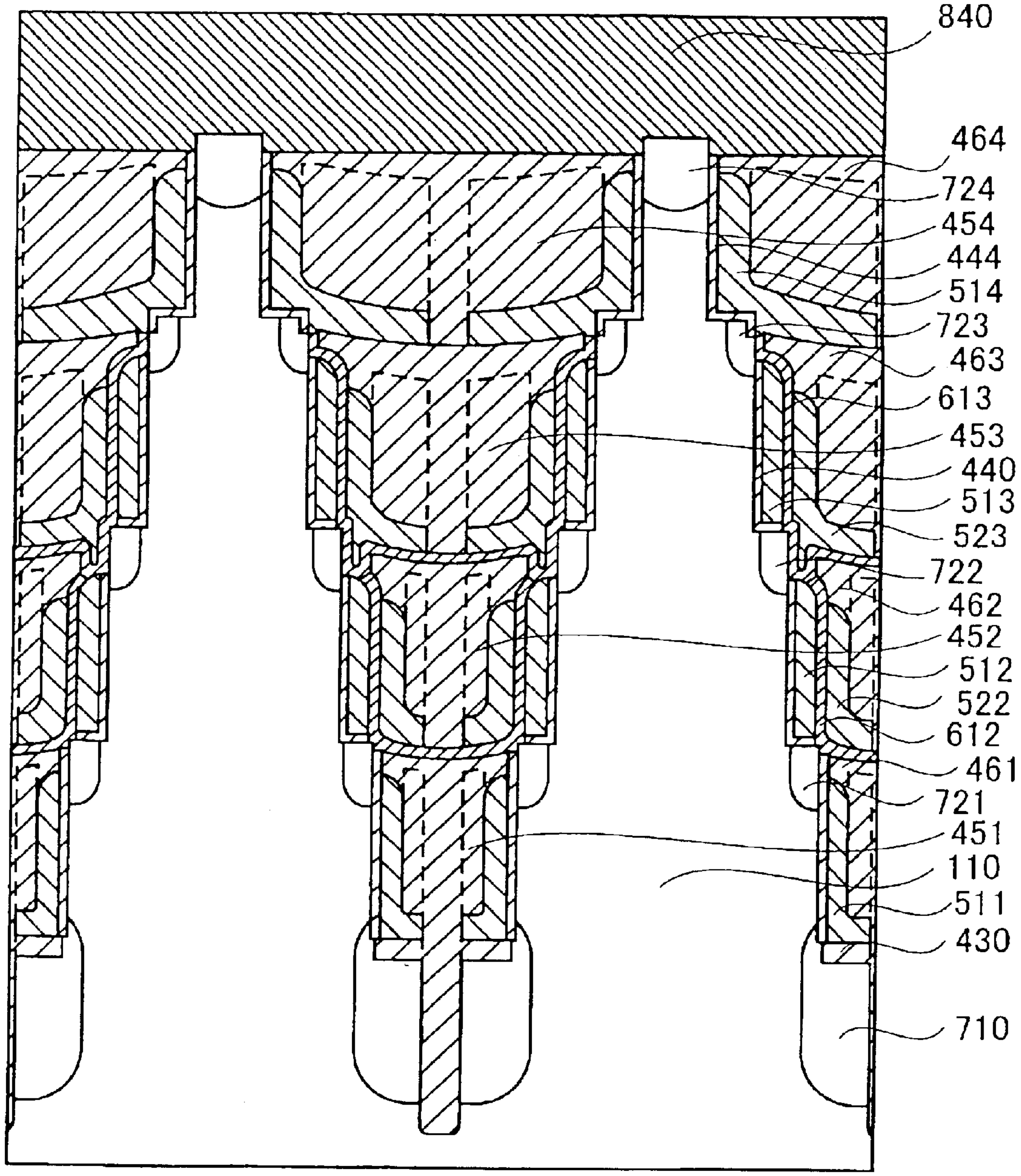

Thereafter, an interlayer insulating film is formed by a known technique, and a contact hole and a metal wiring are formed. Thereby a semiconductor memory is realized which has a memory function according to the state of a charge in the charge storage layer which is the floating gate made of the polysilicon film (FIG. 403 and FIG. 437).

Thus effect similar to that of Production Example 1 can be obtained.

PRODUCTION EXAMPLE 7

In the semiconductor memory produced in this example, a semiconductor substrate is patterned, for example, into an island-like semiconductor layer having at least one step. A side of the island-like semiconductor layer serves as an active region. A plurality of tunnel oxide films and floating gates as charge storage layers are formed on a sidewall of each tier. Control gates are formed on at least a part of sides of the floating gates with intervention of interlayer insulating films. At a corner of each step, an impurity diffusion layer is formed in self-alignment with the floating gate. Steps are further provided in a top portion and in a bottom portion of the island-like semiconductor layer. Selection gate transistors each formed of a gate oxide film and a selection gate are disposed on sidewalls of the tiers. A plurality of, for example, two memory transistors are disposed between the selection gate transistors. The transistors are connected in series along the island-like semiconductor layer. Impurity diffusion layers are formed in self-alignment with the floating gate and the selection gate so that a channel layer of the selection gate transistor and a channel layer of the memory transistor are electrically connected. The gate insulating film of the selection gate transistor has the same thickness as that of the gate insulating film of the memory transistor, and the selection gates and the floating gates of the respective transistors are formed at the same time.

Figure 438:
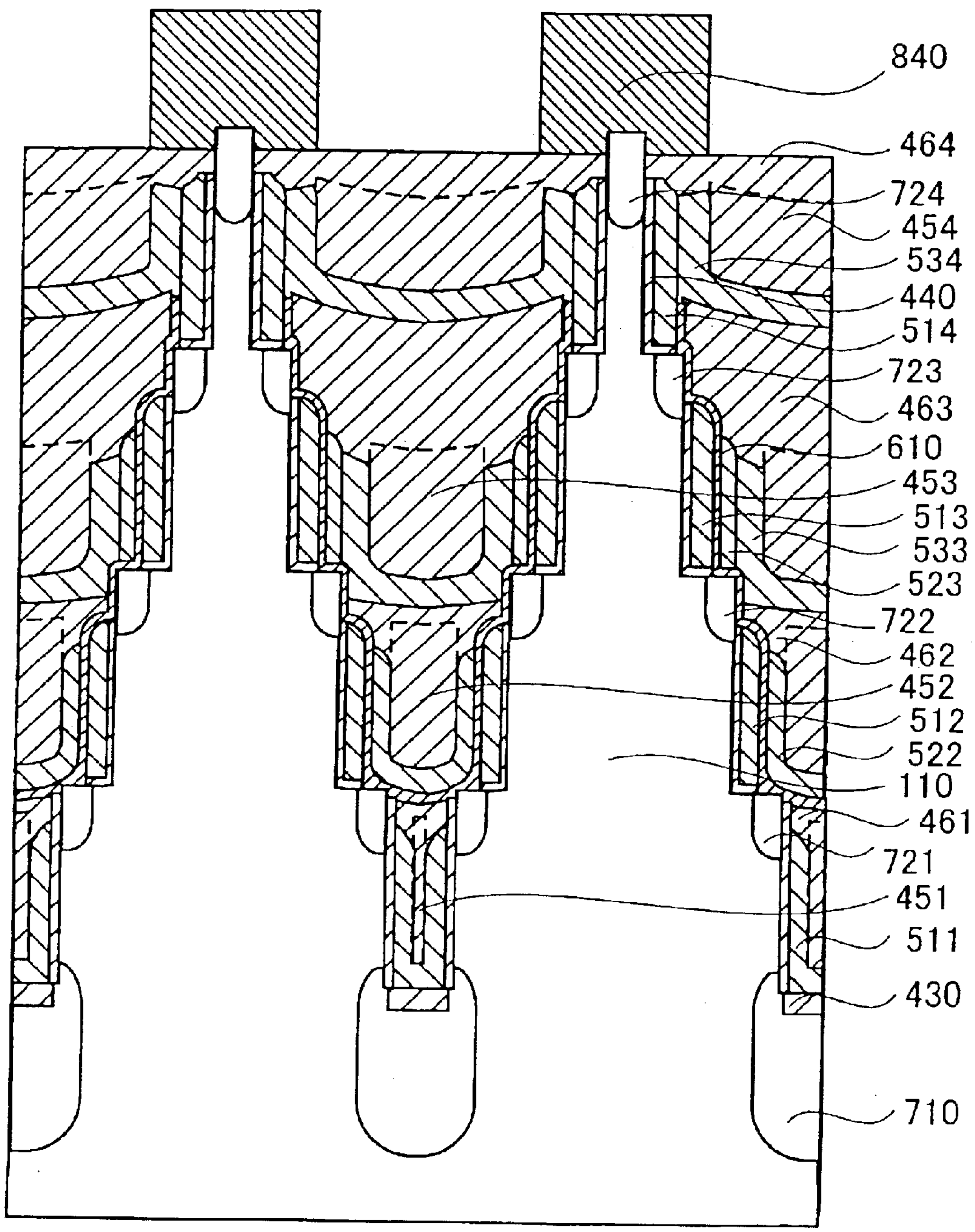
Figure 439:
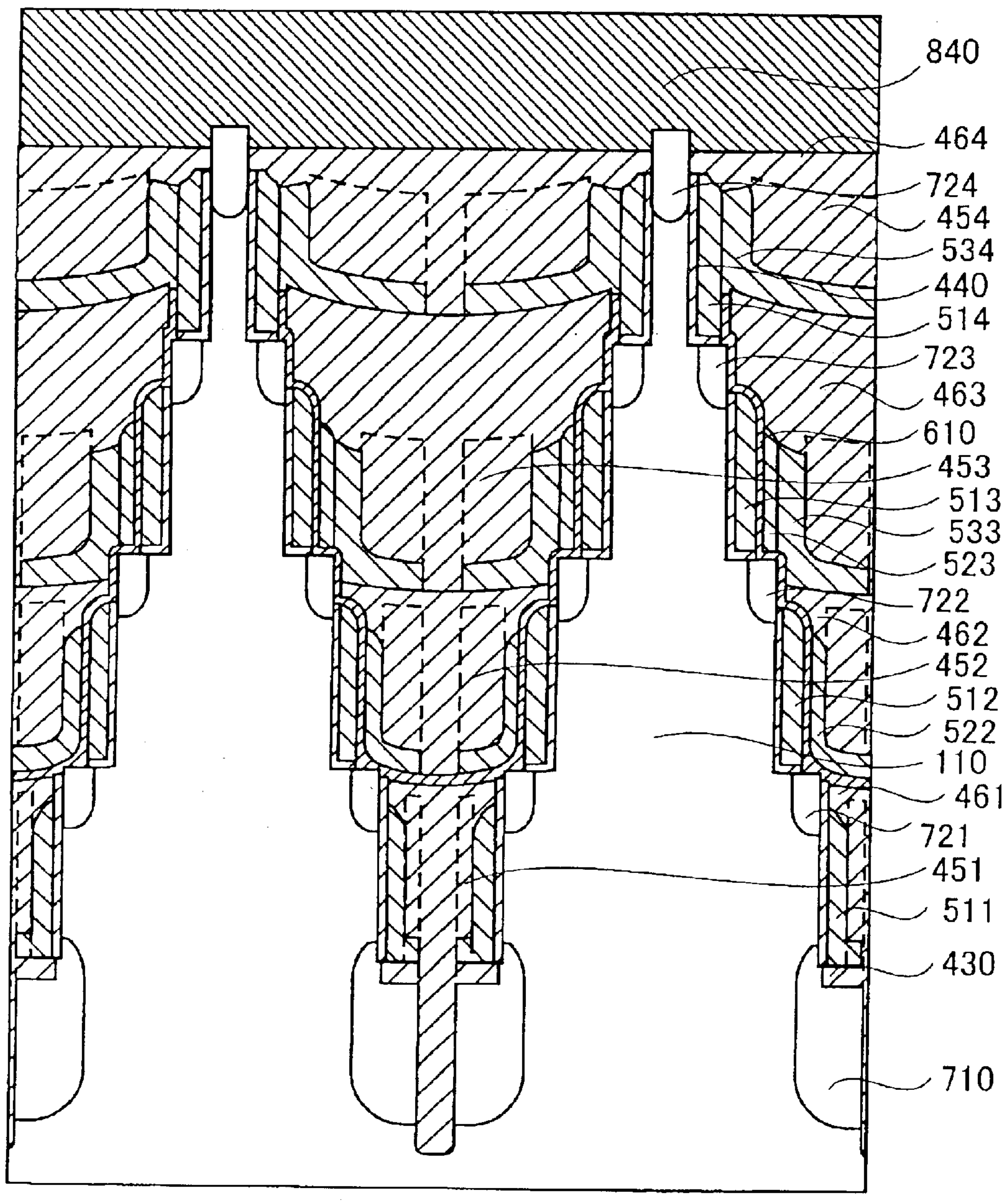

FIG. 438 and FIG. 439 are sectional views taken on line A–A' and line B–B', respectively, of FIG. 1 showing a memory cell array of EEPROM.

In this production example, in a semiconductor memory as described in Production Example 1, the tunnel oxide film, the floating gate, the interlayer insulating film and the control gate are all arranged in one tier where the memory cell is formed, as shown in FIG. 438 and FIG. 439. This arrangement may be taken. The arrangement in the tier may not be particularly limited provided that the memory cell and the selection gate transistor are formed and are not electrically short-circuited directly to the gate of another tier or the island-like semiconductor layer.

PRODUCTION EXAMPLE 8

In the semiconductor memory produced in this example, a semiconductor substrate is patterned, for example, into an island-like semiconductor layer having at least one step. A side of the island-like semiconductor layer serves as an active region. A plurality of tunnel oxide films and floating gates as charge storage layers are formed on a sidewall of each tier. Control gates are formed on at least a part of sides of the floating gates with intervention of interlayer insulating films. At a corner of each step, an impurity diffusion layer is formed in self-alignment with the floating gate. Steps are further provided in a top portion and in a bottom portion of the island-like semiconductor layer. Selection gate transistors each formed of a gate oxide film and a selection gate are disposed on sidewalls of the tiers. A plurality of, for example, two memory transistors are disposed between the selection gate transistors. The transistors are connected in series along the island-like semiconductor layer. Impurity diffusion layers are formed in self-alignment with the floating gate and the selection gate so that a channel layer of the selection gate transistor and a channel layer of the memory transistor are electrically connected. The gate insulating film of the selection gate transistor has the same thickness as that of the gate insulating film of the memory transistor, and the selection gates and the floating gates of the respective transistors are formed at the same time.

Figure 440:
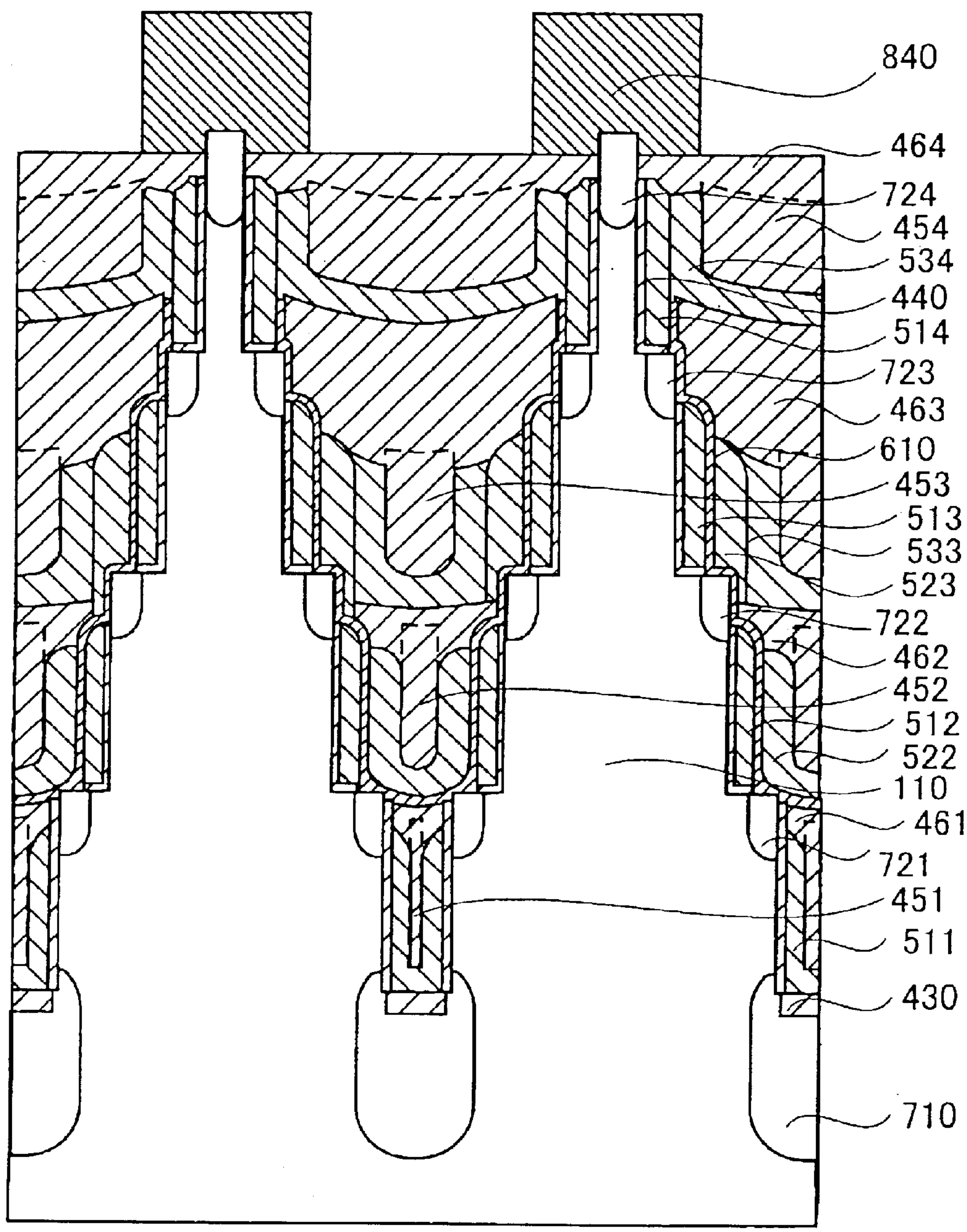
Figure 441:
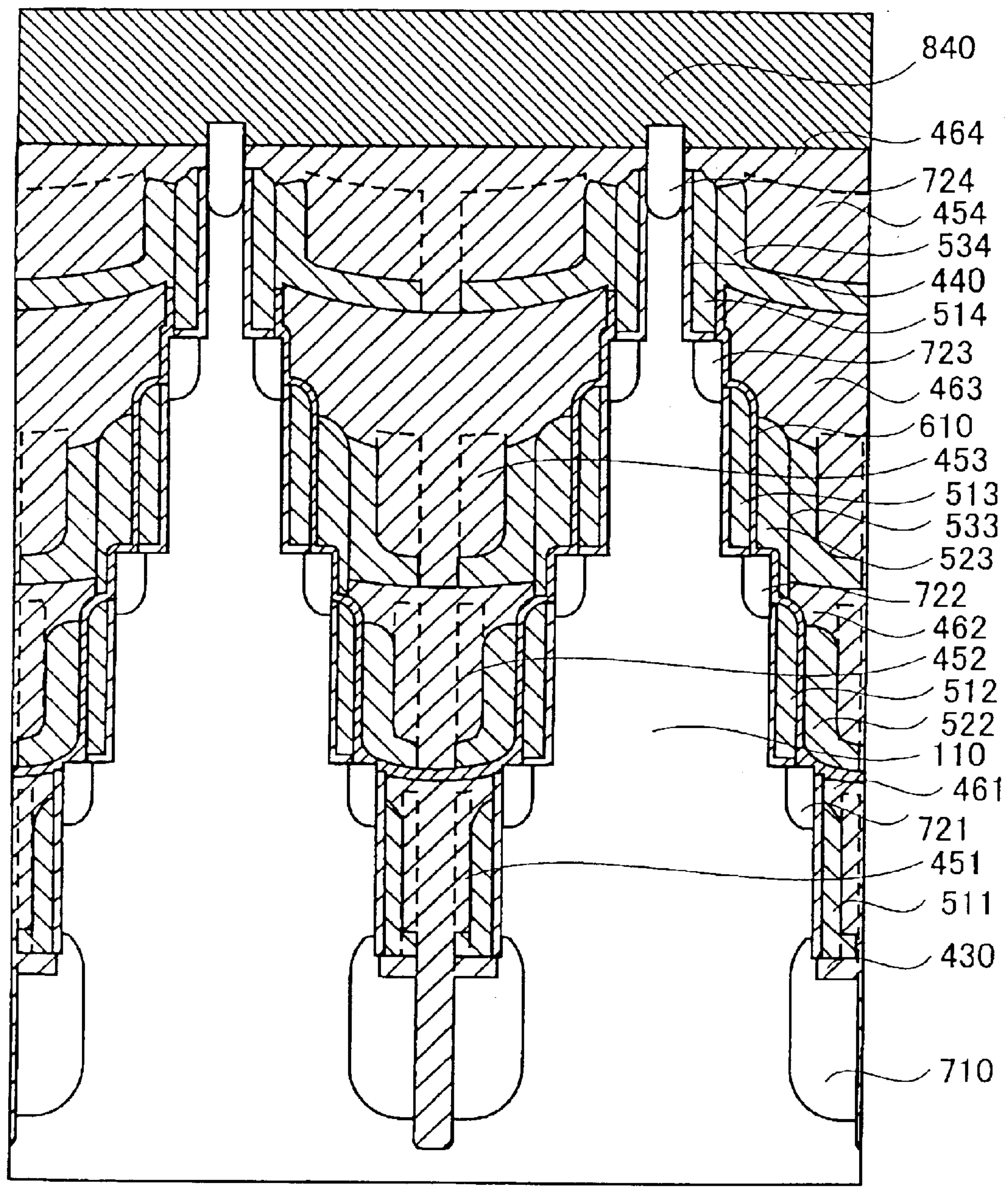

FIG. 440 and FIG. 441 are sectional views taken on line A–A' and line B–B', respectively, of FIG. 1 showing a memory cell array of EEPROM.

In this production example, in a semiconductor memory as described in Production Example 1, the tunnel oxide film, the floating gate, the interlayer insulating film and the control gate are arranged in one tier where the memory cell is formed, and a part of the control gate disposed as opposed to the floating gate with intervention of the interlayer insulating film extends off the tier, as shown in FIG. 440 and FIG. 441. This arrangement may be taken. The arrangement in the tier may not be particularly limited provided that the memory cell and the selection gate transistor are formed and are not electrically short-circuited directly to the gate of another tier or the island-like semiconductor layer.

PRODUCTION EXAMPLE 9

In the semiconductor memory produced in this example, a semiconductor substrate is patterned, for example, into an island-like semiconductor layer having at least one step. A side of the island-like semiconductor layer serves as an active region. A plurality of tunnel oxide films and floating gates as charge storage layers are formed on a sidewall of each tier. Control gates are formed on at least a part of sides of the floating gates with intervention of interlayer insulating films. At a corner of each step, an impurity diffusion layer is formed in self-alignment with the floating gate. Steps are further provided in a top portion and in a bottom portion of the island-like semiconductor layer. Selection gate transistors each formed of a gate oxide film and a selection gate are disposed on sidewalls of the tiers. A plurality of, for example, two memory transistors are disposed between the selection gate transistors. The transistors are connected in series along the island-like semiconductor layer. Impurity diffusion layers are formed in self-alignment with the floating gate and the selection gate so that a channel layer of the selection gate transistor and a channel layer of the memory transistor are electrically connected. The gate insulating film of the selection gate transistor has the same thickness as that of the gate insulating film of the memory transistor, and the selection gates and the floating gates of the respective transistors are formed at the same time.

Figure 442:
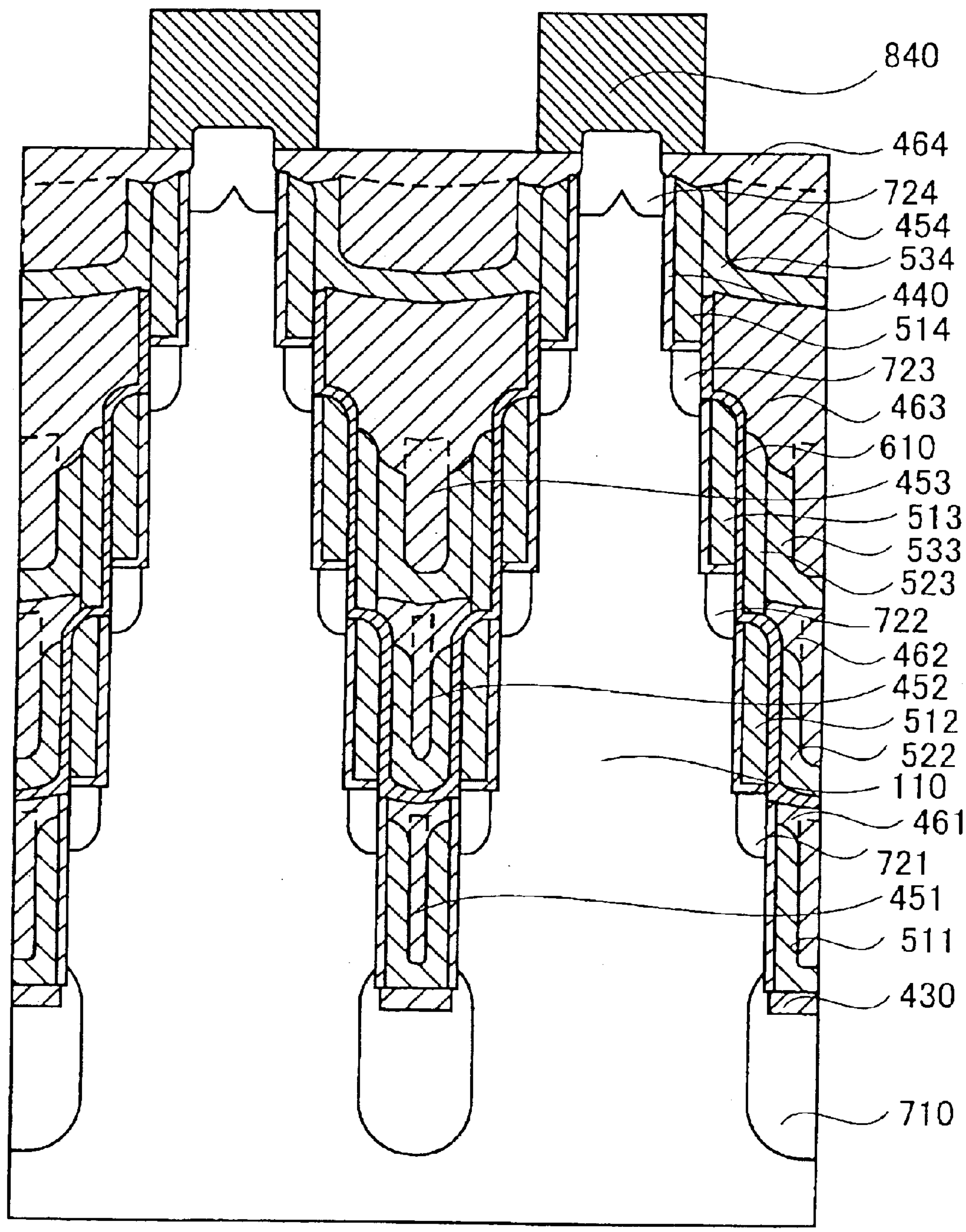
Figure 443:
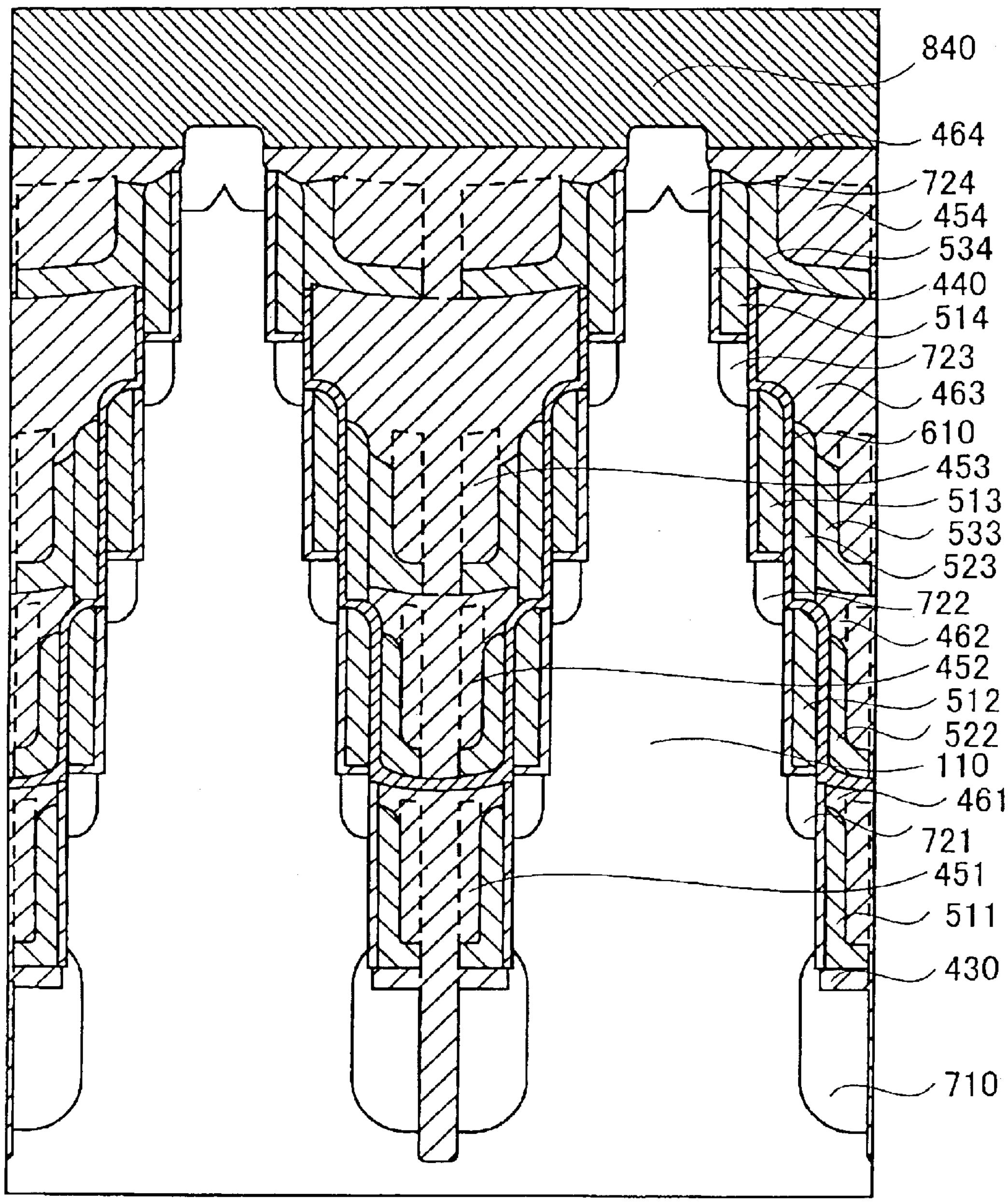

FIG. 442 and FIG. 443 are sectional views taken on line A–A' and line B–B', respectively, of FIG. 1 showing a memory cell array of EEPROM.

In this production example, in a semiconductor memory as described in Production Example 1, at least the tunnel oxide film and the floating gate are arranged in one tier where the memory cell is formed, and the interlayer insulating film and the control gate disposed as opposed to the floating gate with intervention of the interlayer insulating film partially or entirely extend off the tier, as shown in FIG. 442 and FIG. 443. This arrangement may be taken. The arrangement in the tier may not be particularly limited provided that the memory cell and the selection gate transistor are formed and are not electrically short-circuited directly to the gate of another tier or the island-like semiconductor layer.

PRODUCTION EXAMPLE 10

In the semiconductor memory produced in this example, a semiconductor substrate is patterned, for example, into an island-like semiconductor layer having at least one step. A side of the island-like semiconductor layer serves as an active region. A plurality of tunnel oxide films and laminated insulating films as charge storage layers are formed on a sidewall of each tier. Control gates are formed on at least a part of sides of the laminated insulating films with intervention of interlayer insulating films. At a corner of each step, an impurity diffusion layer is formed in self-alignment with the floating gate. Steps are further provided in a top portion and in a bottom portion of the island-like semiconductor layer. Selection gate transistors each formed of a gate oxide film and a selection gate are disposed on sidewalls of the tiers. A plurality of, for example, two memory transistors are disposed between the selection gate transistors. The transistors are connected in series along the island-like semiconductor layer. Impurity diffusion layers are formed in self-alignment with the laminated insulating film and the selection gate so that a channel layer of the selection gate transistor and a channel layer of the memory transistor are electrically connected. The gate insulating film of the selection gate transistor has the same thickness as that of the gate insulating film of the memory transistor, and the selection gates and the laminated insulating films of the respective transistors are formed at the same time.

Figure 5:
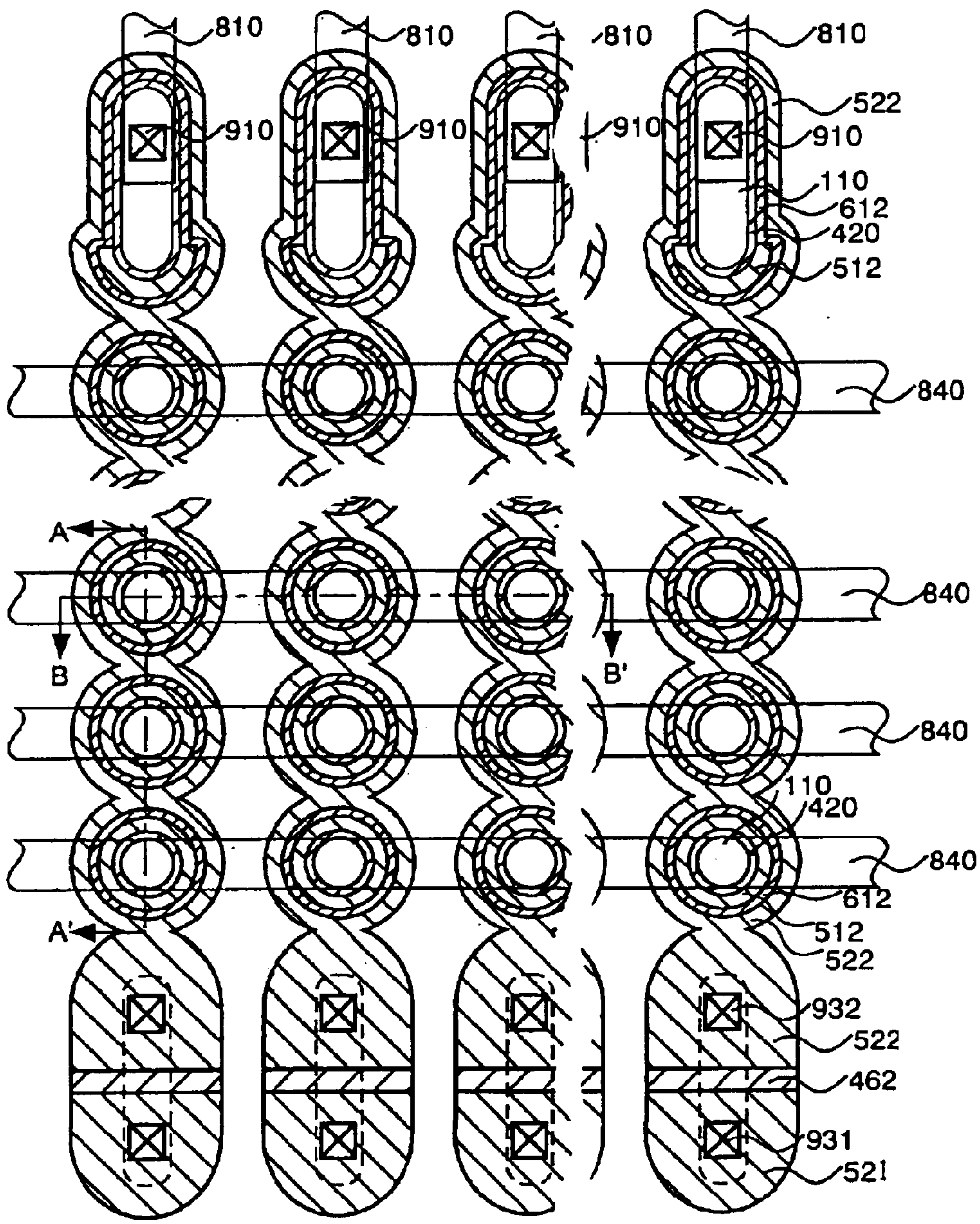
Figure 444:
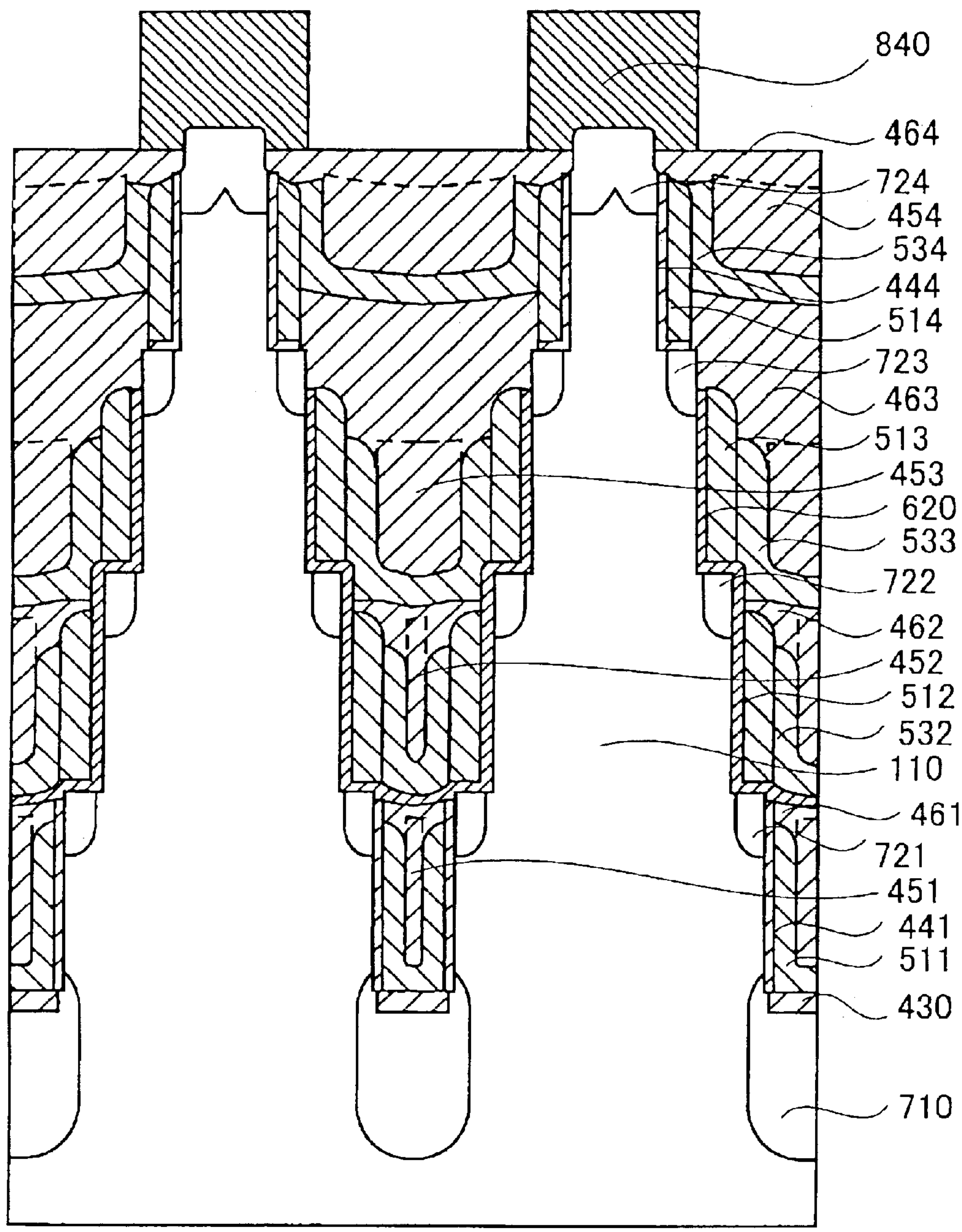
Figure 445:
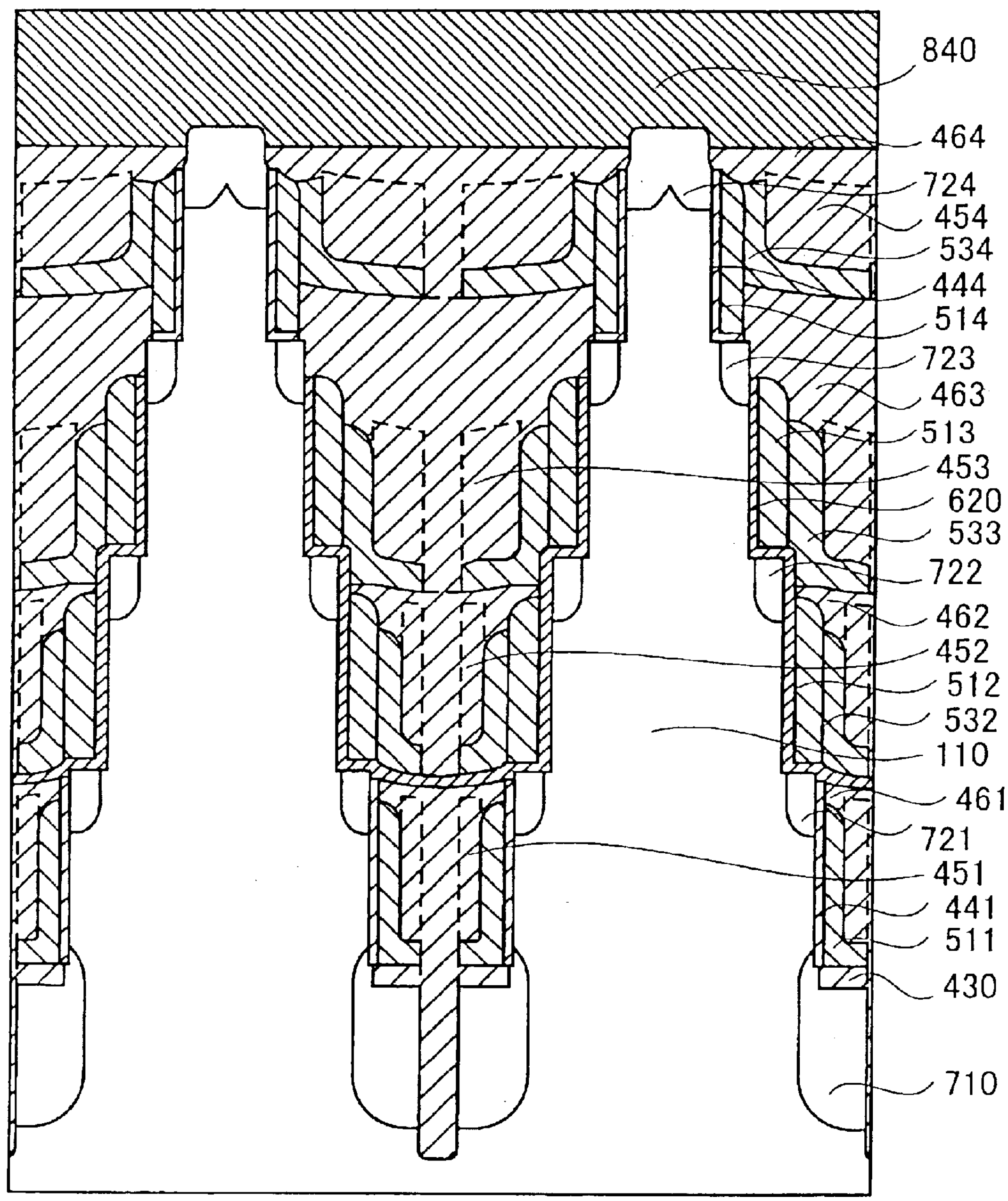
Figure 446:
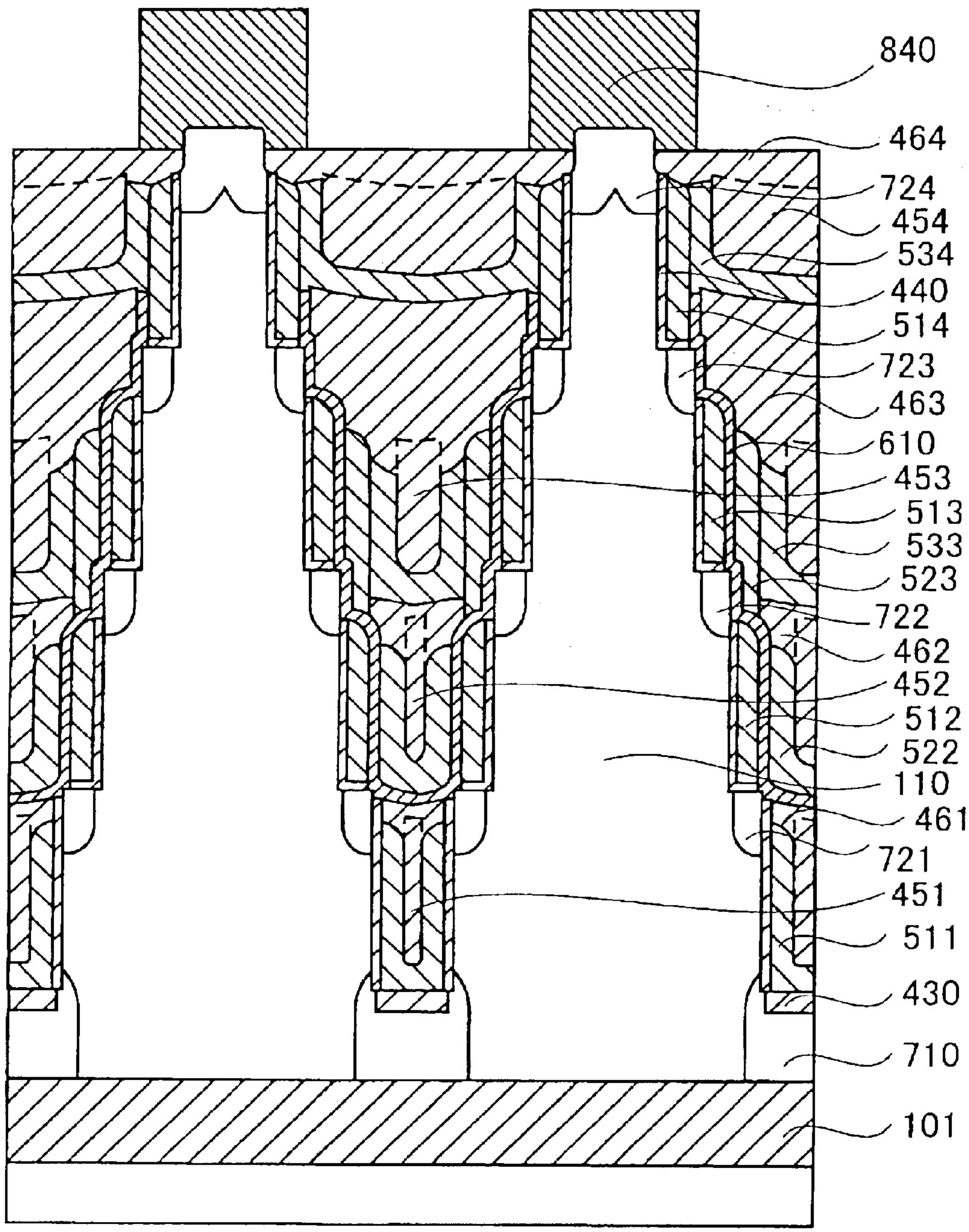
Figure 447:
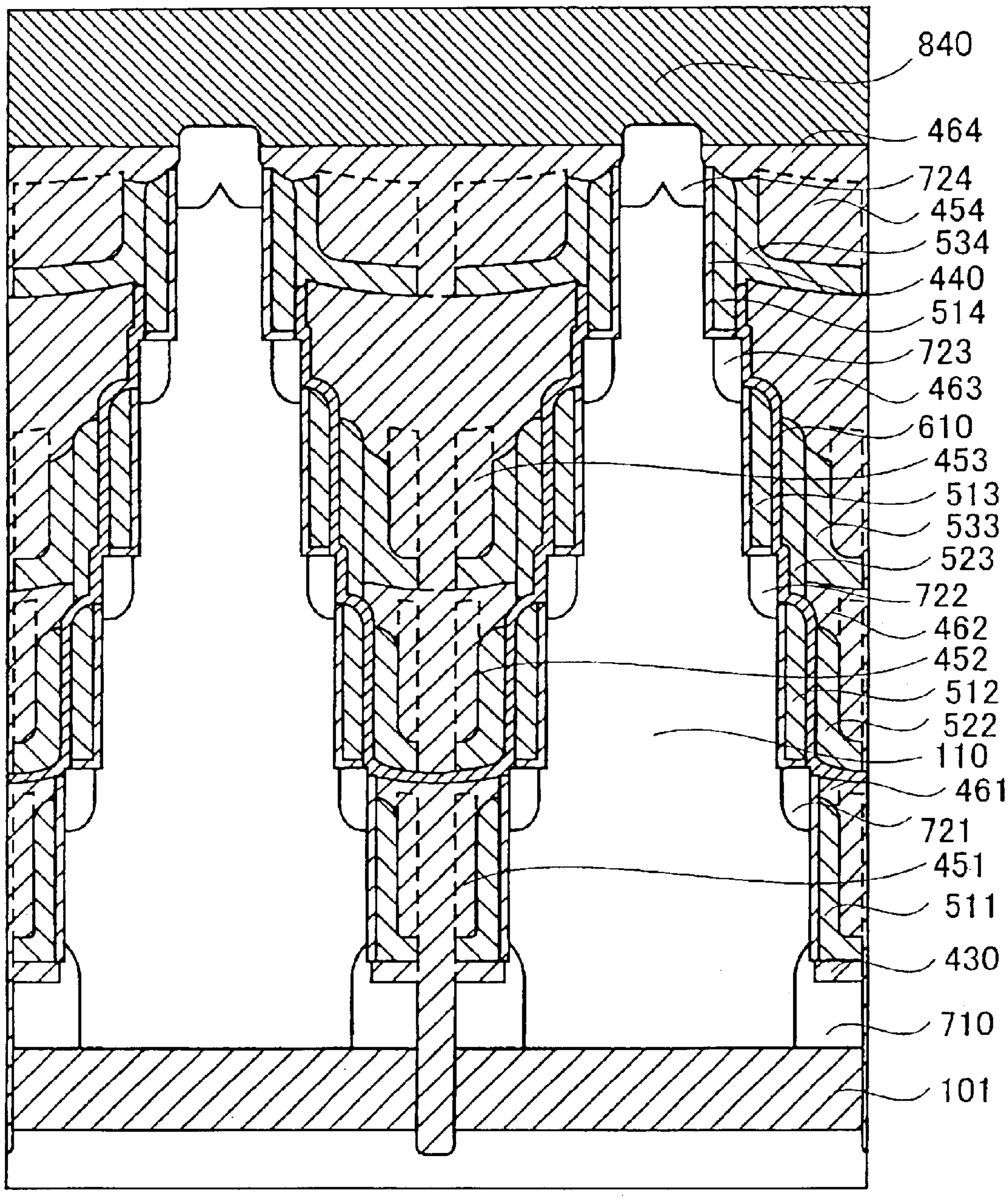

FIG. 444 and FIG. 445 are sectional views taken on line A–A' and line B–B', respectively, of FIG. 5 showing a memory cell array of MNOS or MONOS. Although FIG. 8 shows that the island-like semiconductor layer 110 is in the columnar form, but the island-like semiconductor layer 110 may be patterned in a quadratic prism form. However, in the case where the island-like semiconductor 110 has a size close to the minimum patterning dimensions, the island-like semiconductor layer 110 becomes substantially in the columnar form even if it is designed to be in the quadratic prism form, because the corners are rounded in the production process.

In this production example, in a semiconductor memory described in Production Example 1, a laminated insulating film 620 is formed instead of the silicon oxide film 440, and the laminated insulating film 610 is not formed, as shown in FIG. 444 and FIG. 445.

Here, the laminated insulating film has a structure of a laminate of a tunnel oxide film and a silicon nitride film or a structure wherein a silicon oxide film is further formed on the silicon nitride film. The charge storage layer is realized not by electron implantation into the floating gate as in Production Example 1 but by trapping into the laminated insulating film.

Thereby effect similar to that of Production Example 1 can be obtained.

PRODUCTION EXAMPLE 11

In the semiconductor memory produced in this example, a semiconductor substrate to which an oxide film is inserted, for example, a semiconductor portion on an oxide film of an SOI substrate, is patterned into an island-like semiconductor layer having at least one step. A side of the island-like semiconductor layer serves as an active region. A plurality of tunnel oxide films and floating gates as charge storage layers are formed on a sidewall of each tier. Control gates are formed on at least a part of sides of the floating gates with intervention of interlayer insulating films. At a corner of each step, an impurity diffusion layer is formed in self-alignment with the floating gate. Steps are further provided in a top portion and in a bottom portion of the island-like semiconductor layer. Selection gate transistors each formed of a gate oxide film and a selection gate are disposed on sidewalls of the tiers. A plurality of, for example, two memory transistors are disposed between the selection gate transistors. The transistors are connected in series along the island-like semiconductor layer. Impurity diffusion layers are formed in self-alignment with the floating gate and the selection gate so that a channel layer of the selection gate transistor and a channel layer of the memory transistor are electrically connected. The gate insulating film of the selection gate transistor has the same thickness as that of the gate insulating film of the memory transistor, and the selection gates and the floating gates of the respective transistors are formed at the same time.

FIGS. 446 and 448 and FIGS. 447 and 449 are sectional views taken on line A–A' and line B–B', respectively, of FIG. 1 showing a memory cell array of EEPROM.

Effect similar to that of Production Example 1 can be obtained by this production example. Further the junction capacity of the impurity diffusion layer 710 to be the first wiring layer is reduced or eliminated. In addition, the use of an SOI substrate as the substrate is applicable to all the production example in the present invention.

Figure 448:
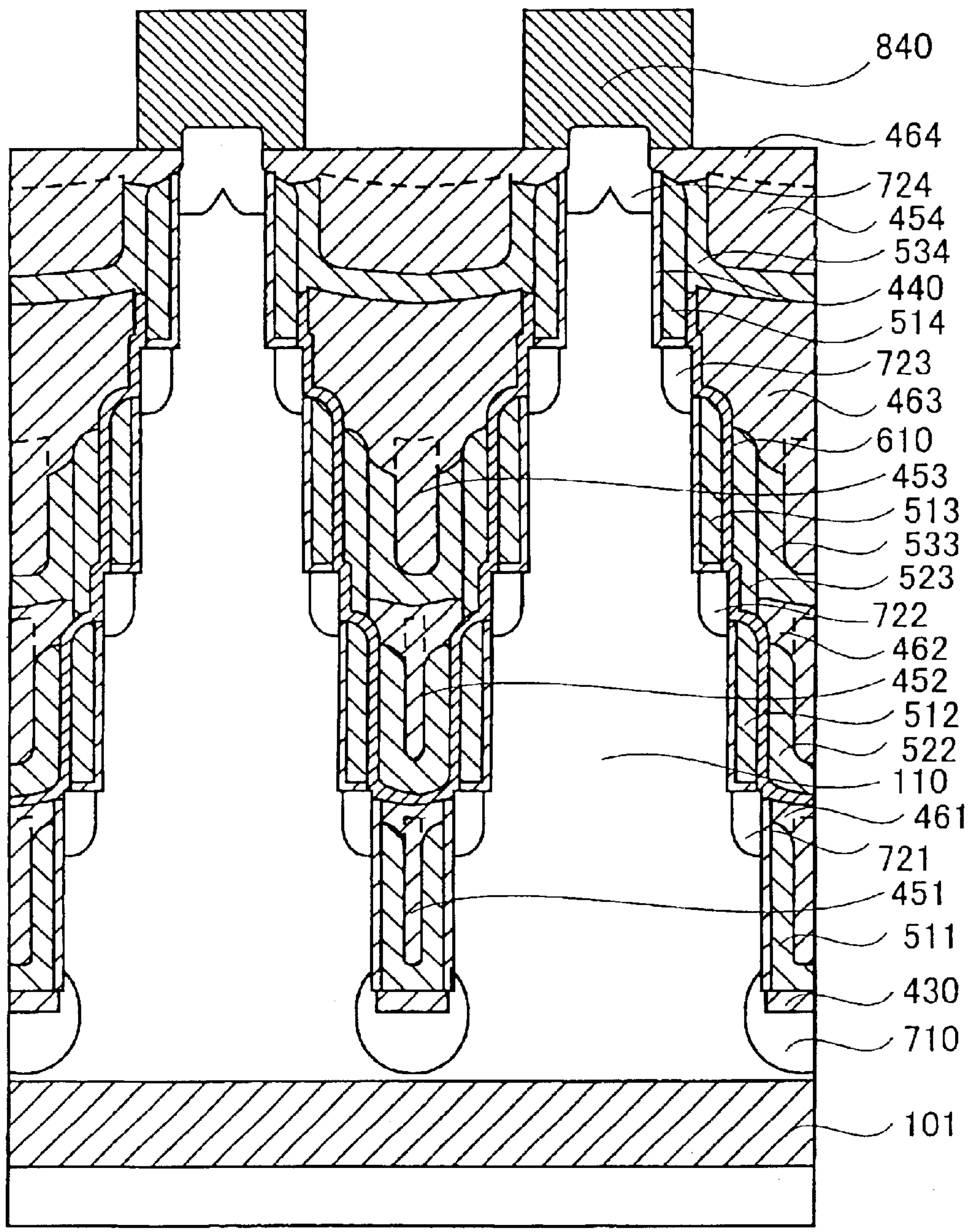
Figure 449:
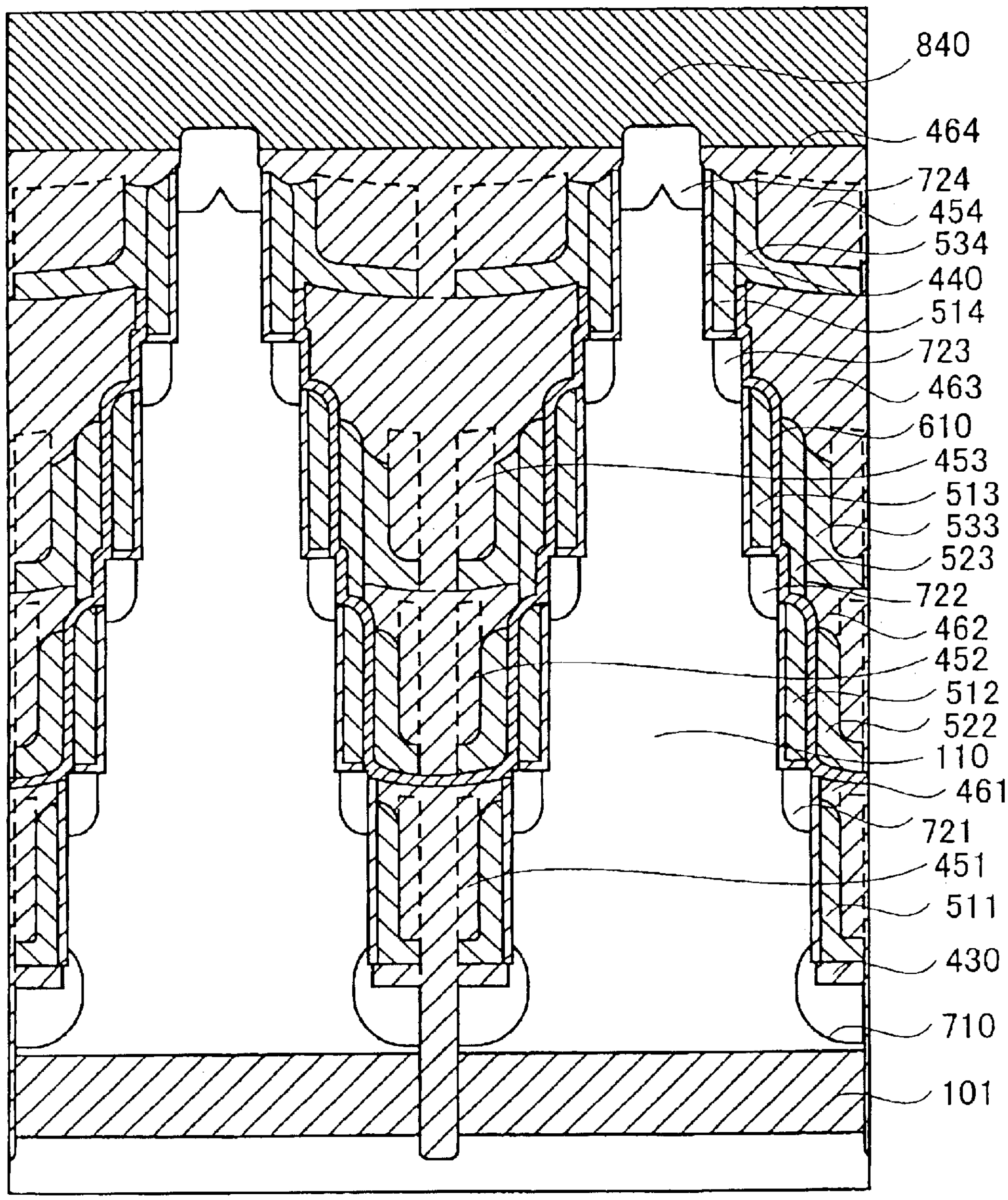

When the SOI substrate is used, the impurity diffusion layer 710 may reach the oxide film of SOI substrate (FIG. 446 and FIG. 447) or may not reach it (FIG. 448 and FIG. 449). A trench for separating the first wiring layer may reach the SOI substrate, may not reach it, or may be formed deeply to penetrate the oxide film of the SOI substrate. The depth of the trench is not particularly limited provided that the impurity diffusion layer 710 can be separated.

In this production example, the SOI substrate with the oxide film inserted as an insulating film. The oxide film may be a silicon nitride film, and the type of the oxide film is not particularly limited.

PRODUCTION EXAMPLE 12

In the semiconductor memory produced in this example, a semiconductor substrate is patterned, for example, into an island-like semiconductor layer having at least one step. A side of the island-like semiconductor layer serves as an active region. A plurality of tunnel oxide films and floating gates as charge storage layers are formed on a sidewall of each tier. Control gates are formed on at least a part of sides of the floating gates with intervention of interlayer insulating films. At a corner of each step, an impurity diffusion layer is formed in self-alignment with the floating gate. A plurality of, for example, two memory transistors are disposed between the selection gate transistors. The transistors are connected in series along the island-like semiconductor layer. Impurity diffusion layers are formed in self-alignment with the floating gate and the selection gate so that a channel layer of the selection gate transistor and a channel layer of the memory transistor are electrically connected. The floating gates of the respective transistors are formed at the same time.

Figure 450:
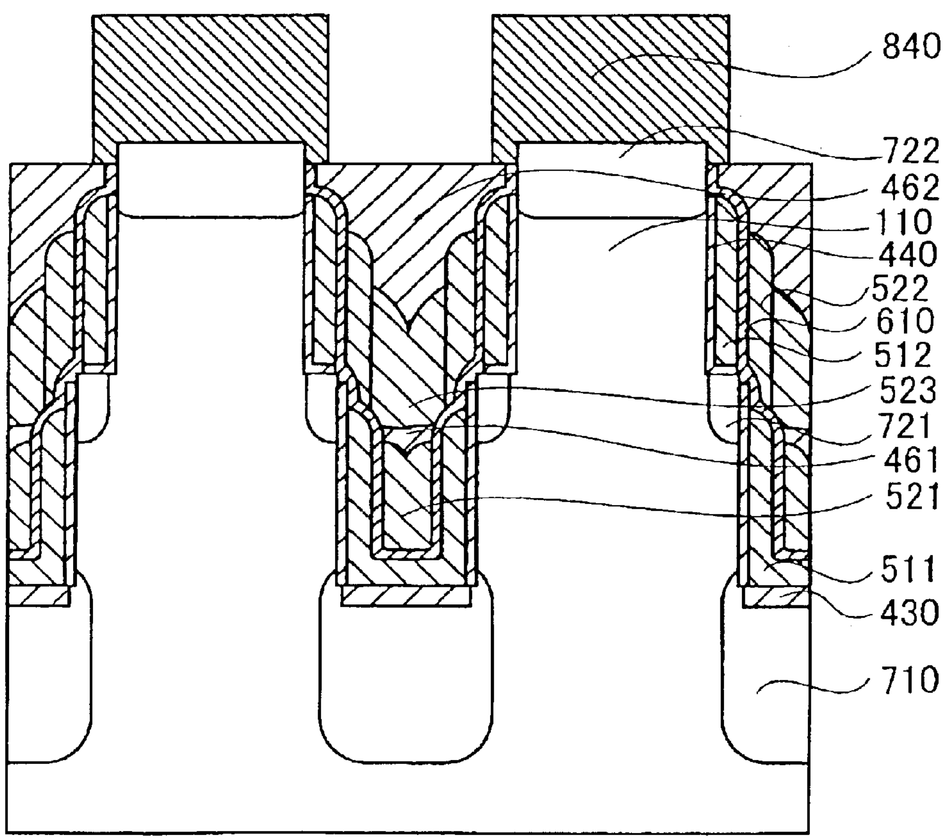
Figure 451:
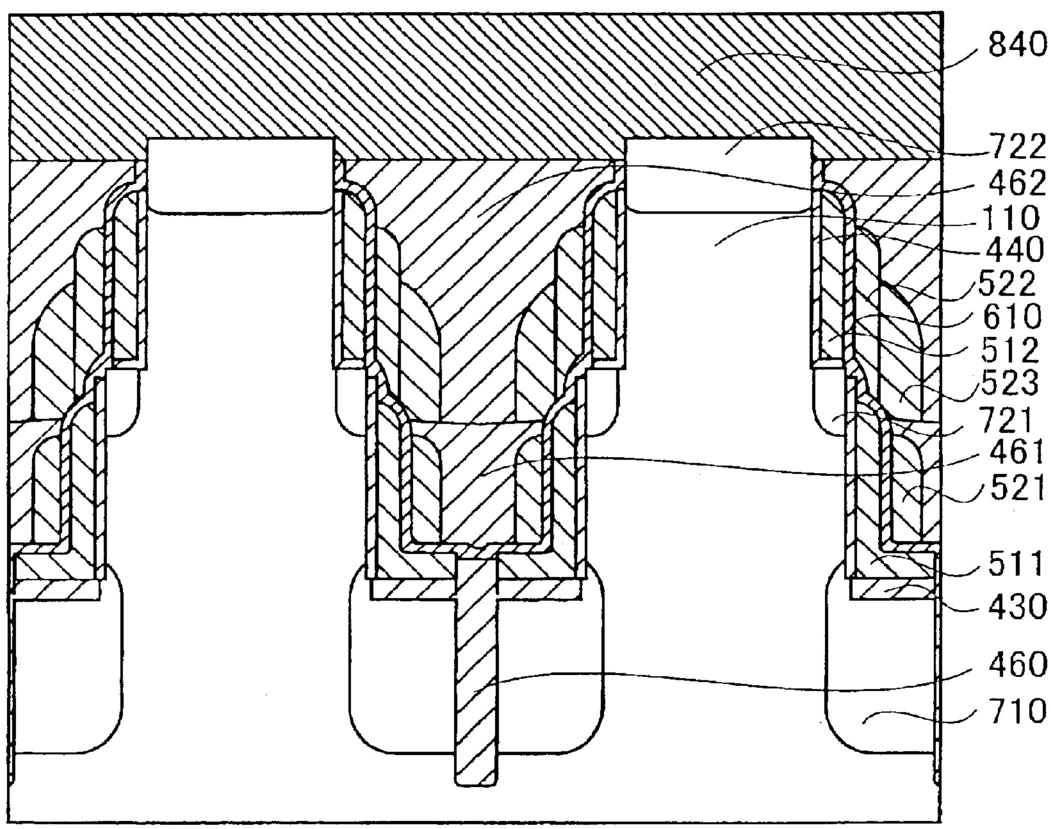

FIG. 450 and FIG. 451 are sectional views taken on line A–A' and line B–B', respectively, of FIG. 5 showing a memory cell array of EEPROM.

In this production example, in a semiconductor memory as described in Production Example 1, a polysilicon film 510 is formed into the form of sidewalls on sidewalls of each tier of each island-like semiconductor layer 110 after the polysilicon film 510 is deposited. Thereby polysilicon films 511 and 512 are formed by separation at the same time.

Thereafter, the impurity is introduced to the corners of the island-like semiconductor layer 110, and then, the interlayer insulating film 610 and the polysilicon film 520 as a second conductive film are deposited. The production process thereafter is the same as in Production Example 1 except that the process of forming the selection gate transistor is omitted (FIG. 450 and FIG. 451).

In this example, the floating gate is used as the charge storage layer, which may be realized in another form.

PRODUCTION EXAMPLE 13

In the semiconductor memory produced in this example, a semiconductor substrate is patterned, for example, into an island-like semiconductor layer having at least one step. A side of the island-like semiconductor layer serves as an active region. A plurality of tunnel oxide films and floating gates as charge storage layers are formed on a sidewall of each tier. Control gates are formed on at least a part of sides of the floating gates with intervention of interlayer insulating films. Steps are further provided in a top portion and in a bottom portion of the island-like semiconductor layer. Selection gate transistors each formed of a gate oxide film and a selection gate are disposed on sidewalls of the tiers. A plurality of, for example, two memory transistors are disposed between the selection gate transistors. The transistors are connected in series along the island-like semiconductor layer. The gate insulating film of the selection gate transistor has the same thickness as that of the gate insulating film of the memory transistor, and the selection gates and the floating gates of the respective transistors are formed at the same time.

Figure 452:
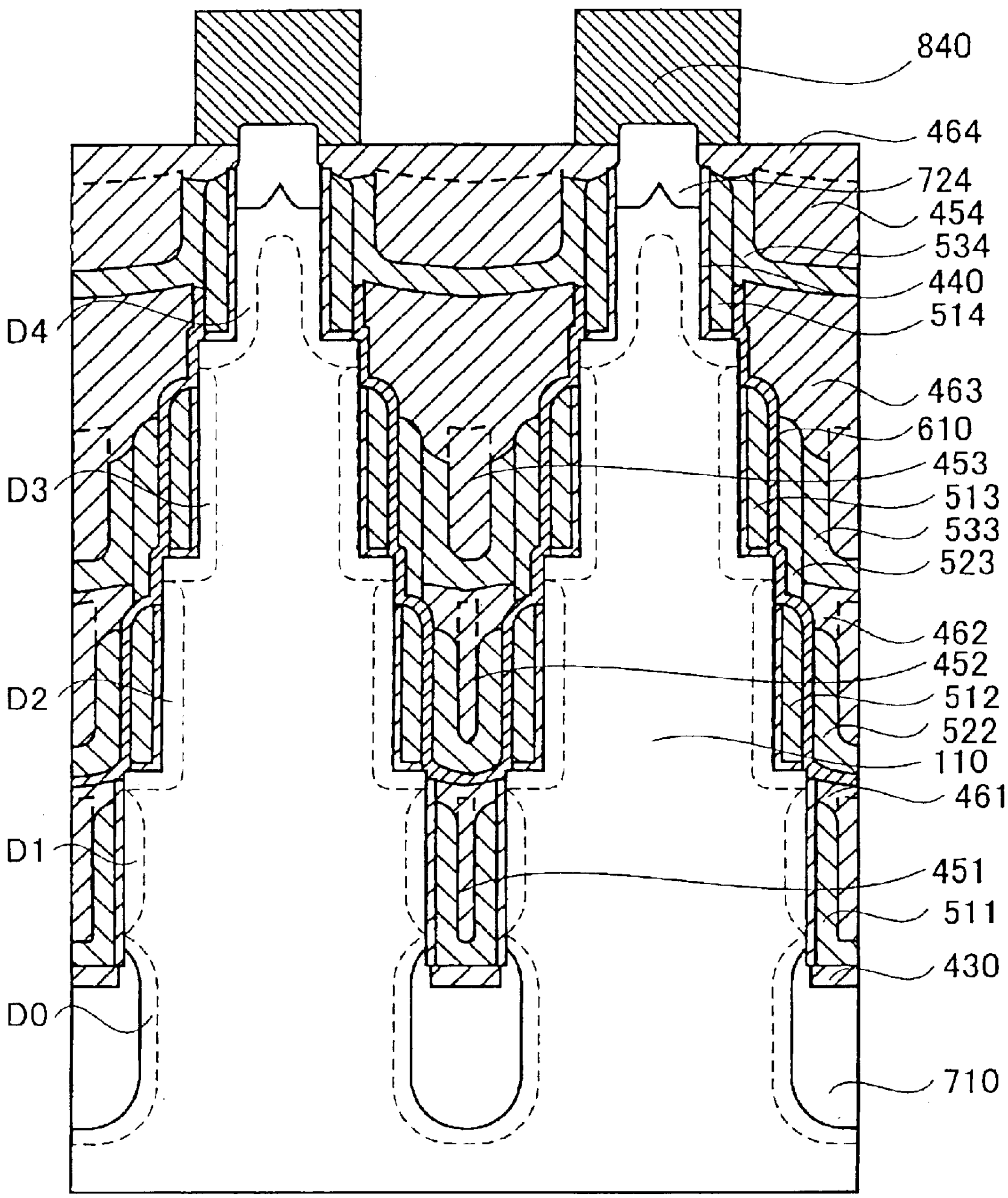
Figure 453:
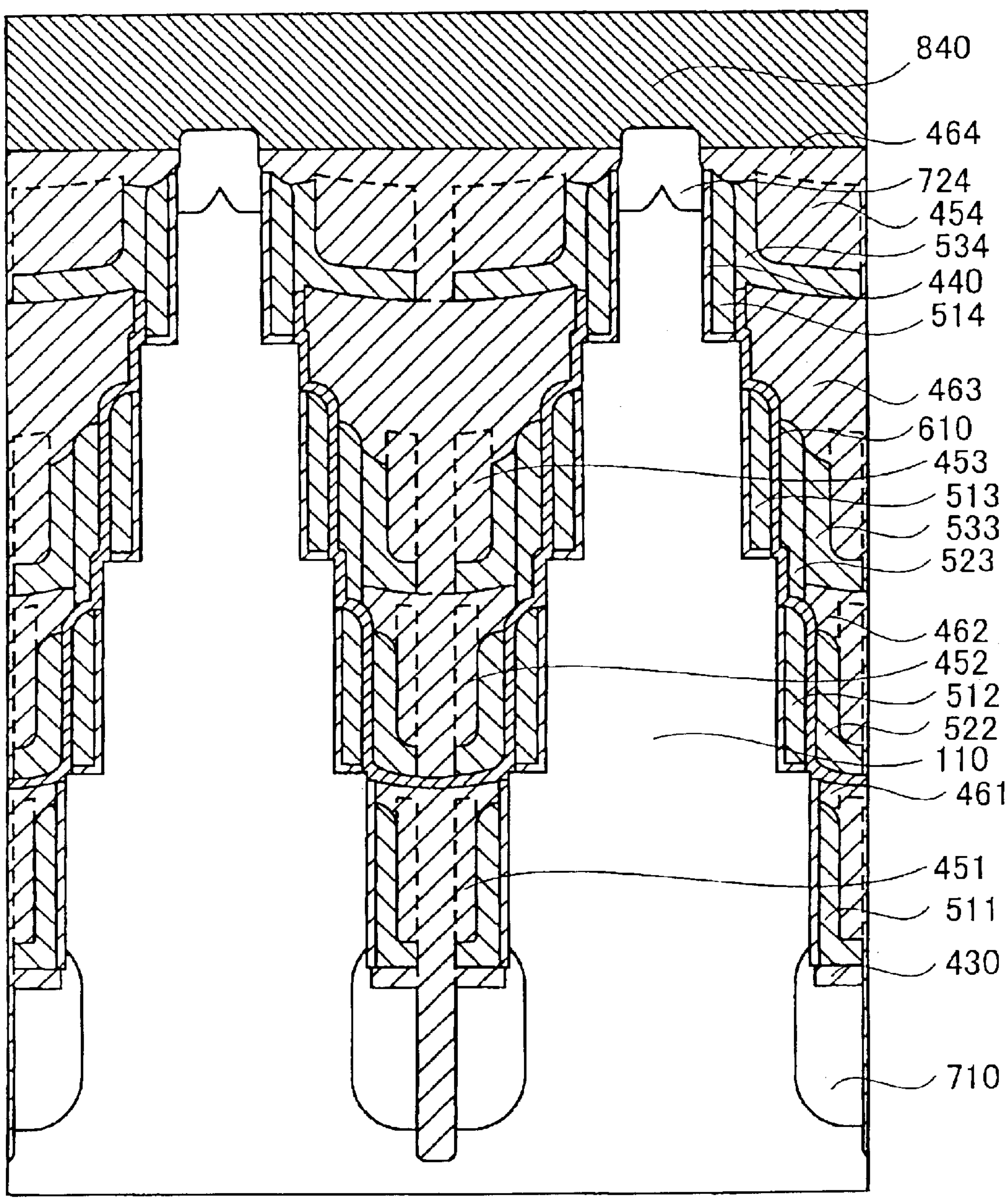

FIG. 452 and FIG. 453 are sectional views taken on line A–A' and line B–B', respectively, of FIG. 1 showing a memory cell array of EEPROM.

In this production example, in a semiconductor memory as described in Production Example 1, the intervals between the memory cells and the selection gate transistors disposed in the island-like semiconductor layer 110 are maintained at about 20 nm to 40 nm, and the diffusion layers 721 to 723 are not formed (FIG. 452 and FIG. 453).

Effect similar to that of Production Example 1 can be obtained by this production process.

When data are read out from the memory cell, as shown in FIG. 452, a path for passing electric current is established between the impurity diffusion layers 710 and 724 by electric connection of depletion layers and reverse layers at D1 to D4 with the gate electrodes 521, 522, 523 and 524. In this state, voltage applied to gates 521, 522, 523 and 524 is so set as to select the formation or non-formation of reverse layers at D2 and D3 according to the state of the charge storage layers 512 and 513. Thus data in the memory cell can be read out.

Figure 454:
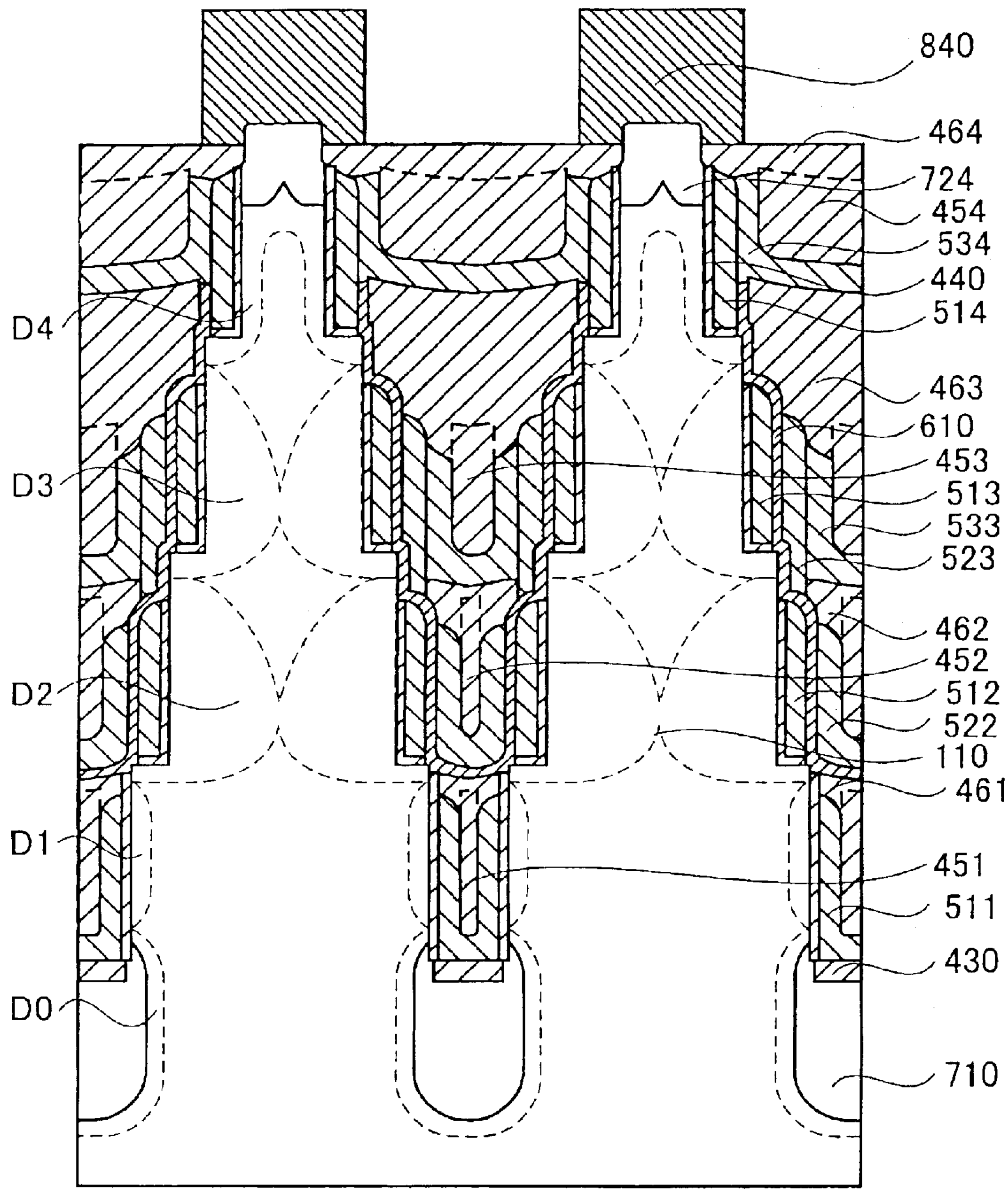

The distribution in D1 to D4 is desirably set so that a complete depletion can be obtained as shown in FIG. 454. In this case, the back-bias effect can be reduced in the memory call and the selection gate transistor, and variations in the performance of the devices can be reduced.

The diffusion from the impurity diffusion layers 710 to 724 can be suppressed by adjusting the amount of the impurity introduced or adjusting thermal treatment. The distance in a height direction of the island-like semiconductor device can be set short, which contributes to reduction in costs and suppression of variations occurring in the production process.

PRODUCTION EXAMPLE 14

In the semiconductor memory of this production example, transmission gates are disposed between the transistors for transmitting potential to active regions of the memory transistors.

In the semiconductor memory produced in this example, a semiconductor substrate is patterned, for example, into an island-like semiconductor layer having at least one step. A side of the island-like semiconductor layer serves as an active region. A plurality of tunnel oxide films and floating gates as charge storage layers are formed on a sidewall of each tier. Control gates are formed on at least a part of sides of the floating gates with intervention of interlayer insulating films. Steps are further provided in a top portion and in a bottom portion of the island-like semiconductor layer. Selection gate transistors each formed of a gate oxide film and a selection gate are disposed on sidewalls of the tiers. A plurality of, for example, two memory transistors are disposed between the selection gate transistors. The transistors are connected in series along the island-like semiconductor layer. The gate insulating film of the selection gate transistor has the same thickness as that of the gate insulating film of the memory transistor, and the selection gates and the floating gates of the respective transistors are formed at the same time. The transmission gates are disposed between the transistors for transmitting potential to active regions of the memory transistors.

Figure 455:
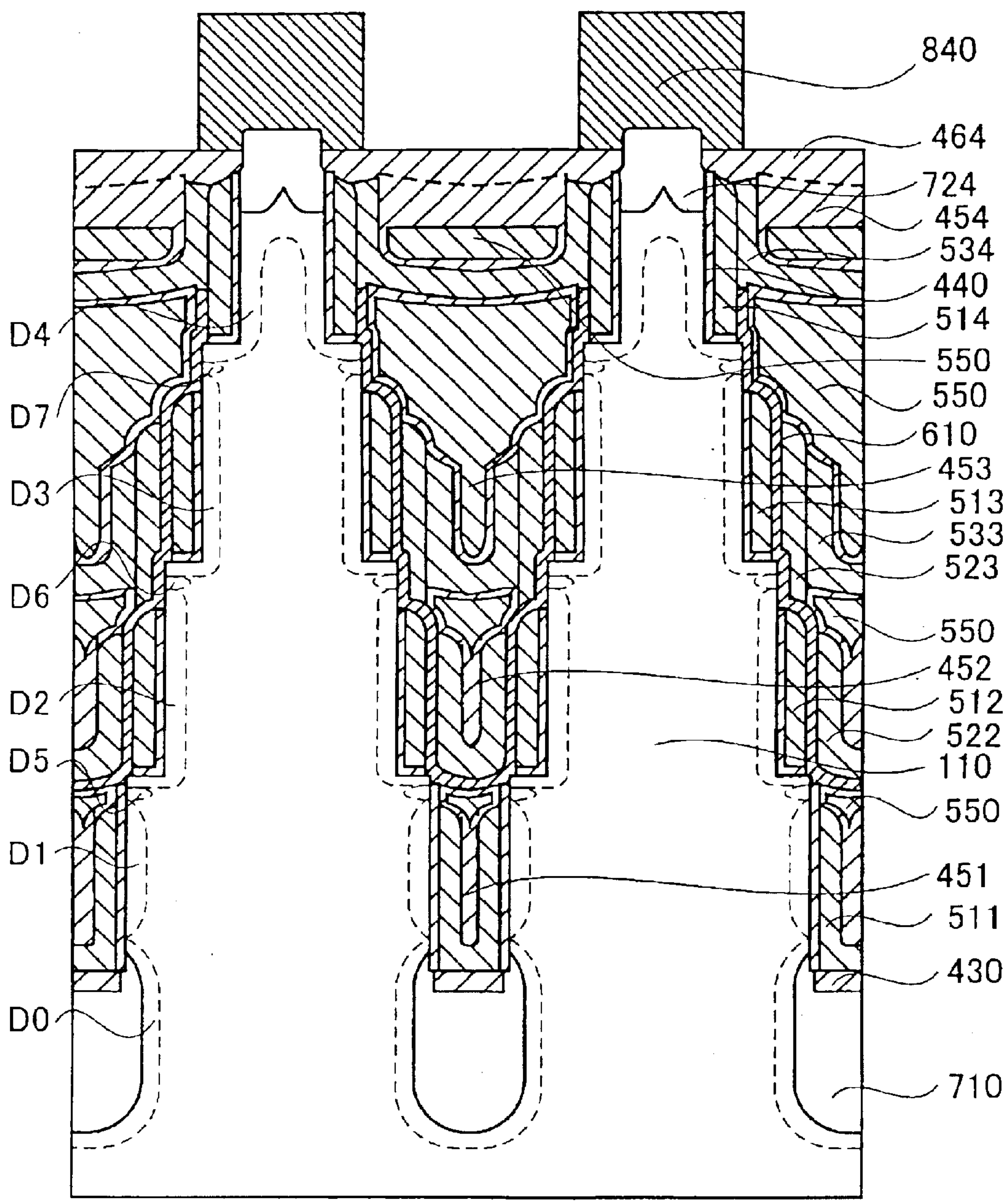
Figure 456:
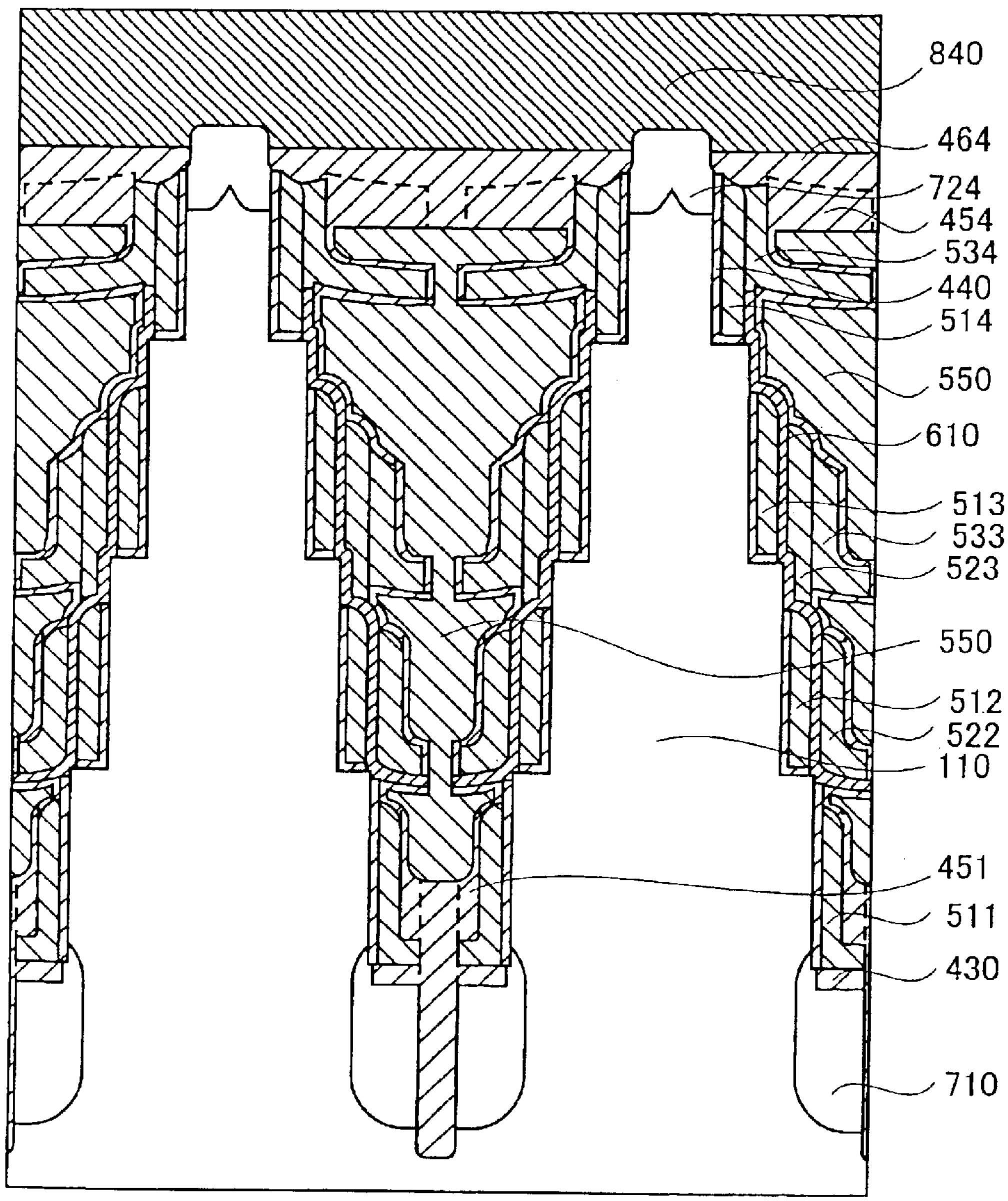

FIG. 455 and FIG. 456 are sectional views taken on line A–A' and line B–B', respectively, of FIG. 1 showing a memory cell array of EEPROM.

In this production example, the impurity diffusion layers 721 to 723 are not formed. After the formation of the polysilicon films 522, 523 and 524, a gate electrode is formed of a polysilicon film 550, for example, as a fifth conductive film. Except these points, the semiconductor memory can be realized in the same manner as in Production Example 1 (FIG. 455 and FIG. 456).

As shown in FIG. 455, when data are read out from the memory cell, a path for passing electric current is established between the impurity diffusion layers 710 and 724 by electric connection of depletion layers and reverse layers at D1 to D7 with the gate electrodes 521, 522, 523, 524 and 530. In this state, voltage applied to gates 521, 522, 523, 524 and 530 is so set as to select the formation or non-formation of reverse layers at D2 and D3 according to the state of the charge storage layers 512 and 513. Thus data in the memory cell can be read out.

Figure 457:
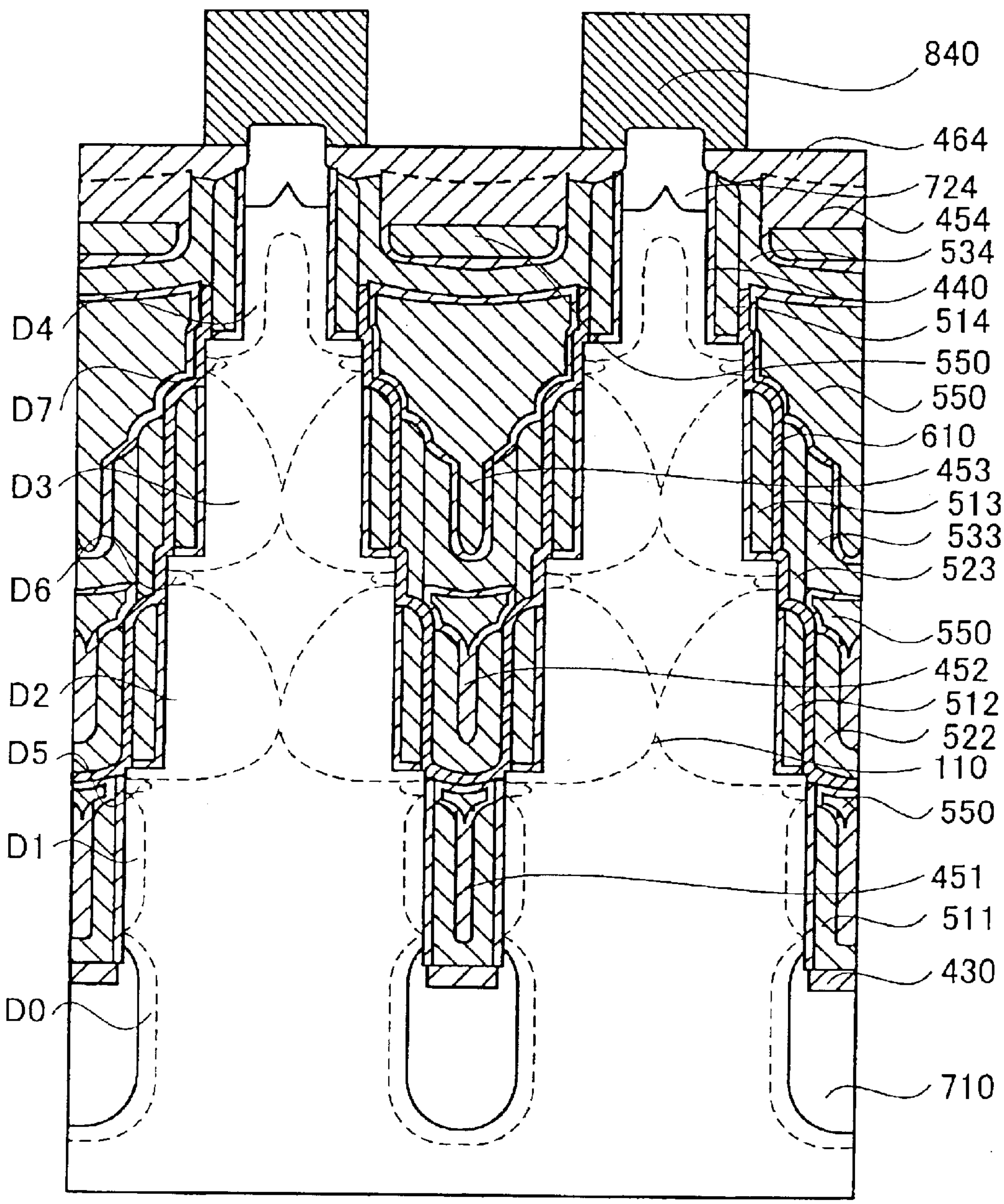

The distribution in D1 to D4 is desirably set so that a complete depletion can be obtained as shown in FIG. 457. In this case, the back-bias effect can be reduced in the memory call and the selection gate transistor, and variations in the performance of the devices can be reduced.

Effect similar to that of Production Example 1 can also be obtained by this production example. The numbers of production steps can be reduced, and the height necessary for the island-like semiconductor layer 110 can be decreased, which results in suppression of variations occurring in the production process.

The positions of the top and the bottom of the polysilicon film 530 as the third conductive film may be those as shown in FIG. 456. It is sufficient that the top of the polysilicon film 530 is located at least above the bottom of the polysilicon film 514 as the first conductive film and the top of the polysilicon film 530 is located at least below the top of the polysilicon film 511 as the first conductive film.

PRODUCTION EXAMPLE 15

The following is a production example for obtaining a structure in which the direction of the first wiring layer is in parallel to and the direction of the fourth wiring layer.

Figure 458:
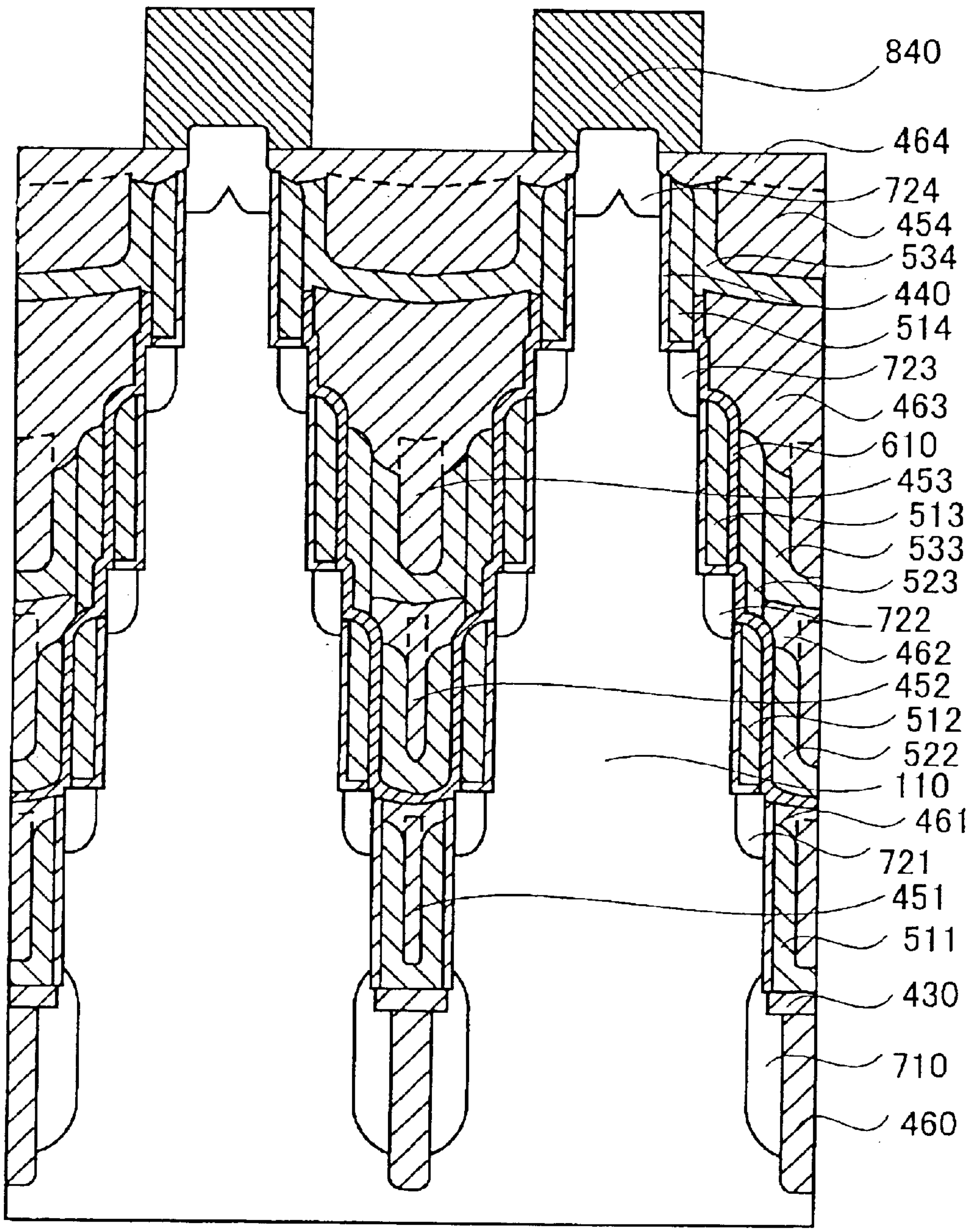
Figure 459:
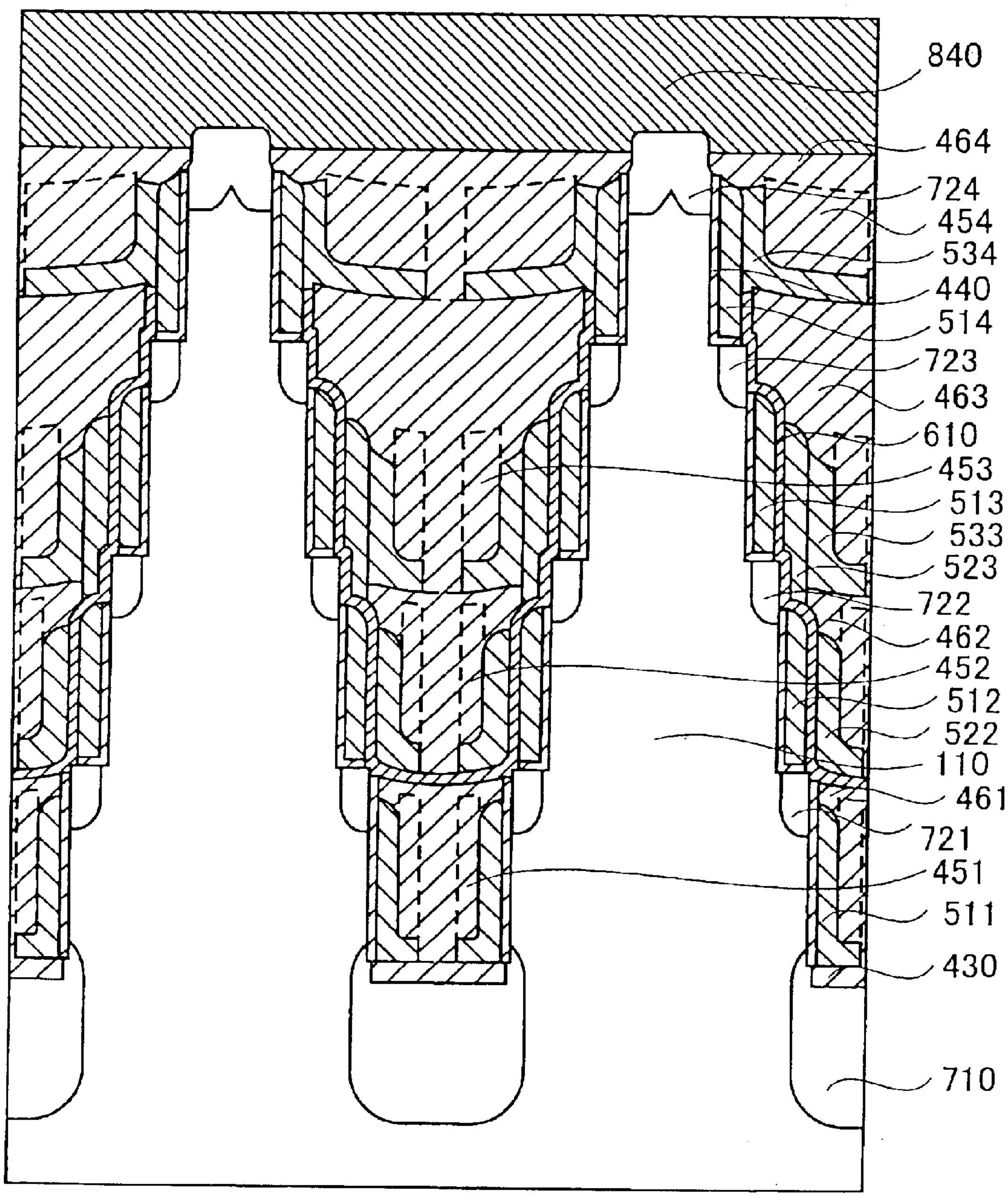

FIG. 458 and FIG. 459 are sectional views taken on line A–A' and line B–B', respectively, of FIG. 1 showing a memory cell array of EEPROM.

In this production example, in a semiconductor memory as described in Production Example 1, the first wiring layer continuous in direction A–A' is separated by anisotropic etching using a patterned resist film as a mask and burying a silicon oxide film 460, for example, as a seventh insulating film. On the other hand, the step of separating the impurity diffusion layer 710 using as a mask a resist film R2 patterned by a known photolithography technique is not performed in order that the first wiring layer is not separated in direction B–B'.

Thereby, a semiconductor memory is realized which has the first wiring layer in parallel to the fourth wiring layer and has a memory function according to the state of a charge stored in the charge storage layer made of the polysilicon film as the first conductive film (FIG. 458 and FIG. 459).

PRODUCTION EXAMPLE 16

The following is a production example for obtaining a structure in which the first wiring layer is electrically common to a memory cell array.

Figure 460:
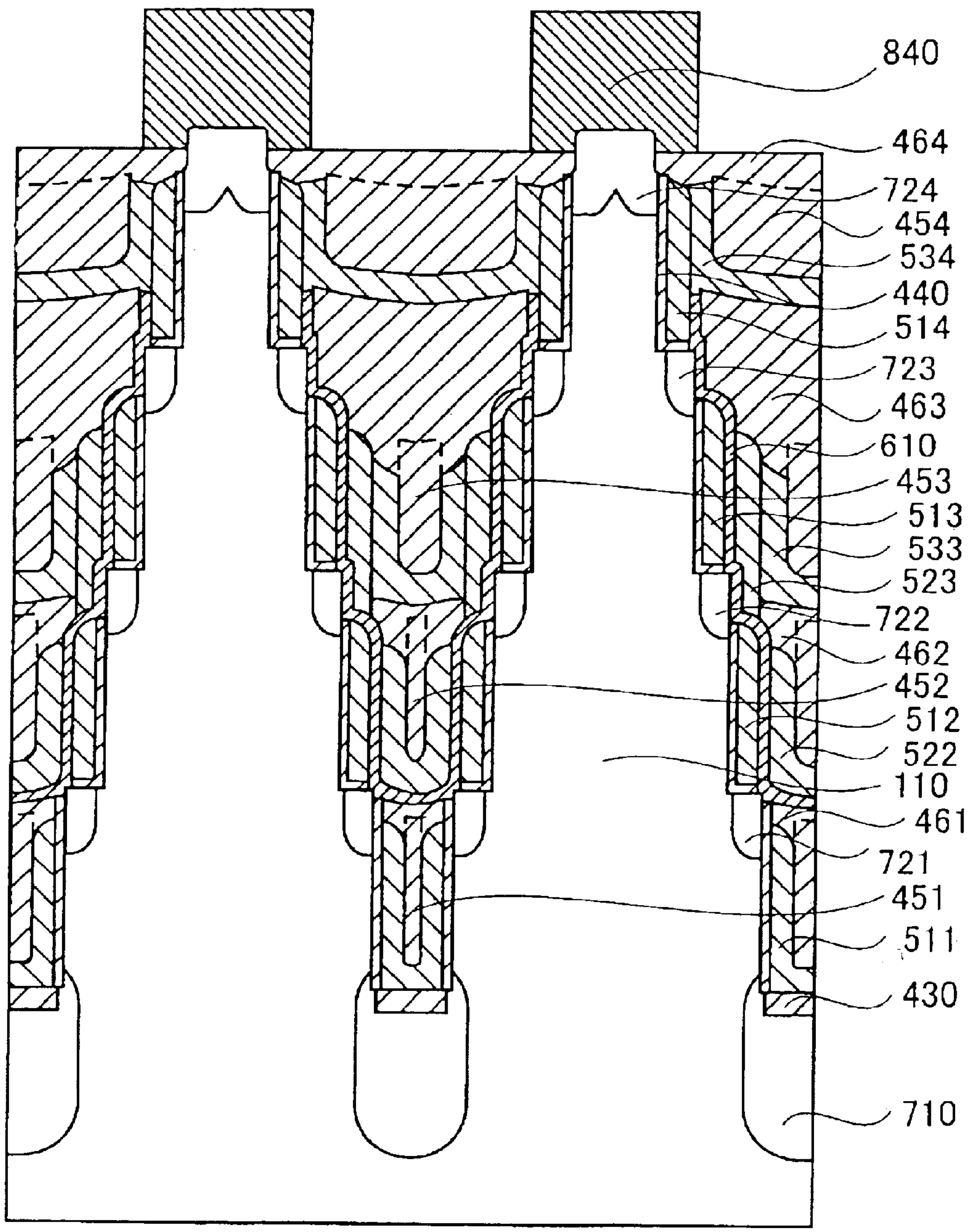
Figure 461:
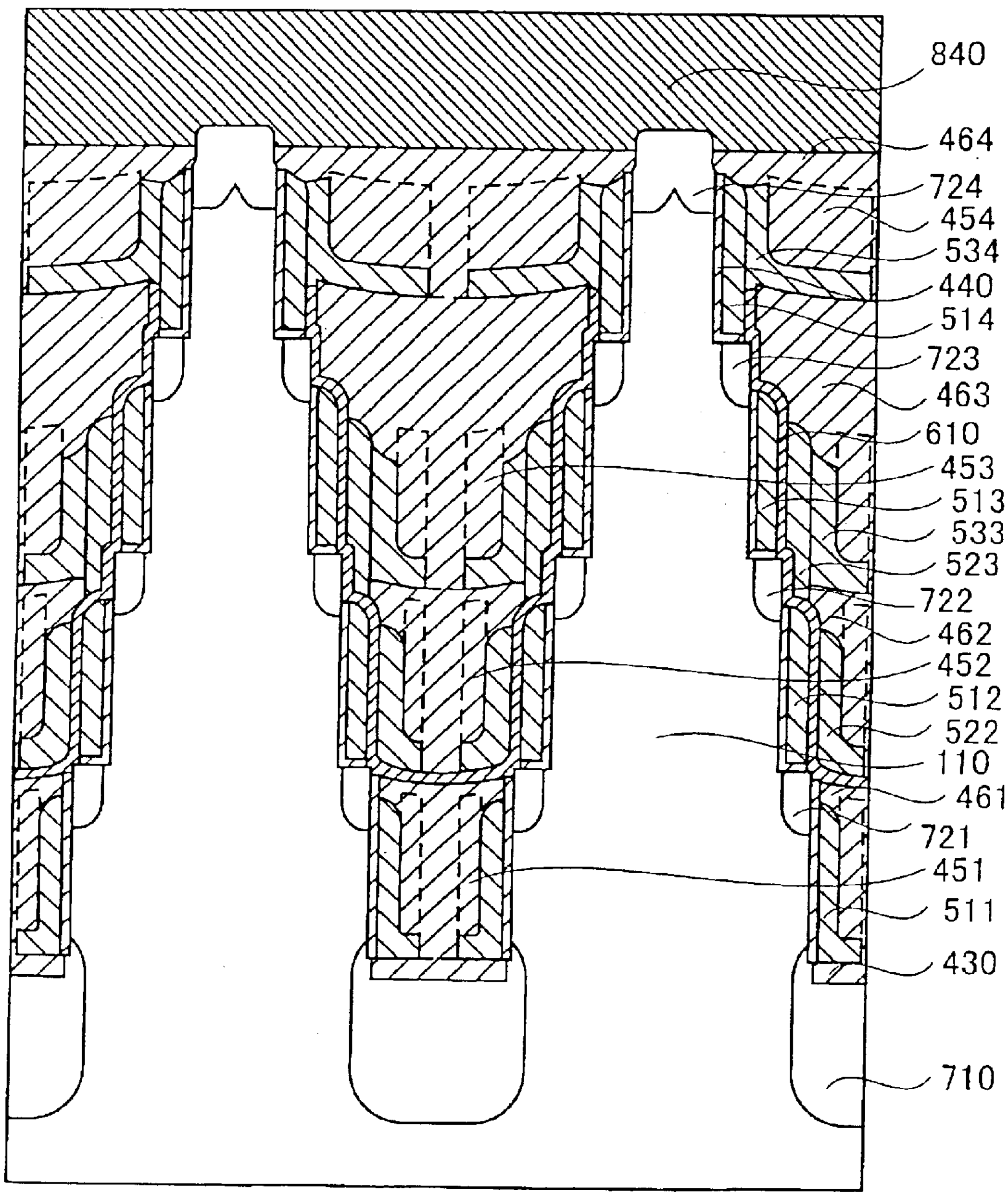

FIG. 460 and FIG. 461 are sectional views taken on line A–A' and line B–B', respectively, of FIG. 1 showing a memory cell array of EEPROM.

In this production example, in a semiconductor memory as described in Production Example 1, the trench 211 is not formed in the semiconductor substrate 100 and the process related thereto is omitted from Production Example 1. Thereby, a semiconductor memory is realized which has the first wiring layer unseparated and common in an array and has a memory function according to the state of a charge stored in the charge storage layer made of the polysilicon film as the first conductive film (FIG. 460 and FIG. 461).

PRODUCTION EXAMPLE 17

The following is a production example for obtaining a structure in which the gates of the memory transistors and the selection gate transistors have different lengths in the vertical direction.

FIGS. 462 and 464 and FIGS. 463 and 465 are sectional views taken on line A–A' and line B–B', respectively, of FIG. 1 showing a memory cell array of EEPROM.

Figure 462:
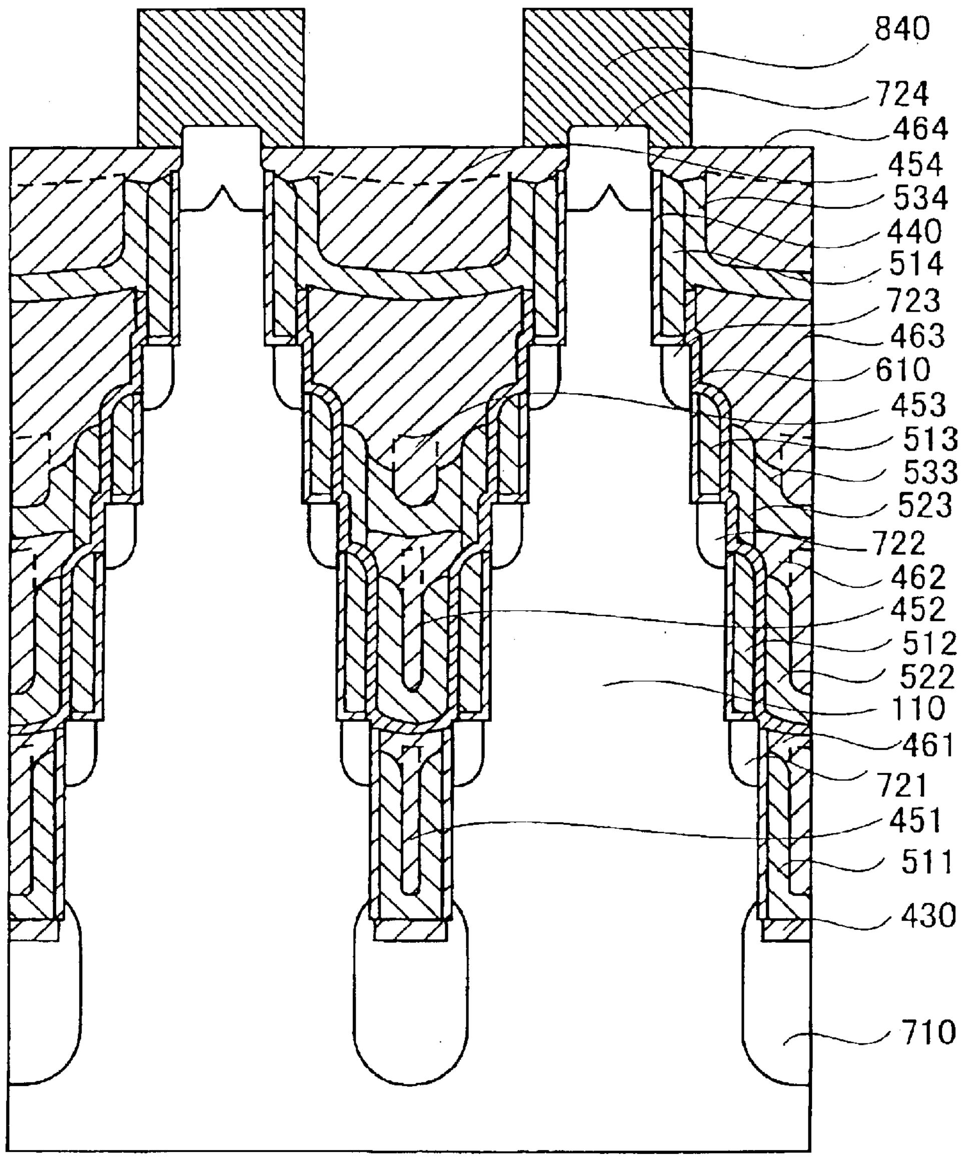
Figure 463:
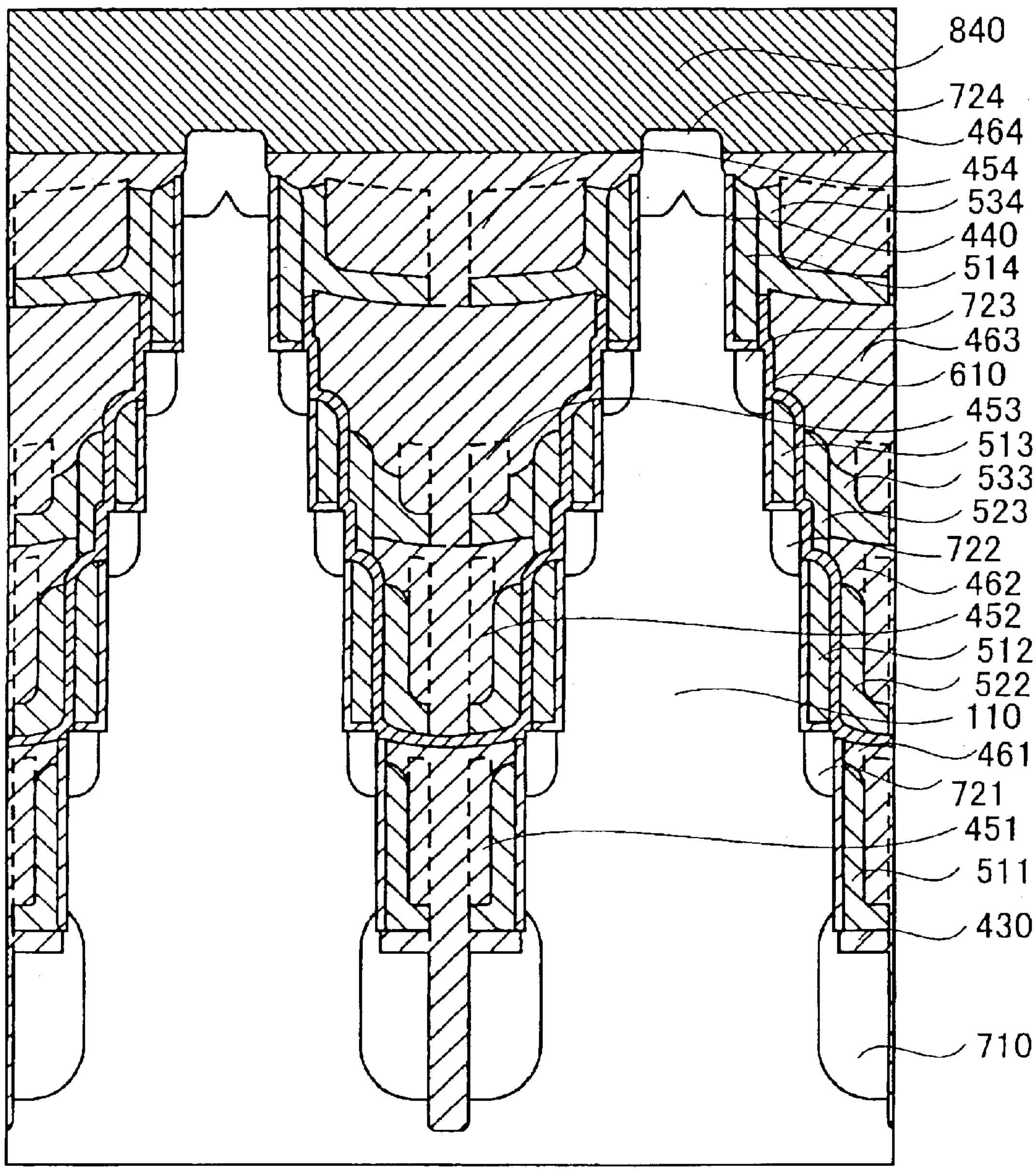
Figure 464:
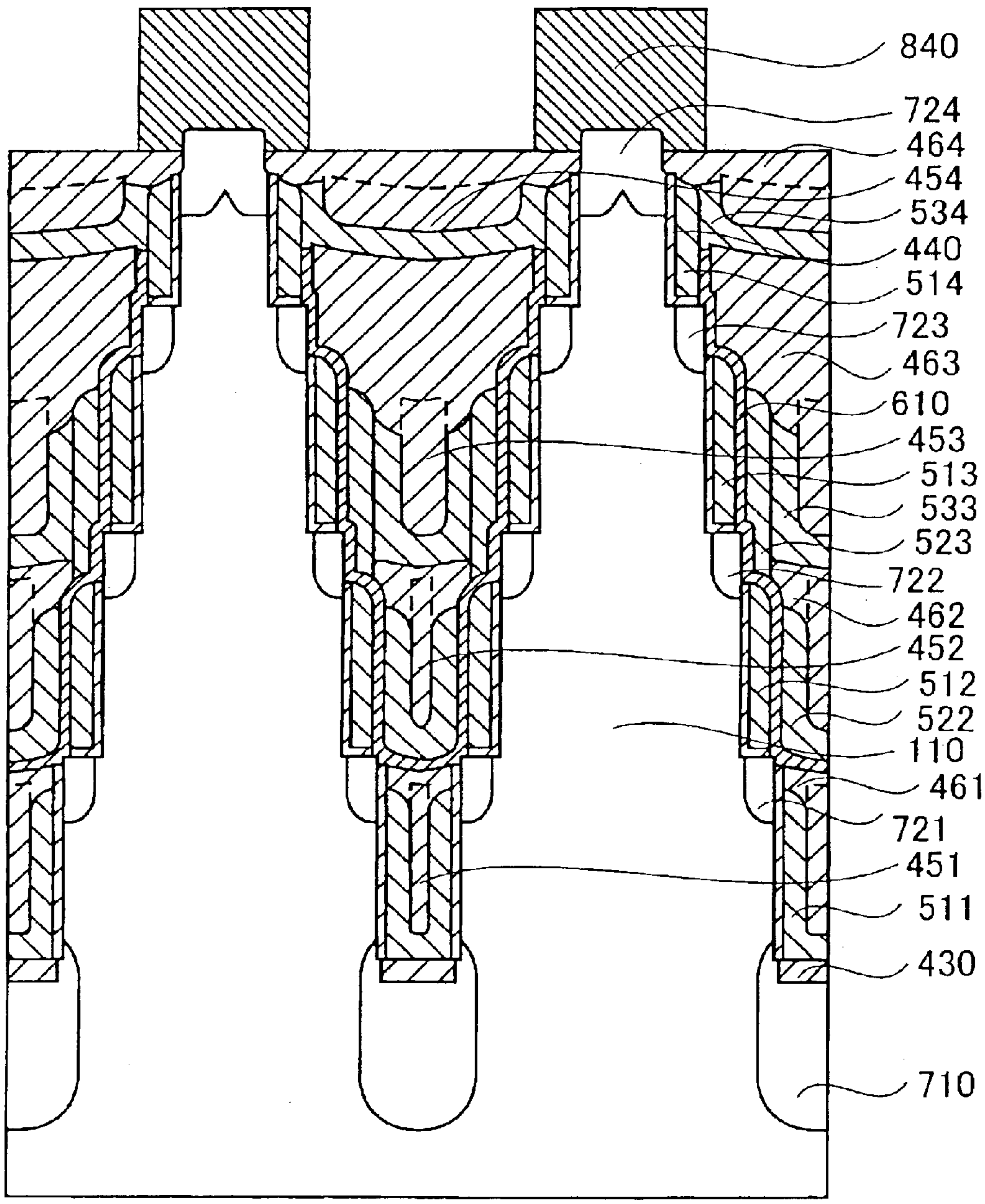
Figure 465:
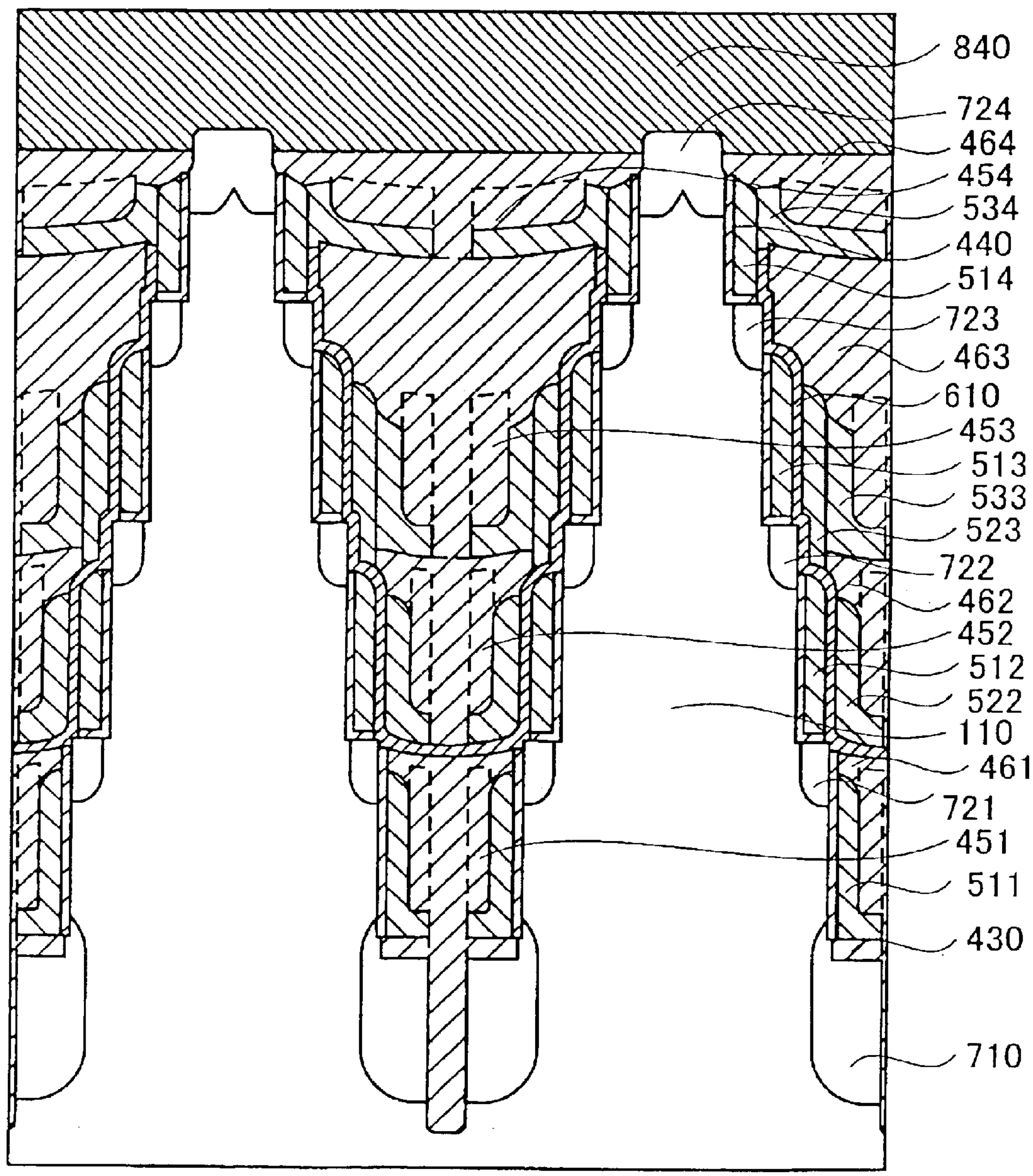

Concerning the lengths of the polysilicon films 511, 512, 513 and 514 as the first conductive film to be the gates of memory cells or the selection gates in the direction vertical to the semiconductor substrate, the gates of memory cells made of the polysilicon films 512 and 513 may have different lengths as shown in FIG. 462 and FIG. 463, or the selection gates made of the polysilicon films 511 and 514 may have different lengths as shown in FIG. 464 and FIG. 465. Also the polysilicon films 521, 522, 523 and 524 as the second conductive film may not have the same lengths in the vertical direction. It is rather desirable to vary the lengths of the gates of the transistors in consideration of decreases in the threshold caused by the back-bias effect from the substrate when data are read out from the memory cells connected in series in the island-like semiconductor layer 100. In this case, since the heights of the first conductive film and the second conductive film which are the lengths of the gates can be controlled tier by tier, the memory cells can be easily controlled.

PRODUCTION EXAMPLE 18

Figure 466:
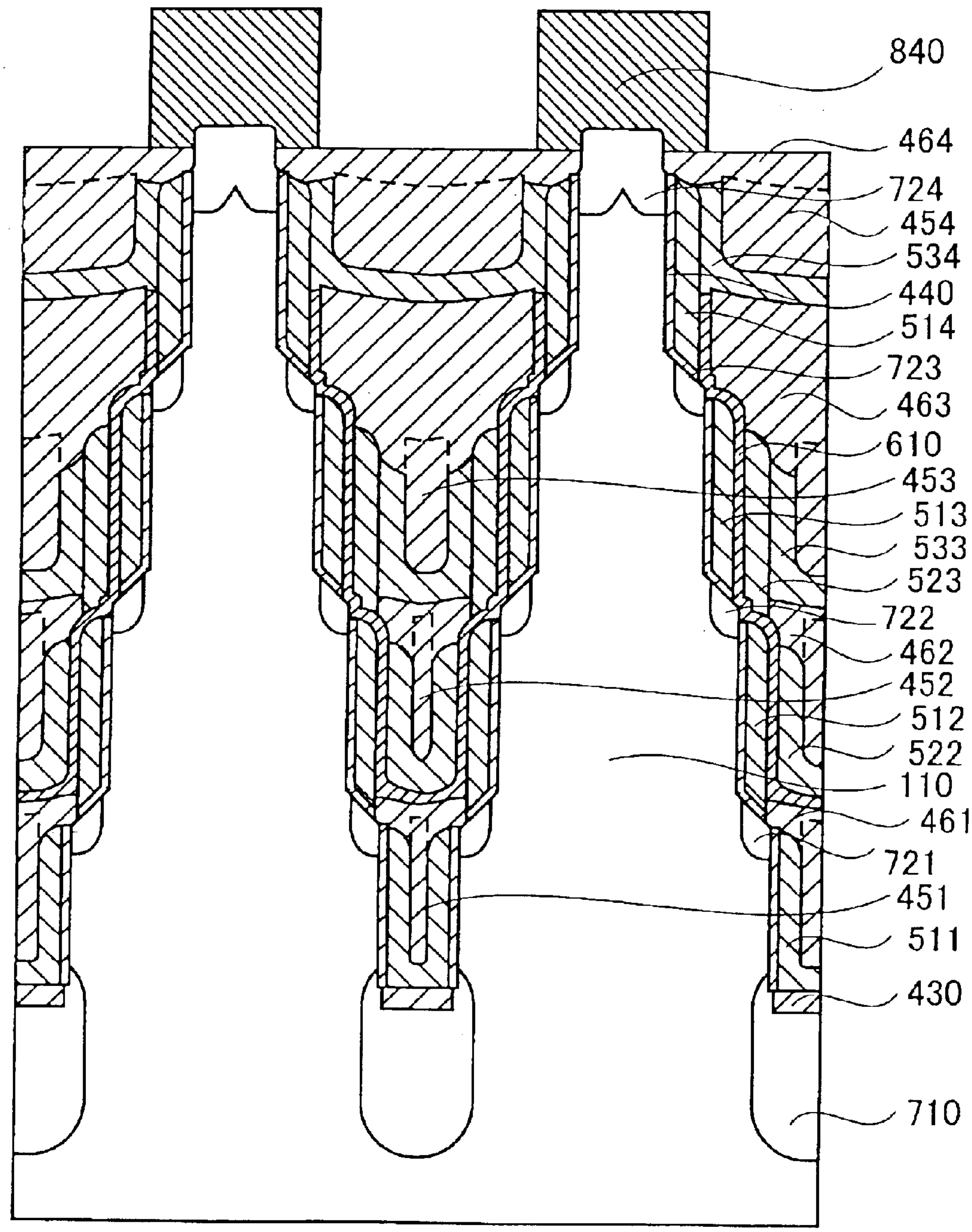
Figure 467:
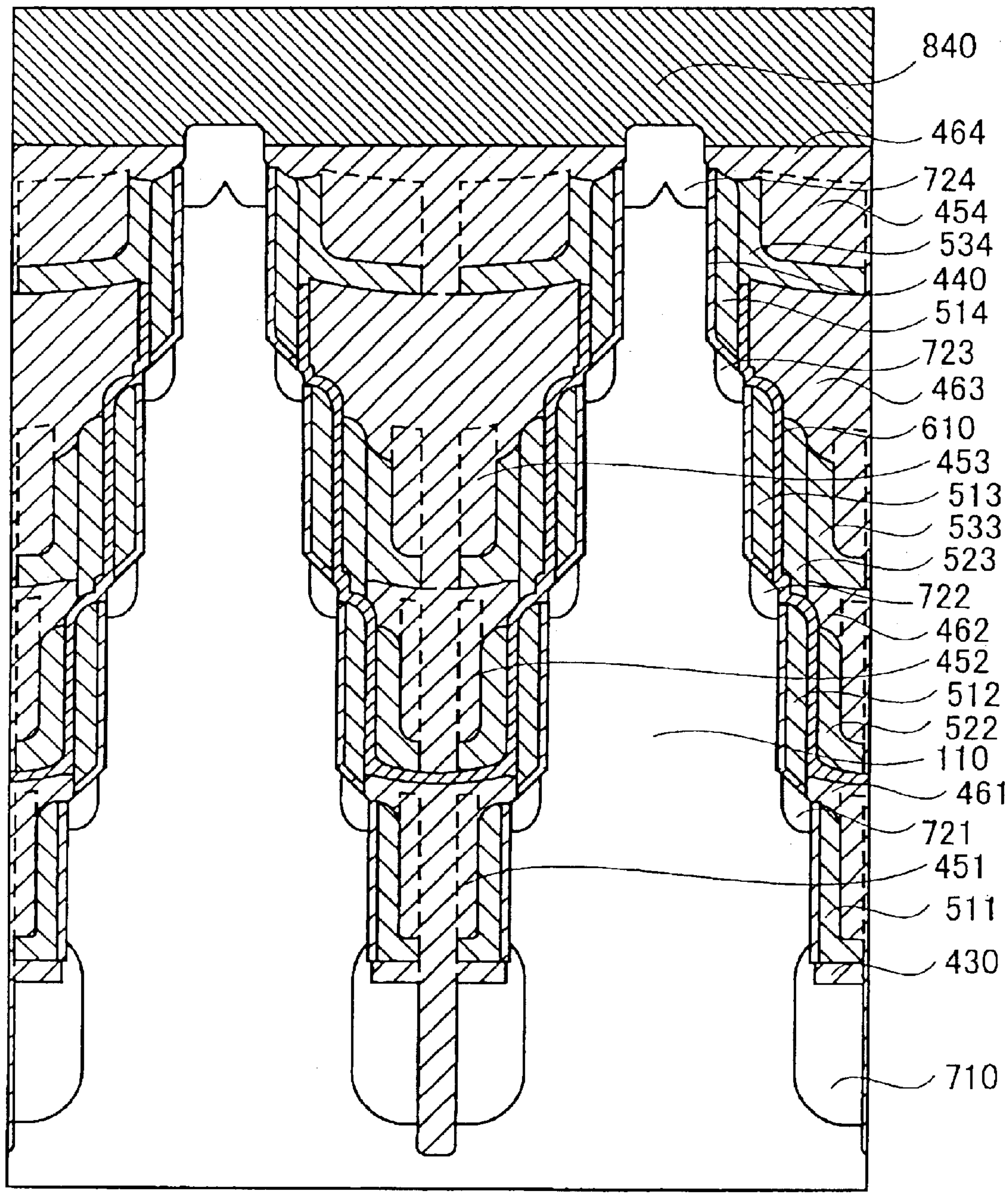

The following is a production example in which the tiers of the island-like semiconductor layer 100 do not have a simple rectangular cross section having right angles. FIG. 466 and FIG. 467 are sectional views taken on line A–A' and line B–B', respectively, of FIG. 1 showing a memory cell array of EEPROM.

As shown in FIG. 466 and 467, the tiers of the island-like semiconductor layer 100 may entirely or partially have an inclined cross section with obtuse angles. Similarly, the tiers of the island-like semiconductor layer 100 may entirely or partially have an inclined cross section with acute angles. The tiers may also have rounded corners.

PRODUCTION EXAMPLE 19

The following is a production example in which the island-like semiconductor layer 110 is electrically floated by the impurity diffusion layer 710. FIGS. 468 and 470 and FIGS. 469 and 471 are sectional views taken on line A–A' and line B–B', respectively, of FIG. 1 showing a memory cell array of EEPROM.

In this production example, in a semiconductor memory as described in Production Example 1, the disposition of the impurity diffusion layers 710 and 721 to 723 is changed.

Figure 468:
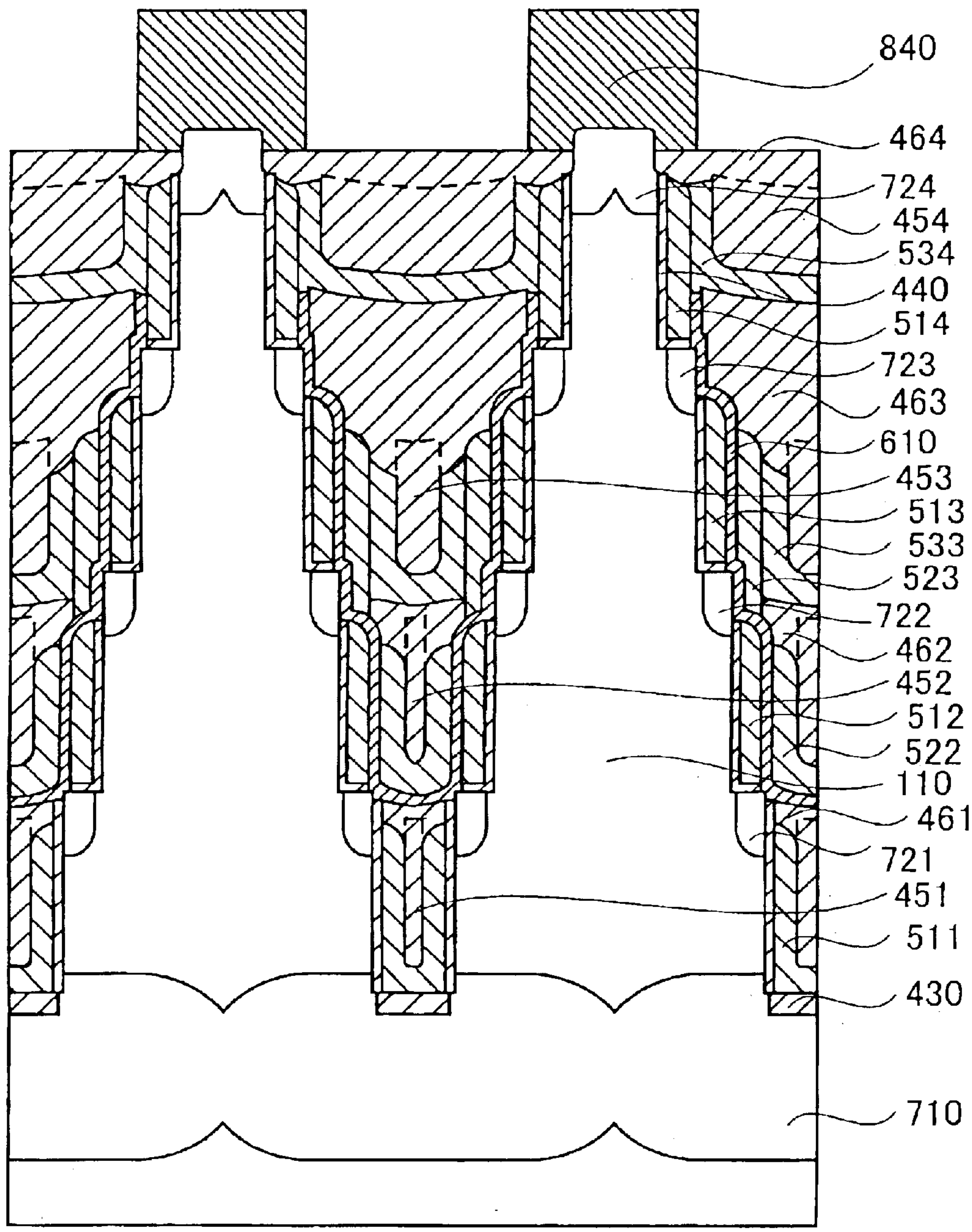
Figure 469:
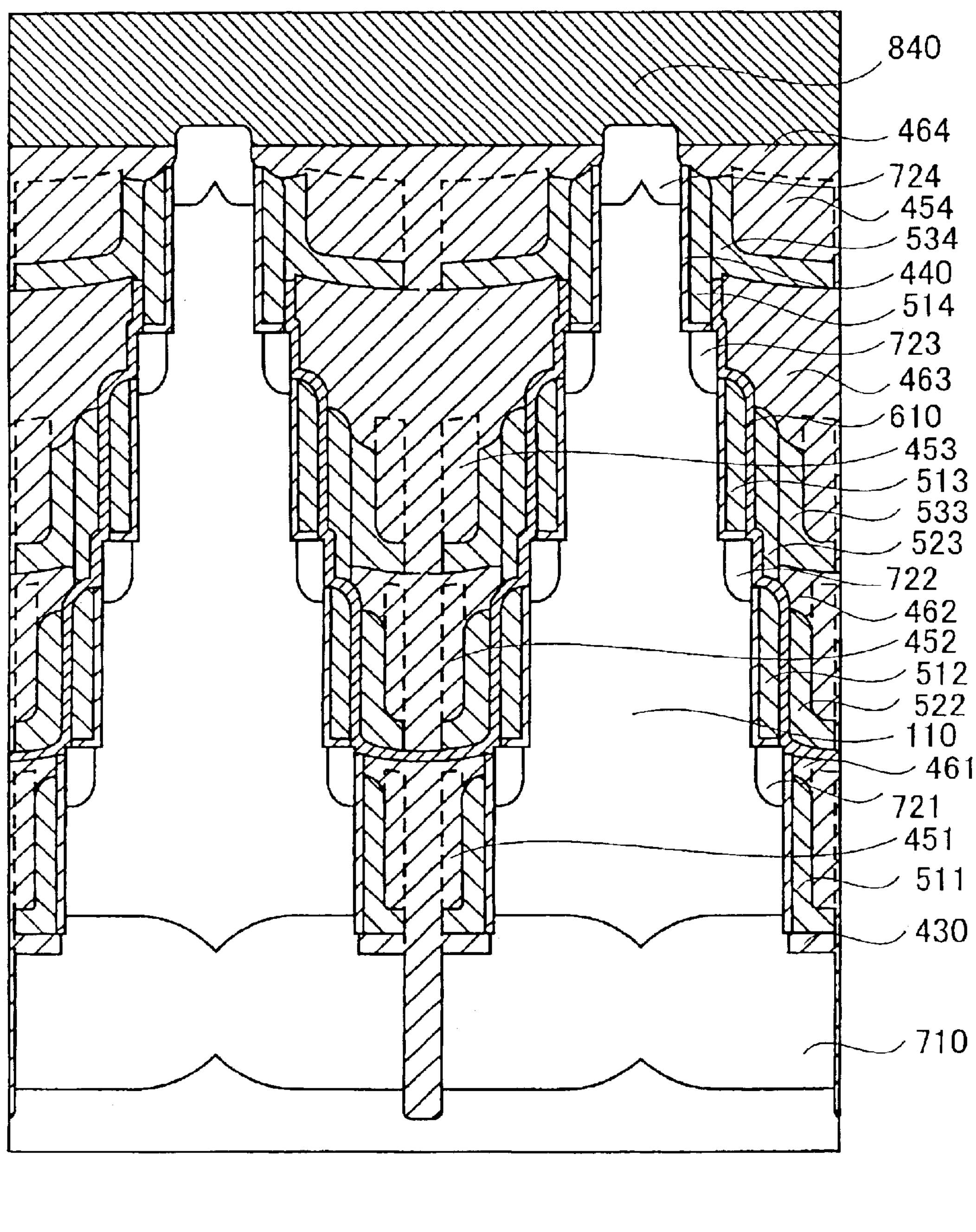

As shown in FIG. 468 and FIG. 469, the impurity diffusion layer 710 may be disposed so that the semiconductor substrate 100 is not electrically connected to the island-like semiconductor layer 110.

Figure 470:
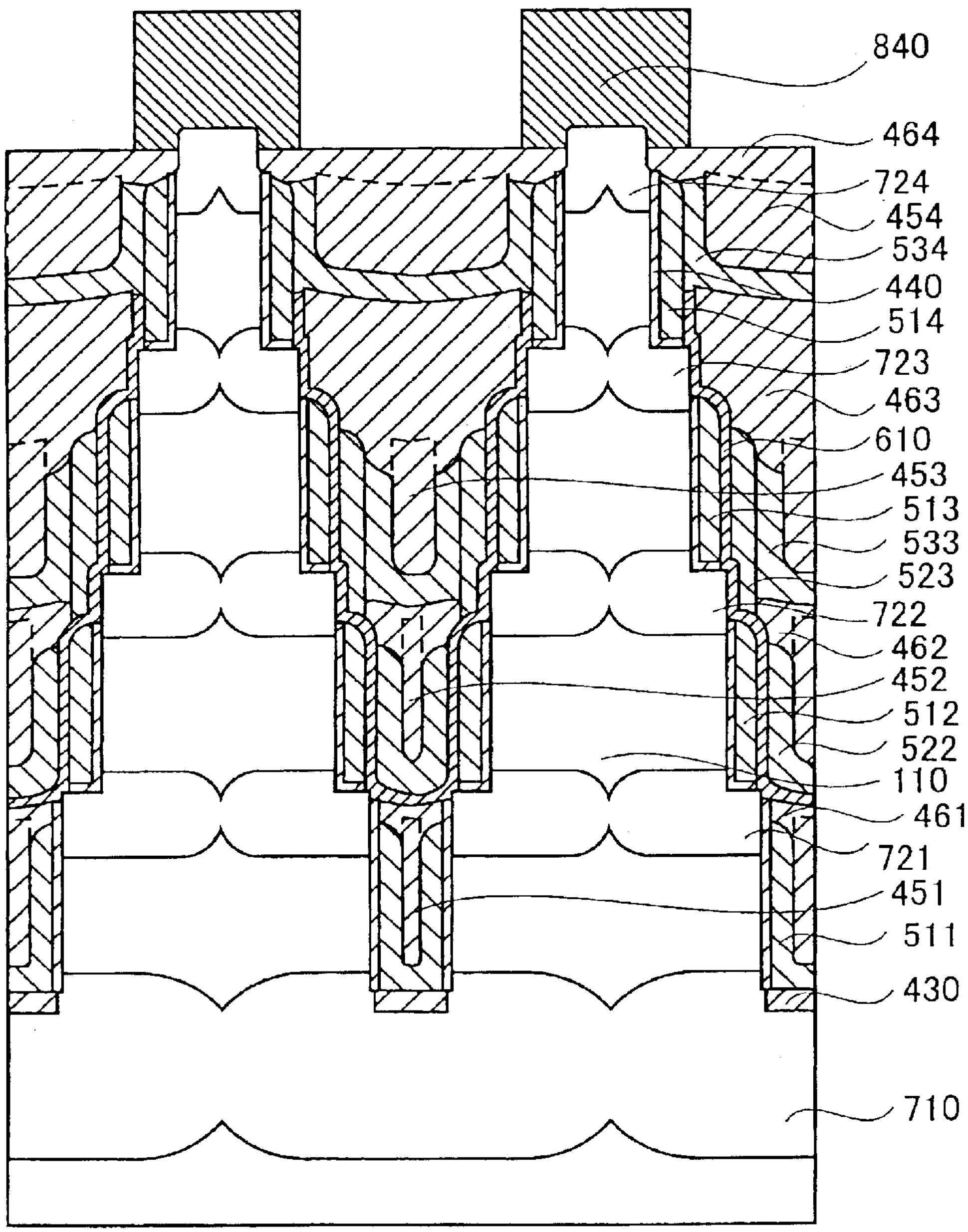
Figure 471:
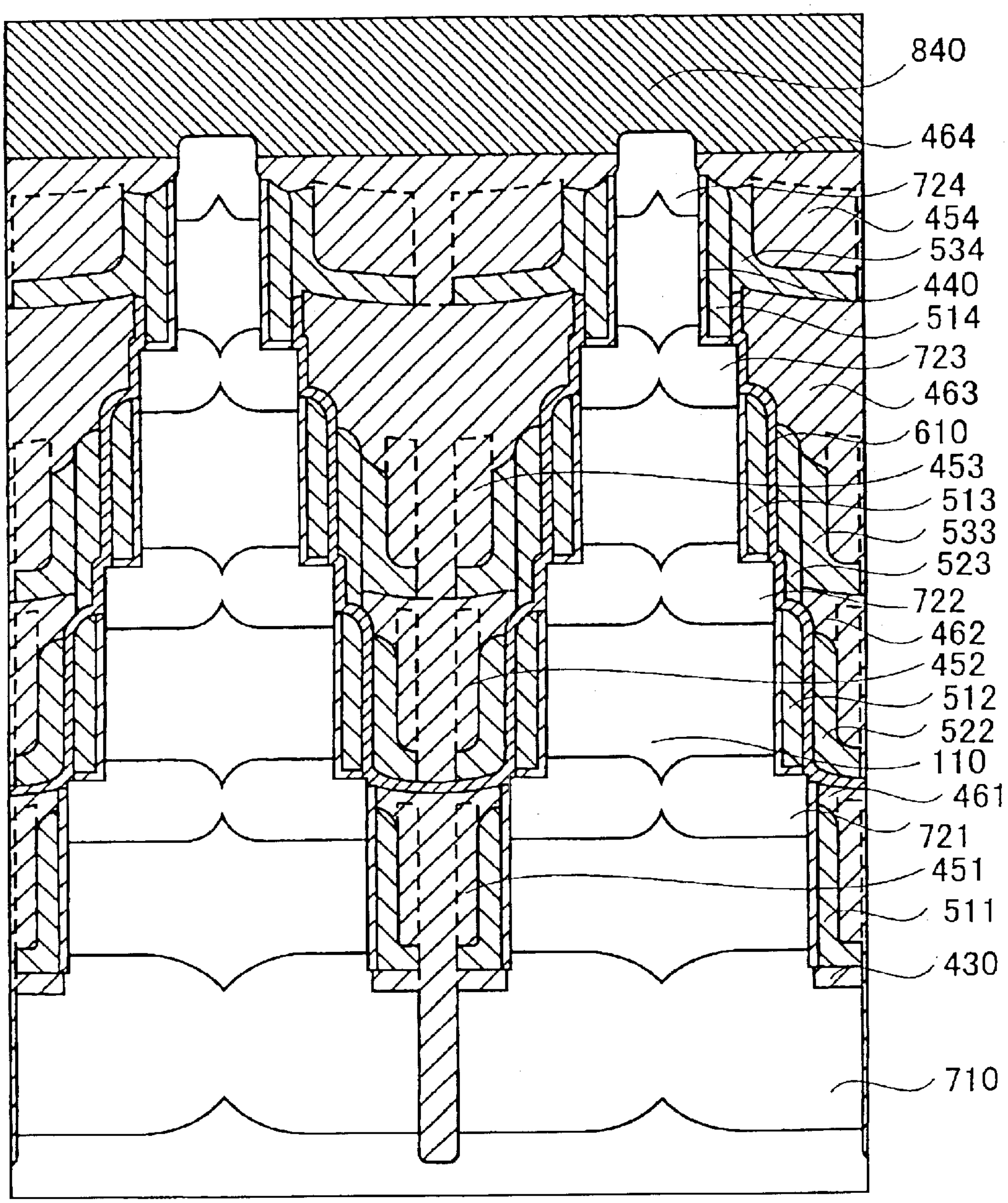

Also as shown in FIG. 470 and 471, the impurity diffusion layers 721, 722 and 723 may be disposed so that the active regions of the memory cells and the selection gate transistors in the island-like semiconductor layer are electrically insulated.

The impurity diffusion layers 710, 721, 722 and 723 may be disposed so that a depletion layer extended by the potential given at reading, at erasing or at writing has an equivalent effect that is the active regions of the memory cells are electrically insulated from the selection gate transistors in the island-like semiconductor layer.

This production example has the same effect as Production Example 1 has. Further, by disposing the impurity diffusion layers so that the active regions of the memory cells are floated with respect to the substrate, the back-bias effect from the substrate is eliminated and variations in the characteristics of the memory cells are reduced which might be cause by a decrease in the threshold of the memory cells at reading. The memory cells and the selection gate transistors are desirably of a complete depletion type.

PRODUCTION EXAMPLE 20

The following is a production example in which the island-like semiconductor layer 110 does not have a simple columnar shape at its bottom tier. FIGS. 472 and 474 and FIGS. 473 and 475 are sectional views taken on line A–A' and line B–B', respectively, of FIG. 1 showing a memory cell array of EEPROM.

Figure 472:
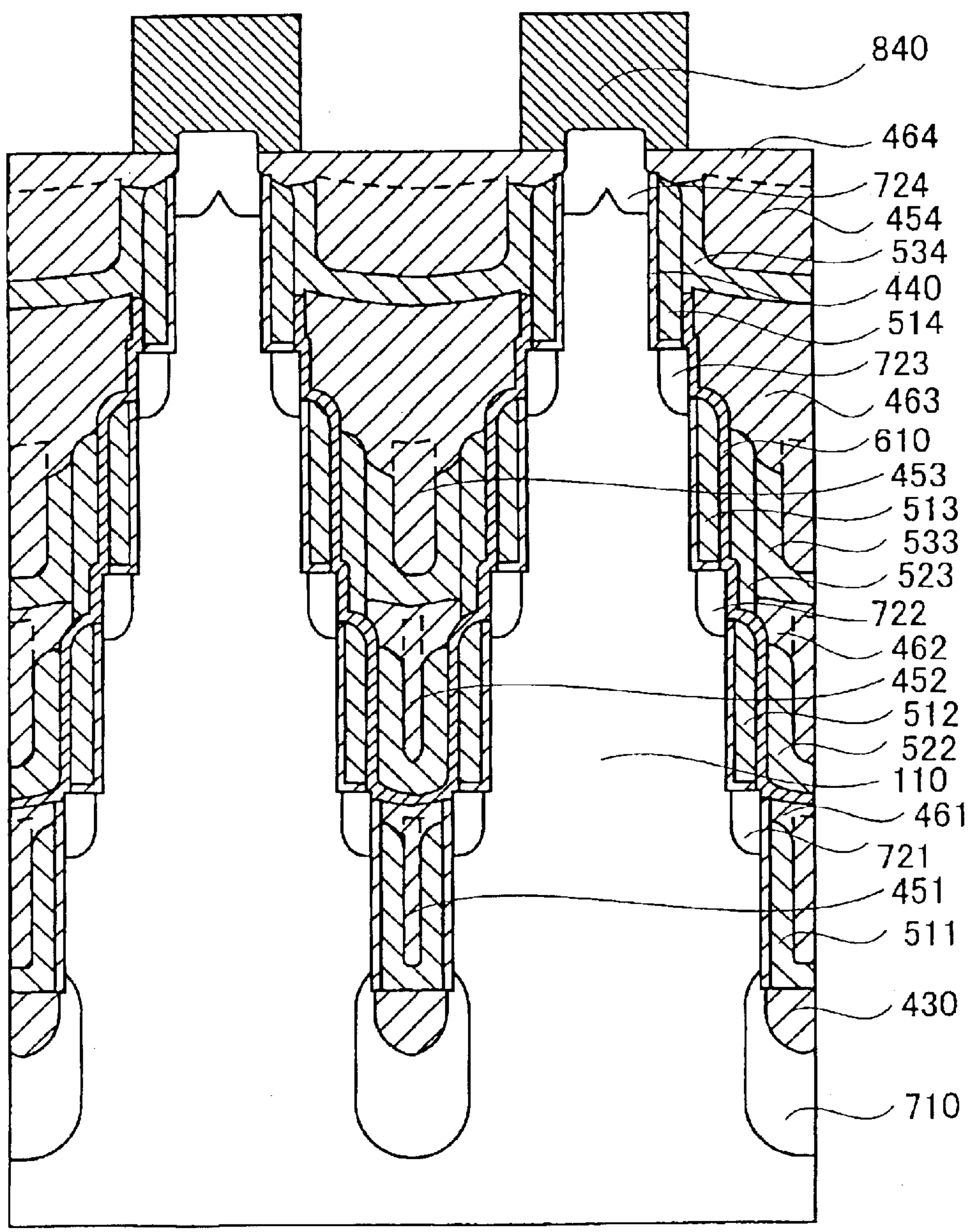
Figure 473:
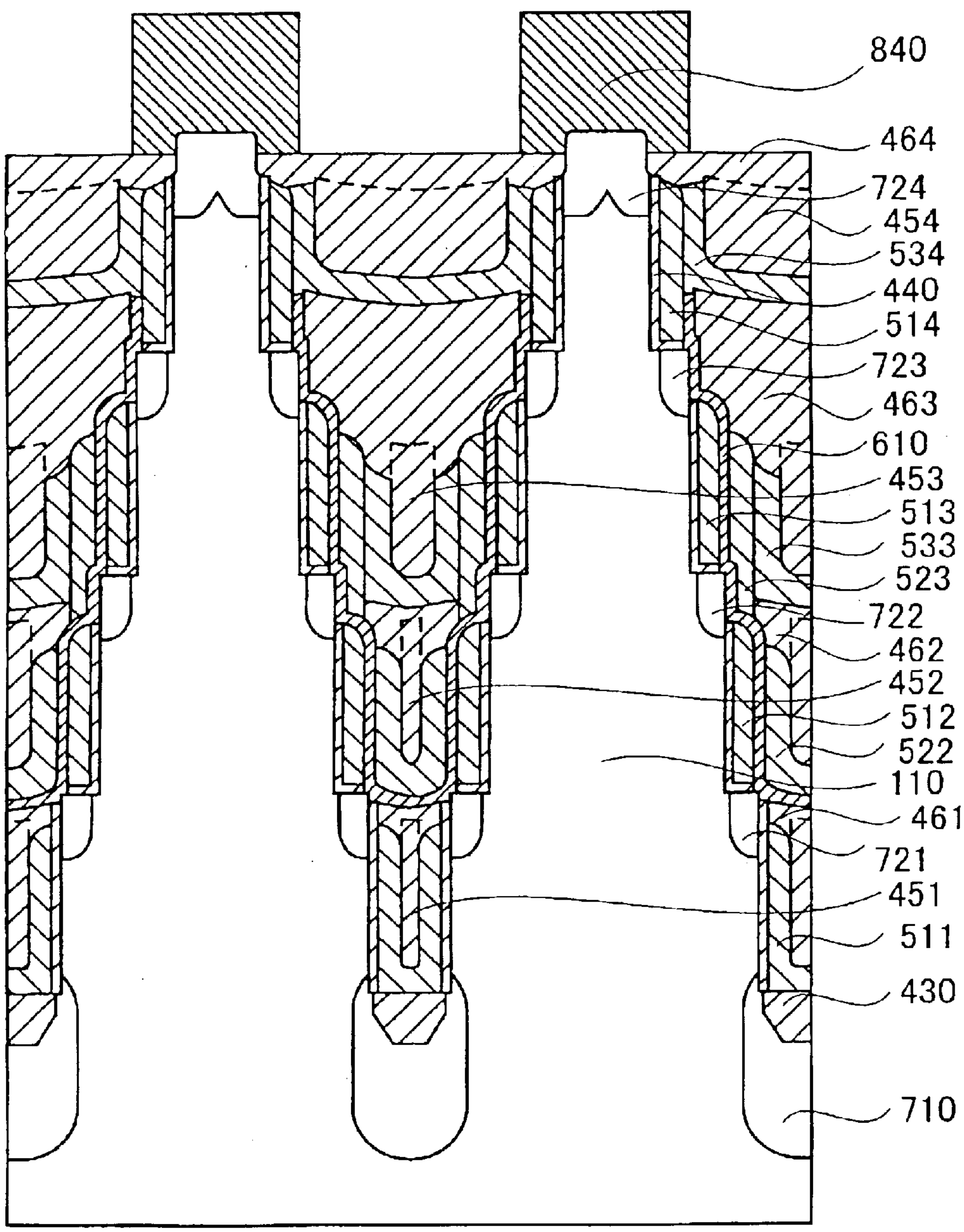

As shown in FIG. 472 and FIG. 473, adjacent island-like semiconductor layers 110 may have a partially or entirely rounded or inclined shape between their bottoms.

The bottom of the polysilicon film 511 as the first conductive film may or may not reach the inclined portion at the bottom of the island-like semiconductor layer 110.

Figure 474:
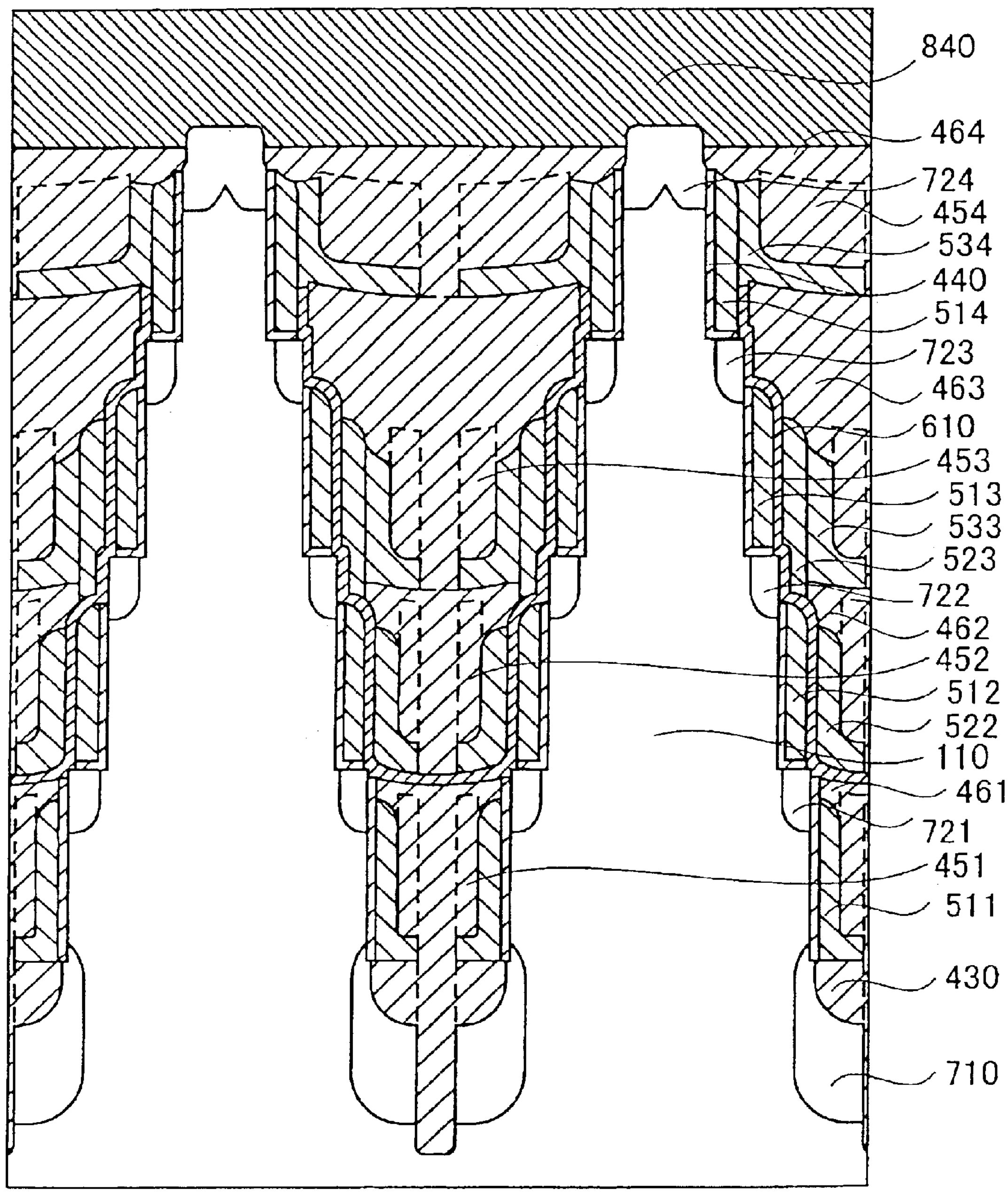
Figure 475:
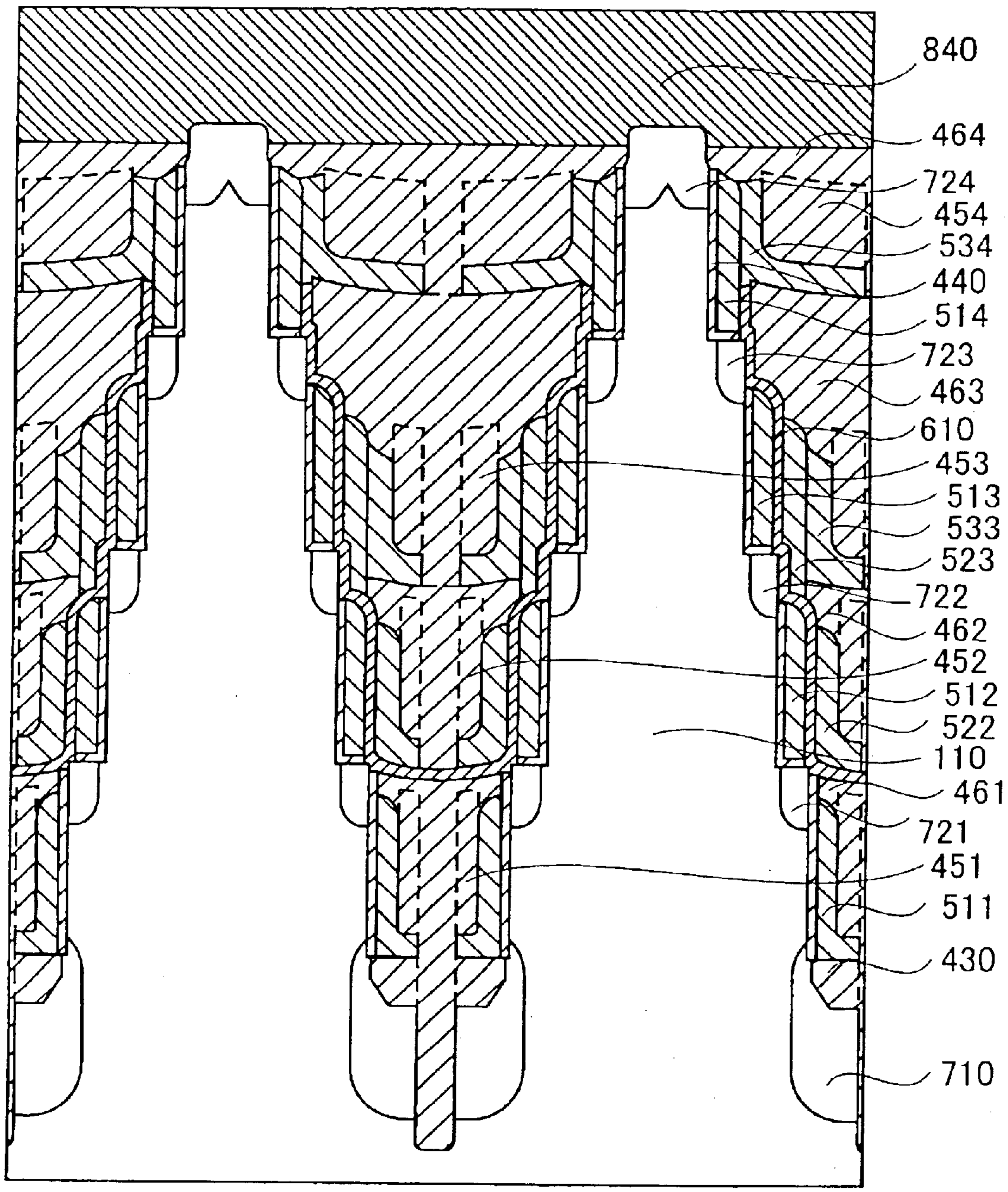

Similarly, as shown in FIG. 474 and FIG. 475, adjacent island-like semiconductor layers 110 may have an inclined shape between their bottoms, and the bottom of the polysilicon film 511 may or may not reach the inclined portion at the bottom of the island-like semiconductor layer 110.

PRODUCTION EXAMPLE 21

The following is a production example in which each tiers of the island-like semiconductor layer 110 is not in the form of simple concentric columns. FIGS. 476, 478 and 480 and FIGS. 477, 479 and 481 are sectional views taken on line A–A' and line B–B', respectively, of FIG. 1 showing a memory cell array of EEPROM.

Figure 476:
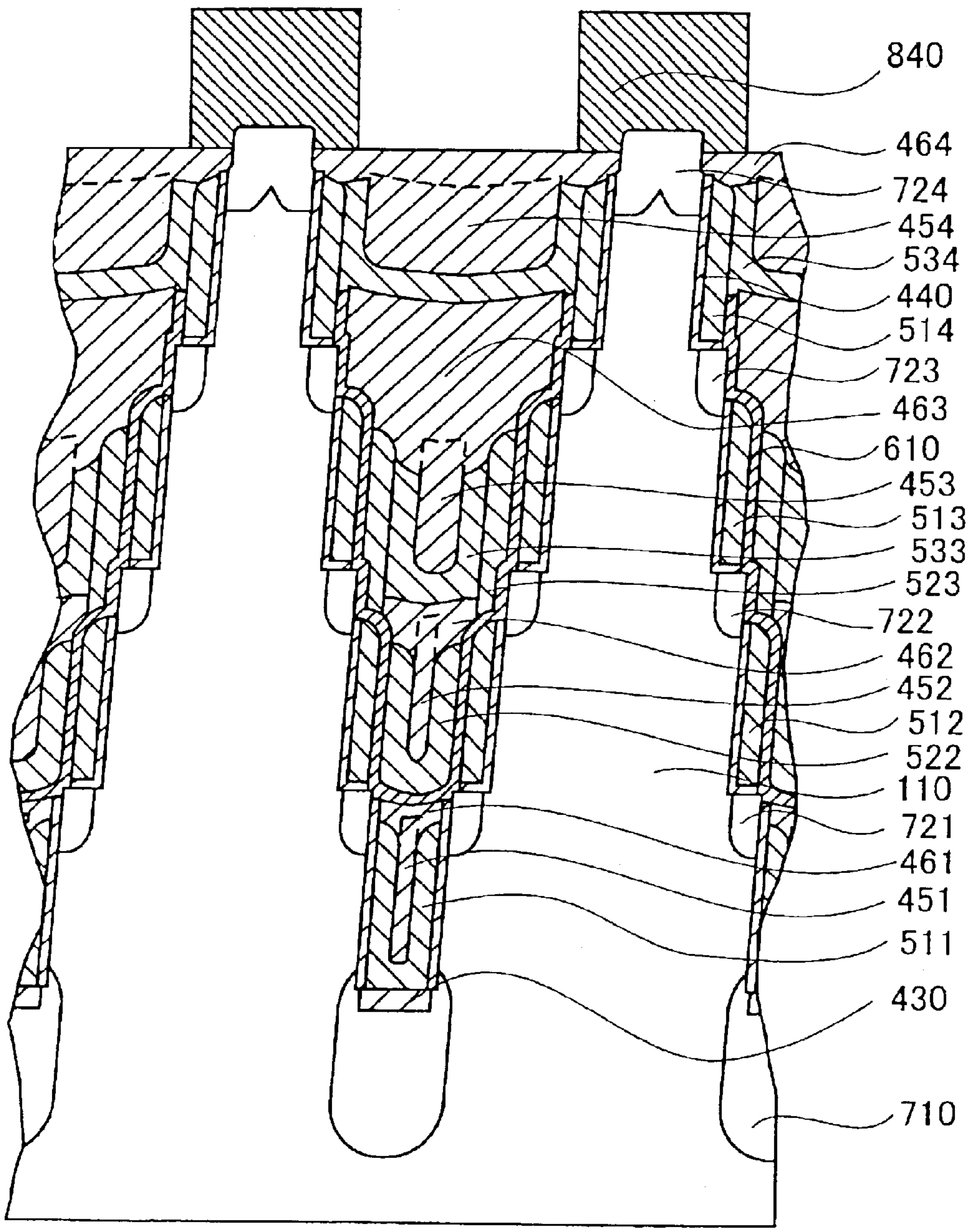
Figure 477:
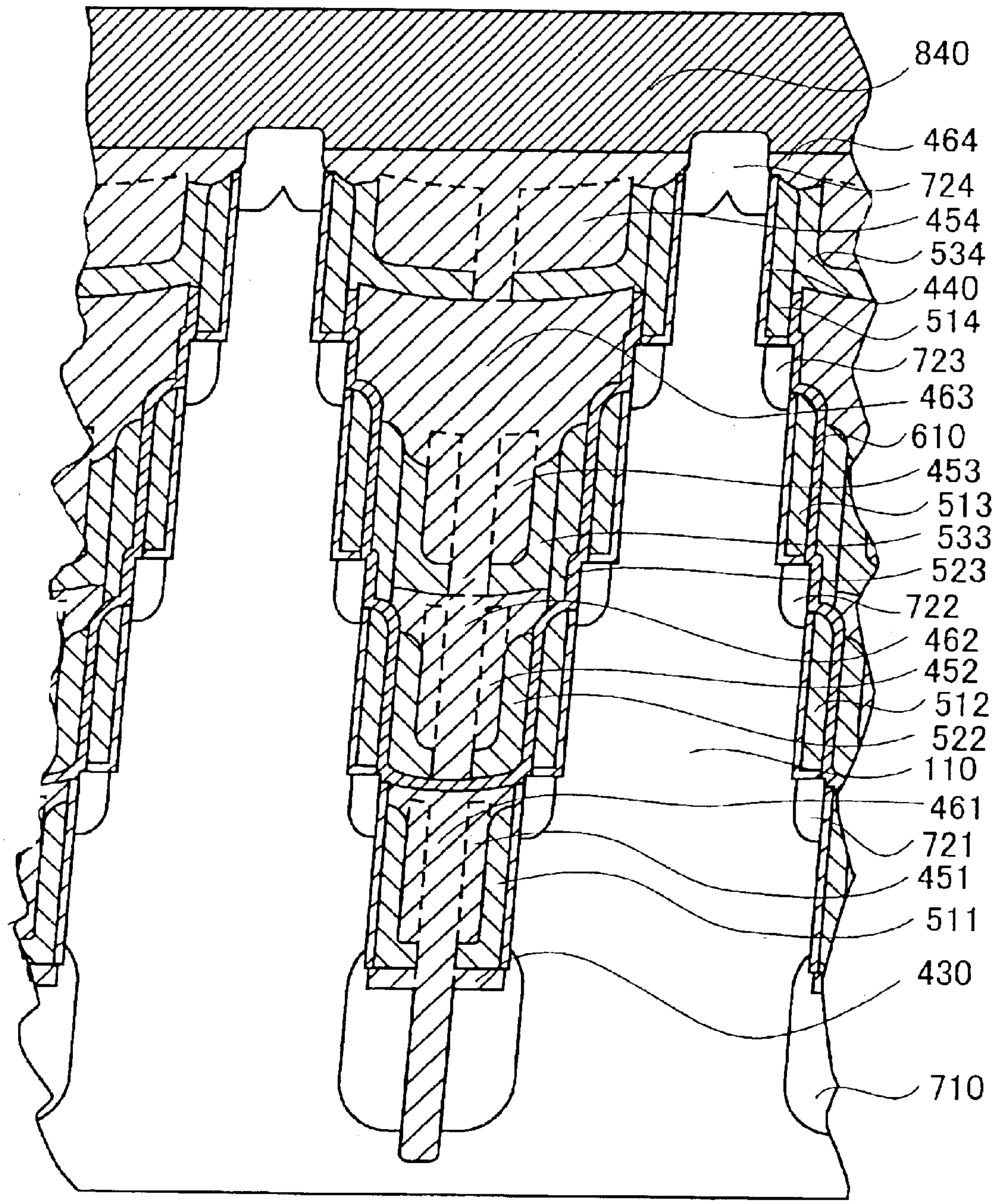

When the island-like semiconductor layer 110 with tiers is formed by a plurality of RIEs, the top tiers and the bottom tiers of the island-like semiconductor layer 110 may be shifted in horizontal position as shown in FIG. 476 and FIG. 477.

Figure 478:
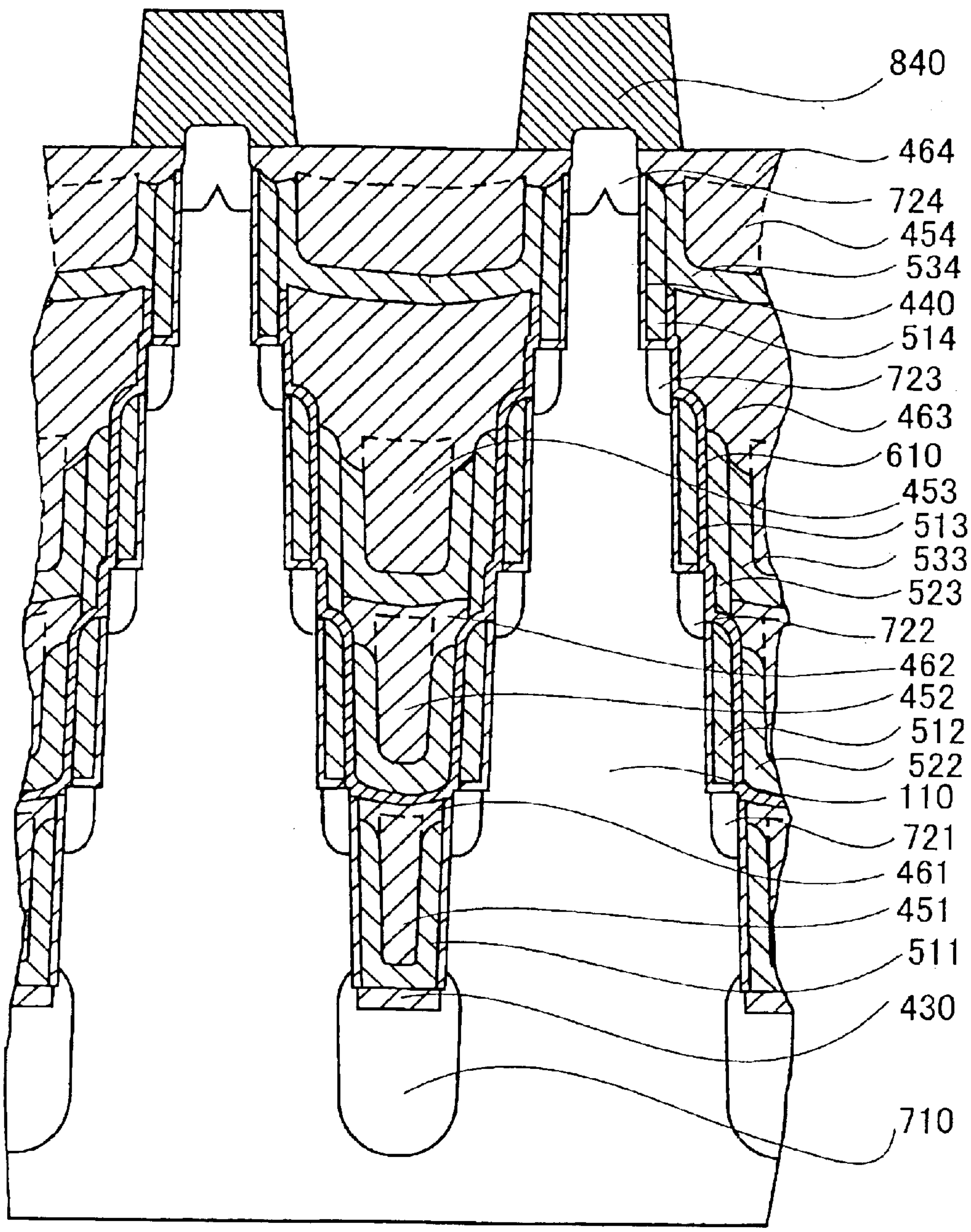
Figure 479:
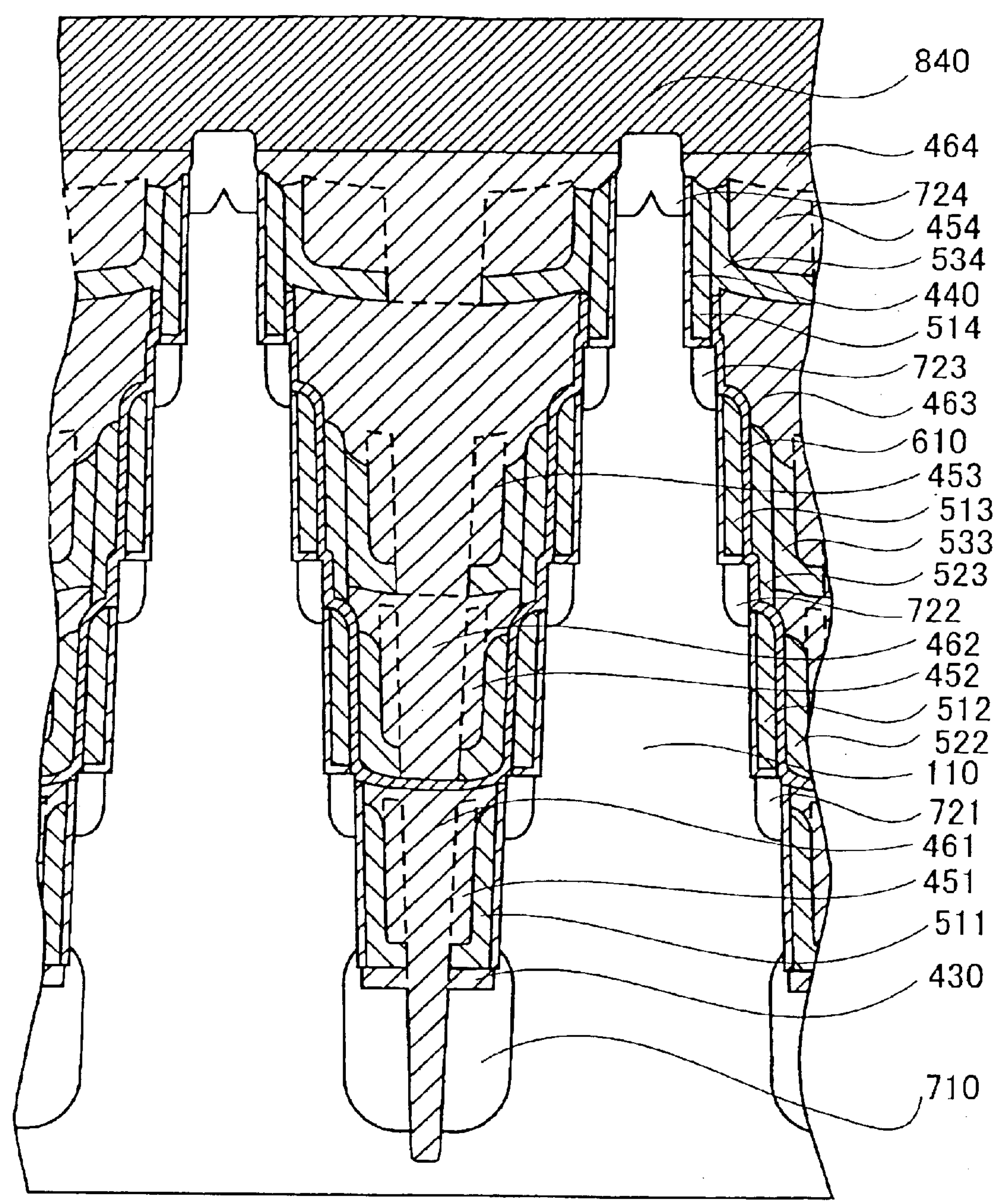

Also as shown in FIG. 478 and FIG. 479, the outward form of each tier may be different at the top and the bottom thereof.

For example, in the case where the island-like semiconductor layer 110 has a circular plan view from the top as shown in FIG. 1, the island-like semiconductor layer 110 has a slant columnar form in FIG. 476 and FIG. 477 and has a conic form in FIG. 478 and FIG. 479.

Figure 480:
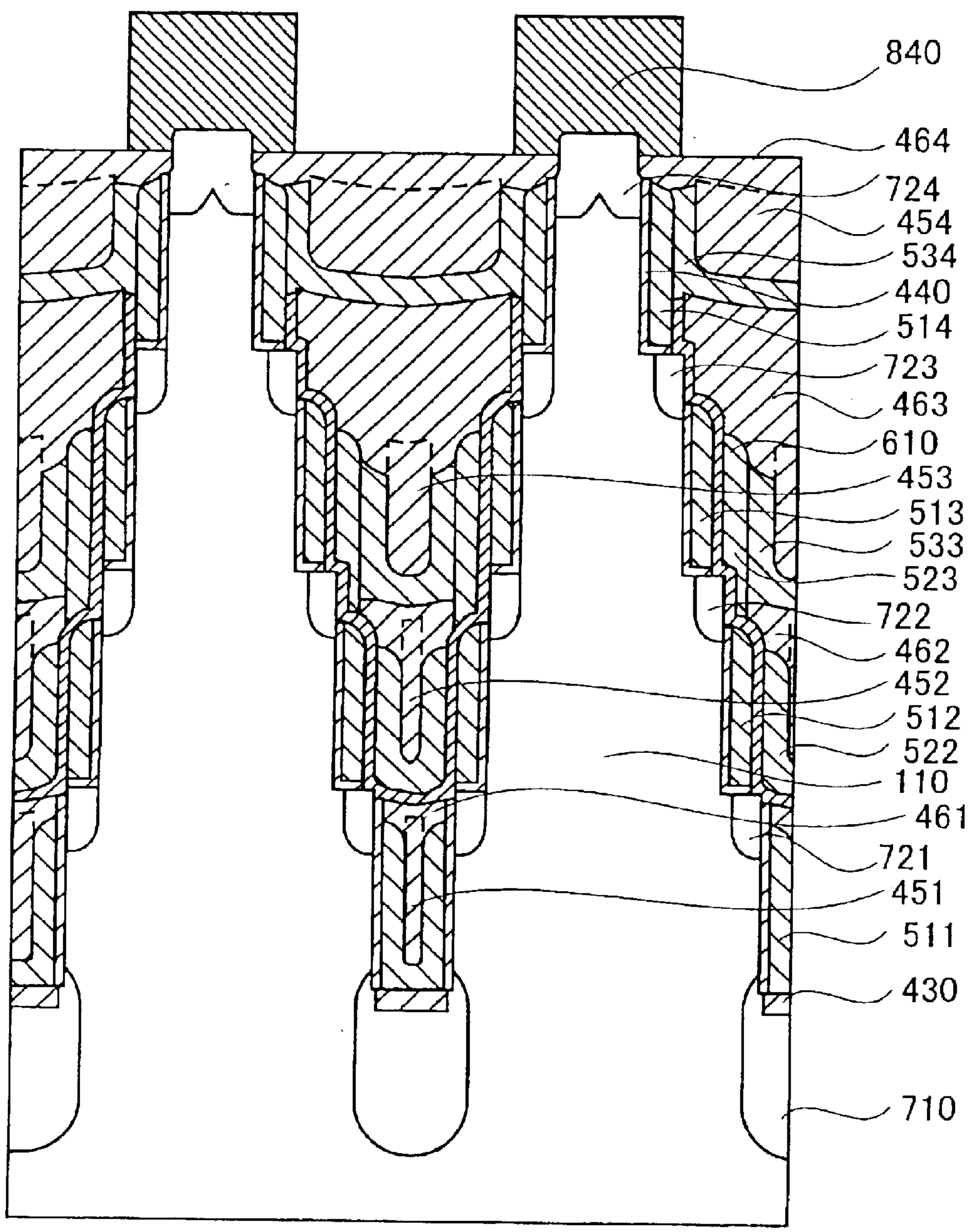
Figure 481:
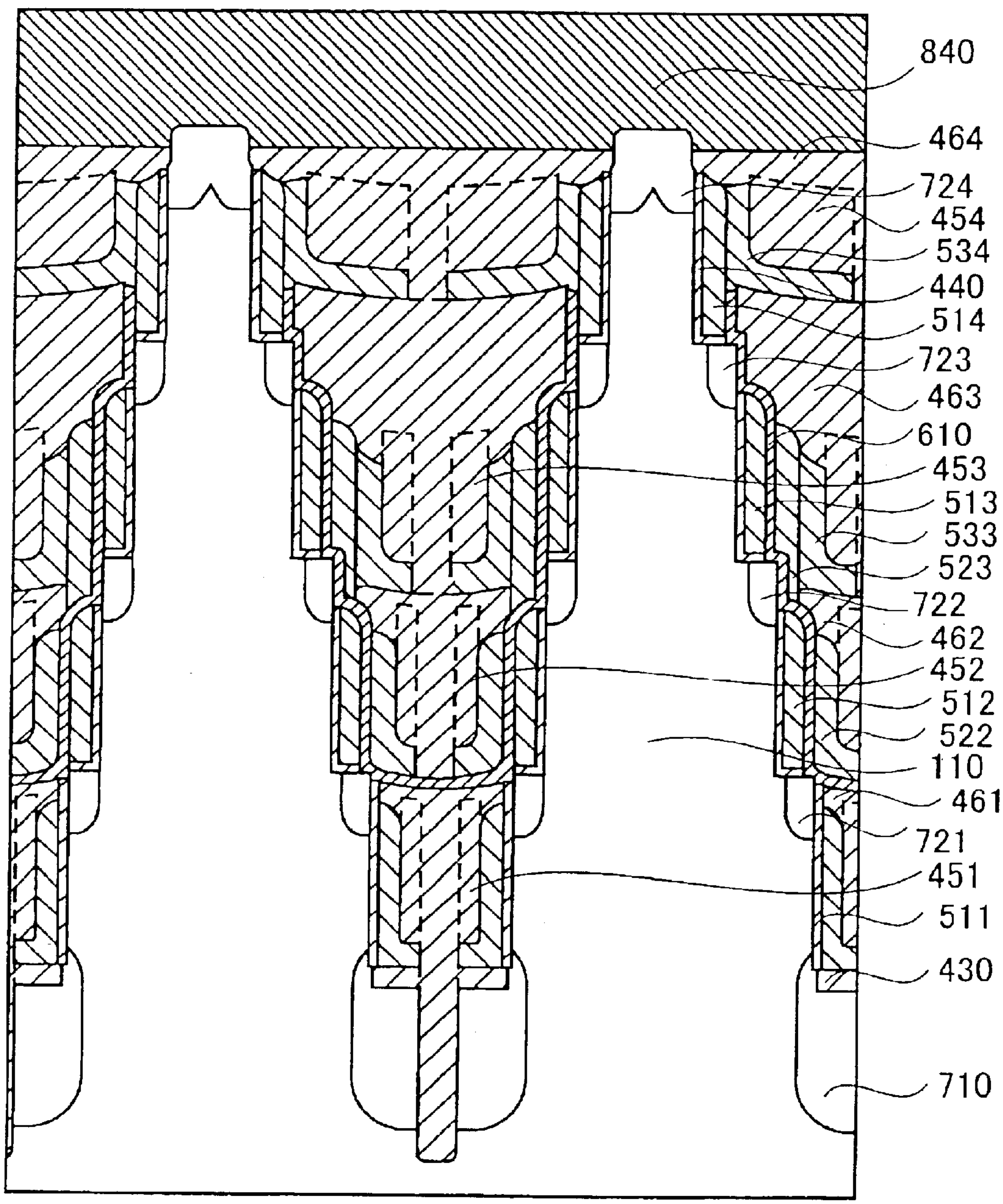

The tiers of the island-like semiconductor layer 110 may have central axes shifted in position. As shown in FIG. 480 and FIG. 481, the central axes may be shifted in one direction or at random.

The shape of the island-like semiconductor layer 110 is not particularly limited provided that the memory cells can be formed in series in the direction vertical to the semiconductor substrate 100.

PRODUCTION EXAMPLE 22

Figure 482:
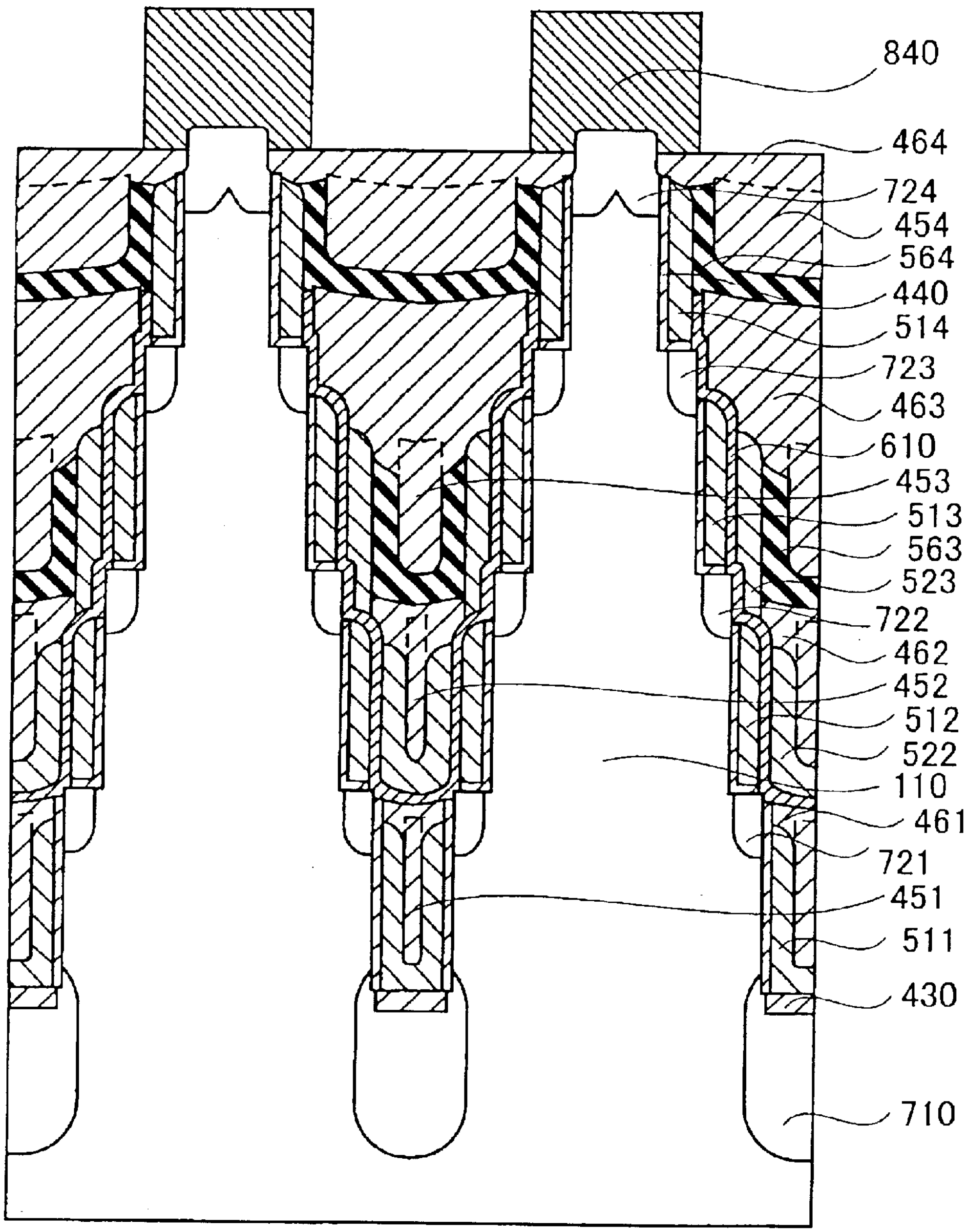
Figure 483:
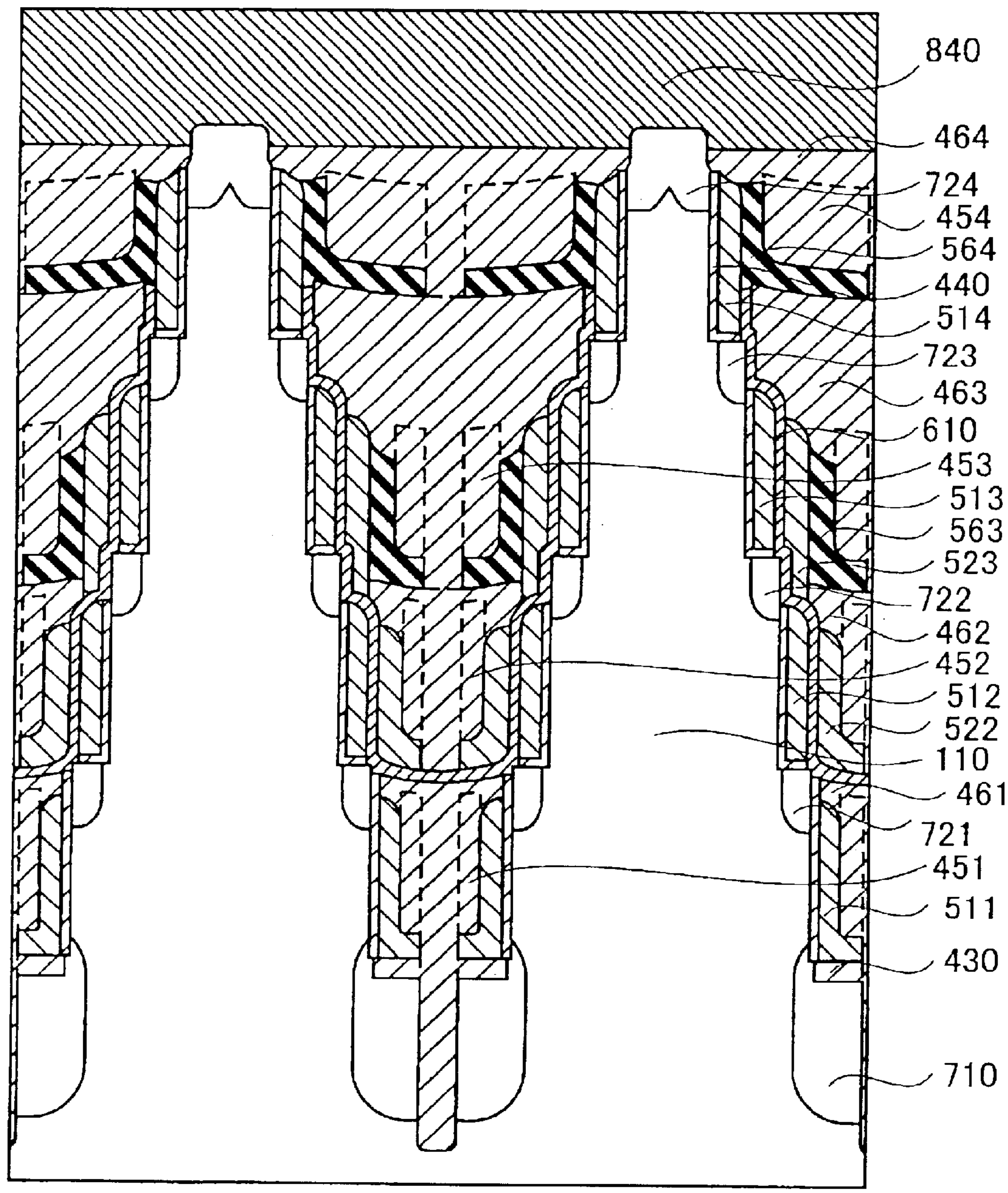

The following shows a production example in which a low-resistant wiring material other than polysilicon is used for electrically connection of the control gates and of the selection gates. FIG. 482 and FIG. 483 are sectional views taken on line A–A' and line B–B', respectively, of FIG. 1 showing a memory cell array of EEPROM.

In this production example, in a semiconductor memory as shown in Production Example 1, instead of the polysilicon films 533 and 534 as the third conductive film, a lower resistant film such as a tungsten film typically used for contacts may be used, or the polysilicon films 533 and 534 may be formed into silicides with titanium, molybdenum, tungsten, cobalt and the like to reduce resistance, as shown in FIG. 482 and FIG. 483. The polysilicon films 511 and 514 as the first conductive films to be the selection gates and the polysilicon films 522 and 523 as the second conductive films to be the control gates may be reduced in resistance in the same manner.

PRODUCTION EXAMPLE 23

Figure 484:
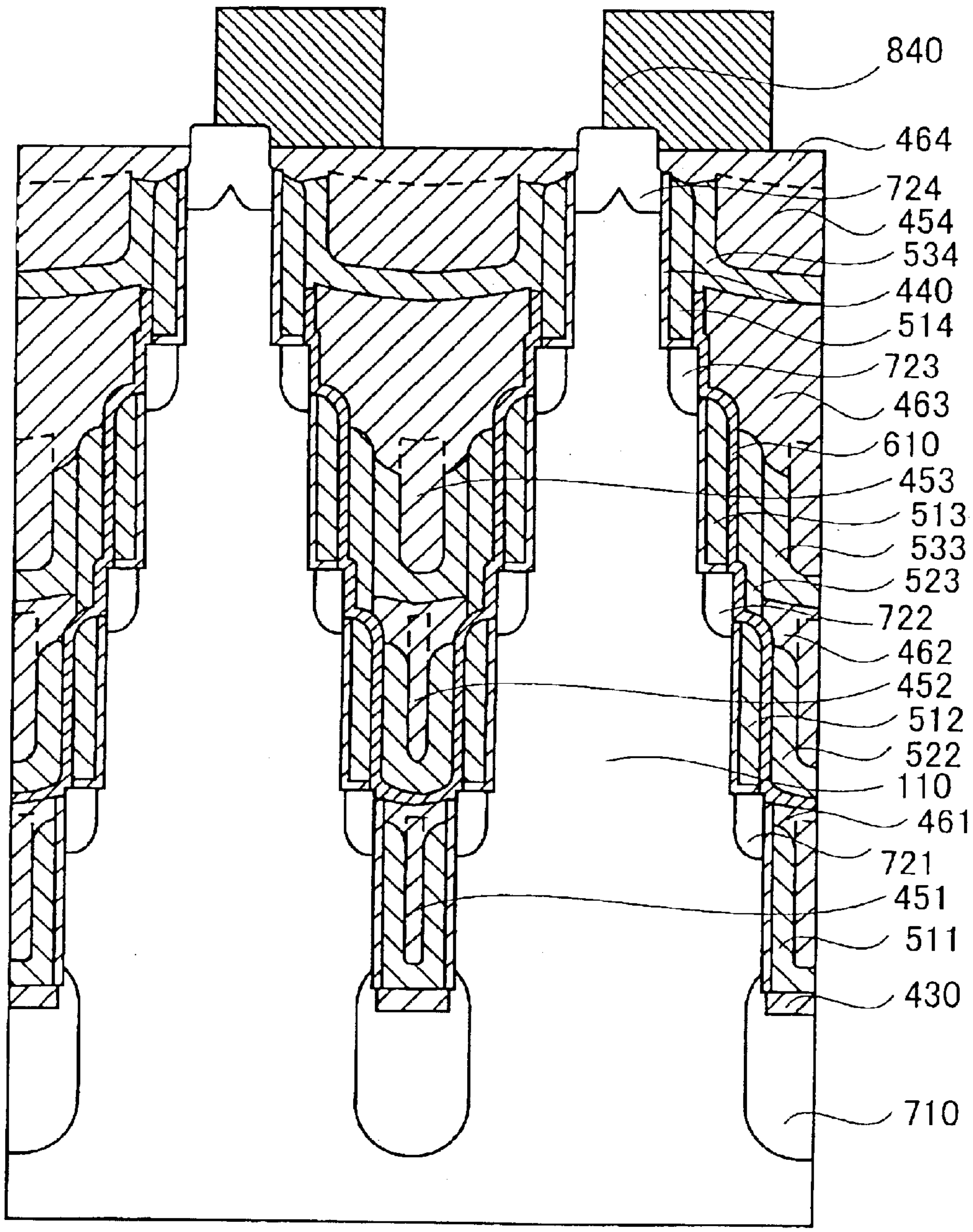
Figure 485:
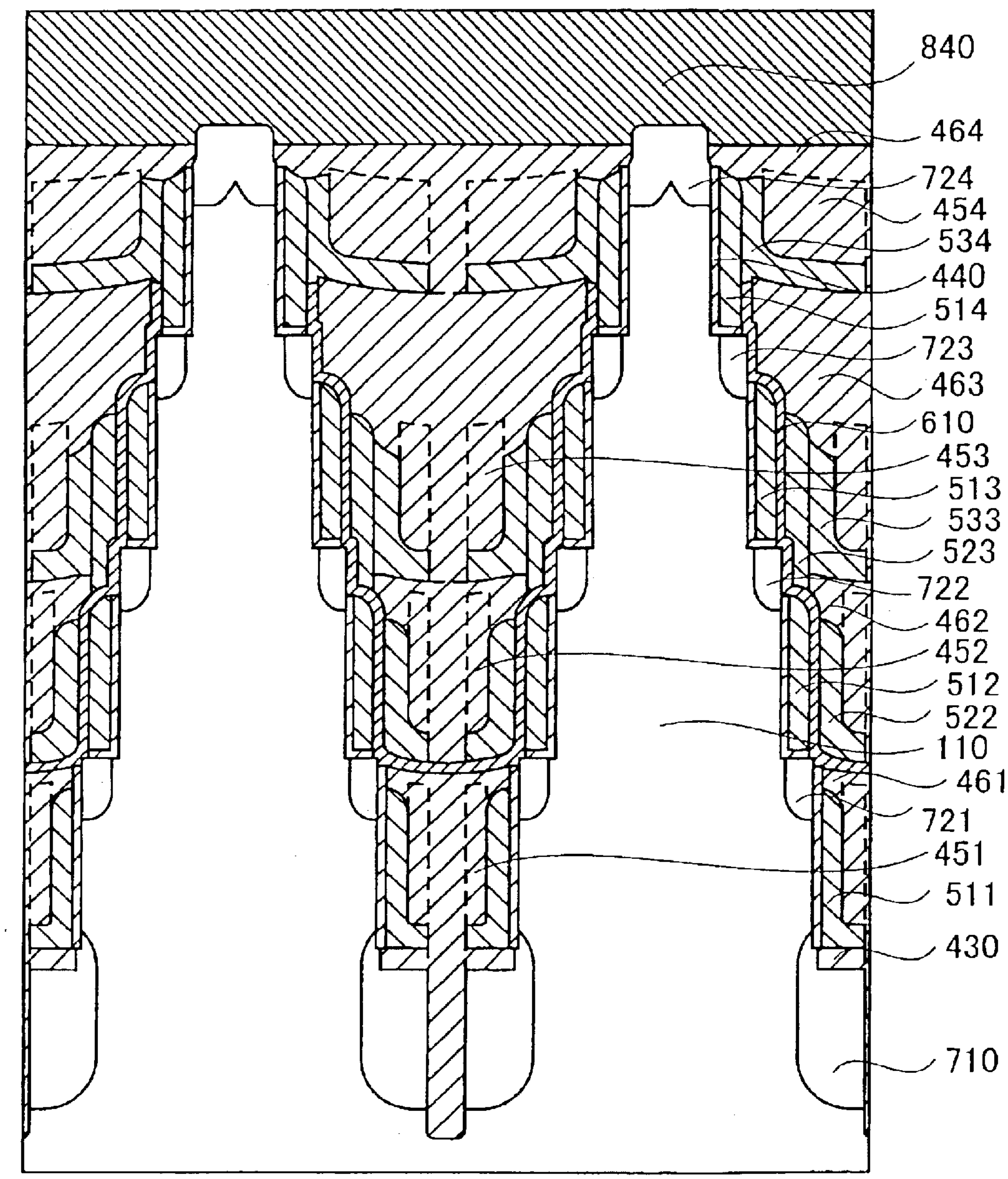

The following shows a production example in which the fourth wiring layer 840 is misaligned with respect to the island-like semiconductor layer 110. FIG. 484 and FIG. 485 are sectional views taken on line A–A' and line B–B', respectively, of FIG. 1 showing a memory cell array of EEPROM.

When the fourth wiring layer 840 is formed to be electrically connected to the island-like semiconductor layer 110, the fourth wiring layer 840 may be aligned with the exposed part of the island-like semiconductor layer 110 or misaligned therewith as shown in FIG. 484 and FIG. 485. The way of connecting the fourth wiring layer is not particularly limited provided that the fourth wiring layer 840 is electrically connected to the impurity diffusion layer 724. Also as shown in FIG. 484 and FIG. 485, the exposed top of the island-like semiconductor layer 110 may not or may be completely covered with the fourth wiring layer 840.

PRODUCTION EXAMPLE 24

The following is a production example in which the seventh insulating films 461 to 464 formed for insulating the second and third wiring layers have different depths in the direction of connecting the second and third wiring layers and in the direction of separating the second and third wiring layers.

FIGS. 486 and 522 and FIGS. 523 and 559 are sectional views taken on line A–A' and line B–B', respectively, of FIG. 1 showing a memory cell array of EEPROM.

Figure 486:
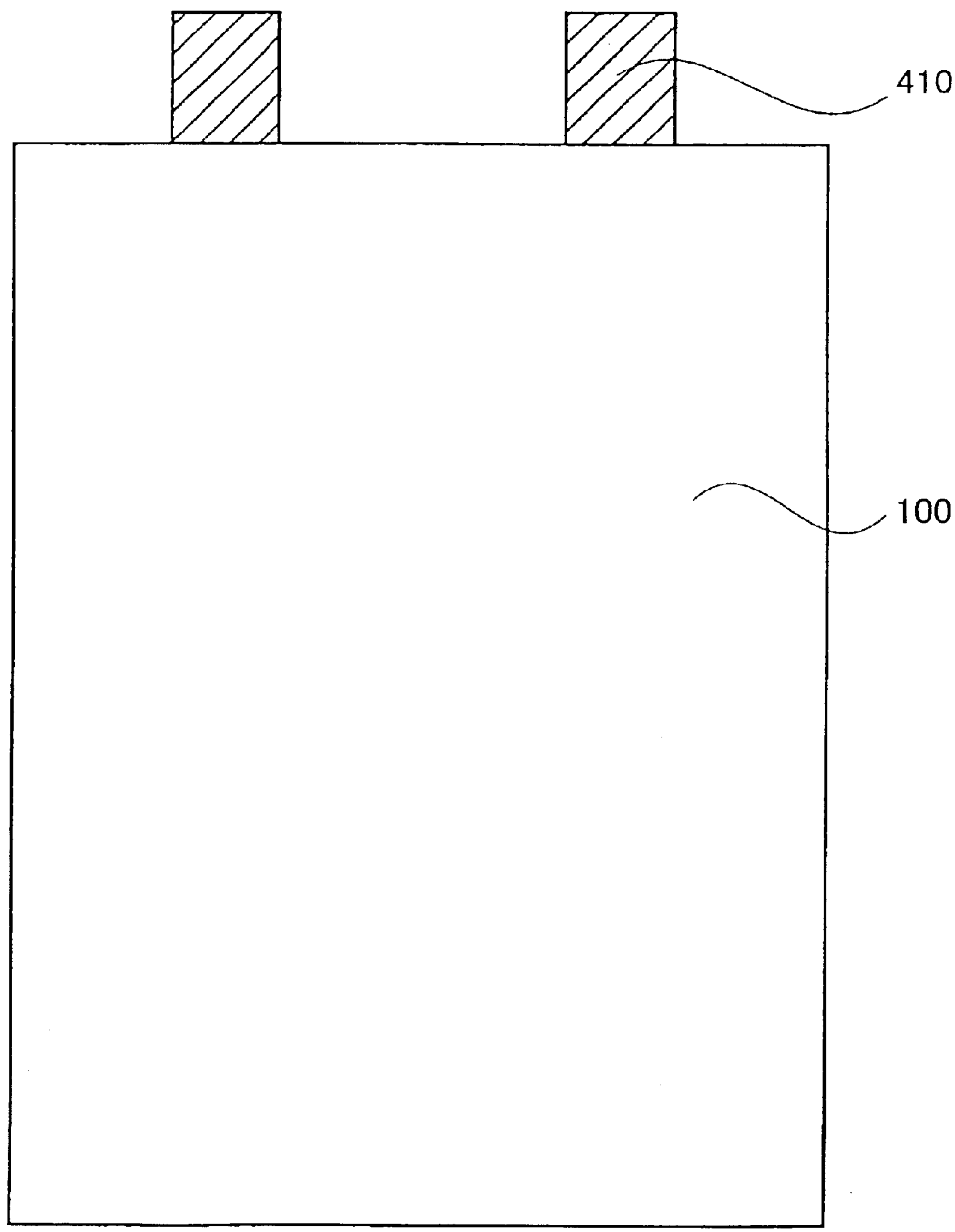
Figure 523:
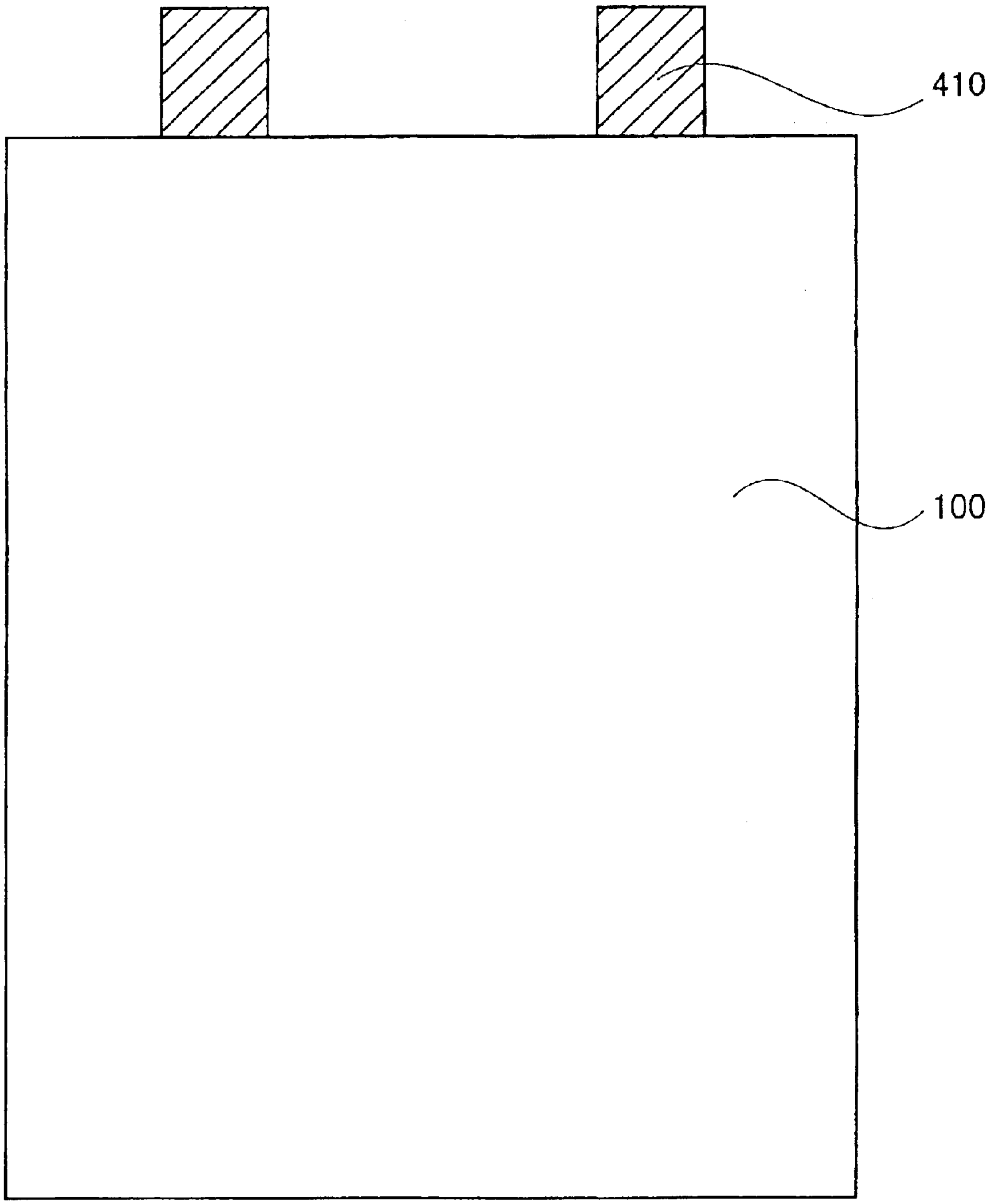

First, a silicon oxide film 410 is deposited to 200 to 2000 nm as a first insulating film to be a mask layer on the surface of a p-type silicon substrate 100 as a semiconductor substrate. Using as a mask a resist film R1 patterned by a known photolithography technique, the silicon oxide film 410 is etched by reactive ion etching (FIG. 486 and FIG. 523). The silicon oxide film 410 may be, for example, a silicon nitride film, a conductive film, a laminate film of two or more kinds of materials, or any material that cannot be etched or exhibits a lower etch rate when the p-type silicon substrate 100 is etched by RIE.

Figure 487:
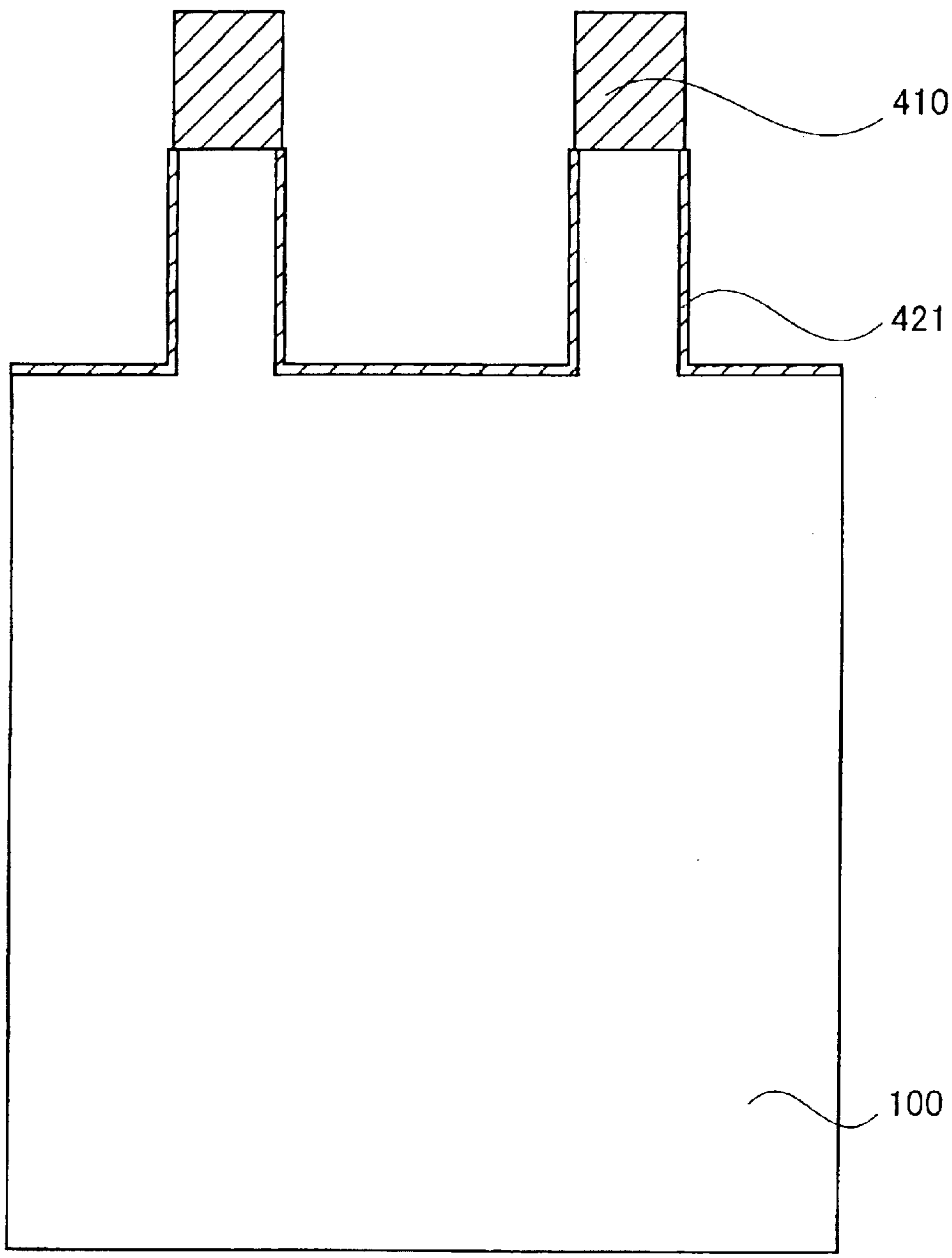
Figure 524:
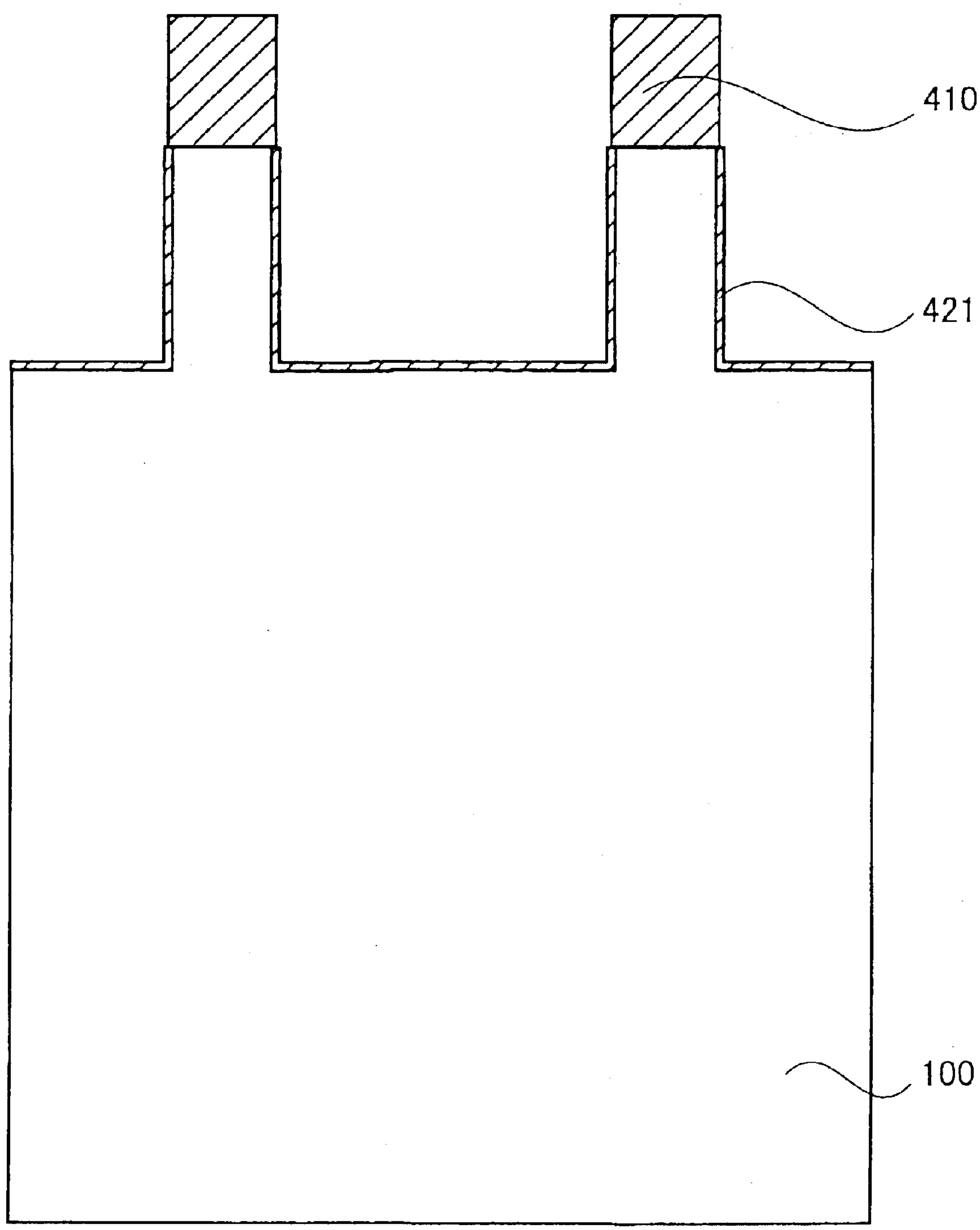
Figure 525:
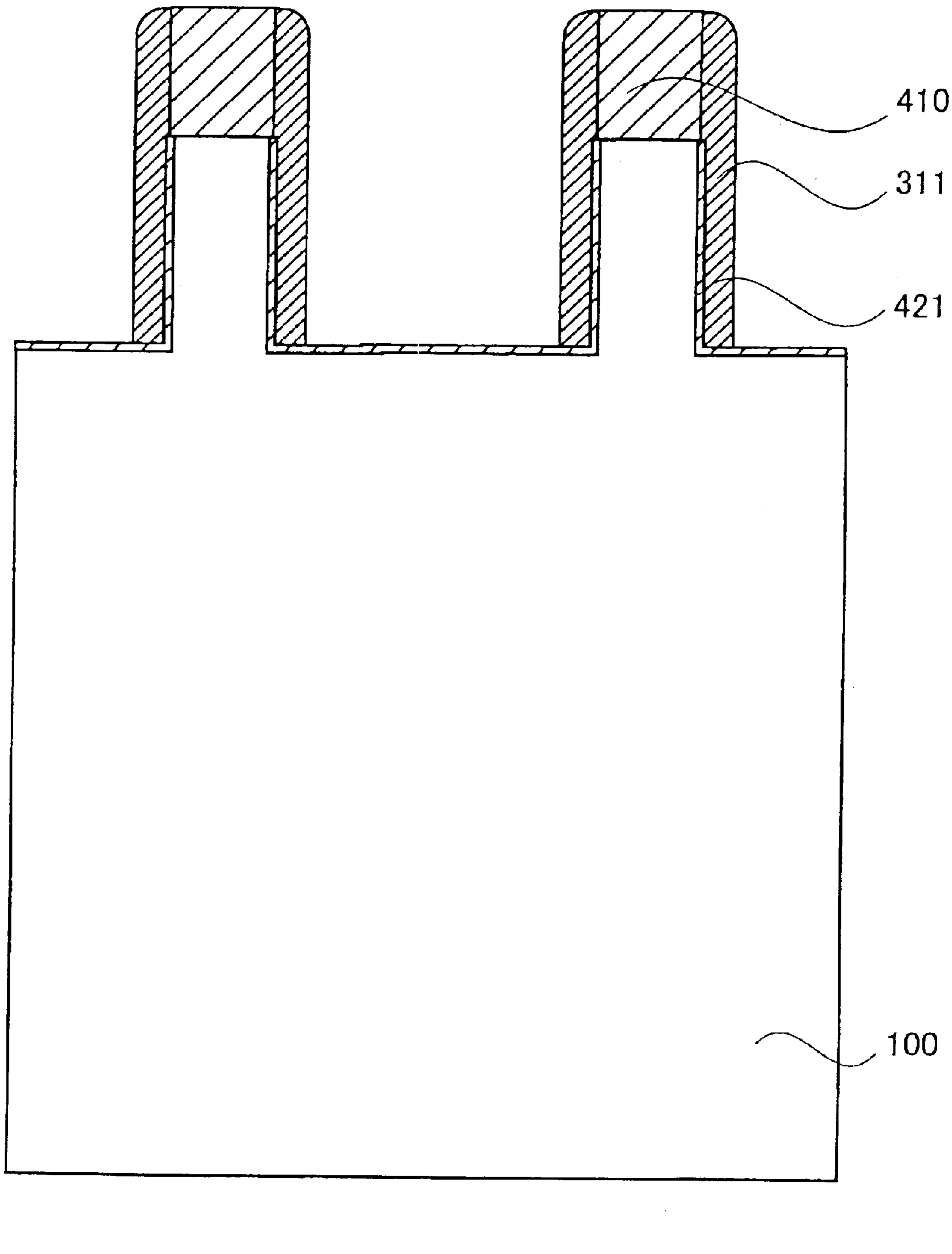

Using the silicon oxide film 410 as a mask, the p-type silicon substrate 100 is etched 50 to 5000 nm by RIE. Thereafter an exposed part of the p-type silicon substrate 100 is thermally oxidized to form a second insulating film, for example, a silicon oxide film 421 of 5 to 100 nm thickness (FIG. 487 and FIG. 524).

Figure 488:
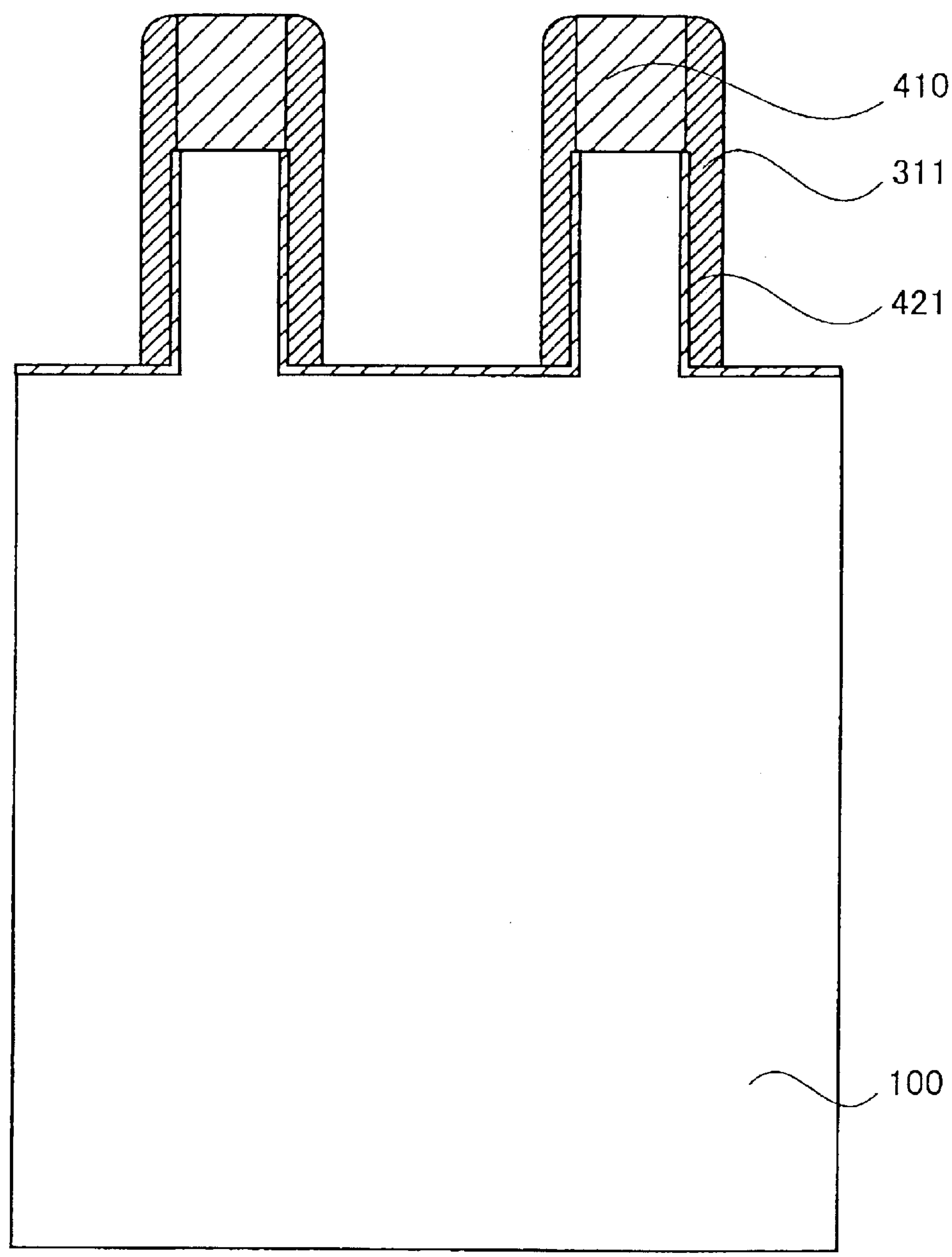

Next, a silicon nitride film 311, for example, is deposited to 10 to 1000 nm as a third insulating film, and then is anisotropically etched in the form of sidewalls on sidewalls of the silicon oxide film 410 and the p-type silicon substrate 100 patterned in the columnar form with intervention of the silicon oxide film 421 (FIG. 488 and FIG. 523).

Subsequently, using as a mask the silicon nitride film 311 formed in the sidewalls, the silicon oxide film 421 is etched away by RIE, and then, the exposed p-type silicon substrate 100 is etched 50 to 5000 nm. Thereby, the p-type silicon substrate 100 is patterned into the form of columns each having a step.

Figure 489:
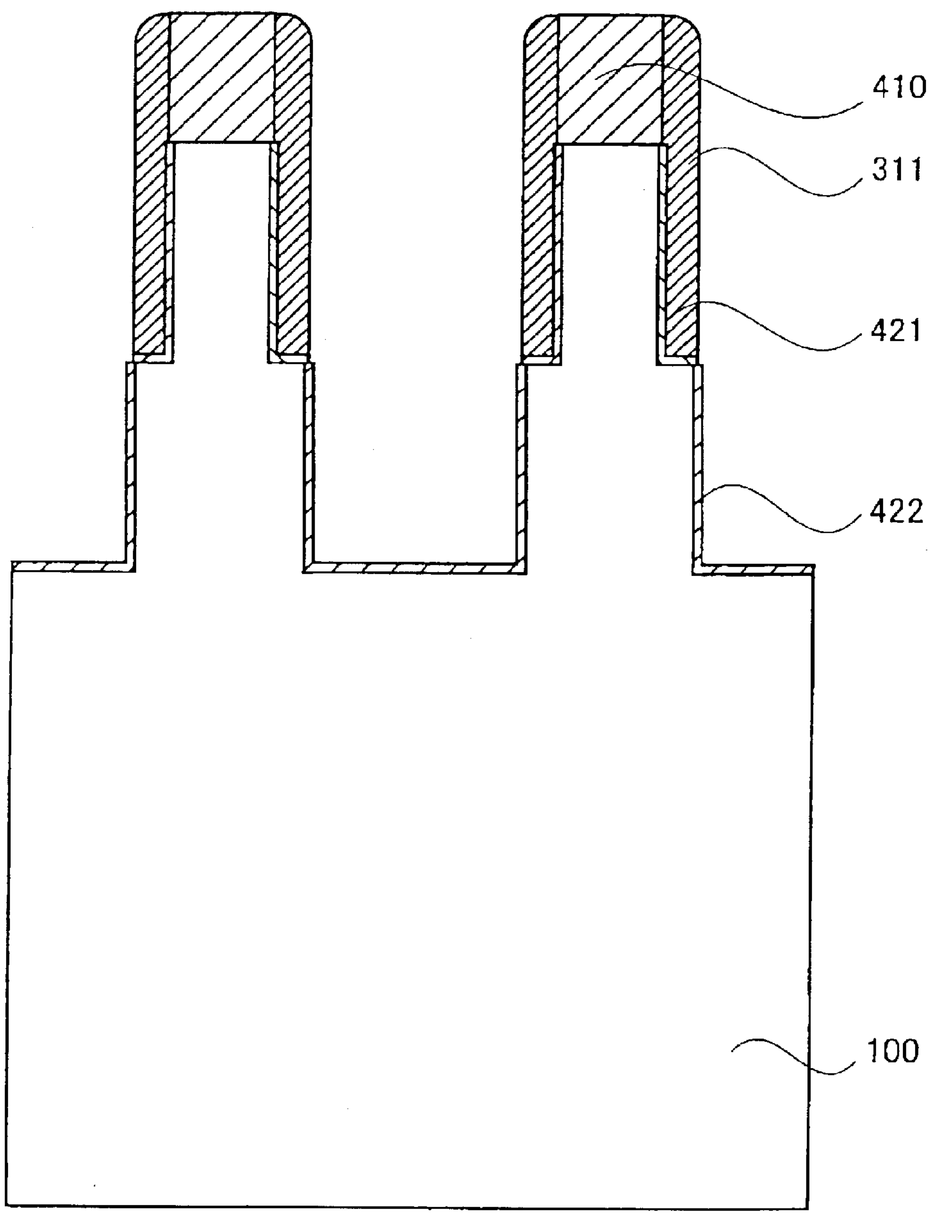
Figure 526:
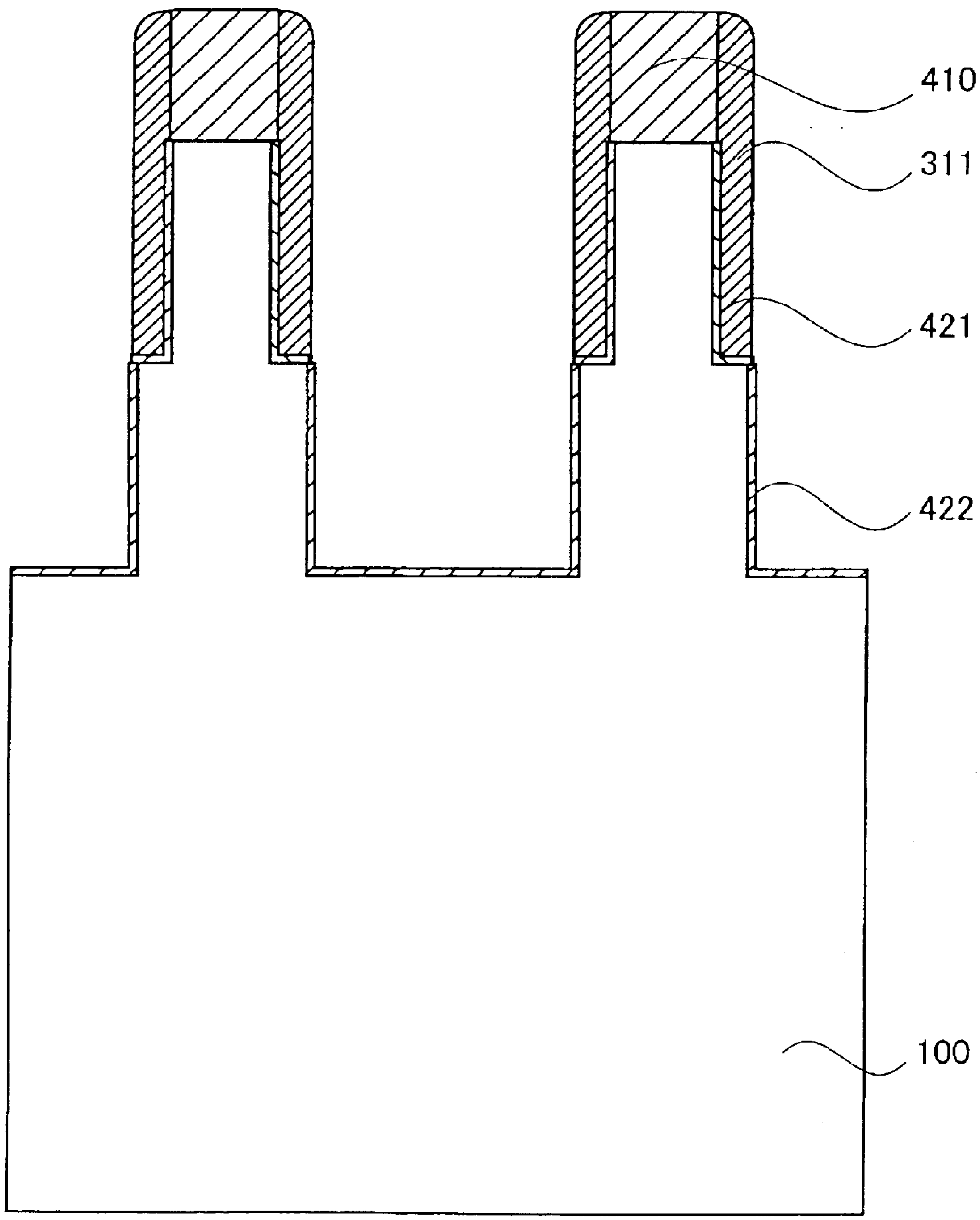

Thereafter, an exposed part of the p-type silicon substrate 100 is thermally oxidized to form a second insulating film, for example, a silicon oxide film 422 of 5 to 100 nm thickness (FIG. 489 and FIG. 526).

A silicon nitride film 312, for example, is deposited to 10 to 1000 nm as a third insulating film, and then is anisotropically etched in the form of sidewalls on sidewalls of the silicon oxide film 410, the silicon nitride film 311 and the p-type silicon substrate 100 patterned in the columnar form having the step with intervention of the silicon oxide film 422.

Subsequently, using as a mask the silicon nitride film 312 formed in the sidewalls, the silicon oxide film 422 is etched away by RIE, and then, the exposed p-type silicon substrate 100 is etched 50 to 5000 nm. Thereby, the p-type silicon substrate 100 is patterned into the form of columns each having two steps.

Figure 490:
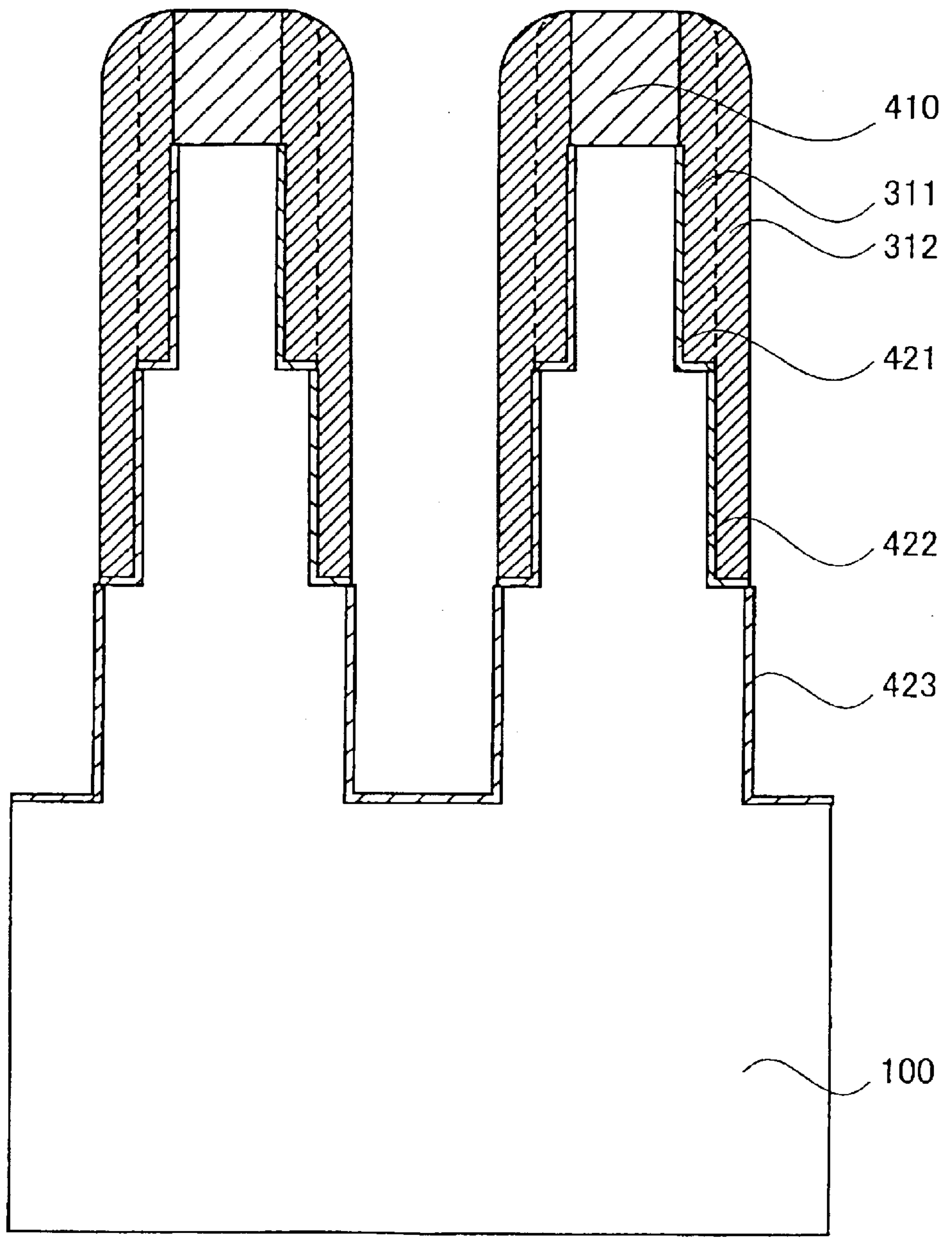
Figure 527:
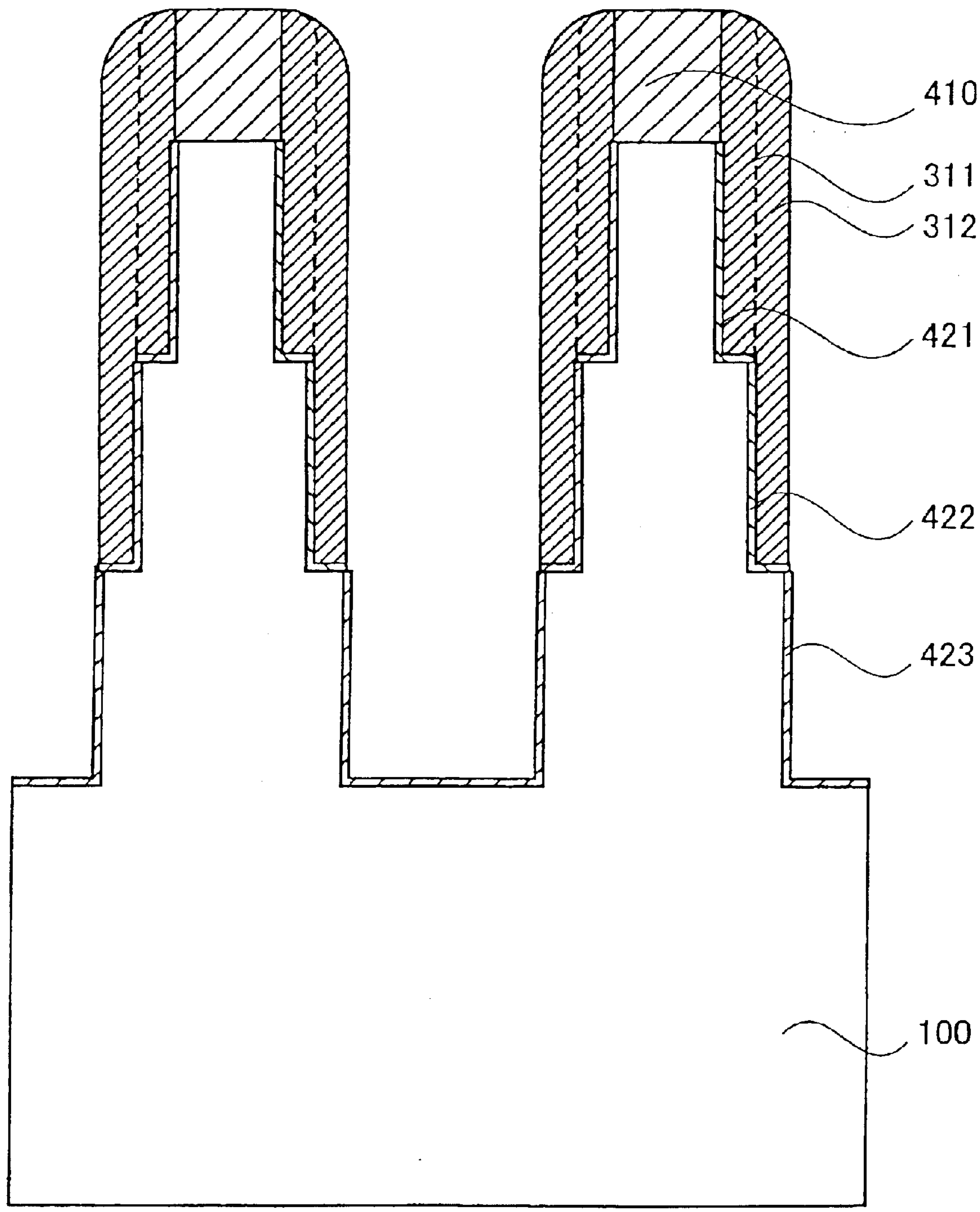

Thereafter, an exposed part of the p-type silicon substrate 100 is thermally oxidized to form a second insulating film, for example, a silicon oxide film 423 of 5 to 100 nm thickness (FIG. 490 and FIG. 527).

Next, a silicon nitride film 313, for example, is deposited to 10 to 1000 nm as a third insulating film, and then is anisotropically etched in the form of sidewalls on sidewalls of the silicon oxide film 410, the silicon nitride film 312 and the p-type silicon substrate 100 patterned in the columnar form having the two steps with intervention of the silicon oxide film 423.

Subsequently, using as a mask the silicon nitride film 313 formed in the sidewalls, the silicon oxide film 423 is etched away by RIE, and then, the exposed p-type silicon substrate 100 is etched 50 to 5000 nm. Thereby, the p-type silicon substrate 100 is patterned into the form of columns each having three steps.

Figure 491:
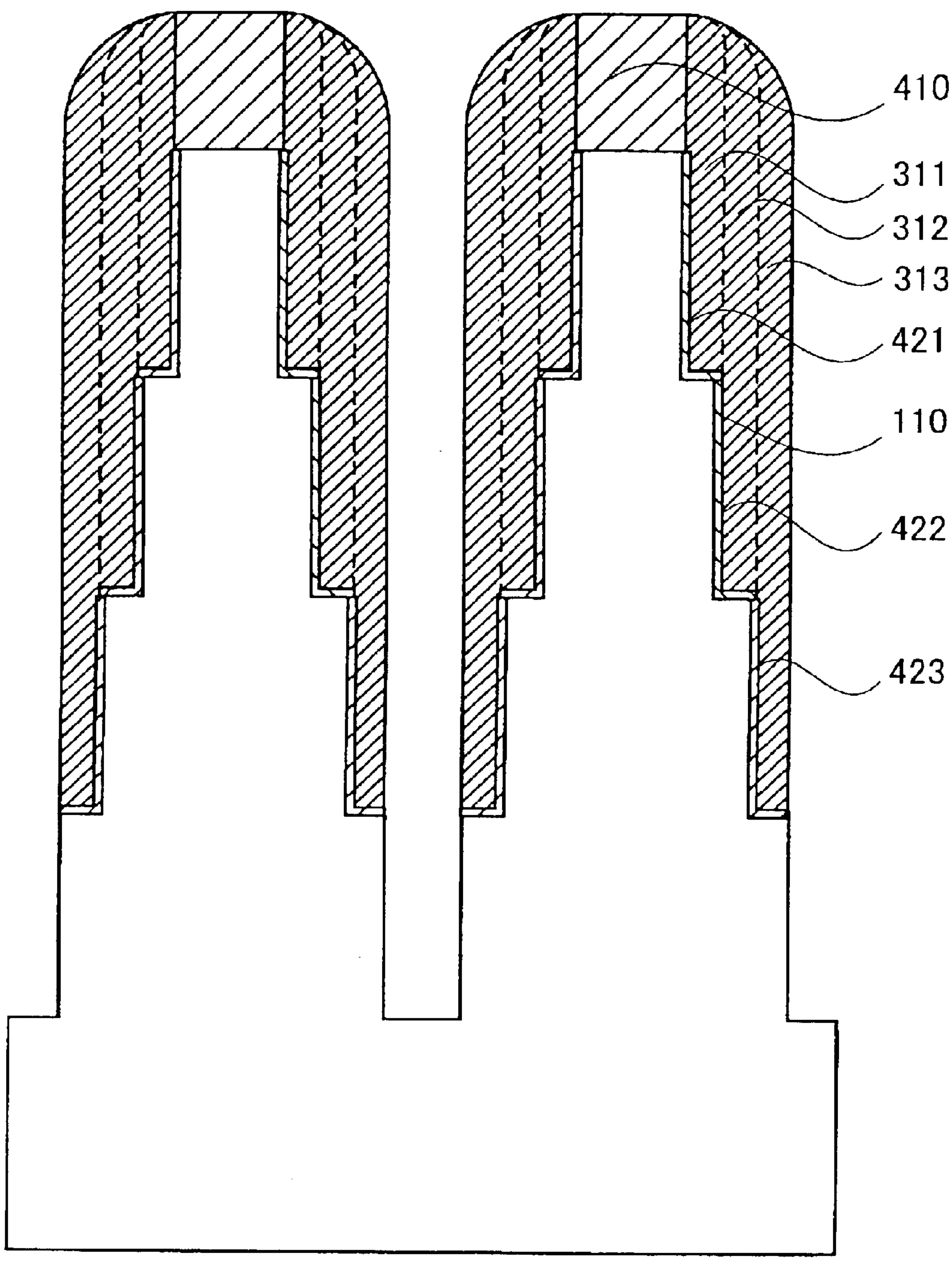
Figure 528:
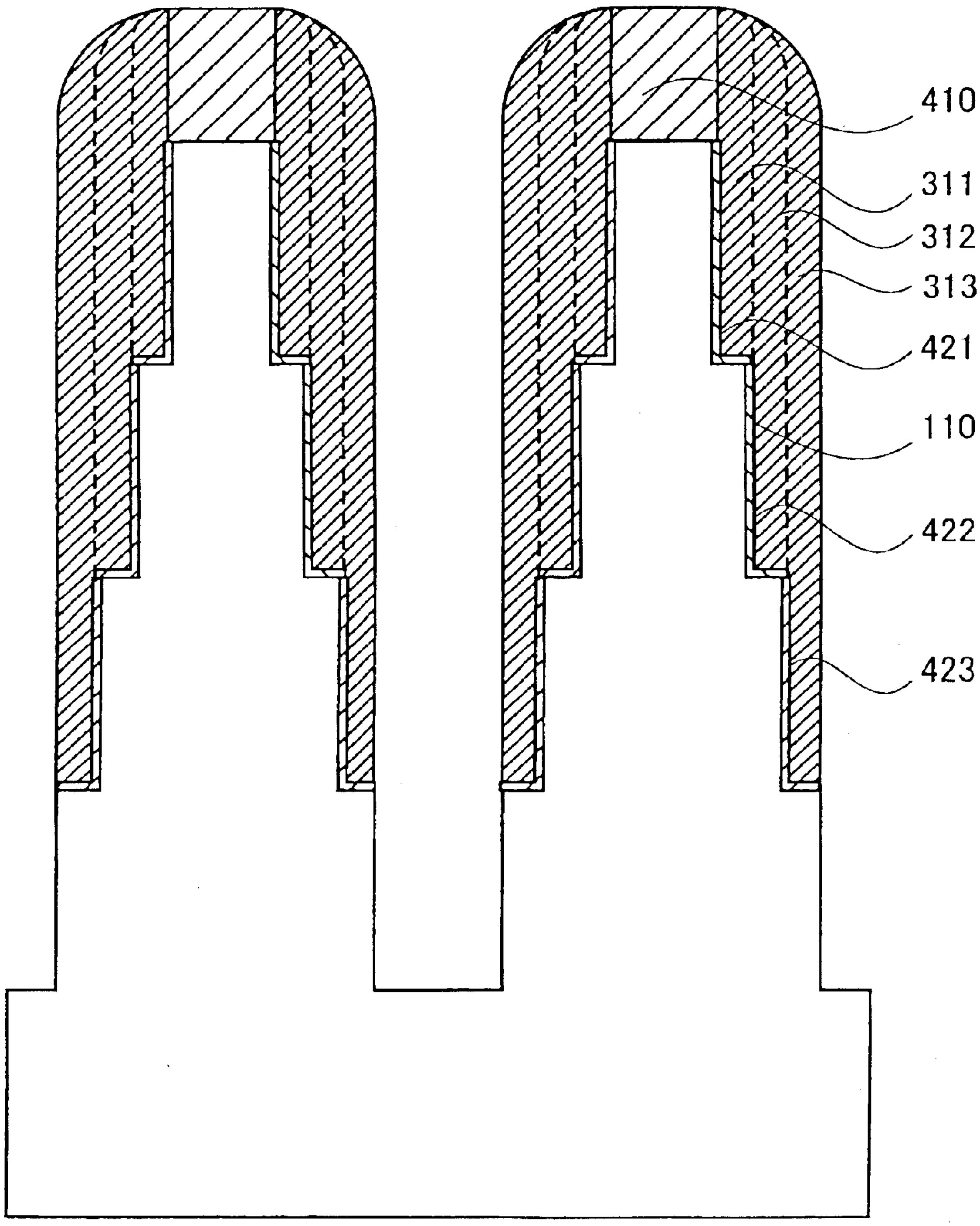

By the above-described process, the p-type silicon substrate 100 is separated into a plurality of columnar island-like semiconductor layers 110 each having the steps (FIG. 491 and FIG. 528).

Figure 492:
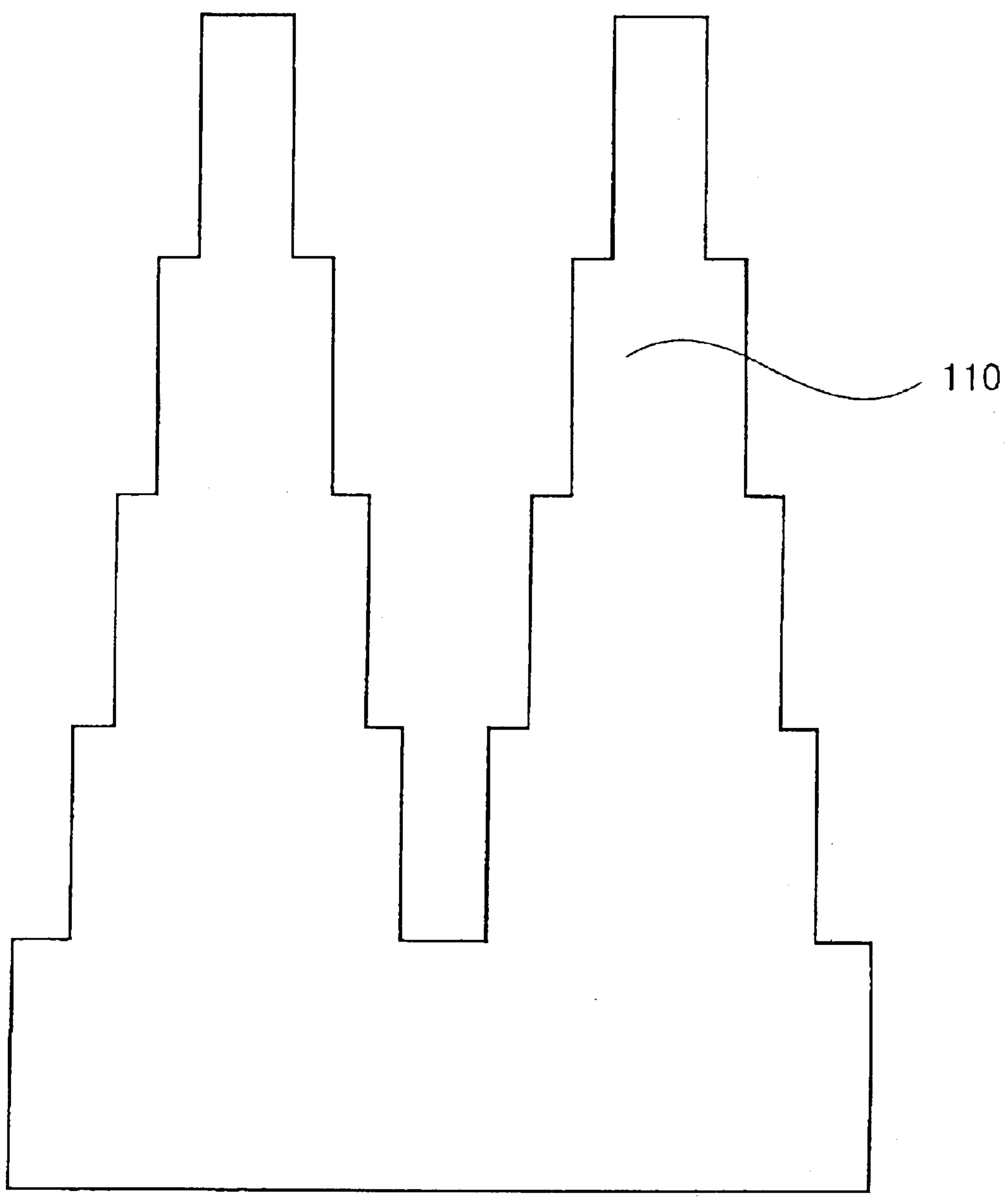
Figure 529:
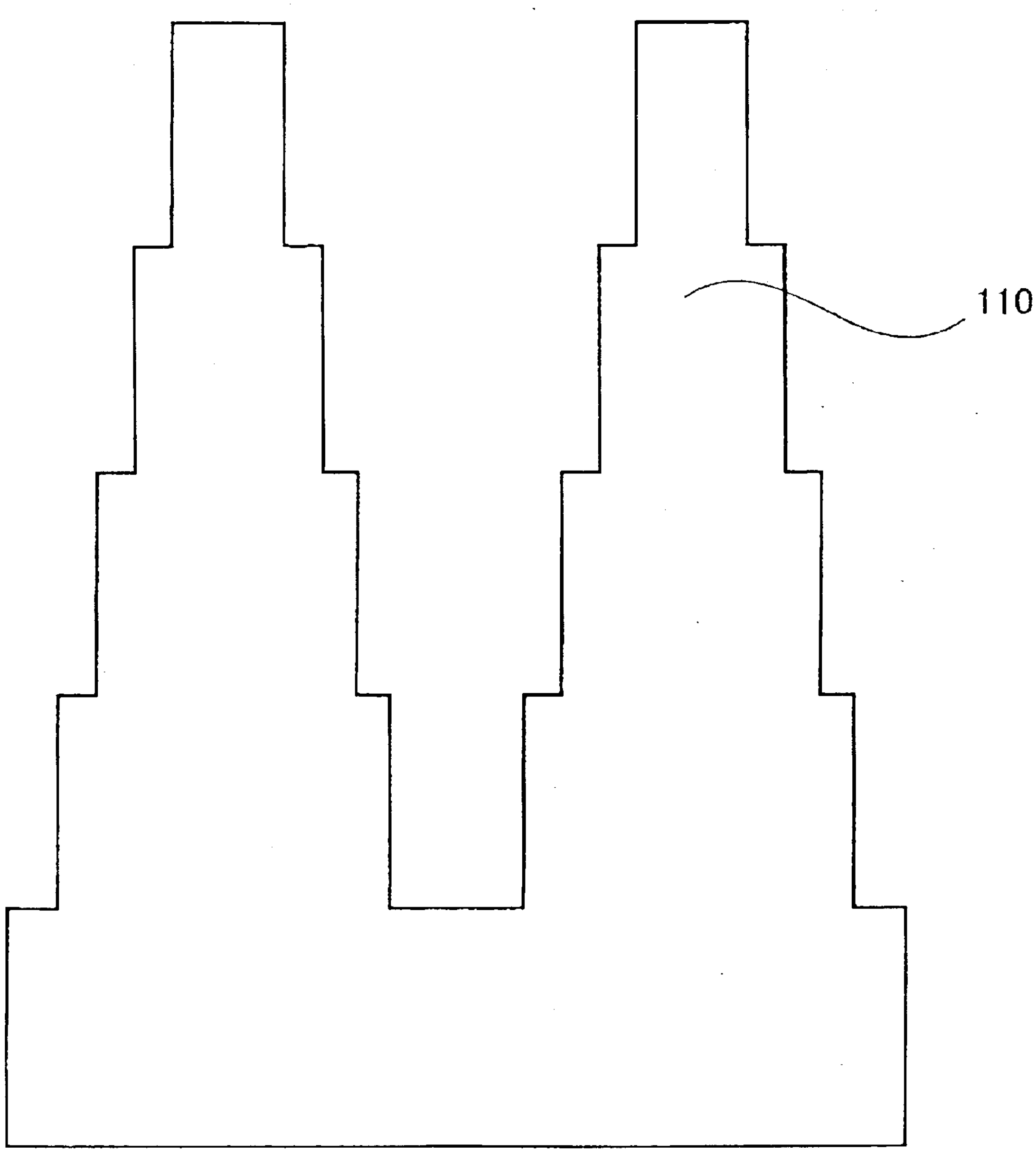

Subsequently, the silicon nitride film and the silicon oxide film are selectively etched away (FIG. 492 and FIG. 529).

Figure 493:
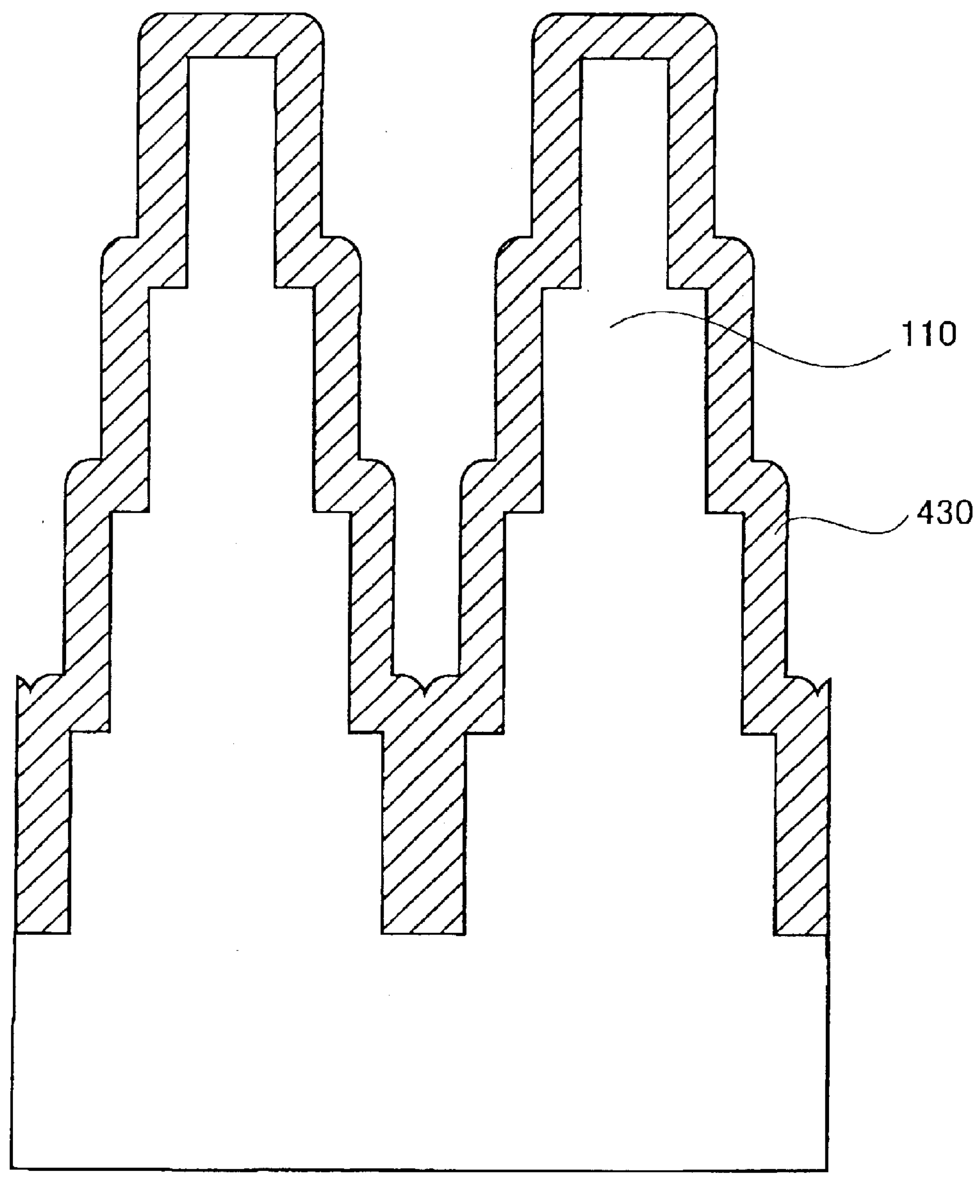
Figure 530:
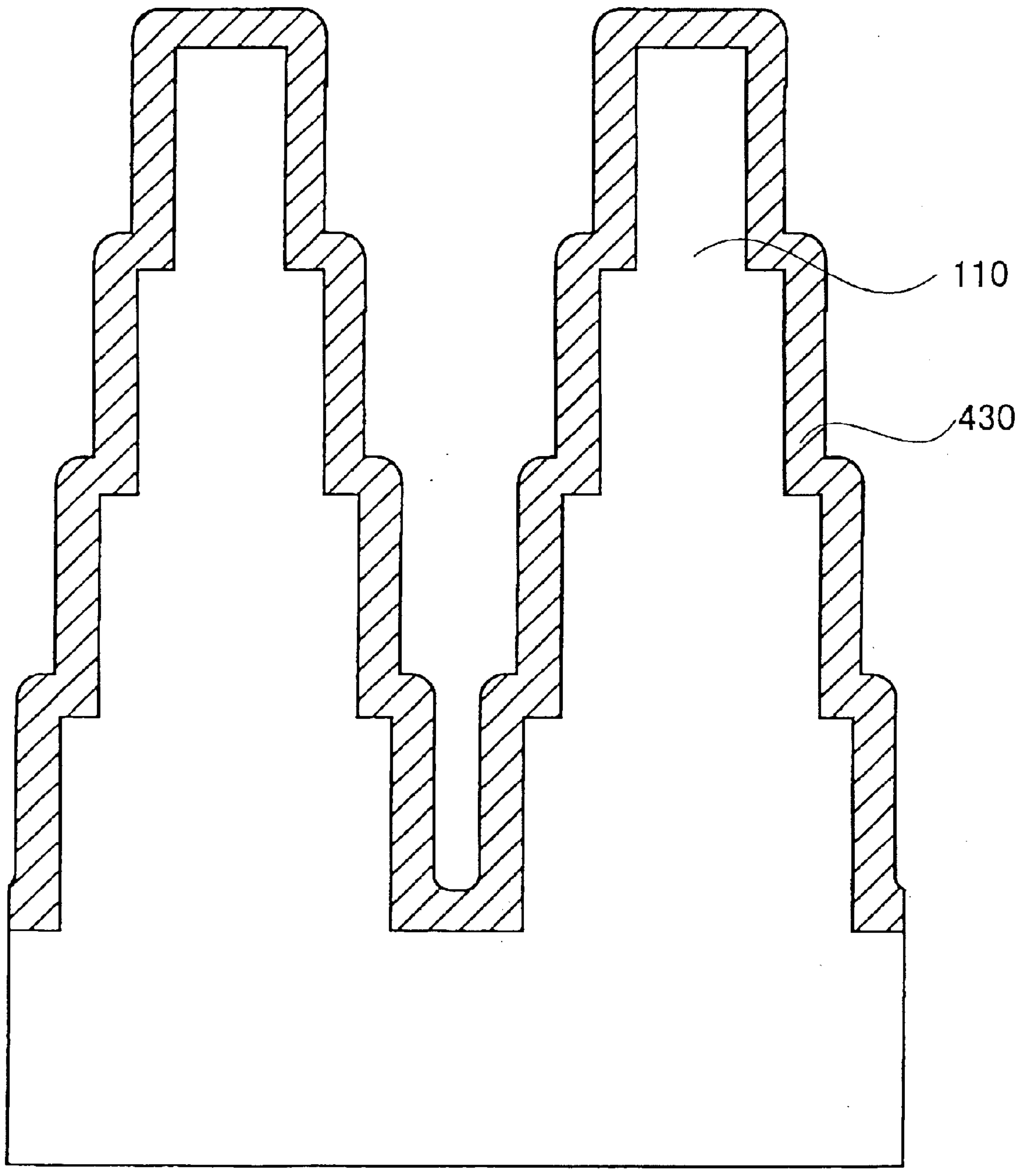

The surface of the island-like semiconductor layer 110 is oxidized to form a fourth insulating film, for example, a silicon oxide film 430 with a thickness of 10 to 100 nm (FIG. 493 and FIG. 530). At this time, if the uppermost tier of the island-like semiconductor layer 110 is formed to have a diameter of the minimum patterning dimensions, the diameter of the uppermost tier of the island-like semiconductor layer 110 is reduced to the minimum patterning dimensions or less by the formation of the silicon oxide film 430.

As shown in FIG. 493, the lowermost tiers may or may not be blocked by the silicon oxide film 430 in direction A–A' of FIG. 1 and also in direction B–B' of FIG. 1.

Figure 494:
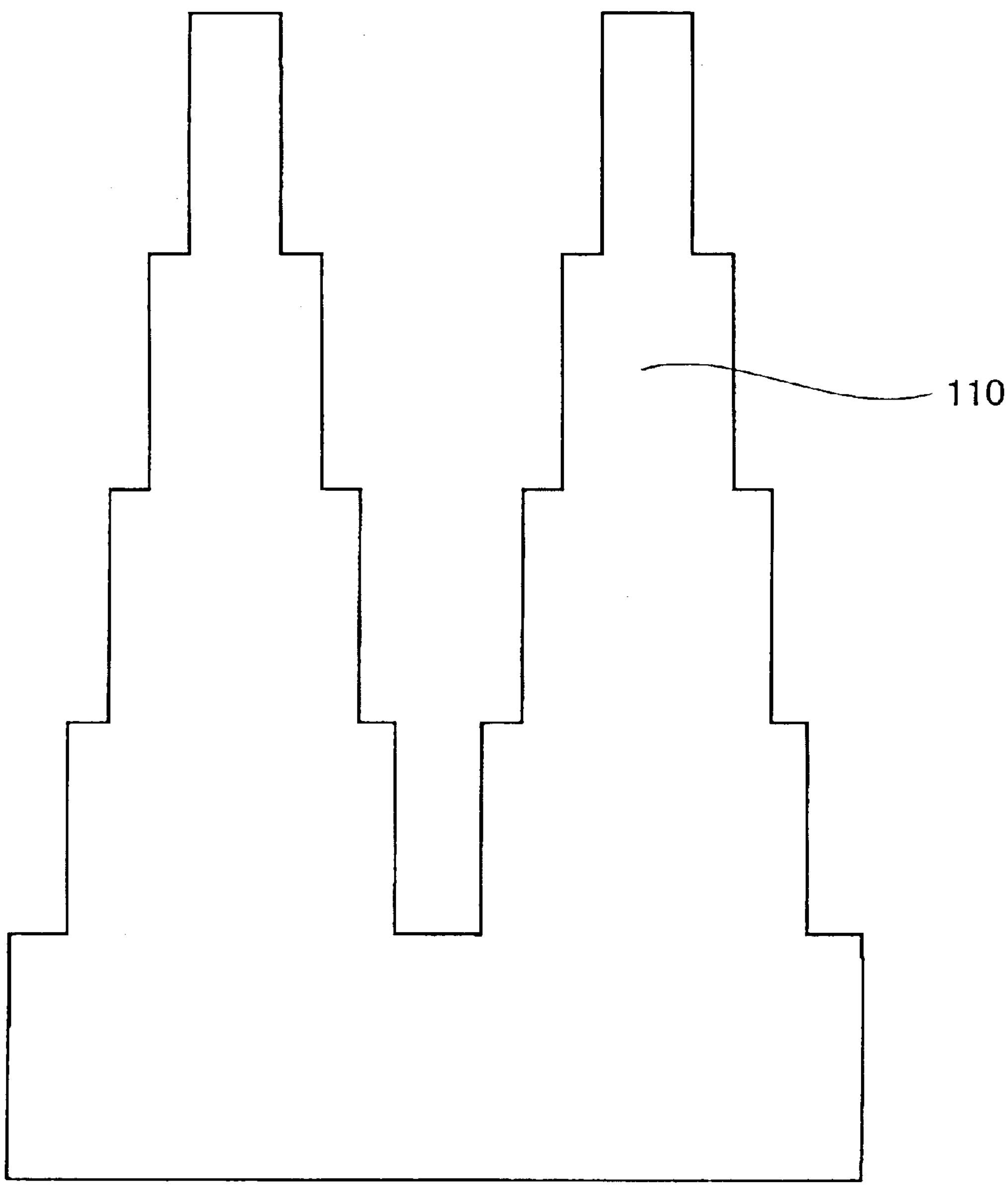
Figure 531:
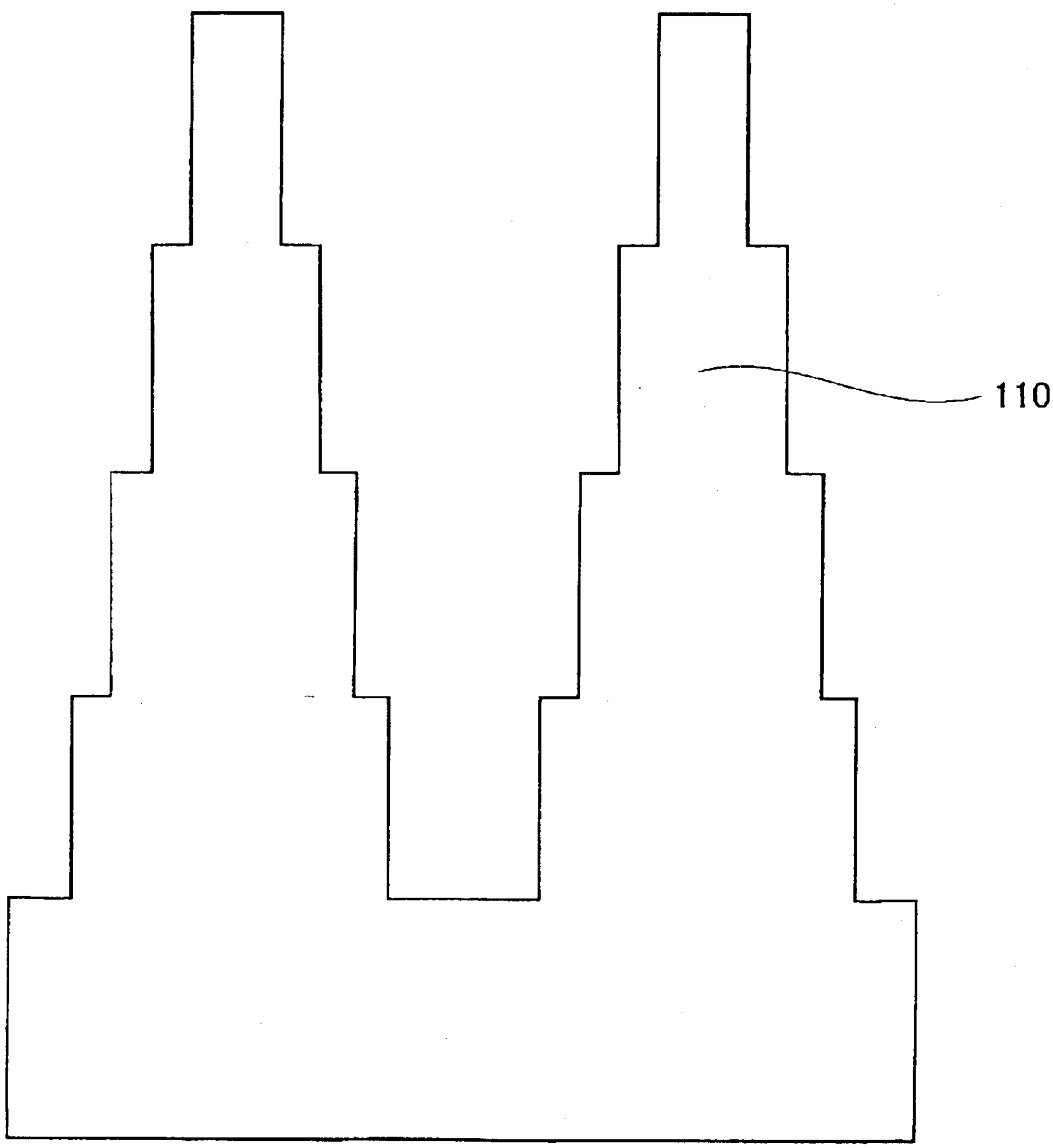

Thereafter, the silicon oxide film 430 is removed by isotropic etching (FIG. 494 and FIG. 531).

Figure 495:
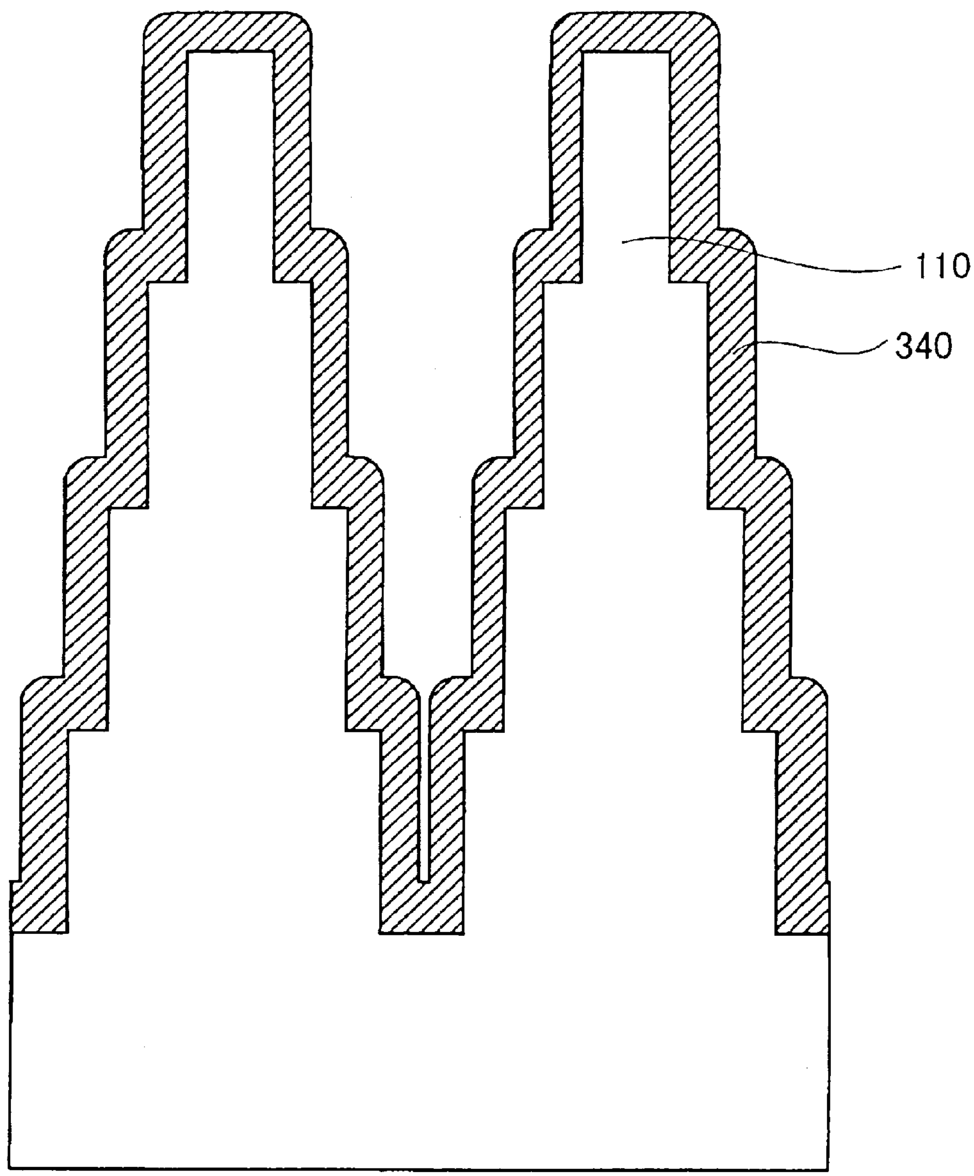
Figure 532:
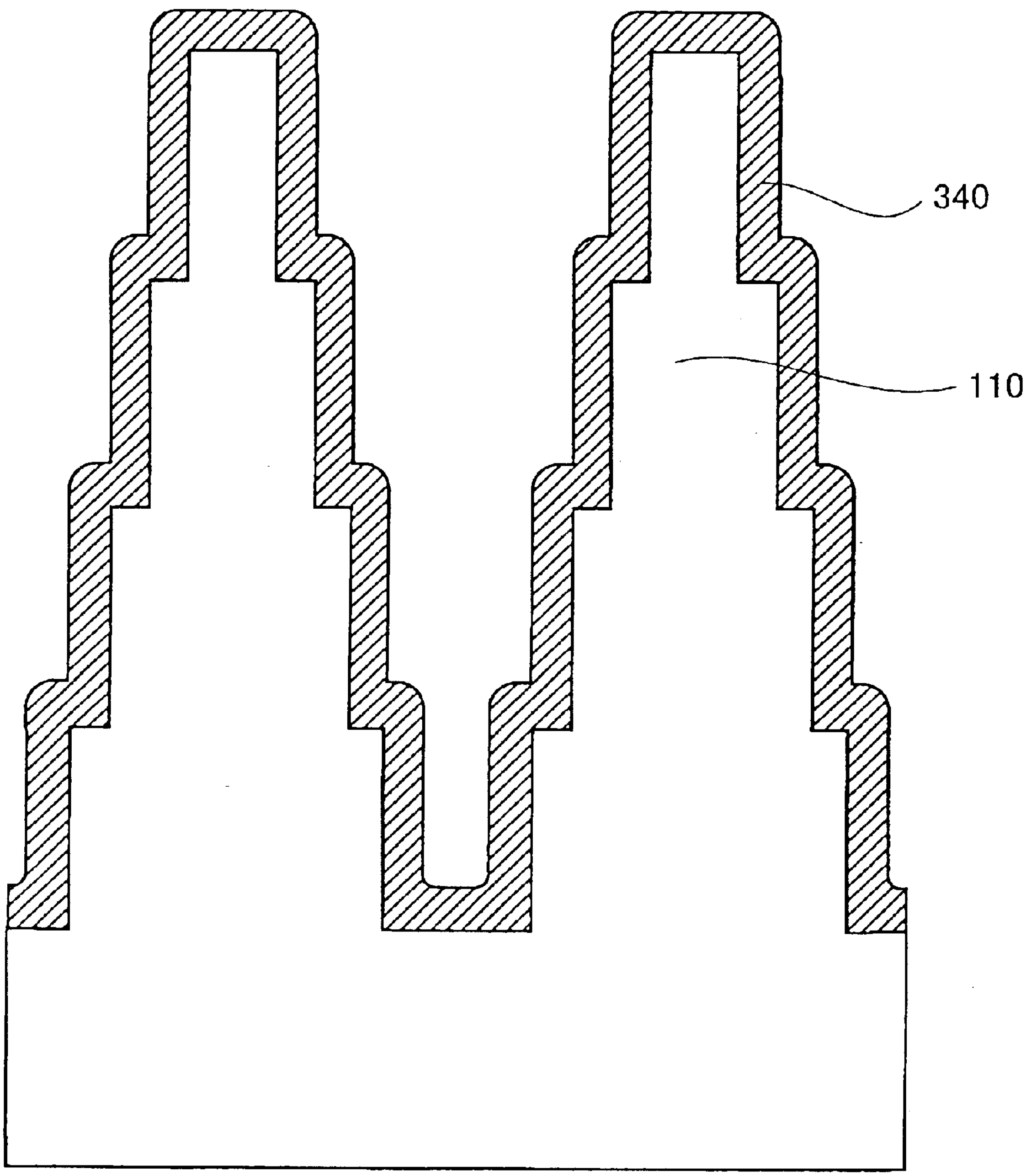

Subsequently, a silicon nitride film 340, for example, is deposited as an eleventh insulating film at least thicker than the deposition thickness of the silicon nitride film as the third insulating film, for example, 15 to 150 nm (FIG. 495 and FIG. 532).

The silicon oxide film 430 may be deposited on the island-like semiconductor layer 110 with intervention of a silicon oxide film.

Figure 496:
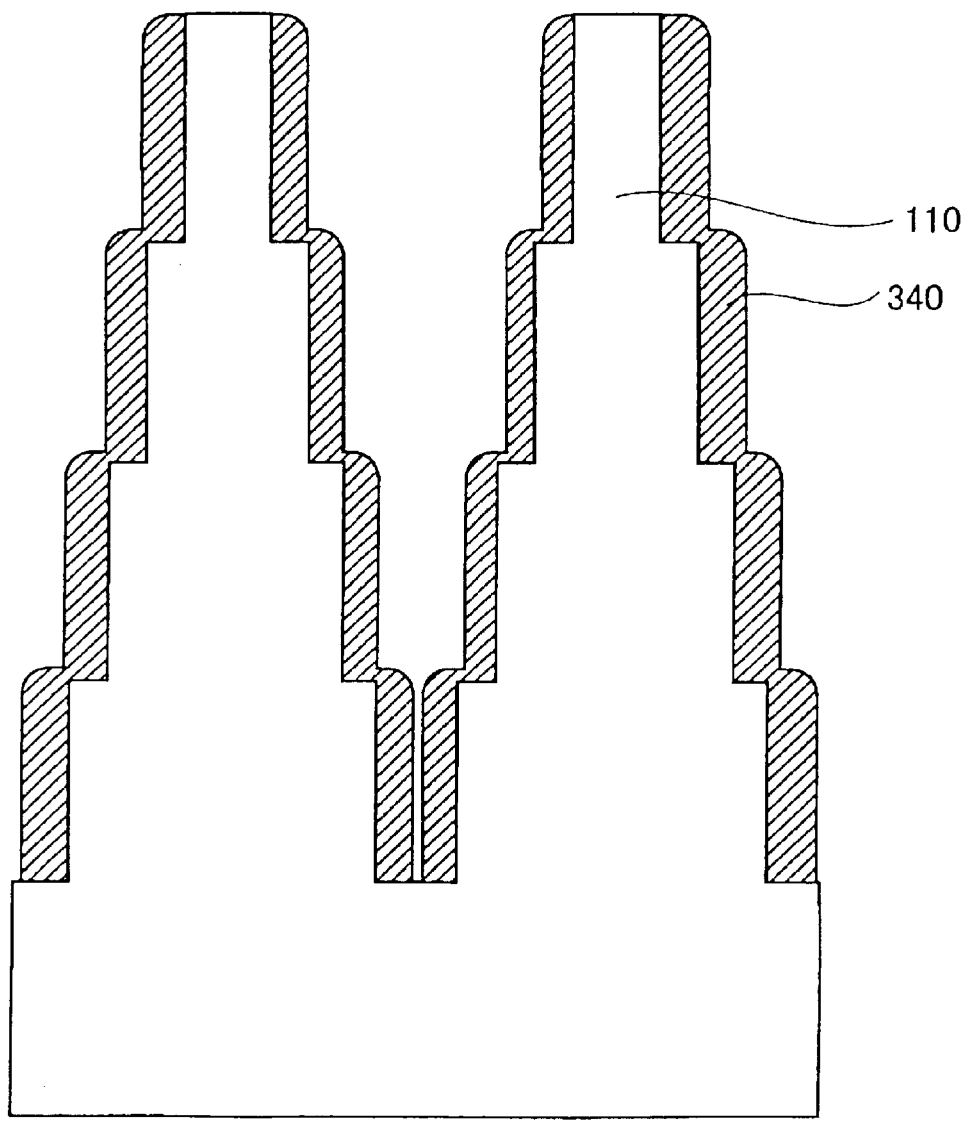
Figure 533:
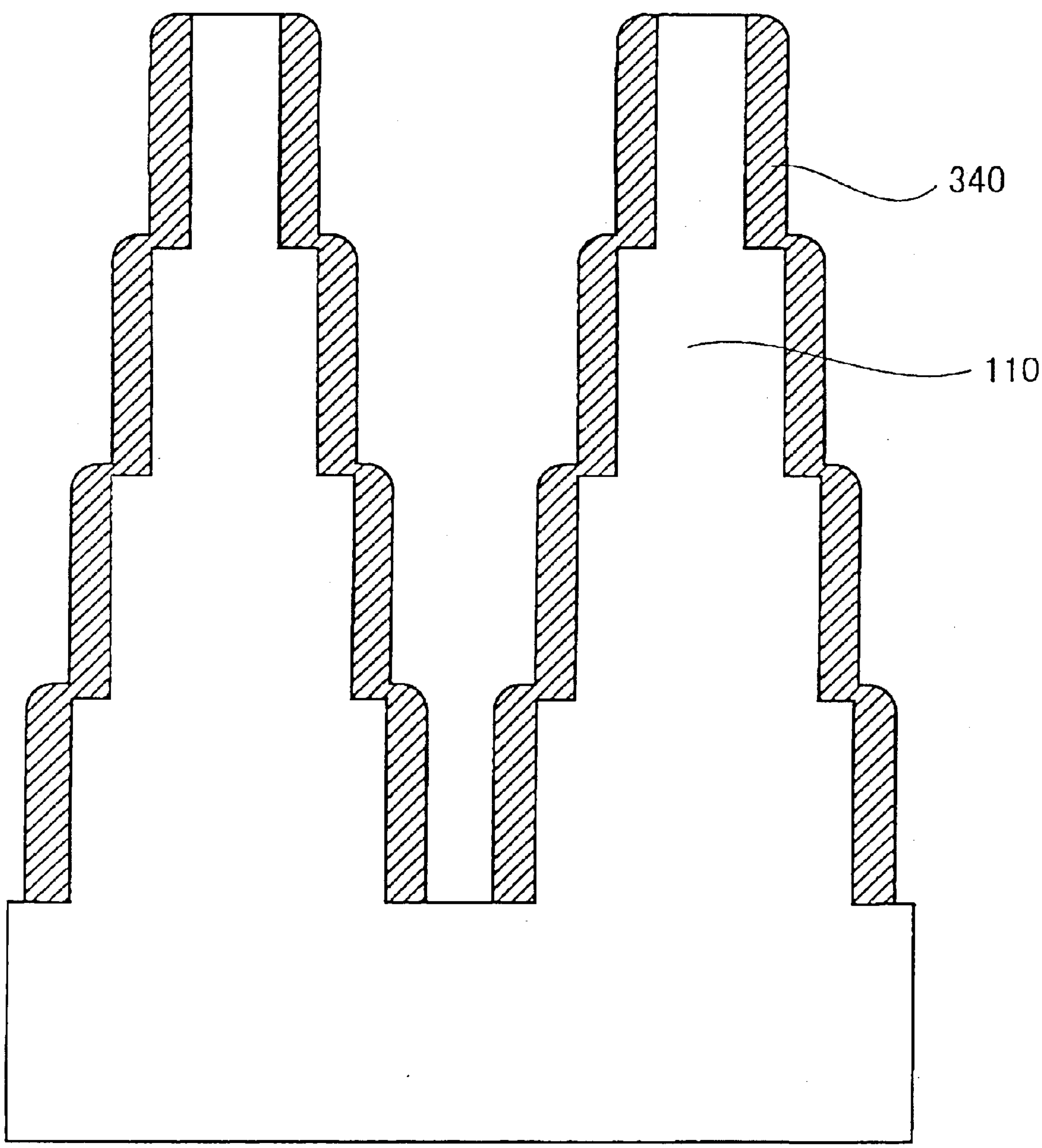

The silicon oxide film 430 is formed into the form of sidewalls on sidewalls of each island-like semiconductor layer 110 (FIG. 496 and FIG. 533).

Figure 497:
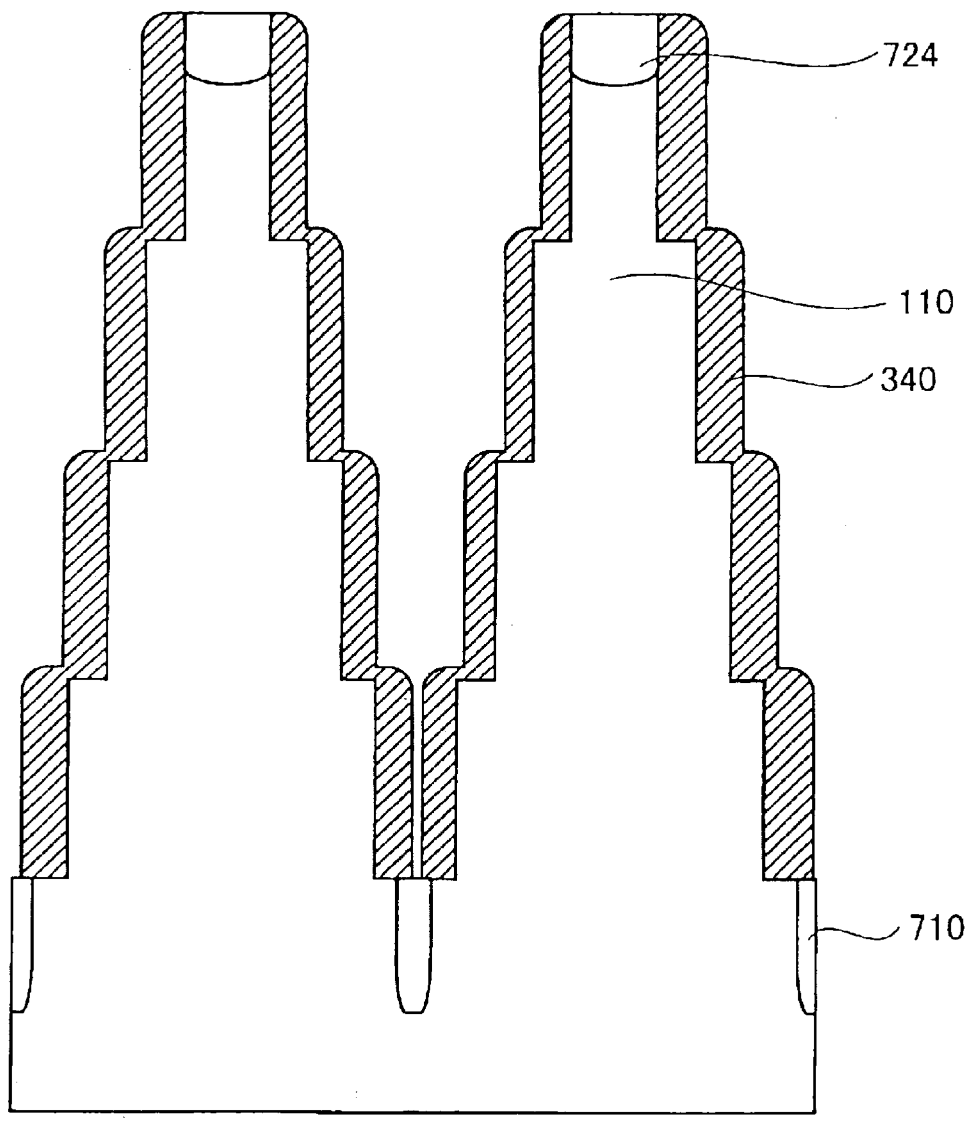
Figure 534:
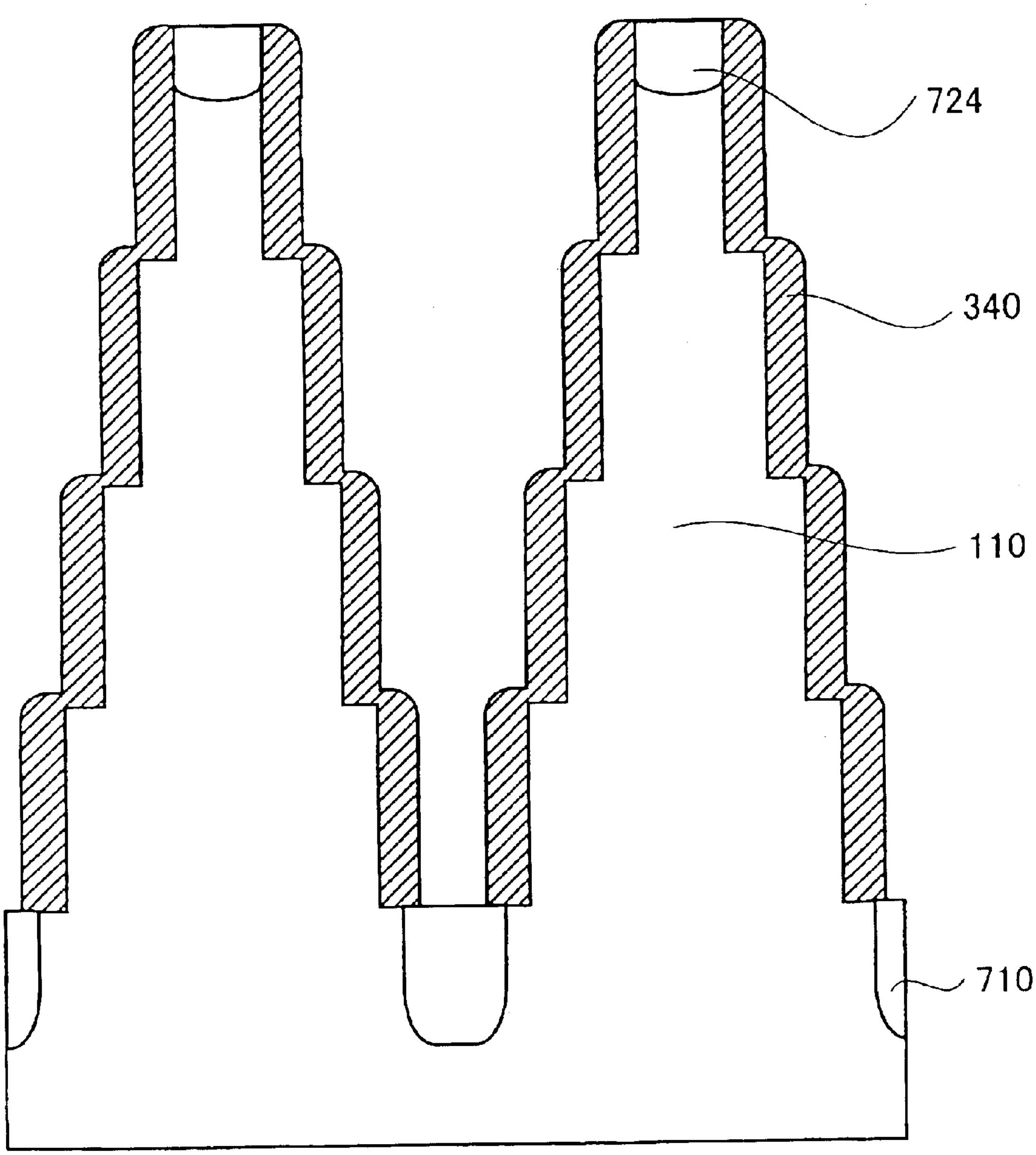

Thereafter, an impurity is introduced to the exposed top and bottom of the island-like semiconductor layer 110 to form n-type impurity diffusion layers 710 and 724 (FIG. 497 and 534). For example, at an implantation energy of 5 to 100 keV at an arsenic or phosphorus dose of about $1\times10^{13}$ to $1\times10^{17}/cm^2$ in a direction inclined about 0 to 7°.

Figure 498:
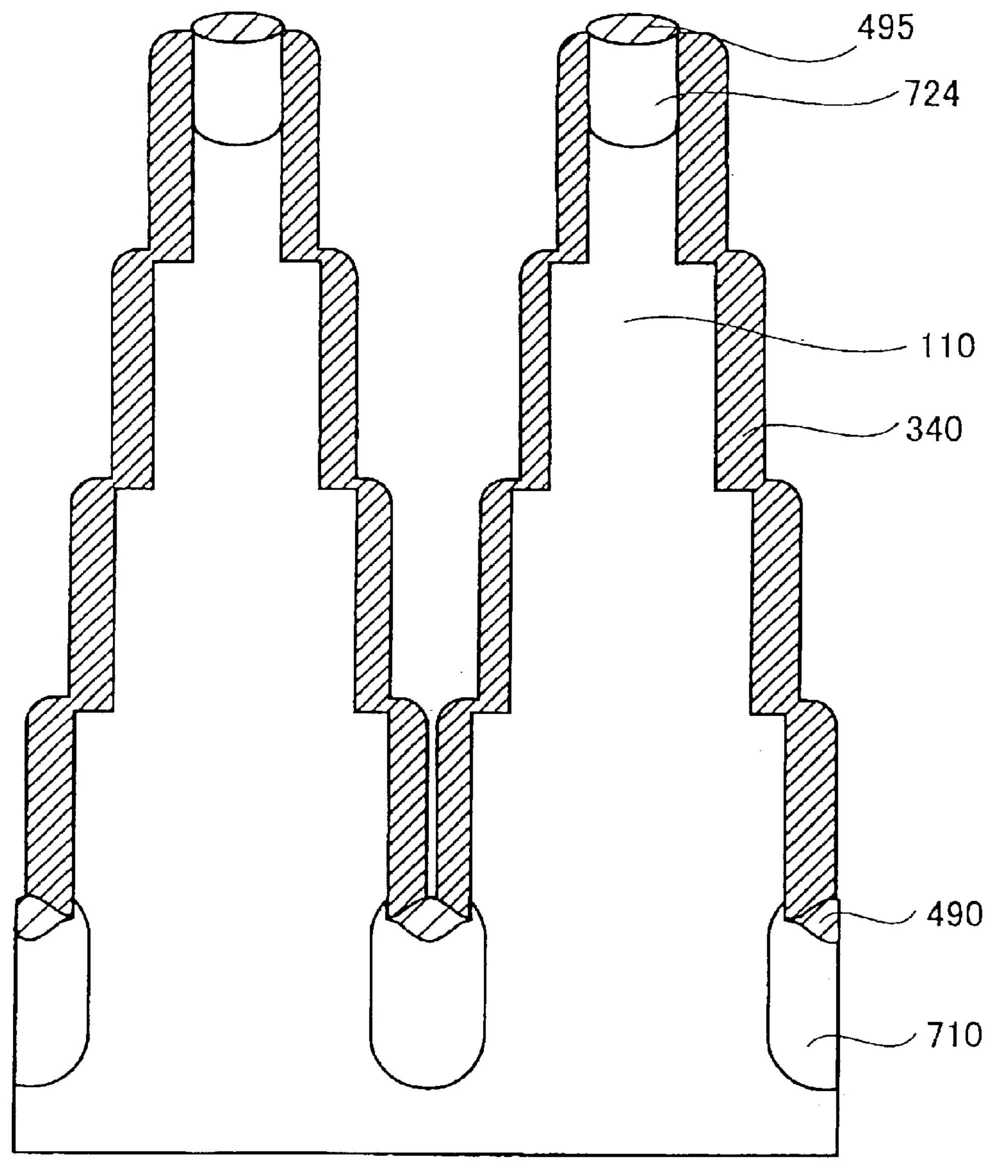
Figure 535:
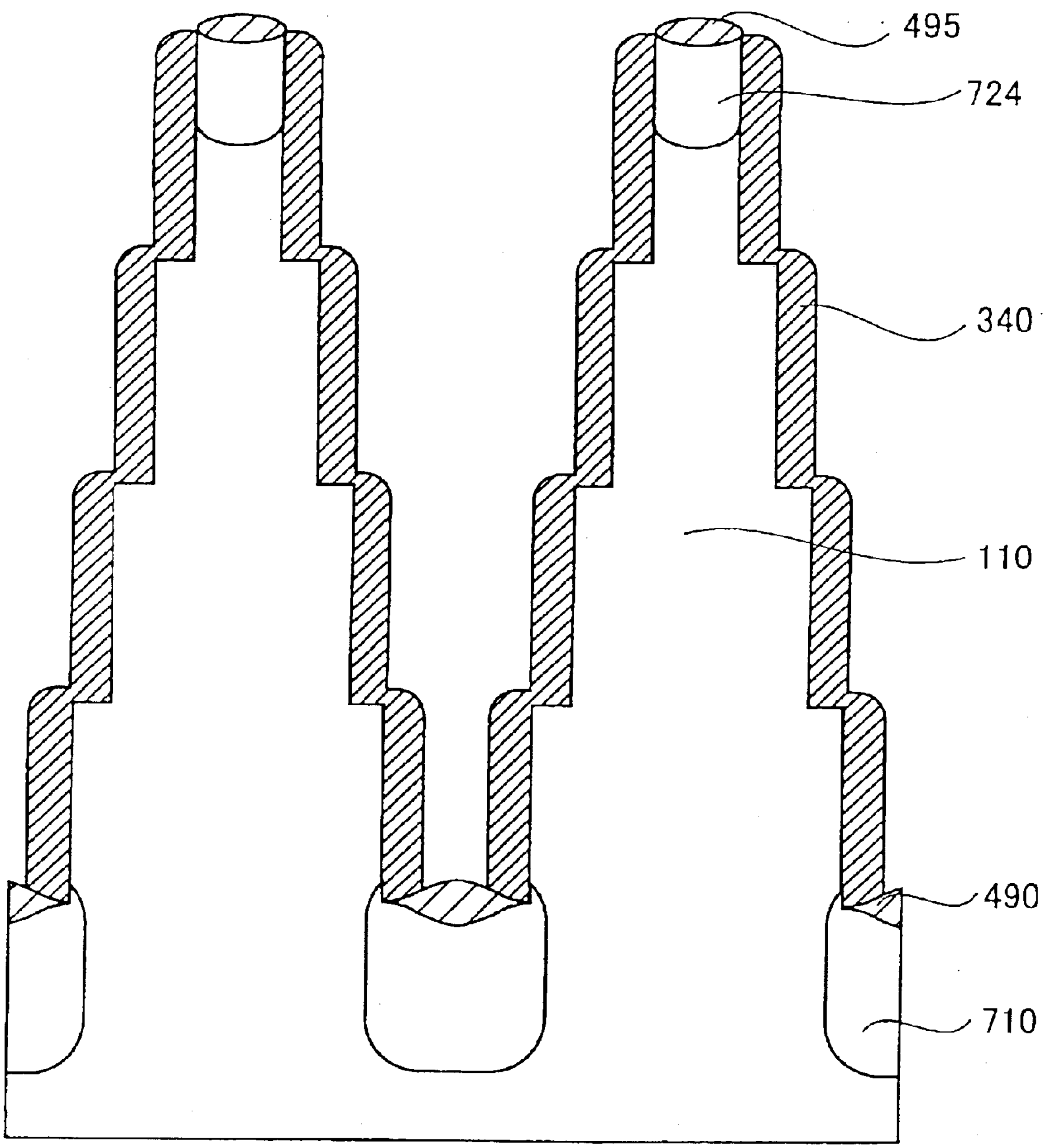

Subsequently, the exposed top and bottom of the island-like semiconductor layer 110 are thermally oxidized to form silicon oxide films 490 and 495 of 50 to 500 nm thickness, for example, as thirteenth insulating films (FIG. 498 and FIG. 535).

Thereafter, the silicon oxide film formed on the surface of the silicon nitride film 340 at thermal etching is removed by isotropic etching as required, and the silicon nitride film 340 is selectively removed by isotropic etching.

Next, channel ion implantation is carried out on the sidewall of the island-like semiconductor layer 110 as required using a slant ion implantation, for example, at an implantation energy of 5 to 100 keV at a phosphorus dose of about $1\times10^{11}$ to $1\times10^{13}/cm^2$ in a direction inclined about 5 to 45°. The channel ion implantation may preferably be performed in various directions toward the island-like semiconductor layer 110 because the surface impurity concentration becomes uniform. Alternatively, instead of the channel ion implantation, a oxide film containing phosphorus is deposited by CVD and diffusion of phosphorus from the oxide film may be utilized. The implantation of the impurity ions from the surface of the island-like semiconductor layer 110 may be done before the surface of the island-like semiconductor layer 110 is covered with the silicon oxide film 430 or may be finished before the island-like semiconductor layer 110 is formed. The means for the implantation is not particularly limited so long as the impurity concentration distribution in the island-like semiconductor layer 110 is equal.

Figure 499:
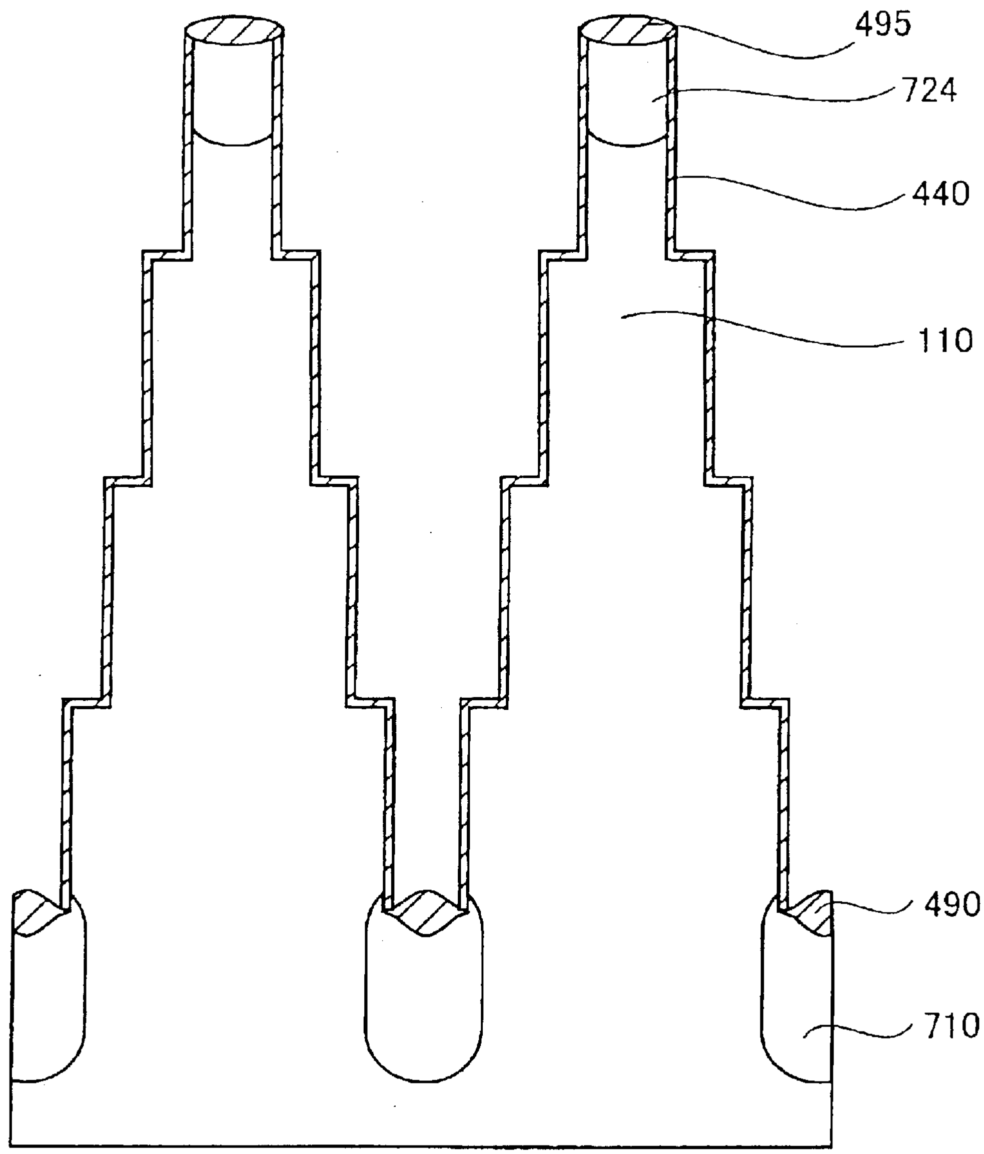
Figure 536:
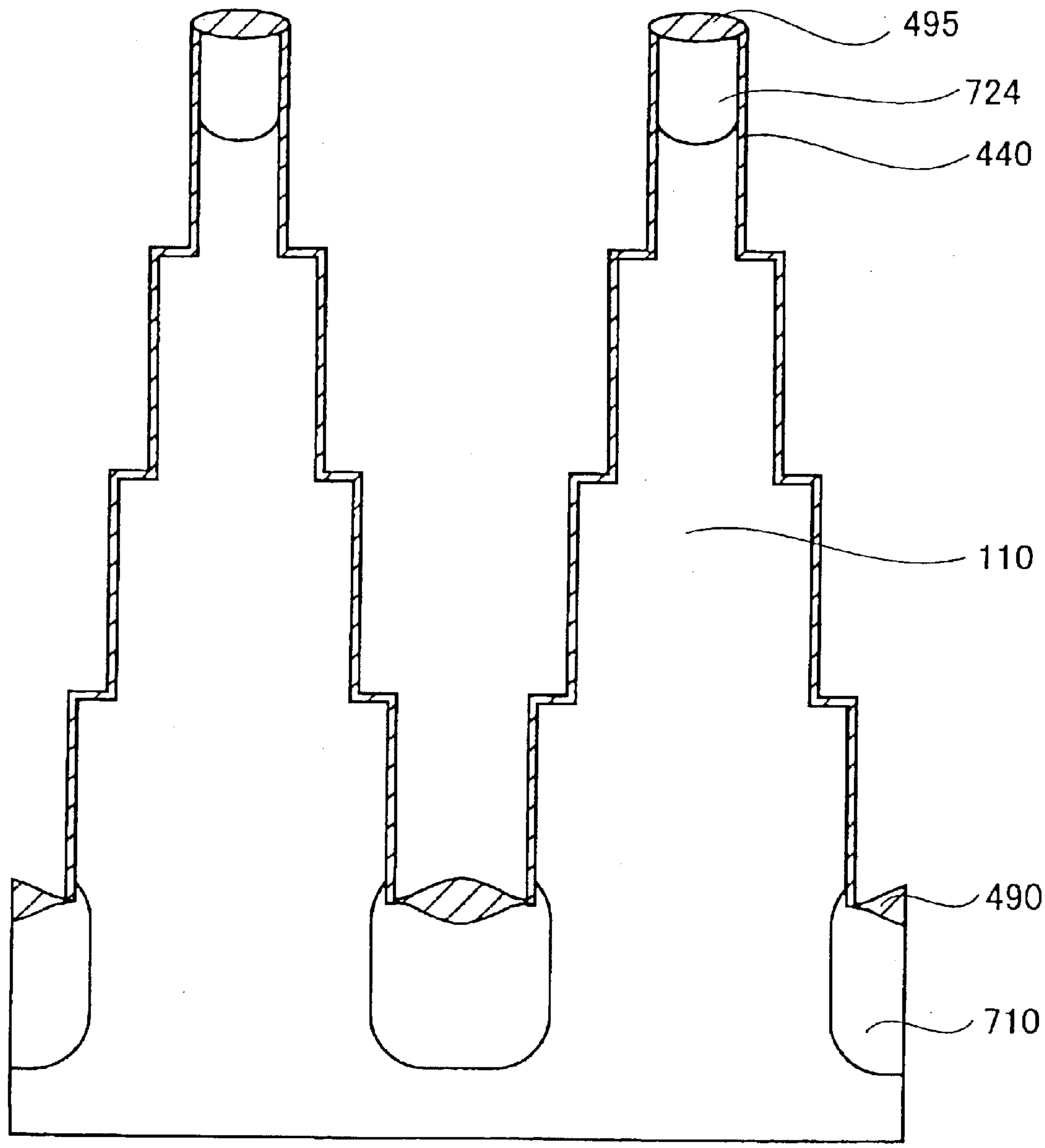

Subsequently, a silicon oxide film 440, for example, is formed as a fifth insulating film to be a tunnel oxide film of about 10 nm around the island-like semiconductor layer 110, for example, using thermal oxidation (FIG. 499 ad FIG. 536). The tunnel oxide film is not limited to the thermally oxidized film but may be a CVD oxide film or an oxynitride film.

Figure 500:
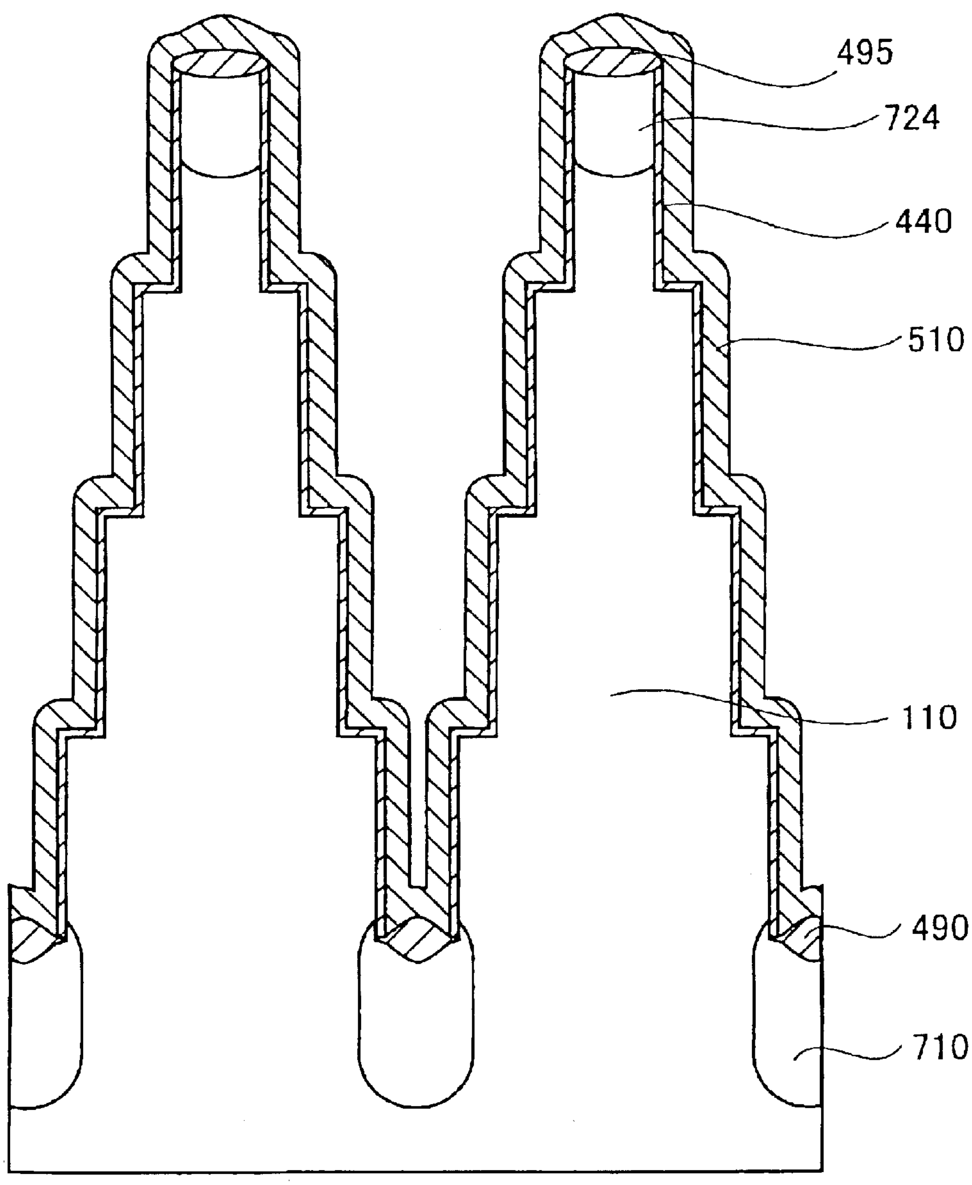
Figure 501:
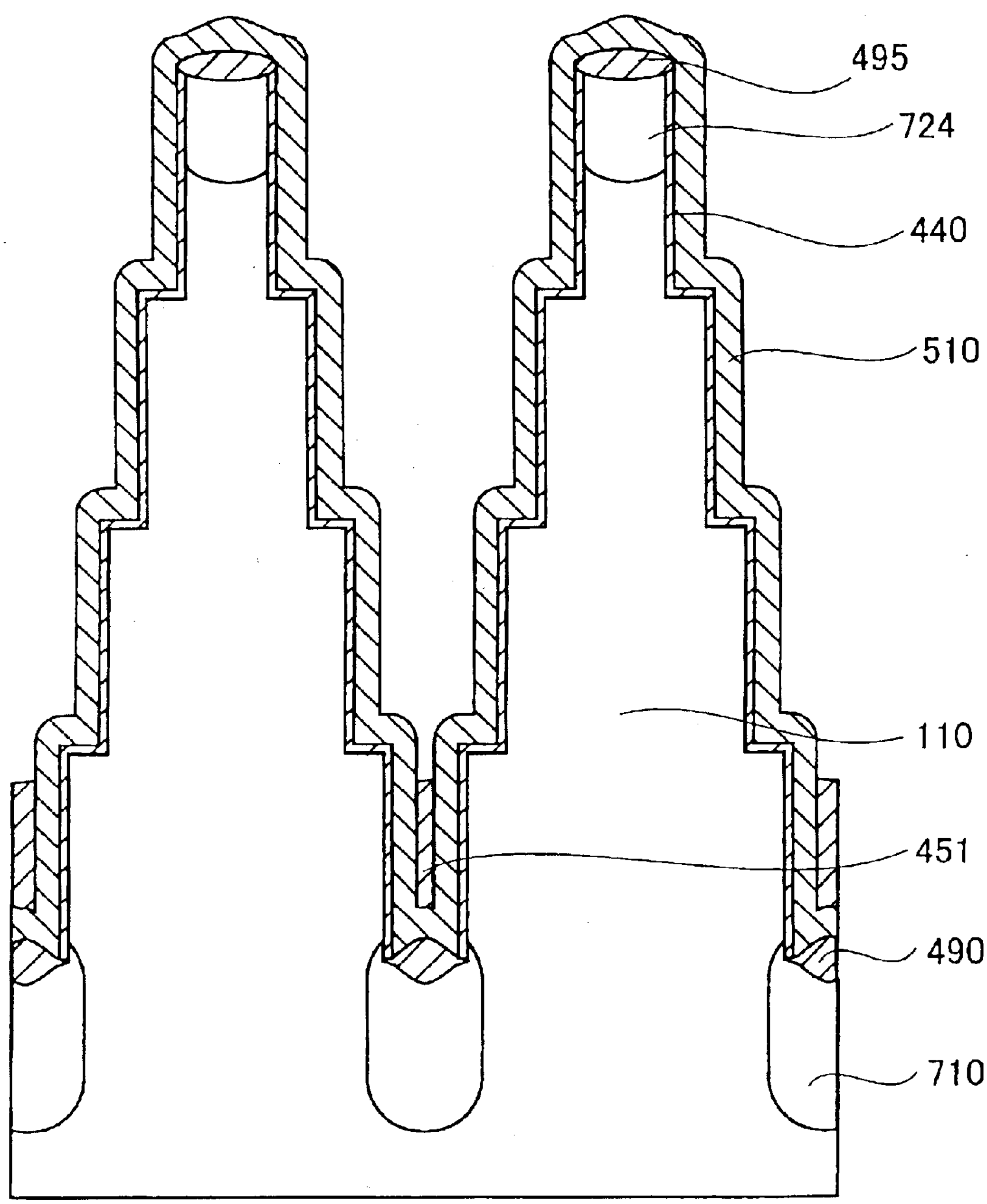
Figure 537:
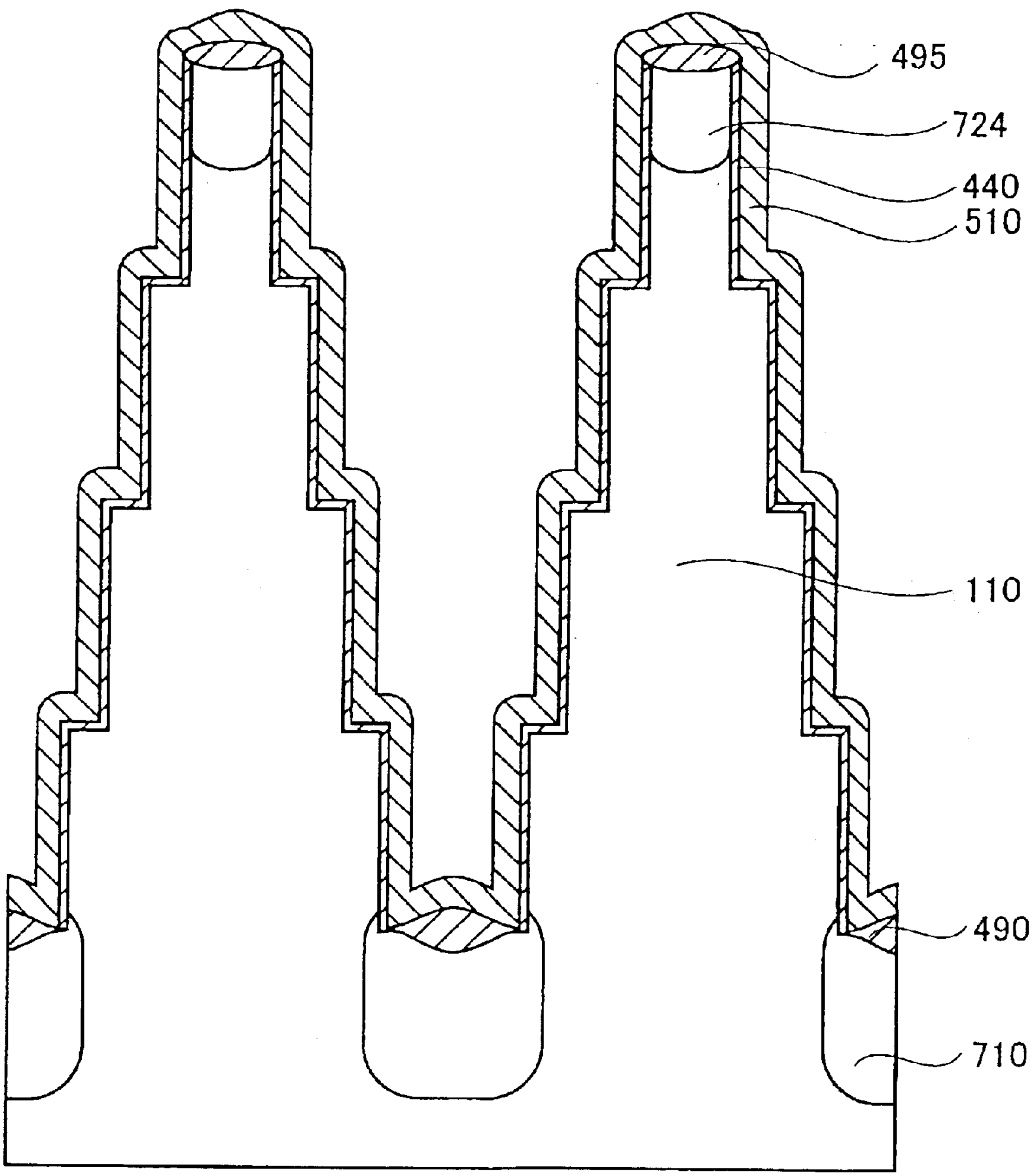
Figure 538:
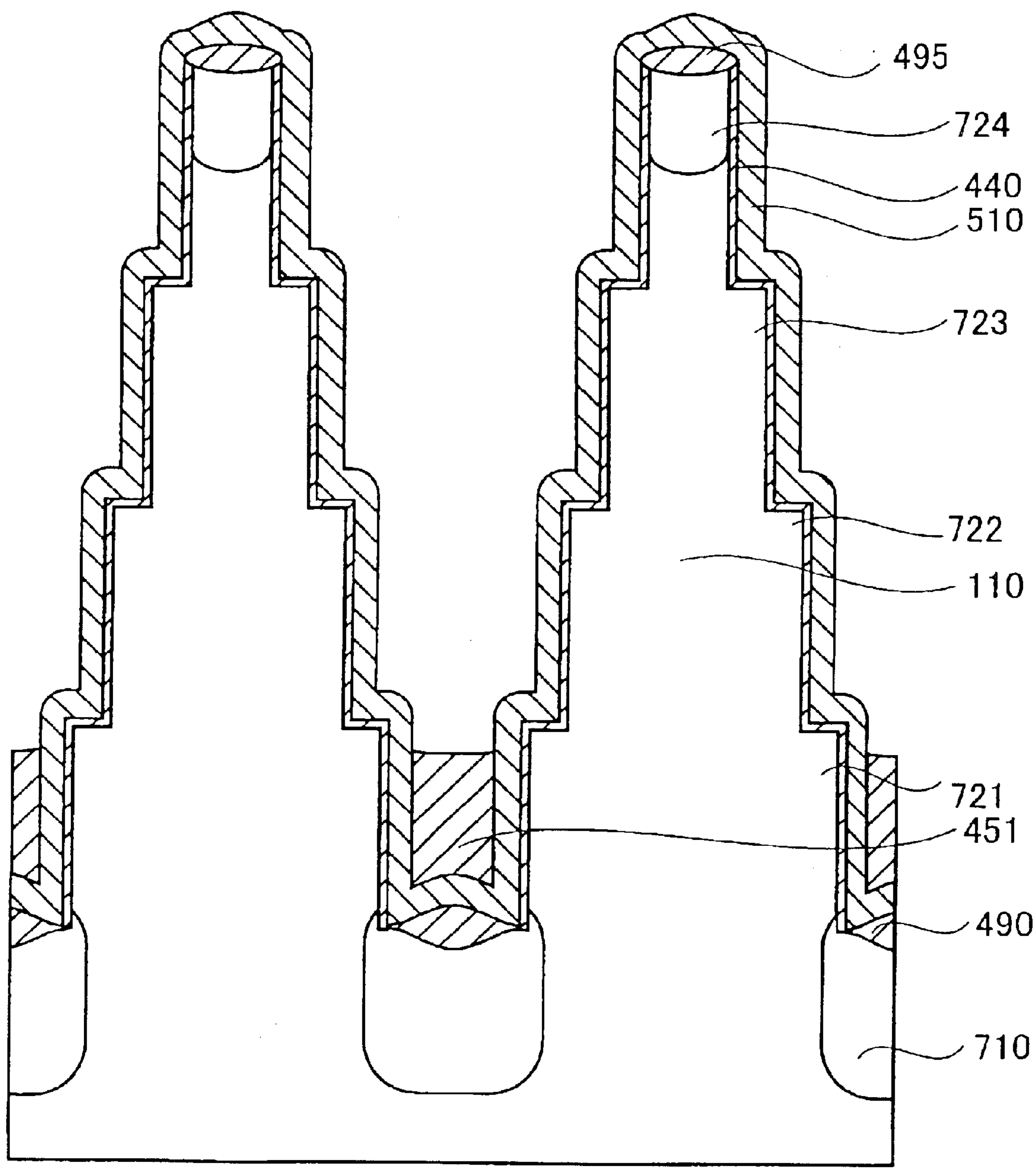

A first conductive film, for example, a polysilicon film 510 is deposited to about 20 to 200 nm (FIG. 500 and FIG. 537), and then a sixth insulating film, for example, a silicon oxide film 451 is deposited to about 20 to 200 nm. Then etch-back is conducted to a desired depth (FIG. 501 and FIG. 538). For example, by anisotropic etching, the polysilicon film 510 is formed in the form of sidewalls on the sidewalls of the tiers of the island-like semiconductor layer 110, whereby separate polysilicon films 511, 512, 513 and 514 are formed at the same time. The selection gates, i.e., the polysilicon film 511, at the bottom tier are all kept continuous by protection by the silicon oxide film 451.

Figure 502:
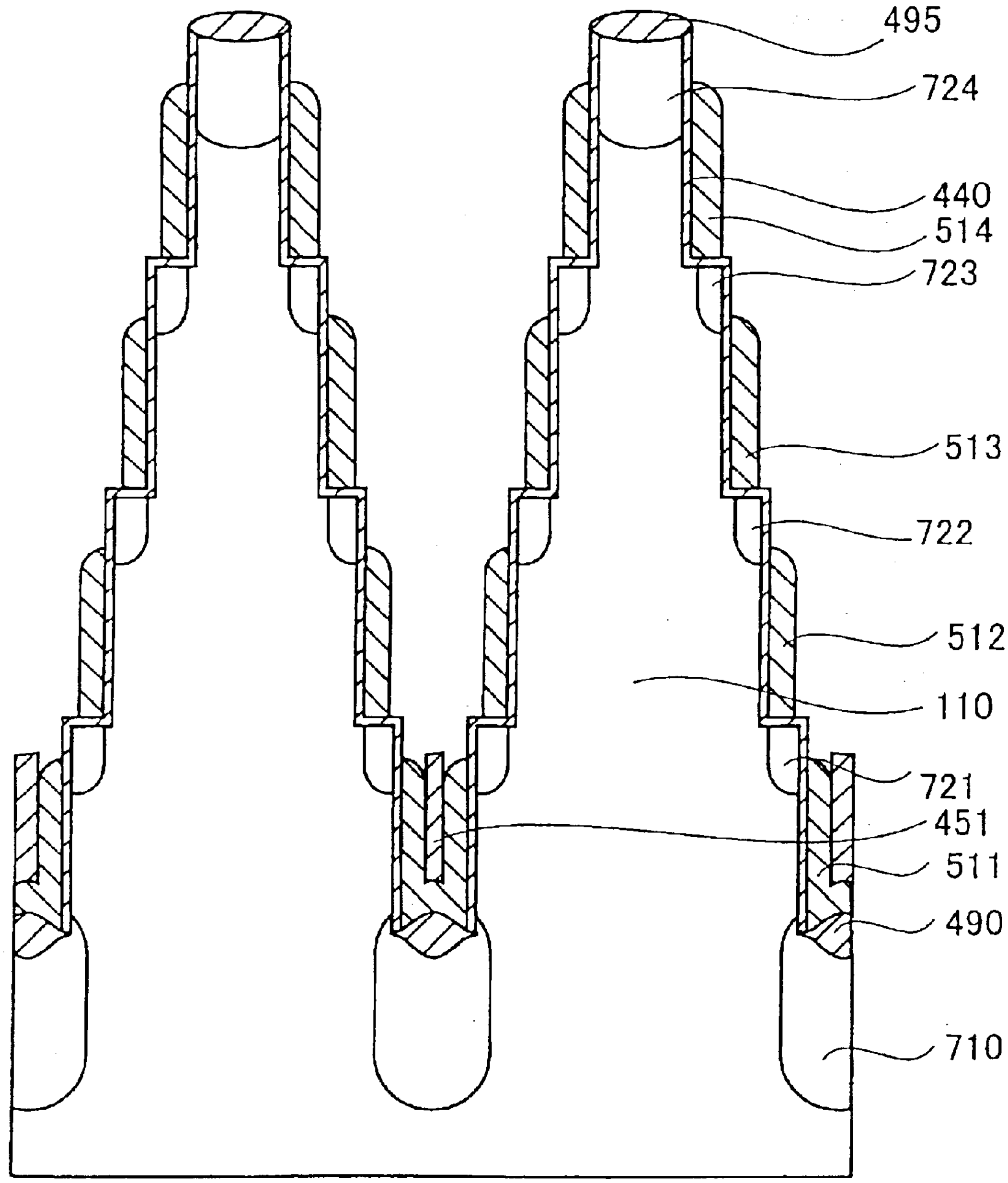
Figure 539:
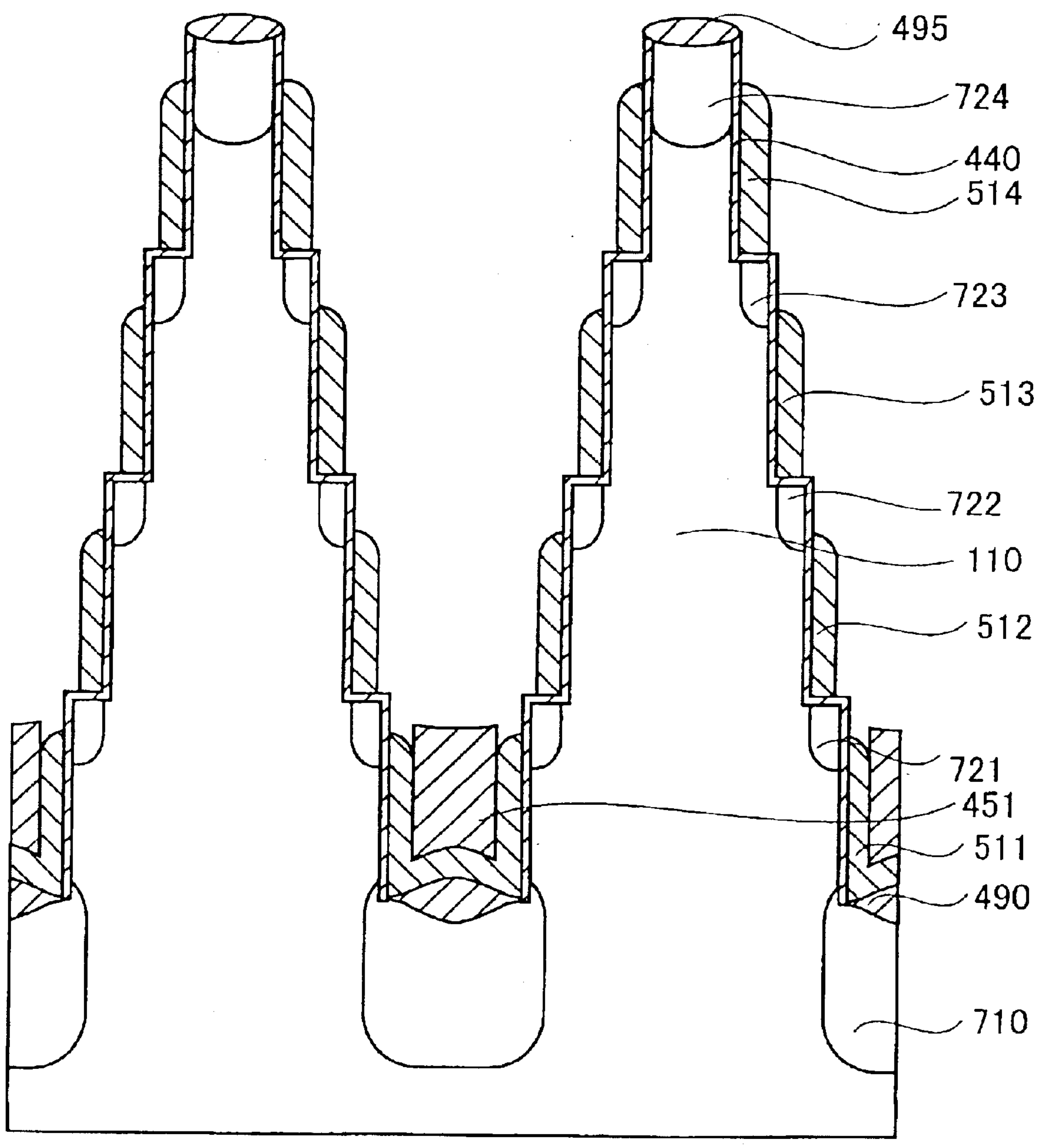

Next, impurity ions are introduced into corners of the step of the island-like semiconductor layer 110 having the tiers to form n-type impurity diffusion layers 721, 722, 723 and 724 (FIG. 502 and FIG. 539), for example, at an implantation energy of 5 to 100 keV at an arsenic or phosphorus dose of about $1\times10^{12}$ to $1\times10^{15}/cm^2$ in a direction inclined about 0 to 45°. Here, the ion implantation for forming the n-type impurity diffusion layers 721, 722, 723 and 724 may be carried out on the entire periphery of the island-like semiconductor layer 110 and may be carried out from one direction or from several directions. That is, the n-type impurity diffusion layers 721, 722, 723 and 724 may not be formed to surround the periphery of the island-like semiconductor layer 110.

Figure 503:
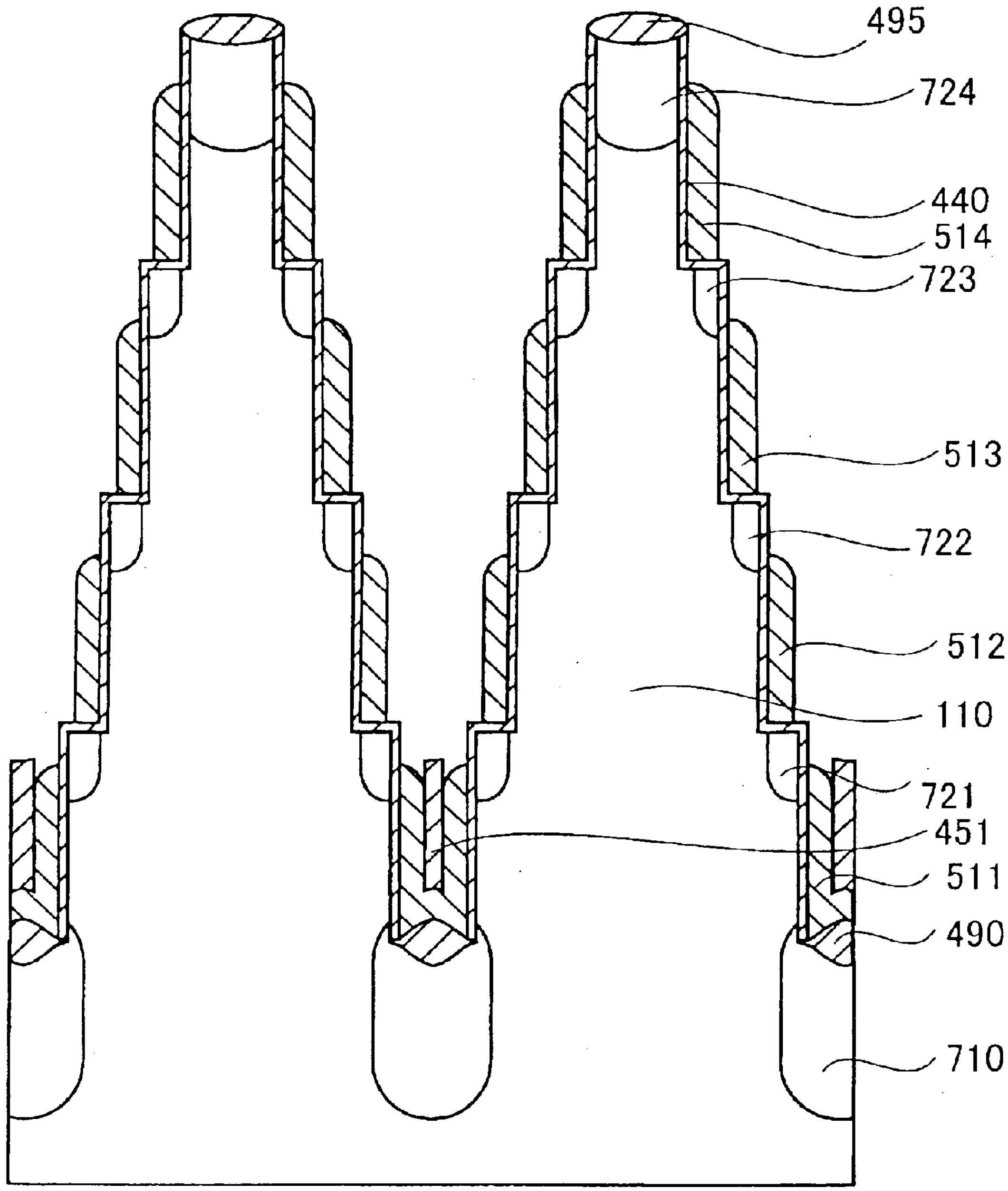
Figure 540:
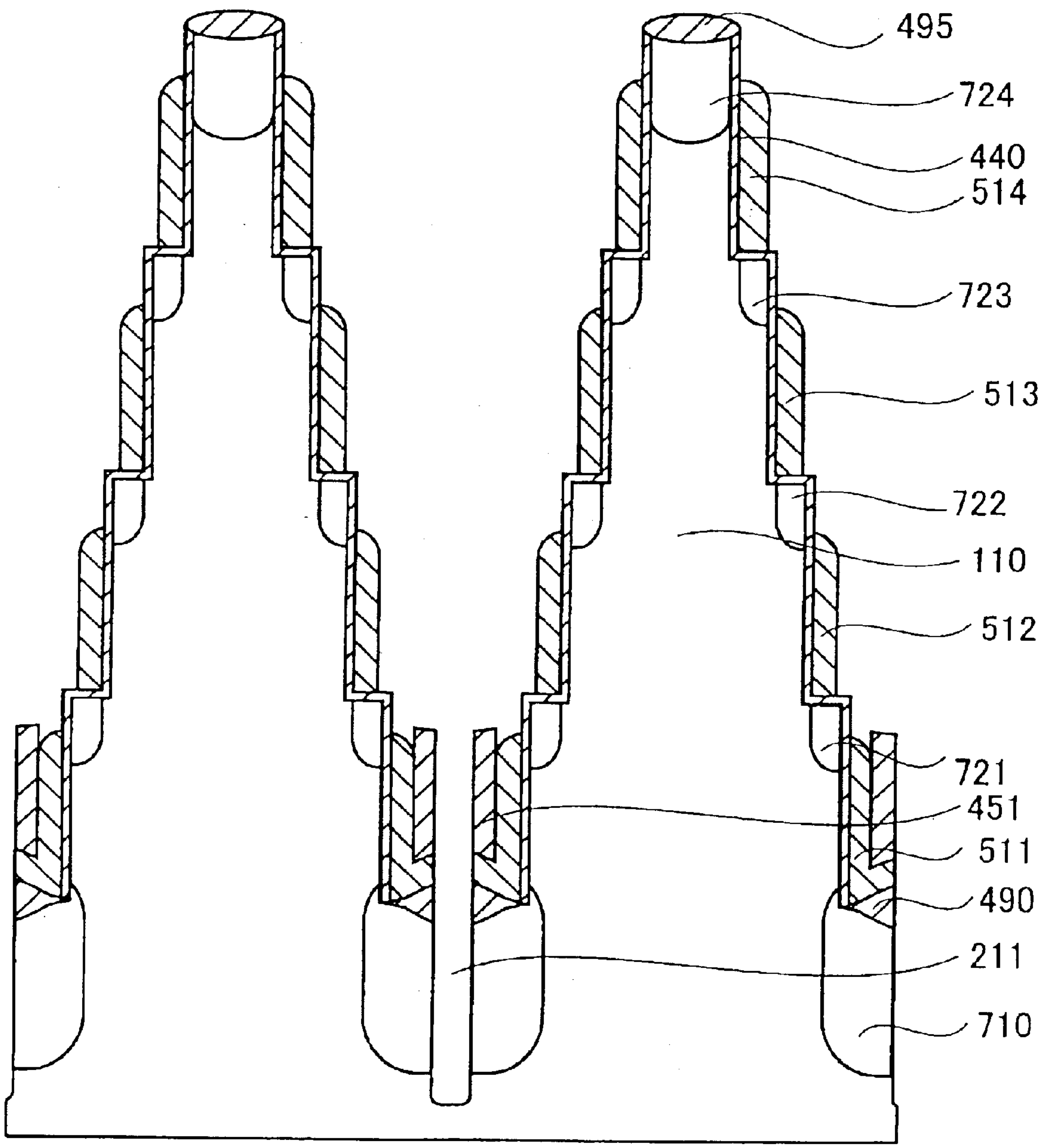

Thereafter, using as a mask a resist film R2 patterned by a known photolithography technique, the silicon oxide film 451 is etched by RIE, and the polysilicon film 511, the silicon oxide film 490 and the impurity diffusion layer 710 are etched to form a first trench 211 (FIG. 503 and FIG. 540). Thereby a first wiring layer and a second wiring layer to be a selection gate line continuous in direction A–A' of FIG. 1 are formed by separation.

Figure 504:
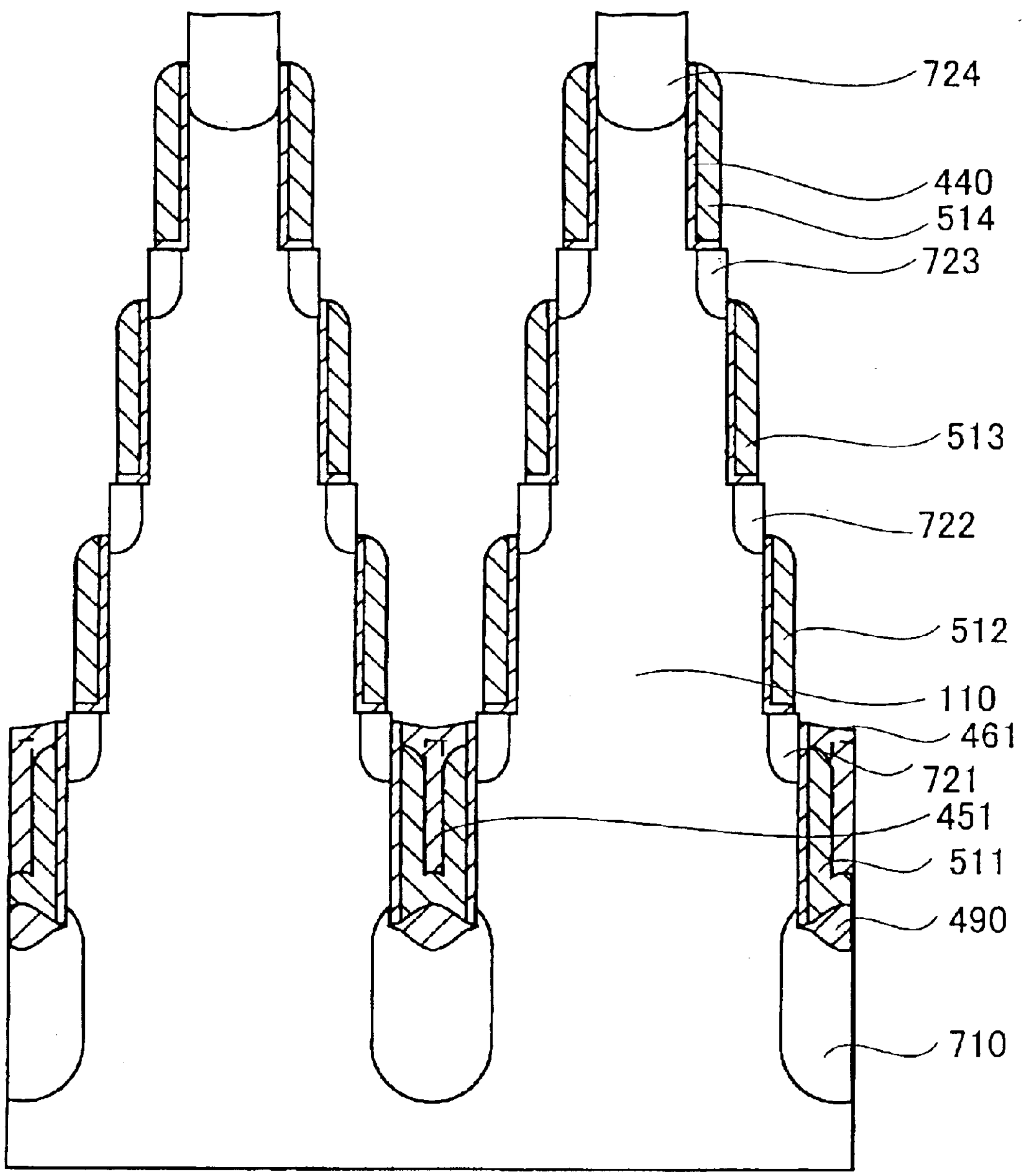
Figure 541:
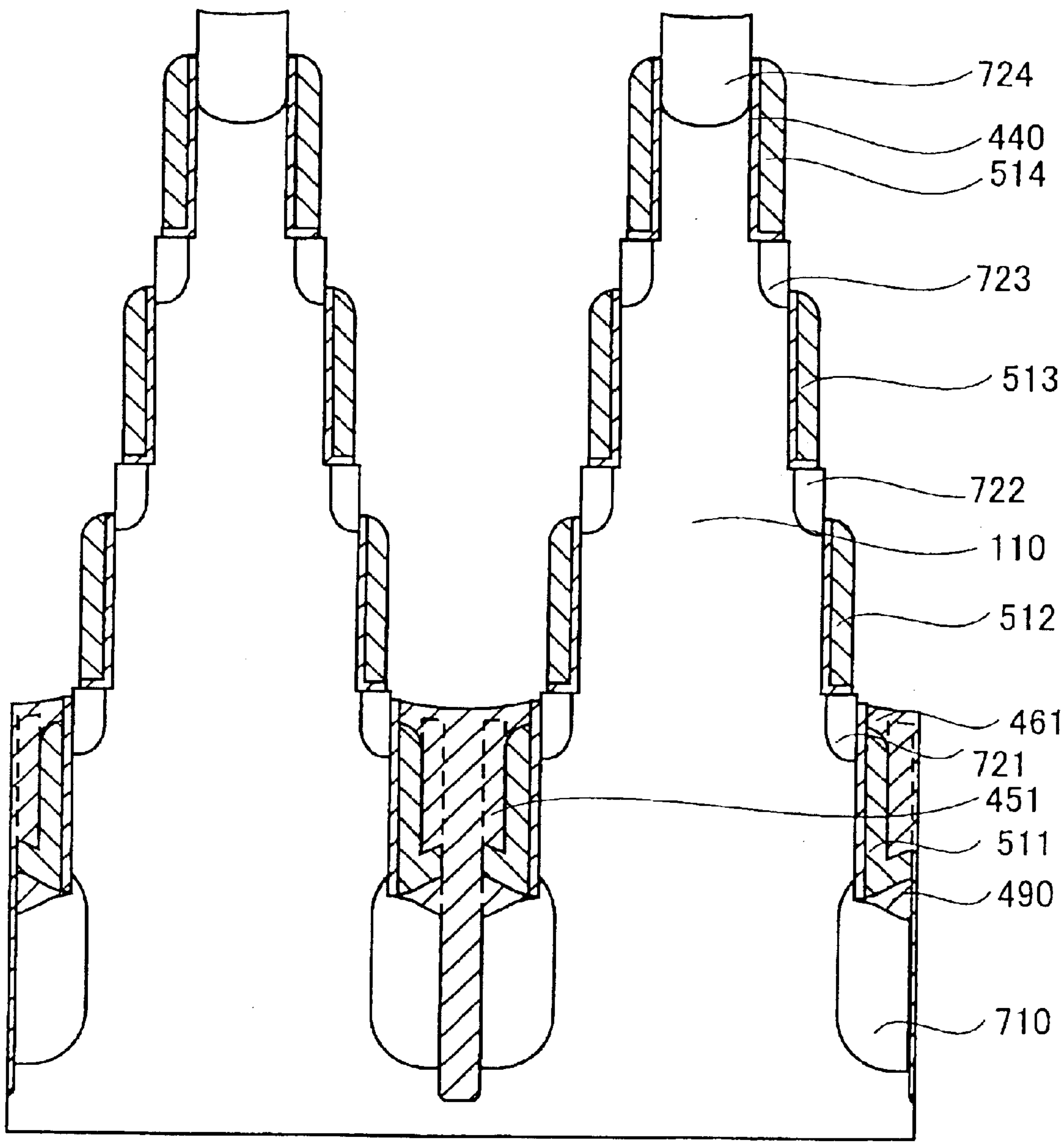

Next, a silicon oxide film 461, for example, is deposited to about 20 to 200 nm as a seventh insulating film and is isotropically etched to be buried and cover the first trench 211 and the top of the polysilicon film 511 (FIG. 504 and FIG. 541).

Subsequently, an interlayer insulating film 610 is formed on the exposed surfaces of the polysilicon films 512, 513 and 514. The interlayer insulating film 610 made of, for example, ONO film.

Figure 505:
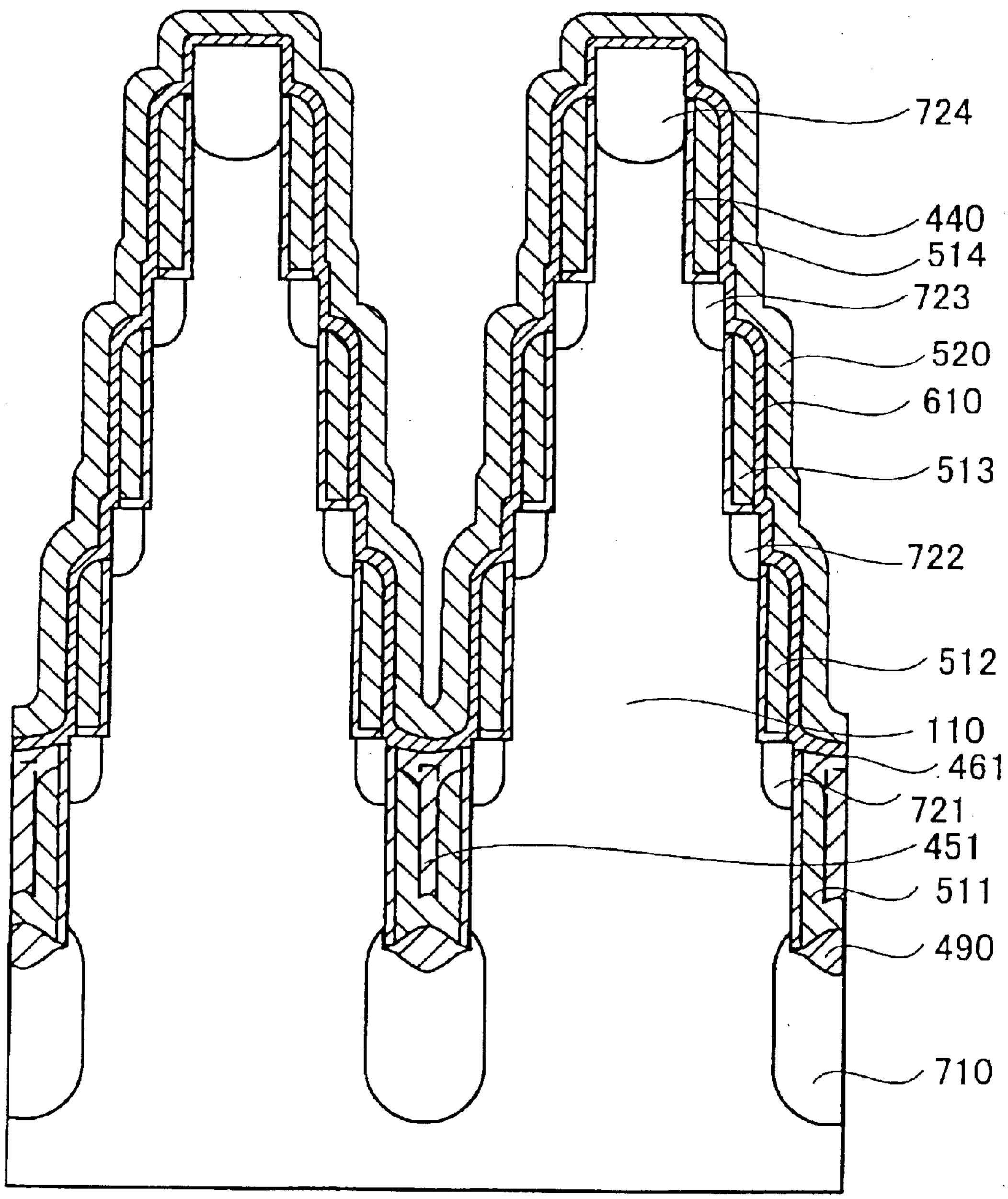
Figure 542:
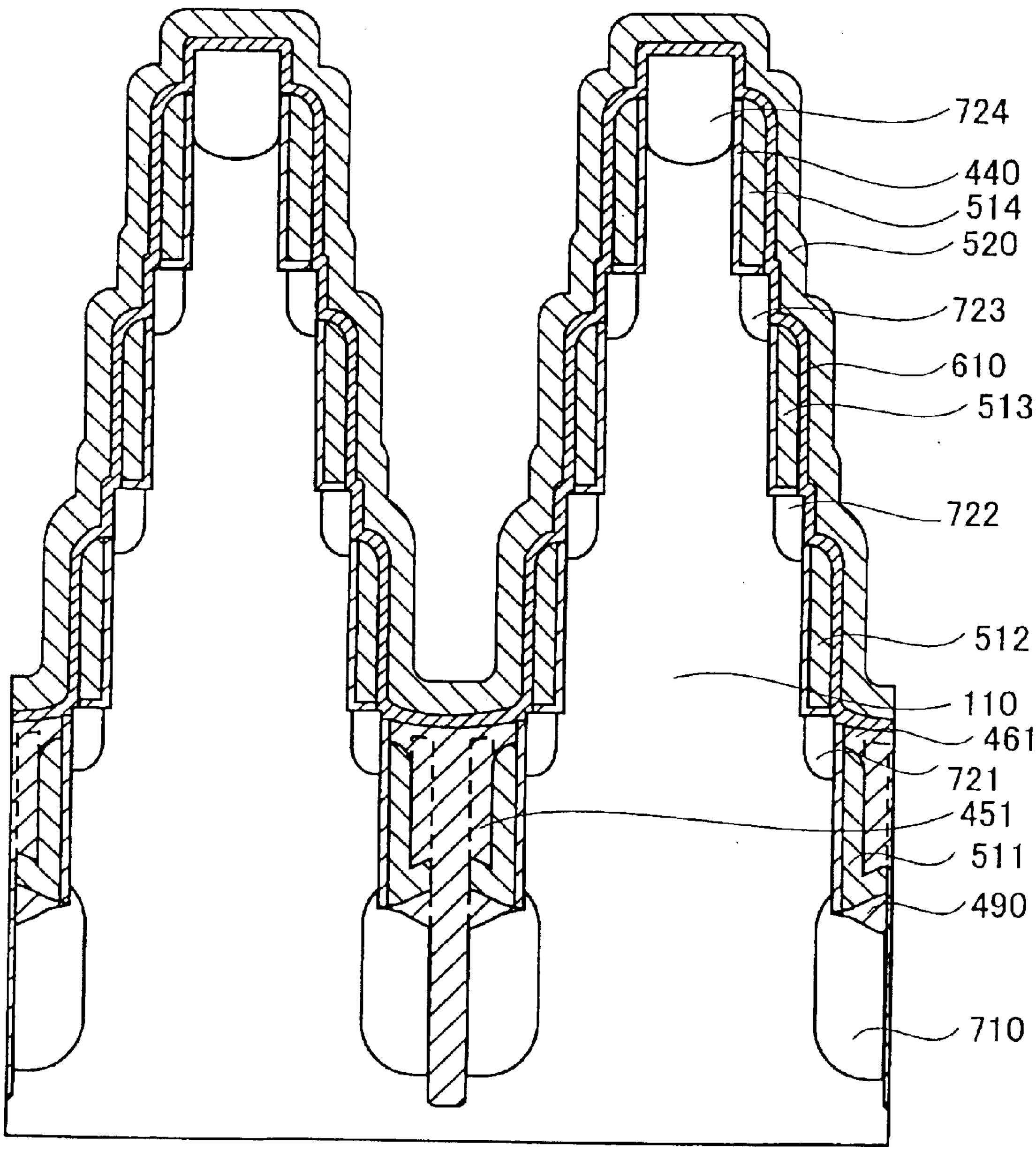

Next, a polysilicon film 520, for example, is deposited to 15 to 150 nm as a second conductive film (FIG. 505 and FIG. 542).

Figure 506:
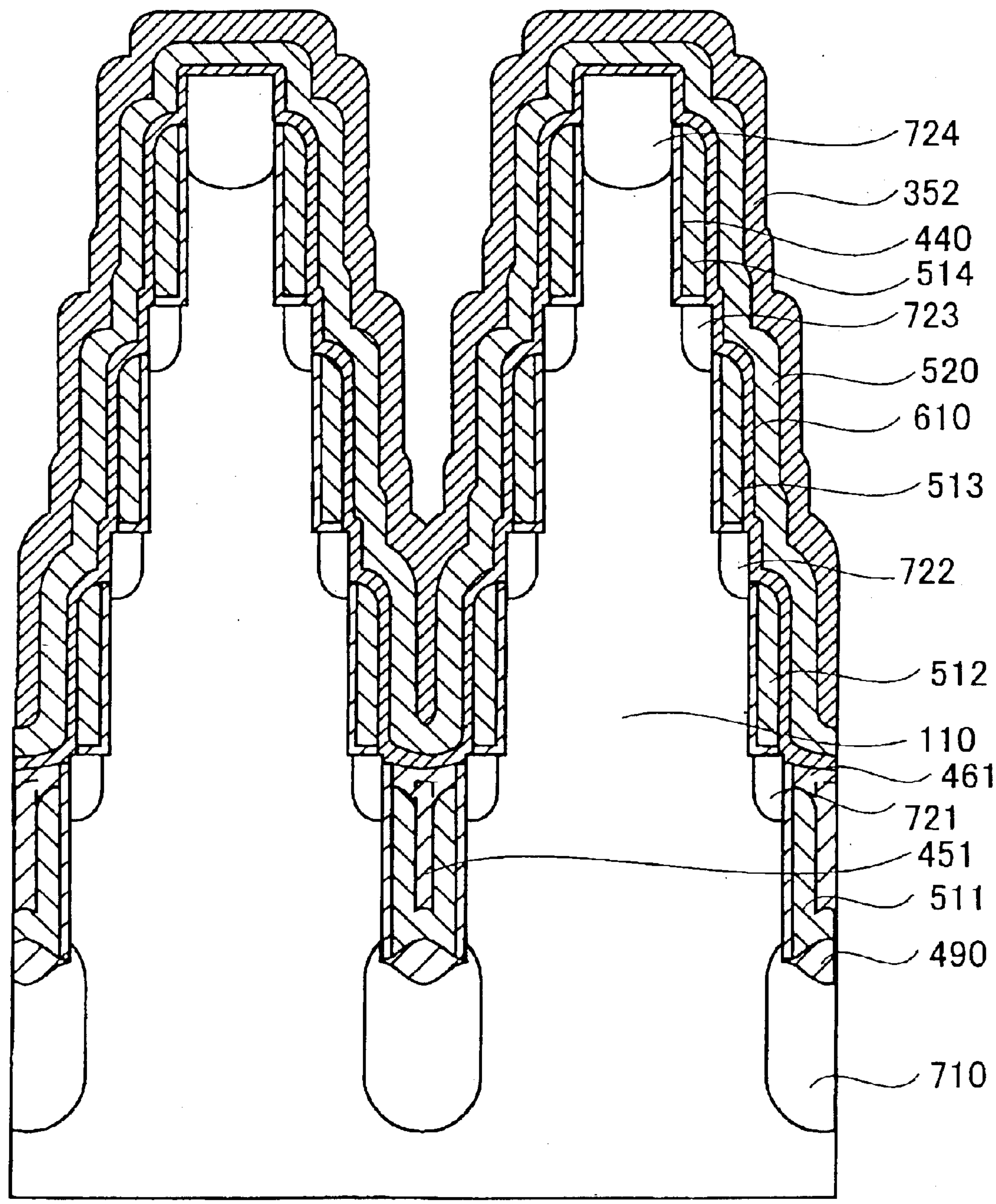
Figure 507:
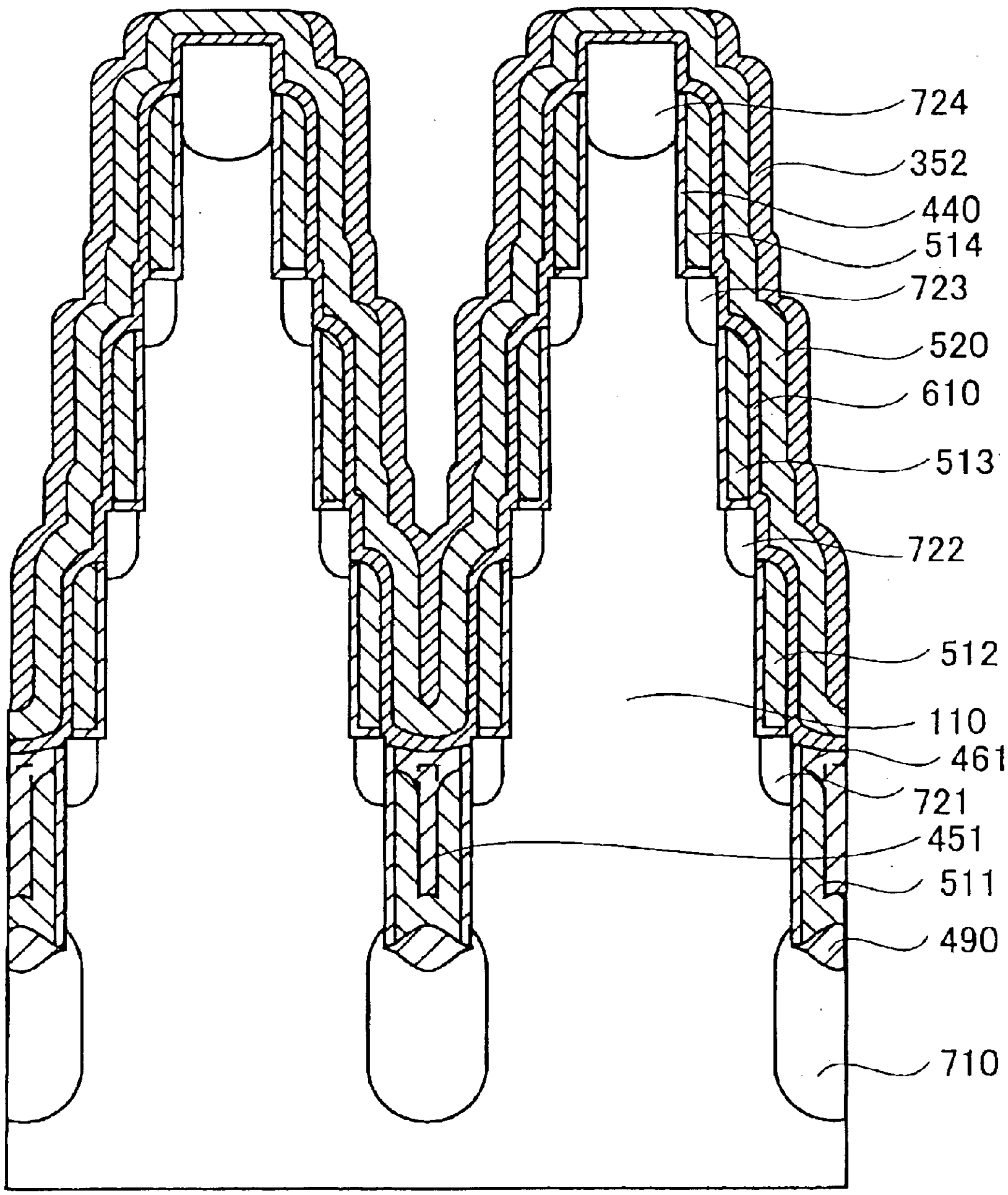
Figure 543:
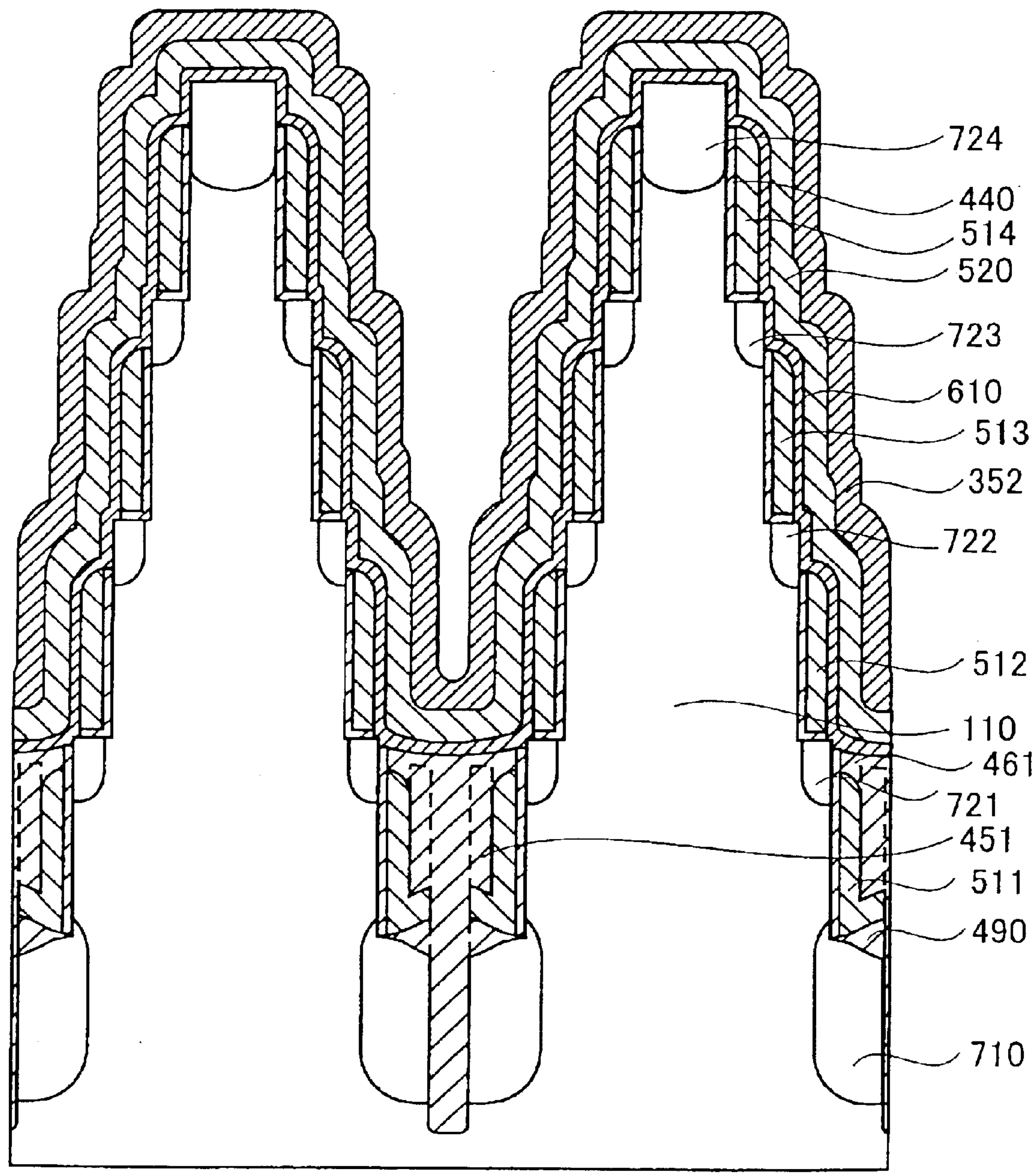
Figure 544:
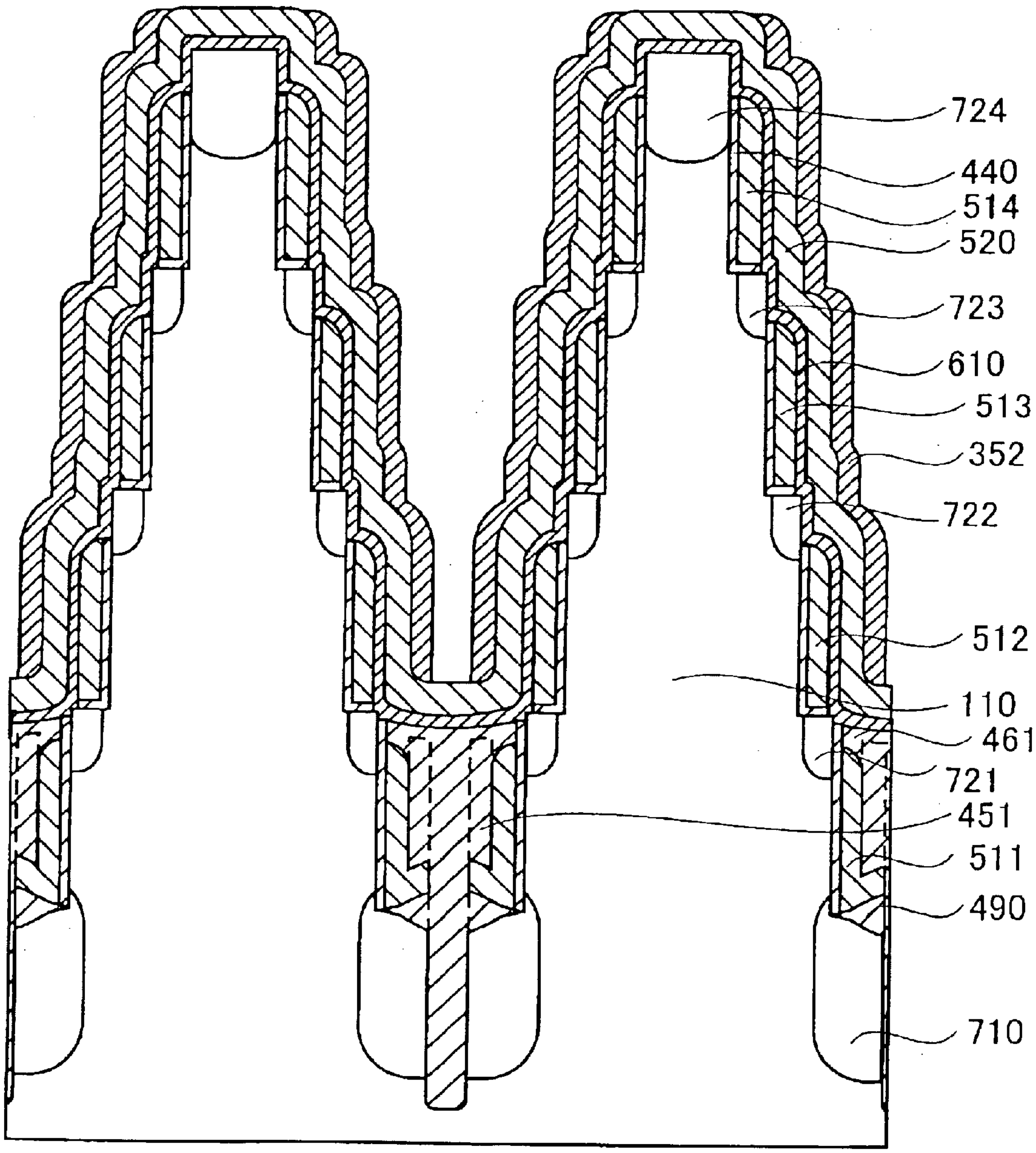

Thereafter, a silicon nitride film 352, for example, is deposited 15 to 300 nm as a fourteenth insulating film (FIG. 506 and FIG. 543). The silicon nitride film 352 is formed in the form of sidewalls of sidewalls of the polysilicon film 520 by anisotropic etching (FIG. 507 and FIG. 544). The intervals between the island-like semiconductor layers 110 and the thickness of the silicon nitride film 352 are adjusted so that the silicon nitride film 352 is continuous in direction A–A' of FIG. 1 and separate in direction B–B' of FIG. 1 at this stage of production.

Figure 508:
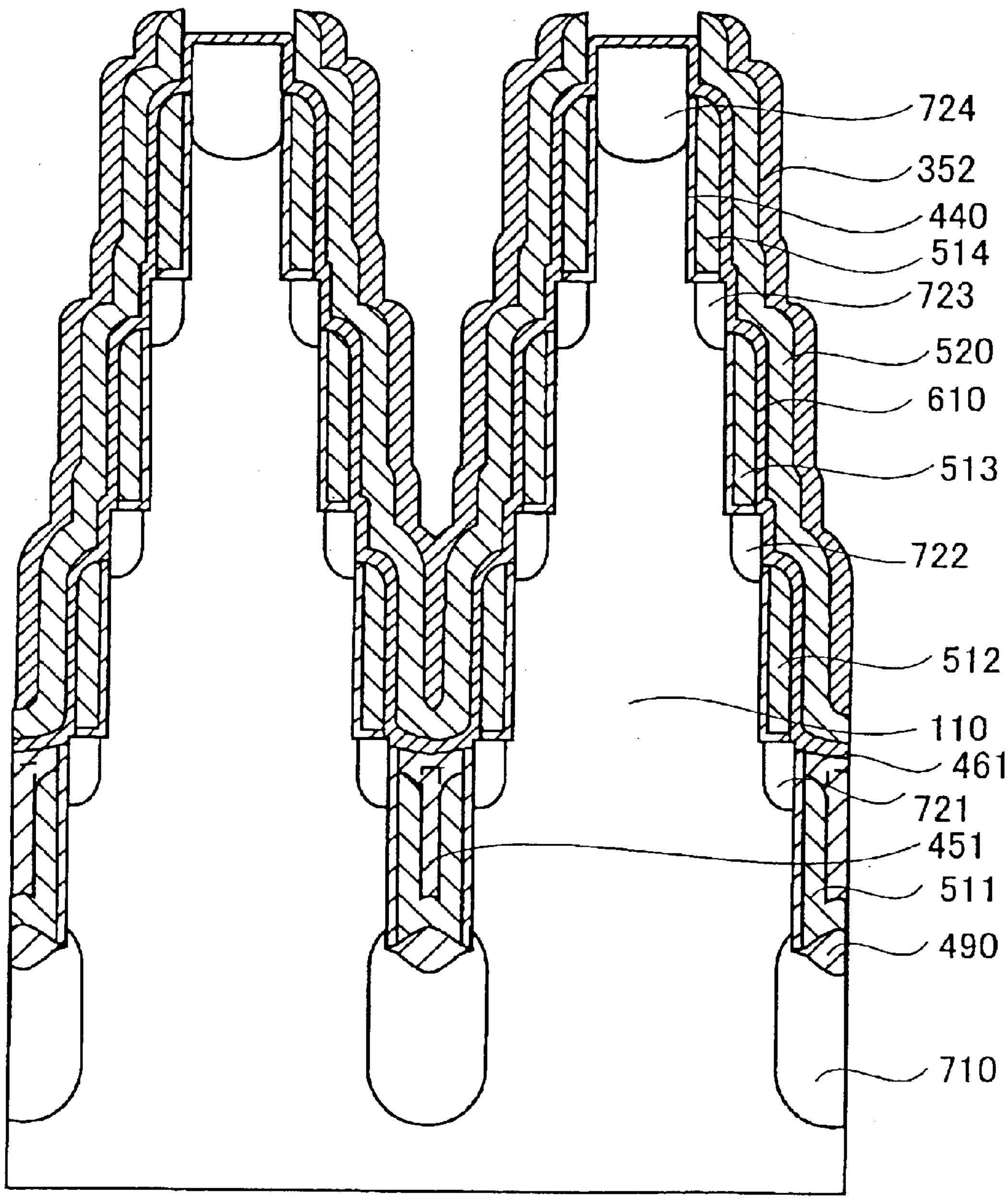
Figure 545:
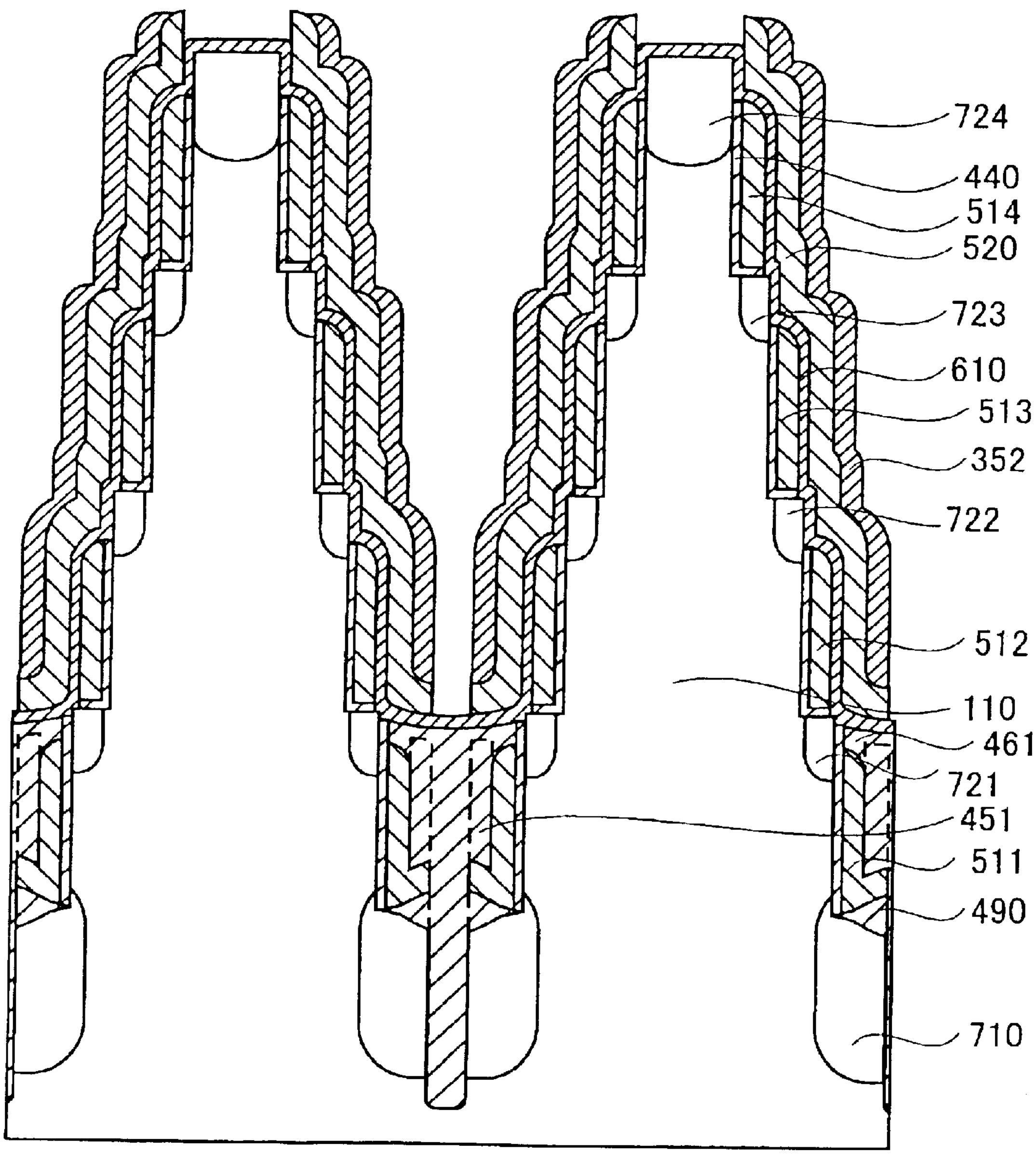

Subsequently, using the silicon nitride film 532 as a mask, the polysilicon film 520 etched by RIE so that the polysilicon film 520 is continuous only in direction A–A' of FIG. 1 and separate in direction B–B' of FIG. 1 (FIG. 508 and FIG. 545).

Figure 509:
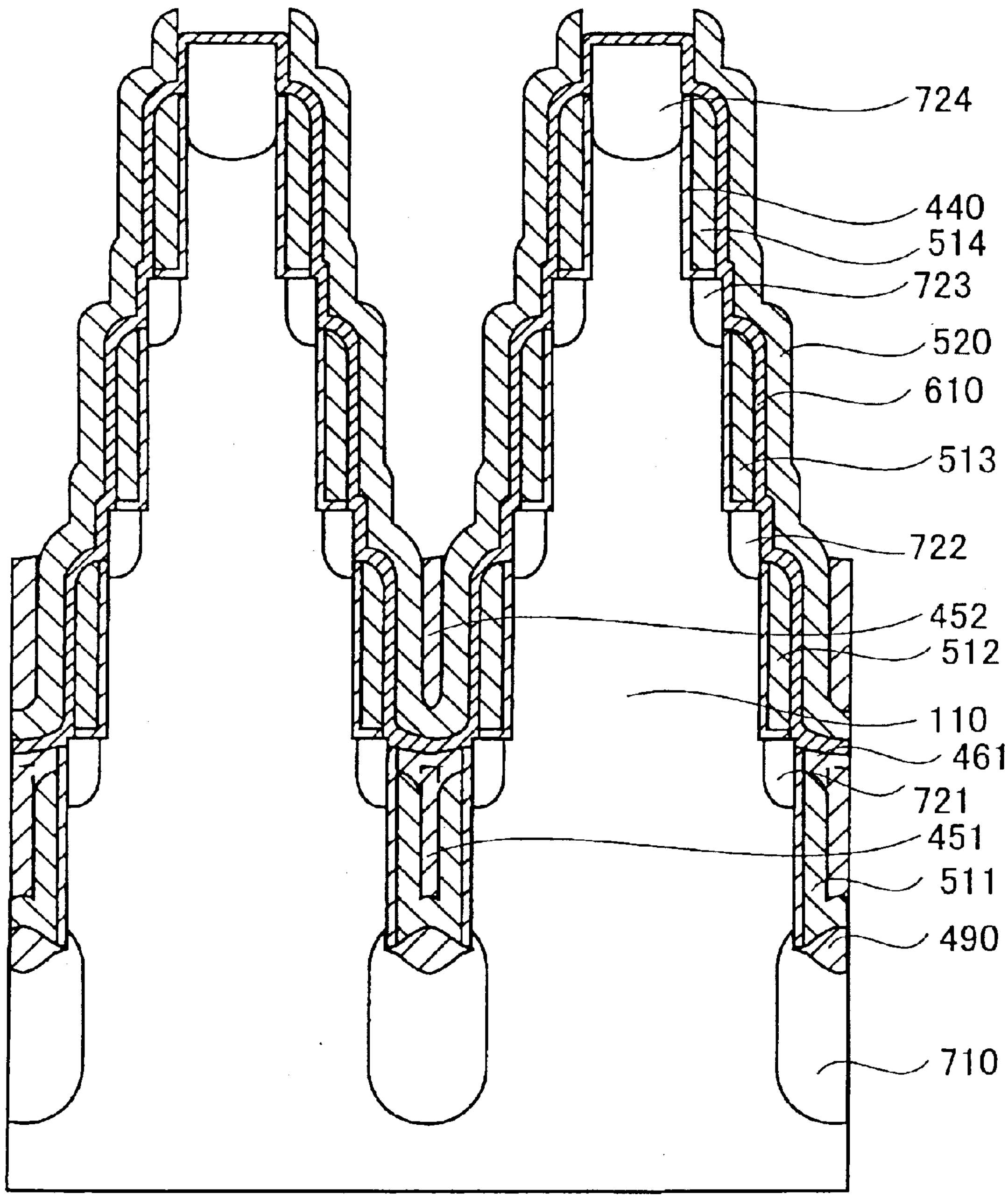
Figure 510:
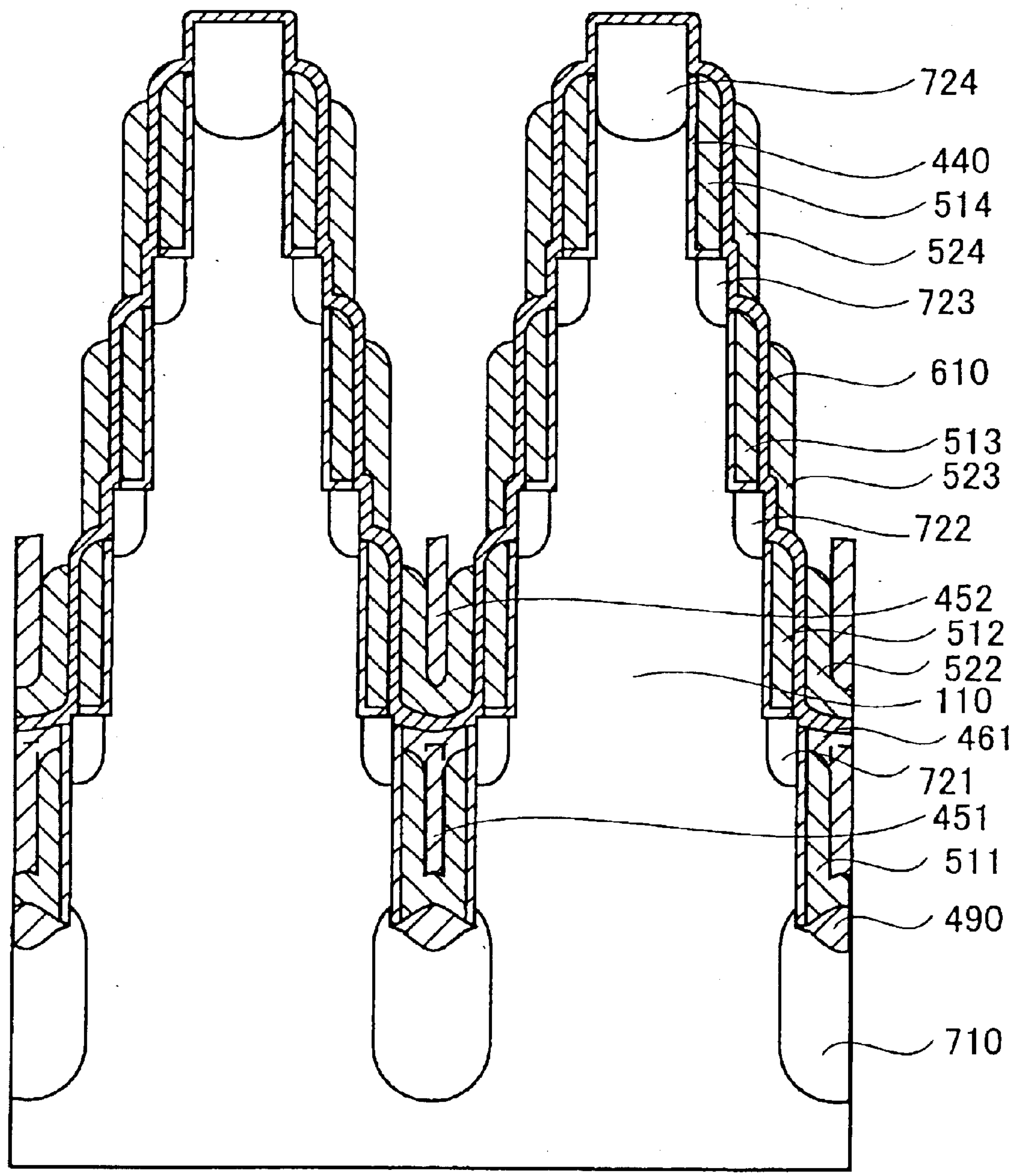
Figure 546:
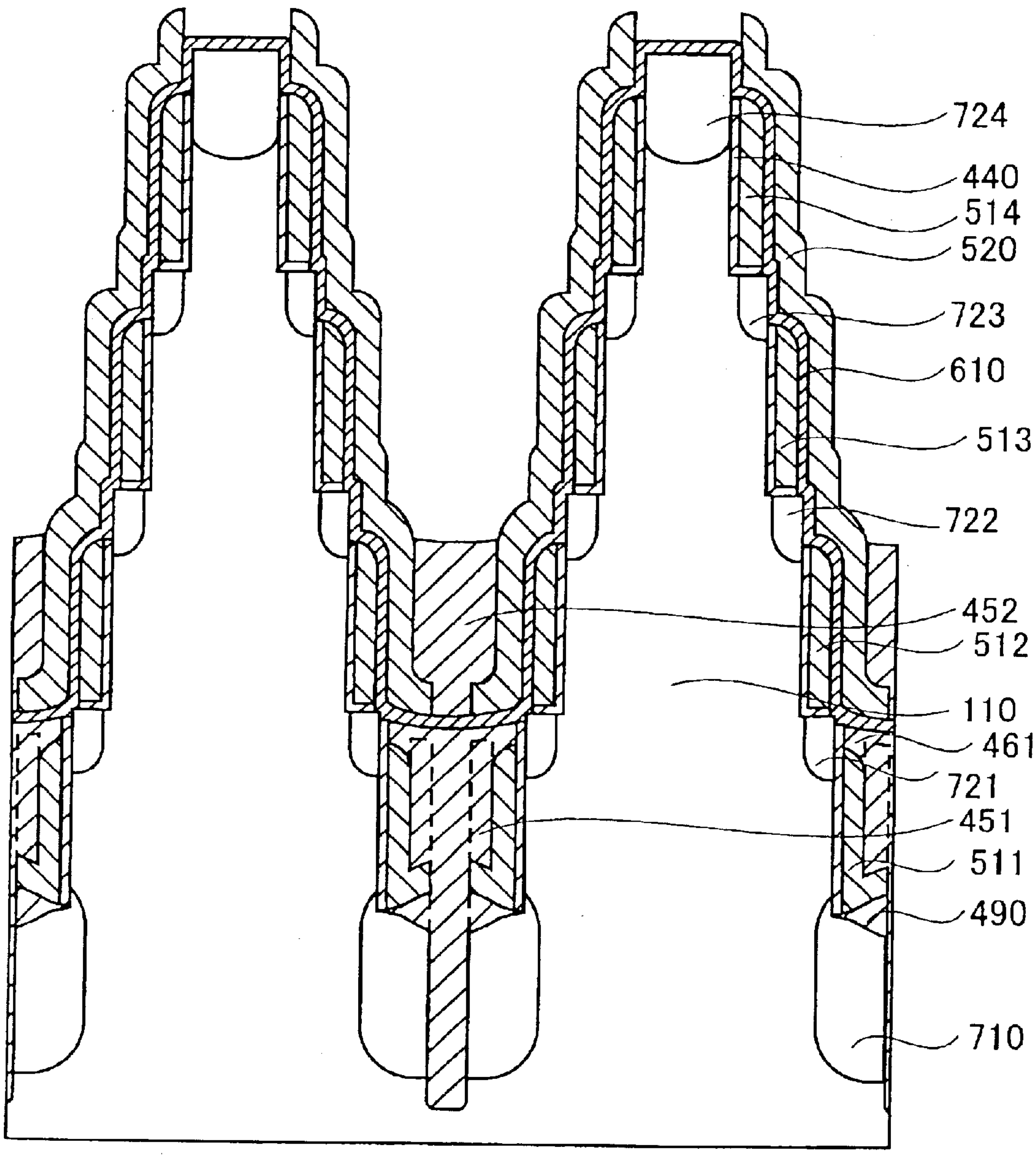
Figure 547:
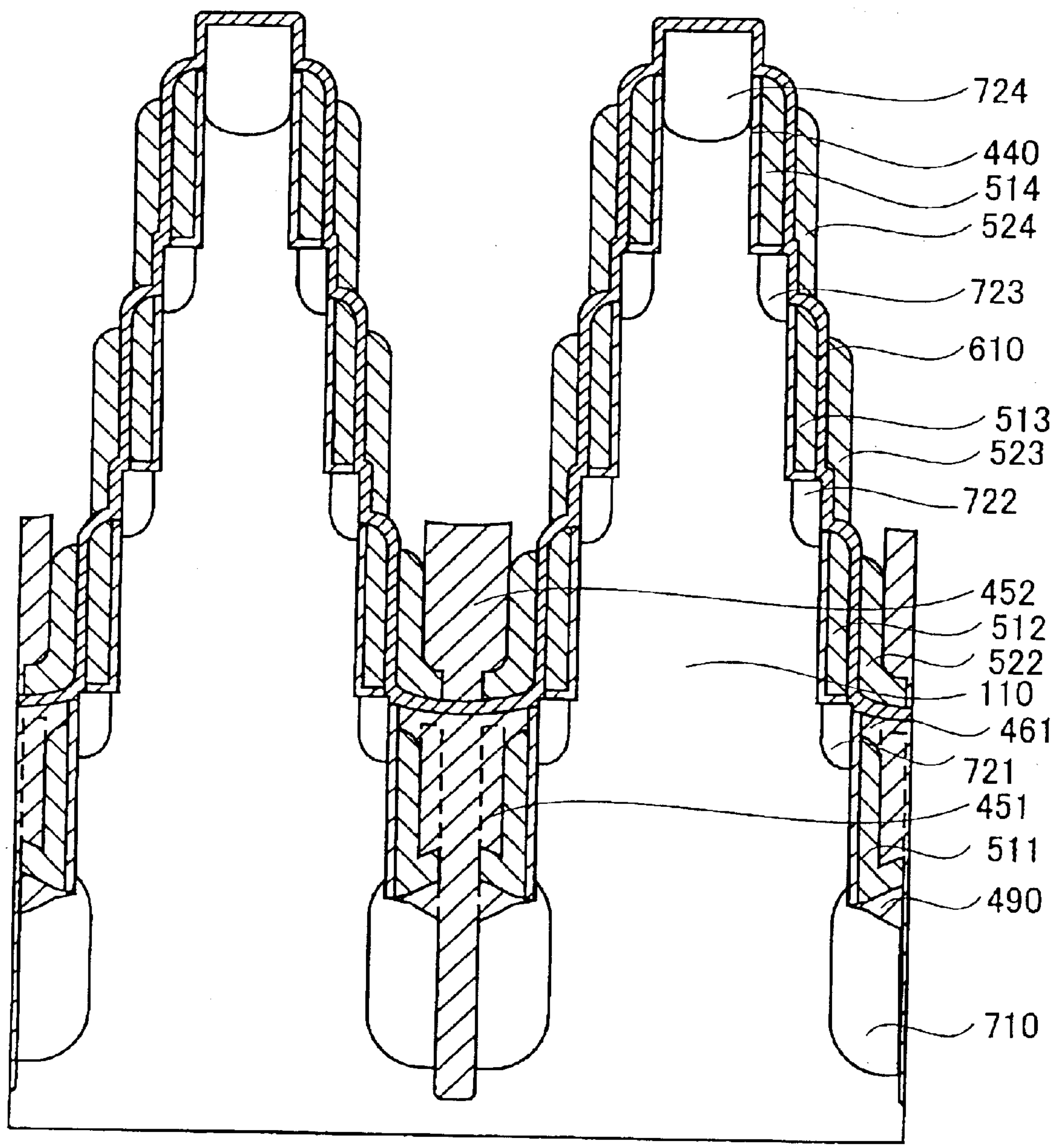

Thereafter, the silicon nitride film 352 is selectively removed by isotropic etching. Subsequently, a silicon oxide film 452 is deposited to about 20 to 200 nm as a sixth insulating film and etched back to a desired depth (FIG. 509 and FIG. 546). For example, by anisotropic etching, the polysilicon film 520 is formed in the form of sidewalls on the sidewalls of the polysilicon films 512, 513 and 514 in the tiers of the island-like semiconductor layer 110 with intervention of the interlayer insulating film 610, whereby separate polysilicon films 522, 523, and 524 are formed at the same time (FIG. 510 and FIG. 547). The control gates, i.e., polysilicon film 522, at the lower tier are formed by separation into third wiring layers to be control gate lines continuous in direction A–A' of FIG. 1.

Figure 511:
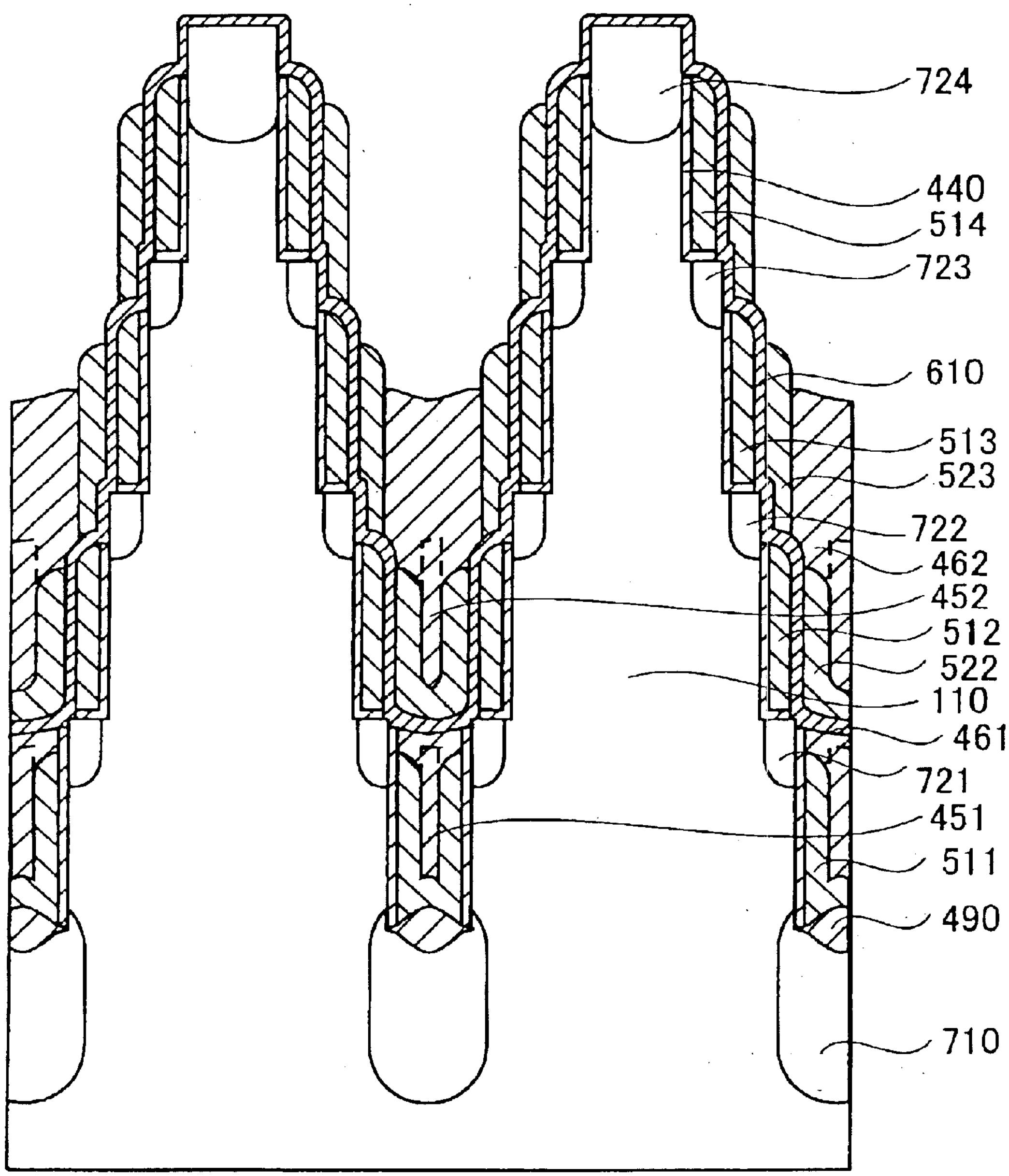
Figure 548:
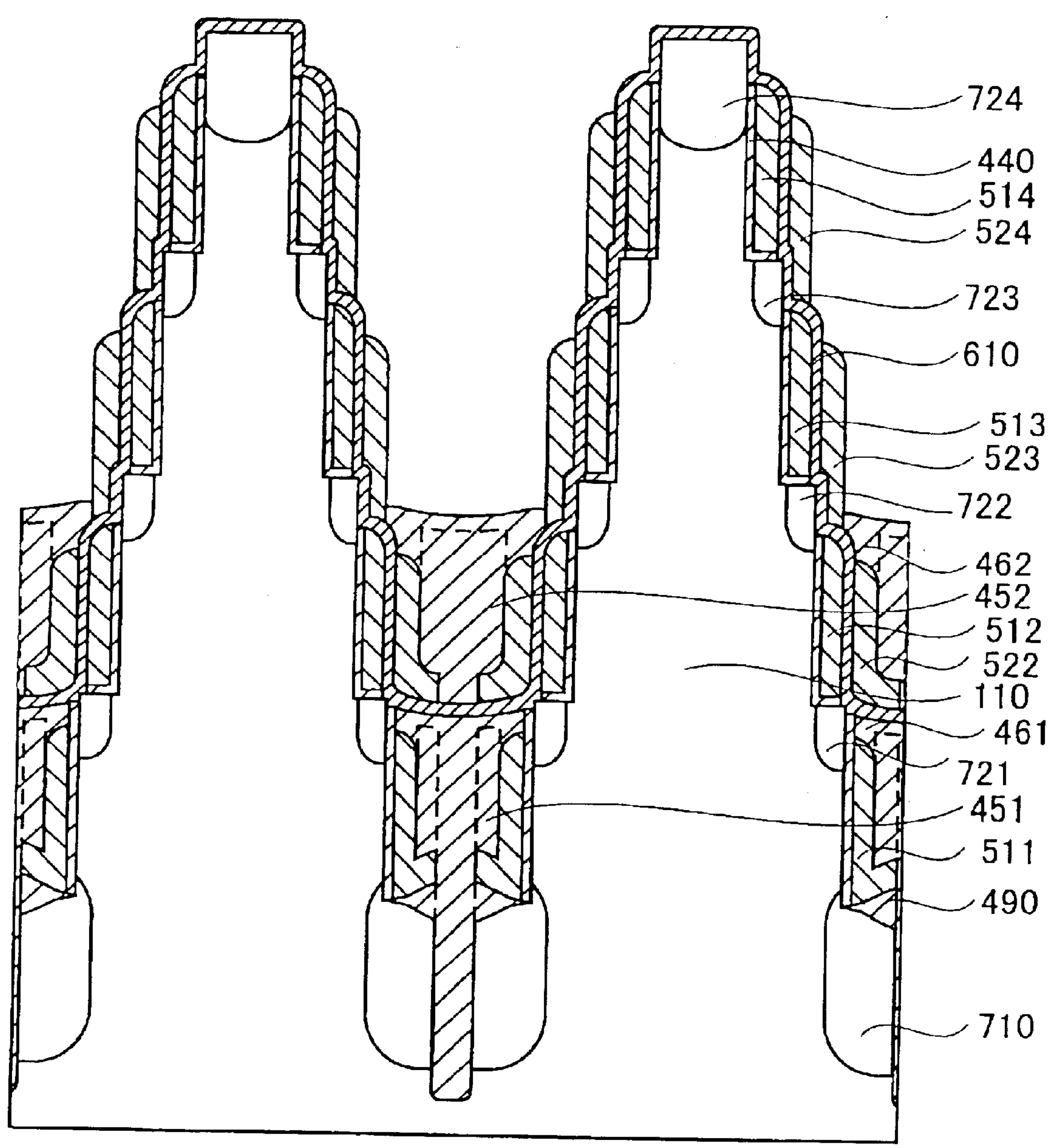

Next, a silicon oxide film 462, for example, is deposited to about 20 to 200 nm as a seventh insulating film to bury the polysilicon film 522. In this burying, the silicon oxide film 462 may be deposited to cover the island-like semiconductor layer 110 completely, followed by flattening as required, and then the silicon oxide film 462 may be etched back isotropically or anisotropically from above the semiconductor substrate so that the burying height is the same in direction A–A' and in direction B–B' of FIG. 1. Alternatively, as shown in FIG. 511 and FIG. 548, the silicon oxide film 462 may be deposited so thin that the island-like semiconductor layer is not buried completely, and thereby the deposition depth is varied in direction A–A' and in direction B–B' of FIG. 1, i.e., in small intervals and in large intervals between the island-like semiconductor layers 110. Then isotropic or anisotropic etching may be carried out so that the burying height is different in direction A–A' and in direction B–B' of FIG. 1.

By thus varying the burying height in the small intervals and in the large intervals between the island-like semiconductor layers 110, it is possible to cut the flattening process and to reduce variations in the production process owing to decrease in the etch-back amount. That is, the depth of burying the seventh insulating film or in other words the height of location of the second wiring layer and the third wiring layer may not be the same in direction A–A' and in direction B–B' of FIG. 1, but may be different and thereby the semiconductor memory can be produced with good control by a reduced number of production steps.

The above-described burying method can be realized in the case where the intervals between the island-like semiconductor layers 110 are different in direction A–A' and in direction B–B' of FIG. 1. If the intervals are the same in direction A–A' and in direction B–B', the burying height is the same. However, to this case, the above-described burying method may be applied. Also the above-described burying method may be applied to a closest packing deposition as shown in FIG. 2 and is applicable to any deposition of the island-like semiconductor layers 110.

Figure 512:
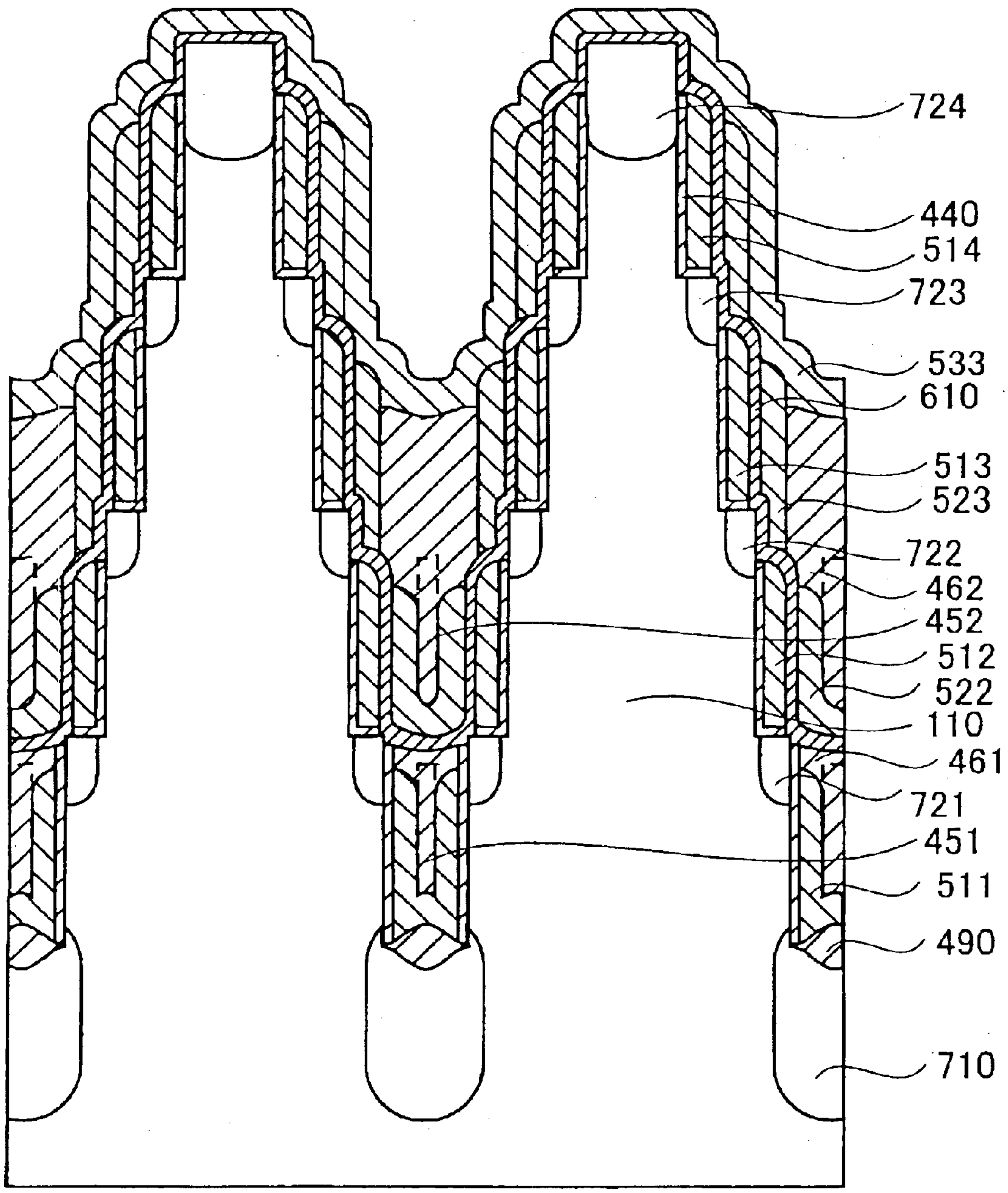
Figure 549:
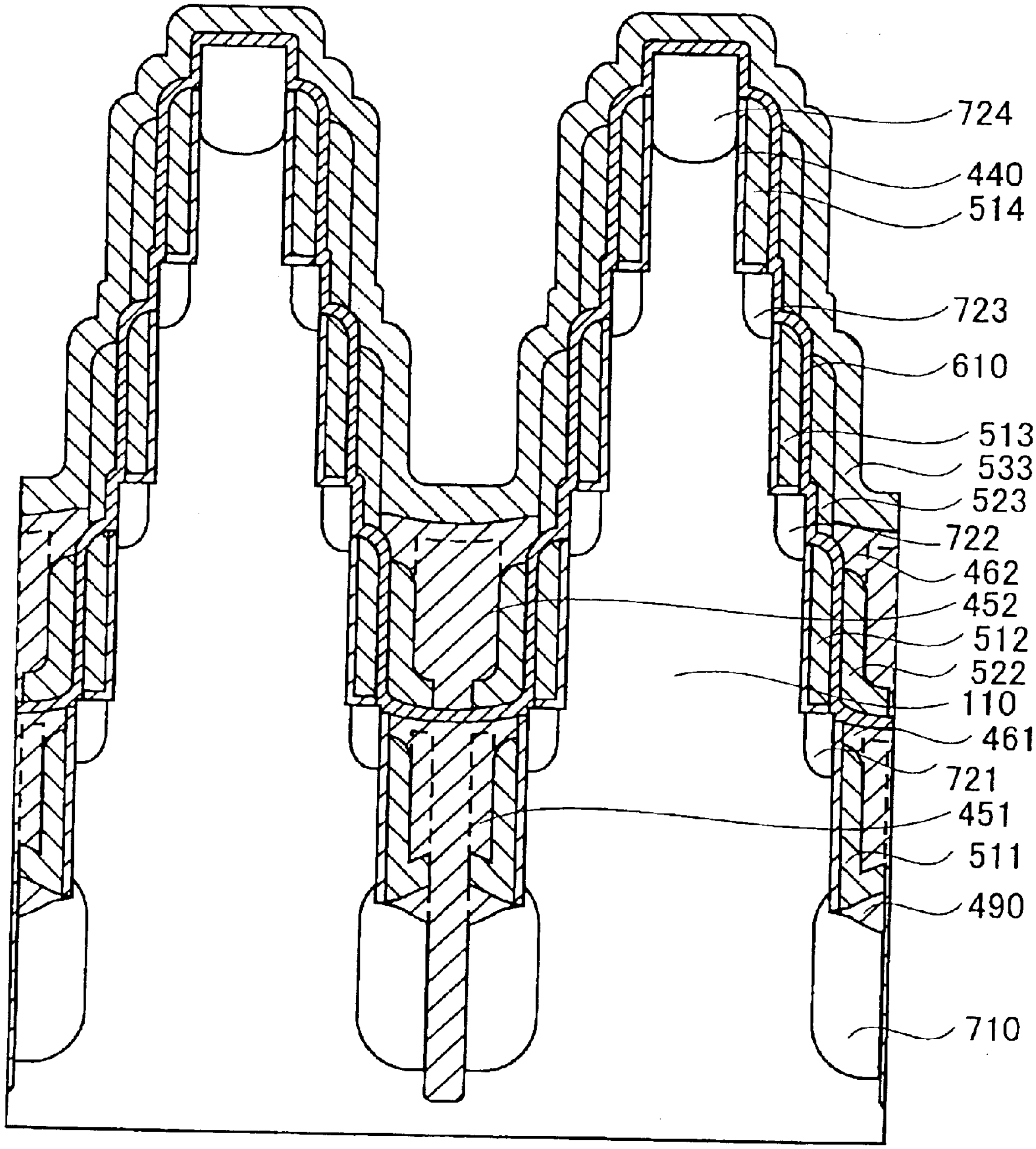

Subsequently, a polysilicon film 533, for example, is deposited to 15 to 150 nm as a third conductive film (FIG. 512 and FIG. 549). At this time, because of the different burying height of the silicon oxide film 462, the height of location of the polysilicon film 533 differs in direction A–A' and in direction B–B' of FIG. 1, being higher in direction A–A'.

Figure 513:
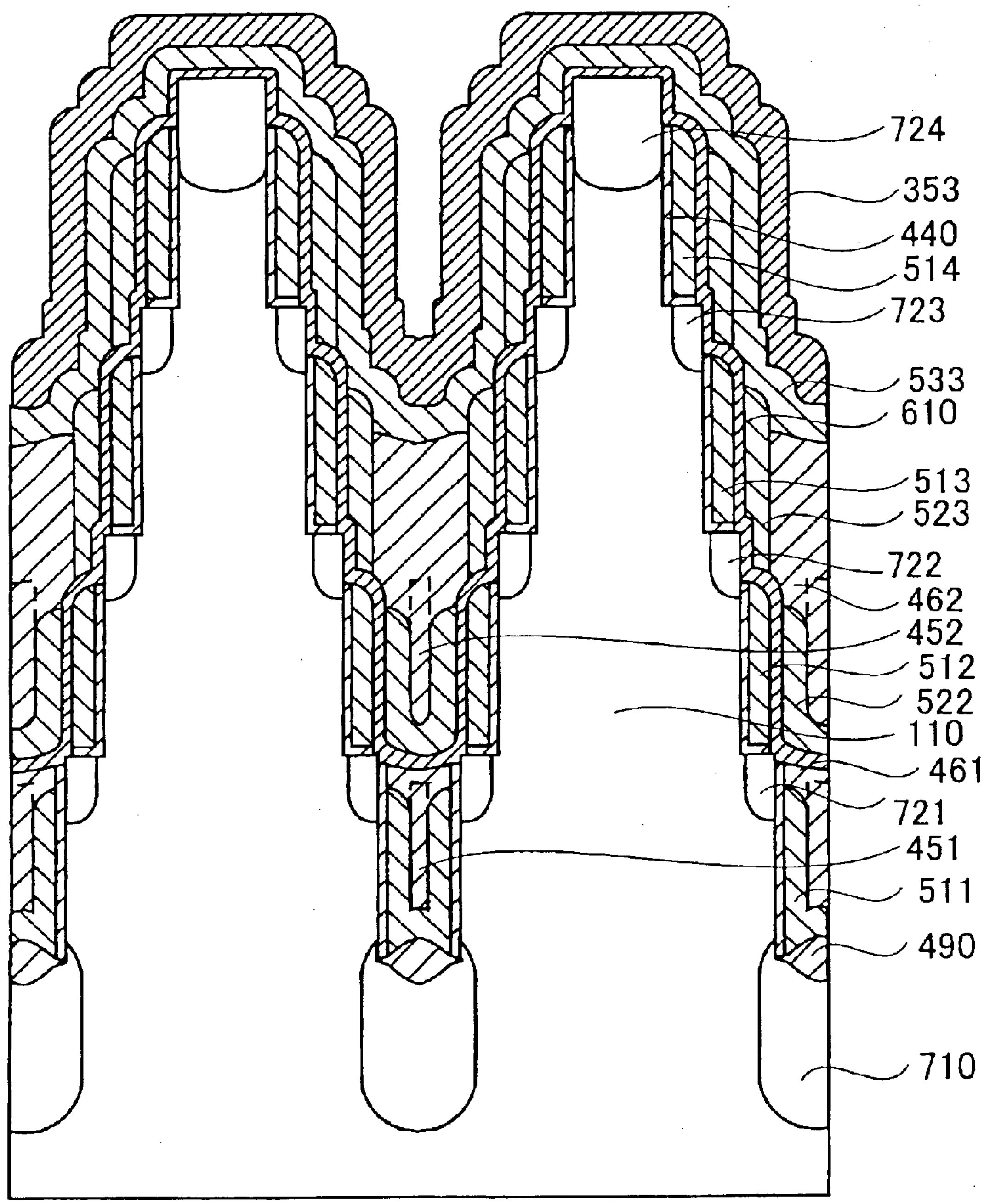
Figure 550:
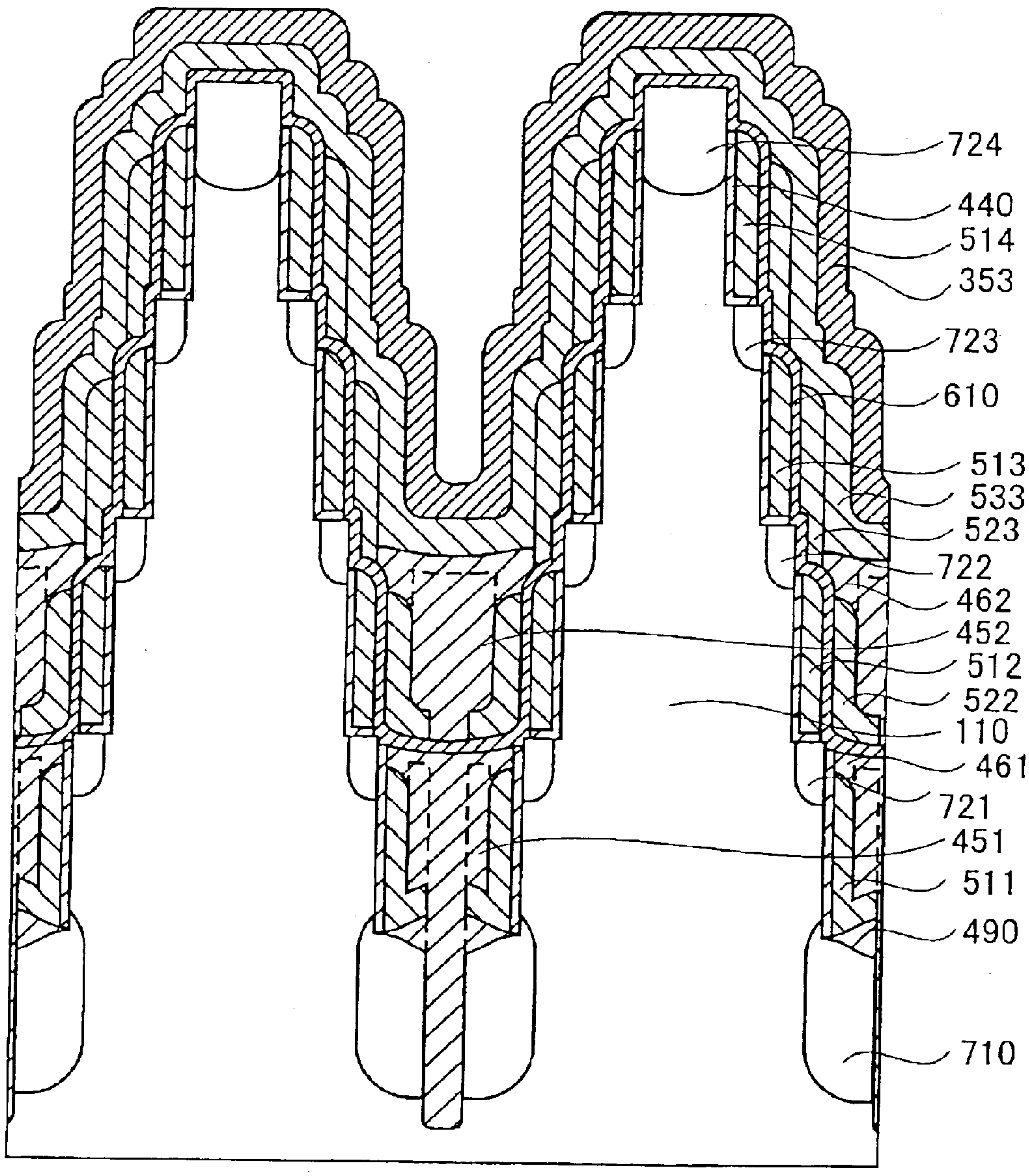

Thereafter, a silicon nitride film 353, for example, is deposited to about 15 to 300 nm as a fourteenth insulating film (FIG. 513 and FIG. 550) and is formed in a sidewall form on sidewalls of the polysilicon film 533. The intervals between the island-like semiconductor layers 110 and the thickness of the silicon nitride film 353 are so adjusted that, at this time, the silicon nitride film 353 is continuous in direction A–A' of FIG. 1 and discontinuous in direction B–B'.

Figure 514:
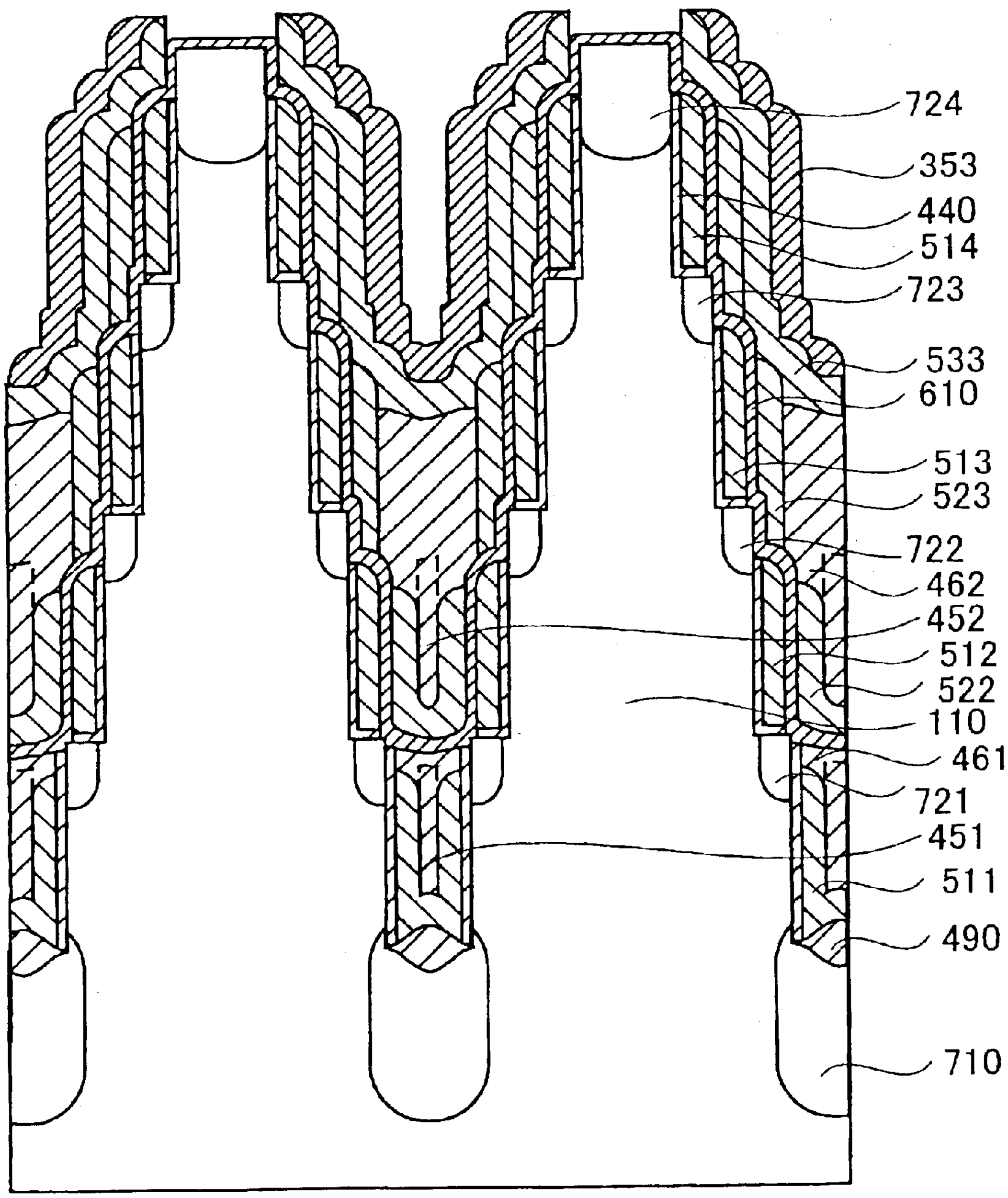
Figure 515:
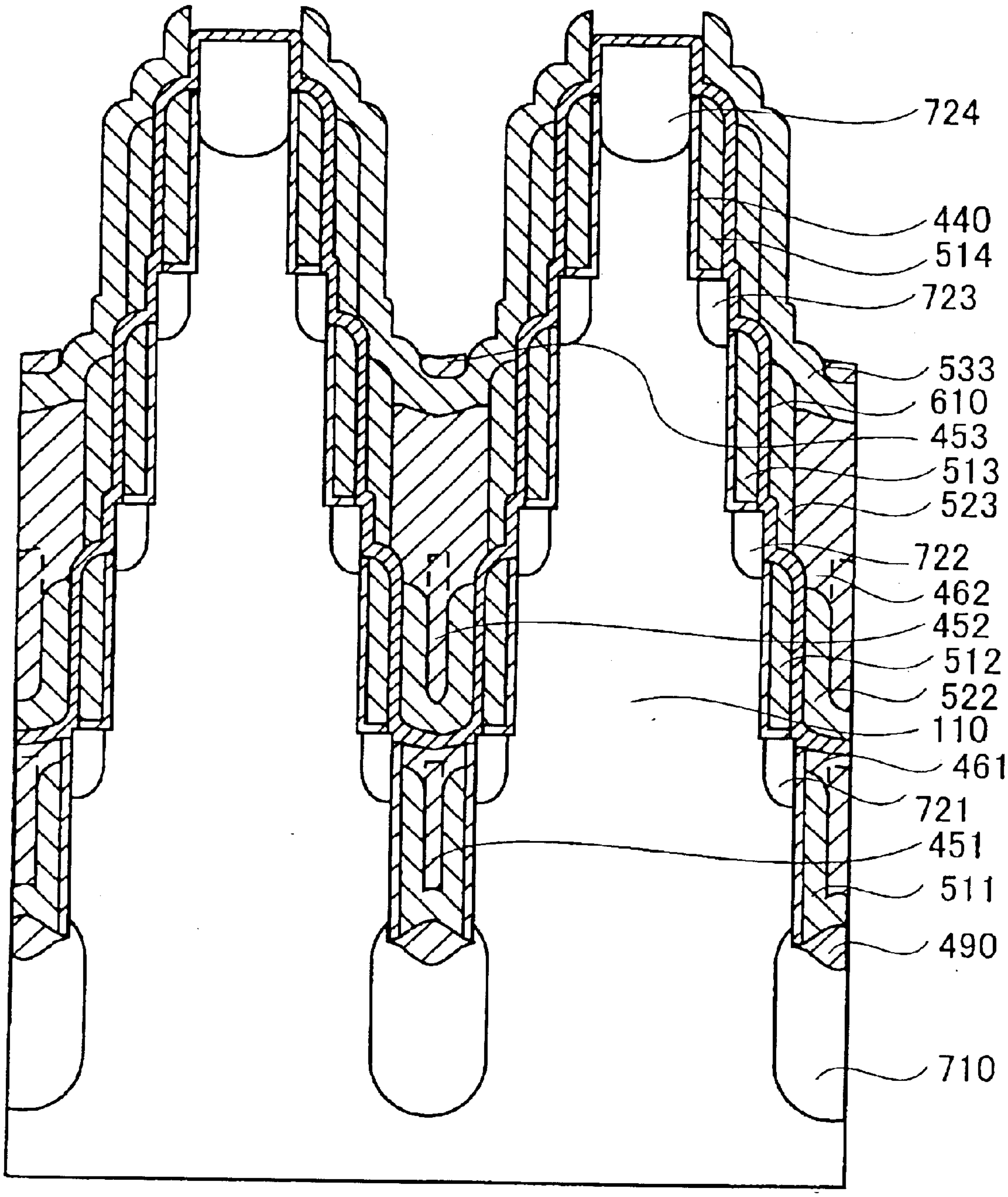
Figure 551:
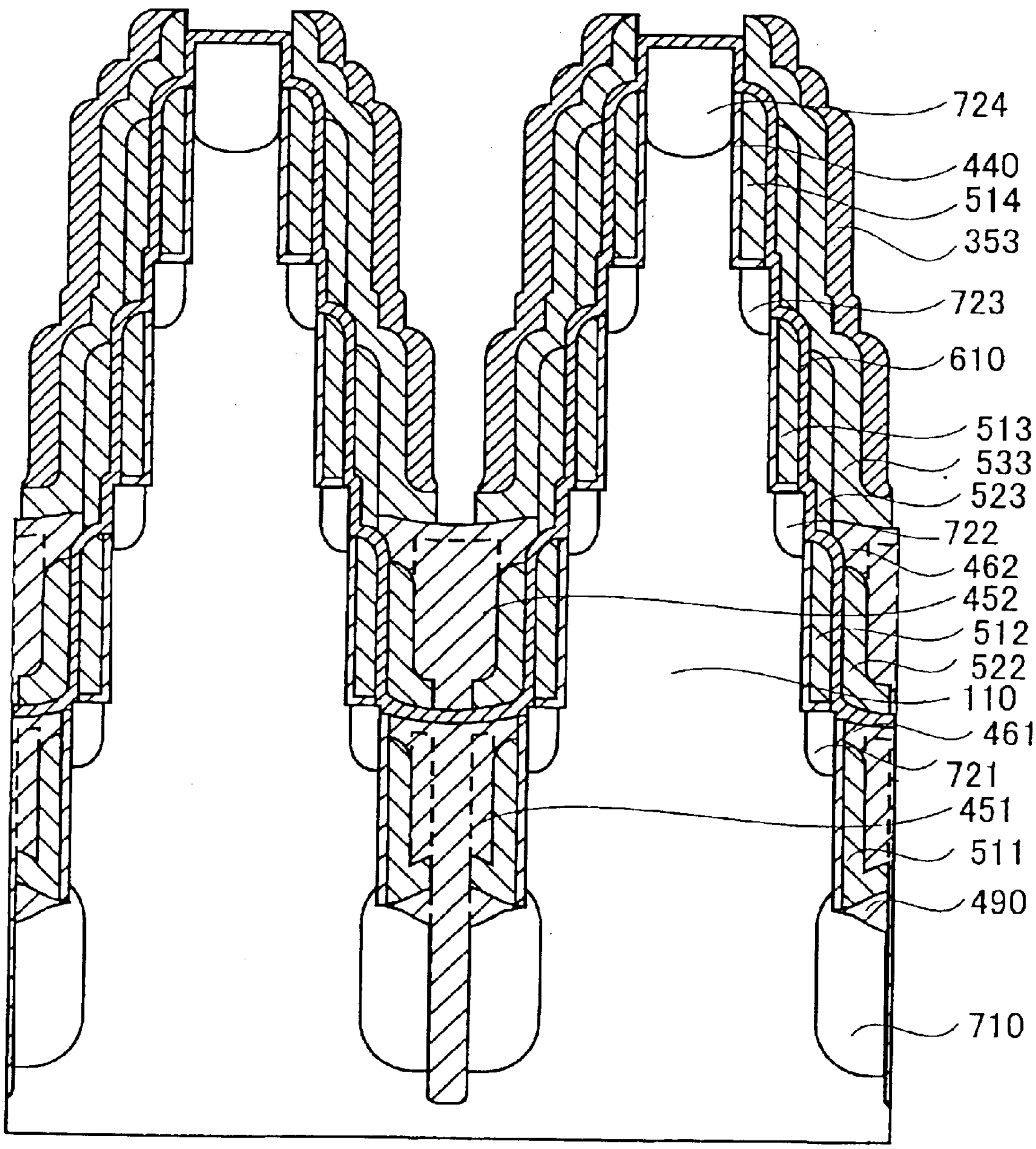
Figure 552:
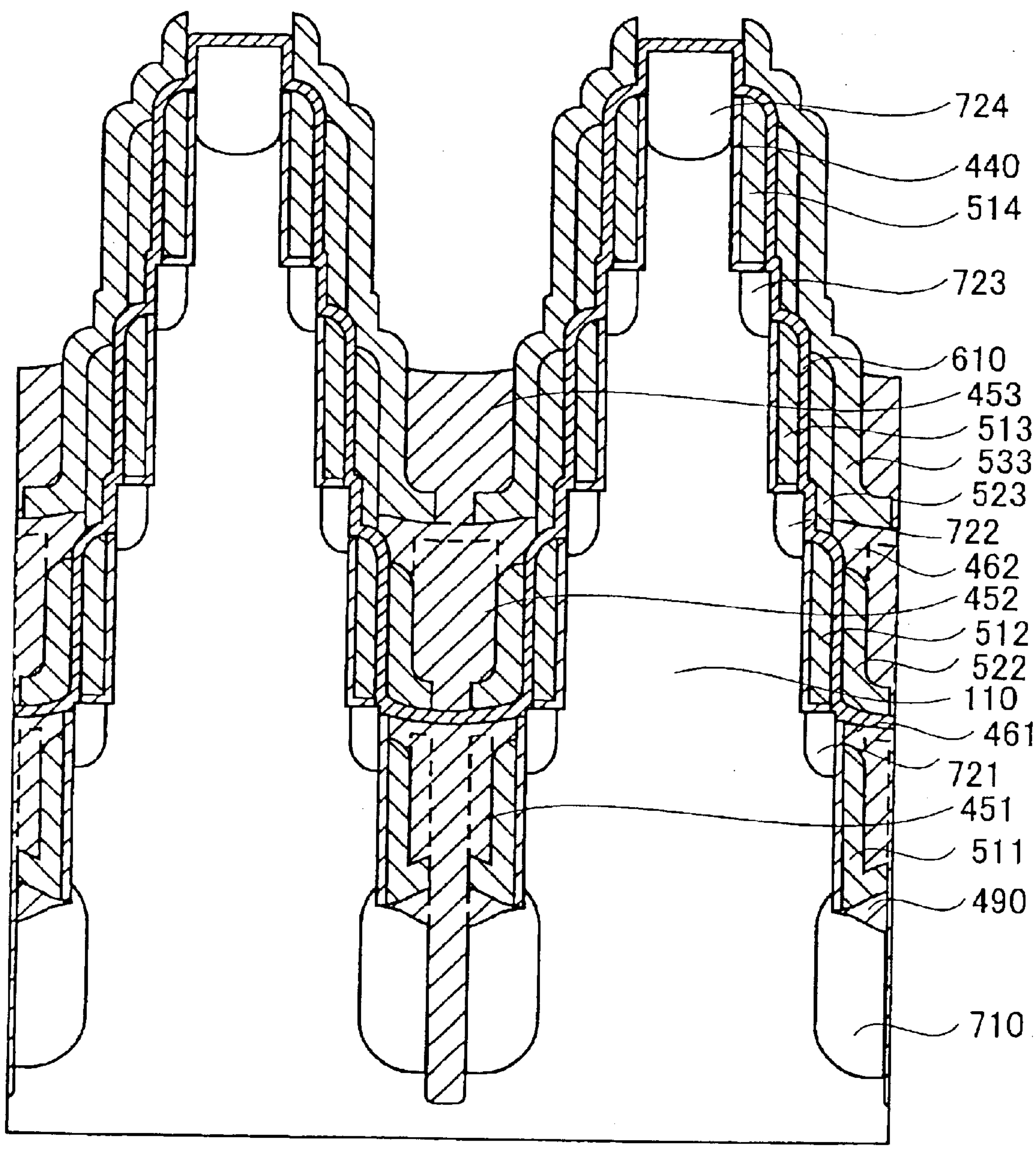

Subsequently, using the silicon nitride film 353 as a mask, the polysilicon film 533 is etched, for example, by RIE so that the polysilicon film 533 is continuous only in direction A–A' of FIG. 1 and discontinuous in direction B–B' (FIG. 514 and FIG. 551).

Figure 516:
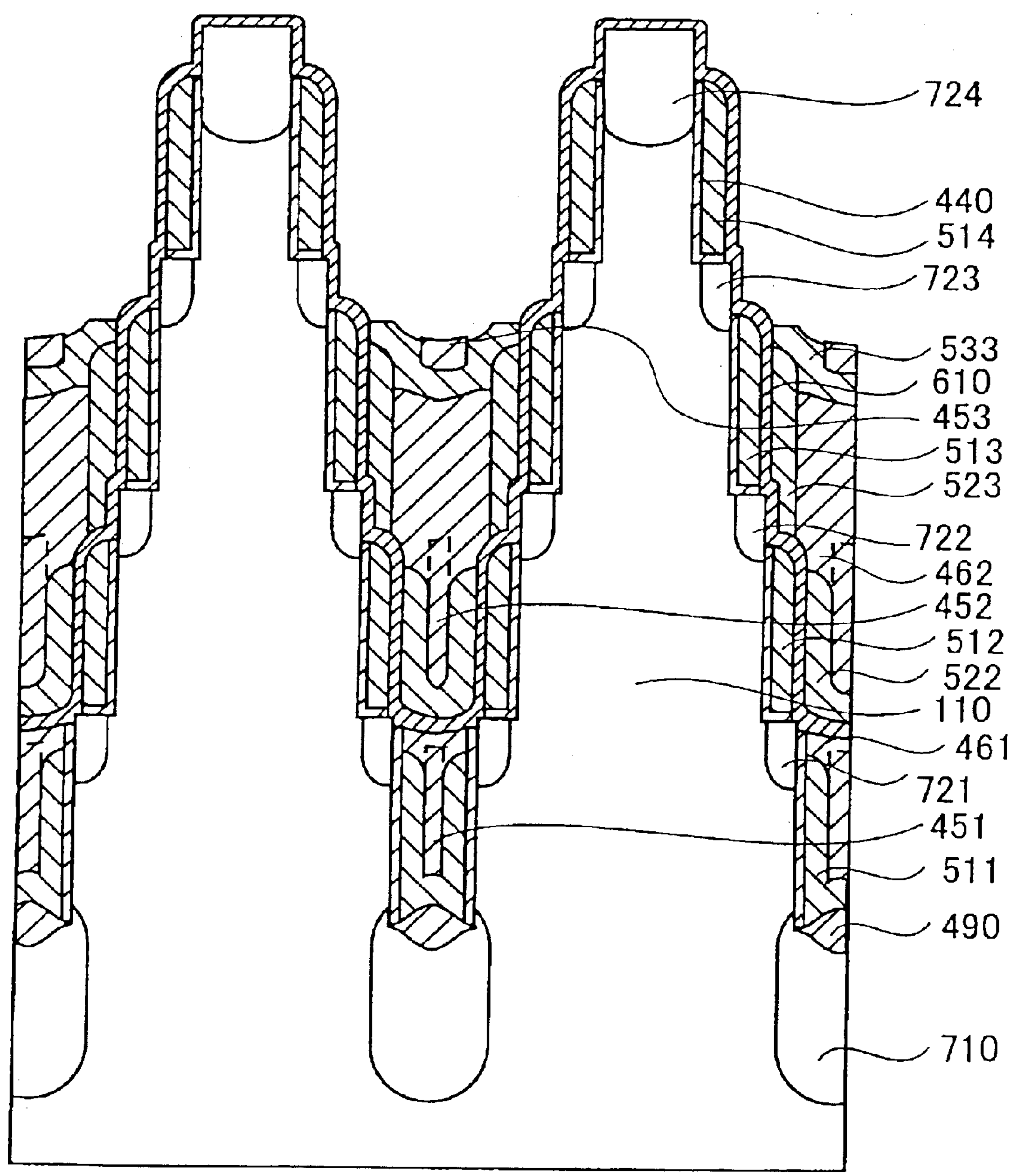
Figure 553:
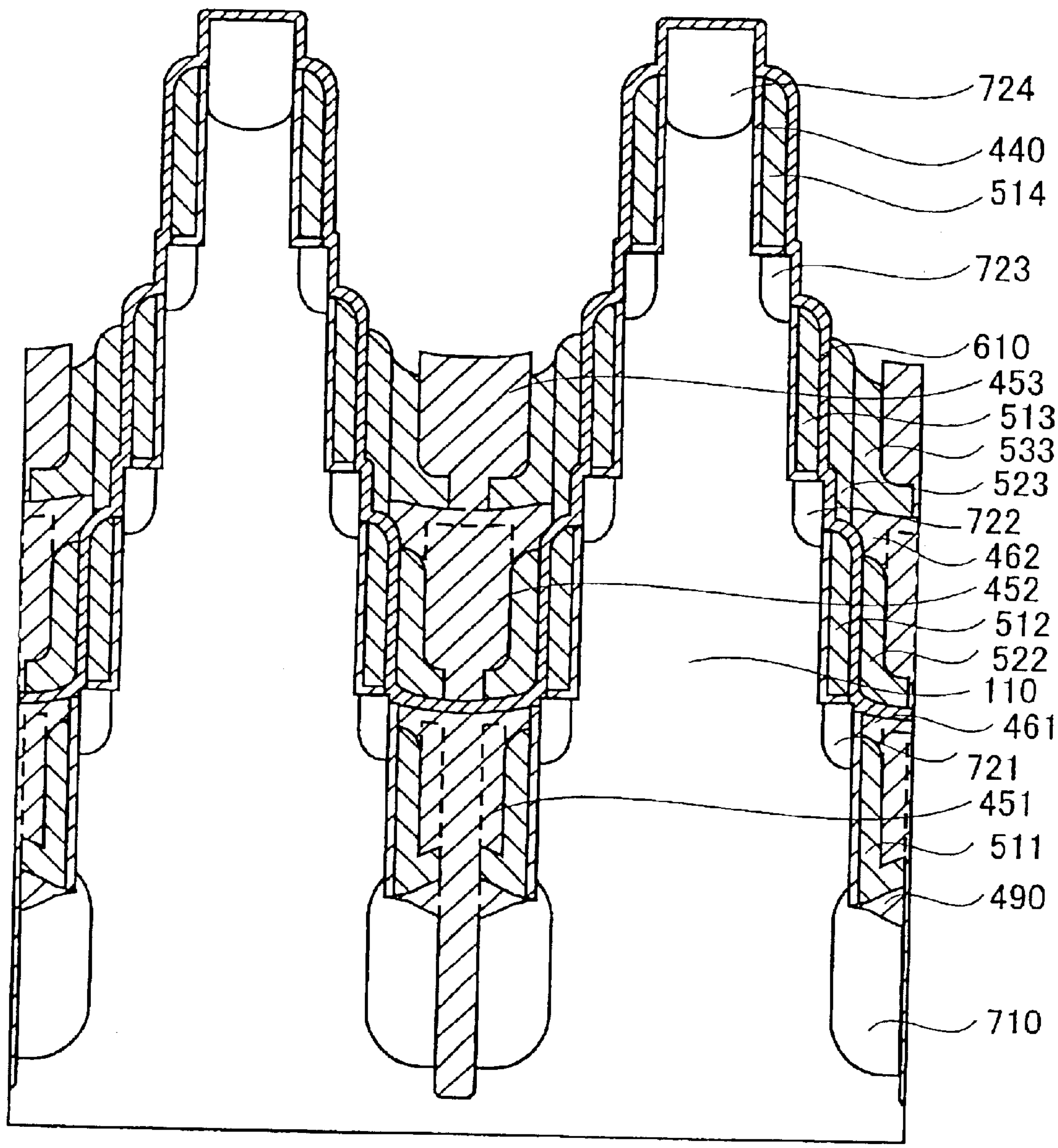

Thereafter, the silicon nitride film 353 is selectively removed by isotropic etching. Subsequently, a silicon oxide film 453, for example, is deposited to about 20 too 200 nm as a sixth insulating film and etched back to a desired depth. Using the silicon oxide film 453 as a mask, an exposed part of the polysilicon film 533 and the polysilicon film 524 are selectively removed by isotropic etching (FIG. 516 and FIG. 553). Thereby the control gate in the upper tier, i.e., the polysilicon film 523, and the polysilicon film 533 as the third conductive film are formed by separation into third wiring layers to be control gate lines continuous in direction A–A' of FIG. 1.

Figure 517:
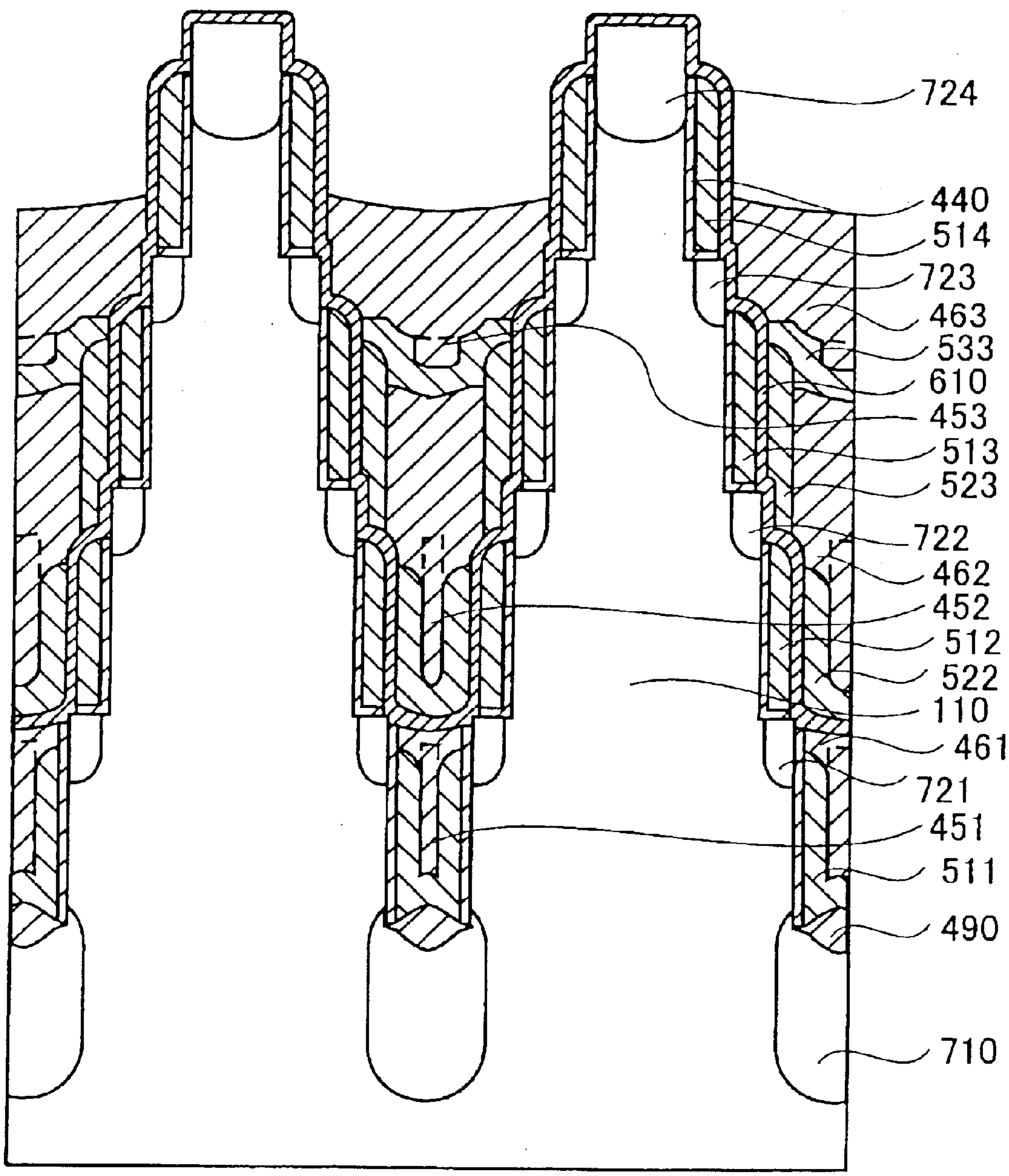
Figure 554:
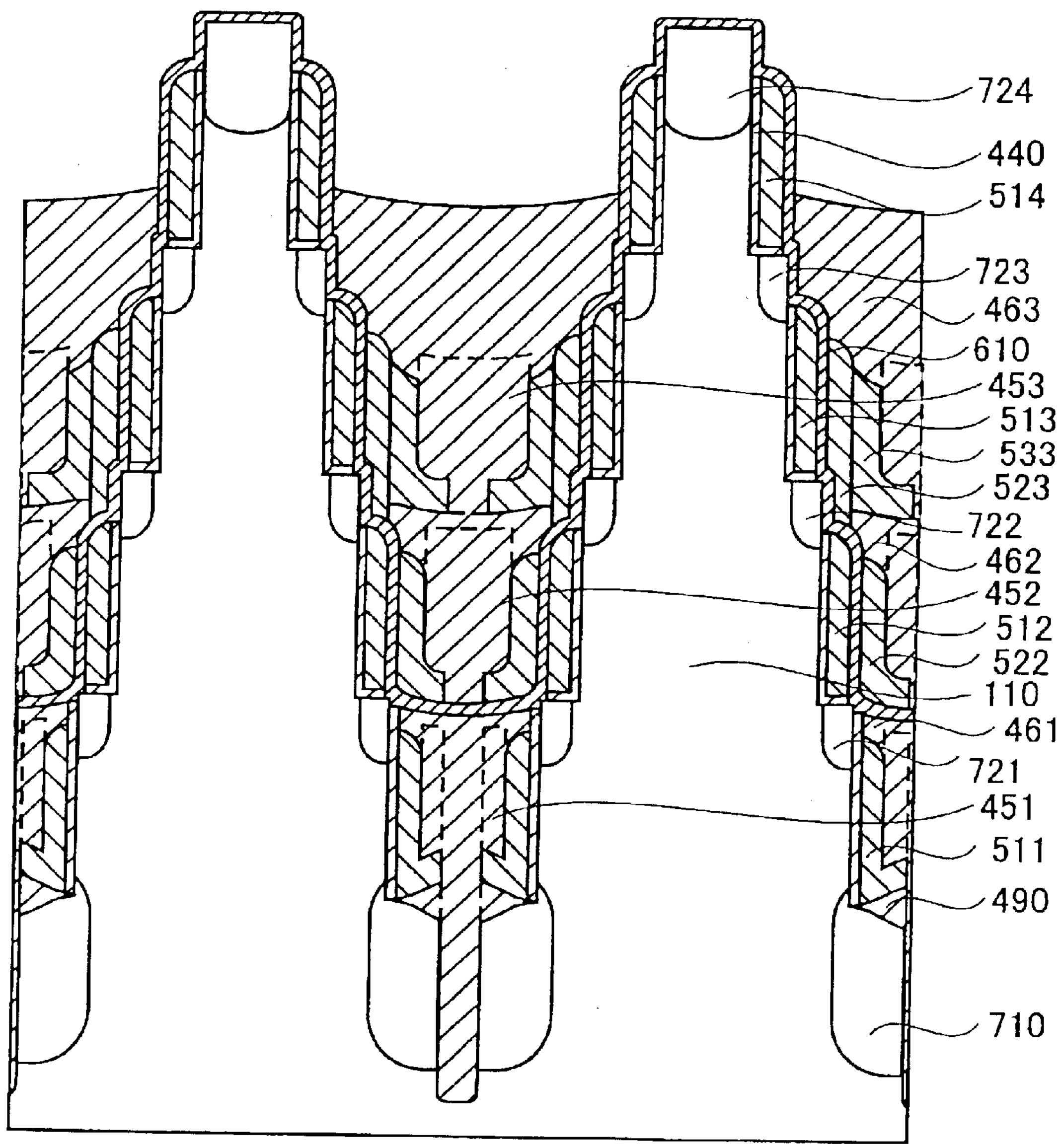

Next, a silicon oxide film 463, for example, is deposited to about 20 to 400 nm as a seventh insulating film and is isotropically etched to be buried and cover the polysilicon film 523 and the top of the polysilicon film 533 (FIG. 517 and FIG. 554).

Figure 518:
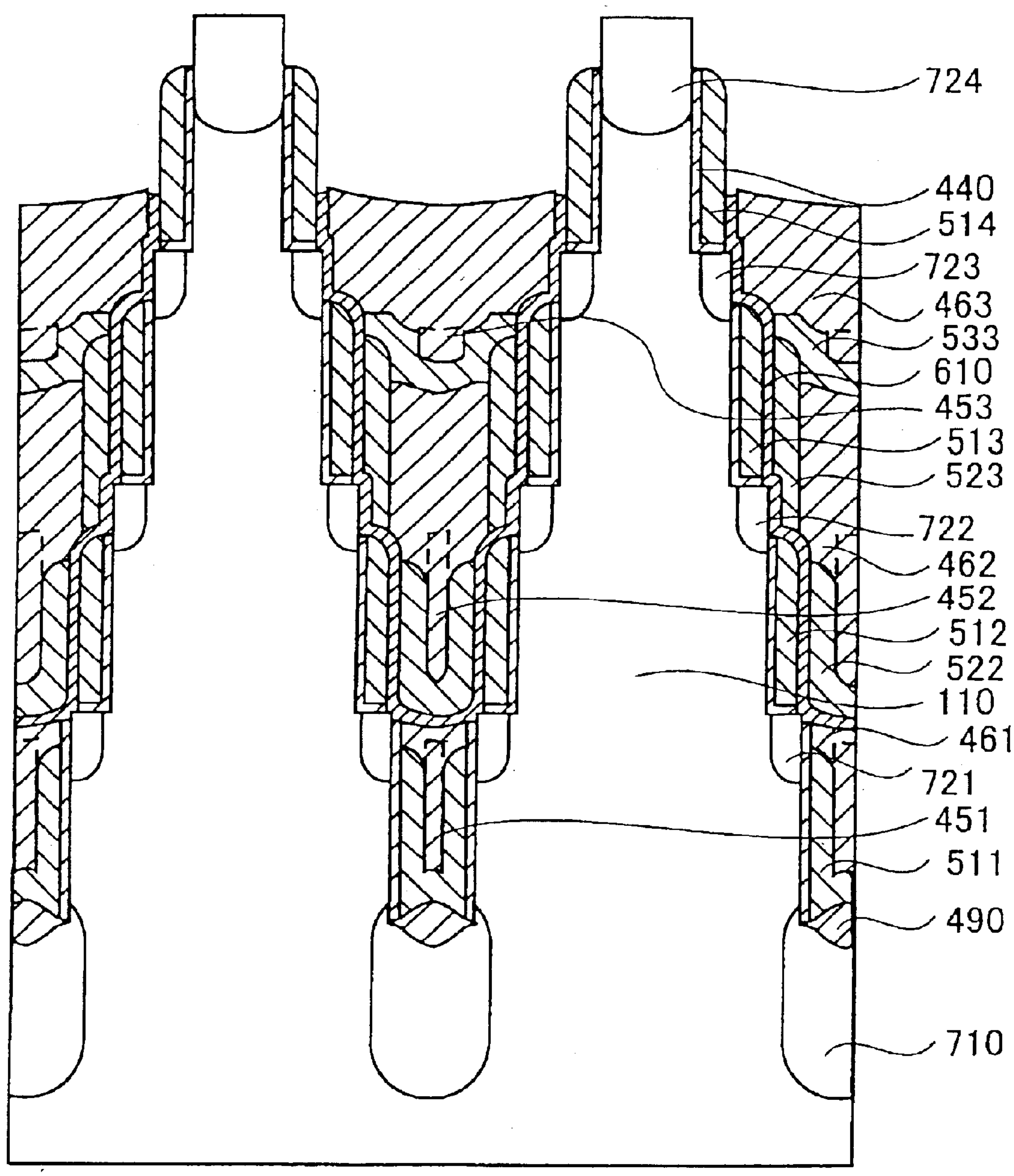
Figure 555:
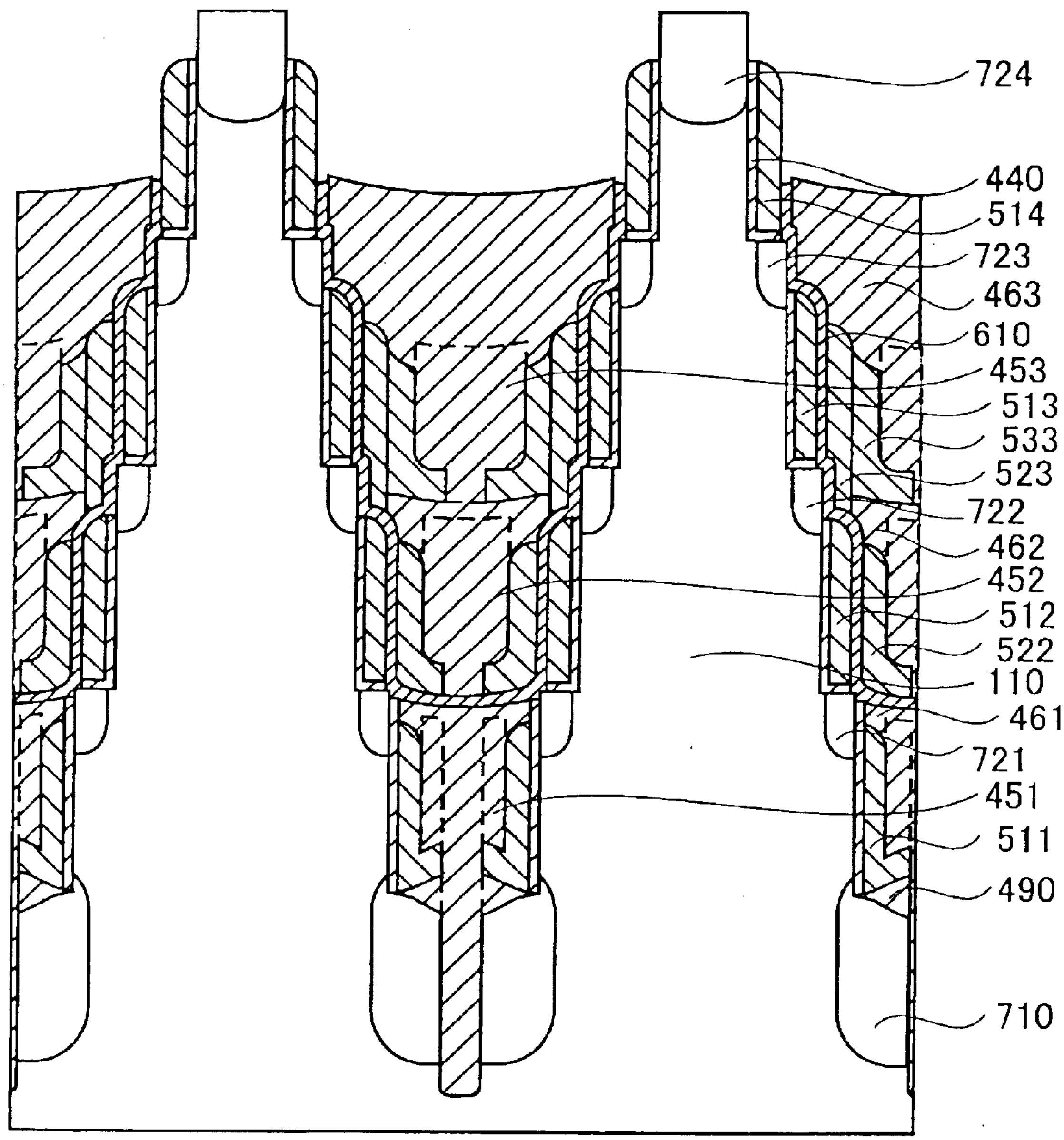

Thereafter, the interlayer insulating film 610 exposed with respect to the silicon oxide film 463 is removed to expose at least a part of the selection gate, i.e., the polysilicon film 514, which is formed on the top of the island-like semiconductor layer 110 and the uppermost tier of the island-like semiconductor layer 110 (FIG. 518 and FIG. 555).

Figure 519:
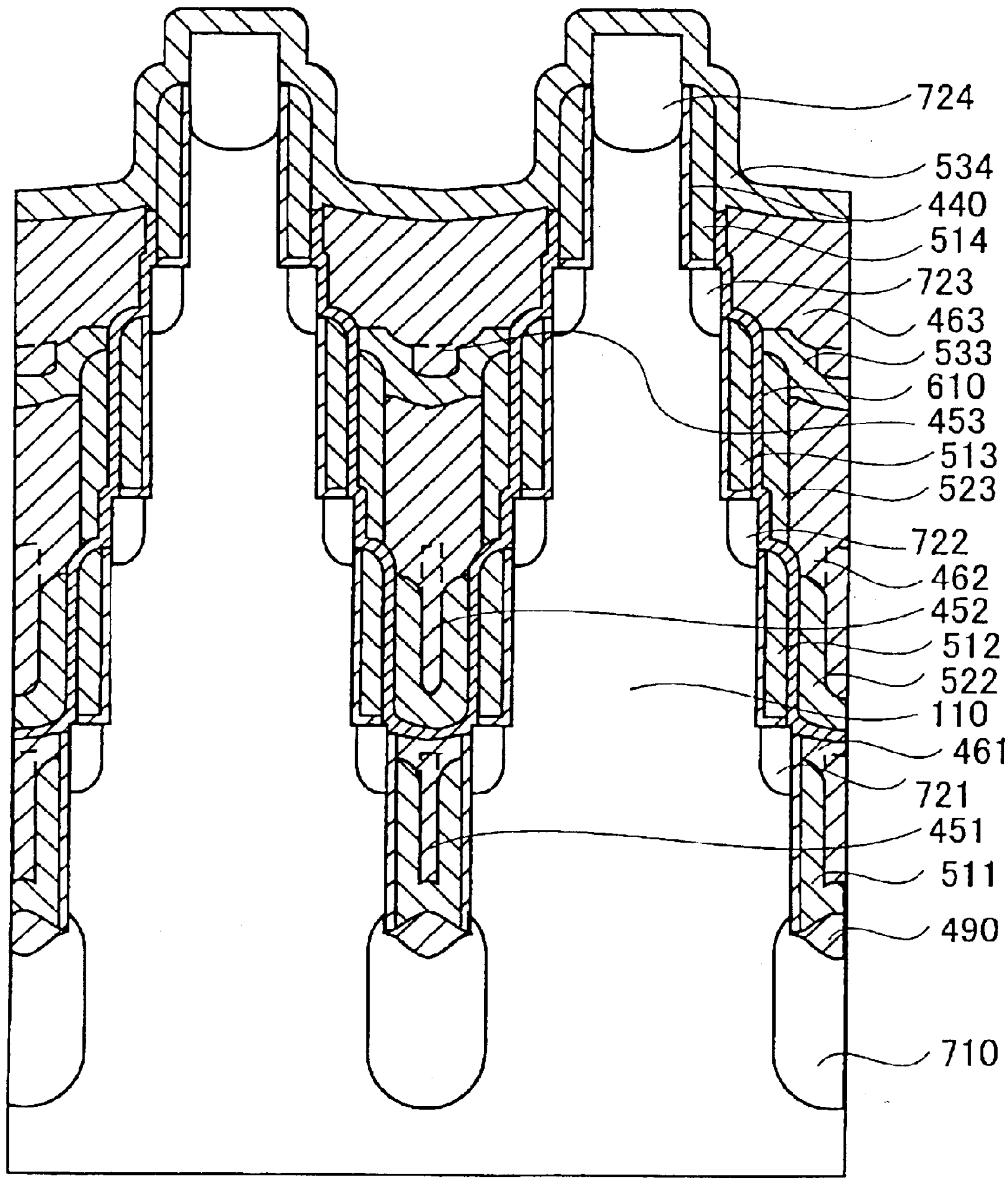
Figure 556:
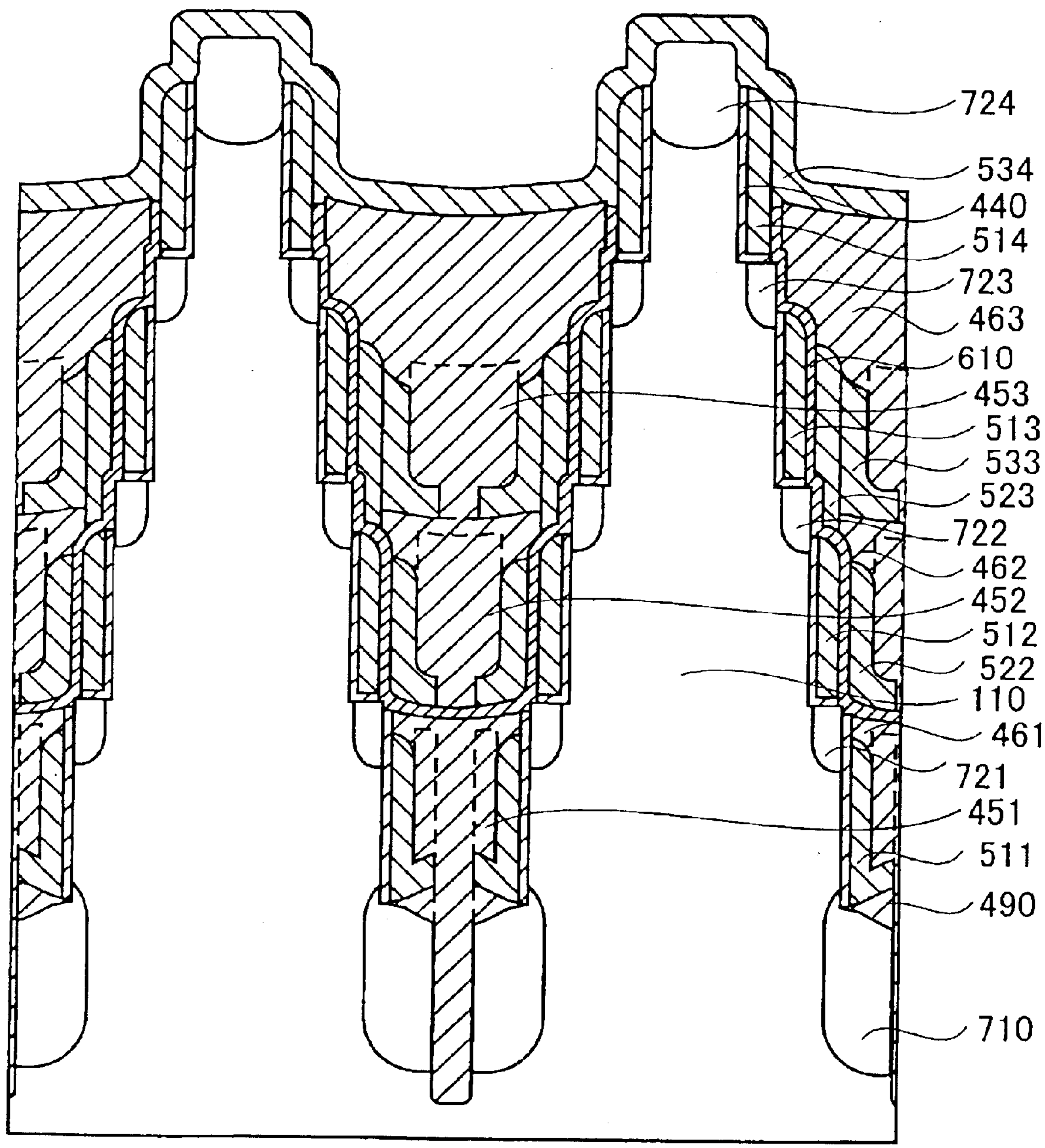

Subsequently, a polysilicon film 534, for example, is deposited to 15 to 150 nm as a third conductive film (FIG. 519 and FIG. 556).

Figure 520:
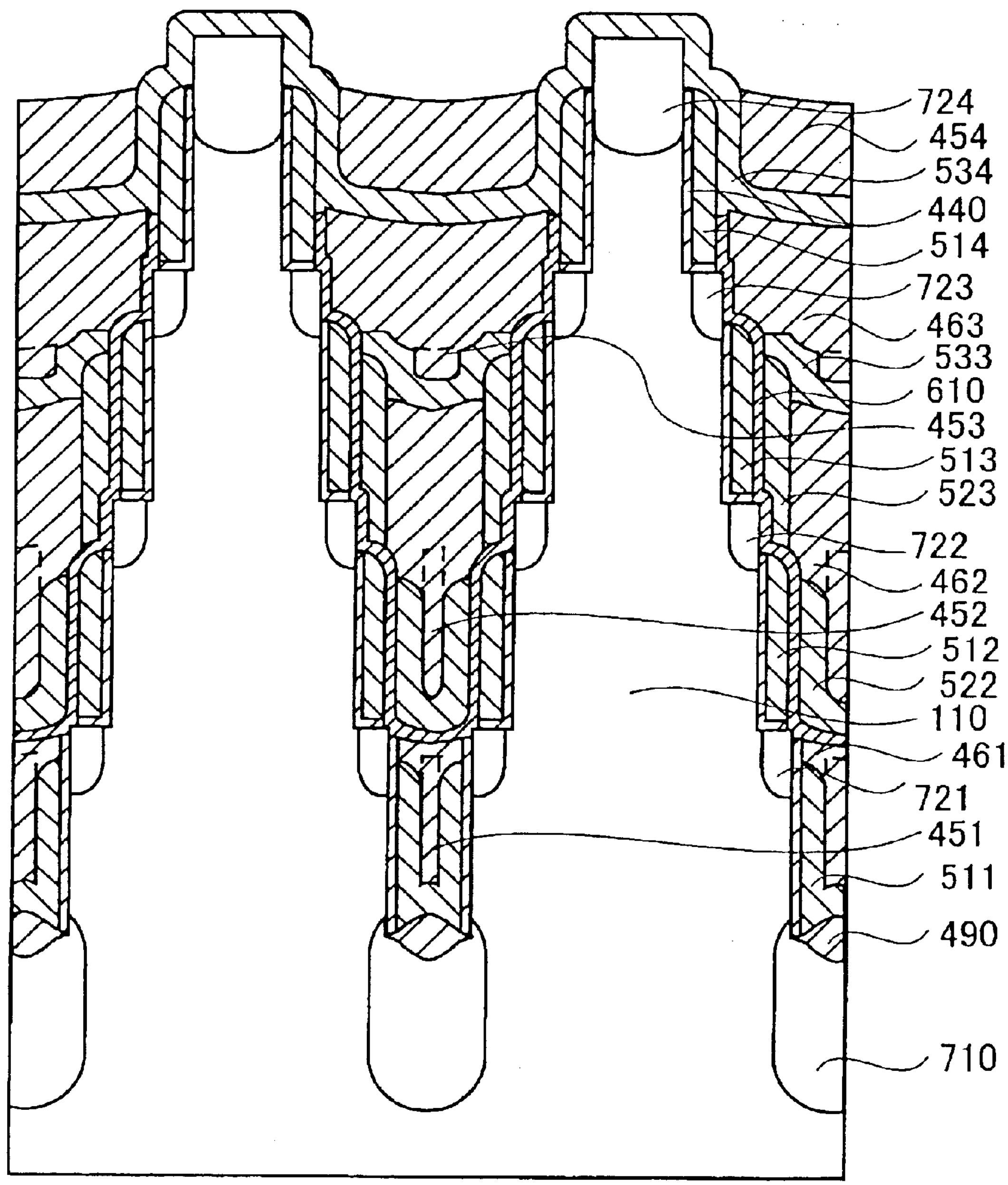
Figure 557:
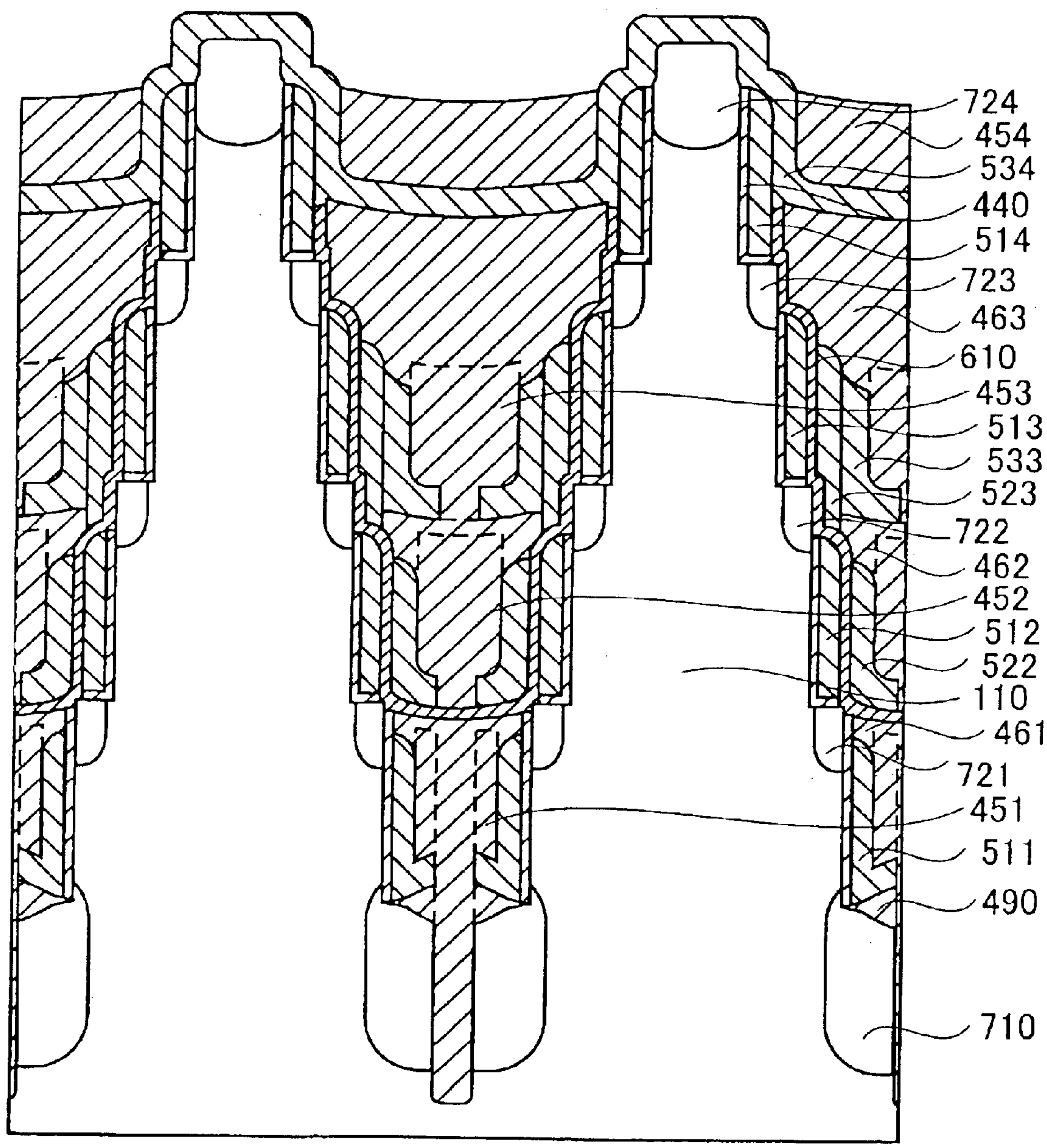

Thereafter, a silicon oxide film 454, for example, is deposited to about 20 to 200 nm as a sixth insulating film and etched back to a desired depth (FIG. 520 and FIG. 557).

The selection gates, i.e., the polysilicon film 514, at the uppermost tiers are all kept connected by the polysilicon film 534.

Figure 521:
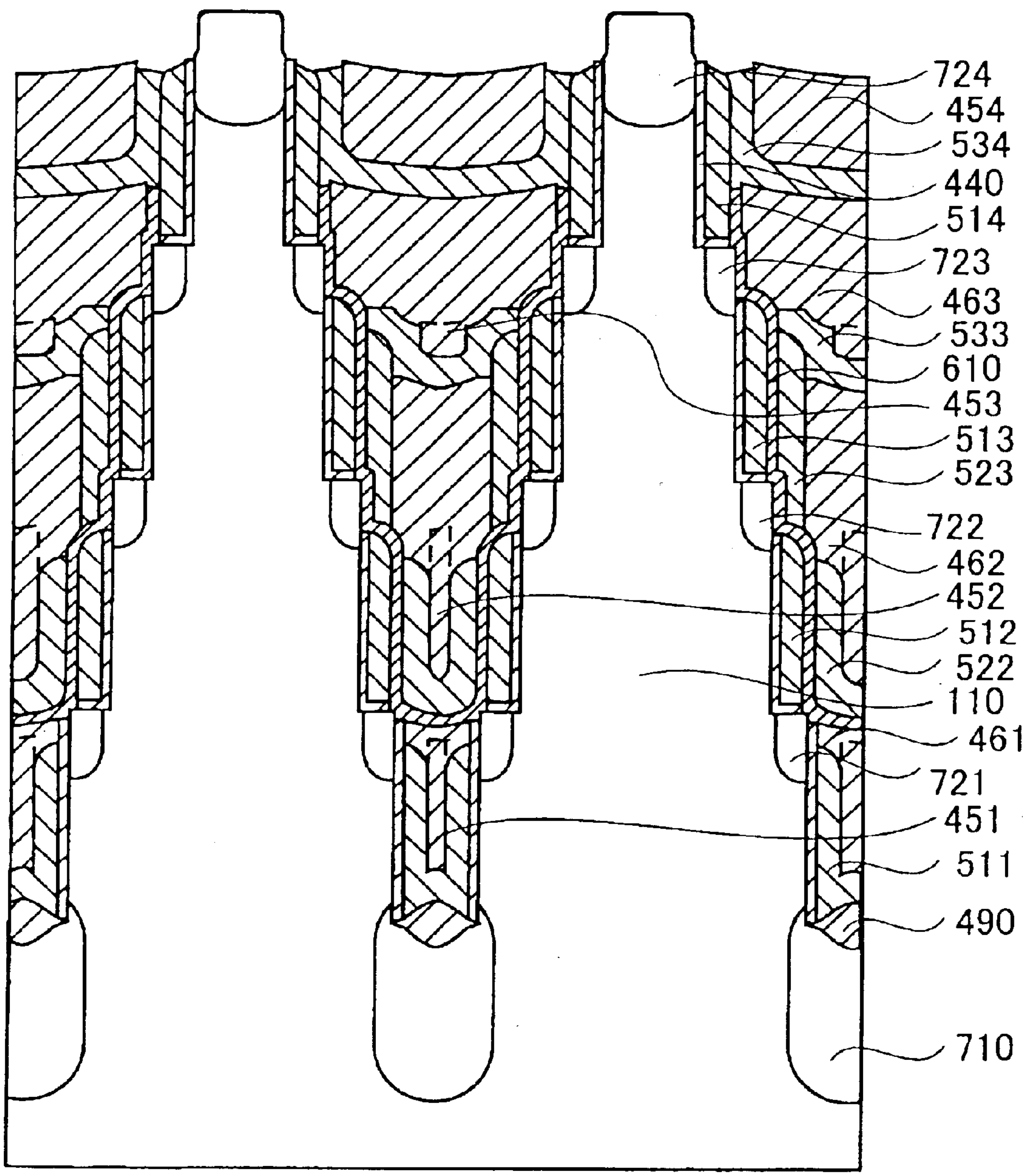
Figure 558:
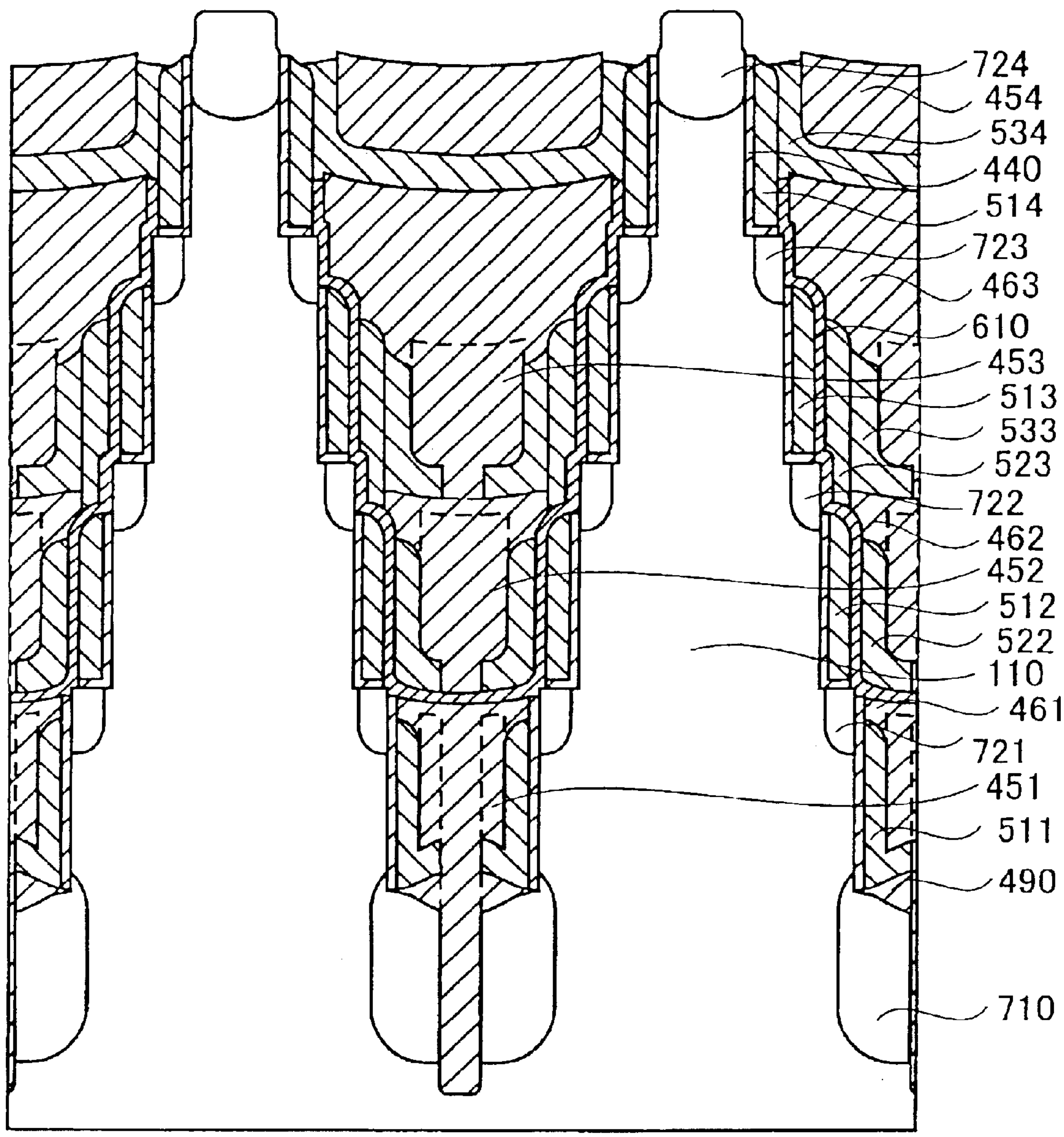

Subsequently, the polysilicon film 534 exposed with respect to the silicon oxide film 454 is selectively removed by isotropic etching (FIG. 521 and FIG. 558). At this time, the selection gate, i.e., the polysilicon film 514, formed on the top of the island-like semiconductor layer 110 and on the uppermost tier of the island-like semiconductor layer 110 are partially etched. However, it is sufficient that the height of the etched top of the island-like semiconductor layer 110 is higher than the top end of the polysilicon film 534 after etching.

Using as a mask a resist film 5 patterned by a known photolithography technique, the silicon oxide film 454 is etched by RIE, and then the polysilicon film 534 is etched to form a first trench 214. Thereby a second wiring layer to be a selection gate line continuous in direction A–A' of FIG. 1 is formed by separation.

Next, a silicon oxide film 464, for example, is deposited to about 20 to 400 nm as a seventh insulating film. The top of the island-like semiconductor layer 110 provided with the impurity diffusion layer 724 is exposed by etch-back or by CMP. The impurity concentration in the top of the island-like semiconductor layer 110 is adjusted as required, for example, by ion implantation, and a fourth wiring layer 840 is connected to the top of the island-like semiconductor layer 110 in a direction crossing the second or third wiring layer.

Figure 522:
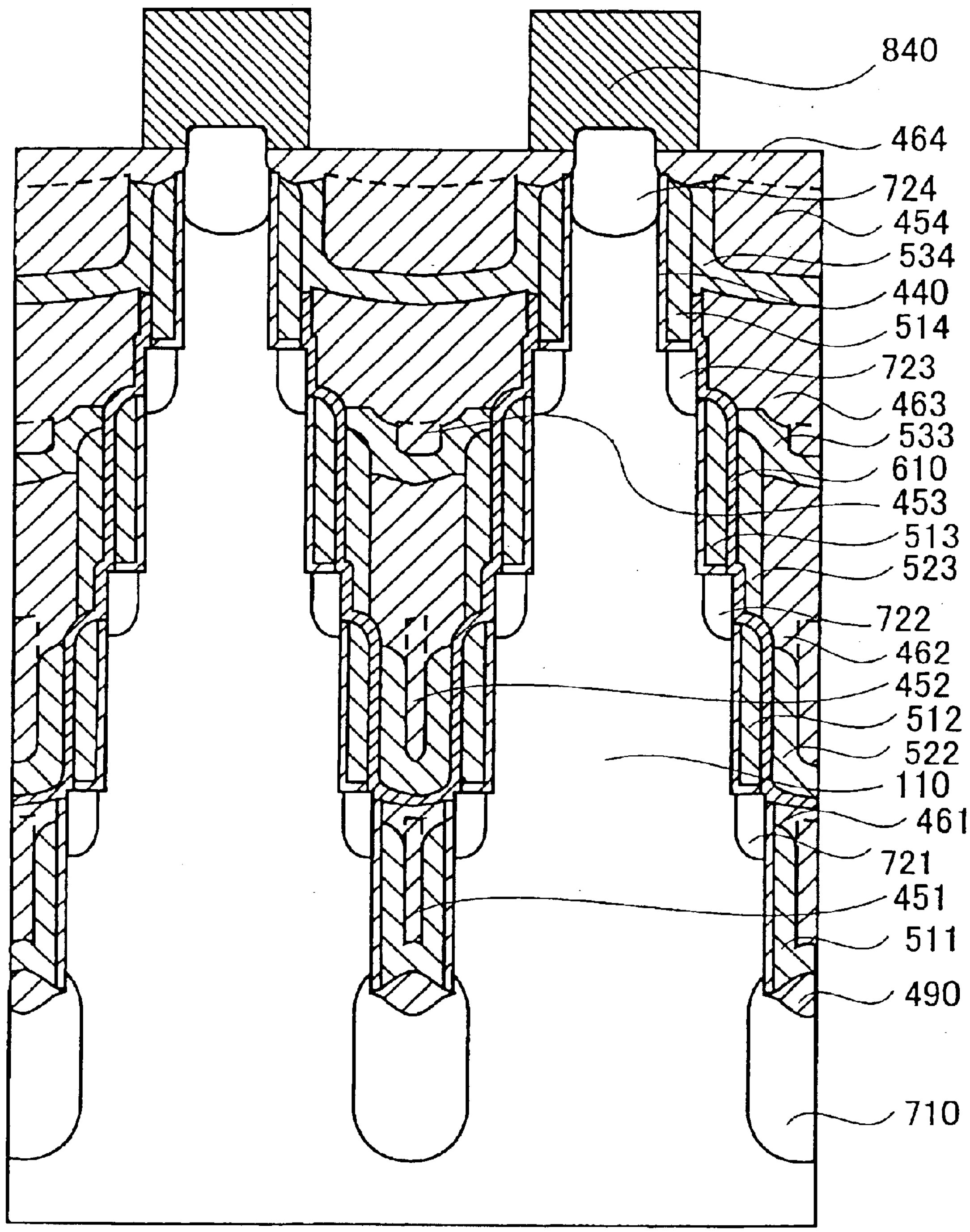
Figure 559:
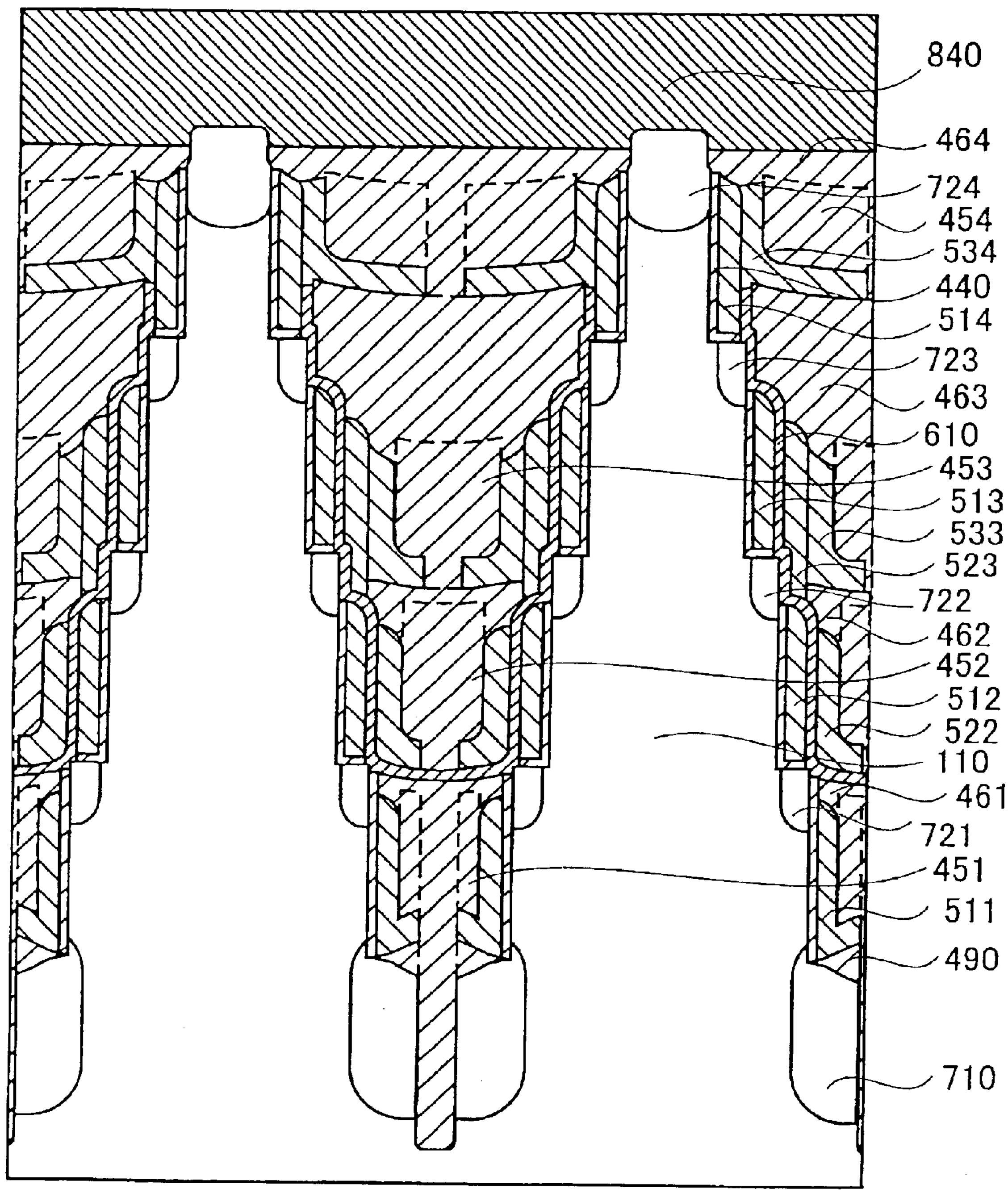

Thereafter, an interlayer insulating film is formed by a known technique, and a contact hole and a metal wiring are formed. Thereby, a semiconductor memory is realized which has a memory function according to the state of a charge in the charge storage layer which is the floating gate made of the polysilicon film (FIG. 522 and FIG. 559).

In this production example, the island-like semiconductor layer 110 is formed on the p-type semiconductor substrate, but the island-like semiconductor layer 110 may be formed in a p-type impurity diffusion layer formed in the n-type semiconductor substrate or in a p-type impurity diffusion layer formed in an n-type impurity diffusion layer formed in the p-type semiconductor substrate. The conductivity type of the impurity diffusion layers may be opposite.

In this production example, in order to form the stepwise island-like semiconductor layer 110, the silicon nitride films 311, 312 and 313 are formed in the sidewall form, and by using these sidewalls as a mask in the reactive ion etching of the p-type silicon substrate 100, the steps are formed. However, for example, an insulating film or a conductive film may be buried so as to expose an upper part of the island-like semiconductor layer 110, and the exposed upper part the island-like semiconductor layer 110 may be thermally oxidized or isotropically etched to be thinner. This process may be repeated with gradually increasing the depositing thickness of the insulating film or the conductive film to form the island-like semiconductor layer 110 having steps.

The above-described production example shows one example in which the silicon oxide film 462 has different burying heights in direction A–A' and in direction B–B' of FIG. 1. However, this may be applied to other burying materials, for example, the silicon oxide films 461, 463 and 464 and the silicon oxide films 451 to 454.

In the above-described production example, the polysilicon film 511 and the polysilicon film 534 are separated with use of the resist films R2 and R5 patterned by a known photolithography technique as a mask. However, the separation of these conductive films may be performed by sidewalls formed of a silicon nitride film.

In this production example, the polysilicon film 520 is separated by two production steps of separating the polysilicon film 520 in the connection direction of the third wiring layer using the sidewalls formed of the silicon nitride film 352, and after removing the silicon nitride film 352, separating it at every tier of the island-like semiconductor layer 110. However, after the formation of the sidewalls of the silicon nitride film 352, the upper portion of the silicon nitride film 352 may be removed, for example, by resist etch-back. After the removal of the resist film, reactive ion etching may be carried out to separate the third wiring layer in the connection direction and each tier of the island-like semiconductor layer 110 at the same time. This formation by separation may be applied not only to the polysilicon film 520 but also to the polysilicon film 533 or may be applied to any conductive film or insulating film.

As for burying, as described in this production example, a desired trench may be directly buried by depositing a silicon oxide film and a polysilicon film or a laminate film of silicon oxide film and a silicon nitride film, and isotropically etching from above the semiconductor substrate. Or the trench may be indirectly buried by resist etch-back.

In the resist etch-back, the burying height by may be controlled by adjusting the exposure time, the exposure amount or a combination of the exposure time and amount. How to control the height is not particularly limited, including a developing process after exposure.

The resist etch-back may be performed by ashing, for example. Or instead of etching back, the burying may be performed so that a desired height is obtained at application of resist. In the latter technique, the resist may desirably be low in viscosity. The above-mentioned techniques may be used as a combination of two or more thereof. Further the surface onto which the resist is applied may desirably be hydrophilic, for example, the resist may desirably be applied on the silicon oxide film.

The silicon oxide film used for burying may be formed not only by CVD but also by rotary application, for example.

By providing the selection gates in the top and the bottom of a set of memory cells, it is possible to prevent the phenomenon that a memory cell transistor is over-erased, i.e., a reading voltage is 0V and a threshold is negative, thereby the cell current flows even through a non-selected cell.

PRODUCTION EXAMPLE 25

Figure 560:
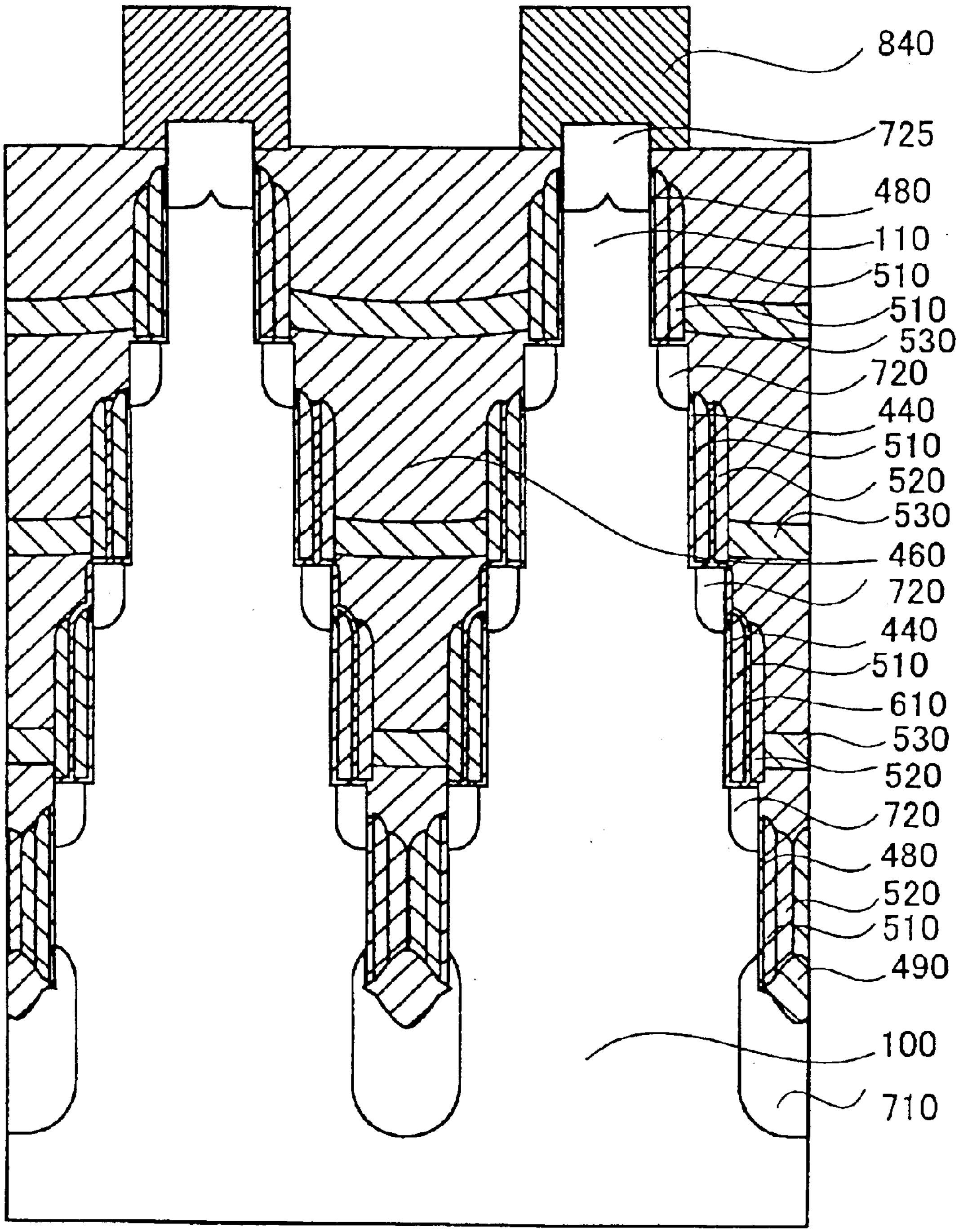
Figure 561:
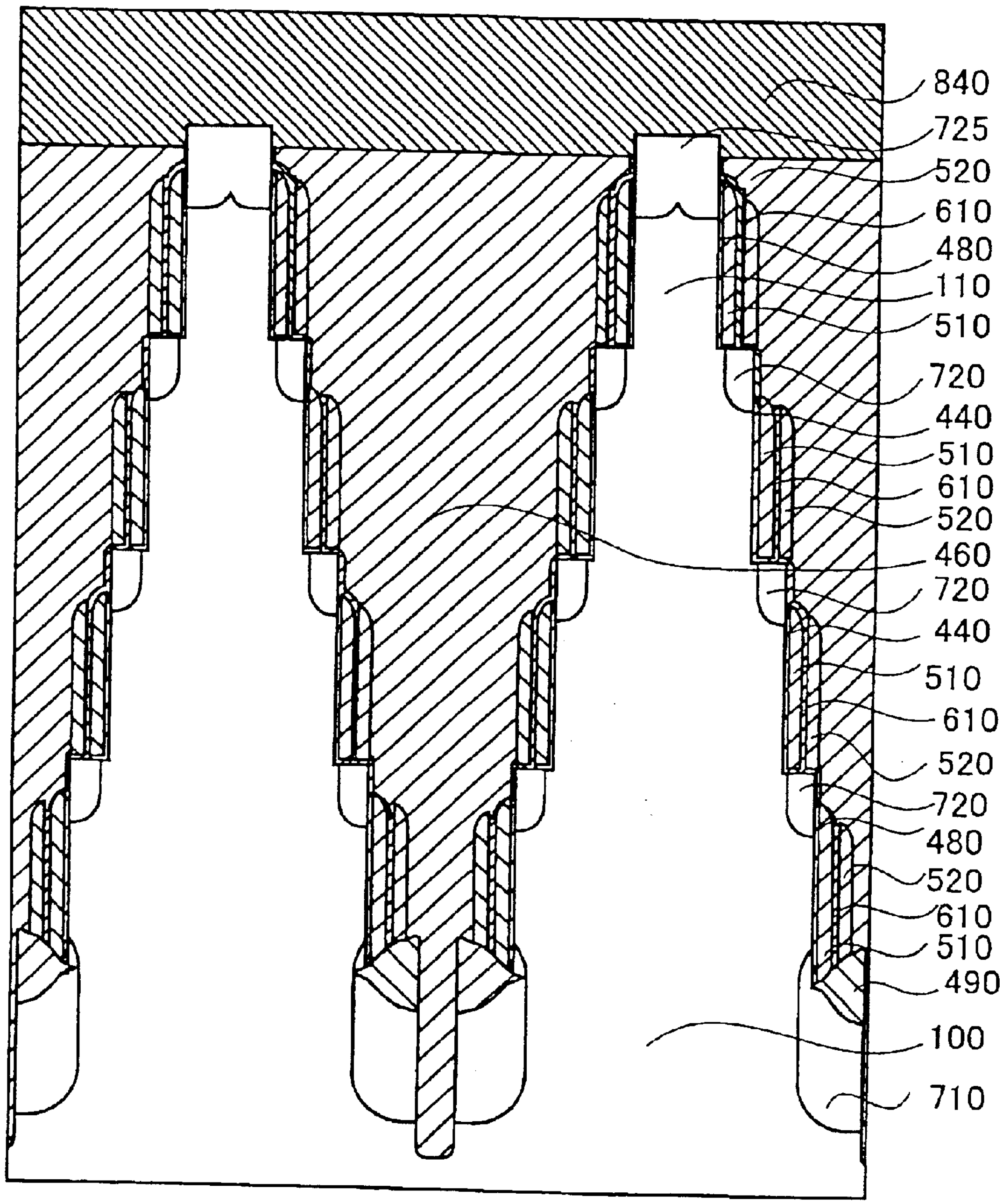
Figure 562:
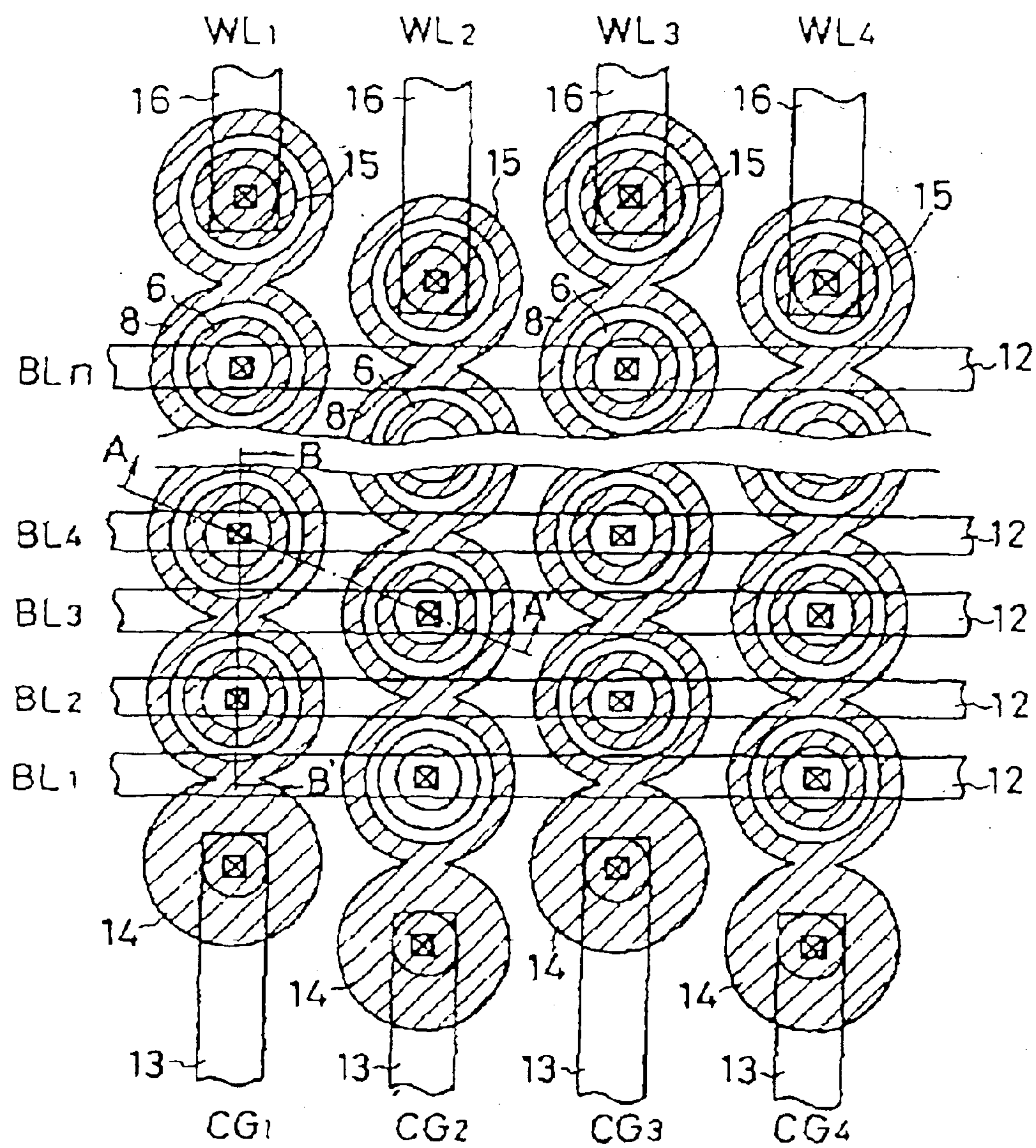
FIG. 562 is a cross-sectional view illustrating a prior-art EEPROM.
Figure 563A:
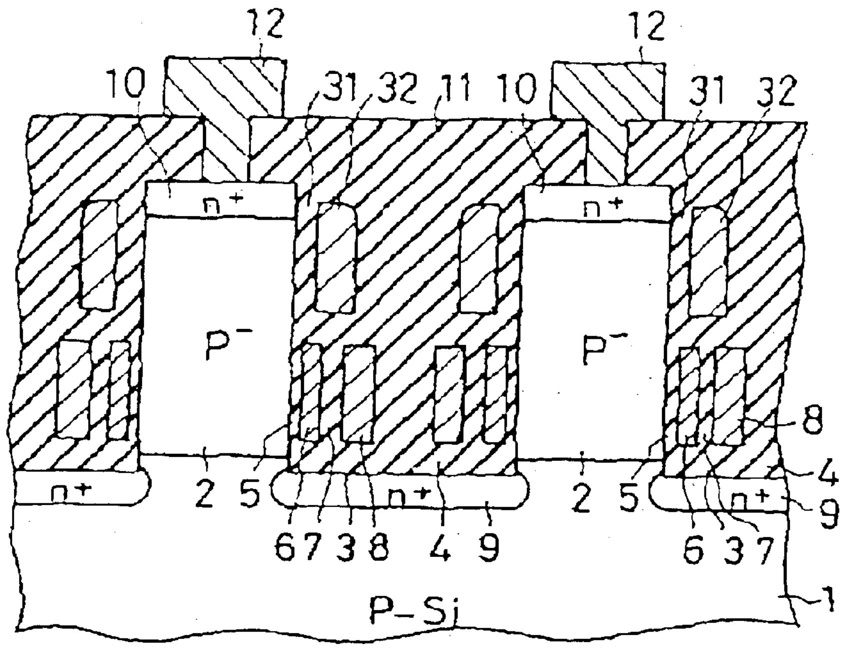
FIG. 563 is a sectional view taken on line A–A' and B–B' in FIG. 1651.
Figure 563B:
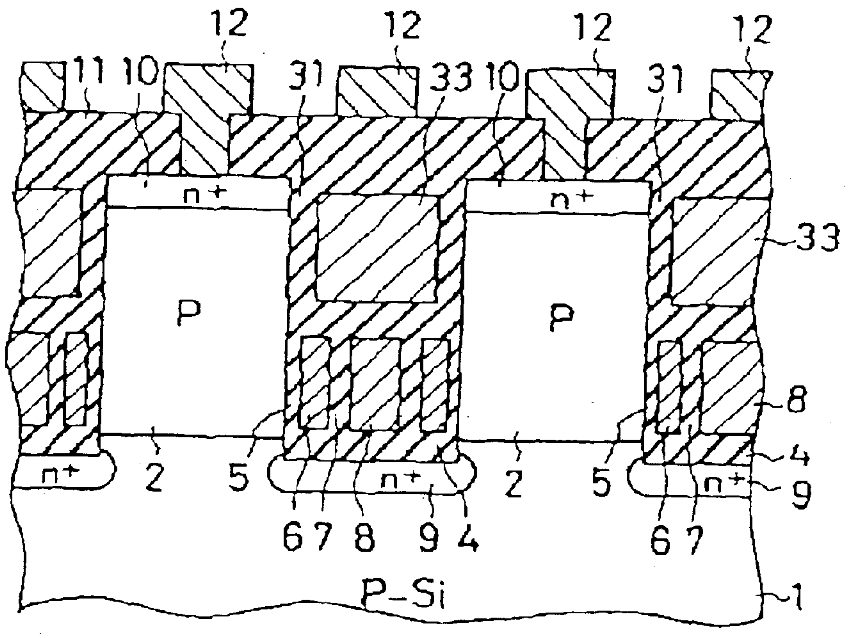
Figure 564A:
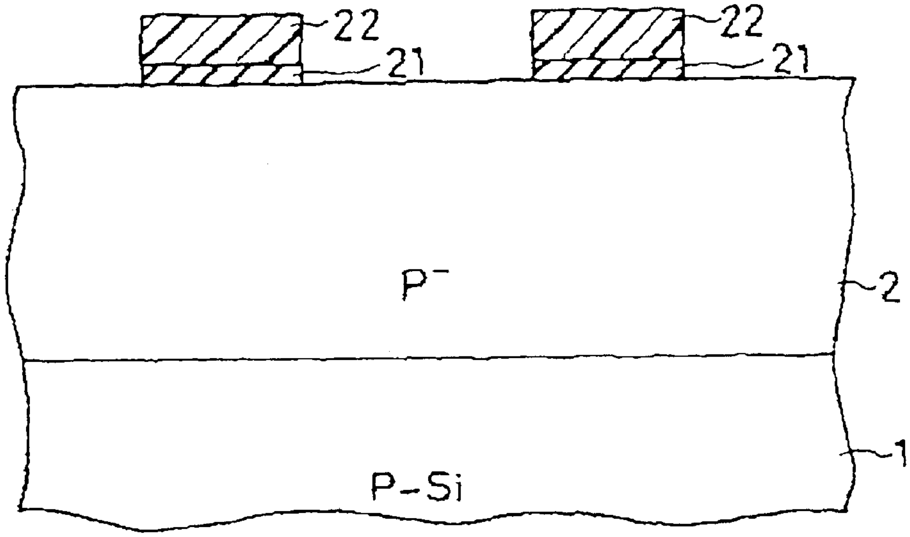
FIGS. 564 to 567 are sectional views illustrating production steps for producing a prior-art EEPROM.
Figure 564B:
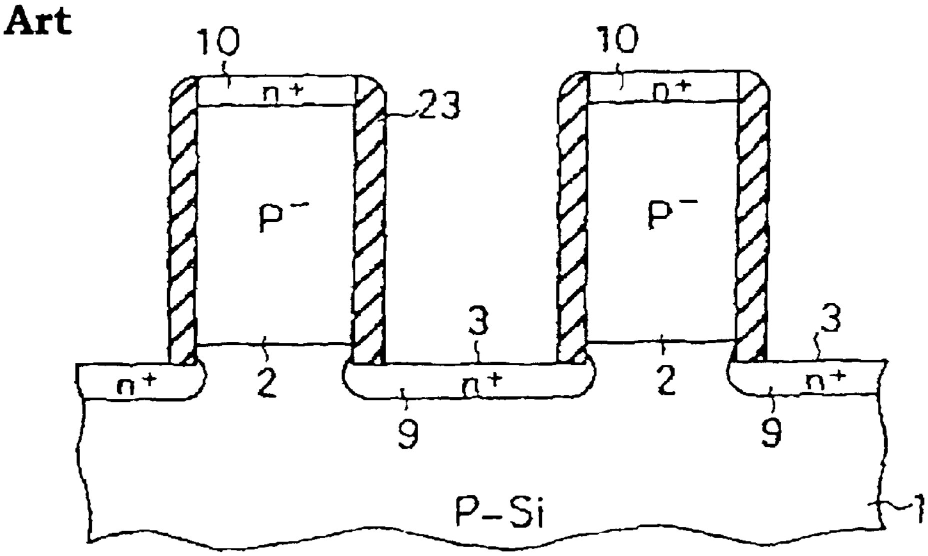
Figure 565C:
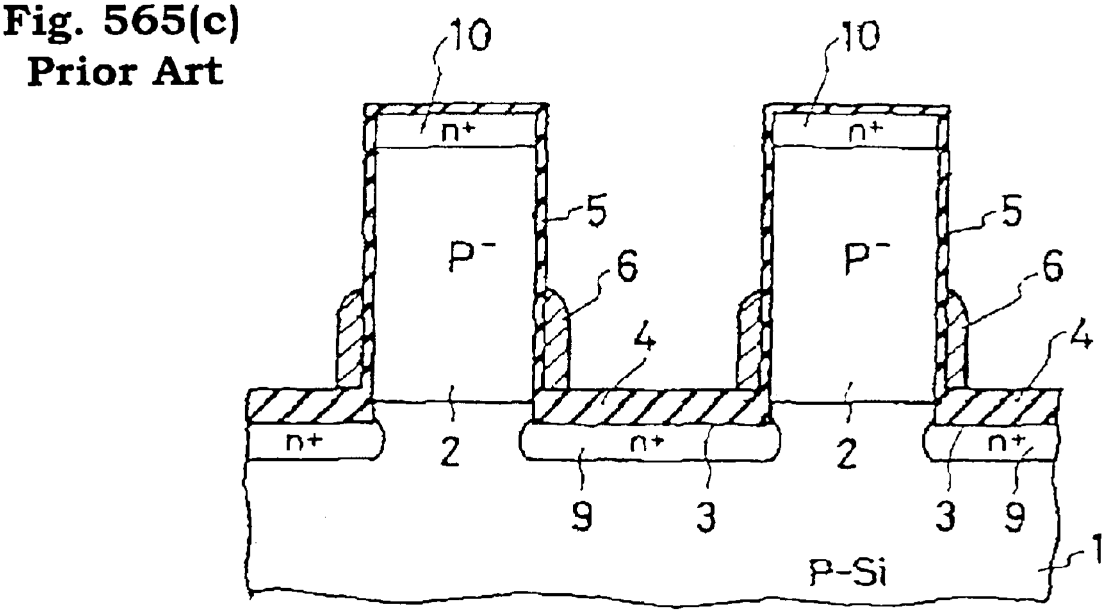
Figure 565D:
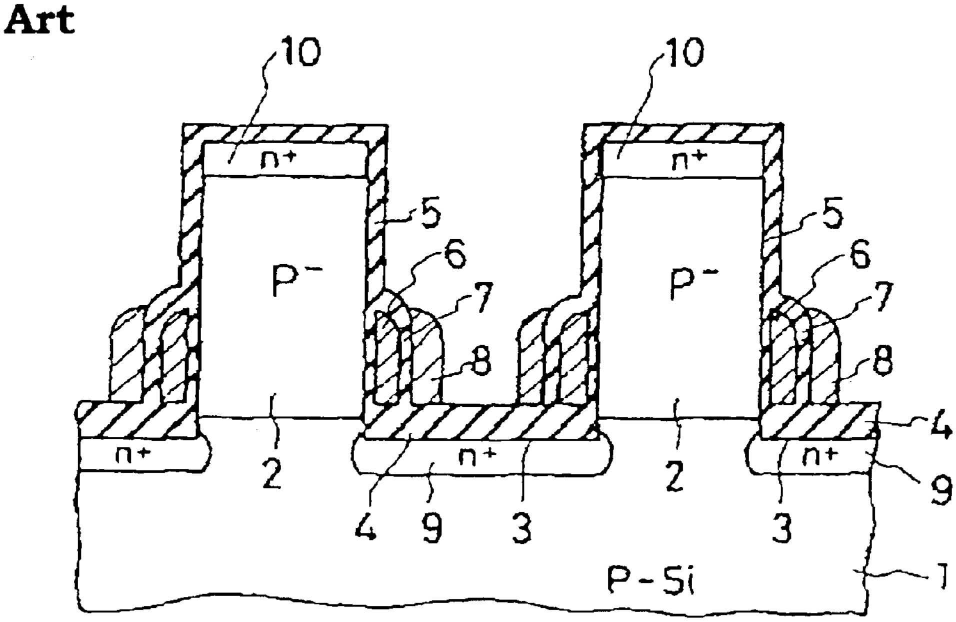
Figure 566E:
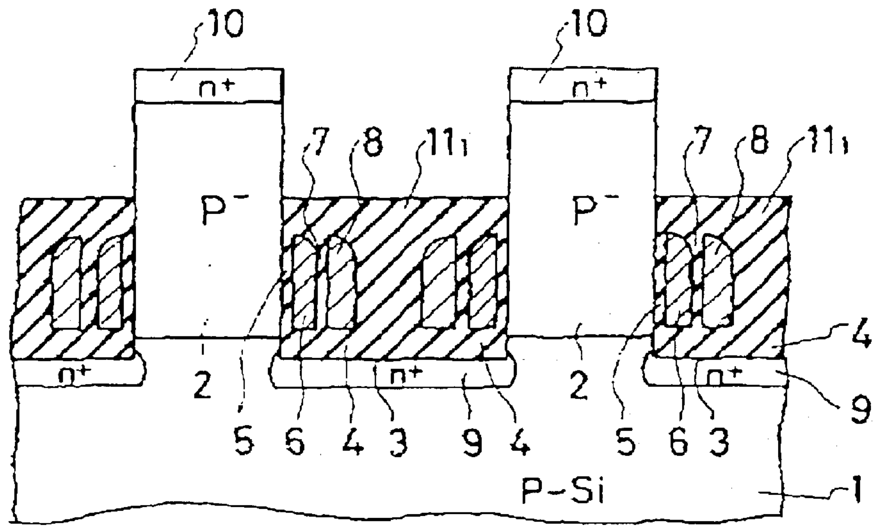
Figure 566F:
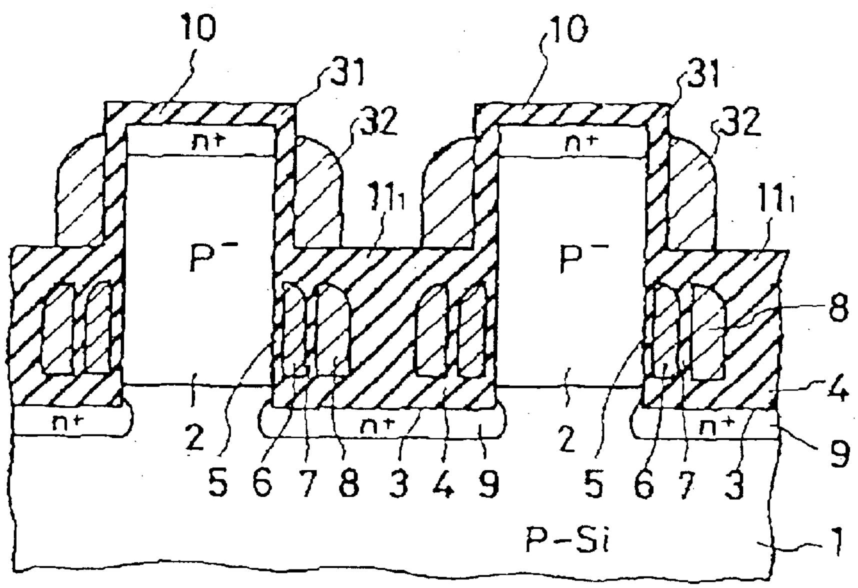
Figure 567G:
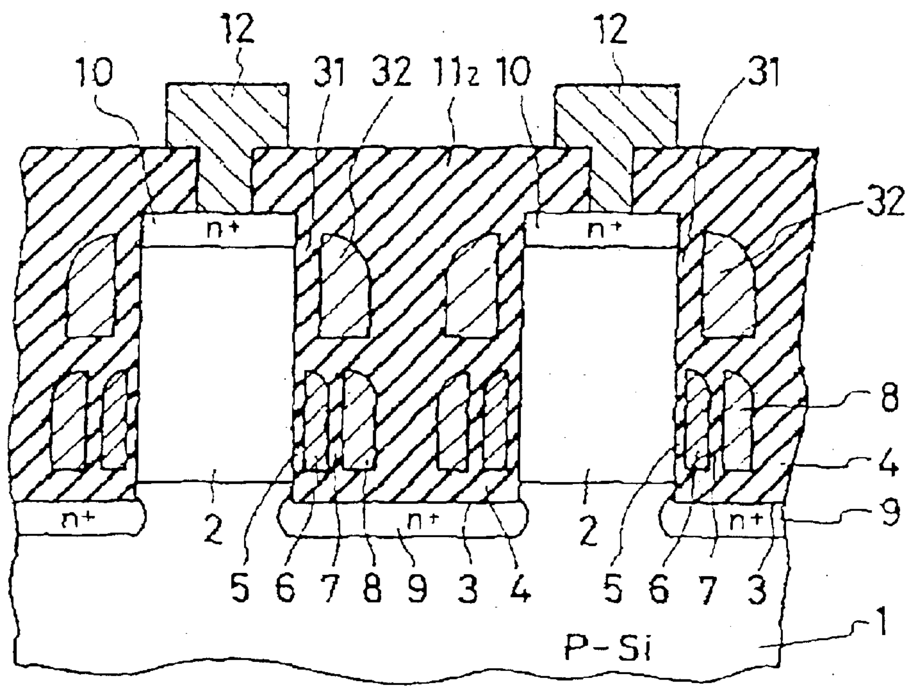
Figure 568A:
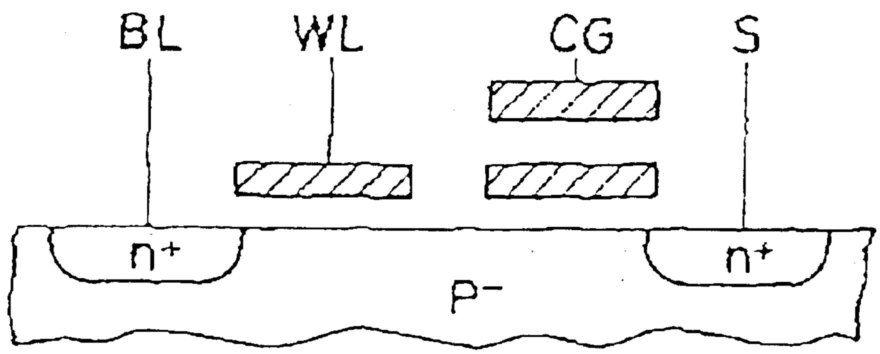
FIG. 568 is a cross-sectional view of a prior-art EEPROM and a corresponding equivalent circuit diagram.
Figure 568B:
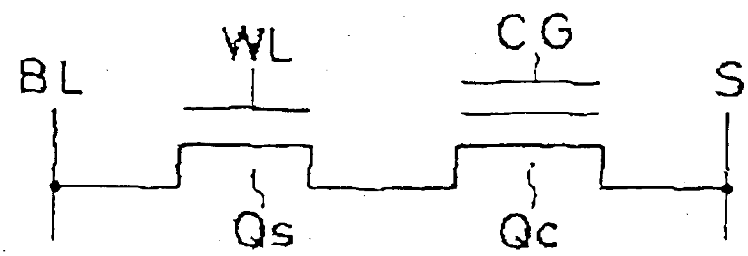
Figure 569:
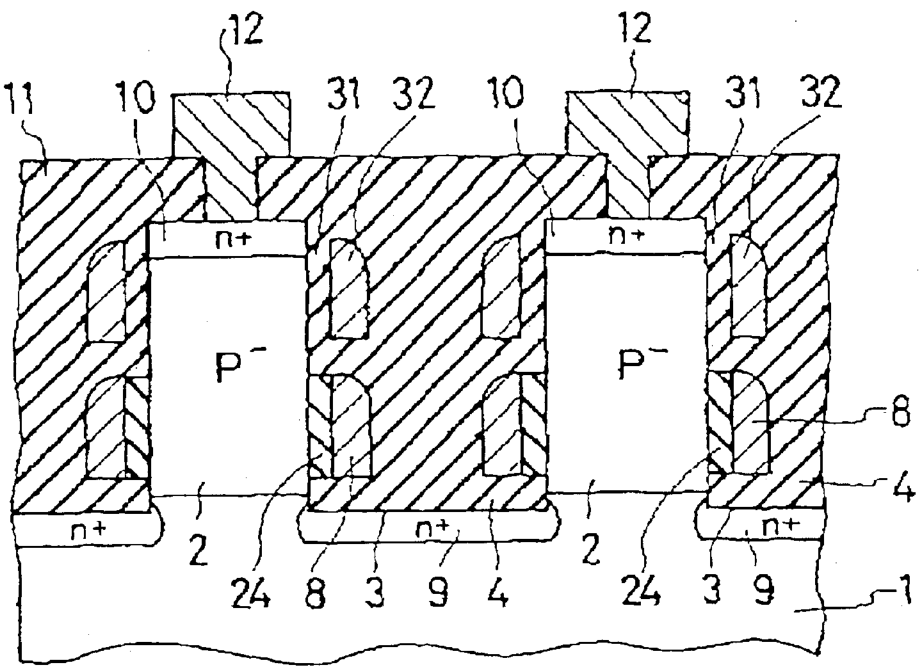
FIGS. 569 to 570 are sectional views of various kinds of prior-art memory cells of MNOS structure.
Figure 570:
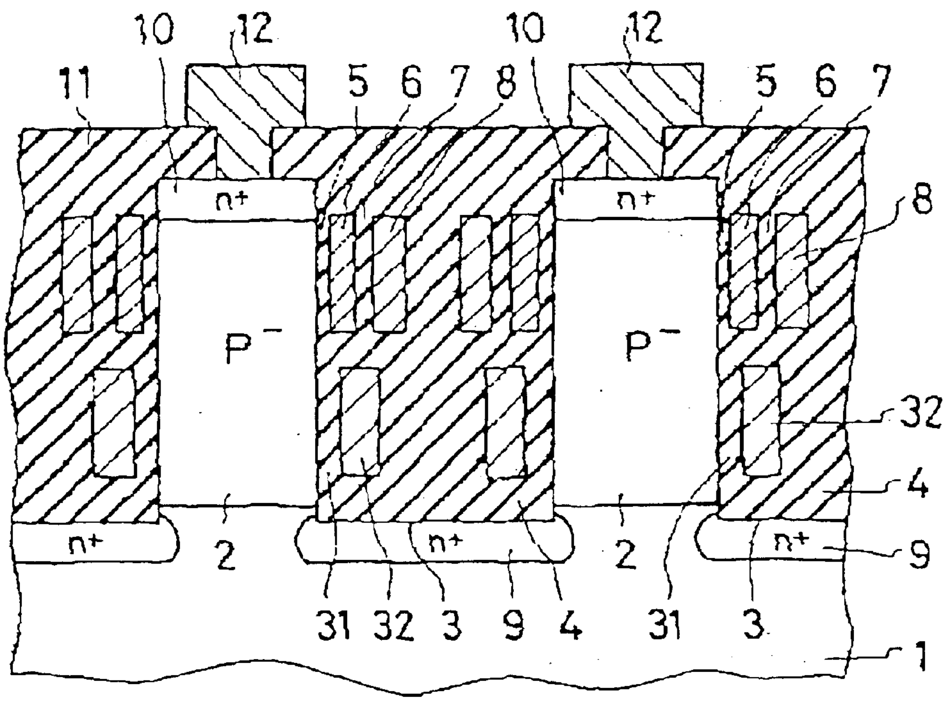
Figure 571:
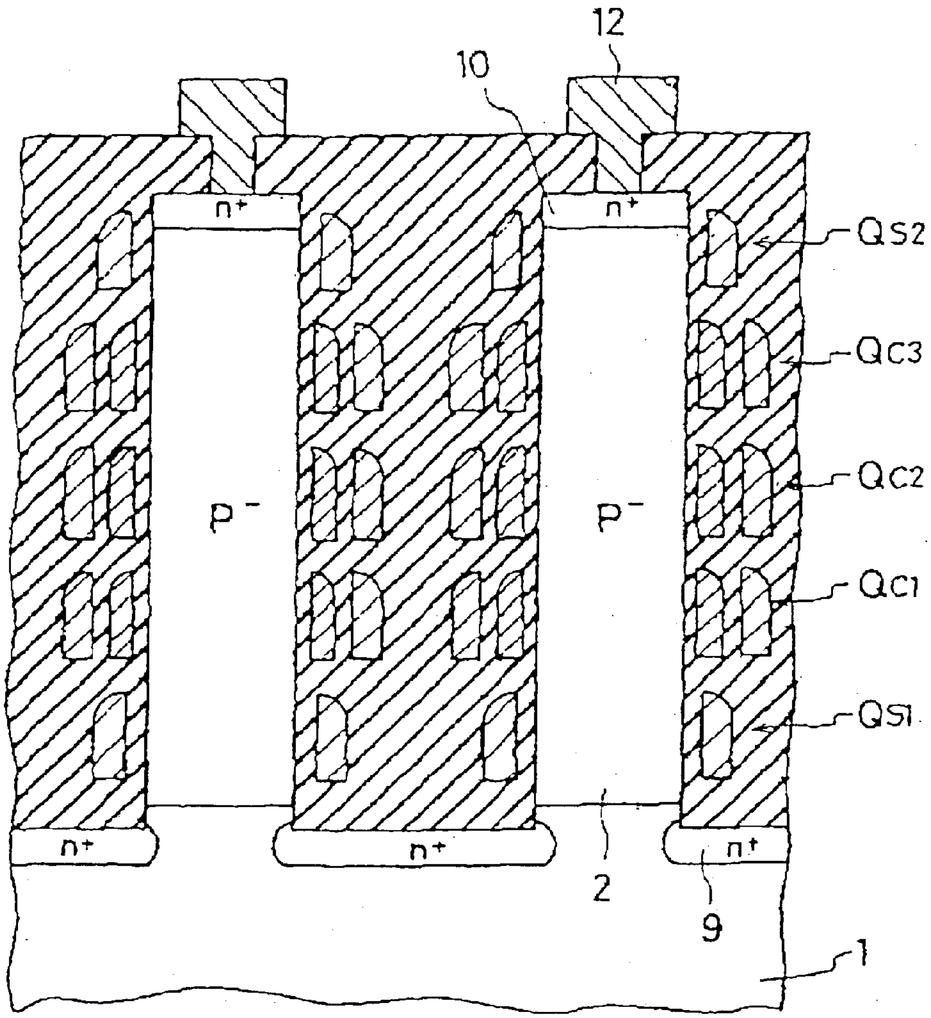
FIG. 571 is a sectional view of a prior-art semiconductor device with a plurality of memory cells formed on each pillar-form silicon layer.

FIG. 560 and FIG. 561 are sectional views taken on line A–A' and line B–B', respectively, of FIG. 1 showing a memory cell array of EEPROM.

In the semiconductor memory of this production example, the floating gate 510 and the control gate 520 are disposed without sticking out of each tier. Selection gate transistors are formed in a top portion and in a bottom portion of the island-like semiconductor layer. Two memory transistors are disposed between the selection gate transistors. The floating gates 510 and control gates 520 of the selection gate transistors and the memory transistors are formed at the same time.

At least a part of the floating gate 510 of the selection gate transistor becomes a selection gate by being electrically connected to the control gate 520.

In production of the semiconductor memory of the present invention, the structures of the memory transistors and the selection transistors described in Production Examples 1 to 25 may be optionally combined.

According to the semiconductor memory of the present invention, by forming memory transistors on island-like semiconductor layers, it has become possible to increase the capacity of memory transistors greatly, reduce the cell area per bit and reduce the size and costs of a chip. Particularly in the case where the island-like semiconductor layers are formed to have the minimum patterning diameter (length) and the smallest distance between the island-like semiconductor layers is set to the minimum patterning distance, it is possible to obtain a capacity twice as large as that of the prior-art memory if two memory transistors are formed on each island-like semiconductor layer. Therefore, the capacity can be raised by multiplication by the number of memory transistor tiers per island-like semiconductor layer. Also since the vertical direction which determines the performance of the memory does not depend upon the minimum patterning dimensions, the performance of the memory can be maintained.

Further, by forming a tunnel oxide film on the surface of the island-like semiconductor layers with tiers, for example, by thermal oxidization, depositing a polysilicon film and then anisotropically etching the polysilicon film by RIE, the polysilicon film is formed by separation into sidewalls simultaneously on every tier. Accordingly, the process of forming the gates does not depend upon the number of tiers, and it is not necessary to perform difficult alignment by resist etch-back or the like. Therefore, it is possible to obtain a semiconductor memory with reduced variations in its characteristics.

By forming the impurity diffusion layers so that the active regions of the memory cells are in the floating state to the substrate, the back-bias effect from the substrate can be eliminated. There do not occur variations in the characteristics of the memory cells due to decrease in the threshold of the memory cells at reading, and the number of cells connected in series between the bit line and the source line can be increased, which allows the capacity to be increased. In the case where the bottom of the island-like semiconductor layer is a source, even if the active regions of the memory cells are not in the floating state to the substrate, the source has the largest diameter in the island-like semiconductor layer having tiers. With the stepwise structure of the island-like semiconductor layer, the source resistance can be decreased and the back-bias effect can be reduced. Therefore, it is possible to obtain a high-performance semiconductor memory.

Also, according to the semiconductor memory of the present invention, a semiconductor substrate or a semiconductor layer is patterned into pillar-form layers each having at least one step. The side of each pillar-form layer forms an active region, and a tunnel oxide film and a floating gate as a charge storage layer are disposed on the side of each tier of the pillar-form layer. A control gate is formed on at least a part of the side of the floating gate with intervention of an interlayer insulating film. Accordingly, an inter-device diffusion layer can be easy formed in self-alignment with the gates using an ion implantation technique with good control. It is also possible to form the inter-device diffusion layer simultaneously when an impurity is introduced to the floating gate and to the control gate, which allows the inter-device diffusion layer to be formed without an inter-device diffusion layer forming step.

Further, as compared with the formation of inter-device diffusion layer by diffusion from a film doped with the impurity in high concentration, the ion implantation provides a high degree of freedom because it does not limit the species of the diffused impurity due to a problem of segregation. The introduction of arsenic, which is difficult by means of diffusion, can be done relatively easily. Thus, a desired diffusion distribution can be obtained more freely.

Furthermore, from the above-mentioned reasons, the formation of not only an n-type but also a p-type semiconductor memory can be realized relatively easily, and the construction of an inverter or a logic circuit from a transistor using a semiconductor substrate pillar is also expected to be realized.

The overall formation of gates by separation can be realized extremely easily, and it does not depend upon the number of tiers the pillar-form layer has. Accordingly, it is possible to form a semiconductor memory having a structure, in which a plurality of memory cells are disposed in series in the direction vertical to the surface of the semiconductor substrate, at low costs in a short time. It is also possible to obtain the tunnel oxide films and the charge storage layers, or the gate oxide films and the control gates homogeneously with respect to each memory cell or each selection gate transistor,. Similarly, the interlayer insulating films and the control gates can be obtained homogeneously with respect to each memory cell. Thus it is possible to easily produce a semiconductor memory with reduced variations in characteristics.

What is claimed is:

1. A semiconductor memory comprising:

a first conductivity type semiconductor substrate and memory cells each constituted of an island-like semiconductor layer, a charge storage layer and a control gate, the charge storage layer and the control gate being formed to entirely or partially encircle a sidewall of the island-like semiconductor layer, wherein the memory cells are disposed in series, and the island-like semiconductor layer on which the memory cells are disposed has cross-sectional areas in a horizontal direction which vary stepwise.

2. A semiconductor memory according to claim 1, wherein the cross-sectional areas decrease sequentially from a semiconductor substrate side to the top.

3. A semiconductor memory according to claim 1, wherein the cross-sectional areas increase sequentially from a semiconductor substrate side to the top.

4. A semiconductor memory according to claim 1, wherein at least one of the cross-sectional areas is equal to a cross-sectional area of the island-like semiconductor layer on a semiconductor substrate side.

5. A semiconductor memory according to claim 1, wherein said one or more memory cells are electrically insulated from the semiconductor substrate by a second conductivity type impurity diffusion layer formed in the semiconductor substrate or in the island-like semiconductor layer, or by the second conductivity type impurity diffusion layer and a first conductivity type impurity diffusion layer formed in the second conductivity type impurity diffusion layer.

6. A semiconductor memory according to claim 1, wherein a plurality of memory cells are formed in one island-like semiconductor layer and at least one of the memory cells is electrically insulated from another memory cell by a second conductivity type impurity diffusion layer formed in the island-like semiconductor layer, or by the second conductivity type impurity diffusion layer and a first conductivity type impurity diffusion layer formed in the second conductivity type impurity diffusion layer.

7. A semiconductor memory according to claim 1, wherein said one or more memory cells are electrically insulated from the semiconductor substrate by a second conductivity type impurity diffusion layer formed in the semiconductor substrate or the island-like semiconductor layer and a depletion layer formed at a junction between the second conductivity type impurity diffusion layer and the semiconductor substrate or the island-like semiconductor layer.

8. A semiconductor memory according to claim 1, wherein a plurality of memory cells are formed and at least one of the memory cells is electrically insulated from another memory cell by a second conductivity type impurity diffusion layer formed in the island-like semiconductor layer and a depletion layer formed at a junction between the second conductivity type impurity diffusion layer and the island-like semiconductor layer.

9. A semiconductor memory according to claim 1, wherein a impurity diffusion layer is formed on the semiconductor substrate, the impurity diffusion layer functions as common wiring for at least one memory cell.

10. A semiconductor memory according to claim 1, wherein a plurality of island-like semiconductor layers are formed in matrix, wiring layers for reading a state of a charge stored in the memory cells are formed in the island-like semiconductor layers, a plurality of control gates are arranged continuously in a direction to form a control gate line, and a plurality of the wiring layers are connected in a direction crossing the control gate line to form a bit line.

11. A semiconductor memory according to claim 1, wherein a gate electrode for selecting a memory cell is formed at least at an end of the memory cell formed on the island-like semiconductor layer so as to partially or entirely encircle the sidewall of the island-like semiconductor layer and the gate electrode is arranged in series with the memory cell.

12. A semiconductor memory according to claim 11, wherein a part of the island-like semiconductor layer opposed to the gate electrode is electrically insulated from the semiconductor substrate or the memory cell by a second conductivity type impurity diffusion layer formed in the surface of the semiconductor substrate or in the island-like semiconductor layer.

13. A semiconductor memory according to claim 1, wherein a second conductivity type impurity diffusion layer, or a second conductivity type impurity diffusion layer and a first conductivity type impurity diffusion layer formed in the second conductivity type impurity diffusion layer is/are formed partially or entirely at a corner of the island-like semiconductor layer having a stepwise structure in self-alignment with the charge storage layer so that channel layers of the memory cells are electrically connected to each other.

14. A semiconductor memory according to claim 11, wherein a second conductivity type impurity diffusion layer, or a second conductivity type impurity diffusion layer and a first conductivity type impurity diffusion layer formed in the second conductivity type impurity diffusion layer is/are formed partially or entirely at a corner of the island-like semiconductor layer having a stepwise structure in self-alignment with the charge storage layer and the gate electrode so that a channel layer formed in a part of the island-like semiconductor layer opposed to the gate electrode and the channel layer of the memory cell are electrically connected.

15. A semiconductor memory according to claim 1, wherein a plurality of memory cells are formed with regard to one island-like semiconductor layer and control gates constituting the memory cell are arranged so closely that cannel layers of memory cells are electrically connected.

16. A semiconductor memory according to claim 1, wherein the control gate and the gate electrode are disposed so closely that a channel layer located in a part of the island-like semiconductor layer opposed to the gate electrode is electrically connected to a channel layer of the memory cell.

17. A semiconductor memory according to claim 1, wherein a plurality of memory cells are formed with regard to one island-like semiconductor layer, and an electrode for electrically connecting cannel layers of memory cells is further formed between control gates.

18. A semiconductor memory according to claim 11, wherein a plurality of memory cells are formed with regard to one island-like semiconductor layer, and an electrode for electrically connecting a channel layer located in a part of the island-like semiconductor layer opposed to the gate electrode to a channel layer of the memory cell is further formed between the control gate and the gate electrode.

19. A semiconductor memory according to claim 11, wherein all, some or one control gate(s) are formed of the same material as all, some or one gate electrode(s).

20. A semiconductor memory according to claim 11, wherein the charge storage layer and the gate electrode are formed of the same material.

21. A semiconductor memory according to claim 1, wherein a plurality of island-like semiconductor layers are formed in matrix, and the width of the island-like semiconductor layers in one direction is smaller than a distance between adjacent island-like semiconductor layers in the same direction.

22. A semiconductor memory according to claim 1, wherein a plurality of island-like semiconductor layers are formed in matrix, and a distance between the island-like semiconductor layers in one direction is smaller than a distance between the island-like semiconductor layers in another direction.

* * * * *